US011581494B2

(12) United States Patent
Lee et al.

(10) Patent No.: US 11,581,494 B2
(45) Date of Patent: Feb. 14, 2023

(54) ORGANIC LIGHT EMITTING DEVICE

(71) Applicant: LG CHEM, LTD., Seoul (KR)

(72) Inventors: Jungha Lee, Daejeon (KR); Tae Yoon Park, Daejeon (KR); Seongmi Cho, Daejeon (KR); Dong Hoon Lee, Daejeon (KR); Min Woo Jung, Daejeon (KR); Su Jin Han, Daejeon (KR); Seoyeon Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 364 days.

(21) Appl. No.: 16/753,497

(22) PCT Filed: Dec. 27, 2018

(86) PCT No.: PCT/KR2018/016773
§ 371 (c)(1),
(2) Date: Apr. 3, 2020

(87) PCT Pub. No.: WO2019/132545
PCT Pub. Date: Jul. 4, 2019

(65) Prior Publication Data

US 2020/0259098 A1 Aug. 13, 2020

(30) Foreign Application Priority Data

Dec. 27, 2017 (KR) ........................ 10-2017-0181543
Dec. 26, 2018 (KR) ........................ 10-2018-0169819

(51) Int. Cl.
*H01L 51/00* (2006.01)
*C09K 11/06* (2006.01)
*H01L 51/50* (2006.01)
*H01L 51/56* (2006.01)

(52) U.S. Cl.
CPC .......... *H01L 51/0067* (2013.01); *C09K 11/06* (2013.01); *H01L 51/0072* (2013.01);
(Continued)

(58) Field of Classification Search
CPC ............. H01L 51/0065; H01L 51/0067; H01L 51/0068; H01L 51/0072; H01L 51/0073; H01L 51/0074
See application file for complete search history.

(56) References Cited

U.S. PATENT DOCUMENTS 9,617,255 B2 * 4/2017 Katakura ............. C07D 409/14
10,622,565 B2 4/2020 Parham et al.
(Continued)

FOREIGN PATENT DOCUMENTS

JP 2004-288381 10/2004
JP 2010135467 6/2010
(Continued)

OTHER PUBLICATIONS

CAS/CAPLUS Listing of Compounds Indexed From A. Parham et a., US 2016/0181548 (2016) That Meet the Requirements of Claim 1, Chemical Formula 1 (Year: 2016).*

*Primary Examiner* — Alexander R Pagano
(74) *Attorney, Agent, or Firm* — Dentons US LLP

(57) ABSTRACT

Provided is an organic light emitting device, comprising: an anode; a cathode disposed opposite to the anode; and one or more organic material layers disposed between the anode and cathode, the organic material layer including a light emitting layer that includes a compound of Chemical Formula 1 and a compound Chemical Formula 2:

Chemical Formula 1

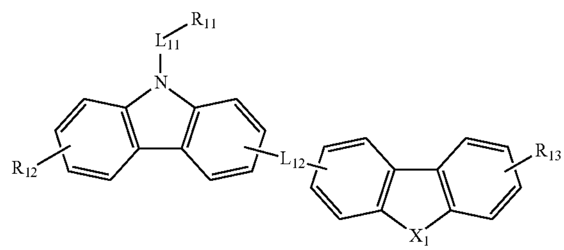

Chemical Formula 2

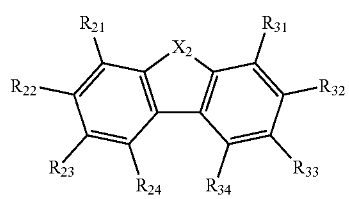

wherein: one of $R_{21}$, $R_{22}$, $R_{23}$, and $R_{24}$ is $-L_{21}-Ar_1$, and the remaining are hydrogen; and one of $R_{31}$, $R_{32}$, $R_{33}$, and $R_{34}$ is $-L_{22}-Ar_2$, and the remaining are hydrogen;
excluding compounds where:
$R_{21}$ is $-L_{21}-Ar_1$ and $R_{31}$ is $-L_{22}-Ar_2$, $R_{22}$ is $-L_{21}-Ar_1$ and $R_{32}$ is $-L_{22}-Ar_2$,
$R_{23}$ is $-L_{21}-Ar_1$ and $R_{33}$ is $-L_{22}-Ar_2$, or $R_{24}$ is $-L_{21}-Ar_1$ and $R_{34}$ is $-L_{22}Ar_2$;
$L_{21}$ and $L_{22}$ each is a single bond, or a substituted or unsubstituted $C_{6-60}$ arylene;
$X_2$ is O or S; and
$Ar_1$ is Chemical Formula 3:

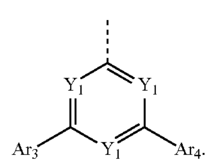

14 Claims, 2 Drawing Sheets

(52) U.S. Cl.
CPC ...... *H01L 51/0073* (2013.01); *H01L 51/0074* (2013.01); *C09K 2211/1018* (2013.01); *H01L 51/001* (2013.01); *H01L 51/5016* (2013.01); *H01L 51/56* (2013.01); *H01L 2251/558* (2013.01)

(56) References Cited

U.S. PATENT DOCUMENTS

| | | | | |
|---|---|---|---|---|
| 2004/0251816 | A1 | 12/2004 | Leo et al. | |
| 2013/0032766 | A1* | 2/2013 | Molt | C07D 307/91 252/301.16 |
| 2016/0028020 | A1* | 1/2016 | Lee | H01L 51/0071 257/40 |
| 2016/0093808 | A1 | 3/2016 | Adamovich et al. | |
| 2016/0181548 | A1* | 6/2016 | Parham | H01L 51/0085 548/440 |
| 2016/0226001 | A1 | 8/2016 | Parham et al. | |
| 2017/0207397 | A1* | 7/2017 | Lee | H01L 51/0052 |
| 2019/0084967 | A1 | 3/2019 | Parham et al. | |
| 2019/0165282 | A1* | 5/2019 | Parham | C07D 491/048 |
| 2019/0198780 | A1* | 6/2019 | Kim | C07D 487/04 |
| 2019/0214577 | A1* | 7/2019 | Pan | C07D 209/86 |
| 2019/0312223 | A1* | 10/2019 | Chun | H01L 51/0059 |

FOREIGN PATENT DOCUMENTS

| | | | | |
|---|---|---|---|---|
| JP | 2014017494 A | * | 1/2014 | |
| KR | 10-20000051826 | | 8/2000 | |
| KR | 10-2016-0028524 | | 3/2016 | |
| KR | 10-20160028979 | | 3/2016 | |
| KR | 10-20160038006 | | 4/2016 | |
| KR | 10-20160054582 | | 5/2016 | |
| KR | 10-20170086211 | | 7/2017 | |
| KR | 10-20170123955 | | 11/2017 | |
| KR | 10-2017-0181464 | * | 12/2017 | |
| WO | 2003012890 | | 2/2003 | |
| WO | WO-2011157790 A1 | * | 12/2011 | C07D 307/91 |
| WO | 2015036080 | | 3/2015 | |
| WO | 2016036171 | | 3/2016 | |
| WO | 2017076485 | | 5/2017 | |
| WO | 2017092495 | | 6/2017 | |
| WO | 2017178311 | | 10/2017 | |

* cited by examiner

[FIG. 1]
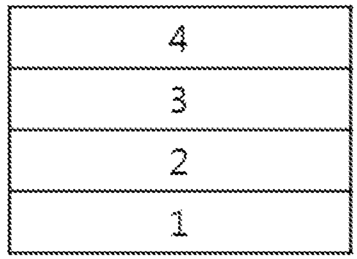
[FIG. 2]
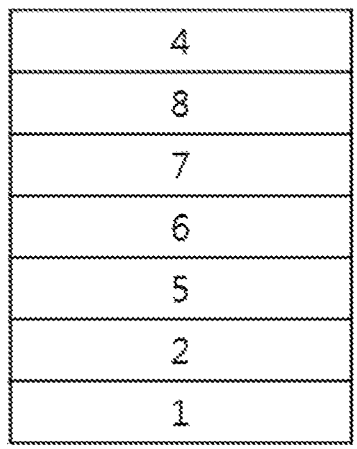
[FIG. 3]
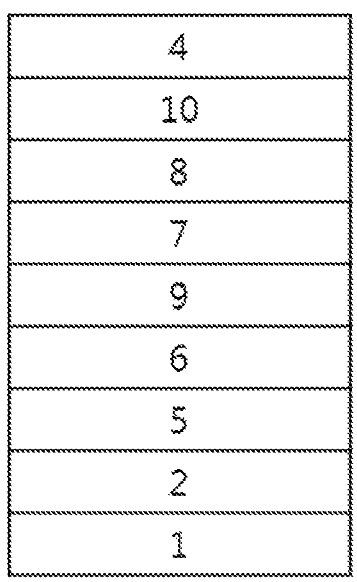

[FIG. 4]
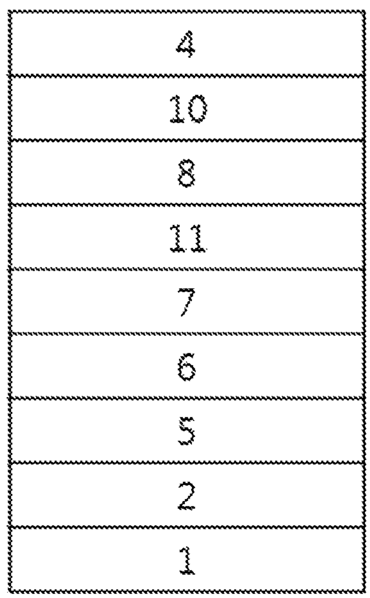

ORGANIC LIGHT EMITTING DEVICE

CROSS-REFERENCE TO RELATED APPLICATION(S)

This application is a National Stage Application of International Application No. PCT/KR2018/016773 filed on Dec. 27, 2018, which claims priority to or the benefit of Korean Patent Application No. 10-2017-0181543 filed with the Korean Intellectual Property Office on Dec. 27, 2017 and Korean Patent Application No. 10-2018-0169819 filed with the Korean Intellectual Property Office on Dec. 26, 2018, the disclosures of which are incorporated herein by reference in their entirety.

TECHNICAL FIELD

The present invention relates to an organic light emitting device.

BACKGROUND ART

In general, an organic light emitting phenomenon refers to a phenomenon where electric energy is converted into light energy by using an organic material. The organic light emitting device using the organic light emitting phenomenon has characteristics such as a wide viewing angle, an excellent contrast, a fast response time, an excellent luminance, driving voltage and response speed, and thus many studies have proceeded.

The organic light emitting device generally has a structure which comprises an anode, a cathode, and an organic material layer interposed between the anode and the cathode. The organic material layer frequently has a multilayered structure that comprises different materials in order to enhance efficiency and stability of the organic light emitting device, and for example, the organic material layer can be formed of a hole injection layer, a hole transport layer, a light emitting layer, an electron transport layer, an electron injection layer and the like. In the structure of the organic light emitting device, if a voltage is applied between two electrodes, the holes are injected from an anode into the organic material layer and the electrons are injected from the cathode into the organic material layer, and when the injected holes and electrons meet each other, an exciton is formed, and light is emitted when the exciton falls to a ground state again.

There is a continuing need for the development of new materials for the organic materials used in the organic light emitting devices as described above.

PRIOR ART LITERATURE

Patent Literature (Patent Literature 0001) Korean Unexamined Patent Publication No. 10-2000-0051826

BRIEF DESCRIPTION

Technical Problem

It is an object of the present invention to provide an organic light emitting device.

Technical Solution

In one aspect of the invention, there is provided the following organic light emitting device:

An organic light emitting device comprising an anode; a cathode that is disposed opposite to the anode; and one or more organic material layers that are disposed between the anode and the cathode, wherein the organic material layer includes a light emitting layer; and the light emitting layer includes a compound of the following Chemical Formula 1, and a compound of the following Chemical Formula 2:

[Chemical Formula 1]

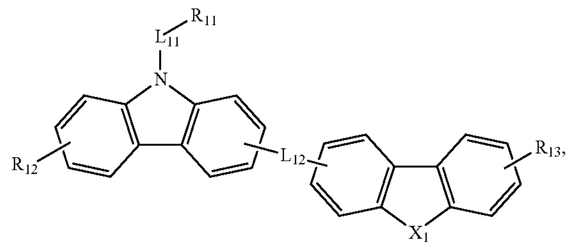

wherein in Chemical Formula 1:

$L_{11}$ is a single bond; or a substituted or unsubstituted $C_{6-60}$ arylene;

$L_{12}$ is a single bond; or a substituted or unsubstituted $C_{6-60}$ arylene;

$R_{11}$ is a substituted or unsubstituted $C_{3-60}$ cycloalkyl, a substituted or unsubstituted $C_{1-60}$ alkyl, a substituted or unsubstituted $C_{6-60}$ aryl, or a substituted or unsubstituted $C_{2-60}$ heteroaryl containing one or more heteroatoms selected from the group consisting of N, O and S;

$R_{12}$ and $R_{13}$ are each independently hydrogen, cyano, a substituted or unsubstituted $C_{1-60}$ alkyl, a substituted or unsubstituted $C_{6-60}$ aryl, or a substituted or unsubstituted $C_{2-60}$ heteroaryl containing one or more heteroatoms selected from the group consisting of N, O and S;

$X_1$ is O, S, $C(CH_3)_2$, N—$R_{14}$, or

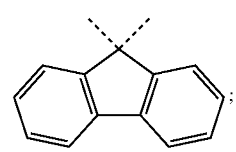

;

$R_{14}$ is a substituted or unsubstituted $C_{6-60}$ aryl;

[Chemical Formula 2]

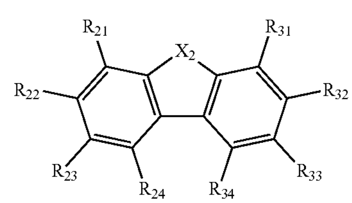

wherein in Chemical Formula 2:

one of $R_{21}$, $R_{22}$, $R_{23}$, and $R_{24}$ is -$L_{21}$-$Ar_1$, and the remaining are hydrogen;

one of $R_{31}$, $R_{32}$, $R_{33}$, and $R_{34}$ is -$L_{22}$-$Ar_2$, and the remaining are hydrogen;

with the proviso that the case where $R_{21}$ is $-L_{21}-Ar_1$ and $R_{31}$ is $-L_{22}-Ar_2$, or $R_{22}$ is $-L_{21}-Ar_1$ and $R_{32}$ is $-L_{22}-Ar_2$, or $R_{23}$ is $-L_{21}-Ar_1$ and $R_{33}$ is $-L_{22}-Ar_2$, or $R_{24}$ is $-L_{21}-Ar_1$ and $R_{34}$ is $-L_{22}-Ar_2$ is excluded;

$L_{21}$ is a single bond; or a substituted or unsubstituted $C_{6-60}$ arylene;

$L_{22}$ is a single bond; or a substituted or unsubstituted $C_{6-60}$ arylene;

$X_2$ is O, or S;

$Ar_1$ is the following Chemical Formula 3:

[Chemical Formula 3]

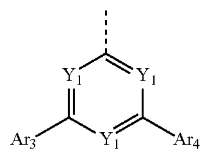

wherein in Chemical Formula 3:

each $Y_1$ is independently N, or CH, with the proviso that at least one of $Y_1$ is N;

$Ar_3$ and $Ar_4$ are each independently a substituted or unsubstituted $C_{6-60}$ aryl, or a substituted or unsubstituted $C_{2-60}$ heteroaryl containing one or more heteroatoms selected from the group consisting of N, O and S;

$Ar_2$ is selected from the group consisting of the following:

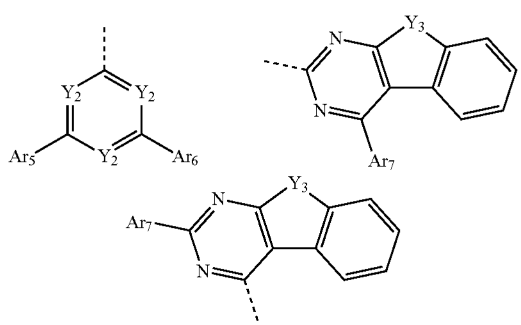

wherein:

each $Y_2$ is independently N, or CH, with the proviso that at least one of $Y_2$ is N;

$Y_3$ is O, or S; and $Ar_5$, $Ar_6$ and $Ar_7$ are each independently a substituted or unsubstituted $C_{6-60}$ aryl, or a substituted or unsubstituted $C_{2-60}$ heteroaryl containing one or more heteroatoms selected from the group consisting of N, O and S.

Advantageous Effects

The organic light emitting device described above can improve the efficiency, achieve low driving voltage and/or improve lifetime characteristics in the organic light emitting device by adjusting the compound included in the light emitting layer.

BRIEF DESCRIPTION OF THE DRAWINGS

FIG. 1 shows an example of an organic light emitting device comprising a substrate 1, an anode 2, a light emitting layer 3, and a cathode 4.

FIG. 2 shows an example of an organic light emitting device comprising a substrate 1, an anode 2, a hole injection layer 5, a hole transport layer 6, a light emitting layer 7, an electron transport layer 8 and a cathode 4.

FIG. 3 shows an example of an organic light emitting device comprising a substrate 1, an anode 2, a hole injection layer 5, a hole transport layer 6, an electron blocking layer 9, a light emitting layer 7, an electron transport layer 8, an electron injection layer 10 and a cathode 4.

FIG. 4 shows an example of an organic light emitting device comprising a substrate 1, an anode 2, a hole injection layer 5, a hole transport layer 6, a light emitting layer 7, a hole blocking layer 11, an electron transport layer 8, an electron injection layer 10 and a cathode 4.

DETAILED DESCRIPTION

Hereinafter, embodiments of the present invention will be described in more detail to facilitate understanding of the invention.

As used herein, the notation

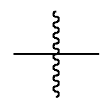

or  means a bond linked to another substituent group.

As used herein, the term "substituted or unsubstituted" means being unsubstituted or substituted with one or more substituents selected from the group consisting of deuterium, a halogen group, a nitrile group, a nitro group, a hydroxy group, a carbonyl group, an ester group, an imide group, an amino group, a phosphine oxide group, an alkoxy group, an aryloxy group, an alkyithioxy group, an arylthioxy group, an alkylsulfoxy group, an arylsulfoxy group, a silyl group, a boron group, an alkyl group, a cycloalkyl group, an alkenyl group, an aryl group, an aralkyl group, an aralkenyl group, an alkylaryl group, an alkylamine group, an aralkylamine group, a heteroarylamine group, an arylamine group, an arylphosphine group, and a heterocyclic group containing at least one of N, O and S atoms, or being unsubstituted or substituted with a substituent to which two or more substituents are linked among the substituents exemplified above. For example, "the substituent to which two or more substituents are linked" can be a biphenyl group. That is, the biphenyl group can also be an aryl group and can be interpreted as a substituent to which two phenyl groups are linked.

In the present specification, the number of carbon atoms of a carbonyl group is not particularly limited, but is preferably 1 to 40. Specifically, the carbonyl group can be a compound having the following structural formulas, but is not limited thereto:

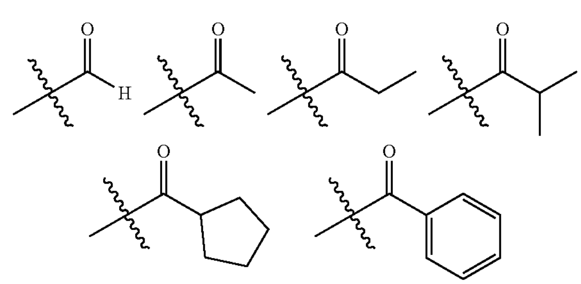

-continued

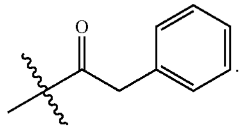

In the present specification, an ester group can have a structure in which oxygen of the ester group can be substituted by a straight-chain, branched-chain, or cyclic alkyl group having 1 to 25 carbon atoms, or an aryl group having 6 to 25 carbon atoms. Specifically, the ester group can be a compound having the following structural formulas, but is not limited thereto:

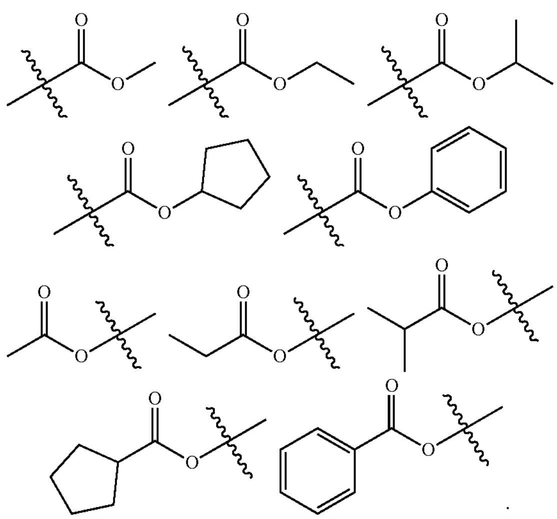

In the present specification, the number of carbon atoms of an imide group is not particularly limited, but is preferably 1 to 25. Specifically, the imide group can be a compound having the following structural formulas, but is not limited thereto:

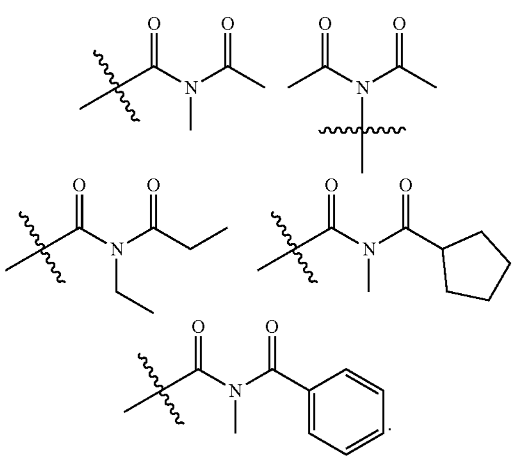

In the present specification, a silyl group specifically includes a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but is not limited thereto.

In the present specification, a boron group specifically includes a trimethylboron group, a triethylboron group, a t-butyldimethylboron group, a triphenylboron group, and a phenylboron group, but is not limited thereto.

In the present specification, examples of a halogen group include fluorine, chlorine, bromine, or iodine.

In the present specification, the alkyl group can be straight-chain or branched-chain, and the number of carbon atoms thereof is not particularly limited, but is preferably 1 to 40. According to one embodiment, the number of carbon atoms of the alkyl group is 1 to 20. According to another embodiment, the number of carbon atoms of the alkyl group is 1 to 10. According to another embodiment, the number of carbon atoms of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto.

In the present specification, the alkenyl group can be straight-chain or branched-chain, and the number of carbon atoms thereof is not particularly limited, but is preferably 2 to 40. According to one embodiment, the number of carbon atoms of the alkenyl group is 2 to 20. According to another embodiment, the number of carbon atoms of the alkenyl group is 2 to 10. According to still another embodiment, the number of carbon atoms of the alkenyl group is 2 to 6. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present specification, a cycloalkyl group is not particularly limited, but the number of carbon atoms thereof is preferably 3 to 60. According to one embodiment, the number of carbon atoms of the cycloalkyl group is 3 to 30. According to another embodiment, the number of carbon atoms of the cycloalkyl group is 3 to 20. According to still another embodiment, the number of carbon atoms of the cycloalkyl group is 3 to 6. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, an aryl group is not particularly limited, but preferably has 6 to 60 carbon atoms, and it can be a monocyclic aryl group or a polycyclic aryl group. According to one embodiment, the number of carbon atoms of the aryl group is 6 to 30. According to one embodiment, the number of carbon atoms of the aryl group is 6 to 20. The aryl group can be a phenyl group, a biphenyl group, a terphenyl group or the like as the monocyclic aryl group, but is not limited thereto. The polycyclic aryl group includes a naphthyl group, an anthracenyl group, a phenanthryl group, a pyrenyl group, a perylenyl group, a chrysenyl group, a fluorenyl group or the like, but is not limited thereto.

In the present specification, a fluorenyl group can be substituted, and two substituent groups can be bonded to each other to form a spiro structure. In the case where the fluorenyl group is substituted,

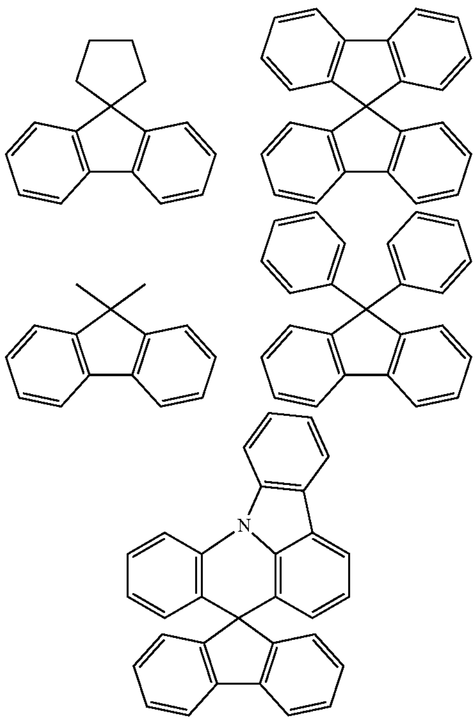

and the like can be formed. However, the structure is not limited thereto.

In the present specification, a heterocyclic group is a heterocyclic group including one or more of O, N, Si and S as a heteroatom, and the number of carbon atoms thereof is not particularly limited, but is preferably 2 to 60. Examples of the heterocyclic group include a thiophene group, a furan group, a pyrrole group, an imidazole group, a thiazole group, an oxazol group, an oxadiazol group, a triazol group, a pyridyl group, a bipyridyl group, a pyrimidyl group, a triazine group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazol group, a benzocarbazole group, a benzothiophene group, a dibenzothiophene group, a benzofuranyl group, a phenanthroline group, an isoxazolyl group, a thiadiazolyl group, a phenothiazinyl group, a dibenzofuranyl group, and the like, but are not limited thereto.

In the present specification, the aryl group in the aralkyl group, the aralkenyl group, the alkylaryl group and the arylamine group is the same as the aforementioned examples of the aryl group. In the present specification, the alkyl group in the aralkyl group, the alkylaryl group and the alkylamine group is the same as the aforementioned examples of the alkyl group. In the present specification, the heteroaryl in the heteroarylamine can be applied to the aforementioned description of the heterocyclic group. In the present specification, the alkenyl group in the aralkenyl group is the same as the aforementioned examples of the alkenyl group. In the present specification, the aforementioned description of the aryl group can be applied except that the arylene is a divalent group. In the present specification, the aforementioned description of the heterocyclic group can be applied except that the heteroarylene is a divalent group. In the present specification, the aforementioned description of the aryl group or cycloalkyl group can be applied except that the hydrocarbon ring is not a monovalent group but formed by combining two substituent groups. In the present specification, the aforementioned description of the heterocyclic group can be applied, except that the heterocyclic group is not a monovalent group but formed by combining two substituent groups.

An embodiment of the prevent invention provides an organic light emitting device including an anode; a cathode that is disposed opposite to the anode; and one or more organic material layers that are disposed between the anode and the cathode, wherein the organic material layer includes a light emitting layer, and wherein the light emitting layer includes the compound of Chemical Formula 1 and the compound of Chemical Formula 2.

The organic light emitting device according the present invention can improve the efficiency, achieve low driving voltage and/or improve lifetime characteristics in the organic light emitting device by adjusting the compound included in the light emitting layer.

Hereinafter, the present invention will be described in detail with respect to each component.

Anode and Cathode

As the anode material, generally, a material having a large work function is preferably used so that holes can be smoothly injected into the organic material layer. Specific examples of the anode material include metals such as vanadium, chrome, copper, zinc, and gold, or an alloy thereof; metal oxides such as zinc oxides, indium oxides, indium tin oxides (ITO), and indium zinc oxides (IZO); a combination of metals and oxides, such as ZnO:Al or $SnO_2$:Sb; conductive polymers such as poly(3-methylthiophene), poly[3,4-(ethylene-1,2-dioxy)thiophene](PEDOT), polypyrrole, and polyaniline, and the like, but are not limited thereto.

As the cathode material, generally, a material having a small work function is preferably used so that electrons can be easily injected into the organic material layer. Specific examples of the cathode material include metals such as magnesium, calcium, sodium, potassium, titanium, indium, yttrium, lithium, gadolinium, aluminum, silver, tin, and lead, or an alloy thereof; a multilayered structure material such as LiF/Al or $LiO_2$/Al, and the like, but are not limited thereto.

Also, a hole injection layer can be further included on the anode. The hole injection layer is made of a hole injection material, and the hole injection material is preferably a compound which has a capability of transporting the holes, thus has a hole injecting effect in the anode and an excellent hole-injecting effect to the light emitting layer or the light emitting material, prevents excitons produced in the light emitting layer from moving to an electron injection layer or the electron injection material, and is excellent in the ability to form a thin film.

It is preferable that a HOMO (highest occupied molecular orbital) of the hole injection material is between the work function of the anode material and a HOMO of a peripheral organic material layer. Specific examples of the hole injection material include metal porphyrine, oligothiophene, an arylamine-based organic material, a hexanitrilehexaazatriphenylene-based organic material, a quinacridone-based organic material, a perylene-based organic material, anthraquinone, polyaniline and polythiophene-based conductive polymer, and the like, but are not limited thereto.

Hole Transport Layer

The hole transport layer used in the present invention is a layer receiving holes from the anode or the hole injection layer which is formed on the anode, and transporting the holes to the light emitting layer. The hole transport material is suitably a material having large mobility to the holes, which can receive holes from the anode or the hole injection layer and transfer the holes to the light emitting layer.

Specific examples thereof include an arylamine-based organic material, a conductive polymer, a block copolymer in which a conjugate portion and a non-conjugate portion are present together, and the like, but are not limited thereto.

Light Emitting Layer

The light emitting material included in the light emitting layer is a material capable of emitting light in a visible light region by receiving holes and electrons from the hole transport layer and the electron transport layer, respectively, and combining them, and is preferably a material having favorable quantum efficiency for fluorescence or phosphorescence.

The light emitting layer can include a host material and a dopant material. In particular, in the present invention, the host material includes the compound of Chemical Formula 1 and the compound of Chemical Formula 2.

In Chemical Formula 1, preferably, $L_{11}$ is a single bond, or phenylene.

Preferably, $L_{12}$ is a single bond, or phenylene.

Preferably, $R_{11}$ is cyclohexyl, phenyl, phenyl substituted with tert-butyl, phenyl substituted with cyano, biphenylyl, terphenylyl, naphthyl, phenanthrenyl, triphenylenyl, dimethylfluorenyl, pyridinyl, dibenzofuranyl, dibenzothiophenyl, dibenzothiophenyl substituted with phenyl, or 9-phenylcarbazolyl.

Preferably, $R_{12}$ and $R_{13}$ are each independently hydrogen, cyano, tert-butyl, phenyl, phenyl substituted with cyano, pyridinyl, or 9-phenylcarbazolyl.

Preferably, $R_{14}$ is phenyl, or biphenylyl.

Representative examples of the compound of Chemical Formula 1 are as follows:

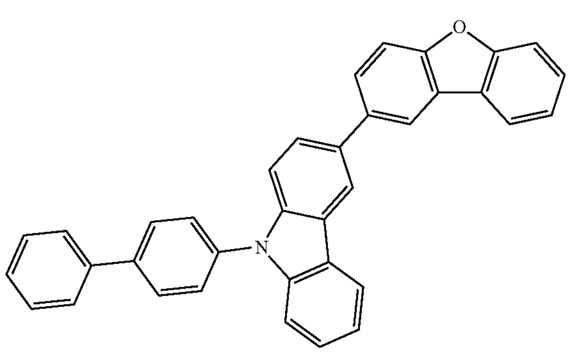

-continued

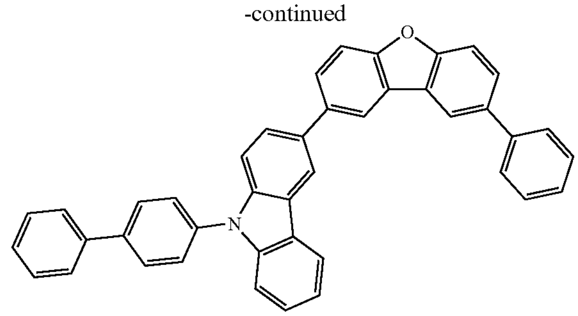

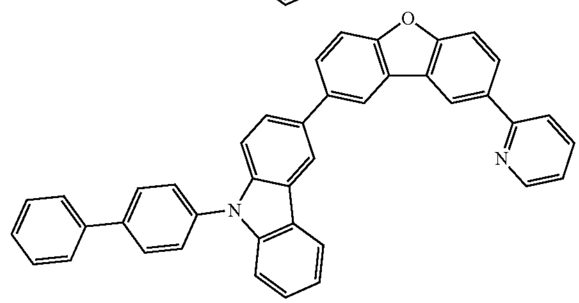

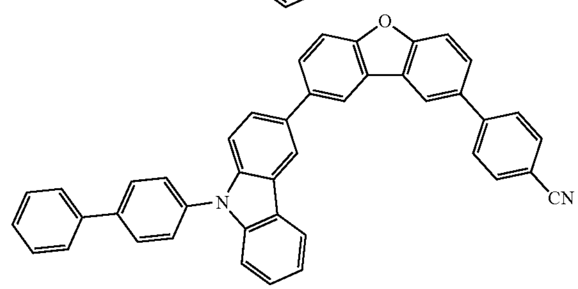

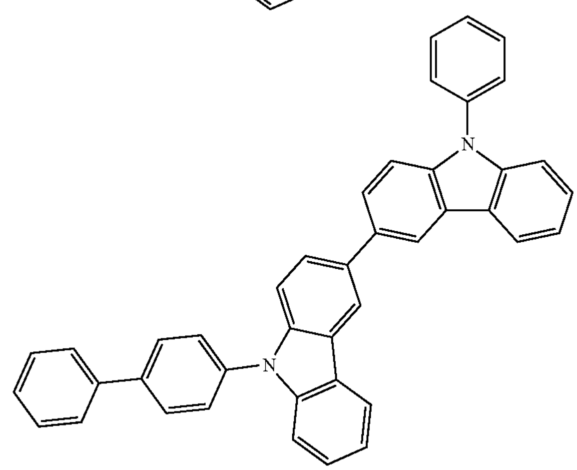

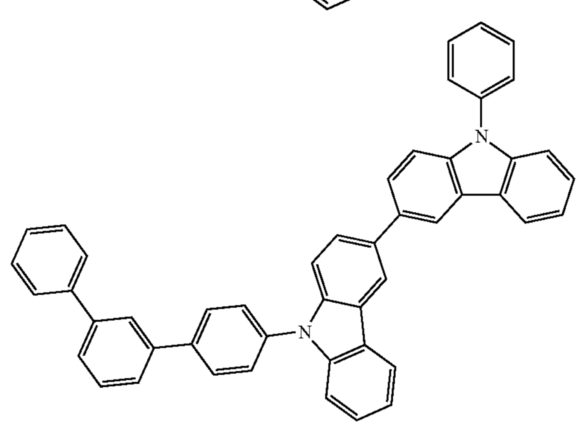

-continued
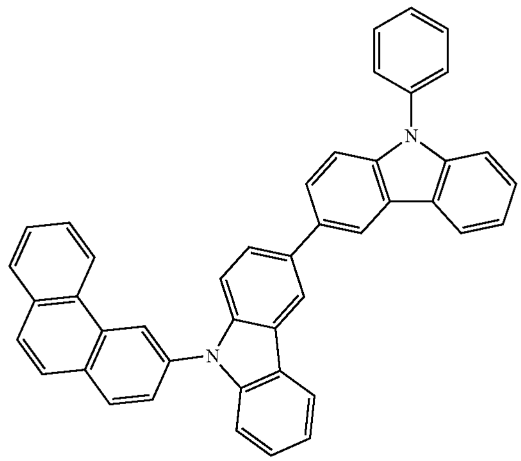
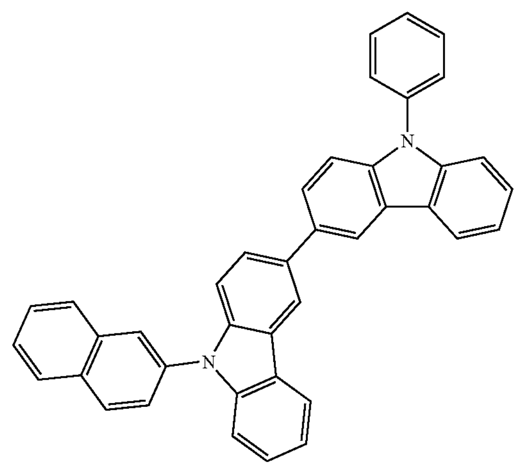
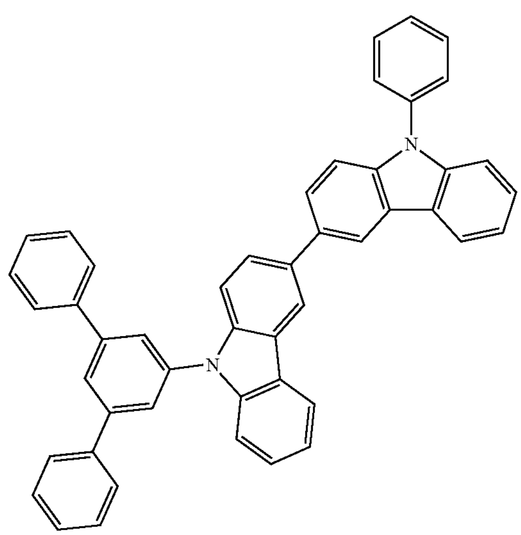
-continued
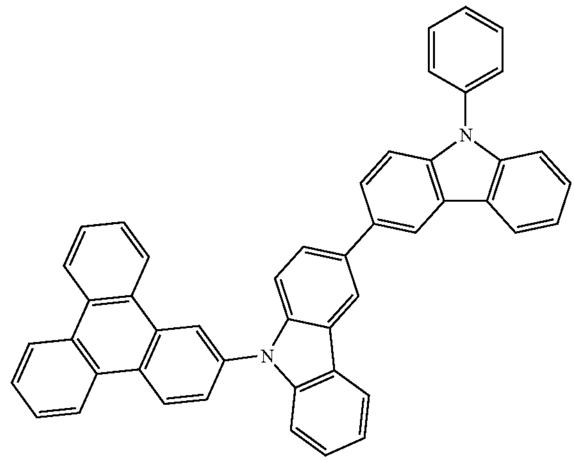
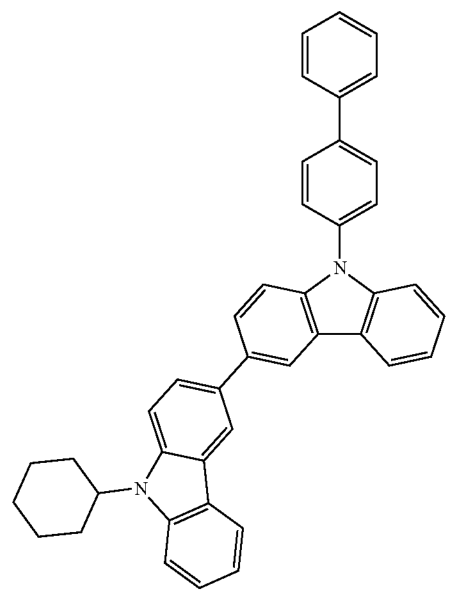
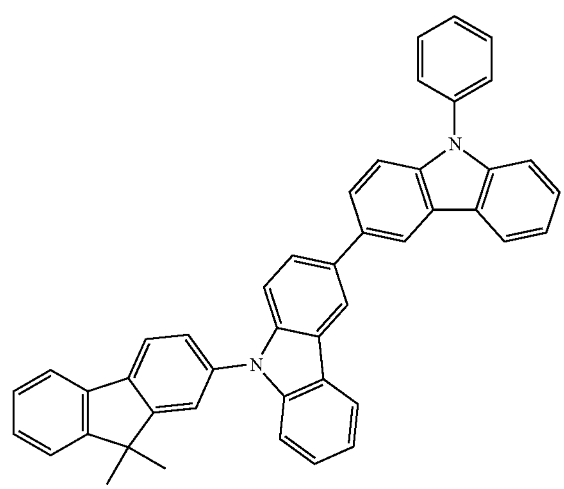

-continued
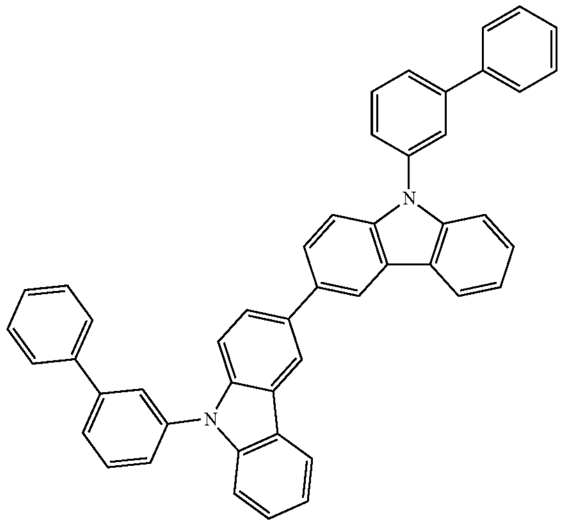
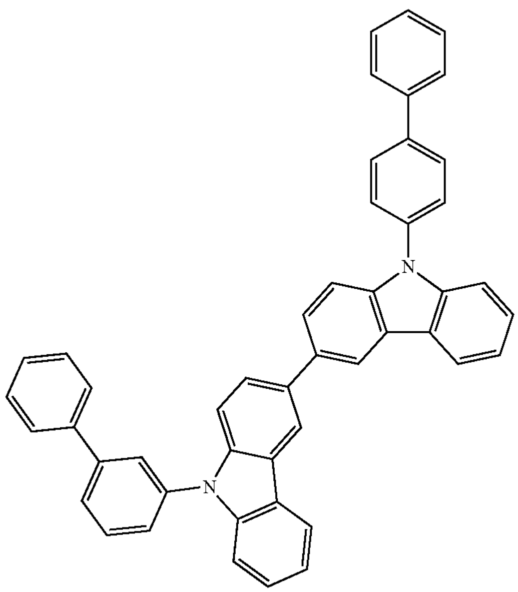
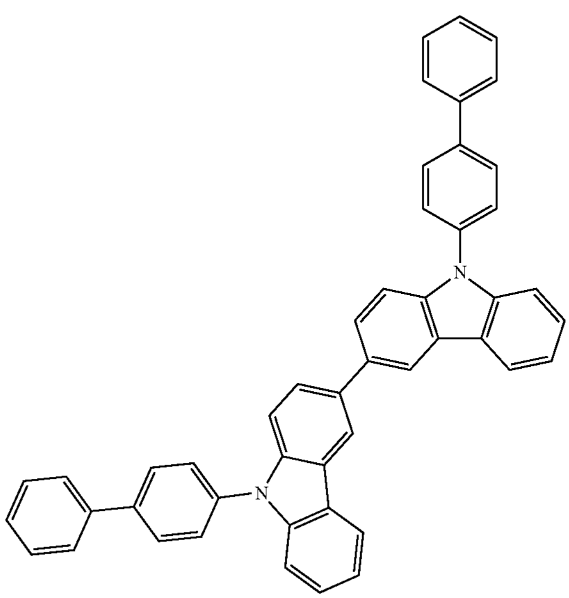
-continued
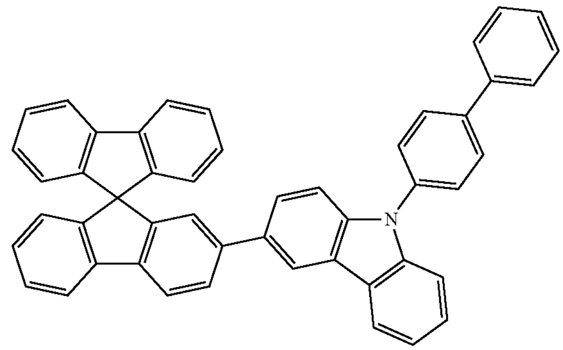
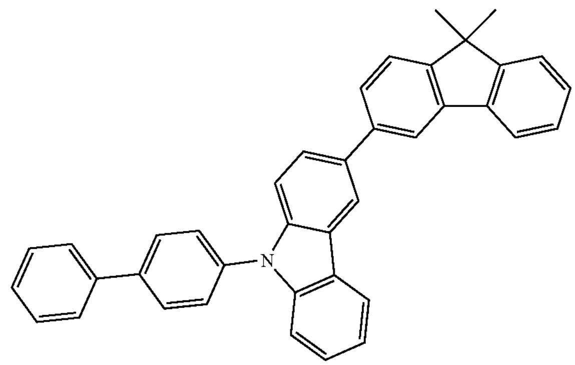
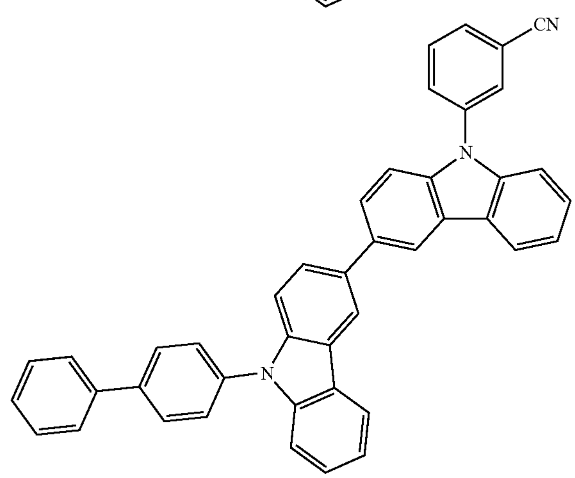
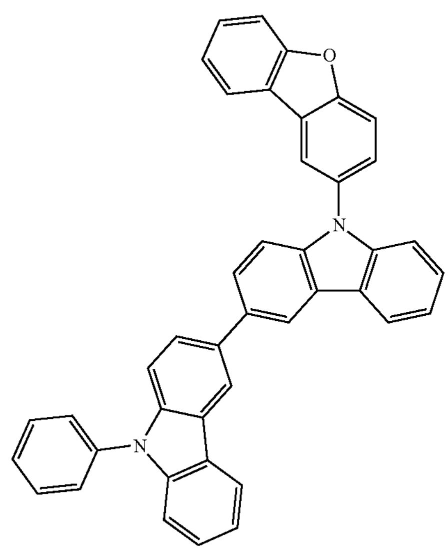

-continued
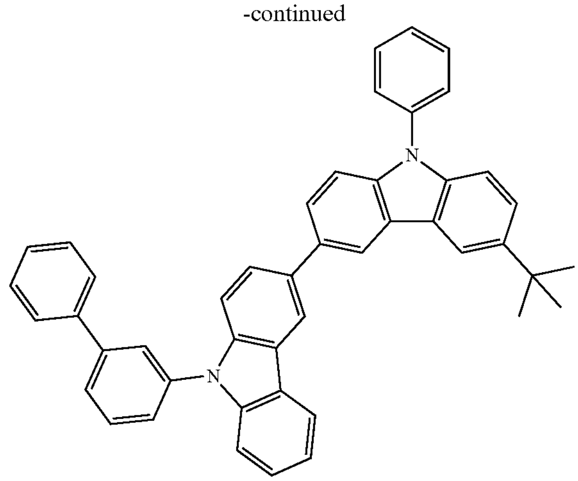
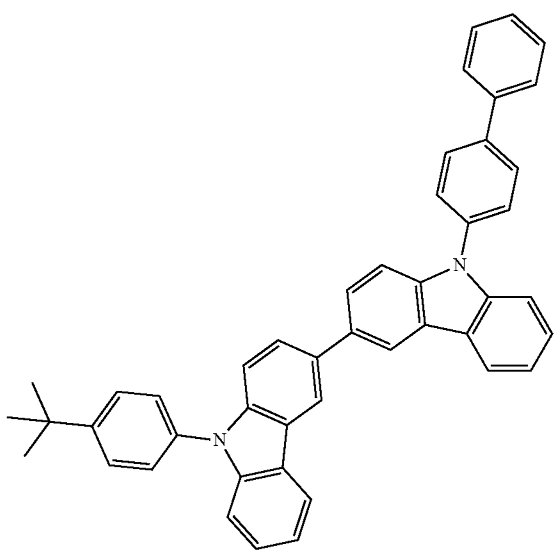
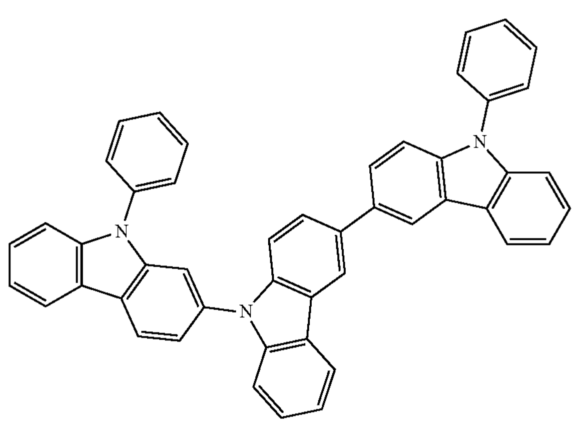
-continued
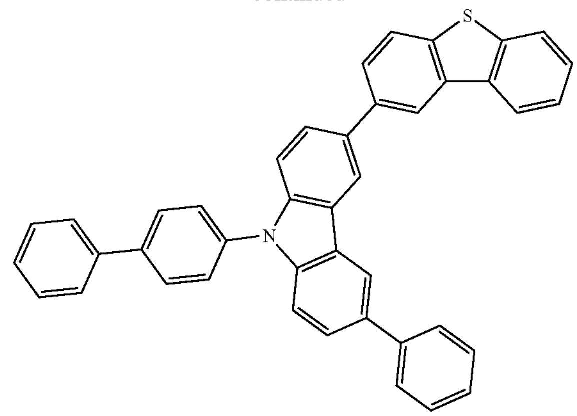
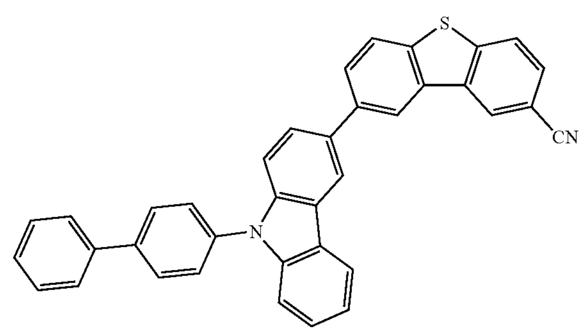
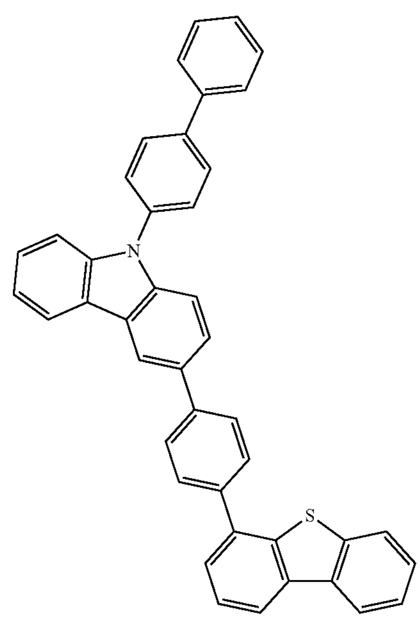

-continued
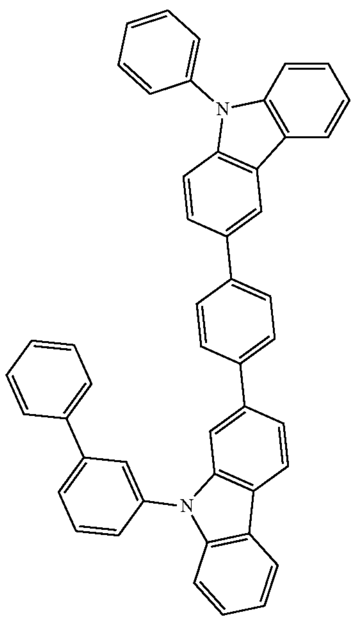
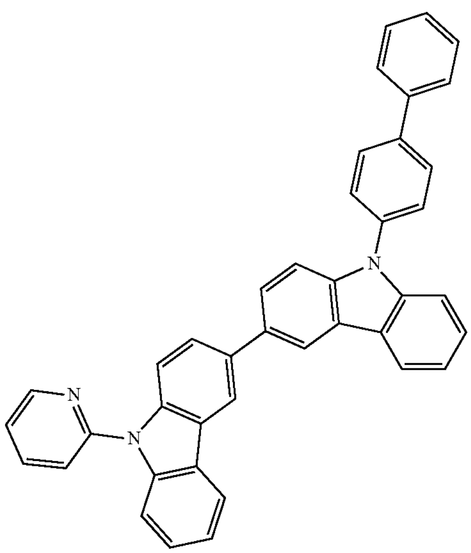
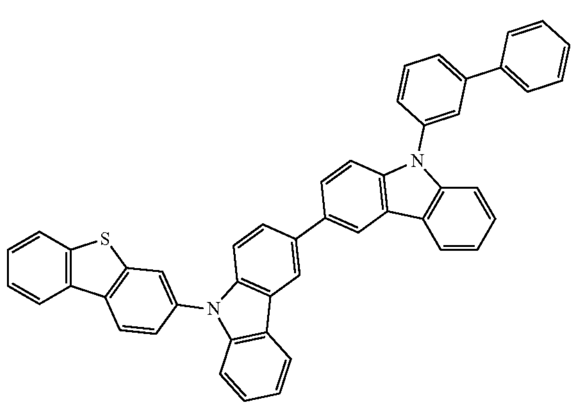
-continued
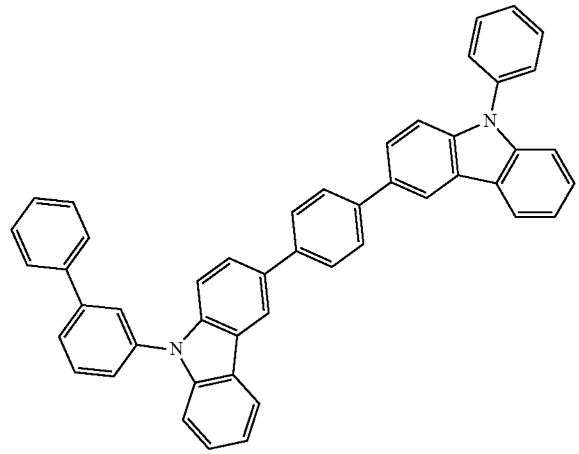
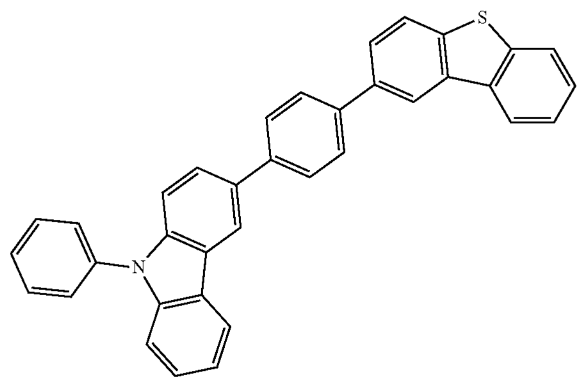
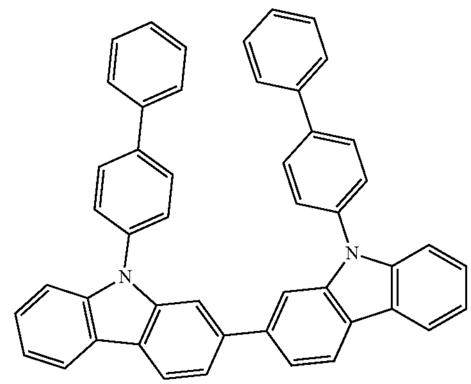
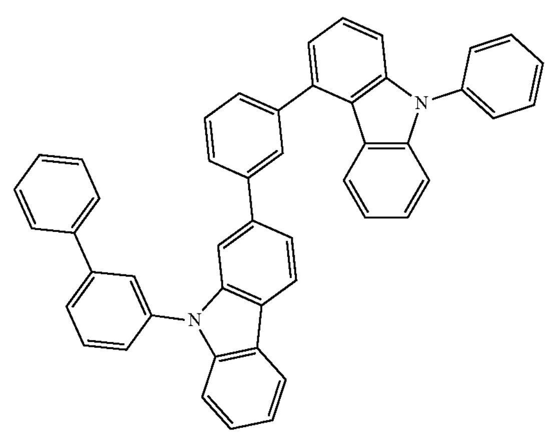

-continued
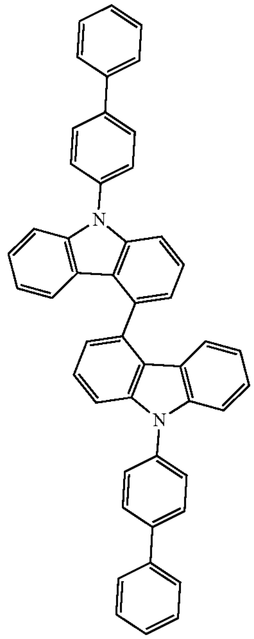
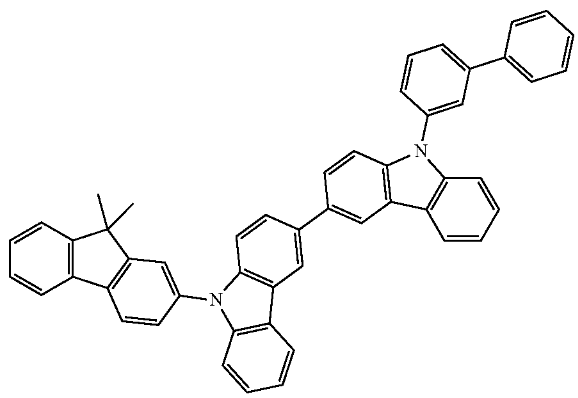
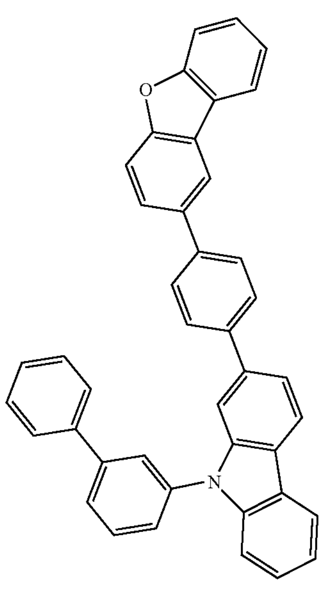
-continued
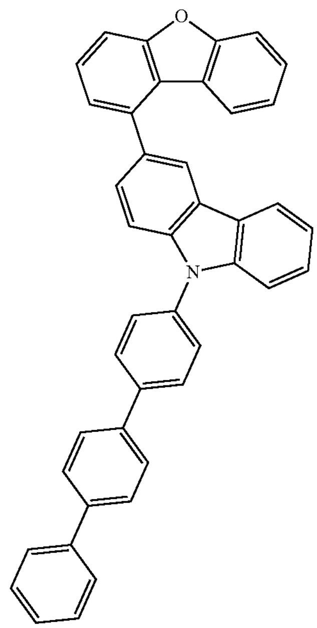
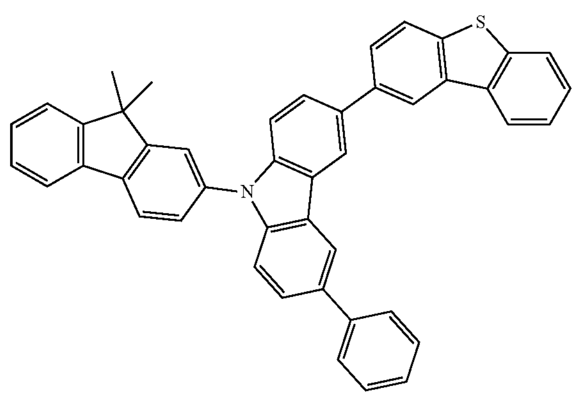
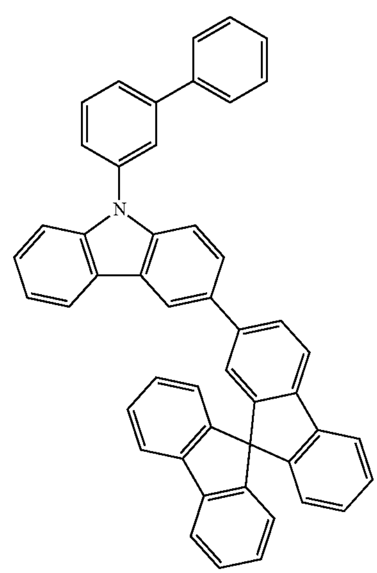

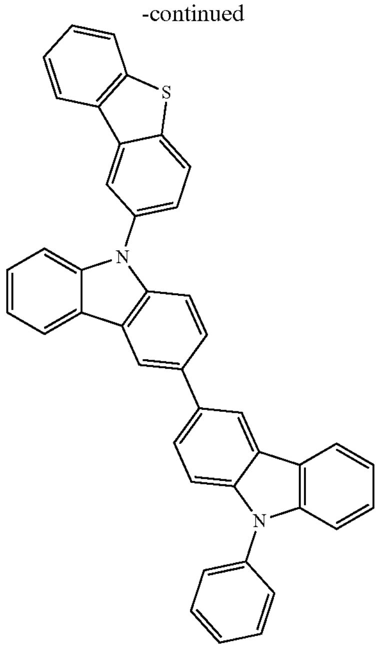
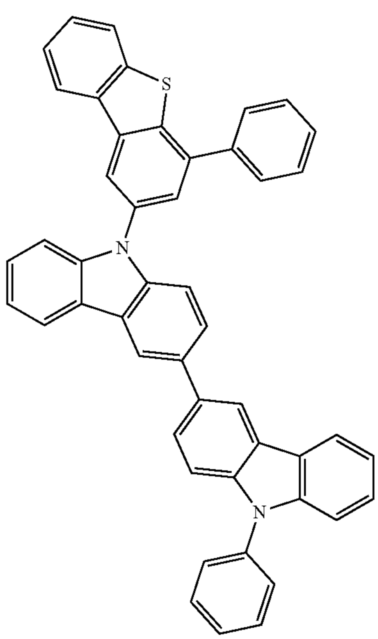
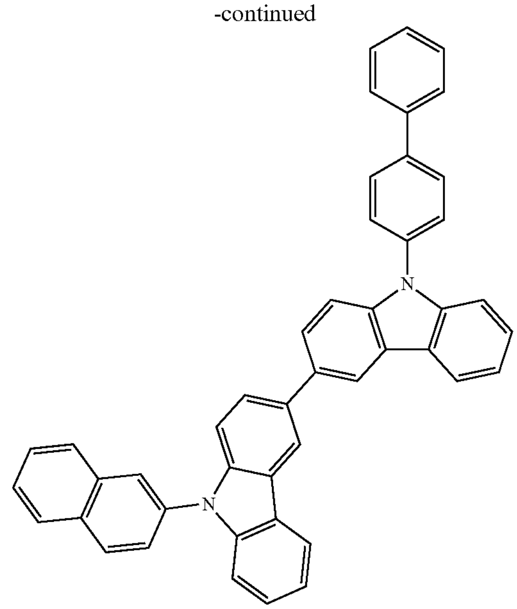
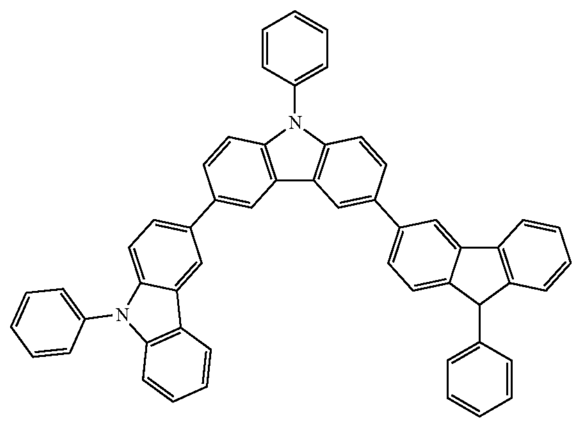
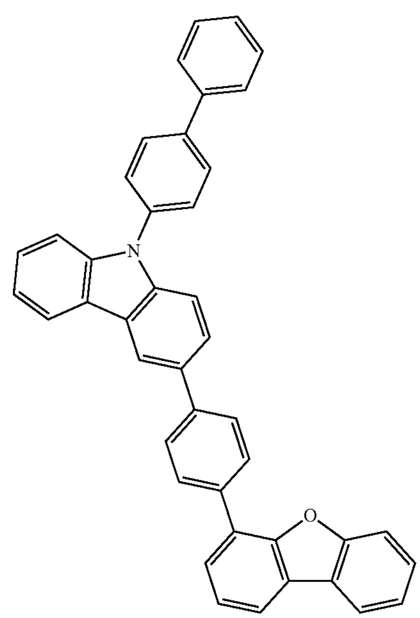
O

-continued
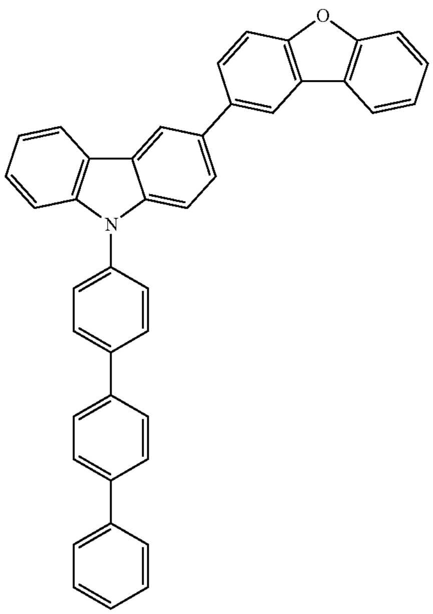
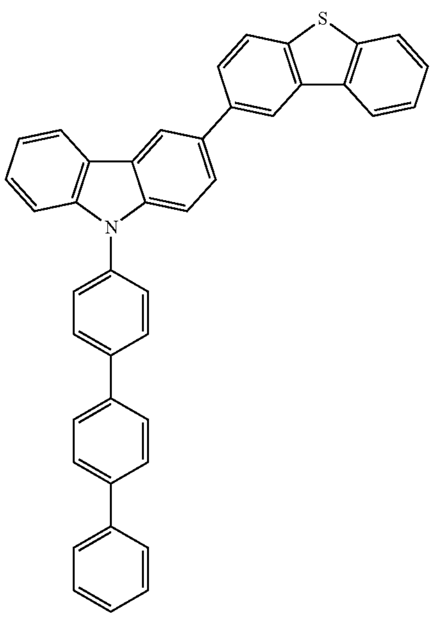
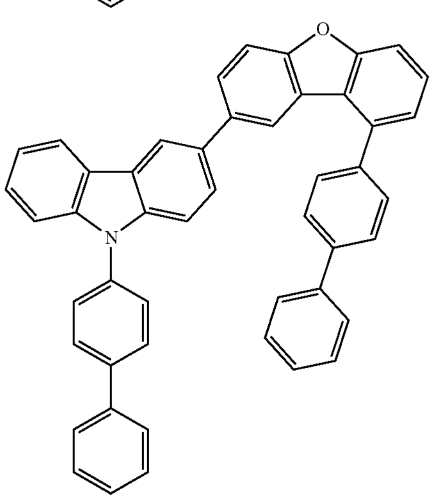
-continued
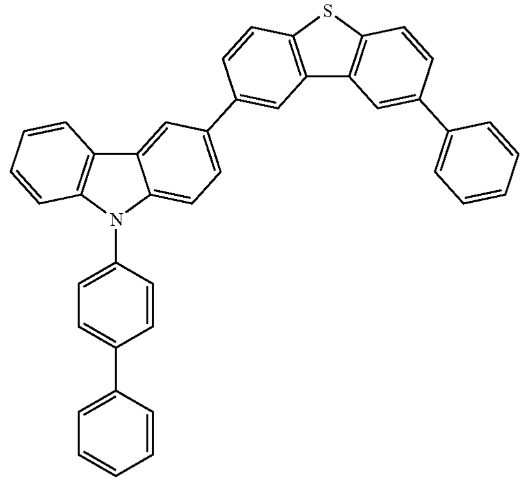
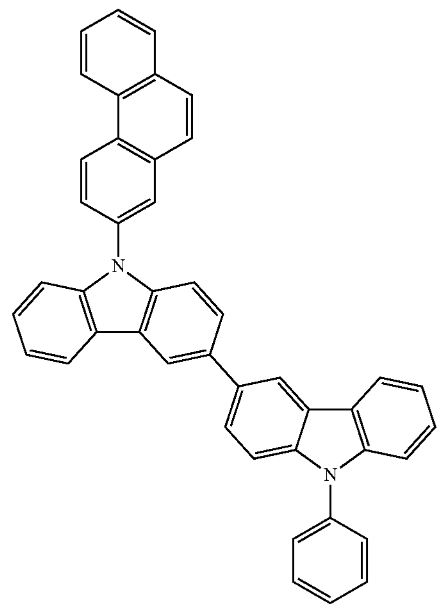
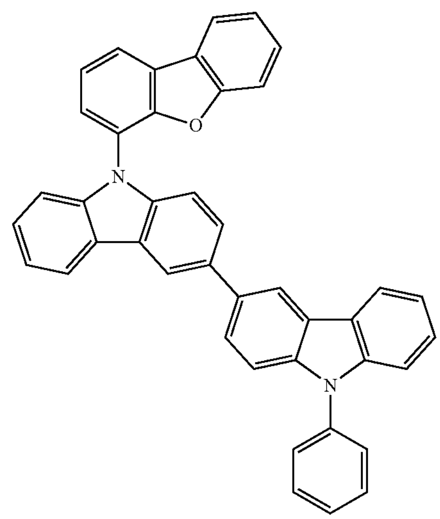

-continued
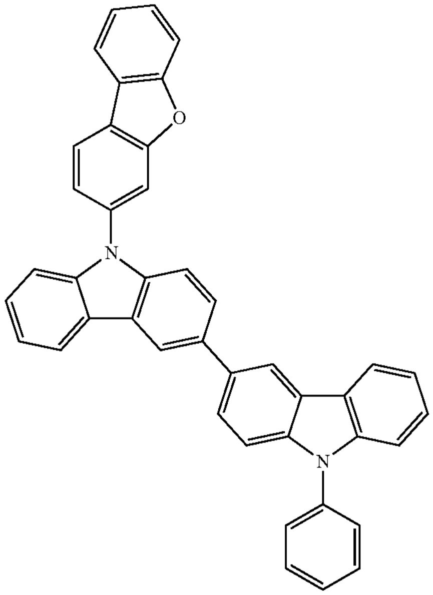
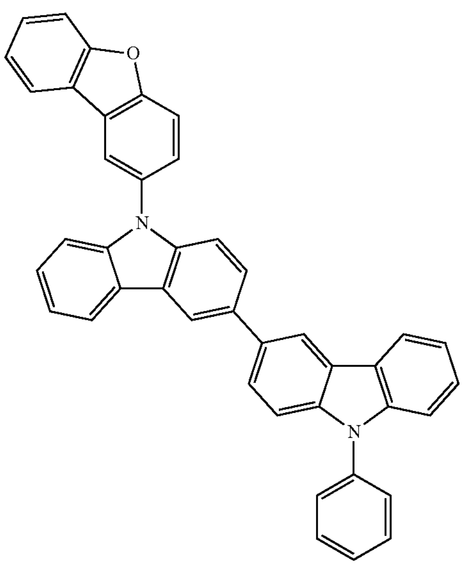
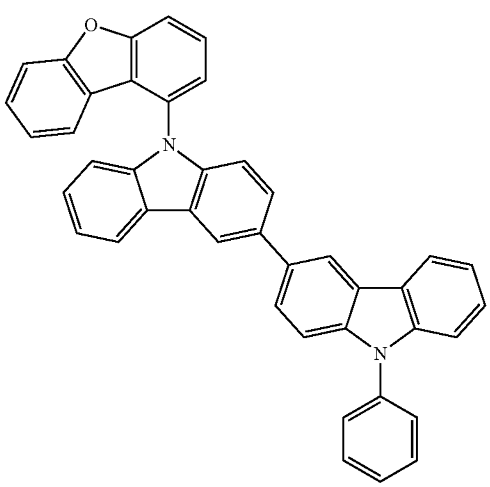
-continued
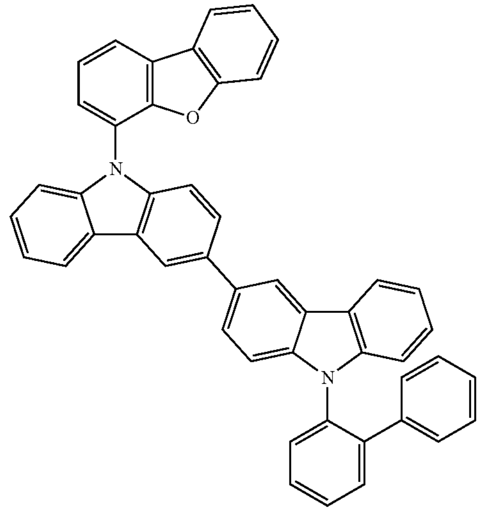
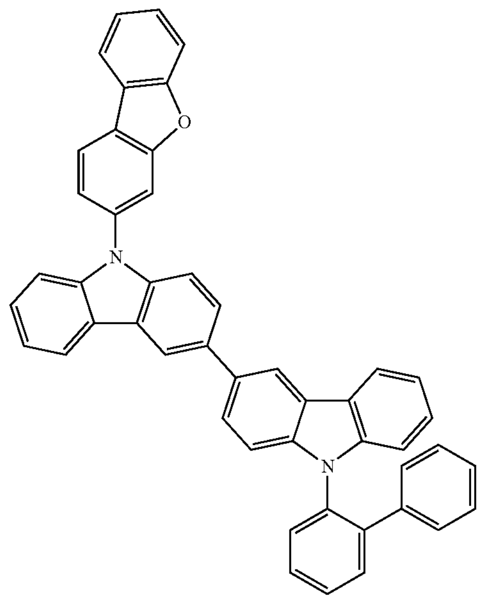
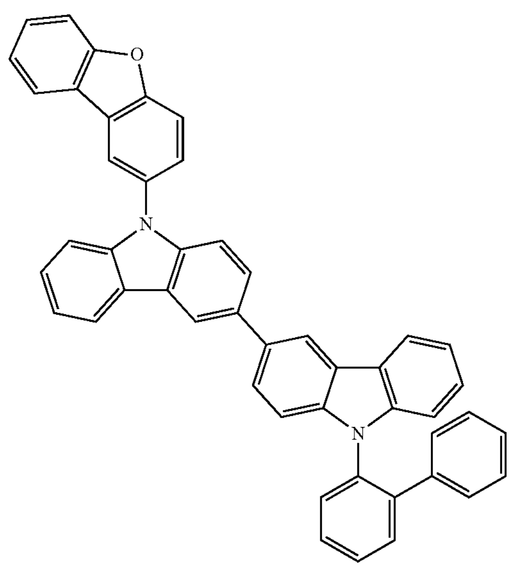

-continued
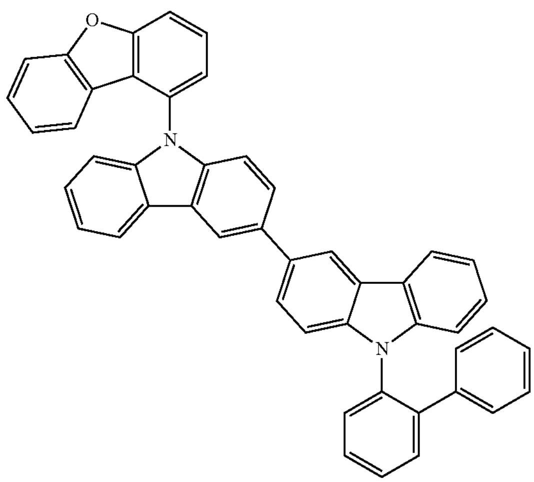
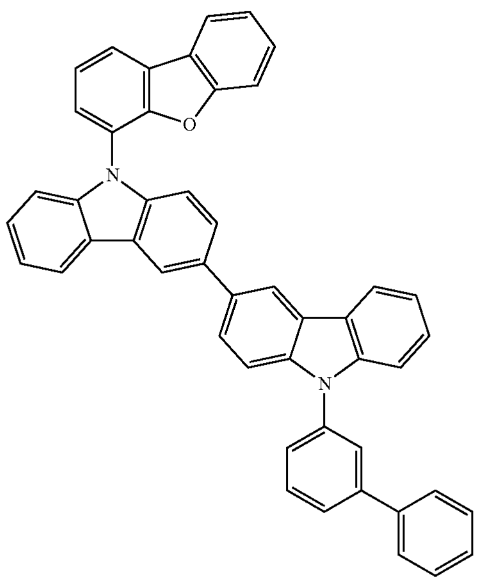
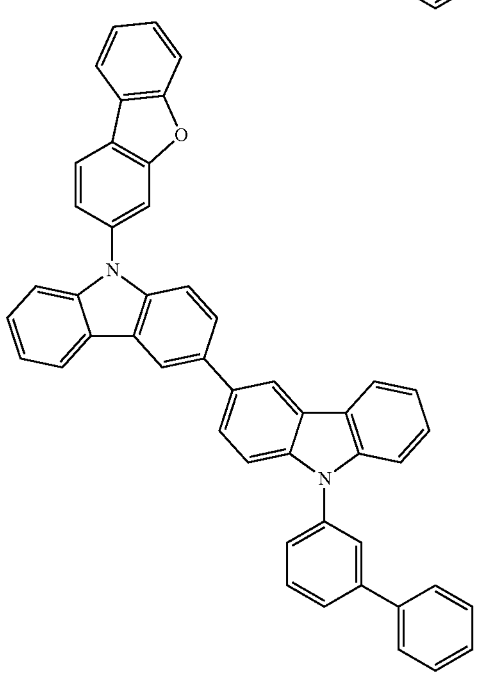
-continued
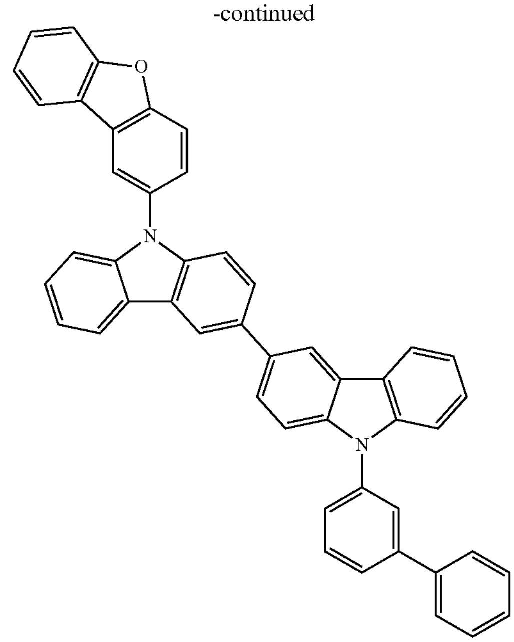
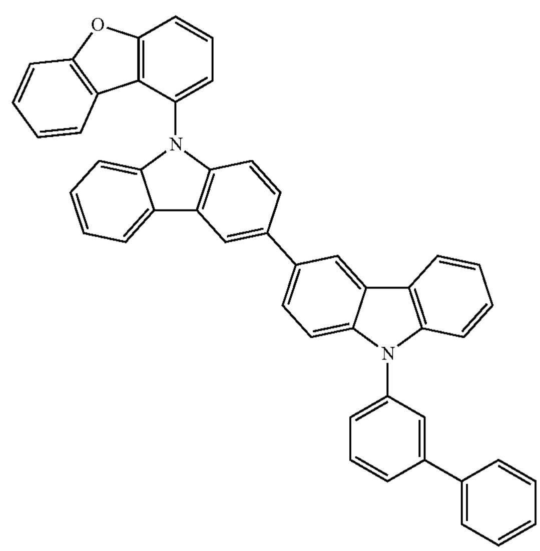

-continued
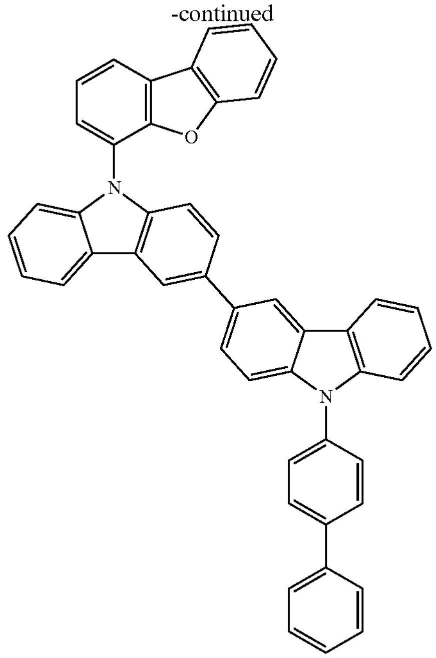
-continued
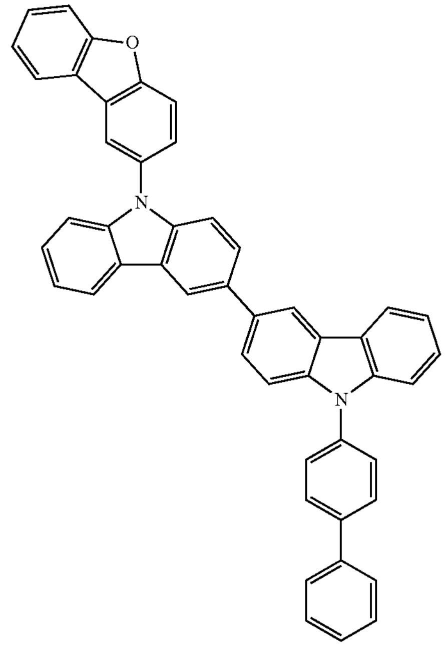
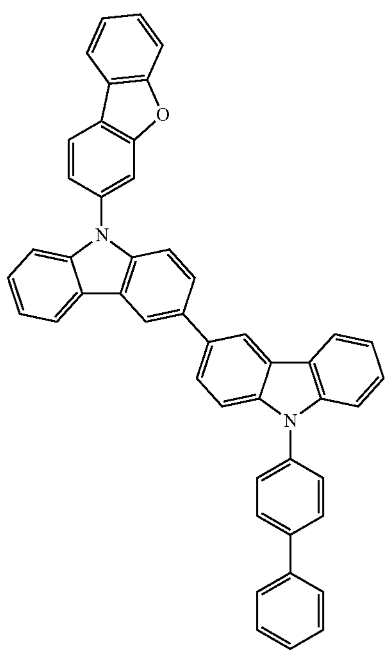
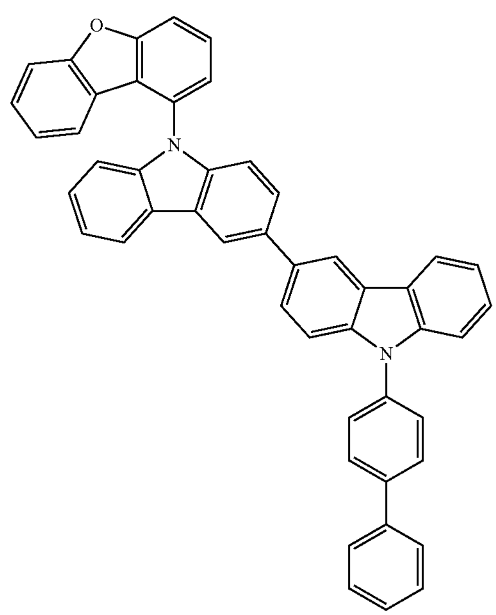

-continued
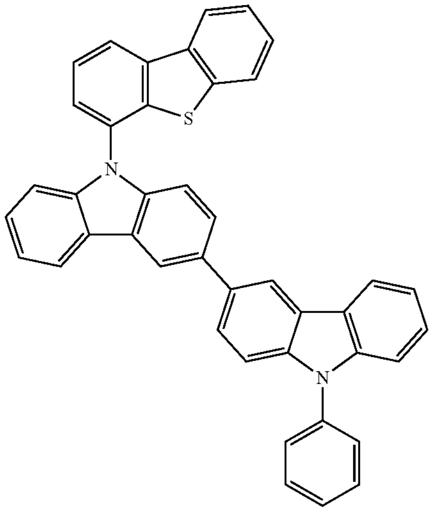
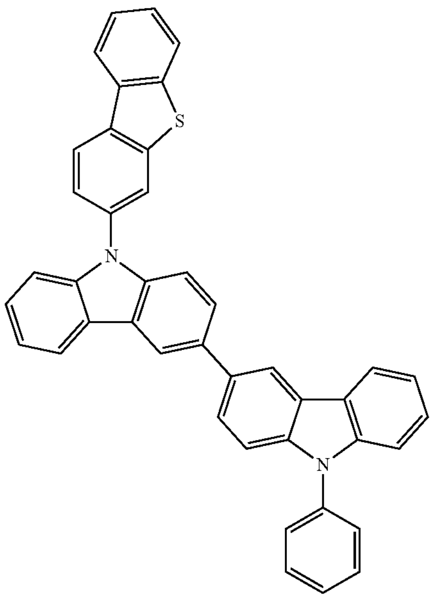
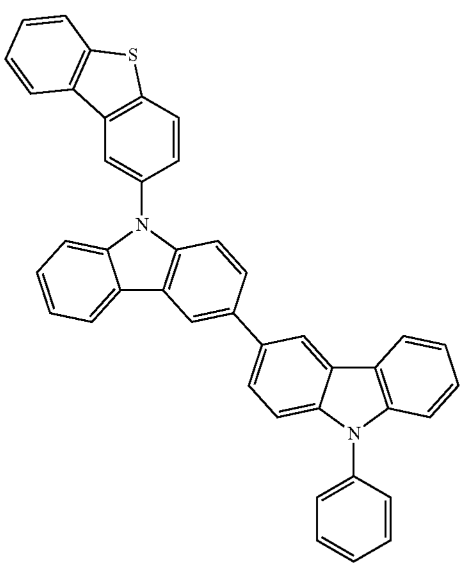
-continued
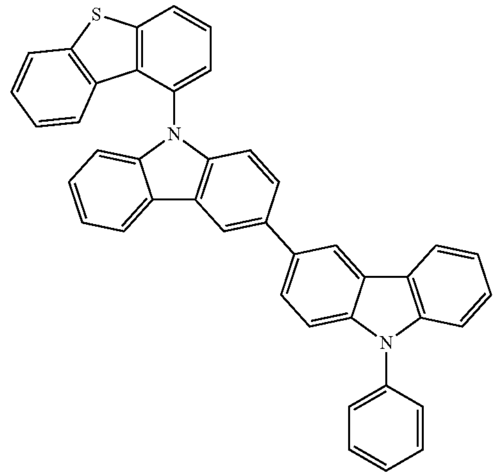
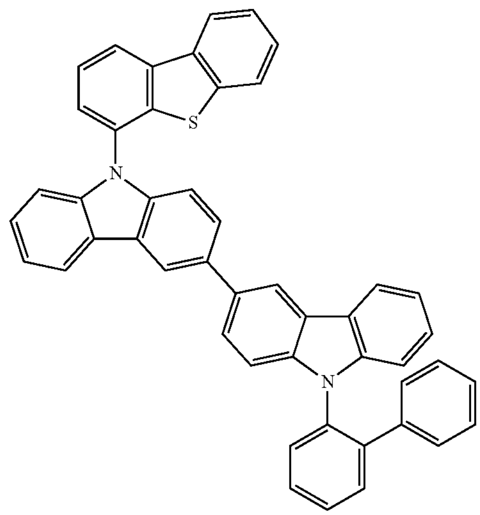
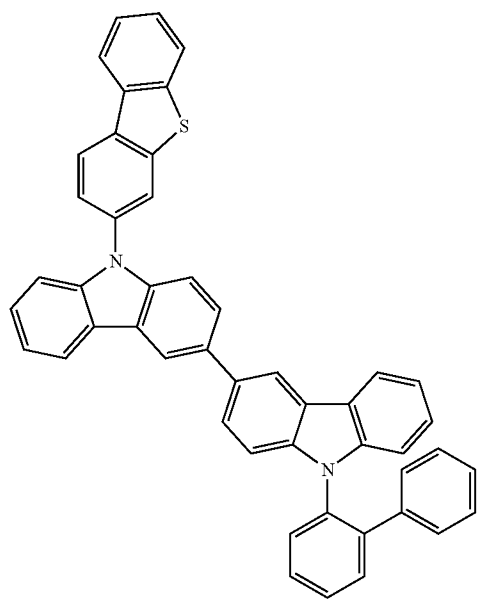

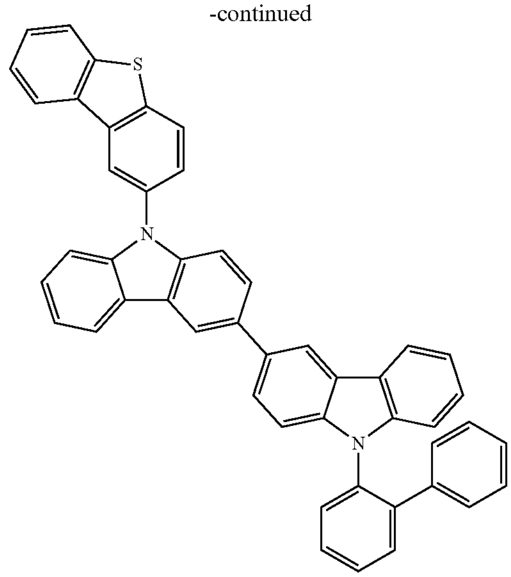
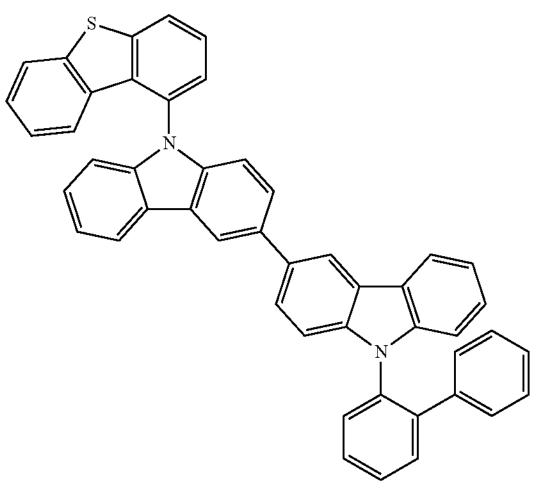
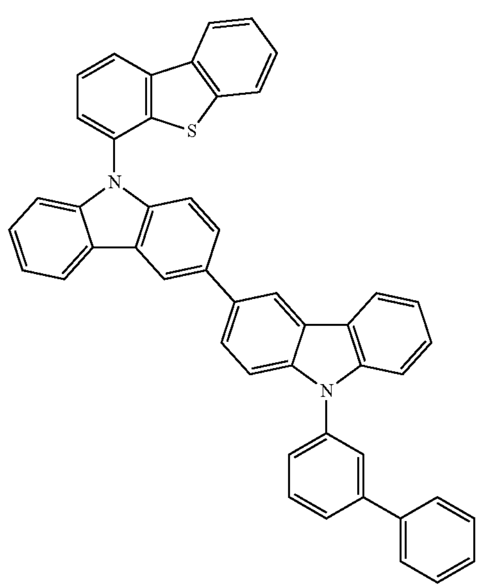
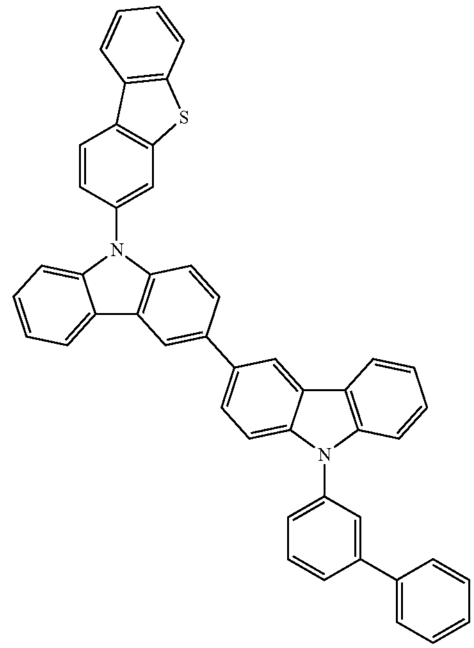
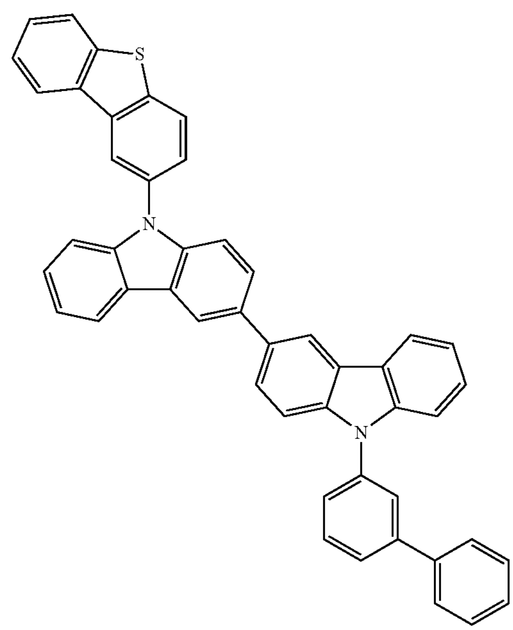

-continued
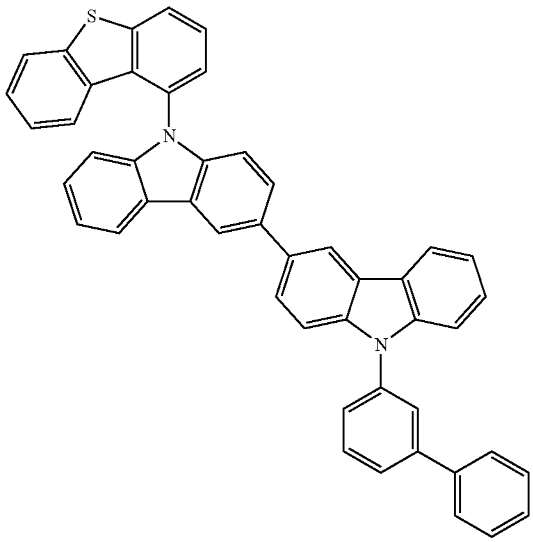
-continued
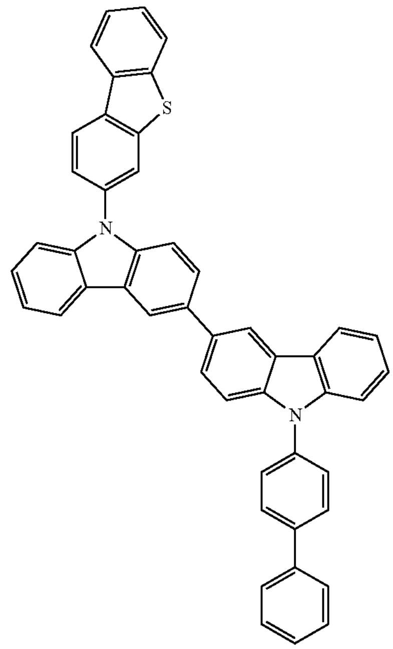
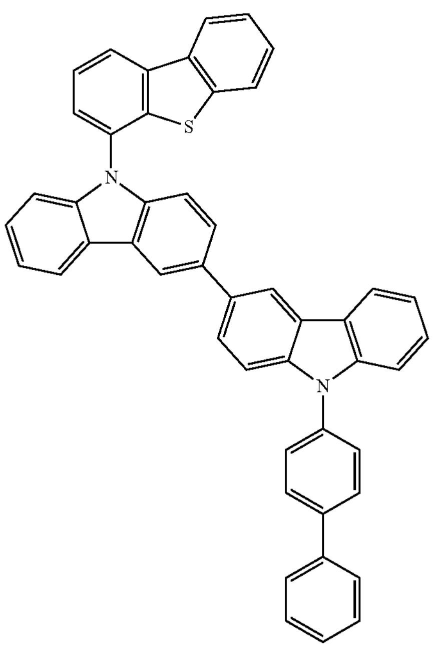
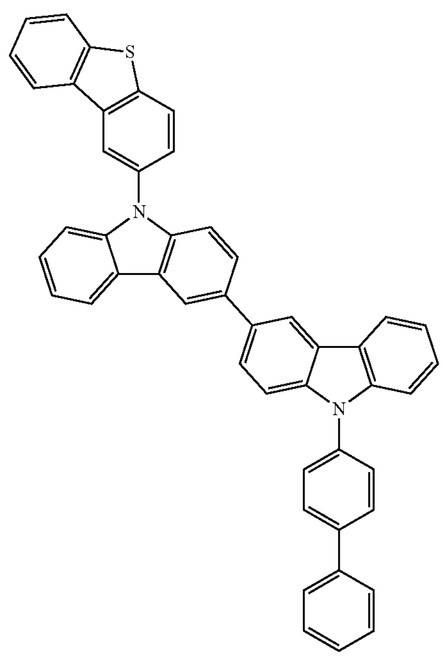

-continued

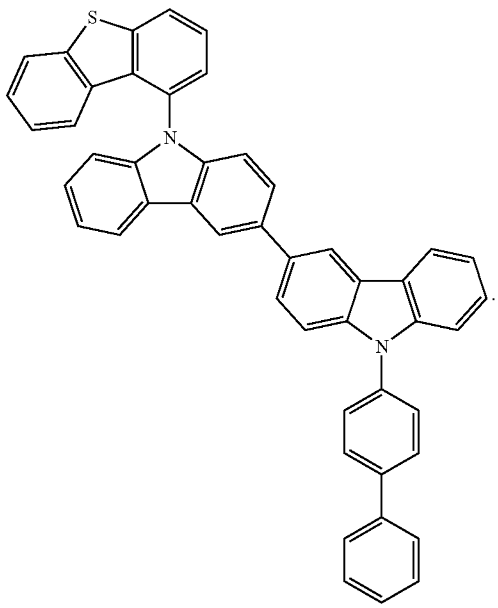 [SMILES: c1ccc(-c2ccc(-n3c4ccccc4c4cc(-c5ccc6c(c5)c5ccccc5n6-c5cccc6sc7ccccc7c56)ccc43)cc2)cc1]

In addition, the compound of Chemical Formula 1 can be prepared by the method as shown in Reaction Scheme 1 below.

Reaction Scheme 1

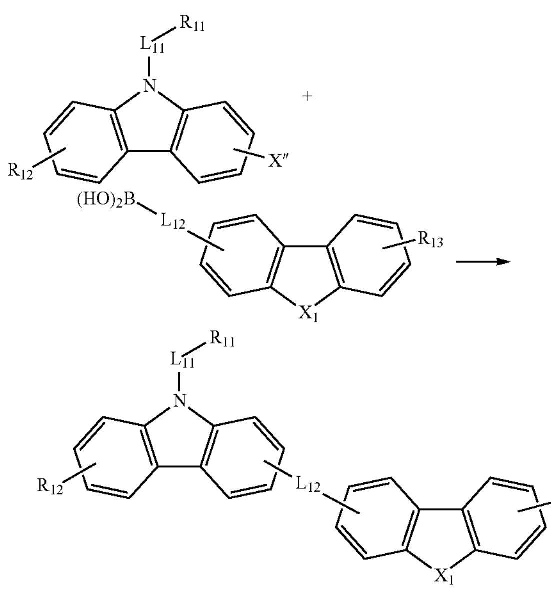

3

In Reaction Scheme 1, the remaining definitions excluding X" are the same as defined above, and X" is halogen and more preferably bromo or chloro.

The above reaction is a Suzuki coupling reaction, which is preferably carried out in the presence of a palladium catalyst and a base, and a reactive group for the Suzuki coupling reaction can be modified as known in the art. The above preparation method will be more specifically described in the Preparation Examples described hereinafter.

In Chemical Formula 2, preferably, the Chemical Formula 2 is any one formula selected from the group consisting of the following:

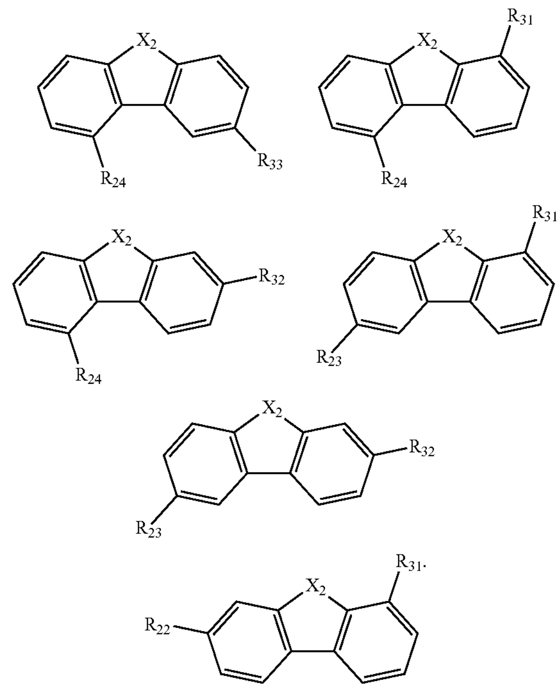

Preferably, $L_{21}$ is a single bond, or phenylene.

Preferably, $L_{22}$ is a single bond, or phenylene.

Preferably, $Ar_3$ and $Ar_4$ are each independently phenyl, biphenylyl, biphenylyl substituted with cyano, or dibenzofuranyl.

Preferably, $Ar_5$ and $Ar_6$ are each independently phenyl, phenyl substituted with carbazolyl, biphenylyl, biphenylyl substituted with cyano, dimethylfluorenyl, dibenzofuranyl, dibenzothiophenyl, or 9-phenylcarbazolyl.

Preferably, $Ar_7$ is phenyl, phenyl substituted with fluoro, phenyl substituted with trifluoromethyl, phenyl substituted with cyano, or biphenylyl.

Representative examples of the compound of Chemical Formula 2 are as follows:

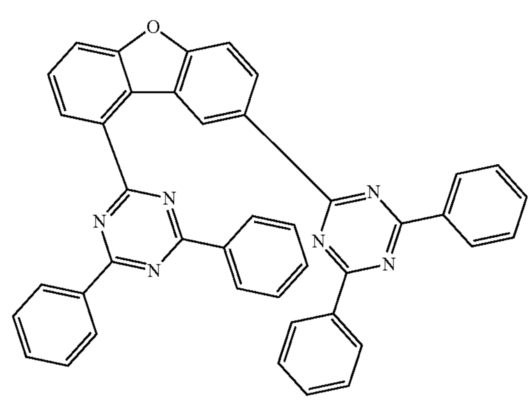

-continued
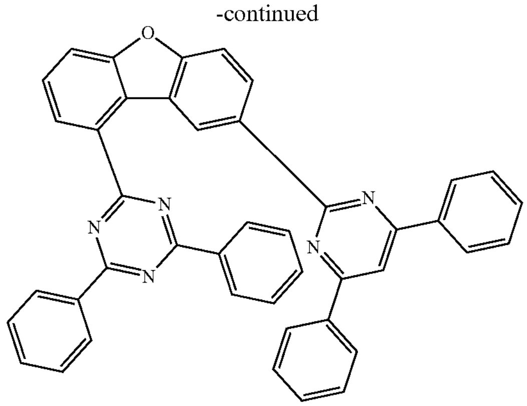
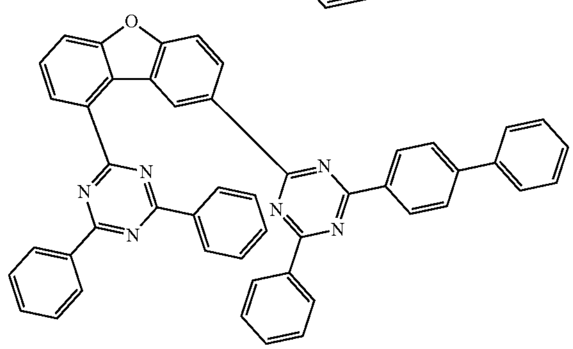
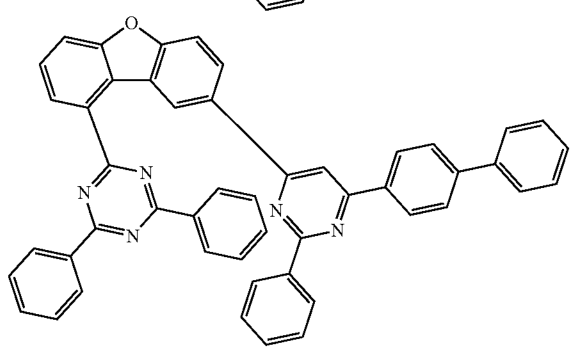
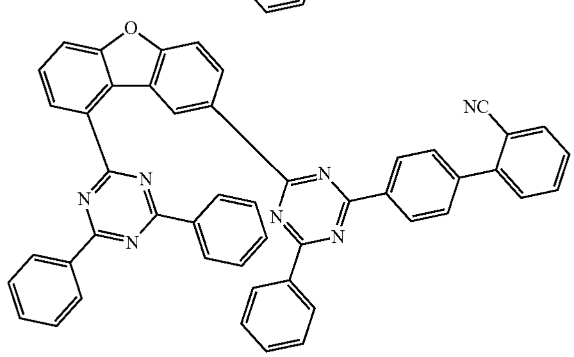
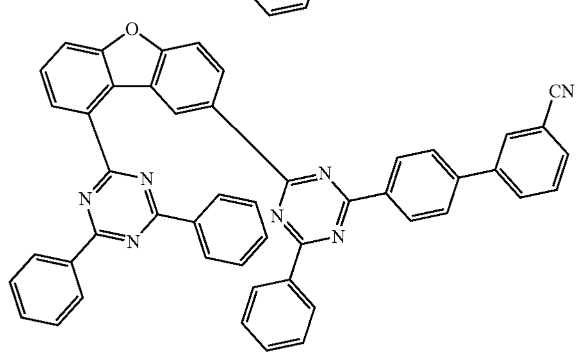
-continued
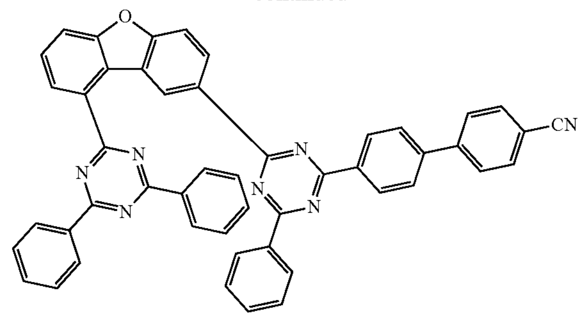
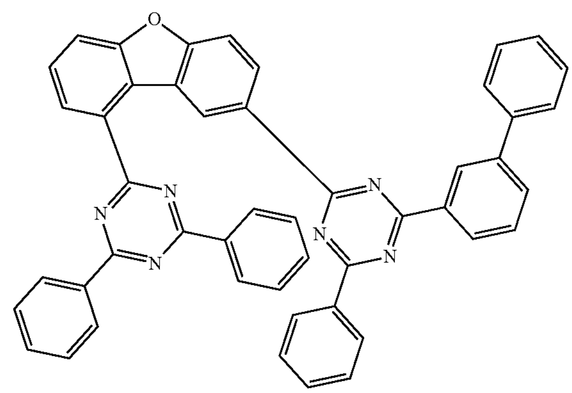
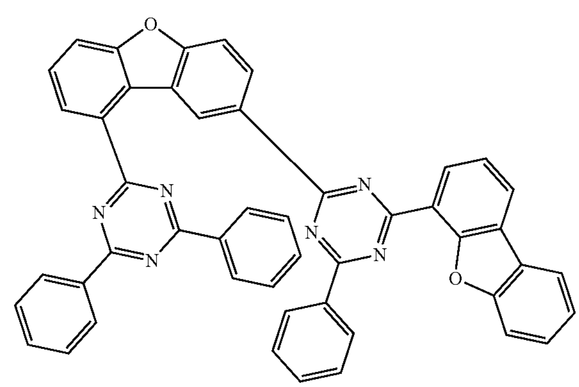
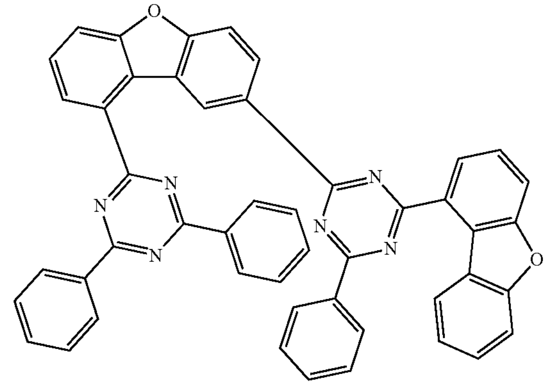

-continued
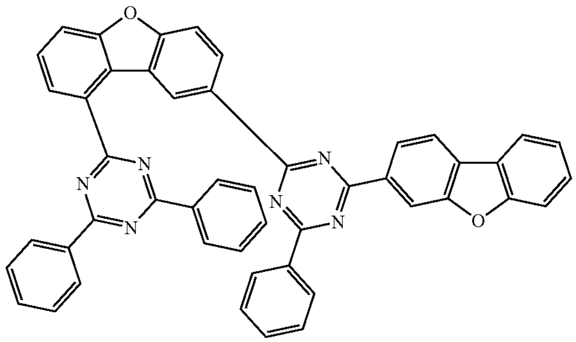
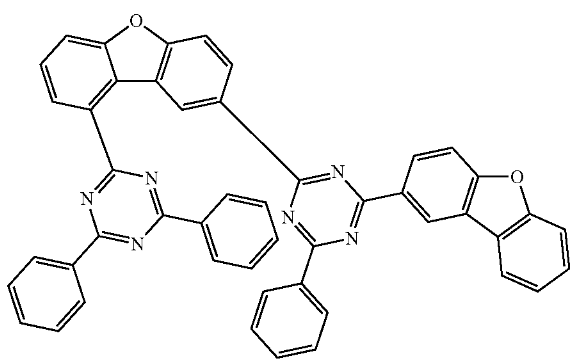
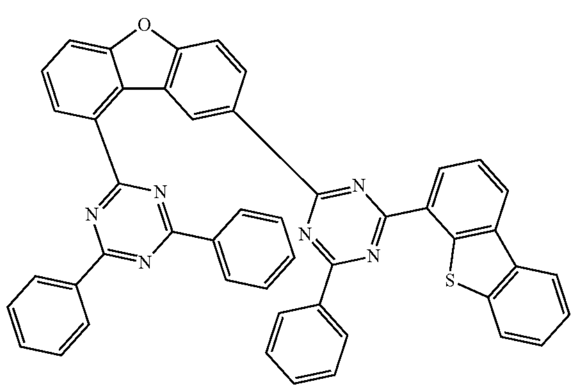
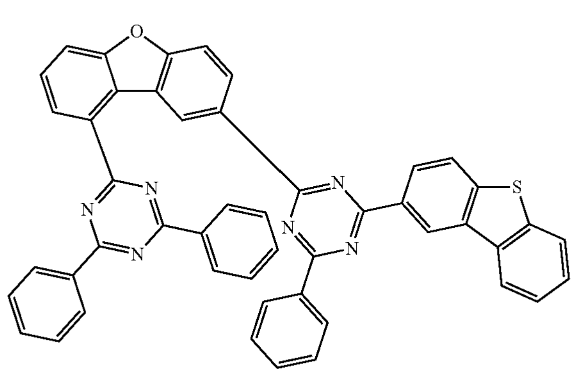
-continued
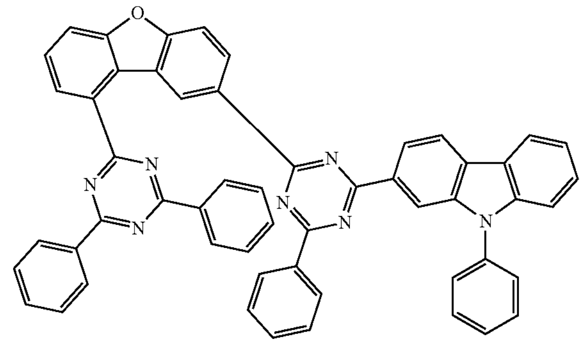
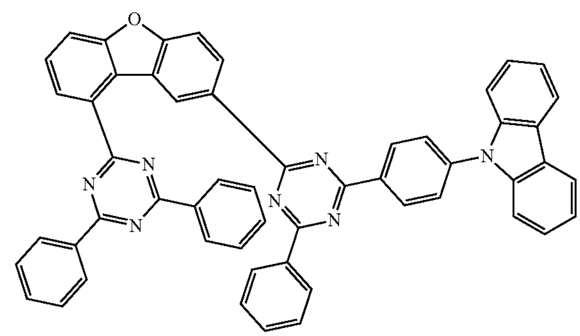
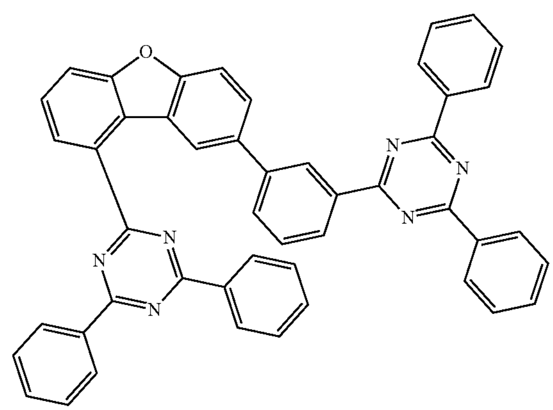
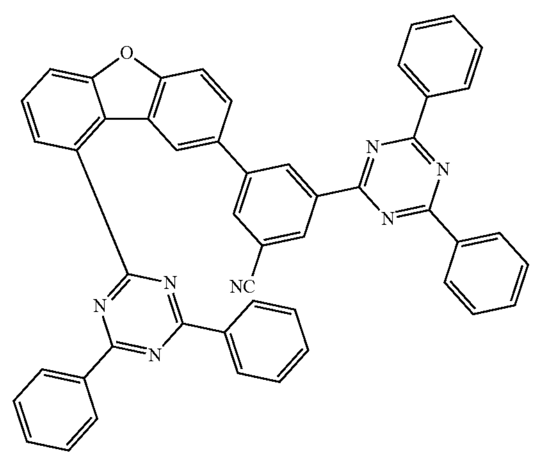

-continued
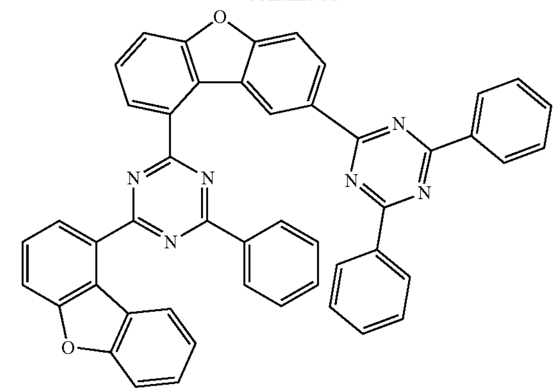
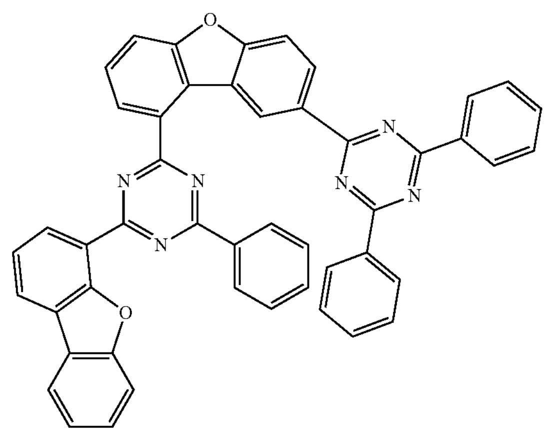
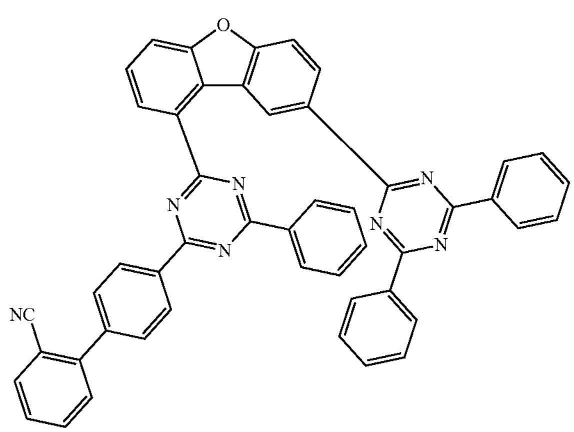
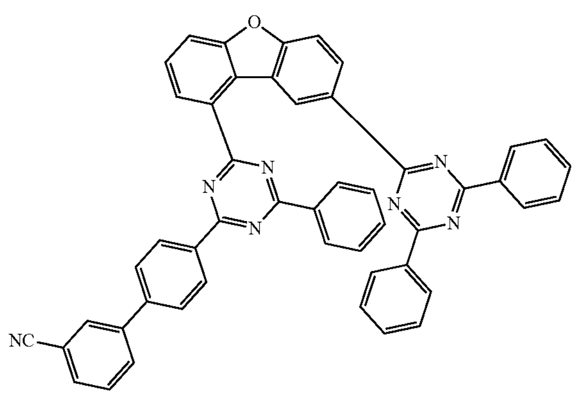
-continued
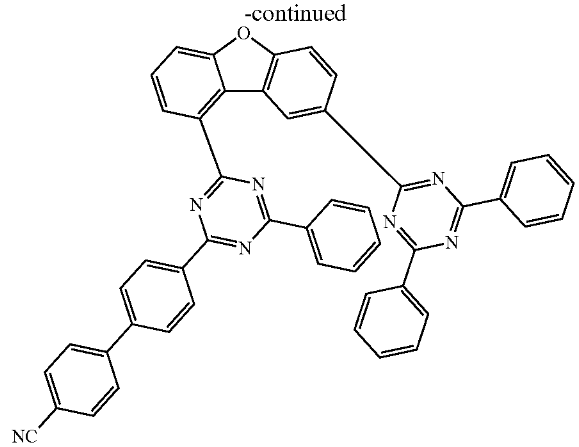
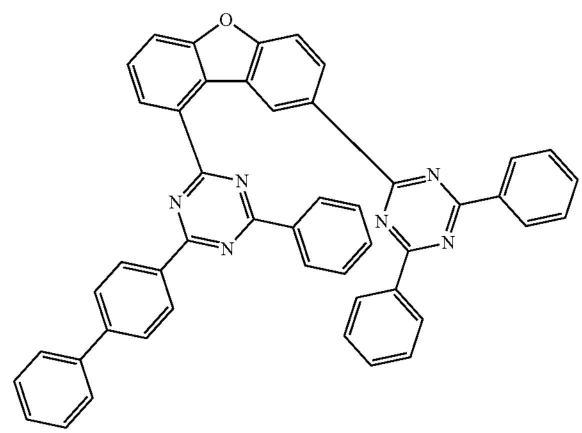
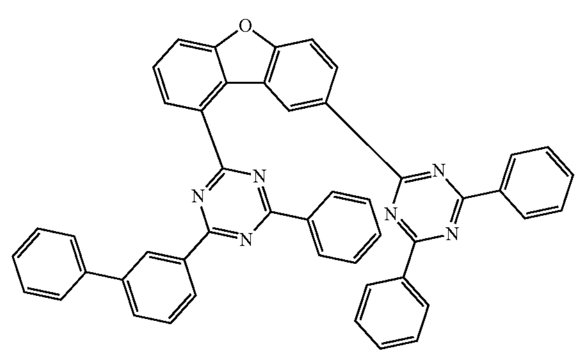
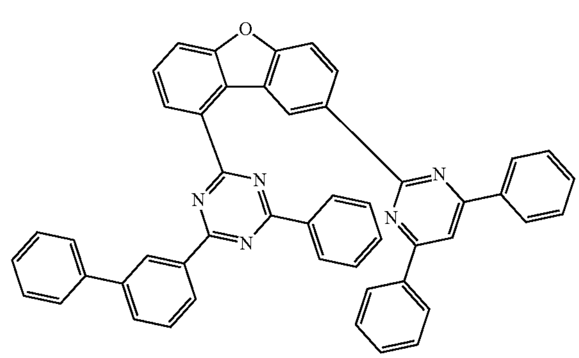

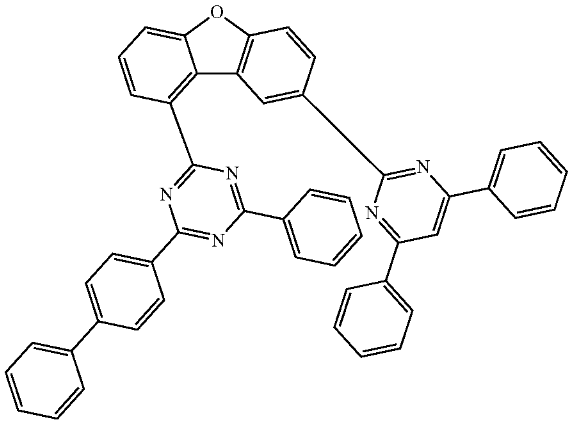
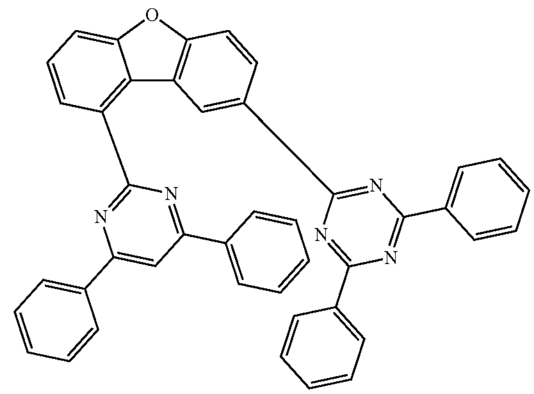
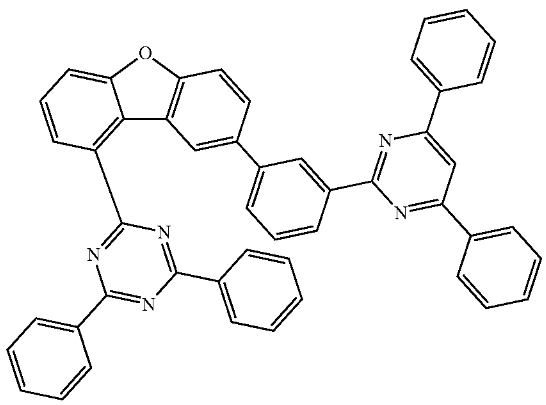
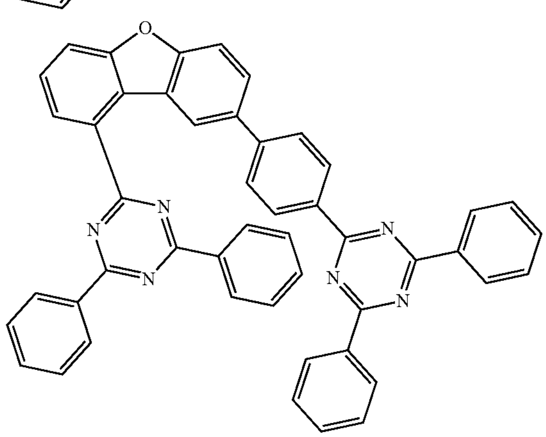
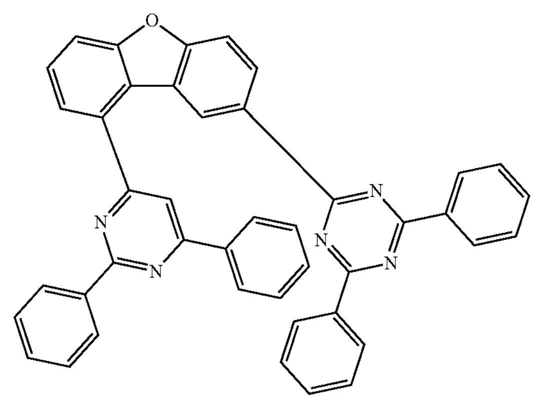
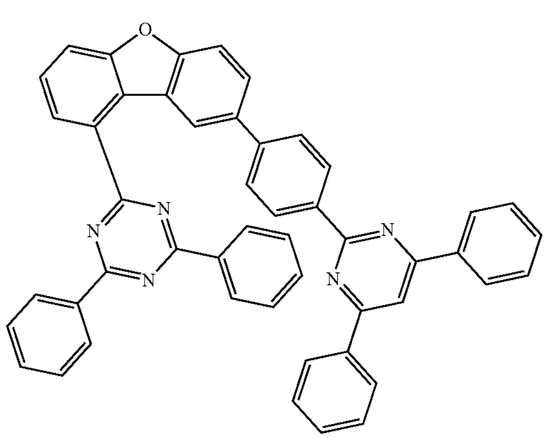
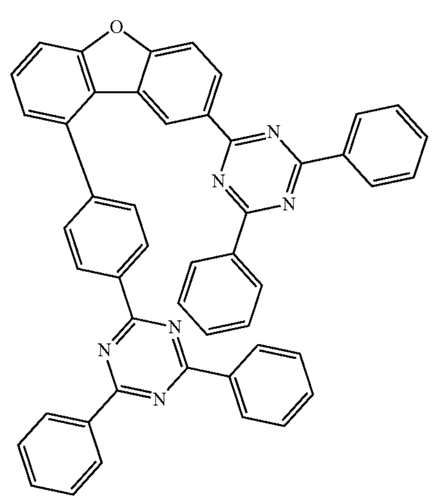

-continued
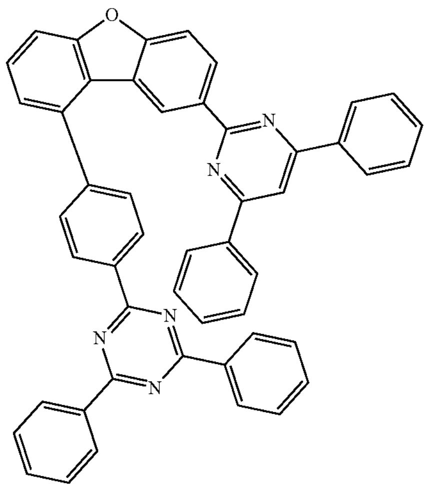
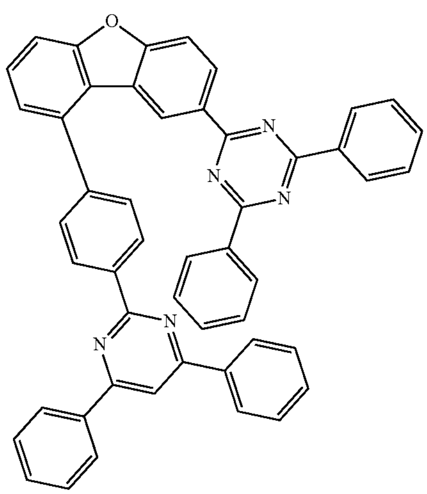
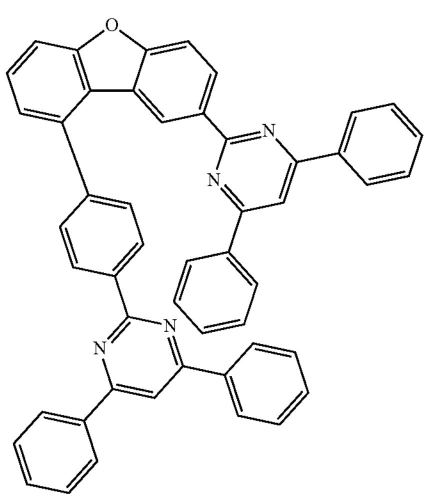
-continued
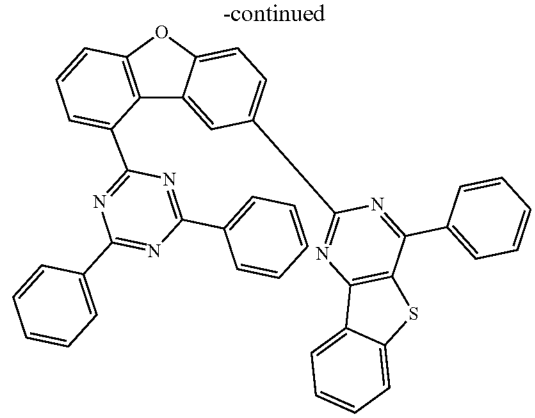
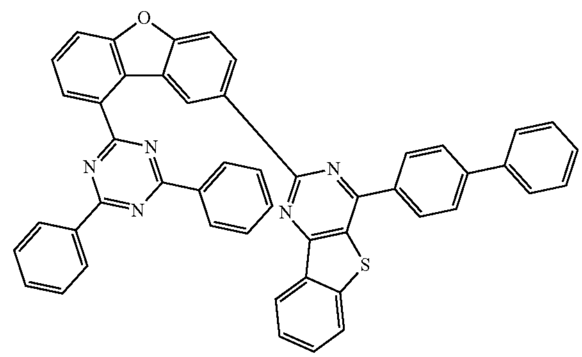
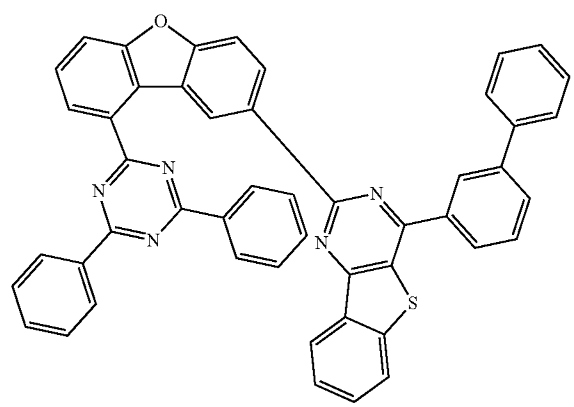
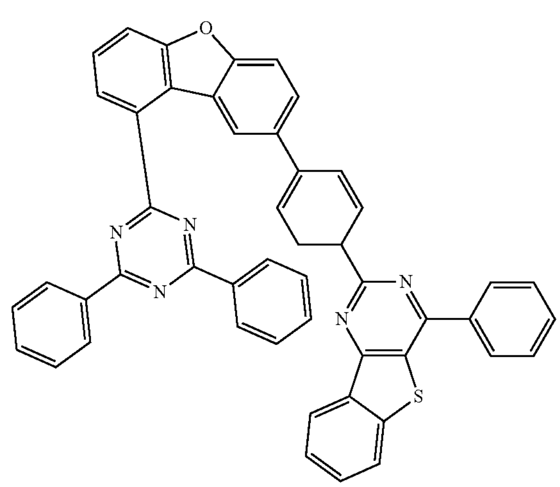

-continued
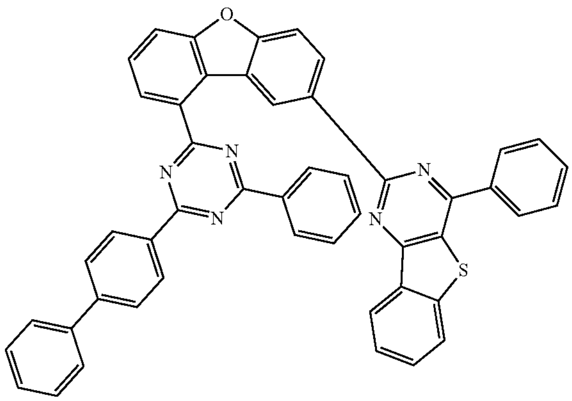
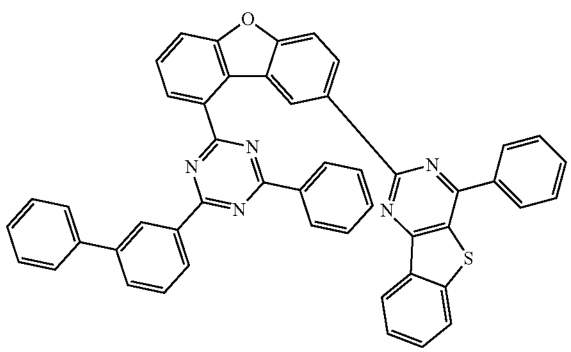
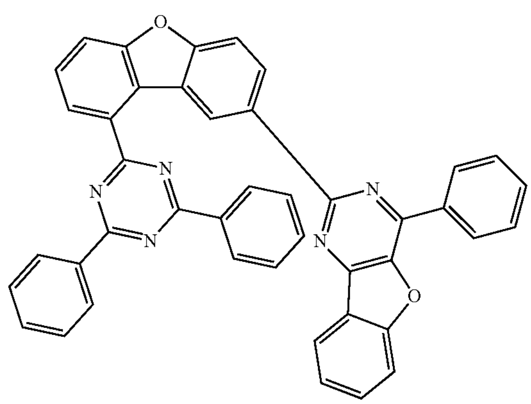
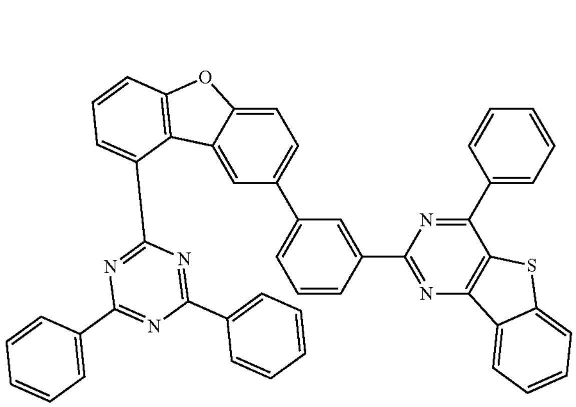
-continued
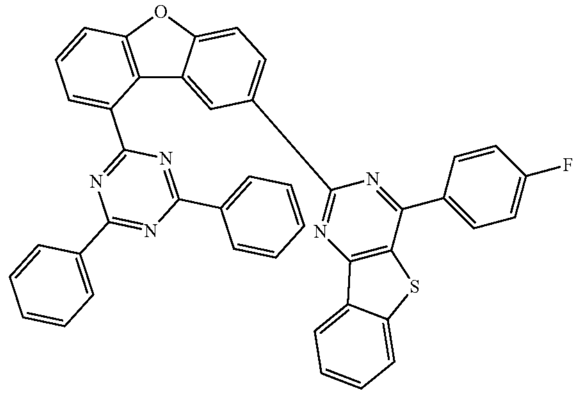
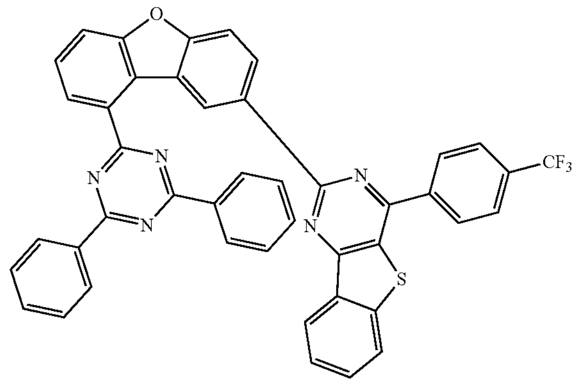
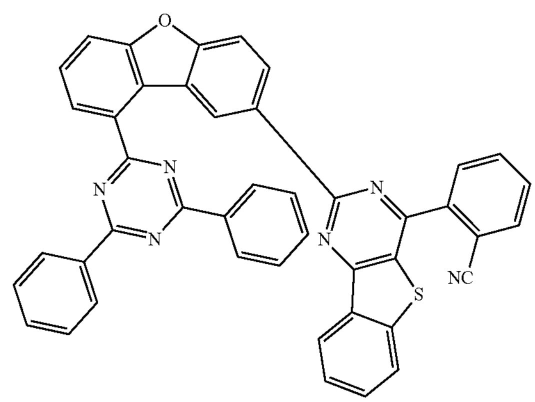
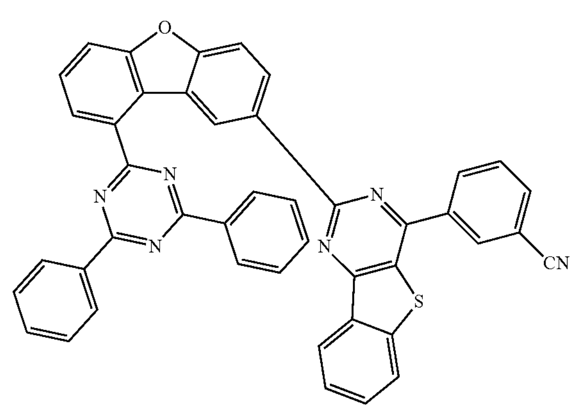

-continued
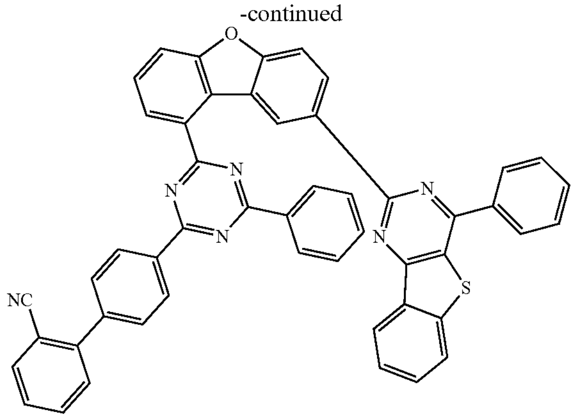
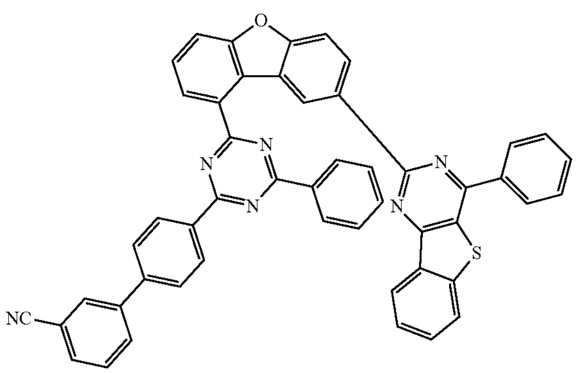
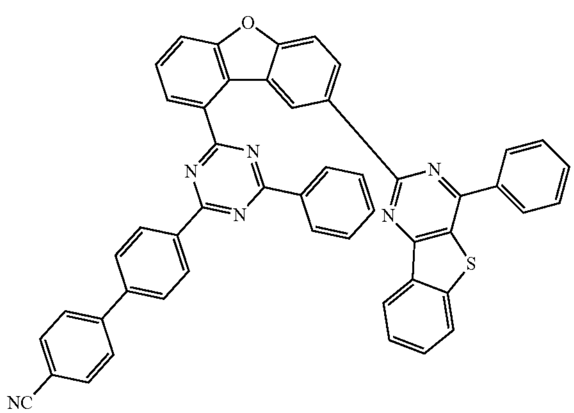
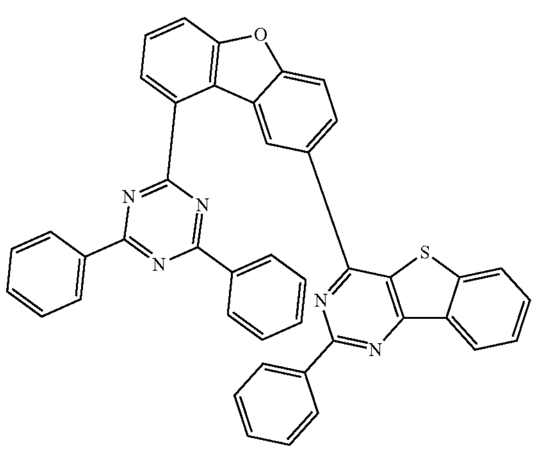
-continued
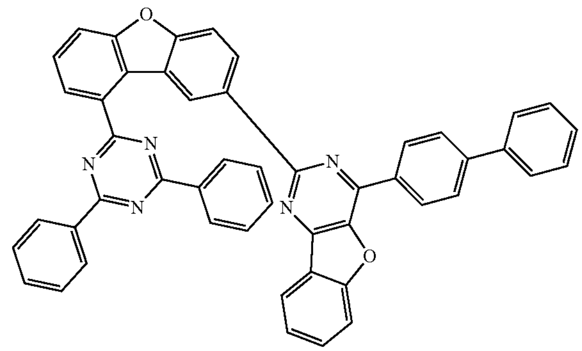
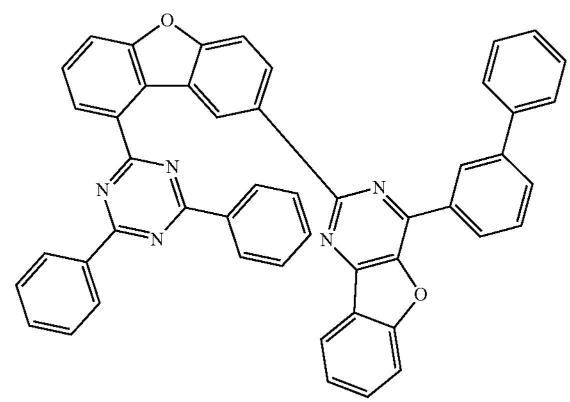
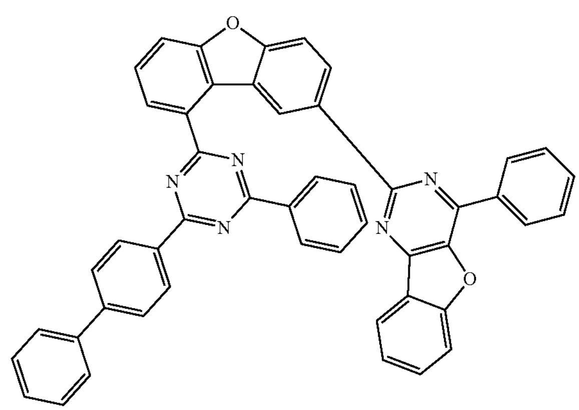
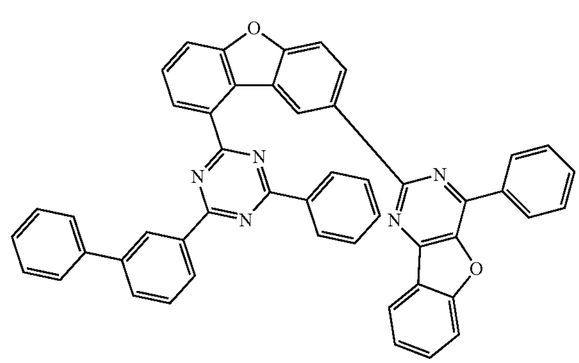

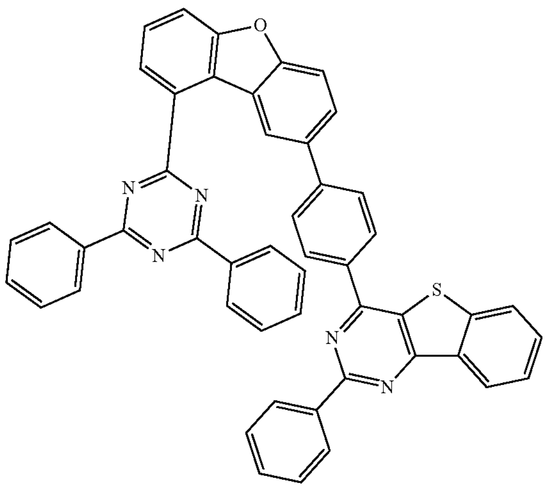
O
N
N
N
S
N
N
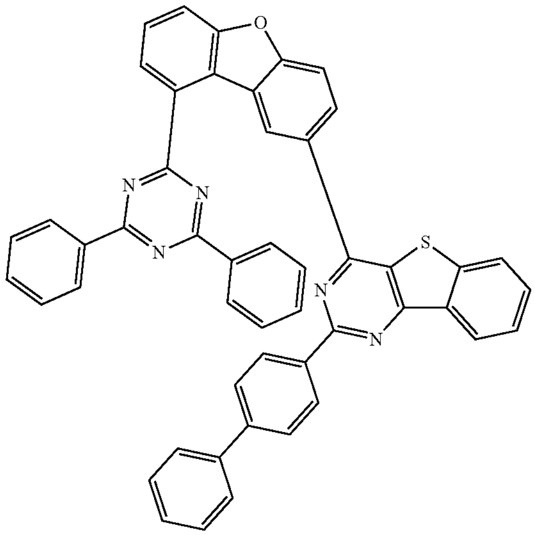
O
N
N
N
S
N
N
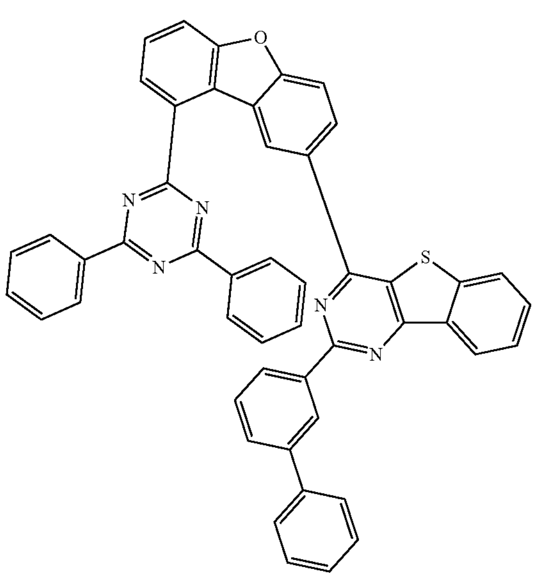
O
N
N
N
S
N
N
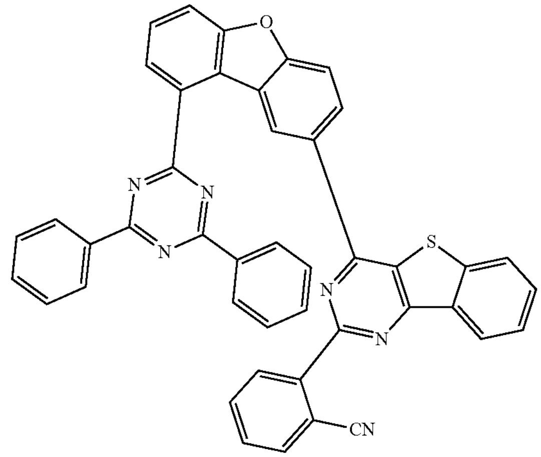
O
N
N
N
S
N
N
CN
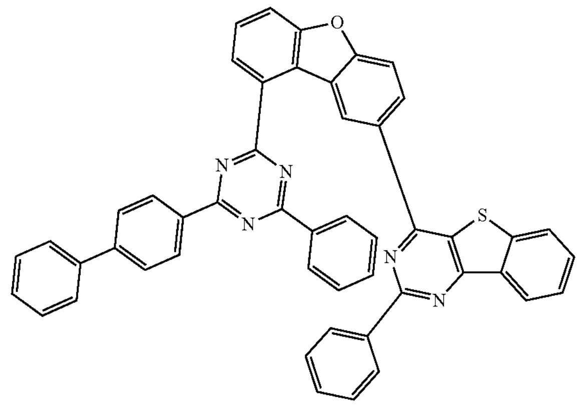
O
N
N
N
S
N
N
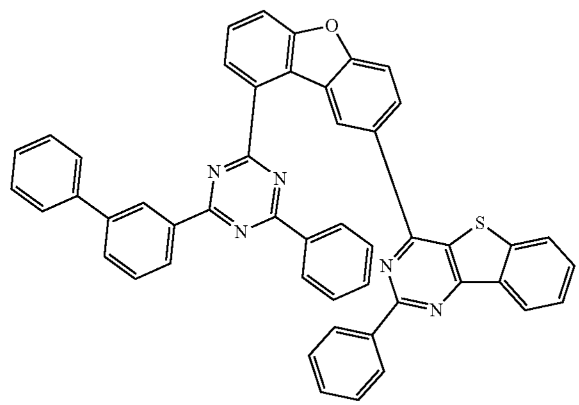
O
N
N
N
S
N
N
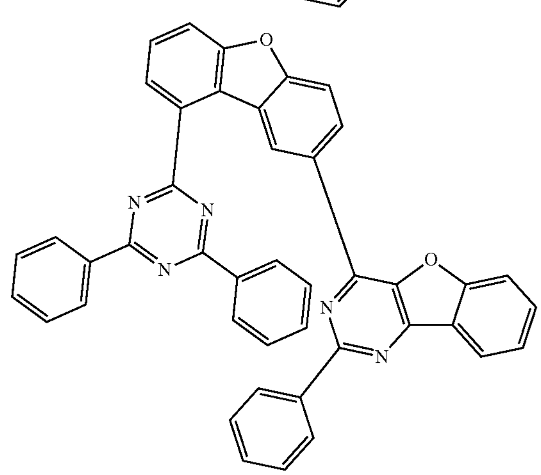
O
N
N
N
O
N
N -continued
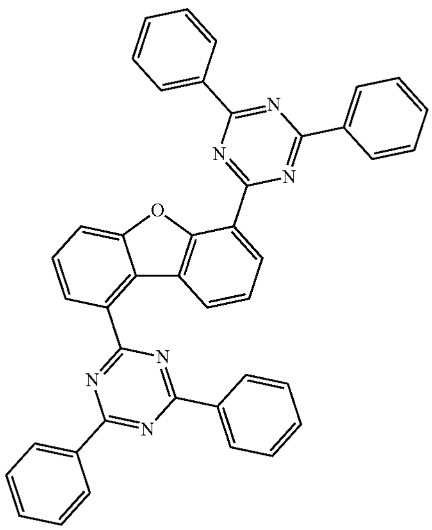
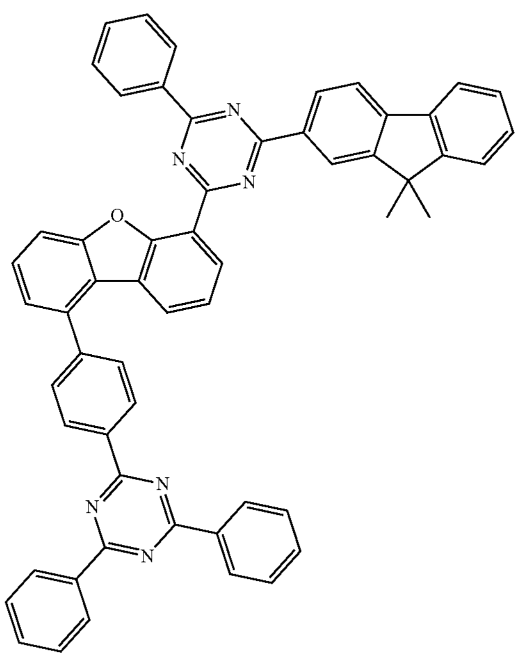
-continued
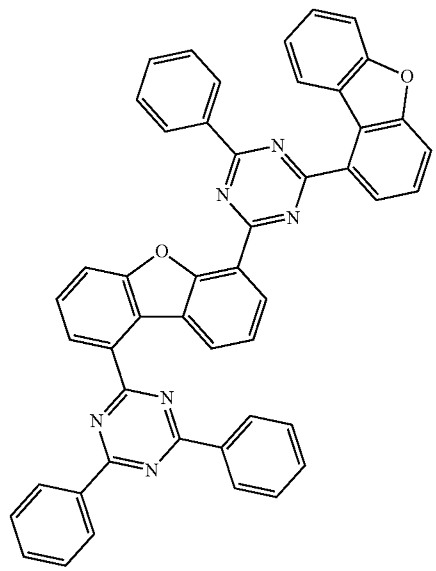
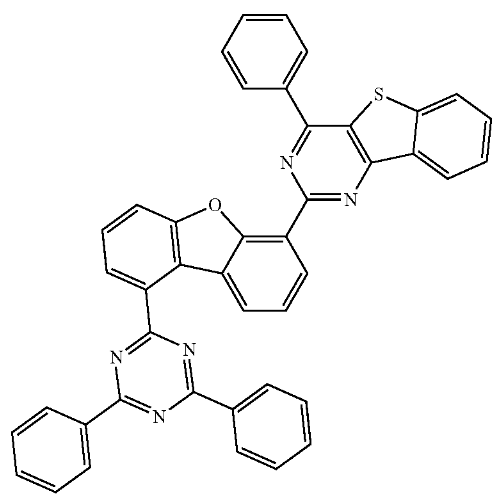
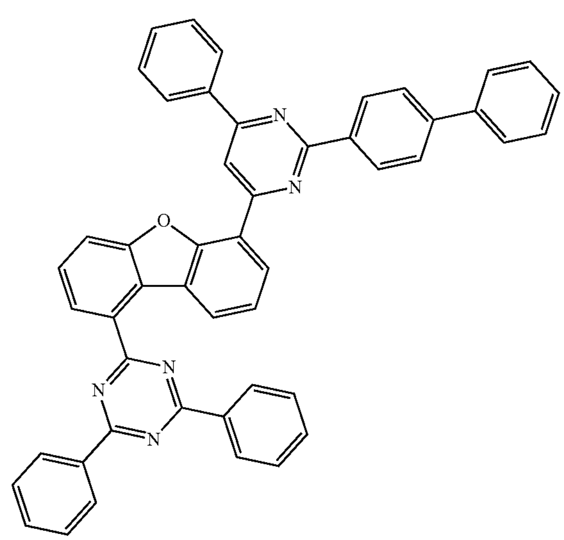

-continued
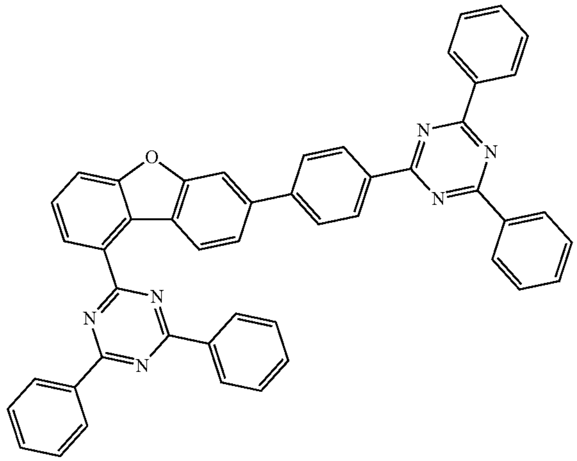
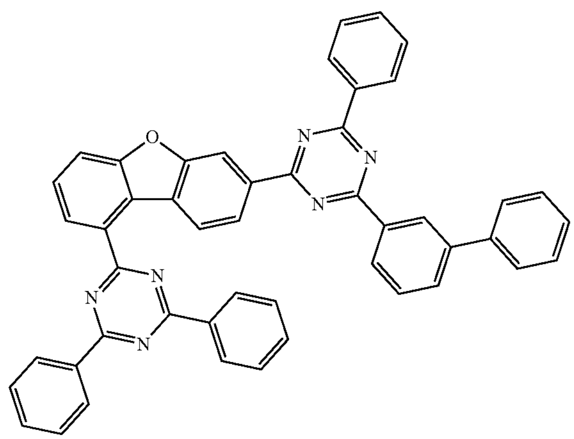
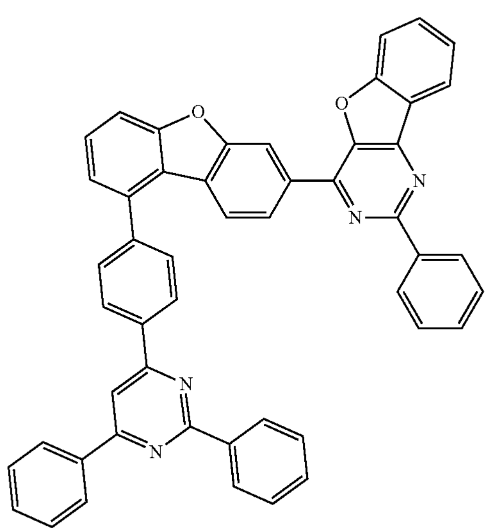
-continued
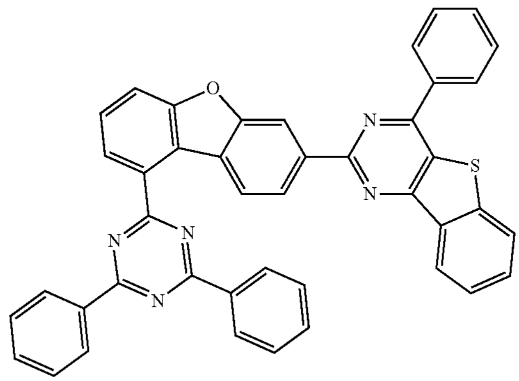
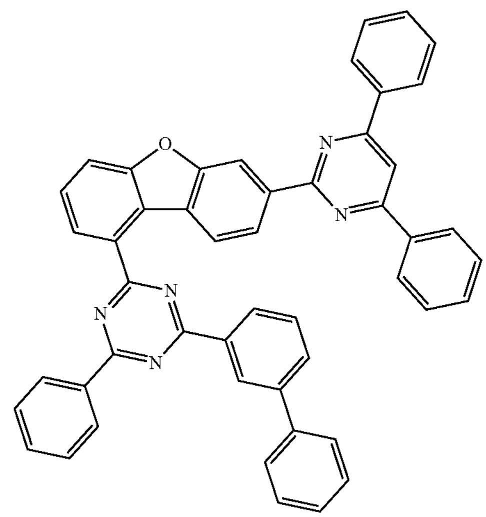
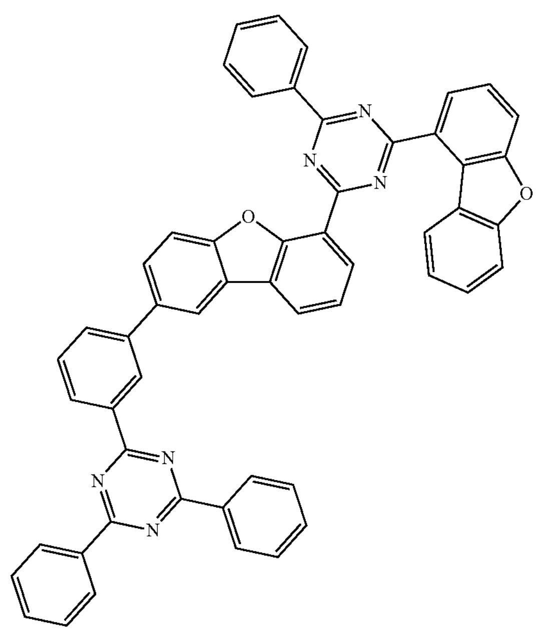

-continued
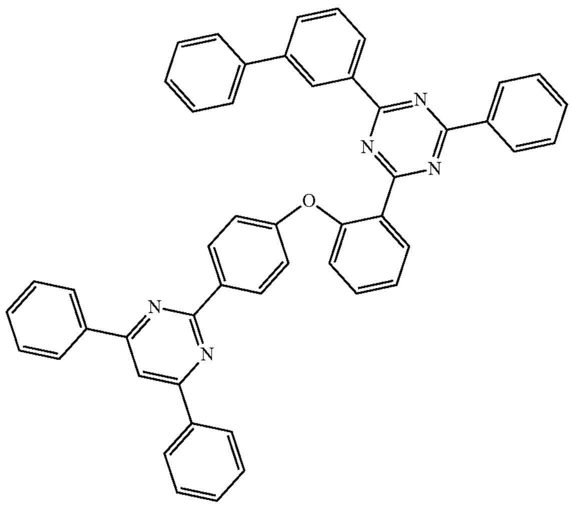
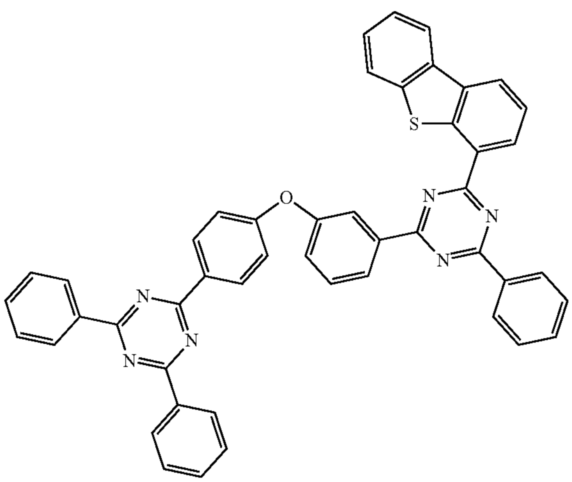
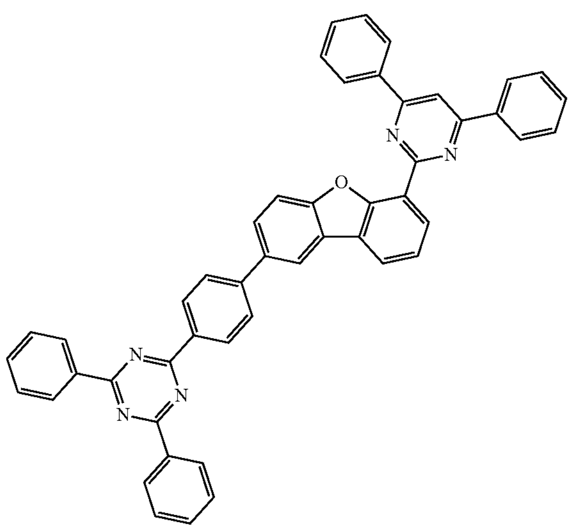
-continued
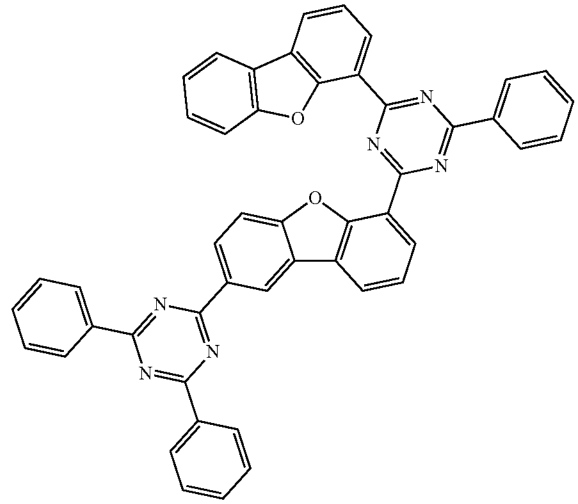
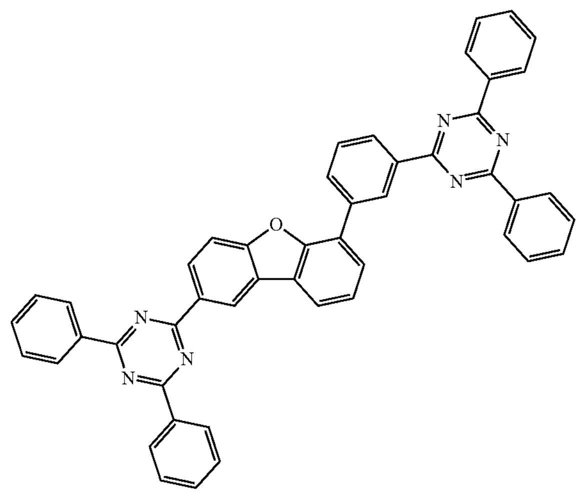
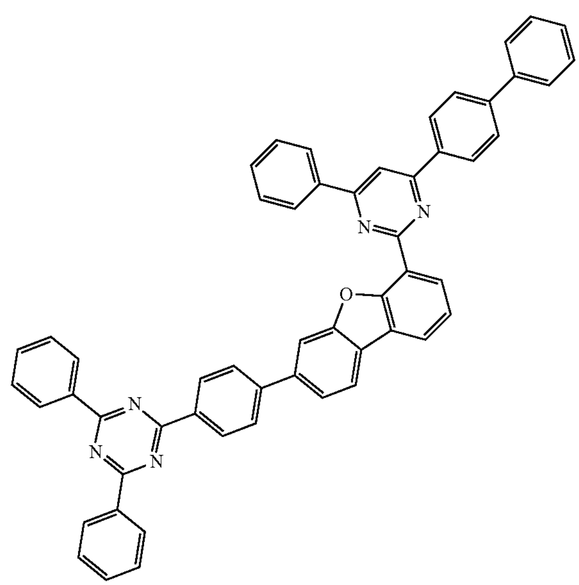

-continued
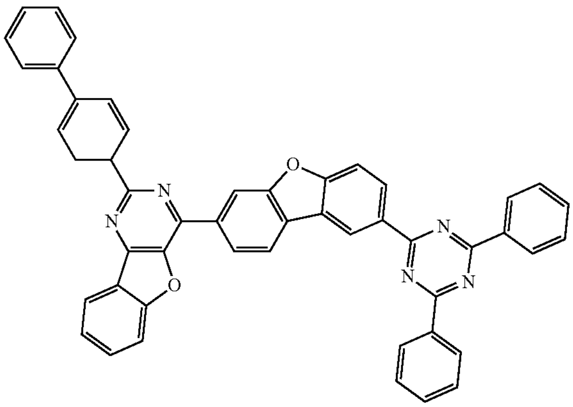
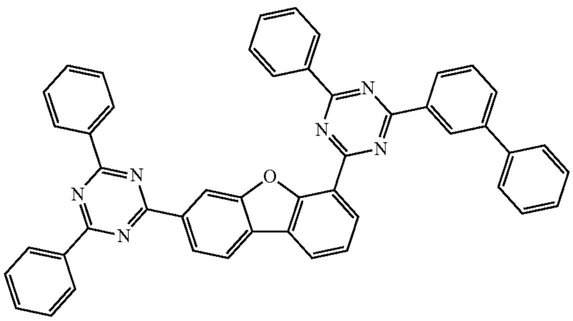
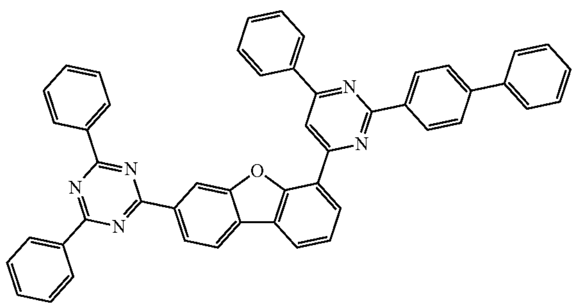
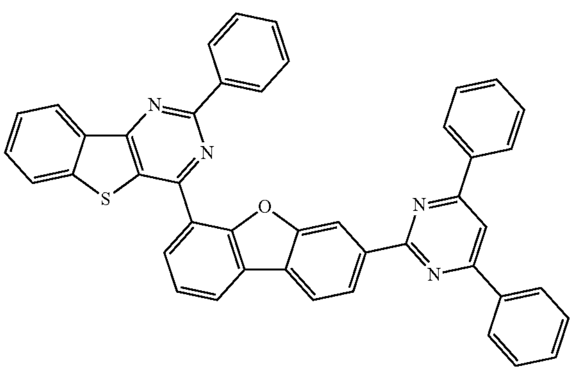
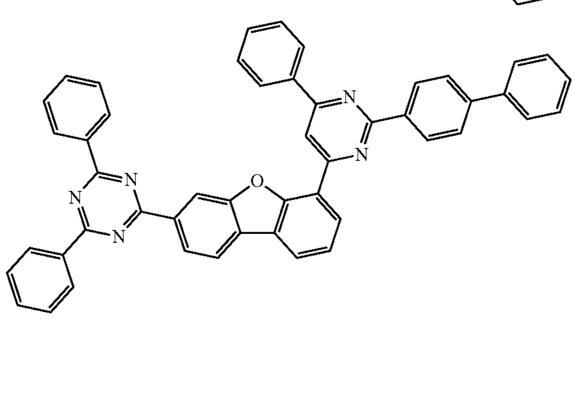
-continued
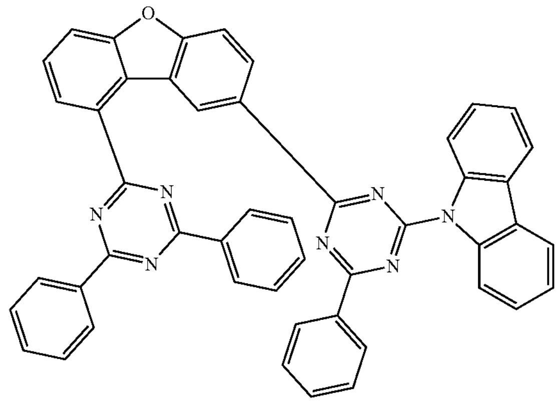
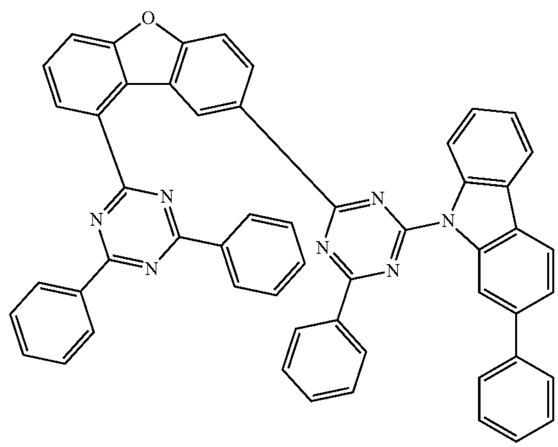
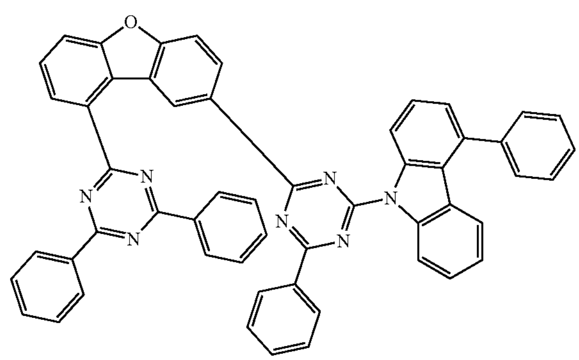
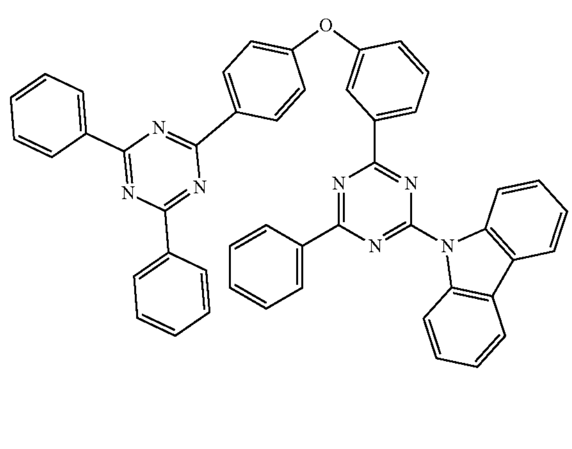

-continued
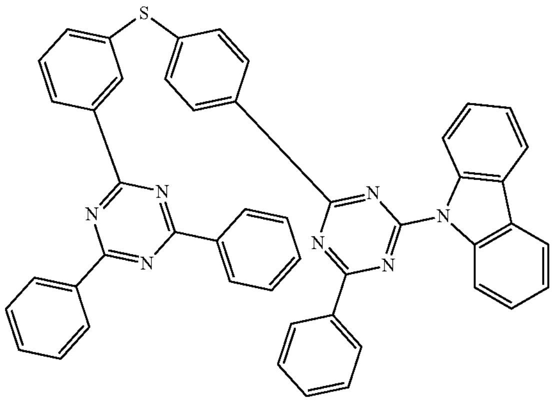
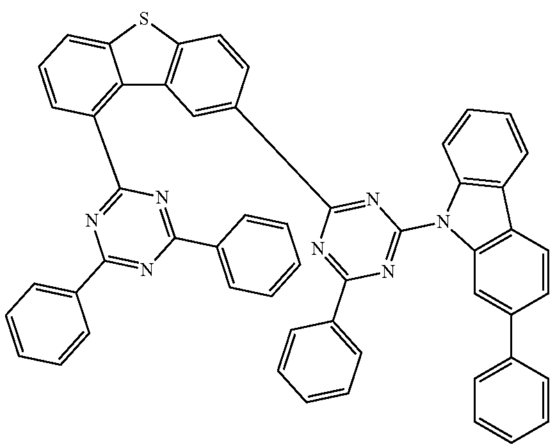
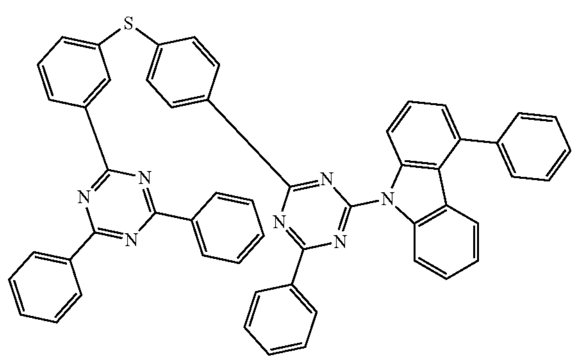
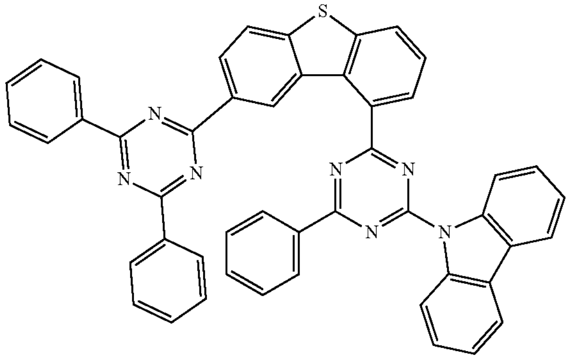
-continued
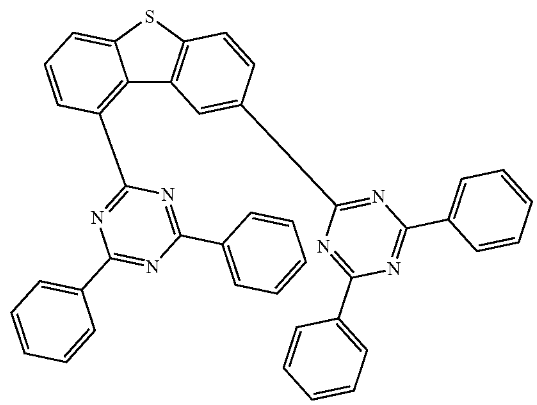
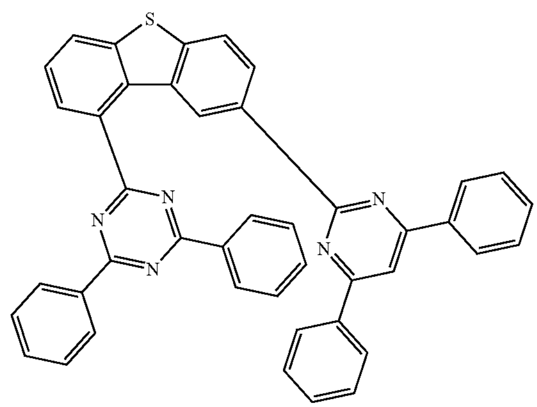
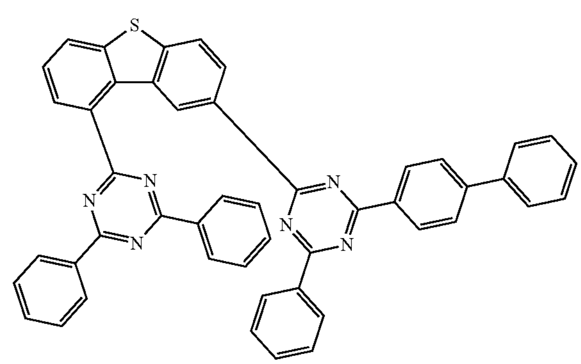
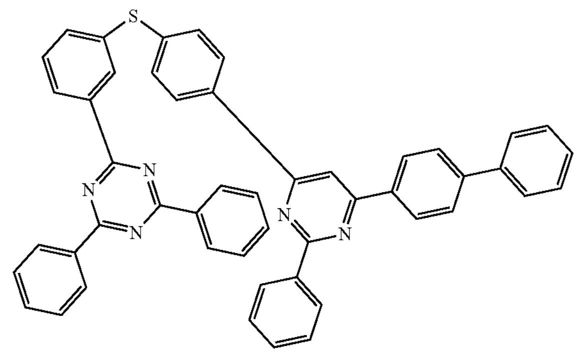

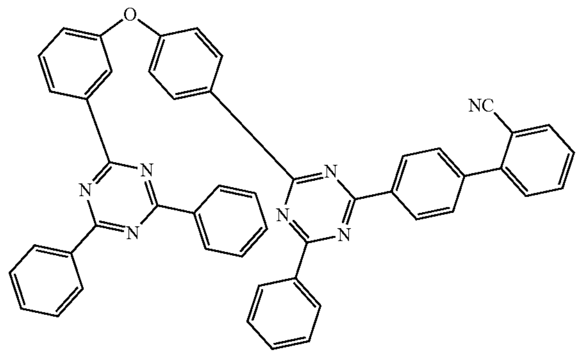
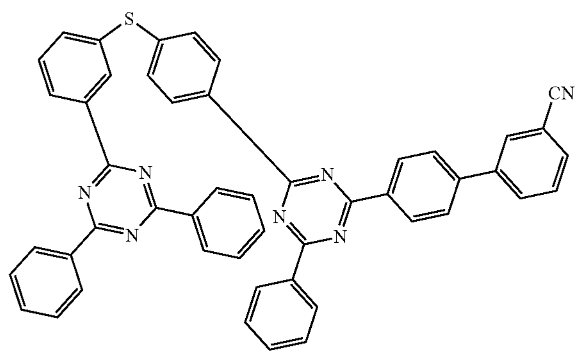
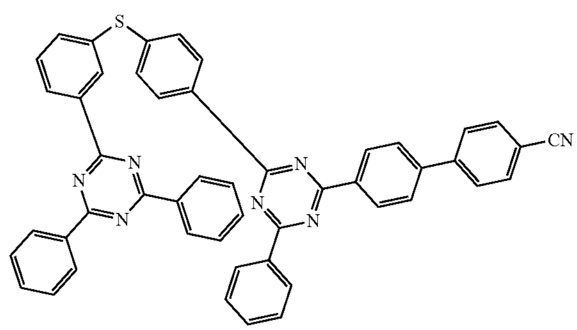
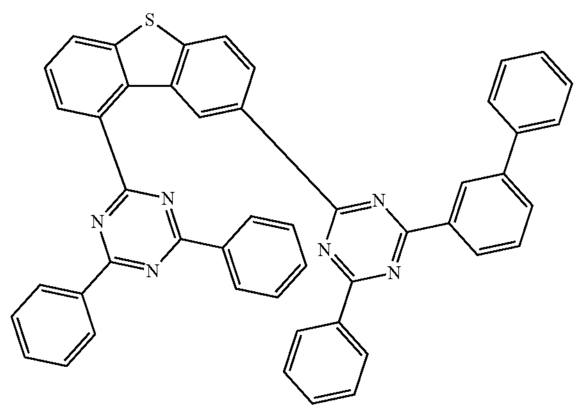
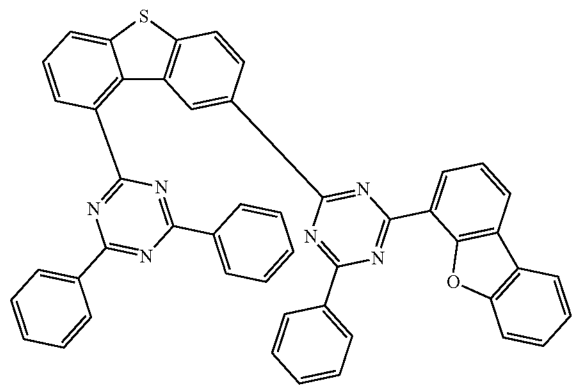
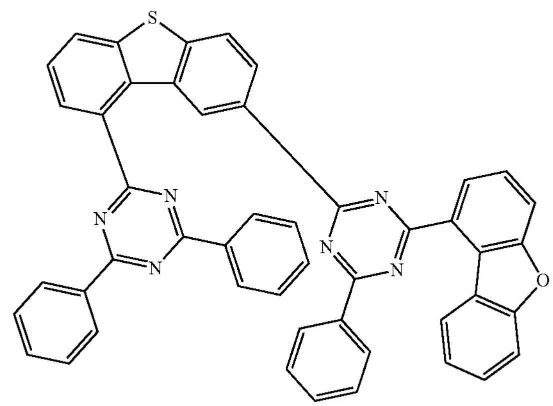
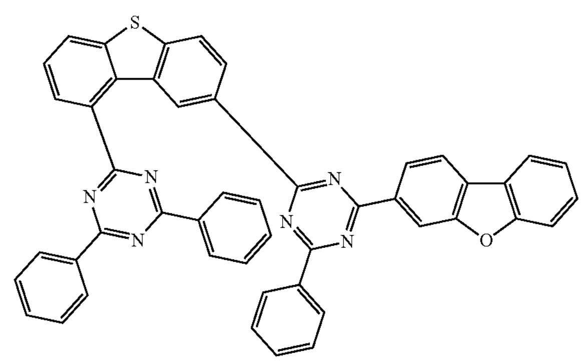
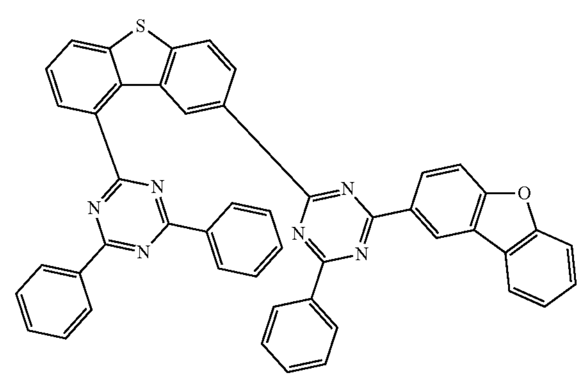

-continued
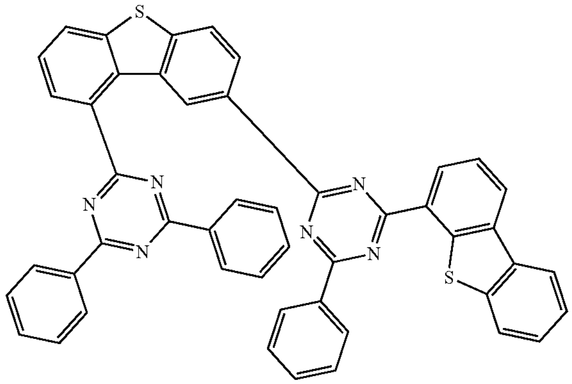
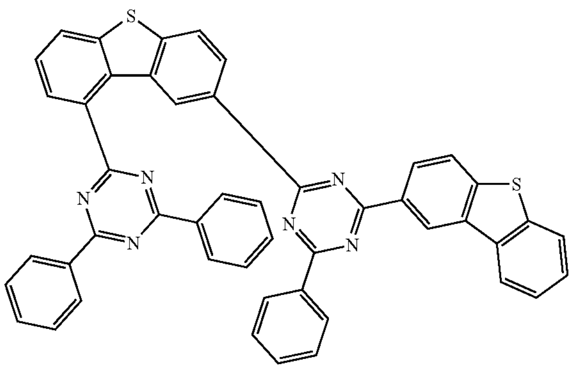
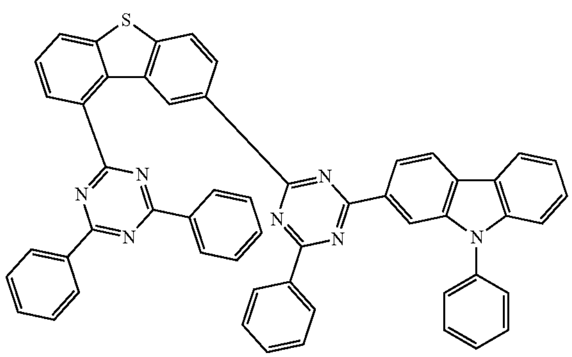
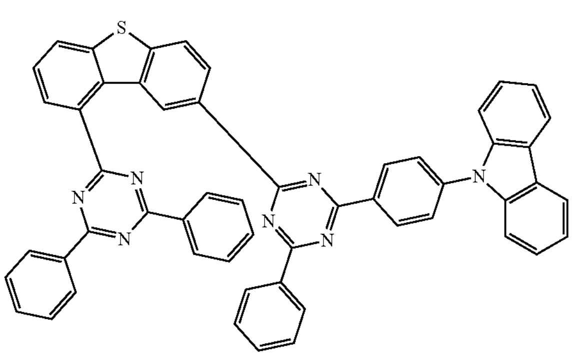
-continued
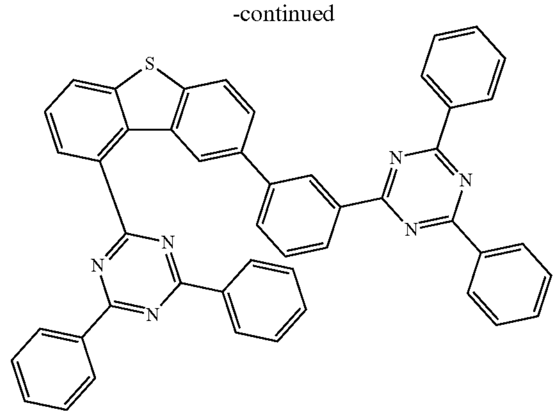
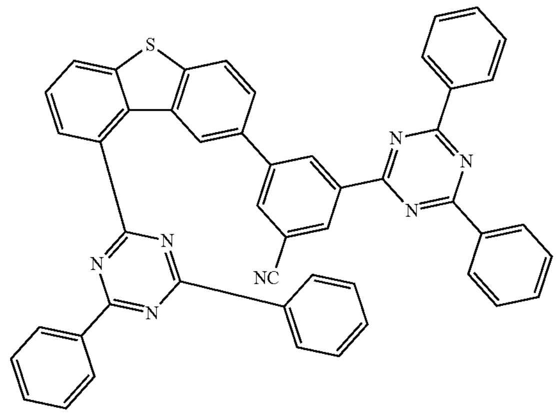
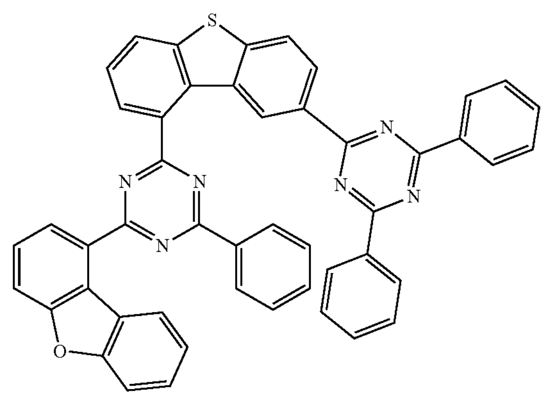
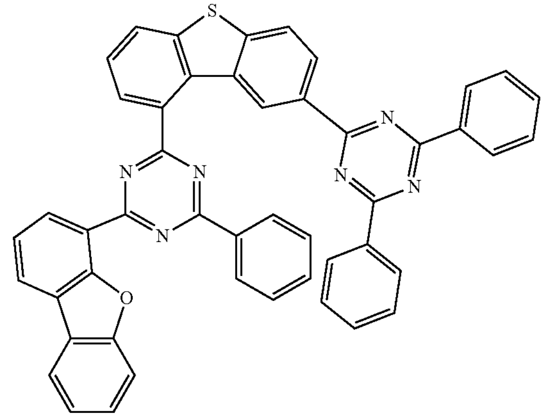

-continued
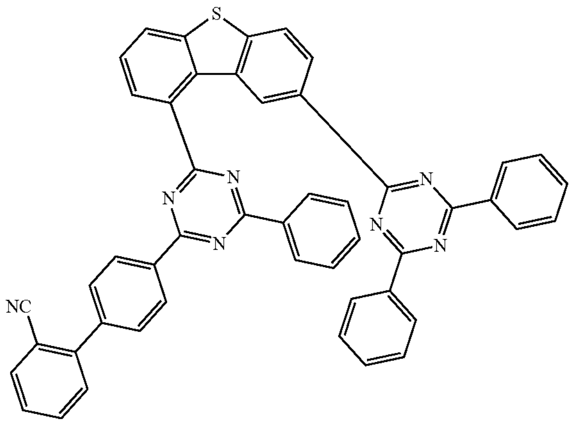
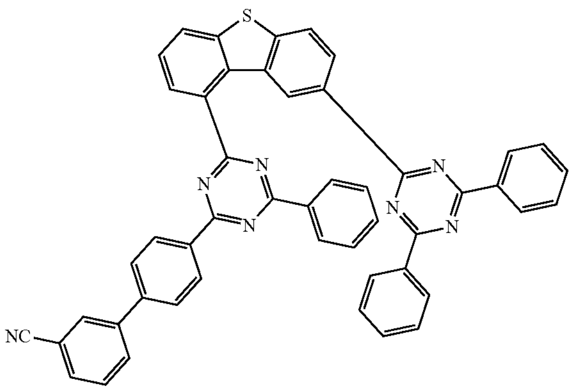
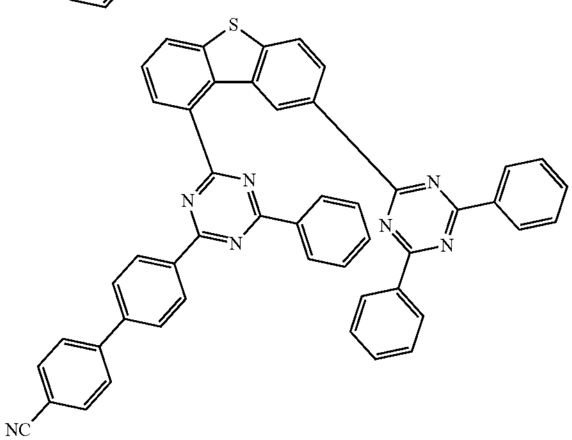
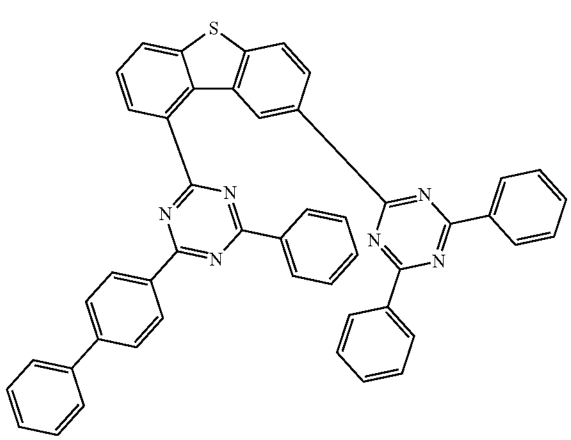
-continued
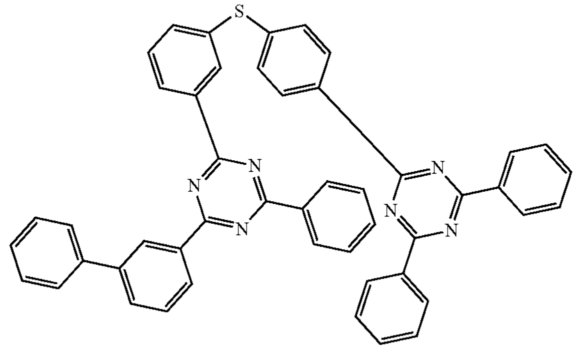
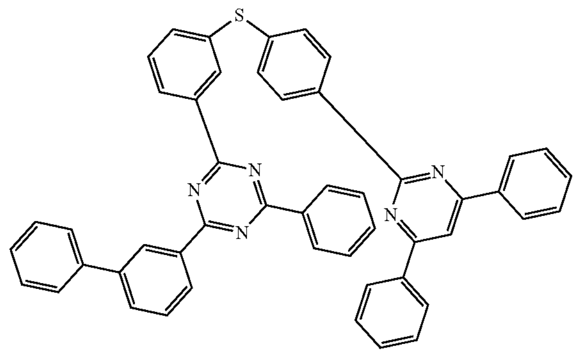
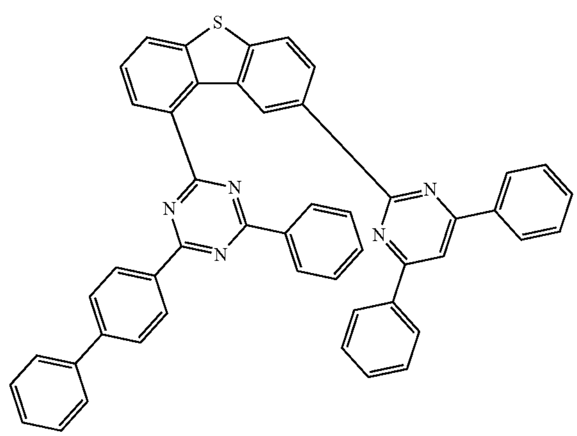
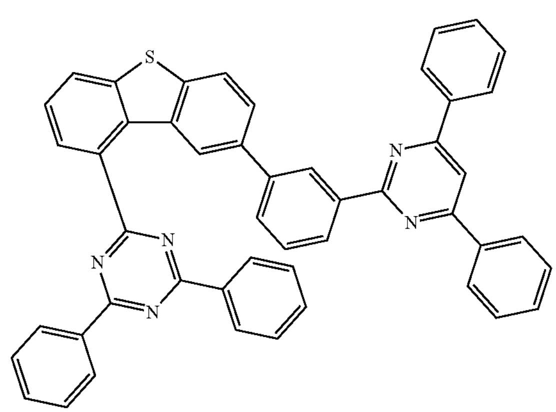

-continued
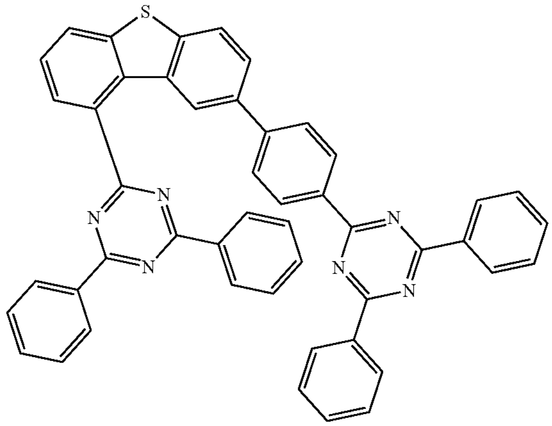
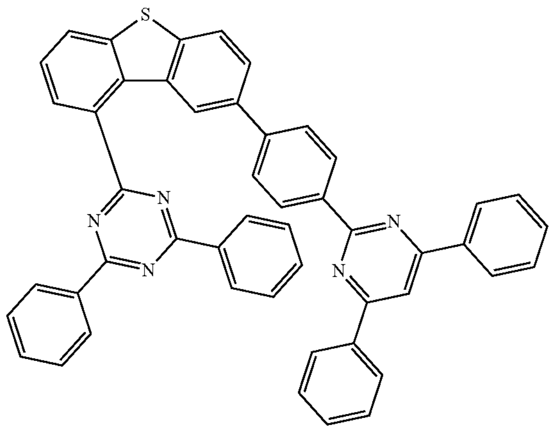
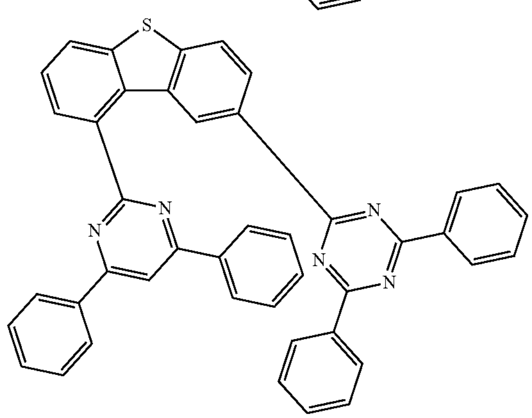
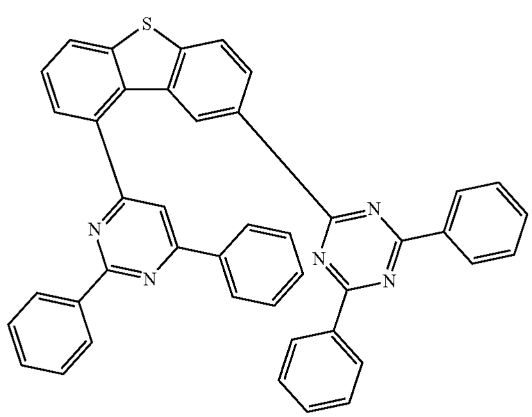
-continued
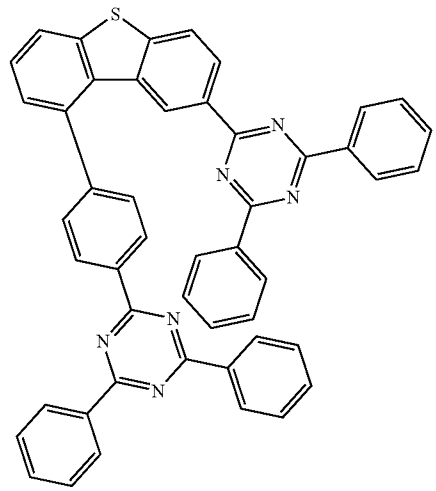
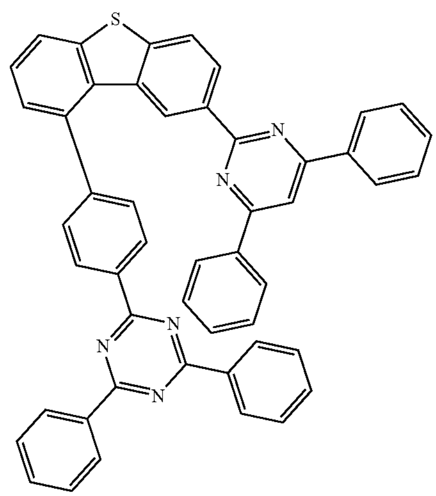
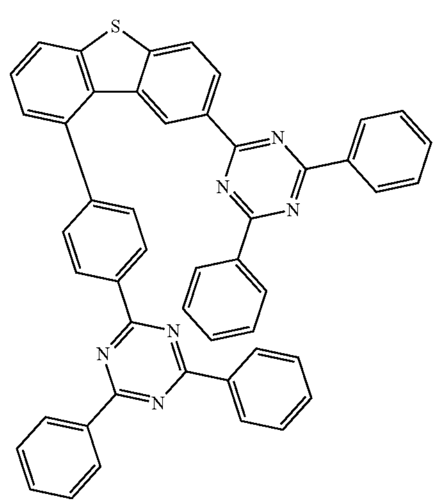

-continued
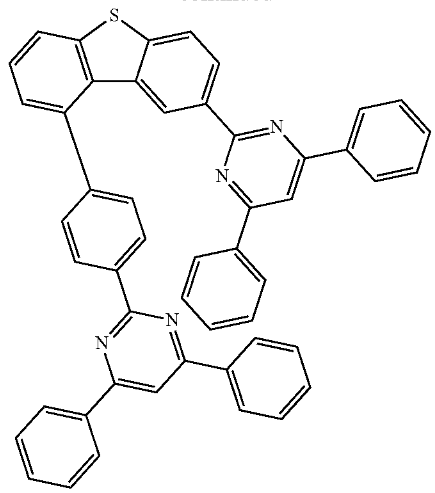
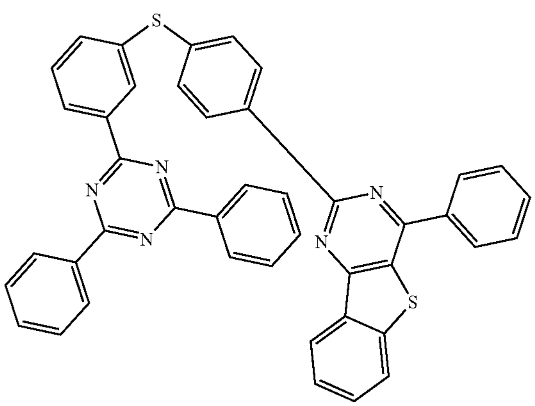
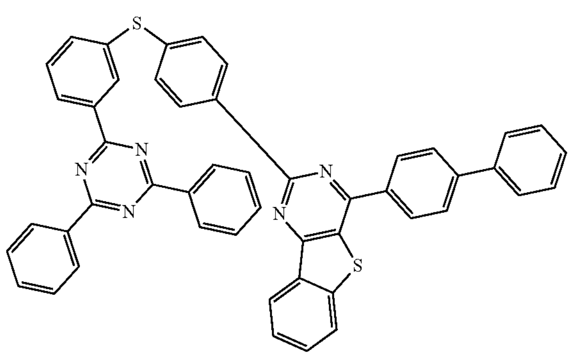
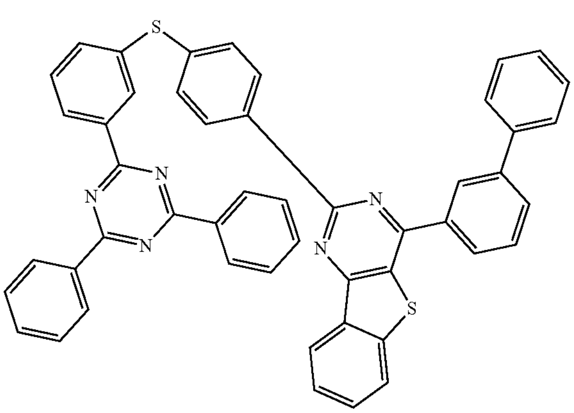
-continued
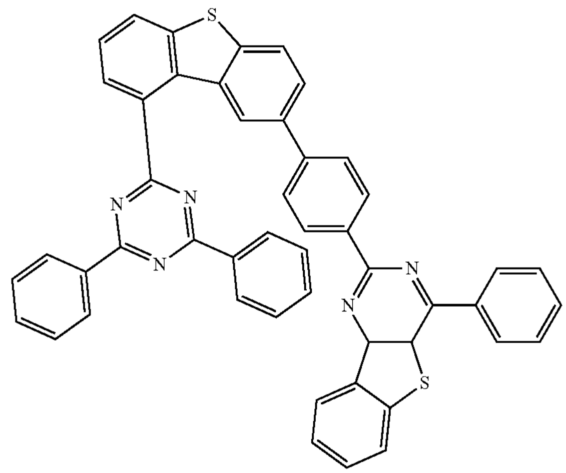
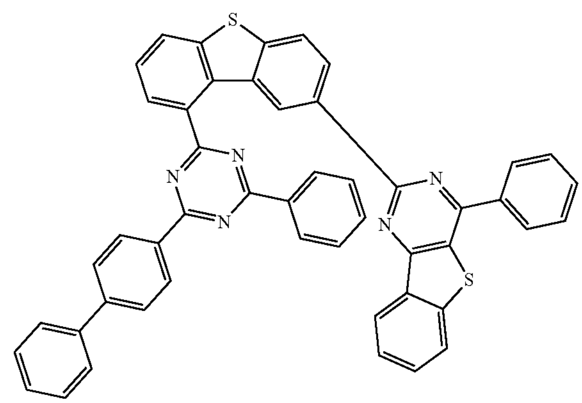
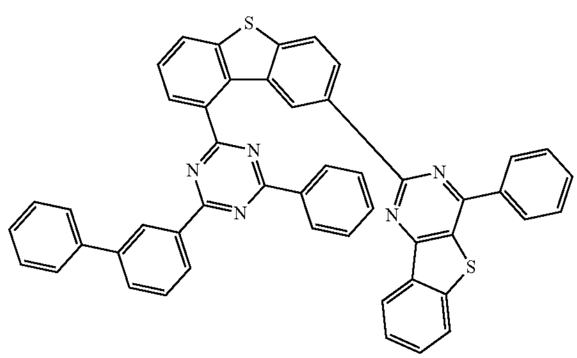
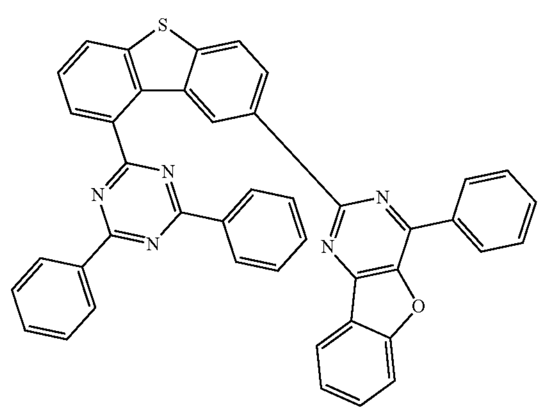

-continued
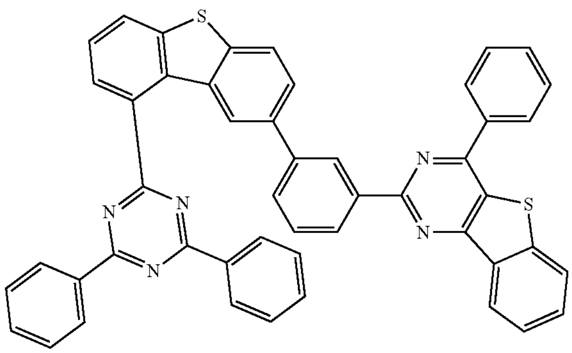
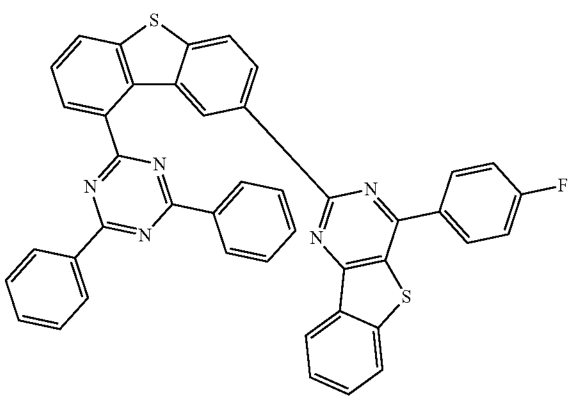
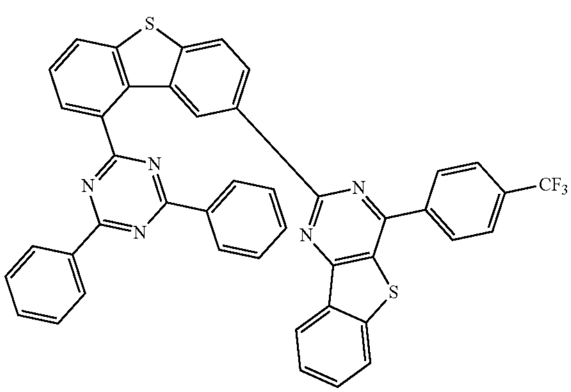
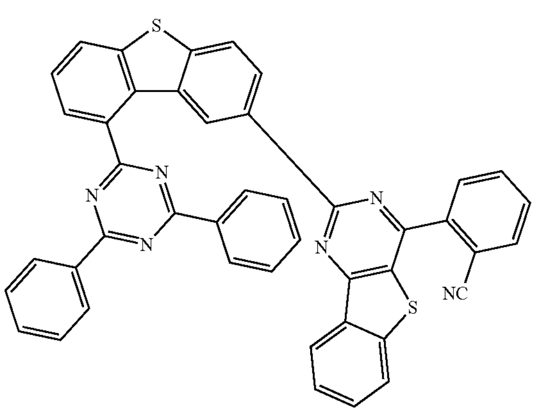
-continued
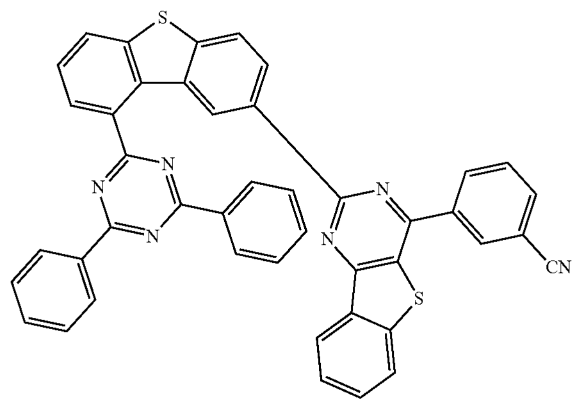
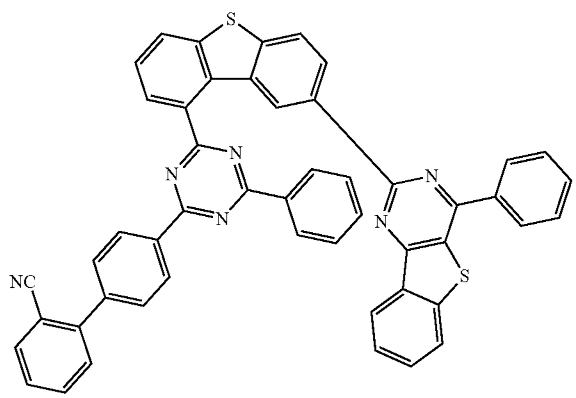
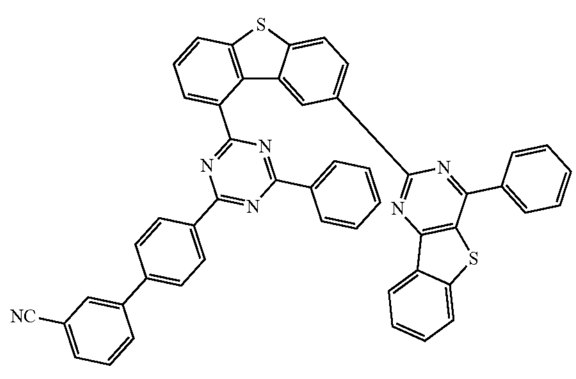
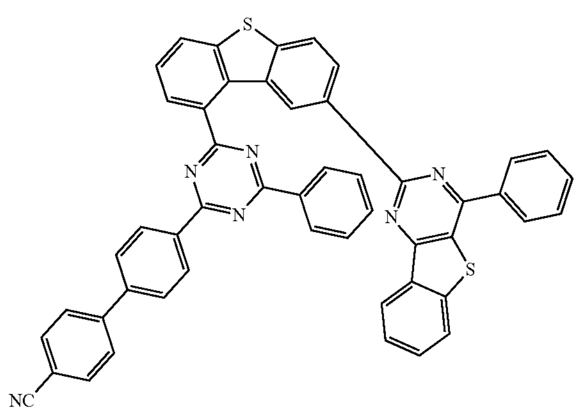

-continued
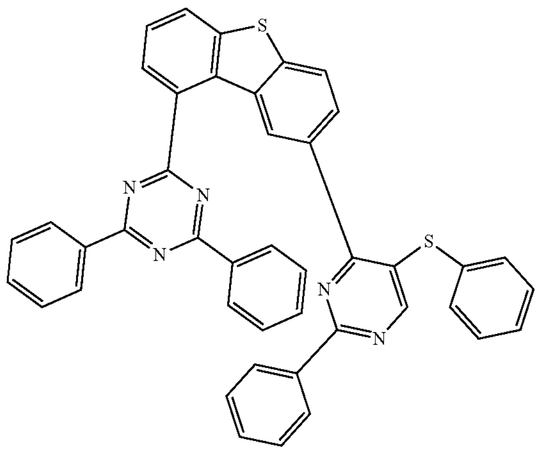
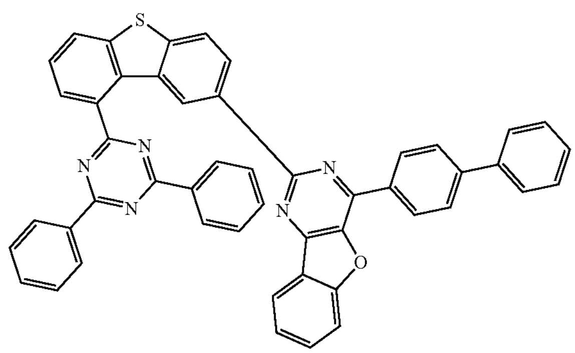
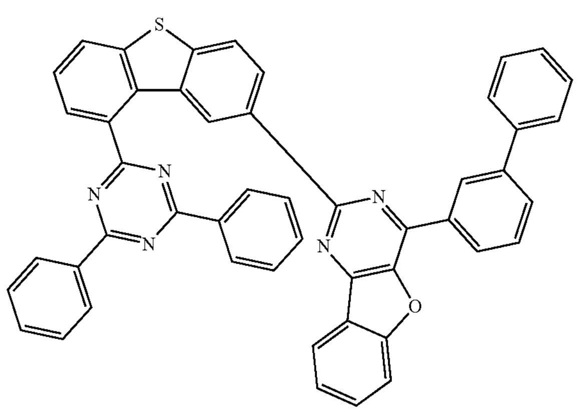
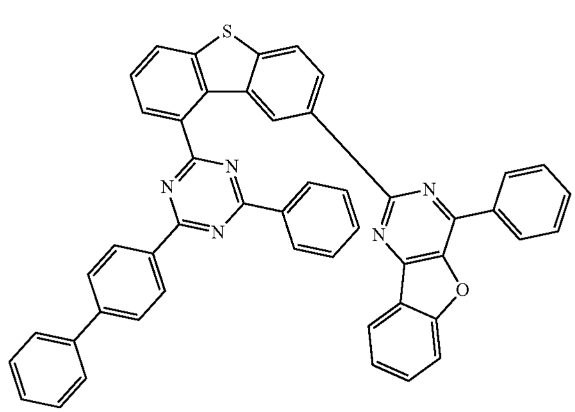
-continued
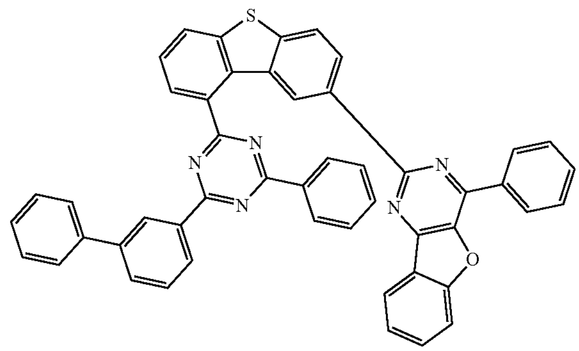
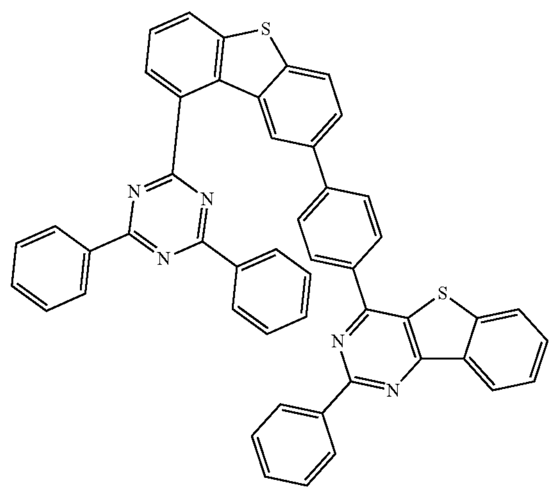
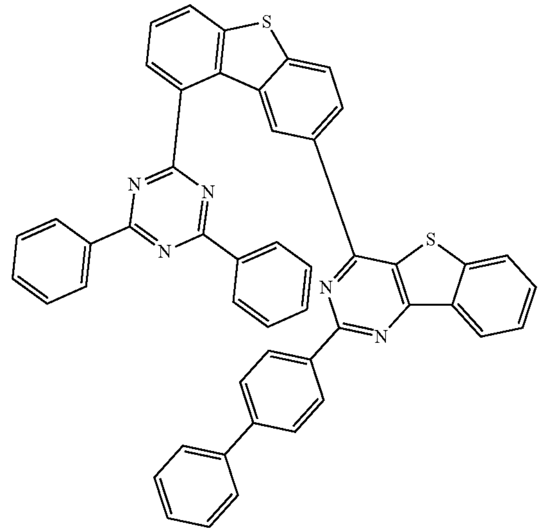

-continued
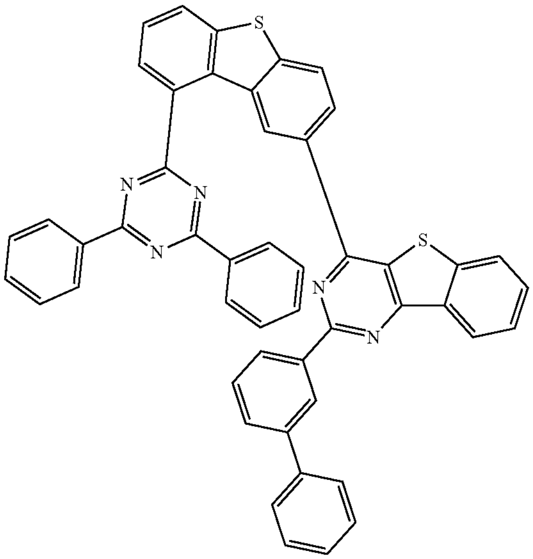
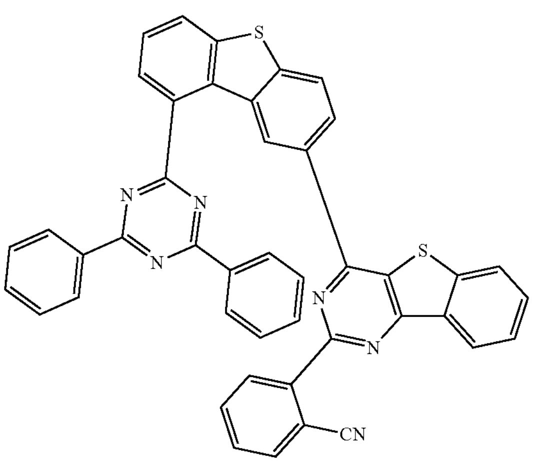
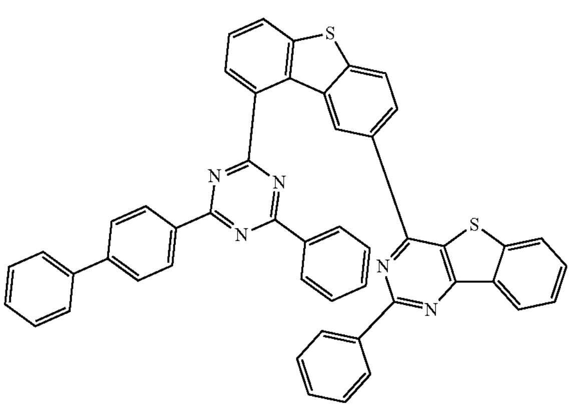
-continued
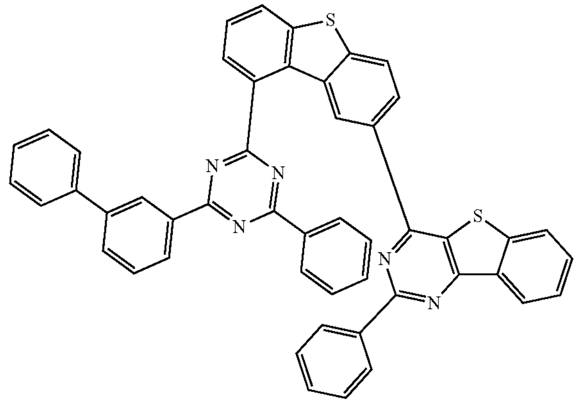
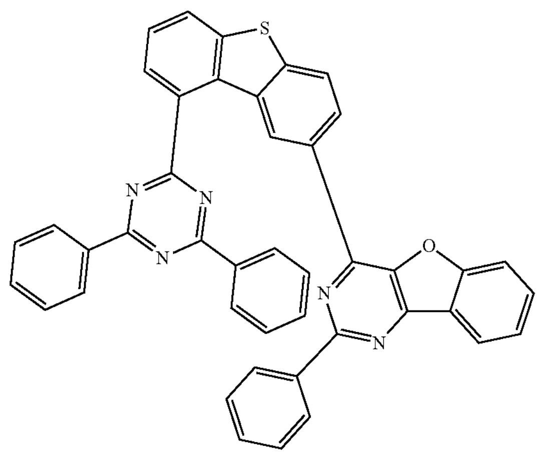
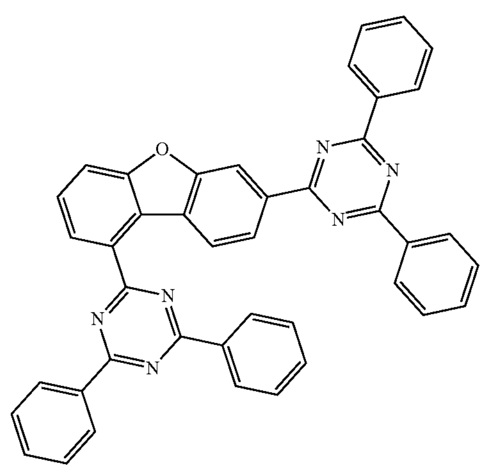

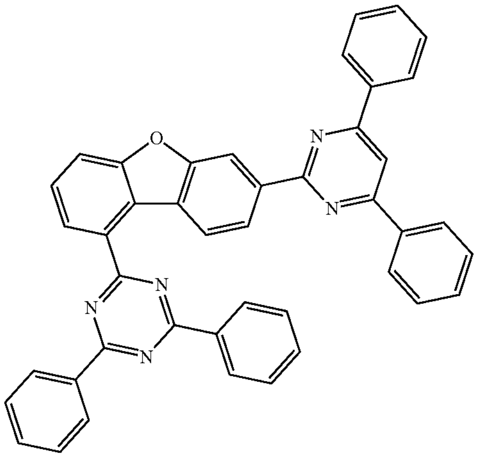
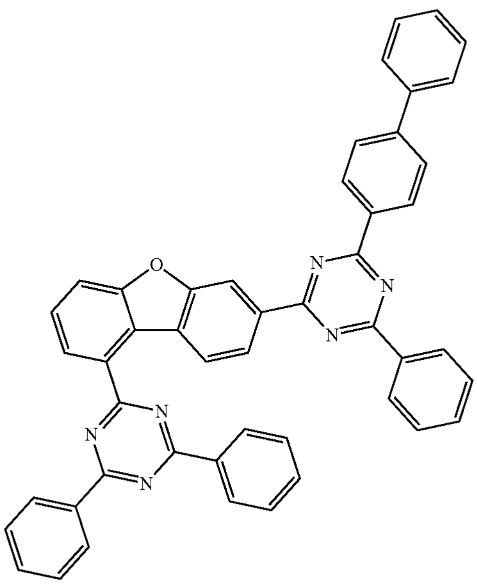
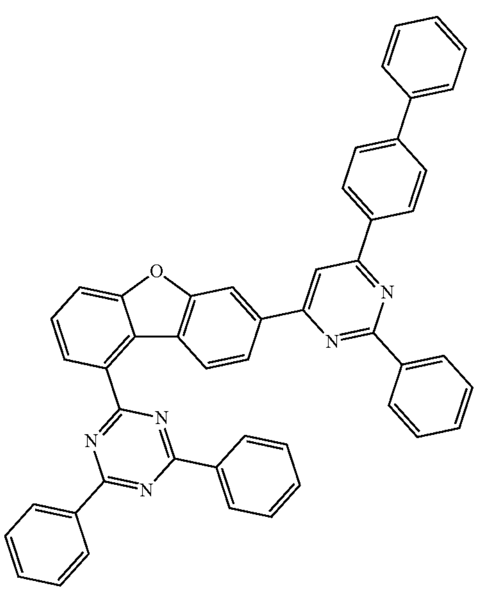
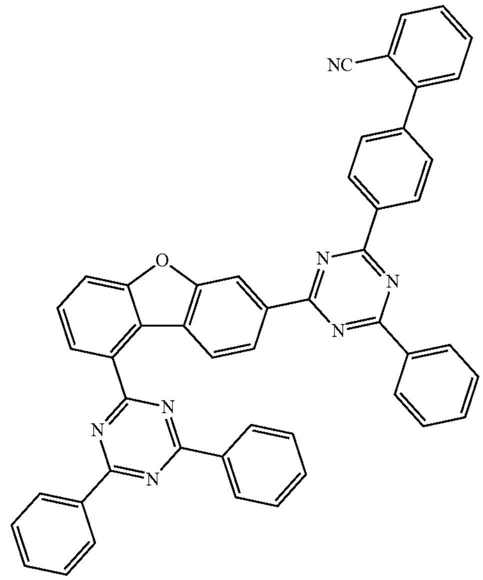
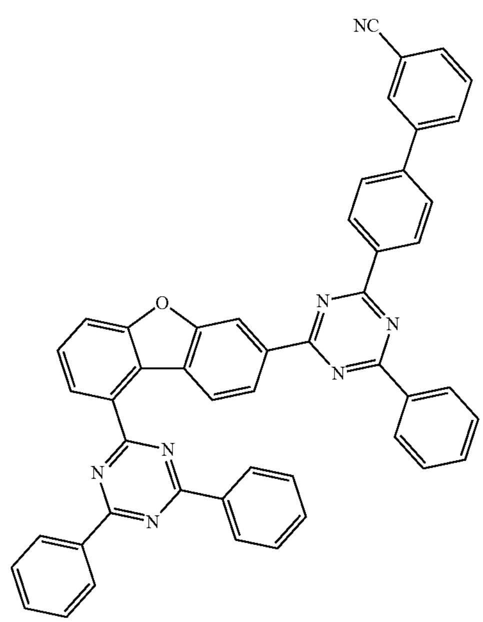

-continued
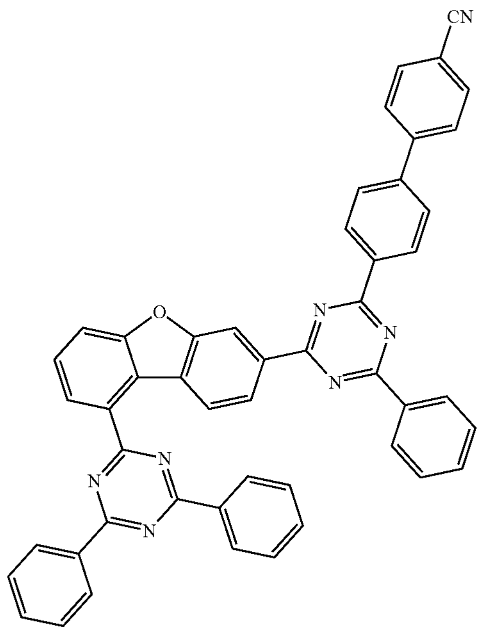
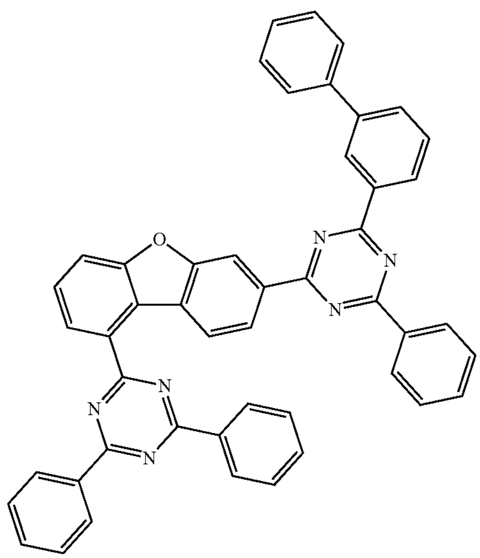
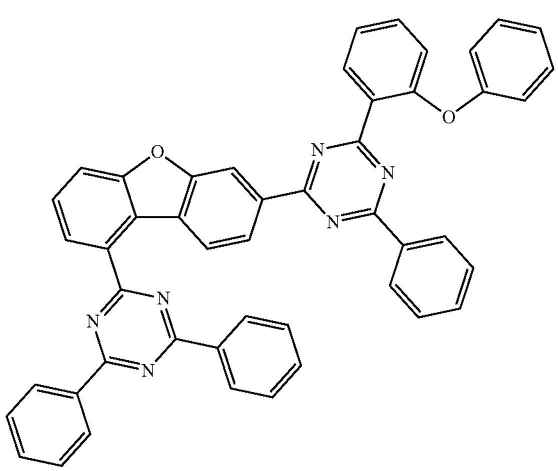
-continued
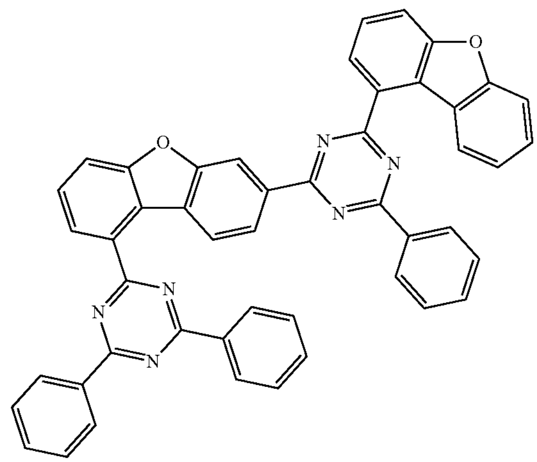
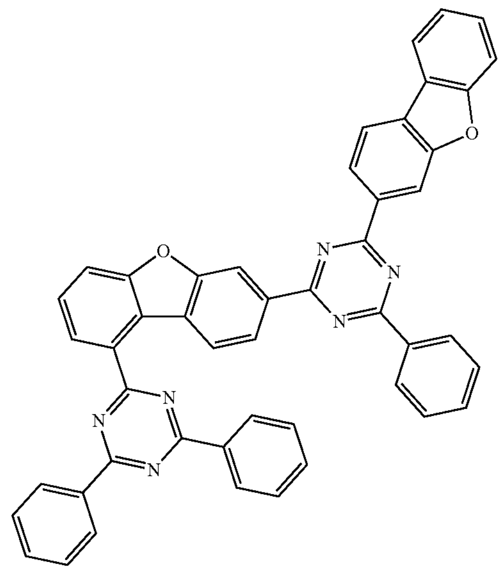
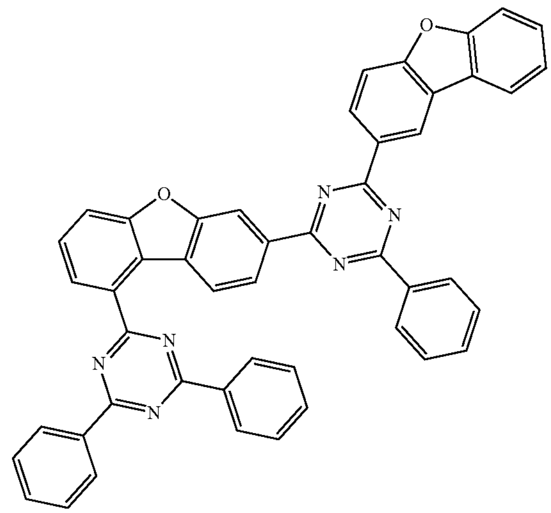

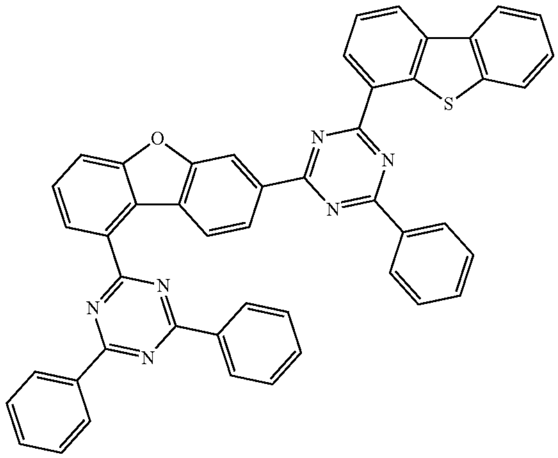
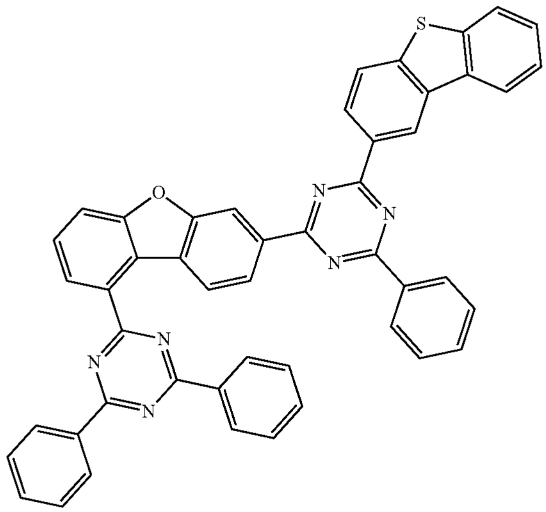
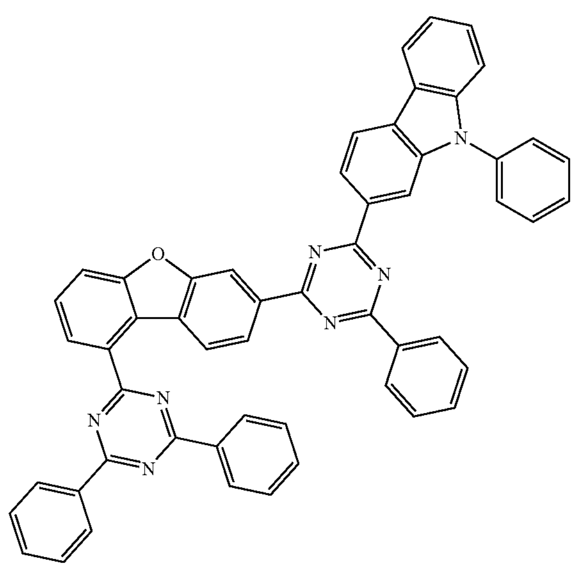
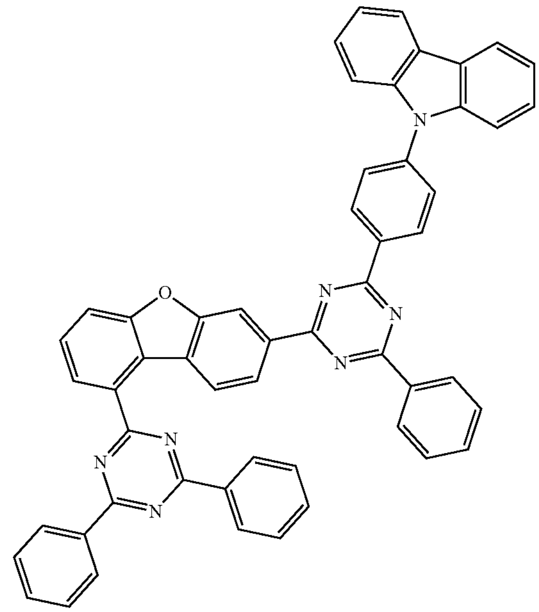
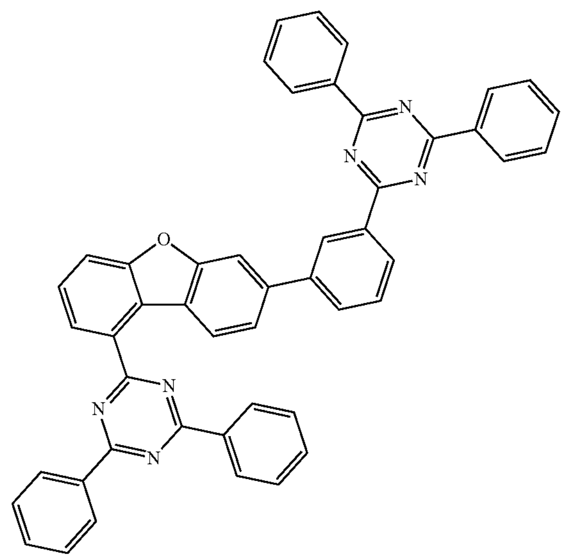
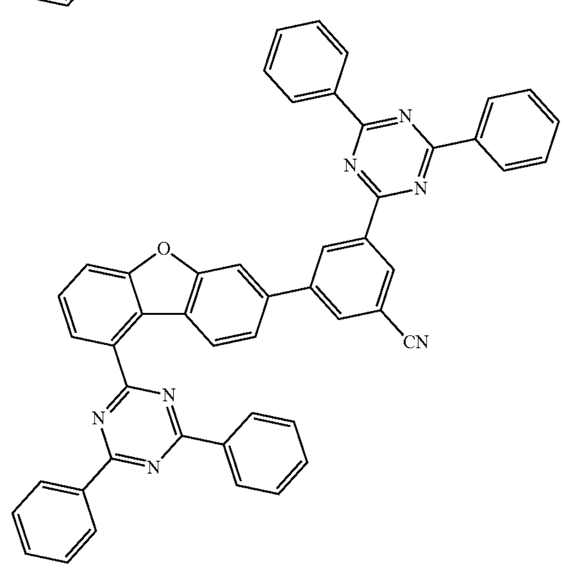

-continued
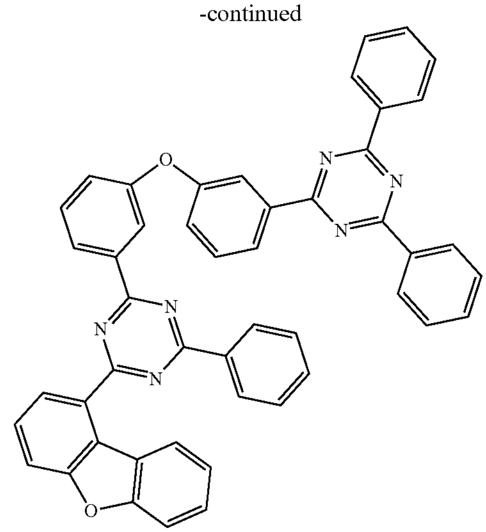
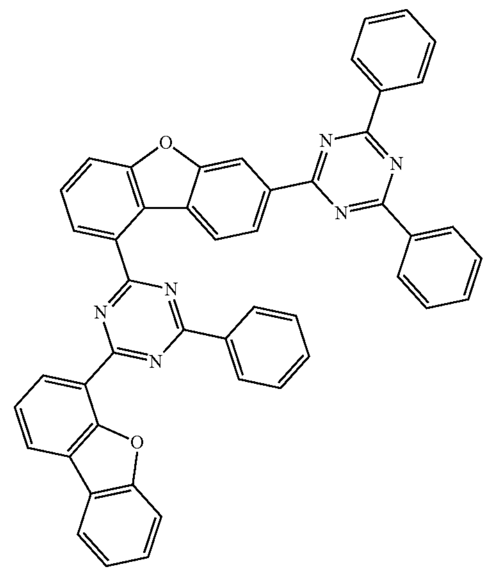
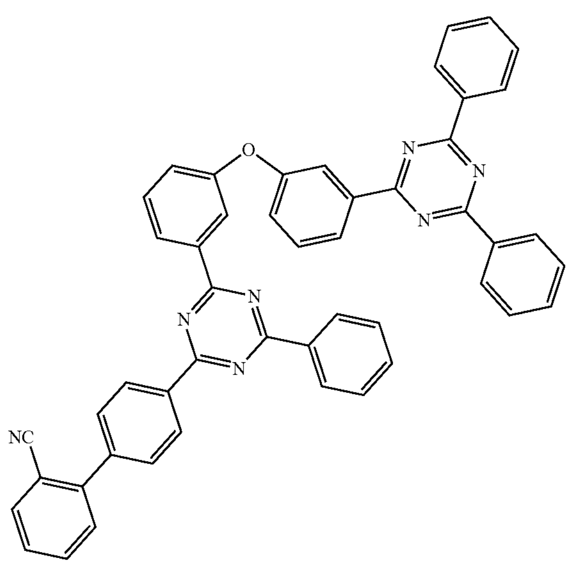
-continued
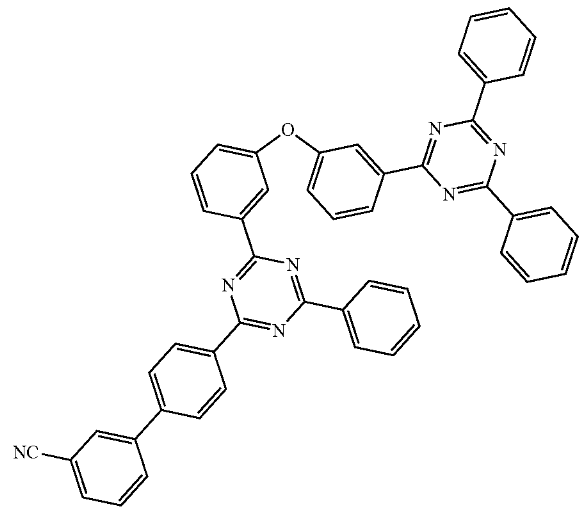
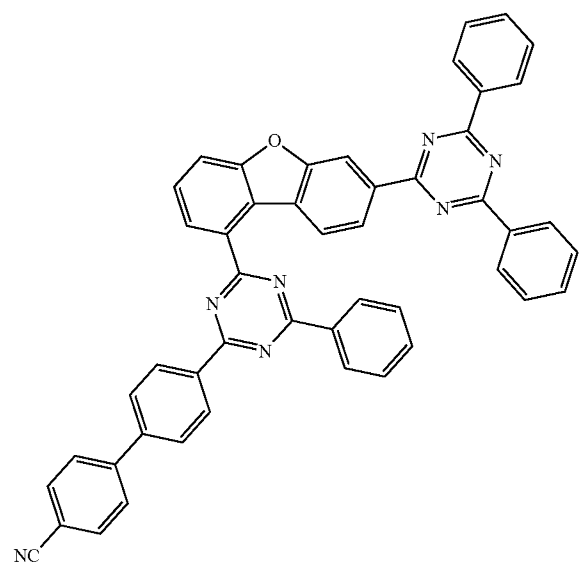
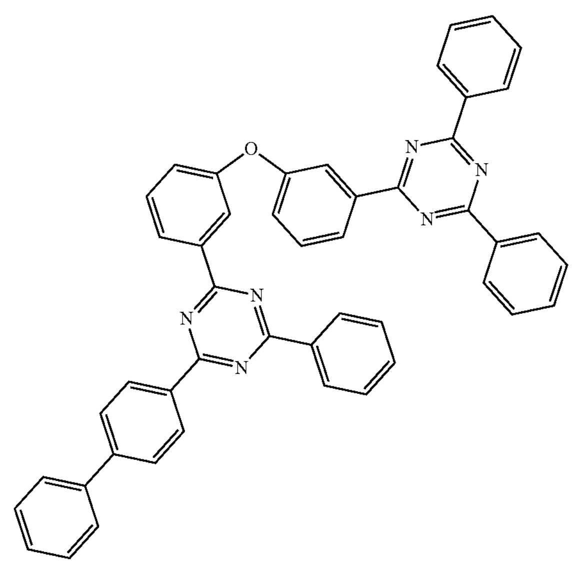

-continued
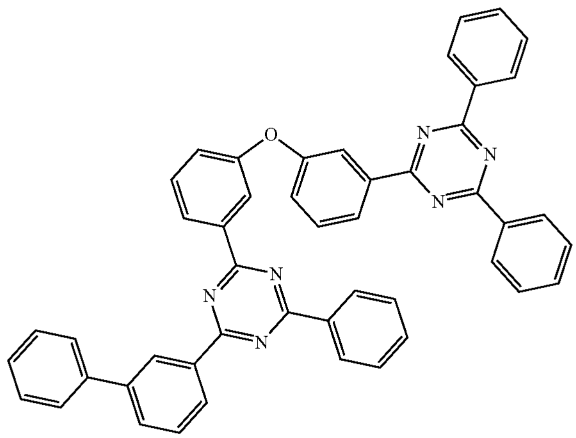
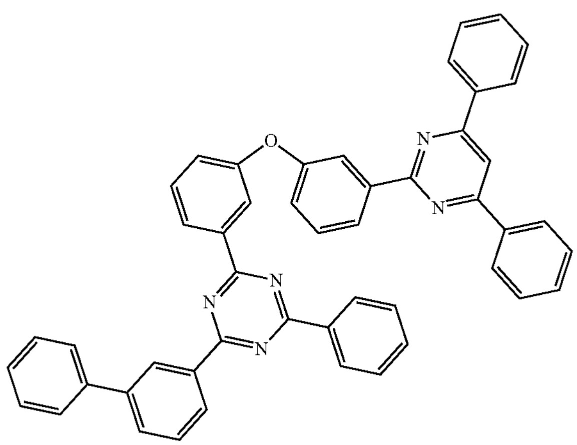
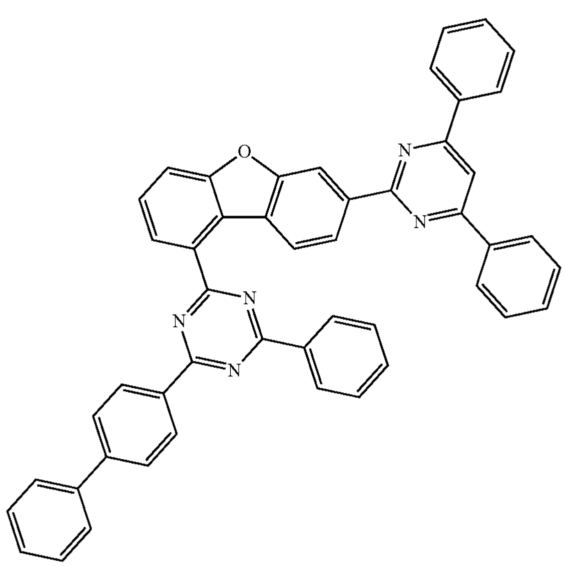
-continued
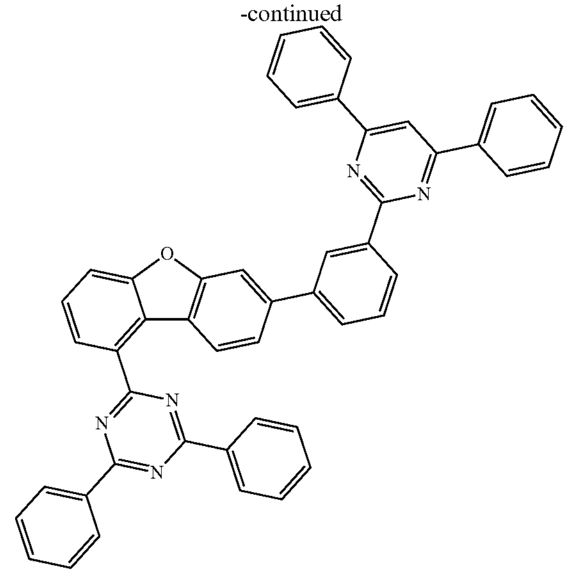
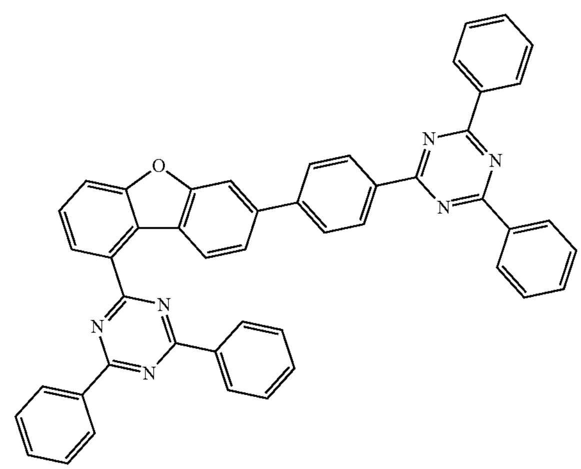
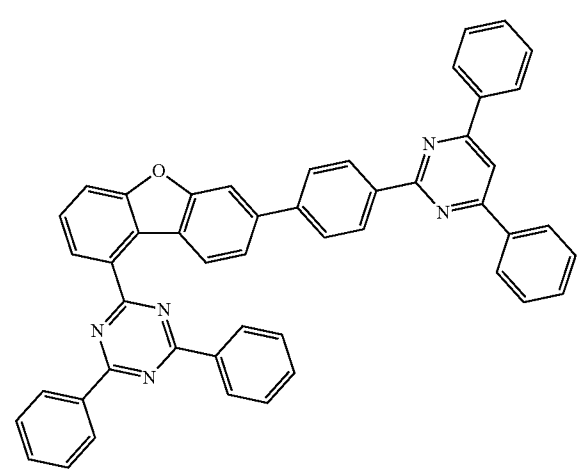

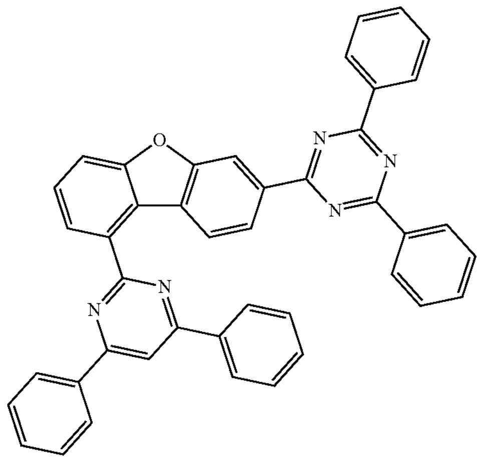
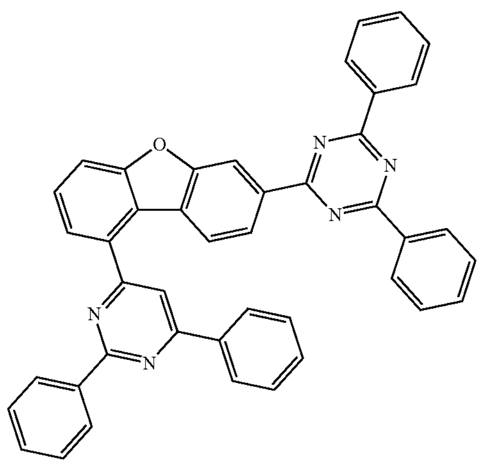
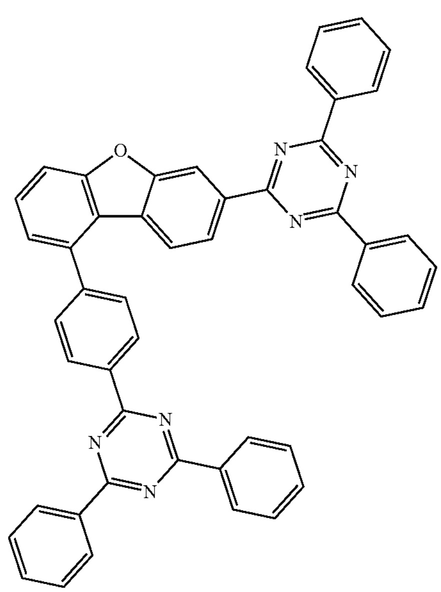
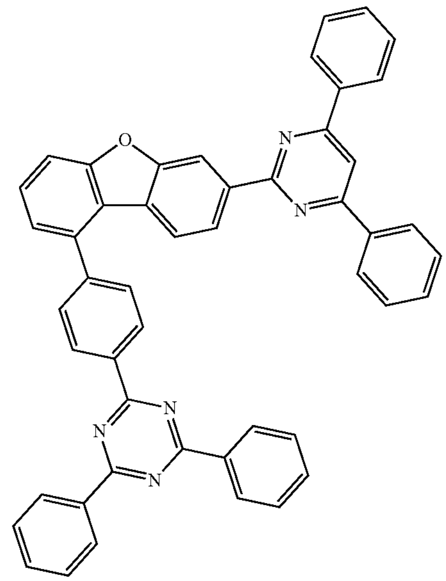
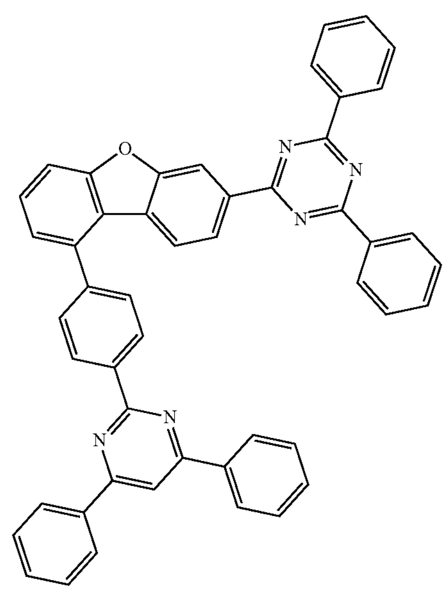

-continued
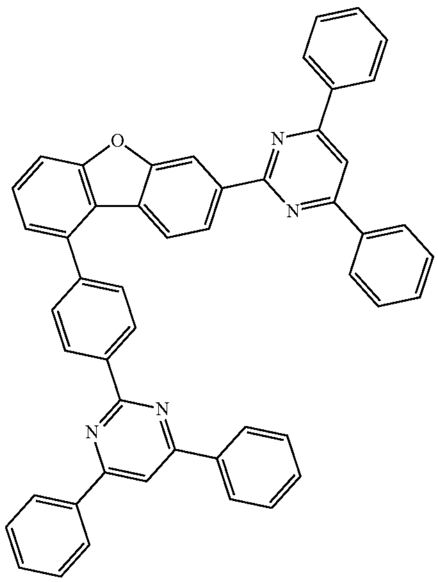
-continued
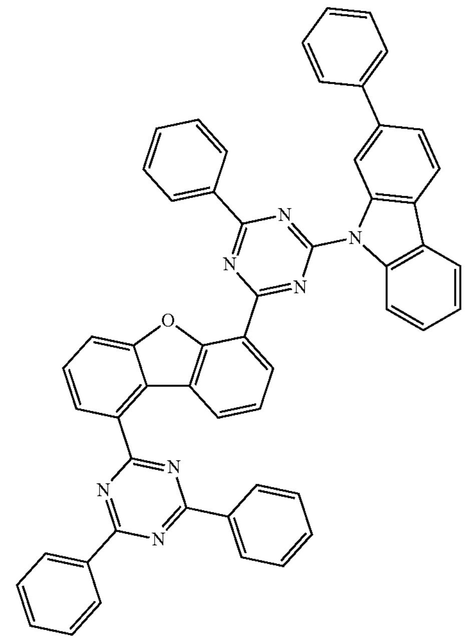
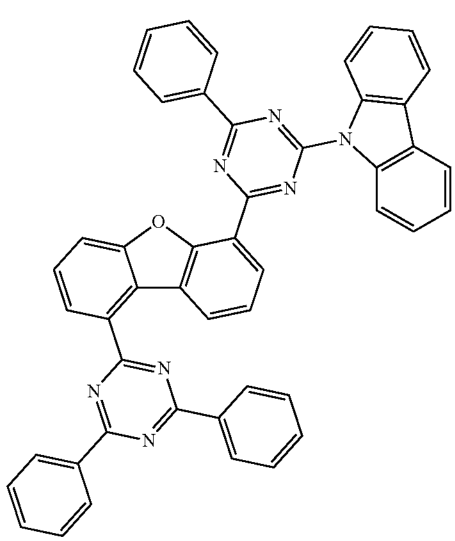
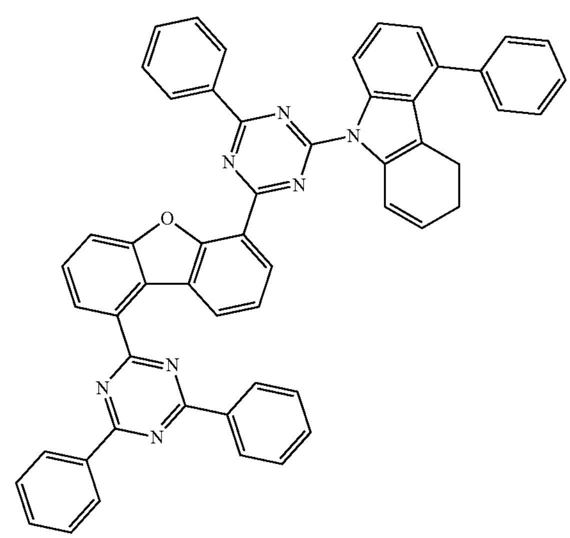

-continued
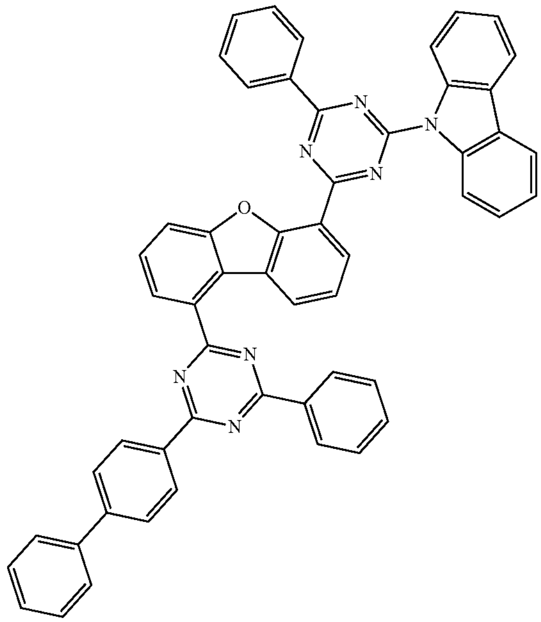
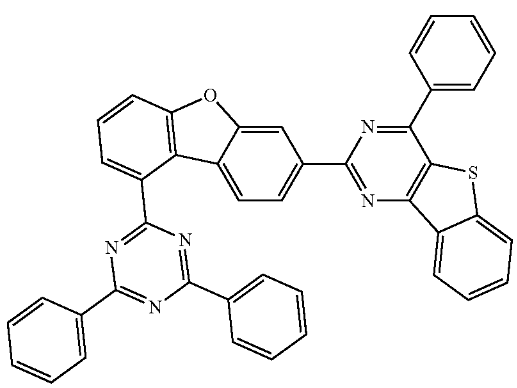
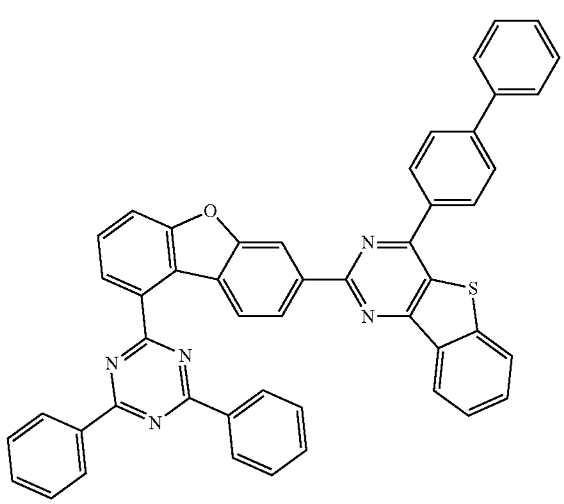
-continued
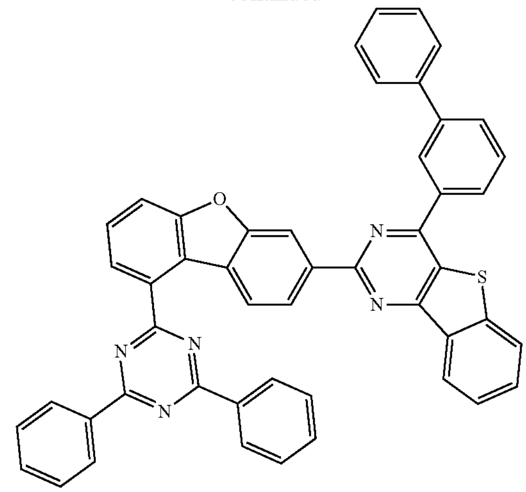
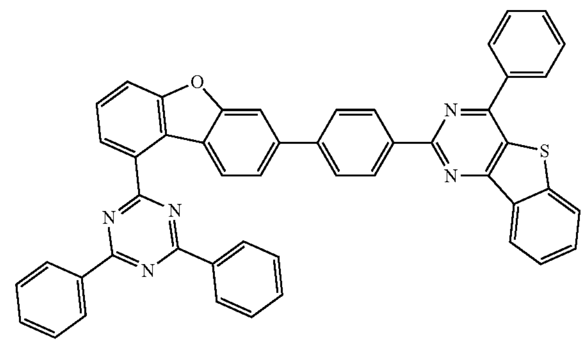
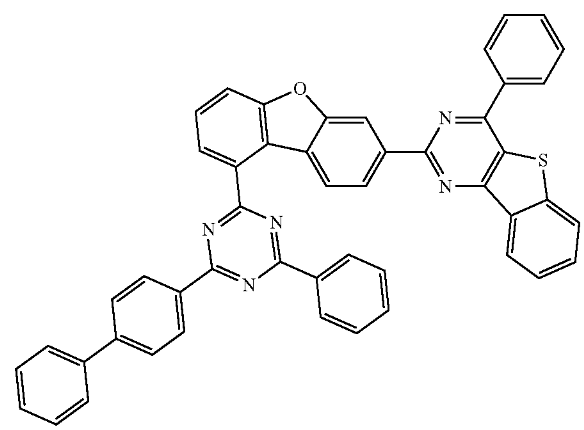
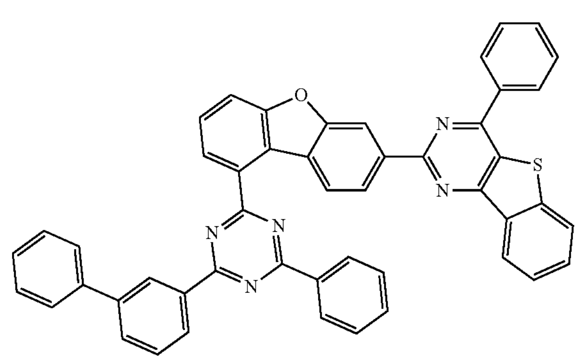

-continued
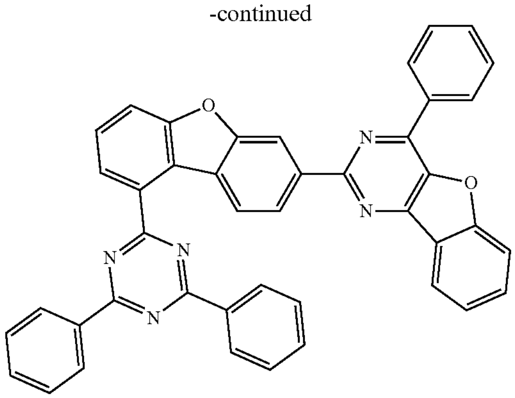
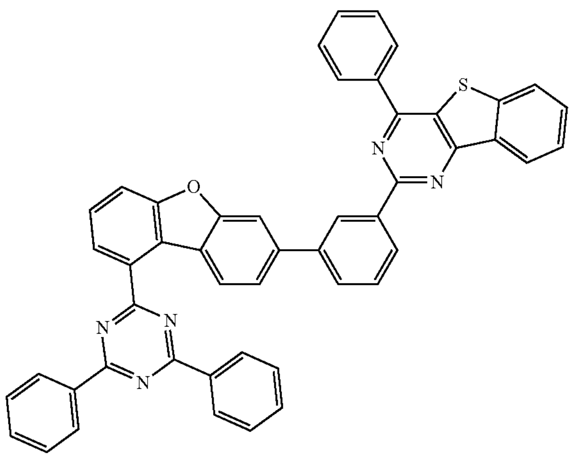
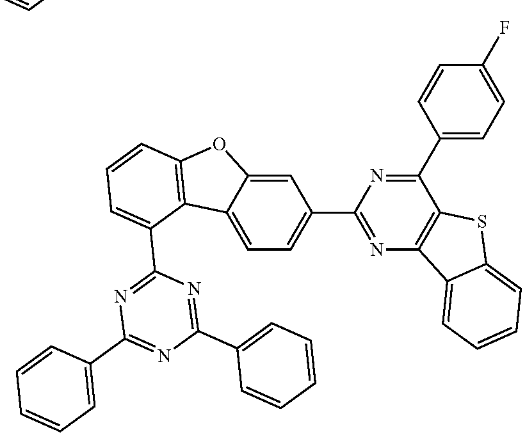
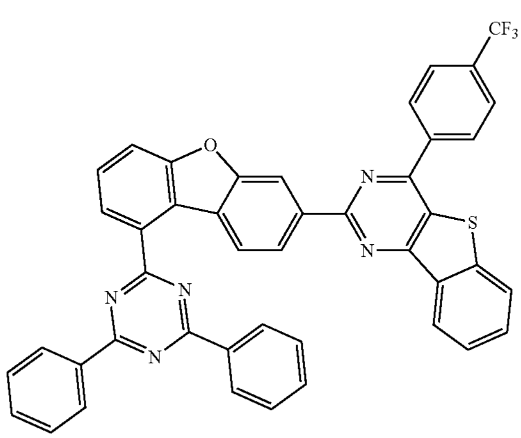
-continued
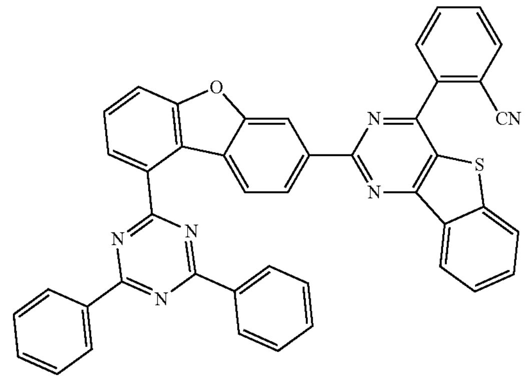
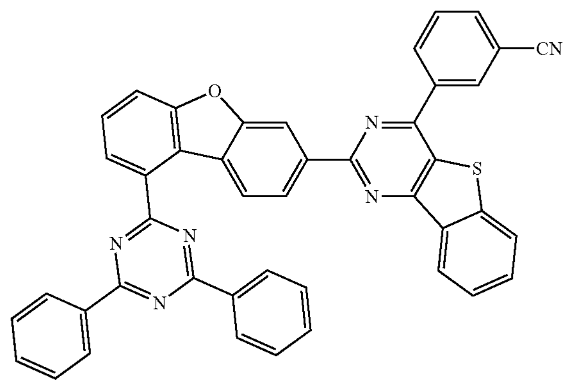
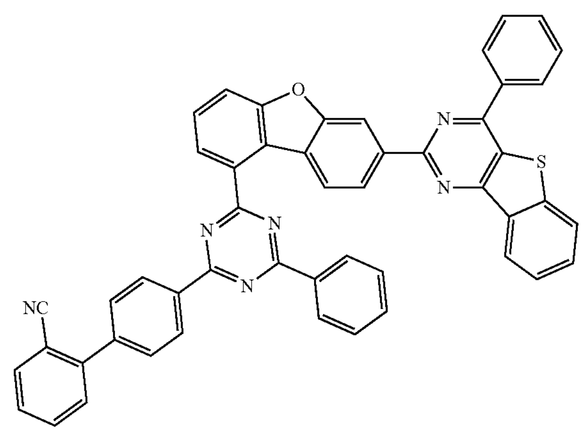
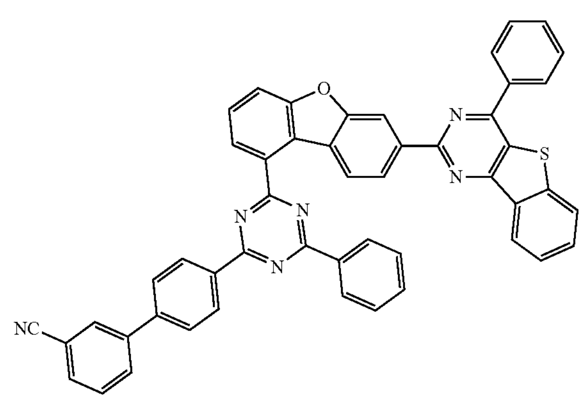

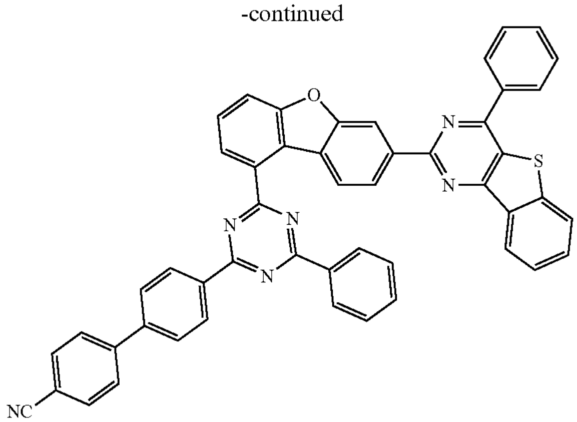
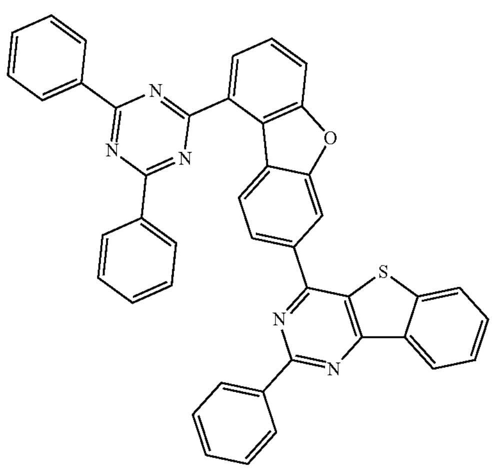
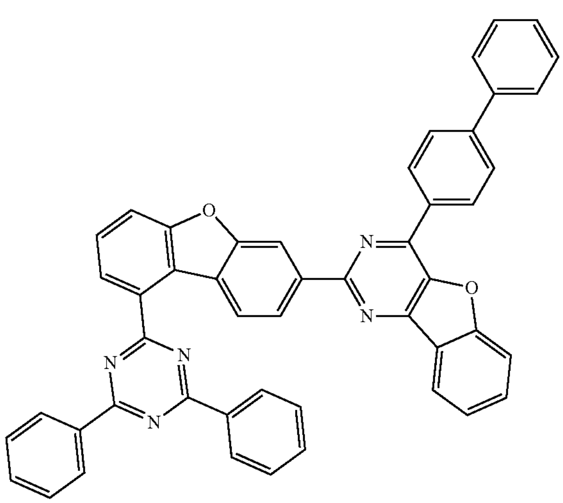
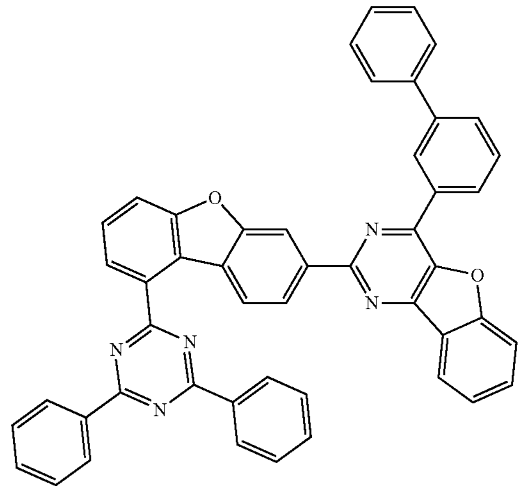
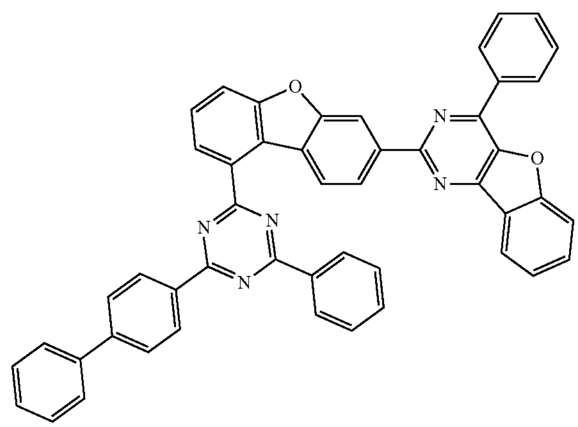
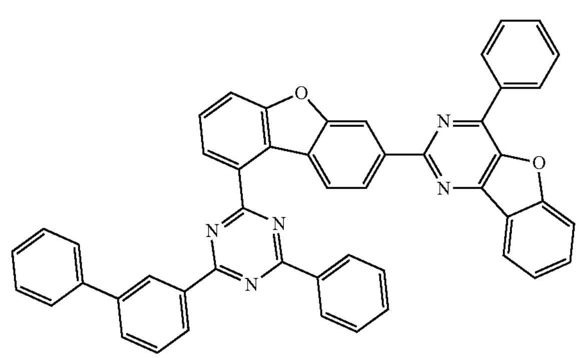

-continued
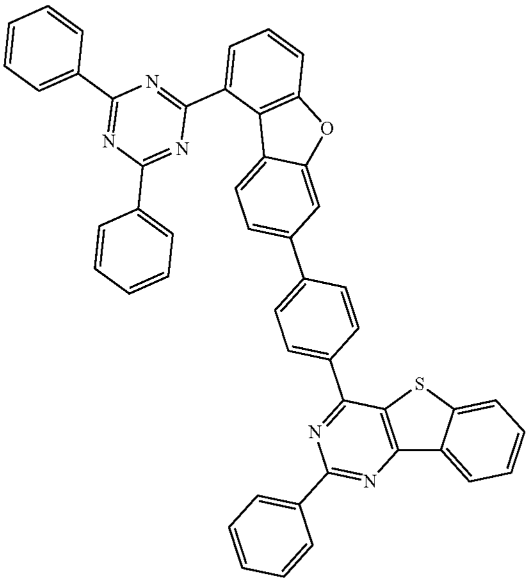
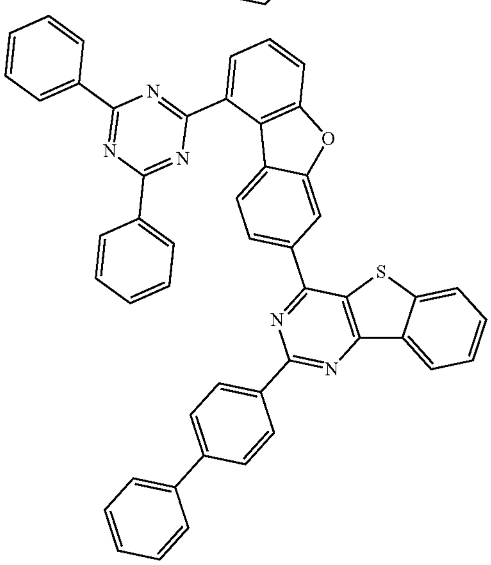
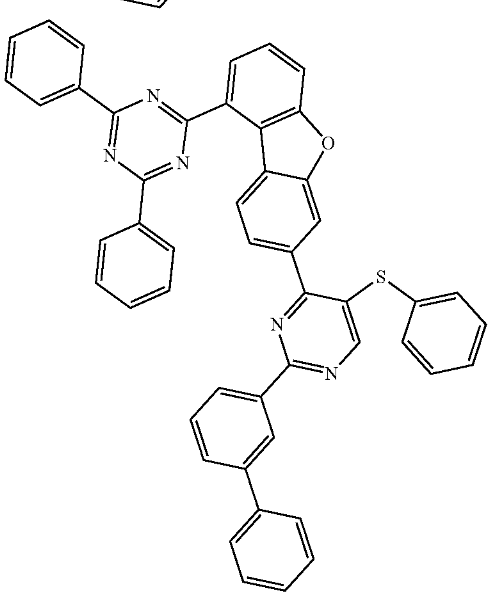
-continued
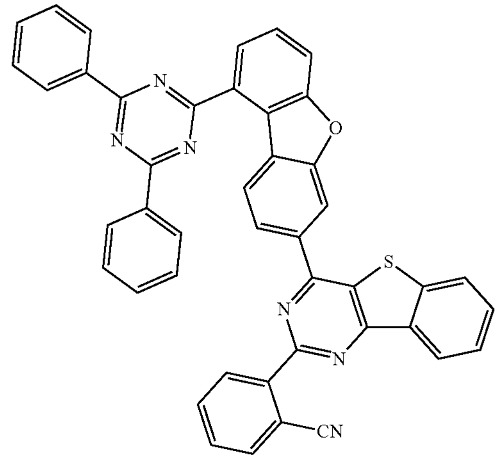 [SMILES: N#Cc1ccccc1-c1nc(-c2ccc3c(c2)oc2cccc(-c4nc(-c5ccccc5)nc(-c5ccccc5)n4)c23)c2sc3ccccc3c2n1]
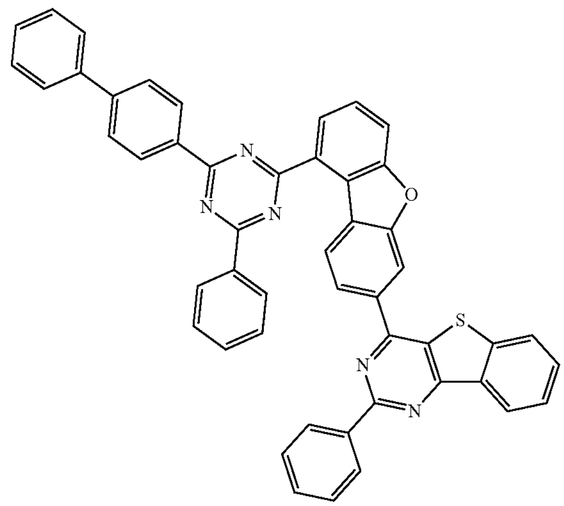
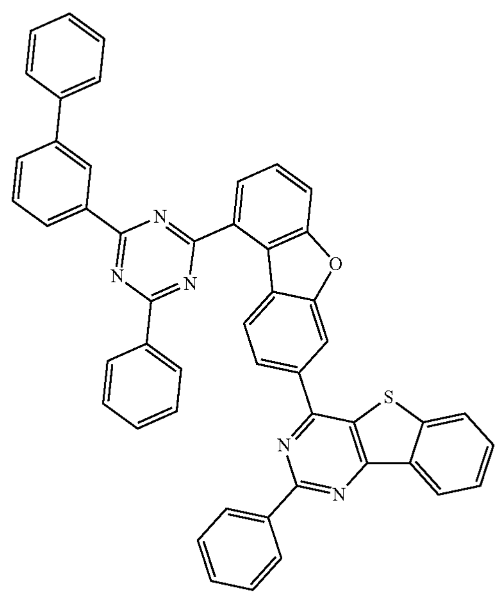

-continued
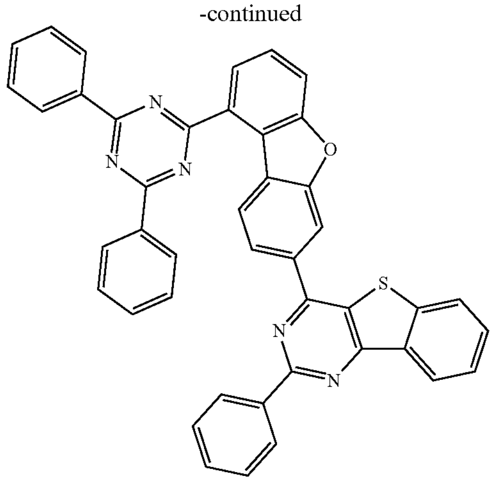
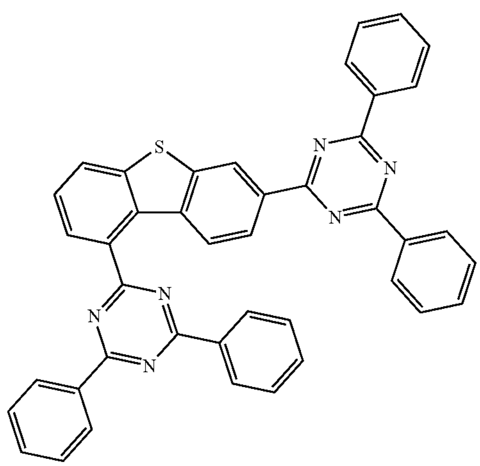
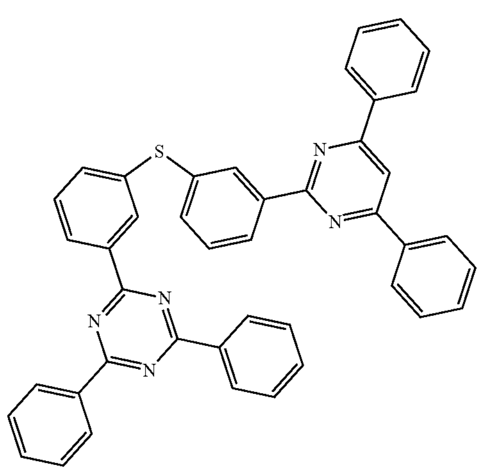
-continued
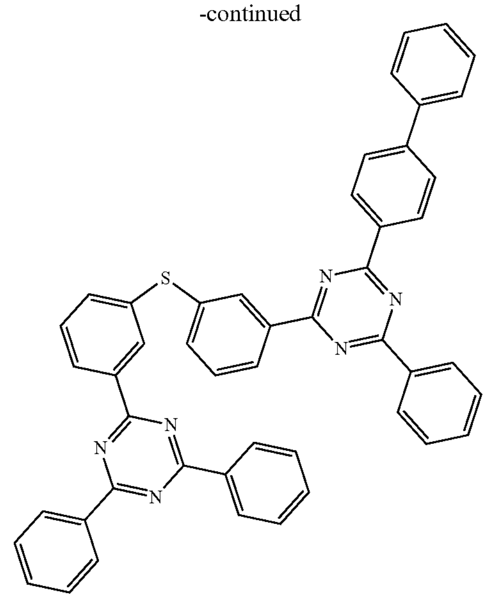
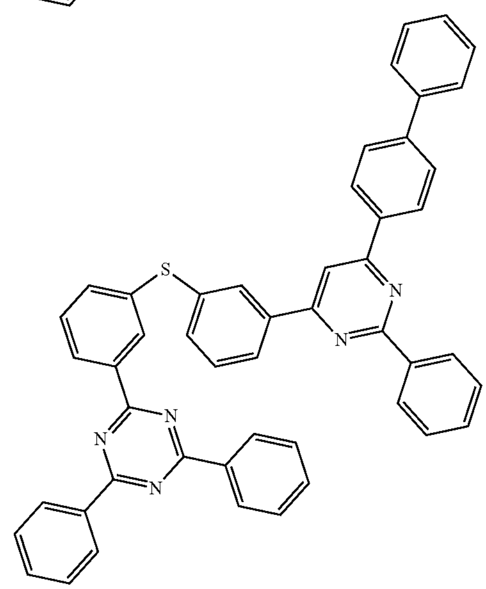
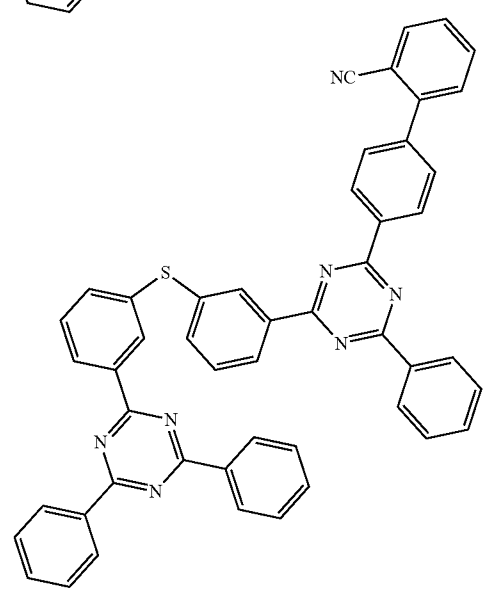

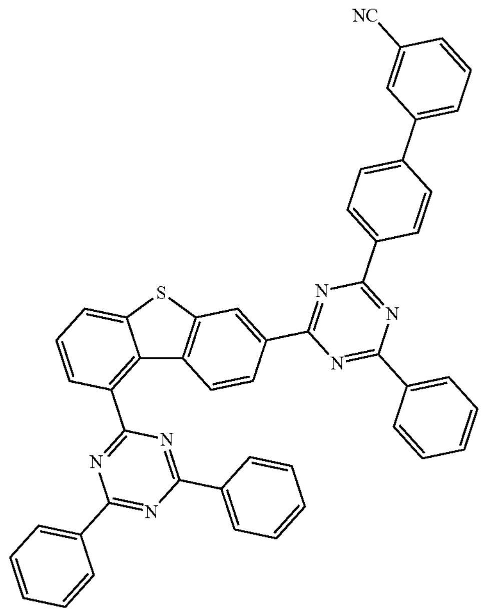
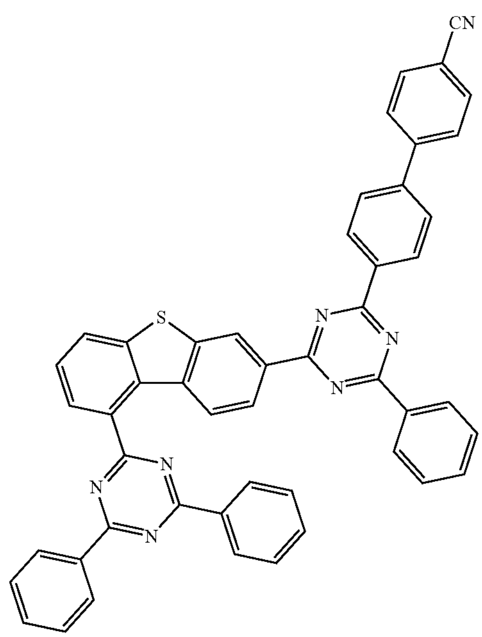
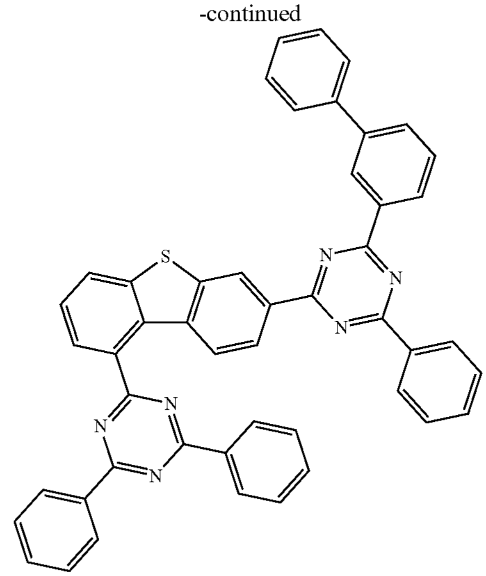
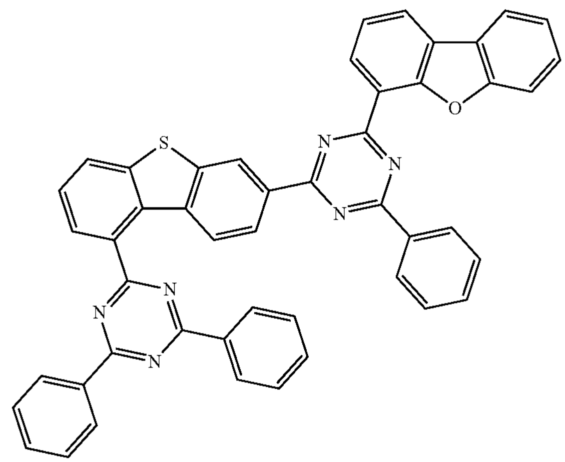
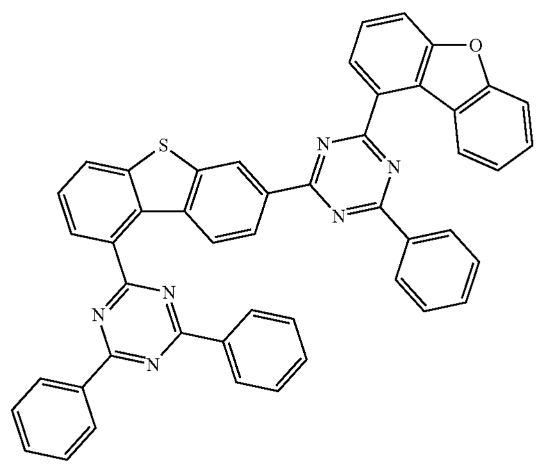
O
S
N
N
N
N
N
N

-continued
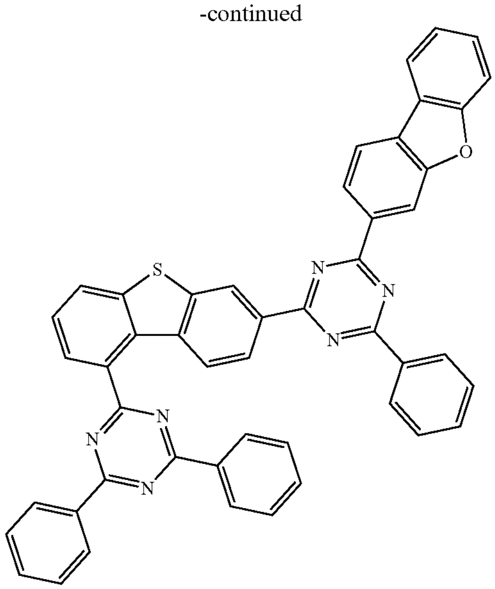
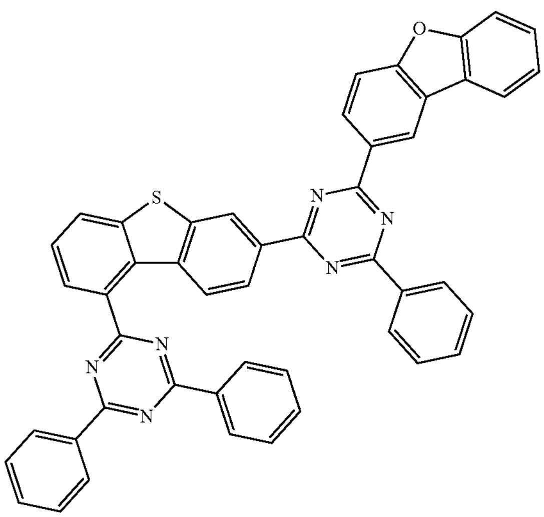
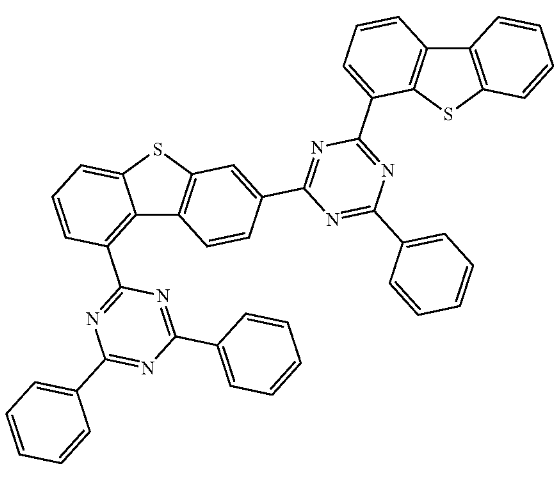
-continued
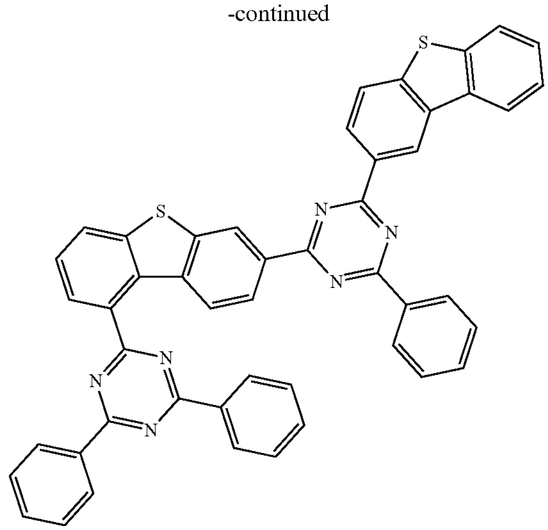
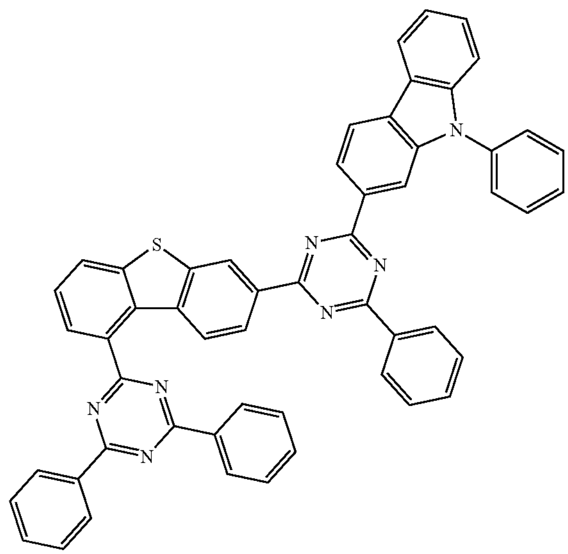
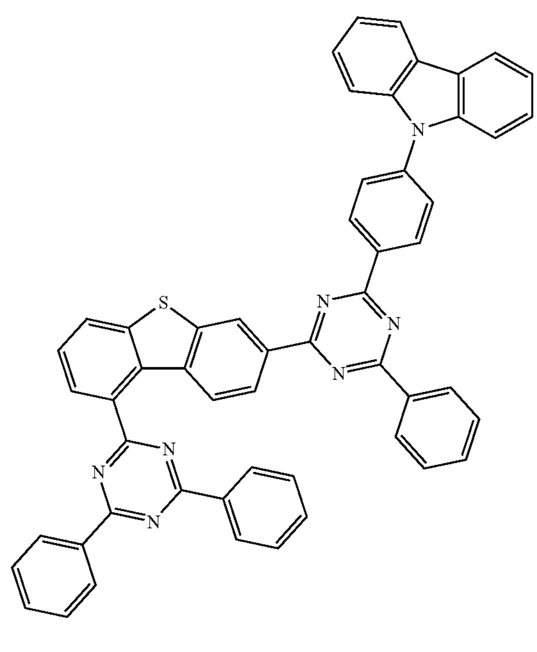

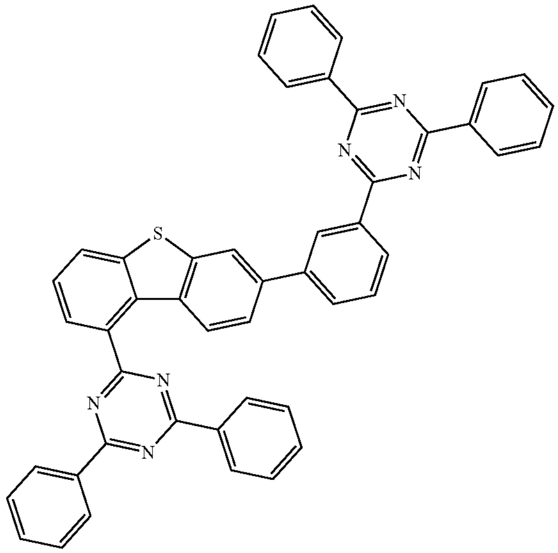
S
N
N
N
N
N
N
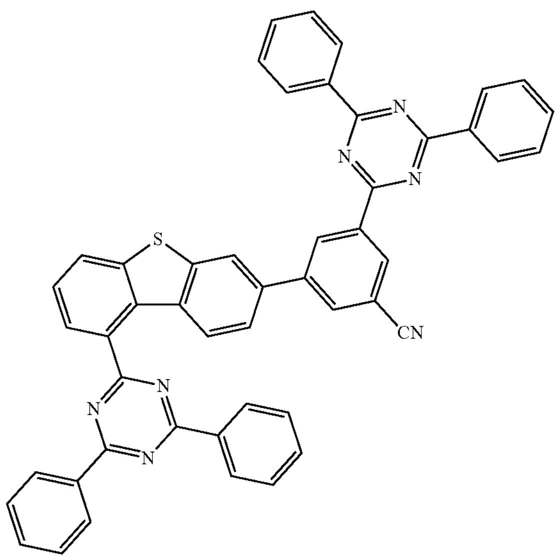
S
N
N
N
N
N
N
CN
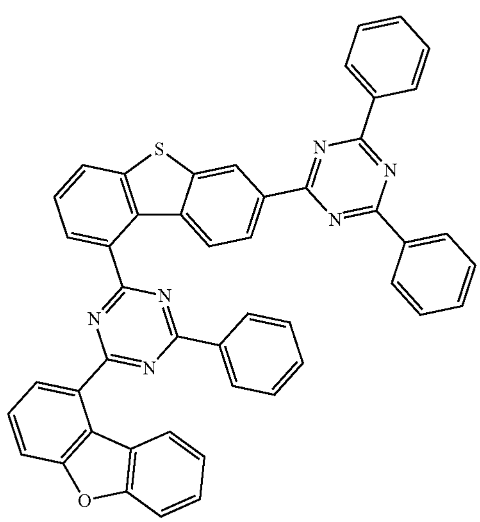
S
N
N
N
N
N
N
O
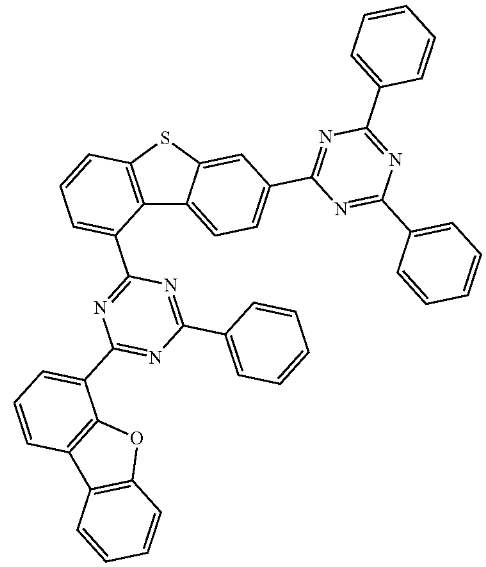
S
N
N
N
N
N
N
O
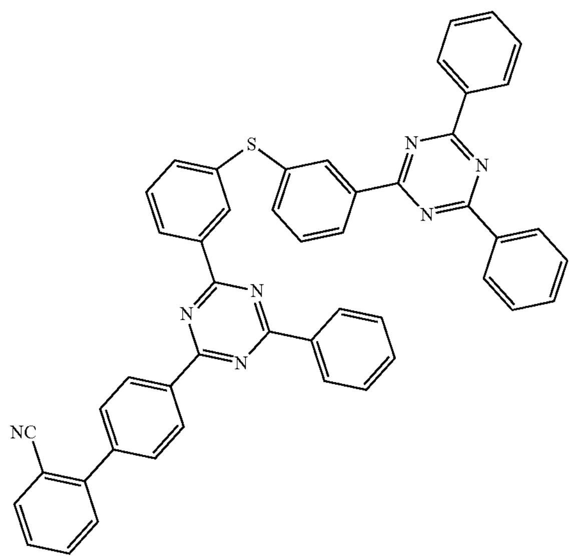
S
N
N
N
N
N
N
NC
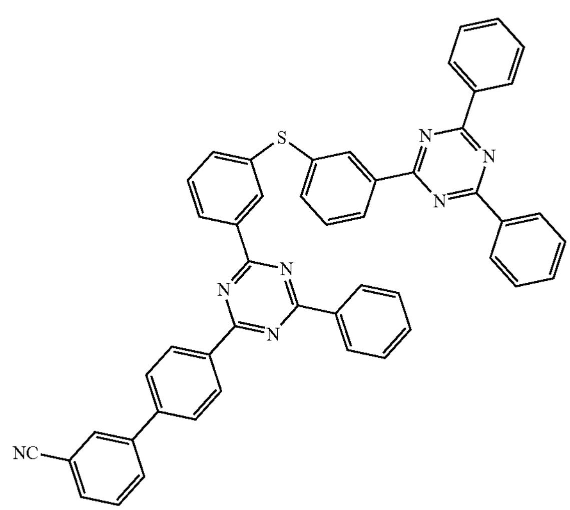
S
N
N
N
N
N
N
NC -continued
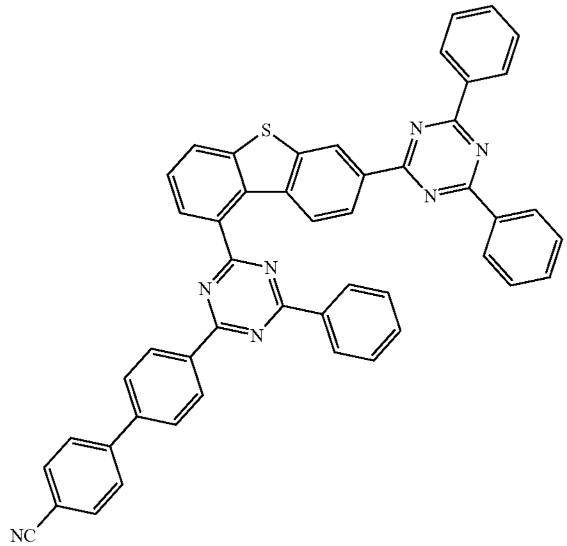
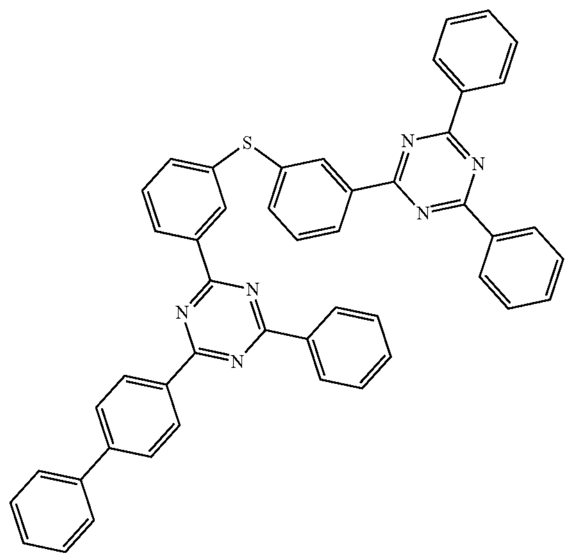
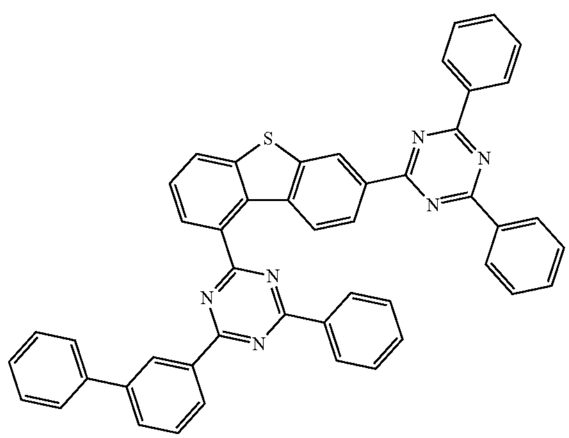
-continued
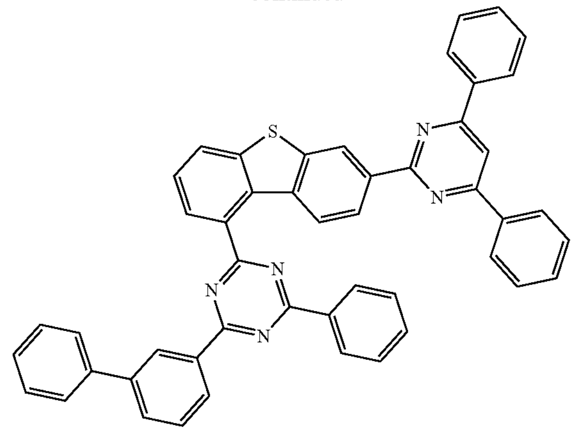
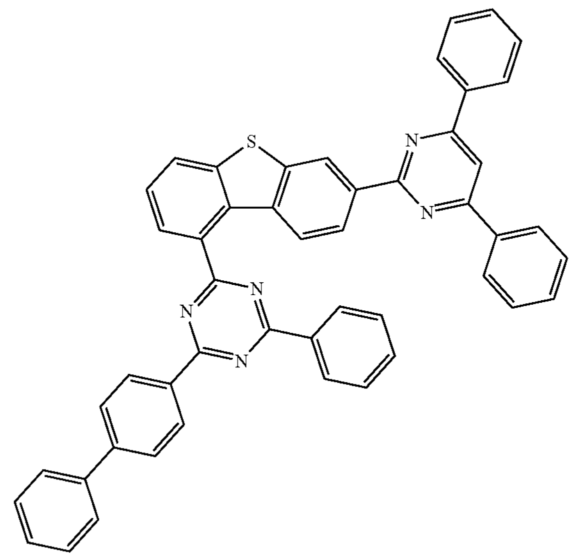
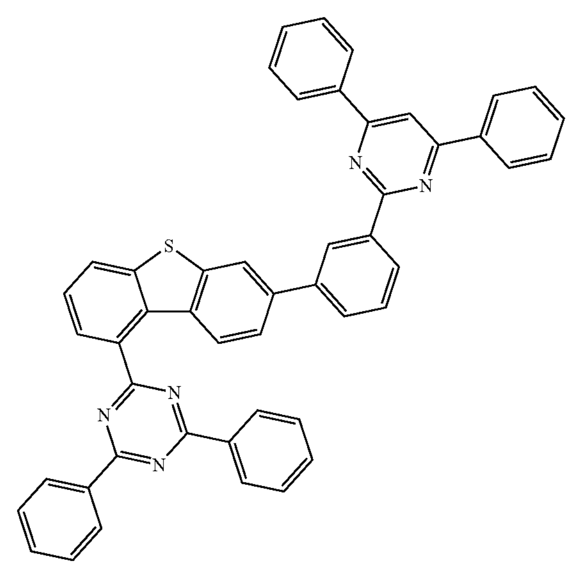

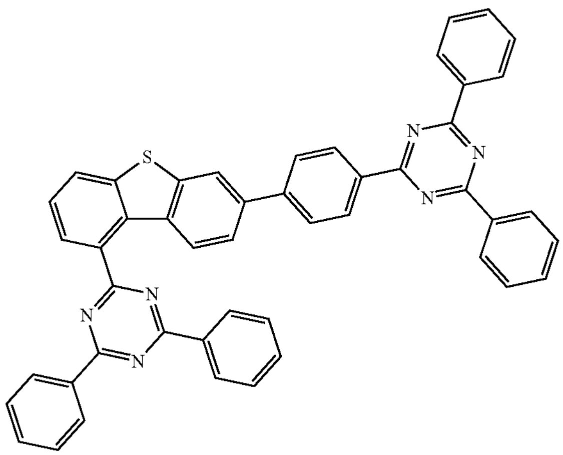
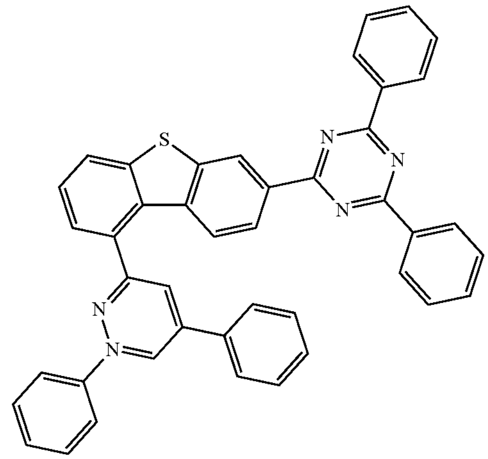
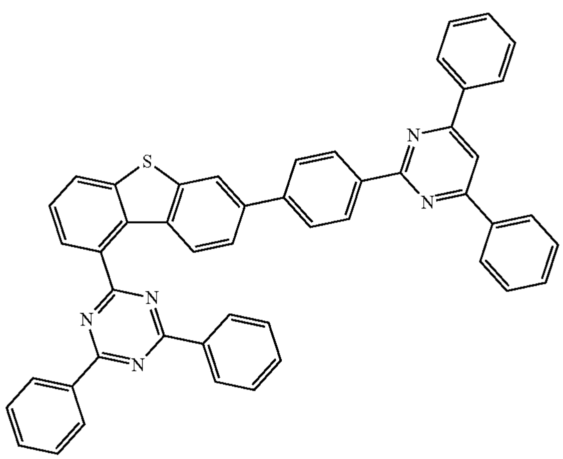
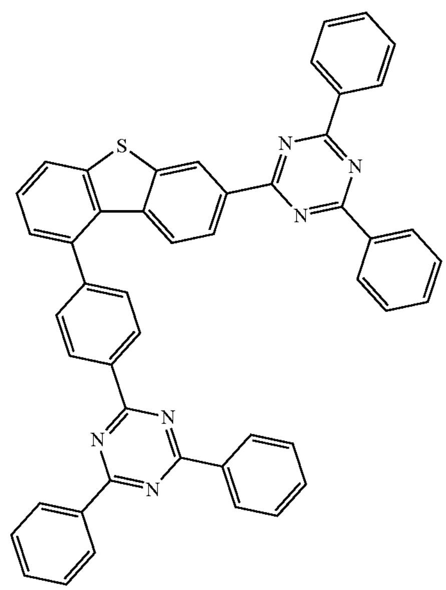
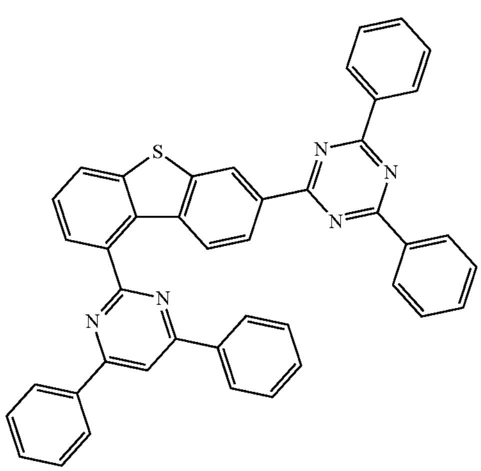
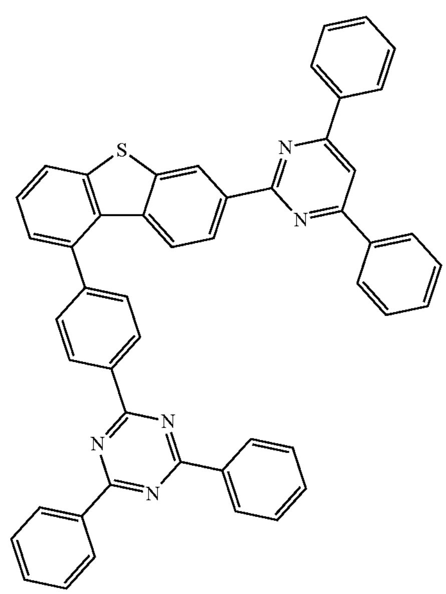

-continued
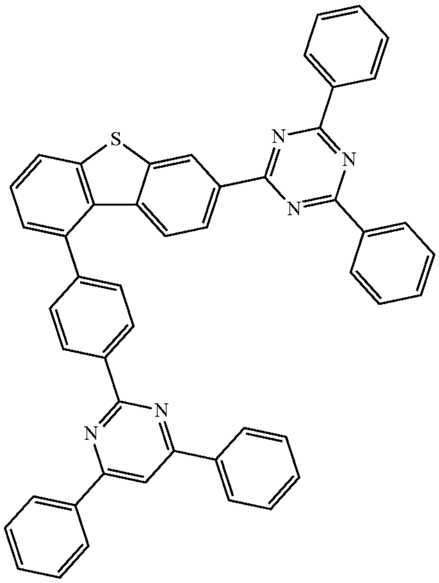
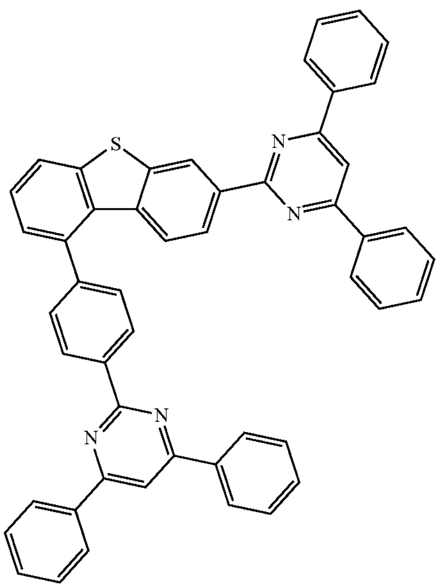
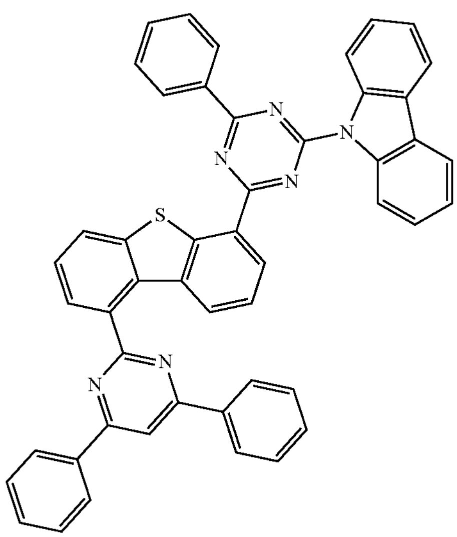
-continued
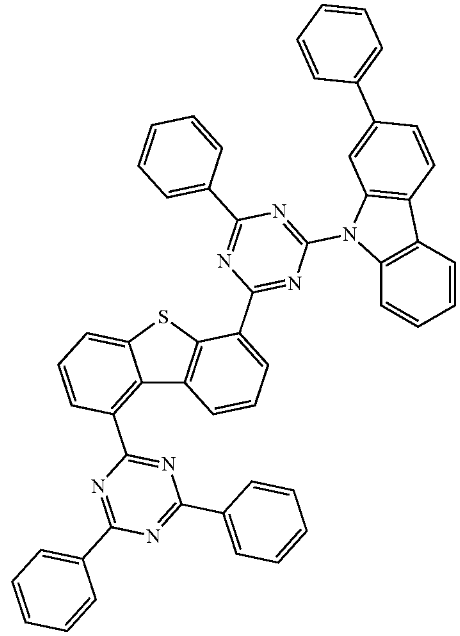
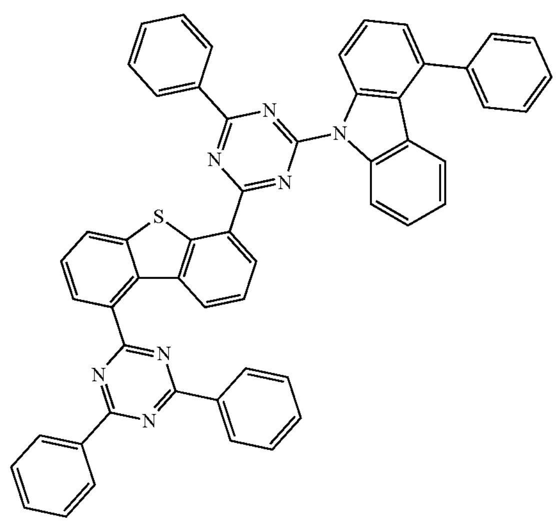

-continued
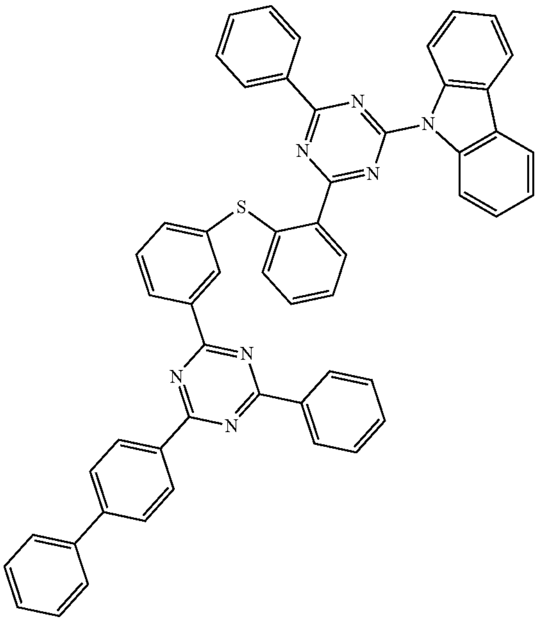
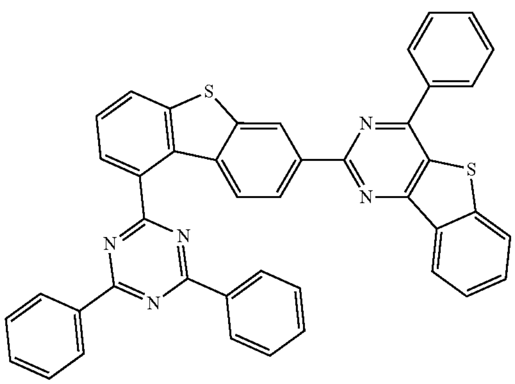
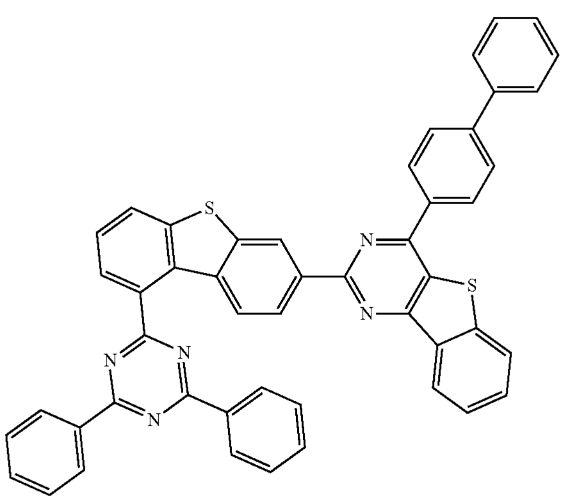
-continued
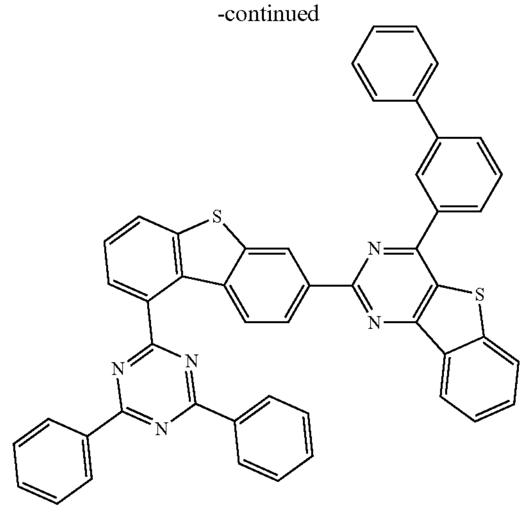
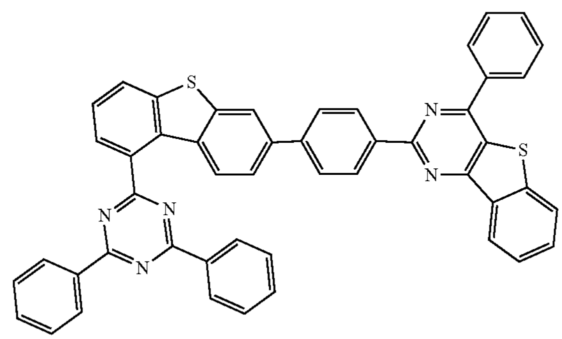
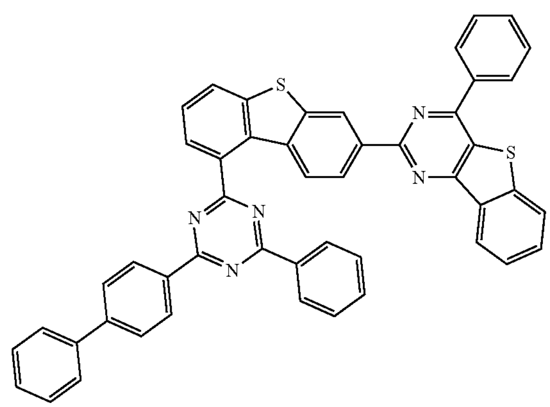
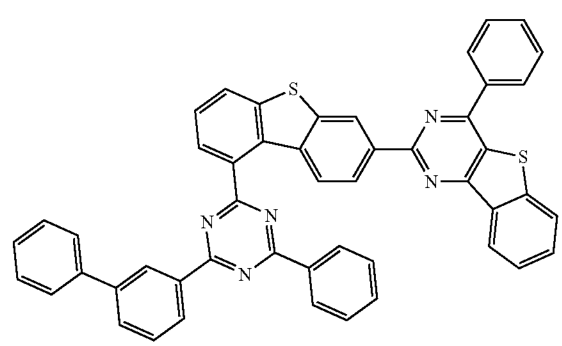

-continued
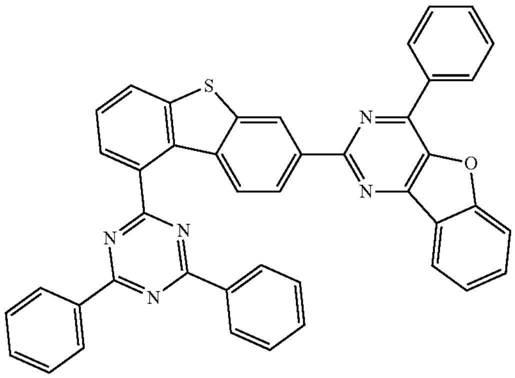
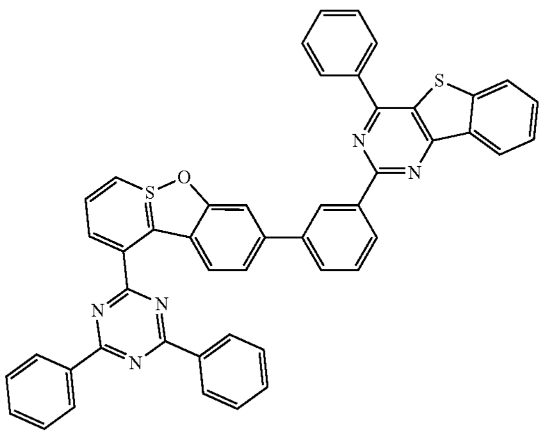
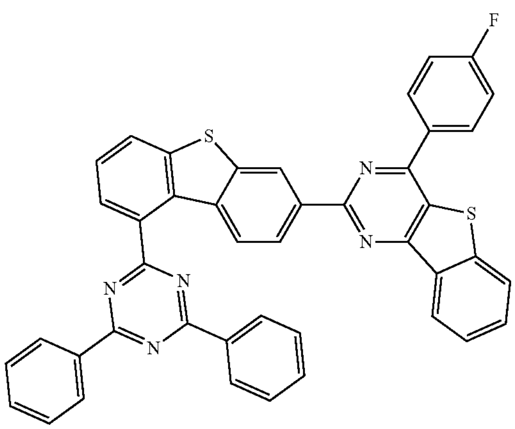
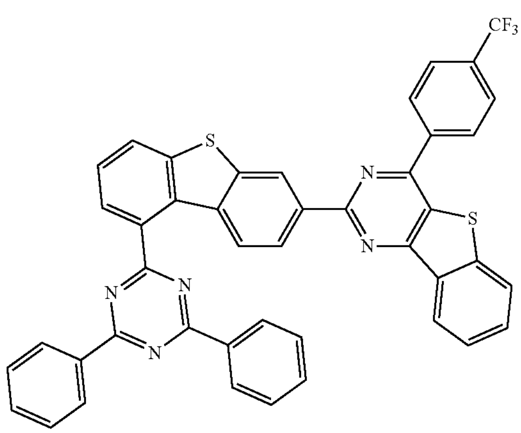
-continued
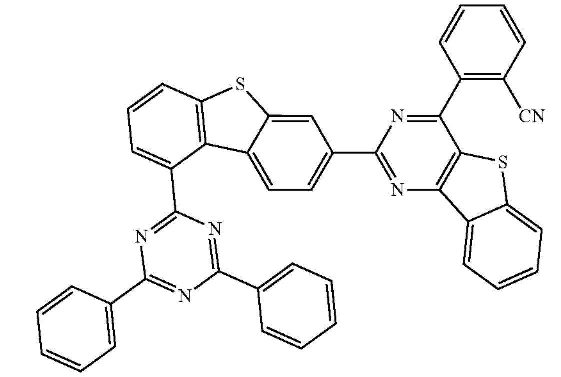
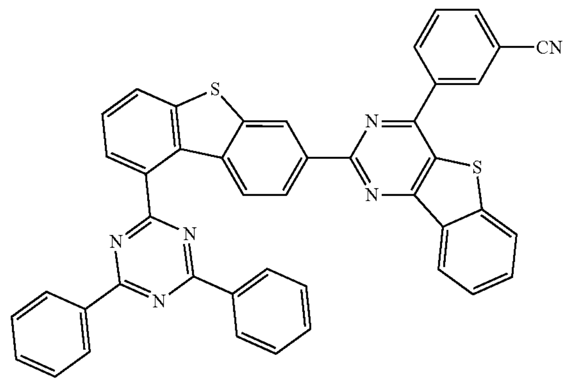
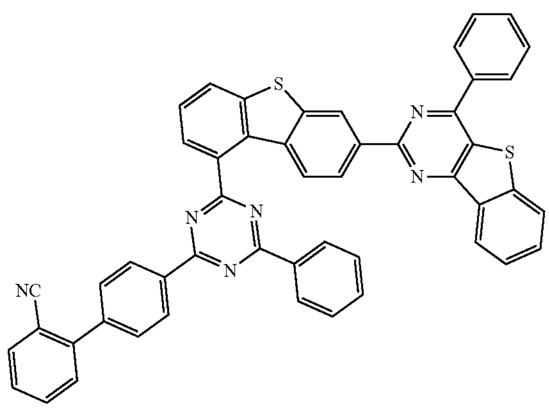
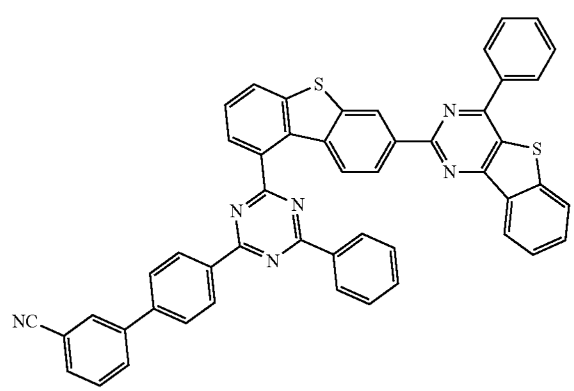

-continued
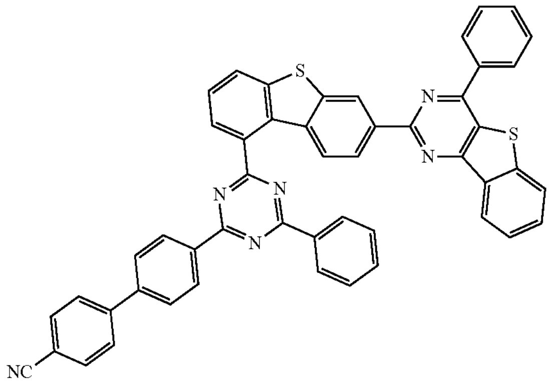
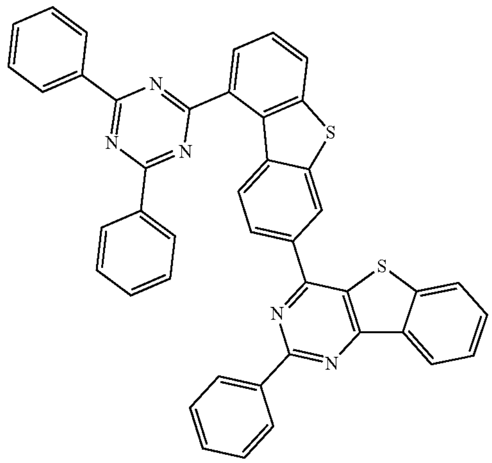
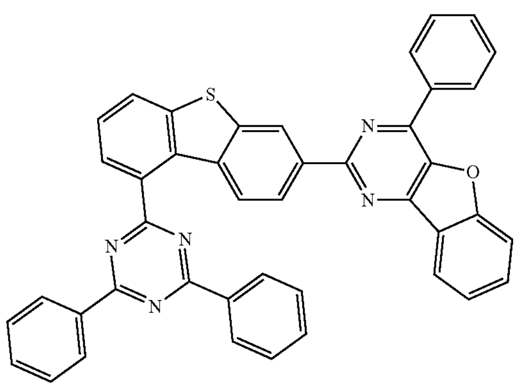
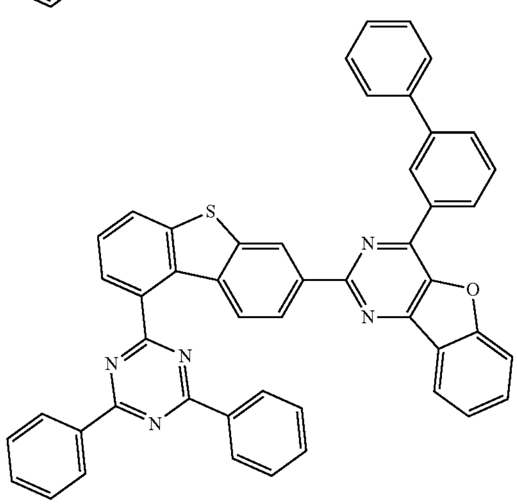
-continued
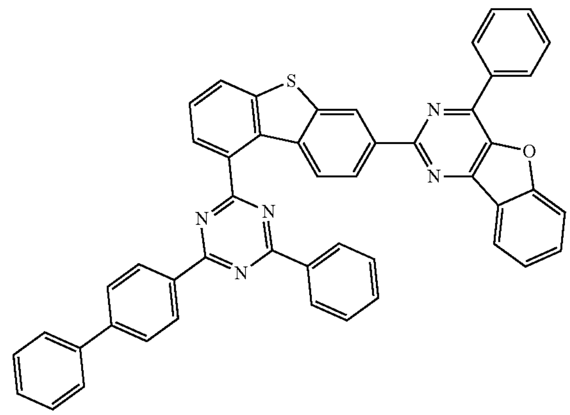
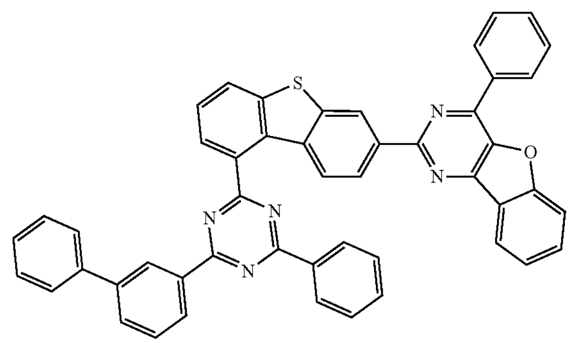
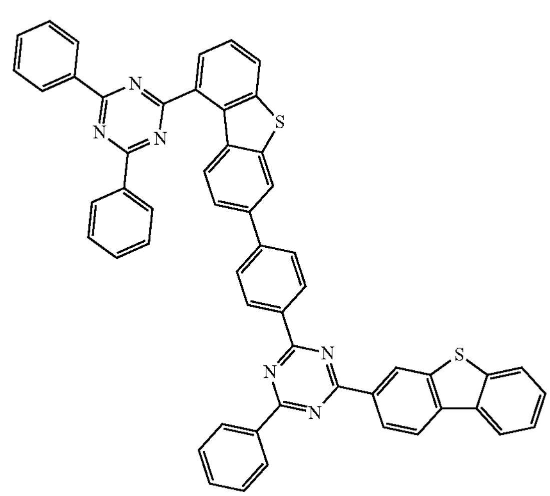

-continued
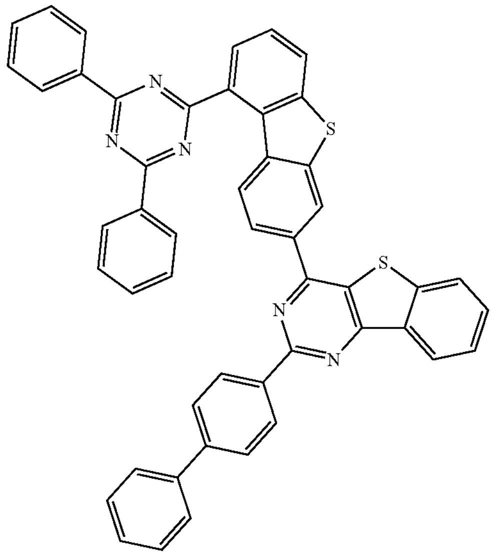
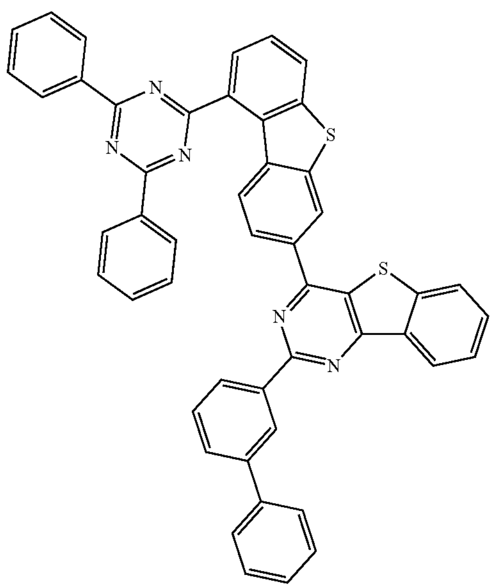
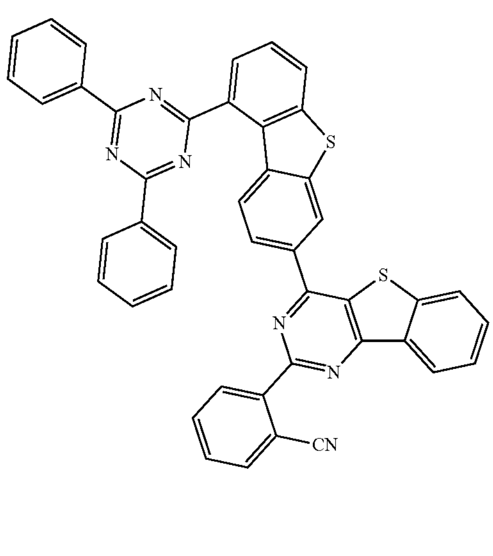
-continued
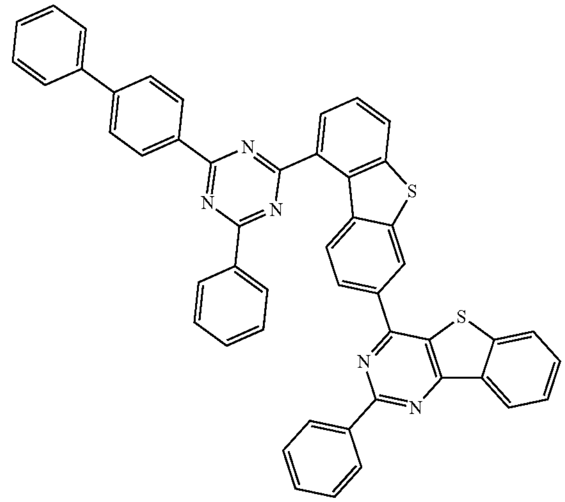
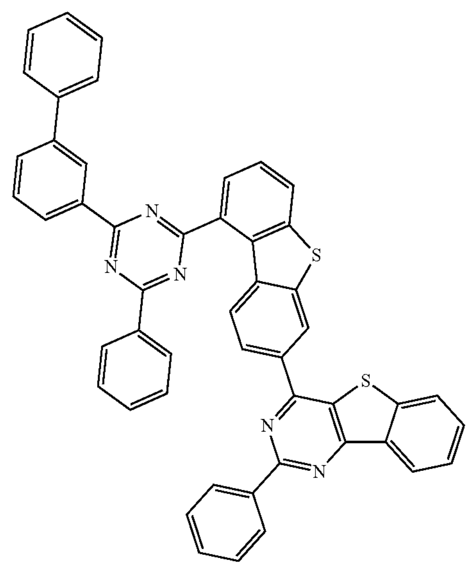
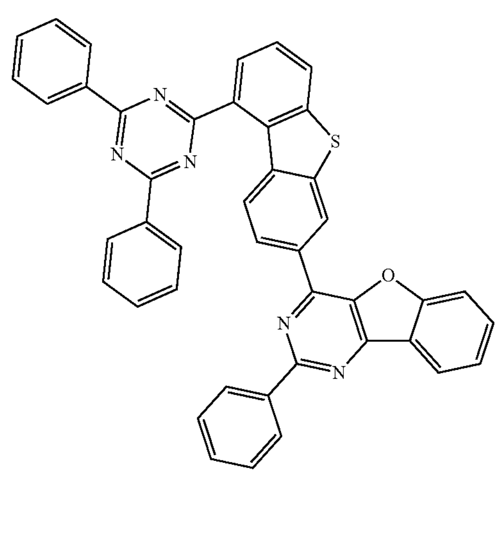

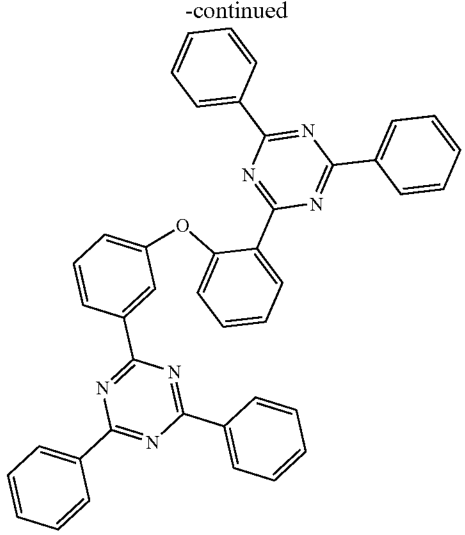
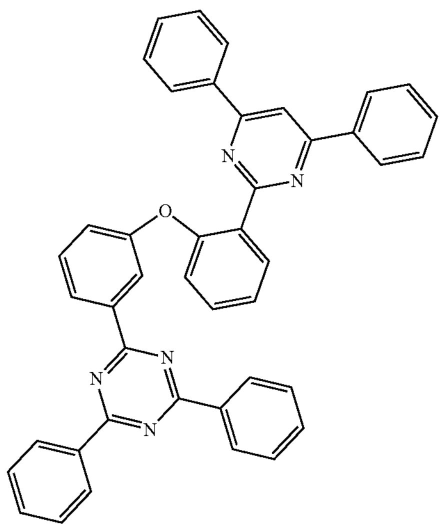
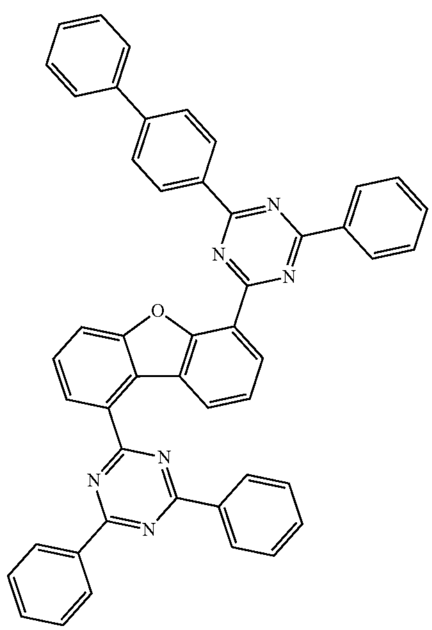
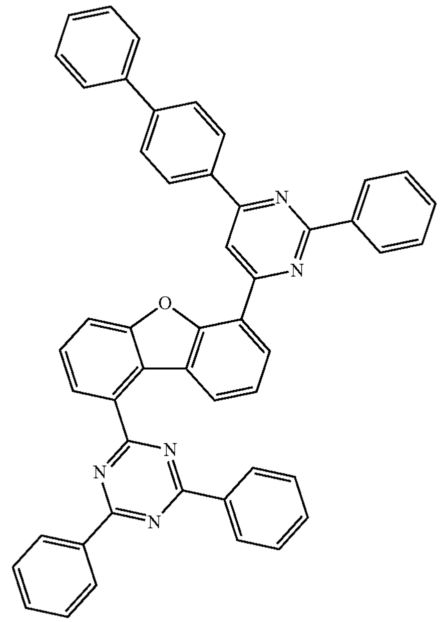
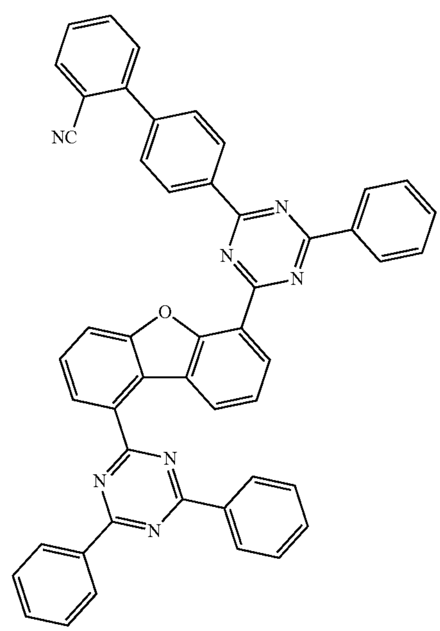
NC

-continued
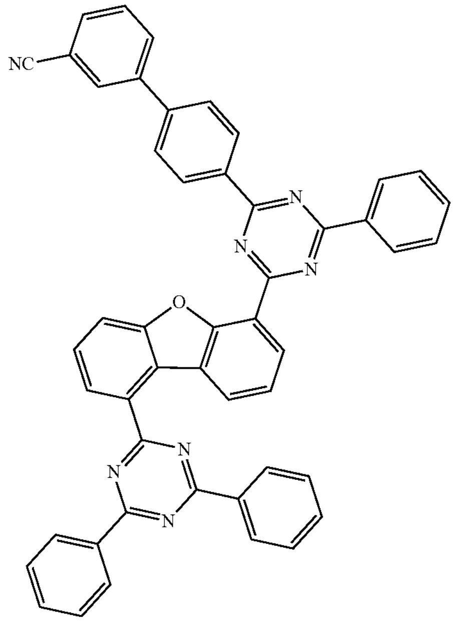
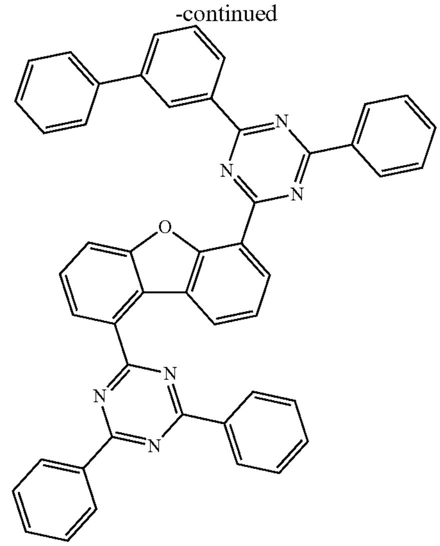
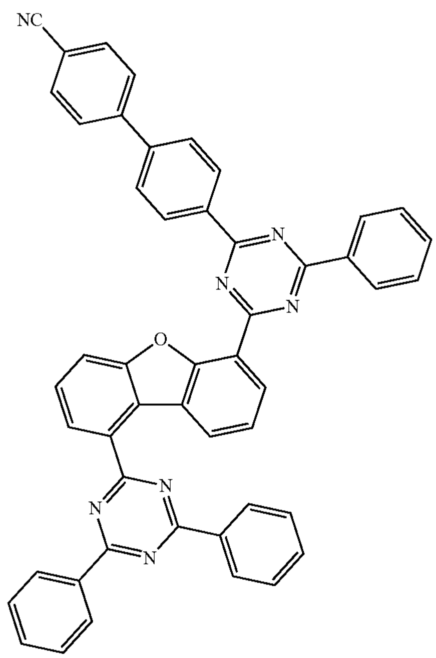
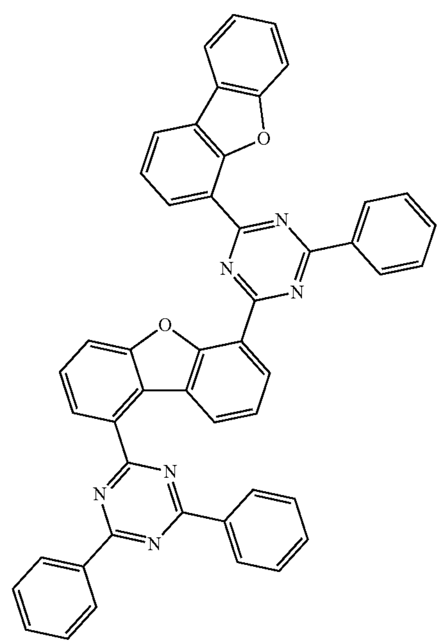
-continued

-continued
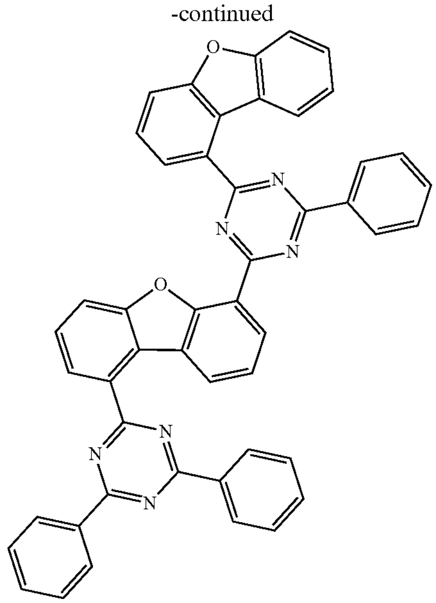
-continued
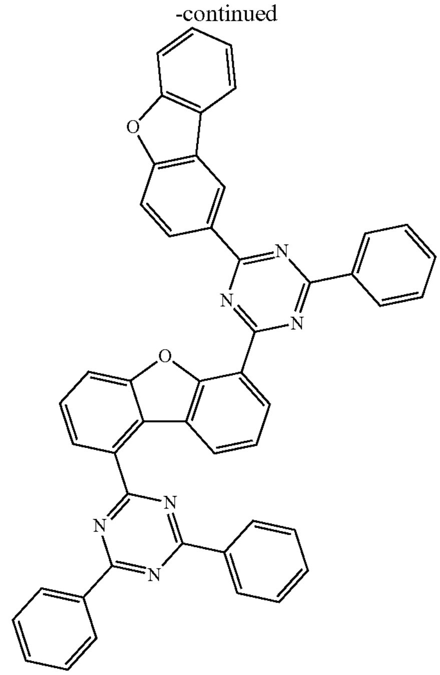
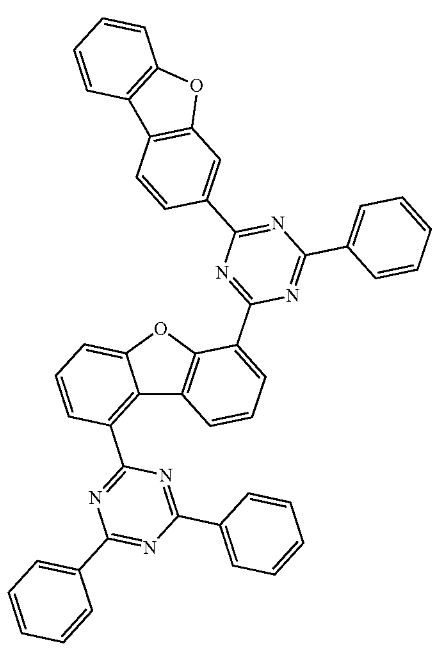
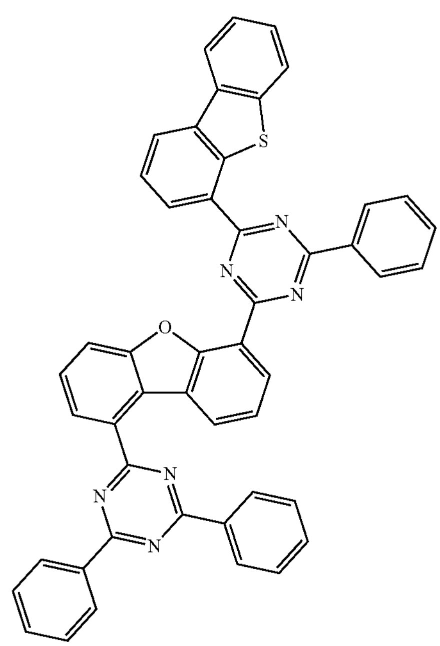

-continued
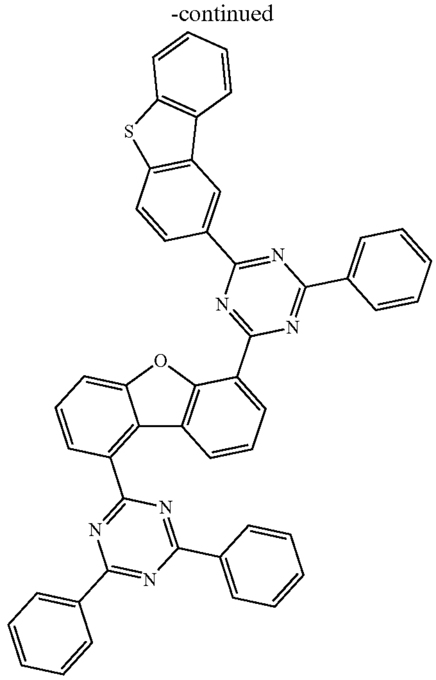
-continued
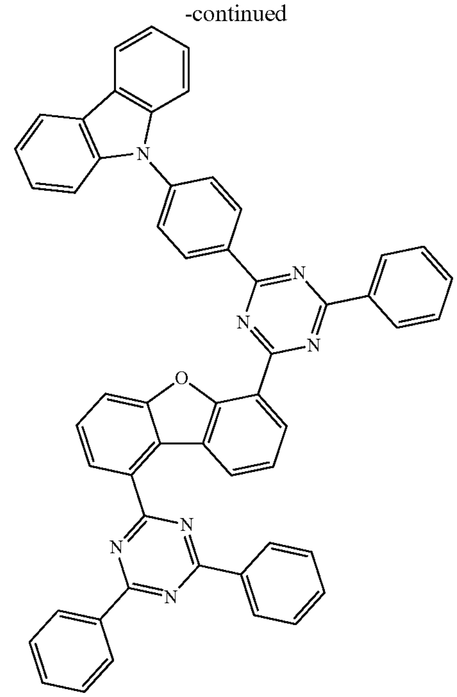
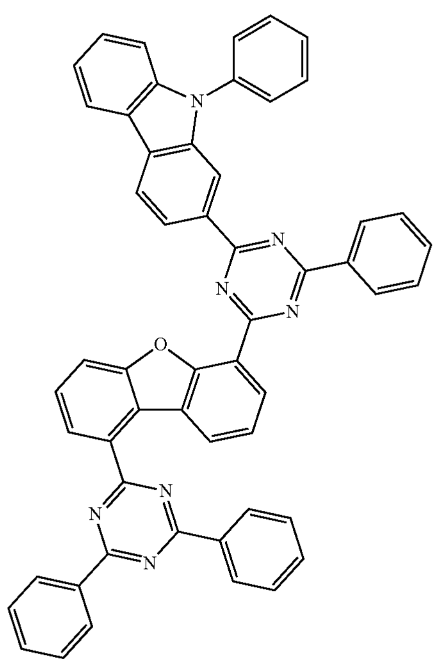
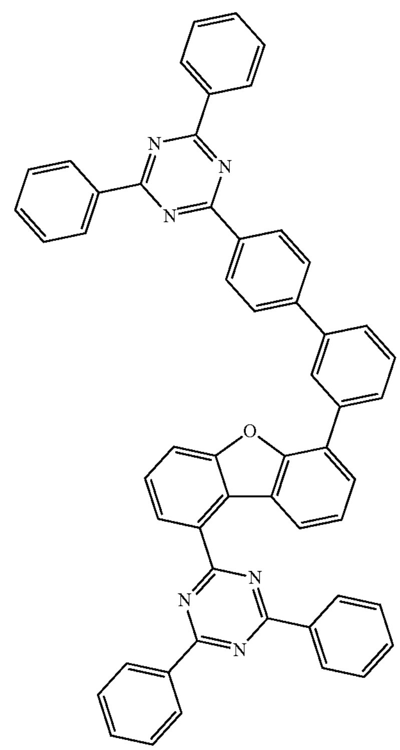

-continued
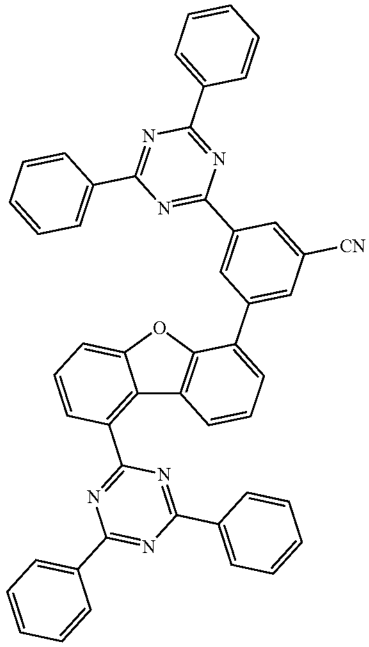
-continued
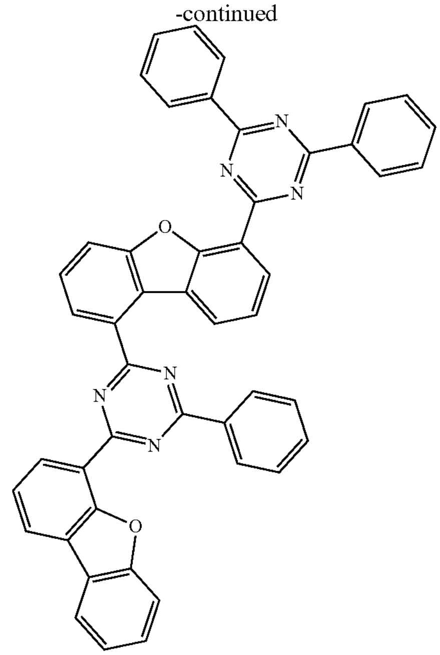
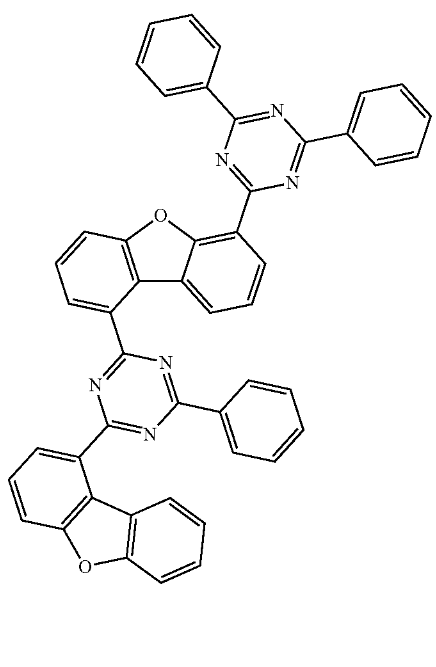
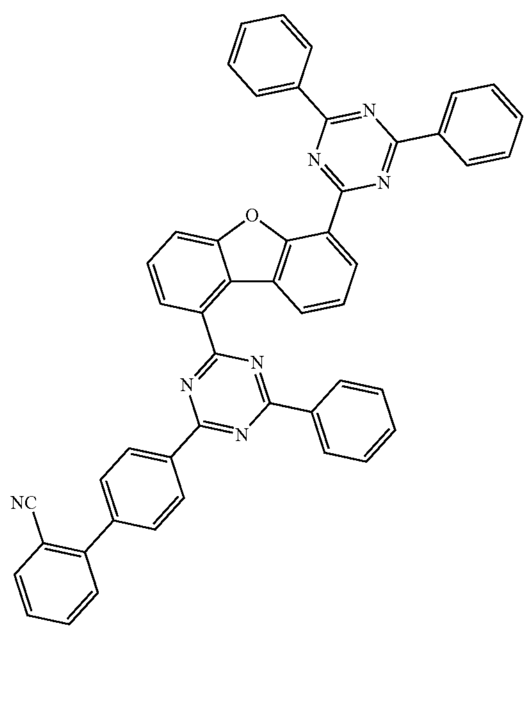

-continued
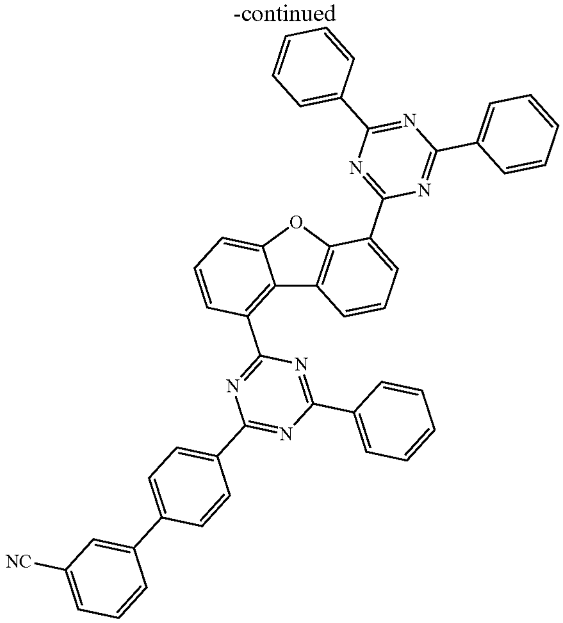
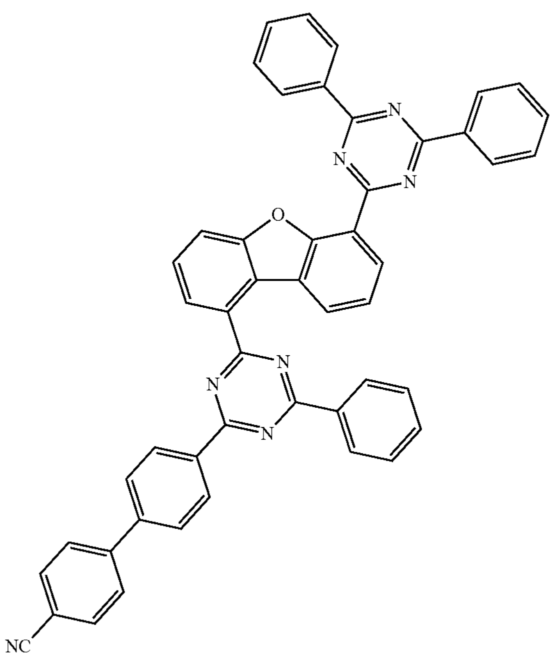
-continued
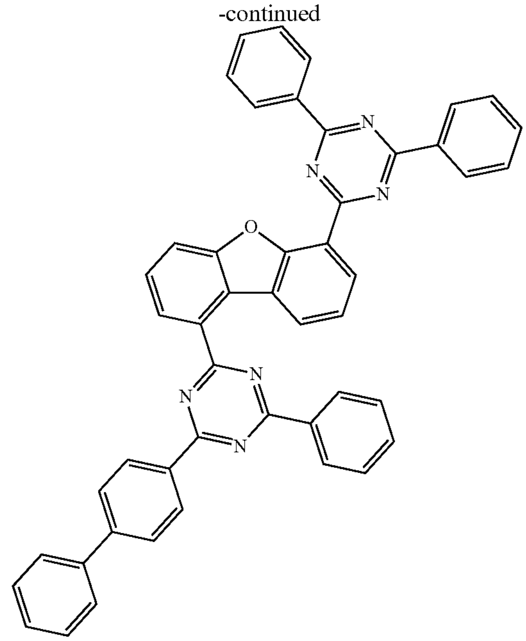
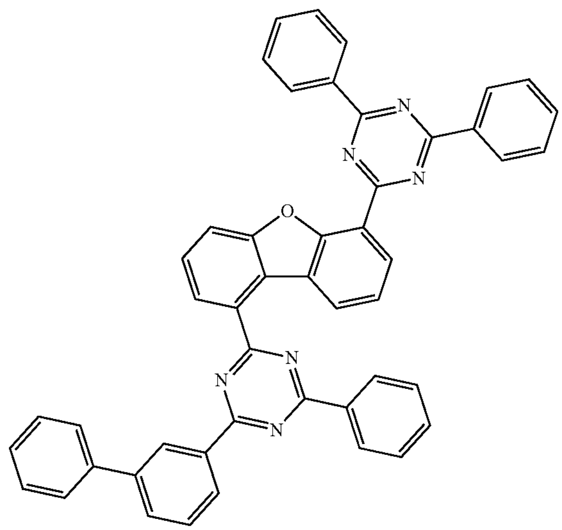
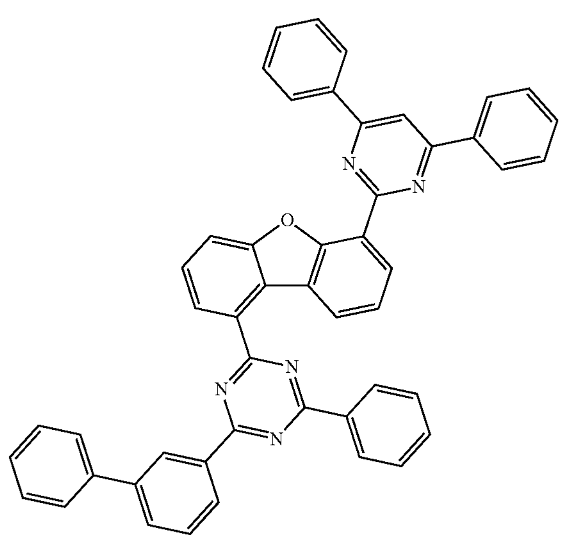

-continued
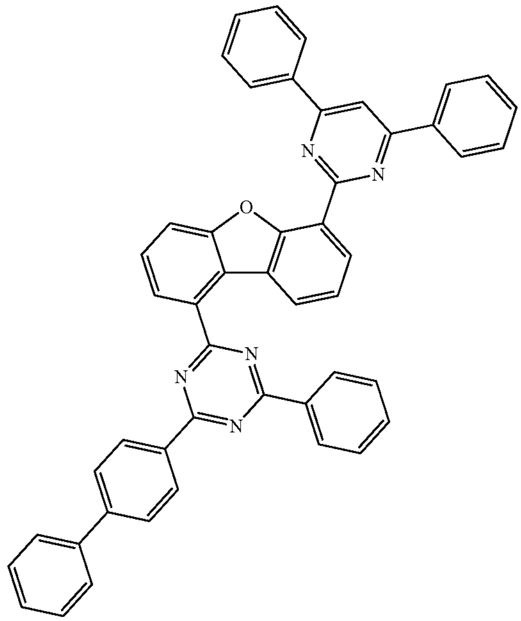
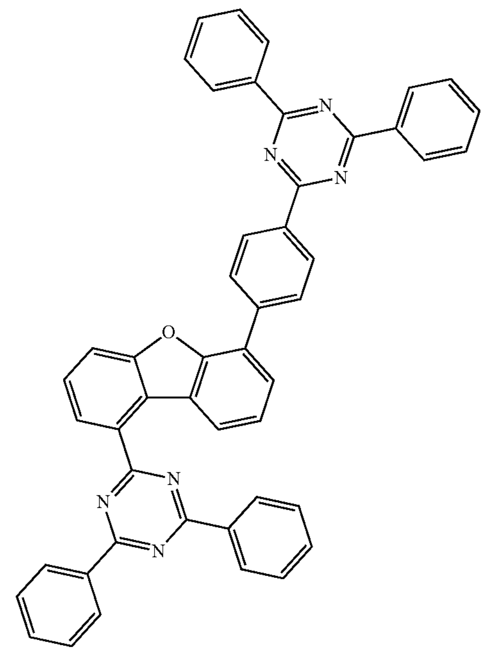
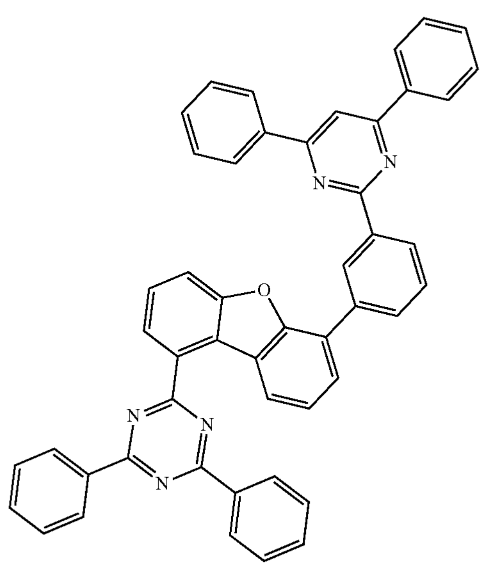
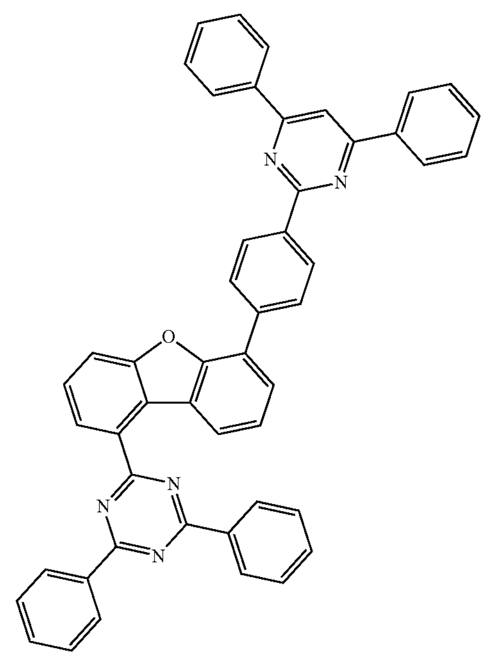

-continued
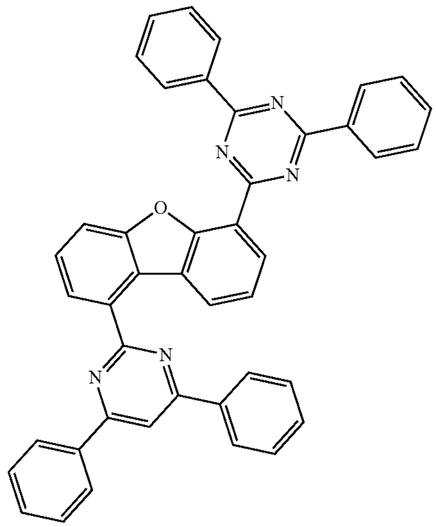
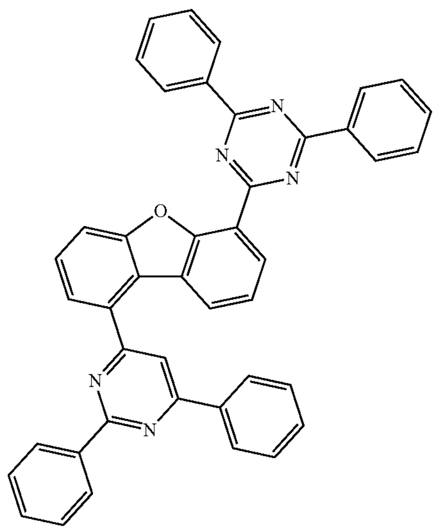
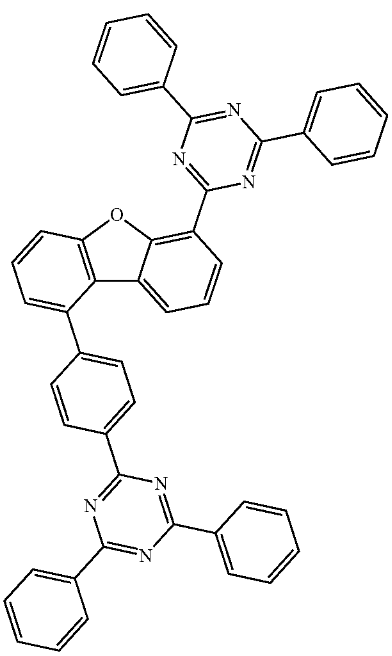
-continued
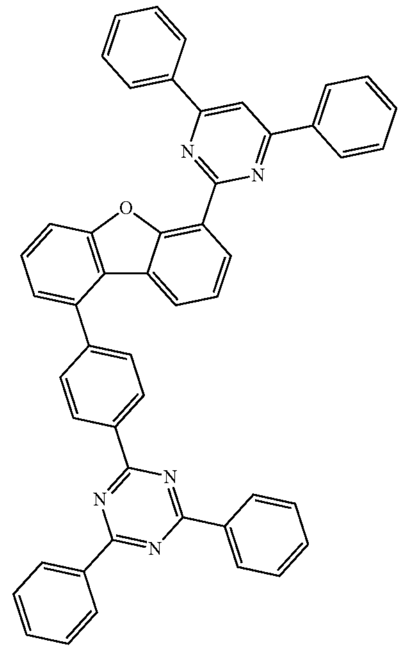
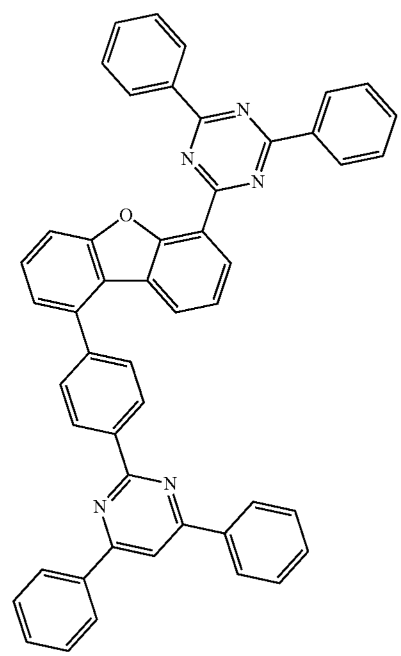

-continued
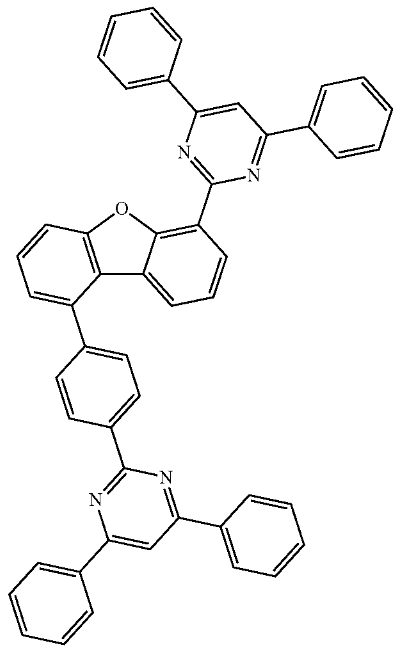
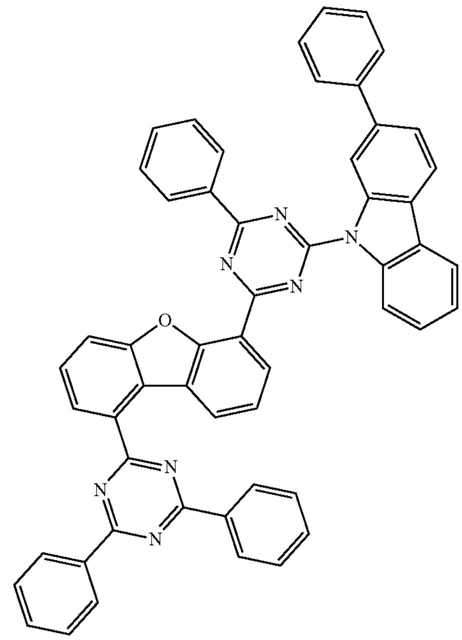
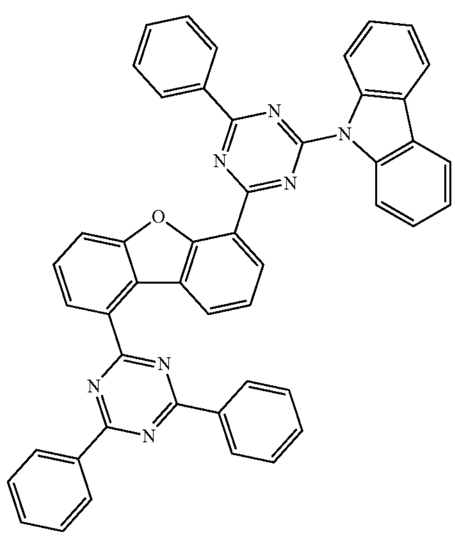
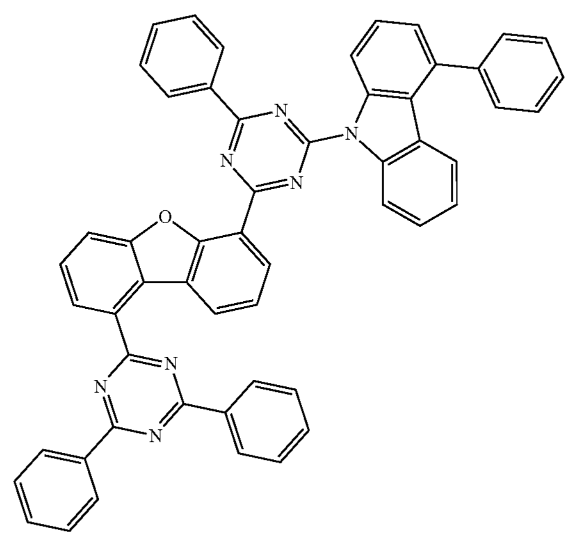

-continued
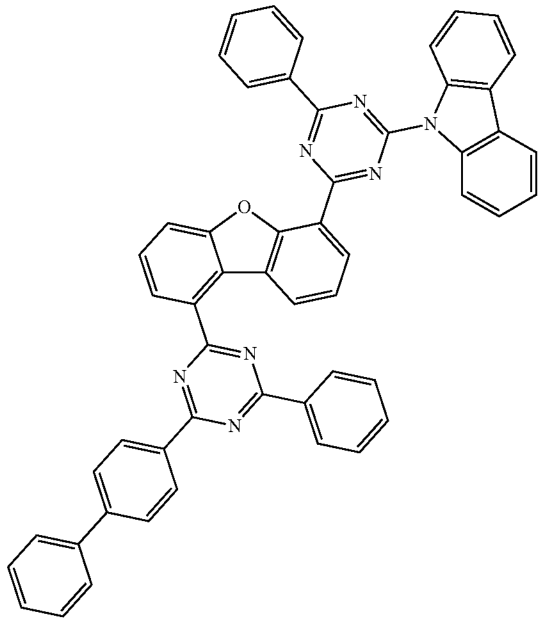
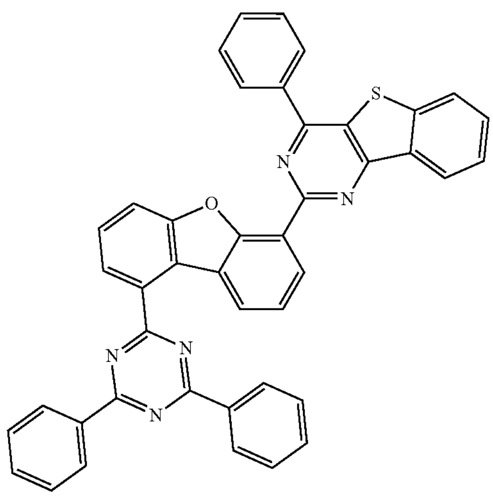
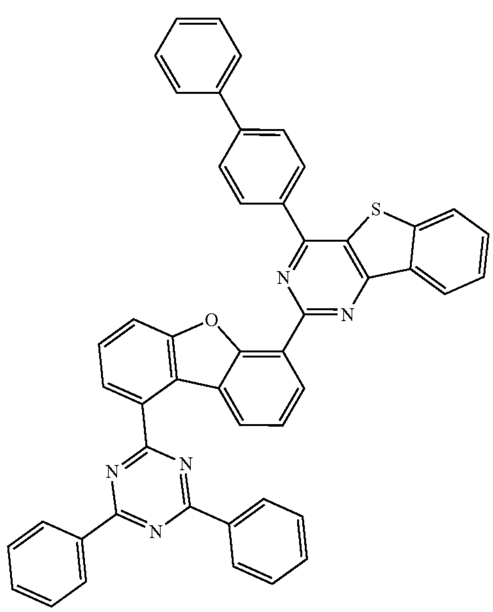
-continued
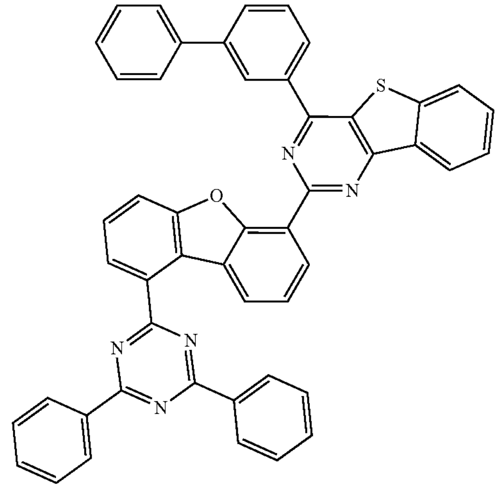
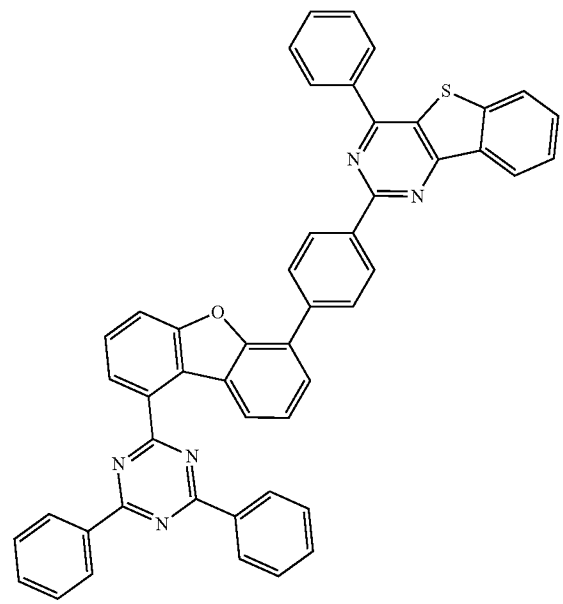
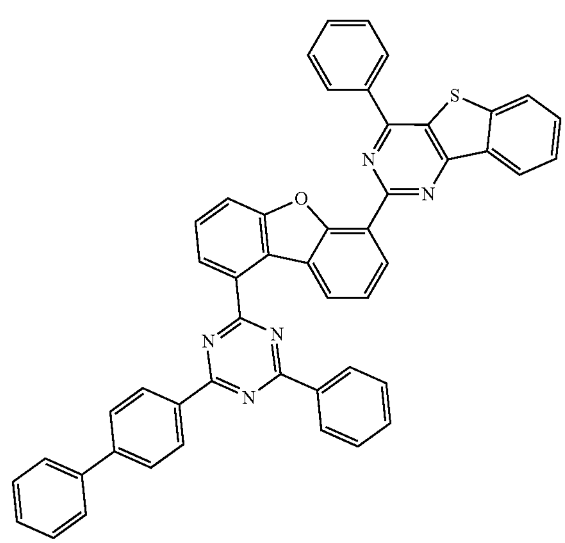

-continued
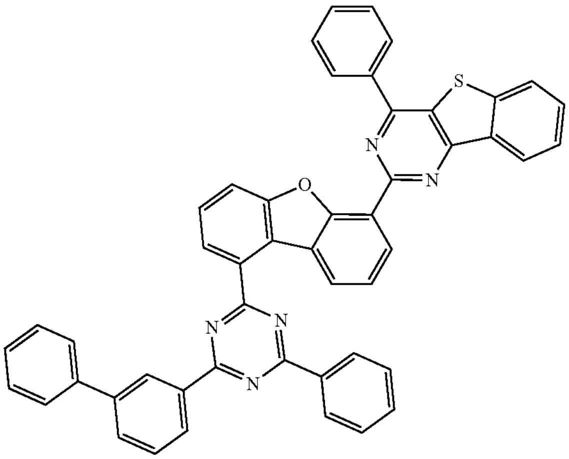
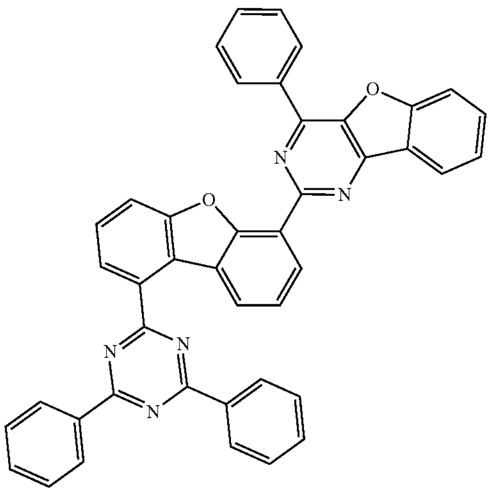
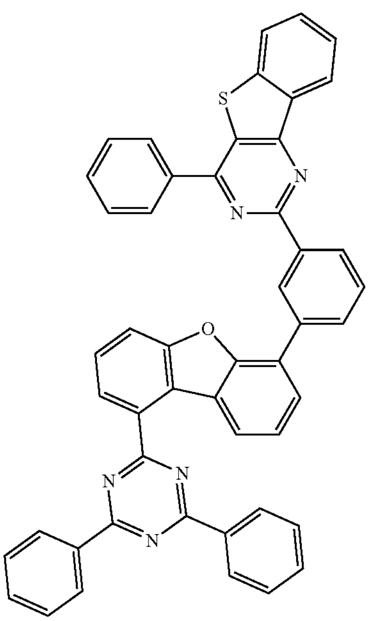
-continued
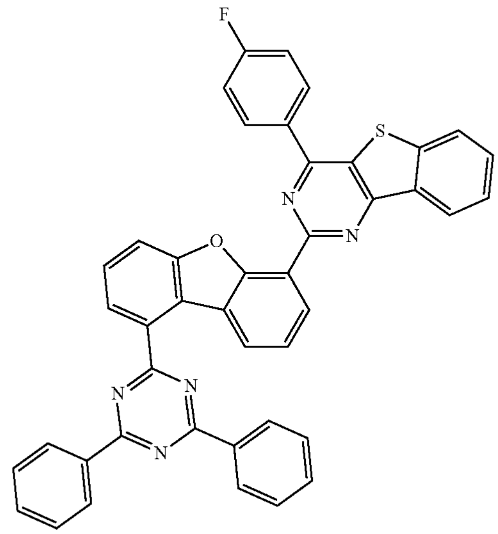
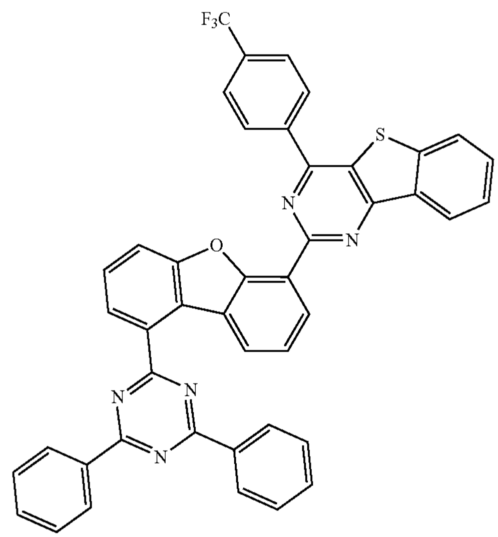
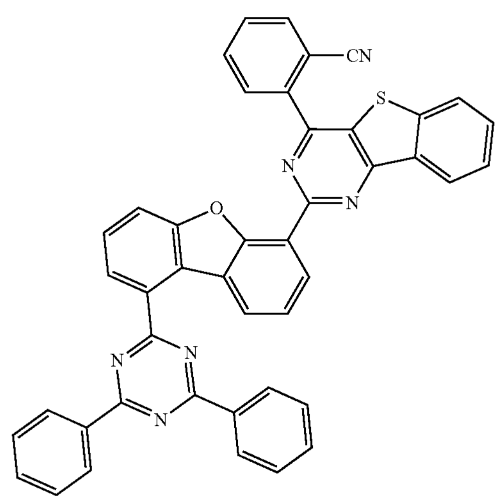

-continued
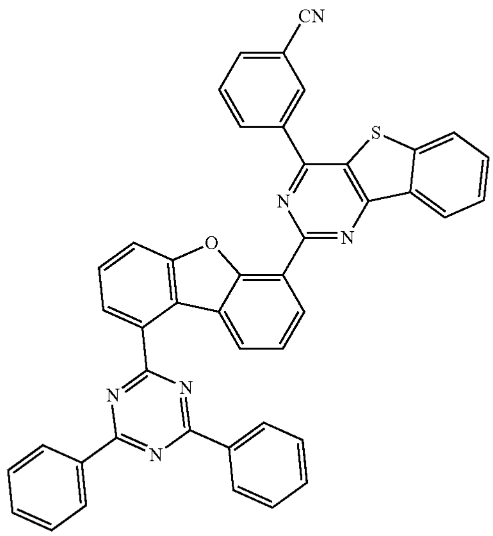
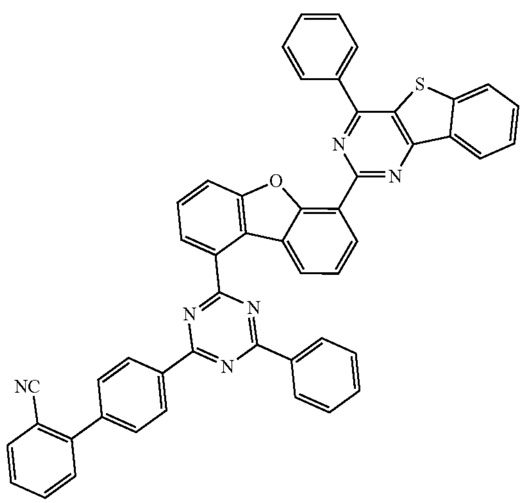
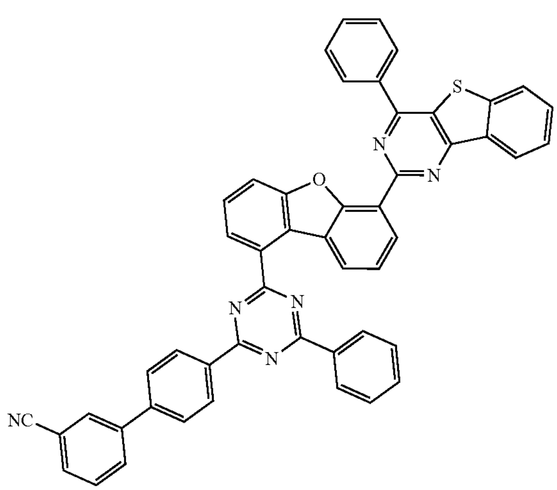
-continued
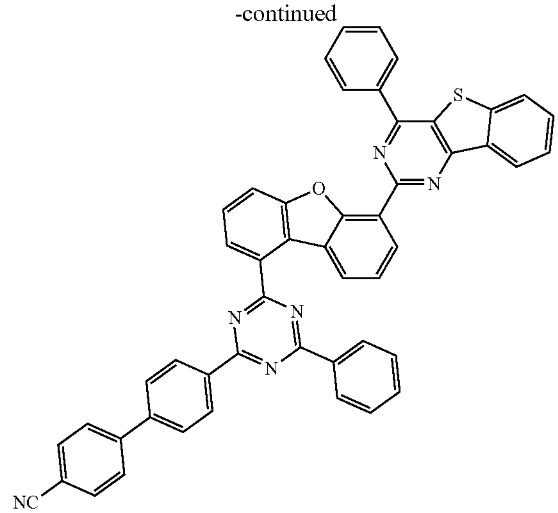
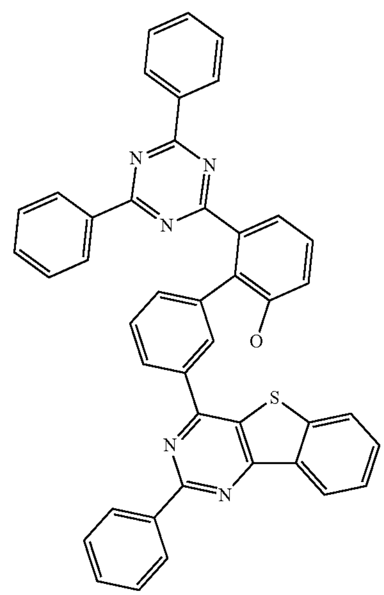
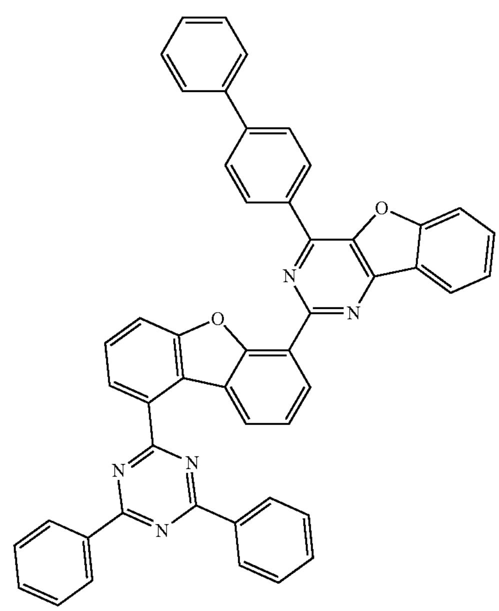

-continued
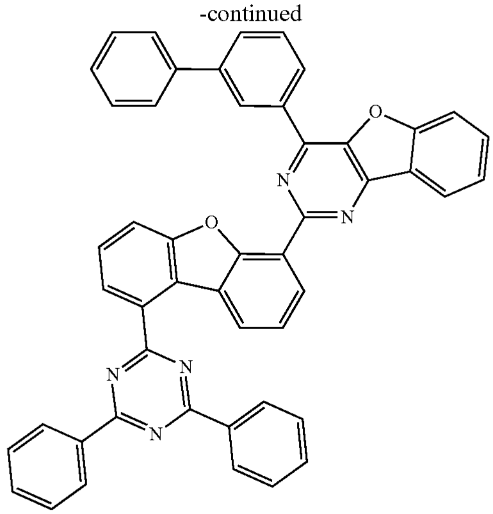
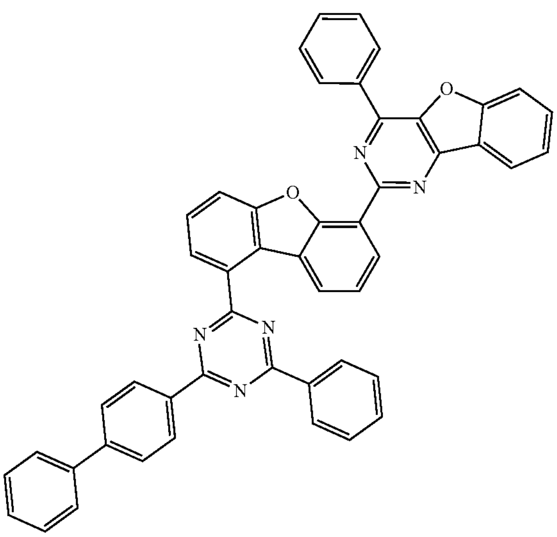
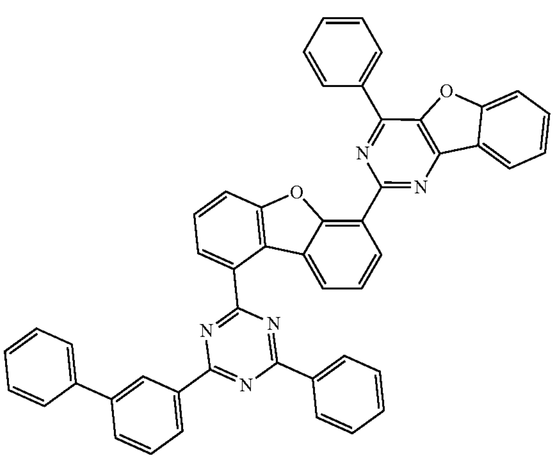
-continued
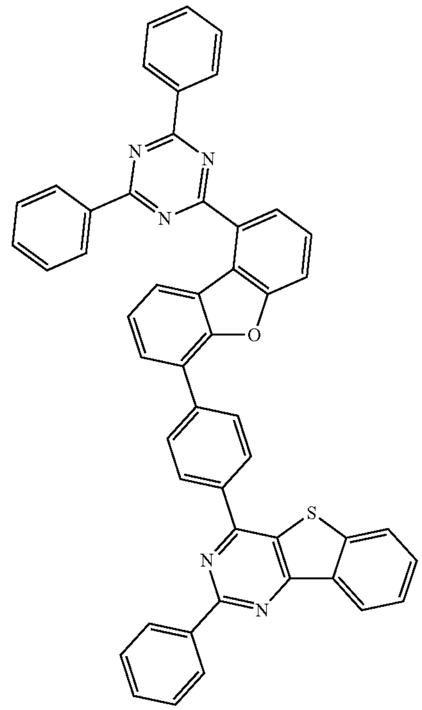
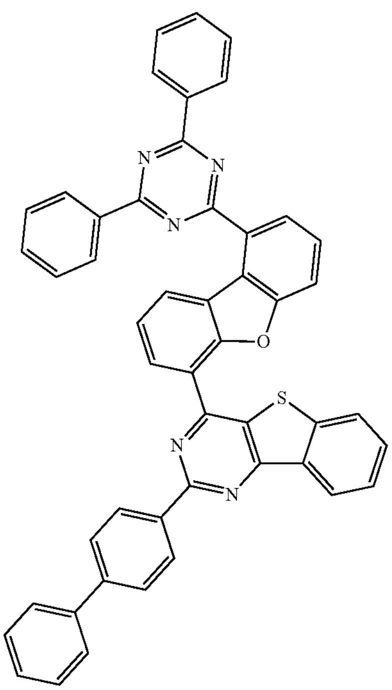

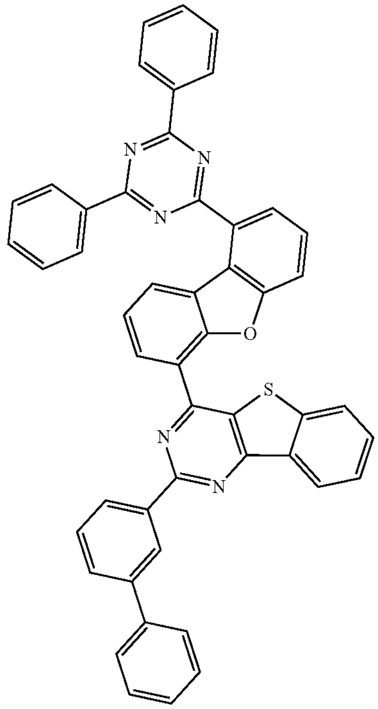
N
N
N
O
S
N
N
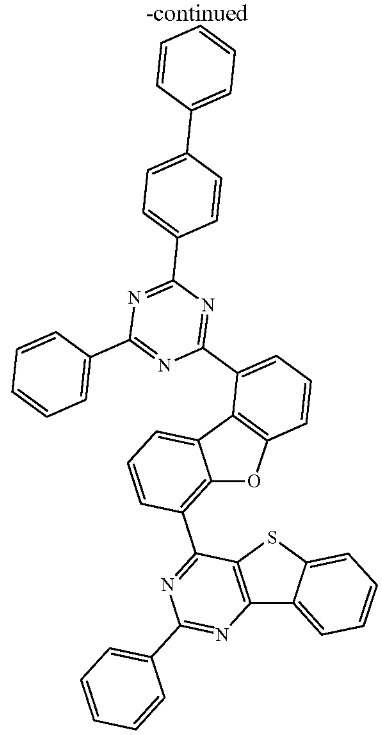
N
N
N
O
S
N
N
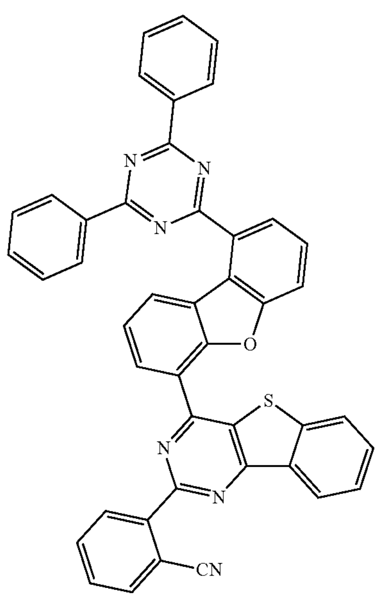
N
N
N
O
S
N
N
CN
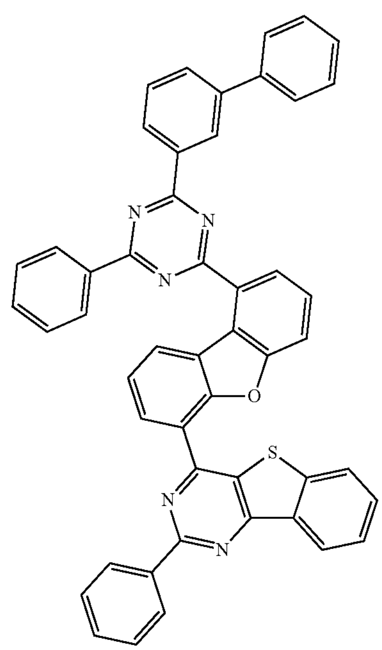
N
N
N
O
S
N
N -continued
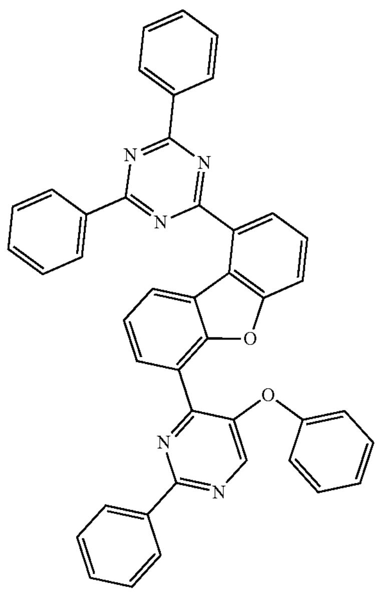
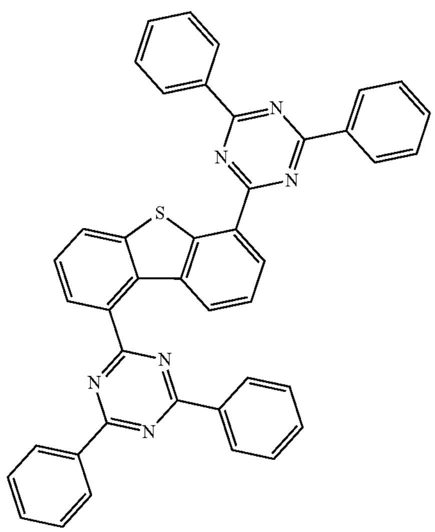
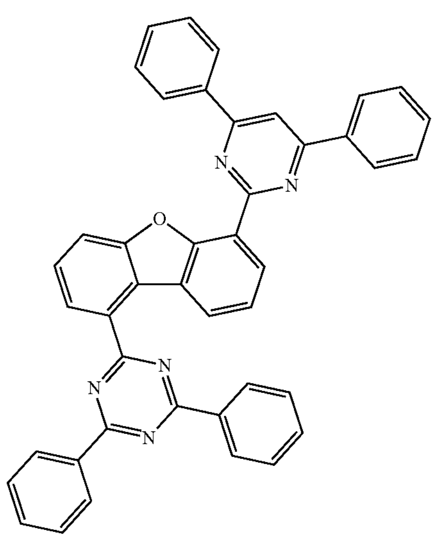
-continued
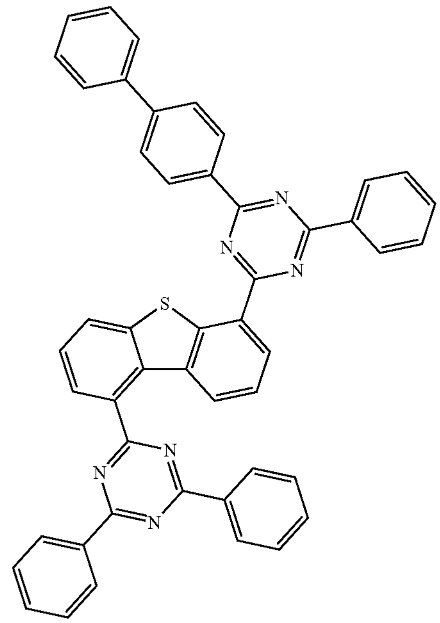
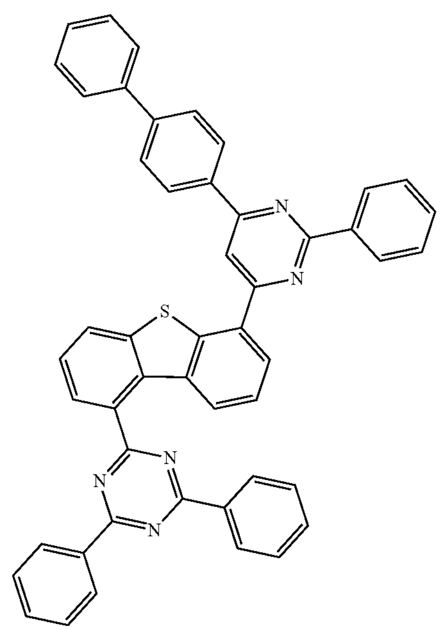

-continued
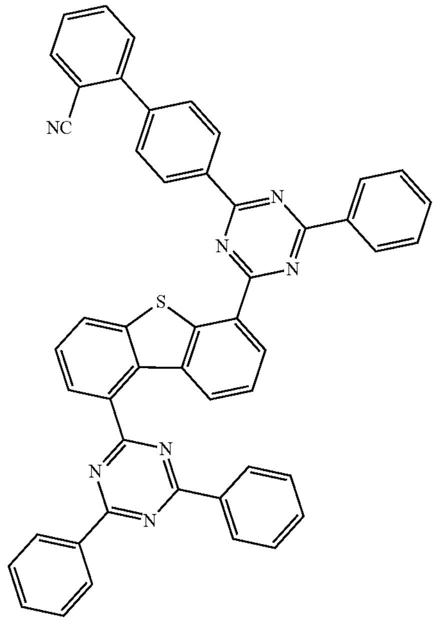
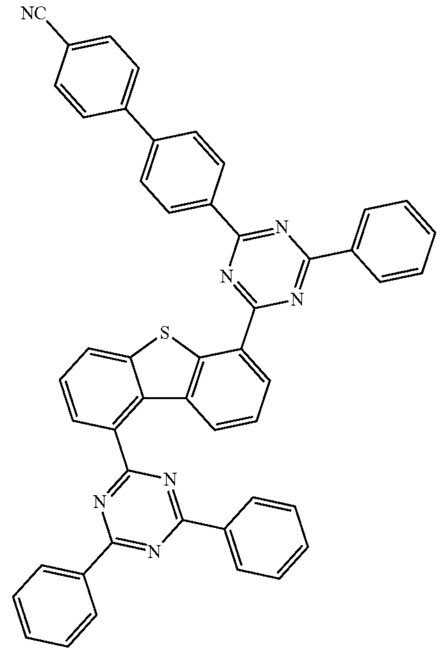
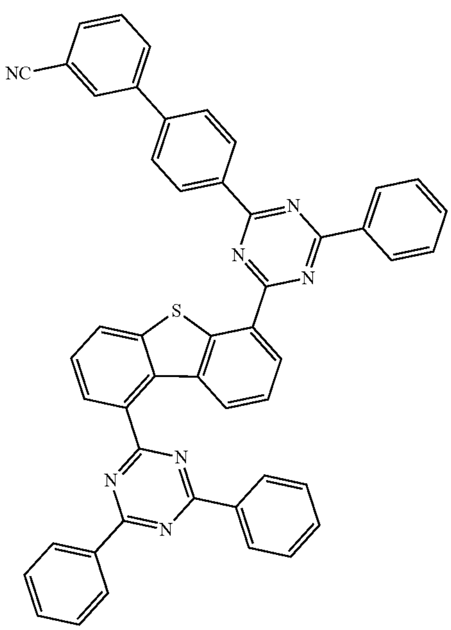
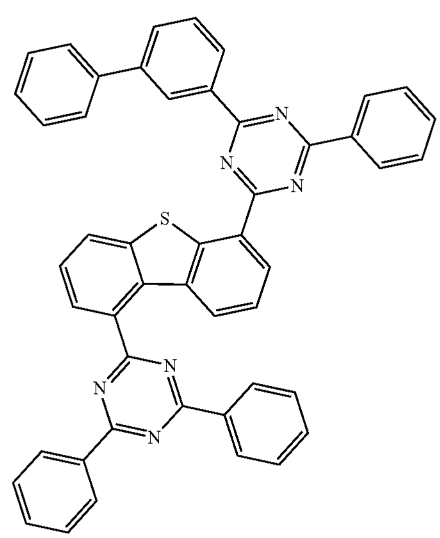
-continued

-continued
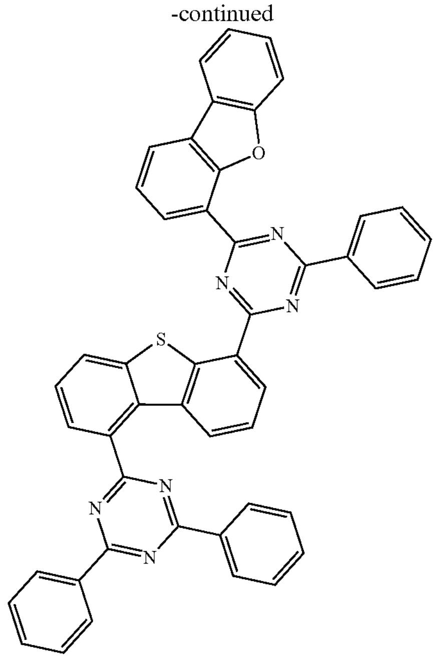
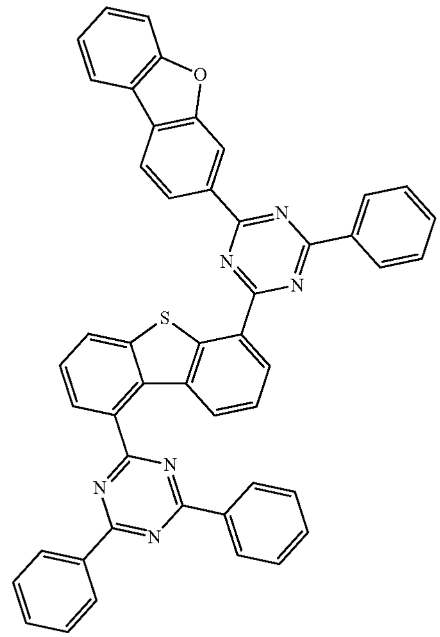
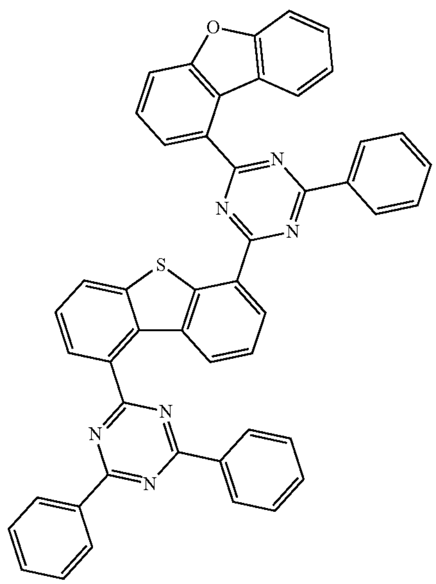
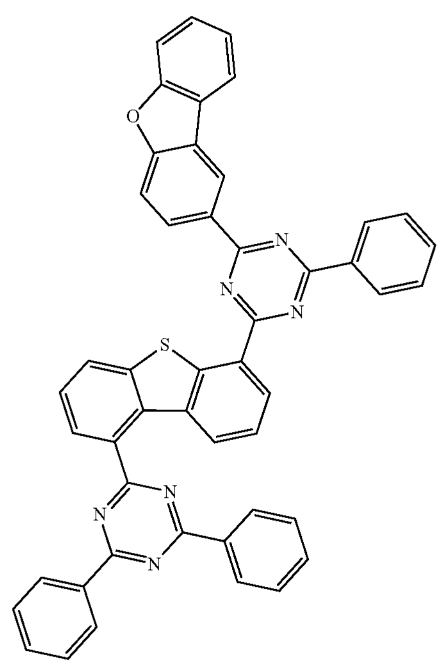

-continued
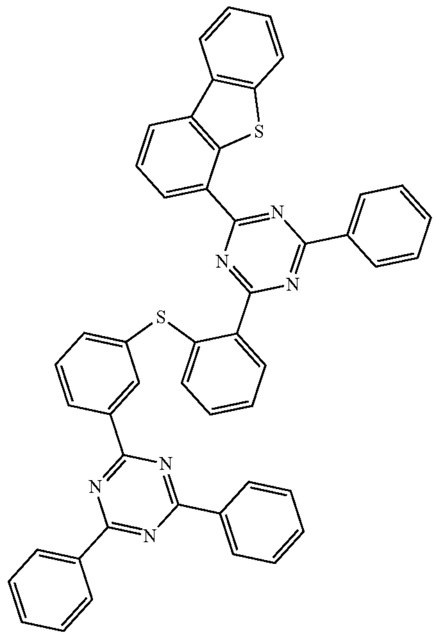
-continued
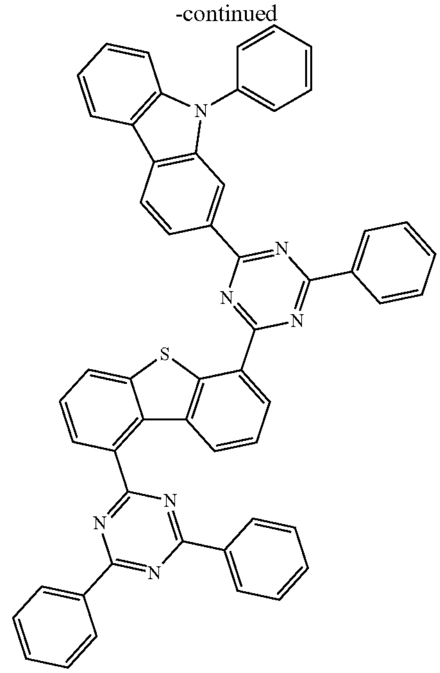
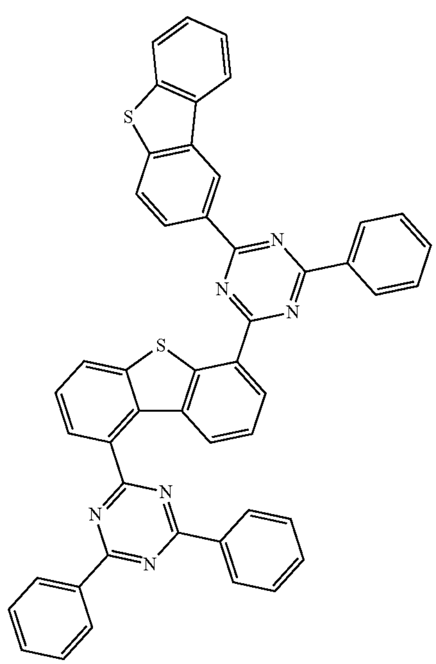
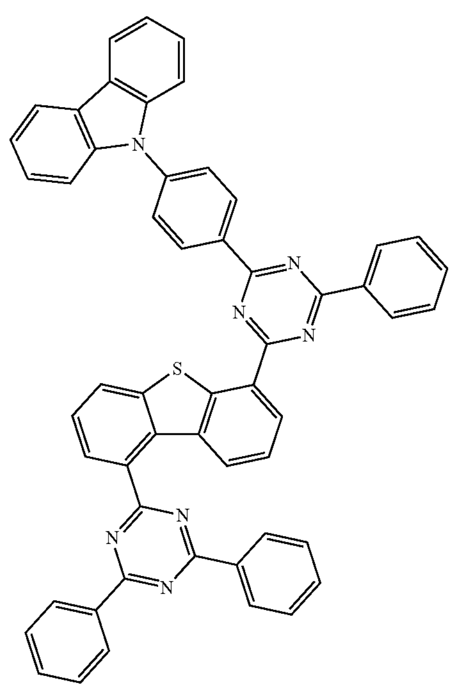

-continued
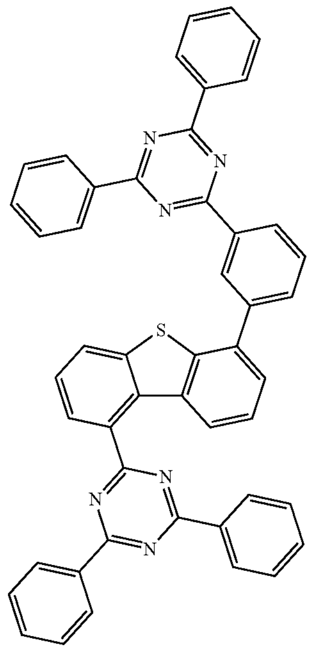
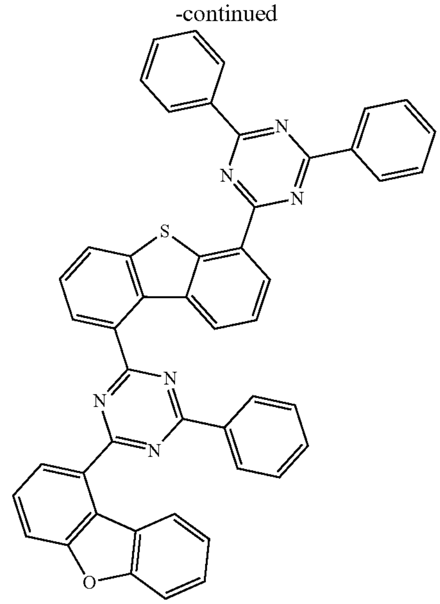
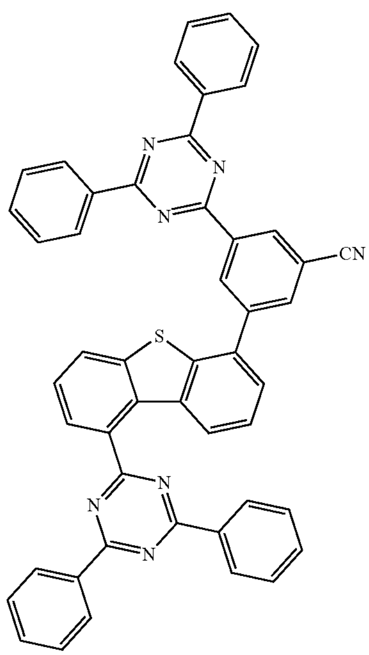
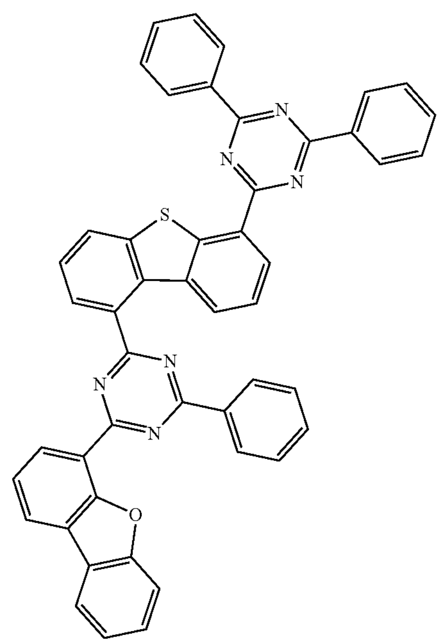

-continued
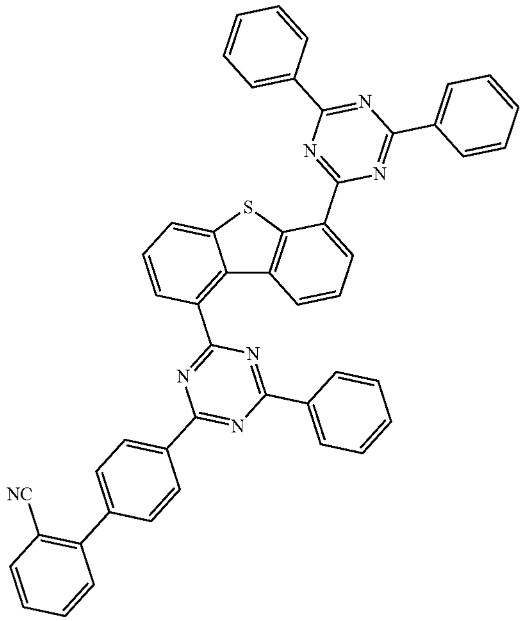
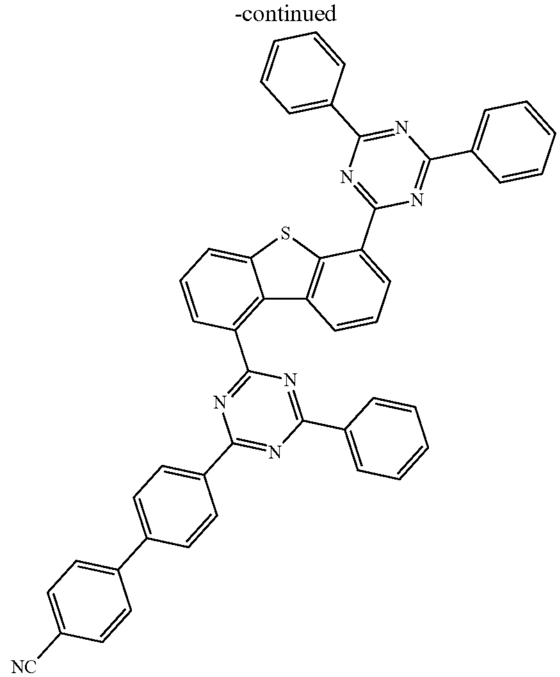
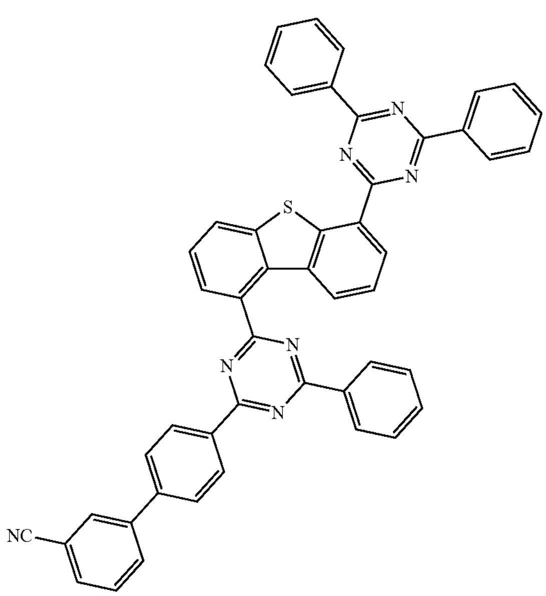
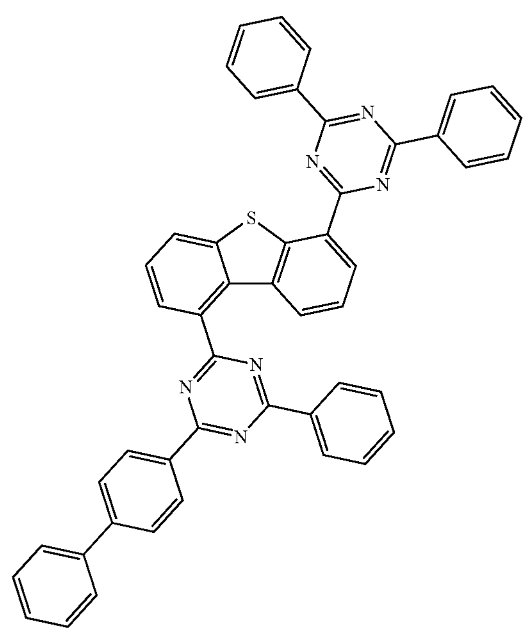

-continued
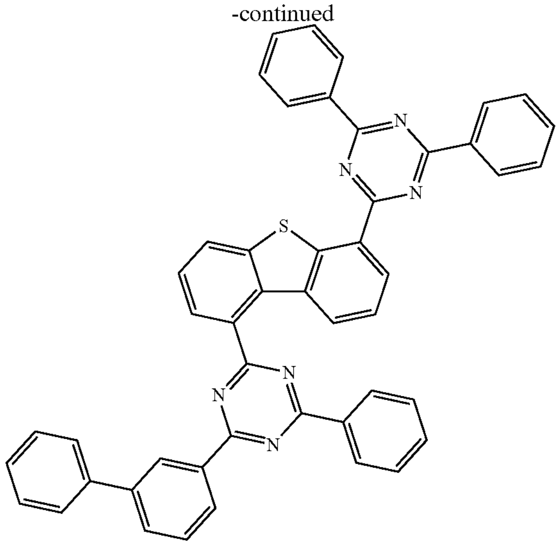
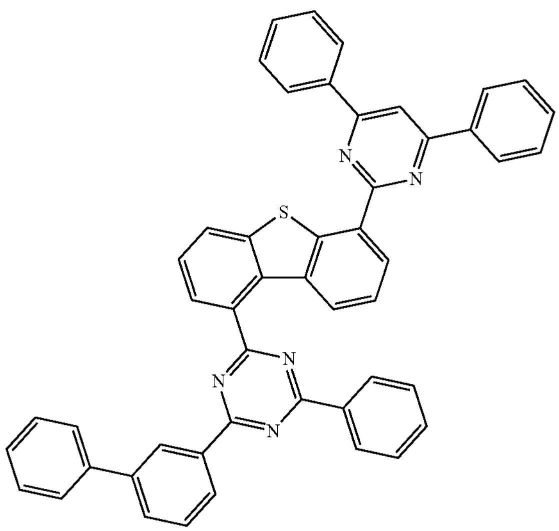
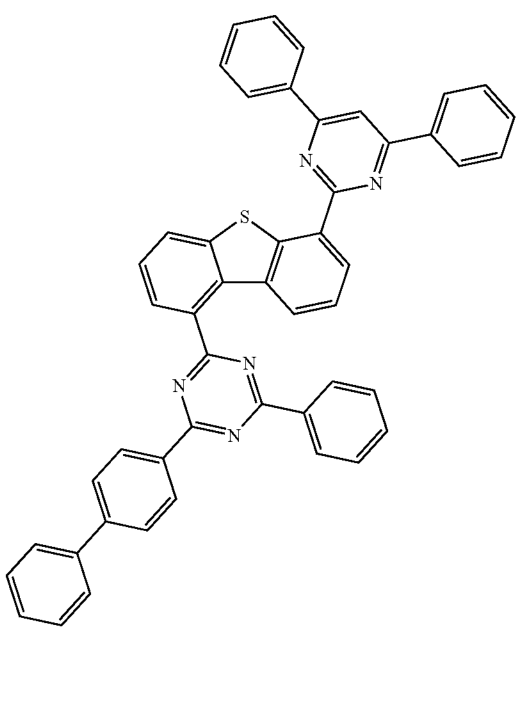
-continued
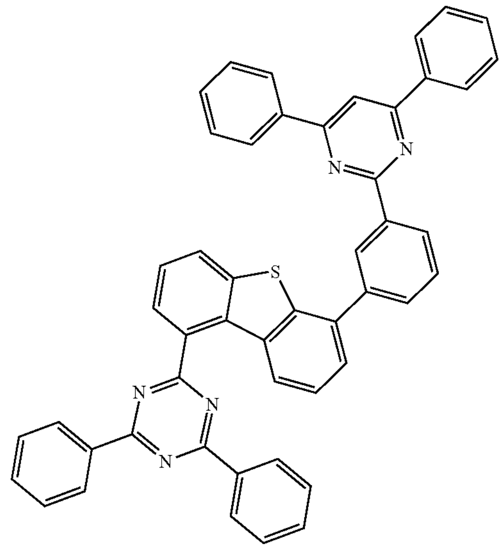
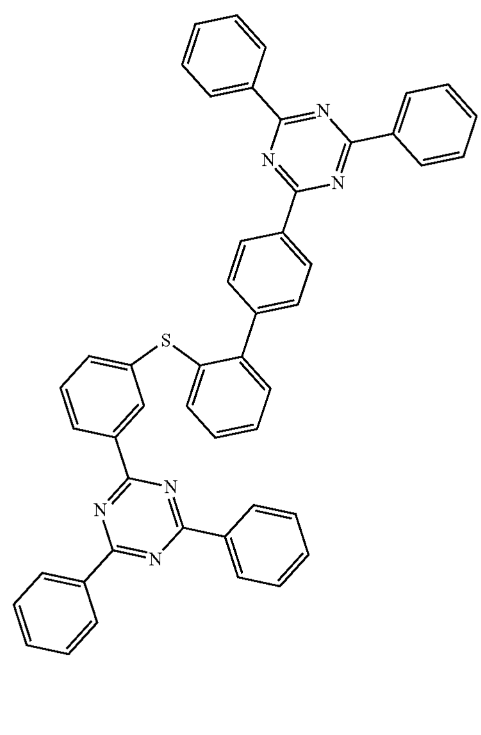

-continued
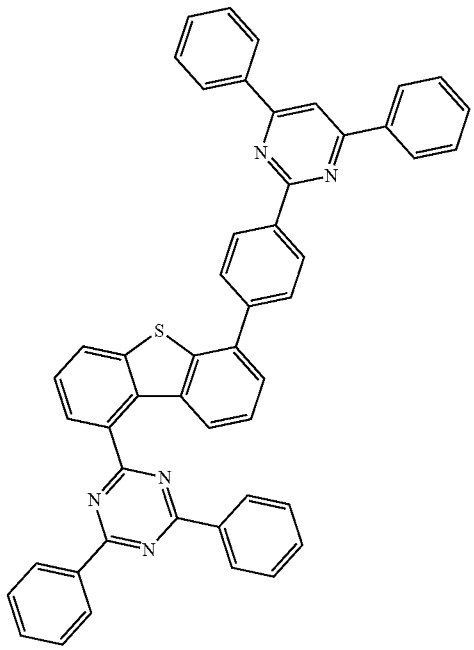
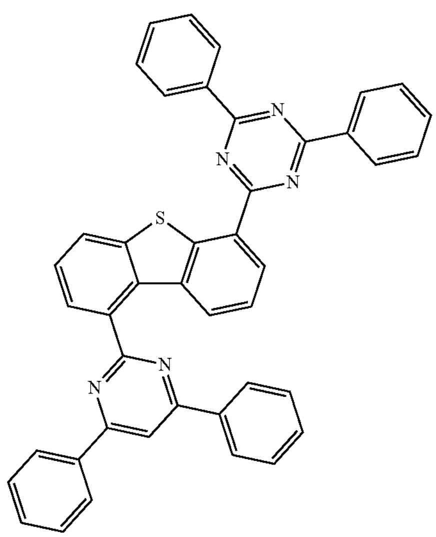
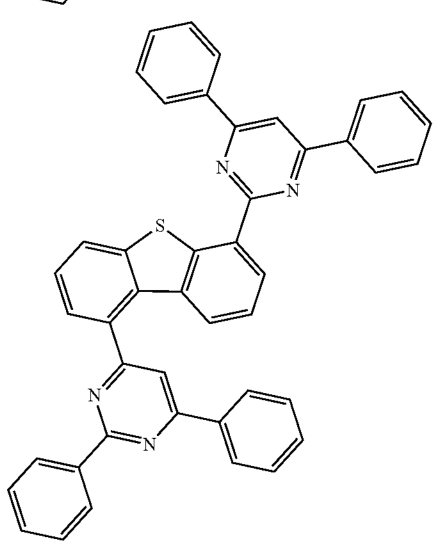
-continued
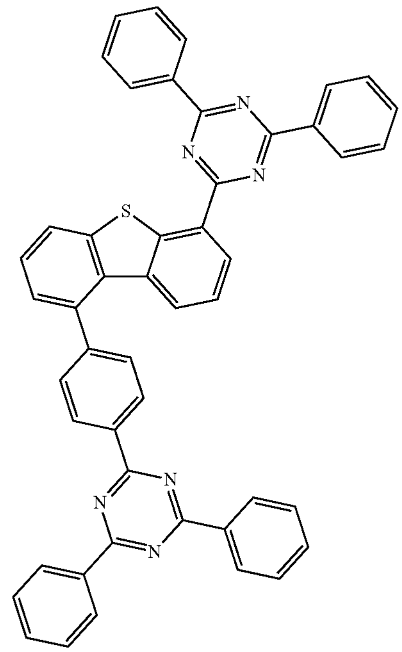
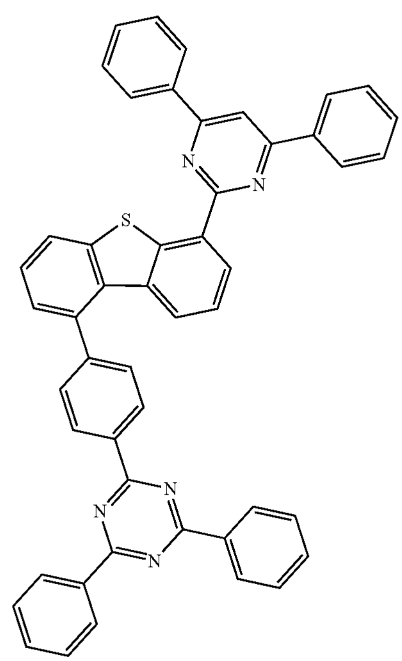

-continued
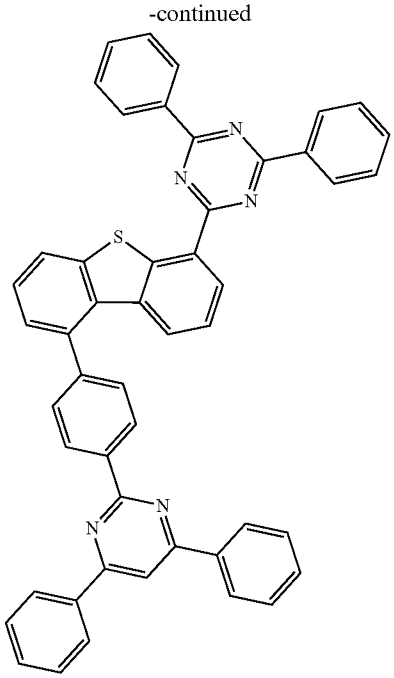
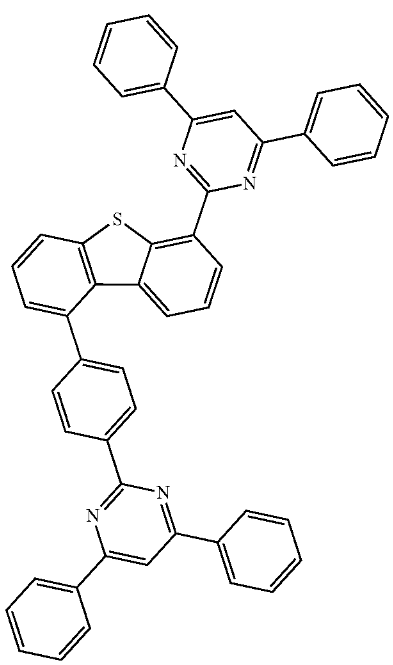
-continued
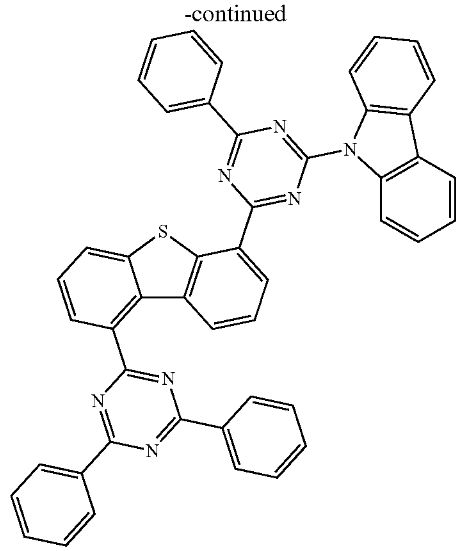
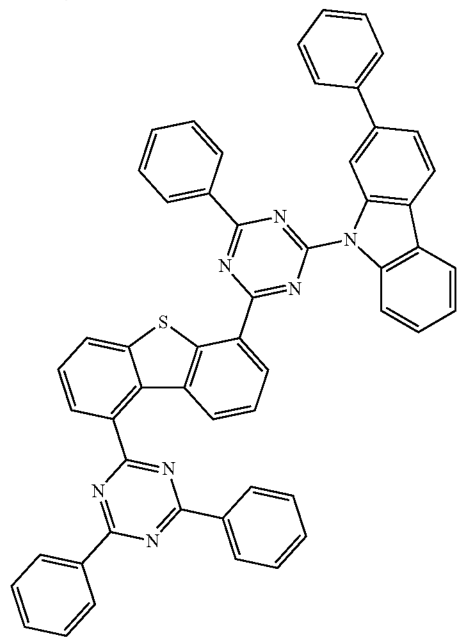
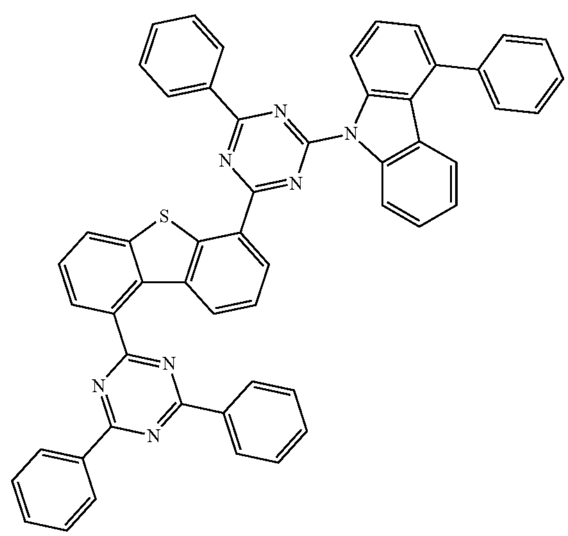

-continued
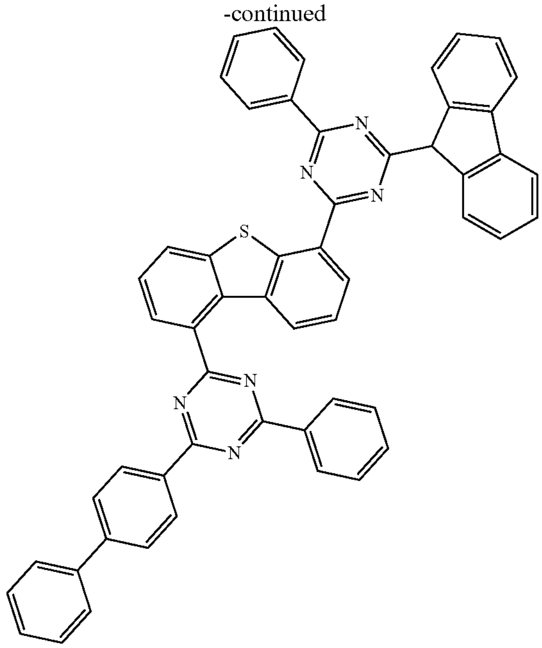
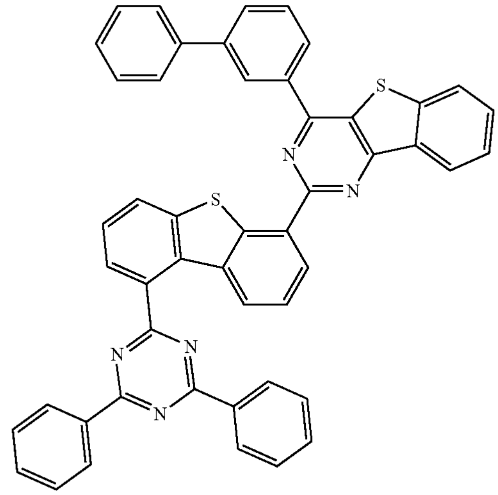
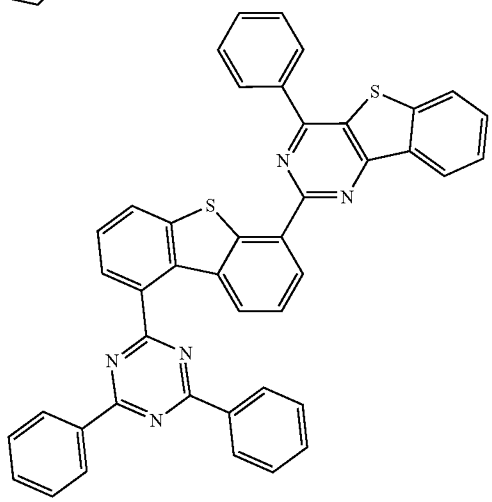
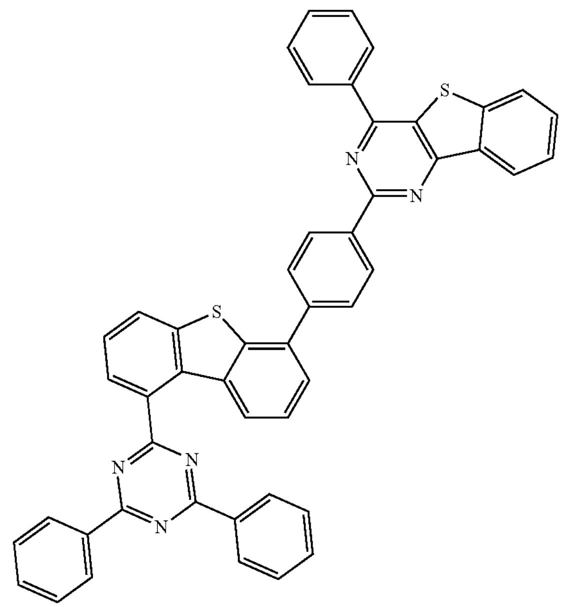
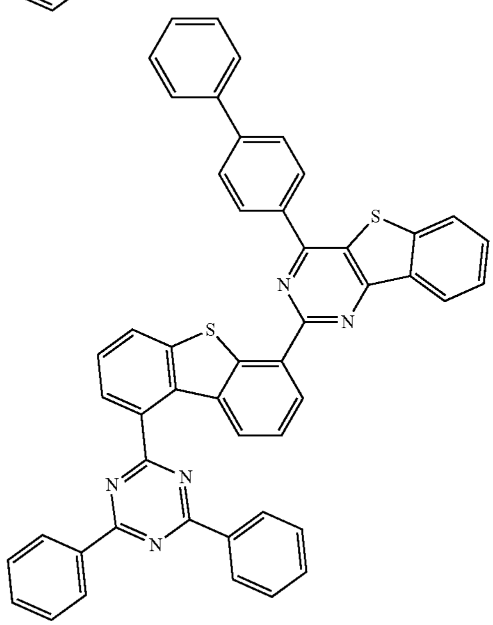
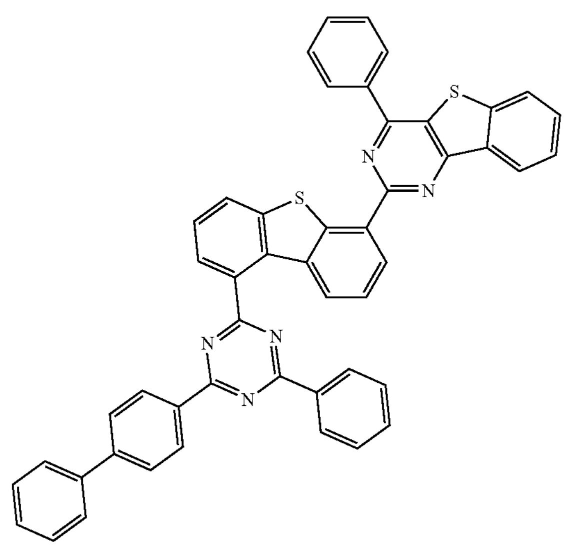
-continued -continued
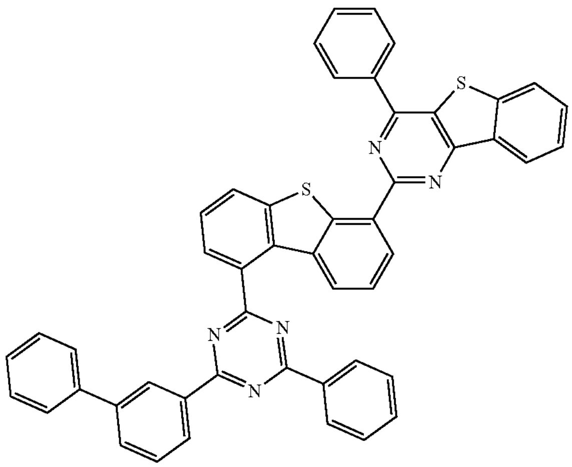
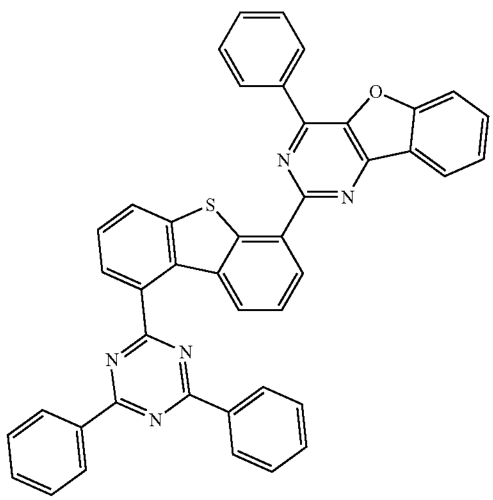
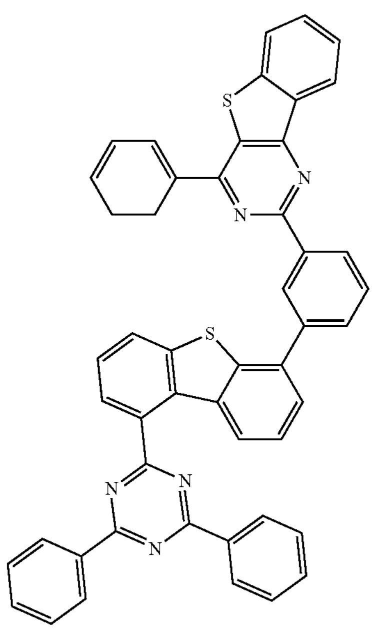
-continued
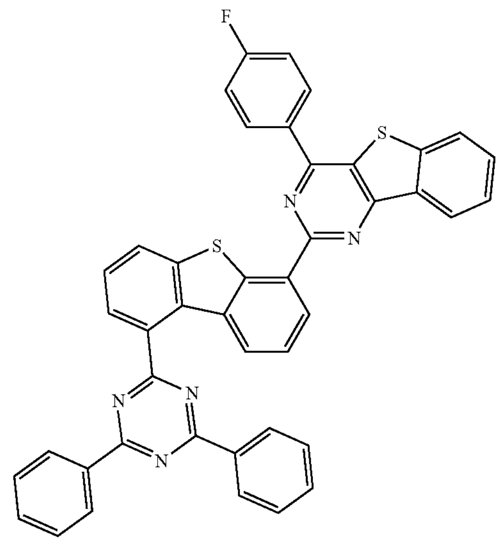
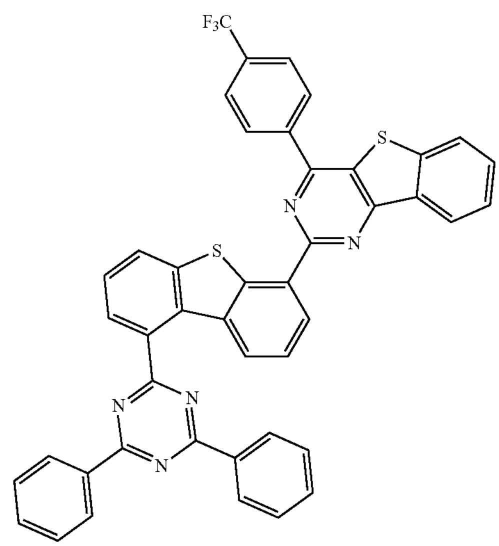
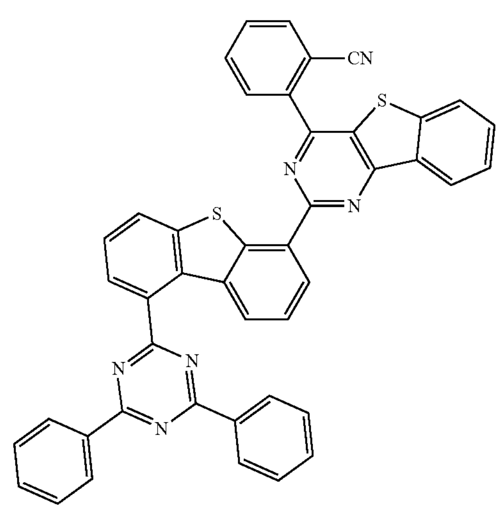

-continued
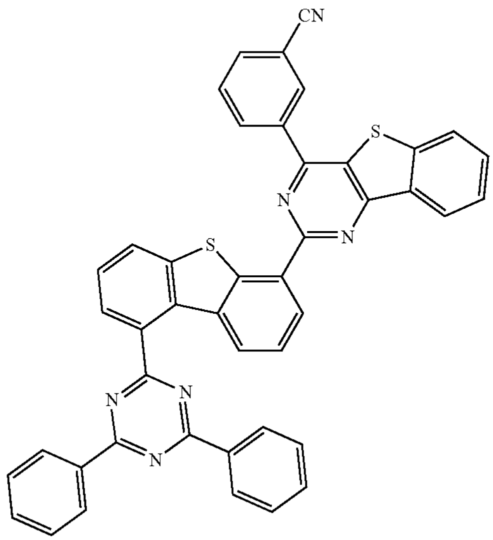
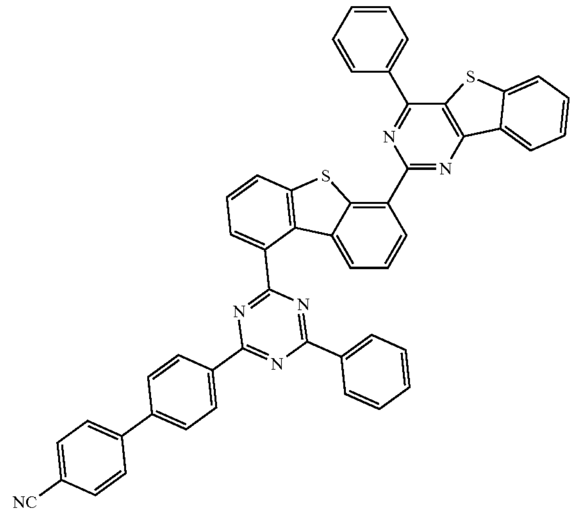
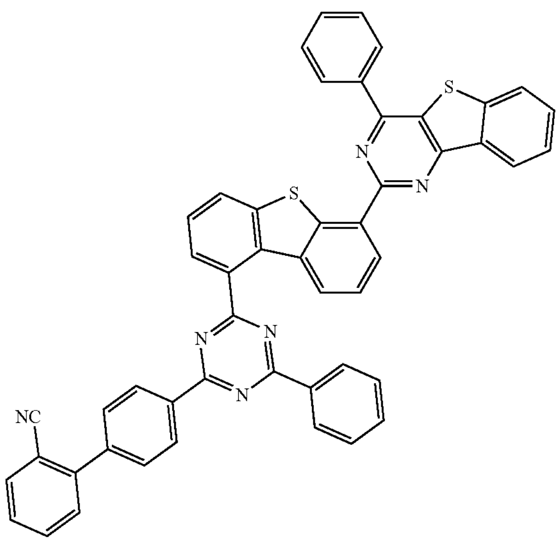
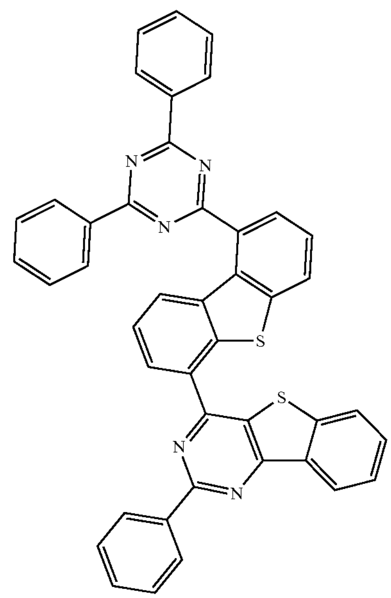
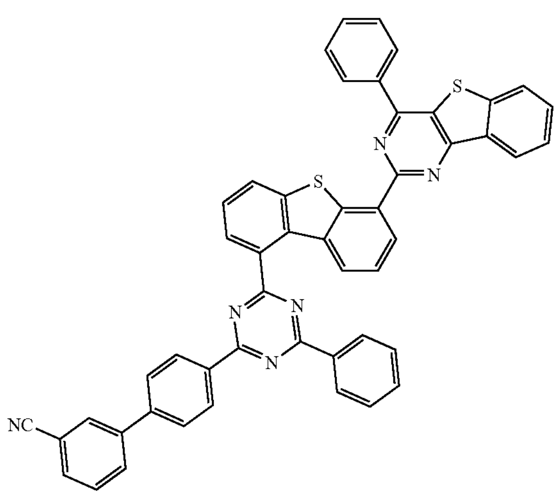
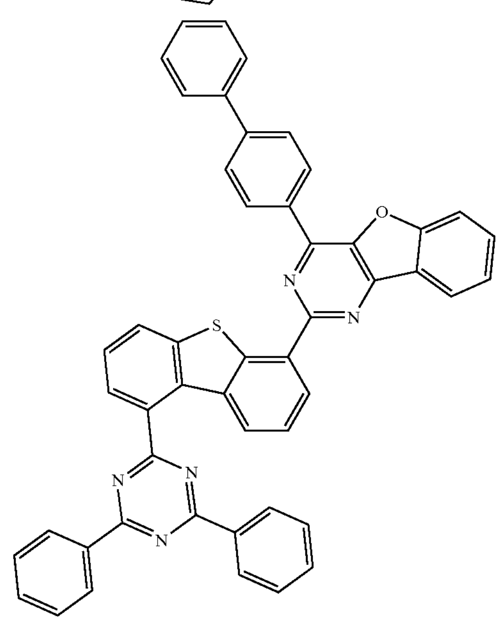
-continued -continued
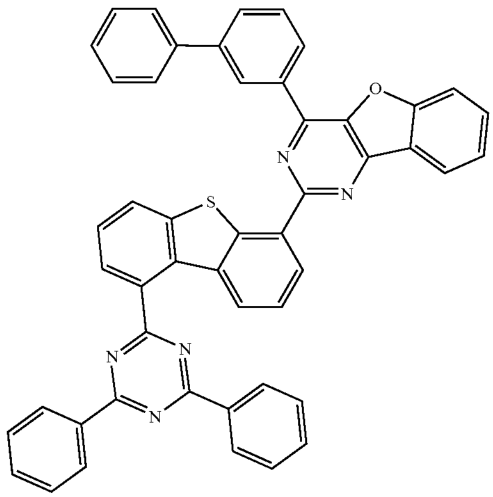
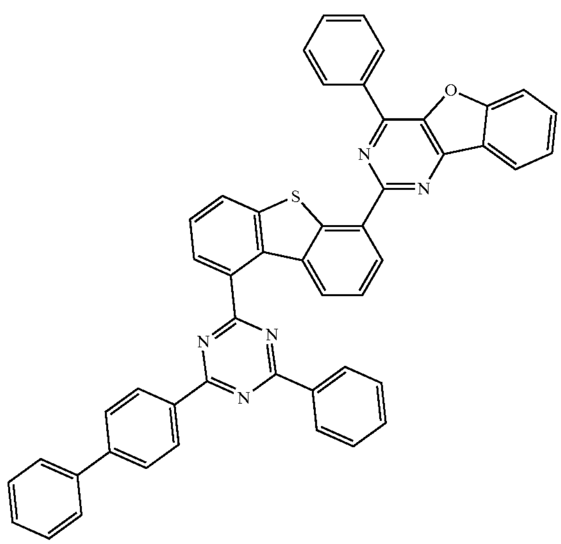
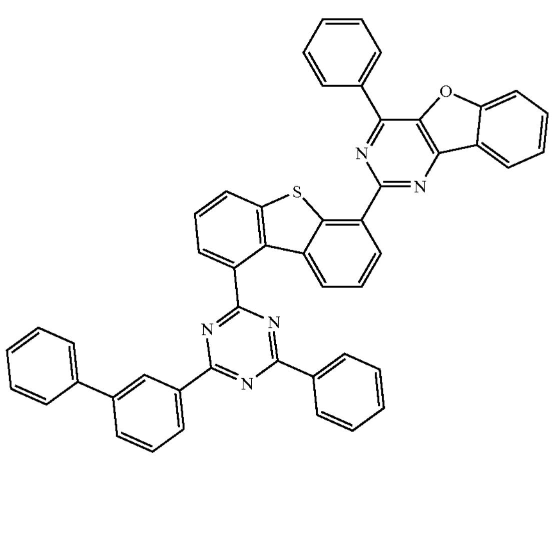
-continued
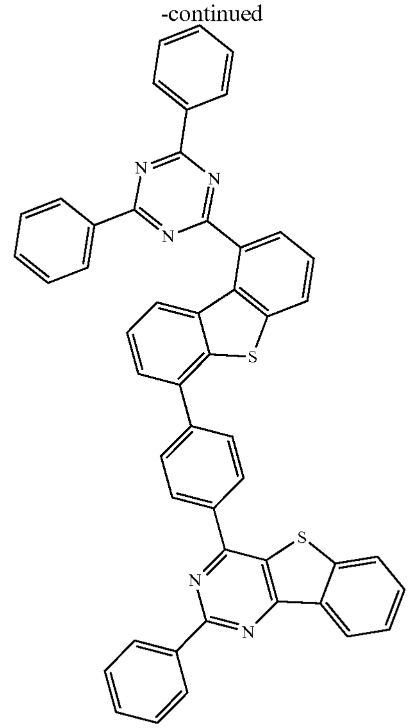
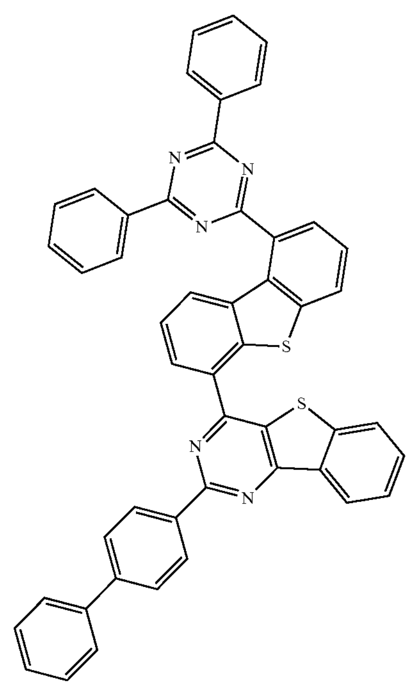

-continued
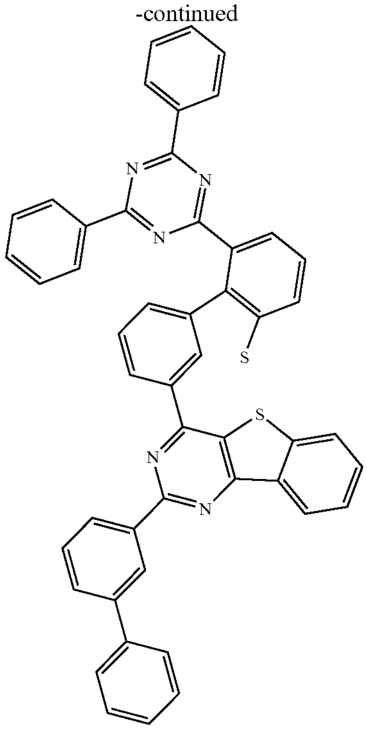
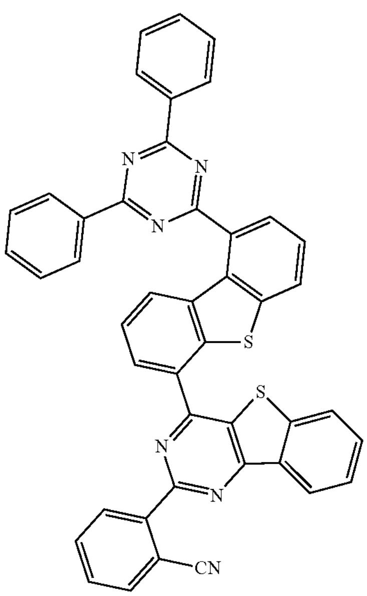
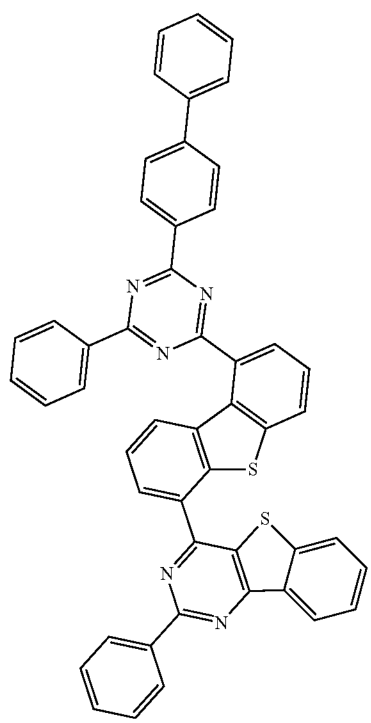

-continued
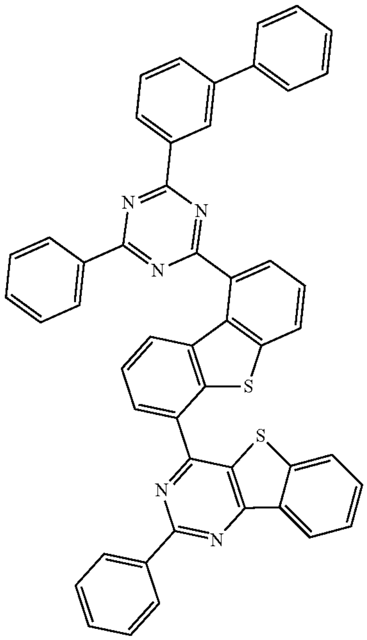
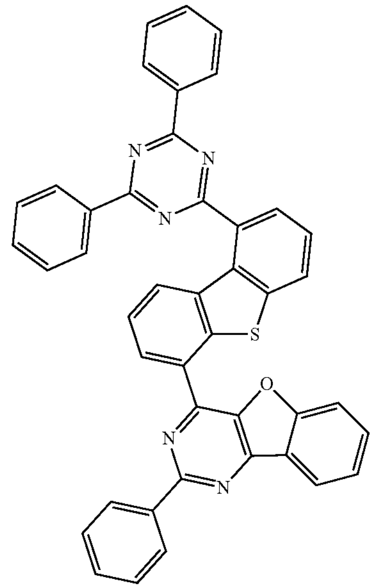
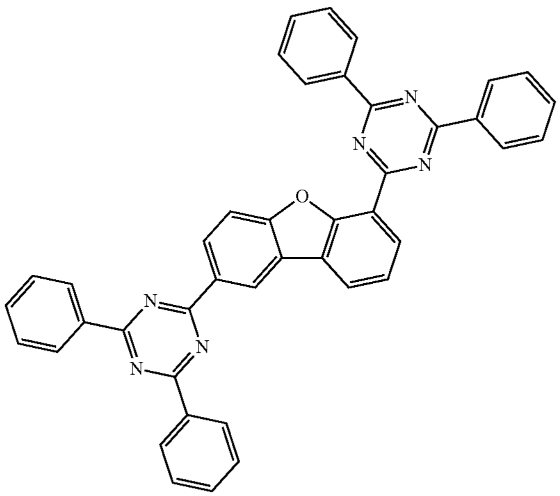
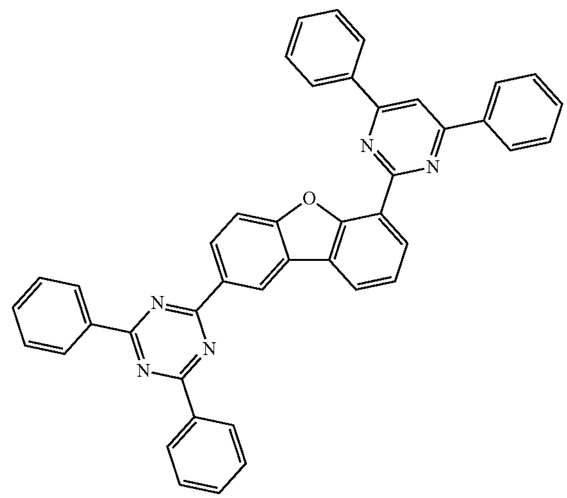
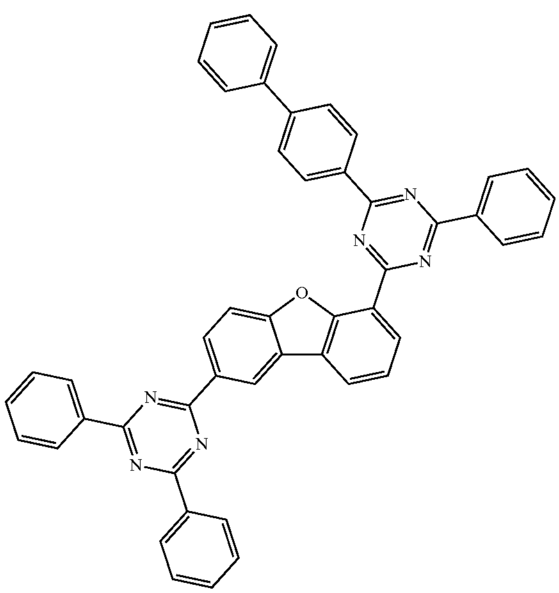
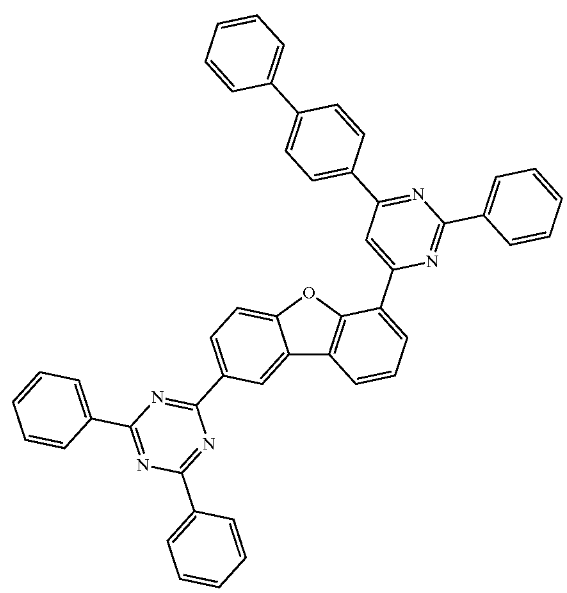

-continued
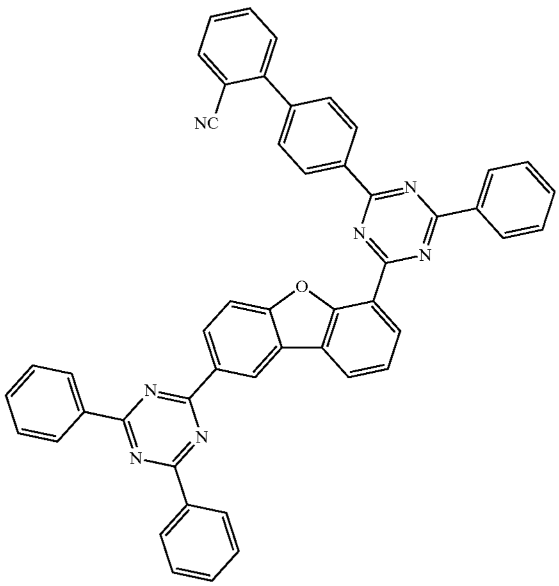
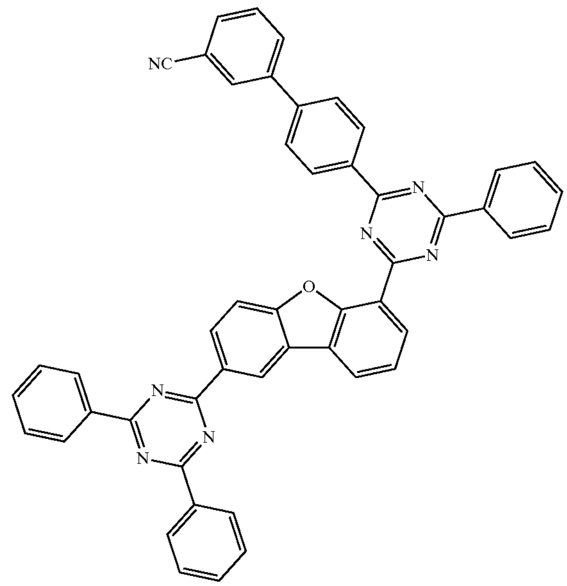
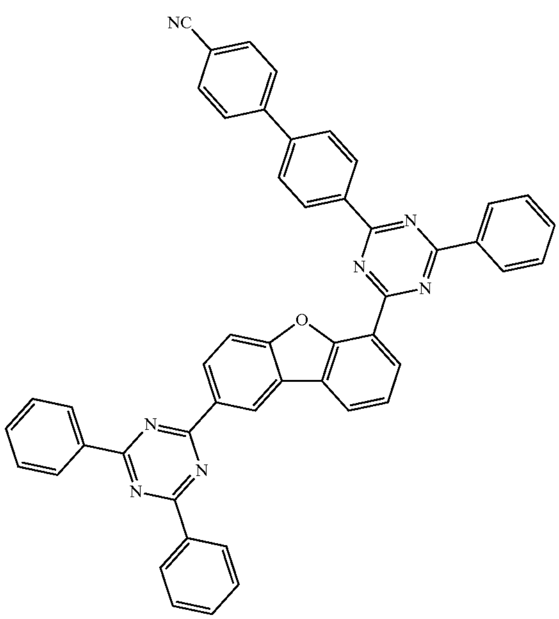
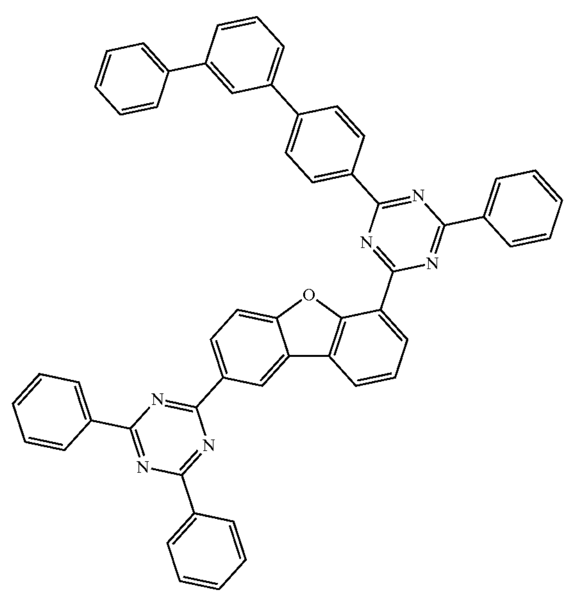

-continued
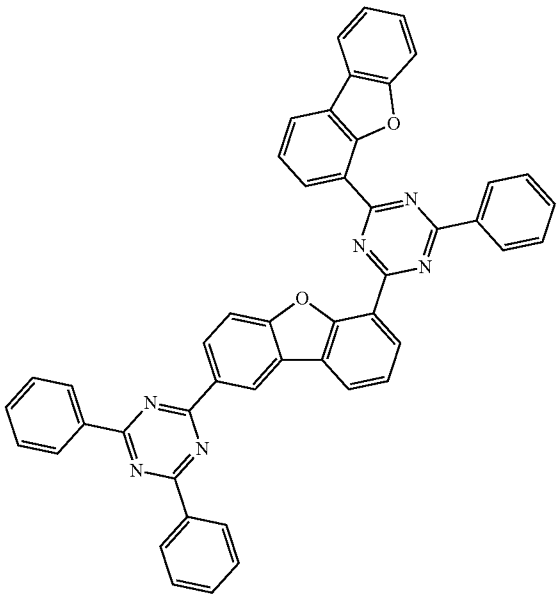
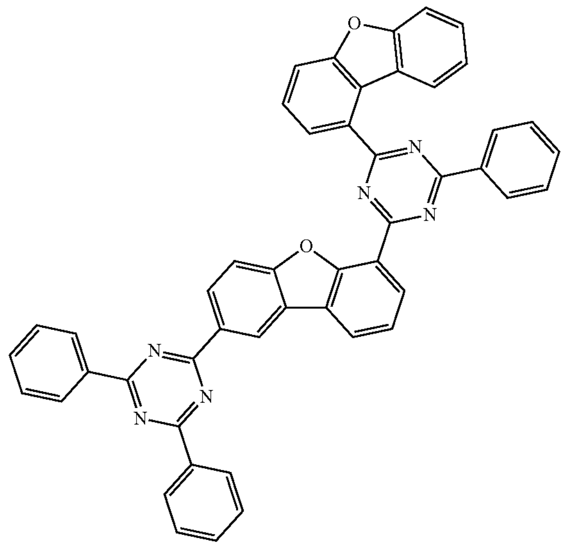
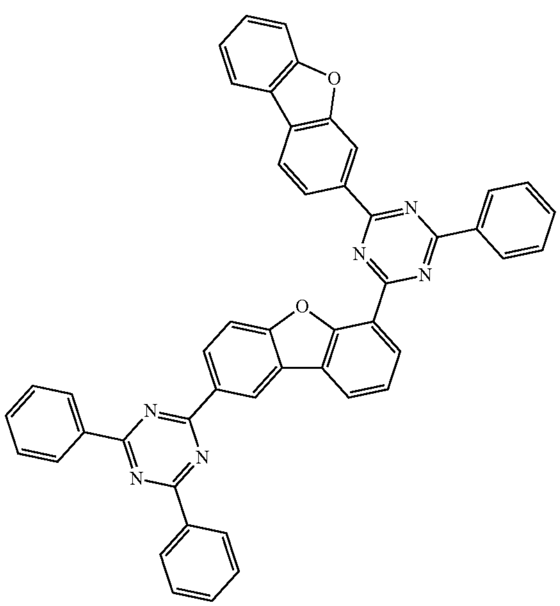
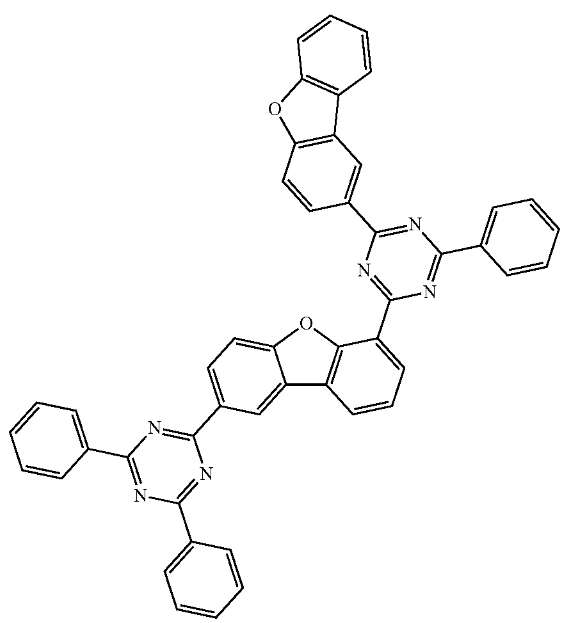

-continued
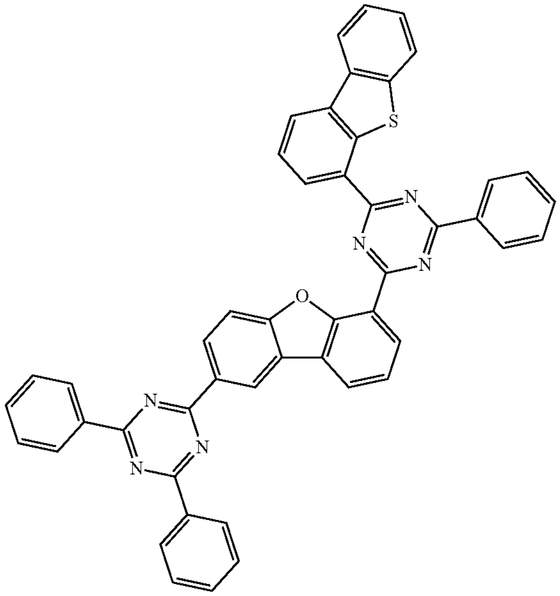
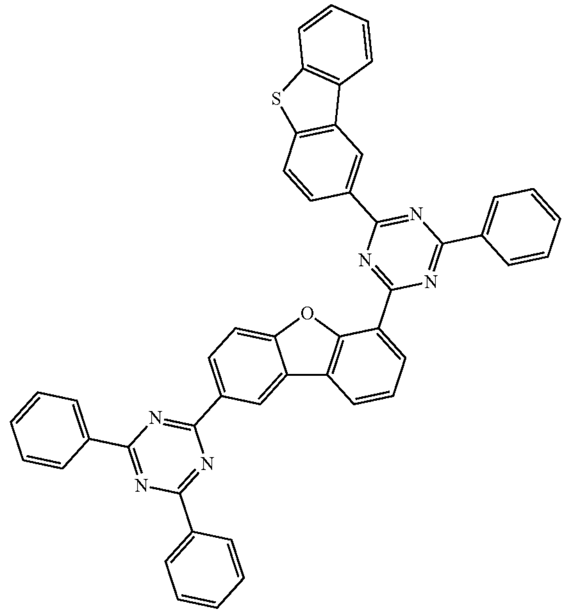
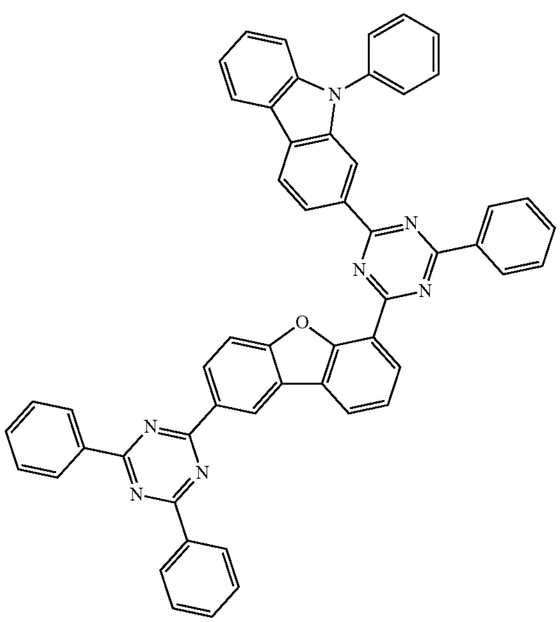
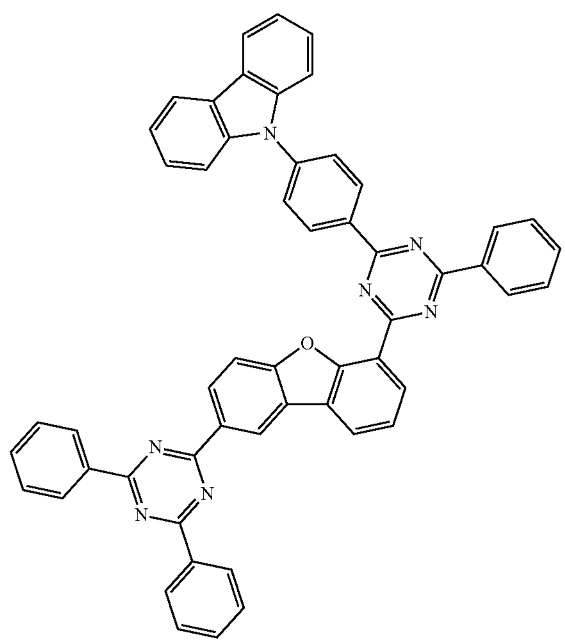

-continued
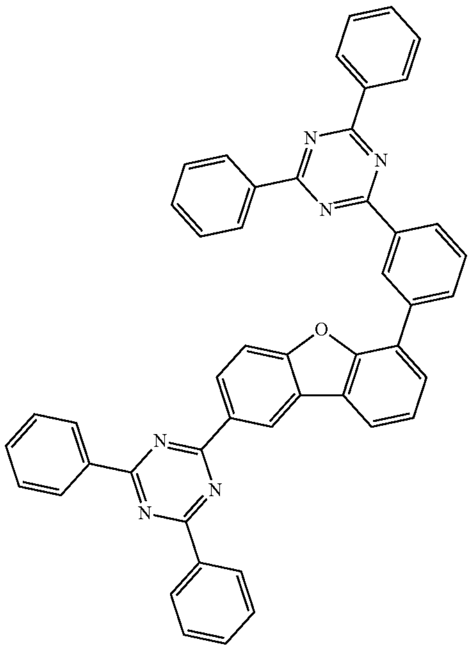
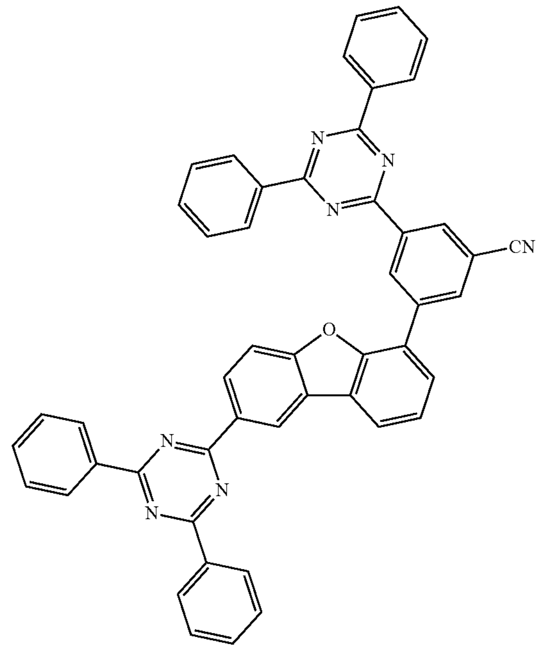
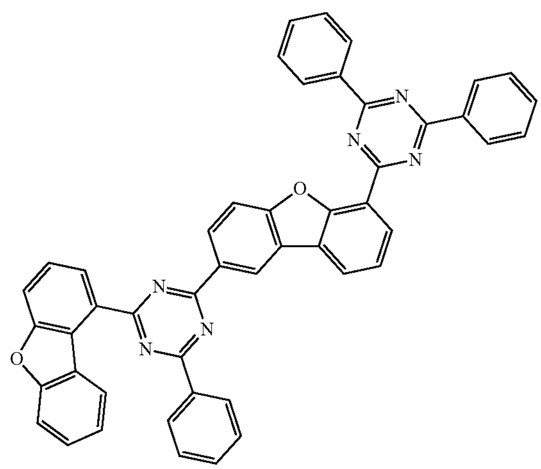
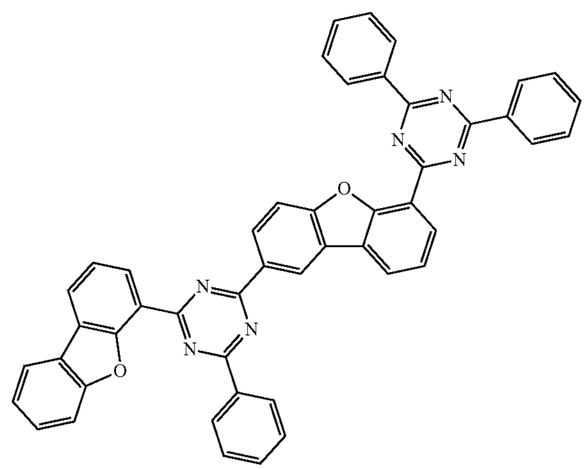
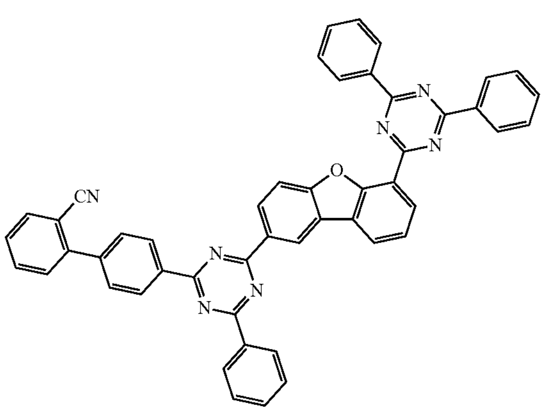
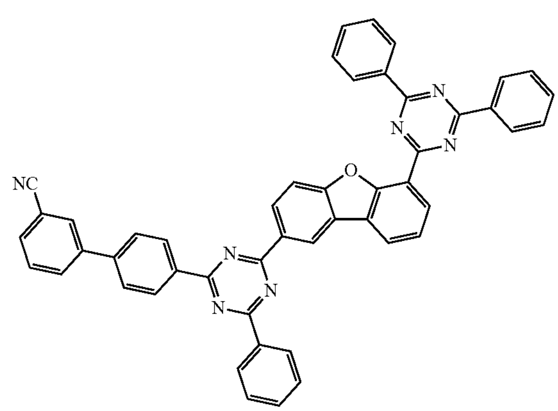

-continued
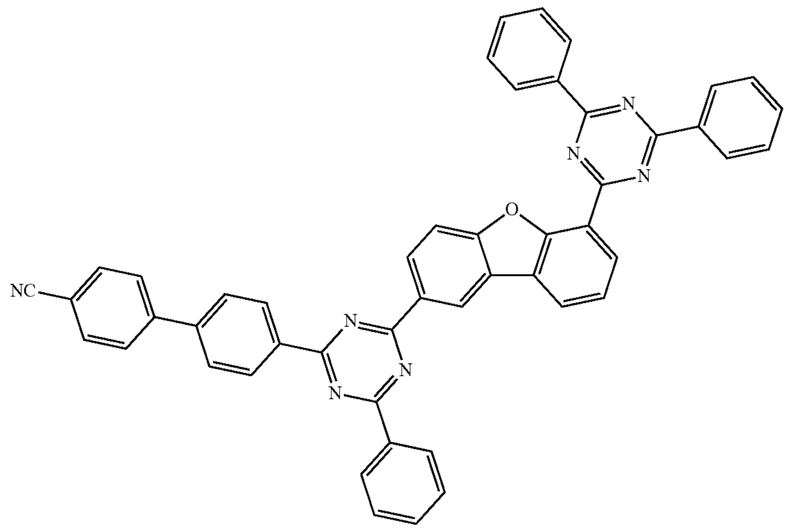
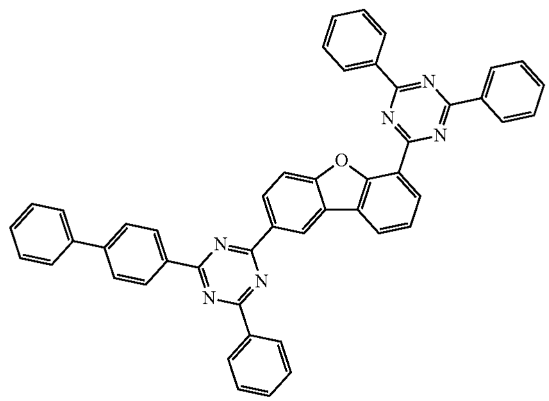
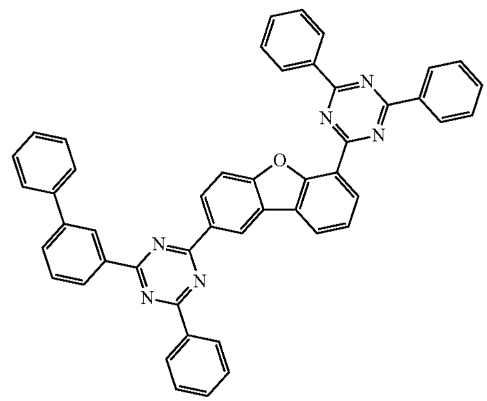
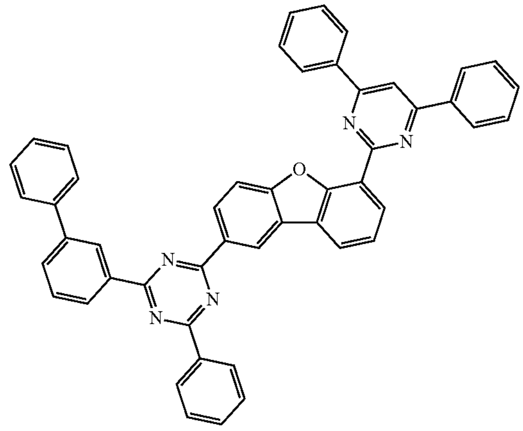
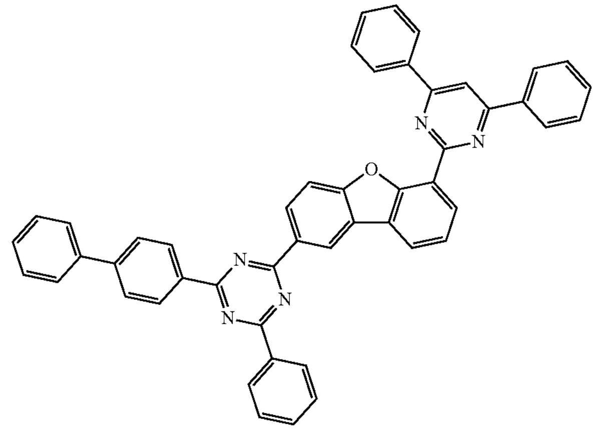

-continued
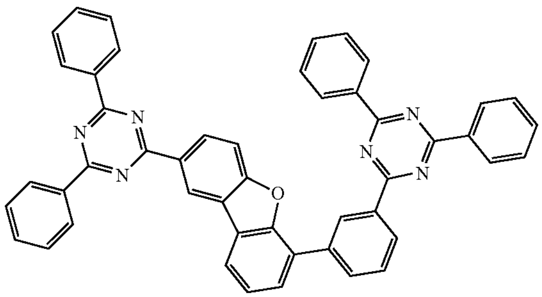
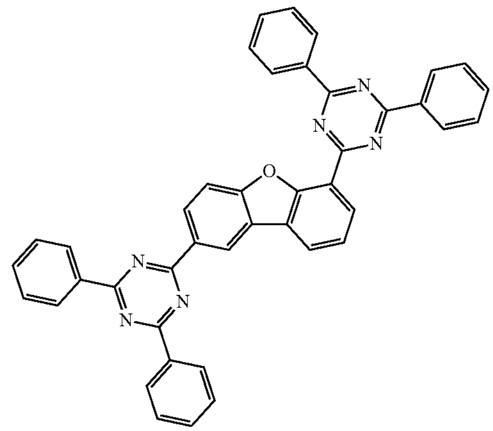
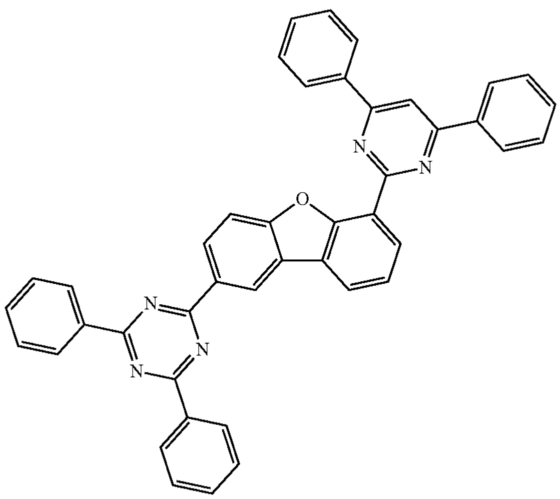
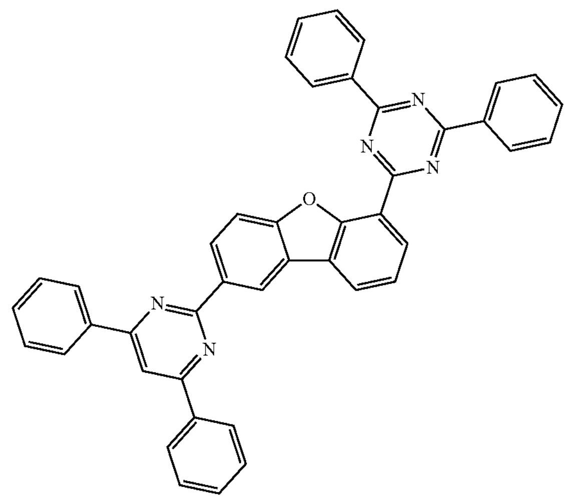
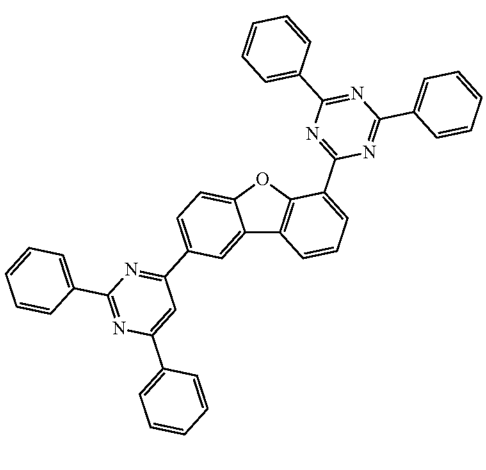
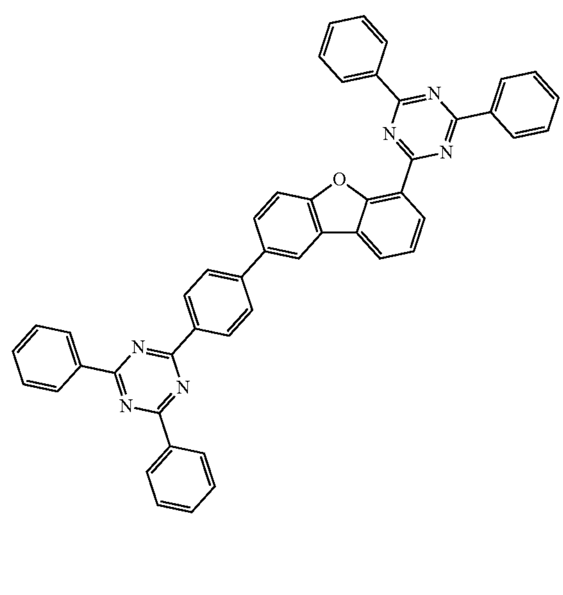

-continued
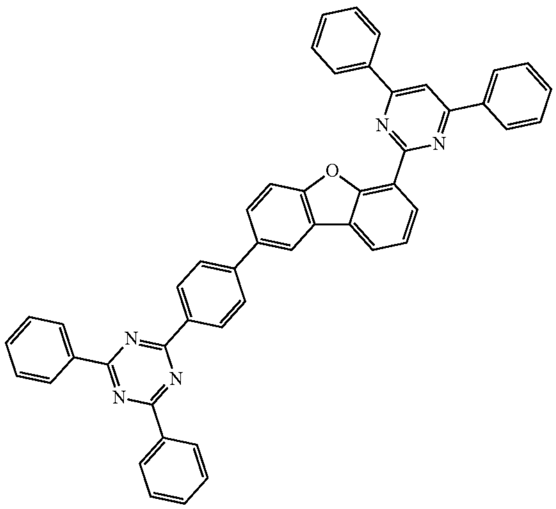
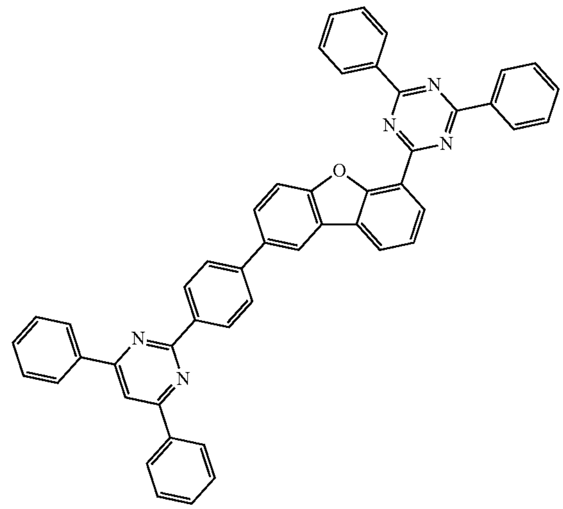
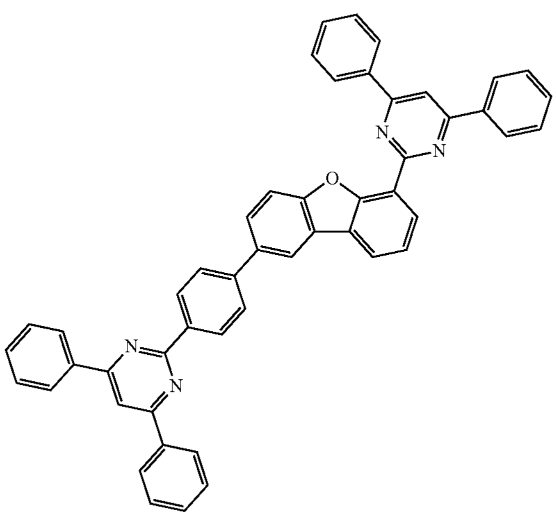
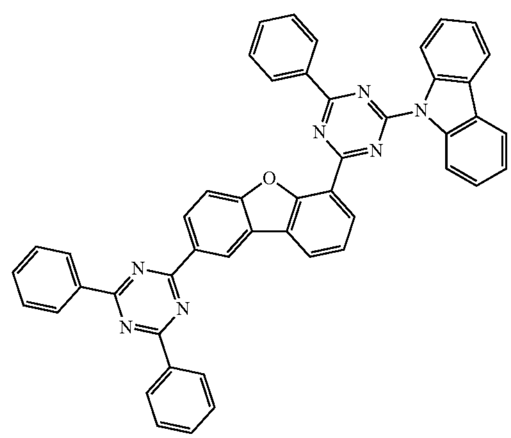
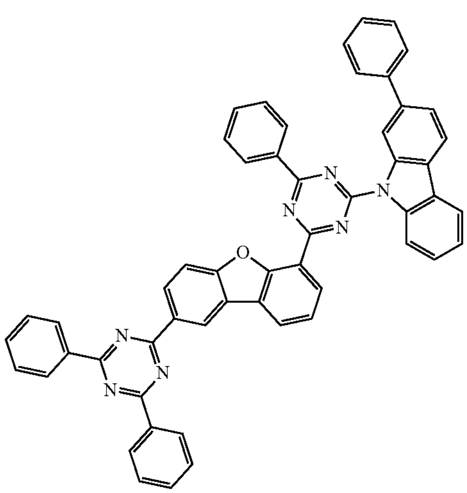
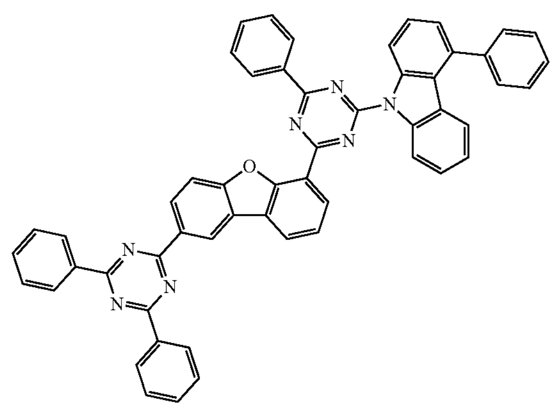

-continued
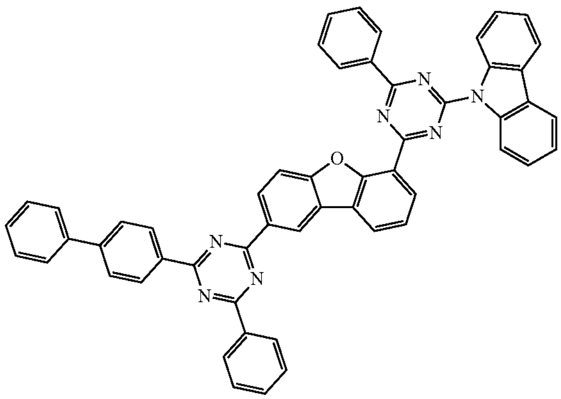
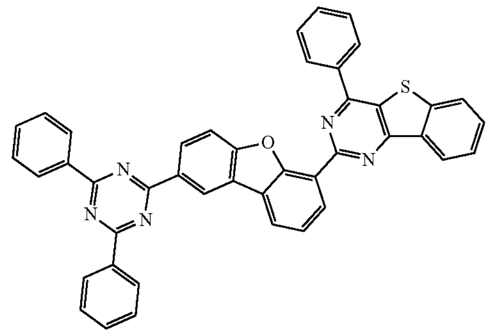
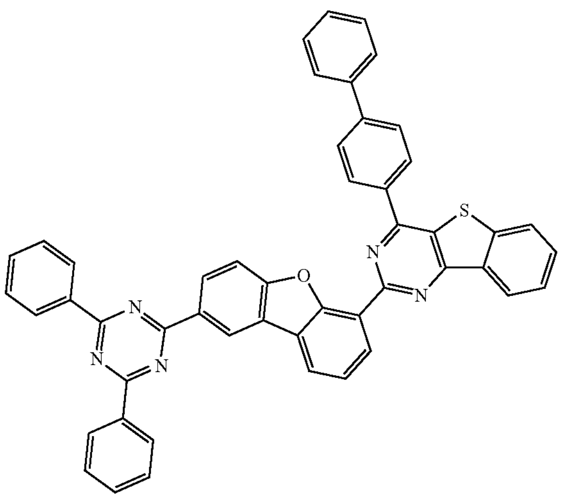
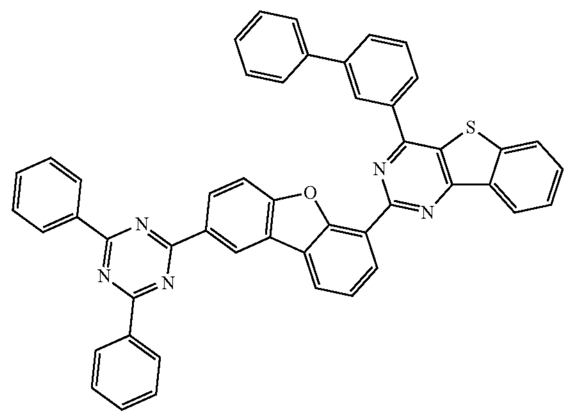
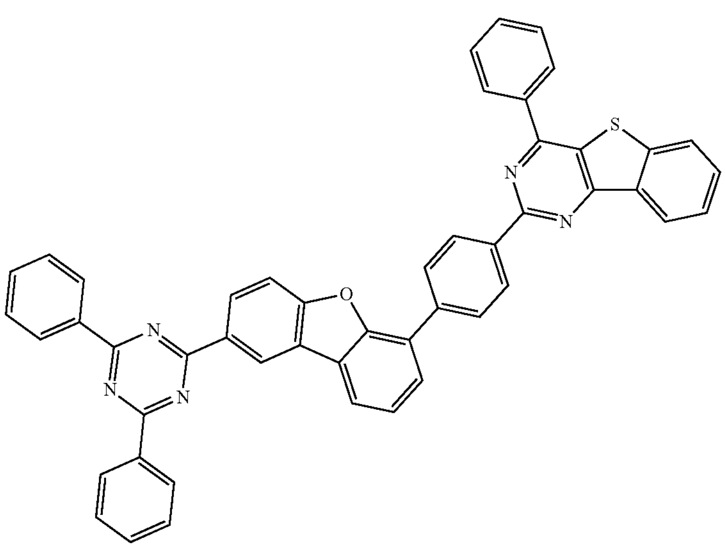

-continued
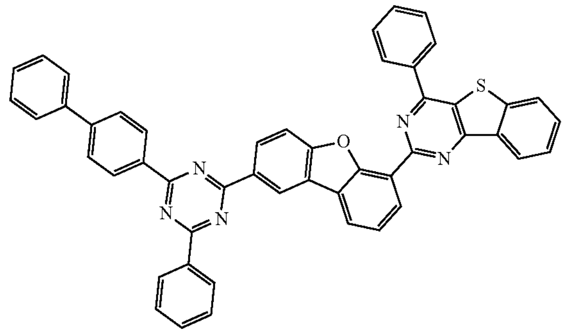
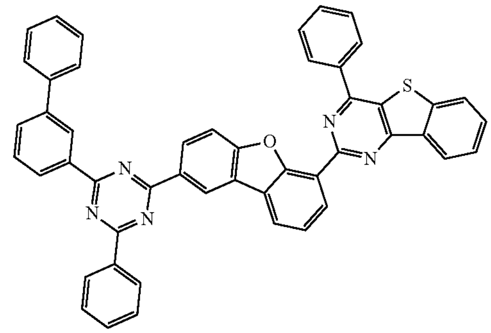
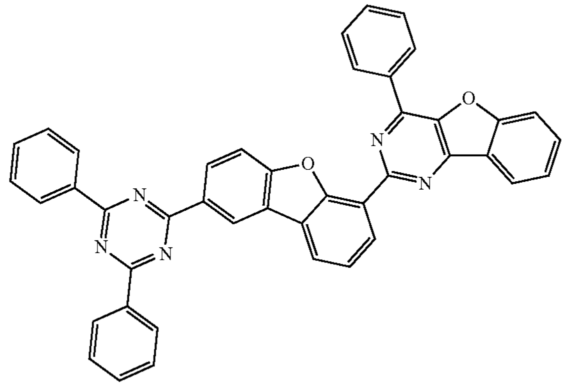
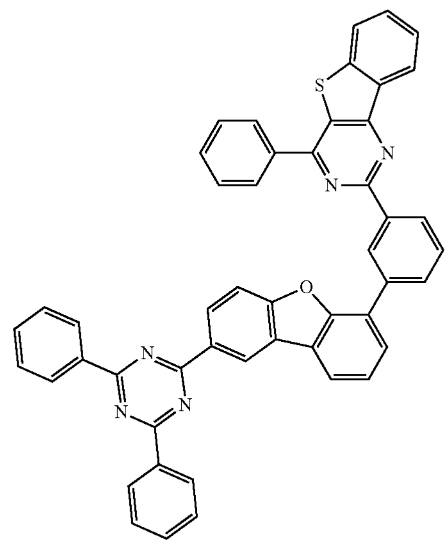
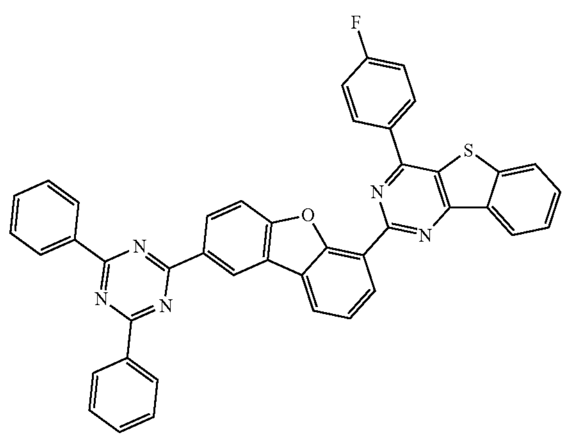
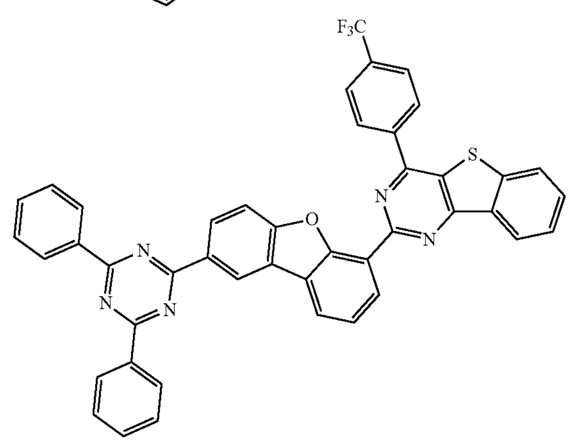
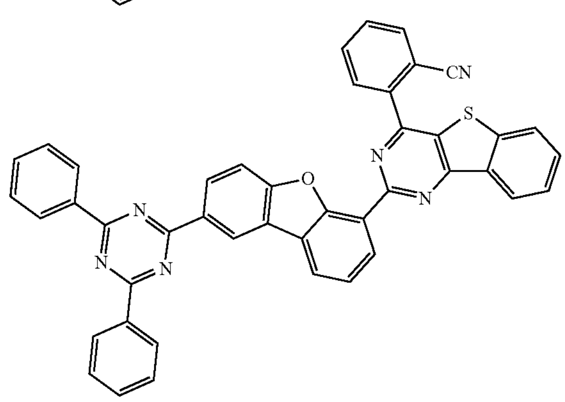
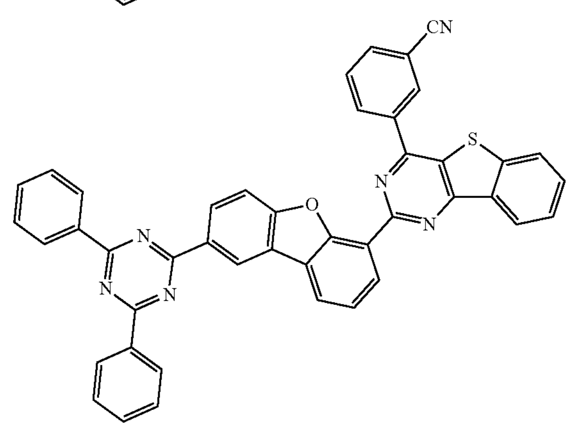

-continued
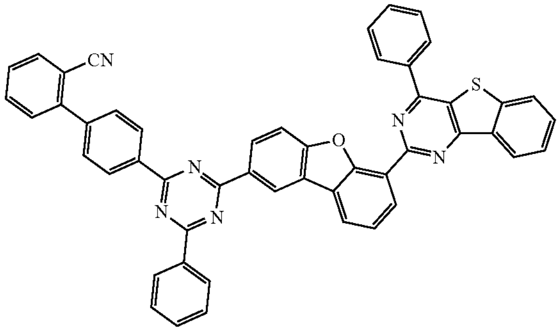
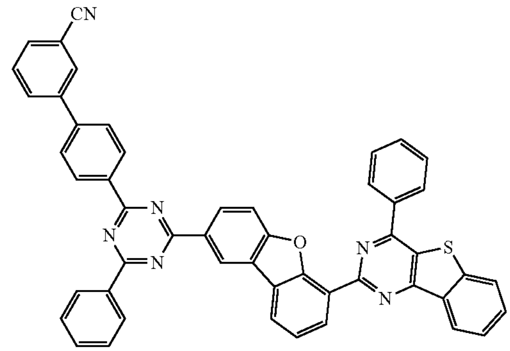
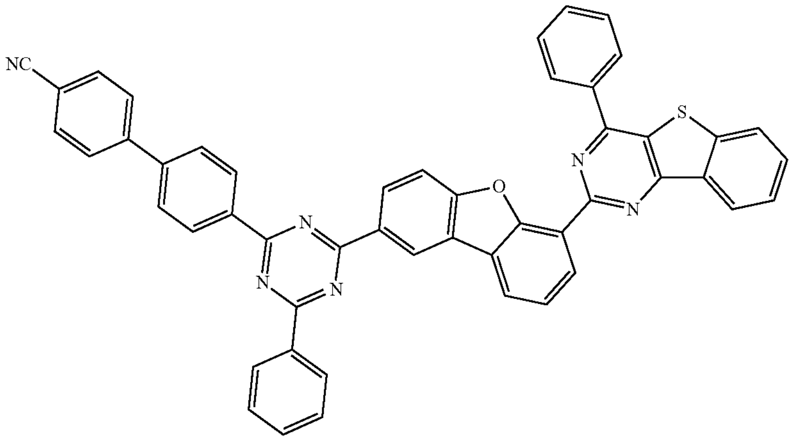
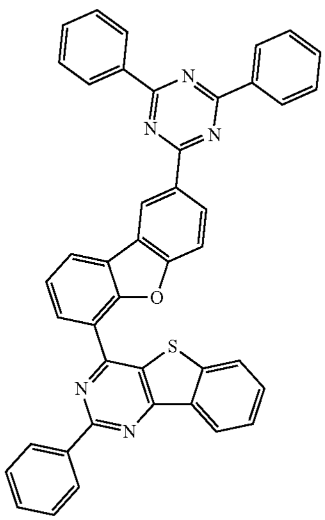
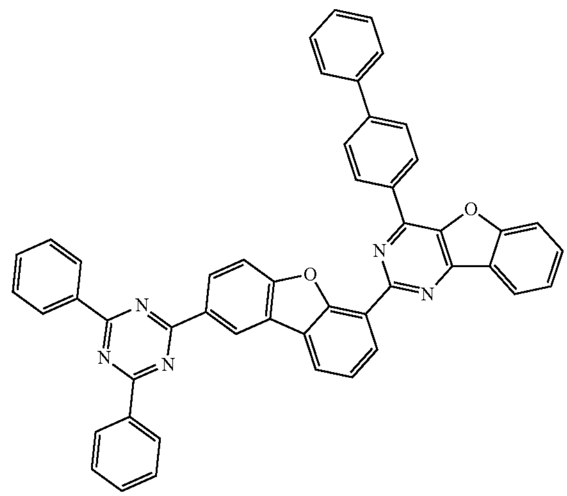
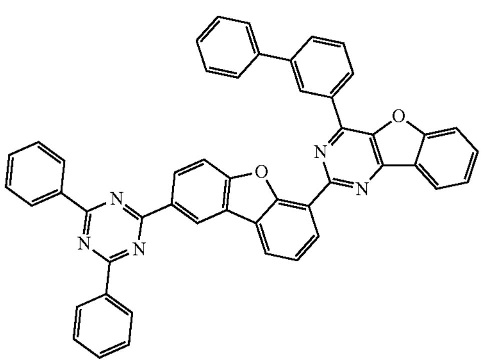
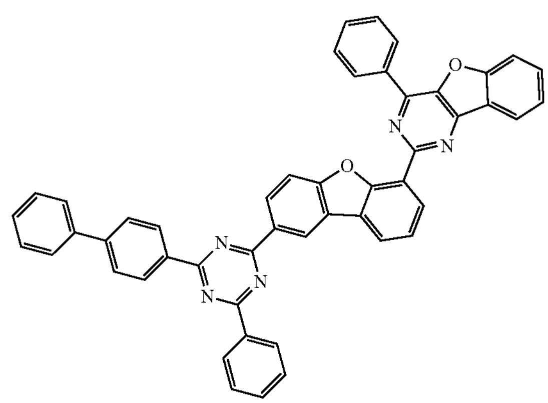

-continued
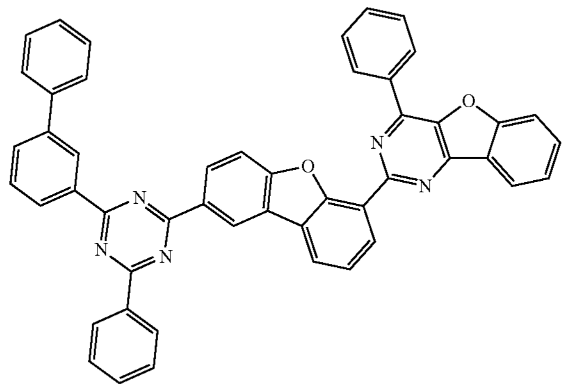
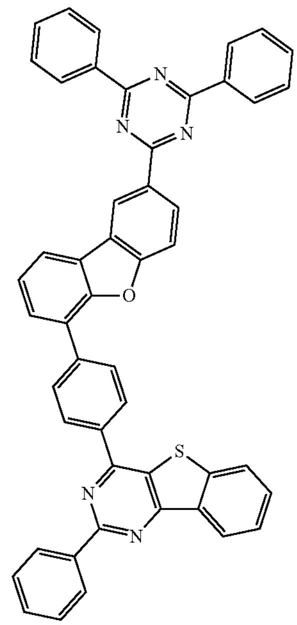
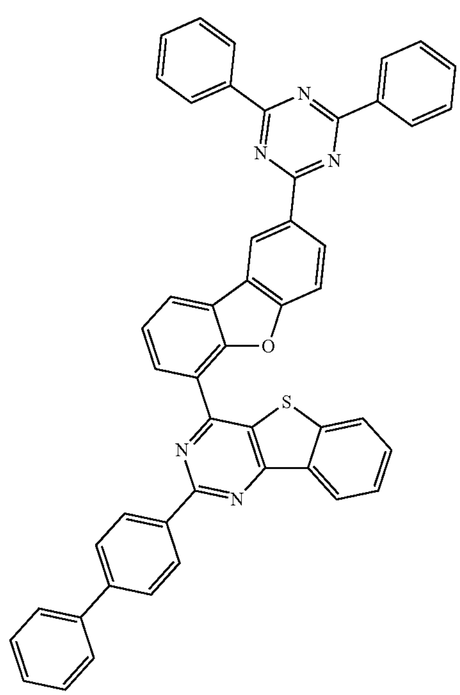
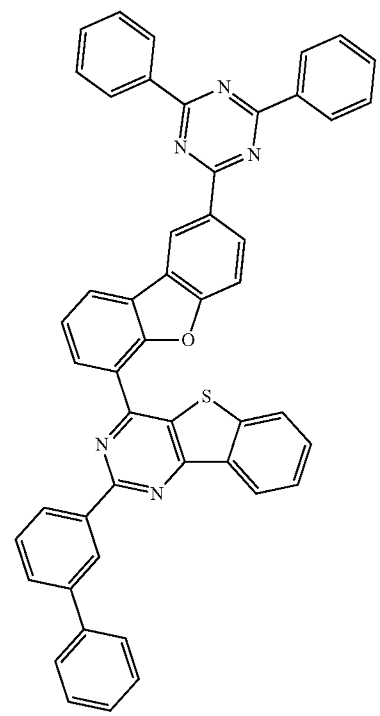

-continued
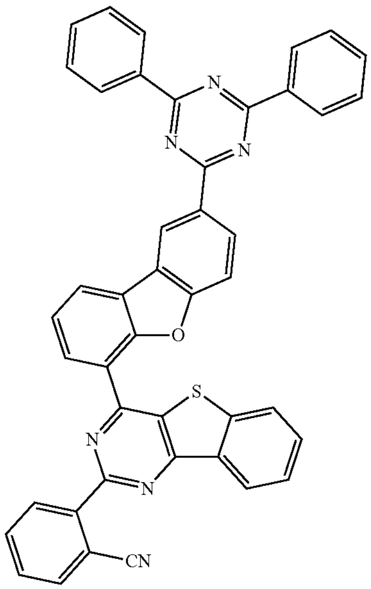
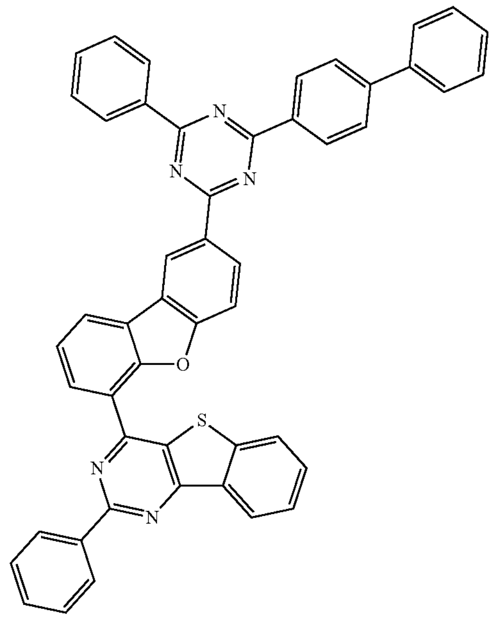
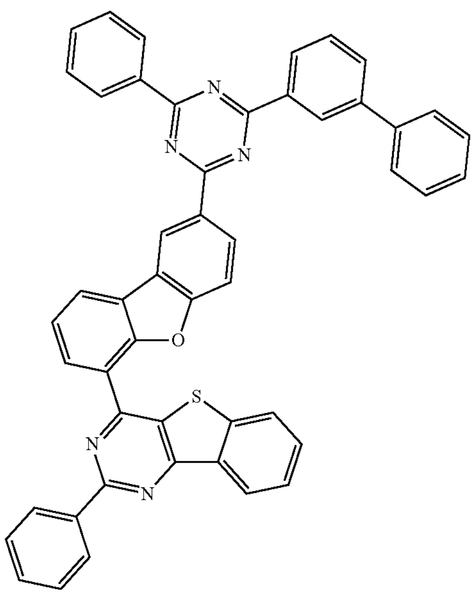
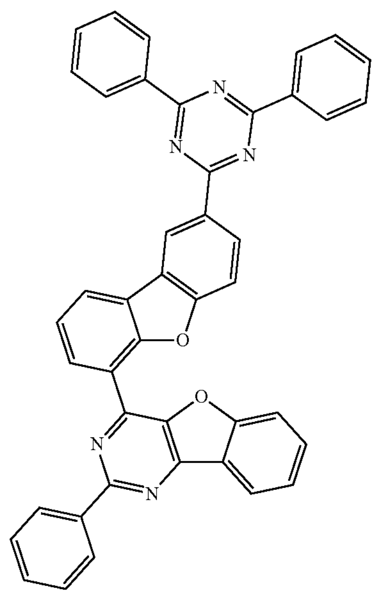
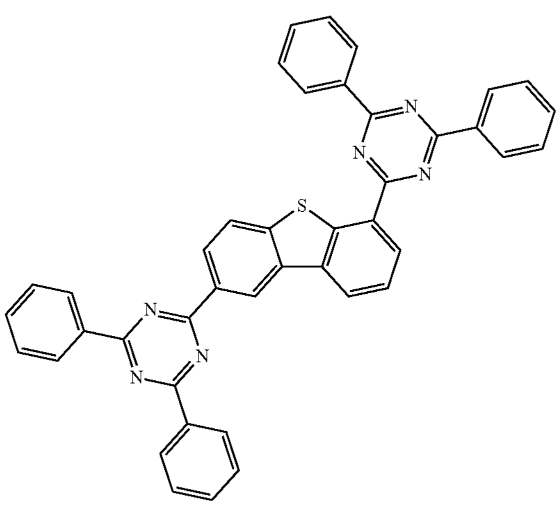
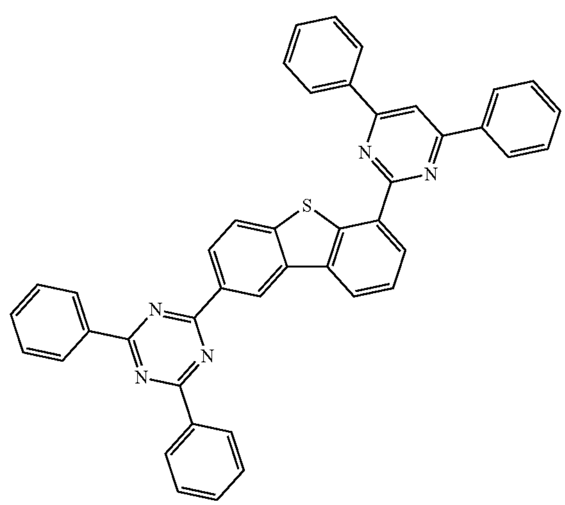

-continued
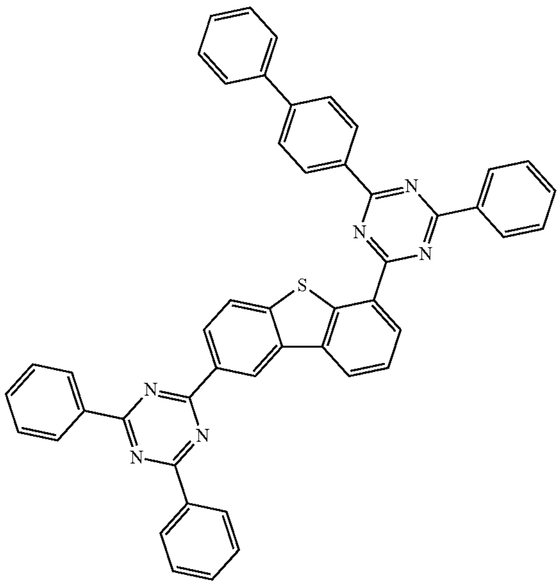
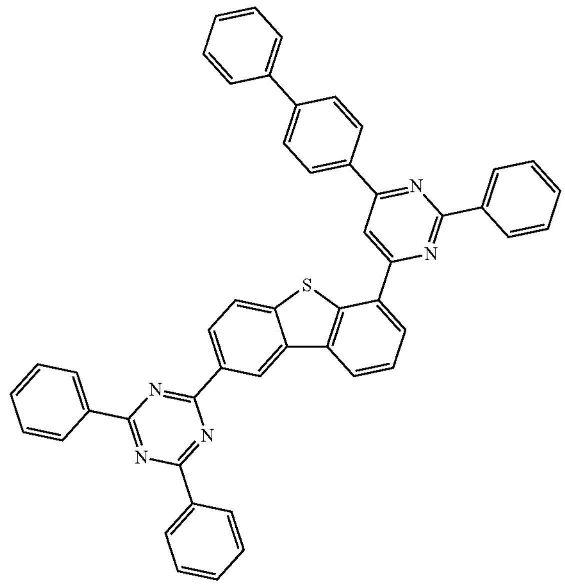
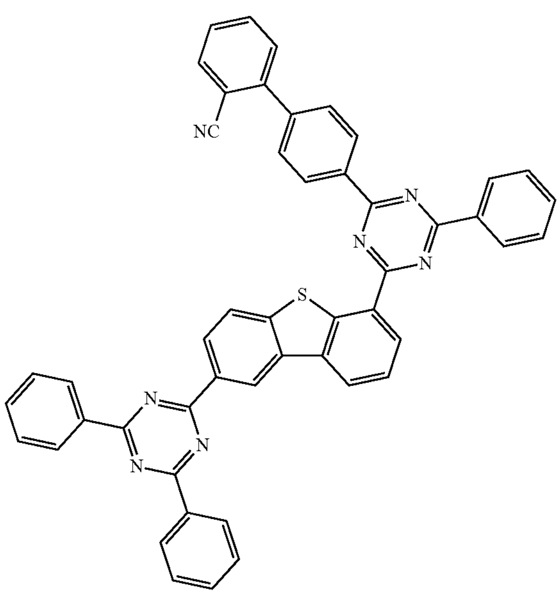
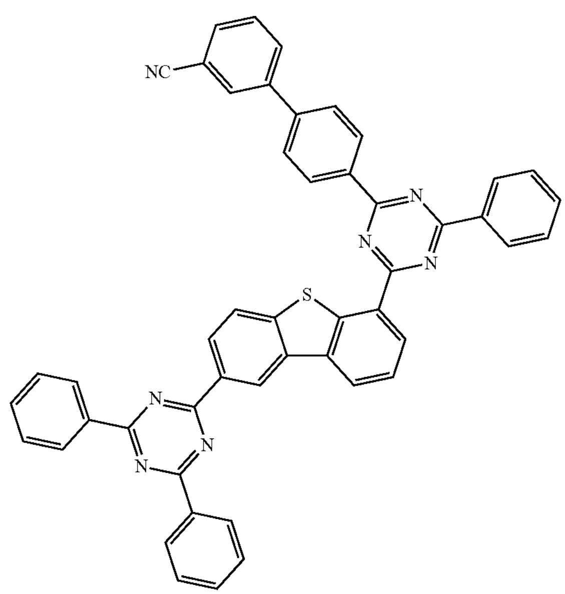

-continued
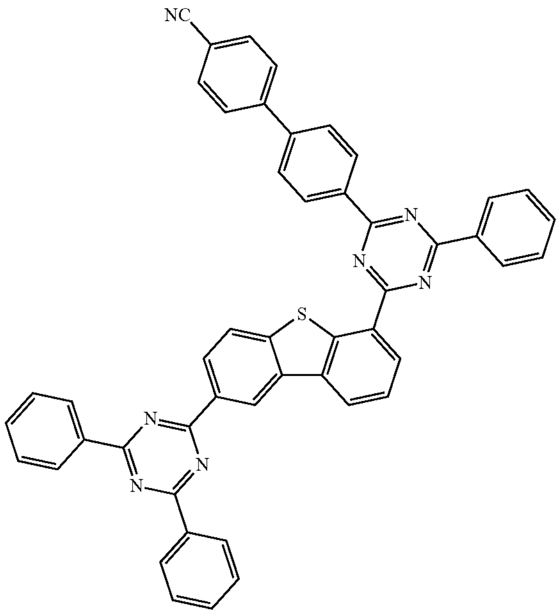
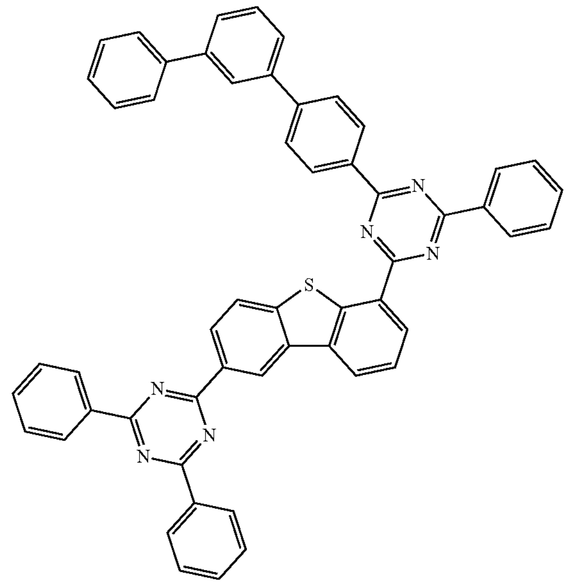
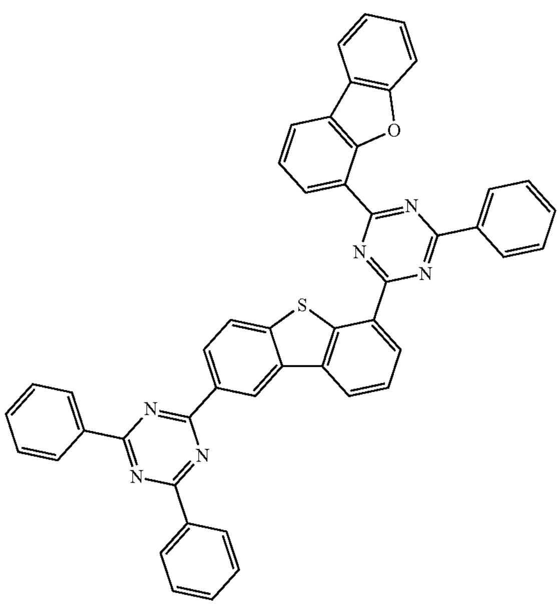
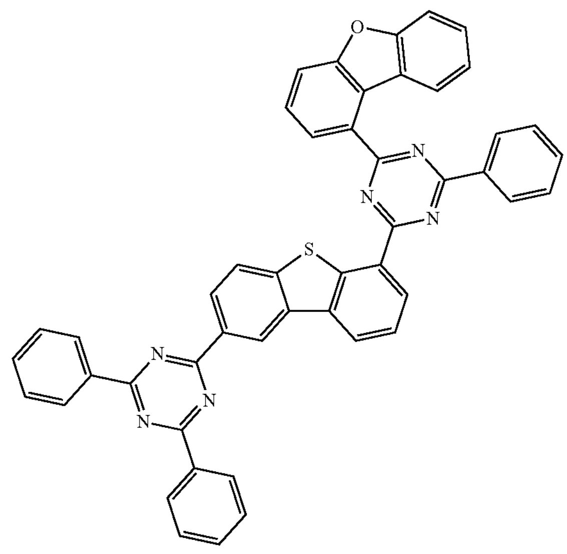

-continued
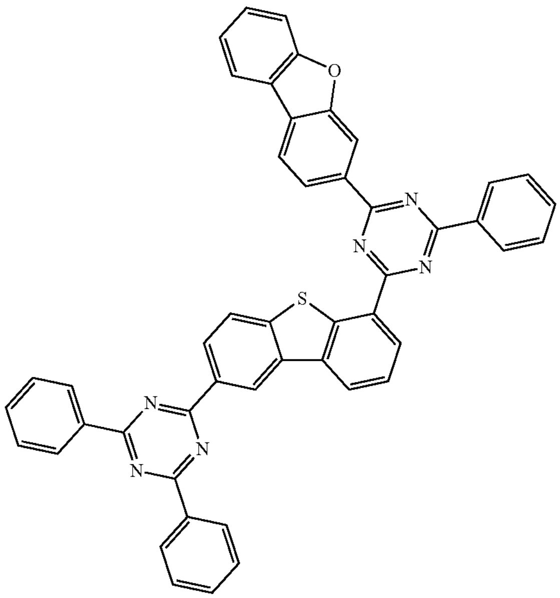
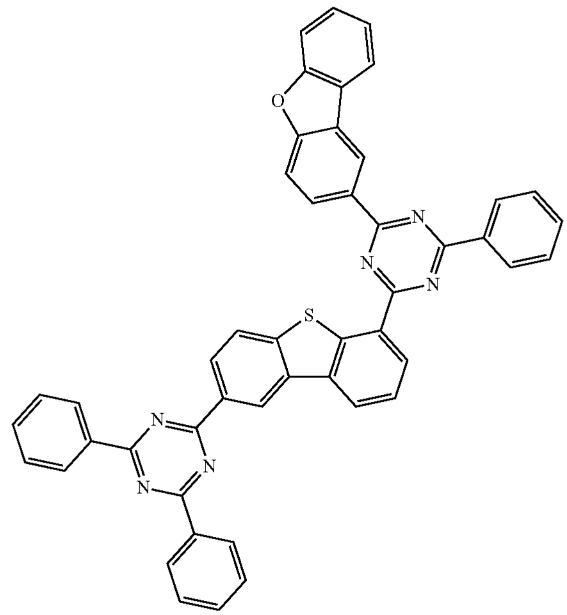
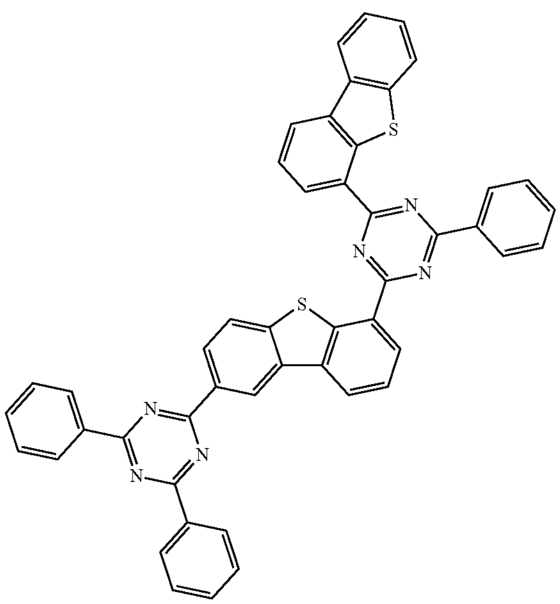
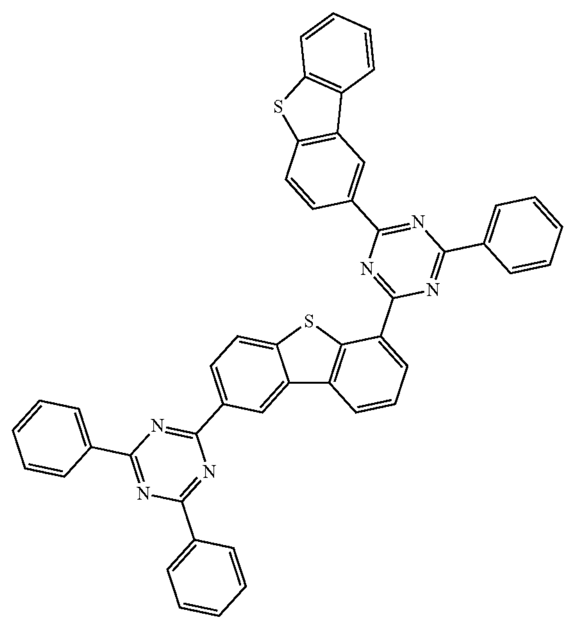

-continued
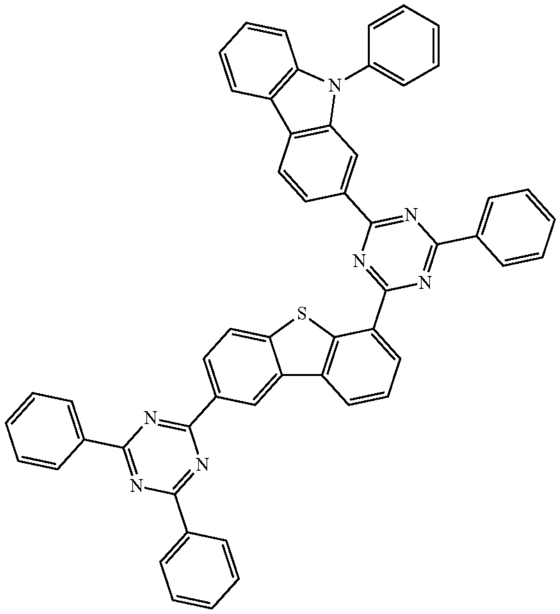
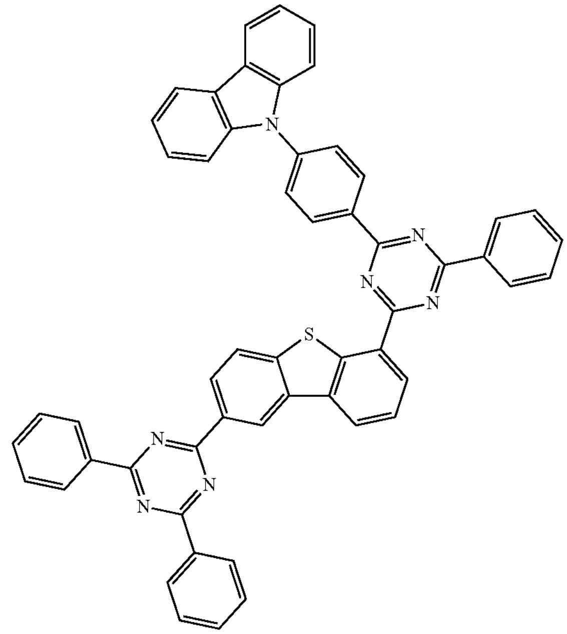
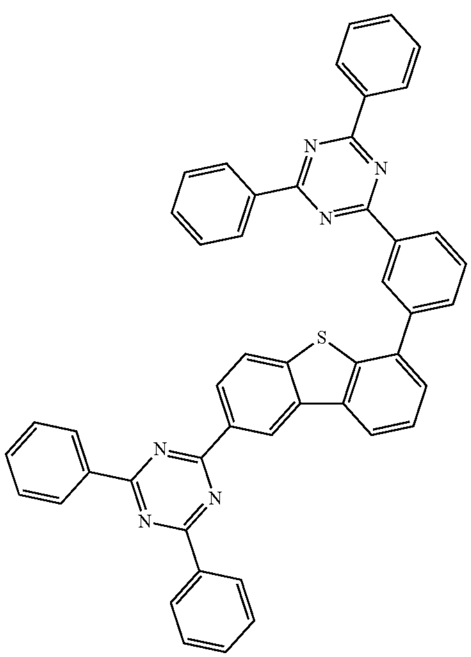
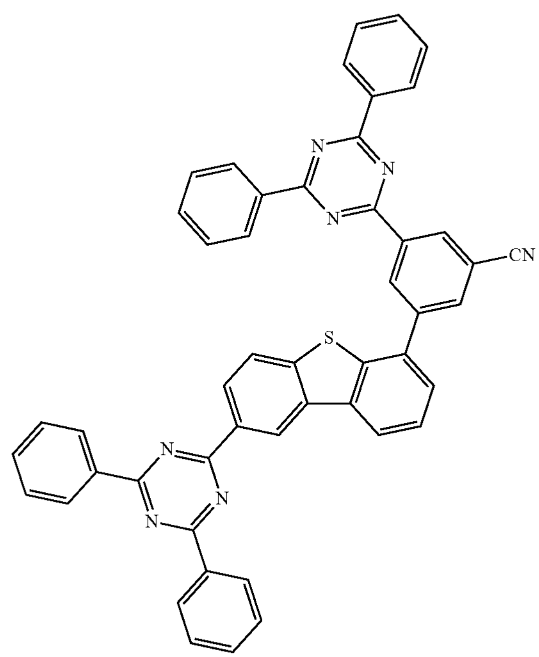

-continued
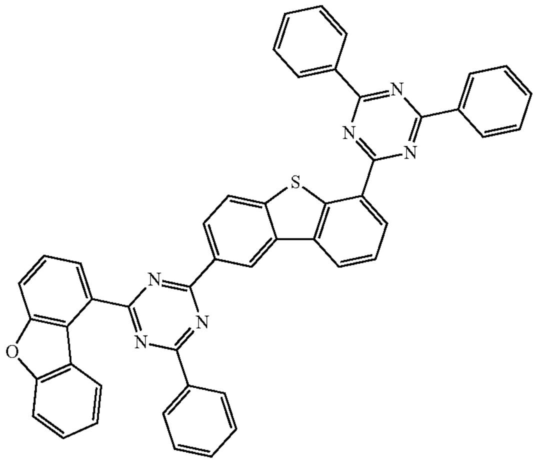
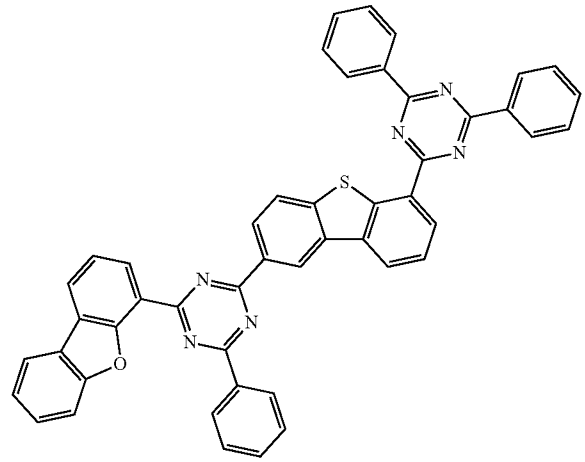
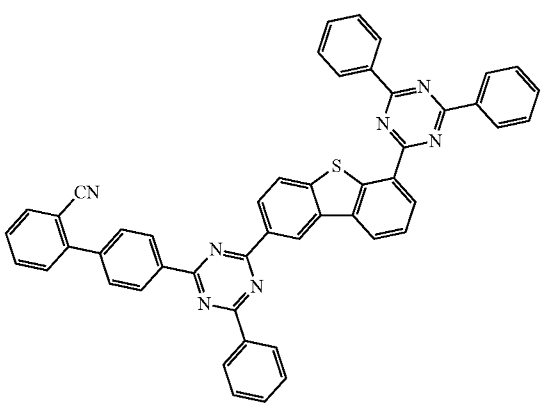
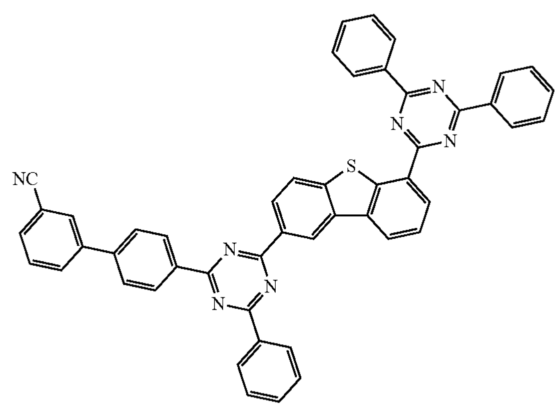
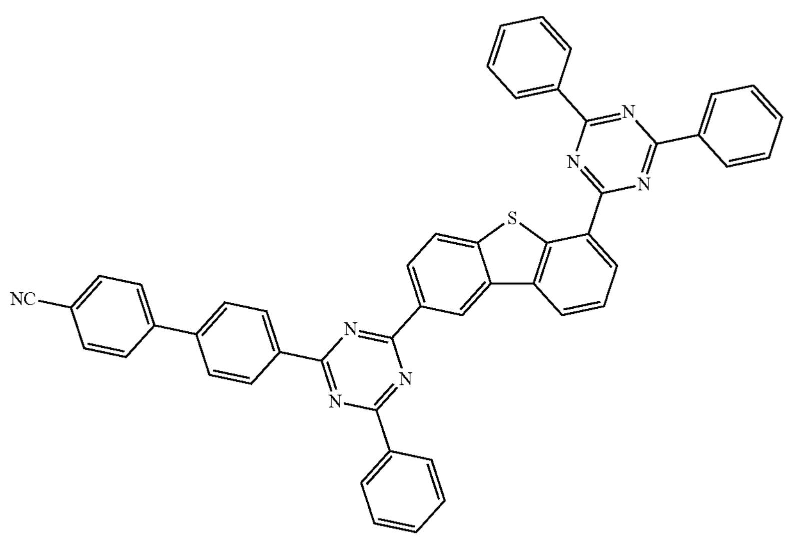

-continued
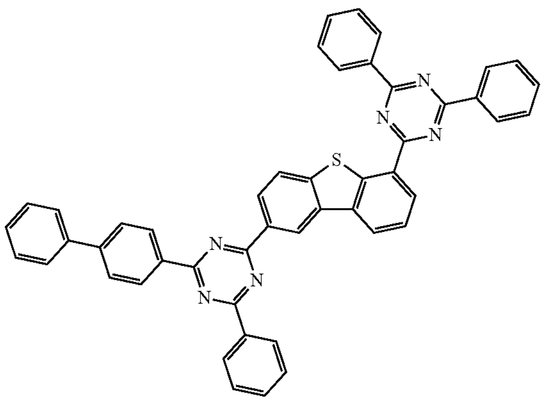
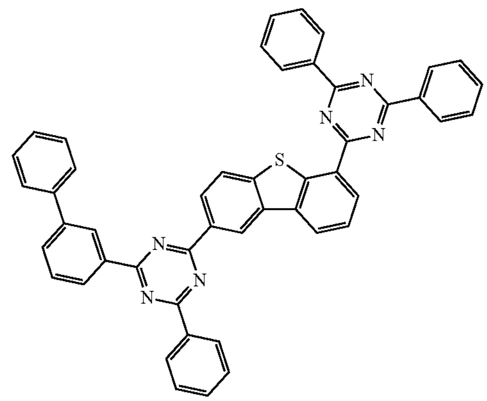
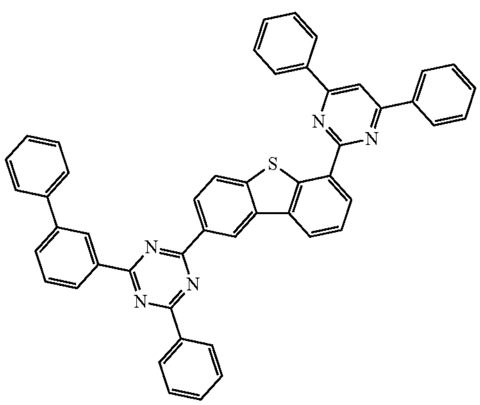
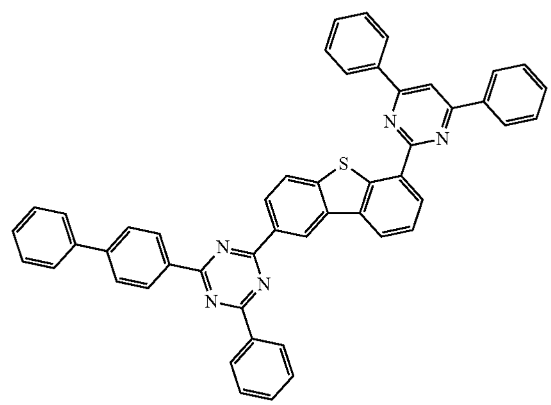
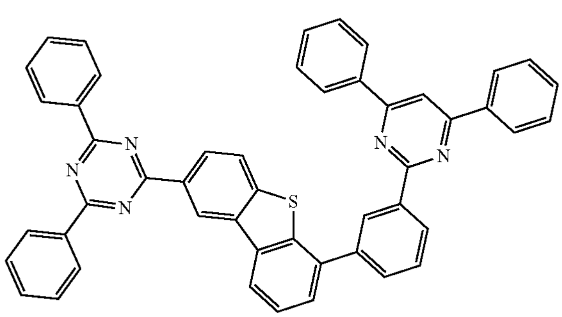
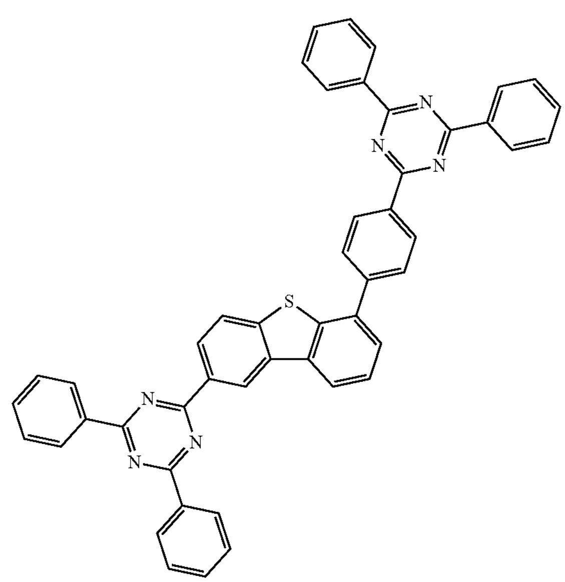

-continued
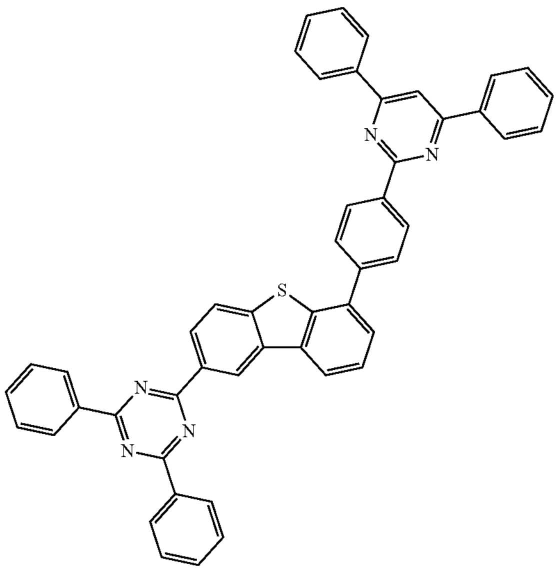
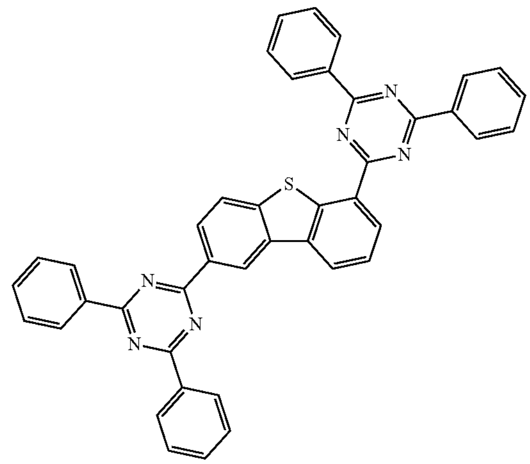
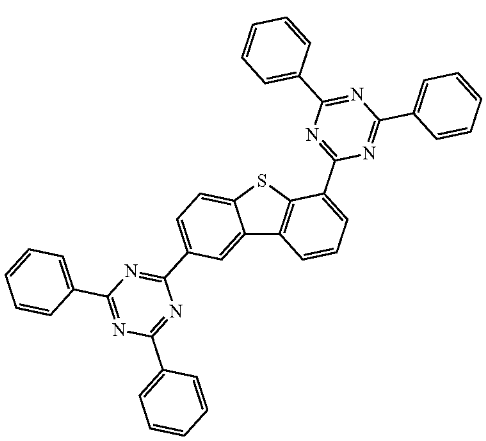
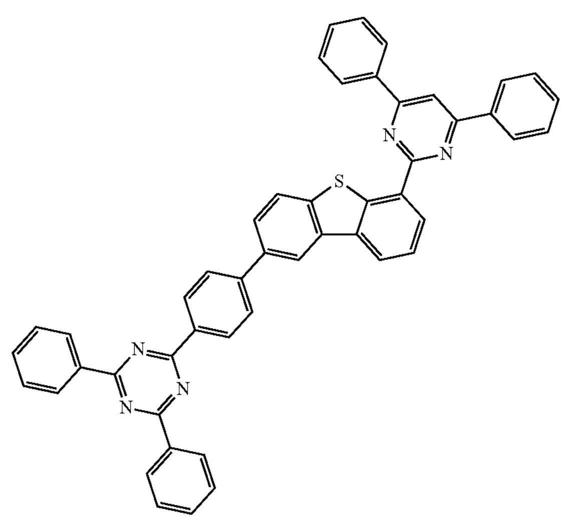

-continued
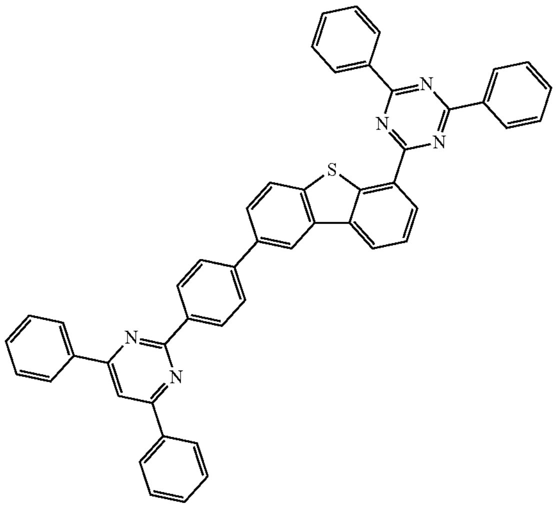
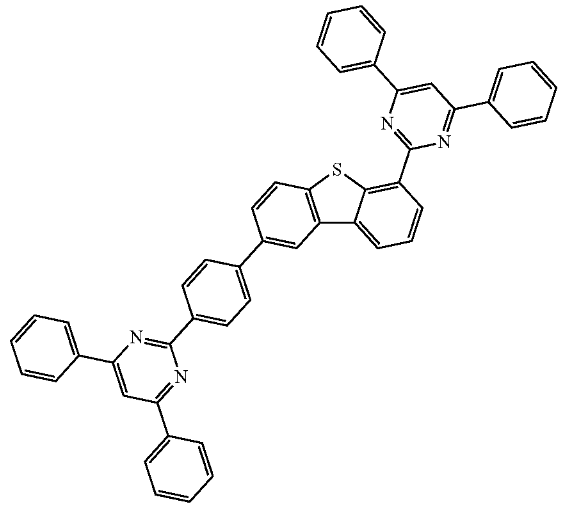
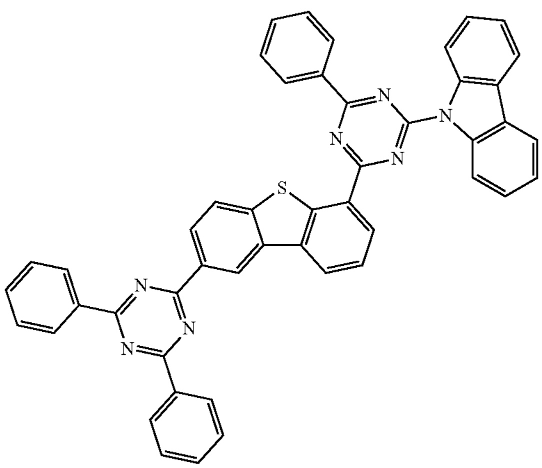
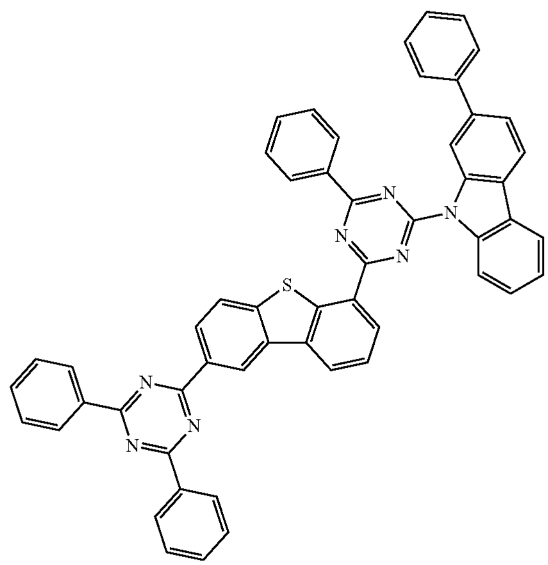
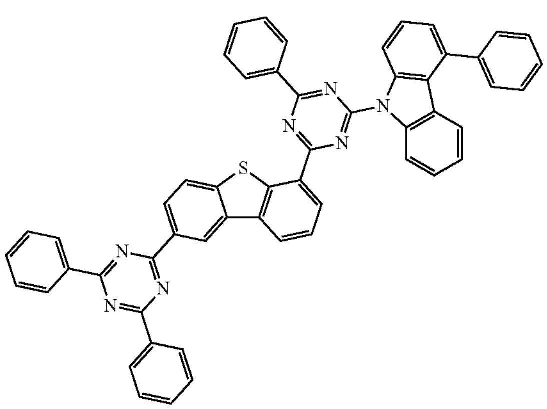
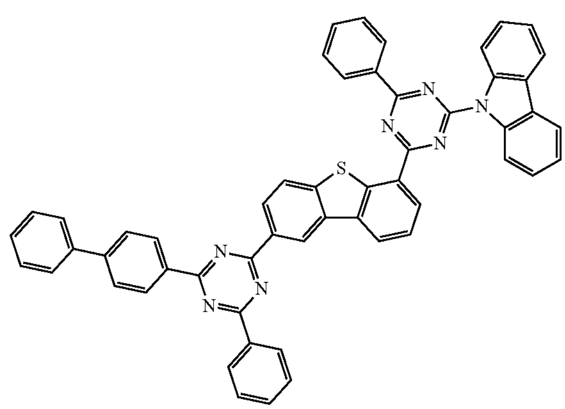

-continued
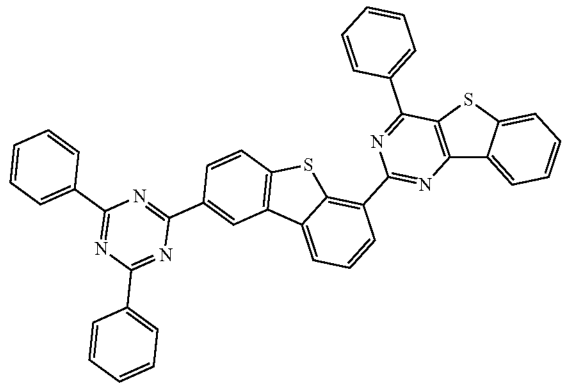
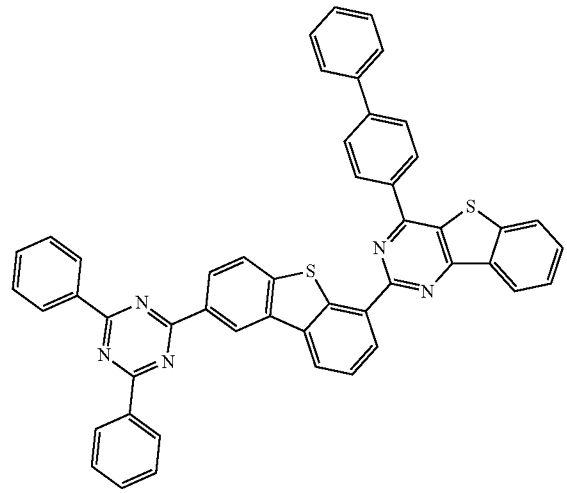
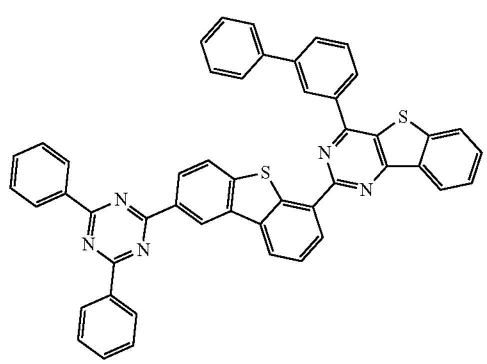
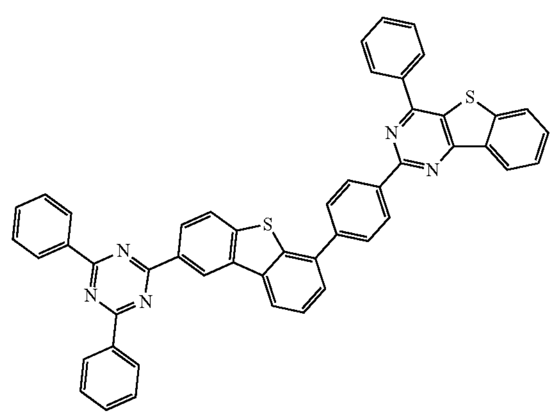
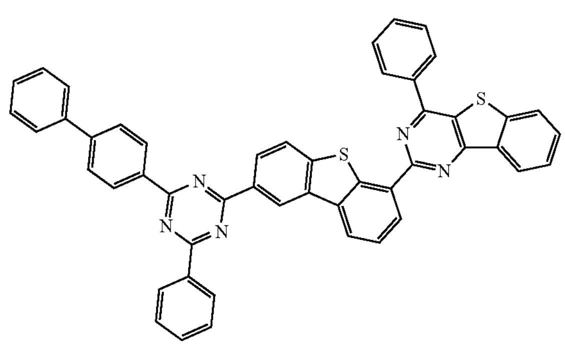
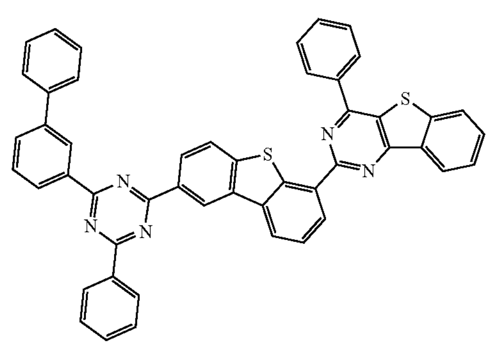

-continued
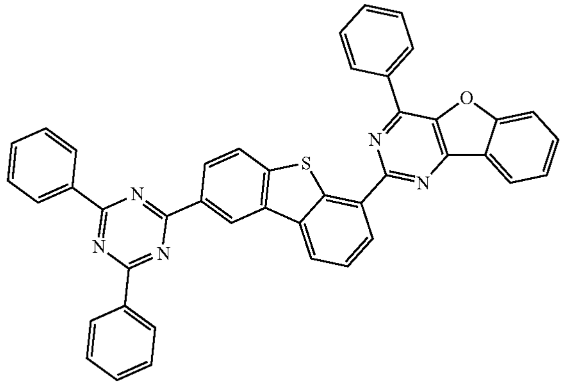
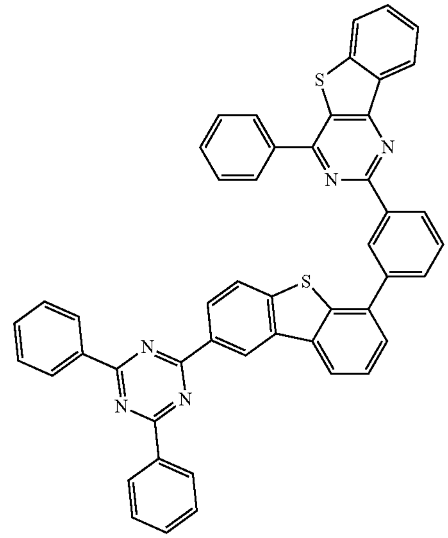
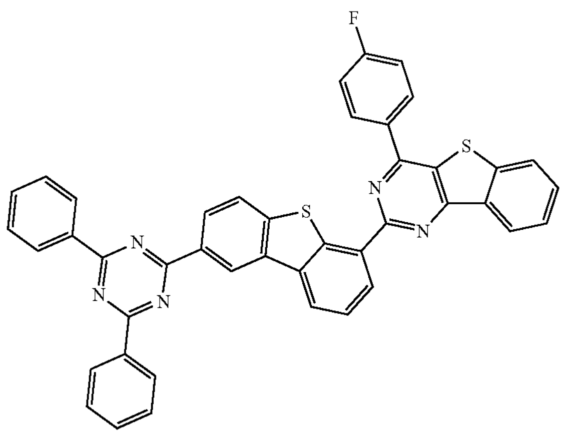
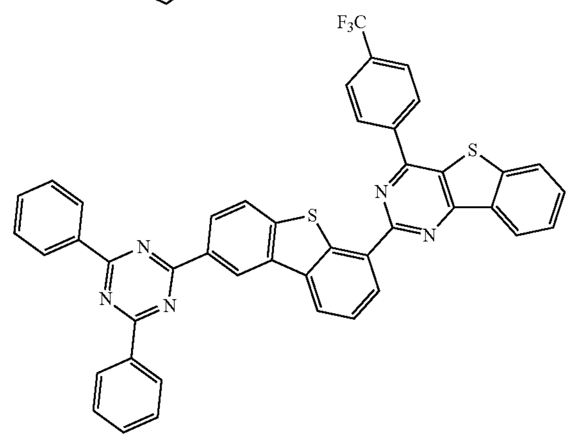
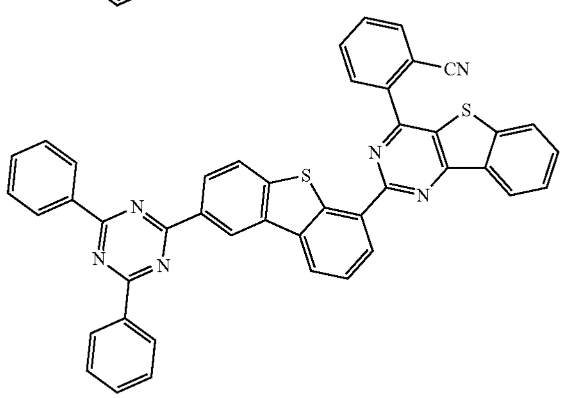
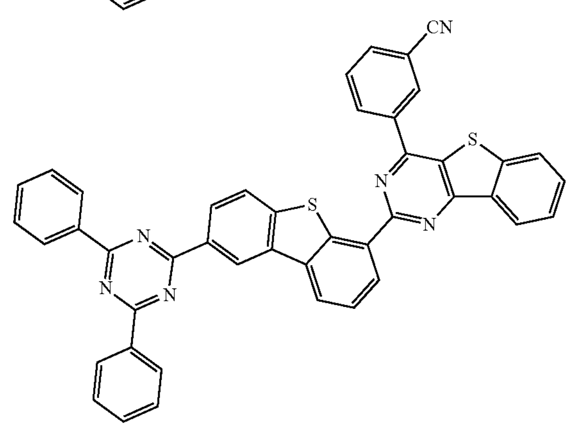
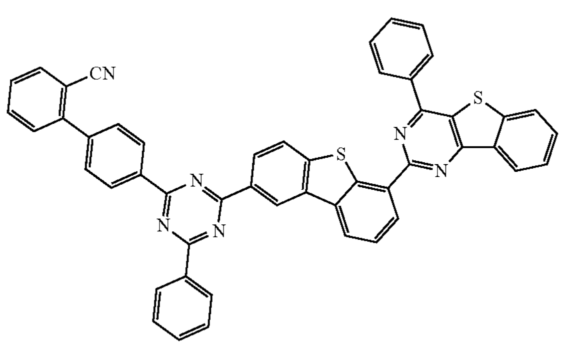
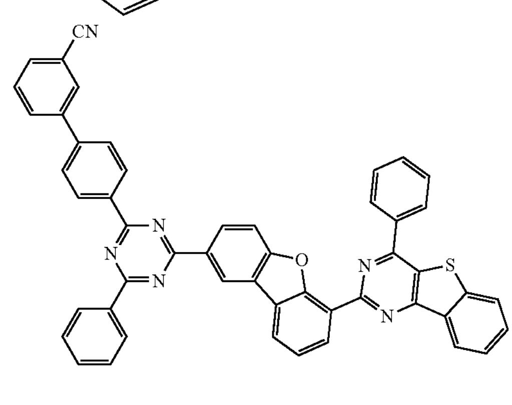

-continued
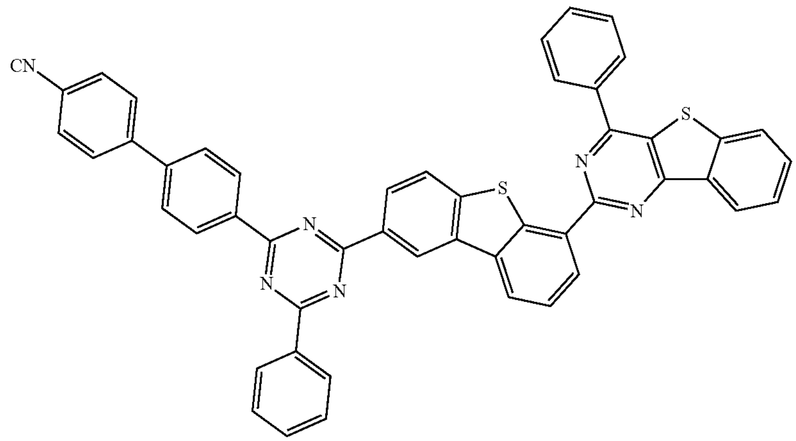
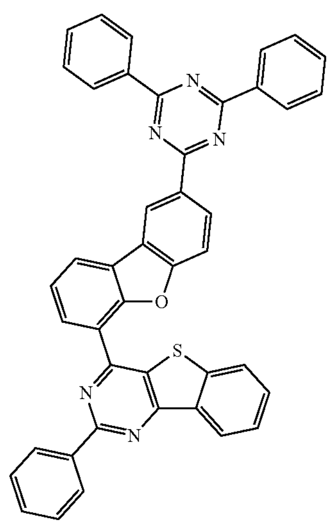
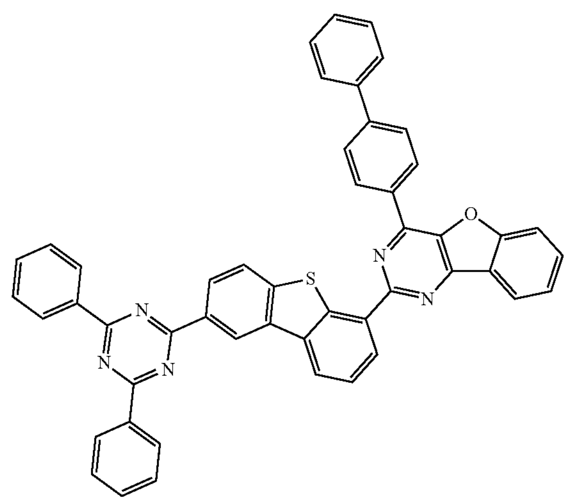
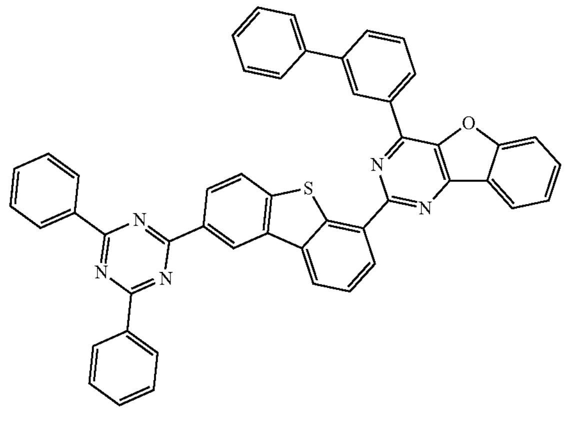
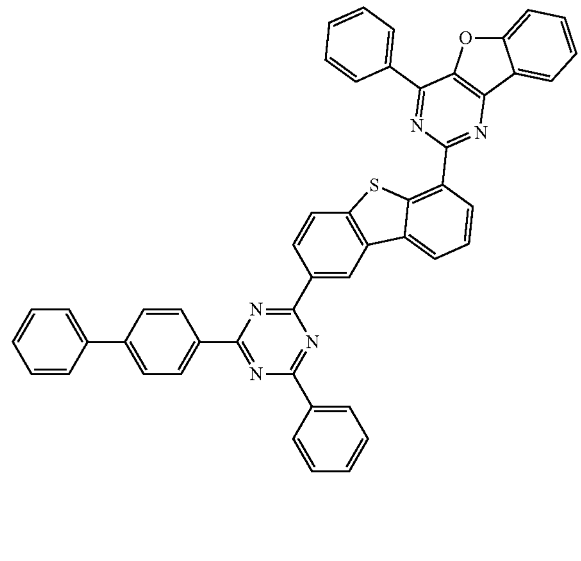

-continued
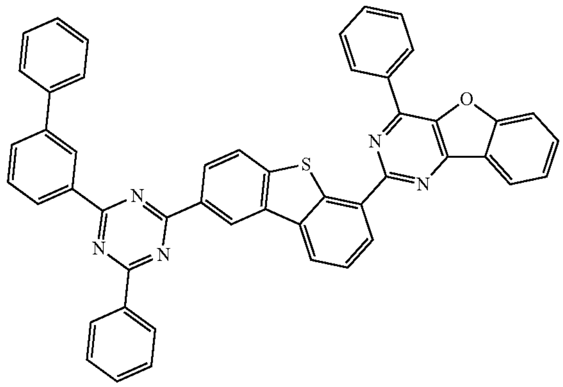
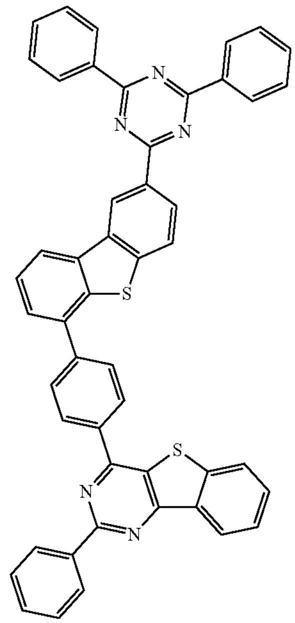
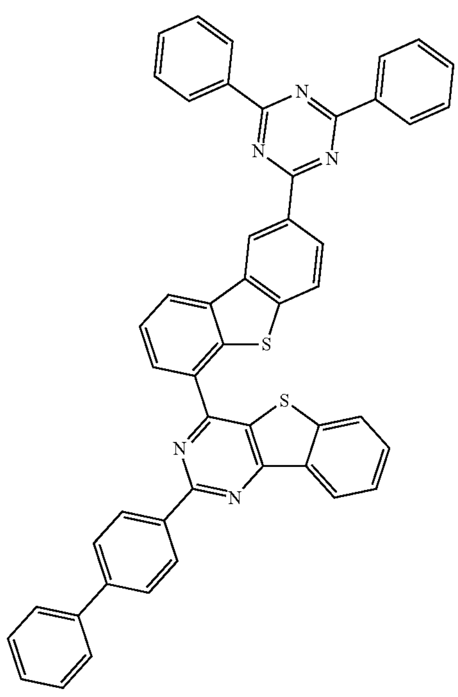
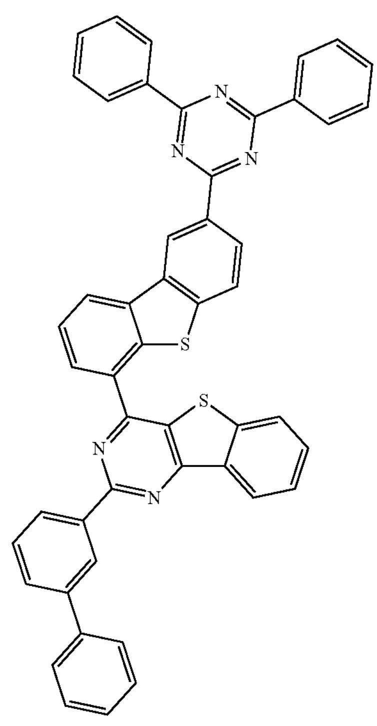

-continued
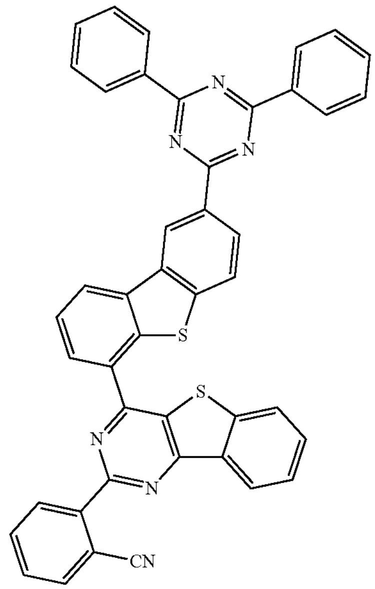
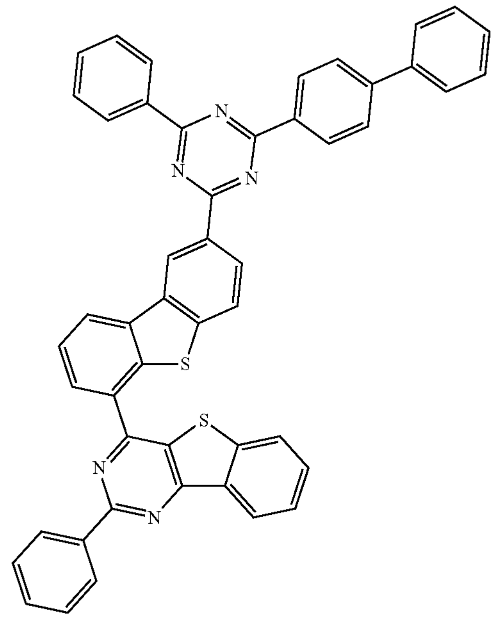
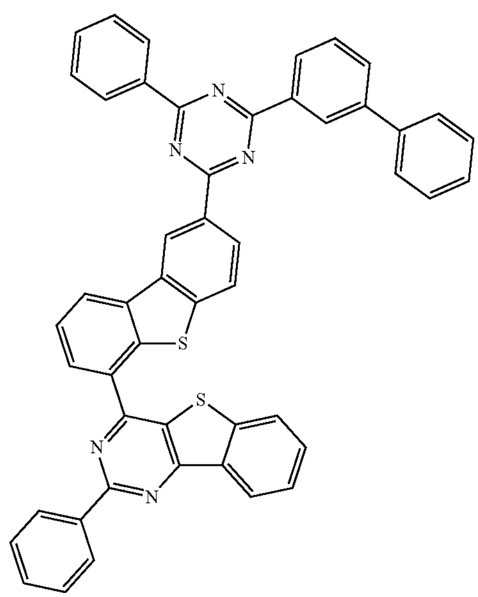
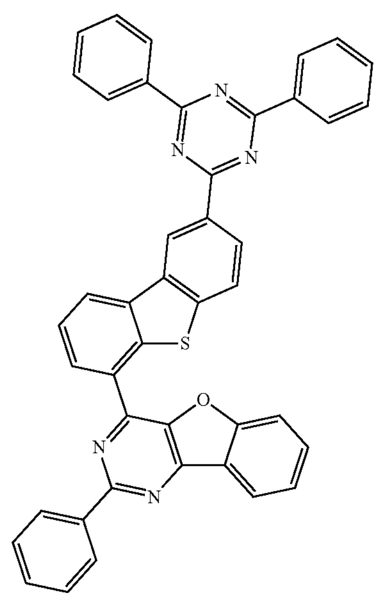
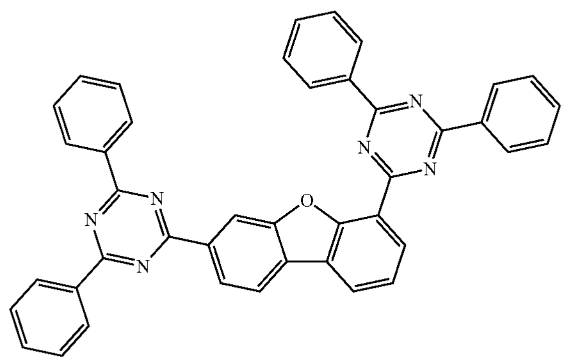
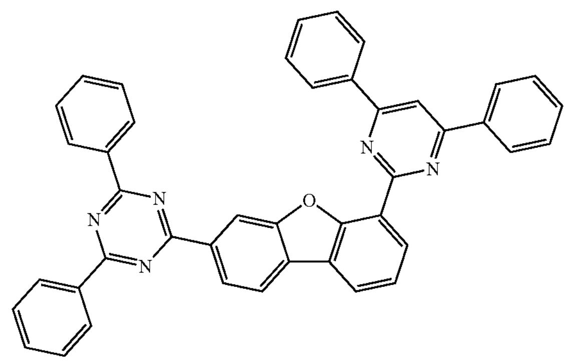

-continued
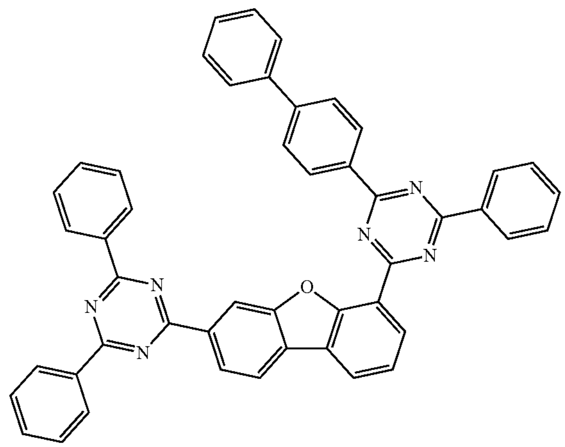
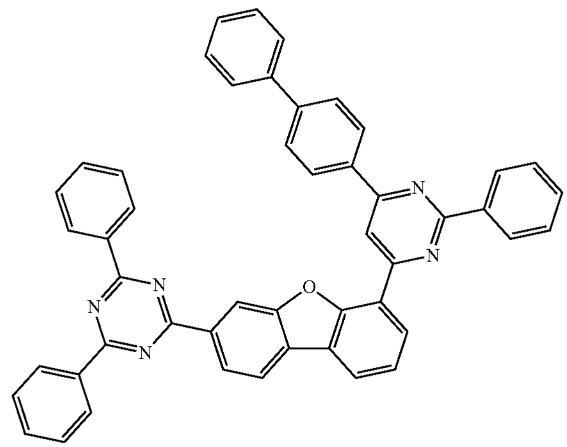
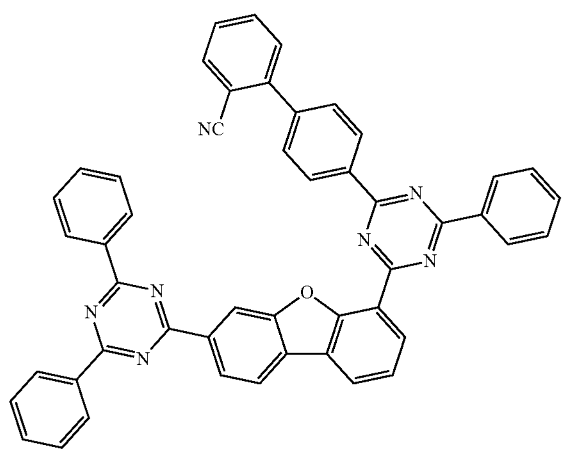
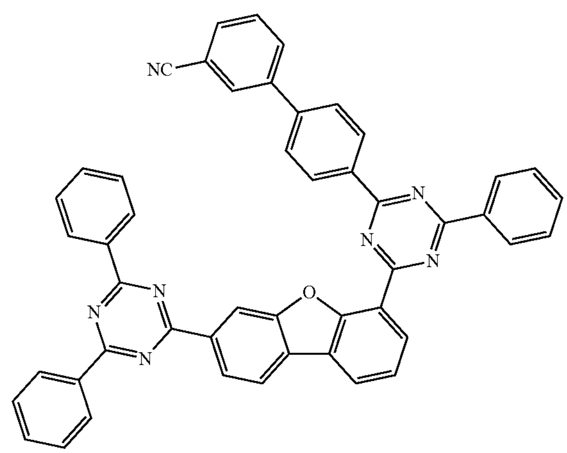
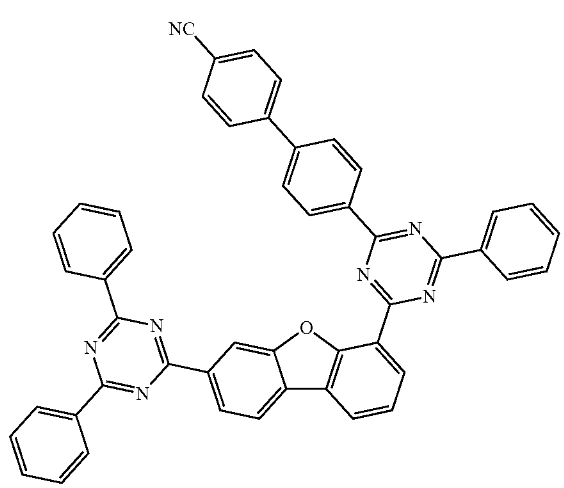
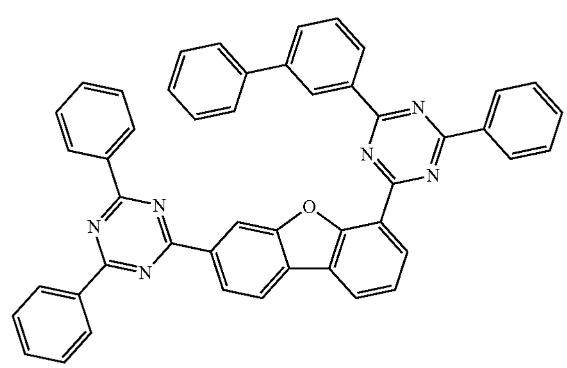

-continued
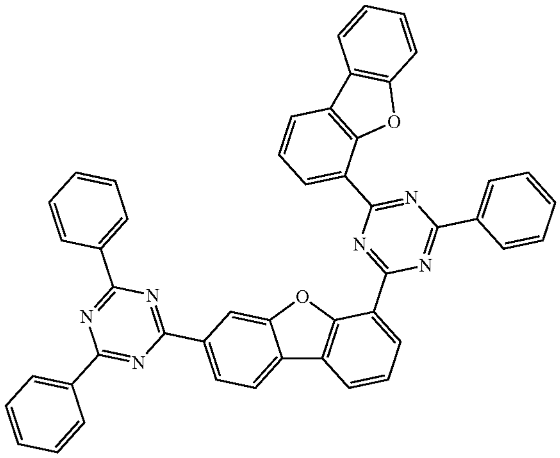
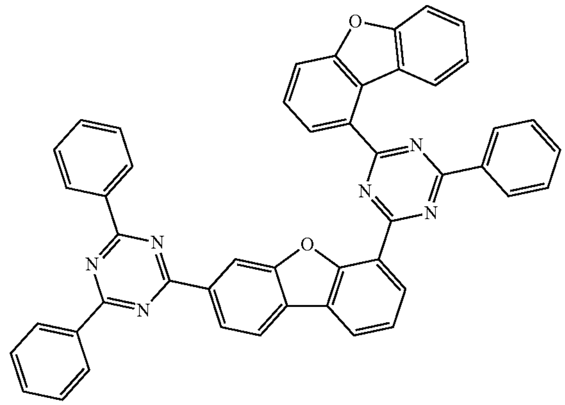
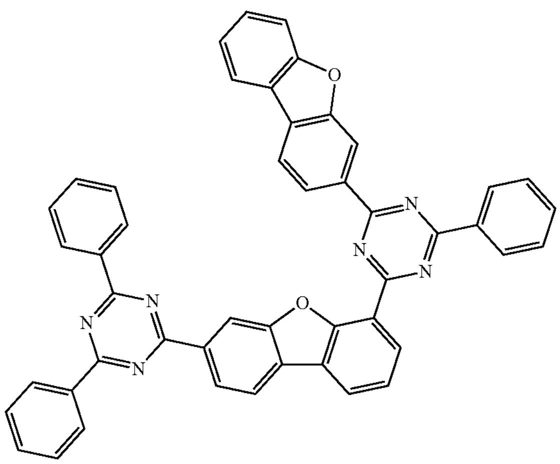
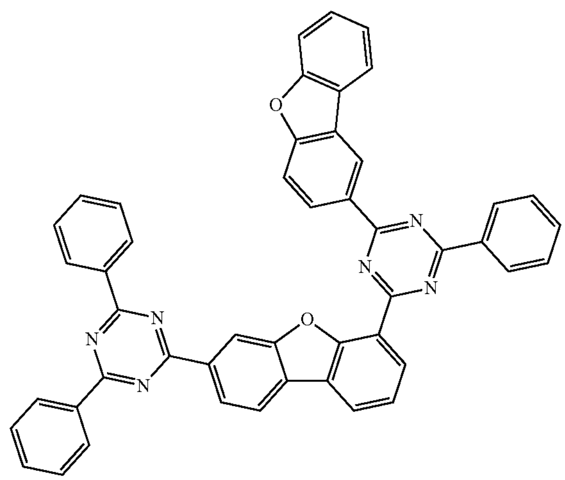
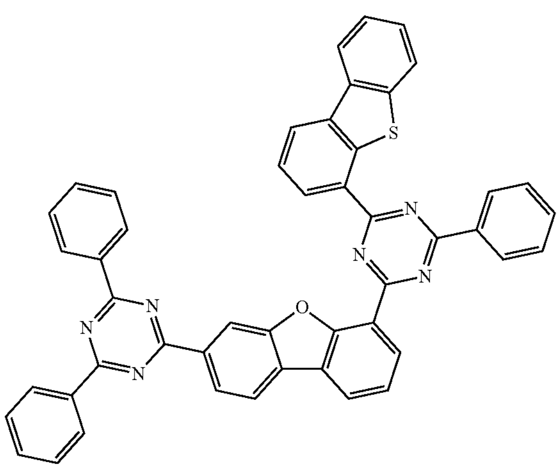
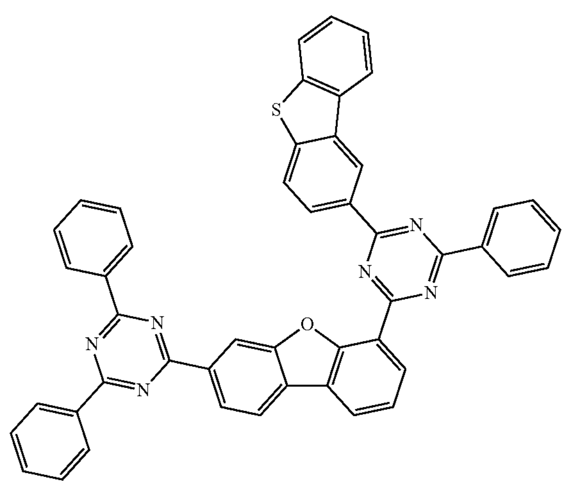

-continued
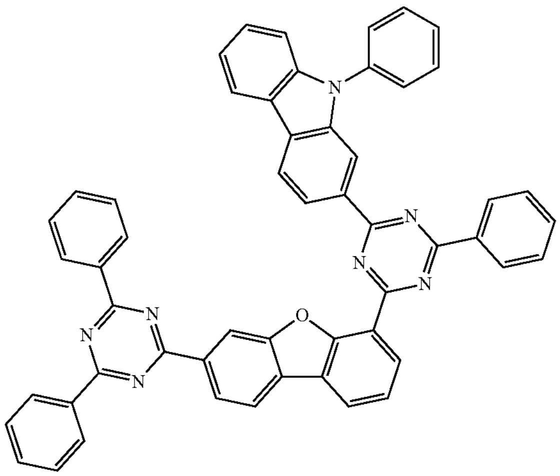
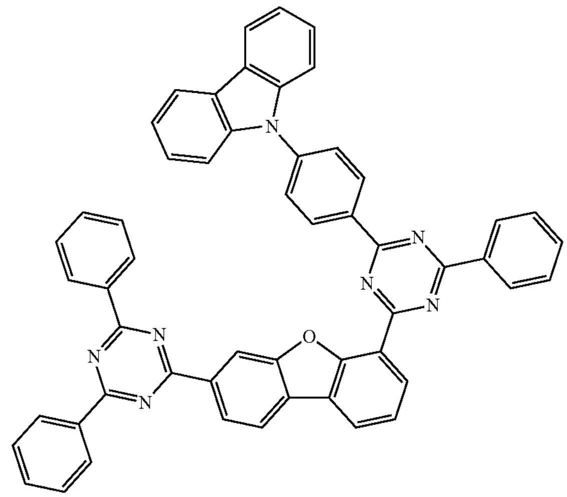
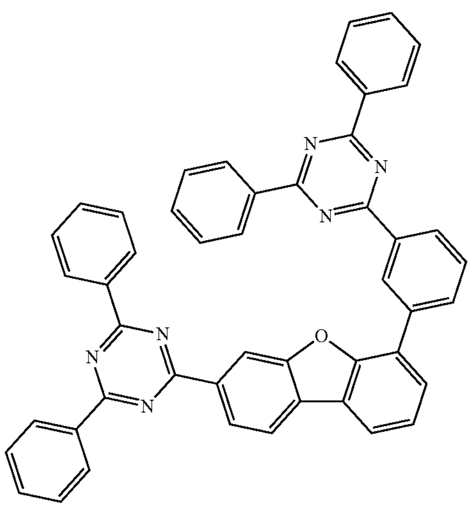
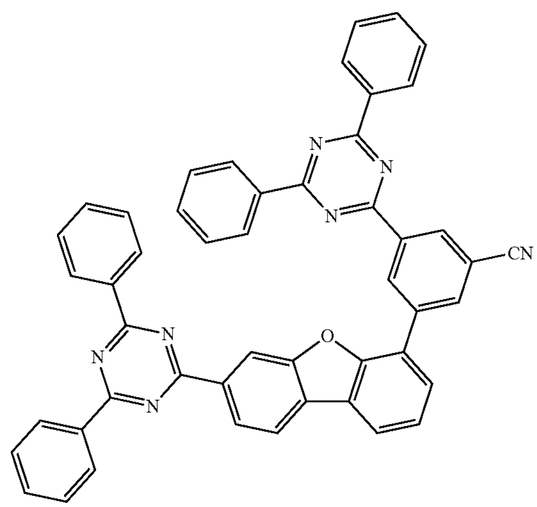
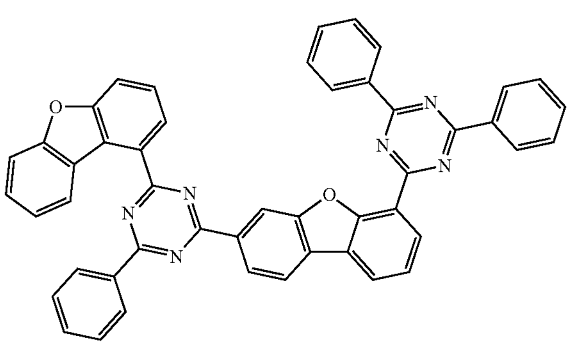
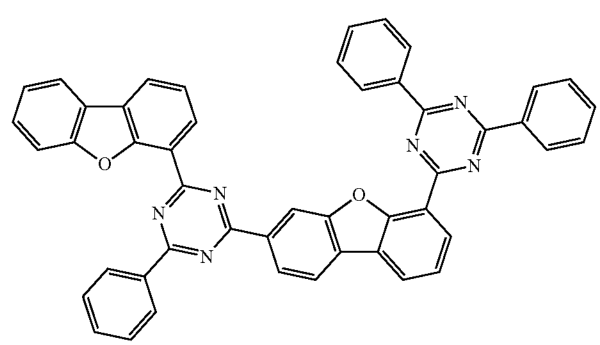

-continued
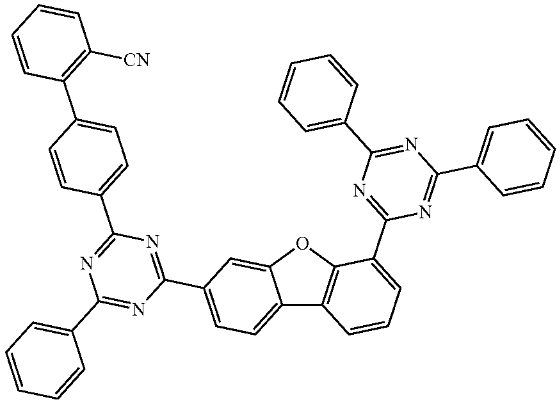
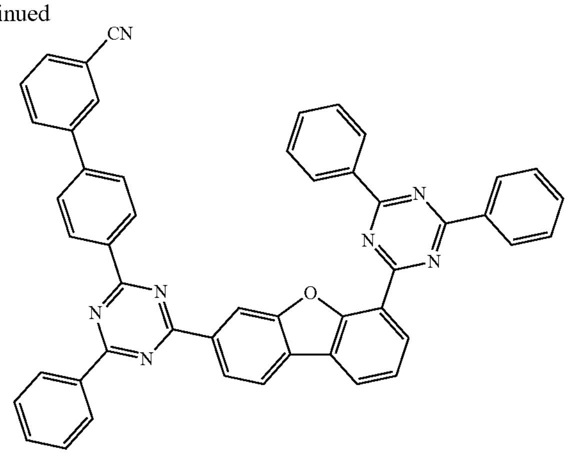
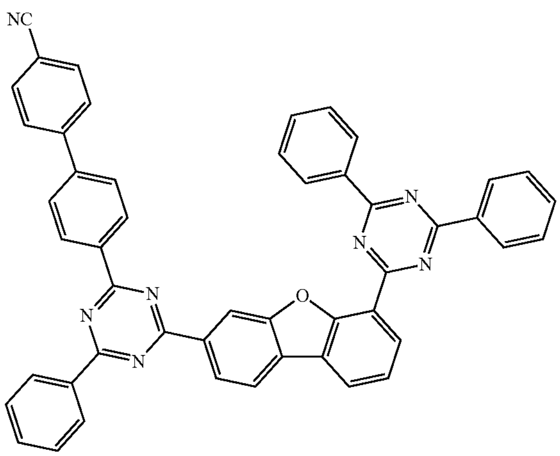
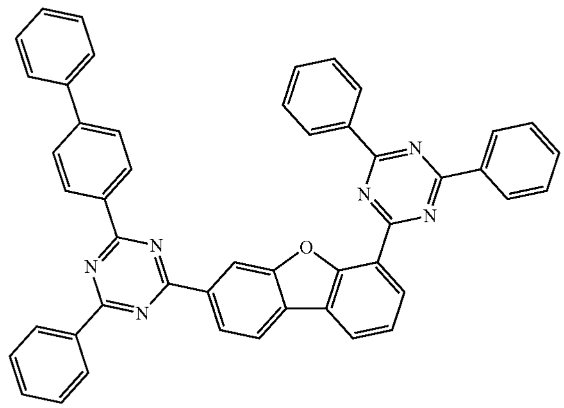
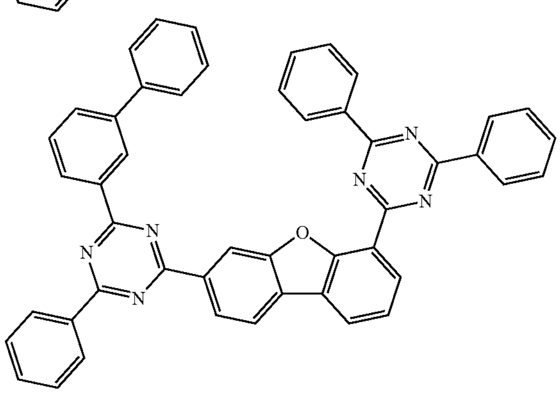
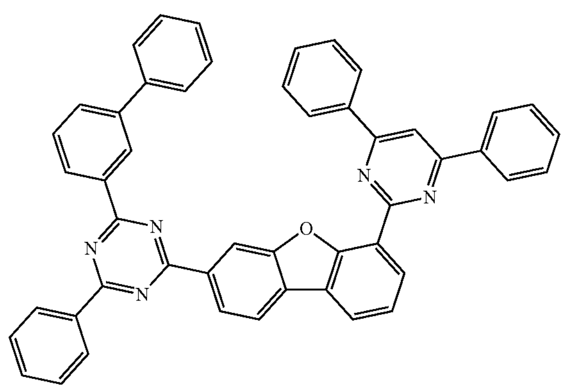
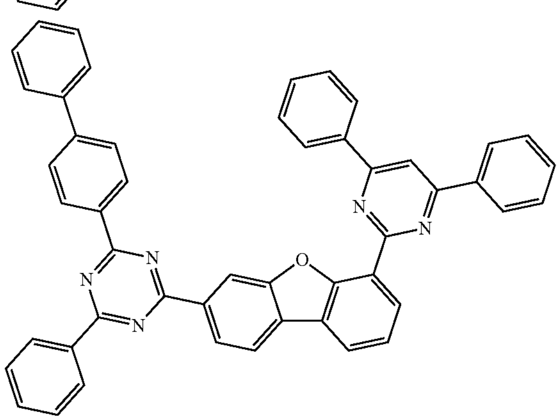
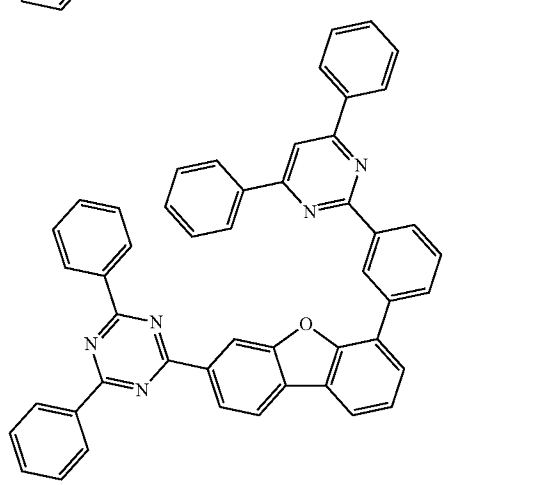

-continued
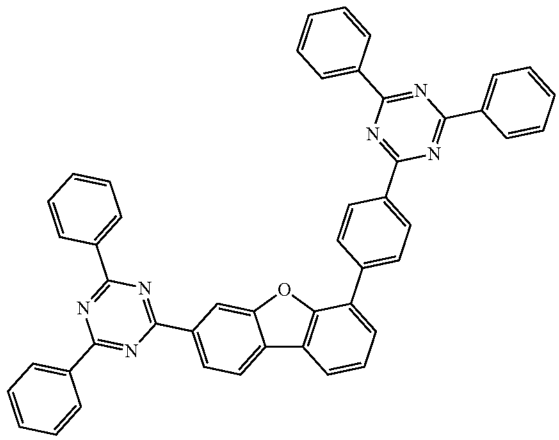
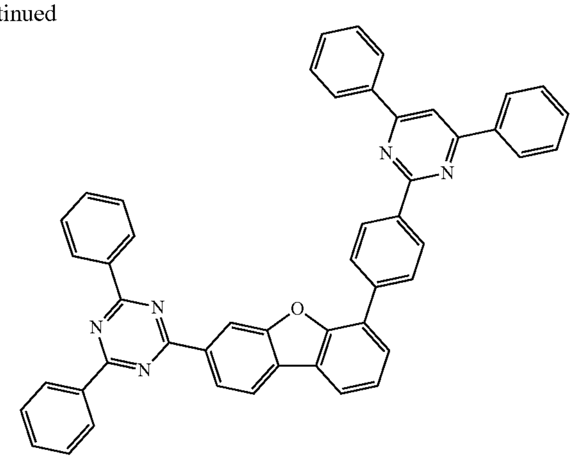
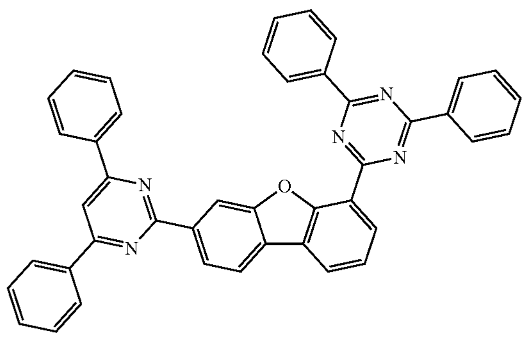
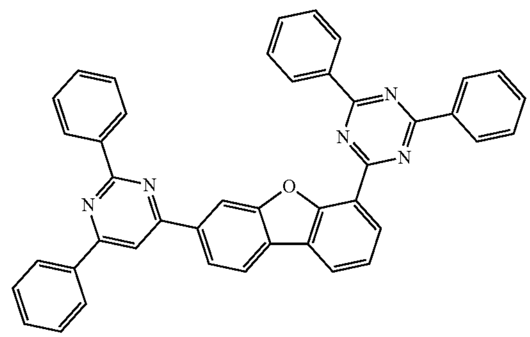
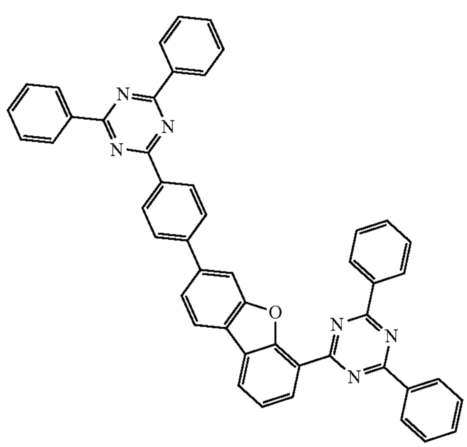
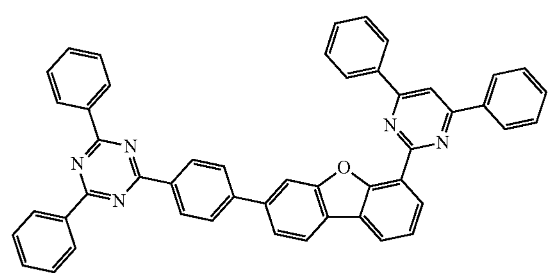
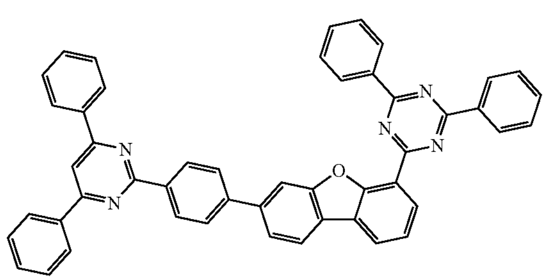
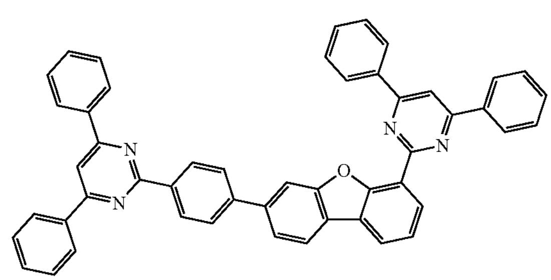

-continued
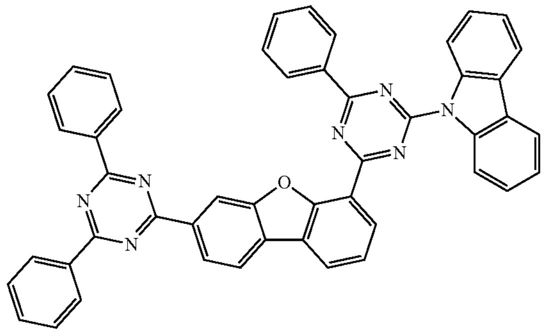
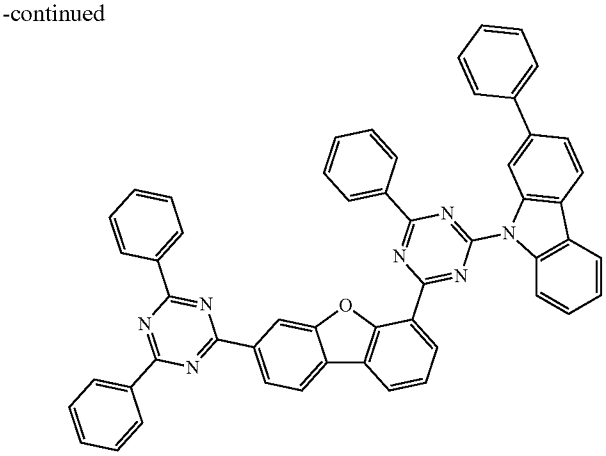
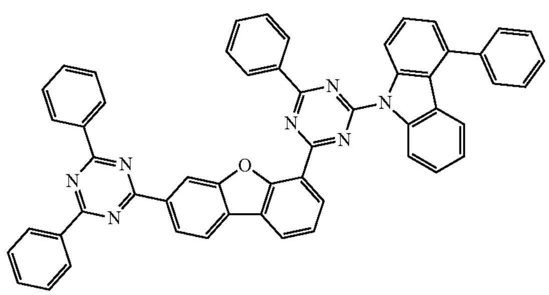
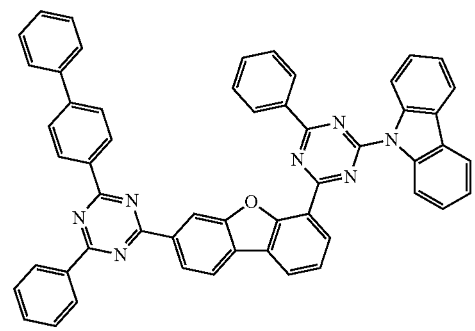
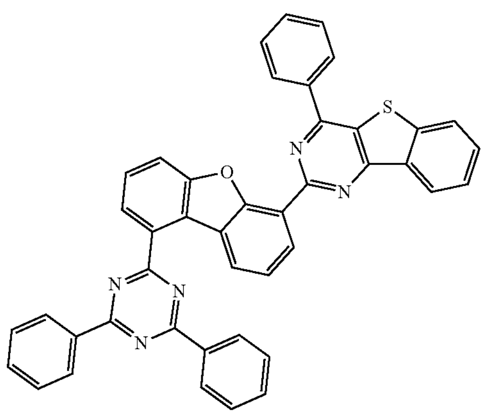
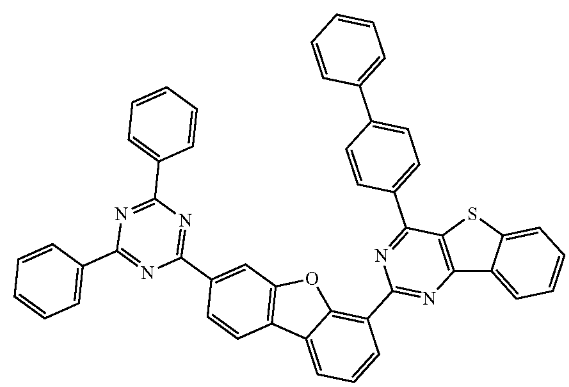
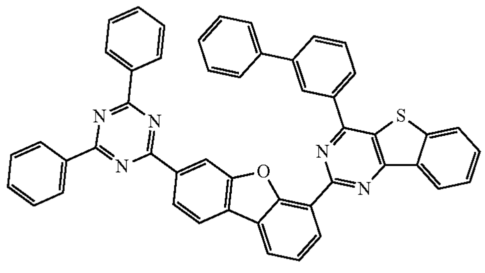
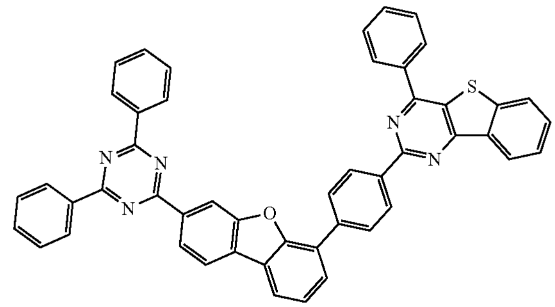

-continued
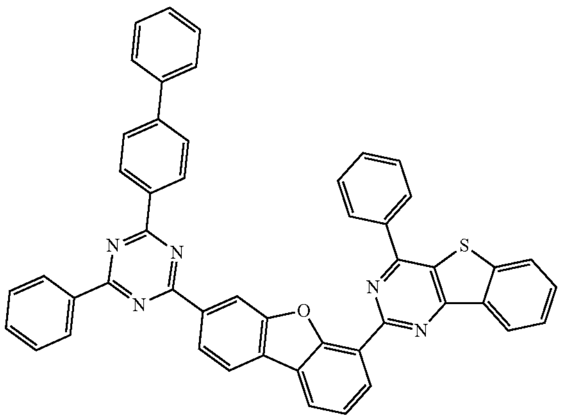
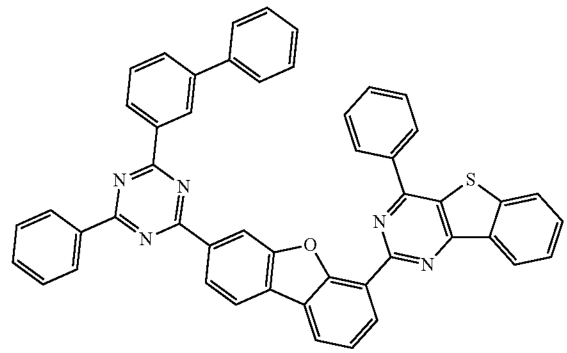
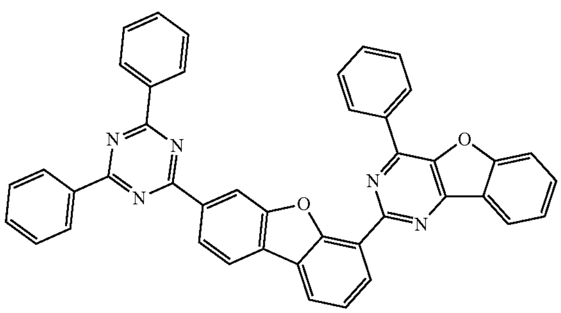
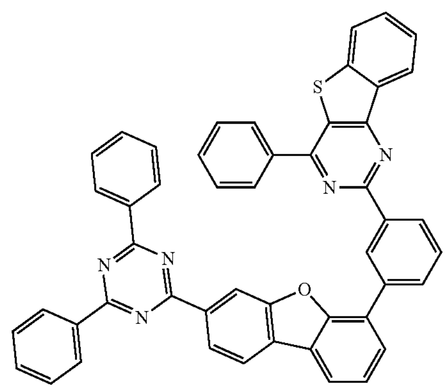
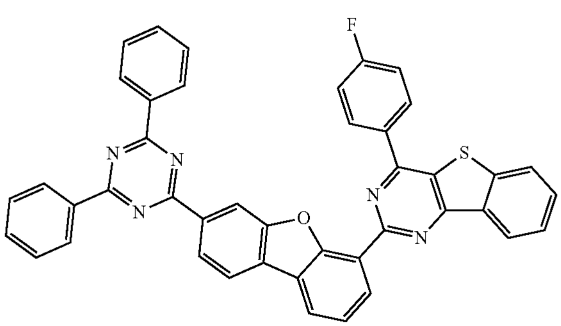
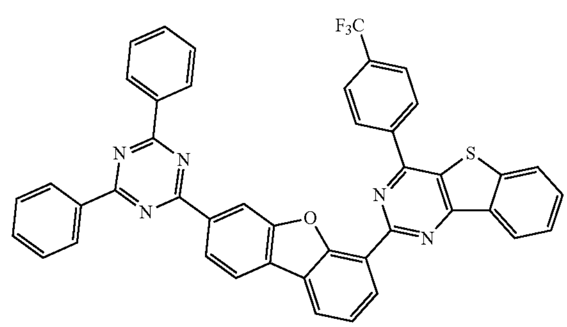
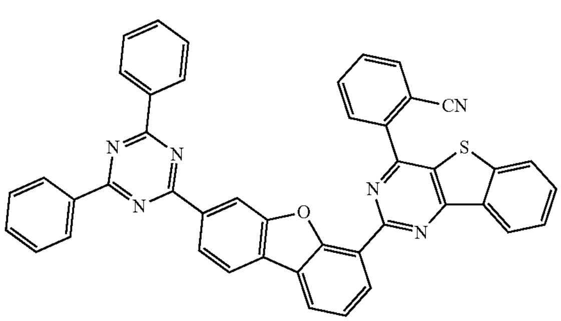
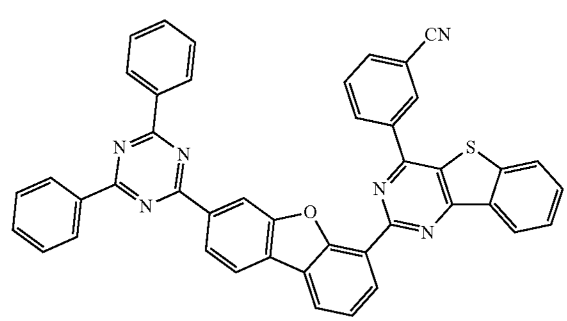

-continued
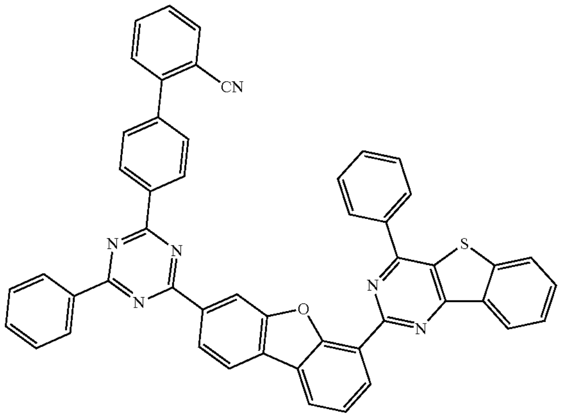
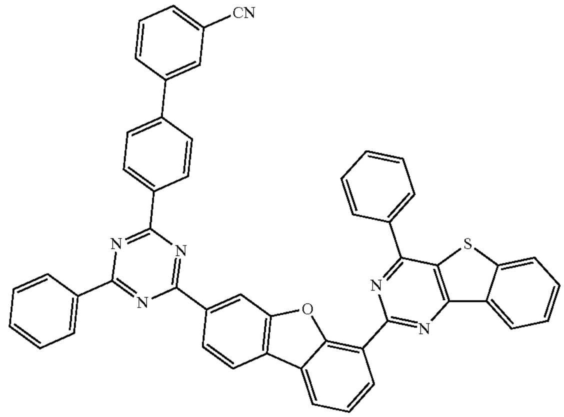
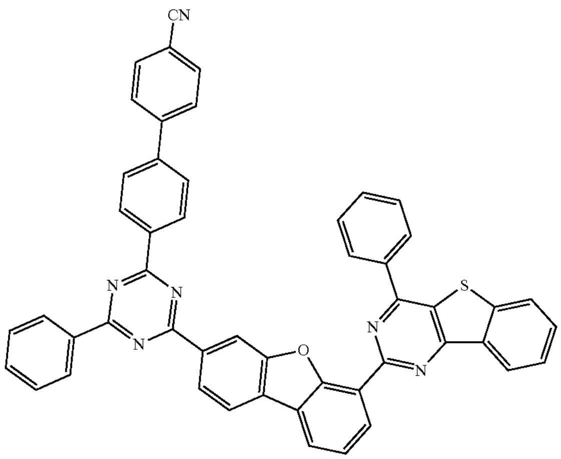
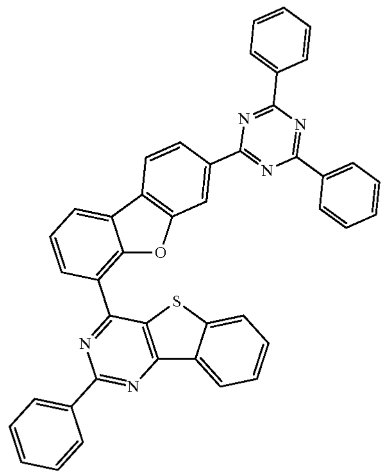
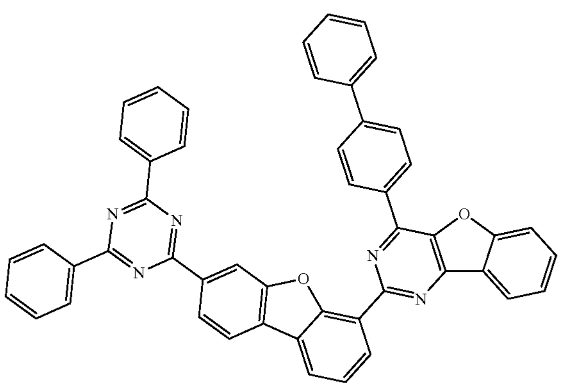
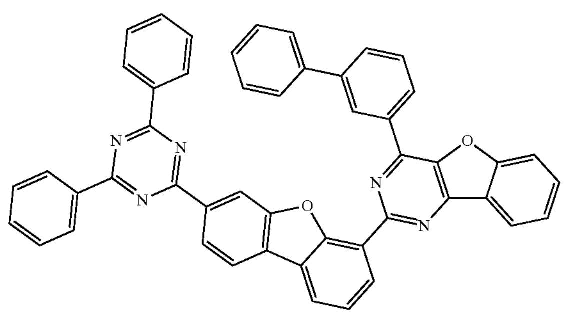
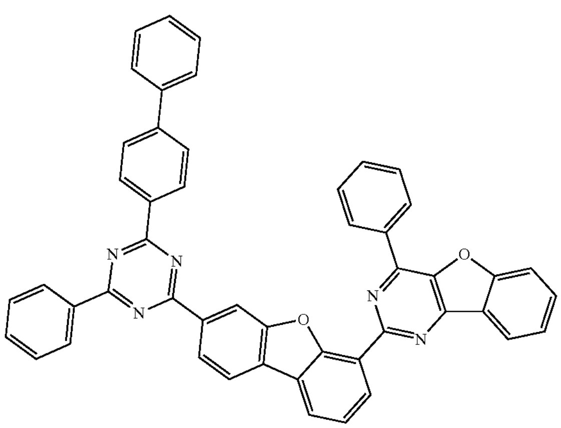
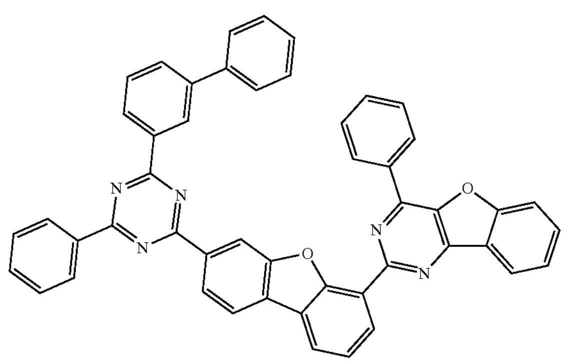

-continued
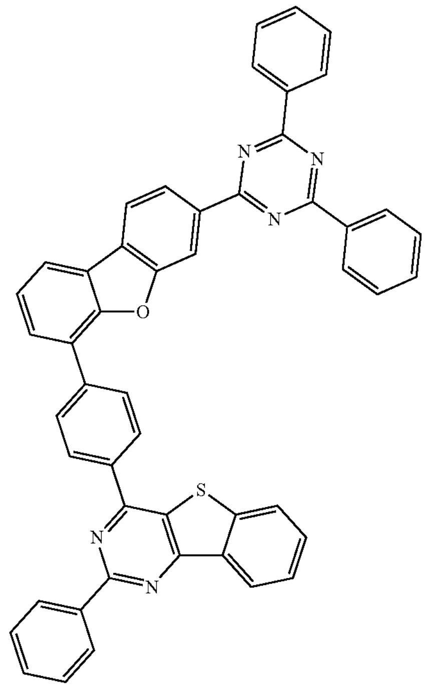
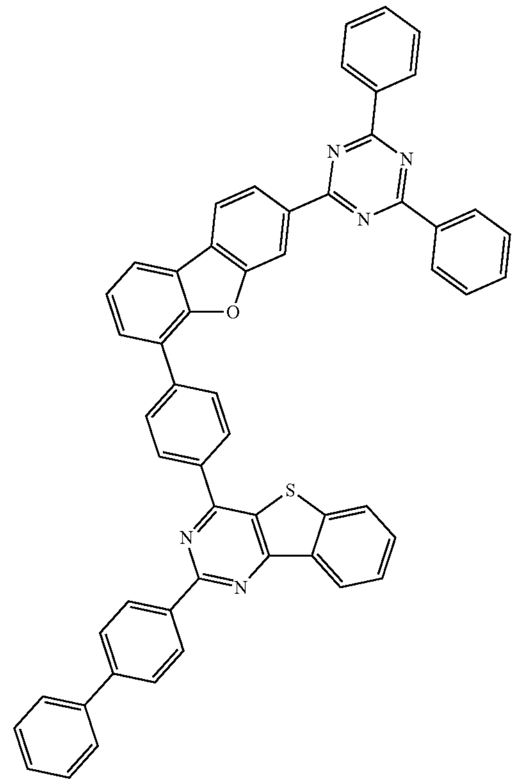
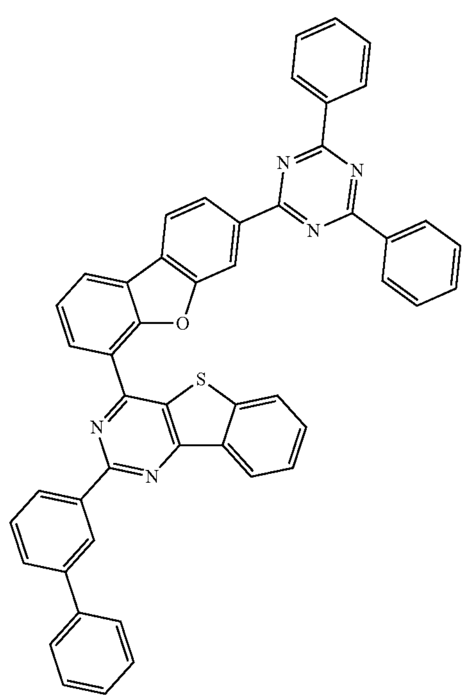
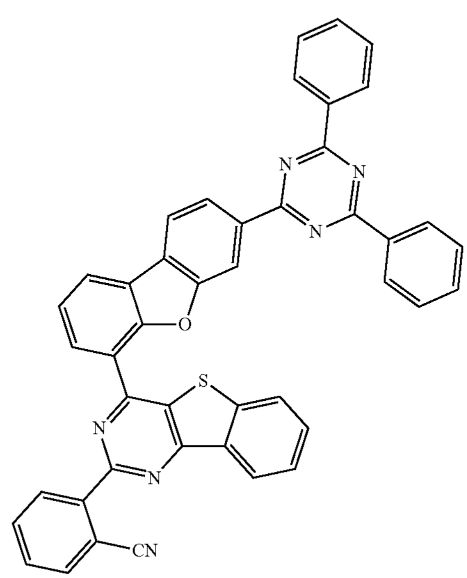

-continued
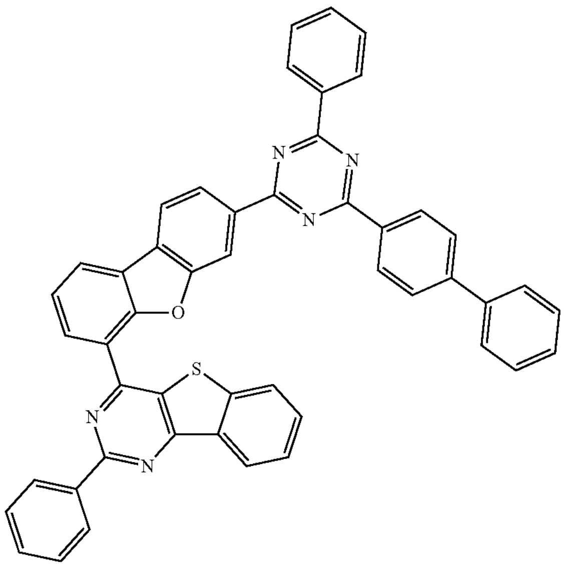
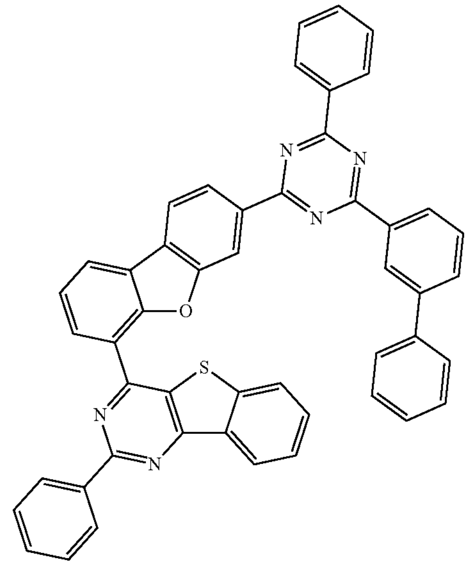
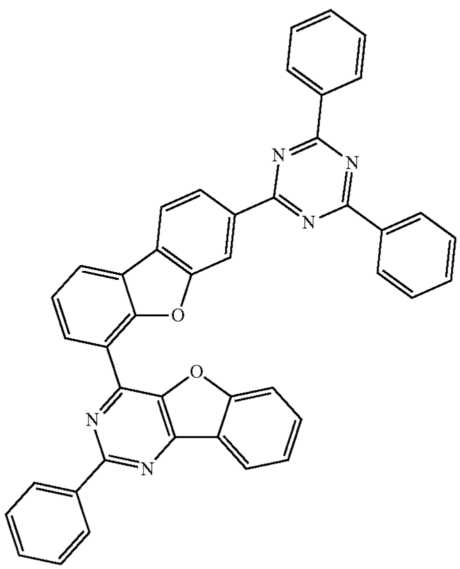
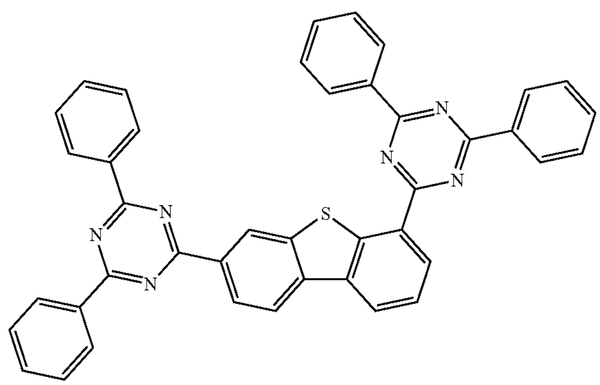
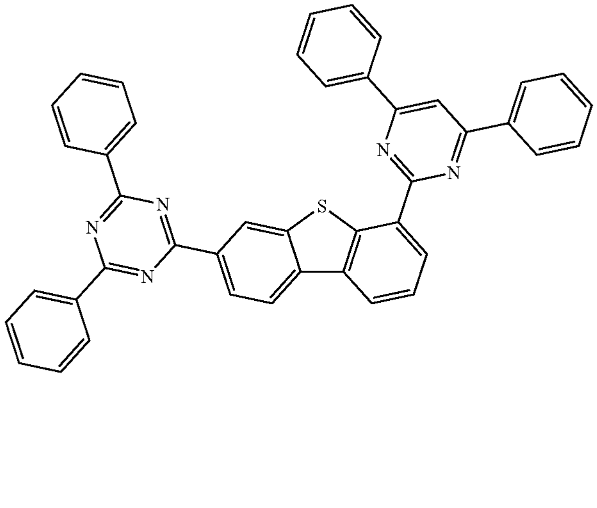

-continued
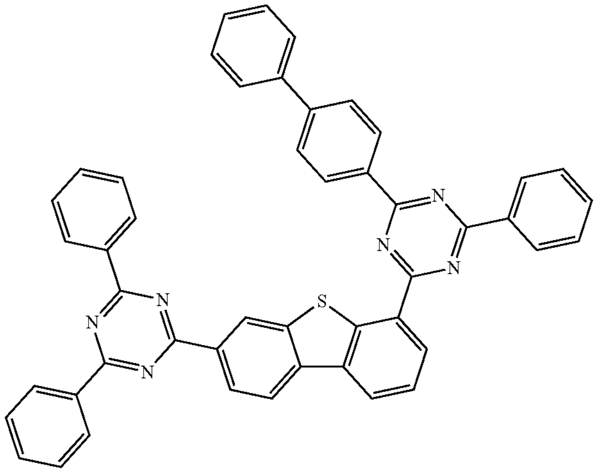
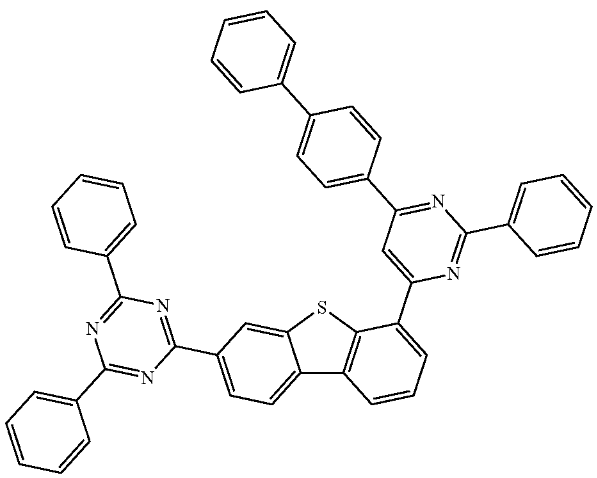
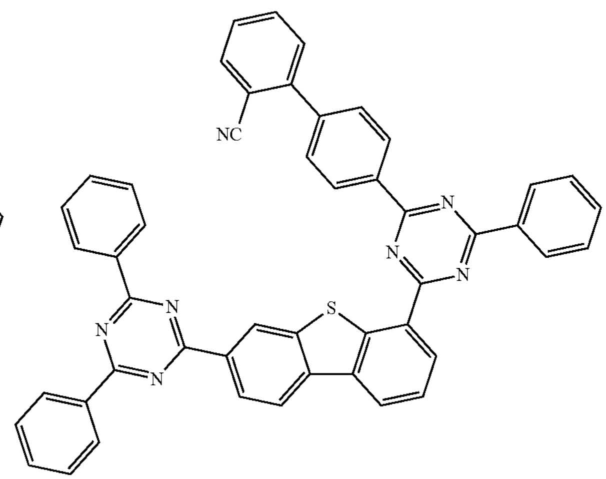
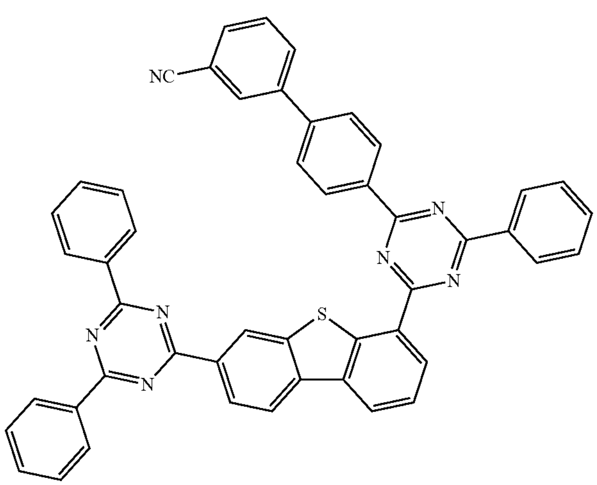

-continued
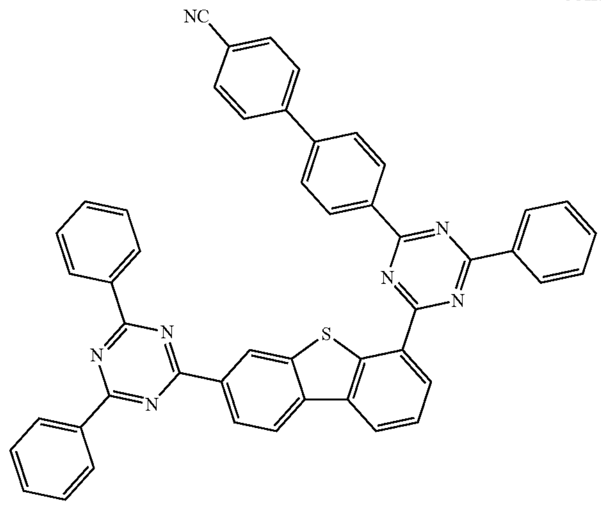
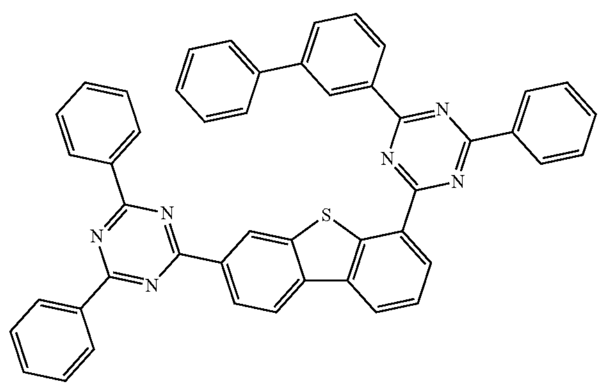
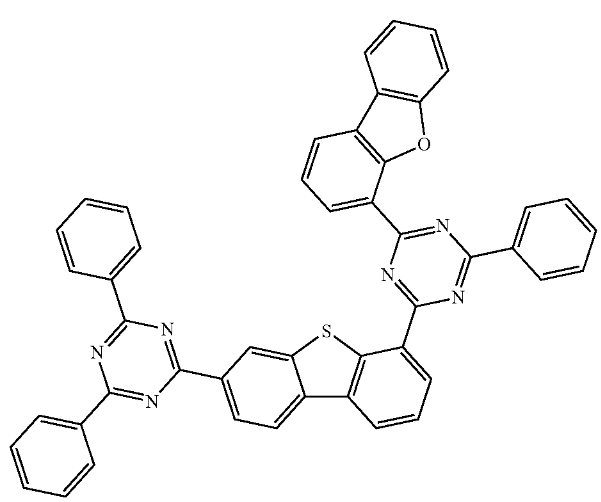

-continued
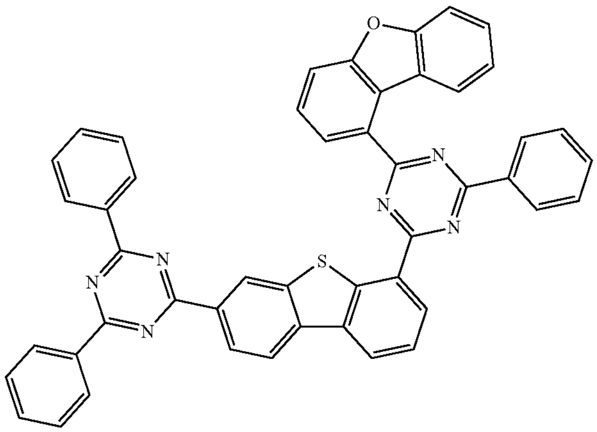
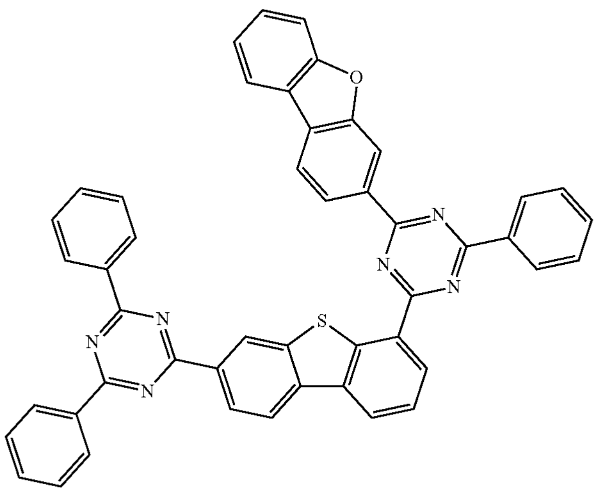
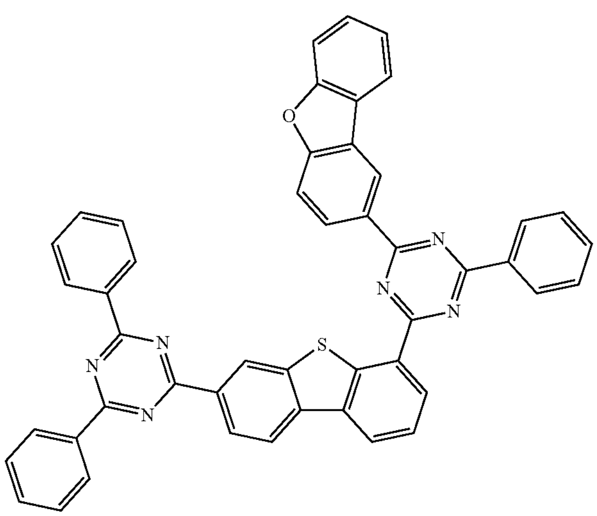

-continued
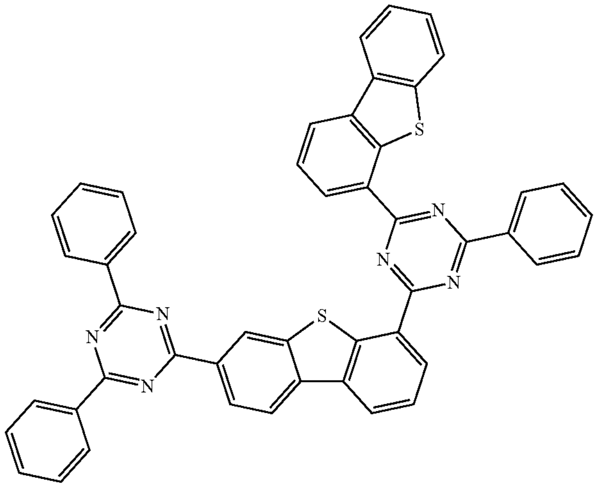
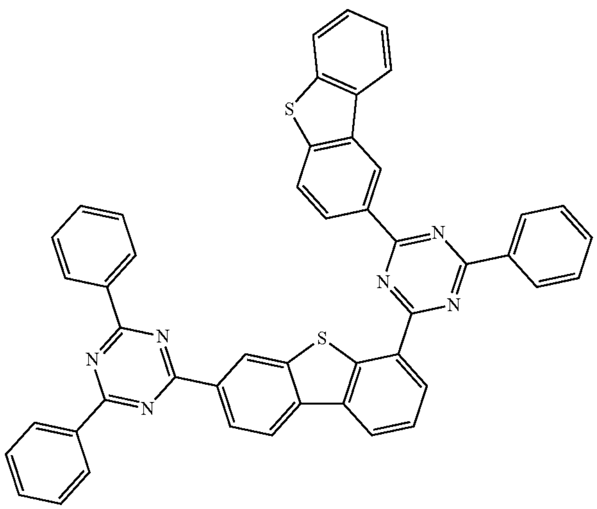
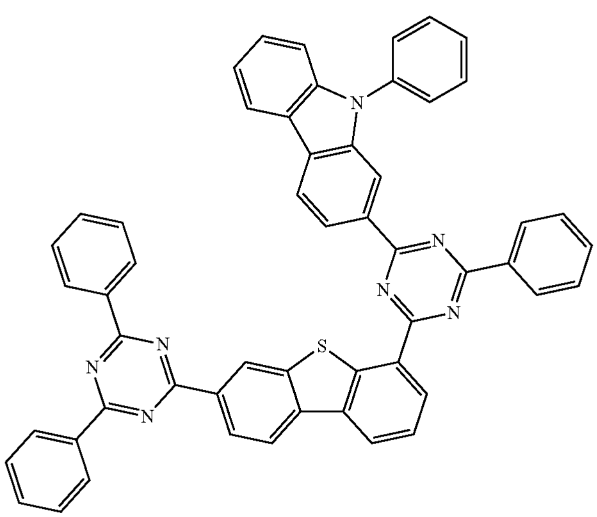

-continued
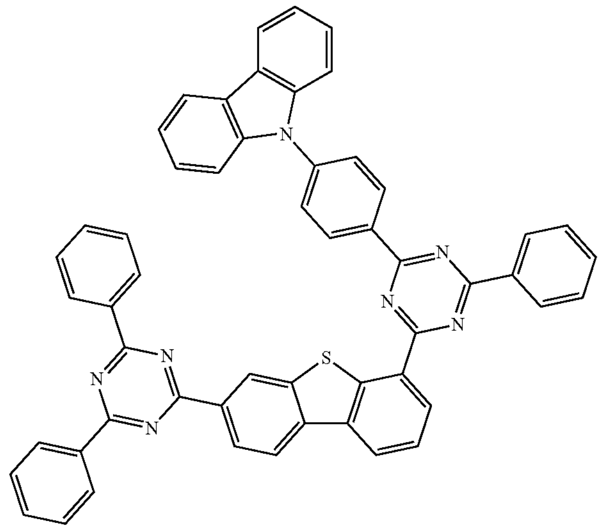
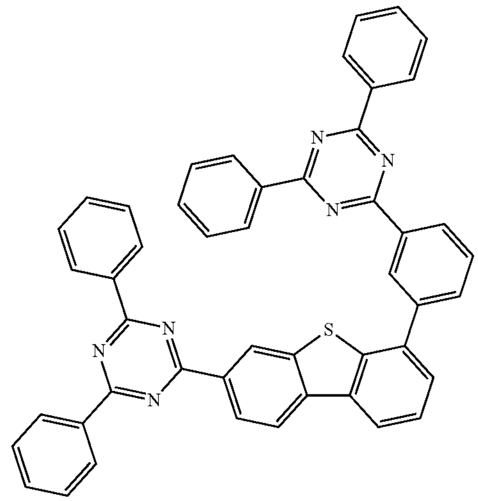
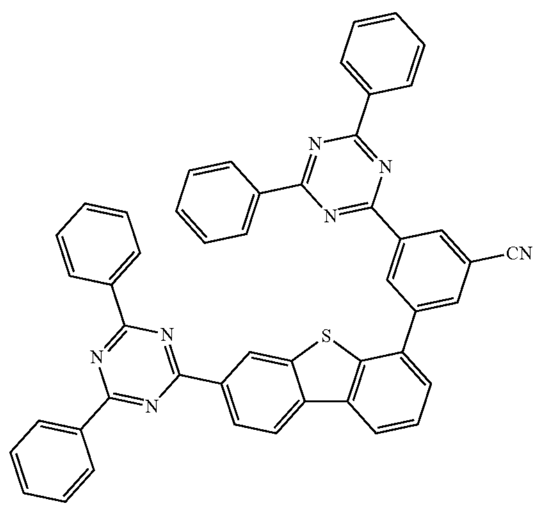
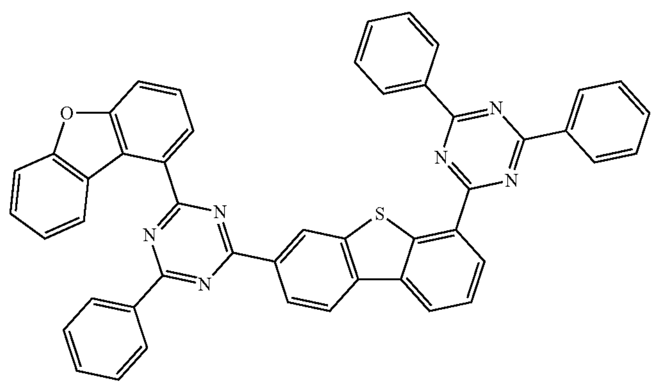
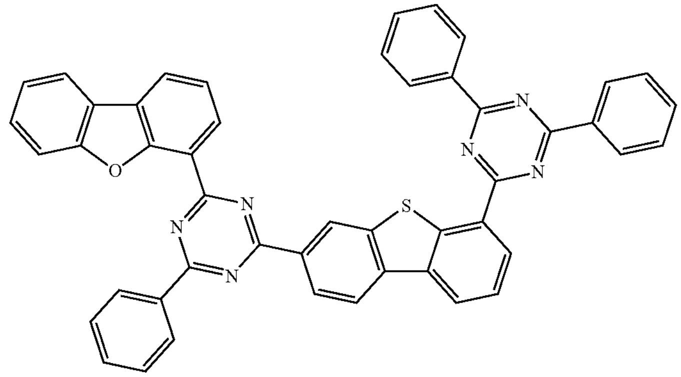

-continued
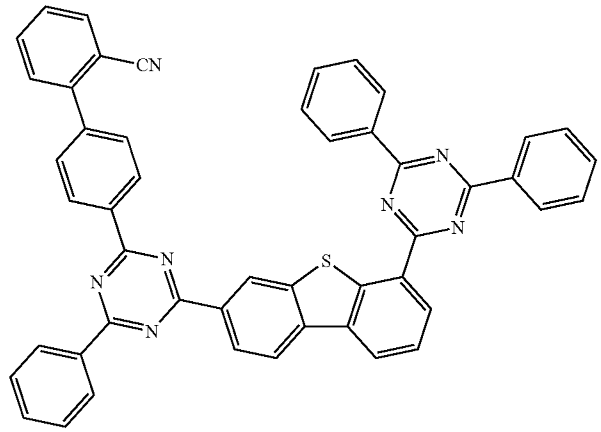
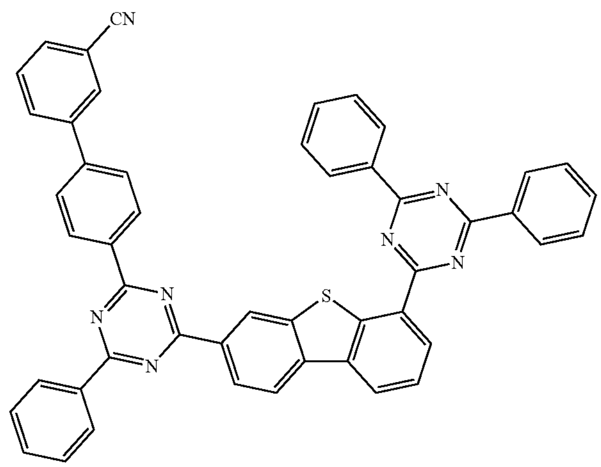
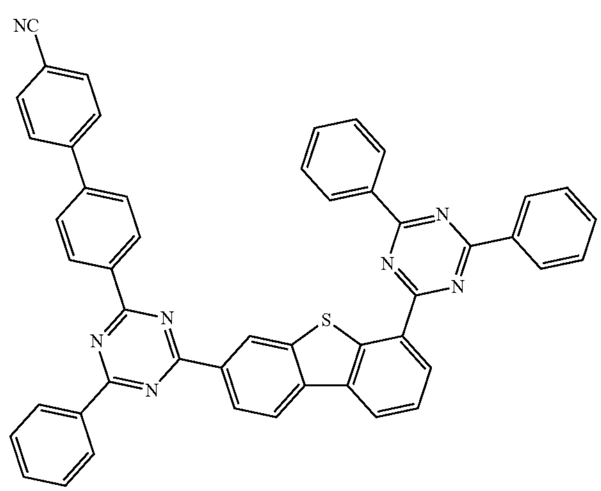

-continued
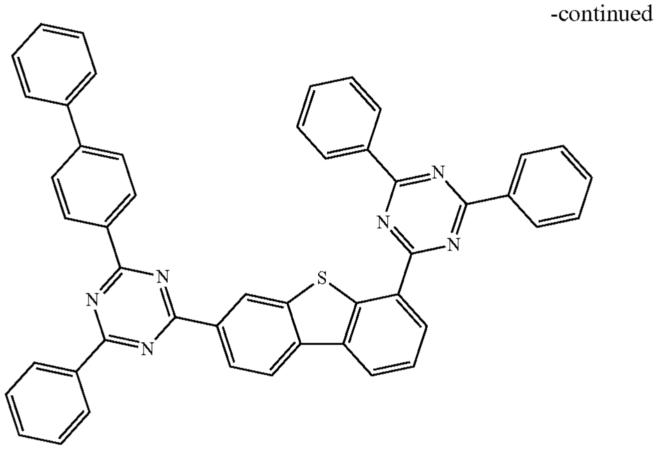
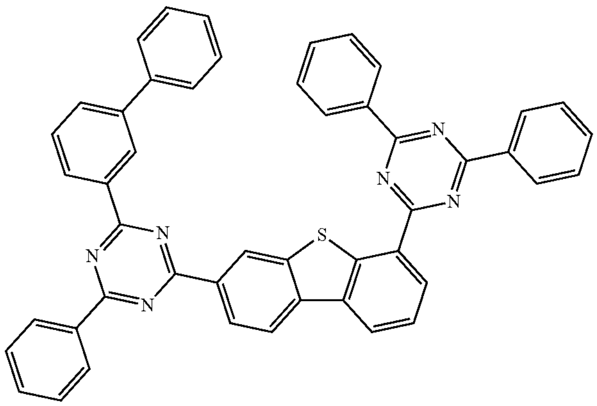
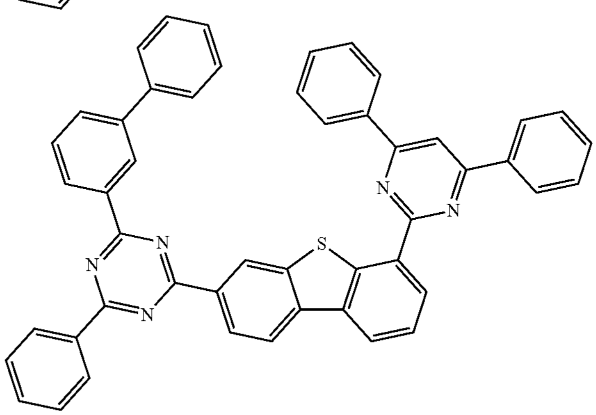
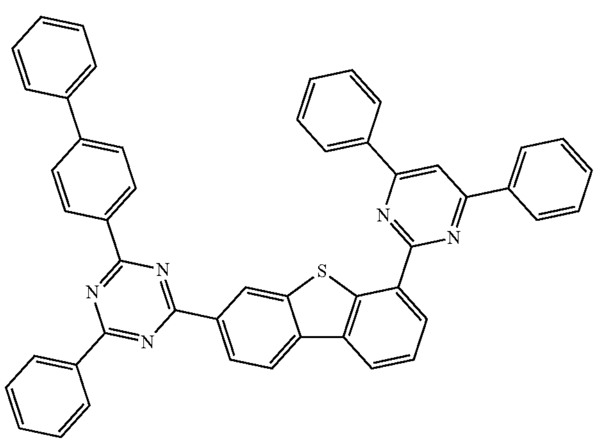
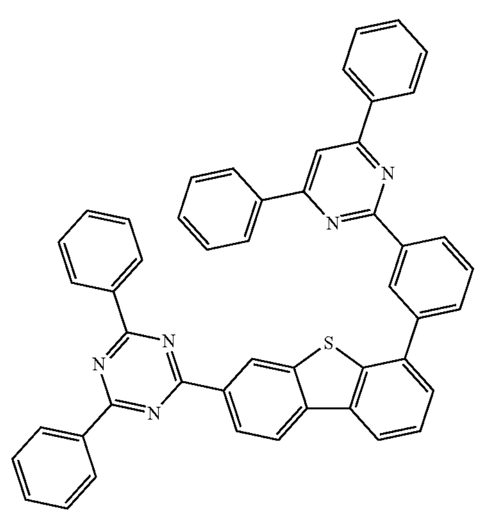

-continued
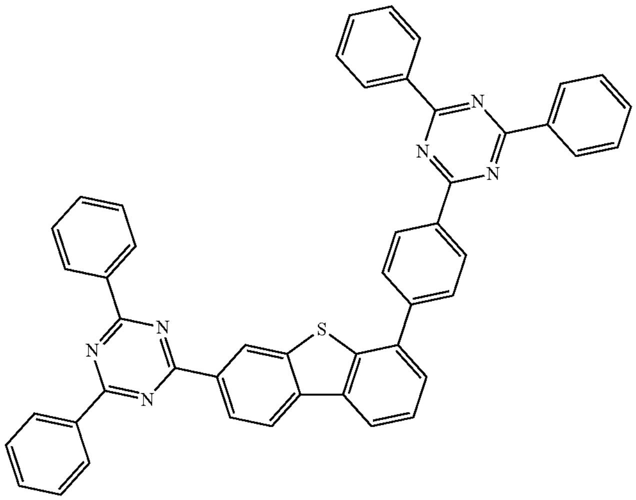
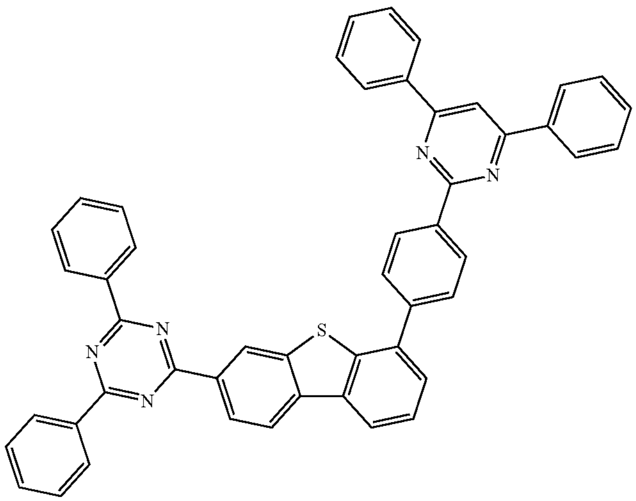
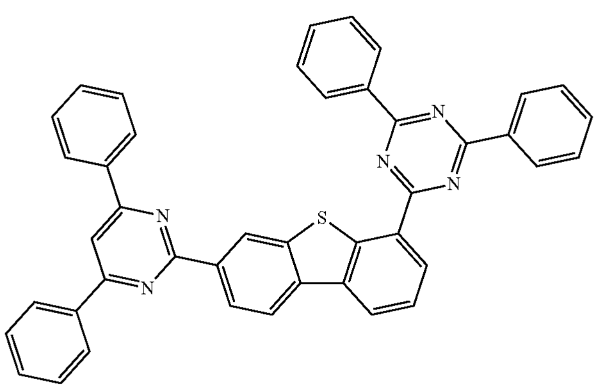
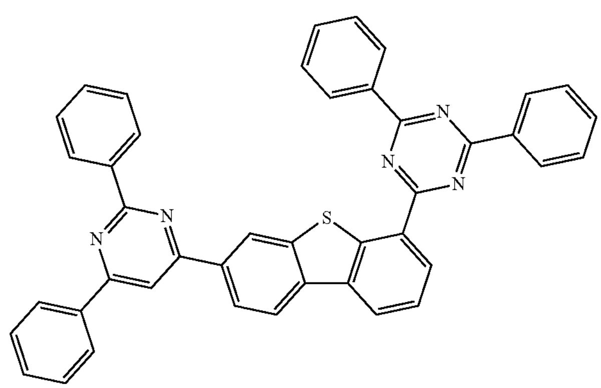

-continued
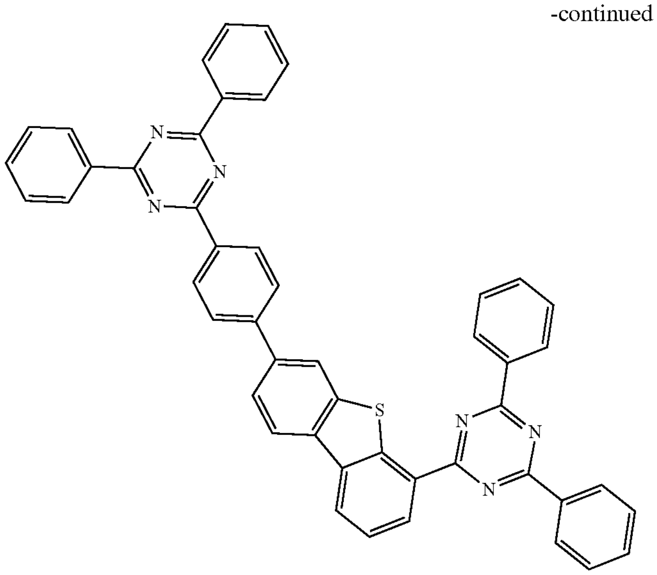
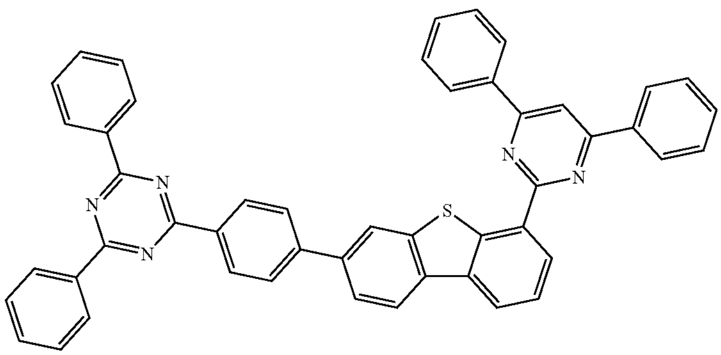
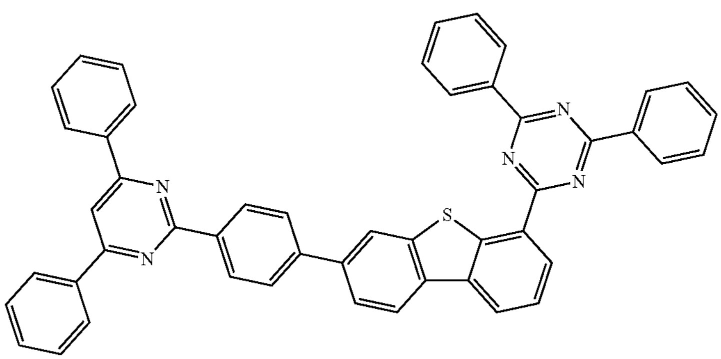
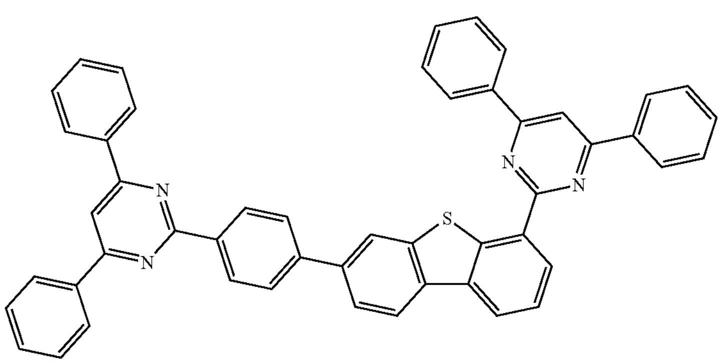

-continued
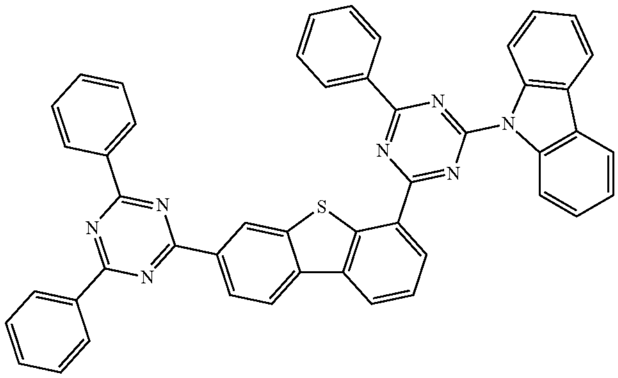
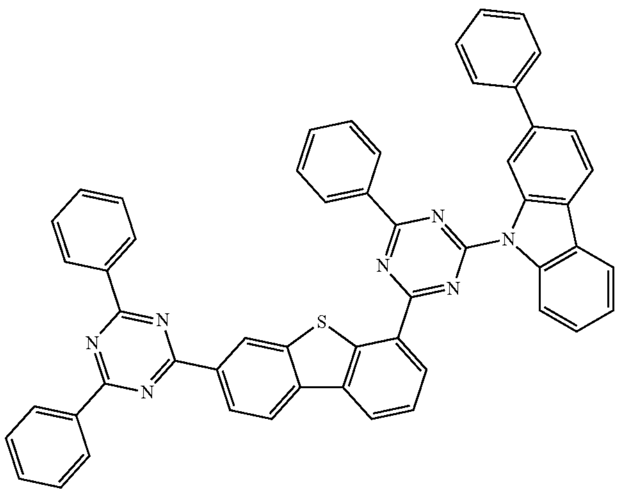
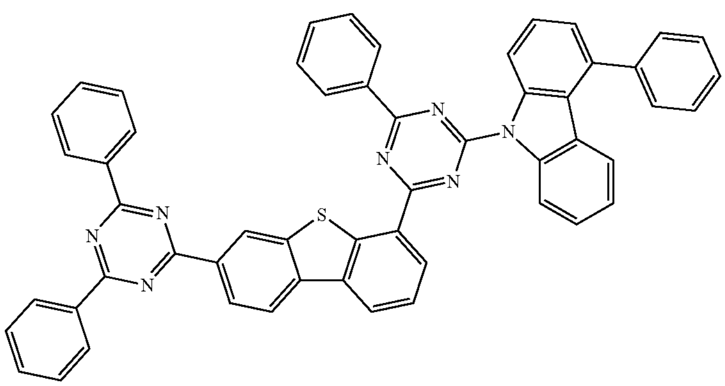
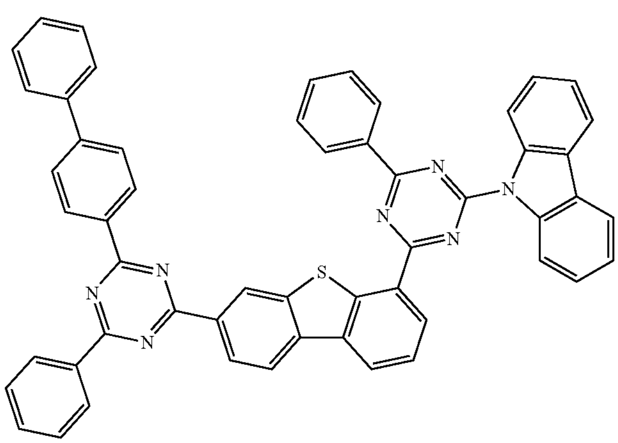
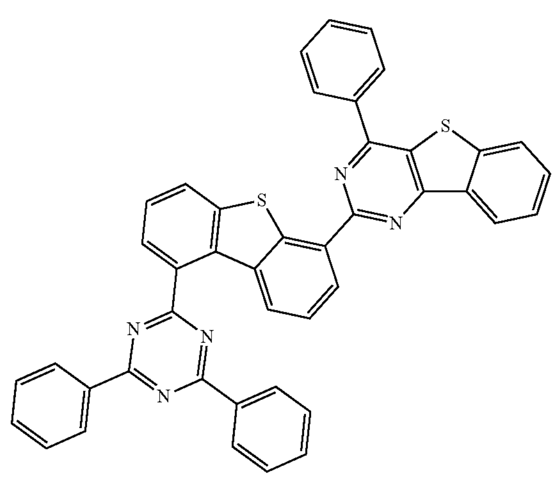

-continued
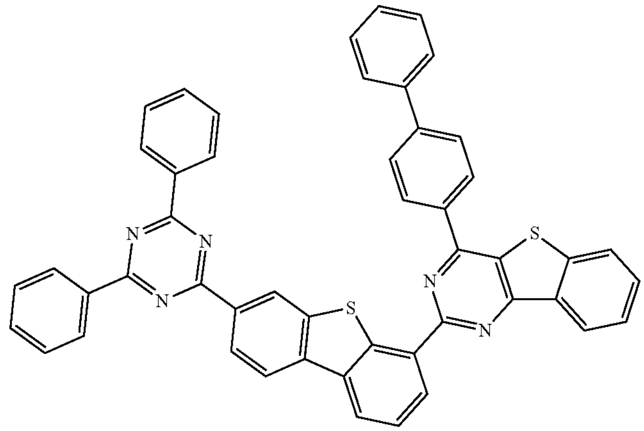
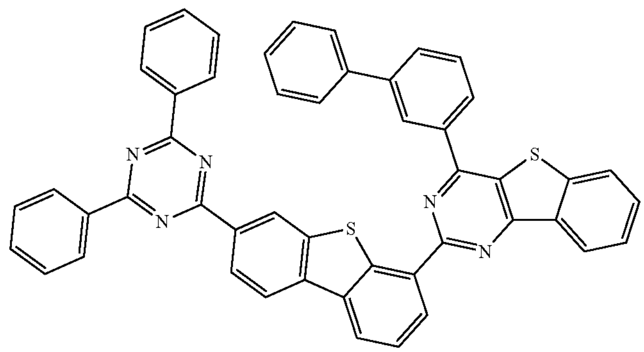
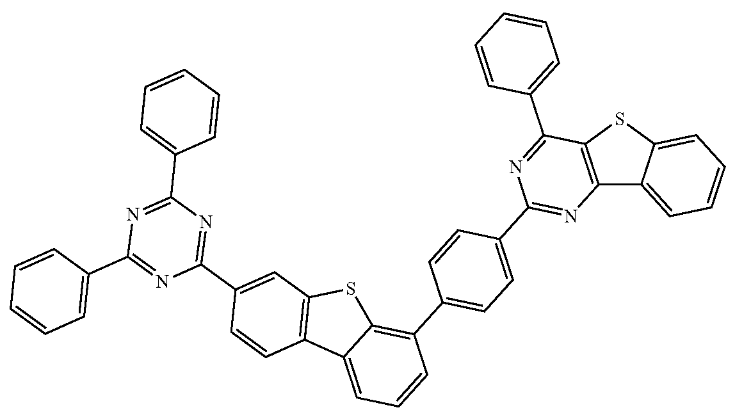
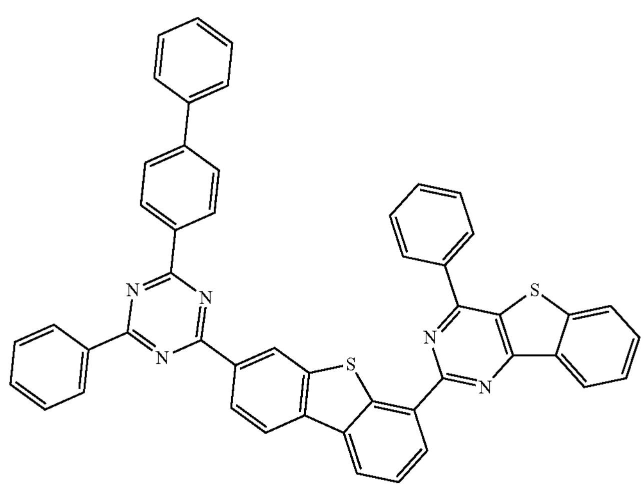

-continued
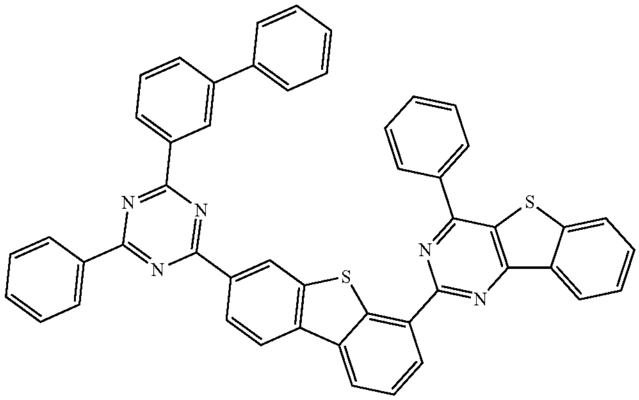
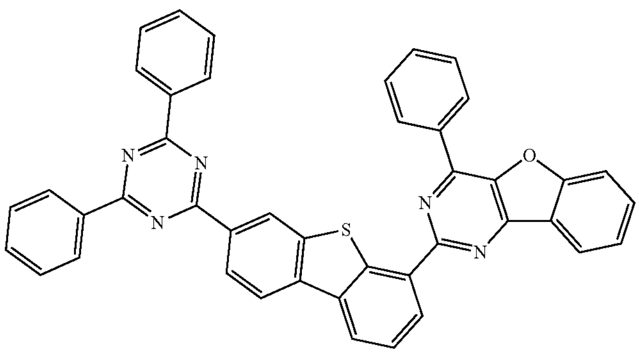
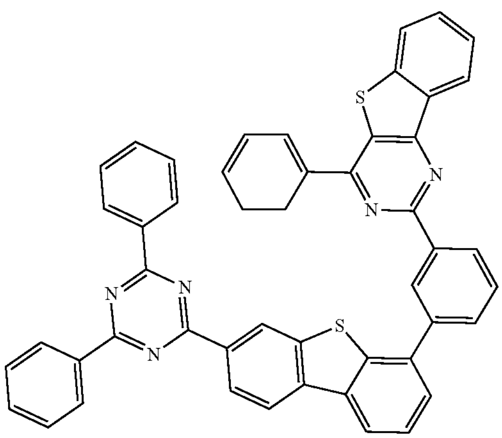
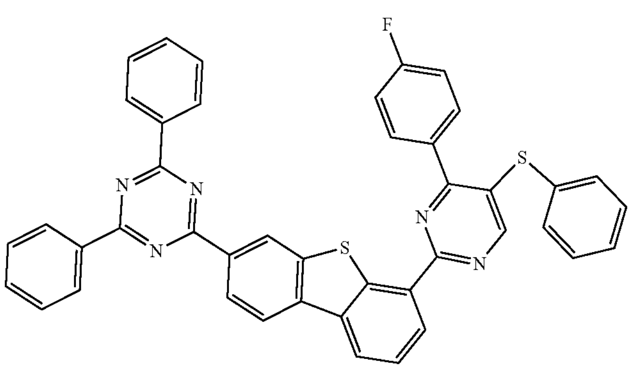

-continued
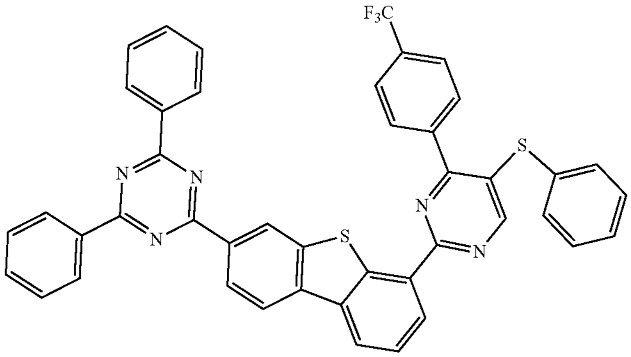
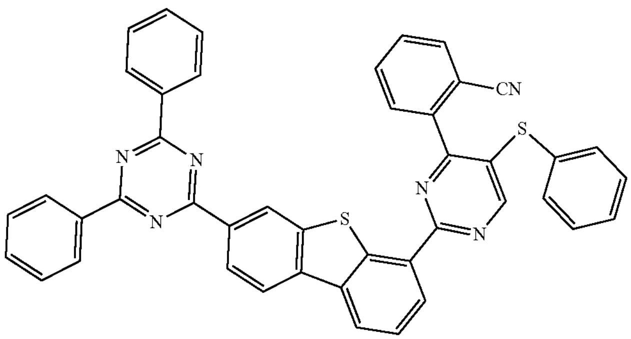
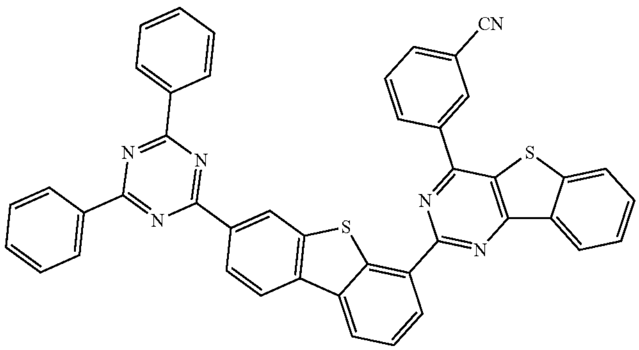
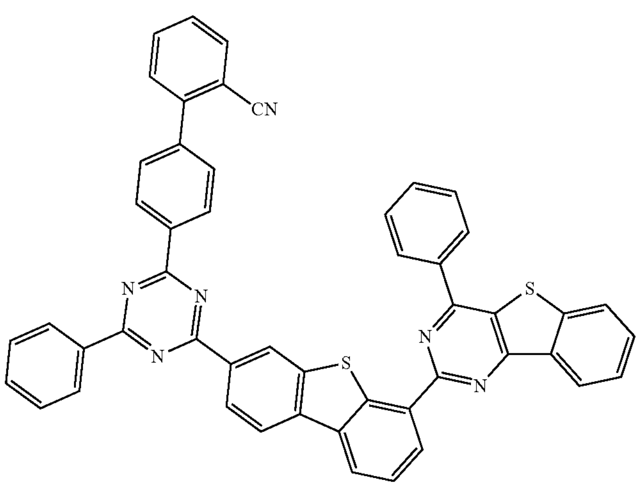

-continued
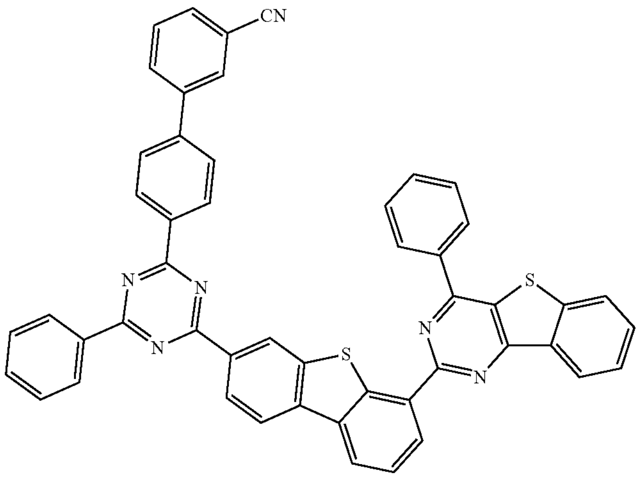
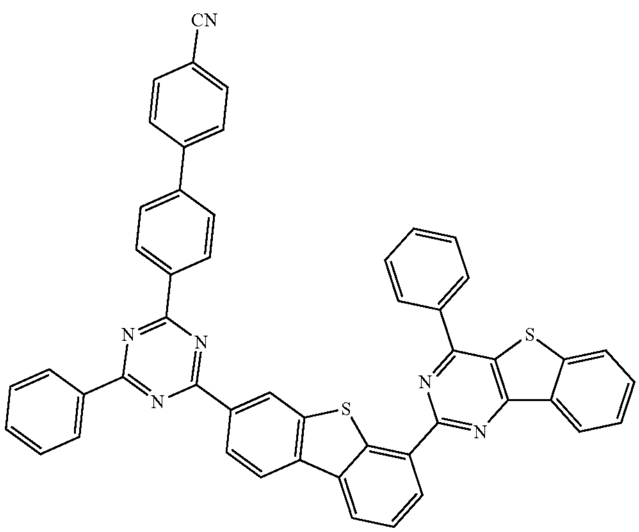
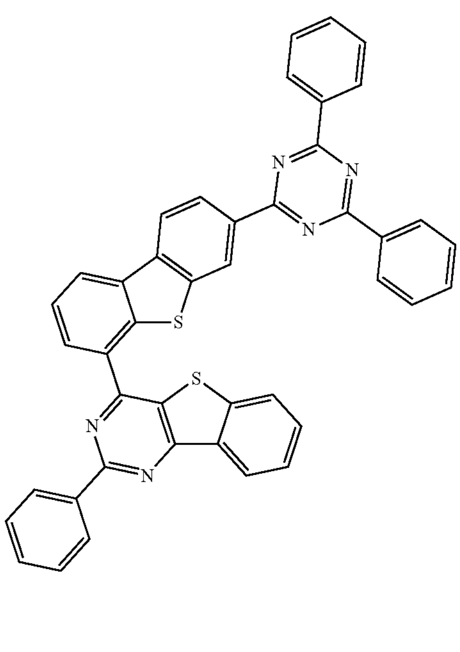
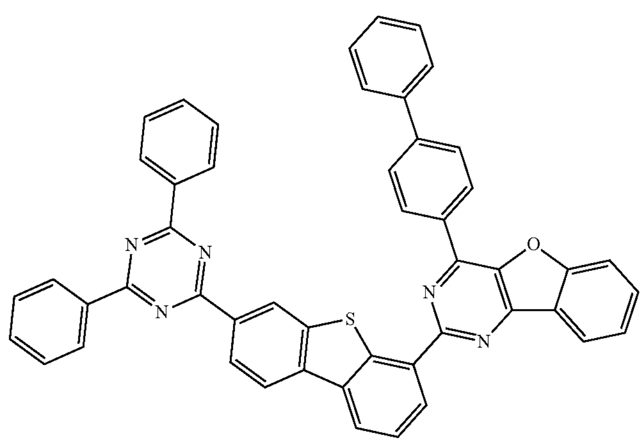

-continued
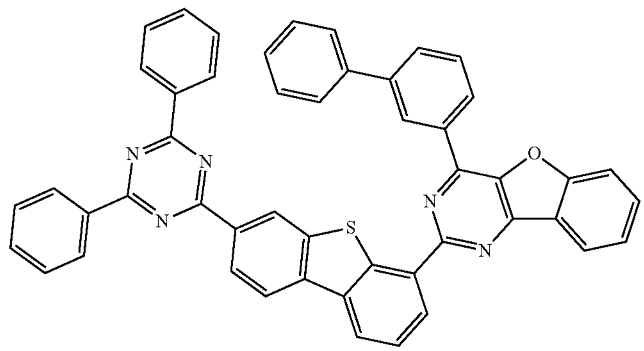
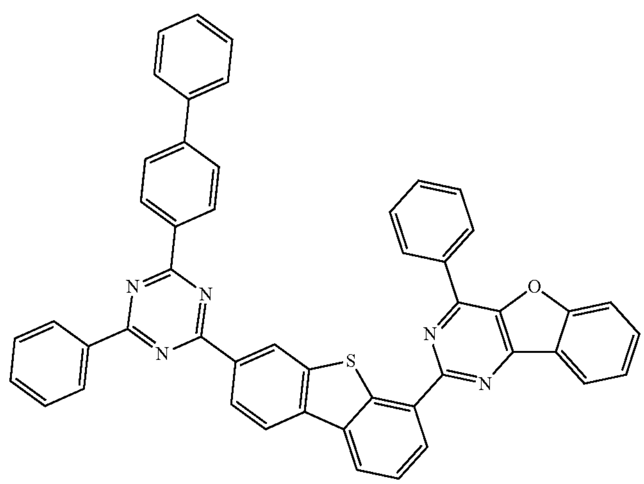
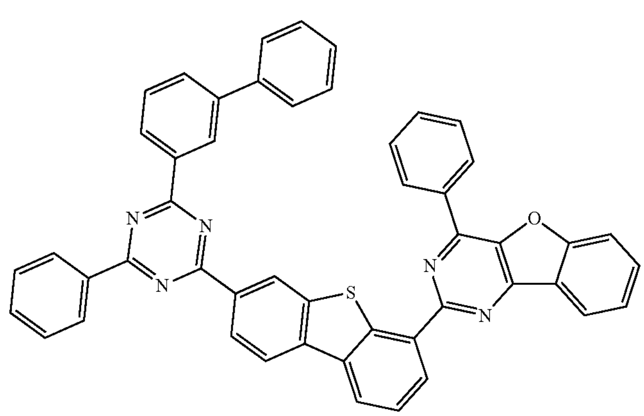

-continued
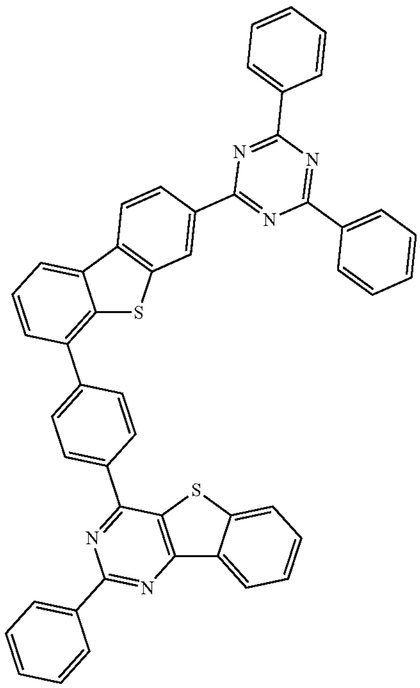
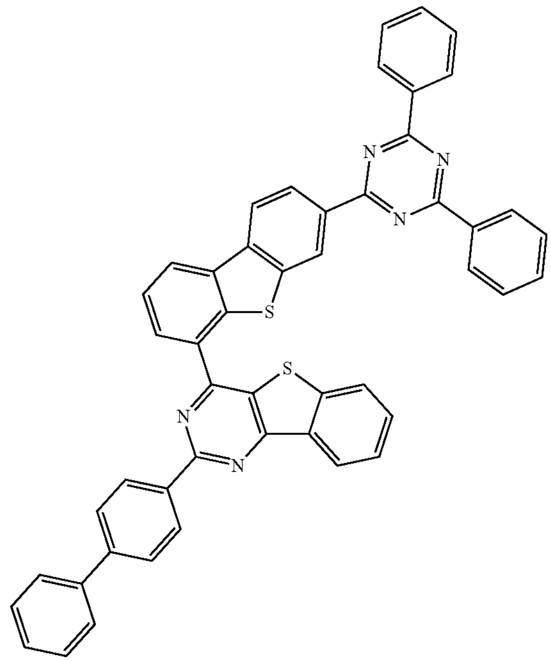
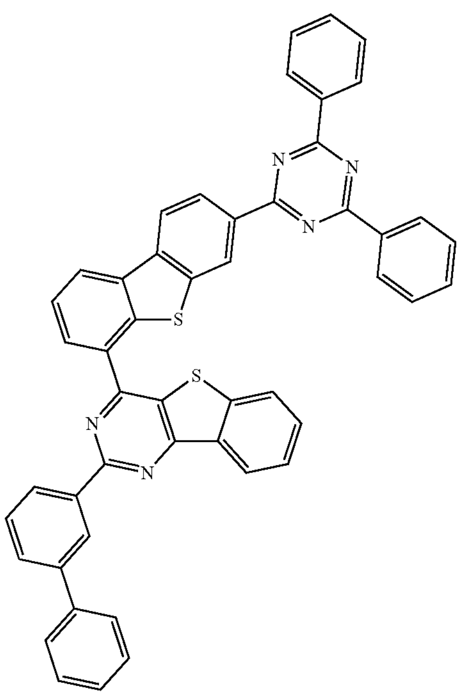
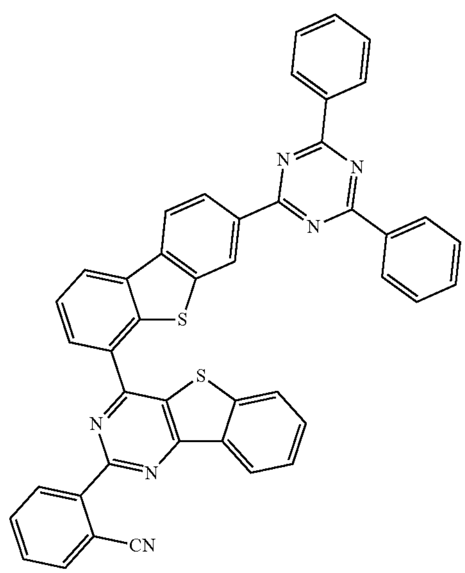

-continued
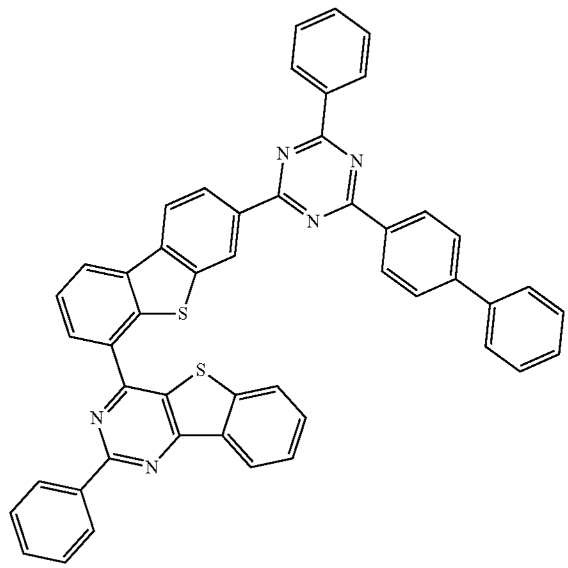
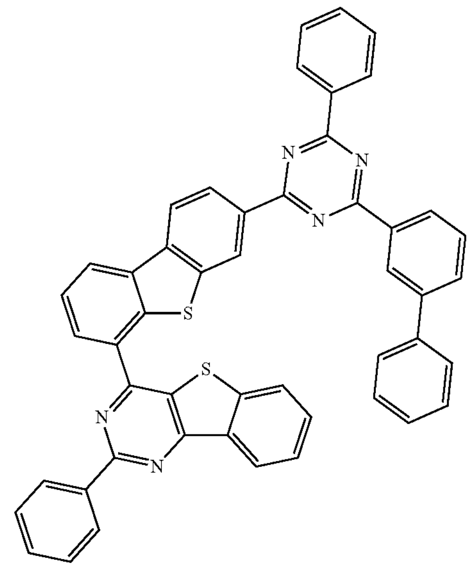
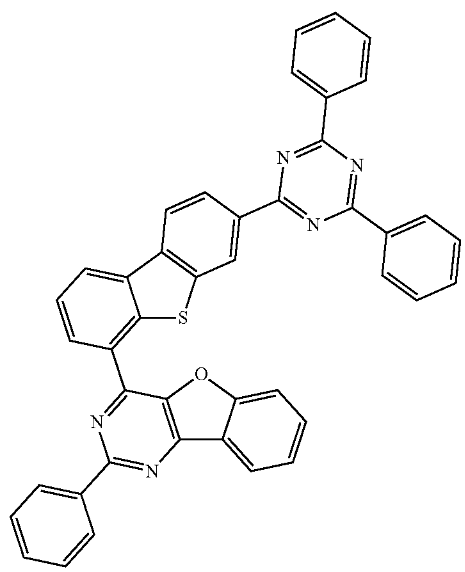
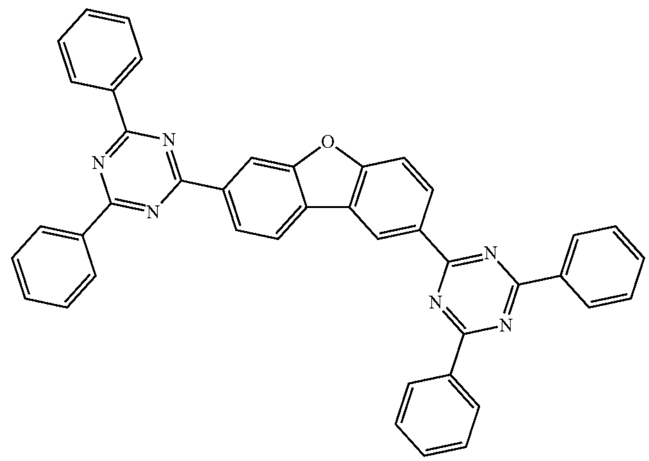
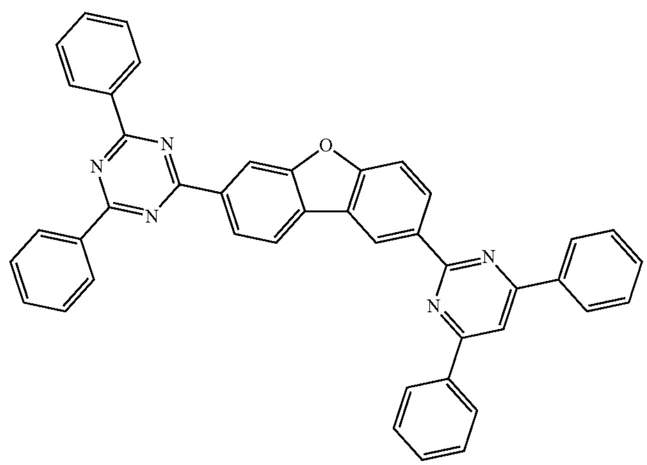

-continued
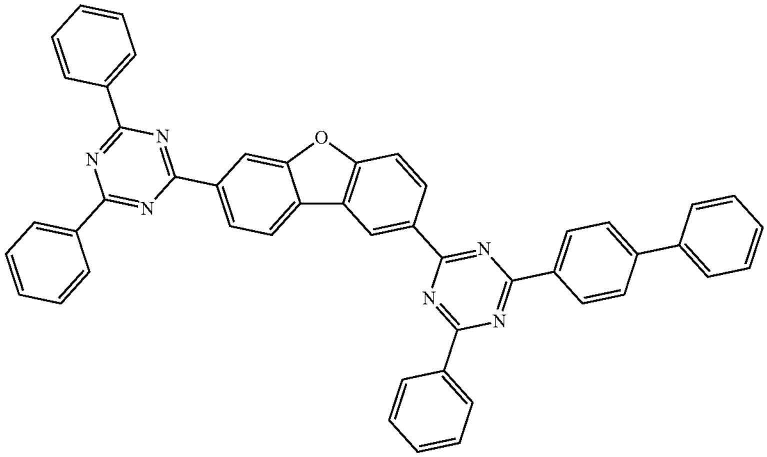
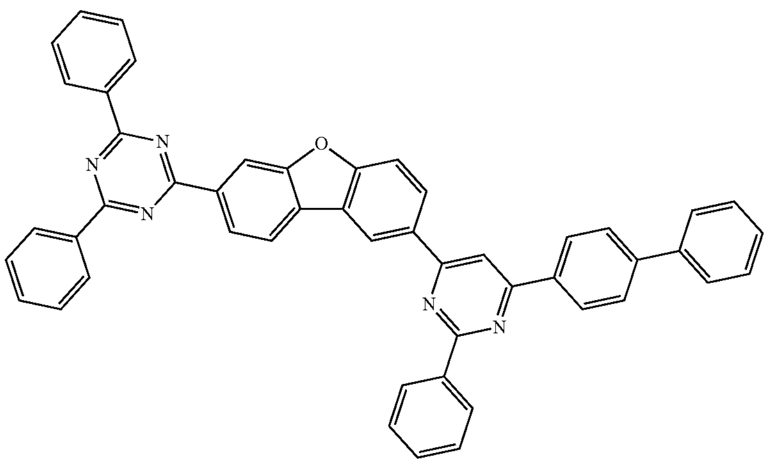
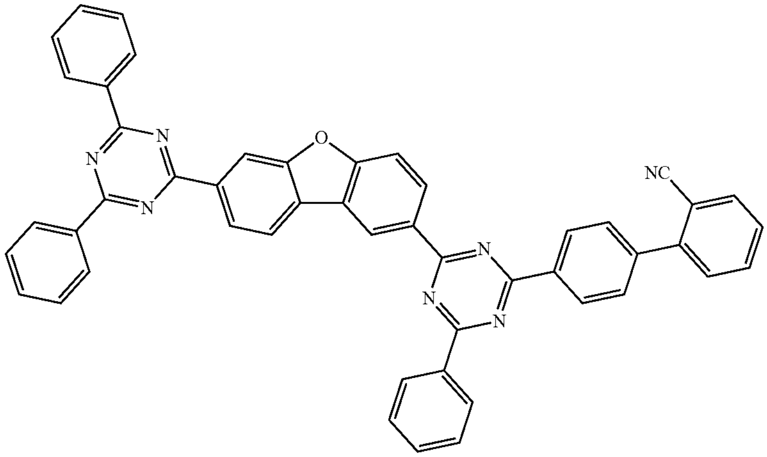

-continued
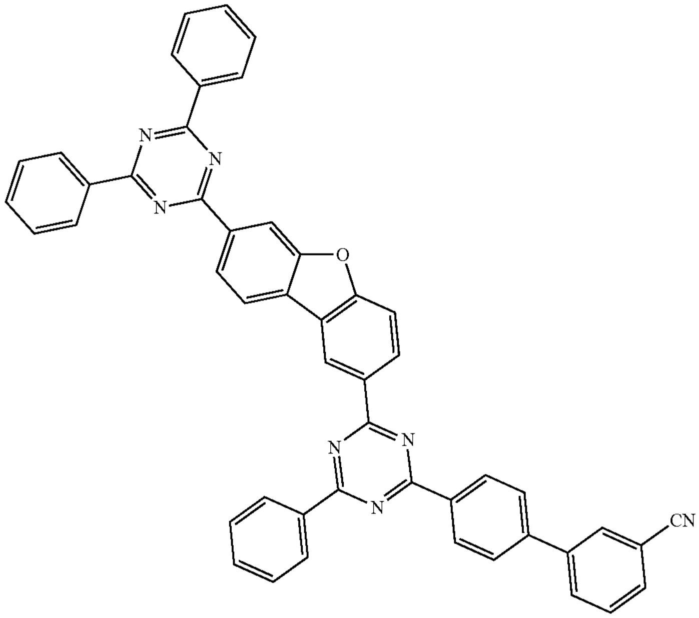
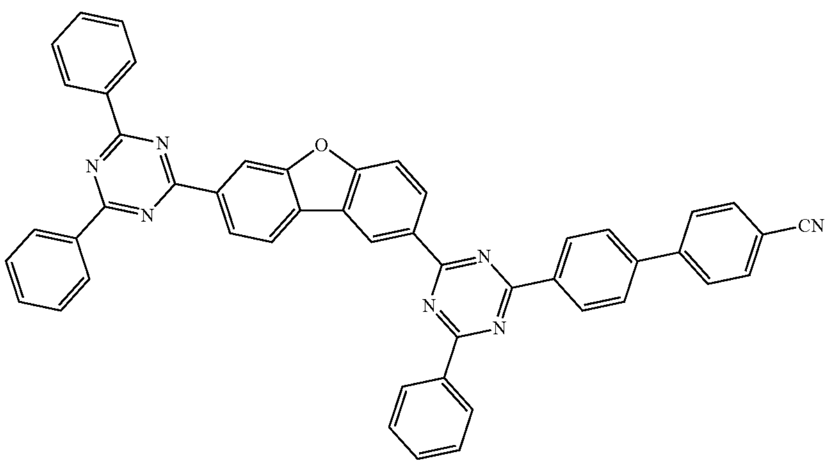
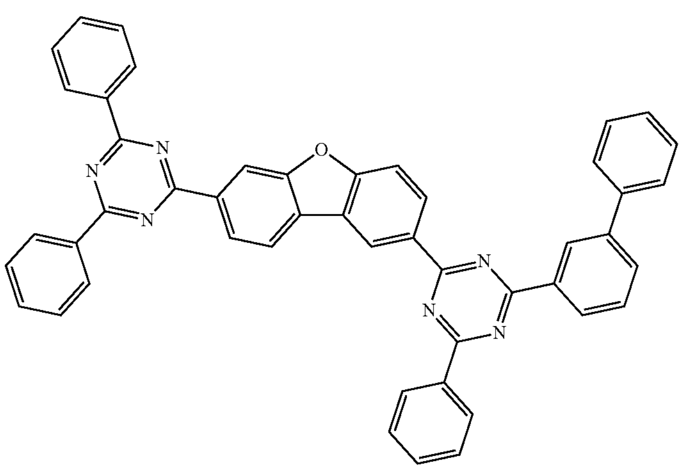

-continued
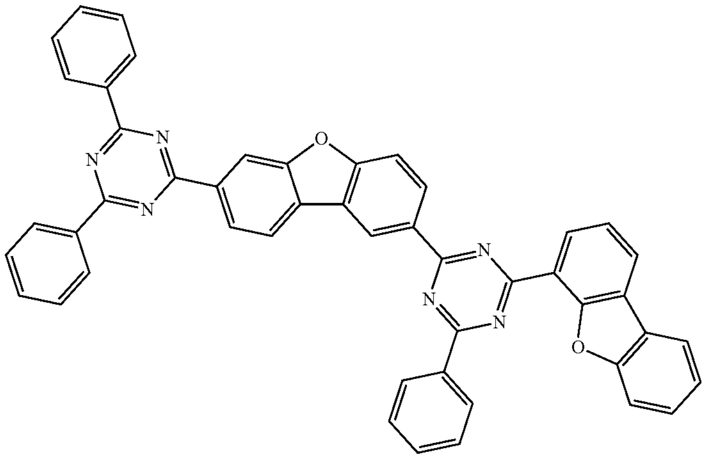
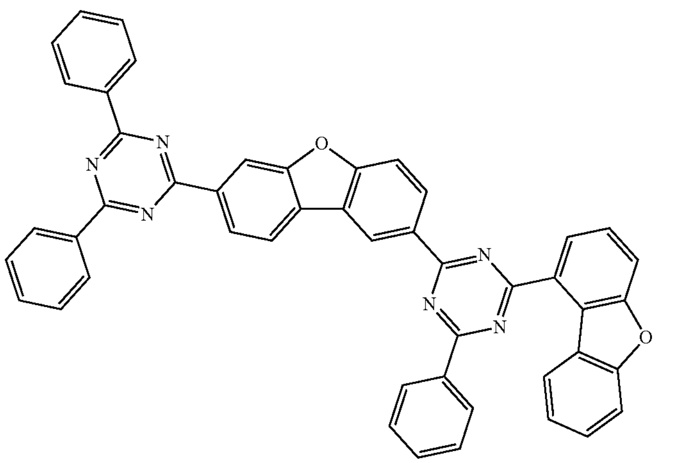
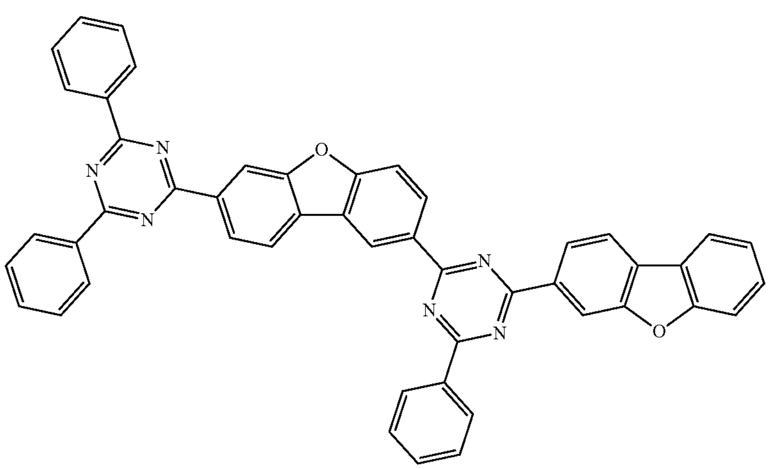

-continued
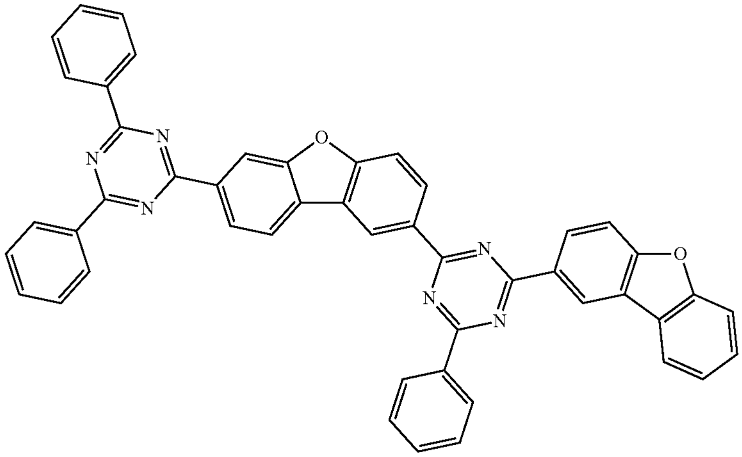
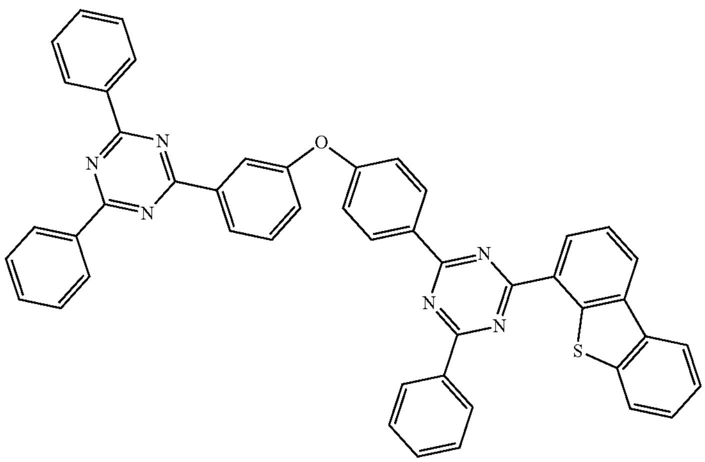
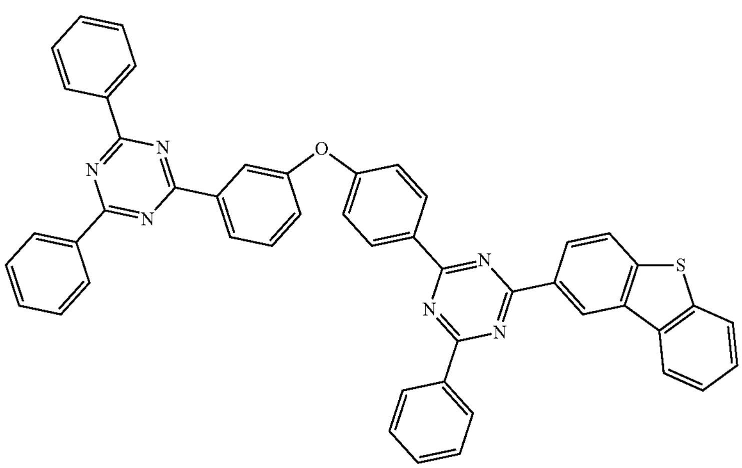

-continued
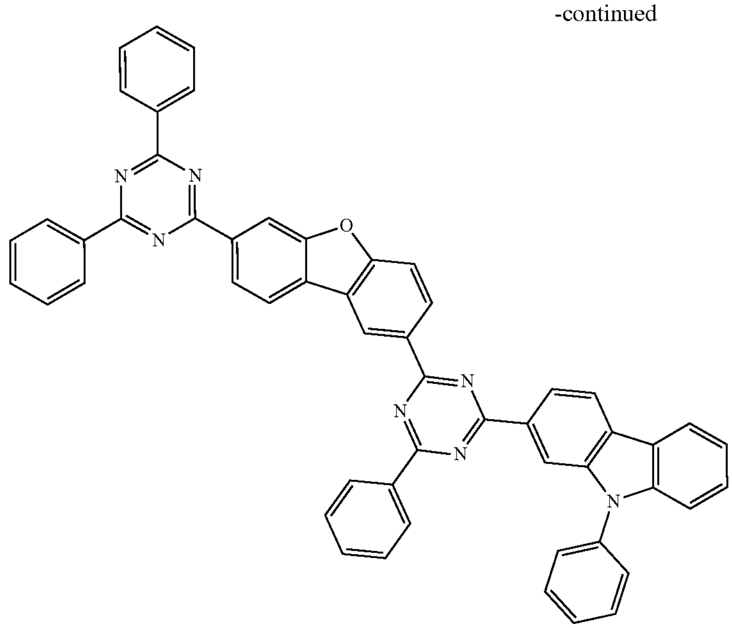
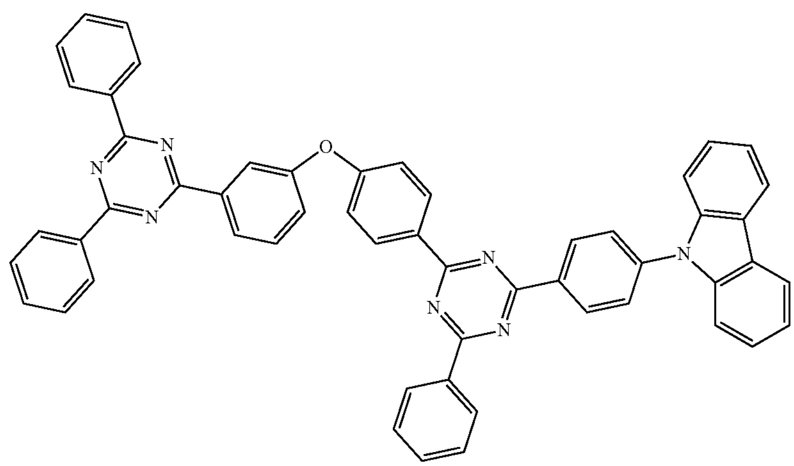
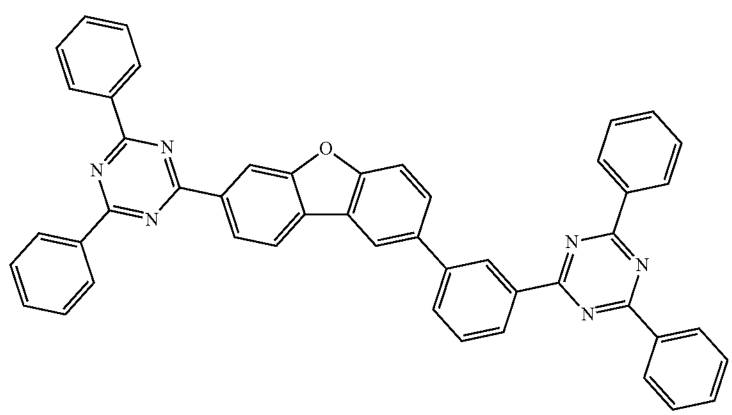

-continued
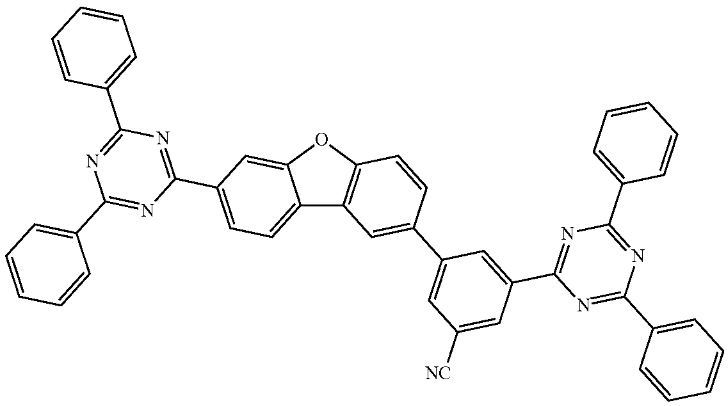
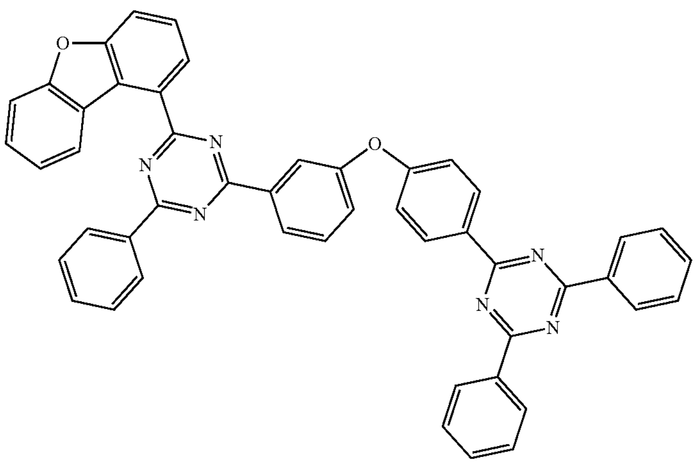
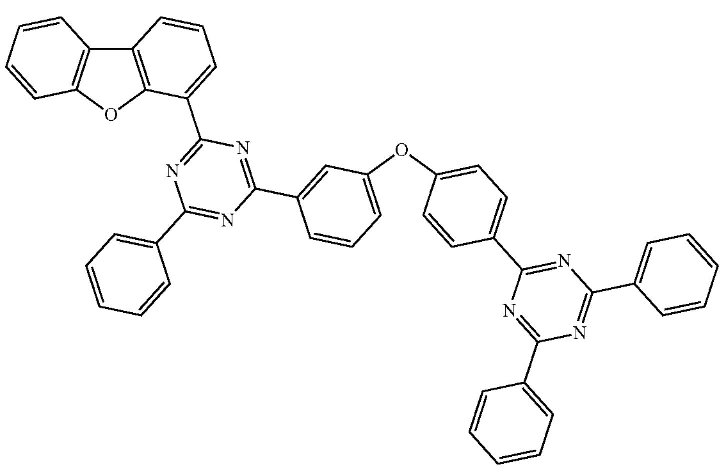

-continued
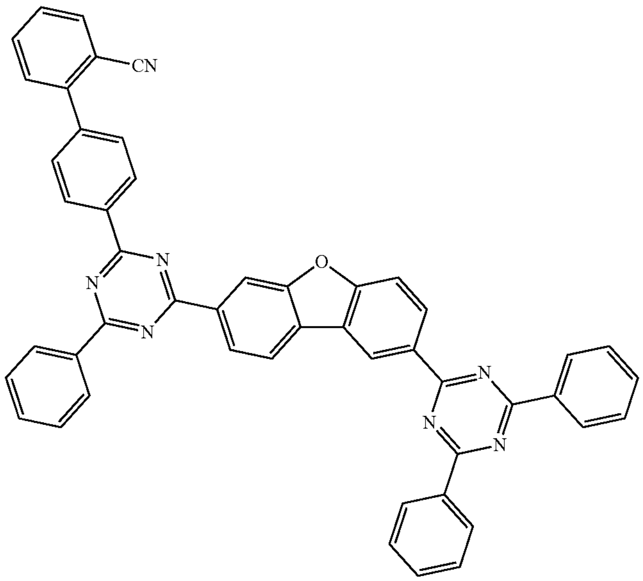
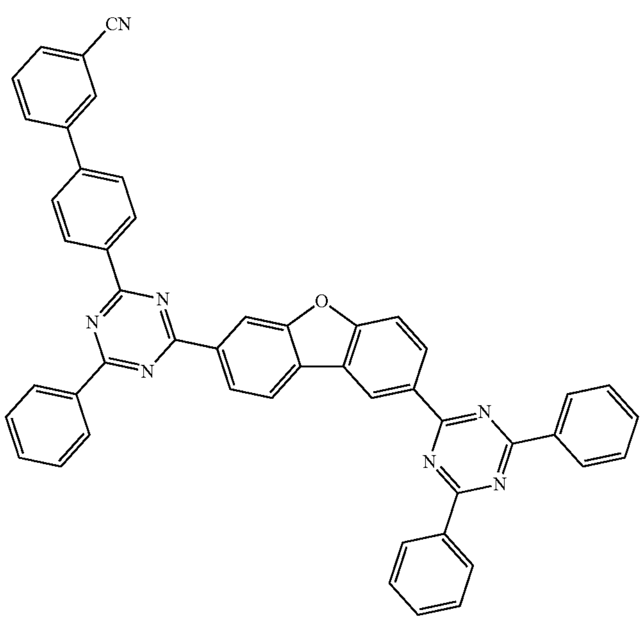

-continued
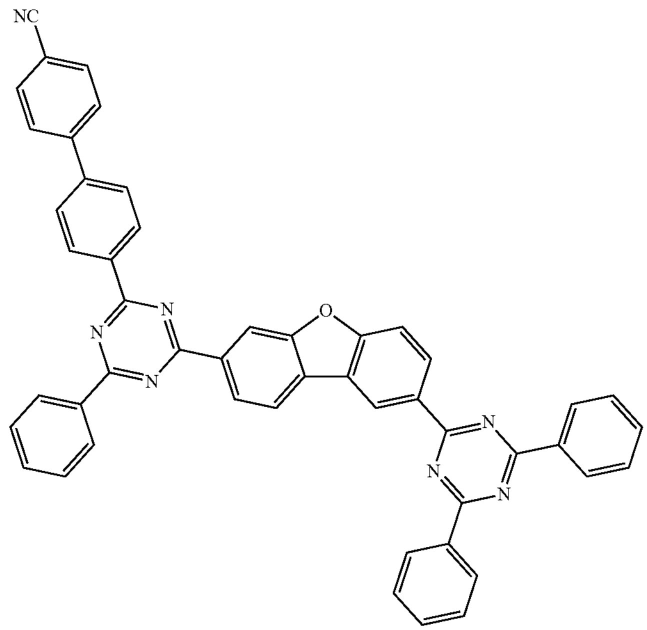
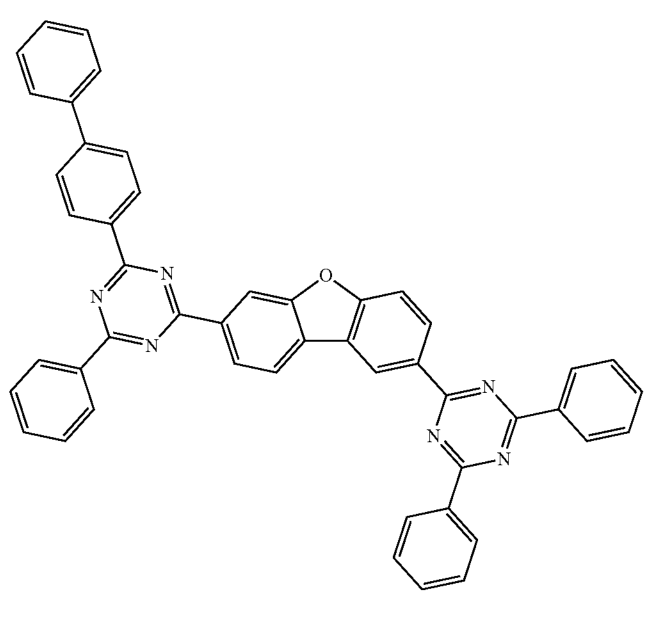

-continued
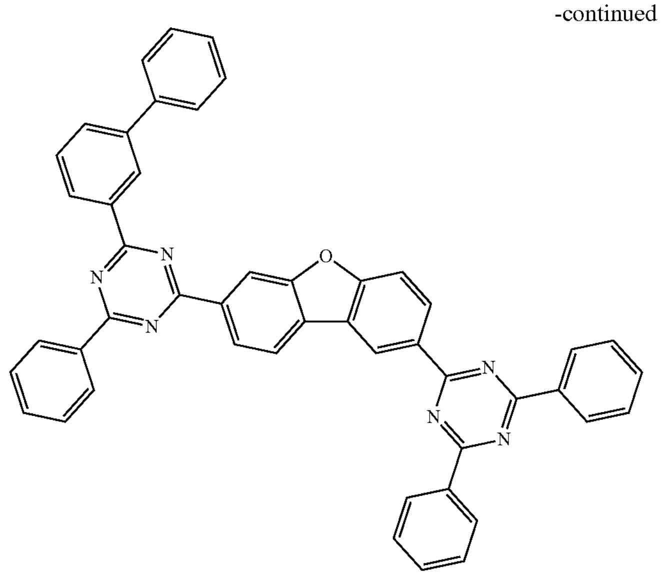
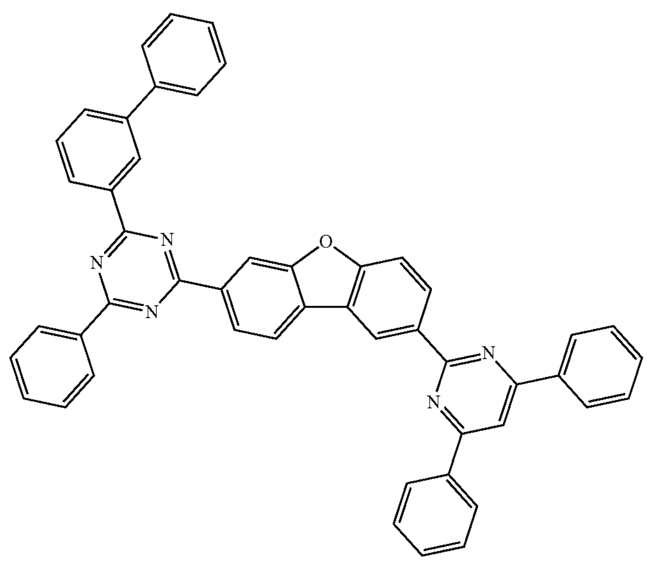
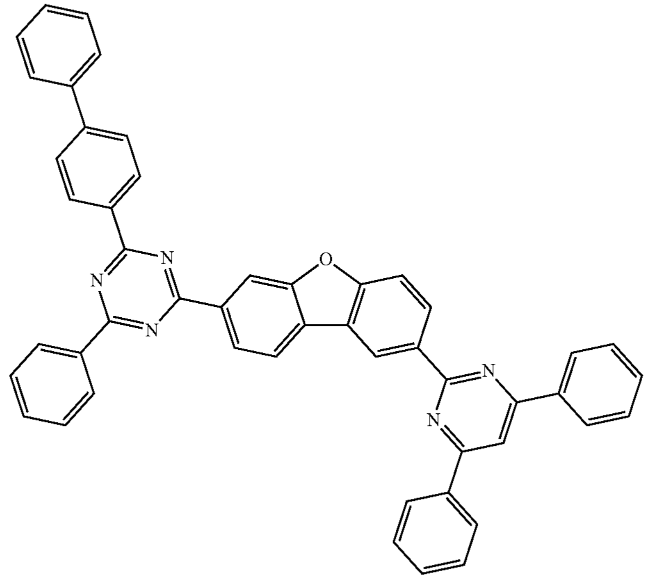

-continued
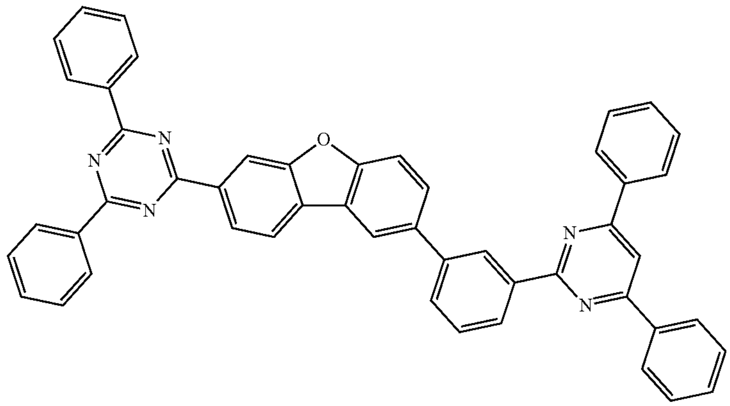
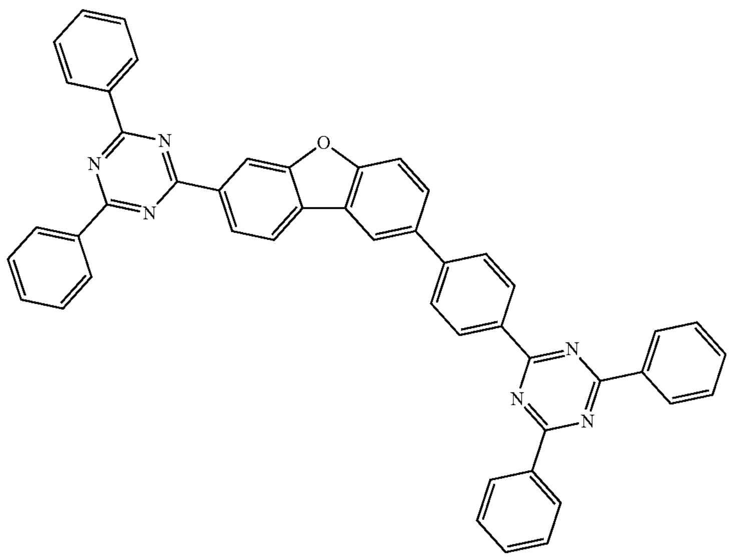
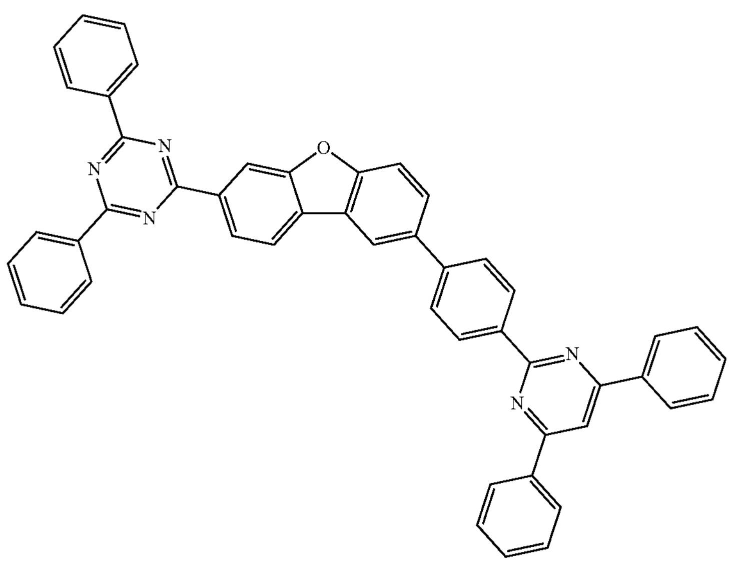

-continued
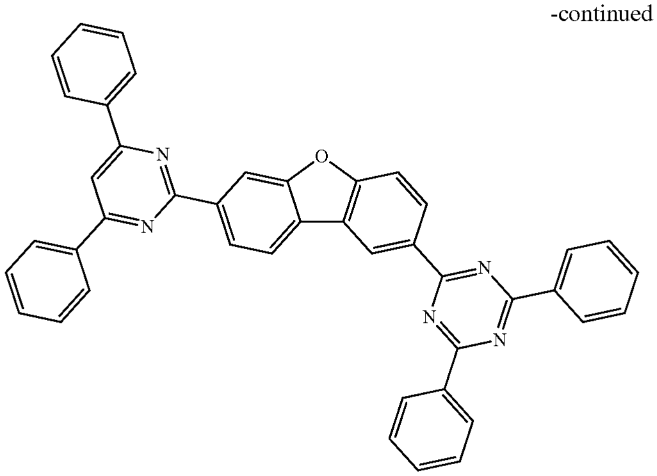
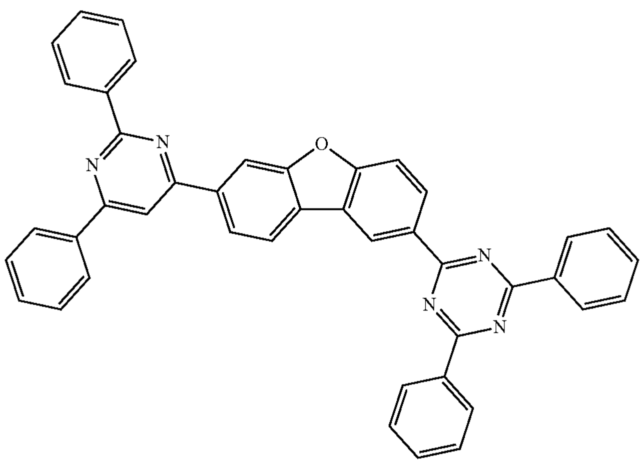
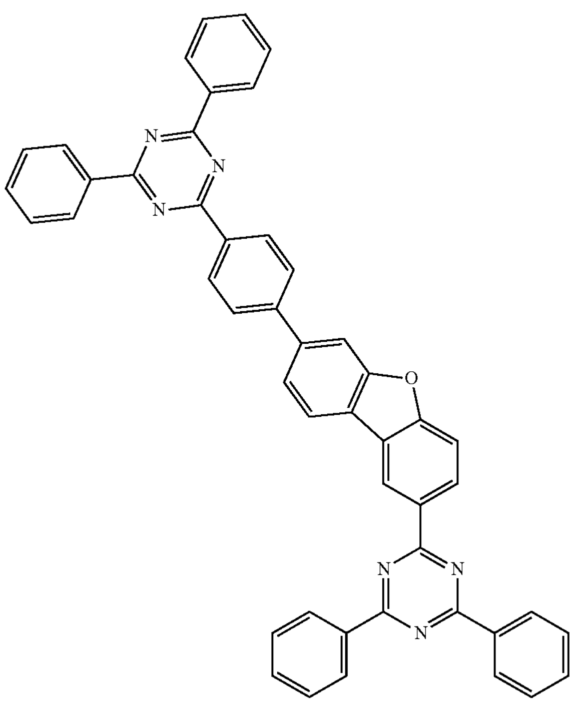

-continued
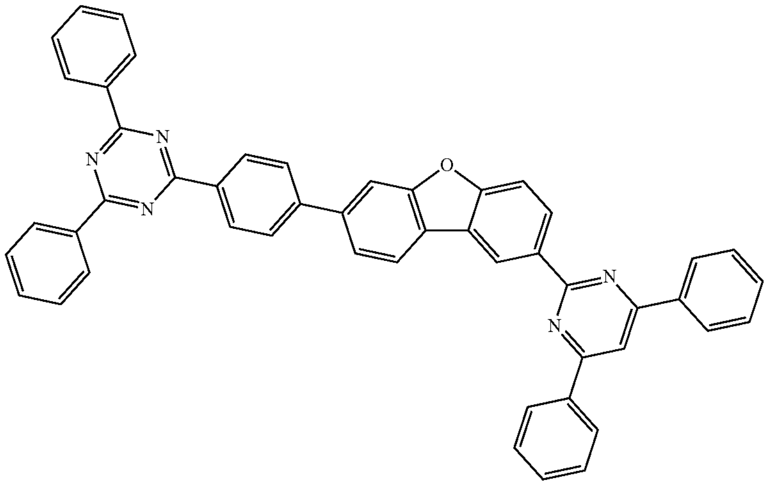
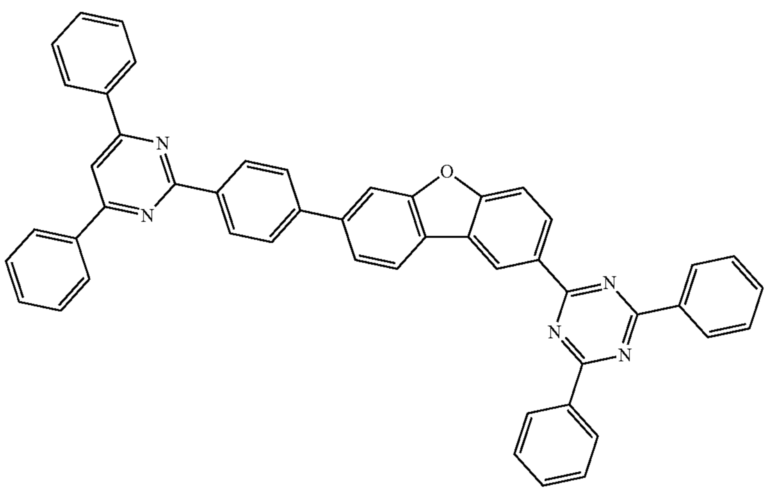
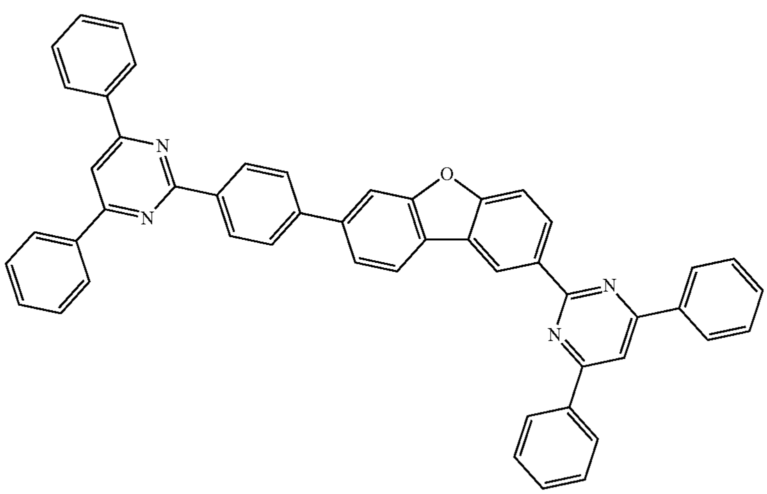

-continued
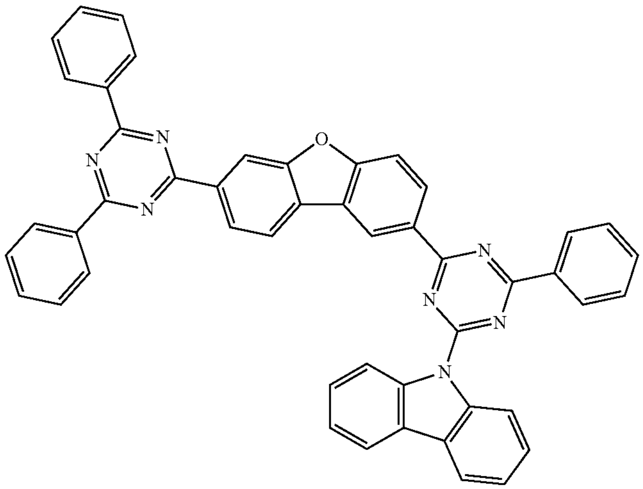
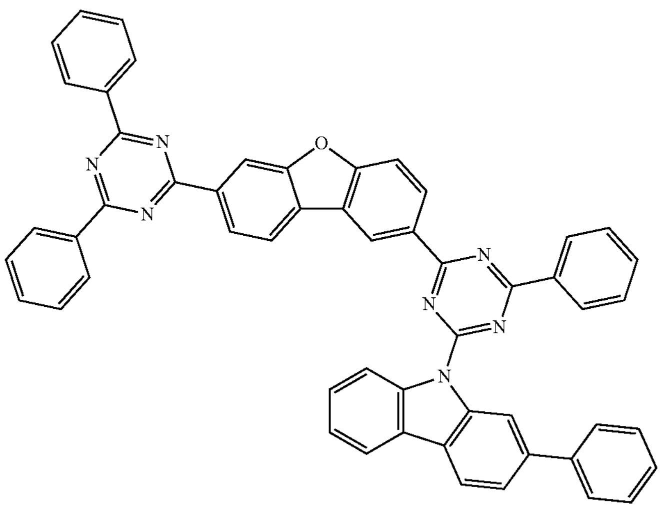
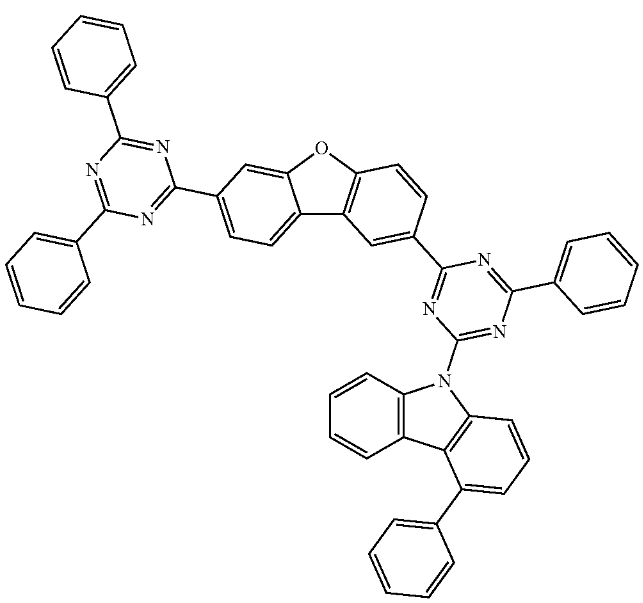

-continued
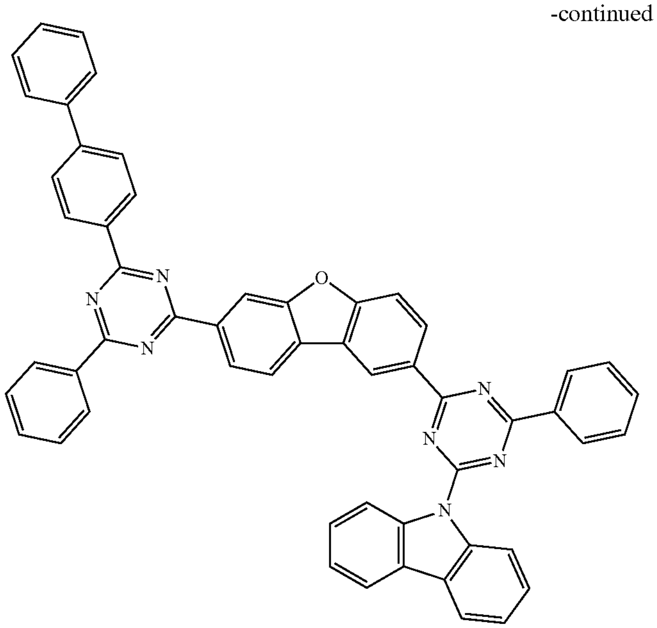
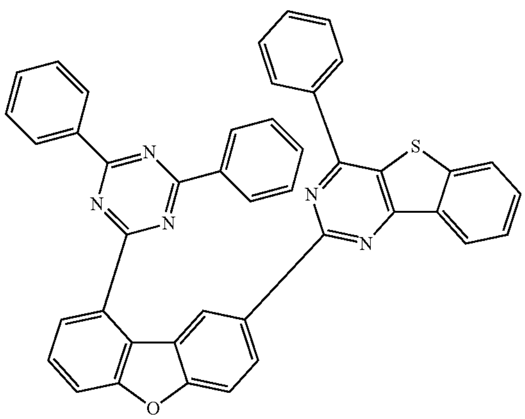
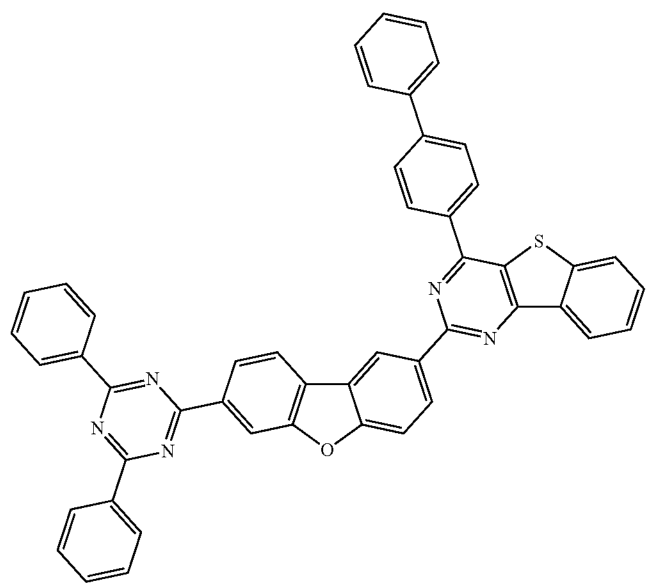
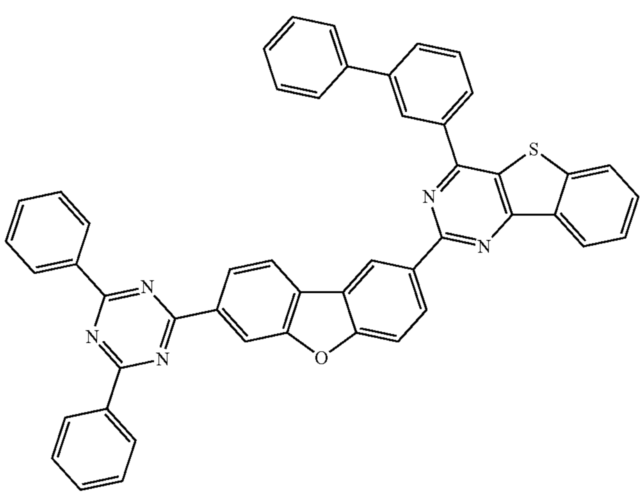

-continued
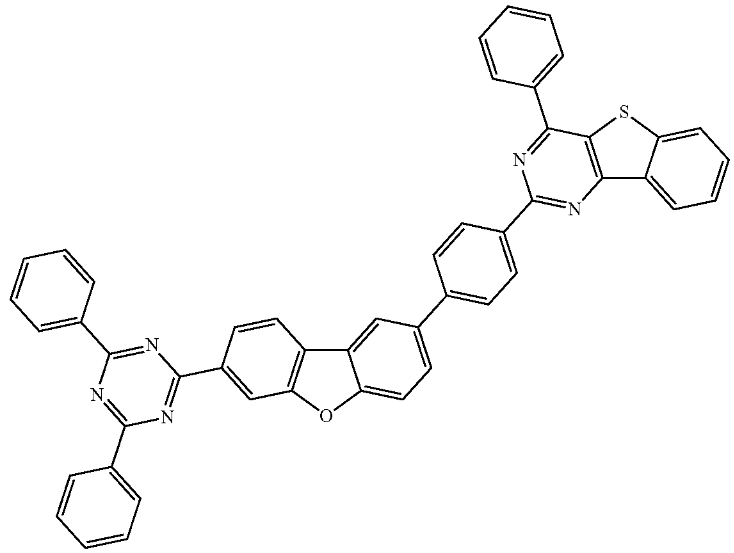
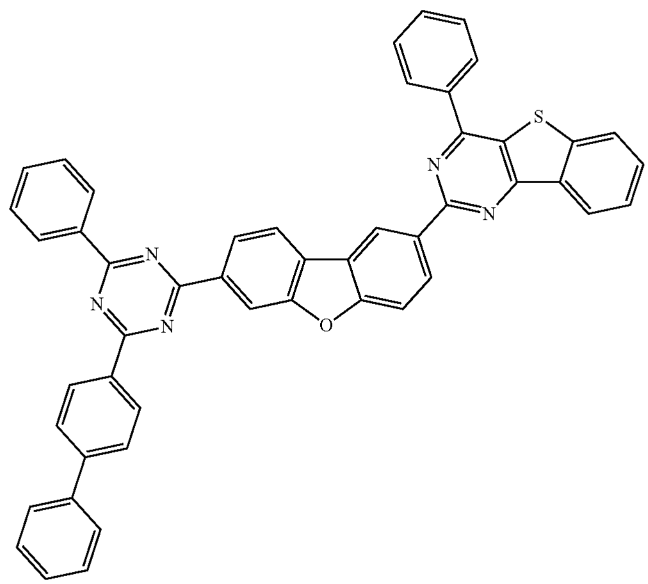
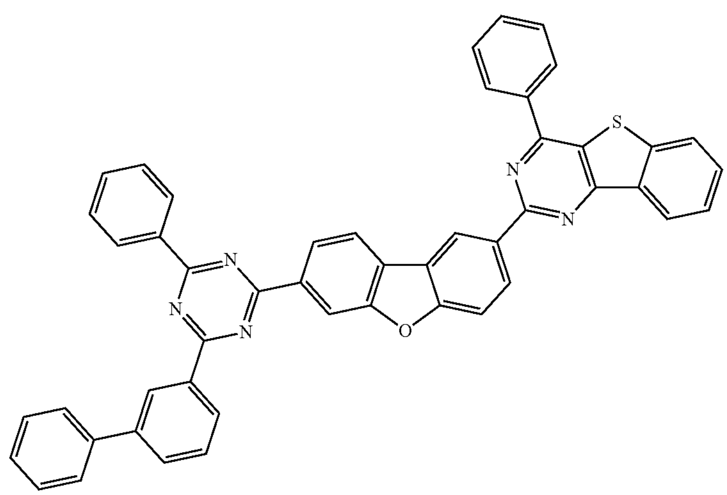

-continued
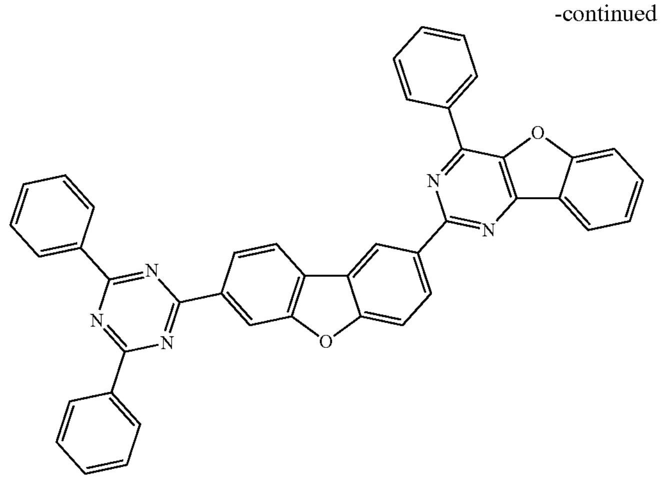
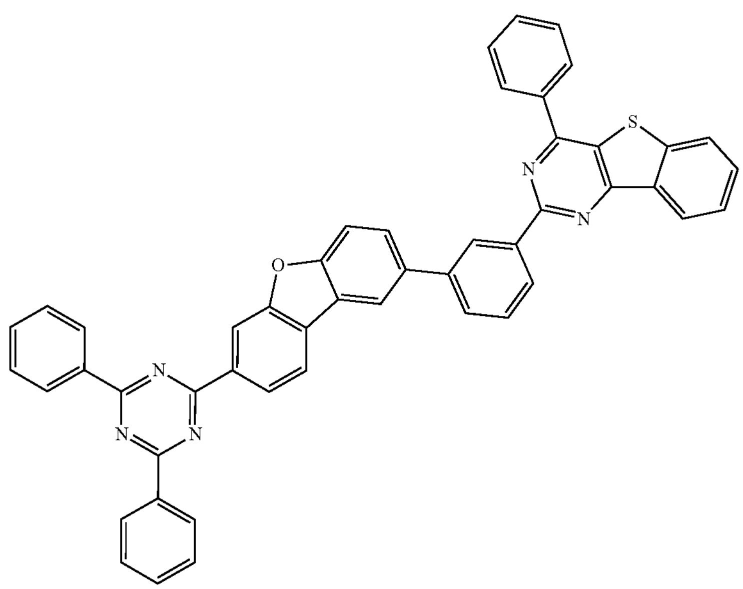
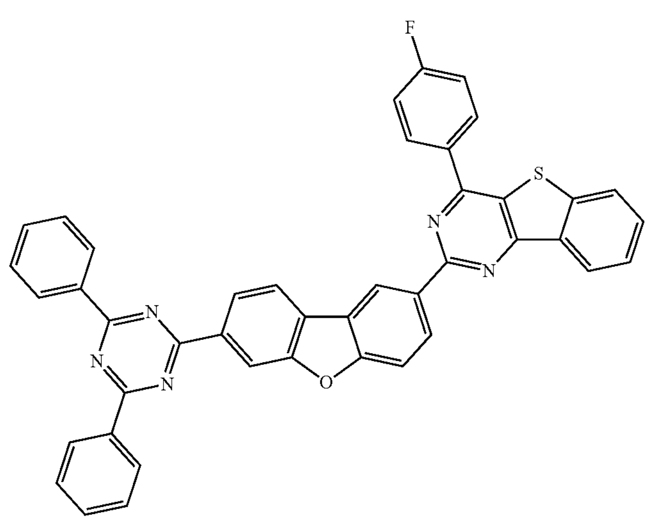

-continued
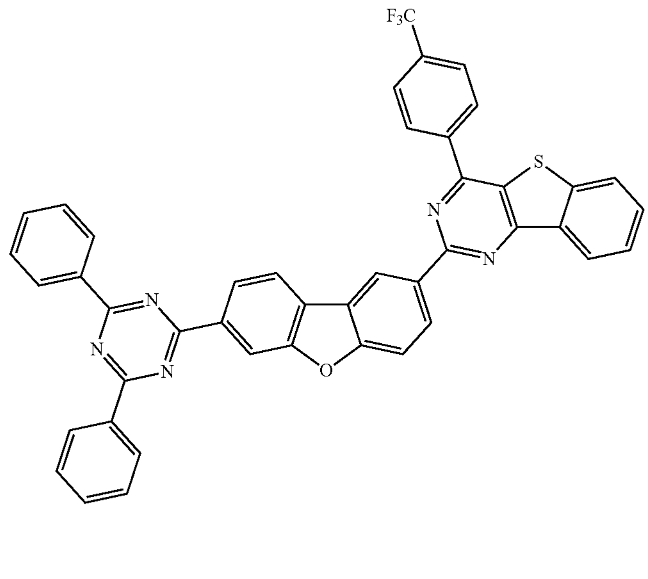
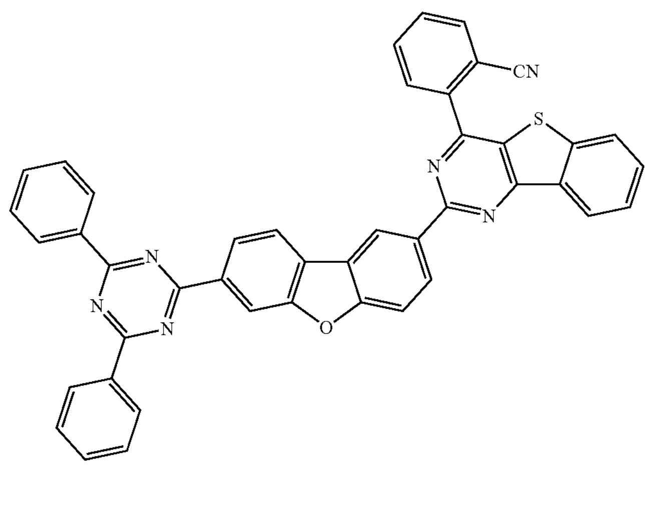
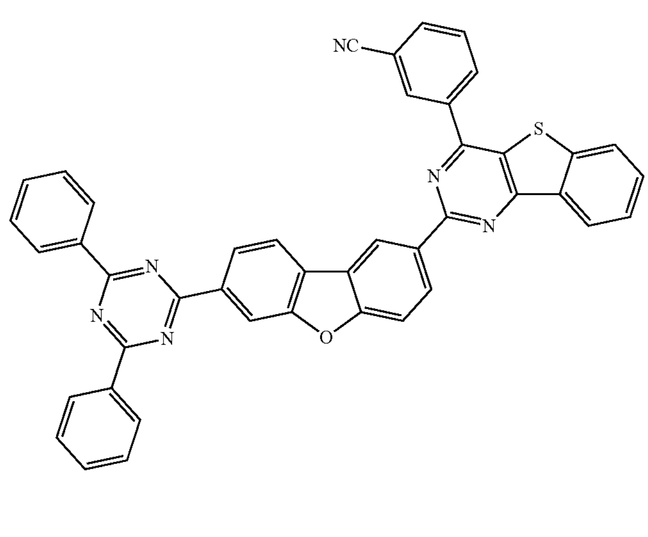

-continued
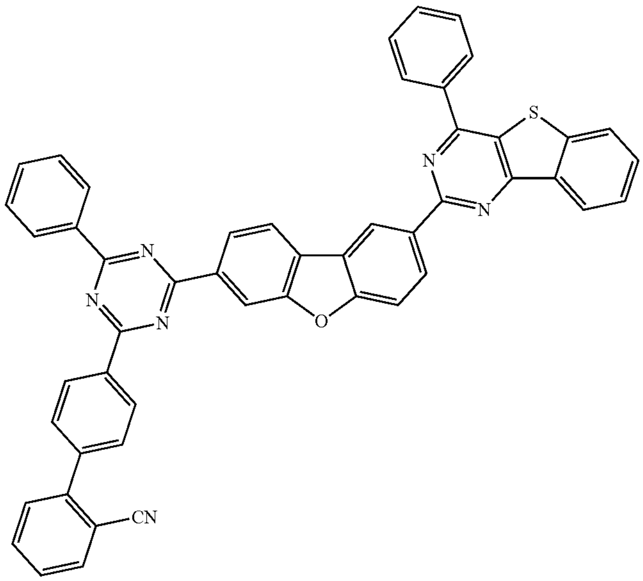
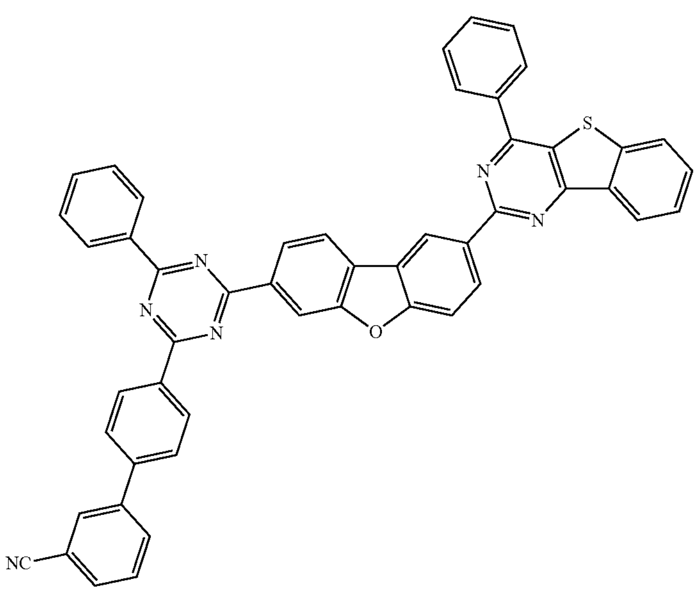

-continued
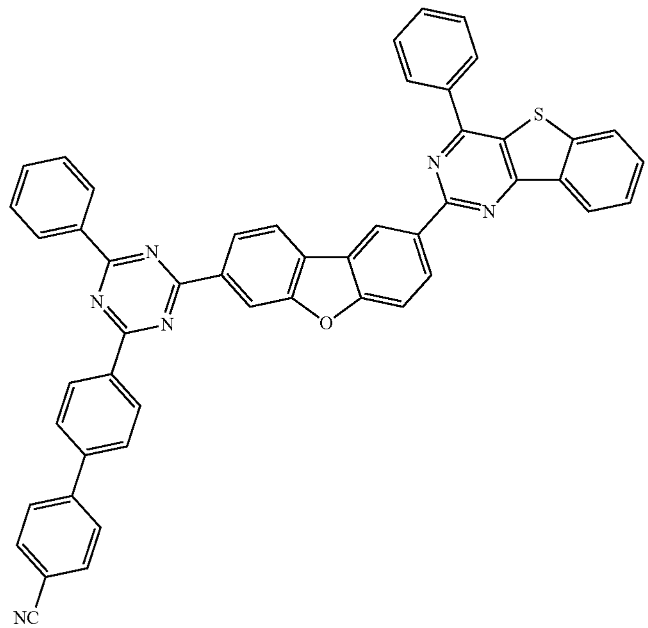
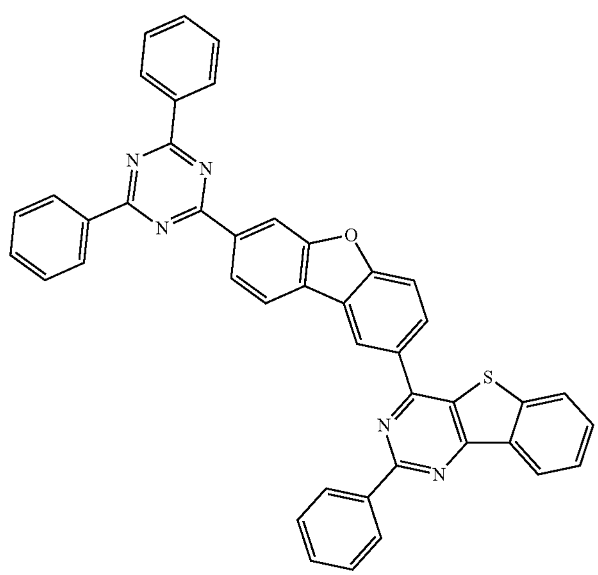

-continued
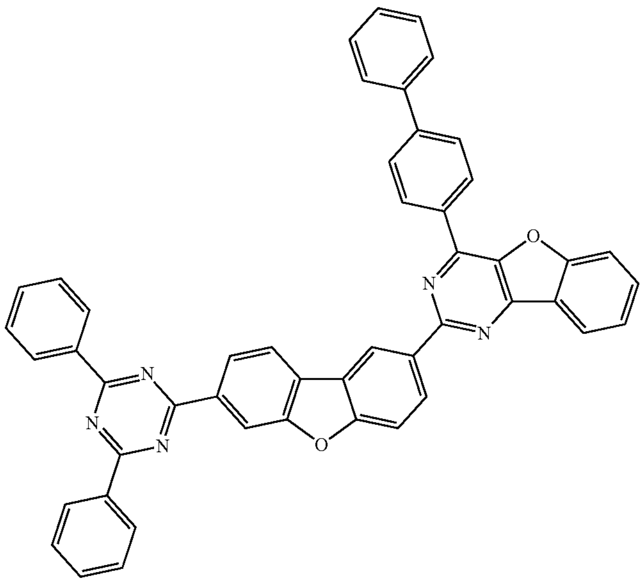
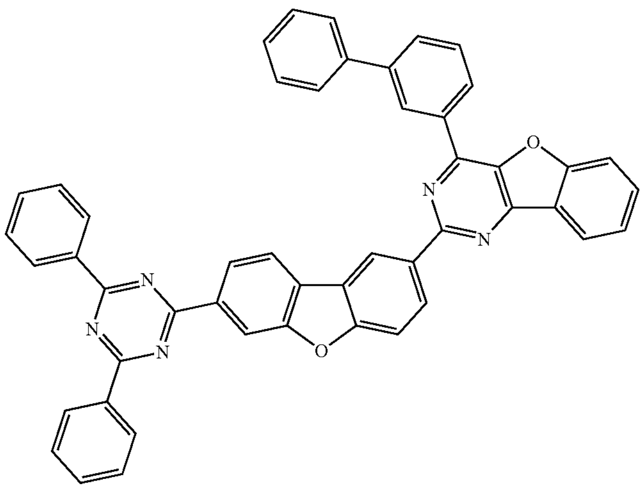
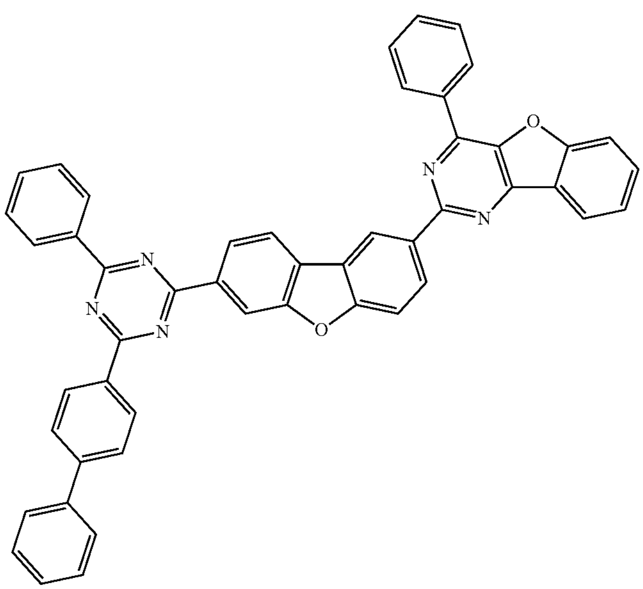

-continued
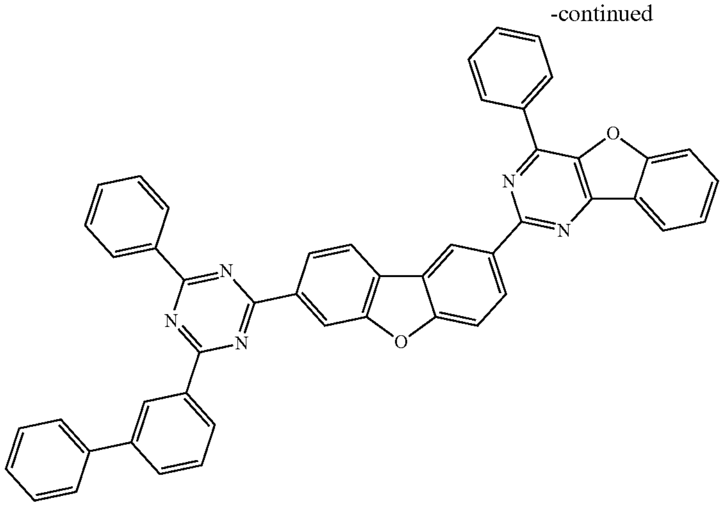
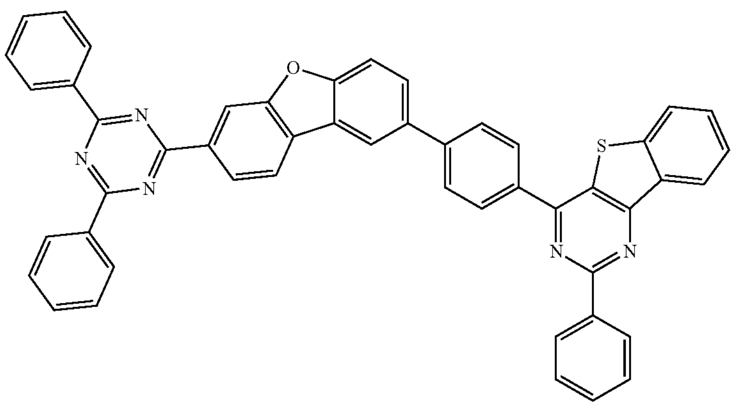
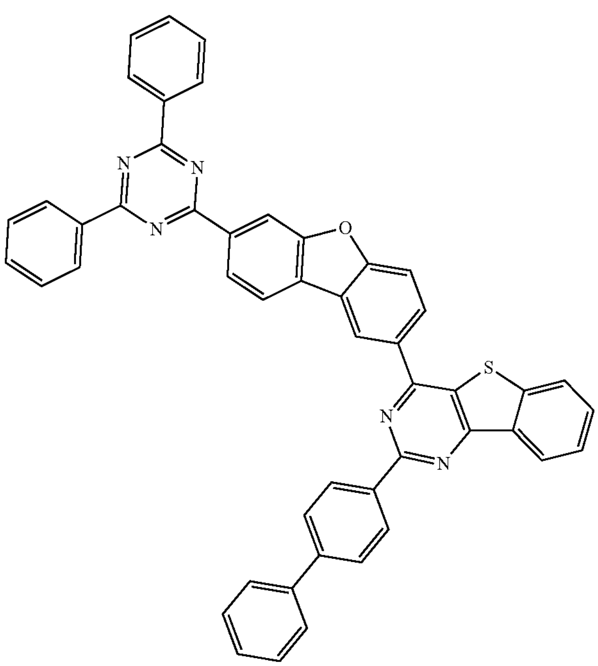
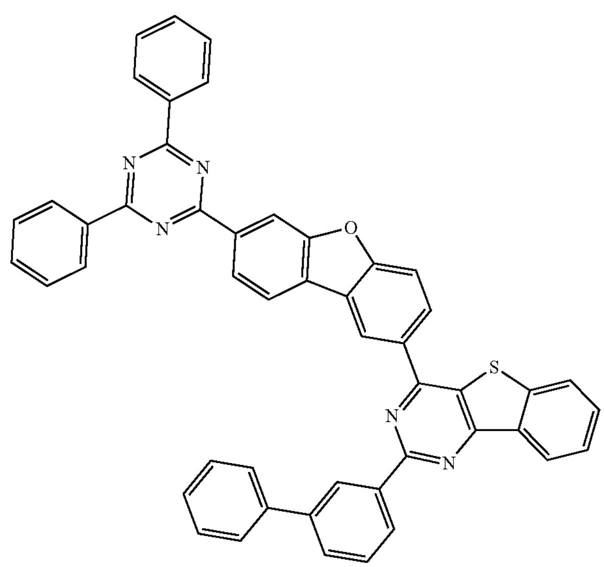

-continued
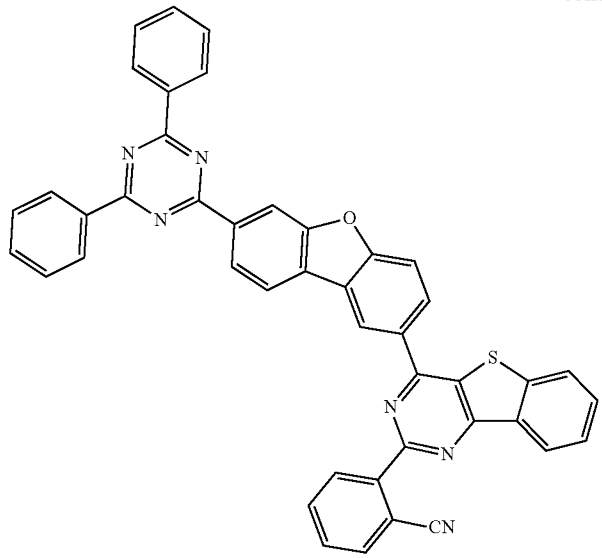
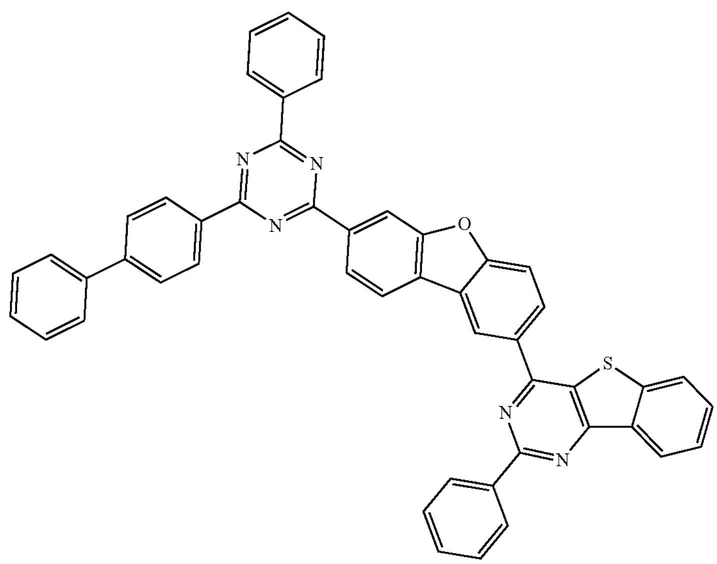
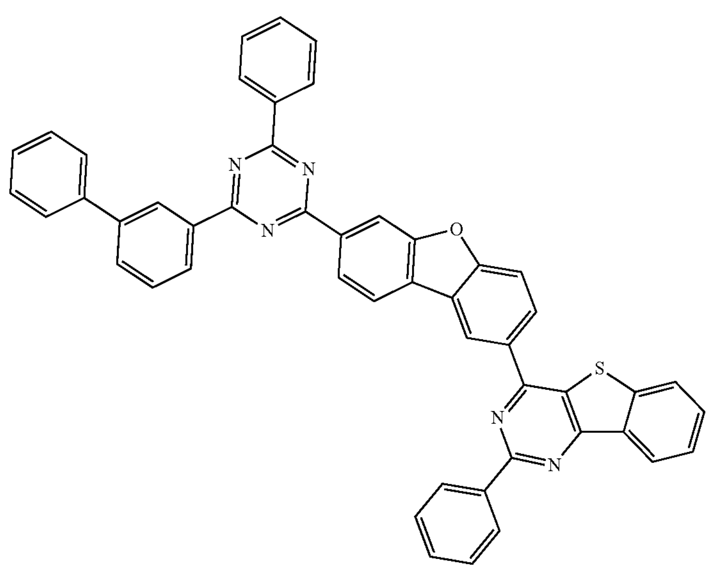

-continued
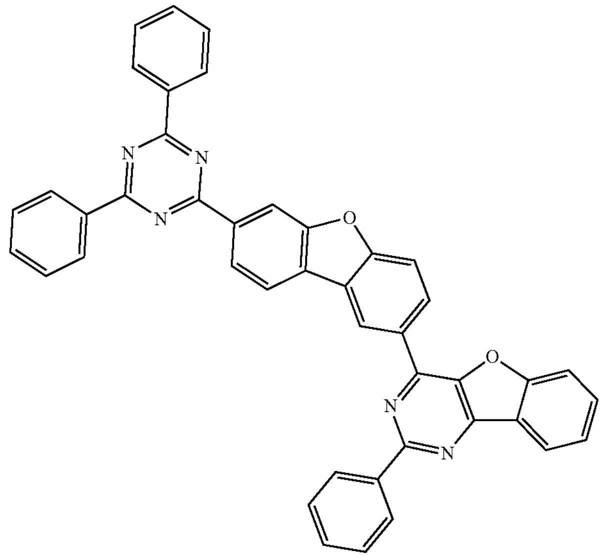
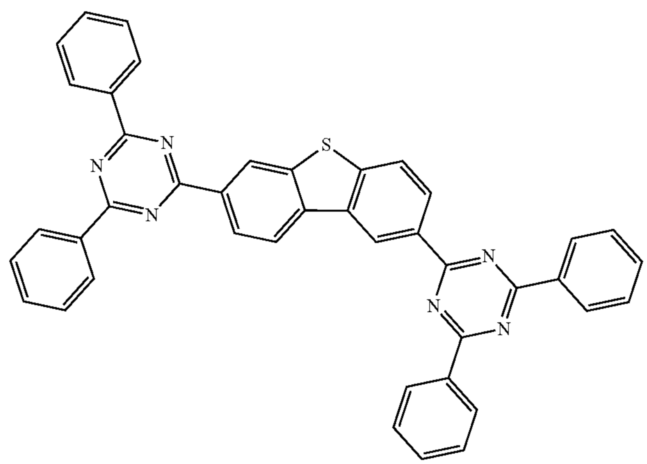
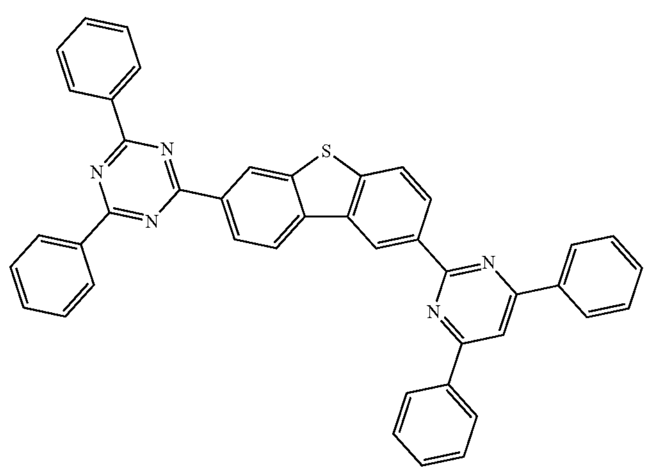

-continued
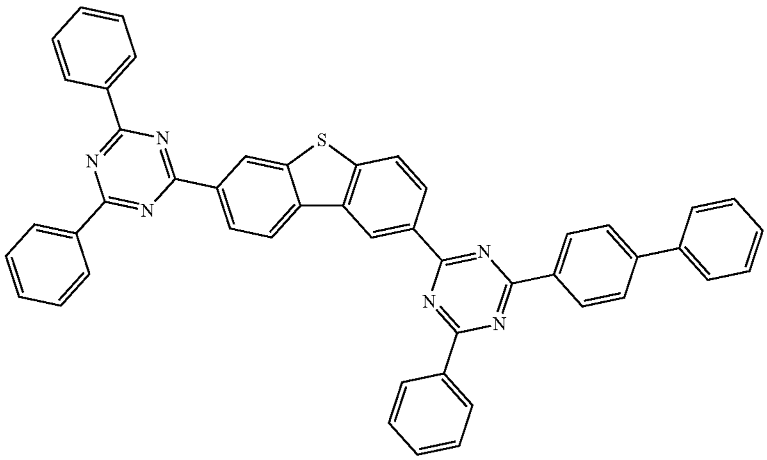
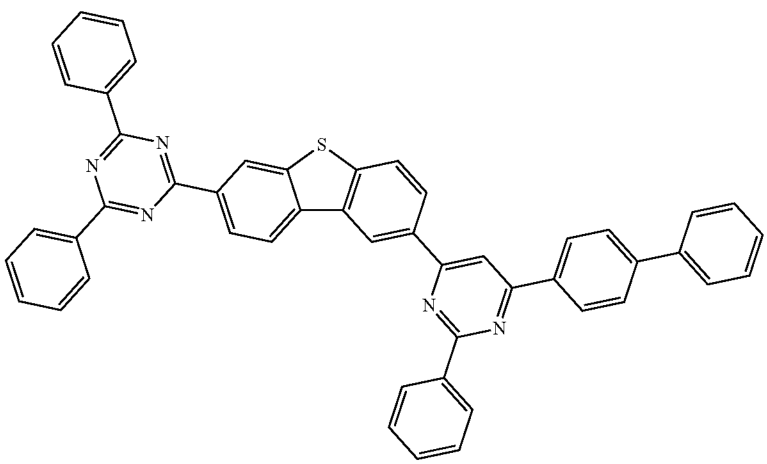
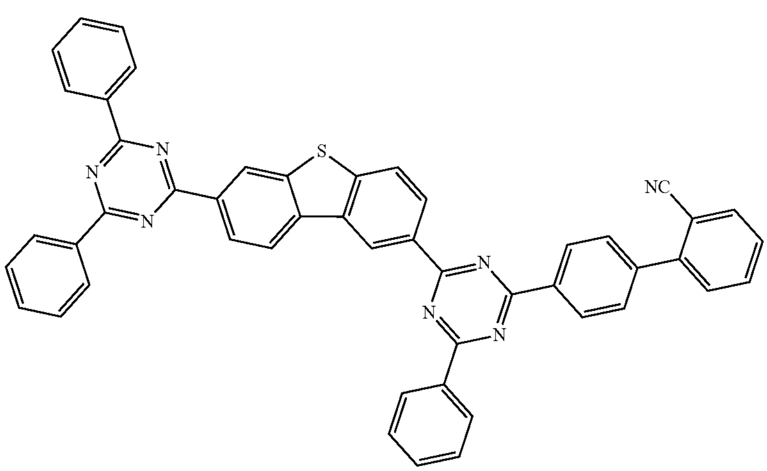

-continued
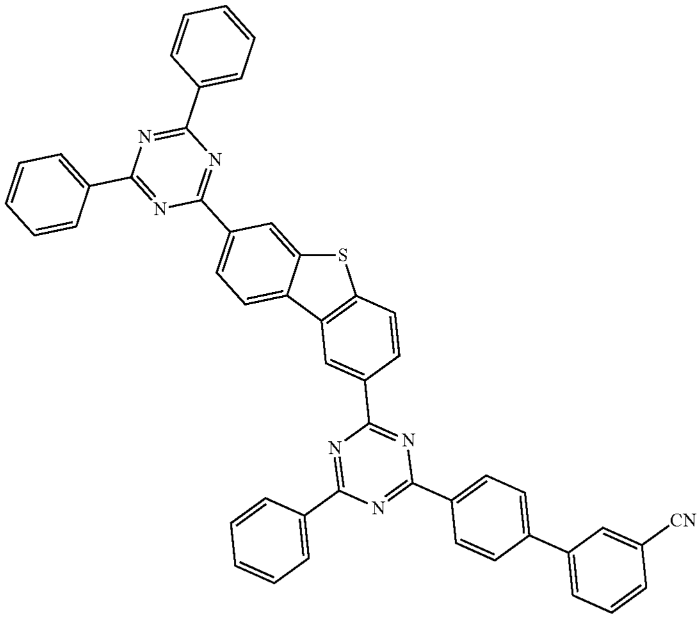
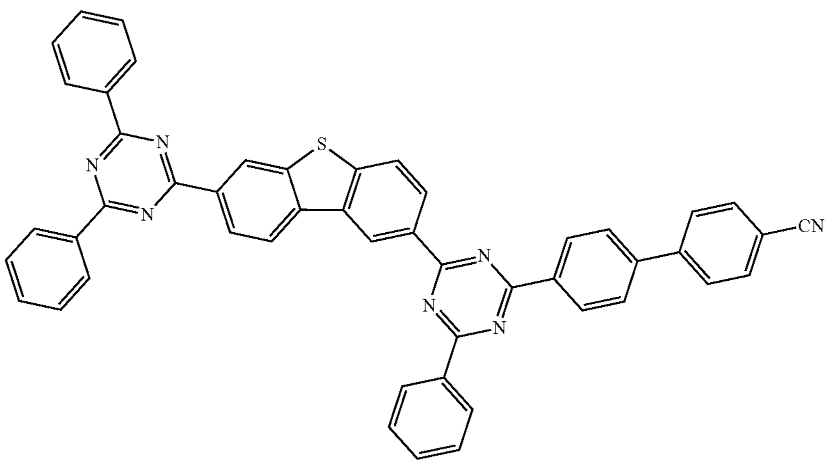
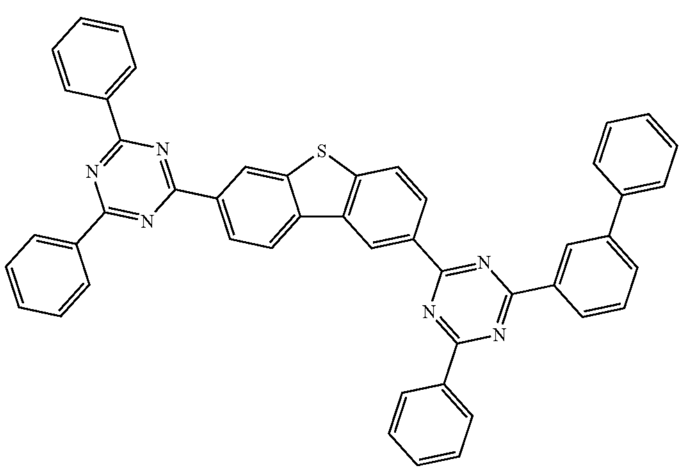

-continued
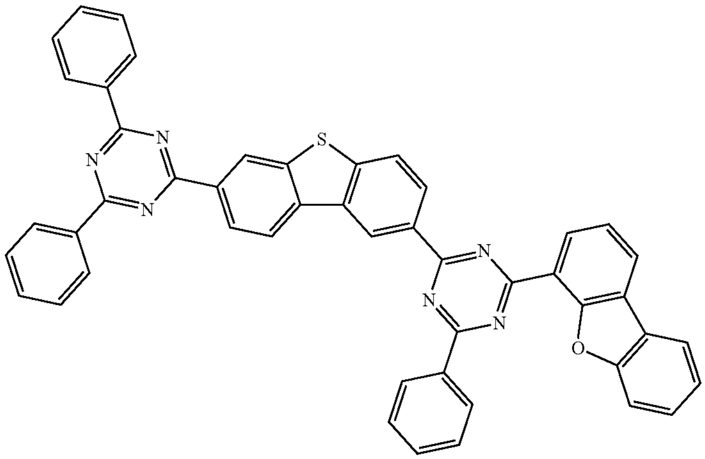
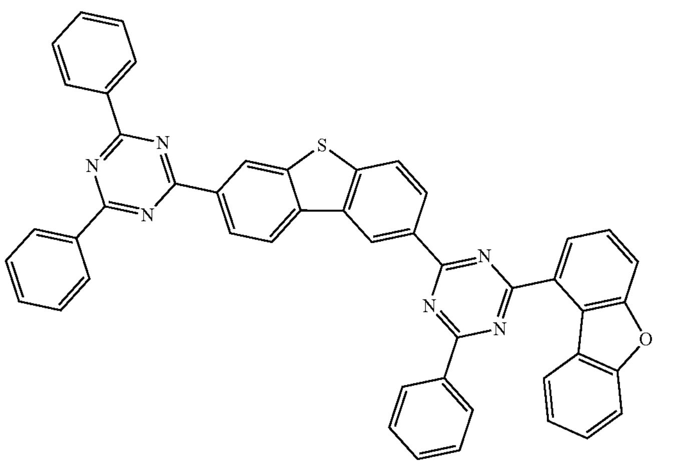
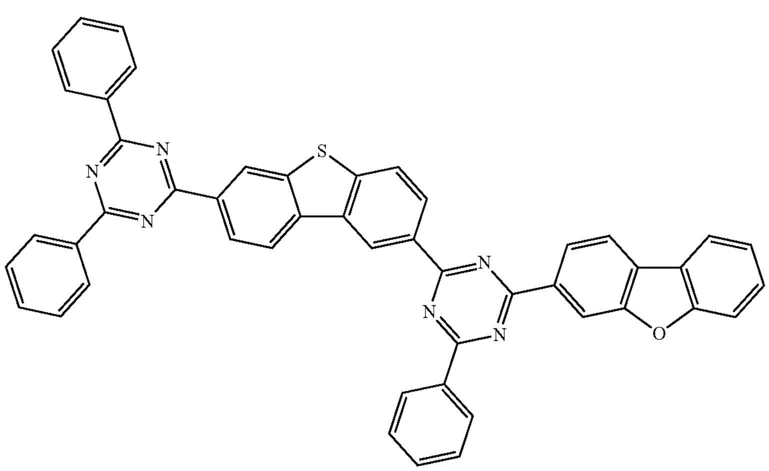

-continued
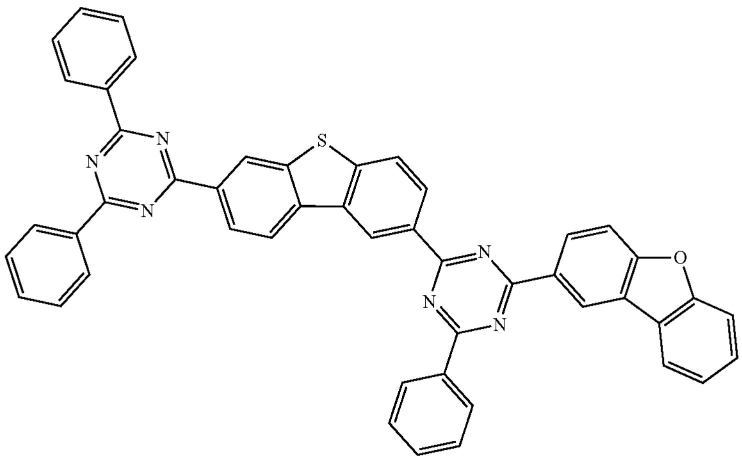
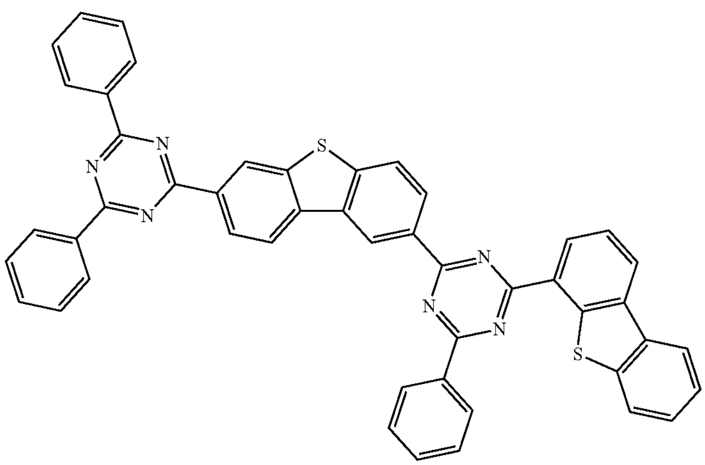
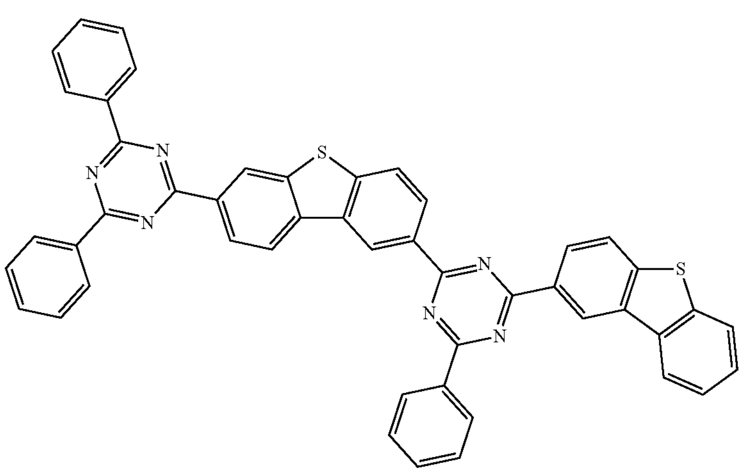

-continued
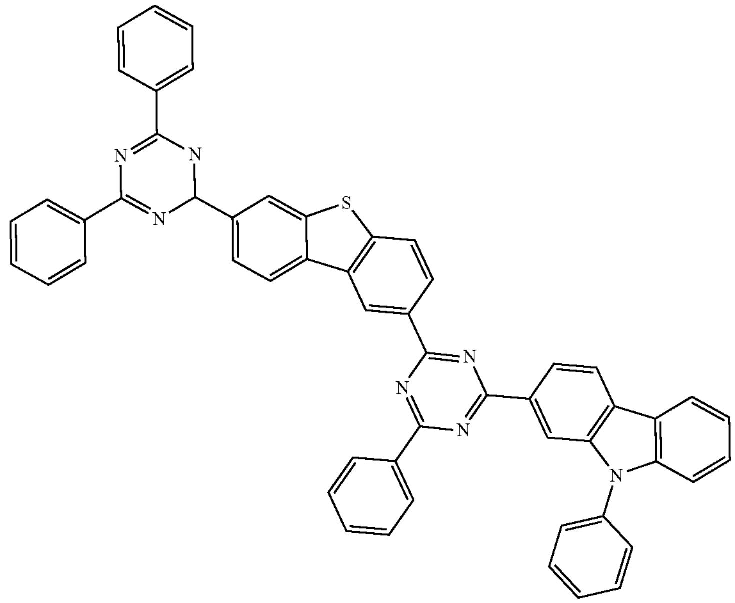
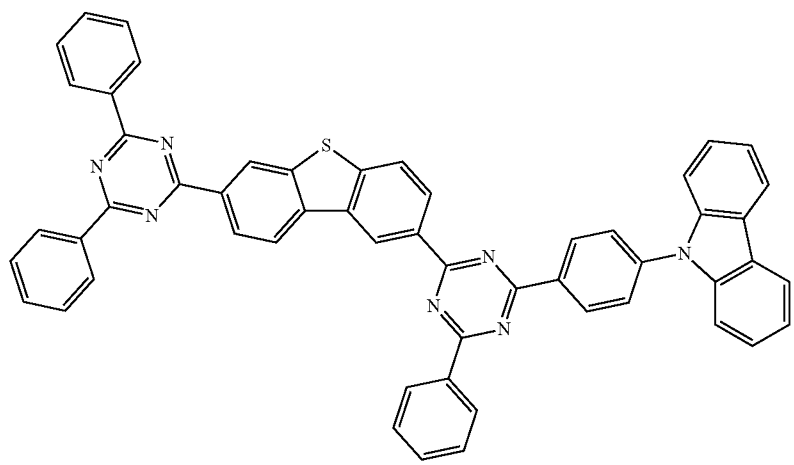
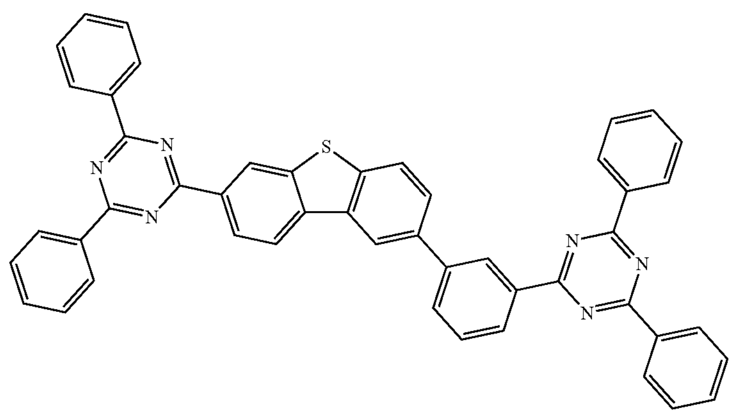

-continued
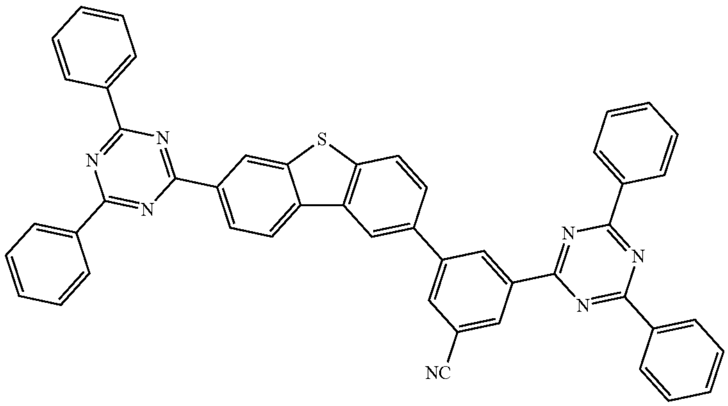
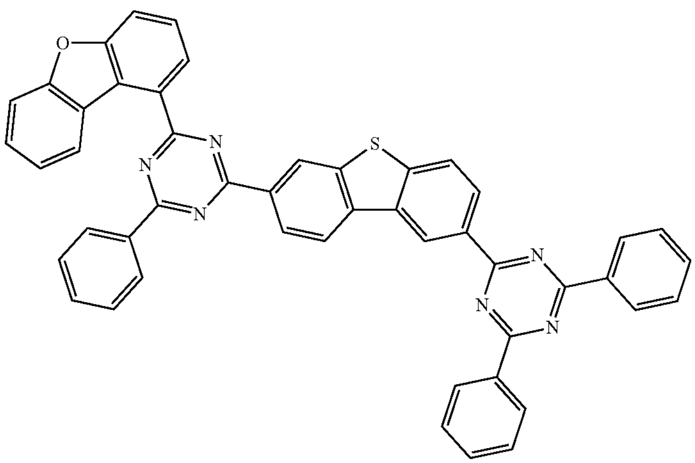
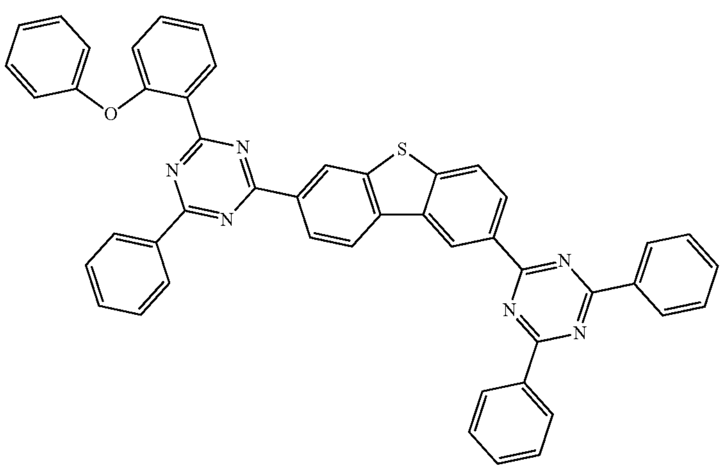

-continued
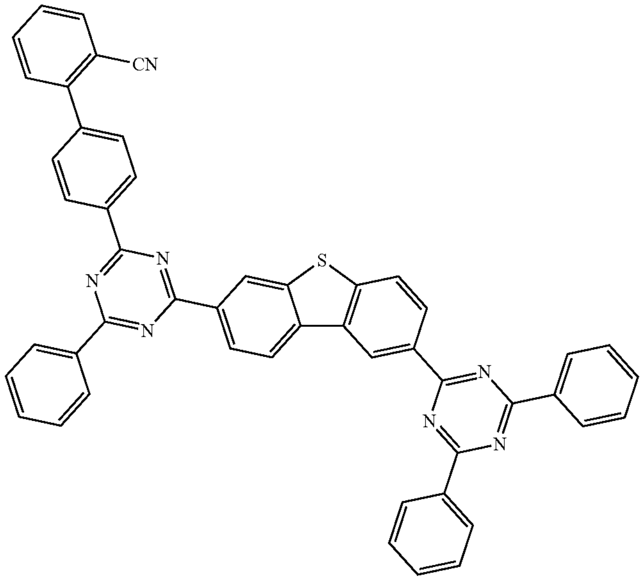
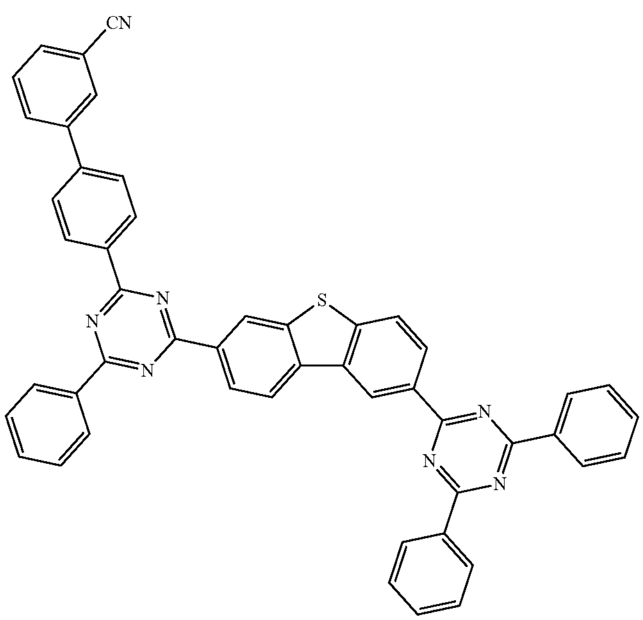

-continued
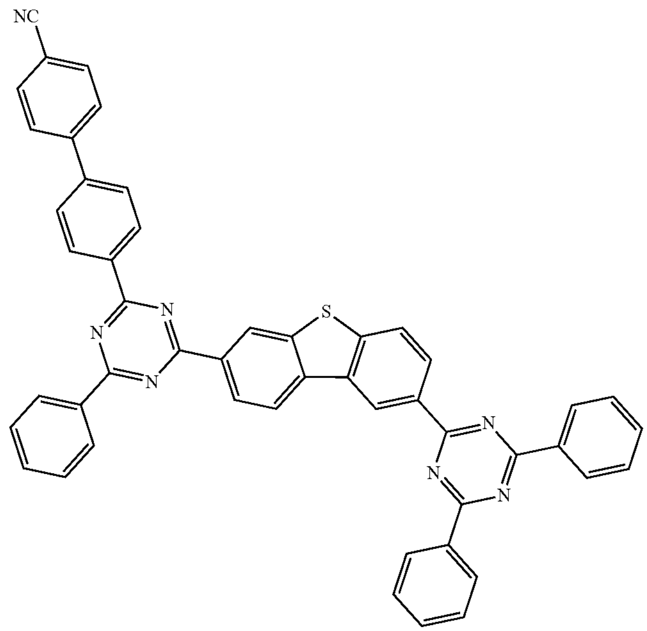
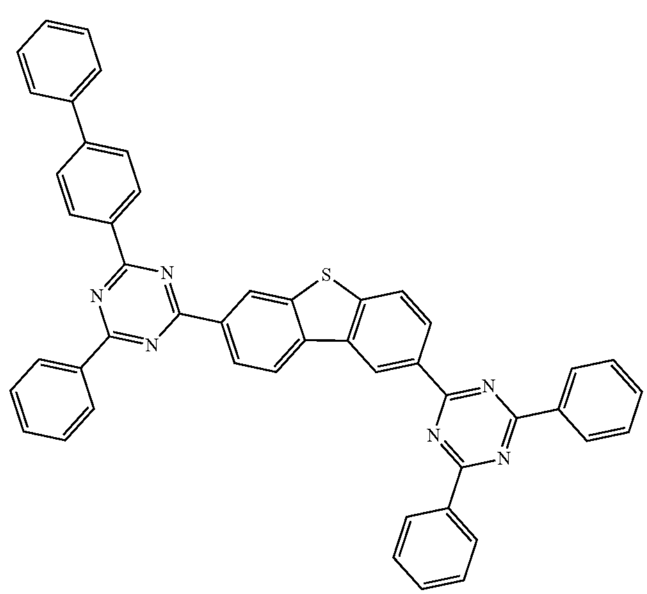

-continued
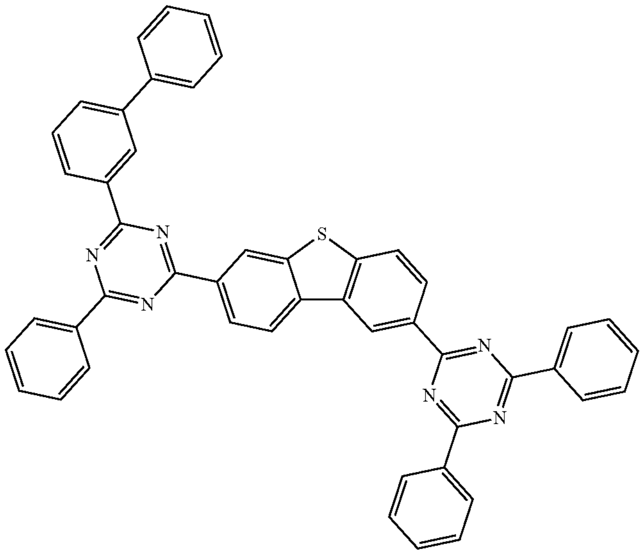
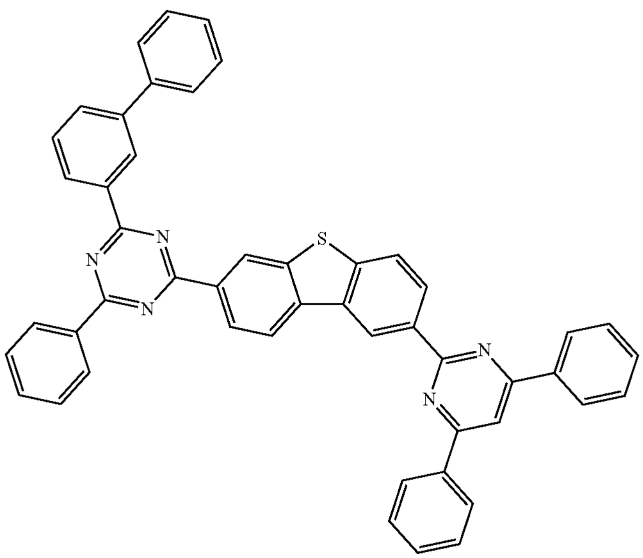
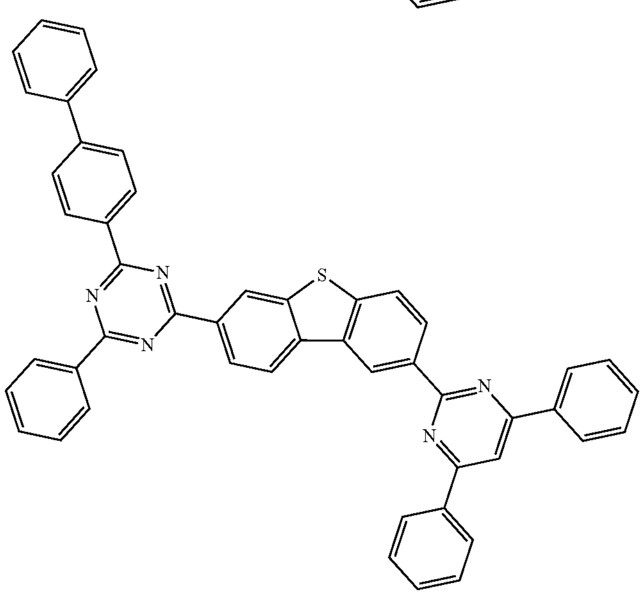

-continued
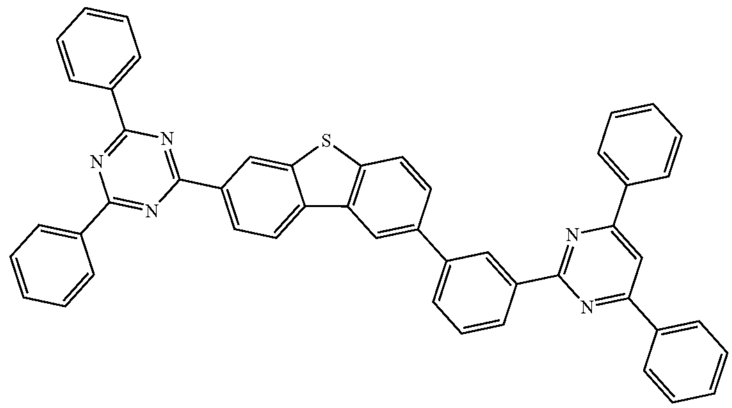
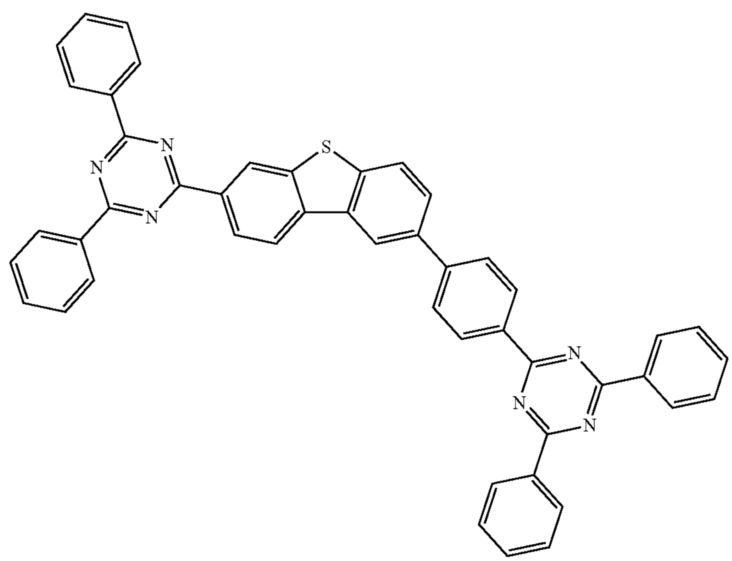
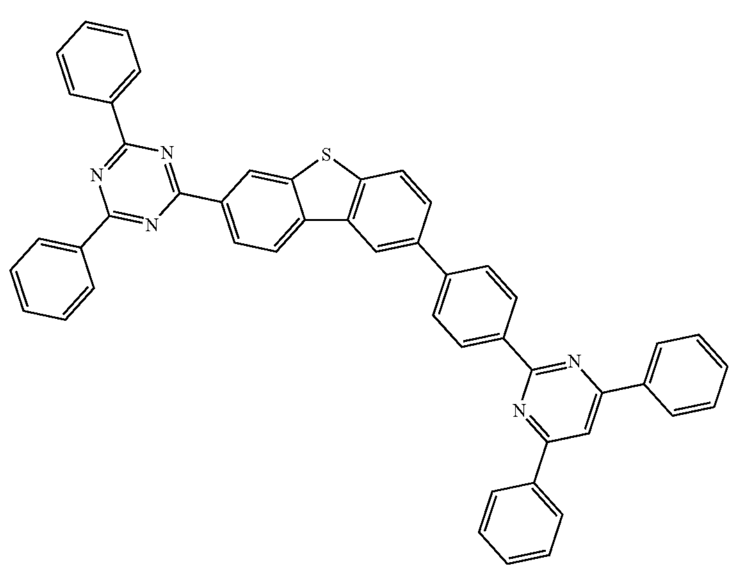

-continued
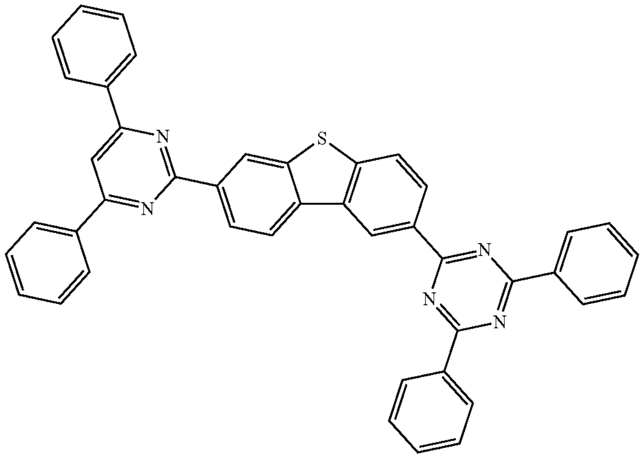
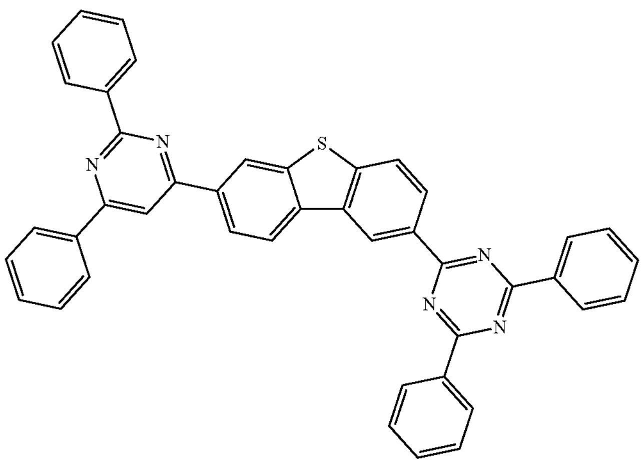
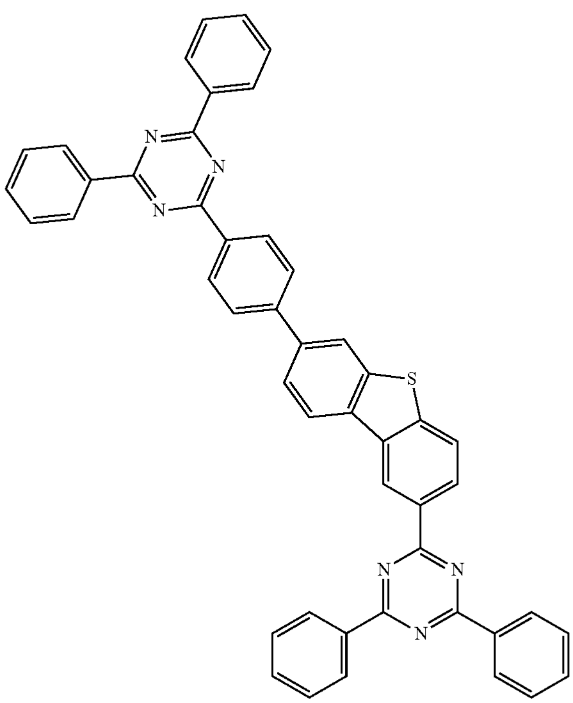

-continued
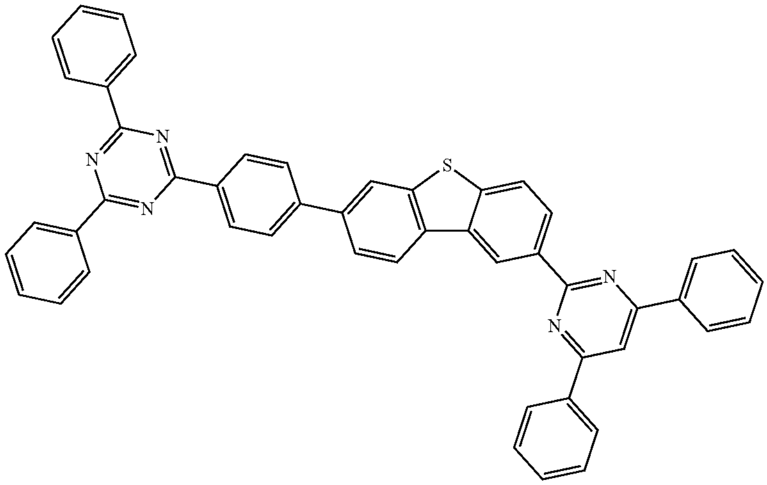
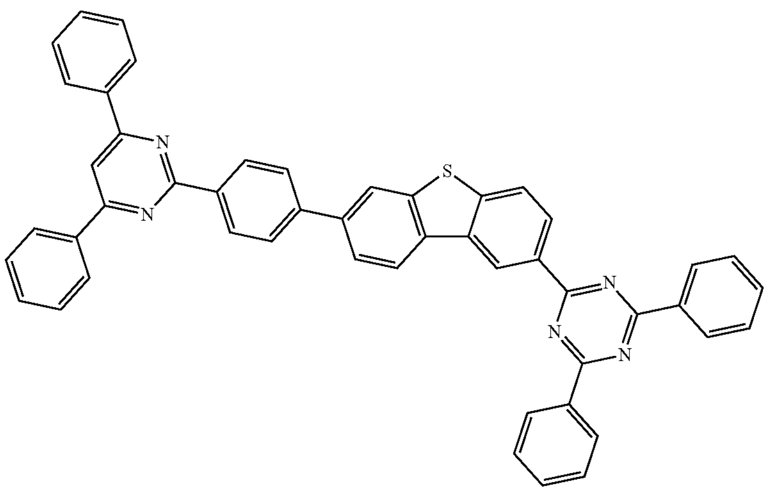
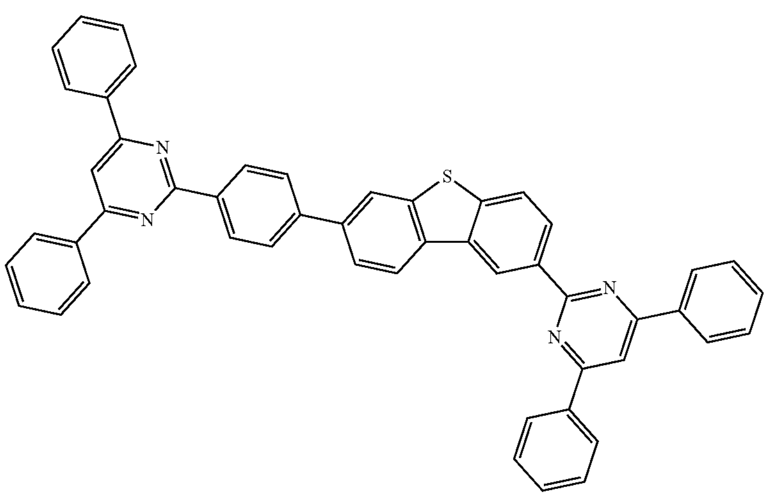

-continued
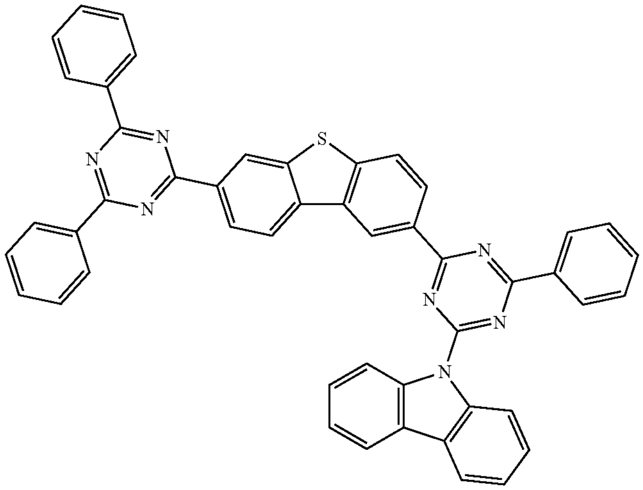
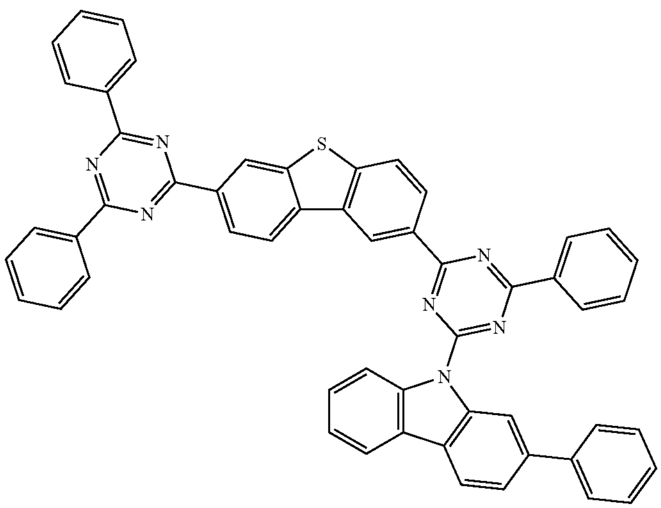
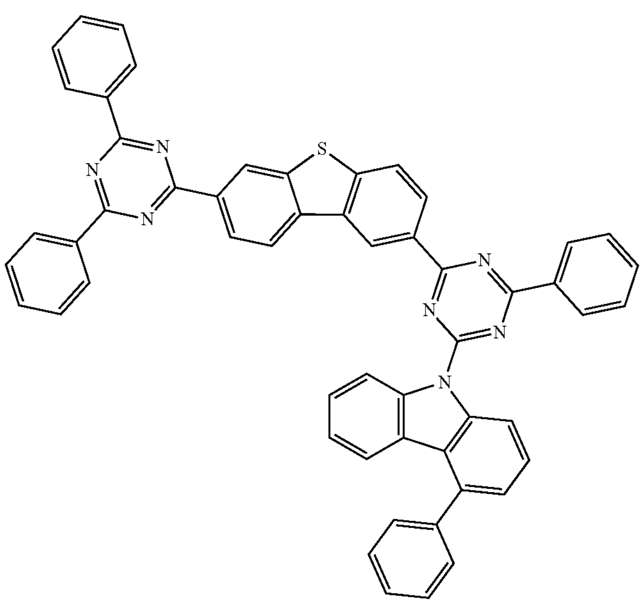

-continued
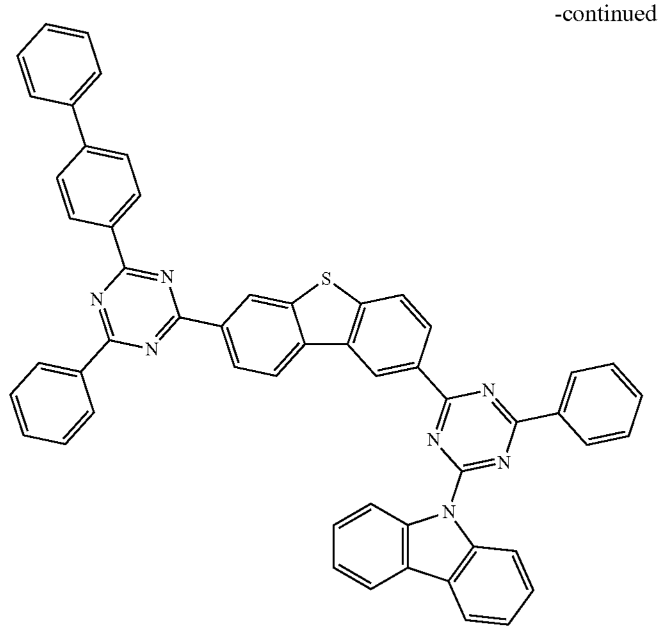
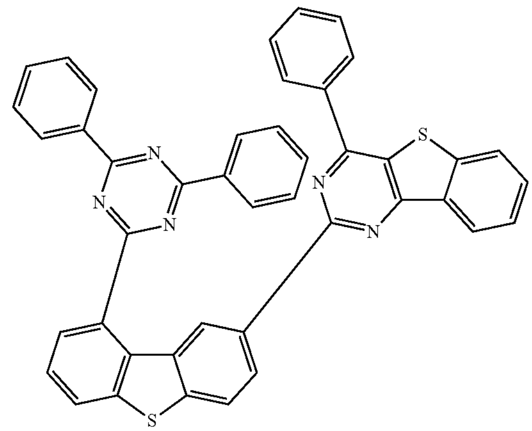
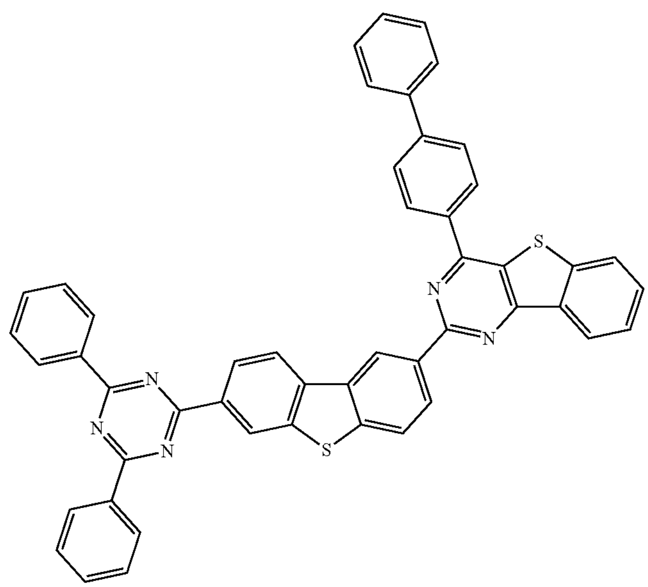
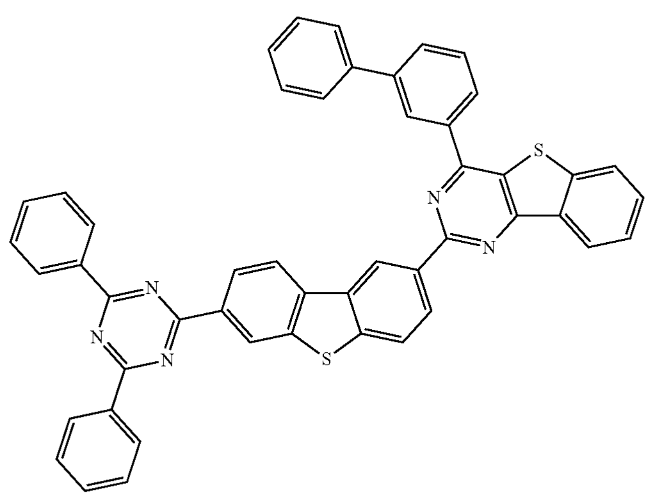

-continued
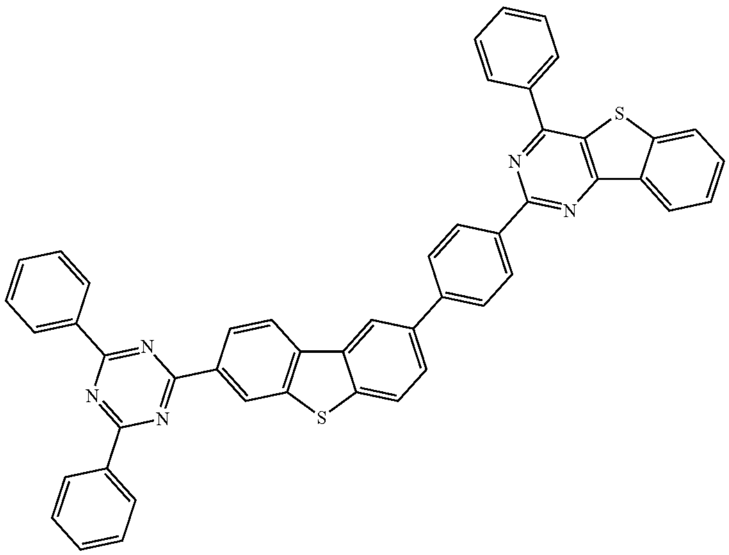
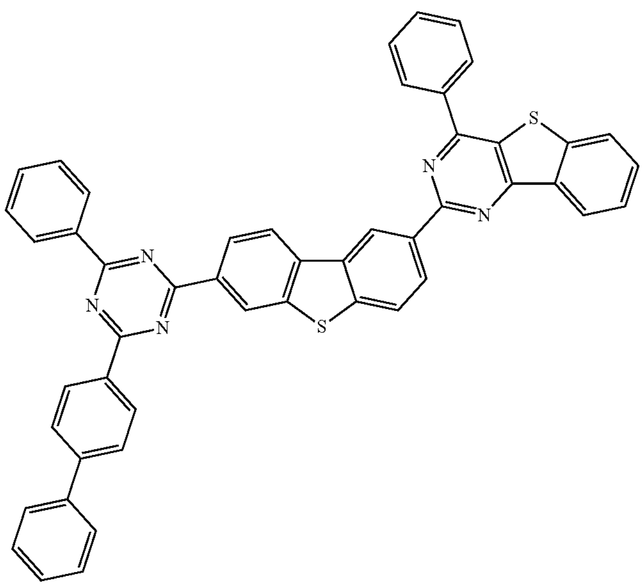
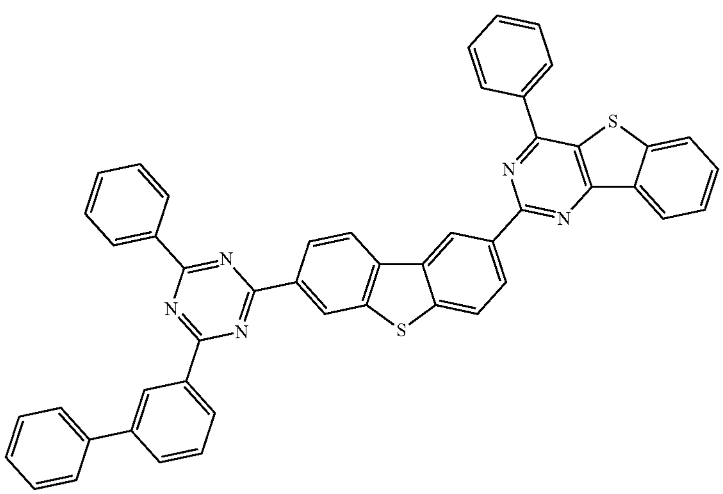

-continued
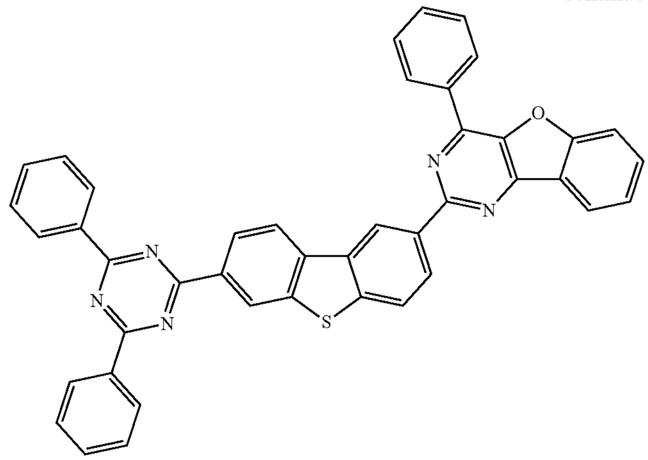
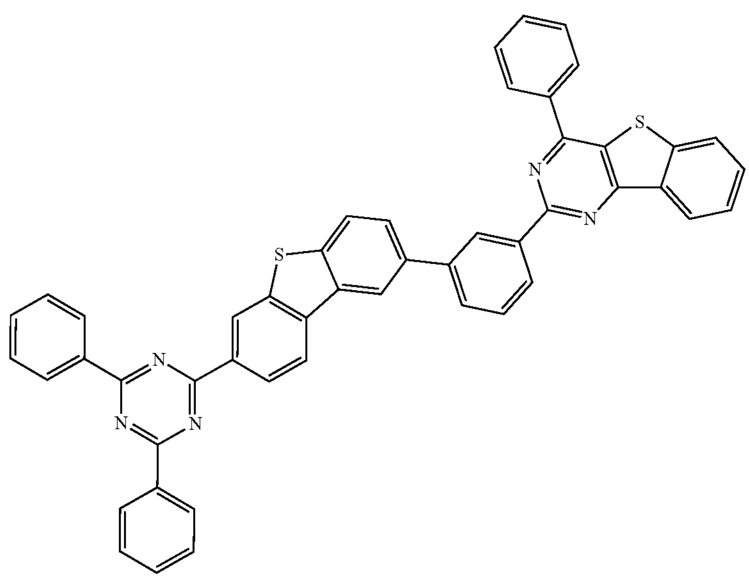
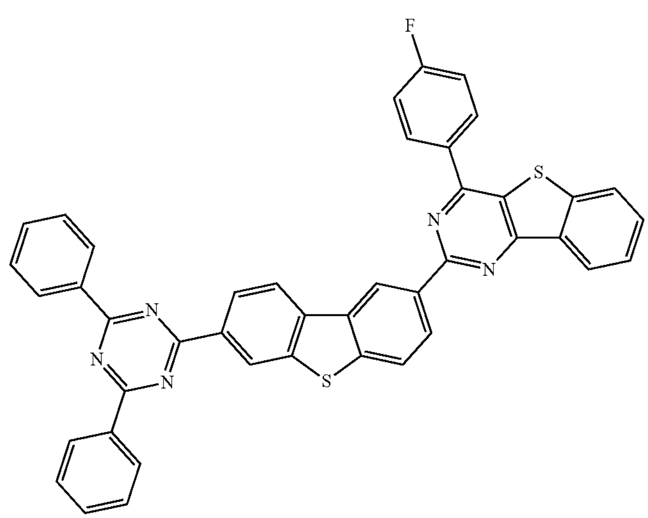

-continued
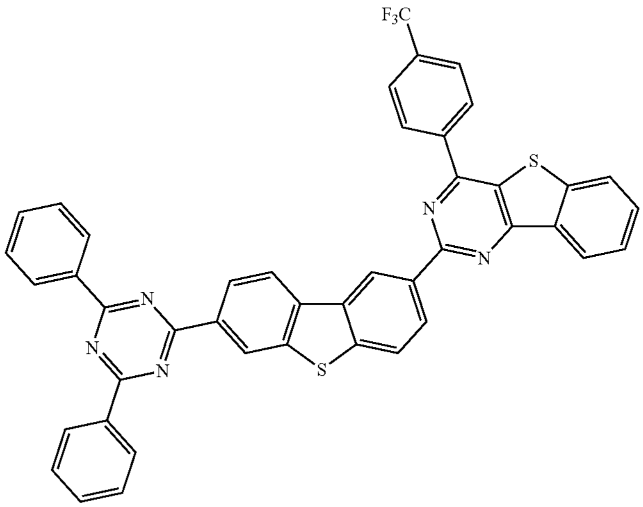
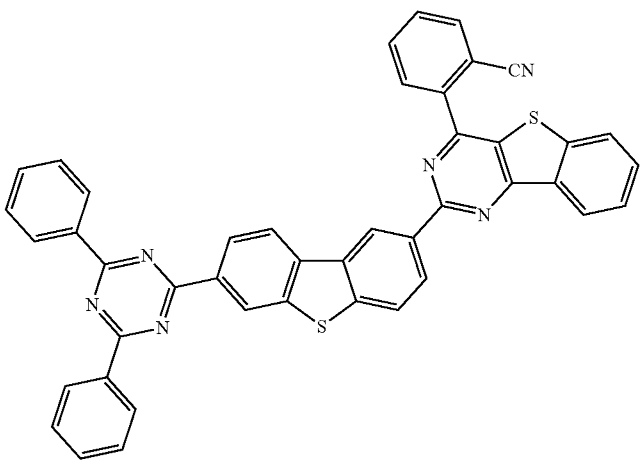
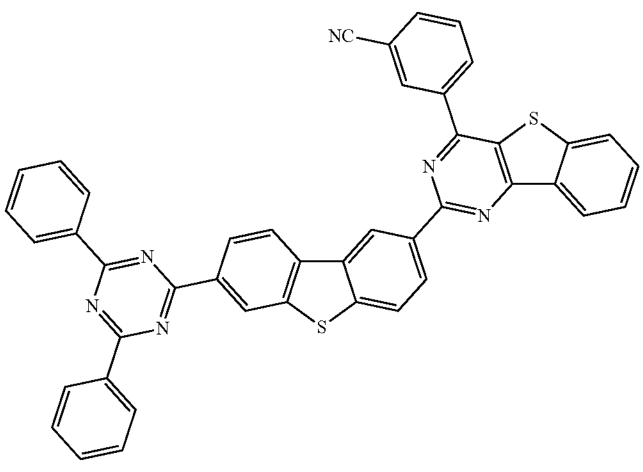

-continued
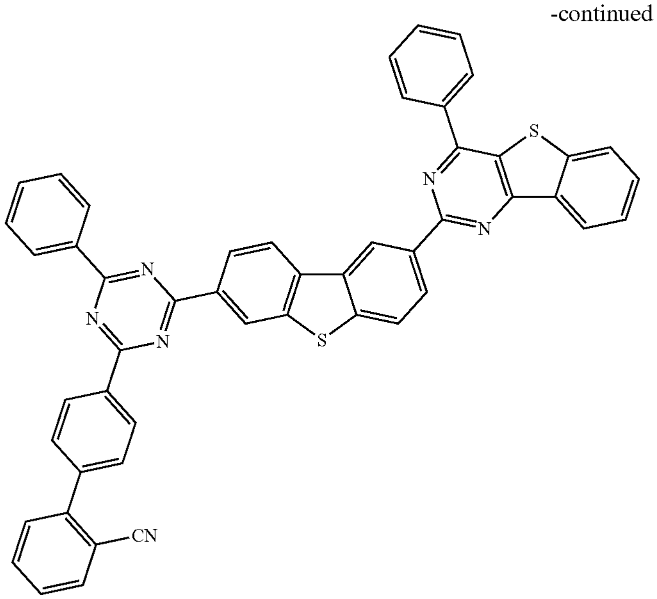
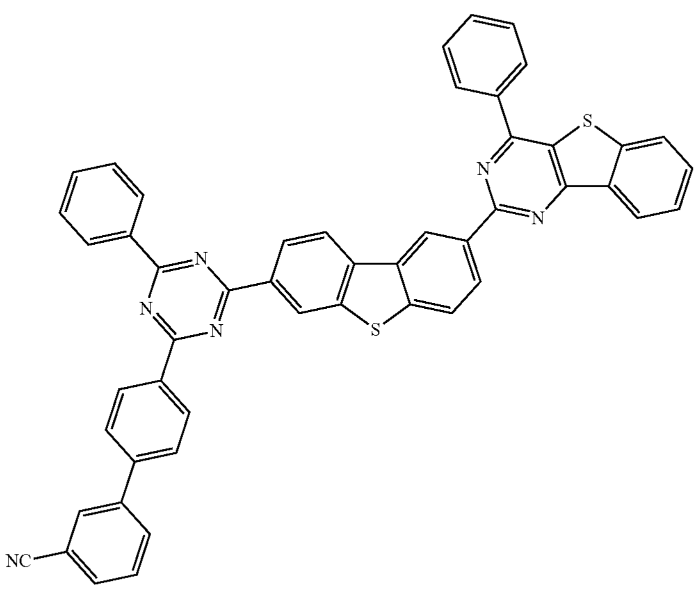

-continued
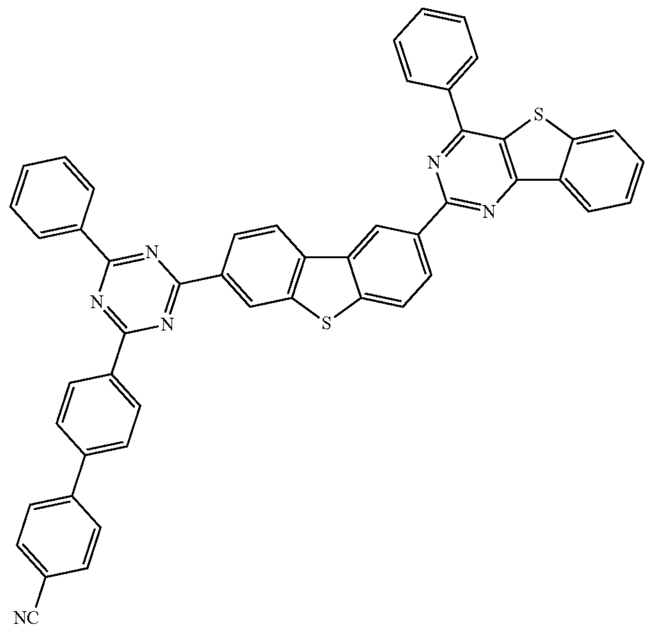
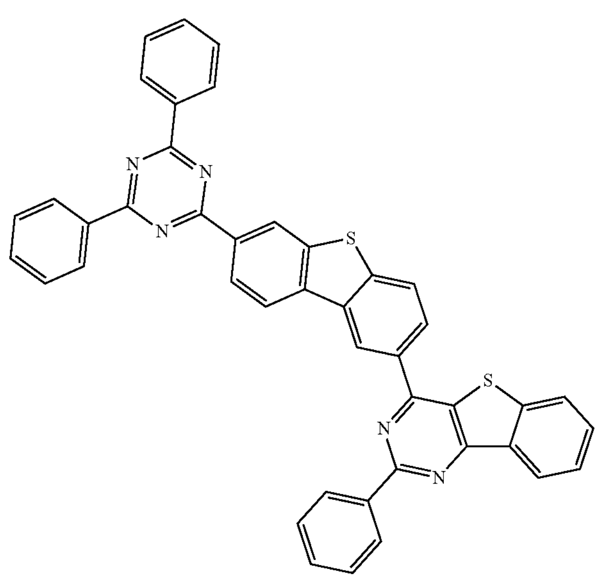

-continued
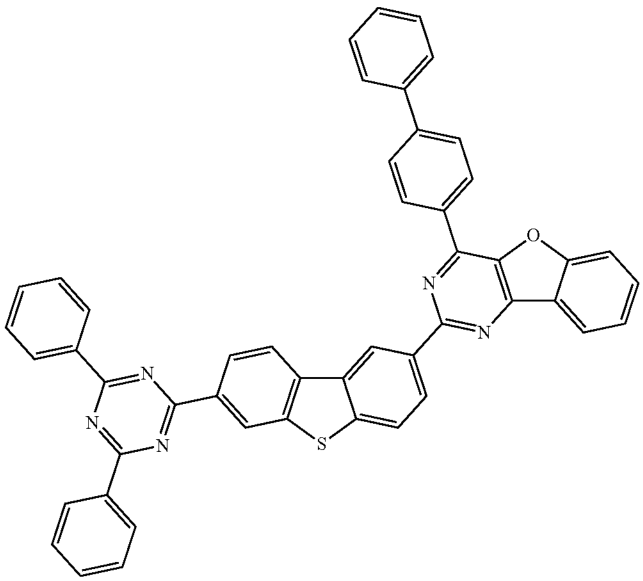
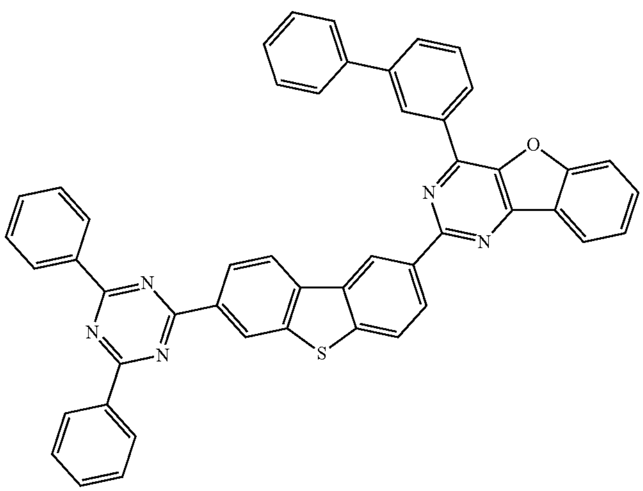
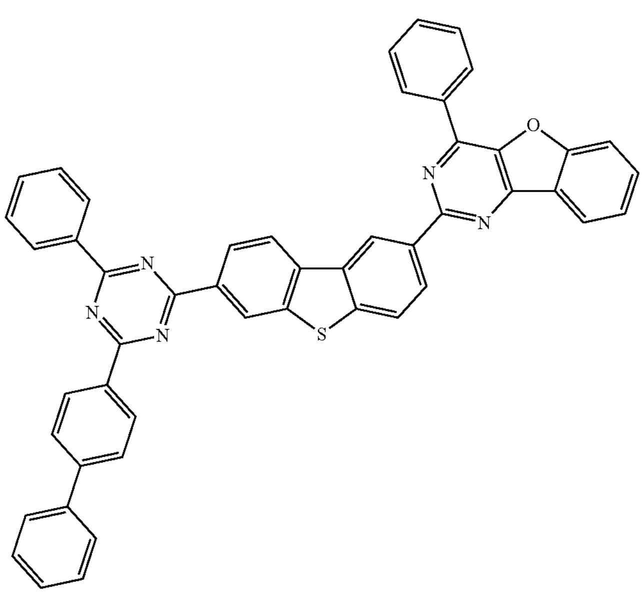

-continued
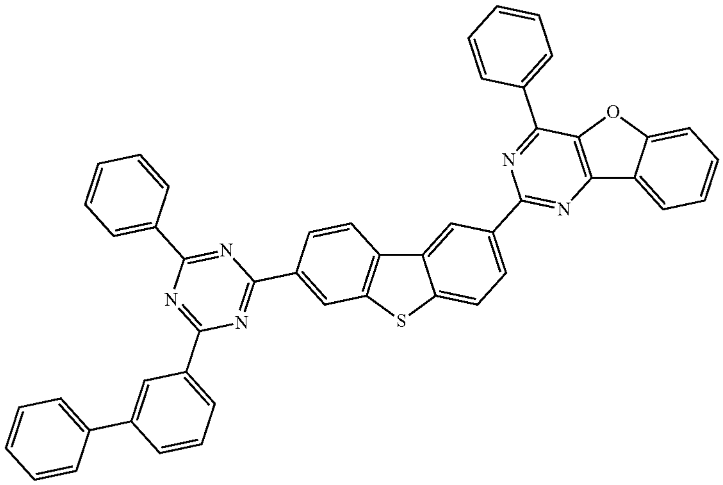
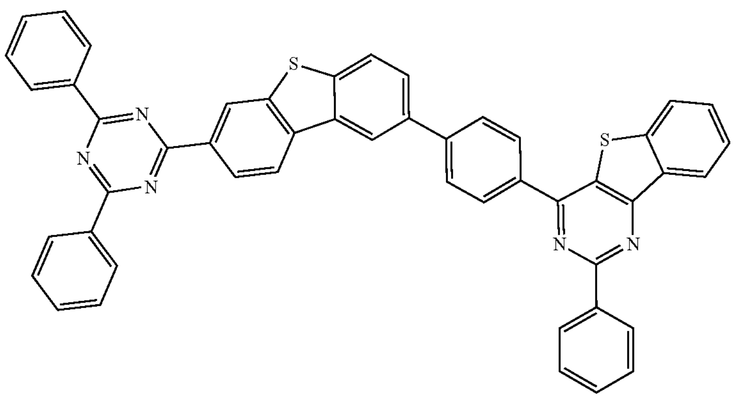
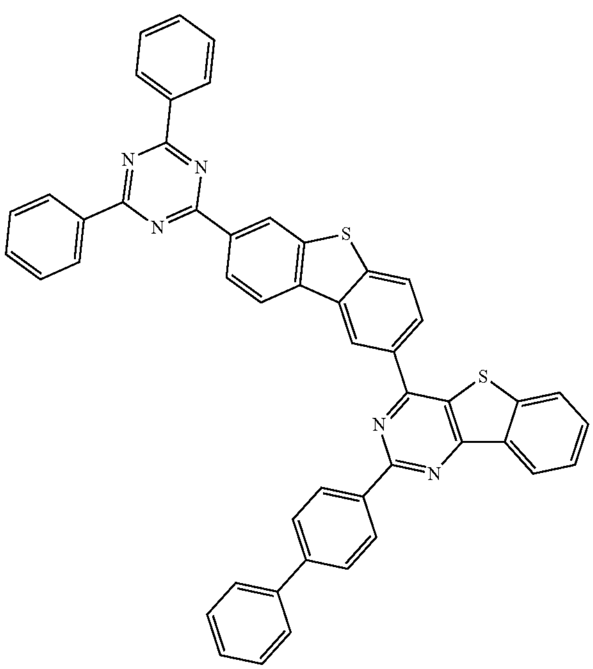
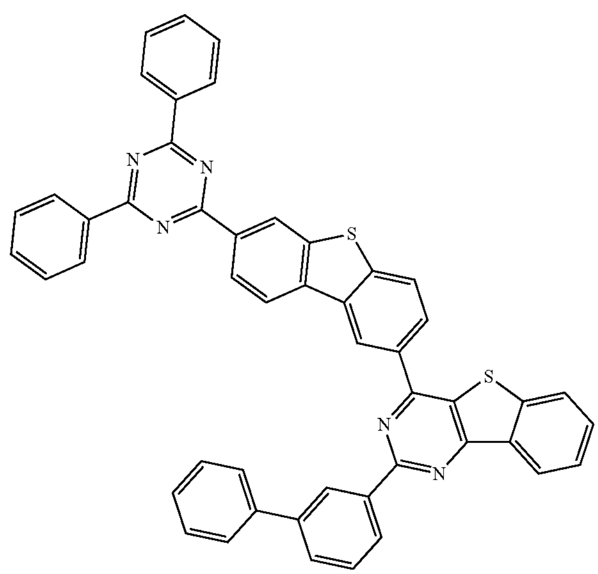

-continued
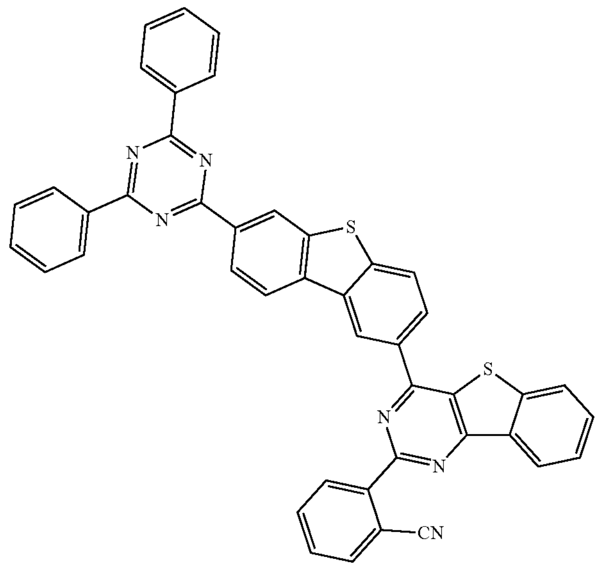
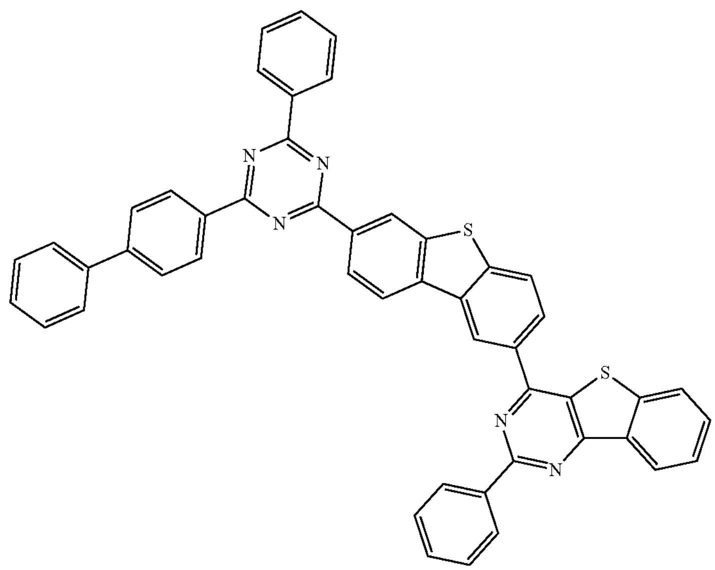
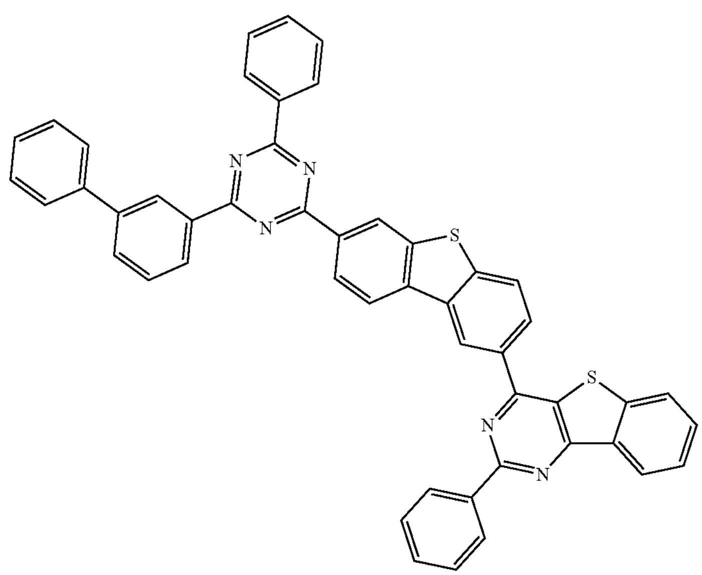

-continued

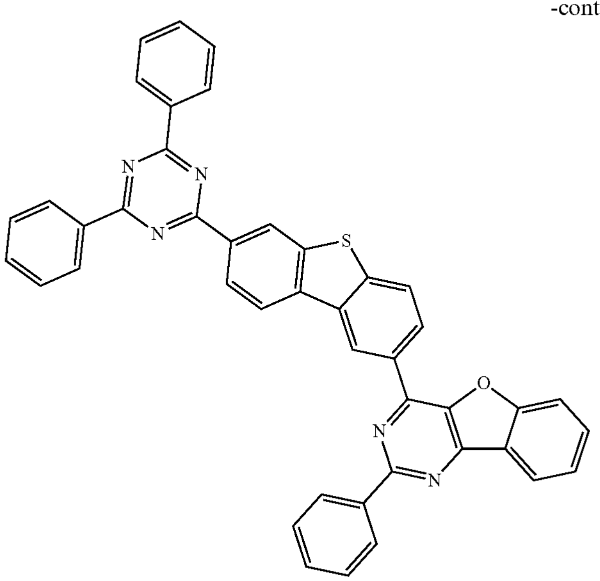

In addition, some of the compounds of Chemical Formula 2 can be prepared by the method as shown in Chemical Scheme 2 below, and can also be applied to the remaining compounds.

Reaction Scheme 2

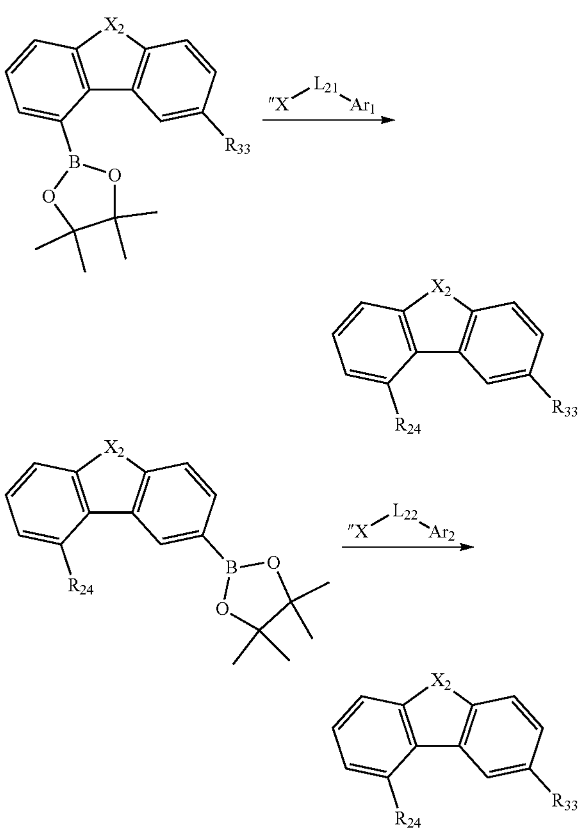

In Reaction Scheme 2, the remaining definitions excluding X" are the same as defined above, and X" is halogen and more preferably bromo or chloro.

The above reaction is a Suzuki coupling reaction, which is preferably carried out in the presence of a palladium catalyst and a base, and a reactive group for the Suzuki coupling reaction can be modified as known in the art. The above preparation method will be more specifically described in the Preparation Examples described hereinafter.

In the light emitting layer, the weight ratio of the compound of Chemical Formula 1 and the compound of Chemical Formula 2 is preferably 99:1 to 1:99, or 95:5 to 5:95.

Meanwhile, the dopant material can be an aromatic amine derivative, a styrylamine compound, a boron complex, a fluoranthene compound, a metal complex, and the like. Specifically, the aromatic amine derivative is a substituted or unsubstituted fused aromatic ring derivative having an arylamino group, and examples thereof include pyrene, anthracene, chrysene, periflanthene and the like, which have an arylamino group. The styrylamine compound is a compound where at least one arylvinyl group is substituted in substituted or unsubstituted arylamine, in which one or two or more substituent groups selected from the group consisting of an aryl group, a silyl group, an alkyl group, a cycloalkyl group, and an arylamino group are substituted or unsubstituted. Specific examples thereof include styrylamine, styryldiamine, styryltriamine, styryltetramine, and the like, but are not limited thereto. Further, the metal complex includes an iridium complex, a platinum complex, and the like, but is not limited thereto.

Electron Transport Layer

The electron transport layer is a layer which receives electrons from an electron injection layer and transports the electrons to a light emitting layer, and an electron transport material is suitably a material which can receive electrons well from a cathode and transfer the electrons to a light emitting layer and has large mobility for electrons. Specific examples thereof include: an Al complex of 8-hydroxyquinoline, a complex including $Alq_3$, an organic radical compound, a hydroxyflavone-metal complex, and the like, but are not limited thereto. The electron transport layer can be used with any desired cathode material, as used according to the related art. In particular, appropriate examples of the cathode material are a typical material which has a low work function, followed by an aluminum layer or a silver layer.

Specific examples thereof include cesium, barium, calcium, ytterbium, and samarium, in each case followed by an aluminum layer or a silver layer.

Electron Injection Layer

The organic light emitting device of the present invention can include the electron injection layer between the electron transport layer and the cathode, if necessary. The electron injection layer is a layer which injects electrons from an electrode, and is preferably a compound which has a capability of transporting electrons, has an effect of injecting electrons from a cathode and an excellent effect of injecting electrons into a light emitting layer or a light emitting material, prevents excitons produced from the light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, a metal complex compound, a nitrogen-containing 5-membered ring derivative, and the like, but are not limited thereto.

Examples of the metal complex compound include 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato)(1-naphtholato)aluminum, bis(2-methyl-8-quinolinato)-(2-naphtholato)gallium, and the like, but are not limited thereto.

Organic Light Emitting Device

The structure of an organic light emitting device according to the present invention is illustrated in FIG. 1. FIG. 1 shows an example of an organic light emitting device comprising a substrate 1, an anode 2, a light emitting layer 3, and a cathode 4. In such a structure, the compound of Chemical Formula 1 and the compound of Chemical Formula 2 can be included in the light emitting layer.

FIG. 2 shows an example of an organic light emitting device comprising a substrate 1, an anode 2, a hole injection layer 5, a hole transport layer 6, a light emitting layer 7, an electron transport layer 8 and a cathode 4. In such a structure, the compound of Chemical Formula 1 and the compound of Chemical Formula 2 can be included in the light emitting layer.

FIG. 3 shows an example of an organic light emitting device comprising a substrate 1, an anode 2, a hole injection layer 5, a hole transport layer 6, an electron blocking layer 9, a light emitting layer 7, an electron transport layer 8, an electron injection layer 10 and a cathode 4. In such a structure, the compound of Chemical Formula 1 and the compound of Chemical Formula 2 can be included in the light emitting layer.

FIG. 4 shows an example of an organic light emitting device comprising a substrate 1, an anode 2, a hole injection layer 5, a hole transport layer 6, a light emitting layer 7, a hole blocking layer 11, an electron transport layer 8, an electron injection layer 10 and a cathode 4. In such a structure, the compound of Chemical Formula 1 and the compound of Chemical Formula 2 can be included in the light emitting layer.

The organic light emitting device according to the present invention can be manufactured by sequentially laminating the above-mentioned components. In this case, the organic light emitting device can be manufactured can be manufactured by depositing a metal, metal oxides having conductivity, or an alloy thereof on the substrate using a PVD (physical vapor deposition) method such as a sputtering method or an e-beam evaporation method to form an anode, forming the above-mentioned respective layers thereon, and then depositing a material that can be used as the cathode thereon. In addition to such a method, the organic light emitting device can be manufactured by sequentially depositing a cathode material, an organic material layer and an anode material on a substrate. Further, the light emitting layer can be formed using the host and the dopant by a solution coating method as well as a vacuum deposition method. Herein, the solution coating method means a spin coating, a dip coating, a doctor blading, an inkjet printing, a screen printing, a spray method, a roll coating, or the like, but is not limited thereto.

In addition to such a method, the organic light emitting device can be manufactured by sequentially depositing a cathode material, an organic material layer and an anode material on a substrate (International Publication WO2003/012890). However, the manufacturing method is not limited thereto.

Meanwhile, the organic light emitting device according to the present invention can be a front side emission type, a backside emission type, or a double-sided emission type according to the used material.

The preparation of the organic light emitting device according to the present invention will be described in detail in the following examples. However, these examples are presented for illustrative purposes only, and are not intended to limit the scope of the present invention.

Preparation Example 1

Preparation Example 1-1: Preparation of Intermediate Compound A-4

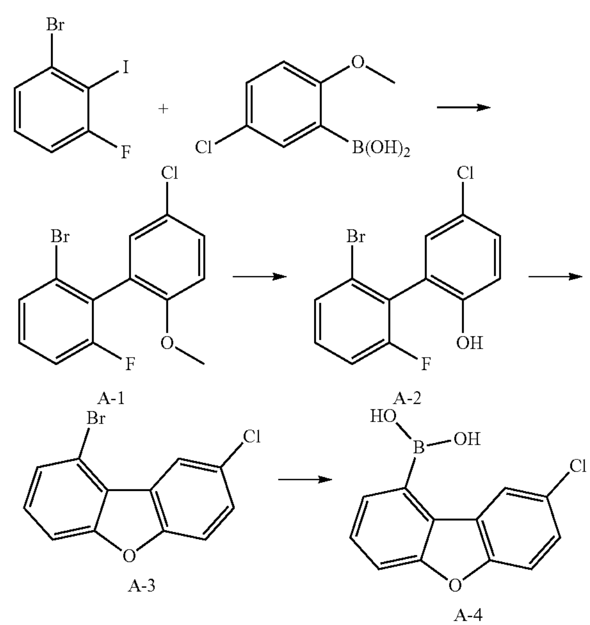

1) Preparation of Compound A-1

1-Bromo-3-fluoro-2-iodobenzene (75 g, 249.3 mmol) and (5-chloro-2-methoxyphenyl)boronic acid (51.1 g, 249.3 mmol) were dissolved in tetrahydrofuran (550 mL). 2M sodium carbonate ($Na_2CO_3$) solution (350 mL) and tetrakis (triphenylphosphine)palladium(0) (2.88 g, 2.49 mmol) were added thereto and the mixture was refluxed for 11 hours. After completion of the reaction, the reaction mixture was cooled to room temperature, the aqueous layer was separated and removed, dried over anhydrous magnesium sulfate and then concentrated under reduced pressure. The resulting mixture was recrystallized from chloroform and ethanol to give Compound A-1 (63.2 g, yield: 80%; MS: $[M+H]^+$=314).

2) Preparation of Compound A-2

Compound A-1 (63.2 g, 200.3 mmol) was dissolved in dichloromethane (750 mL) and then cooled to 0° C. Boron tribromide (20.0 mL, 210.3 mmol) was added slowly dropwise thereto and then stirred for 12 hours. After completion of the reaction, the reaction mixture was washed three times with water, dried over magnesium sulfate and filtered. The filtrate was distilled under reduced pressure and purified by column chromatography to give Compound A-2 (57.9 g, yield: 96%; MS: $[M+H]^+$=300).

3) Preparation of Compound A-3

Compound A-2 (57.9 g, 192.0 mmol) and calcium carbonate (79.6 g, 576.0 mol) were dissolved in N-methyl-2-pyrrolidone (350 mL), and then heated and stirred for 2 hours. The temperature was lowered to room temperature, subjected to reverse precipitation in water and filtered. The reaction mixture was completely dissolved in dichloromethane, washed with water, dried over anhydrous magnesium sulfate, then concentrated under reduced pressure, recrystallized with ethanol and then dried to give Compound A-3 (42.1 g, yield: 78%; MS: $[M+H]^+$=280).

4) Preparation of Compound A-4

After Compound A-3 (42.1 g, 149.5 mmol) was dissolved in tetrahydrofuran (330 mL), the temperature was lowered to −78° C. and 2.5 M tert-butyllithium (t-BuLi) (60.4 mL, 151.0 mmol) was slowly added thereto. After stirring for 1 hour at the same temperature, triisopropyl borate (51.8 mL, 224.3 mmol) was added thereto and then stirred for 3 hours while gradually raising the temperature to room temperature. 2N aqueous hydrochloric acid solution (300 mL) was added to the reaction mixture, which was then stirred for 1.5 hours at room temperature. The produced precipitate was filtered, washed sequentially with water and ethyl ether, and then dried under vacuum to give Compound A-4 (34.3 g, yield: 93%; MS: $[M+H]^+$=247).

Preparation Example 1-2: Preparation of Intermediate Compound B-5

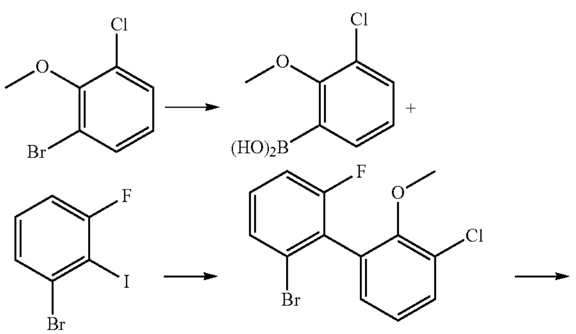

B-2

-continued

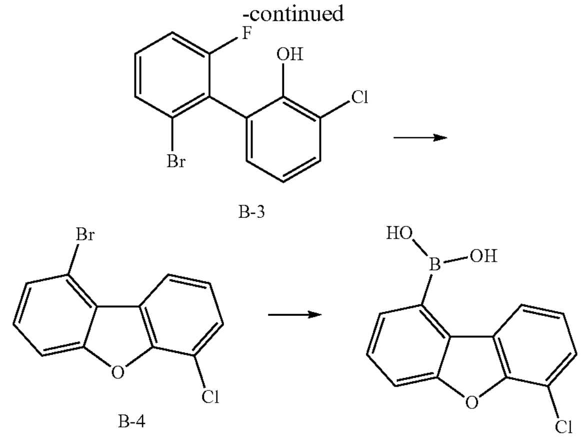

B-3

B-4

B-5

1) Preparation of Compound B-1

After 1-bromo-3-chloro-2-methoxybenzene (100.0 g, 451.5 mmol) was dissolved in tetrahydrofuran (1000 mL), the temperature was lowered to −78° C. and 2.5 M tert-butyllithium (t-BuLi) (182.4 mL, 456.0 mmol) was slowly added thereto. After stirring for 1 hour at the same temperature, triisopropyl borate ($B(OiPr)_3$) (156.3 mL, 677.3 mmol) was added thereto and then stirred for 3 hours while gradually raising the temperature to room temperature. 2N aqueous hydrochloric acid solution (150 mL) was added to the reaction mixture, which was then stirred for 1.5 hours at room temperature. The produced precipitate was filtered, washed sequentially with water and ethyl ether, and then dried under vacuum. After drying, it was recrystallized with chloroform and ethyl acetate, and dried to give Compound B-1 (84.2 g, yield: 90%; MS:$[M+H]^+$=230).

2) Preparation of Compound B-2

Compound B-2 (74.6 g, yield: 52%; MS:$[M+H]^+$=314) was prepared in the same manner as in the preparation method of Compound A-1 of Preparation Example 1, except that Compound B-1 (84.2 g, 451.7 mmol) was used instead of (5-chloro-2-methoxyphenyl)boronic acid.

3) Preparation of Compound B-3

Compound B-3 (60.3 g, yield: 85%; MS:$[M+H]^+$=300) was prepared in the same manner as in the preparation method of Compound A-2, except that Compound B-2 (74.6 g, 236.4 mmol) was used instead of Compound A-1.

4) Preparation of Compound B-4

Compound B-4 (48.1 g, yield: 85%; MS:$[M+H]^+$=280) was prepared in the same manner as in the preparation method of Compound A-3, except that Compound B-3 (60.3 g, 199.9 mmol) was used instead of Compound A-2.

5) Preparation of Compound B-5

Compound B-5 (40.1 g, yield: 95%; MS:$[M+H]^+$=247) was prepared in the same manner as in the preparation method of Compound A-4, except that Compound B-4 (48.1 g, 170.9 mmol) was used instead of Compound A-3.

Preparation Example 1-3: Preparation of Intermediate Compound C-4

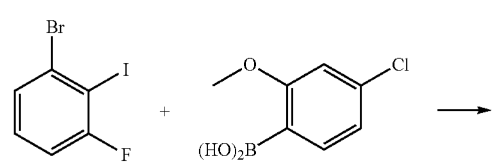

-continued

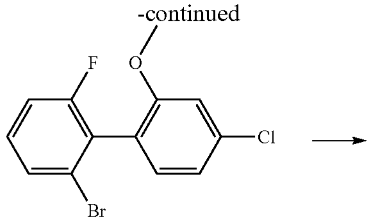

C-1

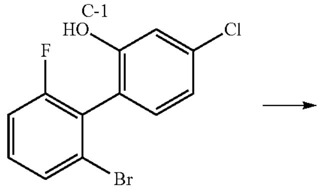

C-2

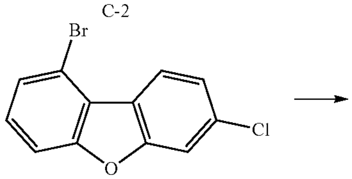

C-3

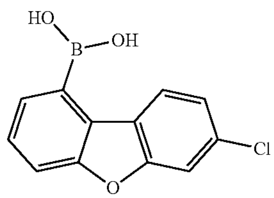

C-4

1) Preparation of Compound C-1

Compound C-1 (60.1 g, yield: 76%; MS:[M+H]$^+$=314) was prepared in the same manner as in the preparation method of Compound A-1 of Preparation Example 1, except that (4-chloro-2-methoxyphenyl)boronic acid (51.1 g, 249.3 mmol) was used instead of (5-chloro-2-methoxyphenyl) boronic acid.

2) Preparation of Compound C-2

Compound C-2 (54.0 g, yield: 94%; MS:[M+H]$^+$=300) was prepared in the same manner as in the preparation method of Compound A-2, except that Compound C-1 (60.1 g, 190.4 mmol) was used instead of Compound A-1.

3) Preparation of Compound C-3

Compound C-3 (42.2 g, yield: 83%; MS:[M+H]$^+$=280) was prepared in the same manner as in the preparation method of Compound A-3, except that Compound C-2 (54.0 g, 179.1 mmol) was used instead of Compound A-2.

4) Preparation of Compound C-4

Compound C-4 (34.1 g, yield: 92%; MS:[M+H]$^+$=247) was prepared in the same manner as in the preparation method of Compound A-4, except that Compound C-3 (42.2 g, 170.9 mmol) was used instead of Compound A-3.

Preparation Example 1-4: Preparation of Intermediate Compound D-4

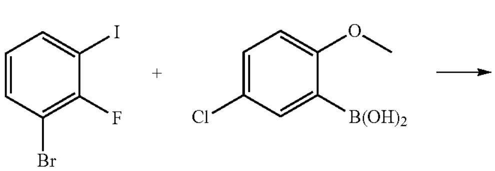

-continued

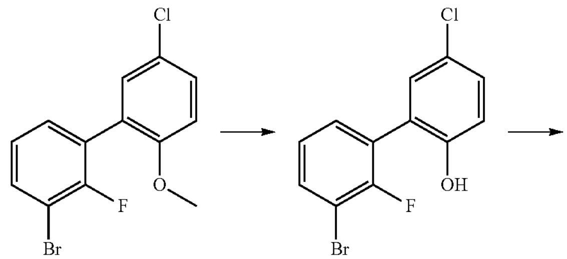

D-1 D-2

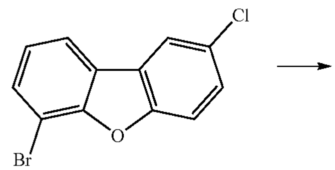

D-3

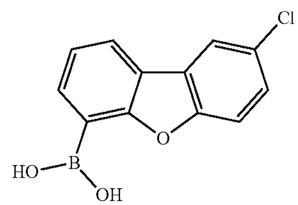

D-4

1) Preparation of Compound D-1

Compound D-1 (58 g, yield: 74%; MS:[M+H]$^+$=315) was prepared in the same manner as in the preparation method of Compound A-1 of Preparation Example 1, except that 1-bromo-2-fluoro-3-iodobenzene was used instead of 1-bromo-3-fluoro-2-iodobenzene.

2) Preparation of Compound D-2

Compound D-2 (49.5 g, yield: 89%; MS:[M+H]$^+$=300) was prepared in the same manner as in the preparation method of Compound A-2, except that Compound D-1 (58 g, 183.8 mmol) was used instead of Compound A-1.

3) Preparation of Compound D-3

Compound D-3 (40.6 g, yield: 88%; MS:[M+H]$^+$=280) was prepared in the same manner as in the preparation method of Compound A-3, except that Compound D-2 (49.5 g, 164.2 mmol) was used instead of Compound A-2.

4) Preparation of Compound D-4

Compound D-4 (31.9 g, yield: 90%; MS:[M+H]$^+$=247) was prepared in the same manner as in the preparation method of Compound A-4, except that Compound D-3 (40.6 g, 144.2 mmol) was used instead of Compound A-3.

Preparation Example 1-5: Preparation of Intermediate Compound E-4

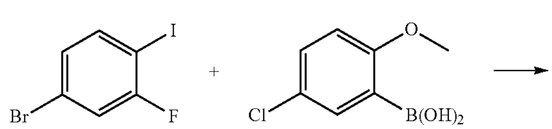

-continued

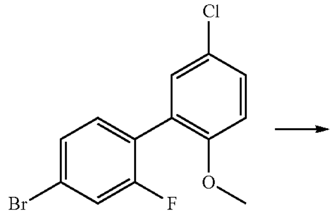

E-1

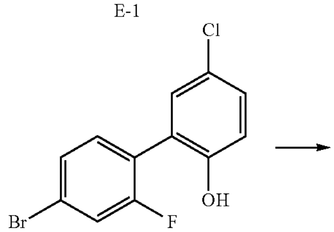

E-2

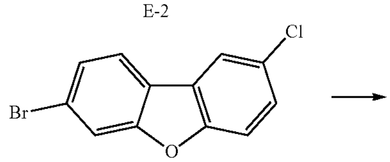

E-3

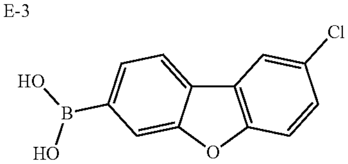

E-4

1) Preparation of Compound E-1

Compound E-1 (62.3 g, yield: 79%; MS:$[M+H]^+$=315) was prepared in the same manner as in the preparation method of Compound A-1 of Preparation Example 1, except that 4-bromo-2-fluoro-1-iodobenzene was used instead of 1-bromo-3-fluoro-2-iodobenzene.

2) Preparation of Compound E-2

Compound E-2 (51.7 g, yield: 87%; MS:$[M+H]^+$=300) was prepared in the same manner as in the preparation method of Compound A-2, except that Compound E-1 (62.3 g, 197.4 mmol) was used instead of Compound A-1.

3) Preparation of Compound E-3

Compound E-3 (41.8 g, yield: 87%; MS:$[M+H]^+$=280) was prepared in the same manner as in the preparation method of Compound A-3, except that Compound E-2 (51.7 g, 171.5 mmol) was used instead of Compound A-2.

4) Preparation of Compound E-4

Compound E-4 (31.2 g, yield: 85%; MS:$[M+H]^+$=247) was prepared in the same manner as in the preparation method of Compound A-4, except that Compound E-3 (41.8 g, 148.5 mmol) was used instead of Compound A-3.

Preparation Example 1-6: Preparation of Intermediate Compound F-4

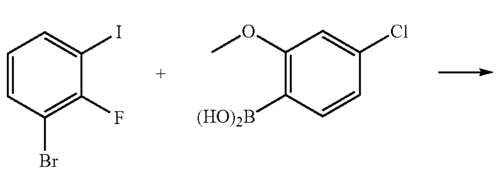

-continued

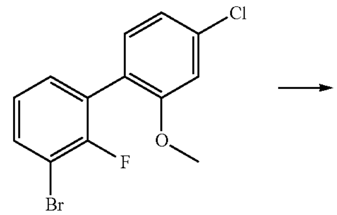

F-1

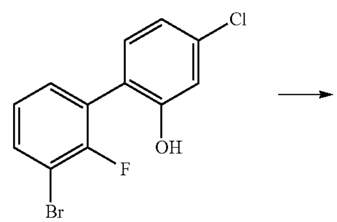

F-2

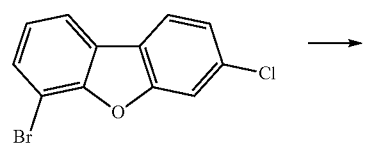

F-3

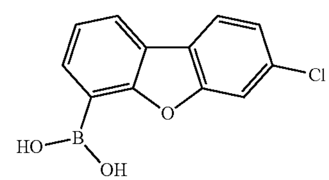

F-4

1) Preparation of Compound F-1

Compound F-1 (60.8 g, yield: 77%; MS:$[M+H]^+$=315) was prepared in the same manner as in the preparation method of Compound A-1 of Preparation Example 1, except that 1-bromo-2-fluoro-3-iodobenzene and (4-chloro-2-methoxyphenyl)boronic acid were used instead of 1-bromo-3-fluoro-2-iodobenzene and (5-chloro-2-methoxyphenyl) boronic acid.

2) Preparation of Compound F-2

Compound F-2 (52.0 g, yield: 90%; MS:$[M+H]^+$=300) was prepared in the same manner as in the preparation method of Compound A-2, except that Compound F-1 (60.8 g, 192.7 mmol) was used instead of Compound A-1.

3) Preparation of Compound F-3

Compound F-3 (42.0 g, yield: 86%; MS:$[M+H]^+$=280) was prepared in the same manner as in the preparation method of Compound A-3, except that Compound F-2 (52.0 g, 172.4 mmol) was used instead of Compound A-2.

4) Preparation of Compound F-4

Compound F-4 (29.8 g, yield: 81%; MS:$[M+H]^+$=247) was prepared in the same manner as in the preparation method of Compound A-4, except that Compound F-3 (42.0 g, 148.5 mmol) was used instead of Compound A-3.

Preparation Example 1-7: Preparation of Intermediate Compound G-5

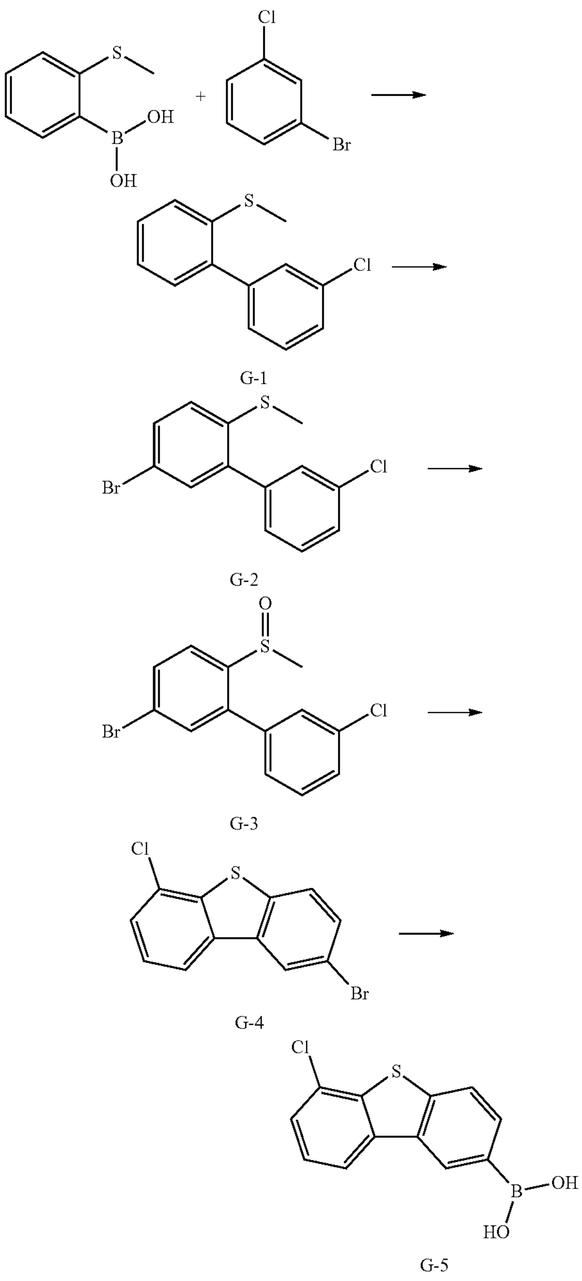

G-1, G-2, G-3, G-4, G-5

1) Preparation of Compound G-1

Compound G-1 (49 g, yield: 79%; MS:[M+H]$^+$=235) was prepared in the same manner as in the preparation method of Compound A-1 of Preparation Example 1, except that 1-bromo-3-chlorobenzene and (2-(methylthio)-phenyl)boronic acid were used instead of 1-bromo-3-fluoro-2-iodobenzene and (5-chloro-2-methoxyphenyl)boronic acid.

2) Preparation of Compound G-2

Acetic acid (420 mL) was added to Compound G-1 (49.0 g, 148.5 mmol) under a nitrogen atmosphere, to which bromine (13.9 mL, 271 mmol) was added and stirred at 65° C. for 3 hours. After cooling, water was added to the mixture, and the precipitated solid was filtered and washed three times with water. The filtered filtrate was recrystallized from acetonitrile and toluene to give Compound G-2 (50.3 g, yield: 77%; MS:[M+H]$^+$=314).

3) Preparation of Compound G-3

Acetic acid (530 mL) was added to Compound G-2 (50.3 g, 160 mmol), to which 35% hydrogen peroxide (16.4 g) was added and stirred at room temperature for 5 hours. Aqueous NaOH solution was added to the reaction mixture, which was stirred for 20 minutes, ethyl acetate was added, and the aqueous layer was removed. The reaction mixture was dried over anhydrous magnesium sulfate, concentrated under reduced pressure and recrystallized with a mixed solution of tetrahydrofuran and ethyl acetate, and then dried to give Compound G-3 (43.2 g, yield: 87%, MS:[M+H]$^+$=308).

4) Preparation of Compound G-4

Compound G-3 (43.2 g, 160 mmol) was added to sulfuric acid (220 mL) and then stirred at room temperature for 5 hours. Aqueous NaOH solution was added to the reaction mixture, which was stirred for 30 minutes, chloroform was added thereto, the layers were separated, and washed three times with water. Ethyl acetate was added and the aqueous layer was removed. The reaction mixture was dried over anhydrous magnesium sulfate, concentrated under reduced pressure, and recrystallized with a mixed solution of tetrahydrofuran and ethyl acetate to give Compound G-4 (30.6 g, yield: 74%, MS:[M+H]$^+$=296).

5) Preparation of Compound G-5

Compound G-5 (20.4 g, yield: 75%; MS:[M+H]$^+$=263) was prepared in the same manner as in the preparation method of Compound A-4, except that Compound G-4 (42.0 g, 148.5 mmol) was used instead of Compound A-3.

Preparation Example 1-8: Preparation of Intermediate Compound H-5

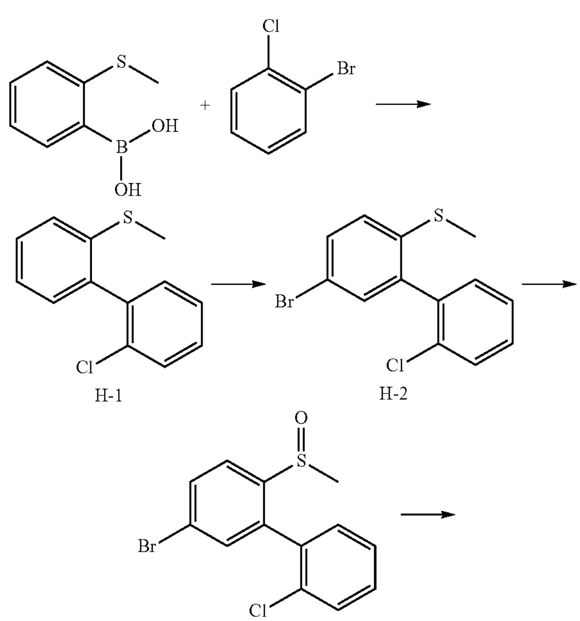

H-1, H-2, H-3

-continued

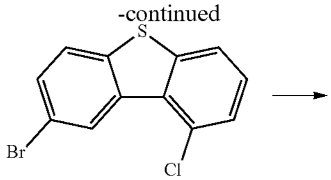

H-4

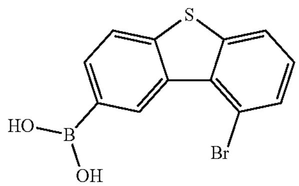

H-5

Compound H-5 (42 g, MS:[M+H]$^+$=235 was prepared in the same manner as in the preparation method of Compound G-5 of Preparation Example 1-7, except that 1-bromo-2-chlorobenzene was used instead of 1-bromo-3-chlorobenzene.

Preparation Example 1-9: Preparation of Intermediate Compound I-5

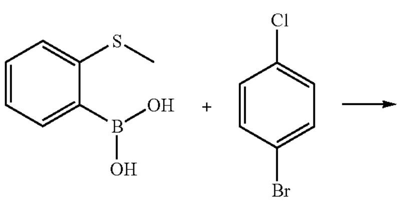

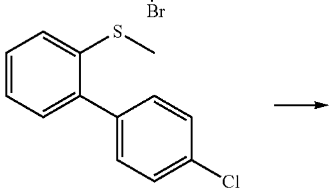

I-1

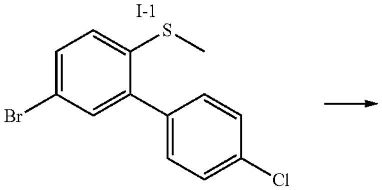

I-2

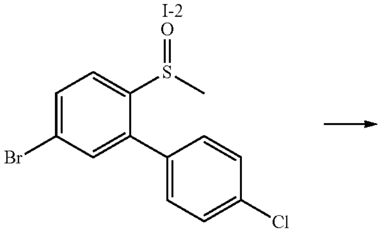

I-3

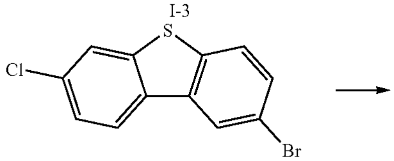

I-4

-continued

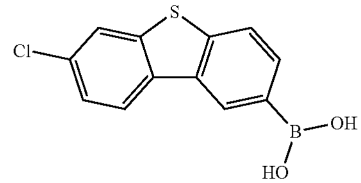

I-5

Compound I-5 (46 g, MS:[M+H]$^+$=235) was prepared in the same manner as in the preparation method of Compound G-5 of Preparation Example 1-7, except that 1-bromo-4-chlorobenzene was used instead of 1-bromo-3-chlorobenzene.

Preparation Example 2

Preparation Example 2-1: Preparation of Intermediate Compound A-6

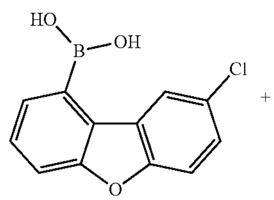

A-4

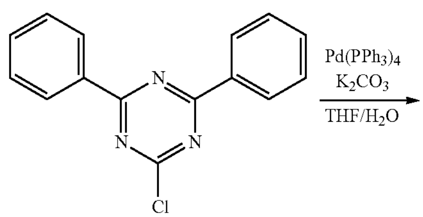

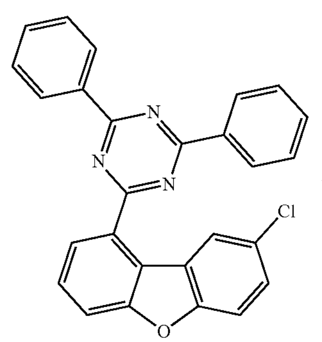

A-5

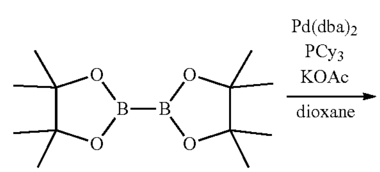

-continued

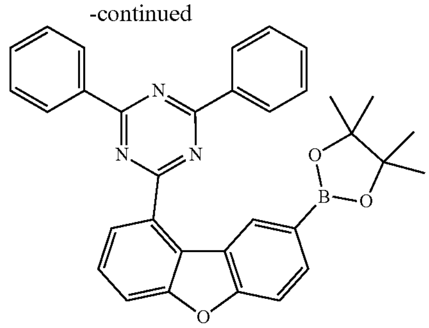

A-6

1) Preparation of Compound A-5

After Compound A-4 (20.0 g, 61 mmol) and 2-chloro-4,6-diphenyltriazine (16.3 g, 61 mmol) were dissolved in tetrahydrofuran (200 mL) in a 500 mL round bottom flask under a nitrogen atmosphere, 1.5 M aqueous potassium carbonate solution (100 mL) was added and tetrakis(triphenylphosphine)palladium (0.93 g, 1.8 mmol) was added, and then the mixture was heated and stirred for 7 hours. The temperature was lowered to room temperature, the aqueous layer was separated and removed, dried over anhydrous magnesium sulfate, concentrated under reduced pressure, recrystallized with a mixed solution of tetrahydrofuran and ethyl acetate, and then dried to give Compound A-5 (20.5 g, yield: 78%, MS:$[M+H]^{+=434}$).

2) Preparation of Compound A-6

Formula A-5 (20.5 g, 47 mmol), bis(pinacolato)diboron (13.2 g, 52 mmol) and potassium acetate (16.2 g, 165 mmol) were mixed under a nitrogen atmosphere, to which dioxane (250 mL) was added and heated with stirring. Under refluxing conditions, bis(dibenzylideneacetone)palladium (0.81 g, 1 mmol) and tricyclohexylphosphine (0.8 g, 2 mmol) were added and the mixture were heated and stirred for 13 hours. After completion of the reaction, the reaction mixture was cooled to room temperature and then filtered. Water was poured into the filtrate, extracted with chloroform, and the organic layer was dried over anhydrous magnesium sulfate. The resultant product was distilled under reduced pressure and then recrystallized from ethyl acetate to give Compound A-6 (20.7 g, 83%).

Preparation Example 2-2: Preparation of Intermediate Compound A-8

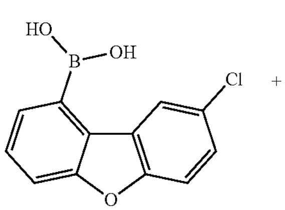

A-4

-continued

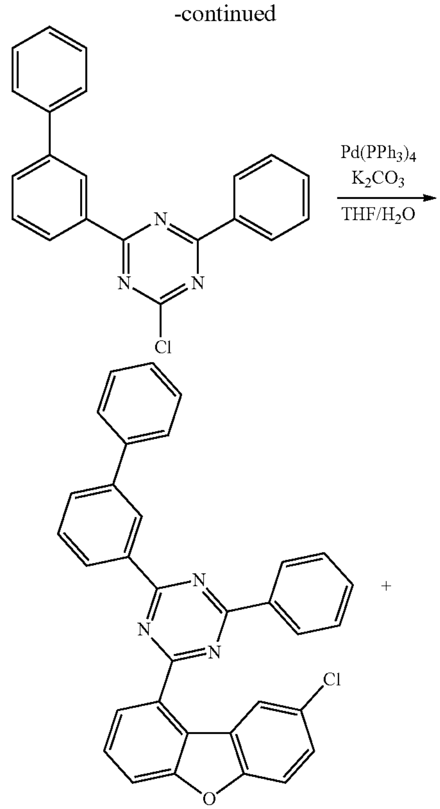

A-7

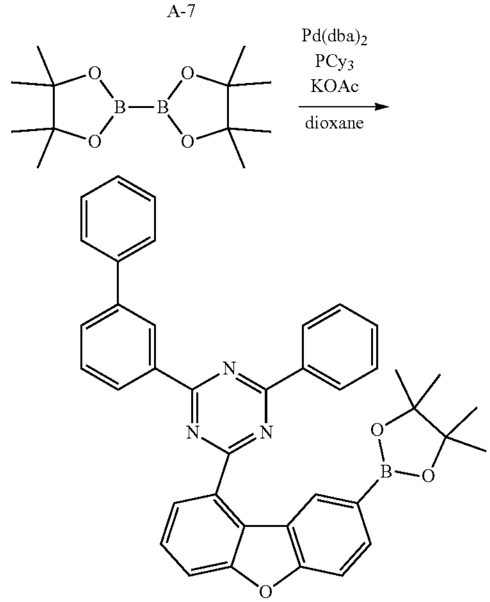

A-8

1) Preparation of Compound A-7

Compound A-7 (14.2 g, yield: 68%, MS:$[M+H]^+$=510) was prepared in the same manner as in the preparation method of Compound A-5, except that 2-([1,1'-biphenyl]-3-yl)-4-chloro-6-phenyl-1,3,5-triazine was used instead of 2-chloro-4,6-diphenyltriazine.

2) Preparation of Compound A-8

Compound A-8 (13.9 g, yield: 82%, MS:$[M+H]^+$=602) was prepared in the same manner as in the preparation method of Compound A-6, except that Compound A-7 was used instead of Compound A-5.

Preparation Example 3

Preparation Example 3-1: Preparation of Intermediate Compound B-7

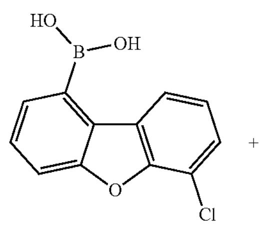

B-5

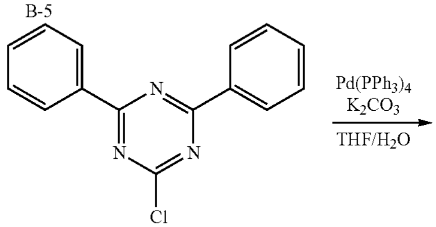

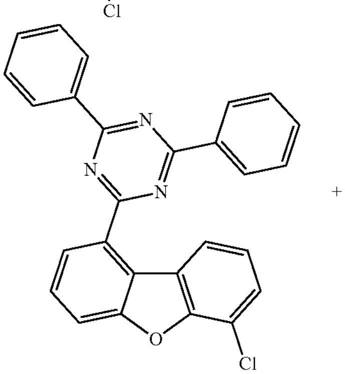

B-6

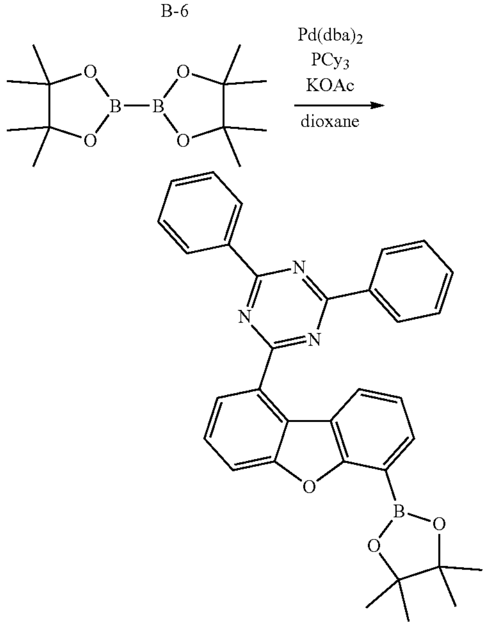

B-7

1) Preparation of Compound B-6

Compound B-6 (14.2 g, yield: 82%, MS:$[M+H]^+$=434) was prepared in the same manner as in the preparation method of Compound A-5, except that Compound B-5 was used instead of Compound A-4.

2) Preparation of Compound B-7

Compound B-7 (15.0 g, yield: 82%, MS:$[M+H]^+$=526) was prepared in the same manner as in the preparation method of Compound A-6, except that Compound B-6 was used instead of Compound A-5.

Preparation Example 3-2: Preparation of Intermediate Compound B-9

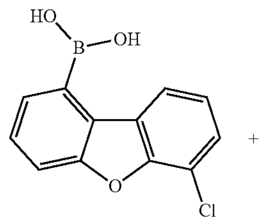

B-5

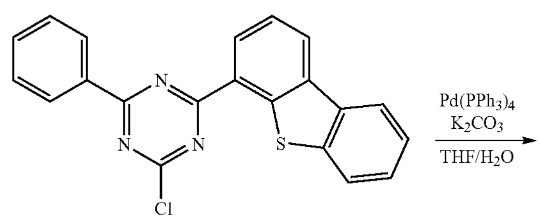

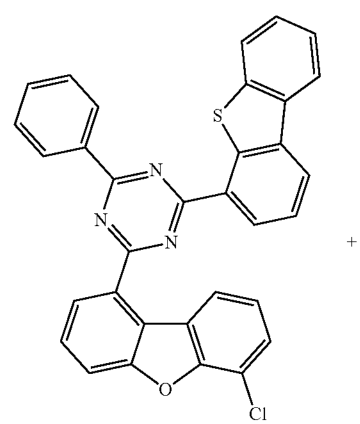

B-8

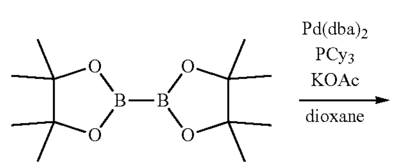

-continued

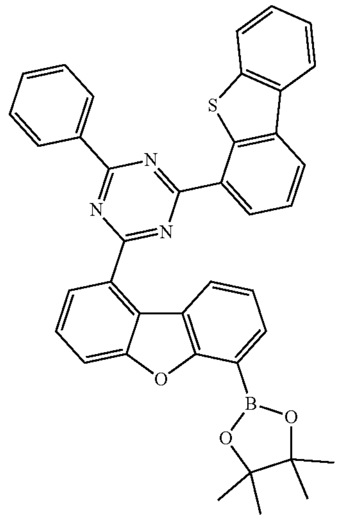

B-9

1) Preparation of Compound B-8

Compound B-8 (14.5 g, yield: 66%, MS:$[M+H]^+$=541) was prepared in the same manner as in the preparation method of Compound A-5, except that Compound B-5 and 2-chloro-4-(dibenzothiophen-4-yl)-6-phenyl-1,3,5-triazine were used instead of Compound A-4 and 2-chloro-4,6-diphenyltriazine.

2) Preparation of Compound B-9

Compound B-9 (10.6 g, yield: 63%, MS:$[M+H]^+$=632) was prepared in the same manner as in the preparation method of Compound A-6, except that Compound B-8 was used instead of Compound A-5.

Preparation Example 4

Preparation Example 4-1: Preparation of Intermediate Compound C-6

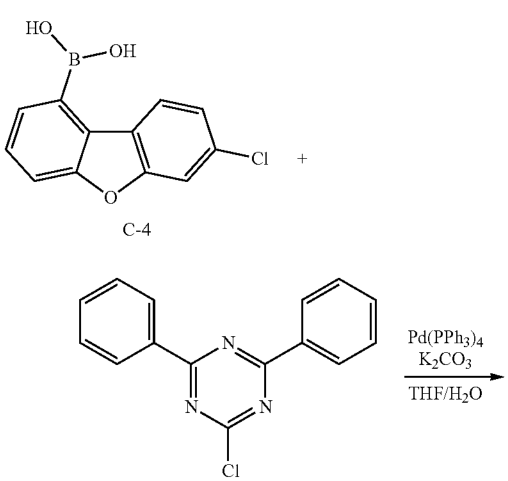

-continued

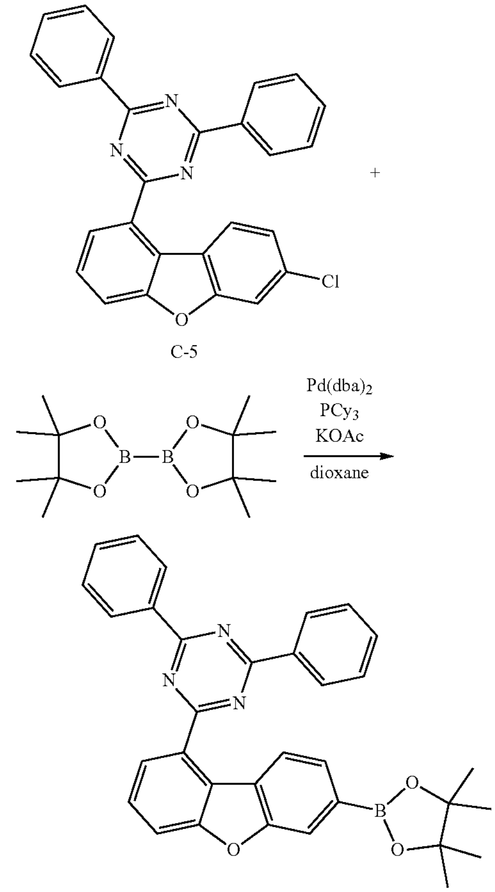

C-6

1) Preparation of Compound C-5

Compound C-5 (13.0 g, yield: 77%, MS:$[M+H]^+$=434) was prepared in the same manner as in the preparation method of Compound A-5, except that Compound C-4 was used instead of Compound A-4.

2) Preparation of Compound C-6

Compound C-6 (12.8 g, yield: 82%, MS:$[M+H]^+$=526) was prepared in the same manner as in the preparation method of Compound A-6, except that Compound C-5 was used instead of Compound A-5.

Preparation Example 4-2: Preparation of Intermediate C-8

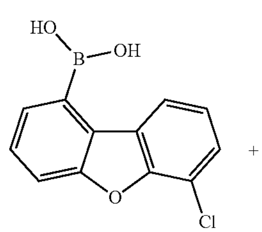

C-4

-continued

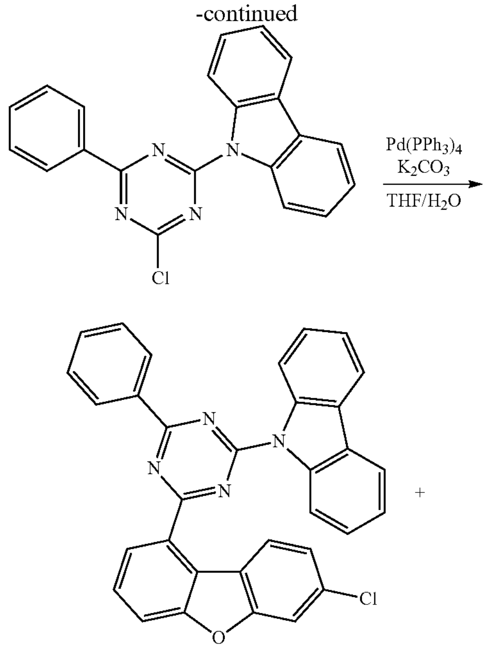

C-7

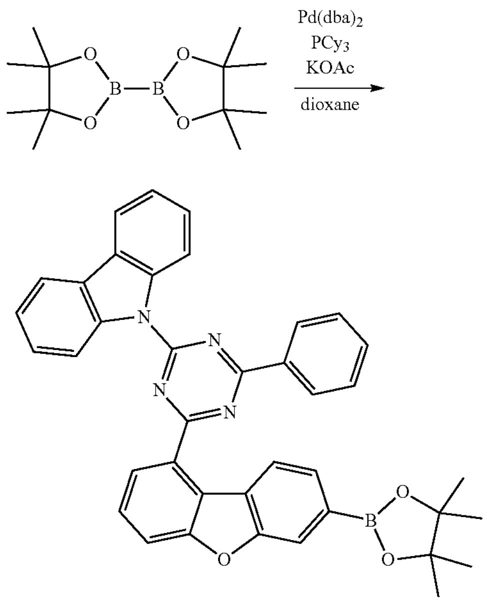

C-8

1) Preparation of Compound C-7

Compound C-7 (11.9 g, yield: 56%, MS:[M+H]$^+$=523) was prepared in the same manner as in the preparation method of Compound A-5, except that Compound C-4 and 9-(4-chloro-6-phenyl-1,3,5-triazine-2-yl)-9H-carbazole were used instead of Compound A-4 and 2-chloro-4,6-diphenyltriazine, respectively.

2) Preparation of Compound C-8

Compound C-8 (10.8 g, yield: 77%, MS:[M+H]$^+$=615) was prepared in the same manner as in the preparation method of Compound A-6, except that Compound C-7 was used instead of Compound A-5.

Preparation Example 5

Preparation Example 5-1: Preparation of Intermediate Compound D-6

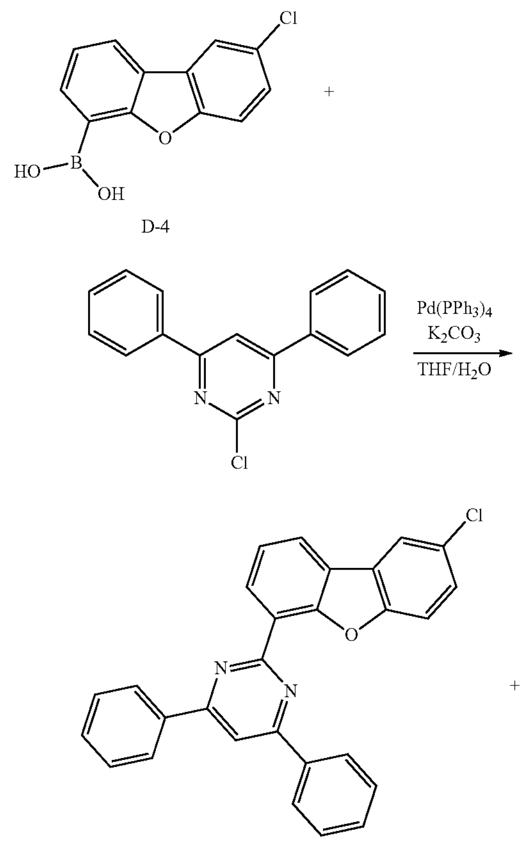

D-4

D-5

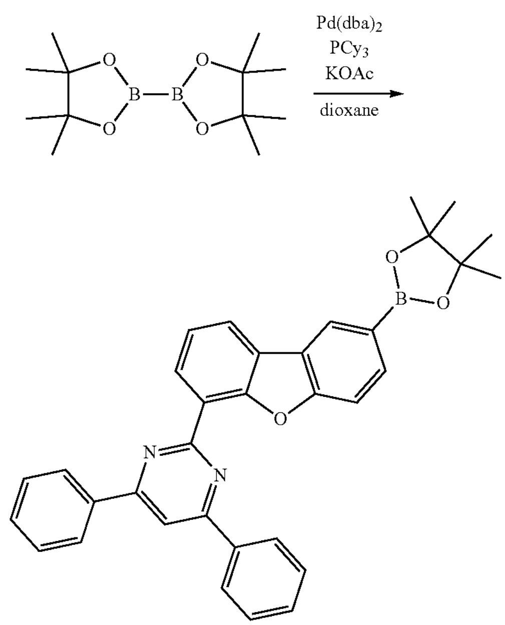

D-6

1) Preparation of Compound D-5

Compound D-5 (9.5 g, yield: 51%, MS:$[M+H]^+$=433) was prepared in the same manner as in the preparation method of Compound A-5, except that Compound D-4 and 2-chloro-4,6-diphenylpyrimidine were used instead of Compound A-4 and 2-chloro-4,6-diphenyltriazine.

2) Preparation of Compound D-6

Compound D-6 (9.8 g, yield: 85%, MS:$[M+H]^+$=525) was prepared in the same manner as in the preparation method of Compound A-6, except that Compound D-5 was used instead of Compound A-5.

Preparation Example 5-2: Preparation of Intermediate D-8

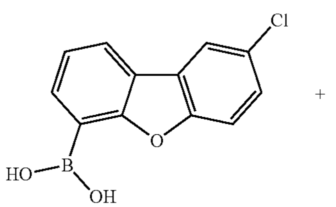

D-4

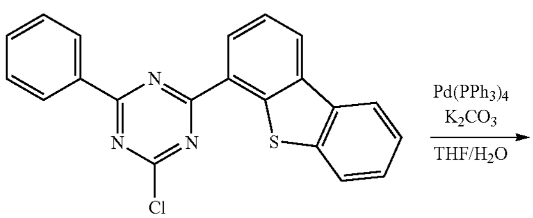

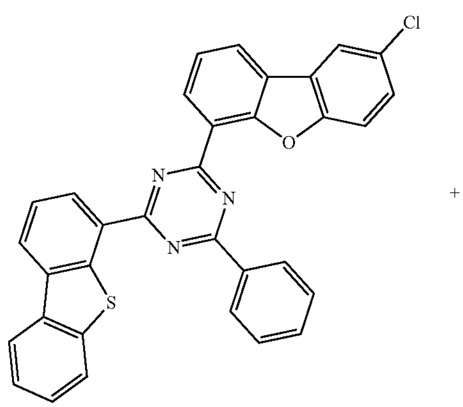

D-7

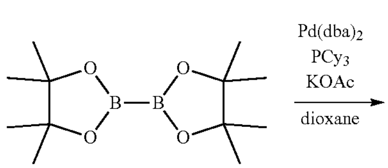

-continued

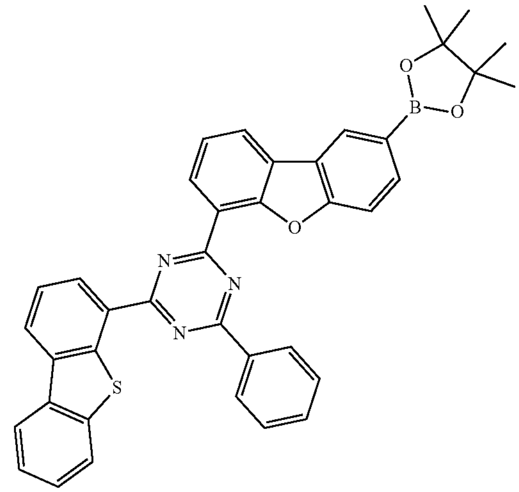

D-8

1) Preparation of Compound D-7

Compound D-7 (14.0 g, yield: 64%, MS:$[M+H]^+$=541) was prepared in the same manner as in the preparation method of Compound A-5, except that Compound D-4 and 2-chloro-4-(dibenzothiophen-4-yl)-6-phenyl-1,3,5-triazine were used instead of Compound A-4 and 2-chloro-4,6-diphenyltriazine.

2) Preparation of Compound D-8

Compound D-8 (12.4 g, yield: 75%, MS:$[M+H]^+$=632) was prepared in the same manner as in the preparation method of Compound A-6, except that Compound D-7 was used instead of Compound A-5.

Preparation Example 6

Preparation Example 6-1: Preparation of Intermediate Compound E-6

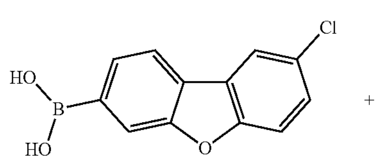

E-4

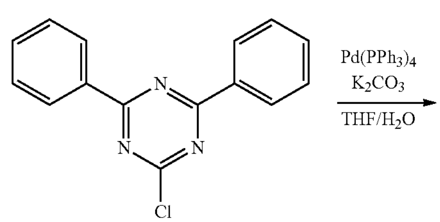

-continued

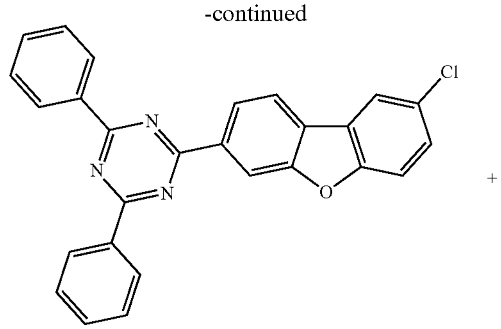

E-5

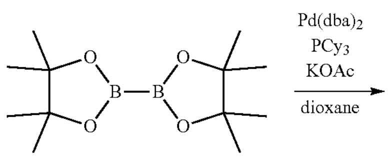

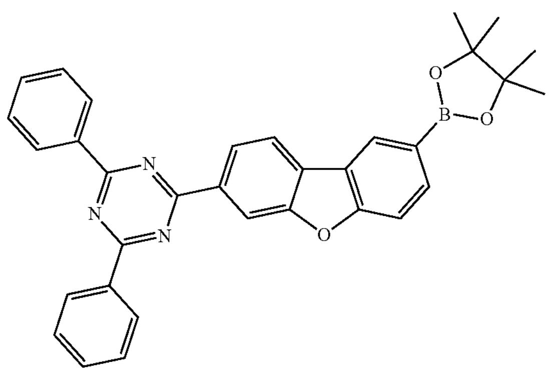

E-6

1) Preparation of Compound E-5

Compound E-5 (13 g, yield: 74%, MS:[M+H]$^+$=434) was prepared in the same manner as in the preparation method of Compound A-5, except that Compound E-4 was used instead of Compound A-4.

2) Preparation of Compound E-6

Compound E-6 (11.5 g, yield: 73%, MS:[M+H]$^+$=526) was prepared in the same manner as in the preparation method of Compound A-6, except that Compound E-5 was used instead of Compound A-5.

Preparation Example 6-2: Preparation of Intermediate Compound E-8

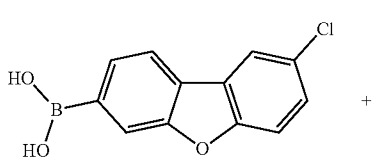

E-4

-continued

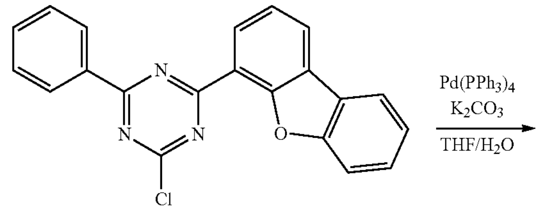

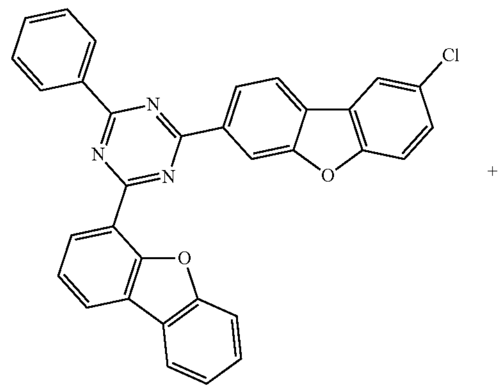

E-7

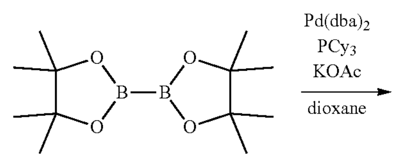

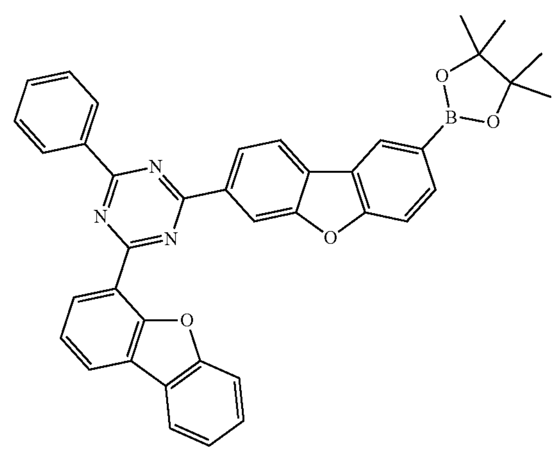

E-8

1) Preparation of Compound E-7

Compound E-7 (13.3 g, yield: 63%, MS:[M+H]$^+$=524) was prepared in the same manner as in the preparation method of Compound A-5, except that Compound E-4 and 2-chloro-4-(dibenzofuran-4-yl)-6-phenyl-1,3,5-triazine were used instead of Compound A-4 and 2-chloro-4,6-diphenyltriazine, respectively.

2) Preparation of Compound E-8

Compound E-8 (10.0 g, yield: 64%, MS:[M+H]+=616) was prepared in the same manner as in the preparation method of Compound A-6, except that Compound E-7 was used instead of Compound A-5.

Preparation Example 7

Preparation Example 7-1: Preparation of Intermediate Compound F-6

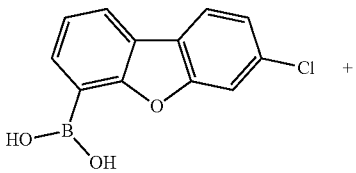

F-4

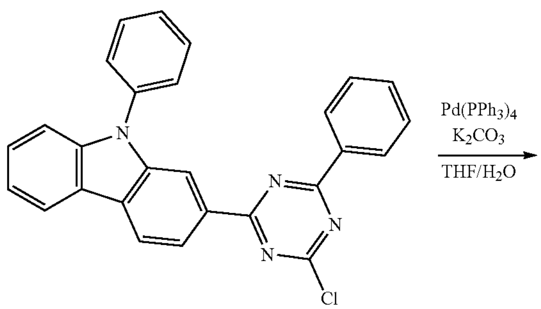

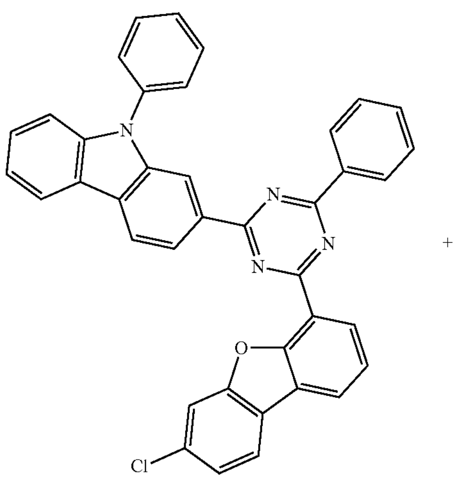

F-5

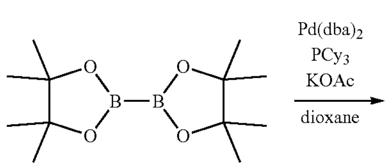

-continued

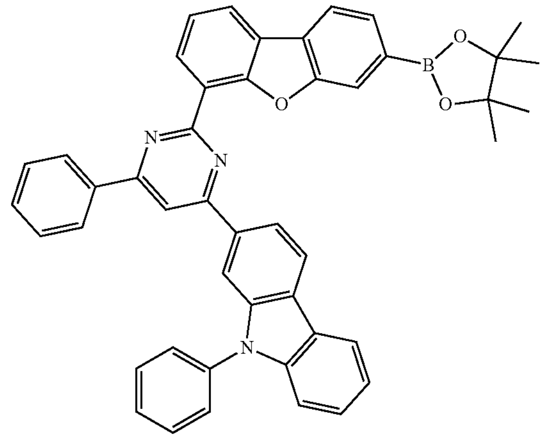

F-6

1) Preparation of Compound F-5

Compound F-5 (12.9 g, yield: 54%, MS:[M+H]+=599) was prepared in the same manner as in the preparation method of Compound A-5, except that Compound F-4 and 2-(4-chloro-6-phenyl-1,3,5-triazine2-yl)9-phenyl-9H-carbazole were used instead of Compound A-4 and 2-chloro-4,6-diphenyltriazine, respectively.

2) Preparation of Compound F-6

Compound F-6 (10.1 g, yield: 66%, MS:[M+H]+=691) was prepared in the same manner as in the preparation method of Compound A-6, except that Compound F-5 was used instead of Compound A-5.

Preparation Example 7-2: Preparation of Intermediate Compound F-8

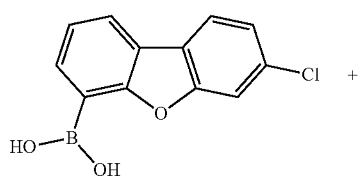

F-4

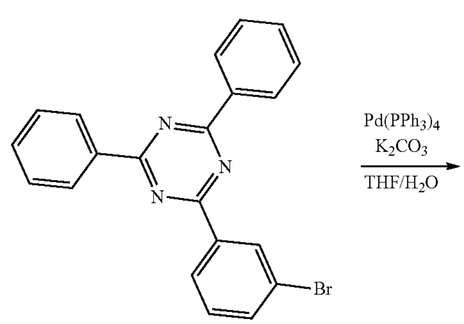

-continued

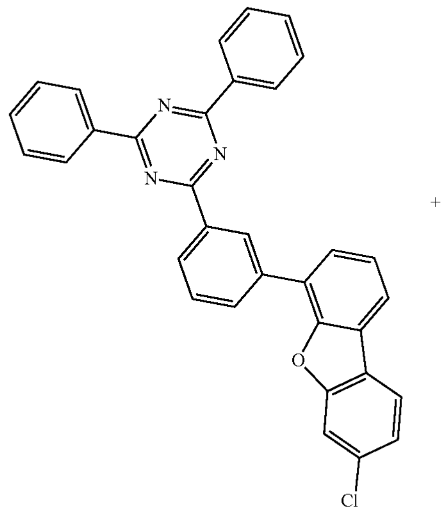

F-7

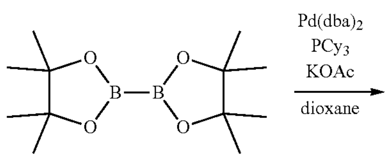

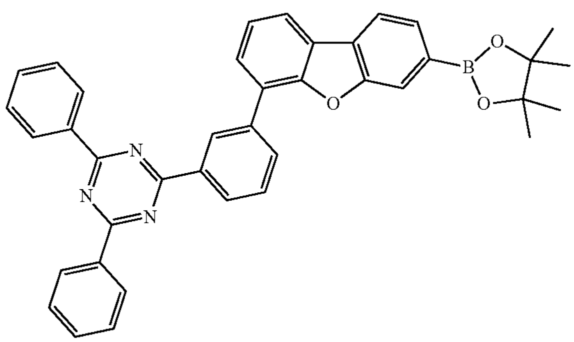

F-8

1) Preparation of Compound F-7

Compound F-7 (14 g, yield: 68%, MS:[M+H]=510) was prepared in the same manner as in the preparation method of Compound A-5, except that Compound F-4 and 2-(3-bromophenyl)-4,6-diphenyl-1,3,5-triazine were used instead of Compound A-4 and 2-chloro-4,6-diphenyltriazine, respectively.

2) Preparation of Compound F-8

Compound F-8 (12.7 g, yield: 77%, MS:$[M+H]^+$=602) was prepared in the same manner as in the preparation method of Compound A-6, except that Compound F-7 was used instead of Compound A-5.

Preparation Example 8

Preparation Example 8-1: Preparation of Intermediate Compound G-7

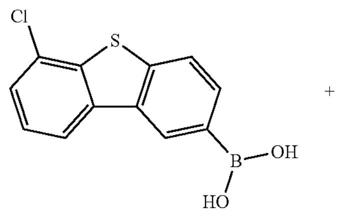

G-5

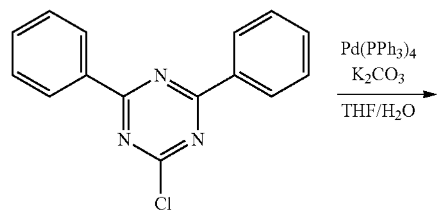

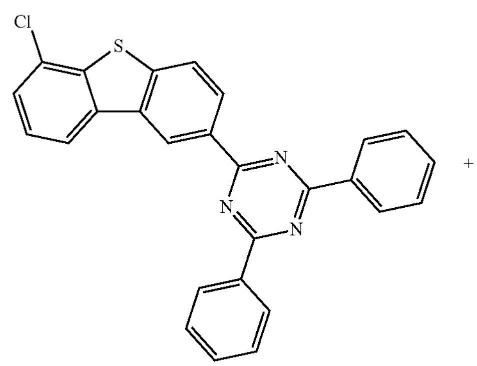

G-6

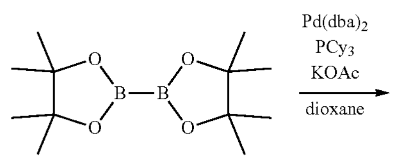

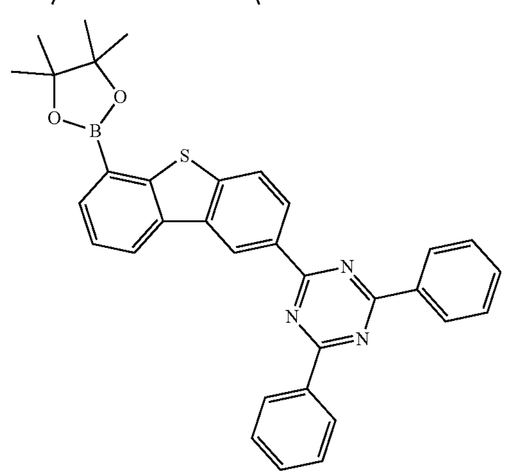

G-7

1) Preparation of Compound G-6

Compound G-6 (13 g, yield: 56%, MS:$[M+H]^+$=450) was prepared in the same manner as in the preparation method of Compound A-5, except that Compound G-5 was used instead of Compound A-4.

2) Preparation of Compound G-7

Compound G-7 (10.9 g, yield: 70%, MS:$[M+H]^+$=542) was prepared in the same manner as in the preparation method of Compound A-6, except that Compound G-6 was used instead of Compound A-5.

Preparation Example 8-2: Preparation of Intermediate Compound H-7

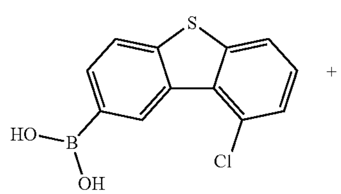

H-5

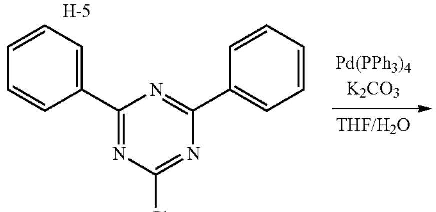

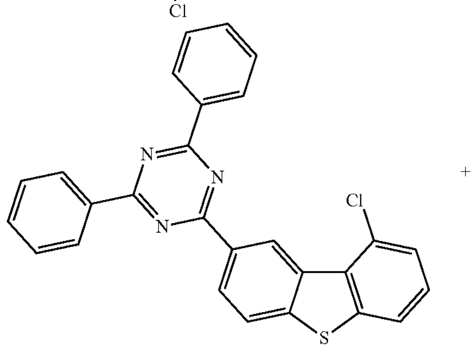

H-6

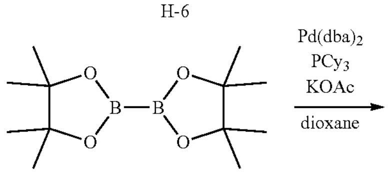

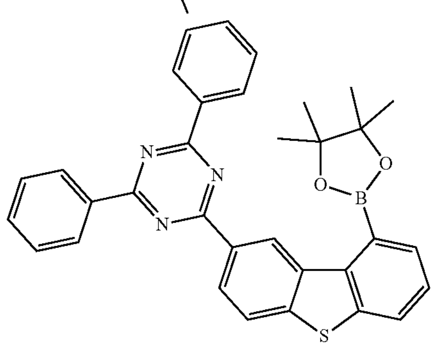

H-7

1) Preparation of Compound H-6

Compound H-6 (13.9 g, yield: 58%, MS:$[M+H]^+$=450) was prepared in the same manner as in the preparation method of Compound A-5, except that Compound H-5 was used instead of Compound A-4.

2) Preparation of Compound H-7

Compound H-7 (12.1 g, yield: 72%, MS:$[M+H]^+$=542) was prepared in the same manner as in the preparation method of Compound A-6, except that Compound H-6 was used instead of Compound A-5.

Preparation Example 8-3: Preparation of Intermediate Compound I-7

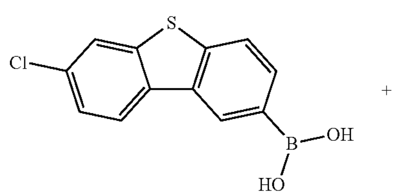

I-5

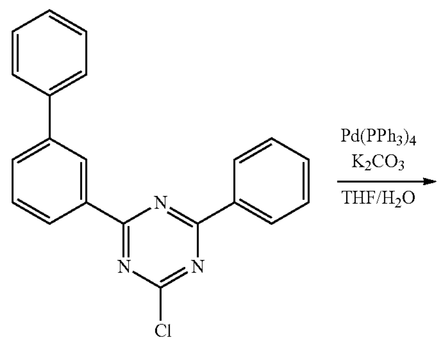

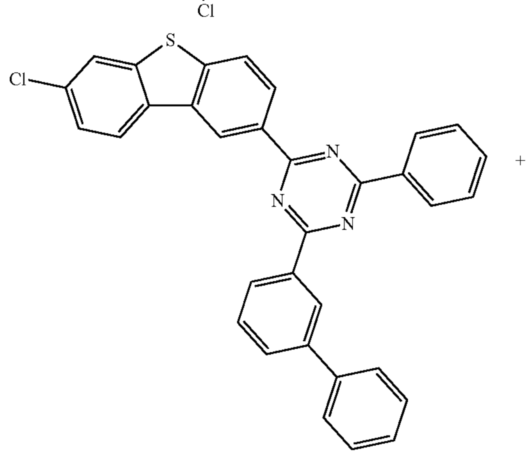

I-6

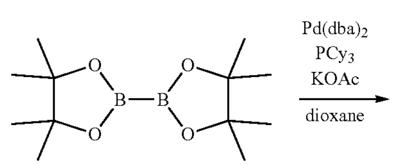

-continued

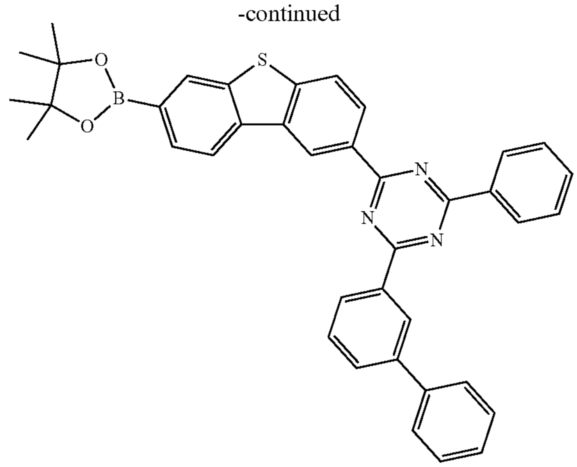

I-7

1) Preparation of Compound I-6

Compound I-6 (20.3 g, yield: 67%, MS:[M+H]$^+$=526) was prepared in the same manner as in the preparation method of Compound A-5, except that Compound I-5 and 2-([1,1'-biphenyl]-3-yl)-4-chloro-6-phenyl-1,3,5-triazine were used instead of Compound A-4 and 2-chloro-4,6-diphenyltriazine, respectively.

2) Preparation of Compound I-7

Compound I-7 (13.9 g, yield: 58%, MS:[M+H]$^+$=618) was prepared in the same manner as in the preparation method of Compound A-6, except that Compound I-6 was used instead of Compound A-5.

Preparation Example 9

Preparation Example 9-1: Preparation of Intermediate Compound J-1

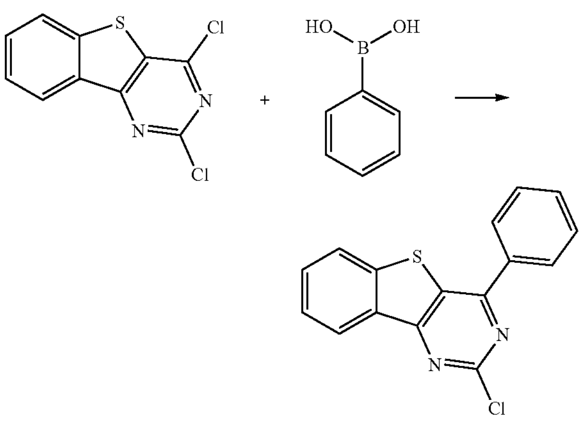

J-1

After 2,4-dichlorobenzothieno[3,2-d]pyrimidine (15 g, 57.8 mmol) and phenylboronic acid (7.9 g, 64.7 mmol) were dissolved in tetrahydrofuran (250 mL), 1.5 M aqueous potassium carbonate solution (120 mL) was added and tetrakis(triphenylphosphine)palladium (1.4 g, 1.28 mmol) was added, and then the mixture was heated and stirred for 7 hours. The temperature was lowered to room temperature, the aqueous layer was separated and removed, dried over anhydrous magnesium sulfate, concentrated under reduced pressure, recrystallized with chloroform and ethanol, and then dried to give Compound J-1 (14.1 g, yield: 83%, MS:[M+H]$^+$=297).

Preparation Example 9-2: Preparation of Intermediate Compound J-2

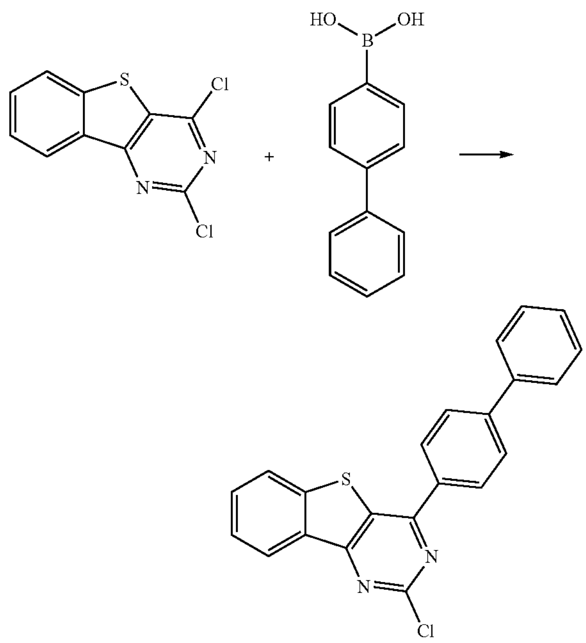

J-2

Compound J-2 was prepared in the same manner as in the preparation method of Compound J-1, except that [1,1'-biphenyl]-4-ylboronic acid was used instead of phenylboronic acid.

Preparation Example 9-3: Preparation of Intermediate Compound J-3

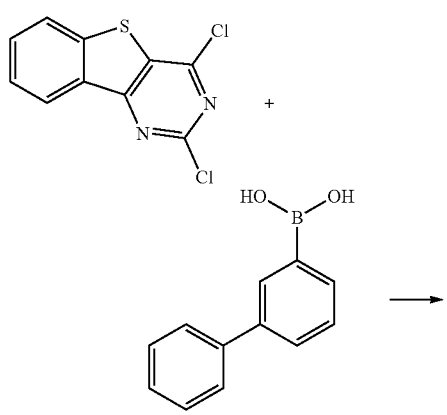

-continued

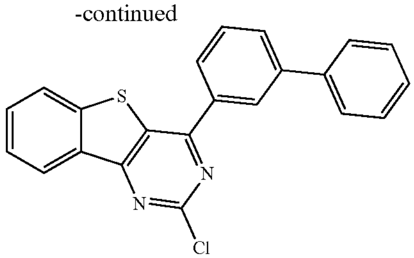

J-3

Compound J-3 was prepared in the same manner as in the preparation method of Compound J-1, except that [1,1'-biphenyl]-3-ylboronic acid was used instead of phenylboronic acid.

Preparation Example 9-4: Preparation of Intermediate Compound J-4

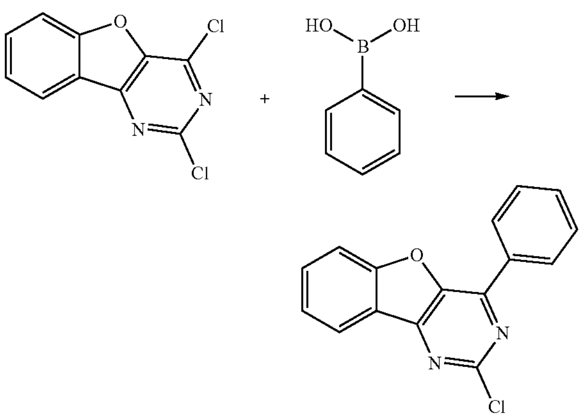

J-4

Compound J-4 was prepared in the same manner as in the preparation method of Compound J-1, except that 2,4-dichlorobenzofuro[3,2-d]pyrimidine was used instead of 2,4-dichlorobenzothieno[3,2-d]pyrimidine.

Preparation Example 9-5: Preparation of Intermediate Compound J-5

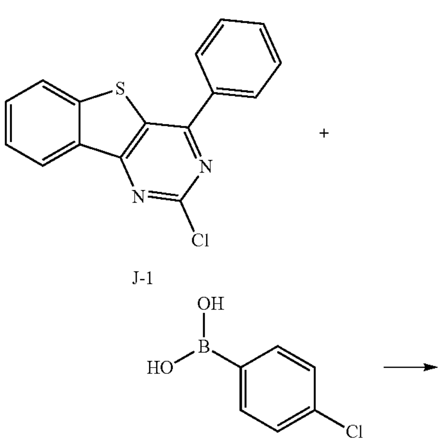

J-1

-continued

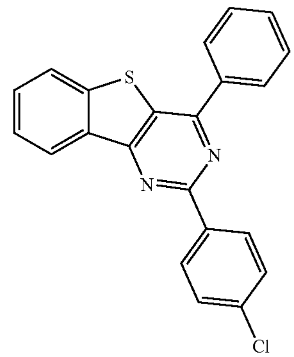

J-5

After Compound J-1 (15.0 g, 0.05 mol) and (4-chlorophenyl)boronic acid (21.4 g, 0.06 mol) were dissolved in dioxane (200 mL), $K_3PO_4$ (21.4 g, 0.1 mol) was added and bis(tri-t-butylphosphine)palladium(0) (0.26 g, 0.5 mmol) was added, and then the mixture was heated and stirred for 13 hours. The temperature was lowered to room temperature, the aqueous layer was separated and removed, dried over anhydrous magnesium sulfate, concentrated under reduced pressure, recrystallized with ethyl acetate, and then dried to give Compound J-5 (14.1 g, yield: 81%, MS:[M+H]$^+$=373).

Preparation Example 9-6: Preparation of Intermediate Compound J-6

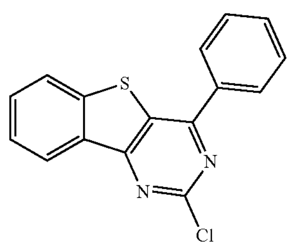

J-1

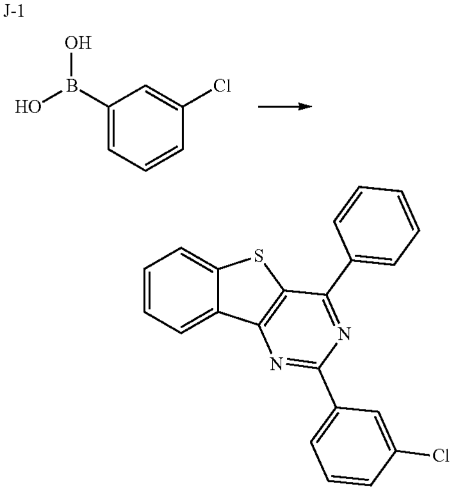

J-6

Compound J-6 was prepared in the same manner as in the preparation method of Compound J-5, except that (3-chlorophenyl)boronic acid was added instead of (4-chlorophenyl)boronic acid.

EXAMPLES

Example 1: Preparation of Compound 1

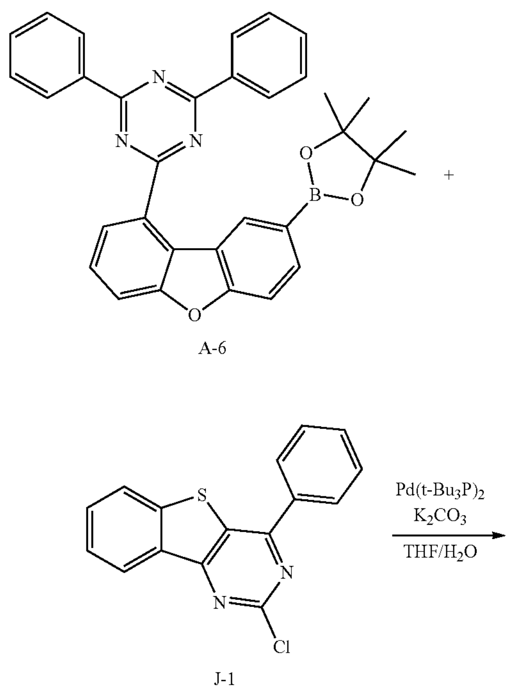

-continued

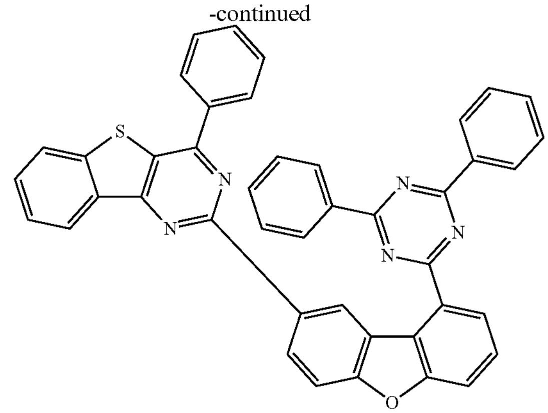

1

Under a nitrogen atmosphere, Compound A-6 (10 g, 19 mmol) and Compound J-1 (5.64 g, 19 mmol) were added to tetrahydrofuran (120 mL), and the mixture was stirred and refluxed. Then, potassium carbonate (7.89 g, 57 mmol) was dissolved in water (50 mL), added thereto and sufficiently stirred, to which bis(tri-t-butylphosphine)palladium(0) (0.1 g, 0.2 mmol) was added. After the reaction for 9 hours, the reaction mixture was cooled to room temperature and filtered. The filtrate was extracted with chloroform and water, and then the organic layer was dried over magnesium sulfate. Then, the organic layer was distilled under reduced pressure, and then recrystallized using a mixed solution of tetrahydrofuran and ethyl acetate. The resulting solid was filtered and then dried to give Compound 1 (7.8 g, yield: 62%, MS:$[M+H]^+$=660).

Examples 2 to 43: Preparation of Compounds 2 to 43

Compound 2 to 43 were prepared in the same manner as in the preparation method of Example 1, except that the starting materials were changed according to Tables 1 and 2 below. The structure, shape, yield and MS thereof are summarized in Tables below.

TABLE 1
| | Intermediate 1 | Intermediate 2 | Chemical Structure | Shape | Yield (%) | MS: [M + H]$^+$ |
|---|---|---|---|---|---|---|
| Example 2 | A-6 | 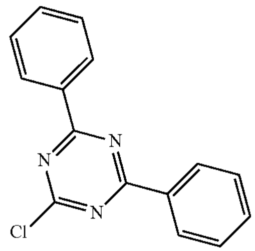 [SMILES: Clc1nc(-c2ccccc2)nc(-c2ccccc2)n1] | 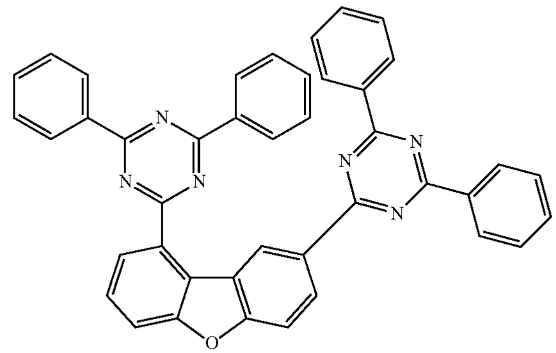 [SMILES: c1ccc(-c2nc(-c3ccccc3)nc(-c3ccc4oc5cccc(-c6nc(-c7ccccc7)nc(-c7ccccc7)n6)c5c4c3)n2)cc1] | White | 63% | 631 |
| Example 3 | A-6 | 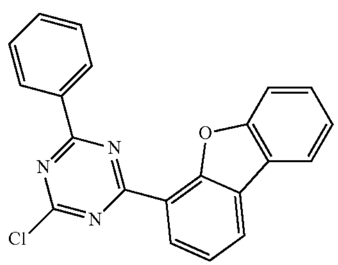 [SMILES: Clc1nc(-c2ccccc2)nc(-c2cccc3c2oc2ccccc23)n1] | 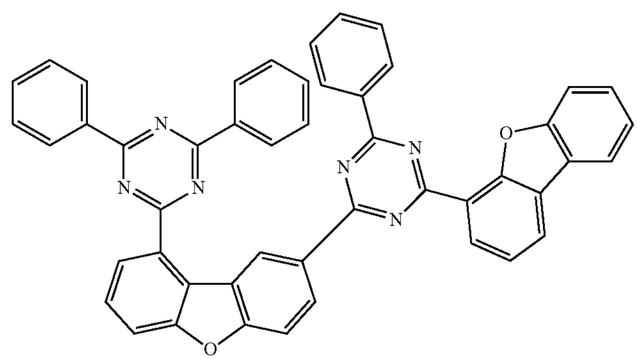 [SMILES: c1ccc(-c2nc(-c3ccc4oc5cccc(-c6nc(-c7ccccc7)nc(-c7ccccc7)n6)c5c4c3)nc(-c3cccc4c3oc3ccccc34)n2)cc1] | White | 69% | 721 |

TABLE 1-continued
| | Intermediate 1 | Intermediate 2 | Chemical Structure | Shape | Yield (%) | MS: [M + H]+ |
|---|---|---|---|---|---|---|
| Example 4 | A-6 | J-6 | 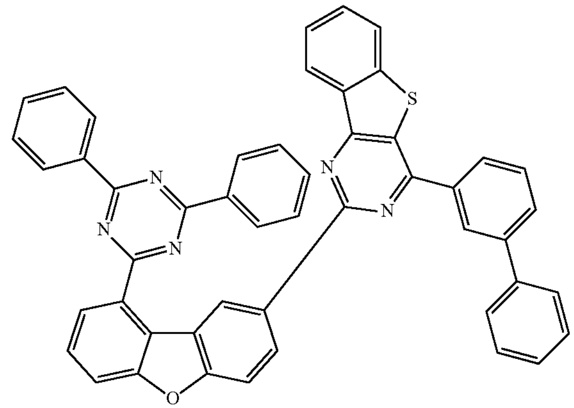 [SMILES: c1ccc(-c2cccc(-c3nc(-c4ccc5oc6cccc(-c7nc(-c8ccccc8)nc(-c8ccccc8)n7)c6c5c4)nc4c3sc3ccccc34)c2)cc1] | White | 60% | 736 |
| Example 5 | A-8 | 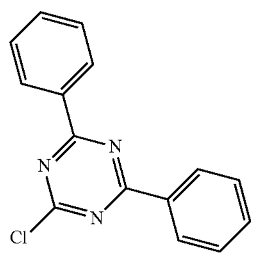 [SMILES: Clc1nc(-c2ccccc2)nc(-c2ccccc2)n1] | 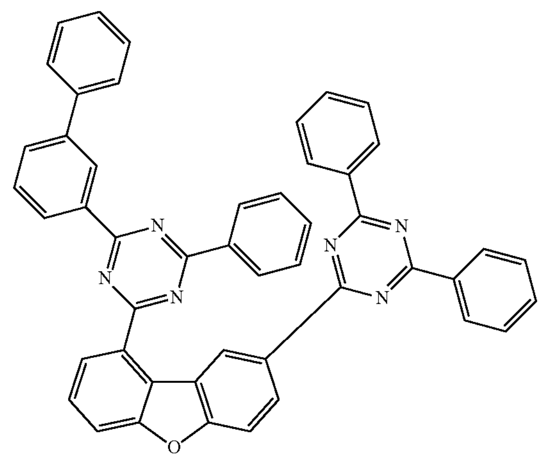 [SMILES: c1ccc(-c2cccc(-c3nc(-c4ccccc4)nc(-c4cccc5oc6ccc(-c7nc(-c8ccccc8)nc(-c8ccccc8)n7)cc6c45)n3)c2)cc1] | White | 56% | 707 |

TABLE 1-continued
| | Intermediate 1 | Intermediate 2 | Chemical Structure | Shape | Yield (%) | MS: [M + H]$^+$ |
|---|---|---|---|---|---|---|
| Example 6 | A-8 | 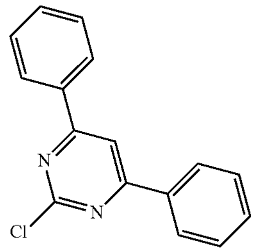 [SMILES: Clc1nc(-c2ccccc2)cc(-c2ccccc2)n1] | 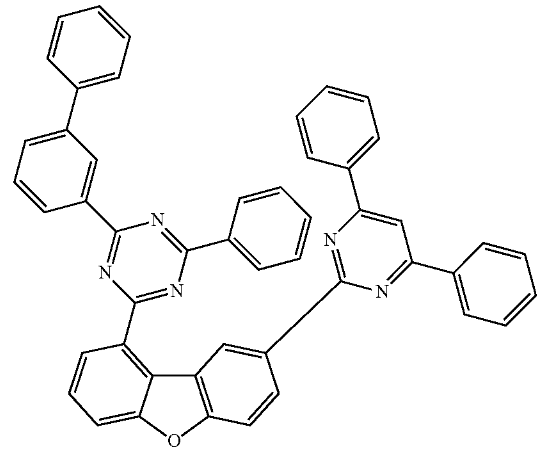 [SMILES: c1ccc(-c2cccc(-c3nc(-c4ccccc4)nc(-c4cccc5oc6ccc(-c7nc(-c8ccccc8)cc(-c8ccccc8)n7)cc6c45)n3)c2)cc1] | White | 58% | 706 |
| Example 7 | A-8 | J-3 | 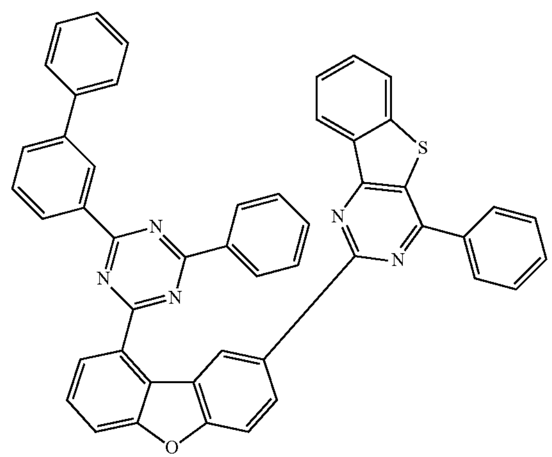 [SMILES: c1ccc(-c2cccc(-c3nc(-c4ccccc4)nc(-c4cccc5oc6ccc(-c7nc(-c8ccccc8)c8sc9ccccc9c8n7)cc6c45)n3)c2)cc1] | White | 60% | 736 |

TABLE 1-continued
| | Intermediate 1 | Intermediate 2 | Chemical Structure | Shape | Yield (%) | MS: [M + H]$^+$ |
|---|---|---|---|---|---|---|
| Example 8 | A-8 | J-4 | 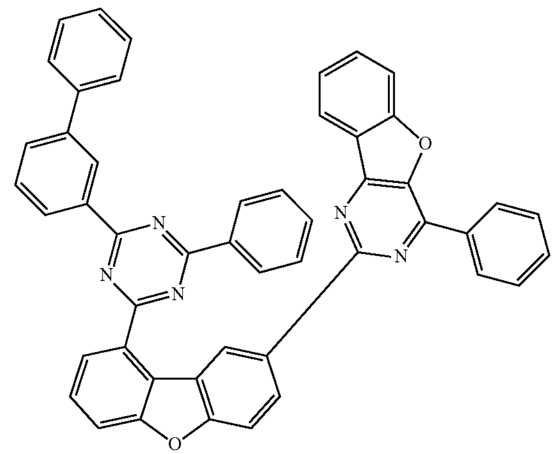 [SMILES: c1ccc(-c2cccc(-c3nc(-c4ccccc4)nc(-c4cccc5oc6ccc(-c7nc(-c8ccccc8)c8oc9ccccc9c8n7)cc6c45)n3)c2)cc1] | White | 62% | 720 |
| Example 9 | B-7 | 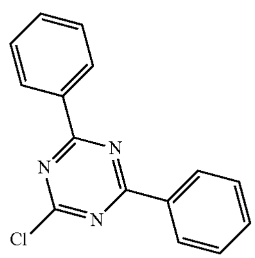 [SMILES: Clc1nc(-c2ccccc2)nc(-c2ccccc2)n1] | 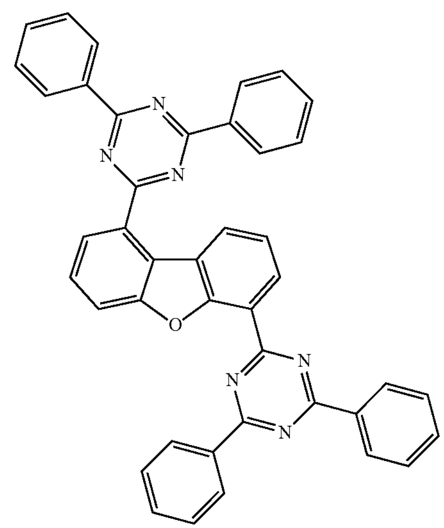 [SMILES: c1ccc(-c2nc(-c3ccccc3)nc(-c3cccc4c3oc3cccc(-c5nc(-c6ccccc6)nc(-c6ccccc6)n5)c34)n2)cc1] | White | 66% | 631 |

TABLE 1-continued
| | Intermediate 1 | Intermediate 2 | Chemical Structure | Shape | Yield (%) | MS: [M + H]+ |
|---|---|---|---|---|---|---|
| Example 10 | B-7 | 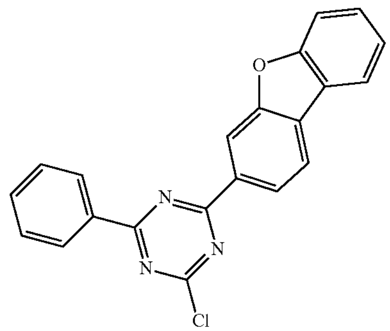 [SMILES: Clc1nc(-c2ccccc2)nc(-c2ccc3c(c2)oc2ccccc23)n1] | 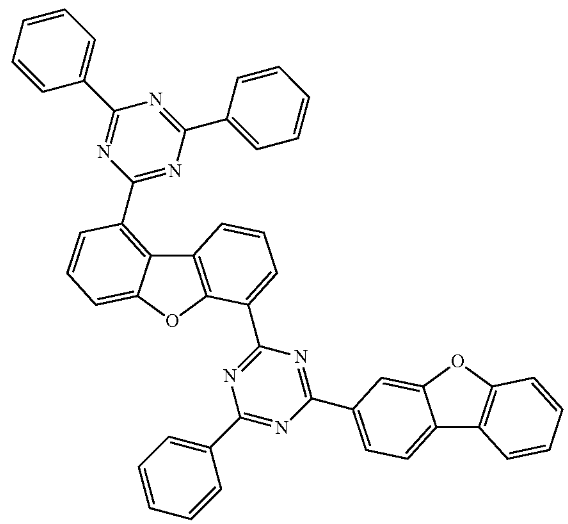 [SMILES: c1ccc(-c2nc(-c3ccc4c(c3)oc3ccccc34)nc(-c3cccc4c3oc3cccc(-c5nc(-c6ccccc6)nc(-c6ccccc6)n5)c34)n2)cc1] | White | 64% | 721 |
| Example 11 | B-7 | J-6 | 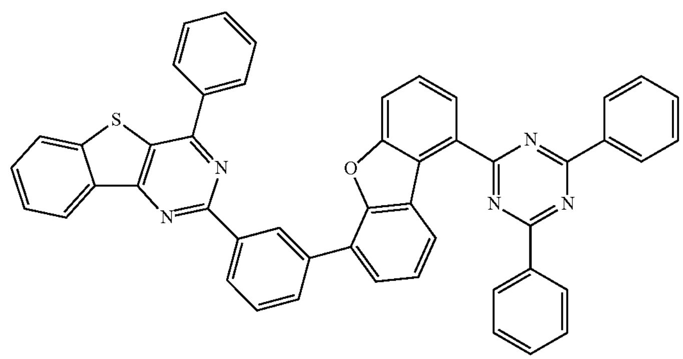 [SMILES: c1ccc(-c2nc(-c3ccccc3)nc(-c3cccc4oc5c(-c6cccc(-c7nc(-c8ccccc8)c8sc9ccccc9c8n7)c6)cccc5c34)n2)cc1] | White | 55% | 736 |

TABLE 1-continued
| | Intermediate 1 | Intermediate 2 | Chemical Structure | Shape | Yield (%) | MS: $[M + H]^+$ |
|---|---|---|---|---|---|---|
| Example 12 | B-9 | 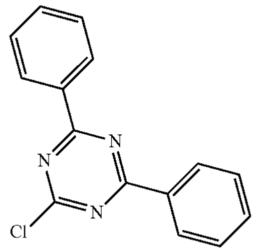 [SMILES: Clc1nc(-c2ccccc2)nc(-c2ccccc2)n1] | 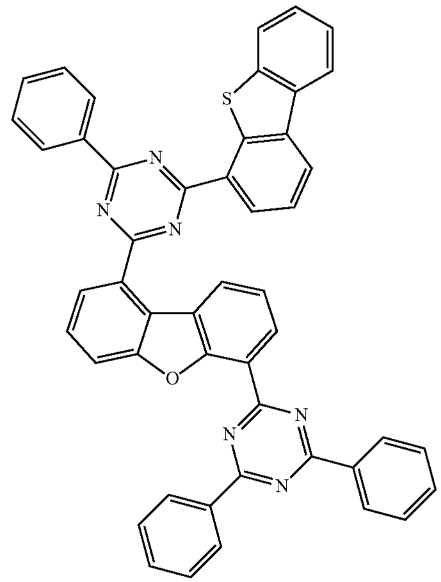 [SMILES: c1ccc(-c2nc(-c3ccccc3)nc(-c3cccc4c3oc3cccc(-c5nc(-c6ccccc6)nc(-c6cccc7c6sc6ccccc67)n5)c34)n2)cc1] | White | 60% | 737 |

TABLE 1-continued
| | Intermediate 1 | Intermediate 2 | Chemical Structure | Shape | Yield (%) | MS: [M + H]$^+$ |
|---|---|---|---|---|---|---|
| Example 13 | B-9 | 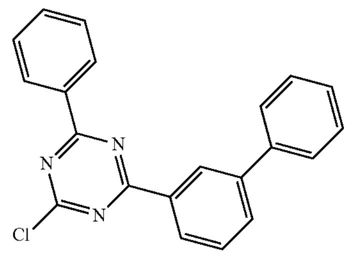 [SMILES: Clc1nc(-c2ccccc2)nc(-c2cccc(-c3ccccc3)c2)n1] | 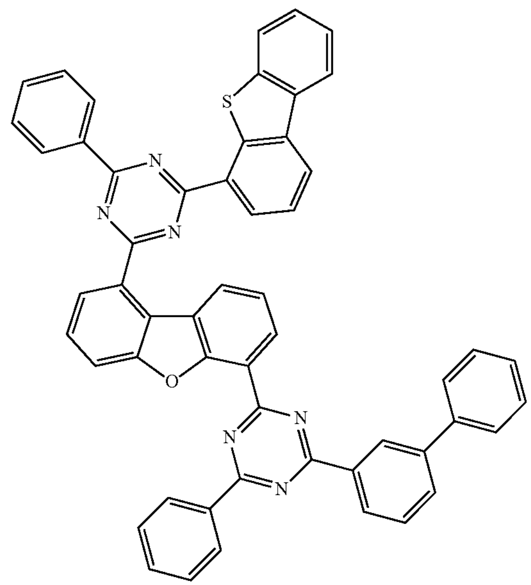 [SMILES: c1ccc(-c2cccc(-c3nc(-c4ccccc4)nc(-c4cccc5c4oc4cccc(-c6nc(-c7ccccc7)nc(-c7cccc8c7sc7ccccc78)n6)c45)n3)c2)cc1] | White | 63% | 813 |

TABLE 1-continued
| | Intermediate 1 | Intermediate 2 | Chemical Structure | Shape | Yield (%) | MS: [M + H]+ |
|---|---|---|---|---|---|---|
| Example 14 | C-6 | 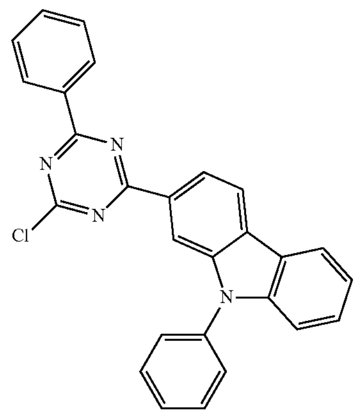 [SMILES: Clc1nc(-c2ccccc2)nc(-c2ccc3c4ccccc4n(-c4ccccc4)c3c2)n1] | 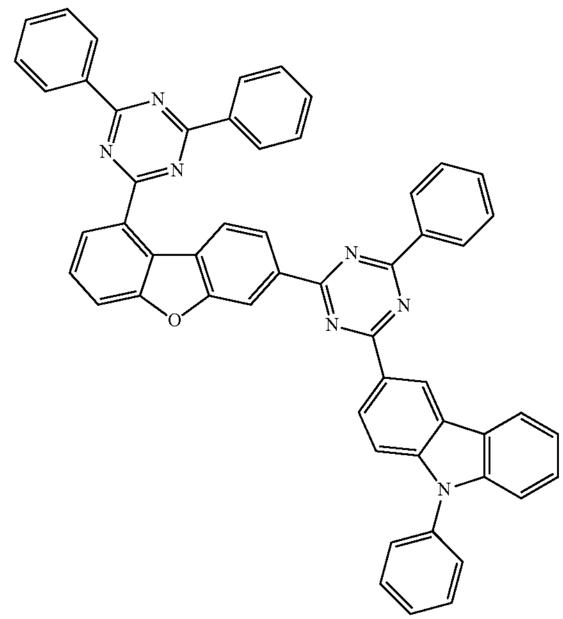 [SMILES: c1ccc(-c2nc(-c3ccc4c(c3)oc3cccc(-c5nc(-c6ccccc6)nc(-c6ccccc6)n5)c34)nc(-c3ccc4c(c3)c3ccccc3n4-c3ccccc3)n2)cc1] | Light yellow | 68% | 796 |

TABLE 1-continued
| | Intermediate 1 | Intermediate 2 | Chemical Structure | Shape | Yield (%) | MS: [M + H]+ |
|---|---|---|---|---|---|---|
| Example 15 | C-6 | 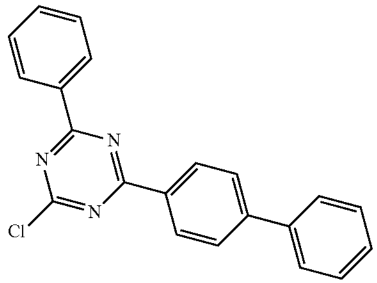 [SMILES: Clc1nc(-c2ccccc2)nc(-c2ccc(-c3ccccc3)cc2)n1] | 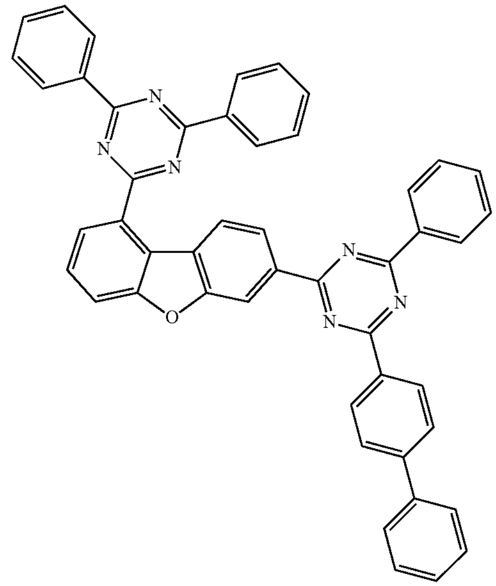 [SMILES: c1ccc(-c2ccc(-c3nc(-c4ccccc4)nc(-c4ccc5c(c4)oc4cccc(-c6nc(-c7ccccc7)nc(-c7ccccc7)n6)c45)n3)cc2)cc1] | White | 70% | 706 |

TABLE 1-continued
| | Intermediate 1 | Intermediate 2 | Chemical Structure | Shape | Yield (%) | MS: [M + H]$^+$ |
|---|---|---|---|---|---|---|
| Example 16 | C-6 | J-2 | 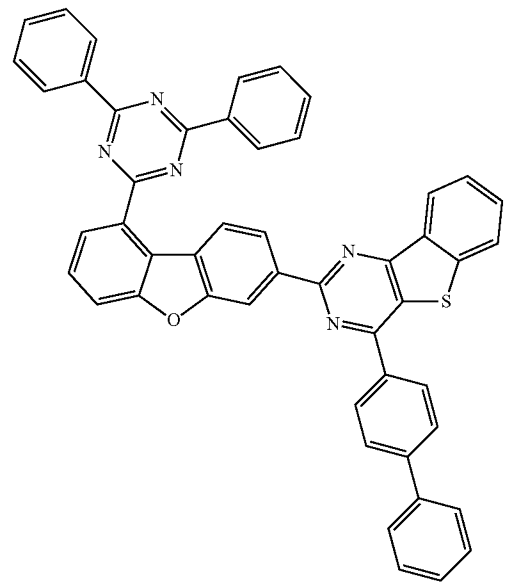 [SMILES: c1ccc(-c2ccc(-c3nc(-c4ccc5c(c4)oc4cccc(-c6nc(-c7ccccc7)nc(-c7ccccc7)n6)c45)nc4c3sc3ccccc34)cc2)cc1] | White | 71% | 736 |

TABLE 1-continued
| | Intermediate 1 | Intermediate 2 | Chemical Structure | Shape | Yield (%) | MS: [M + H]+ |
|---|---|---|---|---|---|---|
| Example 17 | C-8 | 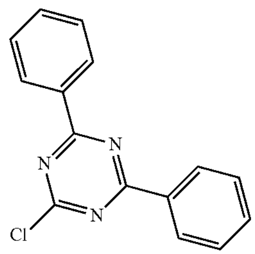 [SMILES: Clc1nc(-c2ccccc2)nc(-c2ccccc2)n1] | 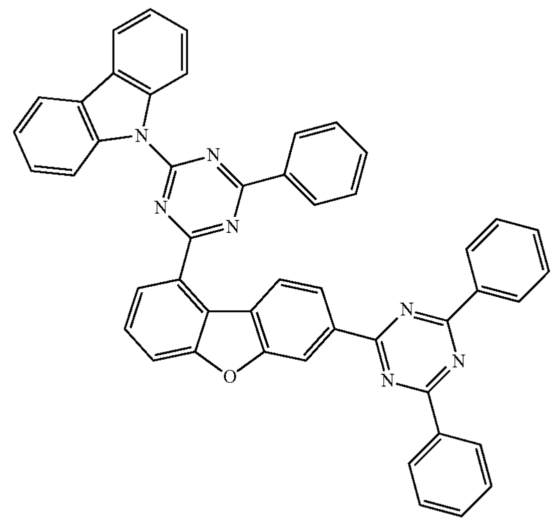 [SMILES: c1ccc(-c2nc(-c3ccccc3)nc(-c3ccc4c(c3)oc3cccc(-c5nc(-c6ccccc6)nc(-n6c7ccccc7c7ccccc76)n5)c34)n2)cc1] | White | 67% | 720 |
| Example 18 | C-8 | J-1 | 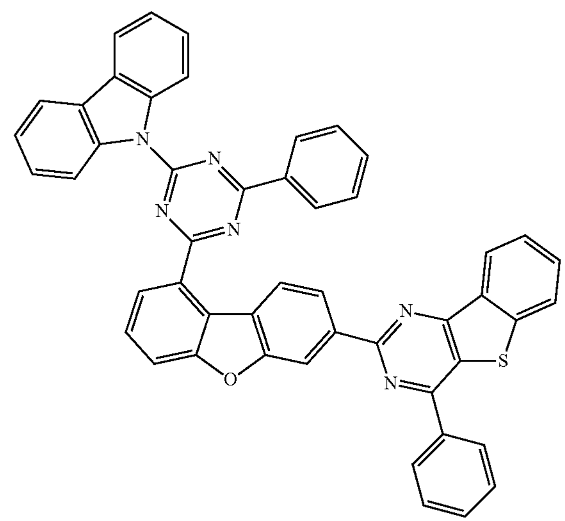 [SMILES: c1ccc(-c2nc(-c3cccc4oc5cc(-c6nc(-c7ccccc7)c7sc8ccccc8c7n6)ccc5c34)nc(-n3c4ccccc4c4ccccc43)n2)cc1] | White | 70% | 749 |

TABLE 1-continued
| | Intermediate 1 | Intermediate 2 | Chemical Structure | Shape | Yield (%) | MS: [M + H]+ |
|---|---|---|---|---|---|---|
| Example 19 | D-6 | 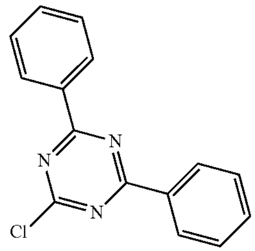 [SMILES: Clc1nc(-c2ccccc2)nc(-c2ccccc2)n1] | 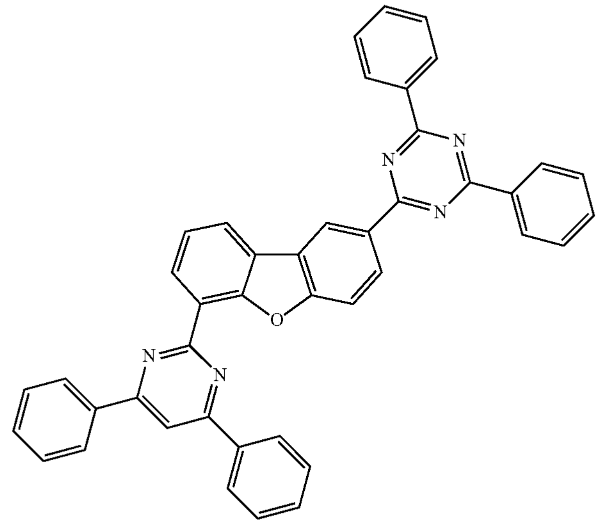 [SMILES: c1ccc(-c2cc(-c3ccccc3)nc(-c3cccc4c3oc3ccc(-c5nc(-c6ccccc6)nc(-c6ccccc6)n5)cc34)n2)cc1] | White | 65% | 630 |
| Example 20 | D-6 | 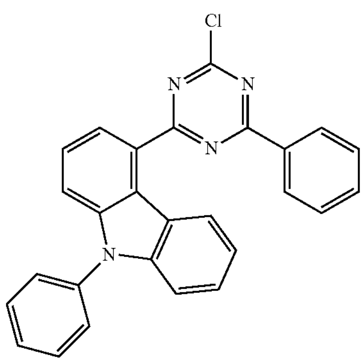 [SMILES: Clc1nc(-c2ccccc2)nc(-c2cccc3c2c2ccccc2n3-c2ccccc2)n1] | 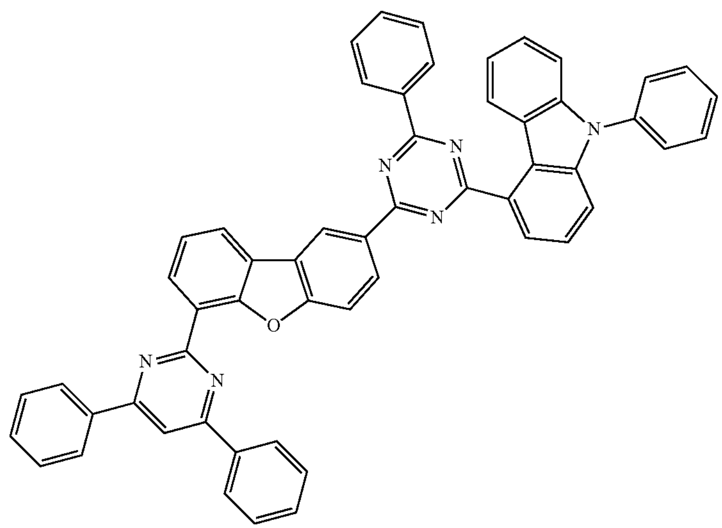 [SMILES: c1ccc(-c2cc(-c3ccccc3)nc(-c3cccc4c3oc3ccc(-c5nc(-c6ccccc6)nc(-c6cccc7c6c6ccccc6n7-c6ccccc6)n5)cc34)n2)cc1] | Light yellow | 61% | 795 |

TABLE 1-continued
| | Intermediate 1 | Intermediate 2 | Chemical Structure | Shape | Yield (%) | MS: [M + H]+ |
|---|---|---|---|---|---|---|
| Example 21 | D-8 | 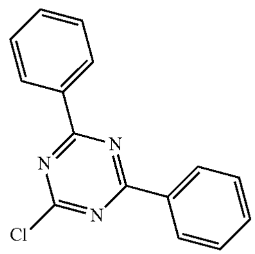 [SMILES: Clc1nc(-c2ccccc2)nc(-c2ccccc2)n1] | 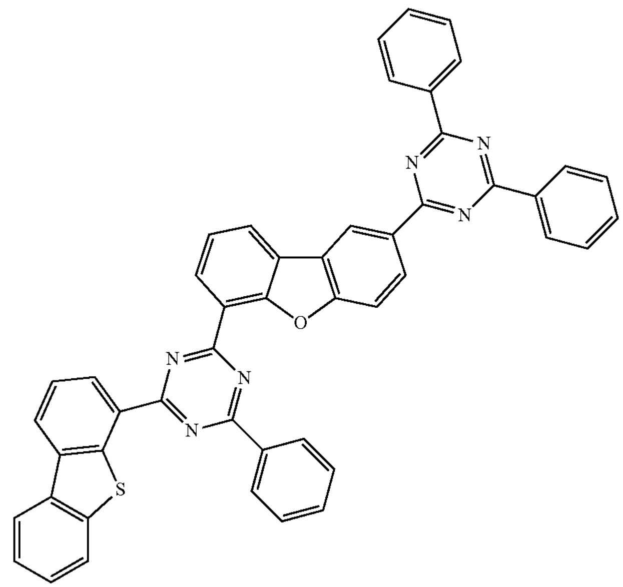 [SMILES: c1ccc(-c2nc(-c3ccccc3)nc(-c3ccc4oc5c(-c6nc(-c7ccccc7)nc(-c7cccc8c7sc7ccccc78)n6)cccc5c4c3)n2)cc1] | White | 63% | 737 |

TABLE 1-continued
| | Intermediate 1 | Intermediate 2 | Chemical Structure | Shape | Yield (%) | MS: [M + H]+ |
|---|---|---|---|---|---|---|
| Example 22 | D-8 | 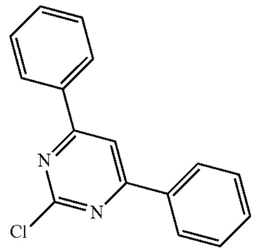 [SMILES: Clc1nc(-c2ccccc2)cc(-c2ccccc2)n1] | 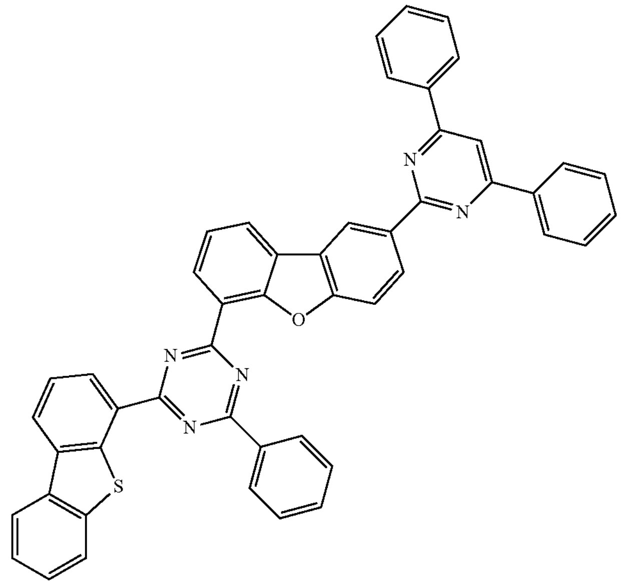 [SMILES: c1ccc(-c2cc(-c3ccccc3)nc(-c3ccc4oc5c(-c6nc(-c7ccccc7)nc(-c7cccc8c7sc7ccccc78)n6)cccc5c4c3)n2)cc1] | White | 61% | 736 |

TABLE 2
| | Intermediate 1 | Intermediate 2 | Chemical Structure | Shape | Yield (%) | MS: [M + H]+ |
|---|---|---|---|---|---|---|
| Example 23 | D-8 | J-4 | 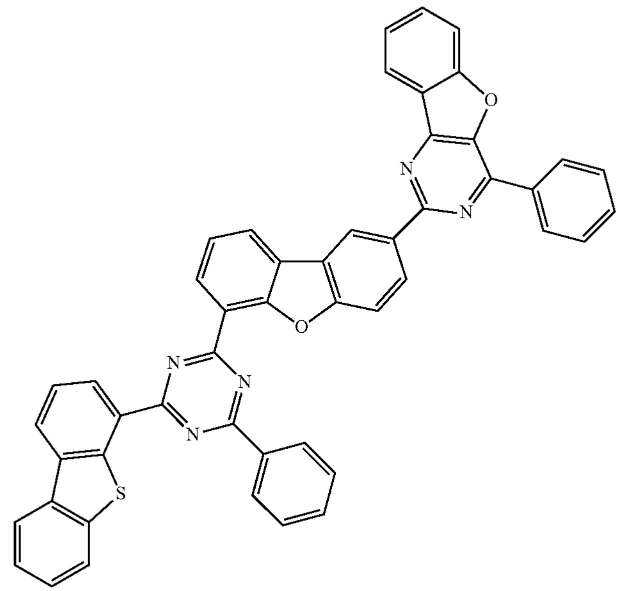 [SMILES: c1ccc(-c2nc(-c3cccc4c3oc3ccc(-c5nc(-c6ccccc6)c6oc7ccccc7c6n5)cc34)nc(-c3cccc4c3sc3ccccc34)n2)cc1] | White | 65% | 750 |

TABLE 2-continued
| | Intermediate 1 | Intermediate 2 | Chemical Structure | Shape | Yield (%) | MS: $[M + H]^+$ |
|---|---|---|---|---|---|---|
| Example 24 | E-6 | 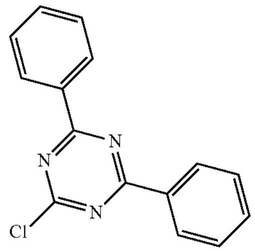 [SMILES: Clc1nc(-c2ccccc2)nc(-c2ccccc2)n1] | 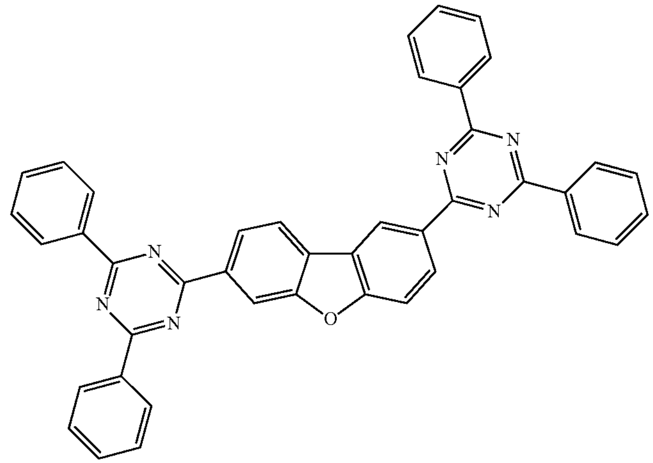 [SMILES: c1ccc(-c2nc(-c3ccccc3)nc(-c3ccc4c(c3)oc3ccc(-c5nc(-c6ccccc6)nc(-c6ccccc6)n5)cc34)n2)cc1] | White | 70% | 631 |
| Example 25 | E-6 | 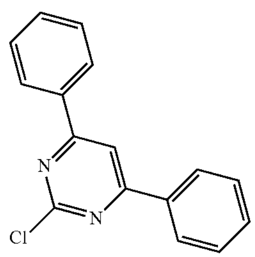 | 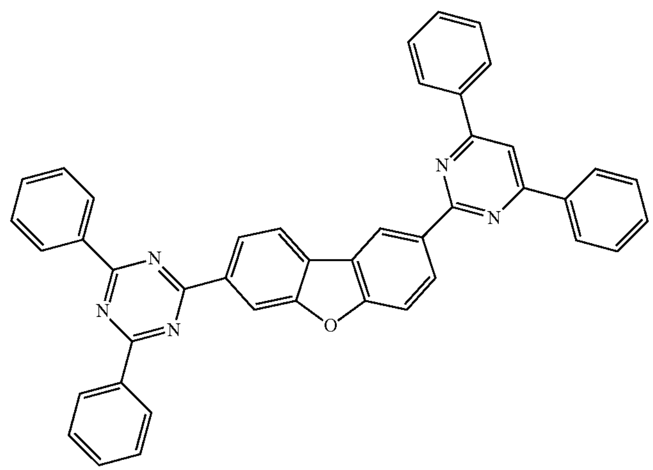 [SMILES: c1ccc(-c2cc(-c3ccccc3)nc(-c3ccc4oc5cc(-c6nc(-c7ccccc7)nc(-c7ccccc7)n6)ccc5c4c3)n2)cc1] | White | 67% | 630 |

TABLE 2-continued
| | Intermediate 1 | Intermediate 2 | Chemical Structure | Shape | Yield (%) | MS: [M + H]+ |
|---|---|---|---|---|---|---|
| Example 26 | E-6 | 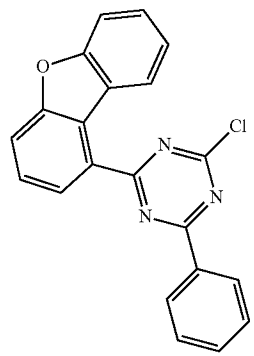 [SMILES: Clc1nc(-c2ccccc2)nc(-c2cccc3oc4ccccc4c23)n1] | 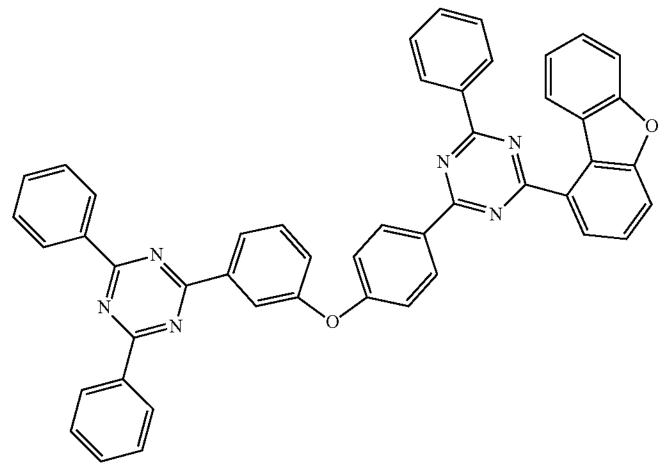 [SMILES: c1ccc(-c2nc(-c3ccccc3)nc(-c3cccc(Oc4ccc(-c5nc(-c6ccccc6)nc(-c6cccc7oc8ccccc8c67)n5)cc4)c3)n2)cc1] | White | 64% | 721 |
| Example 27 | E-6 | J-1 | 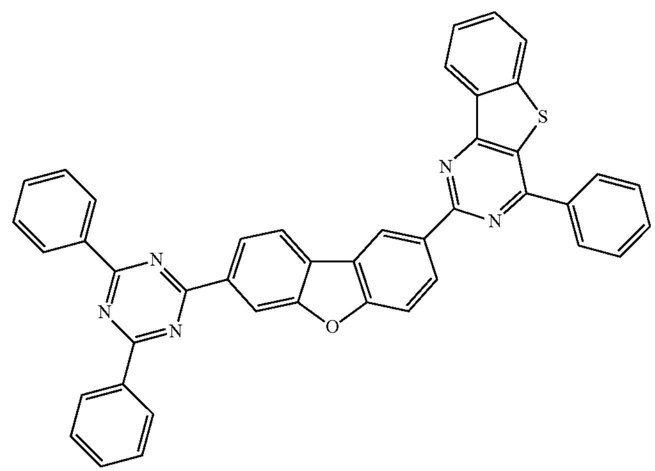 [SMILES: c1ccc(-c2nc(-c3ccccc3)nc(-c3ccc4c(c3)oc3ccc(-c5nc(-c6ccccc6)c6sc7ccccc7c6n5)cc34)n2)cc1] | White | 72% | 660 |

TABLE 2-continued
| | Intermediate 1 | Intermediate 2 | Chemical Structure | Shape | Yield (%) | MS: [M + H]$^+$ |
|---|---|---|---|---|---|---|
| Example 28 | E-6 | J-5 | 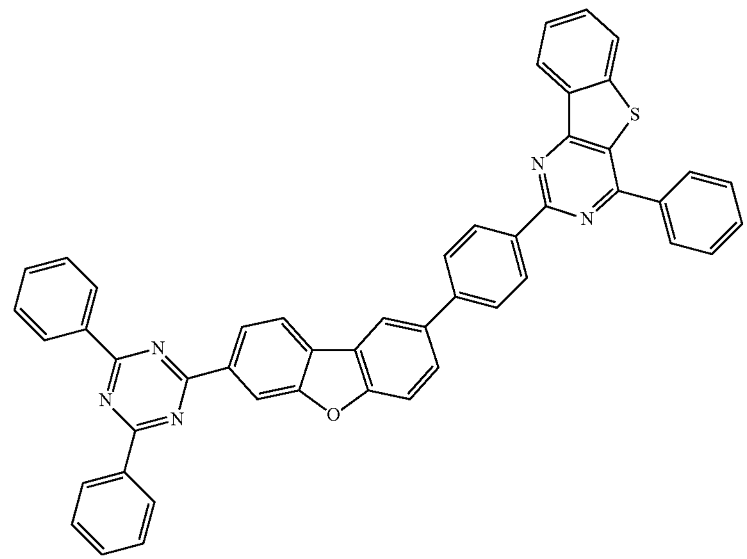 [SMILES: c1ccc(-c2nc(-c3ccccc3)nc(-c3ccc4c(c3)oc3ccc(-c5ccc(-c6nc(-c7ccccc7)c7sc8ccccc8c7n6)cc5)cc34)n2)cc1] | White | 75% | 736 |

TABLE 2-continued
| | Intermediate 1 | Intermediate 2 | Chemical Structure | Shape | Yield (%) | MS: [M + H]+ |
|---|---|---|---|---|---|---|
| Example 29 | E-8 | 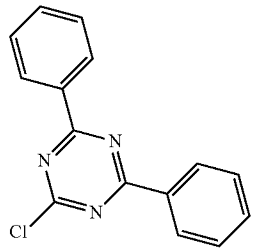 [SMILES: Clc1nc(-c2ccccc2)nc(-c2ccccc2)n1] | 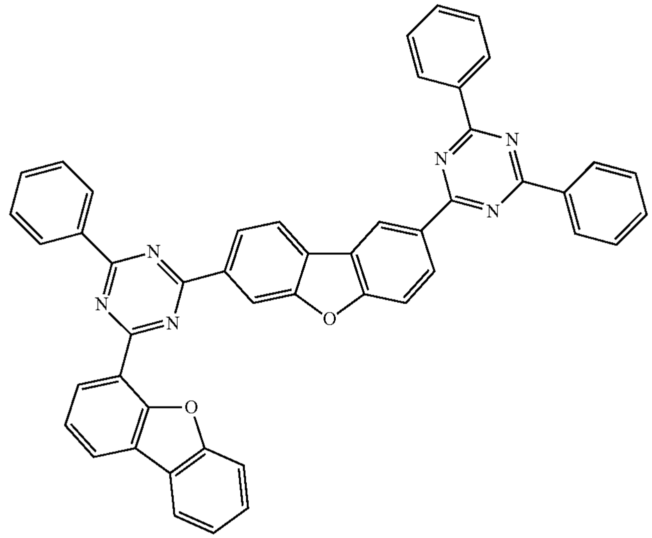 [SMILES: c1ccc(-c2nc(-c3ccccc3)nc(-c3ccc4oc5cc(-c6nc(-c7ccccc7)nc(-c7cccc8c7oc7ccccc78)n6)ccc5c4c3)n2)cc1] | White | 69% | 721 |
| Example 30 | F-6 | 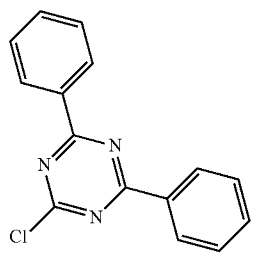 [SMILES: Clc1nc(-c2ccccc2)nc(-c2ccccc2)n1] | 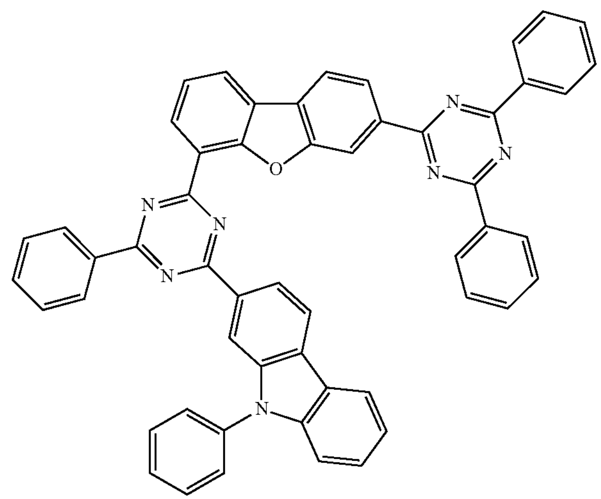 [SMILES: c1ccc(-c2nc(-c3ccccc3)nc(-c3ccc4c(c3)oc3c(-c5nc(-c6ccccc6)nc(-c6ccc7c8ccccc8n(-c8ccccc8)c7c6)n5)cccc34)n2)cc1] | Light yellow | 60% | 796 |

TABLE 2-continued
| | Intermediate 1 | Intermediate 2 | Chemical Structure | Shape | Yield (%) | MS: [M + H]$^+$ |
| --- | --- | --- | --- | --- | --- | --- |
| Example 31 | F-6 | 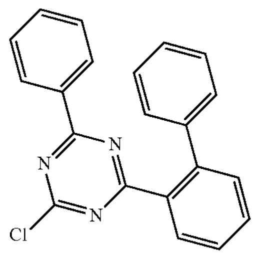 [SMILES: Clc1nc(-c2ccccc2)nc(-c2ccccc2-c2ccccc2)n1] | 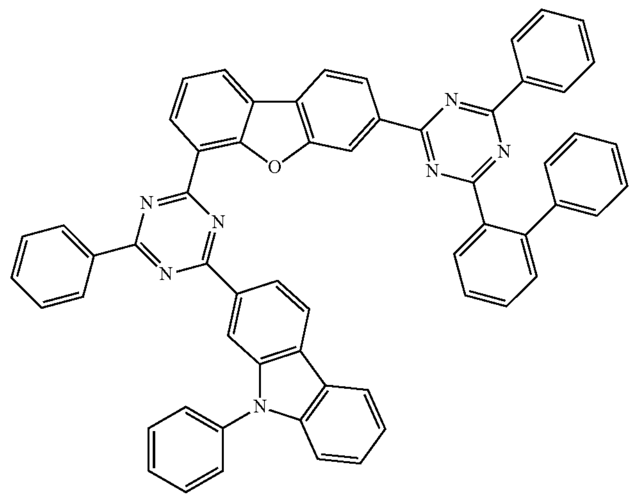 [SMILES: c1ccc(-c2nc(-c3ccc4c(c3)oc3c(-c5nc(-c6ccccc6)nc(-c6ccc7c8ccccc8n(-c8ccccc8)c7c6)n5)cccc34)nc(-c3ccccc3-c3ccccc3)n2)cc1] | Light yellow | 51% | 872 |
| Example 32 | F-6 | J-4 | 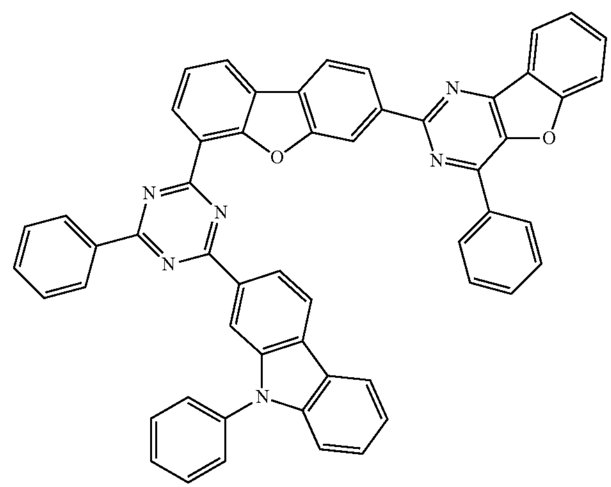 [SMILES: c1ccc(-c2nc(-c3ccc4c5ccccc5n(-c5ccccc5)c4c3)nc(-c3cccc4c3oc3cc(-c5nc(-c6ccccc6)c6oc7ccccc7c6n5)ccc34)n2)cc1] | Light yellow | 63% | 809 |

TABLE 2-continued
| | Intermediate 1 | Intermediate 2 | Chemical Structure | Shape | Yield (%) | MS: [M + H]+ |
|---|---|---|---|---|---|---|
| Example 33 | F-8 | 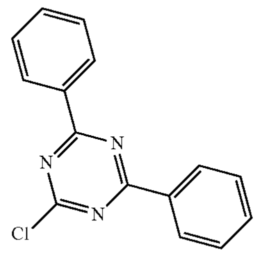 [SMILES: Clc1nc(-c2ccccc2)nc(-c2ccccc2)n1] | 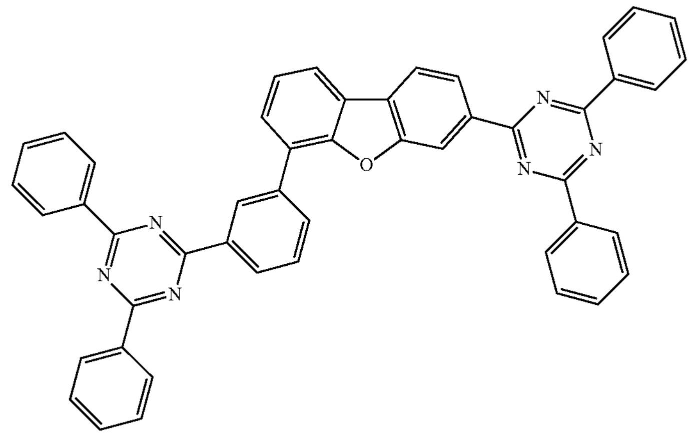 [SMILES: c1ccc(-c2nc(-c3ccccc3)nc(-c3cccc(-c4cccc5c4oc4cc(-c6nc(-c7ccccc7)nc(-c7ccccc7)n6)ccc45)c3)n2)cc1] | White | 60% | 707 |
| Example 34 | F-8 | 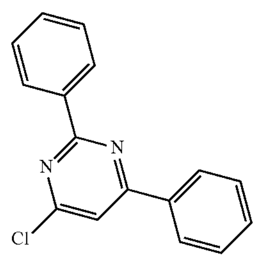 [SMILES: Clc1cc(-c2ccccc2)nc(-c2ccccc2)n1] | 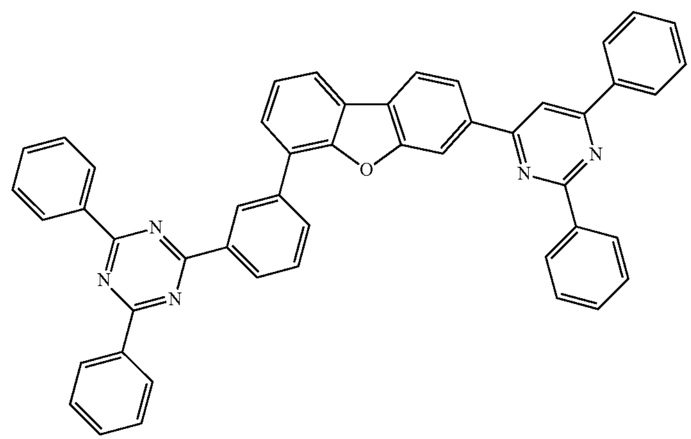 [SMILES: c1ccc(-c2cc(-c3ccc4c(c3)oc3c(-c5cccc(-c6nc(-c7ccccc7)nc(-c7ccccc7)n6)c5)cccc34)nc(-c3ccccc3)n2)cc1] | White | 63% | 706 |

TABLE 2-continued
| | Intermediate 1 | Intermediate 2 | Chemical Structure | Shape | Yield (%) | MS: [M + H]+ |
|---|---|---|---|---|---|---|
| Example 35 | F-8 | J-1 | 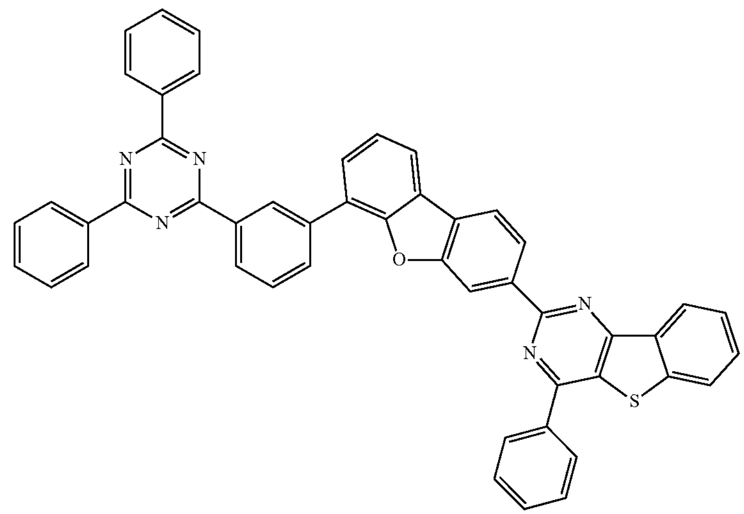 [SMILES: c1ccc(-c2nc(-c3ccccc3)nc(-c3cccc(-c4cccc5c4oc4cc(-c6nc(-c7ccccc7)c7sc8ccccc8c7n6)ccc45)c3)n2)cc1] | White | 62% | 736 |
| Example 36 | G-7 | 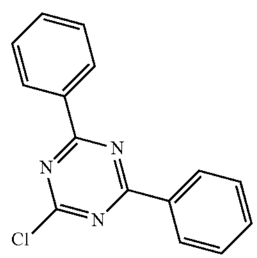 [SMILES: Clc1nc(-c2ccccc2)nc(-c2ccccc2)n1] | 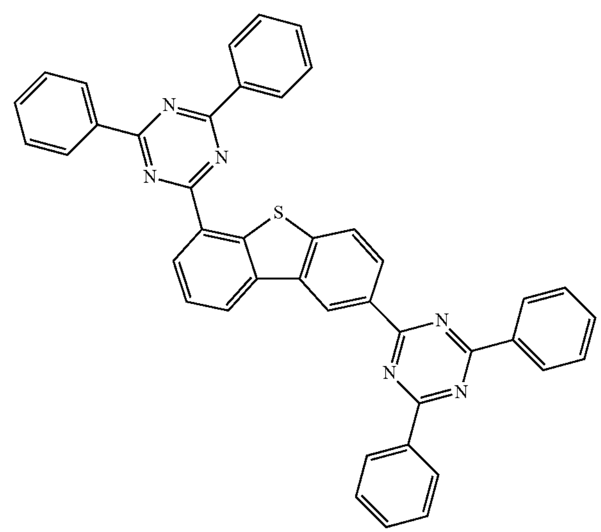 [SMILES: c1ccc(-c2nc(-c3ccccc3)nc(-c3ccc4sc5c(-c6nc(-c7ccccc7)nc(-c7ccccc7)n6)cccc5c4c3)n2)cc1] | White | 65% | 647 |

TABLE 2-continued
| | Intermediate 1 | Intermediate 2 | Chemical Structure | Shape | Yield (%) | MS: [M + H]+ |
|---|---|---|---|---|---|---|
| Example 37 | G-7 | 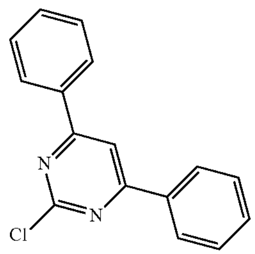 [SMILES: Clc1nc(-c2ccccc2)cc(-c2ccccc2)n1] | 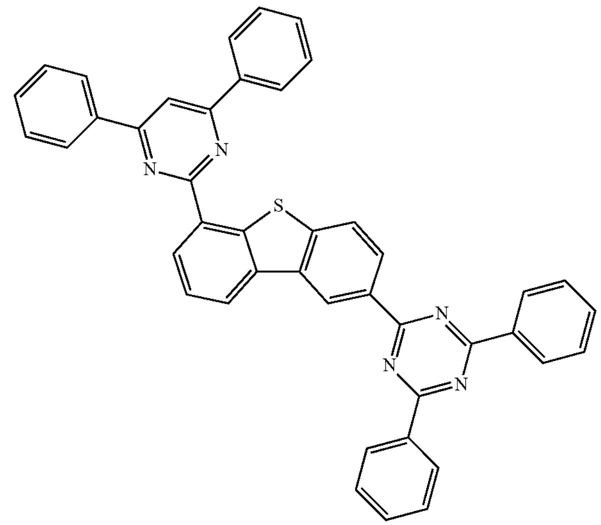 [SMILES: c1ccc(-c2cc(-c3ccccc3)nc(-c3cccc4c3sc3ccc(-c5nc(-c6ccccc6)nc(-c6ccccc6)n5)cc34)n2)cc1] | White | 62% | 646 |
| Example 38 | G-7 | J-1 | 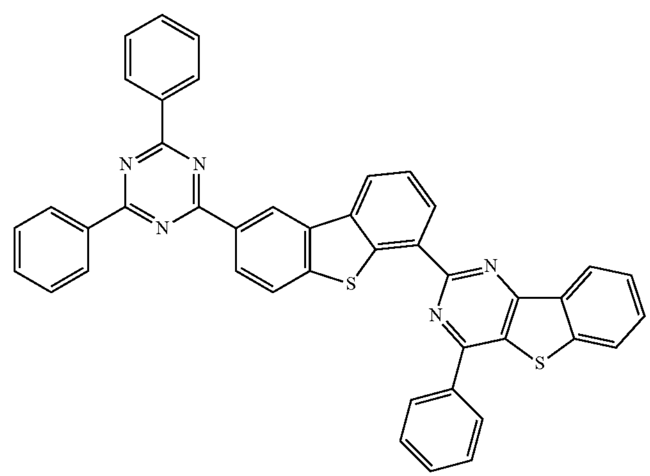 [SMILES: c1ccc(-c2nc(-c3ccccc3)nc(-c3ccc4sc5c(-c6nc(-c7ccccc7)c7sc8ccccc8c7n6)cccc5c4c3)n2)cc1] | White | 66% | 676 |

TABLE 2-continued
| | Intermediate 1 | Intermediate 2 | Chemical Structure | Shape | Yield (%) | MS: [M + H]⁺ |
|---|---|---|---|---|---|---|
| Example 39 | H-7 | 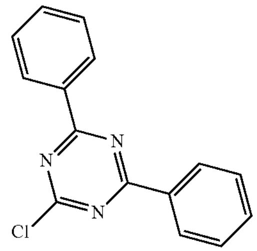 [SMILES: Clc1nc(-c2ccccc2)nc(-c2ccccc2)n1] | 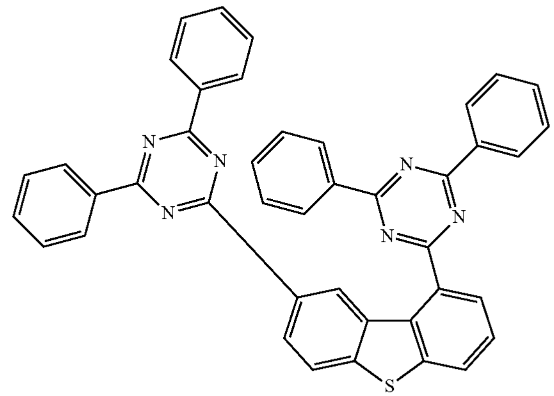 [SMILES: c1ccc(-c2nc(-c3ccccc3)nc(-c3ccc4sc5cccc(-c6nc(-c7ccccc7)nc(-c7ccccc7)n6)c5c4c3)n2)cc1] | White | 47% | 646 |
| Example 40 | H-7 | 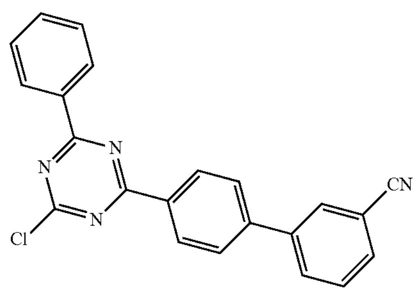 [SMILES: N#Cc1cccc(-c2ccc(-c3nc(Cl)nc(-c4ccccc4)n3)cc2)c1] | 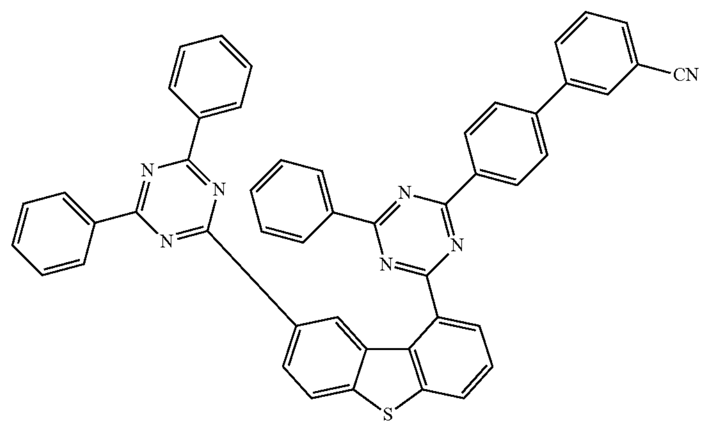 [SMILES: N#Cc1cccc(-c2ccc(-c3nc(-c4ccccc4)nc(-c4cccc5sc6ccc(-c7nc(-c8ccccc8)nc(-c8ccccc8)n7)cc6c45)n3)cc2)c1] | White | 50% | 748 |

TABLE 2-continued
| | Intermediate 1 | Intermediate 2 | Chemical Structure | Shape | Yield (%) | MS: [M + H]+ |
|---|---|---|---|---|---|---|
| Example 41 | H-7 | J-1 | 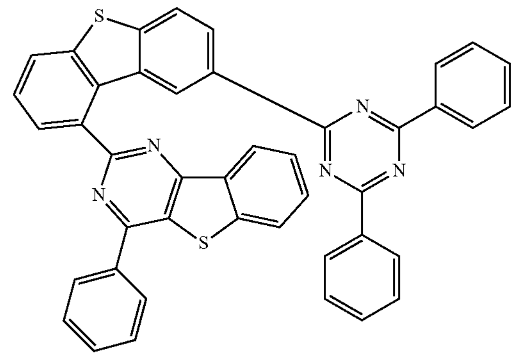 [SMILES: c1ccc(-c2nc(-c3ccccc3)nc(-c3ccc4sc5cccc(-c6nc(-c7ccccc7)c7sc8ccccc8c7n6)c5c4c3)n2)cc1] | White | 49% | 676 |
| Example 42 | I-7 | 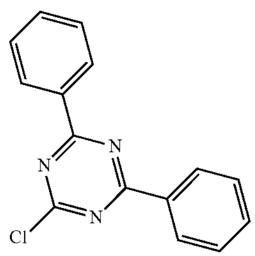 [SMILES: Clc1nc(-c2ccccc2)nc(-c2ccccc2)n1] | 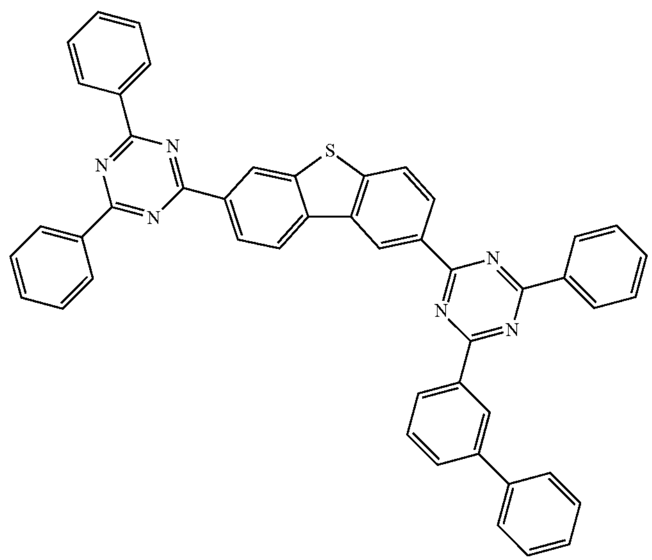 [SMILES: c1ccc(-c2cccc(-c3nc(-c4ccccc4)nc(-c4ccc5sc6cc(-c7nc(-c8ccccc8)nc(-c8ccccc8)n7)ccc6c5c4)n3)c2)cc1] | White | 45% | 723 |

TABLE 2-continued
| | Intermediate 1 | Intermediate 2 | Chemical Structure | Shape | Yield (%) | MS: $[M + H]^+$ |
|---|---|---|---|---|---|---|
| Example 43 | I-7 | 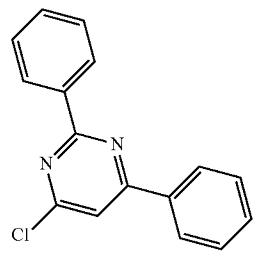 | 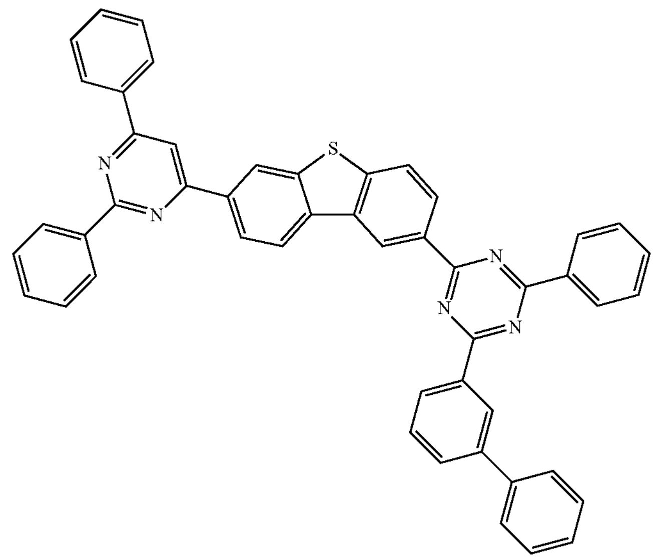 [SMILES: c1ccc(-c2cccc(-c3nc(-c4ccccc4)nc(-c4ccc5sc6cc(-c7cc(-c8ccccc8)nc(-c8ccccc8)n7)ccc6c5c4)n3)c2)cc1] | White | 45% | 722 |

Example 44 Preparation of Compound 2-1

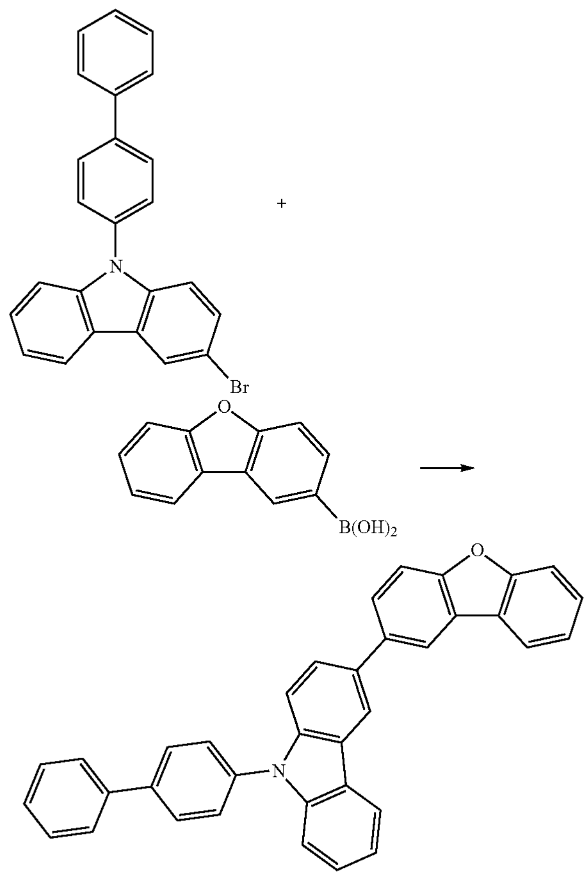

2-1

After 9-(1,1'-biphenyl)-4-yl)-3-bromo-9H-carbazole (15 g, 27 mmol) and dibenzo[b,d]furan-2-ylboronic acid (5.7 g, 27 mmol) were dispersed in tetrahydrofuran (80 mL), 2M aqueous potassium carbonate solution (aq. $K_2CO_3$) (40 mL, 81 mmol) was added and tetrakistriphenylphosphinopalladium $[Pd(PPh_3)_4]$(0.3 g, 1 mol %) was added, and then the mixture was stirred and refluxed for 6 hours. The temperature was lowered to room temperature, the aqueous layer was removed and concentrated under reduced pressure. Ethyl acetate was added thereto, stirred under reflux for 1 hour, cooled to room temperature, and then the solid was filtered. Chloroform was added to the resulting solid and dissolved under reflux. The resultant product was recrystallized from ethyl acetate to give Compound 2-1 (11.5 g, yield: 73%, MS:$[M+H]^+$=486).

Example 45: Preparation of Compound

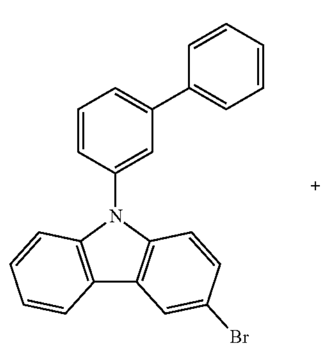

-continued

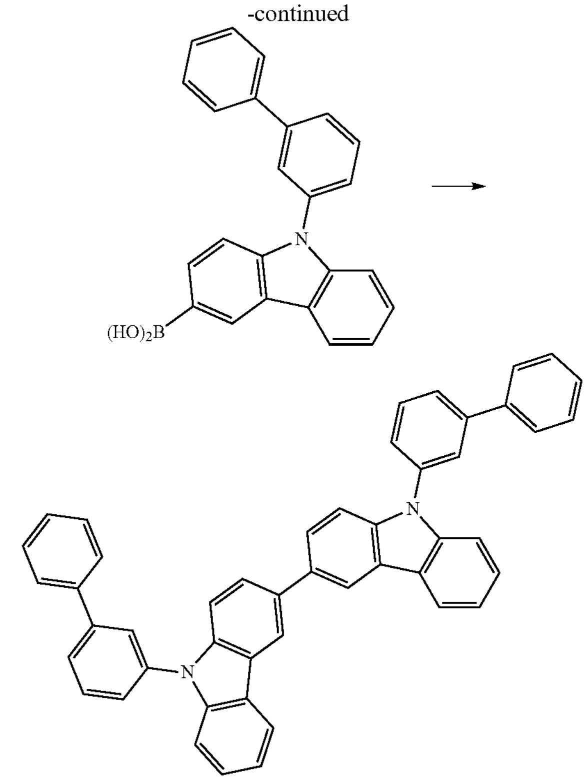

2-2

Compound 2-2 (19.7 g, yield: 77%, MS:$[M+H]^+$=637) was prepared in the same manner as in the preparation method of Compound 2-1 by using 9-([1,1'-biphenyl]-3-yl)-3-bromo-9H-carbazole (16 g, 40 mmol) and 9-([1,1'-biphenyl]-3-yl)-9H-carbazol-3-yl)boronic acid (14.6 g, 40 mmol).

Example 46: Preparation of Compound

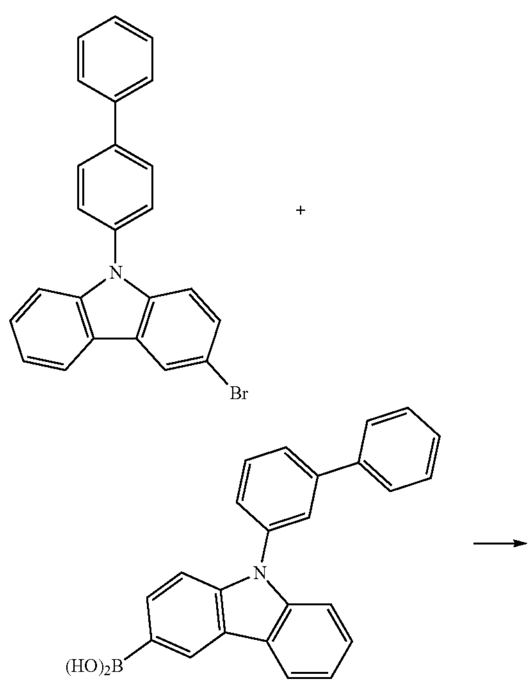

-continued

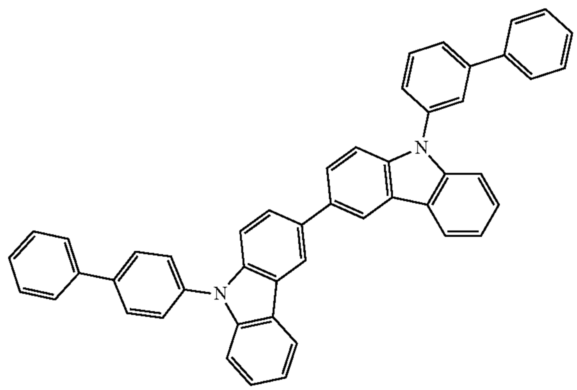

2-3

Compound 2-3 (20.6 g, yield: 80%, MS:[M+H]$^+$=637) was prepared in the same manner as in the preparation method of Compound 2-1 by using 9-([1,1'-biphenyl]-4-yl)-3-bromo-9H-carbazole (16 g, 40 mmol) and 9-([1,1'-biphenyl]-3-yl)-9H-carbazol-3-yl)boronic acid (14.6 g, 40 mmol).

Example 47: Preparation of Compound 2-4

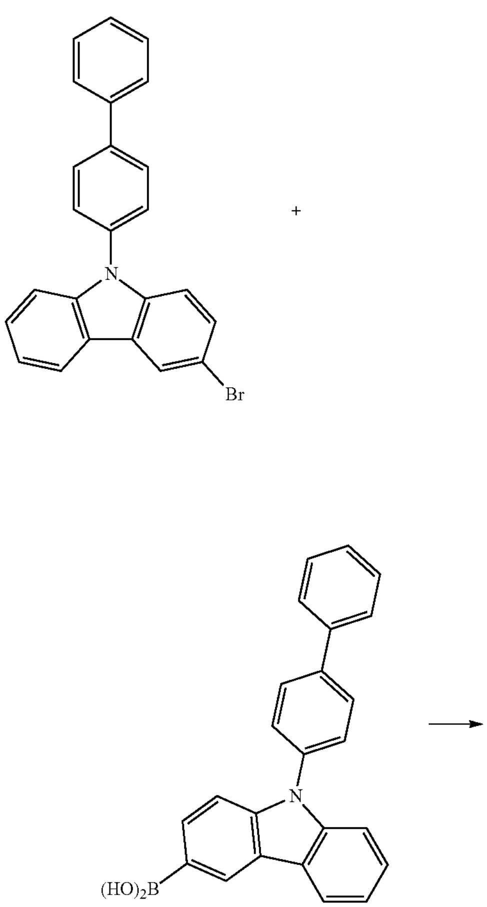

-continued

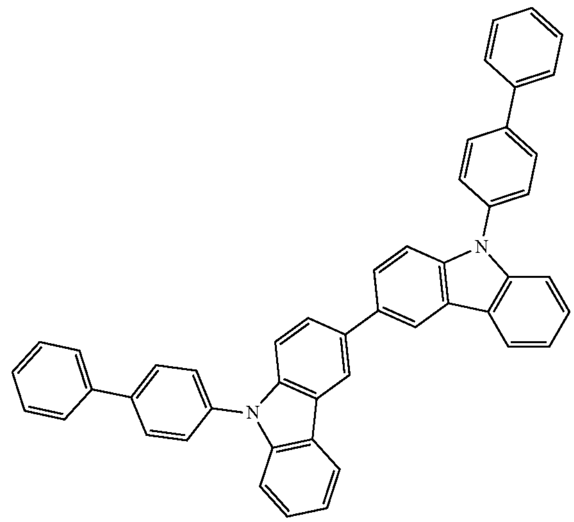

2-4

Compound 2-4 (22.5 g, yield: 88%, MS:[M+H]$^+$=637) was prepared in the same manner as in the preparation method of Compound 2-1 by using 9-([1,1'-biphenyl]-4-yl)-3-bromo-9H-carbazole (16 g, 40 mmol) and 9-([1,1'-biphenyl]-4-yl)-9H-carbazol-3-yl)boronic acid (14.6 g, 40 mmol).

Example 48: Preparation of Compound 2-5

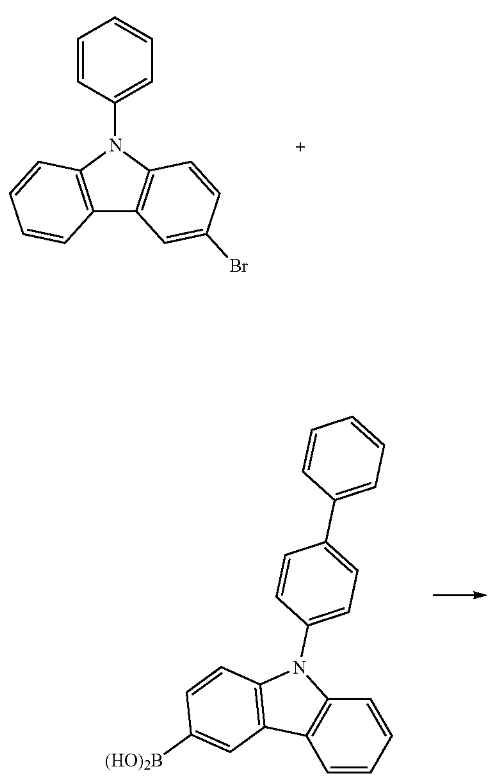

-continued

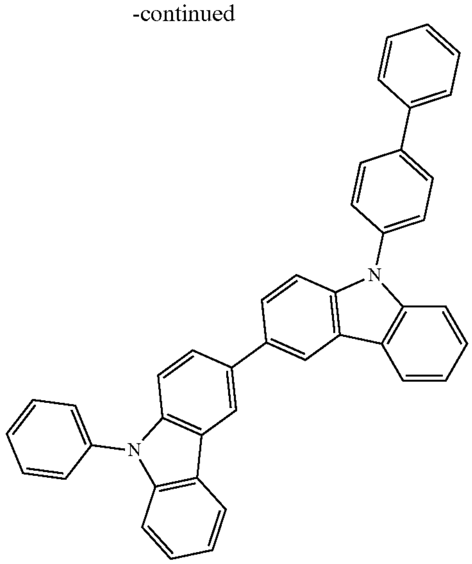

2-5

Compound 2-5 (19.7 g, yield: 71%, MS:[M+H]$^{+}$=561) was prepared in the same manner as in the method for preparing Compound 2-1 by using 3-bromo-9-phenyl-9H-carbazole (16 g, 50 mmol) and 9-([1,1'-biphenyl]-4-yl)-9H-carbazol-3-yl)boronic acid (18.03 g, 50 mmol).

EXPERIMENTAL EXAMPLES

Experimental Example 1

A glass substrate on which ITO (indium tin oxide) was coated as a thin film to a thickness of 1,300 Å was put into distilled water in which a detergent was dissolved, and ultrasonically cleaned. A product manufactured by Fischer Co. was used as the detergent, and as the distilled water, distilled water filtered twice using a filter manufactured by Millipore Co. was used. After the ITO was cleaned for 30 minutes, ultrasonic cleaning was repeated twice using distilled water for 10 minutes. After the cleaning with distilled water was completed, the substrate was ultrasonically cleaned with solvents of isopropyl alcohol, acetone, and methanol, dried, and then transferred to a plasma cleaner. The substrate was cleaned for 5 minutes using oxygen plasma and then transferred to a vacuum depositor.

On the ITO transparent electrode thus prepared, the compound HAT shown below was thermally vacuum-deposited in a thickness of 50 Å to form a hole injection layer. The compound HT-1 shown below was thermally vacuum-deposited in a thickness of 250 Å on the hole injection layer to form a hole transport layer, and the compound HT-2 shown below was vacuum-deposited in a thickness of 50 Å on the HT-1 deposited layer to form an electron blocking layer. The compound 1 (host) prepared previously, the compound 2-5 (host) prepared previously, and the compound YGD-1 shown below (phosphorescent dopant) were co-deposited at a weight ratio of 44:44:12 thereon to form a light emitting layer having a thickness of 400 Å. The compound ET-1 shown below was vacuum-deposited in a thickness of 250 Å on the light emitting layer, and further the compound ET-2 shown below was co-deposited with 2 wt % Li to a thickness of 100 Å to form an electron transport layer and an electron injection layer. Aluminum was deposited in a thickness of 1000 Å on the electron injection layer to form a cathode.

HAT

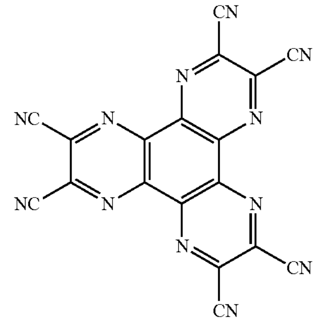

HT-1

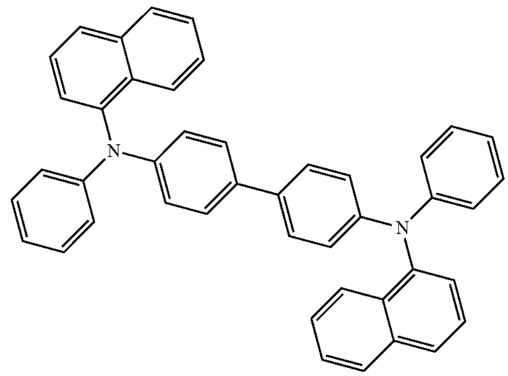

HT-2

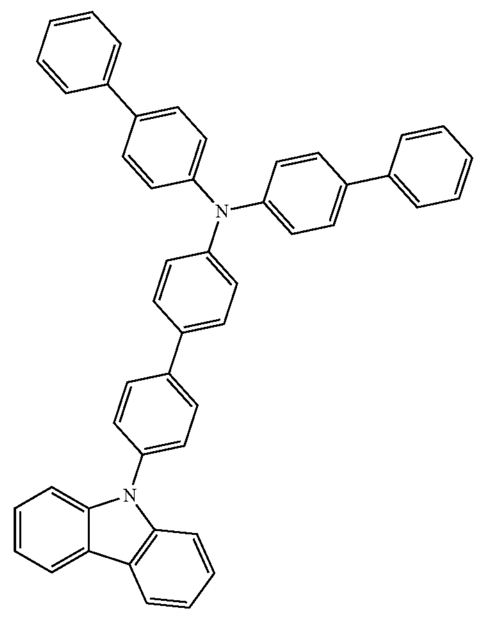

YGD-1

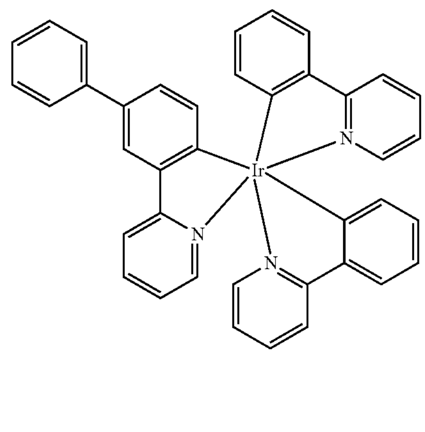

-continued

ET-1

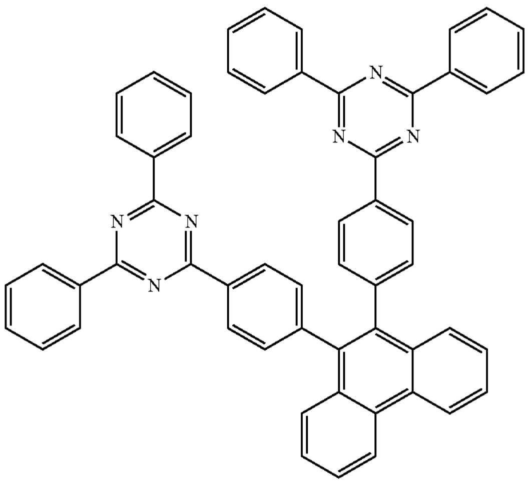

ET-2

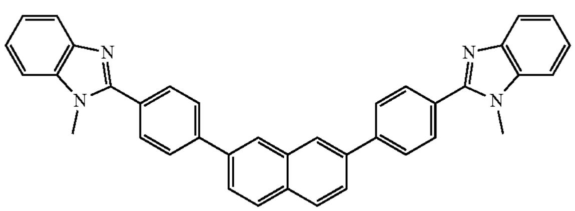

In the above-mentioned process, the vapor deposition rate of the organic material was maintained at 0.4 to 0.7 Å/sec, the deposition rate of aluminum was maintained at 2 Å/sec, and the degree of vacuum during the deposition was maintained at $1\times10^{-7}$ to $5\times10^{-8}$ torr.

Experimental Examples 2 to 14

The organic light emitting devices were manufactured in the same manner as in Experimental Example 1, except that the compounds shown in Table 3 below were used as a host compound when forming the light emitting layer.

Comparative Experimental Examples 1 to 13

The organic light emitting devices was manufactured in the same manner as in Experimental Example 1, except that the compounds shown in Table 3 below were used as a host compound when forming the light emitting layer. In Table 3 below, Compounds C1, C2 and C3 are as follows.

C1

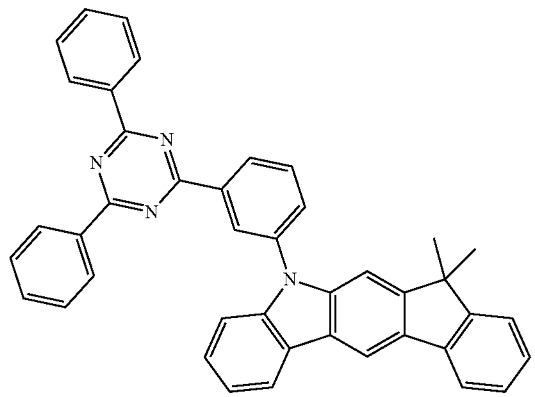

C2

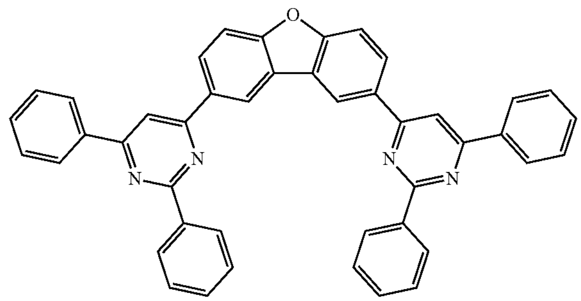

C3

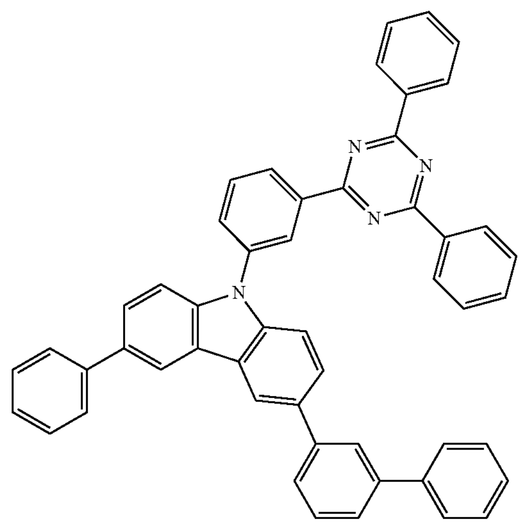

The voltage, efficiency, color coordinate and lifetime were measured by applying a current to the organic light emitting devices manufactured in Experimental Examples 1 to 14 and Comparative Experimental Examples 1 to 13, and the results are shown in Table 3 below. T95 means the time required for the luminance to be reduced to 95% of the initial luminance.

TABLE 3

| | Host material | Voltage (V) (@ 10 mA/cm²) | Efficiency (cd/A) (@ 10 mA/cm²) | Color coordinate (x, y) | Lifetime (h) (T95 at 50 mA/cm²) |
|---|---|---|---|---|---|
| Experimental Example 1 | Compound 2-5:Compound 1 | 3.3 | 72 | 0.45, 0.52 | 130 |
| Experimental Example 2 | Compound 2-5:Compound 2 | 3.4 | 69 | 0.45, 0.54 | 158 |

TABLE 3-continued

| | Host material | Voltage (V) (@ 10 mA/cm²) | Efficiency (cd/A) (@ 10 mA/cm²) | Color coordinate (x, y) | Lifetime (h) (T95 at 50 mA/cm²) |
|---|---|---|---|---|---|
| Experimental Example 3 | Compound 2-5:Compound 3 | 3.5 | 70 | 0.45, 0.54 | 160 |
| Experimental Example 4 | Compound 2-5:Compound 4 | 3.5 | 71 | 0.46, 0.52 | 140 |
| Experimental Example 5 | Compound 2-5:Compound 6 | 3.8 | 72 | 0.45, 0.53 | 130 |
| Experimental Example 6 | Compound 2-5:Compound 9 | 3.6 | 68 | 0.45, 0.54 | 109 |
| Experimental Example 7 | Compound 2-5:Compound 11 | 3.4 | 73 | 0.45, 0.53 | 120 |
| Experimental Example 8 | Compound 2-5:Compound 15 | 3.6 | 75 | 0.45, 0.54 | 140 |
| Experimental Example 9 | Compound 2-5:Compound 17 | 3.7 | 79 | 0.44, 0.54 | 195 |
| Experimental Example 10 | Compound 2-5:Compound 21 | 3.4 | 75 | 0.45, 0.53 | 175 |
| Experimental Example 11 | Compound 2-5:Compound 24 | 3.7 | 73 | 0.43, 0.54 | 155 |
| Experimental Example 12 | Compound 2-5:Compound 26 | 3.7 | 72 | 0.45, 0.53 | 160 |
| Experimental Example 13 | Compound 2-5:Compound 30 | 3.2 | 77 | 0.45, 0.54 | 160 |
| Experimental Example 14 | Compound 2-5:Compound 36 | 3.6 | 70 | 0.43, 0.54 | 145 |
| Comparative Experimental Example 1 | Compound 2-5:C1 | 3.6 | 68 | 0.45, 0.54 | 91 |
| Comparative Experimental Example 2 | Compound 2-5:C2 | 4.2 | 60 | 0.45, 0.53 | 65 |
| Comparative Experimental Example 3 | Compound 2-5:C3 | 4.4 | 69 | 0.45, 0.54 | 50 |
| Comparative Experimental Example 4 | Compound 1 | 3.3 | 58 | 0.44, 0.55 | 55 |
| Comparative Experimental Example 5 | Compound 2 | 3.0 | 62 | 0.46, 0.53 | 21 |
| Comparative Experimental Example 6 | Compound 3 | 3.2 | 61 | 0.46, 0.52 | 25 |
| Comparative Experimental Example 7 | Compound 4 | 3.3 | 60 | 0.44, 0.54 | 57 |
| Comparative Experimental Example 8 | Compound 9 | 3.2 | 56 | 0.45, 0.53 | 30 |
| Comparative Experimental Example 9 | Compound 17 | 3.3 | 63 | 0.44, 0.52 | 40 |
| Comparative Experimental Example 10 | Compound 21 | 3.4 | 60 | 0.44, 0.52 | 39 |
| Comparative Experimental Example 11 | Compound 24 | 3.2 | 61 | 0.44, 0.52 | 43 |
| Comparative Experimental Example 12 | Compound 30 | 3.3 | 63 | 0.43, 0.55 | 50 |
| Comparative Experimental Example 13 | Compound 36 | 3.4 | 60 | 0.45, 0.52 | 29 |

As shown in Table 3, it was confirmed that in the case of an organic light emitting devices manufactured using the compound according to the present invention as a host of the light emitting layer, it exhibited superior performance in terms of driving voltage and lifetime as compared with the organic light emitting devices of Comparative Examples. In addition, it was confirmed that when the compound of Chemical Formula 1 and the compound of Chemical Formula 2 were used together, it exhibited high efficiency and long lifetime as compared with the case where it was not so.

Experimental Example 15

On the ITO transparent electrode prepared as in Experimental Example 1, the compound HAT below was thermally vacuum-deposited in a thickness of 500 Å to form a hole injection layer. The compound HT-1 below was thermally vacuum-deposited in a thickness of 800 Å on the hole injection layer, and sequentially the compound HT-3 below was vacuum-deposited in a thickness of 500 Å to form a hole transport layer. The compound 1 (host) prepared previously, the compound 2-3 (host) prepared previously, and the compound GD below (phosphorescent dopant) were co-deposited at a weight ratio of 47:47:6 on the hole transport layer to form a light emitting layer having a thickness of 350 Å. The compound ET-3 below were vacuum-deposited in a thickness of 50 Å on the light emitting layer to form a hole blocking layer, and the compound ET-4 below and LiQ (Lithium Quinolate) were vacuum-deposited at a weight ratio of 1:1 on the hole blocking layer to form an electron transport layer having a thickness of 250 Å. Lithium fluoride (LiF) in a thickness of 10 Å and aluminum in a thickness of 1000 Å were sequentially deposited on the electron transport layer to form a cathode.

HAT

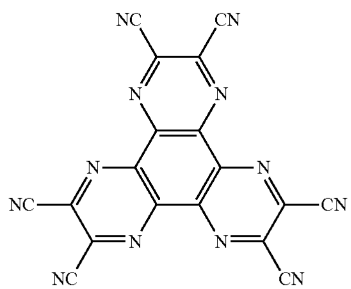

HT-1

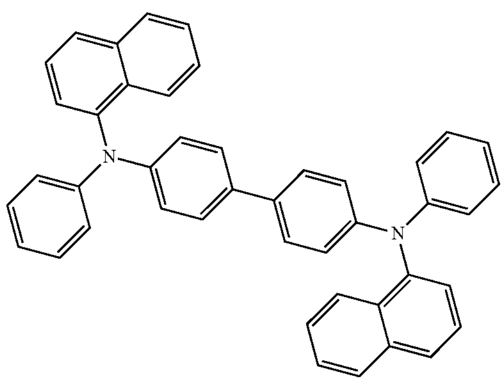

HT-3

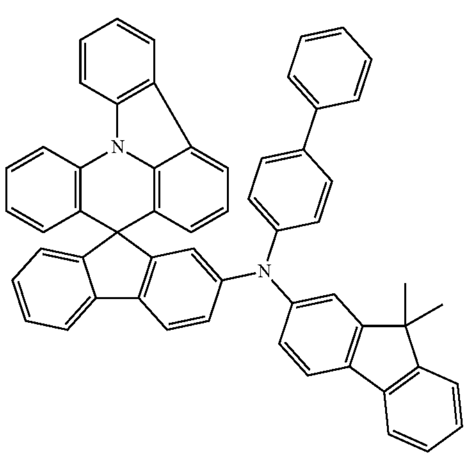

-continued

ET-3

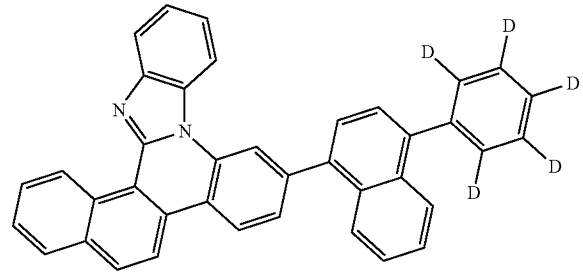

ET-4

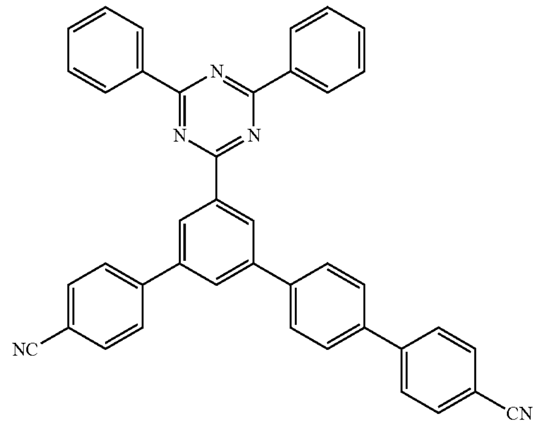

LiQ

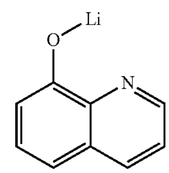

GD

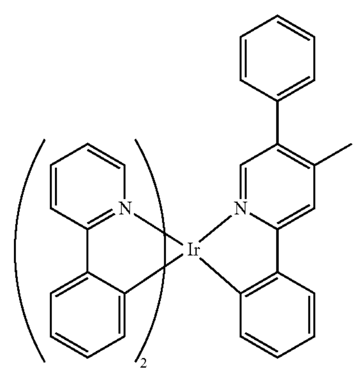

In the above-mentioned process, the vapor deposition rate of the organic material was maintained at 0.4 to 0.7 Å/sec, the deposition rate of lithium fluoride of the cathode was maintained at 0.3 Å/sec, the deposition rate of aluminum was maintained at 2 Å/sec, and the degree of vacuum during the deposition was maintained at $1\times10^{-7}$ to $5\times10^{-8}$ torr.

Experimental Examples 16 to 33

The organic light emitting devices were manufactured in the same manner as in Experimental Example 15, except that the compounds shown in Table 4 below were used as a host compound when forming the light emitting layer. In this case, when a mixture of two kinds of compounds was used as a host, the parenthesis means the weight ratio between the host compounds.

Comparative Experimental Examples 14 to 30

The organic light emitting devices was manufactured in the same manner as in Experimental Example 15, except that the compounds shown in Table 4 below were used as a host compound when forming the light emitting layer. In this case, when a mixture of two kinds of compounds was used as a host, the parenthesis means the weight ratio between the host compounds. In Table 4 below, Compounds C1, C2 and C3 are the same as those used in the previous Table 3, respectively.

The voltage, efficiency and lifetime were measured by applying a current to the organic light emitting devices manufactured in Experimental Examples 15 to 33 and Comparative Experimental Examples 14 to 30, and the results are shown in Table 4 below. T95 means the time required for the luminance to be reduced to 95% of the initial luminance.

TABLE 4

| | Host material | Voltage (V)(@10 mA/cm$^2$) | Efficiency (cd/A)(@ 10 mA/cm$^2$) | Color coordinate (x, y) | Lifetime (h) (T95 at 50 mA/cm$^2$) |
|---|---|---|---|---|---|
| Experimental Example 15 | Compound 2-3:Compound 1 (50:50) | 3.8 | 65 | 0.32, 0.62 | 115 |
| Experimental Example 16 | Compound 2-3:Compound 2 (60:40) | 4.1 | 61 | 0.34, 0.61 | 96 |
| Experimental Example 17 | Compound 2-3:Compound 3 (70:30) | 4.3 | 62 | 0.34, 0.61 | 133 |
| Experimental Example 18 | Compound 2-3:Compound 4 (60:40) | 4.0 | 72 | 0.32, 0.61 | 130 |
| Experimental Example 19 | Compound 2-4:Compound 6 (70:30) | 4.3 | 74 | 0.33, 0.62 | 150 |
| Experimental Example 20 | Compound 2-3:Compound 9 (60:40) | 4.0 | 68 | 0.32, 0.62 | 109 |
| Experimental Example 21 | Compound 2-4:Compound 12 (70:30) | 4.0 | 75 | 0.32, 0.61 | 140 |
| Experimental Example 22 | Compound 2-3:Compound 15 (60:40) | 3.6 | 75 | 0.33, 0.63 | 140 |
| Experimental Example 23 | Compound 2-4:Compound 17 (60:40) | 3.9 | 77 | 0.32, 0.62 | 185 |
| Experimental Example 24 | Compound 2-5:Compound 19 (70:30) | 4.1 | 73 | 0.33, 0.62 | 160 |
| Experimental Example 25 | Compound 2-3:Compound 21 (60:40) | 4.2 | 75 | 0.33, 0.61 | 135 |
| Experimental Example 26 | Compound 2-5:Compound 24 (70:30) | 4.0 | 75 | 0.32, 0.62 | 170 |
| Experimental Example 27 | Compound 2-3:Compound 26 (70:30) | 3.9 | 73 | 0.32, 0.62 | 165 |
| Experimental Example 28 | Compound 2-3:Compound 27 (60:40) | 3.8 | 70 | 0.33, 0.62 | 175 |
| Experimental Example 29 | Compound 2-4:Compound 30 (60:40) | 4.0 | 70 | 0.33, 0.61 | 155 |
| Experimental Example 30 | Compound 2-4:Compound 36 (70:30) | 3.8 | 74 | 0.33, 0.62 | 160 |
| Experimental Example 31 | Compound 2-5:Compound 37 (60:40) | 4.2 | 68 | 0.32, 0.62 | 150 |
| Experimental Example 32 | Compound 2-4:Compound 39 (70:30) | 4.3 | 70 | 0.33, 0.61 | 145 |
| Experimental Example 33 | Compound 2-4:Compound 43 (70:30) | 4.2 | 65 | 0.33, 0.62 | 155 |
| Comparative Experimental Example 14 | Compound 2-3:C1 (50:50) | 4.2 | 55 | 0.35, 0.61 | 55 |
| Comparative Experimental Example 15 | Compound 2-3:C2 (50:50) | 4.9 | 56 | 0.35, 0.63 | 55 |
| Comparative Experimental Example 16 | Compound 2-3:C3 (60:40) | 5.0 | 60 | 0.34, 0.61 | 40 |
| Comparative Experimental Example 17 | Compound 1 | 3.5 | 50 | 0.35, 0.61 | 50 |
| Comparative Experimental Example 18 | Compound 2 | 3.6 | 56 | 0.34, 0.61 | 30 |
| Comparative Experimental Example 19 | Compound 3 | 3.9 | 53 | 0.36, 0.61 | 45 |
| Comparative Experimental Example 20 | Compound 4 | 3.5 | 60 | 0.35, 0.62 | 57 |

TABLE 4-continued

| | Host material | Voltage (V)(@10 mA/cm²) | Efficiency (cd/A)(@ 10 mA/cm²) | Color coordinate (x, y) | Lifetime (h) (T95 at 50 mA/cm²) |
|---|---|---|---|---|---|
| Comparative Experimental Example 21 | Compound 9 | 3.9 | 60 | 0.35, 0.63 | 50 |
| Comparative Experimental Example 22 | Compound 12 | 3.8 | 65 | 0.33, 0.62 | 55 |
| Comparative Experimental Example 23 | Compound 15 | 3.9 | 60 | 0.35, 0.62 | 43 |
| Comparative Experimental Example 24 | Compound 17 | 3.7 | 63 | 0.35, 0.61 | 55 |
| Comparative Experimental Example 25 | Compound 21 | 3.9 | 65 | 0.36, 0.61 | 50 |
| Comparative Experimental Example 26 | Compound 27 | 3.3 | 66 | 0.35, 0.61 | 45 |
| Comparative Experimental Example 27 | Compound 30 | 3.6 | 67 | 0.35, 0.62 | 55 |
| Comparative Experimental Example 28 | Compound 37 | 3.9 | 60 | 0.35, 0.61 | 55 |
| Comparative Experimental Example 29 | Compound 39 | 3.6 | 55 | 0.34, 0.61 | 35 |
| Comparative Experimental Example 30 | Compound 43 | 3.8 | 61 | 0.35, 0.61 | 50 |

As shown in Table 4, it was confirmed that when the light emitting layer was manufactured by the combination of the compounds of the present invention, it exhibited excellent characteristics in terms of driving voltage and lifetime as compared with Comparative Experimental Examples, similar to the previous experiments.

| Description of Symbols | |
|---|---|
| 1: substrate | 2: anode |
| 3: light emitting layer | 4: cathode |
| 5: hole injection layer | 6: hole transport layer |
| 7: light emitting layer | 8: electron transport layer |
| 9: electron blocking layer | 10: electron injection layer |
| 11: hole blocking layer | |

The invention claimed is:

1. An organic light emitting device, comprising:

an anode;

a cathode that is disposed opposite to the anode; and one or more organic material layers that are disposed between the anode and the cathode, wherein the organic material layer includes a light emitting layer, and the light emitting layer includes a compound of the following Chemical Formula 1, and a compound of the following Chemical Formula 2:

<Chemical Formula 1>

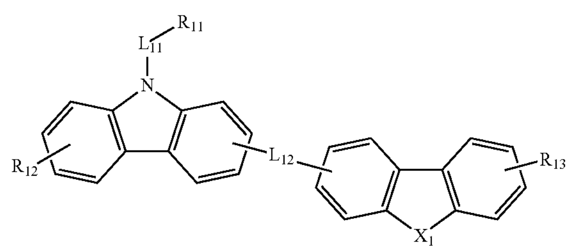

wherein in Chemical Formula 1:

$L_{11}$ is a single bond or a substituted or unsubstituted $C_{6-60}$ arylene;

$L_{12}$ is a single bond or a substituted or unsubstituted $C_{6-60}$ arylene;

$R_{11}$ is a substituted or unsubstituted $C_{3-60}$ cycloalkyl, a substituted or unsubstituted $C_{1-60}$ alkyl, a substituted or unsubstituted $C_{6-60}$ aryl, or a substituted or unsubstituted $C_{2-60}$ heteroaryl containing one or more heteroatoms selected from the group consisting of N, O and S;

$R_{12}$ and $R_{13}$ are each independently hydrogen, cyano, a substituted or unsubstituted $C_{1-60}$ alkyl, a substituted or unsubstituted $C_{6-60}$ aryl, or a substituted or unsubstituted $C_{2-60}$ heteroaryl containing one or more heteroatoms selected from the group consisting of N, O and S;

$X_1$ is O, S, $C(CH_3)_2$, N—$R_{14}$, or

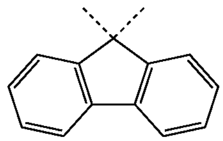
;

$R_{14}$ is a substituted or unsubstituted $C_{6-60}$ aryl;

<Chemical Formula 2>

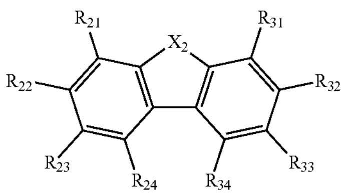

wherein in Chemical Formula 2:

one of $R_{21}$, $R_{22}$, $R_{23}$, and $R_{24}$ is $-L_{21}-Ar_1$, and the remaining are hydrogen;

one of $R_{31}$, $R_{32}$, $R_{33}$, and $R_{34}$ is $-L_{22}-Ar_2$, and the remaining are hydrogen;

with the proviso that the case where $R_{21}$ is $-L_{21}-Ar_1$ and $R_{31}$ is $-L_{22}-Ar_2$, or $R_{22}$ is $-L_{21}-Ar_1$ and $R_{32}$ is $-L_{22}-Ar_2$, or $R_{23}$ is $-L_{21}-Ar_1$ and $R_{33}$ is $-L_{22}-Ar_2$, or $R_{24}$ is $-L_{21}-Ar_1$ and $R_{34}$ is $-L_{22}-Ar_2$ is excluded;

$L_{21}$ is a single bond or a substituted or unsubstituted $C_{6-60}$ arylene;

$L_{22}$ is a single bond or a substituted or unsubstituted $C_{6-60}$ arylene;

$X_2$ is O;

$Ar_1$ is the following Chemical Formula 3:

<Chemical Formula 3>

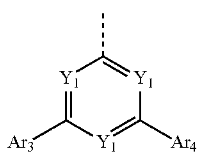

wherein in Chemical Formula 3:

each $Y_1$ is independently N, or CH, with the proviso that at least one of $Y_1$ is N;

$Ar_3$ and $Ar_4$ are each independently a substituted or unsubstituted $C_{6-60}$ aryl, or a substituted or unsubstituted $C_{2-60}$ heteroaryl containing one or more heteroatoms selected from the group consisting of N, O and S;

$Ar_2$ is selected from the group consisting of the following:

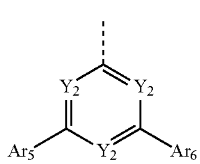

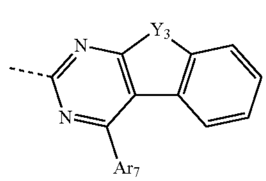

-continued

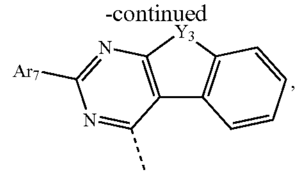
, wherein:

each $Y_2$ is independently N, or CH, with the proviso that at least one of $Y_2$ is N;

$Y_3$ is O, or S; and $Ar_5$, $Ar_6$ and $Ar_7$ are each independently a substituted or unsubstituted $C_{6-60}$ aryl, or a substituted or unsubstituted $C_{2-60}$ heteroaryl containing one or more heteroatoms selected from the group consisting of N, O and S.

2. The organic light emitting device according to claim 1, wherein $L_{11}$ is a single bond, or phenylene.

3. The organic light emitting device according to claim 1, wherein $L_{12}$ is a single bond, or phenylene.

4. The organic light emitting device according to claim 1, wherein $R_{11}$ is cyclohexyl, phenyl, phenyl substituted with tert-butyl, phenyl substituted with cyano, biphenylyl, terphenylyl, naphthyl, phenanthrenyl, triphenylenyl, dimethyfflurorenyl, pyridinyl, dibenzofuranyl, dibenzothiophenyl, dibenzothiophenyl substituted with phenyl, or 9-phenylcarbazolyl.

5. The organic light emitting device according to claim 1, wherein $R_{12}$ and $R_{13}$ are each independently hydrogen, cyano, Cert-butyl, phenyl, phenyl substituted with cyano, pyridinyl, or 9-phenylcarbazolyl.

6. The organic light emitting device according to claim 1, wherein $R_{14}$ is phenyl, or biphenylyl.

7. The organic light emitting device according to claim 1, wherein the compound of Chemical Formula 1 is any one compound selected from the group consisting of the following:

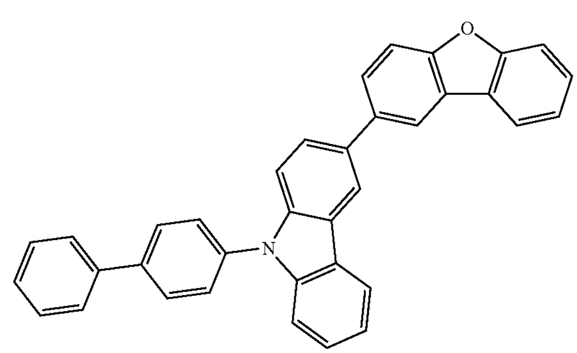

-continued
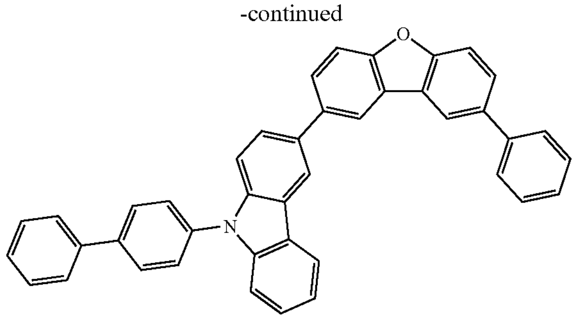
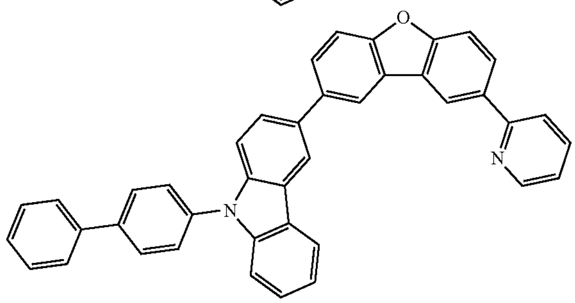
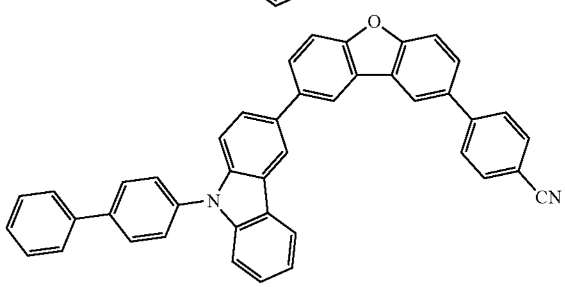
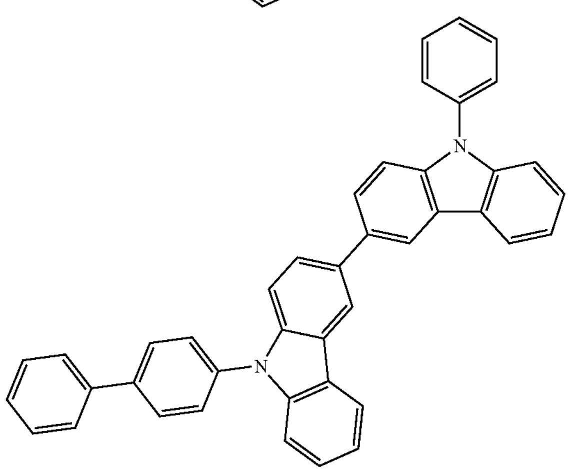
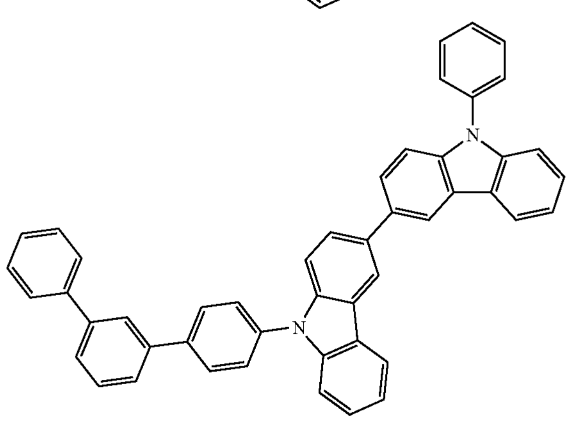
-continued
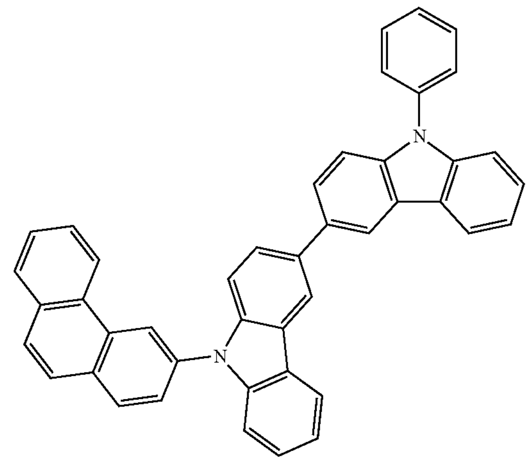
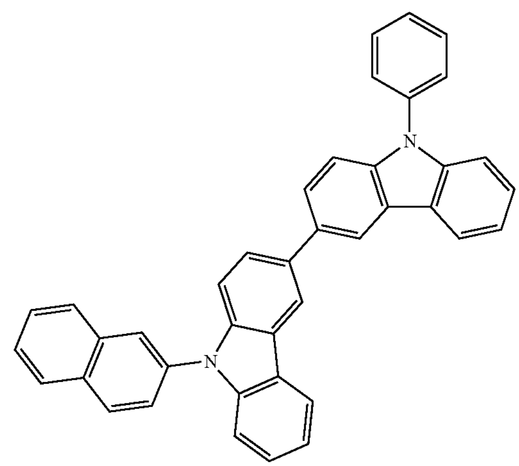
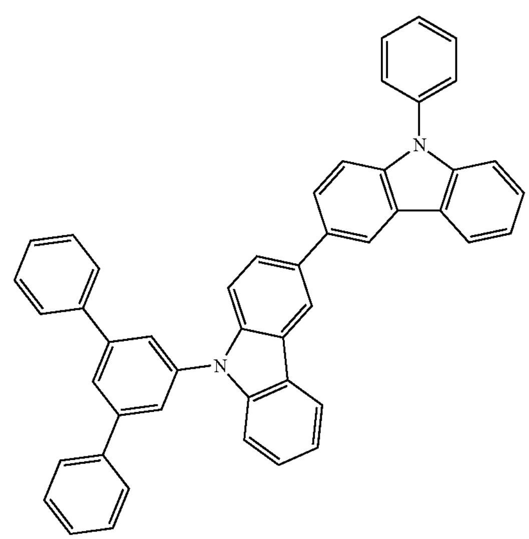

-continued
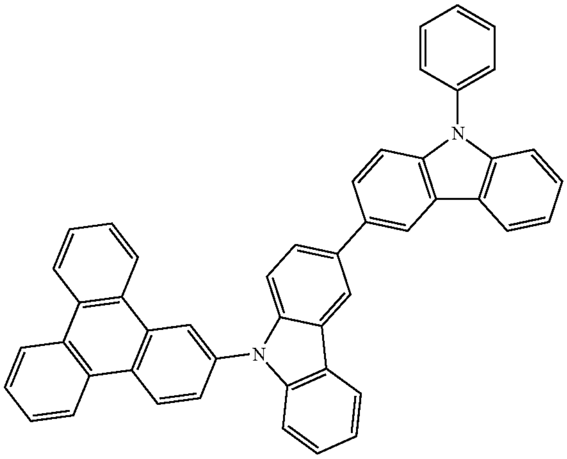
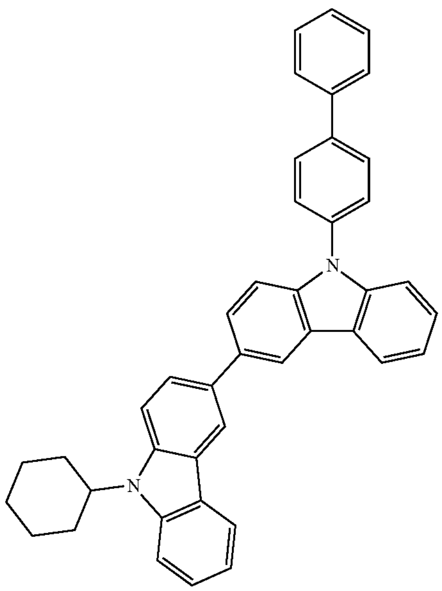
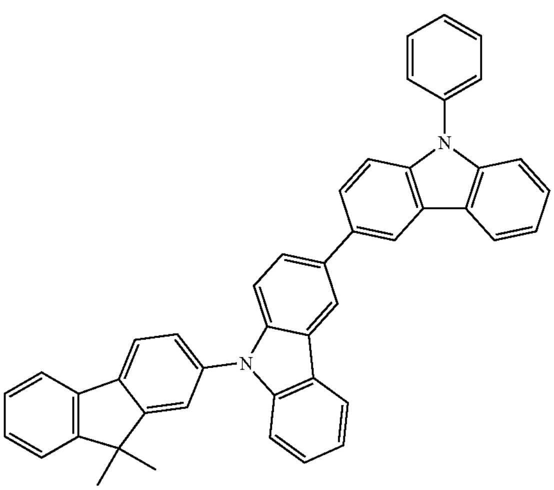
-continued
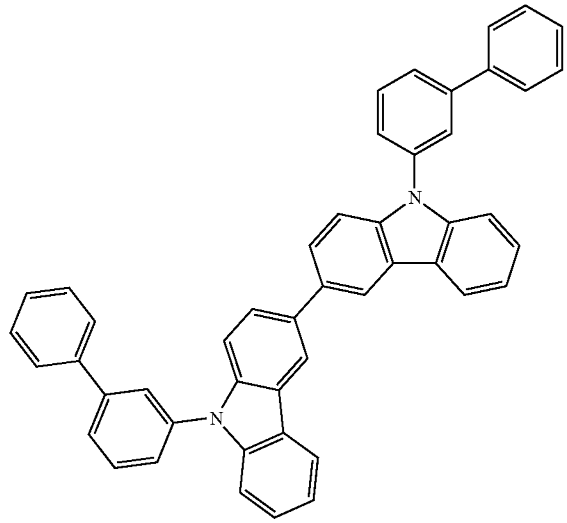
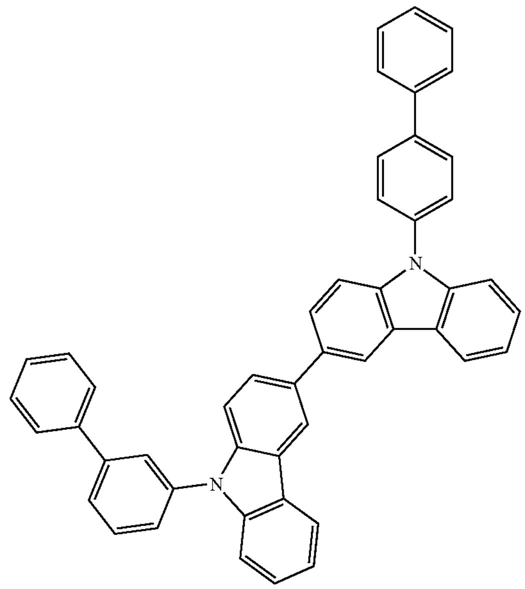
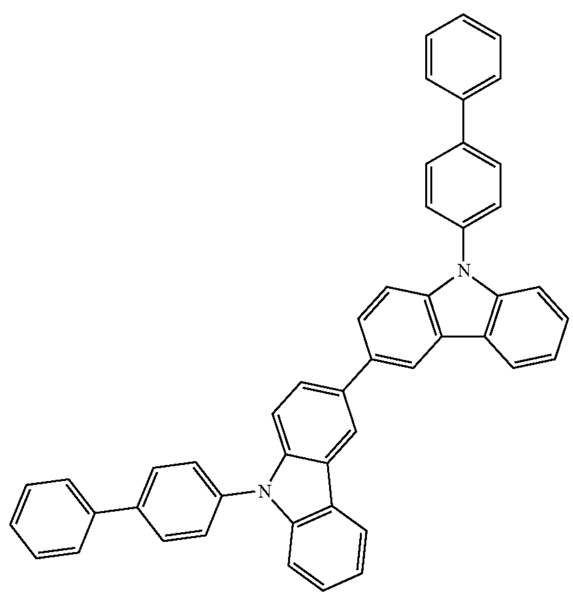

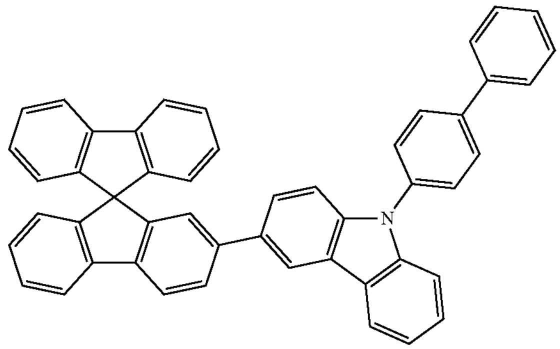
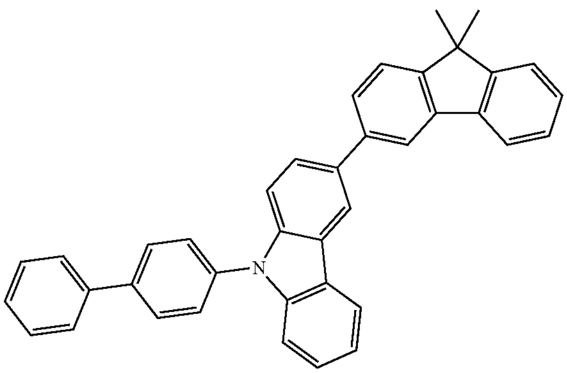
N
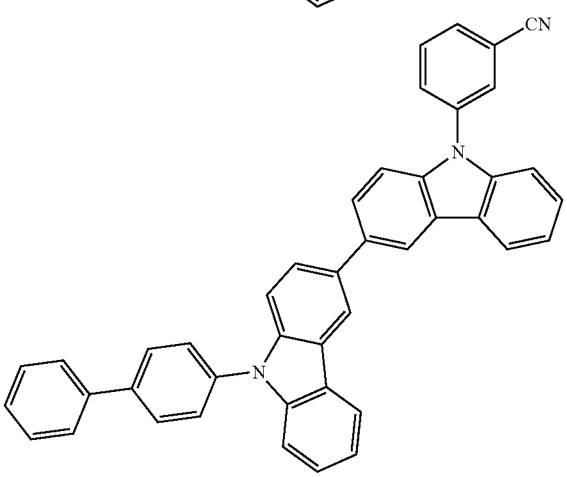
CN
N
N
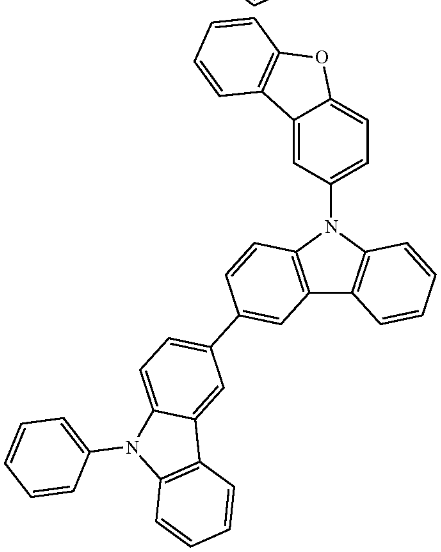
O
N
N
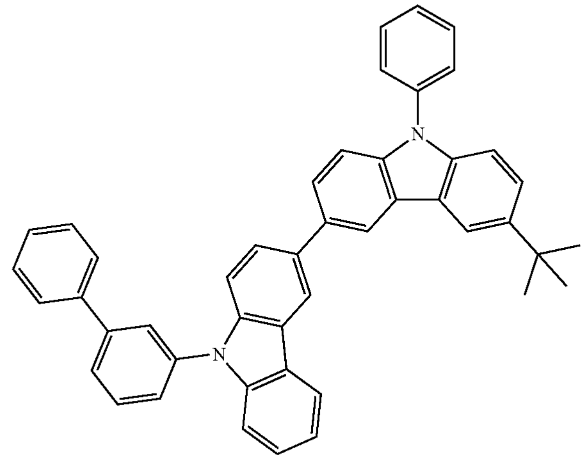
N
N
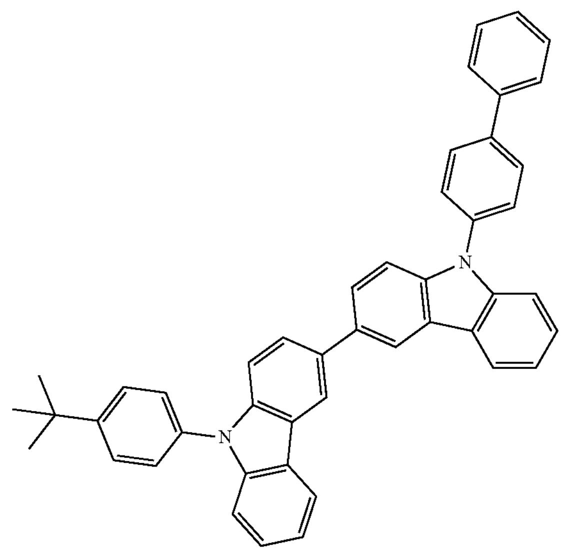
N
N
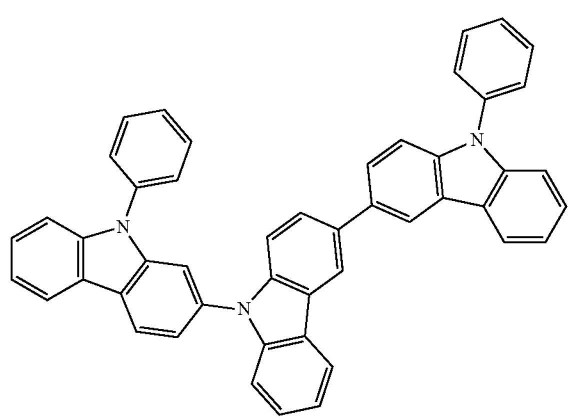
N
N
N

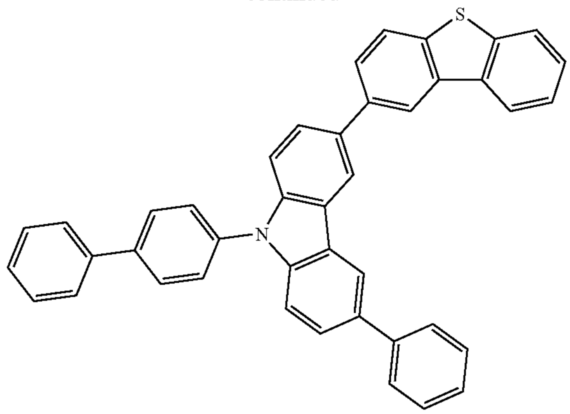
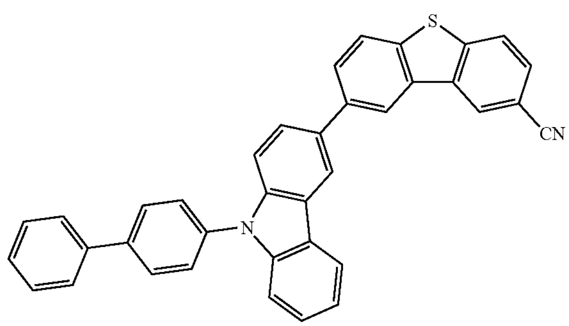
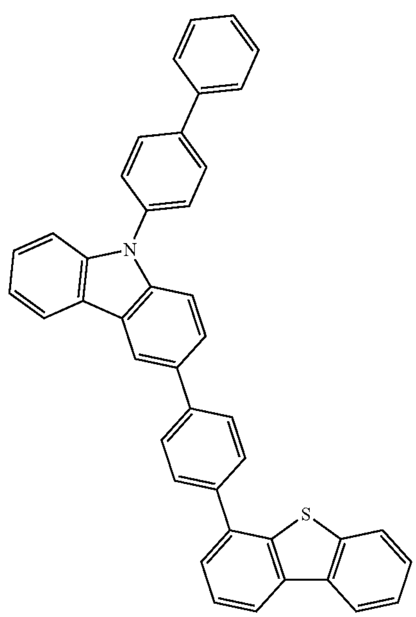
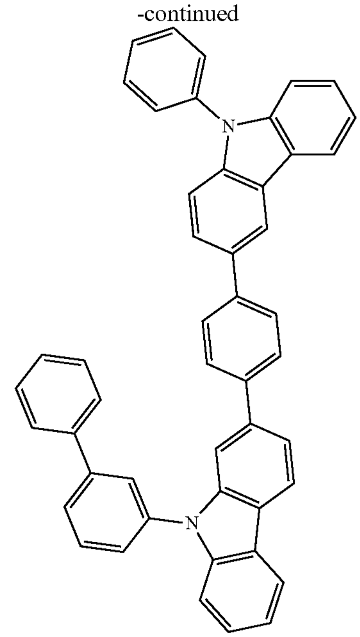
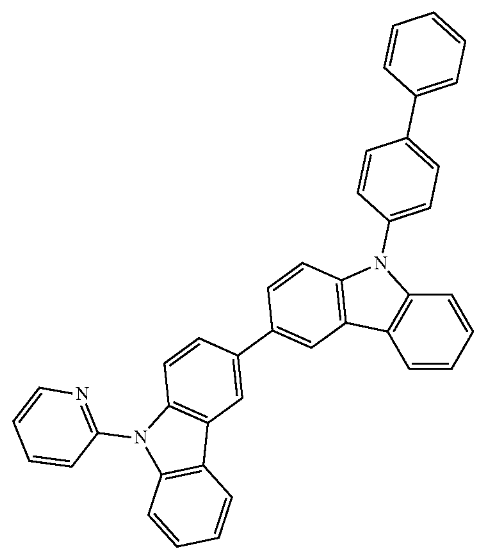
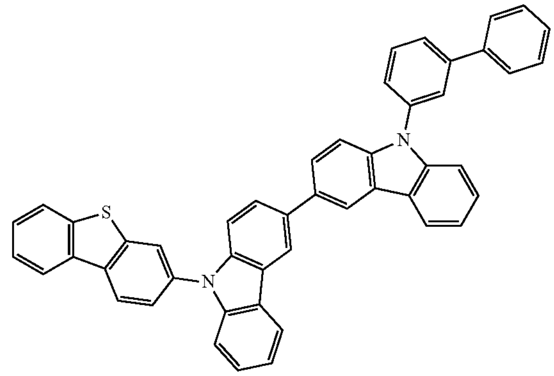

-continued
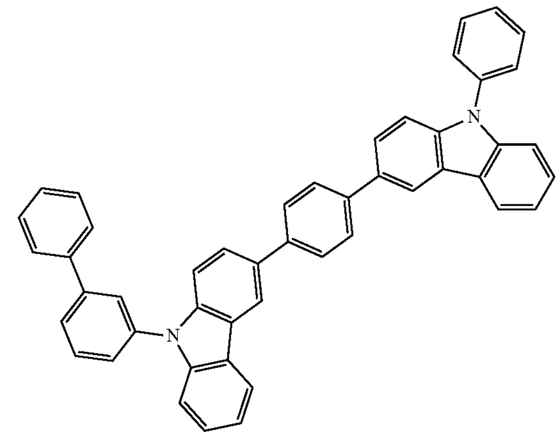
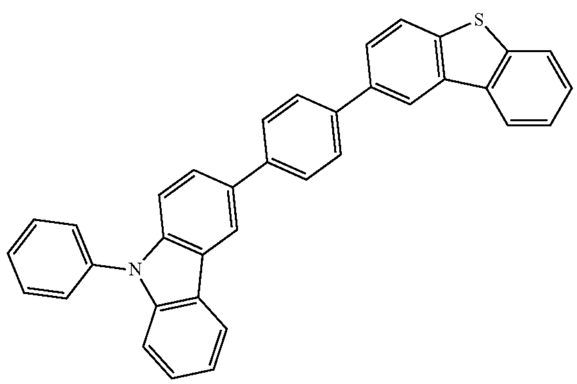
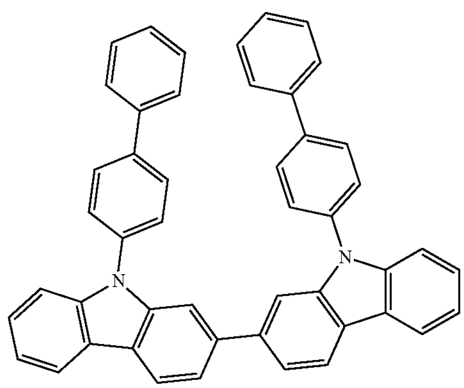
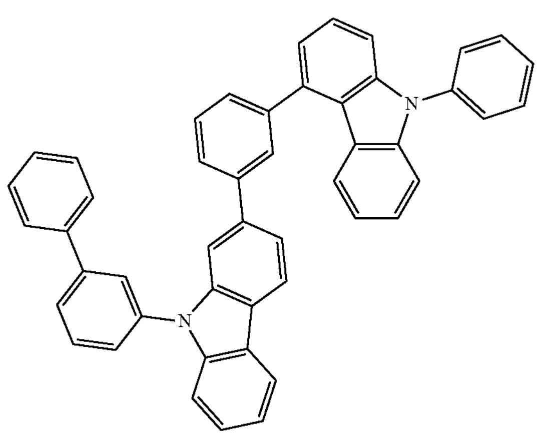
-continued
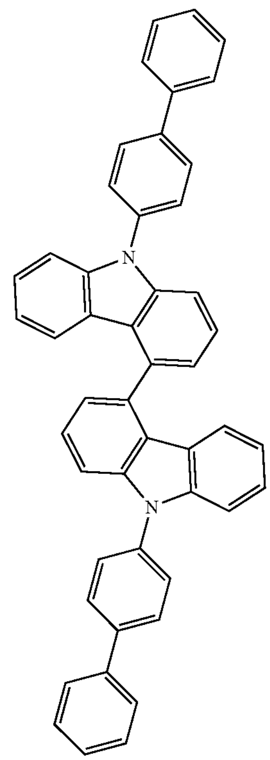
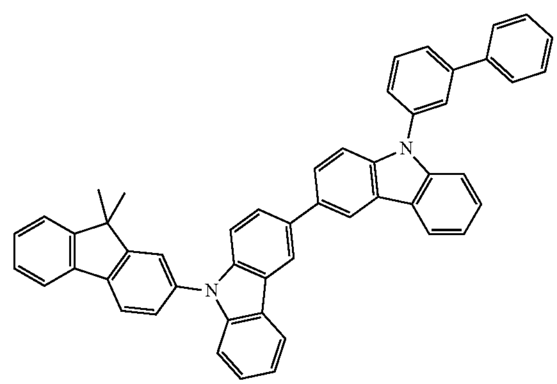
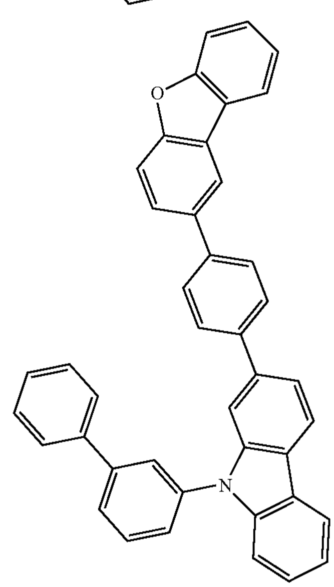

-continued
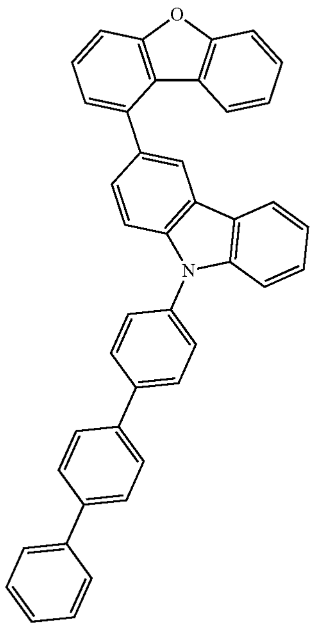
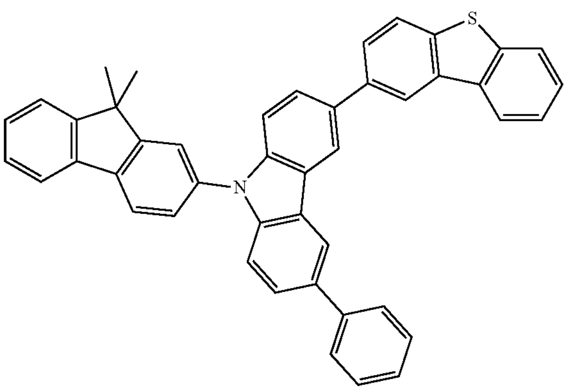
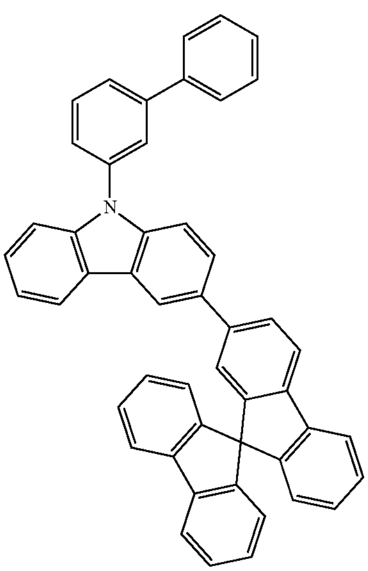
-continued
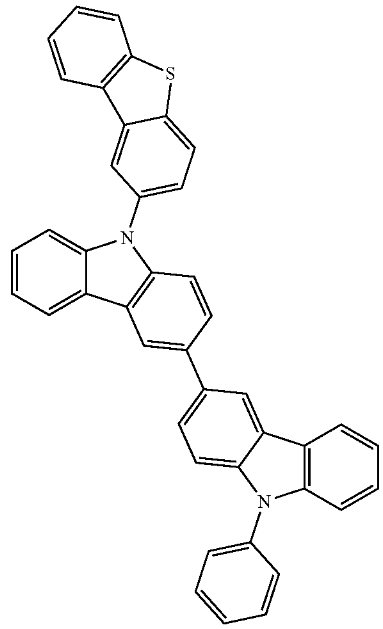
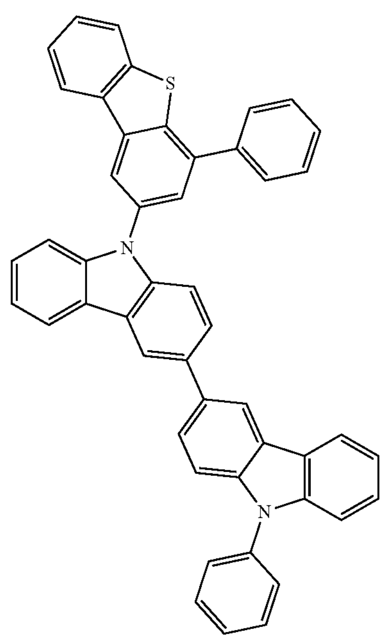

-continued
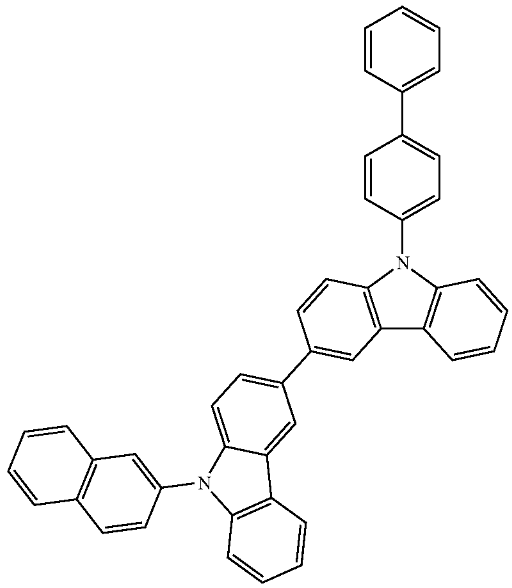
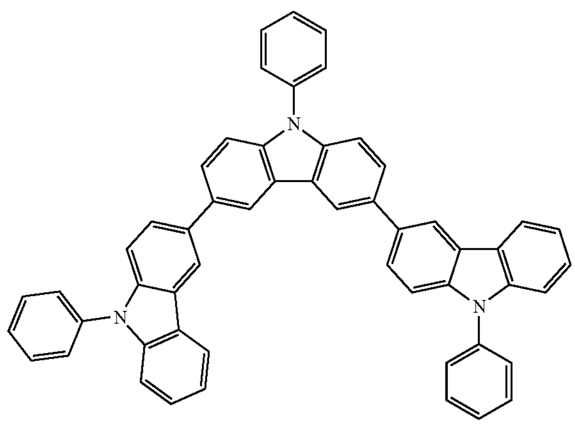
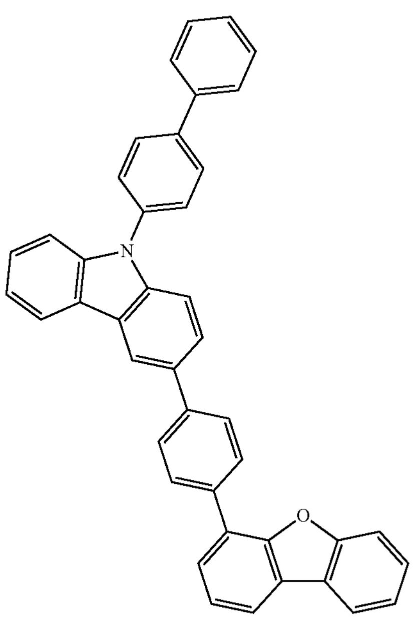
-continued
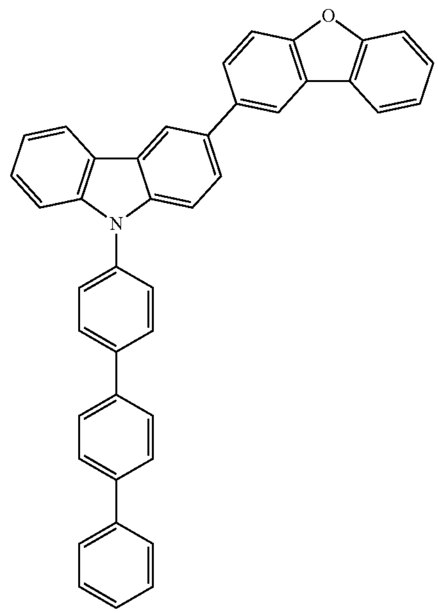
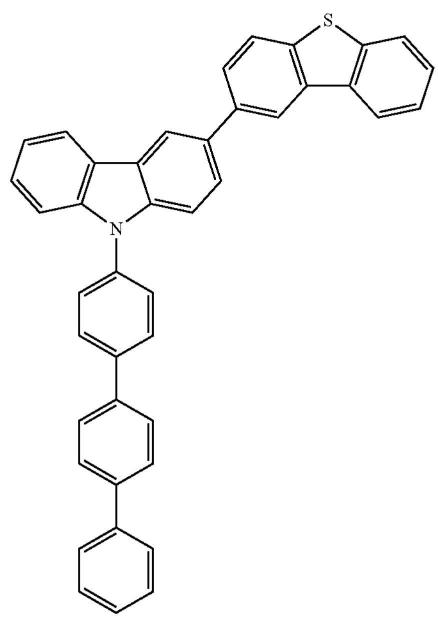
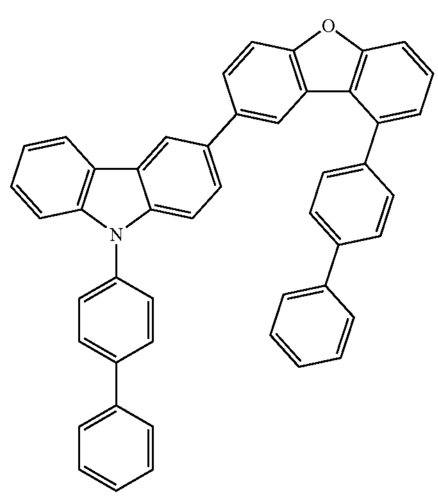

-continued

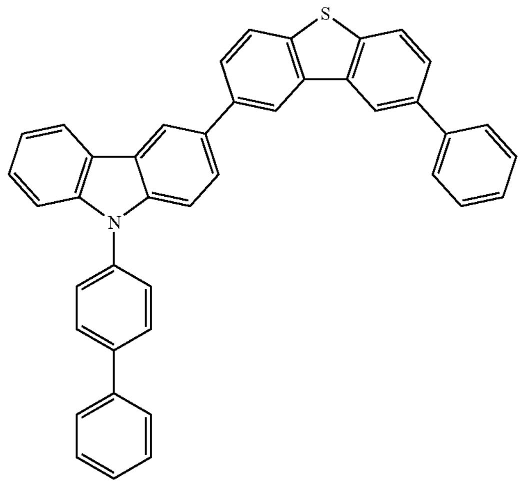

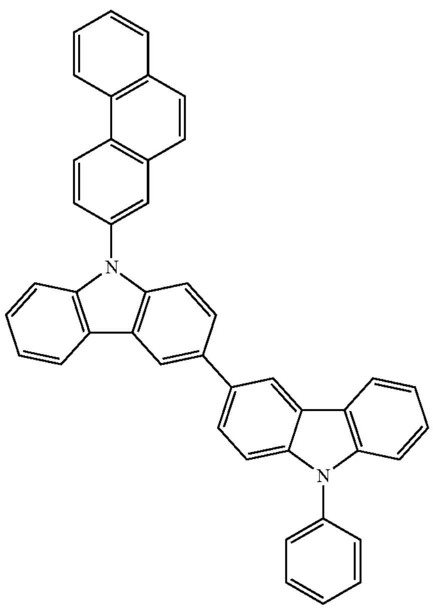

8. The organic light emitting device according to claim 1, wherein the compound of Chemical Formula 2 is any one compound selected from the group consisting of the following:

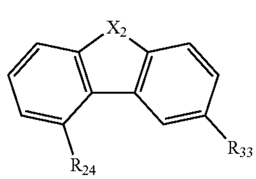

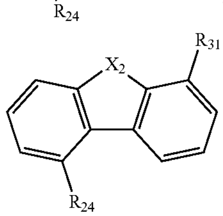

-continued

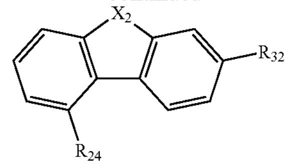

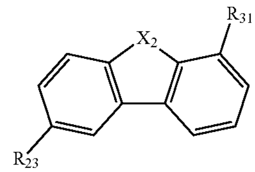

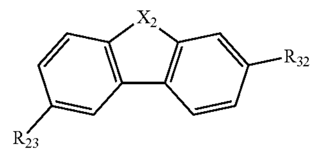

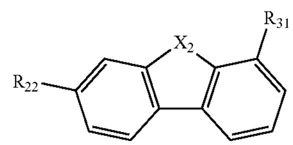

9. The organic light emitting device according to claim 1, wherein $L_{21}$ is a single bond, or phenylene.

10. The organic light emitting device according to claim 1, wherein $L_{22}$ is a single bond, or phenylene.

11. The organic light emitting device according to claim 1, wherein $Ar_3$ and $Ar_4$ are each independently phenyl, biphenylyl, biphenylyl substituted with cyano, or dibenzofuranyl.

12. The organic light emitting device according to claim 1, wherein $Ar_5$ and $Ar_6$ are each independently phenyl, phenyl substituted with carbazolyl, biphenylyl, biphenylyl substituted with cyano, dimethylfluorenyl, dibenzofuranyl, dibenzothiophenyl, or 9-phenylcarbazolyl.

13. The organic light emitting device according to claim 1, wherein $Ar_7$ is phenyl, phenyl substituted with fluoro, phenyl substituted with trifluorornethyl, phenyl substituted with cyano, or biphenylyl.

14. An organic light emitting device, comprising:

an anode;

a cathode that is disposed opposite to the anode; and one or more organic material layers that are disposed between the anode and the cathode, wherein the organic material layer includes a light emitting layer, and the light emitting layer includes:

(a) a compound of Chemical Formula 1:

[Chemical Formula 1]

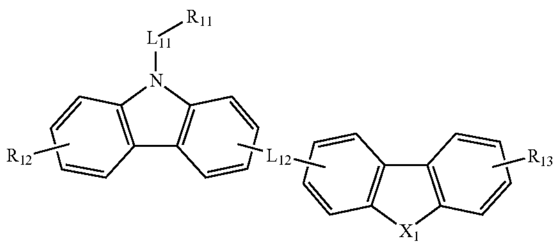

wherein in Chemical Formula 1, $L_{11}$ is a single bond or a substituted or unsubstituted $C_{6-60}$ arylene;

$L_{12}$ is a single bond or a substituted or unsubstituted $C_{6-60}$ arylene;

$R_{11}$ is a substituted or unsubstituted $C_{3-60}$ cycloalkyl, a substituted or unsubstituted $C_{1-60}$ alkyl, a substituted or unsubstituted $C_{6-60}$ aryl, or a substituted or unsubstituted $C_{2-60}$ heteroaryl containing one or more heteroatoms selected from the group consisting of N, O and S;

$R_{12}$ and $R_{13}$ are each independently hydrogen, cyano, a substituted or unsubstituted $C_{1-60}$ alkyl, a substituted or unsubstituted $C_{6-60}$ aryl, or a substituted or unsubstituted $C_{2-60}$ heteroaryl containing one or more heteroatoms selected from the group consisting of N, O and S;

$X_1$ is O, S, $C(CH_3)_2$, N—$R_{14}$, or

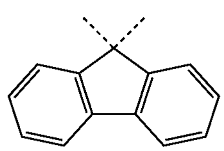

;

and $R_{14}$ is a substituted or unsubstituted $C_{6-60}$ aryl; and (b) any one compound selected from group consisting of the following:

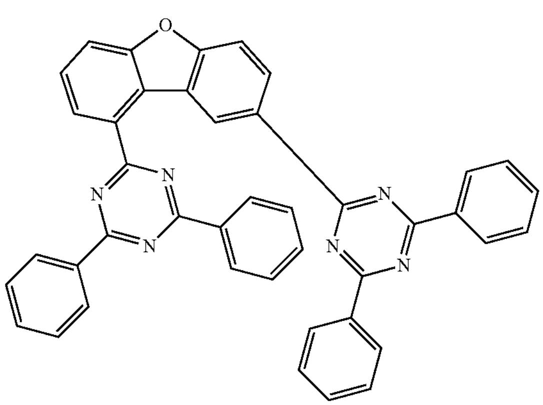

-continued

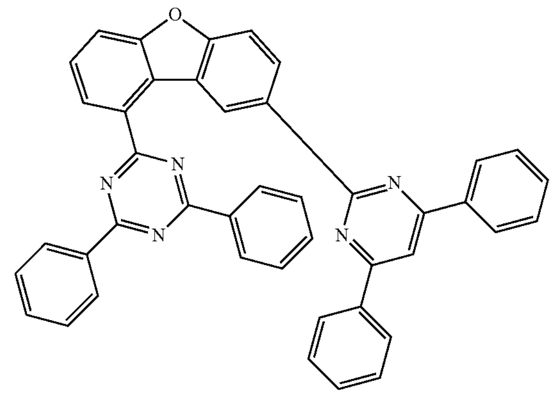

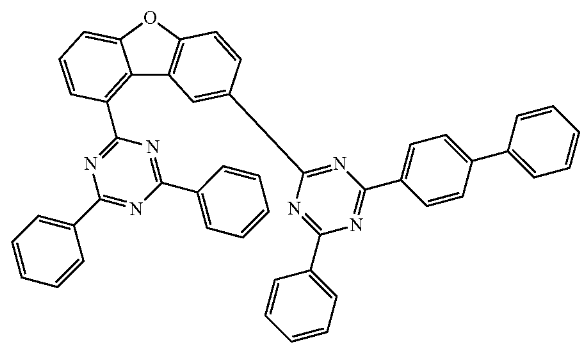

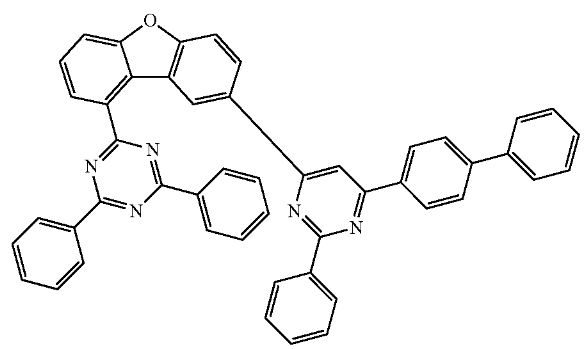

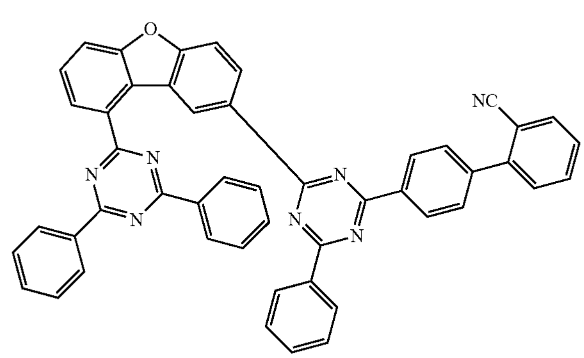

-continued
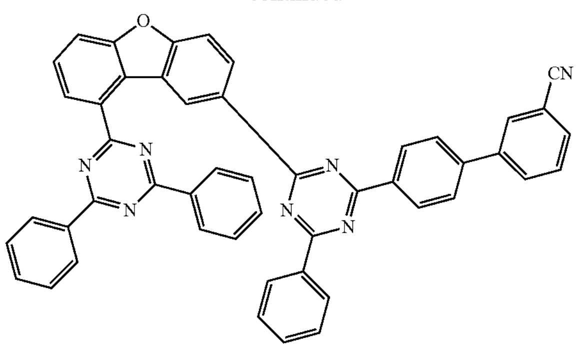
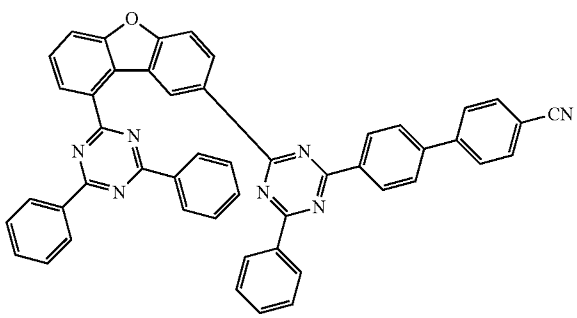
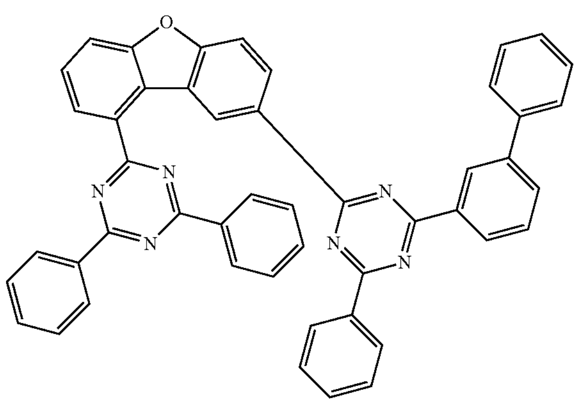
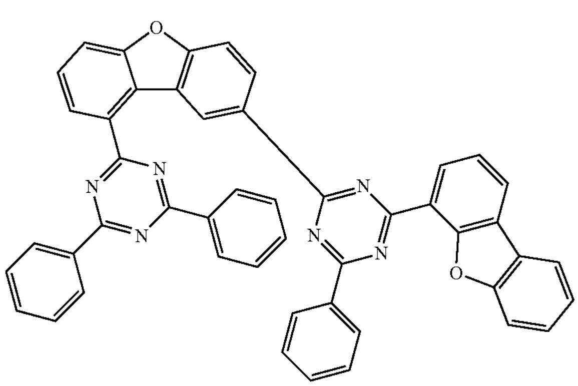
-continued
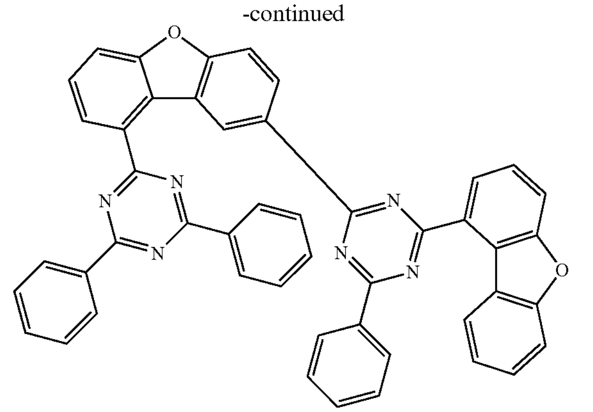
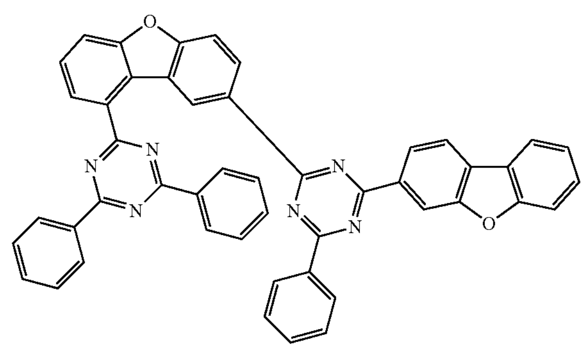
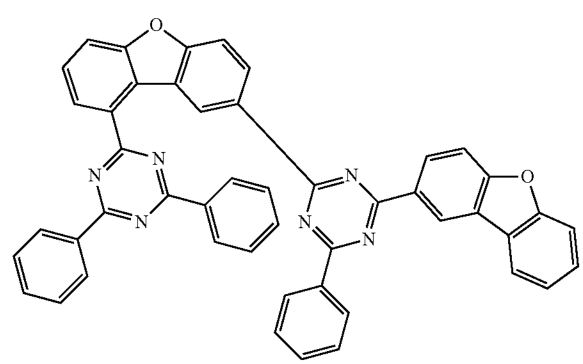
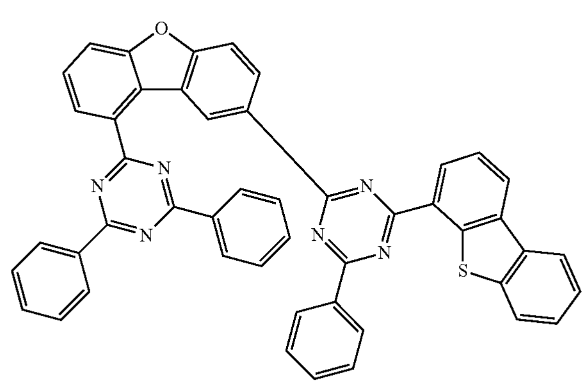

-continued
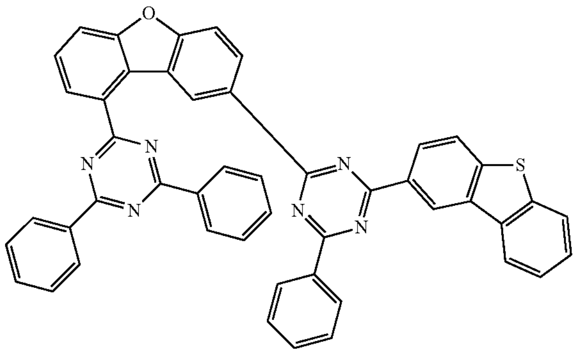
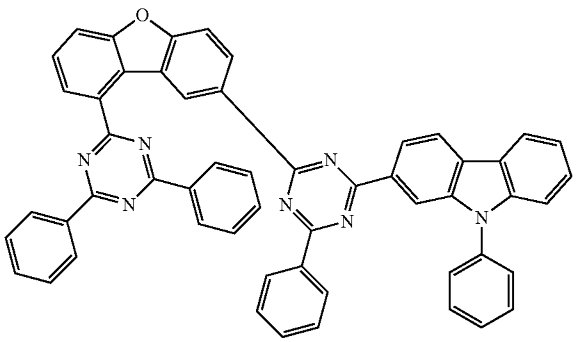
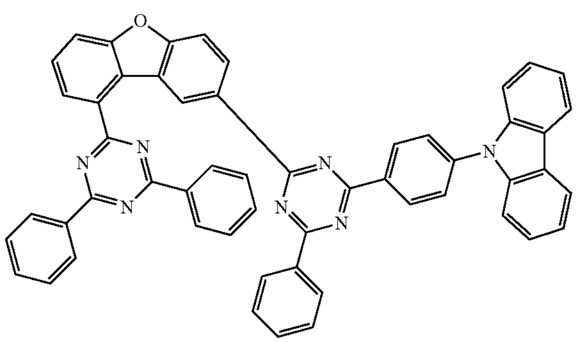
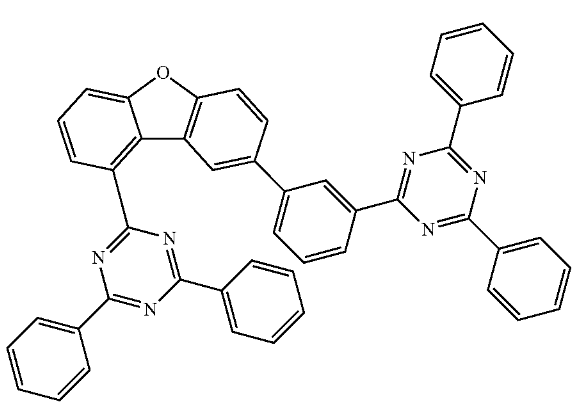
-continued
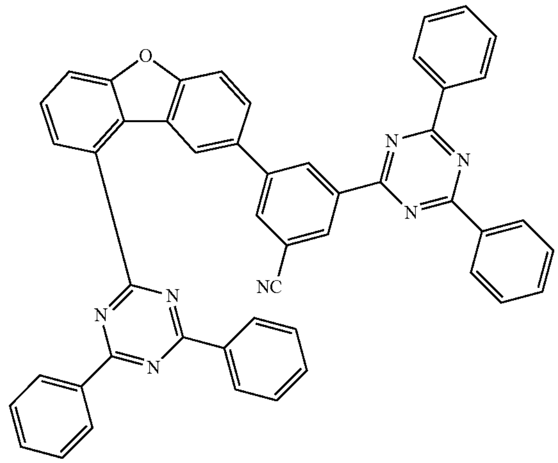
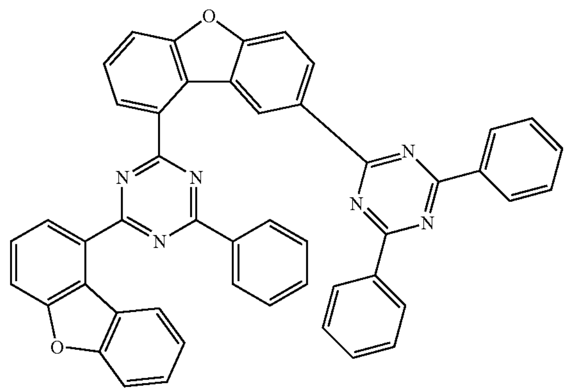
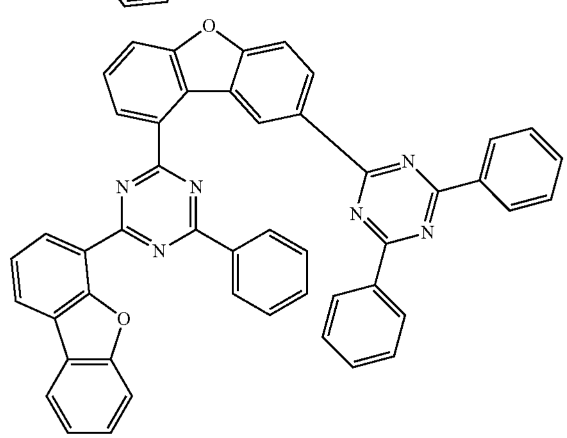
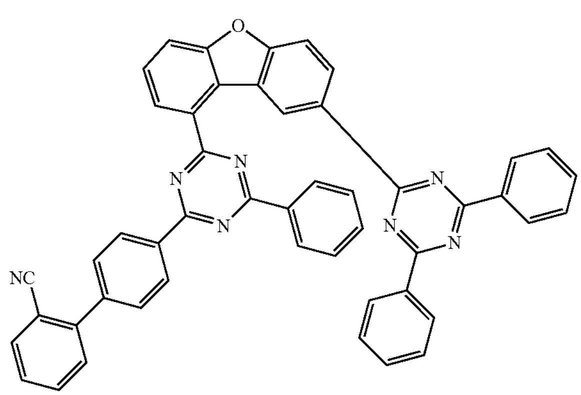

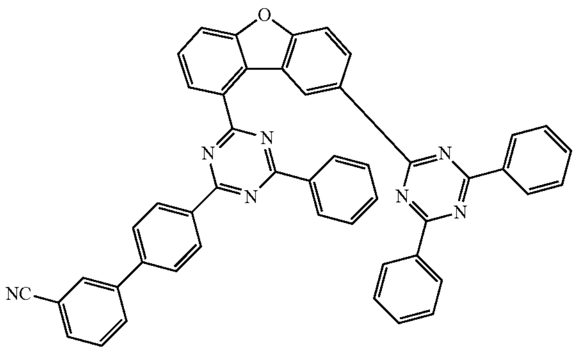
O
N
N
N
NC
N
N
N
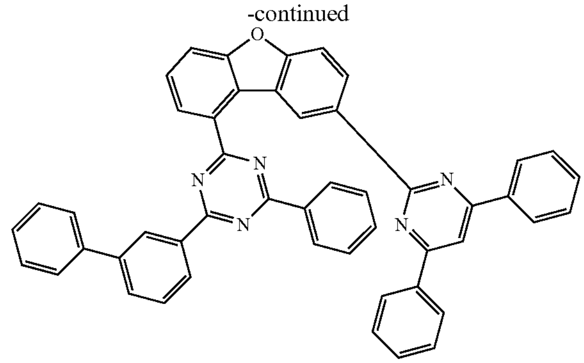
O
N
N
N
N
N
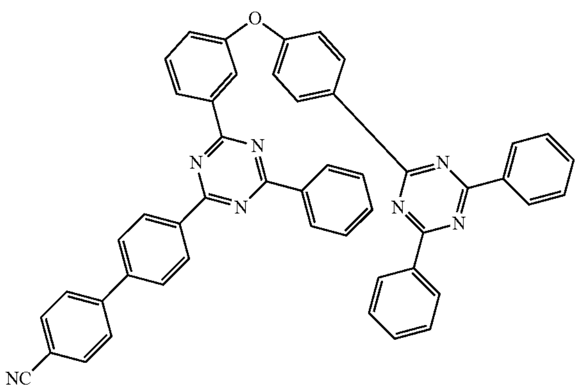
O
N
N
N
NC
N
N
N
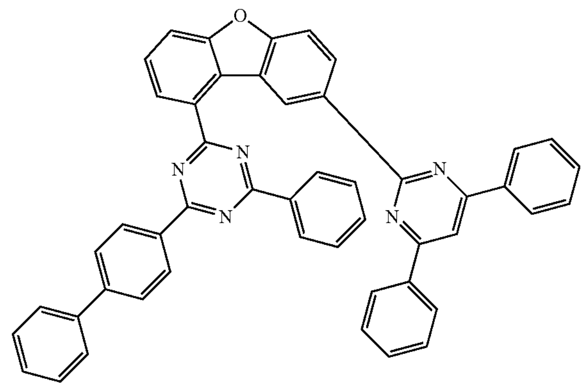
O
N
N
N
N
N
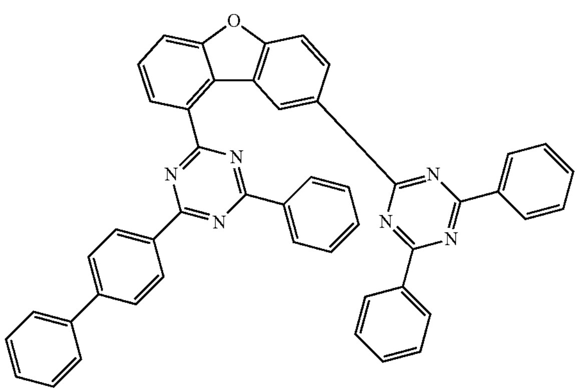
O
N
N
N
N
N
N
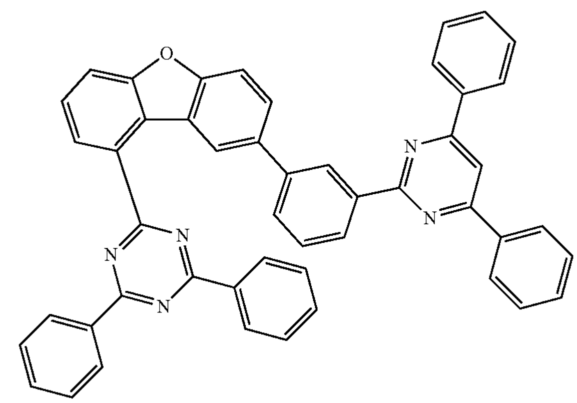
O
N
N
N
N
N
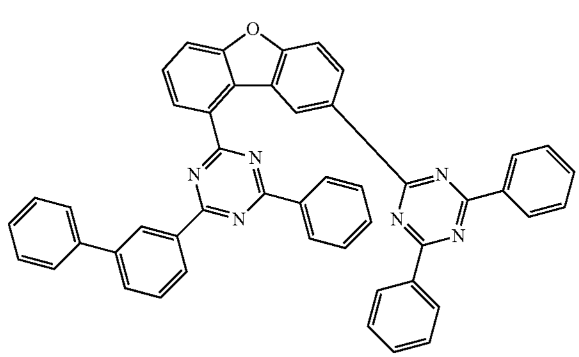
O
N
N
N
N
N
N
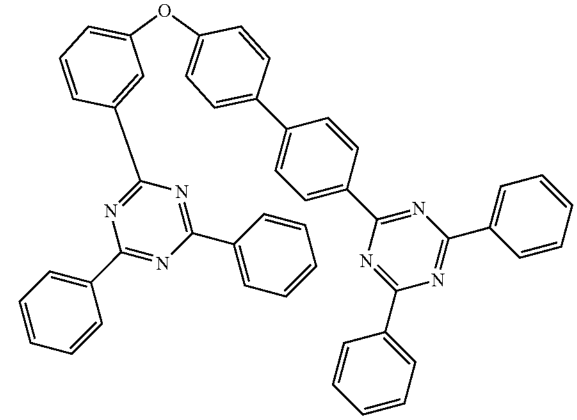
O
N
N
N
N
N
N -continued
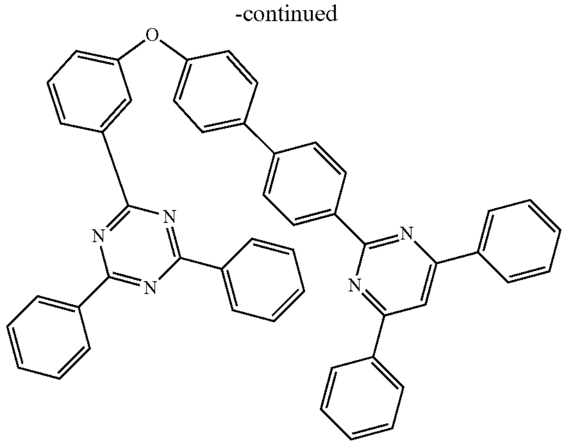
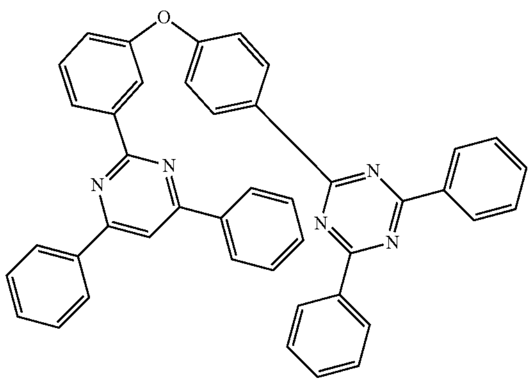
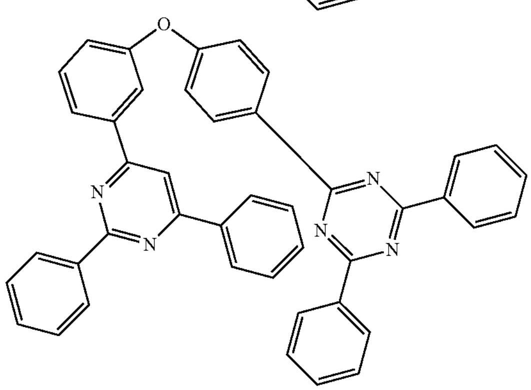
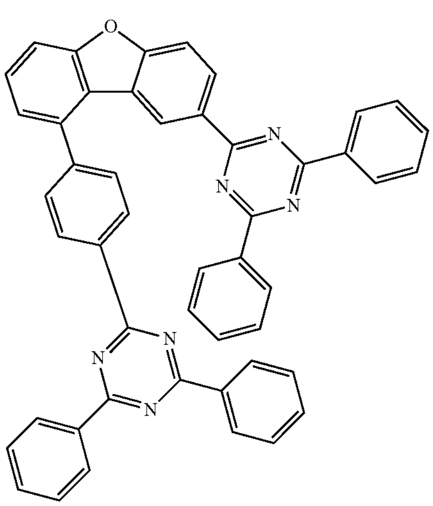
-continued
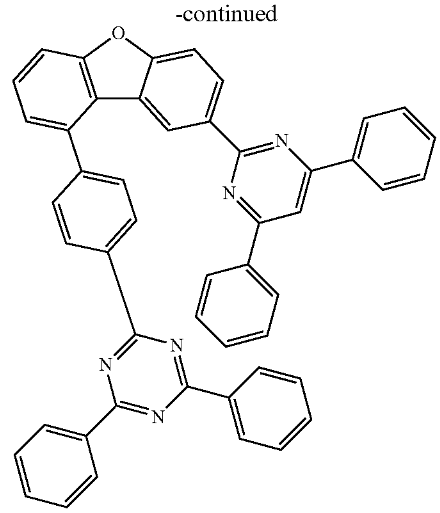
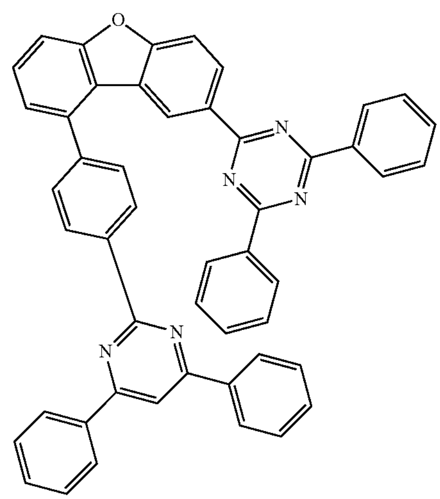
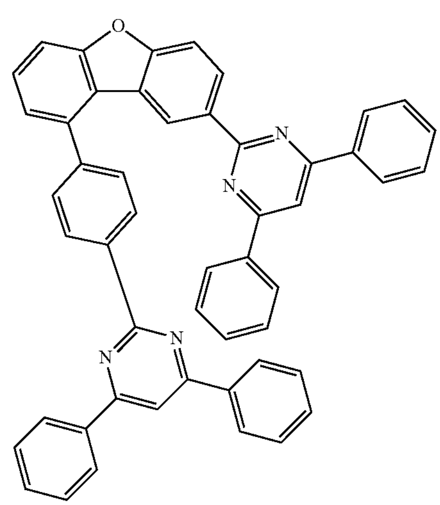 [SMILES: c1ccc(-c2cc(-c3ccccc3)nc(-c3ccc(-c4cccc5oc6ccc(-c7nc(-c8ccccc8)cc(-c8ccccc8)n7)cc6c45)cc3)n2)cc1]

-continued
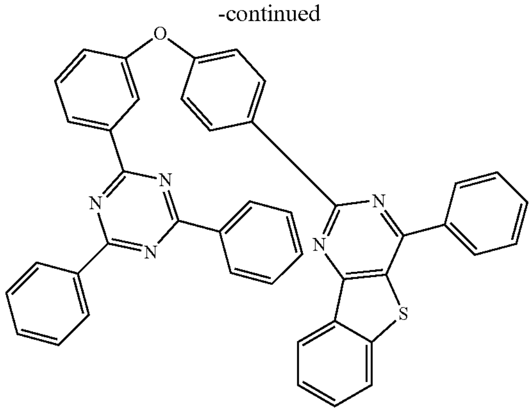
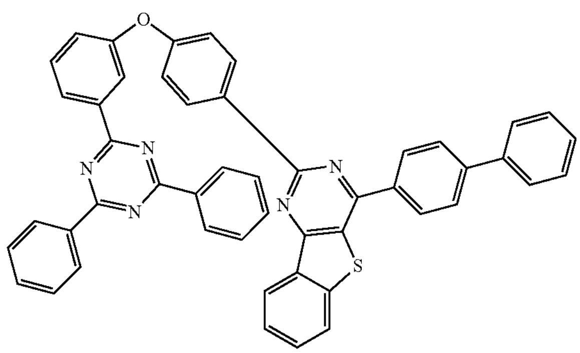
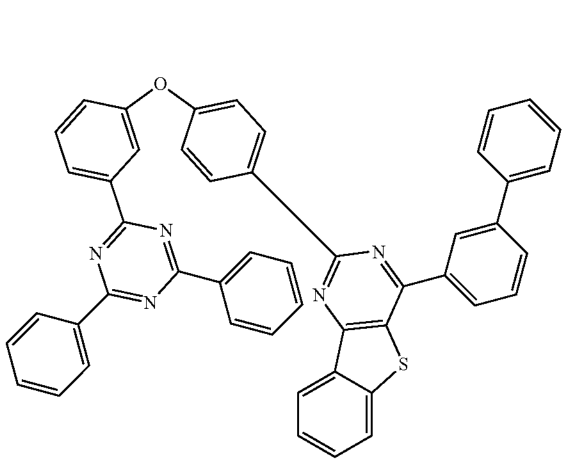
-continued
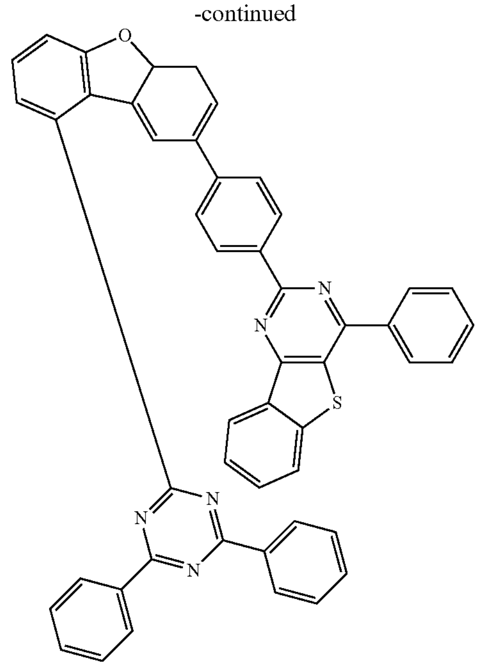
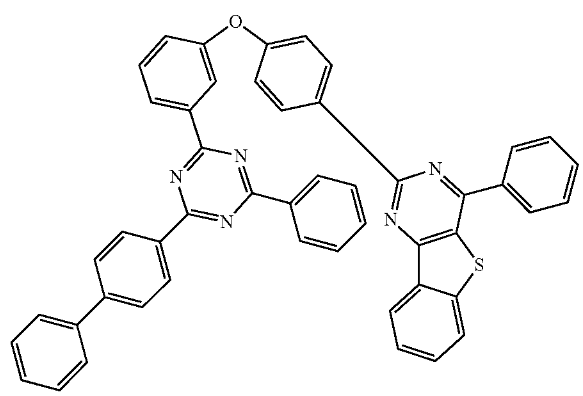
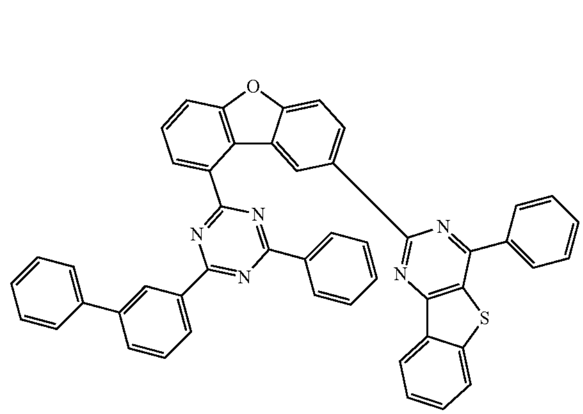

-continued
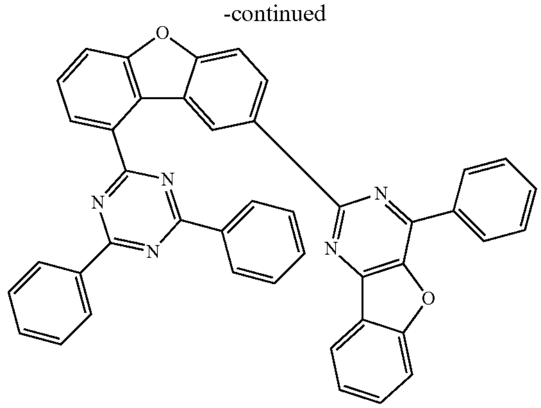
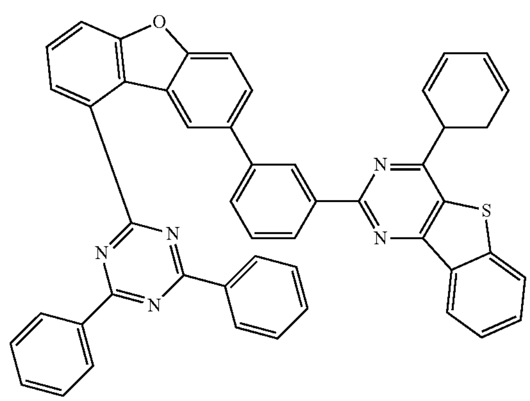
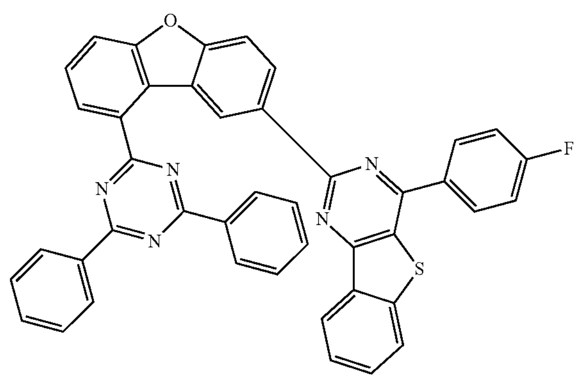
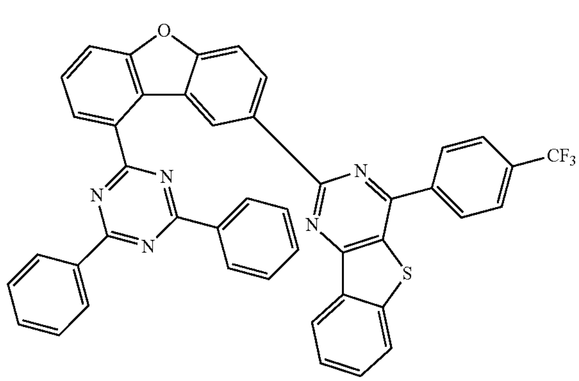
-continued
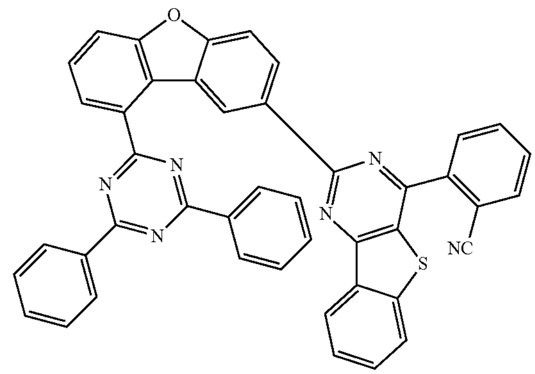
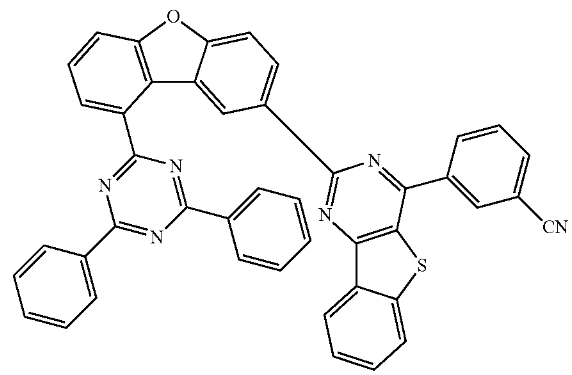
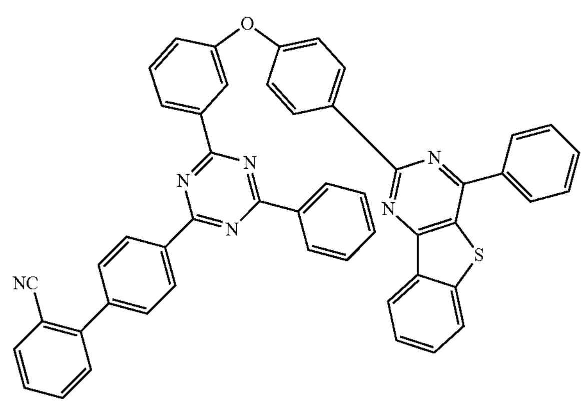
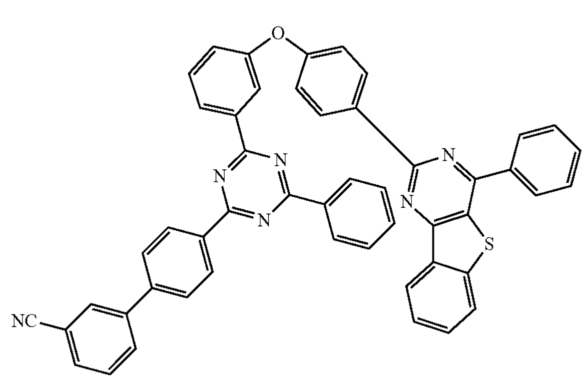

-continued
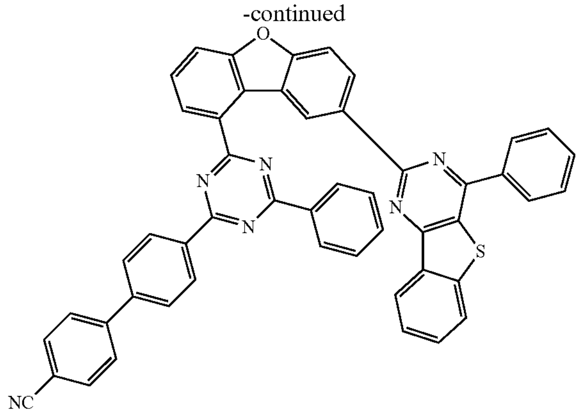
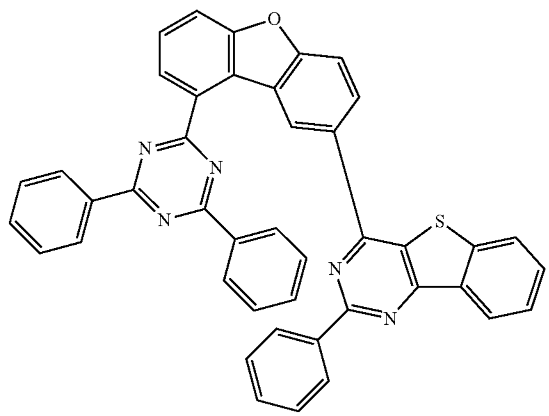
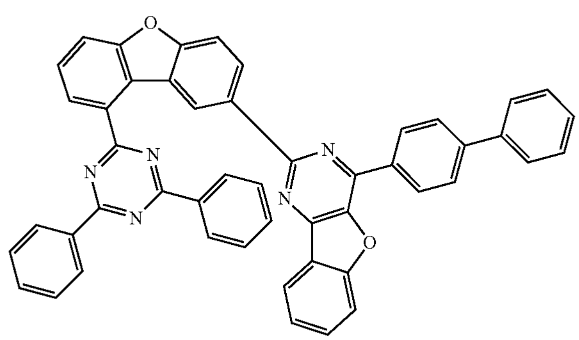
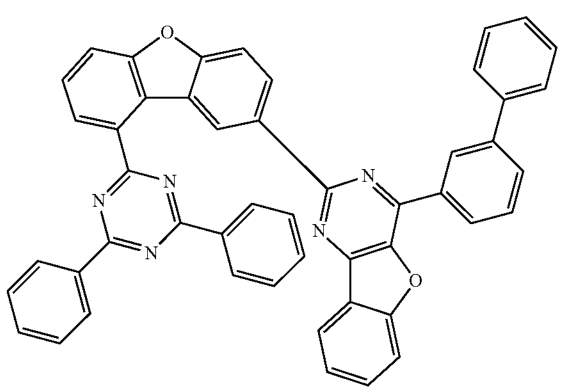
-continued
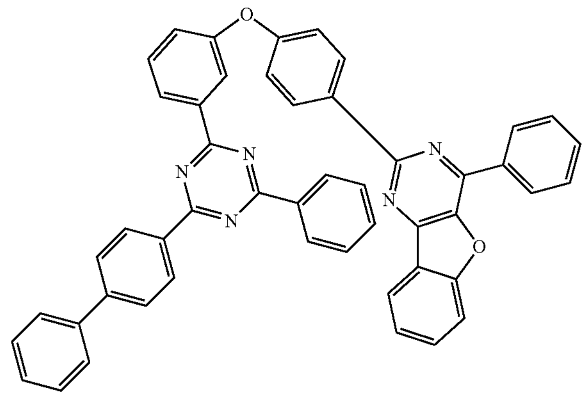
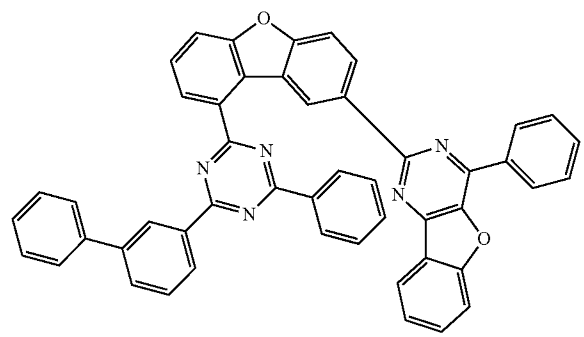
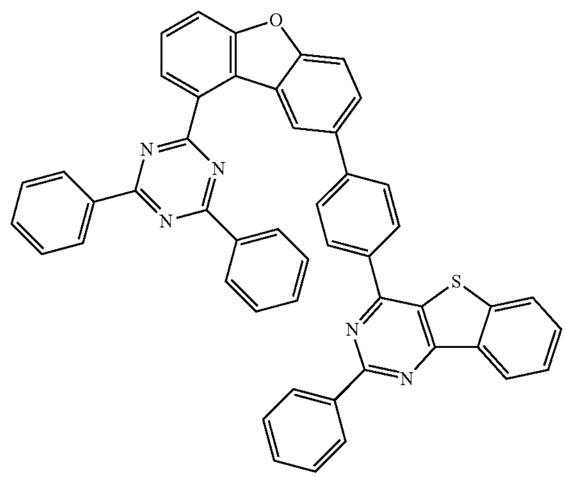
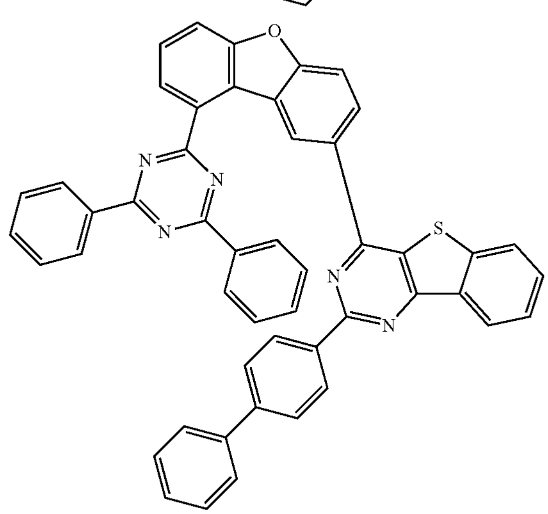

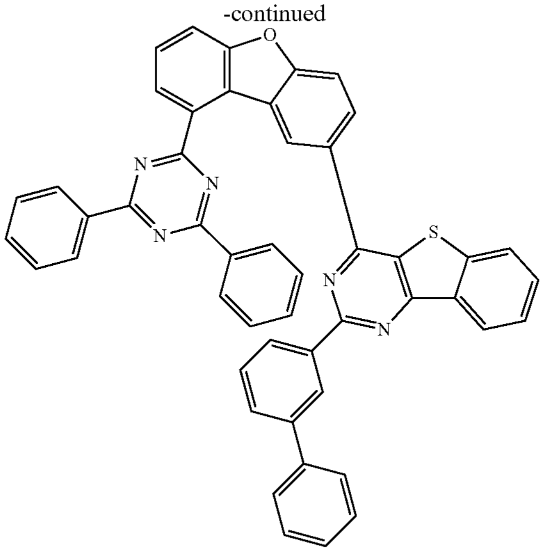
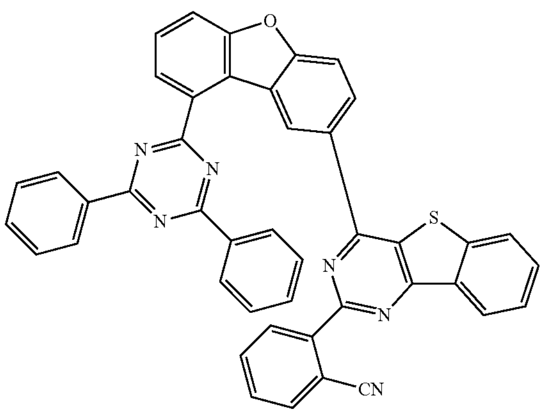
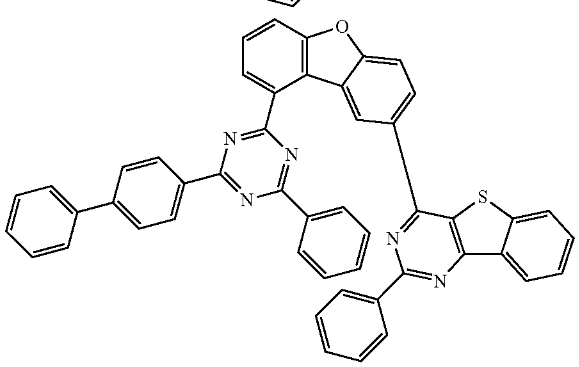
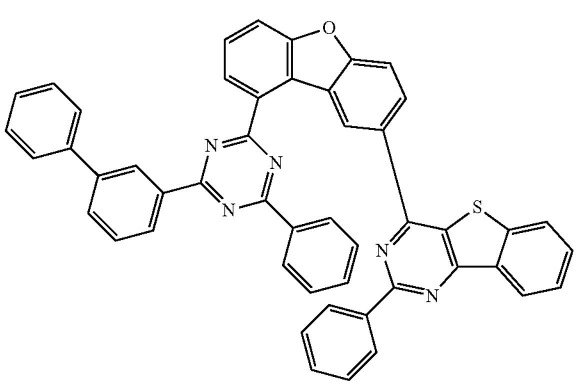
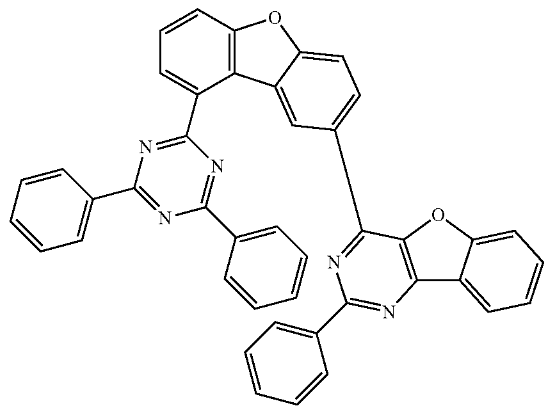
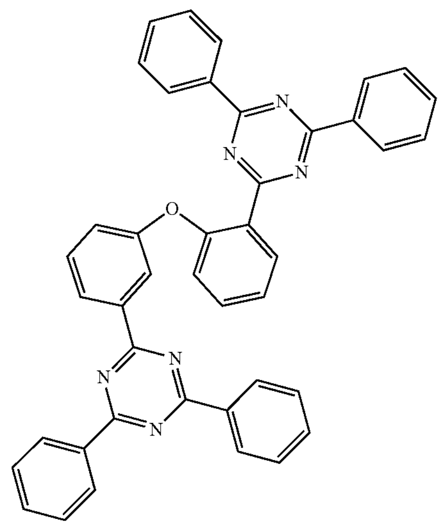
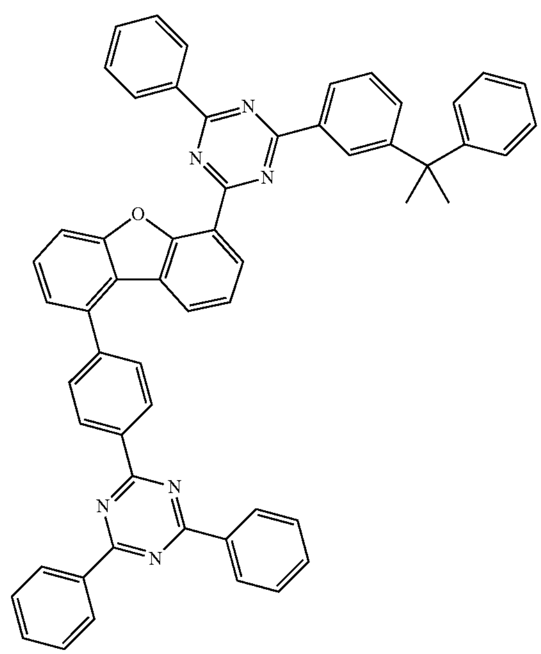

-continued
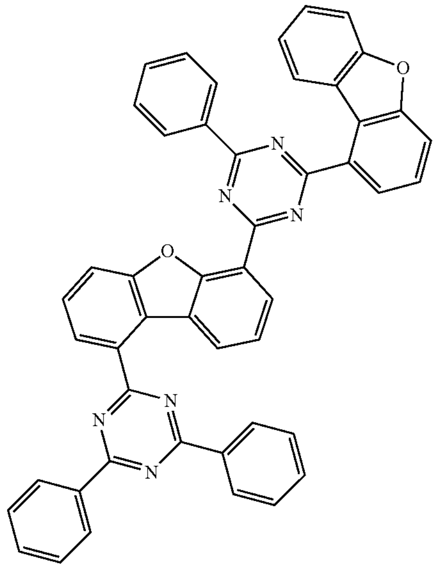
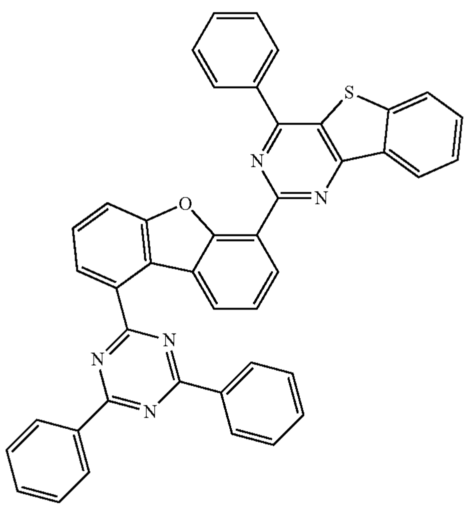
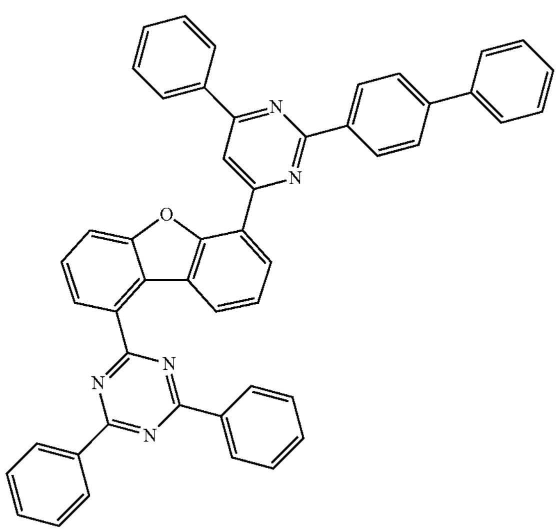
-continued
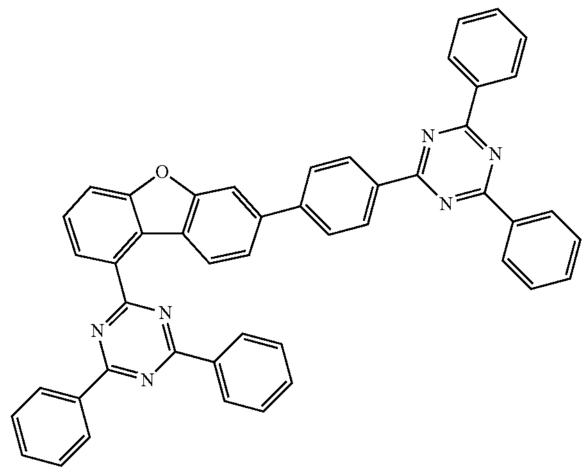
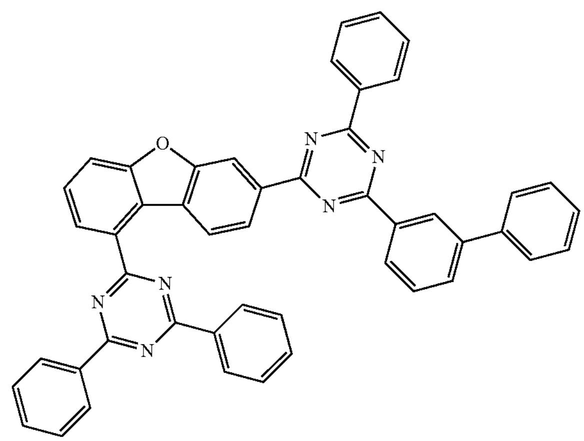
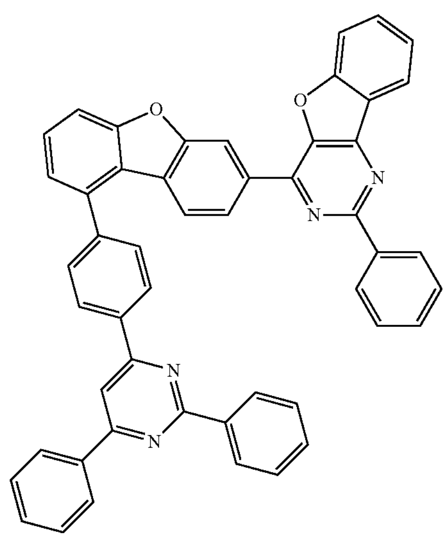

-continued
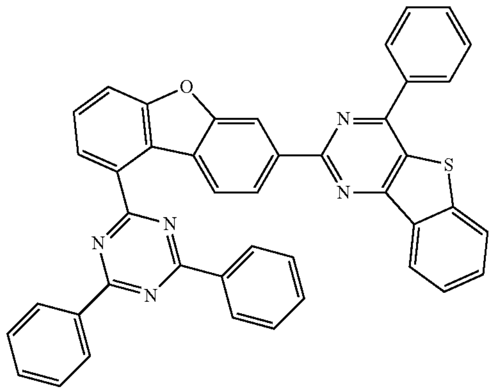
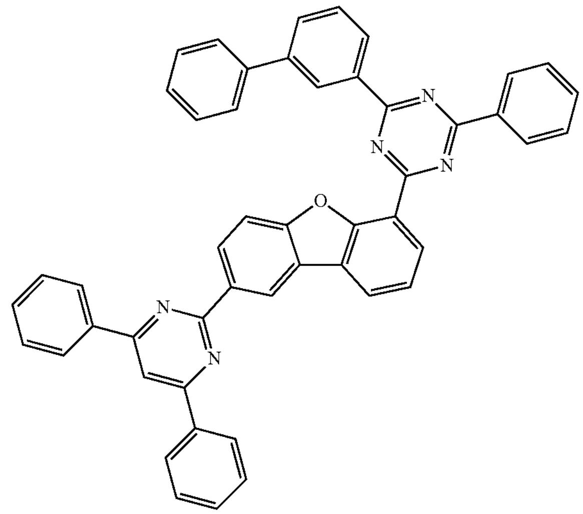
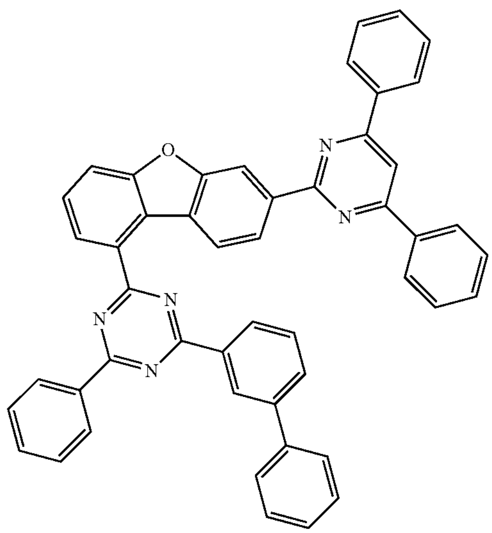
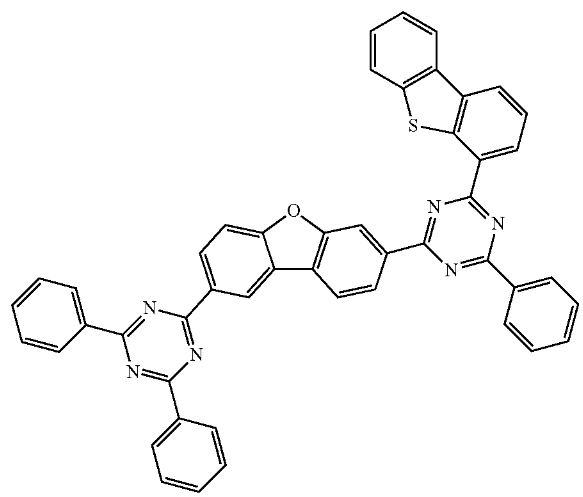
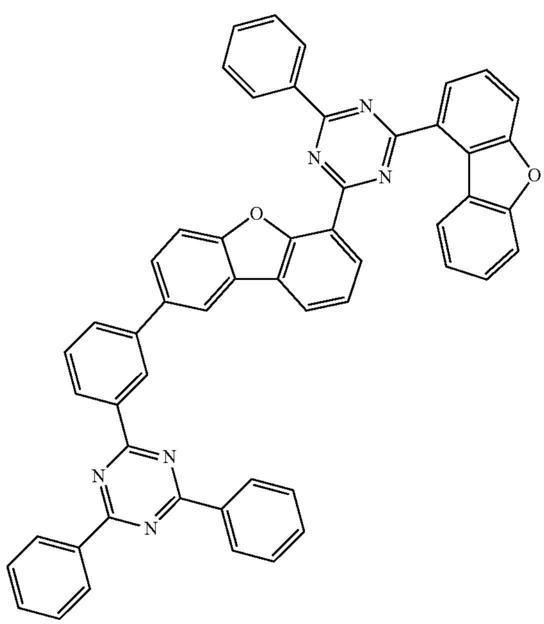
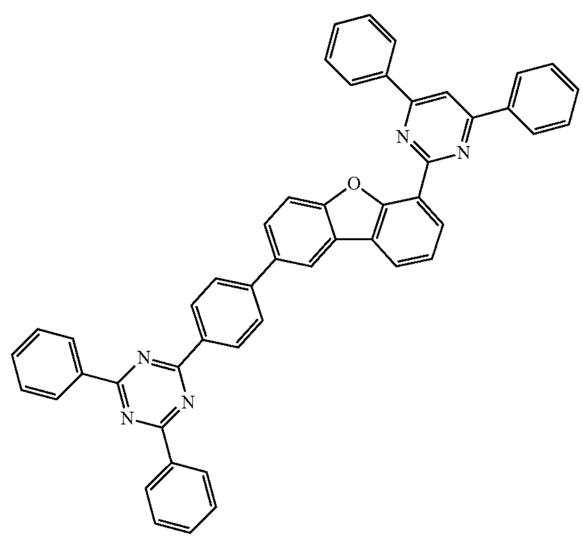
-continued -continued
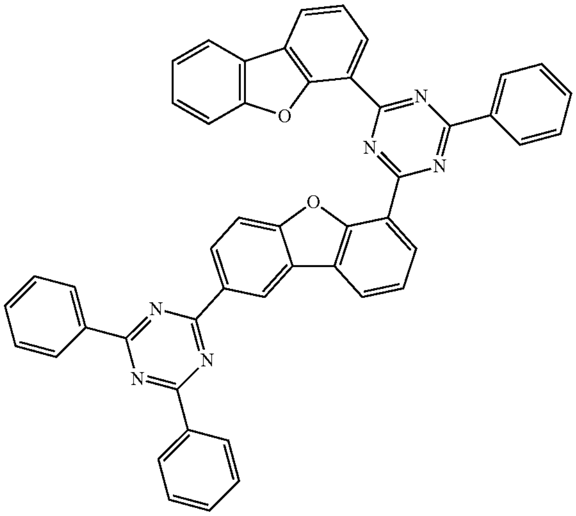
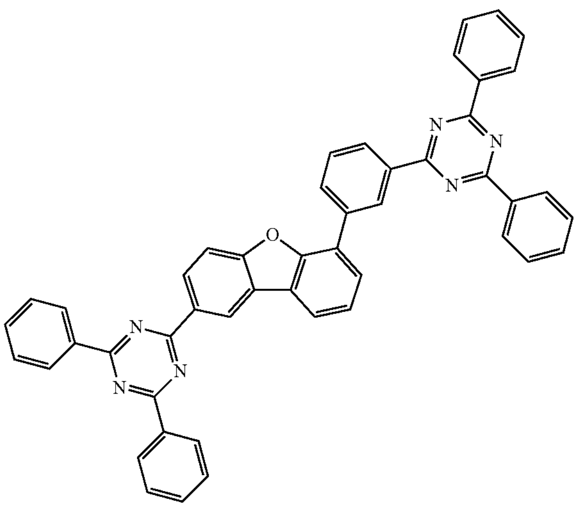
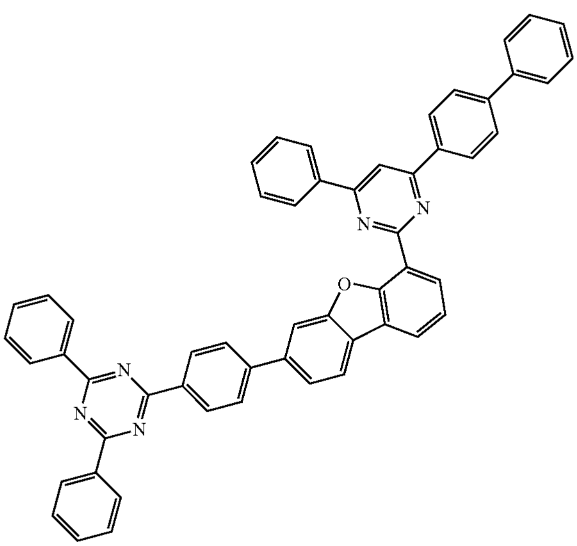
-continued
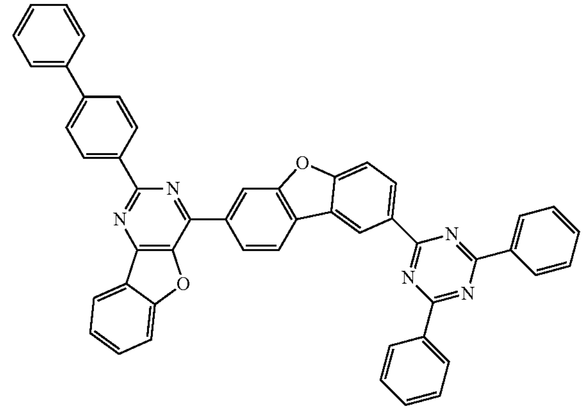
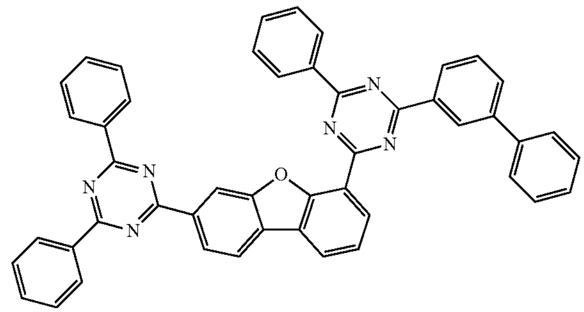
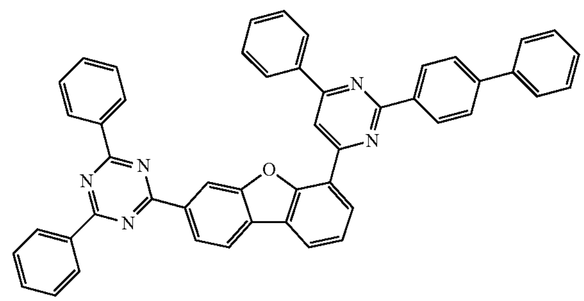
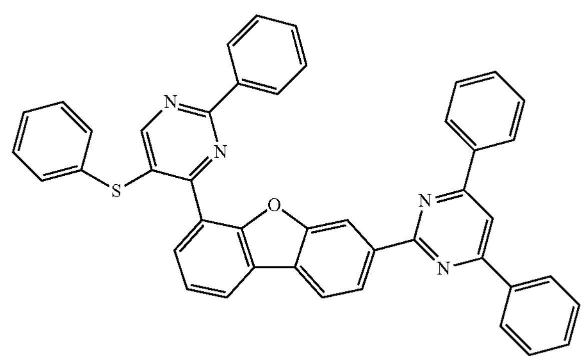
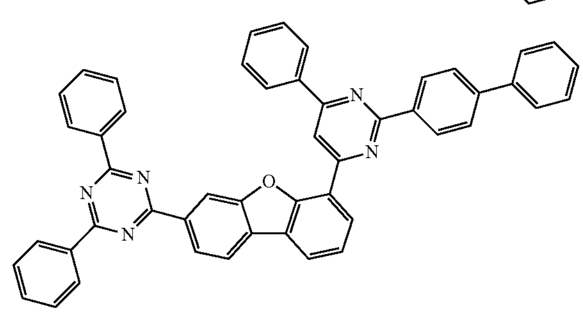

-continued
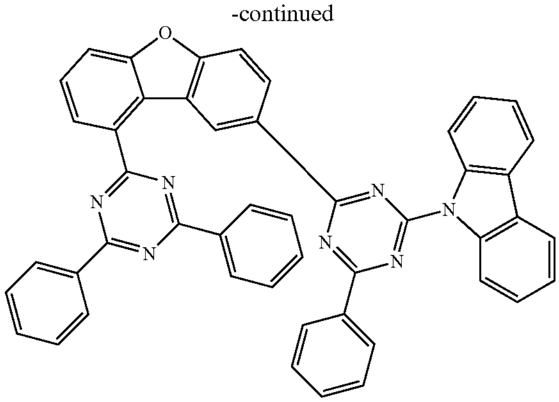
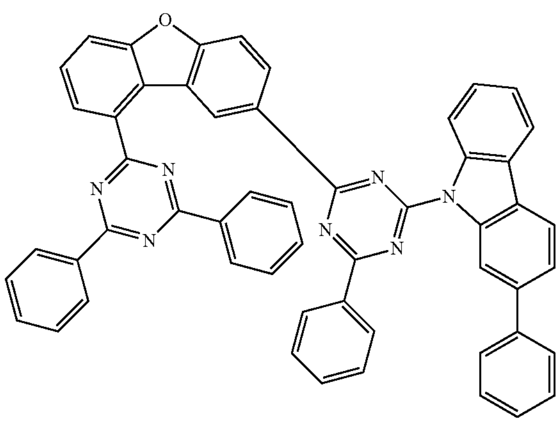
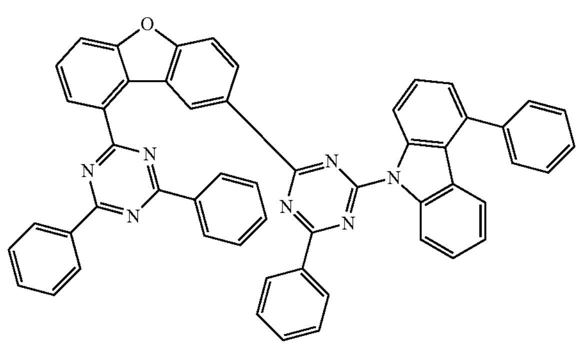
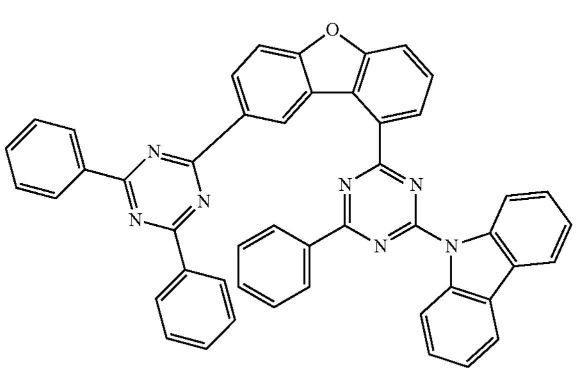
-continued
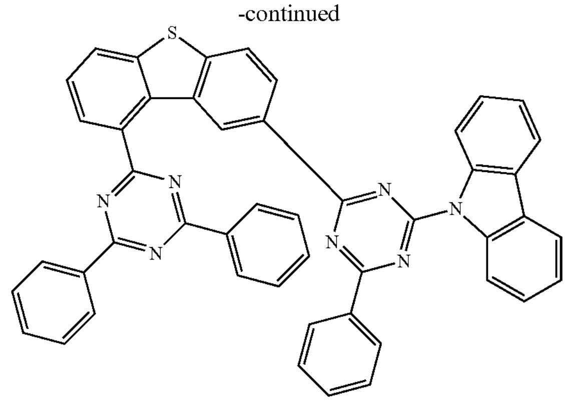
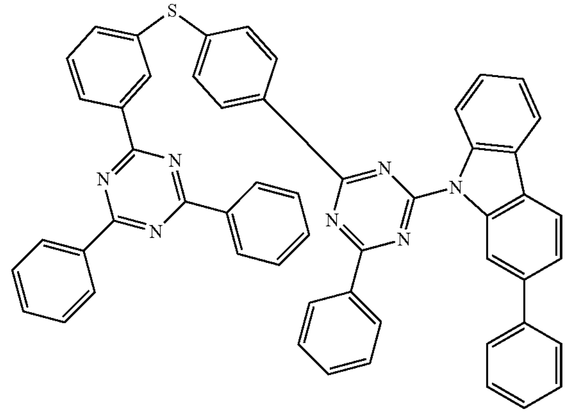
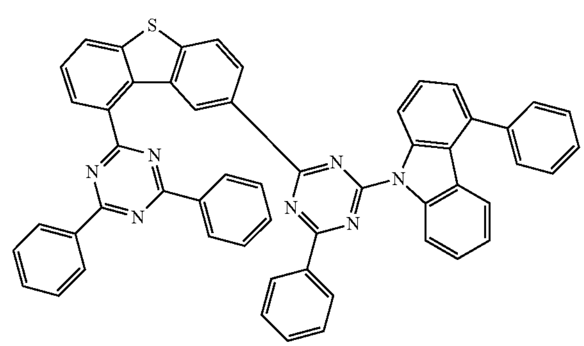
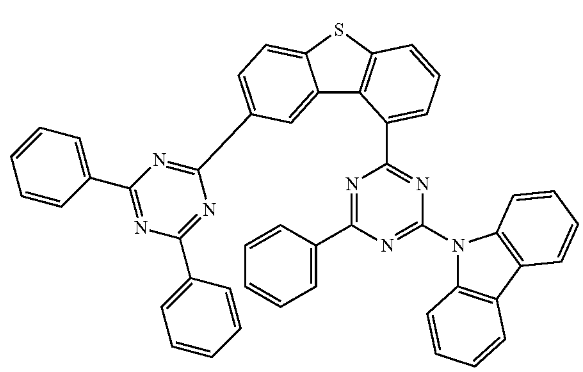

-continued
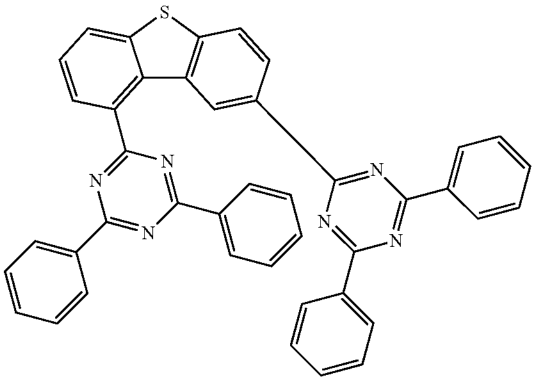
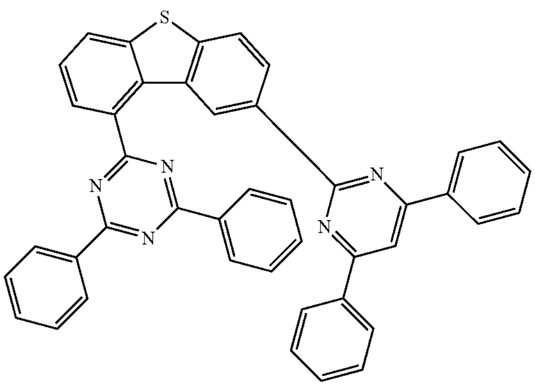
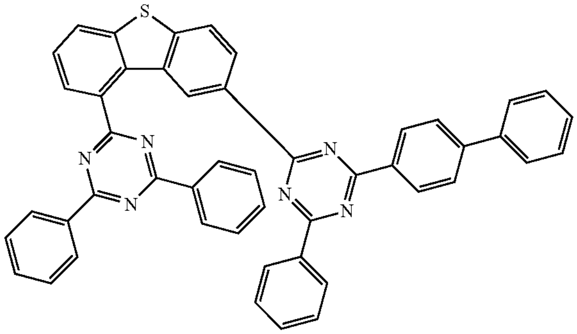
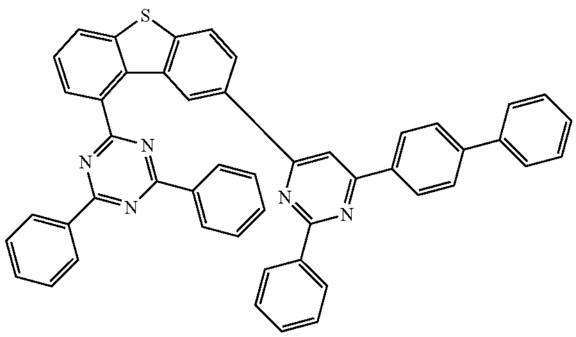
-continued
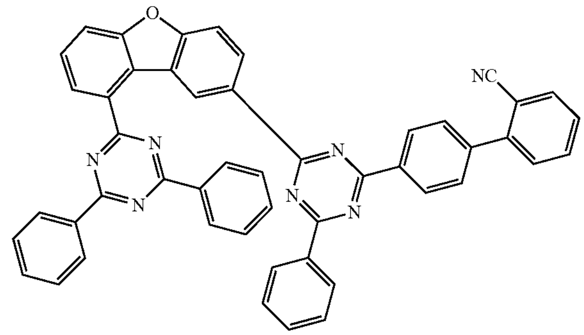
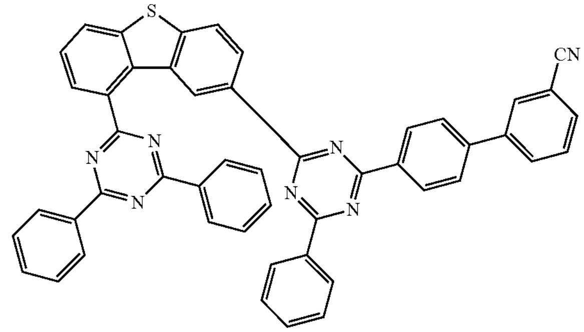
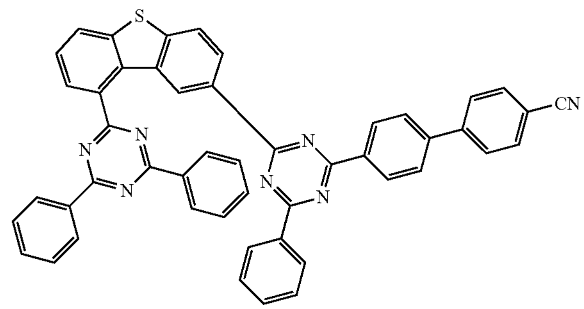
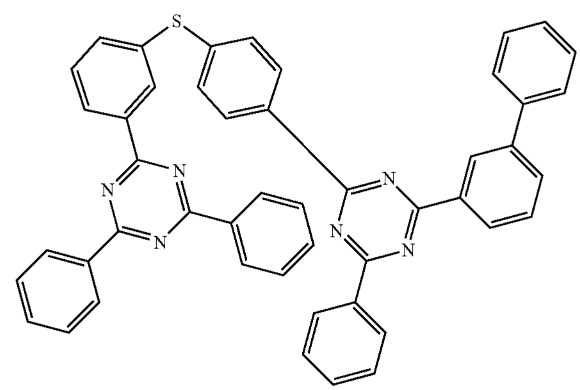
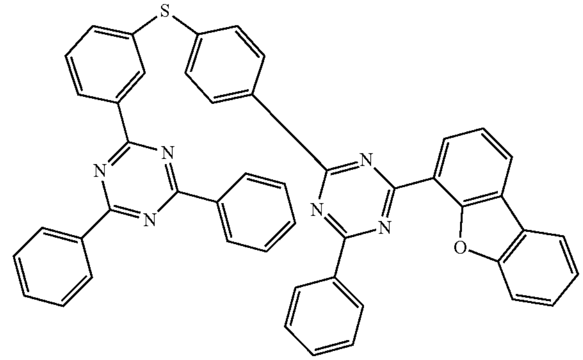

-continued
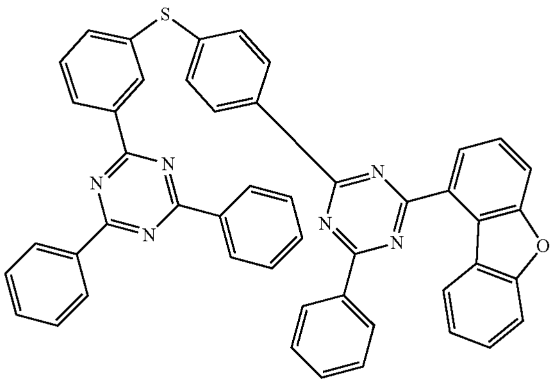
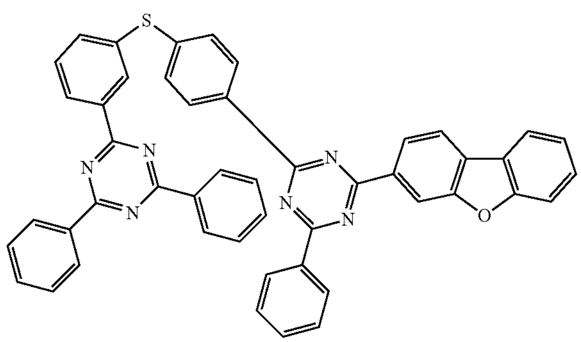
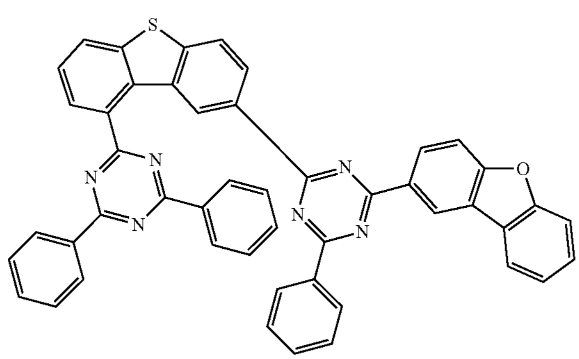
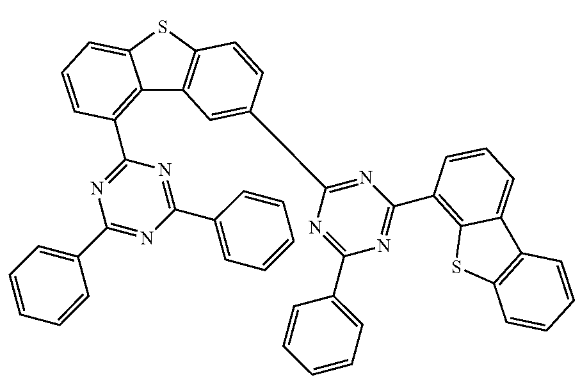
-continued
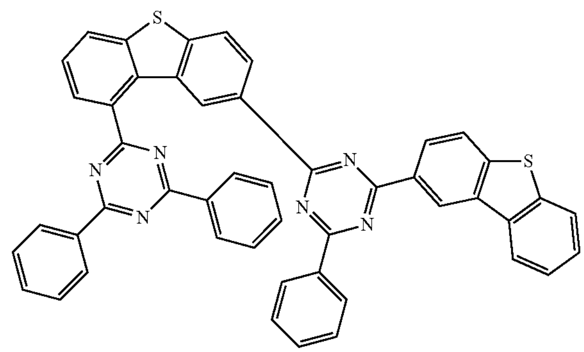
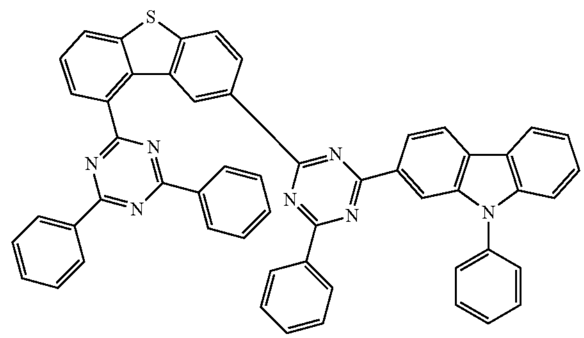
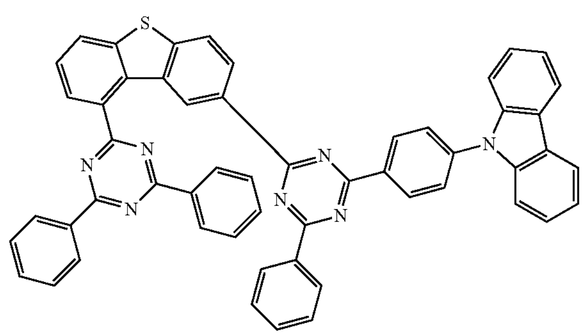
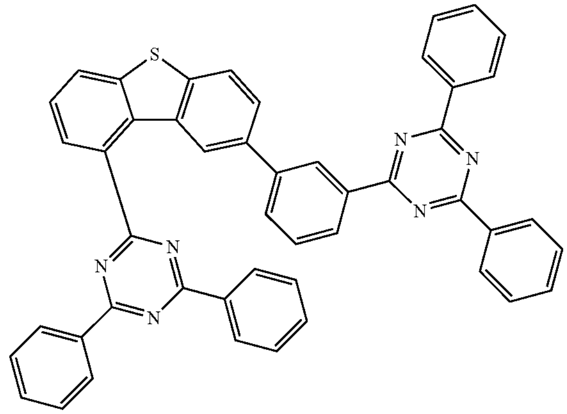

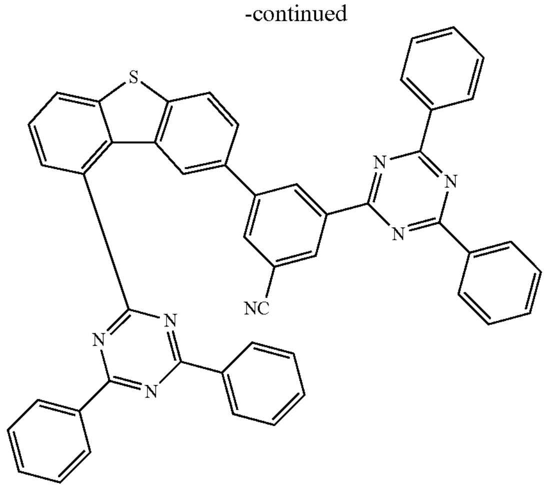
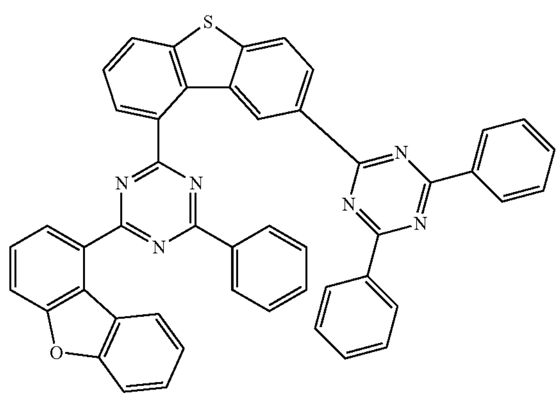
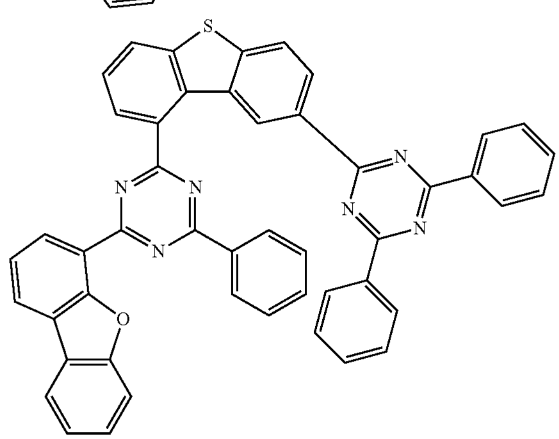
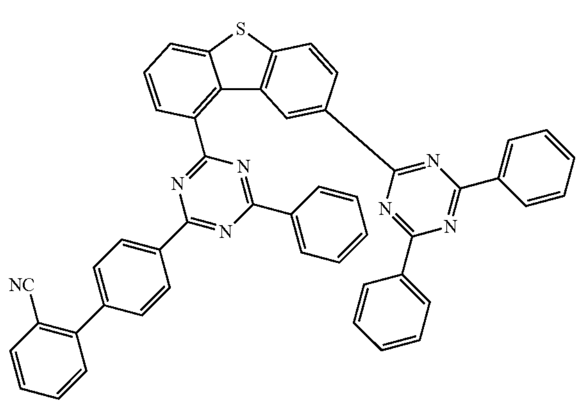
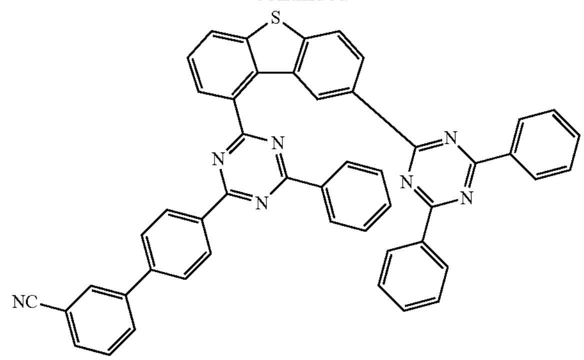
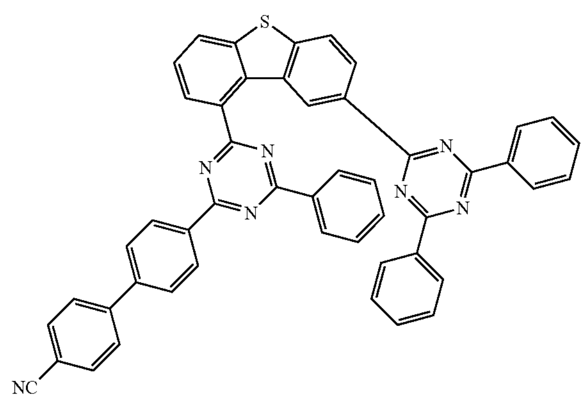
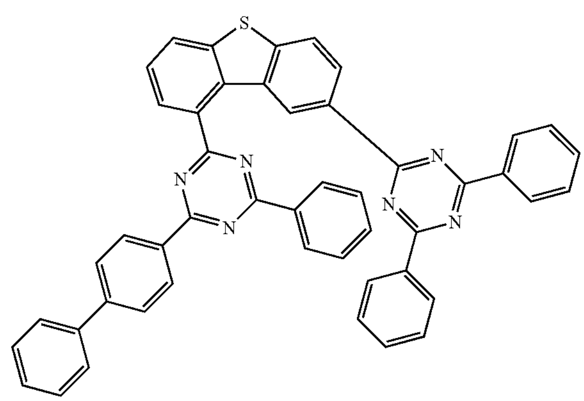
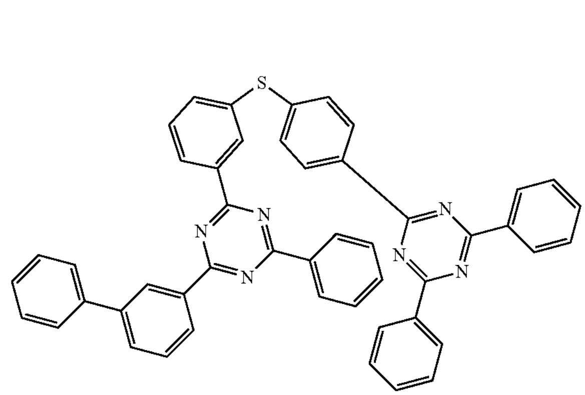

-continued
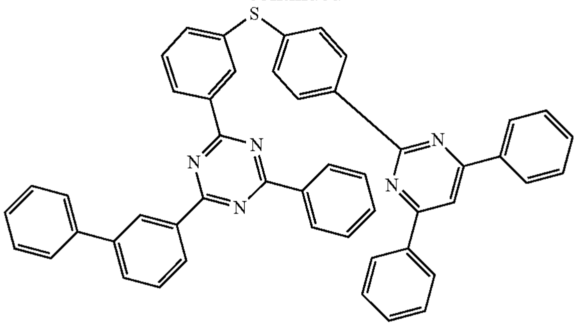
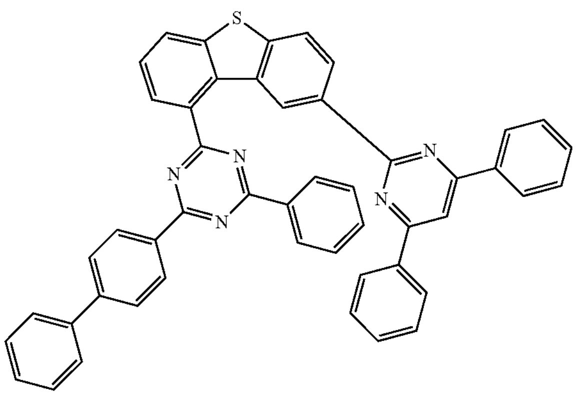
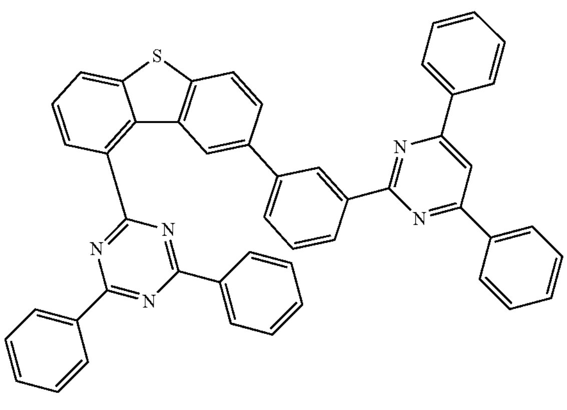
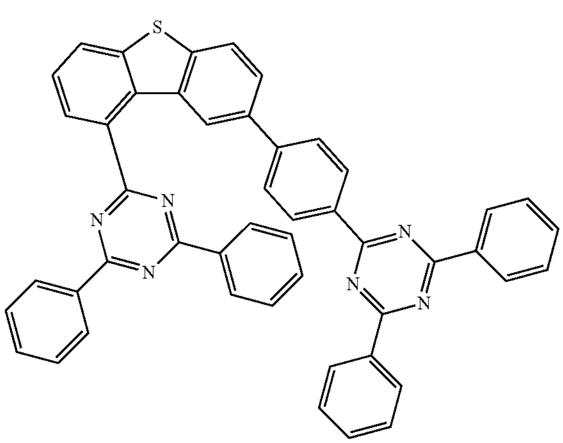
-continued
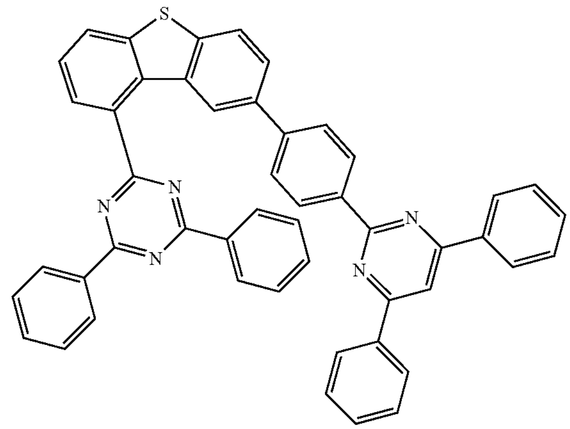
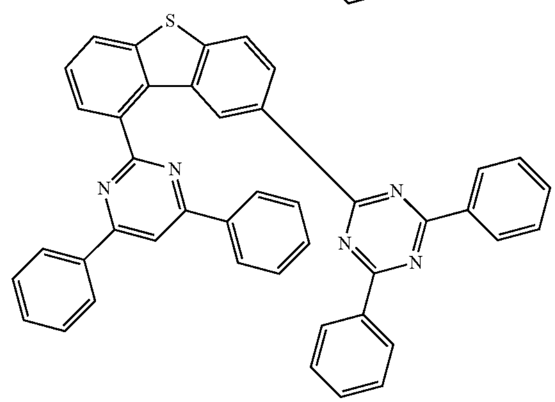
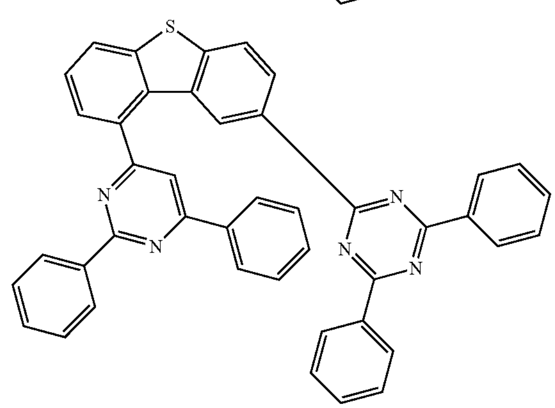
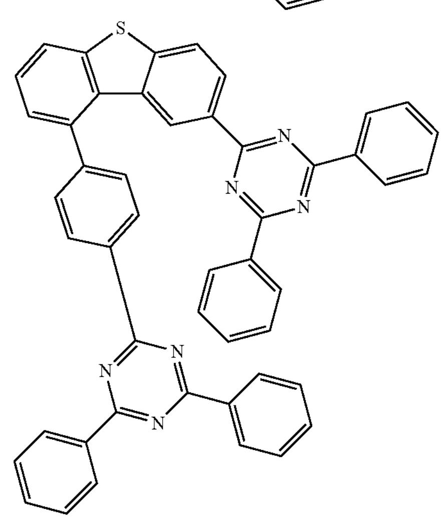

-continued
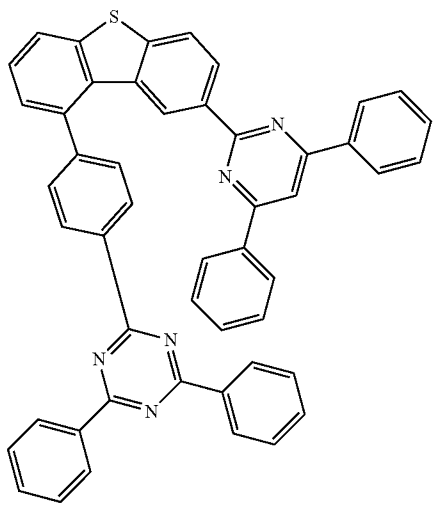 [SMILES: c1ccc(-c2cc(-c3ccccc3)nc(-c3ccc4sc5cccc(-c6ccc(-c7nc(-c8ccccc8)nc(-c8ccccc8)n7)cc6)c5c4c3)n2)cc1]
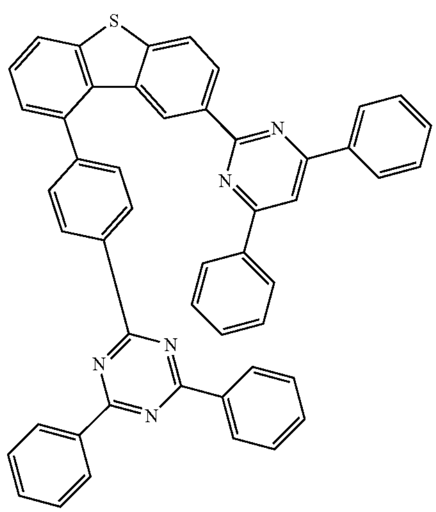
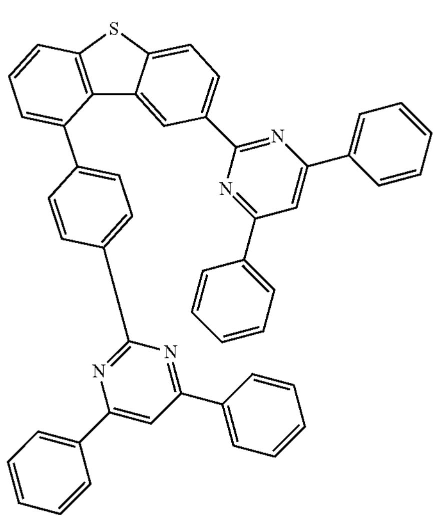
-continued
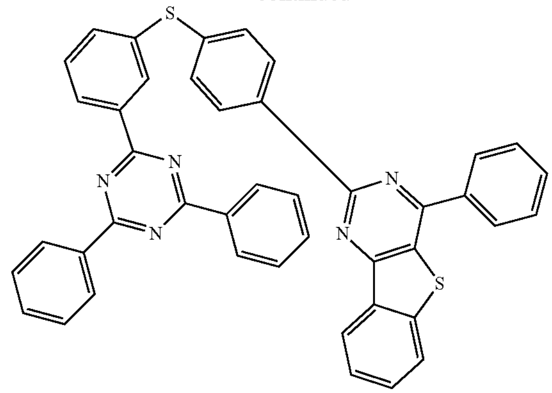
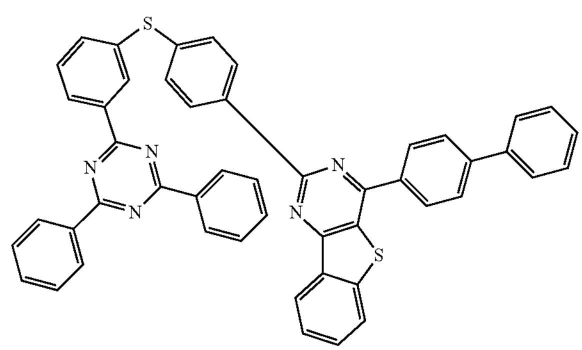
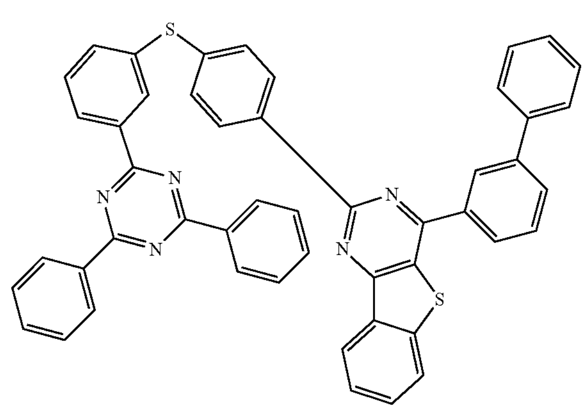

-continued
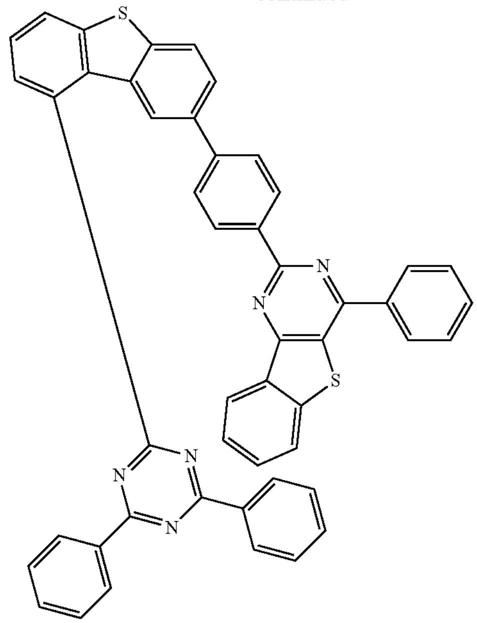
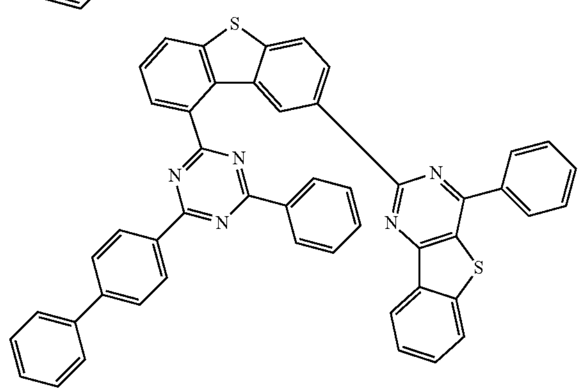
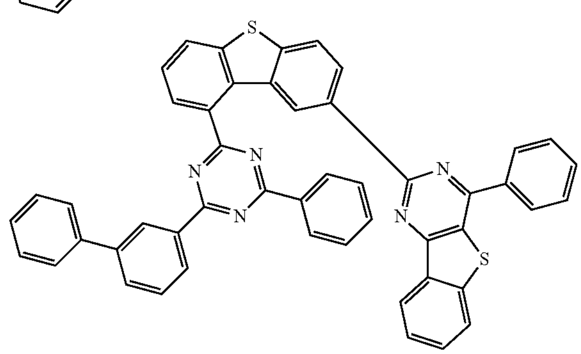
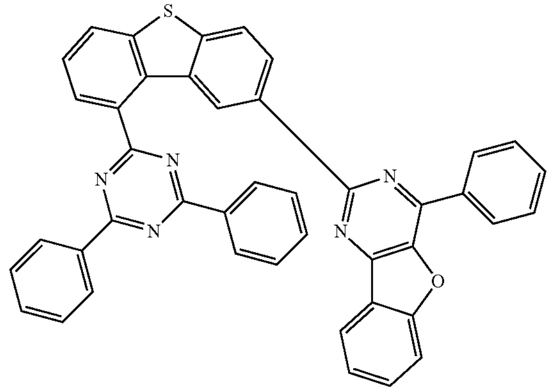
-continued
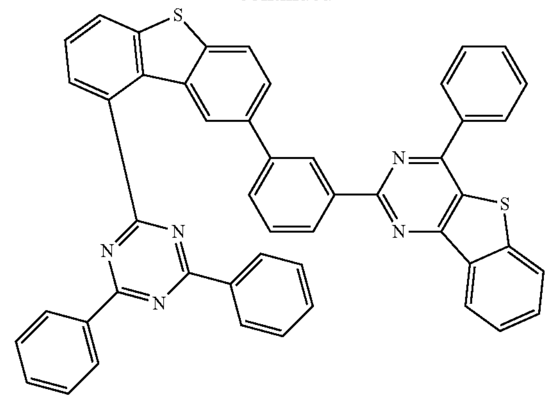
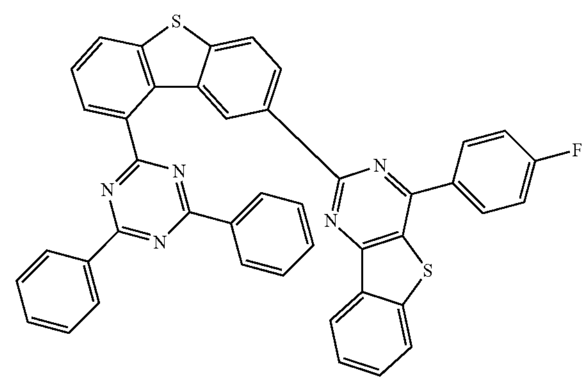
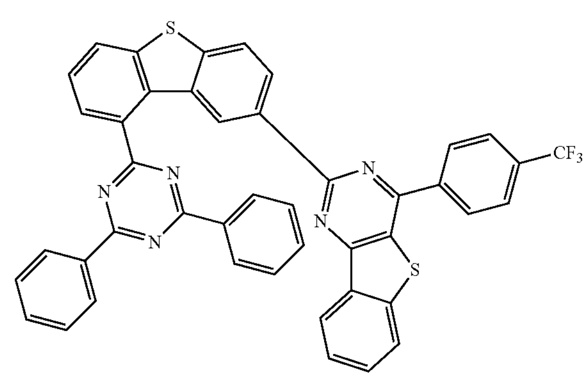
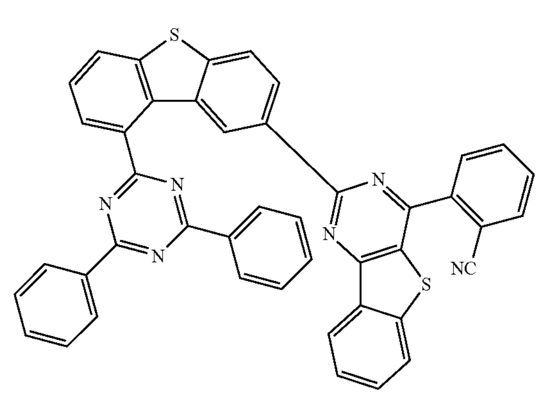

-continued
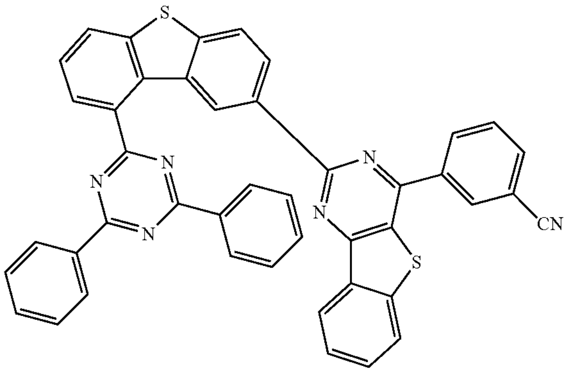
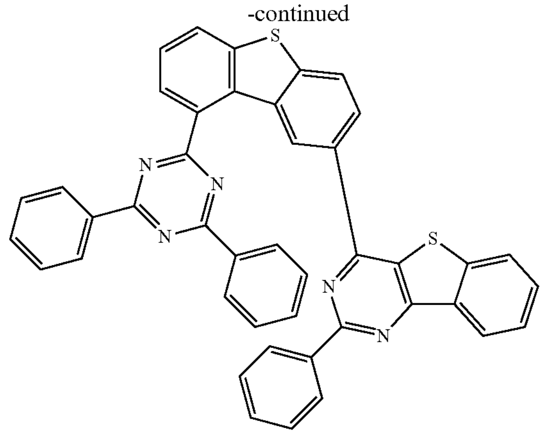
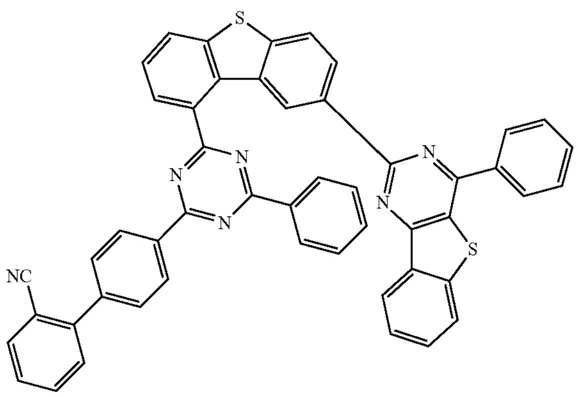
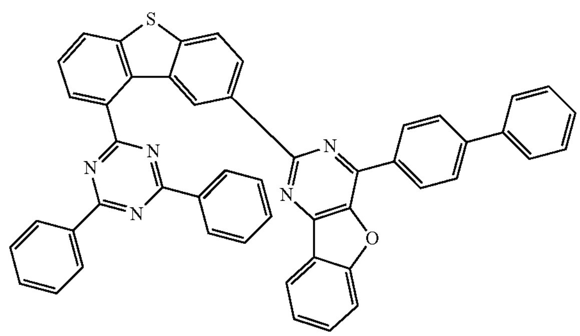
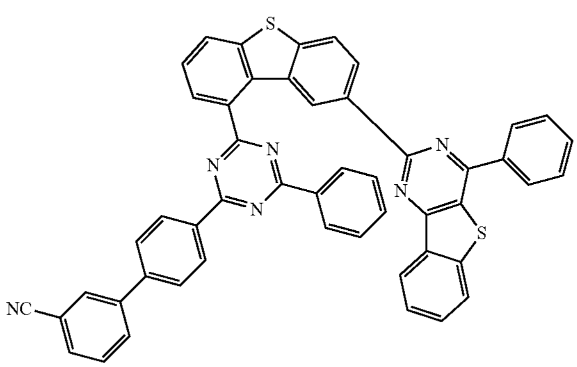
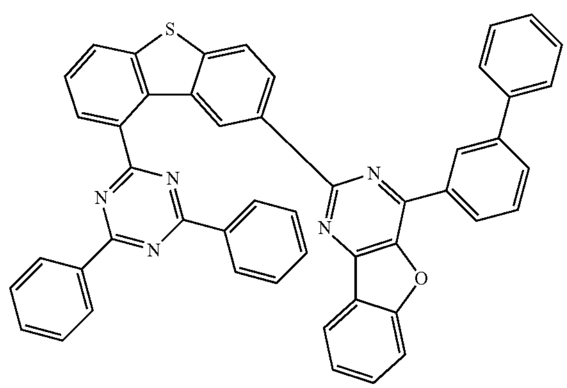
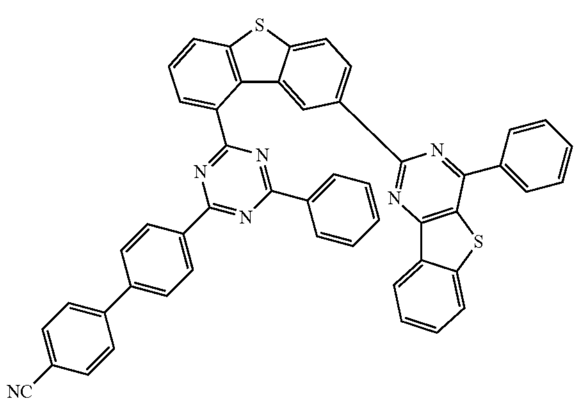
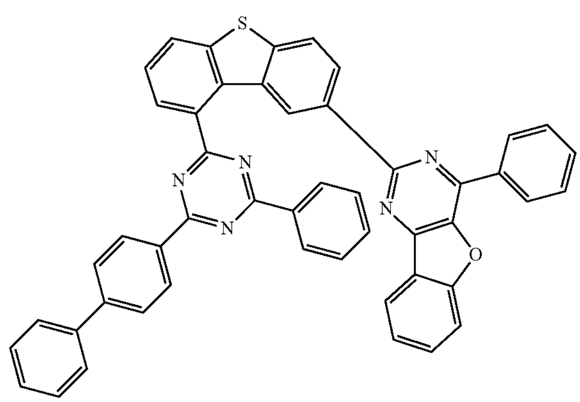

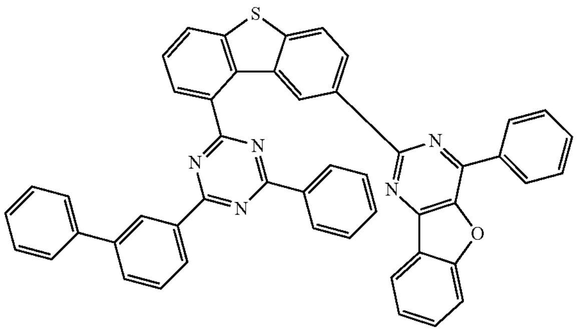
S
N
N
N
N
N
O
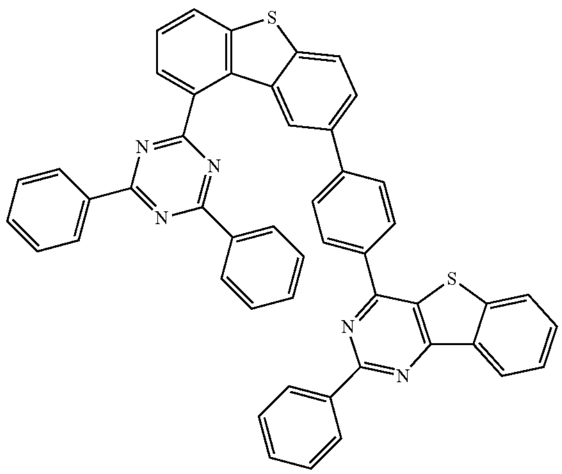
S
N
N
N
S
N
N
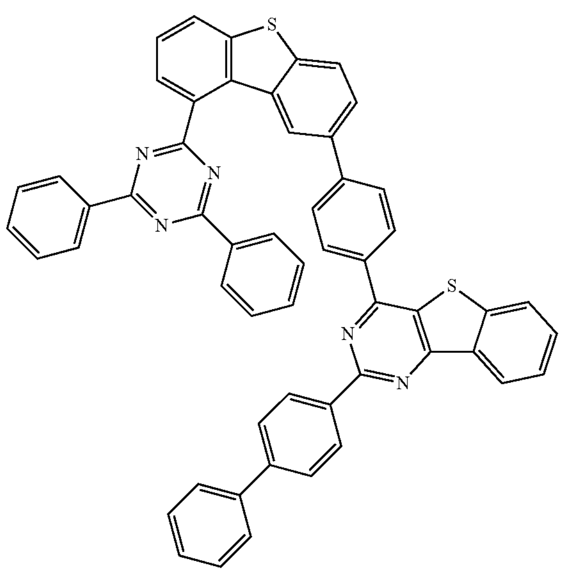
S
N
N
N
S
N
N
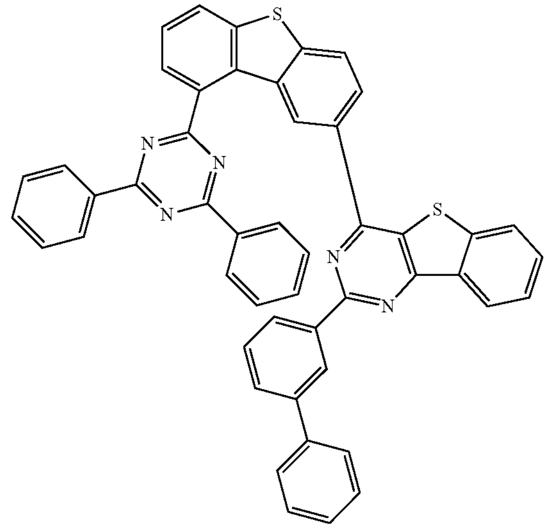
S
N
N
N
S
N
N
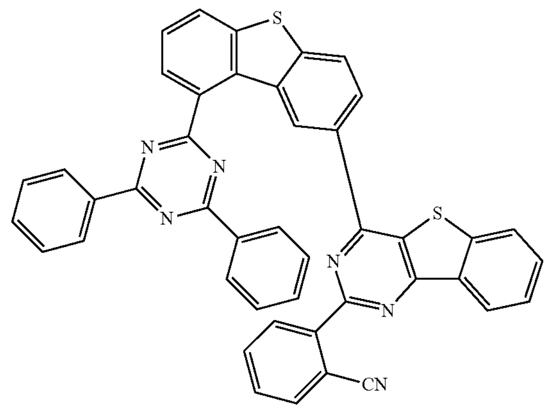
S
N
N
N
S
N
N
CN
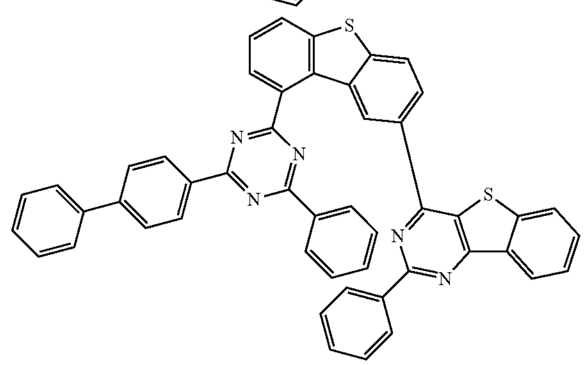
S
N
N
N
S
N
N
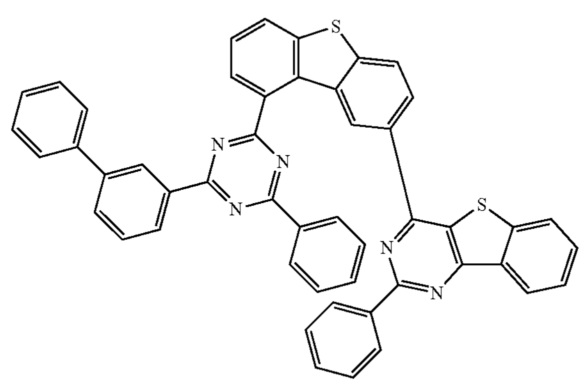
S
N
N
N
S
N
N

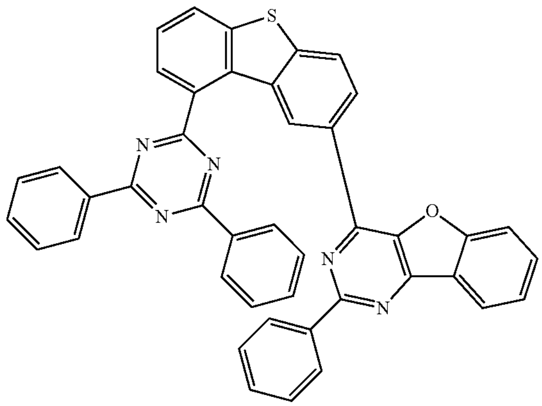
S
N
N
N
O
N
N
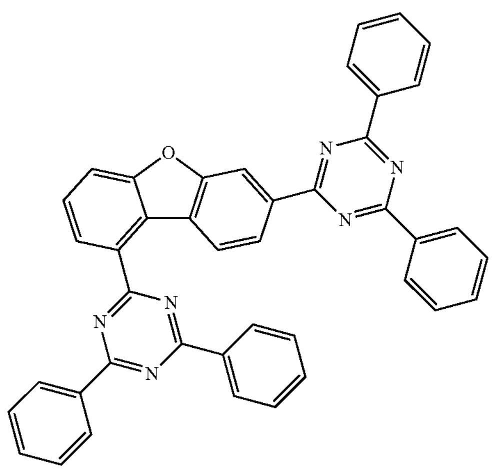
O
N
N
N
N
N
N
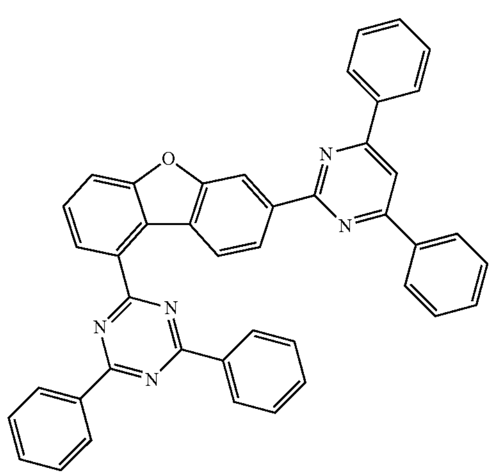
O
N
N
N
N
N
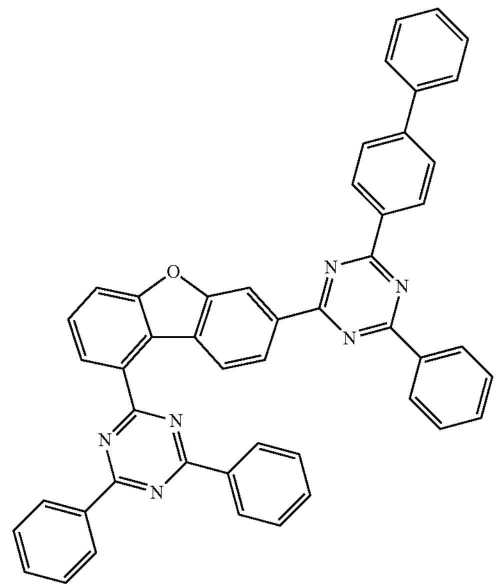
O
N
N
N
N
N
N
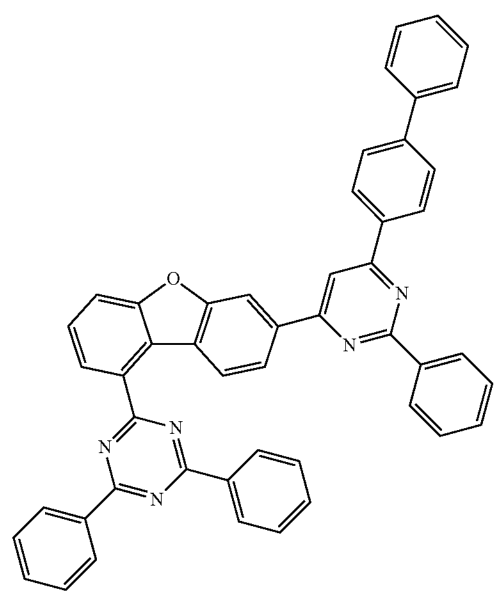
O
N
N
N
N
N -continued
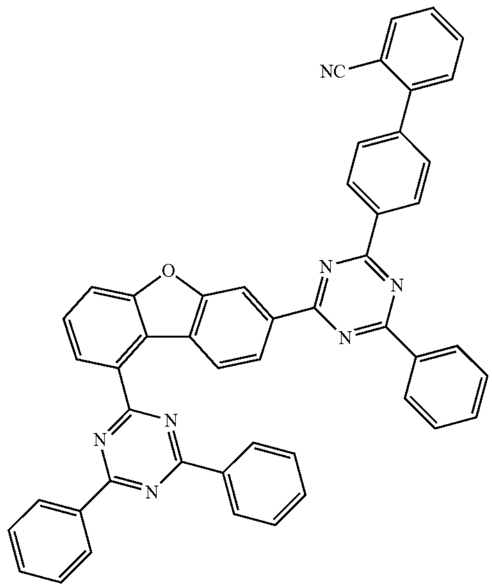
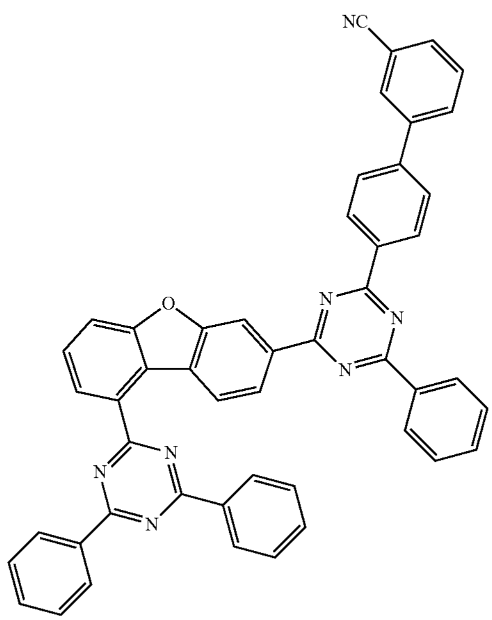
-continued
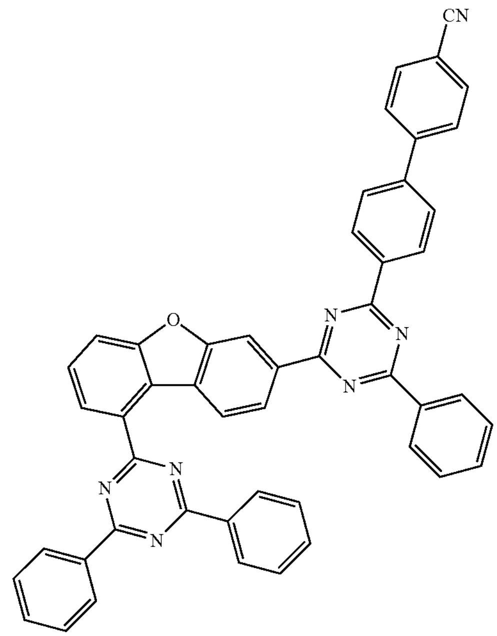
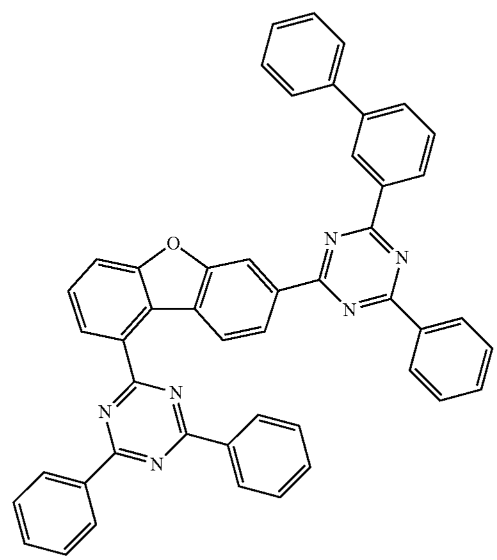
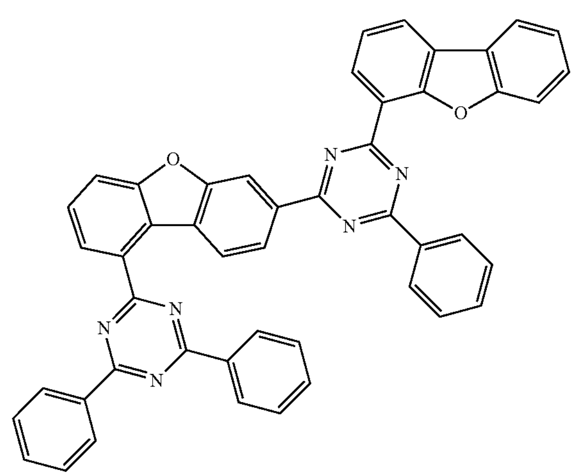

-continued
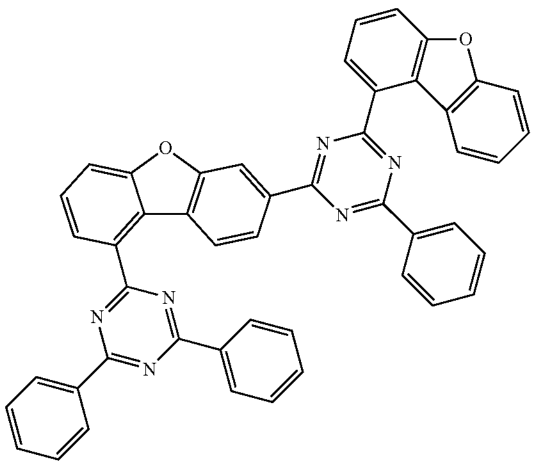
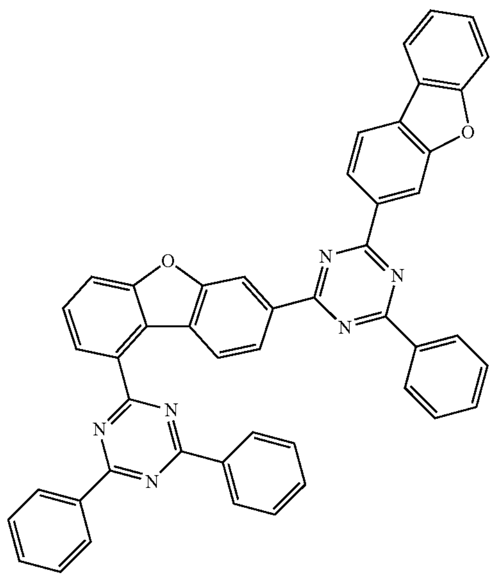
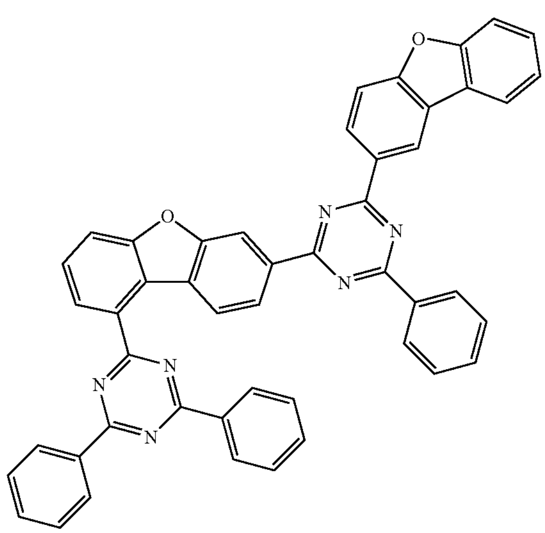
-continued
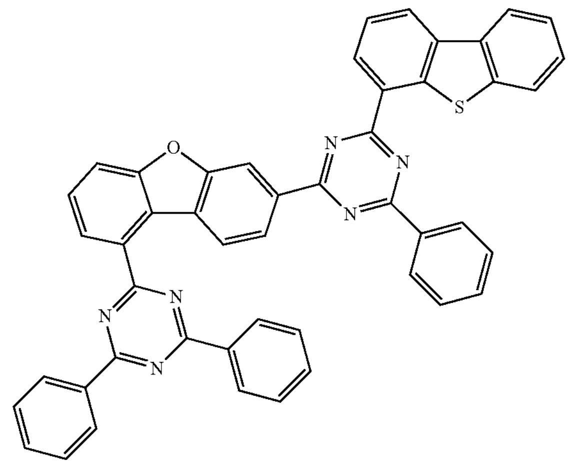
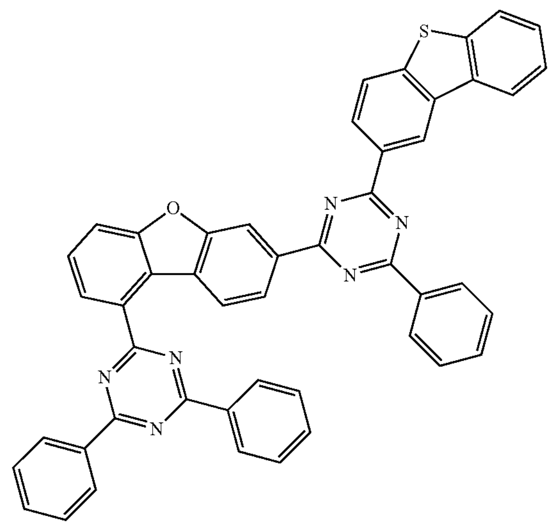
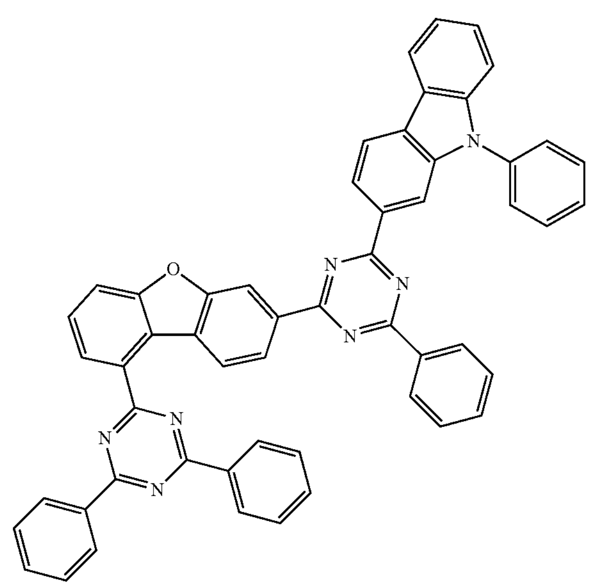

-continued
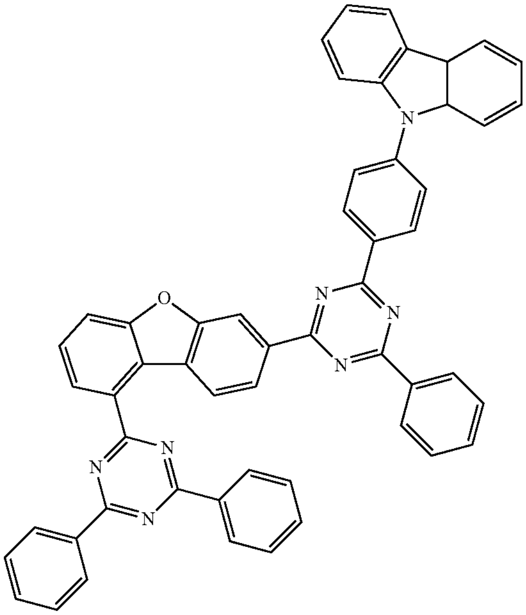
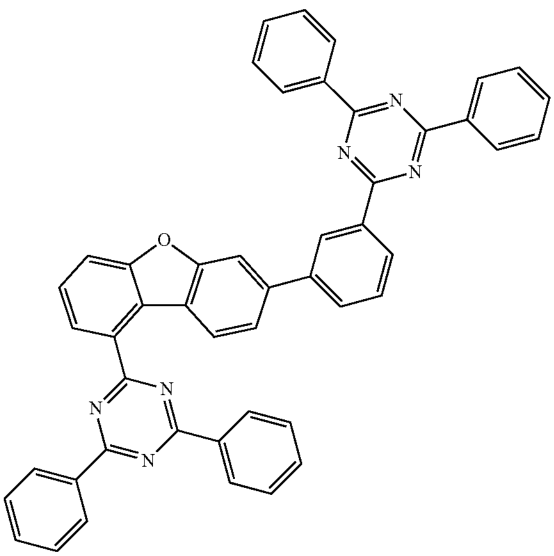
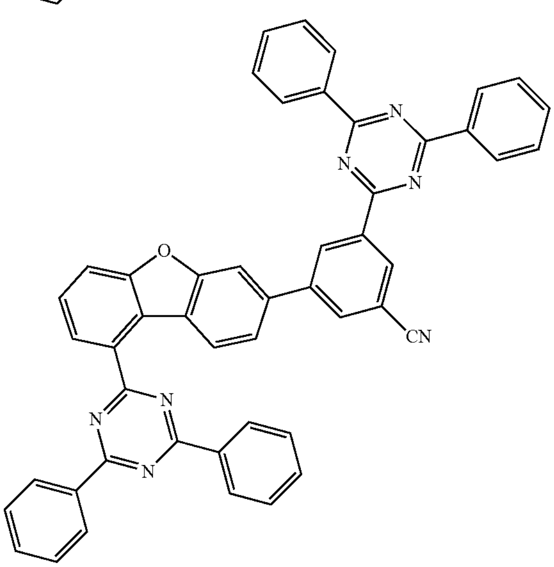
-continued
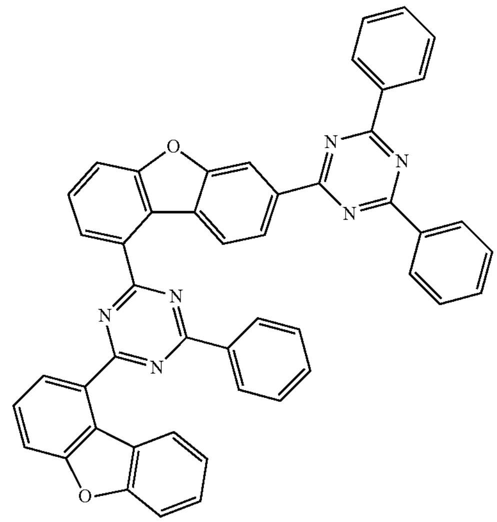
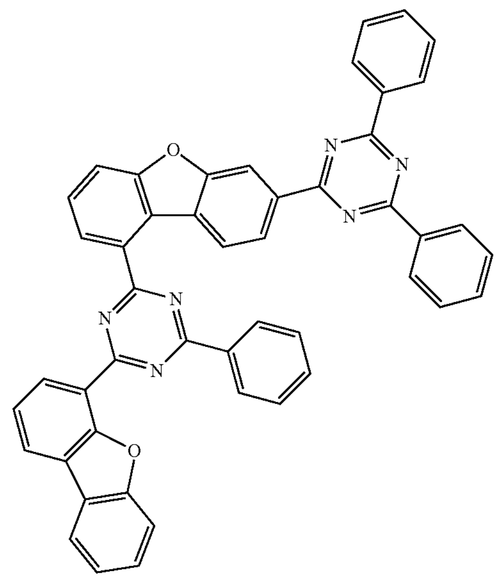
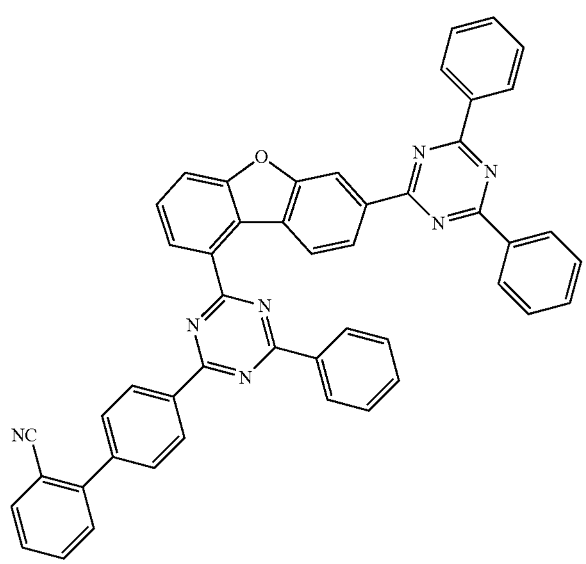

-continued
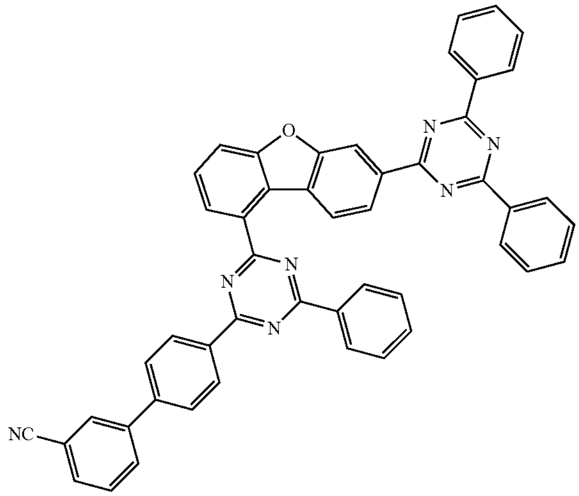
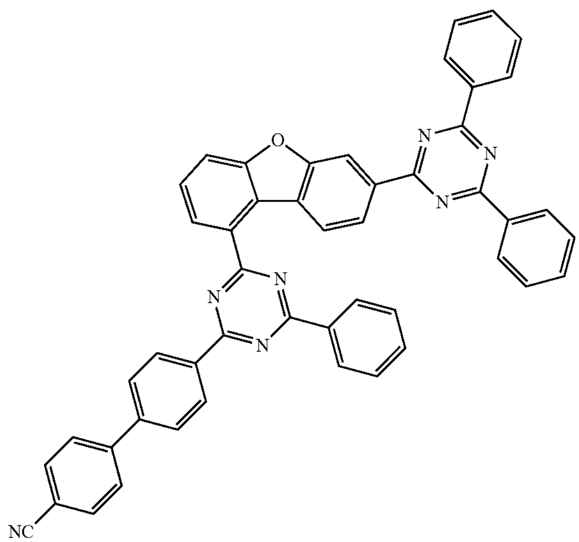
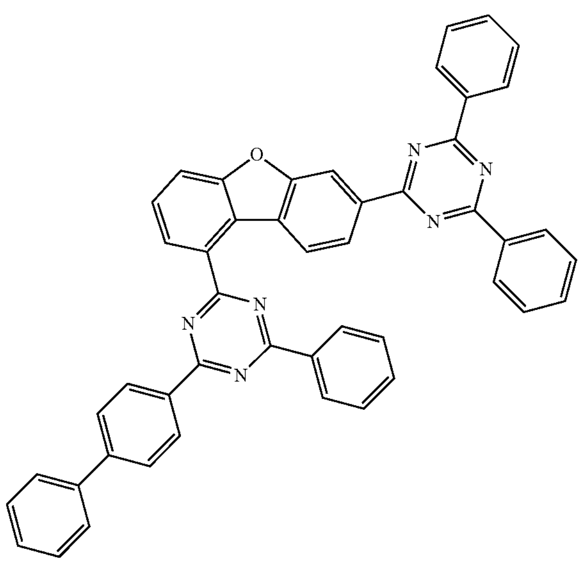
-continued
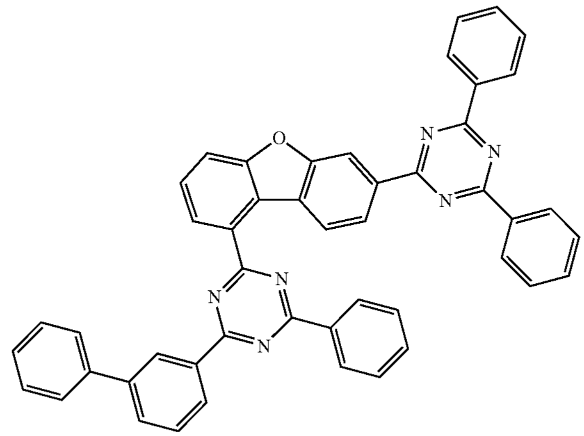
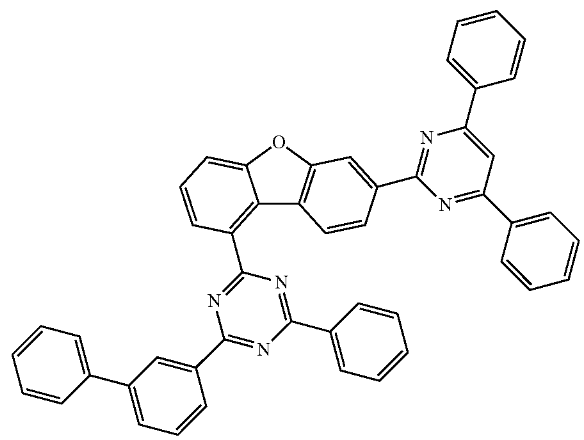
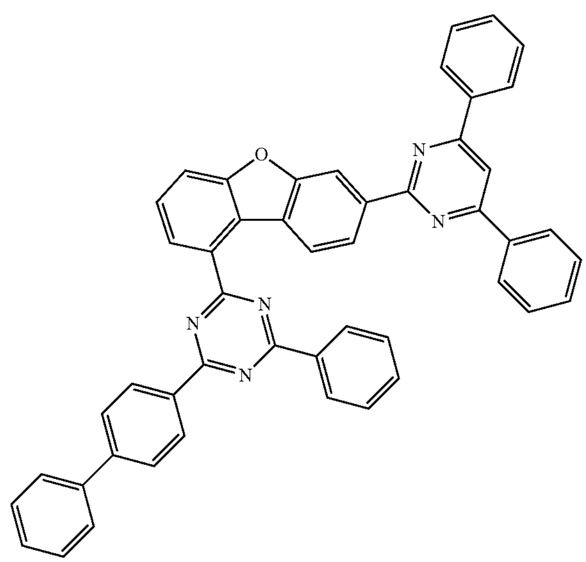 [SMILES: c1ccc(-c2ccc(-c3nc(-c4ccccc4)nc(-c4cccc5oc6cc(-c7nc(-c8ccccc8)nc(-c8ccccc8)n7)ccc6c45)n3)cc2)cc1]

-continued
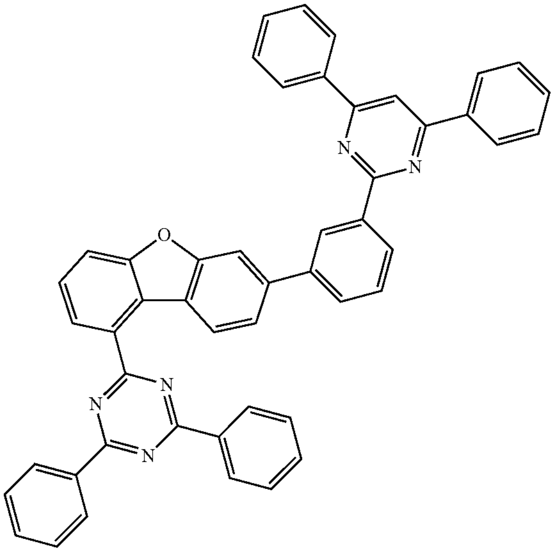
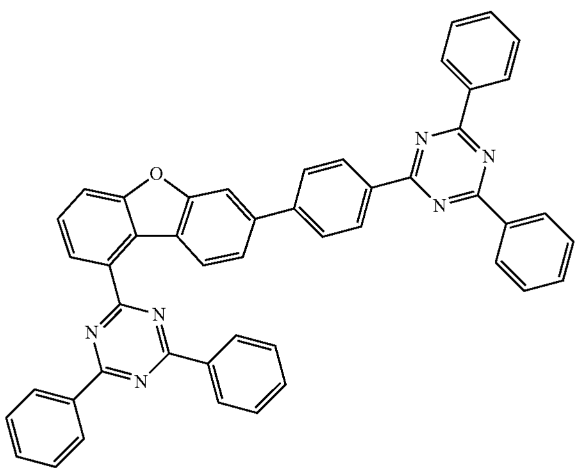
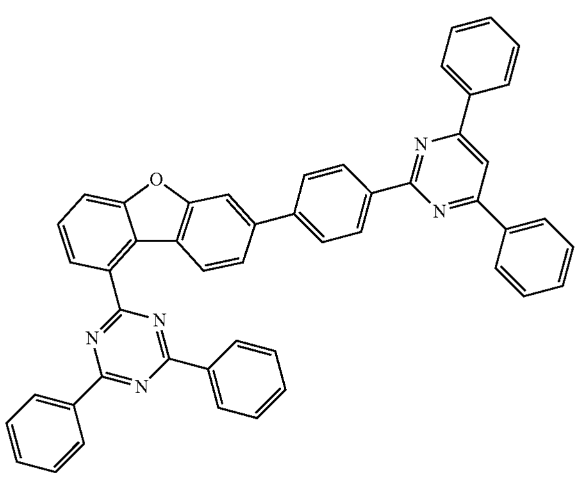
-continued
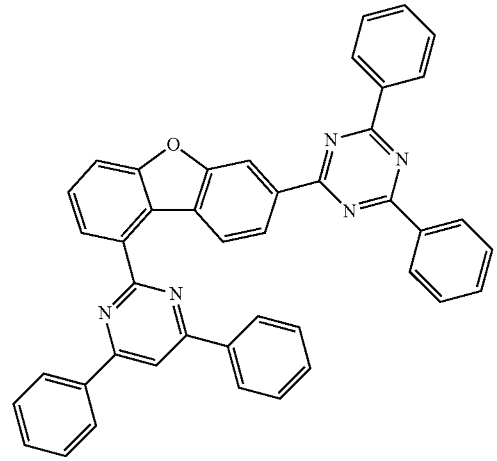
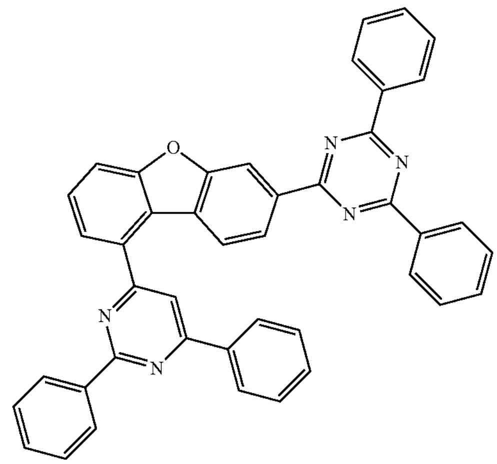
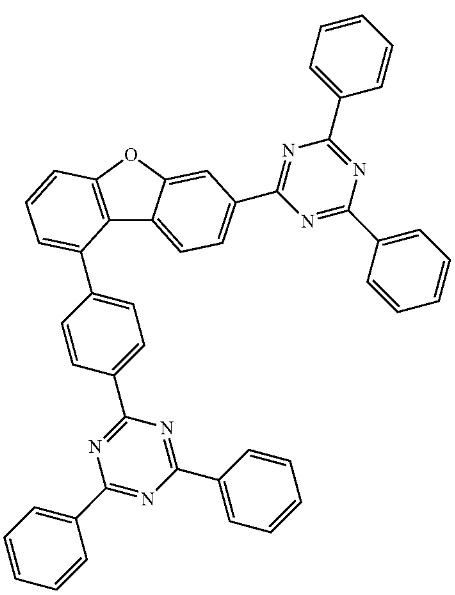

-continued
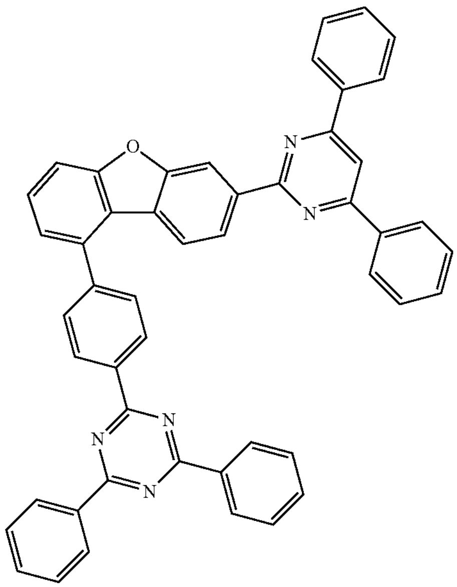
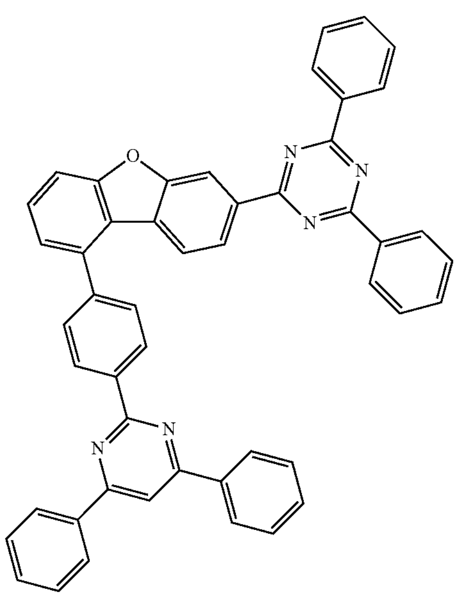
-continued
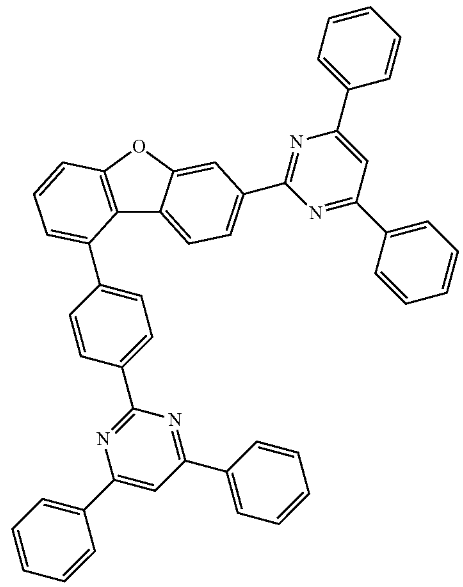
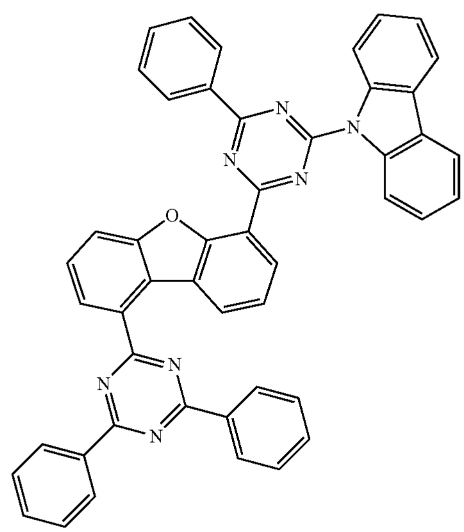

-continued
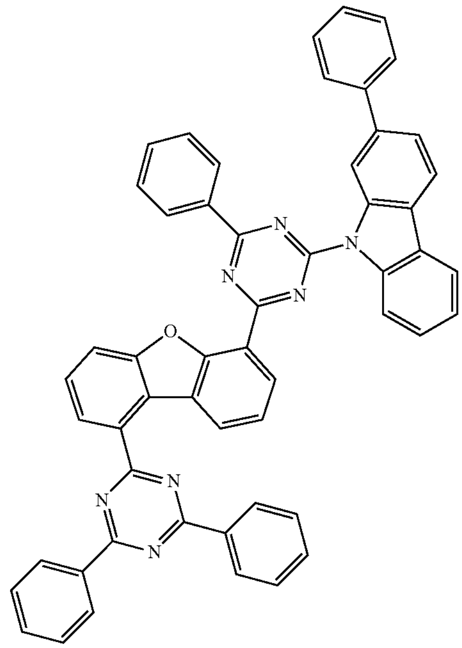
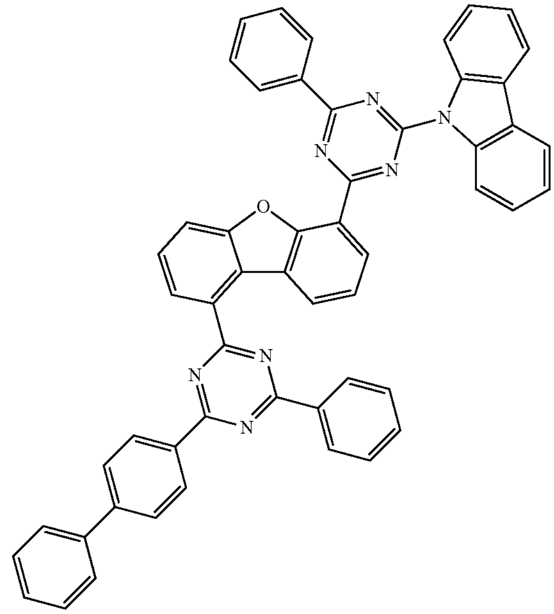
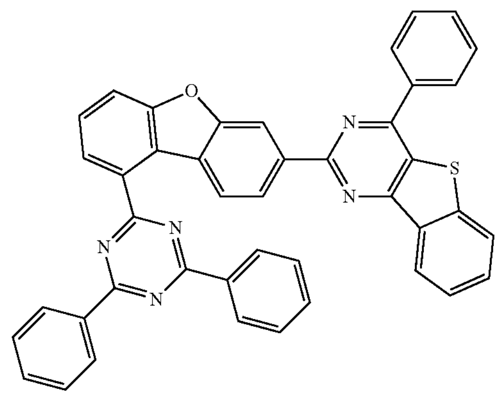
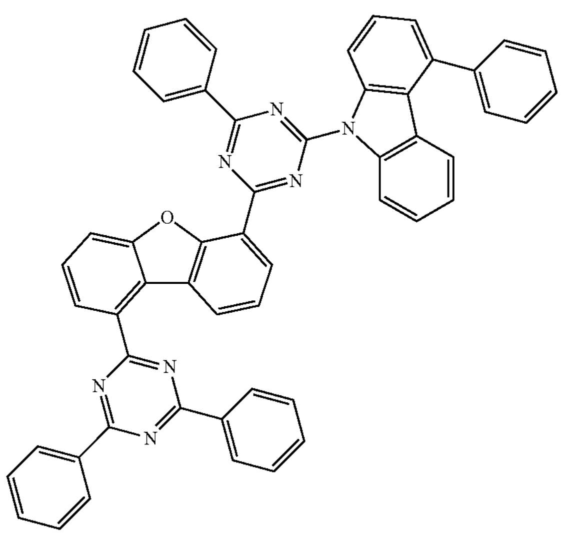
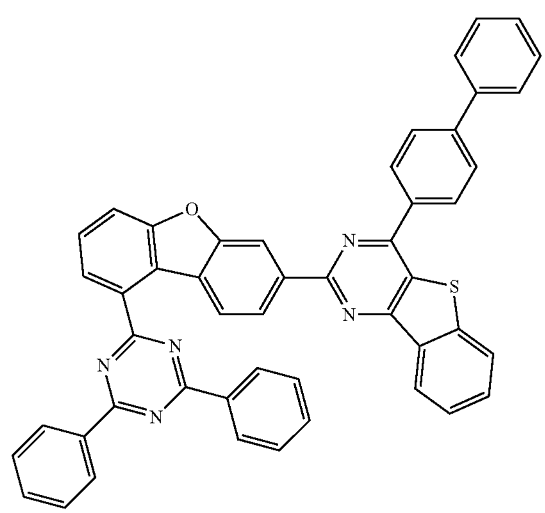

-continued
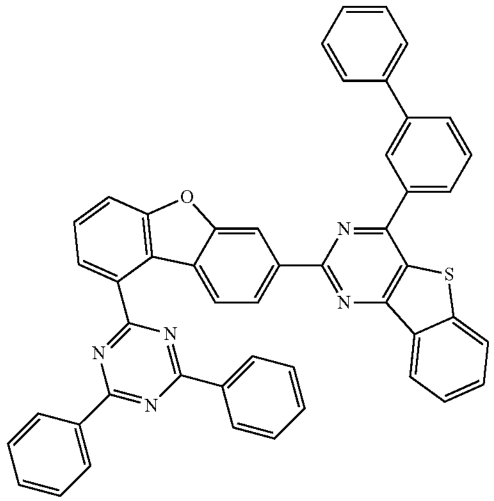
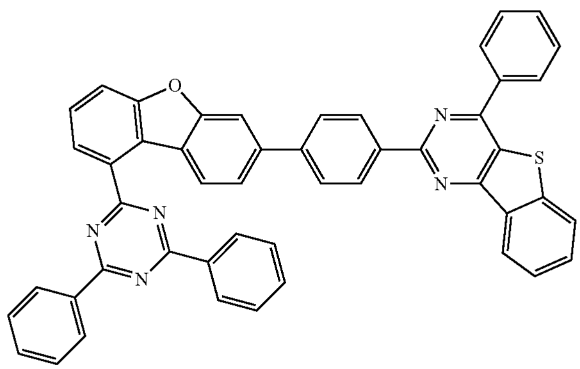
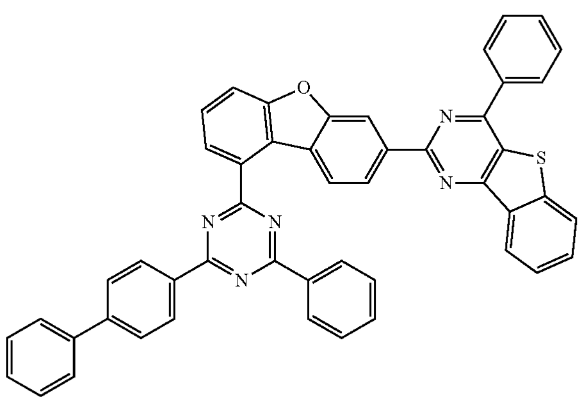
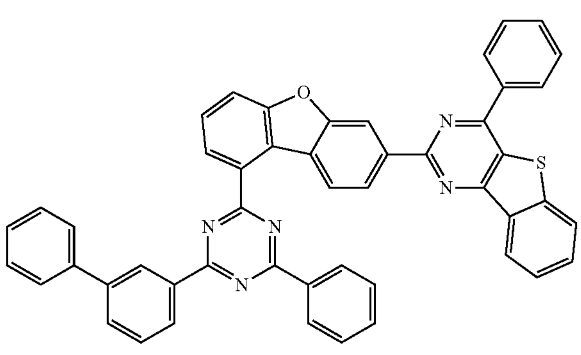
-continued
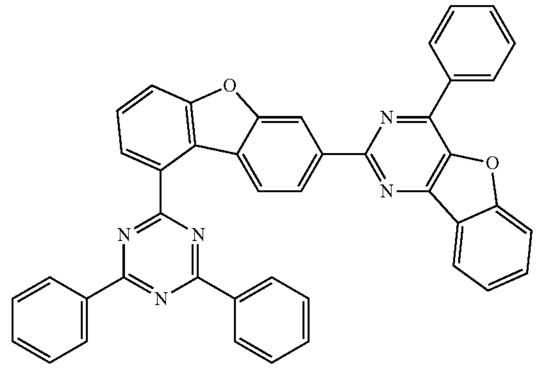
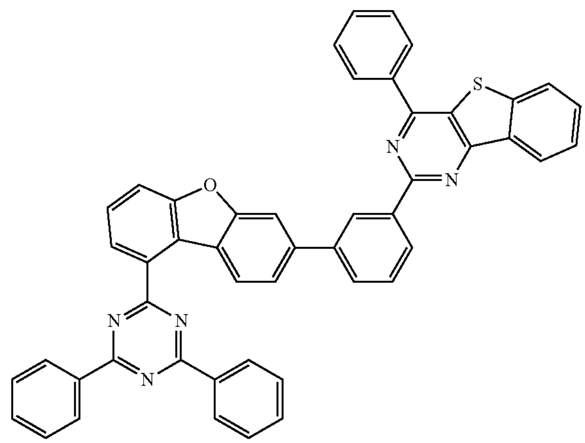
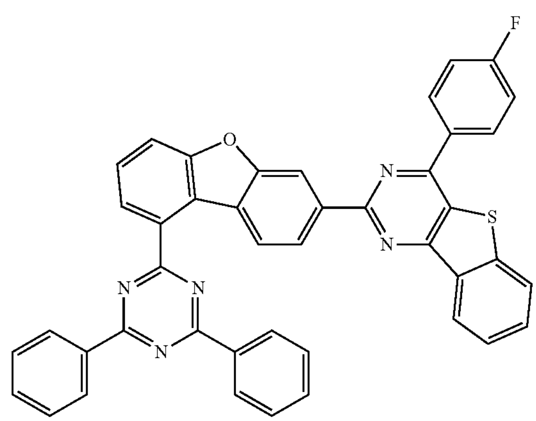
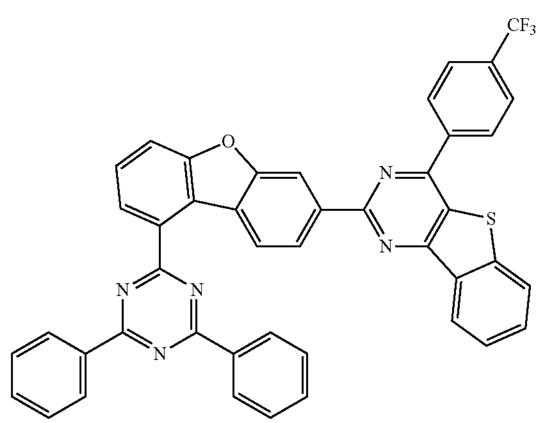

-continued
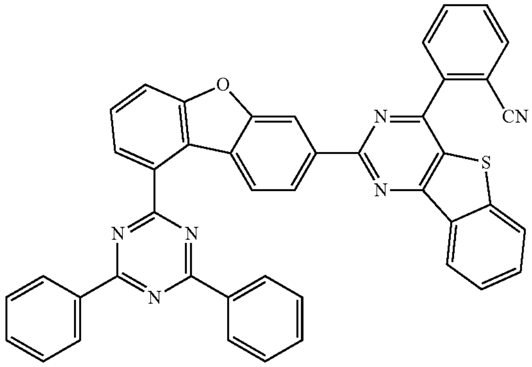
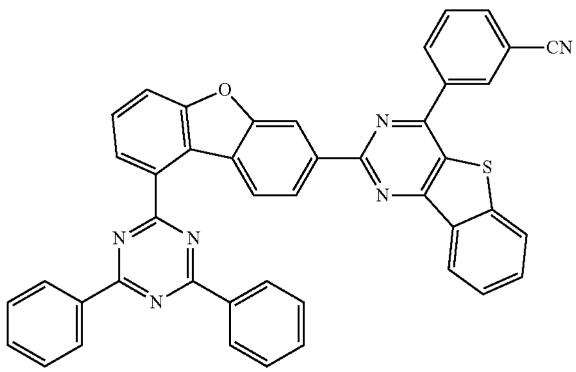
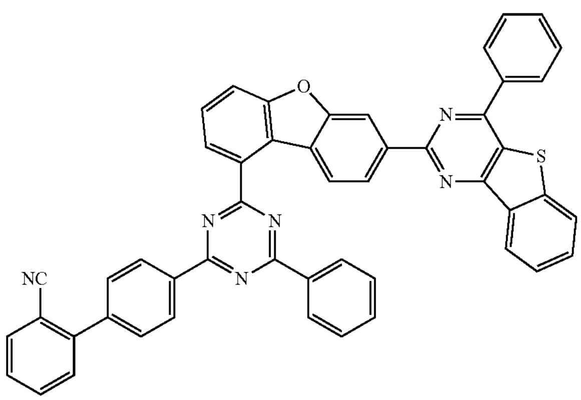
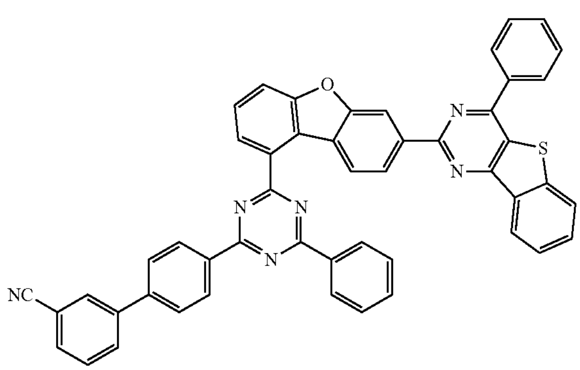
-continued
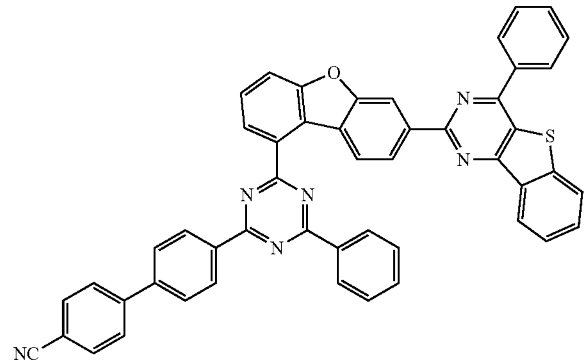
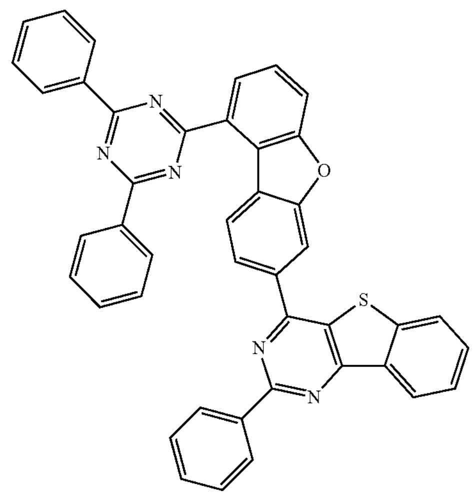
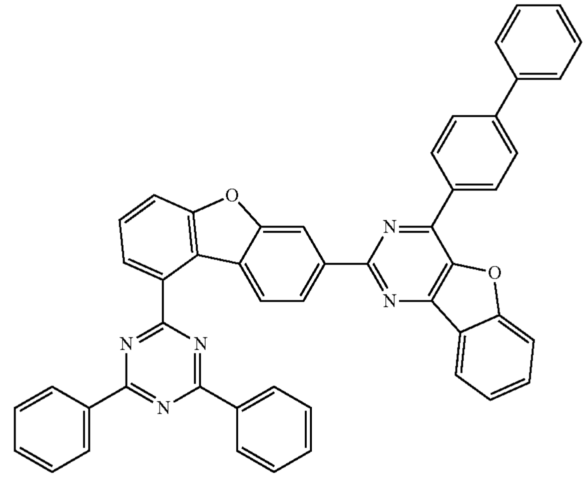

-continued
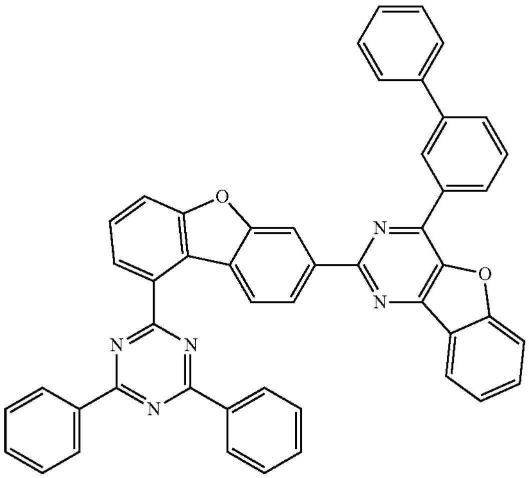
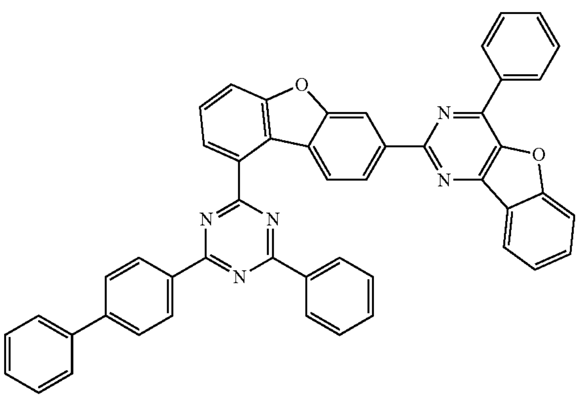
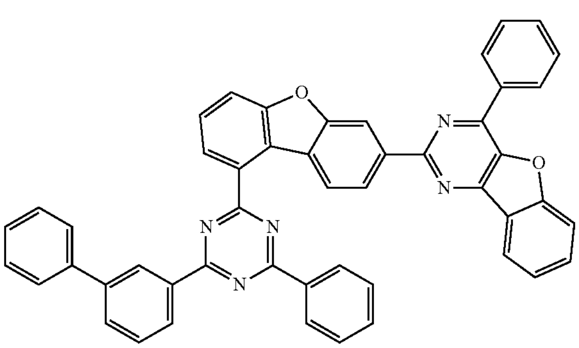
-continued
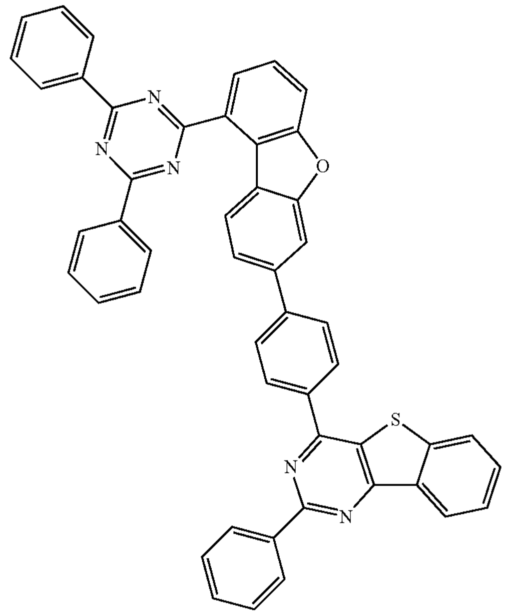
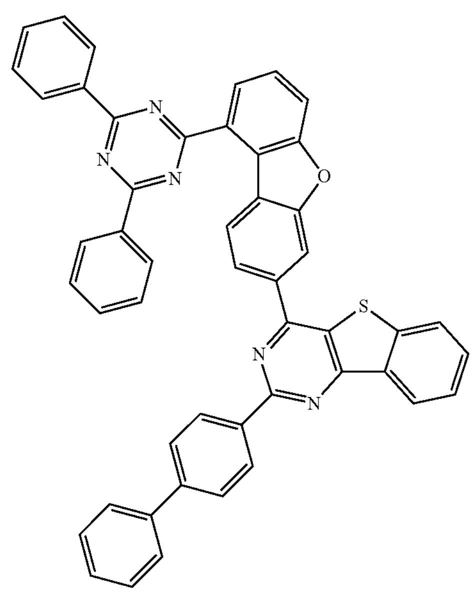

-continued
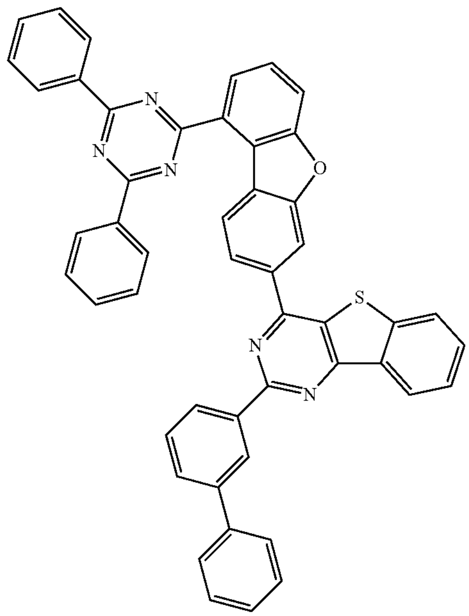
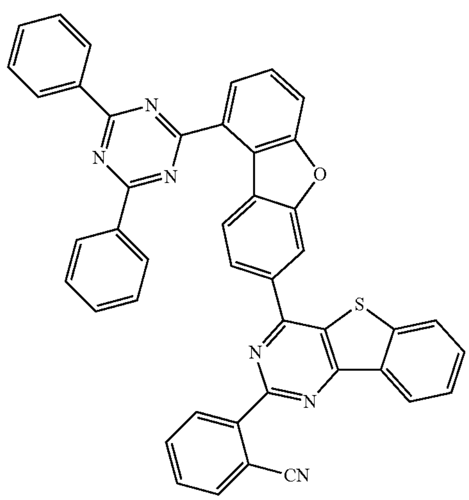
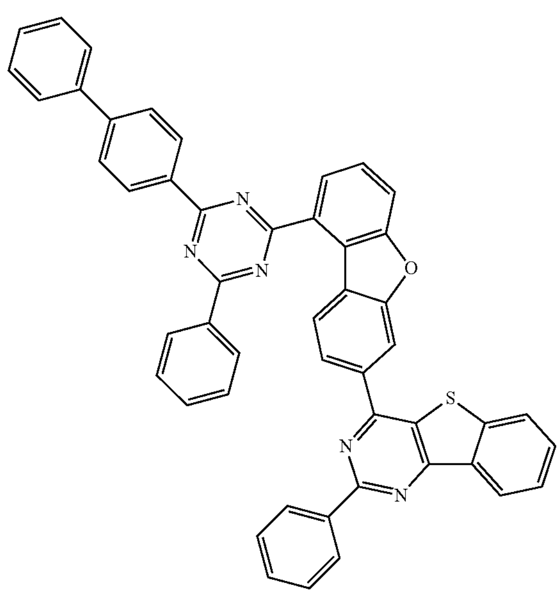
-continued
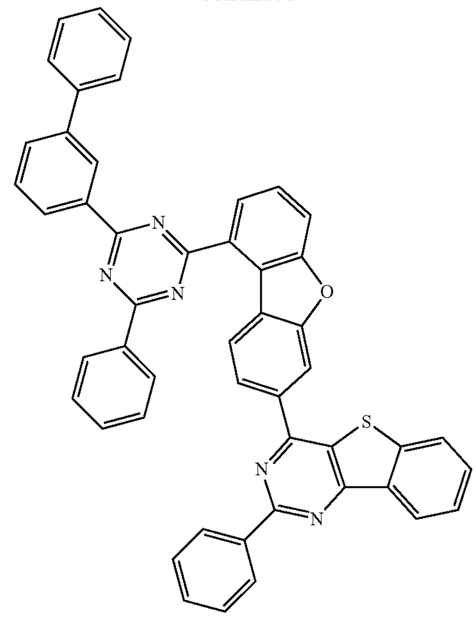
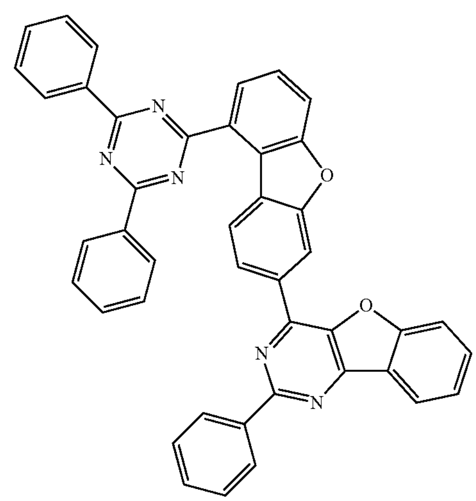
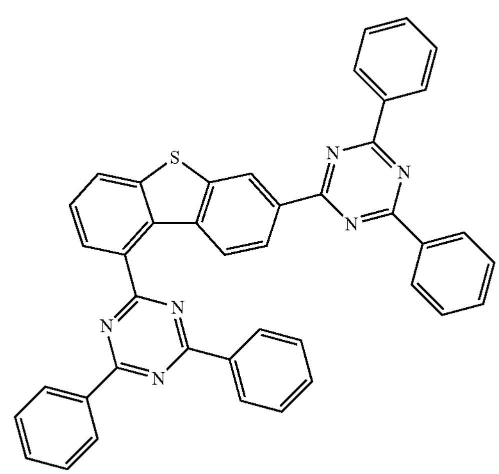

-continued
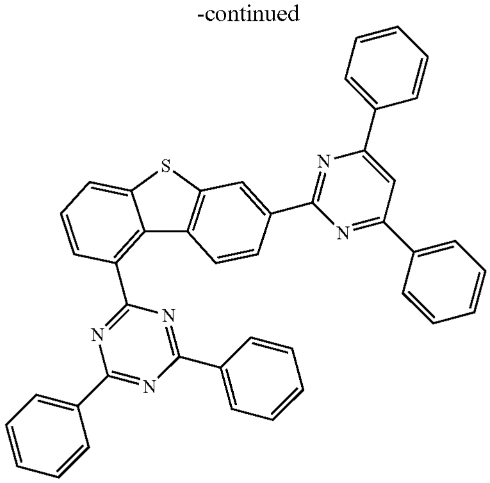
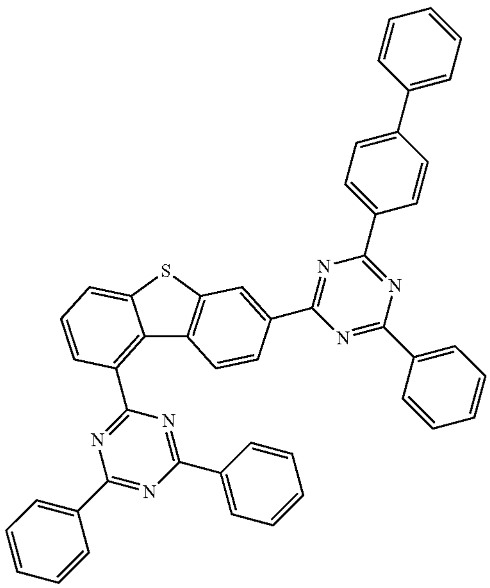
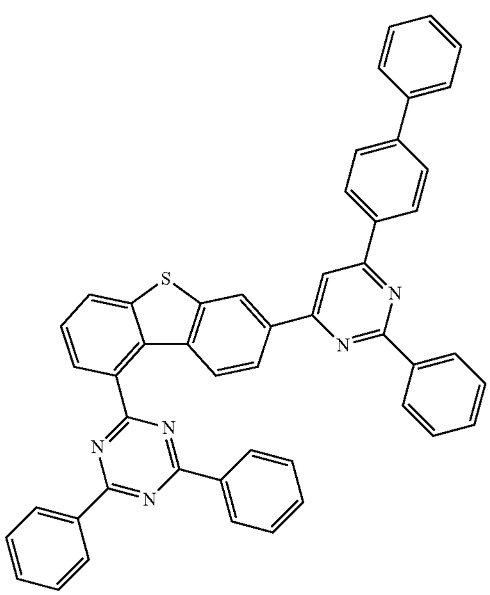
-continued
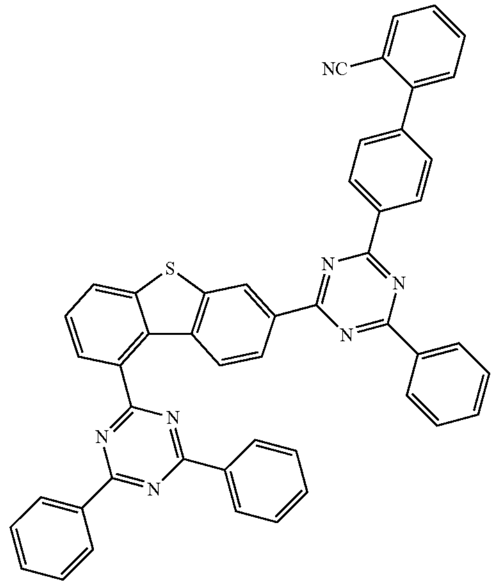
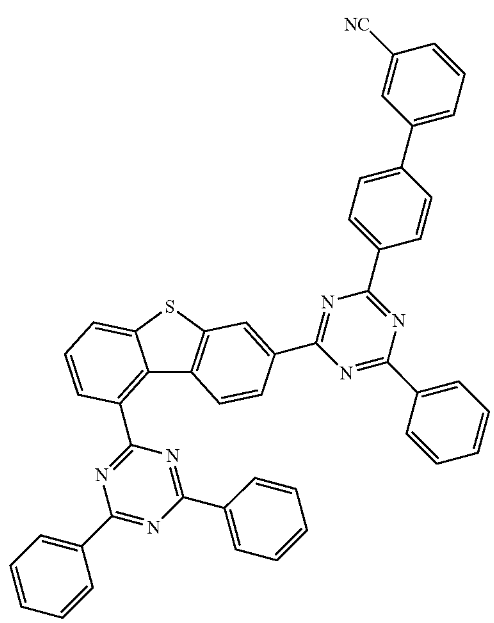

-continued
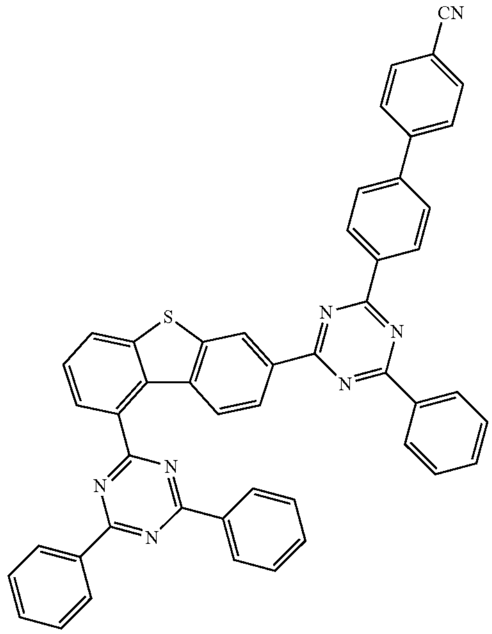
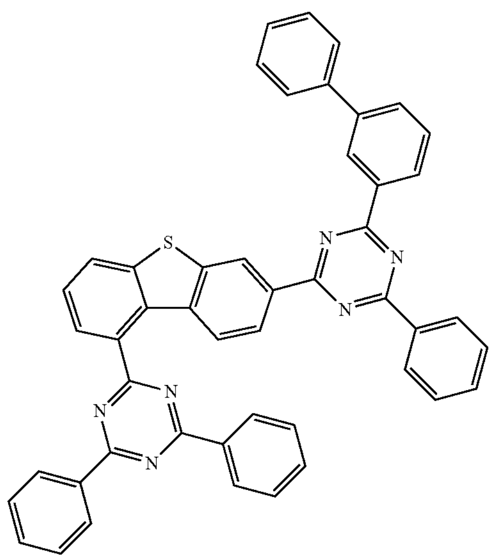
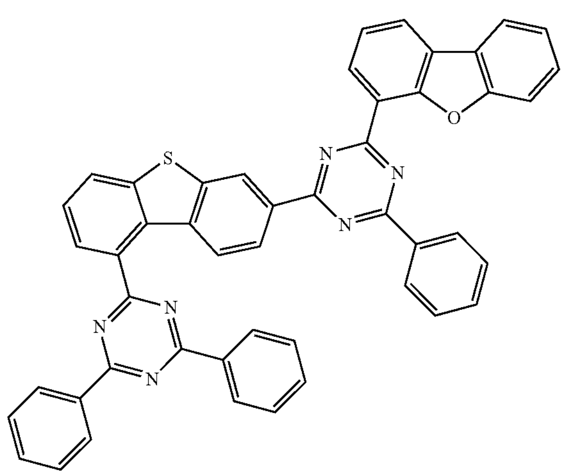
-continued
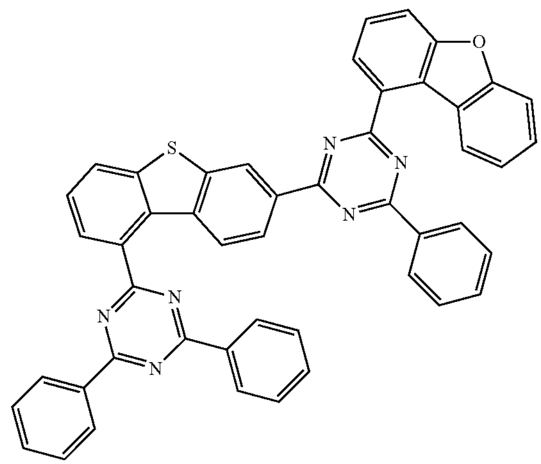
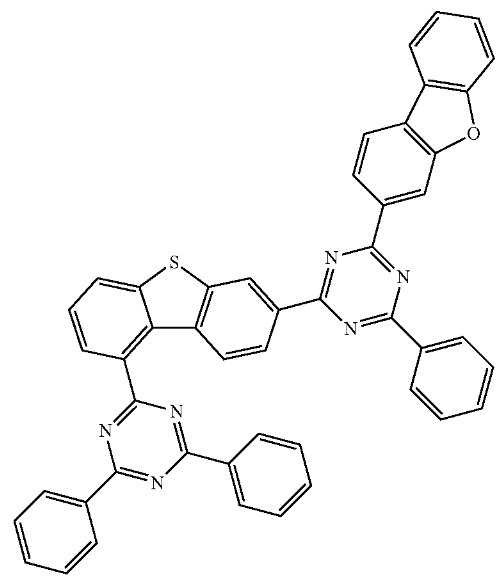
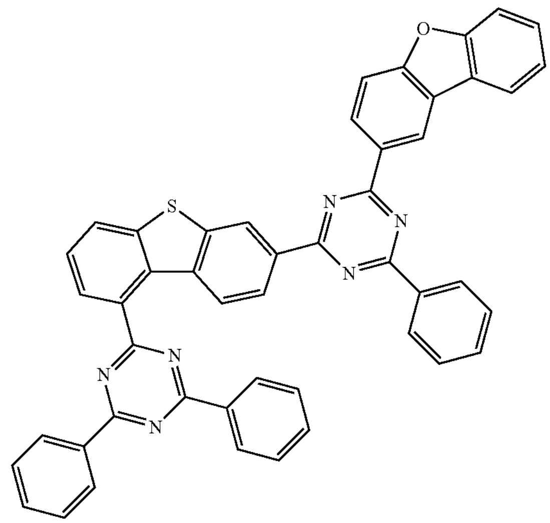

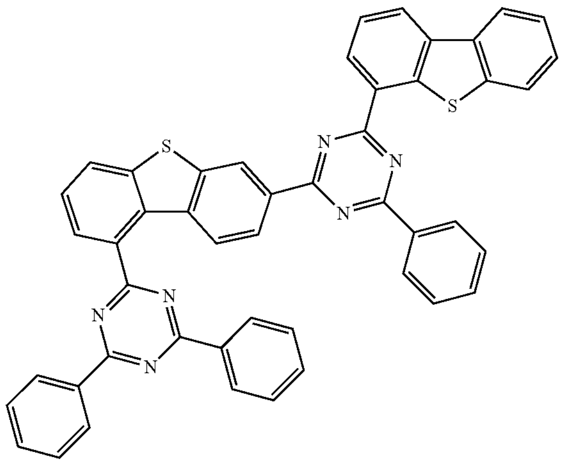
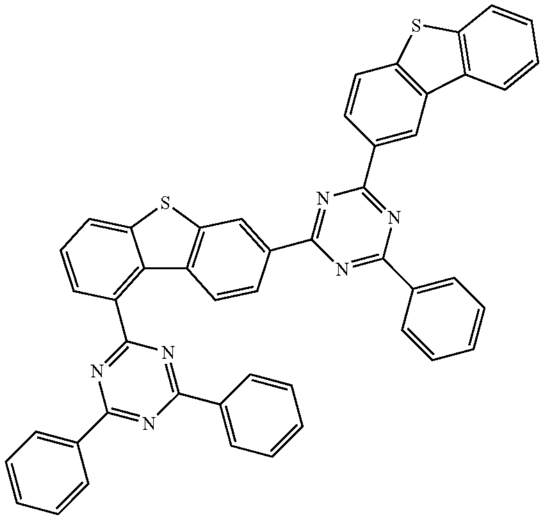
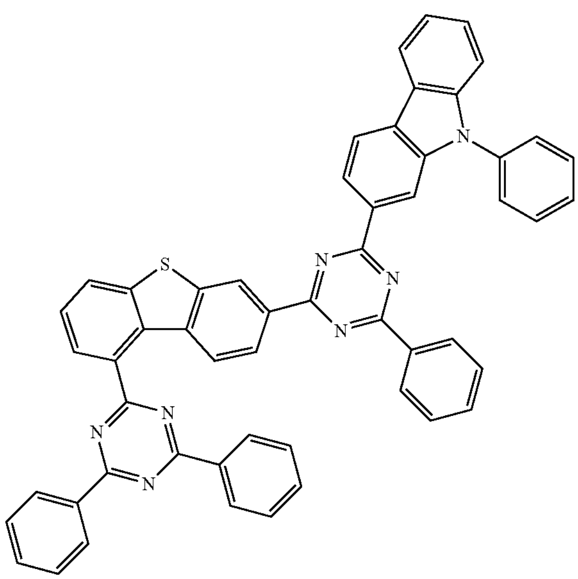
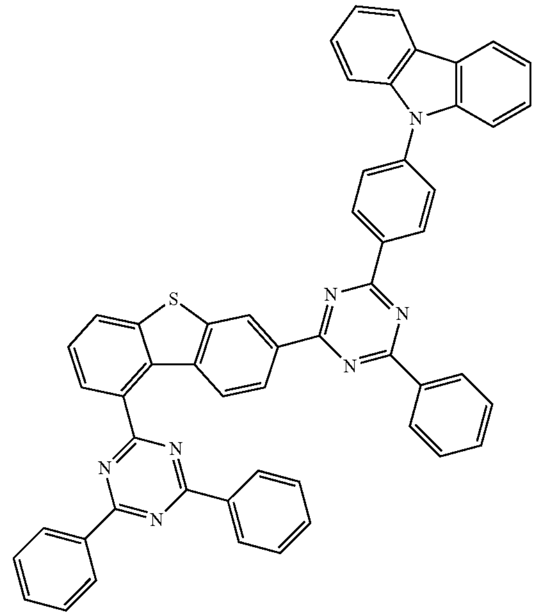
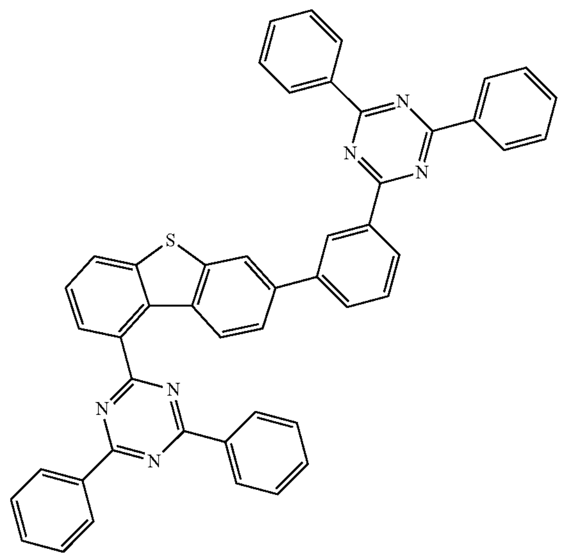
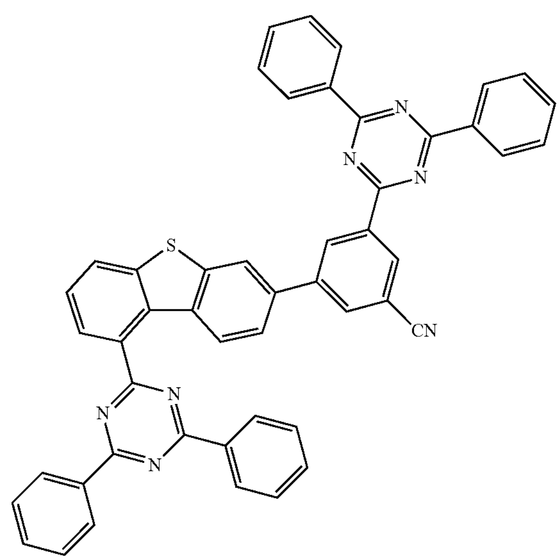

-continued
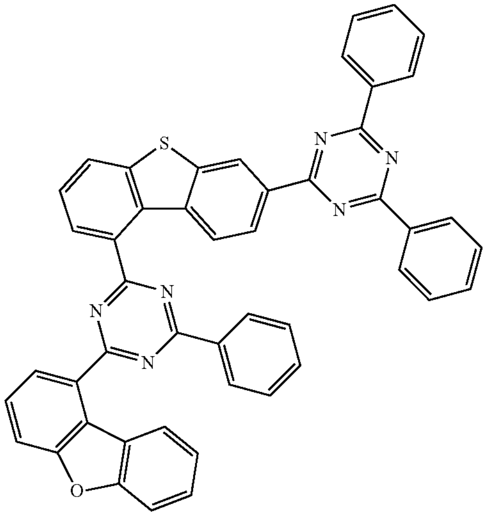
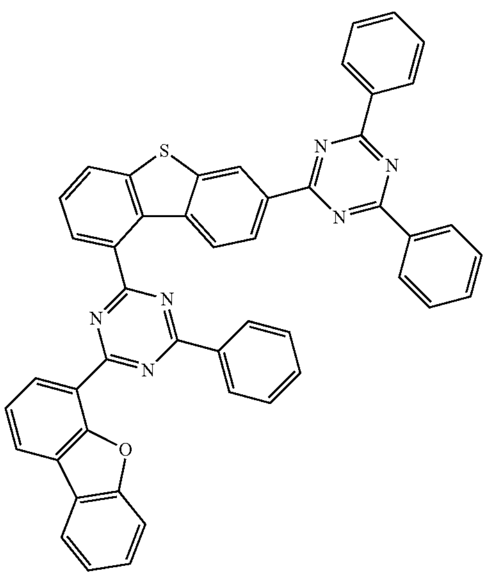
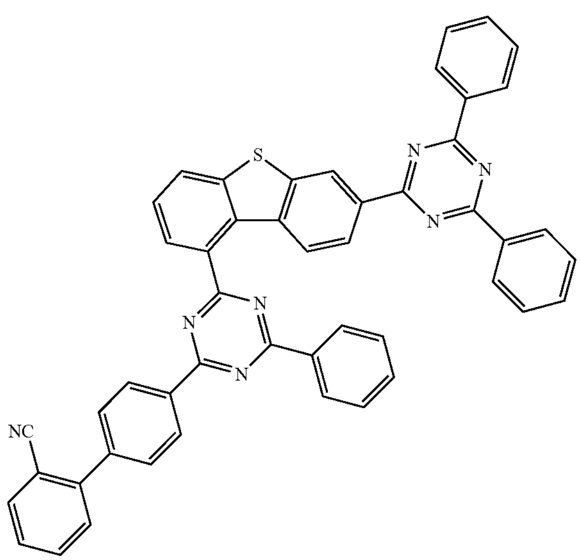
-continued
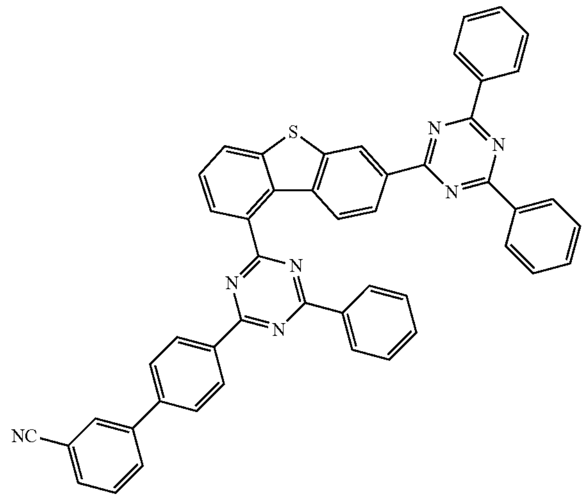
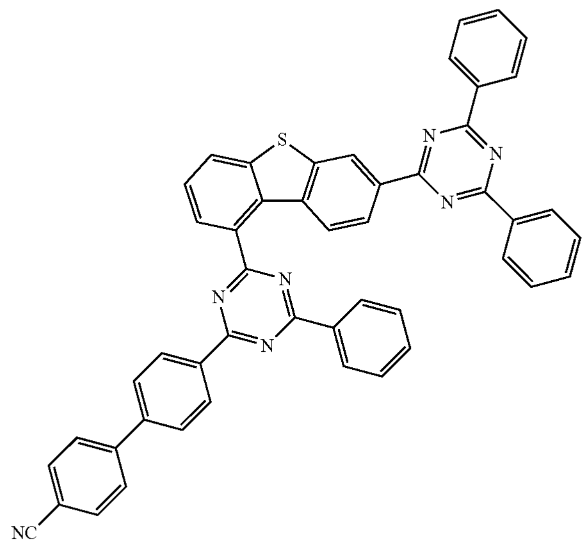
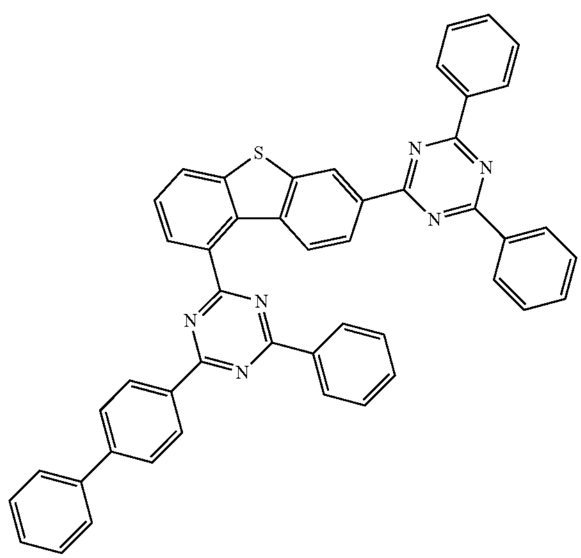

-continued
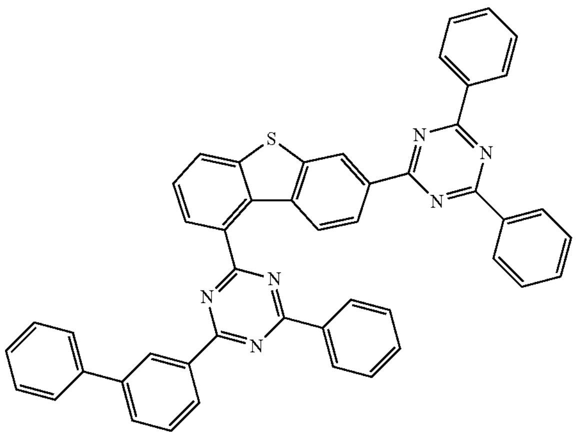
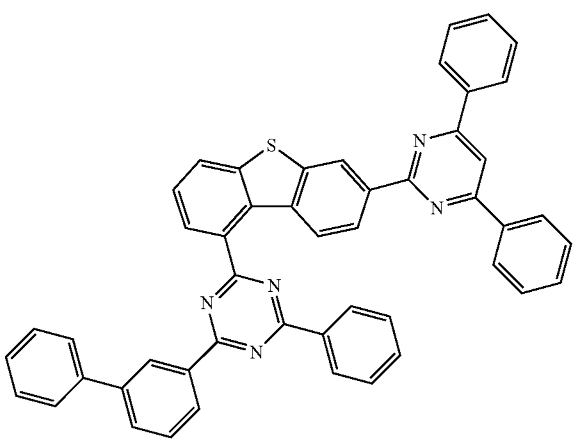
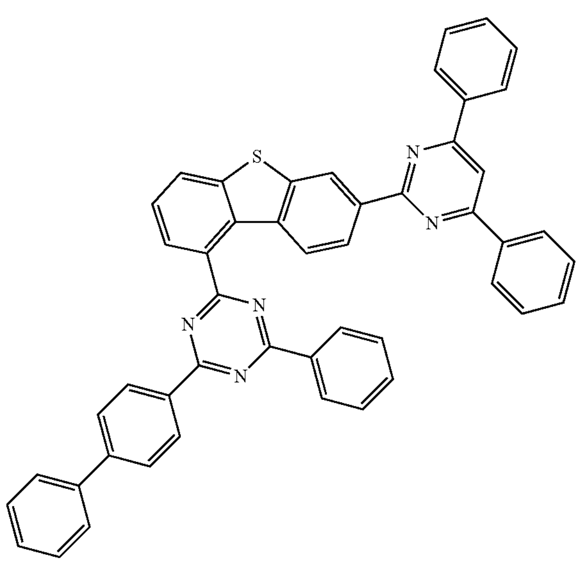
-continued
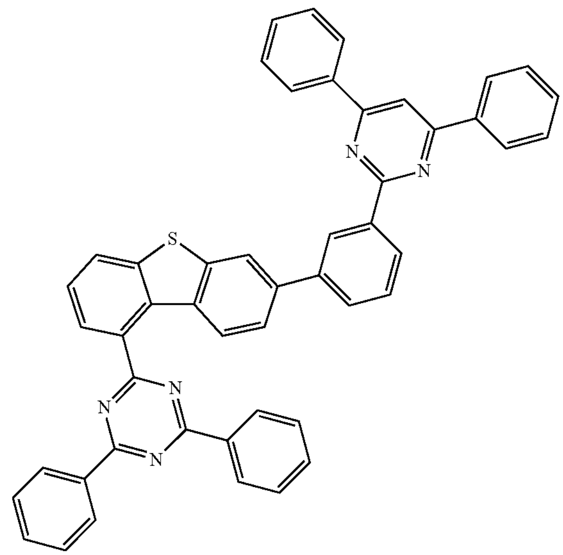
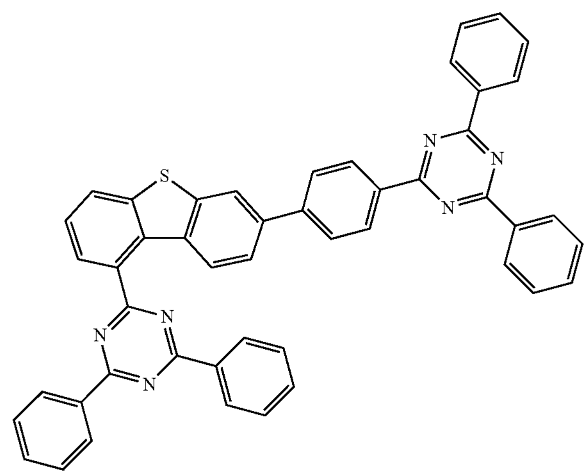
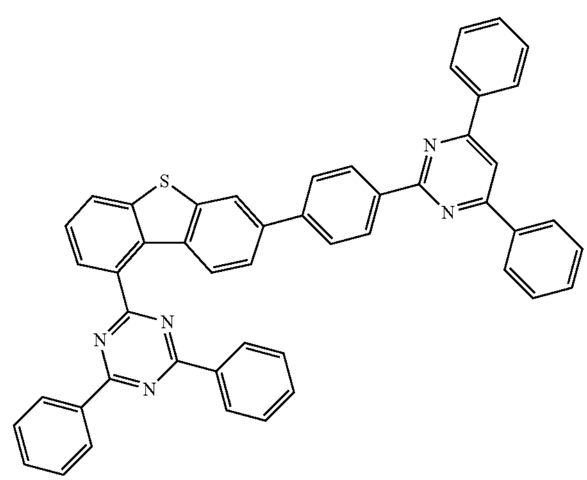

-continued
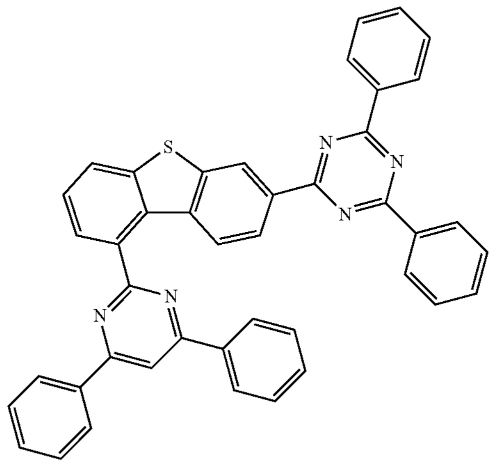
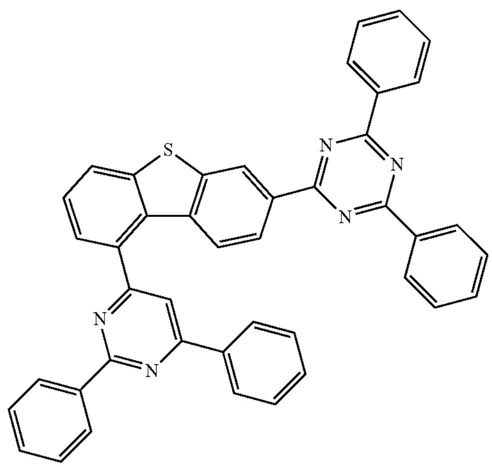
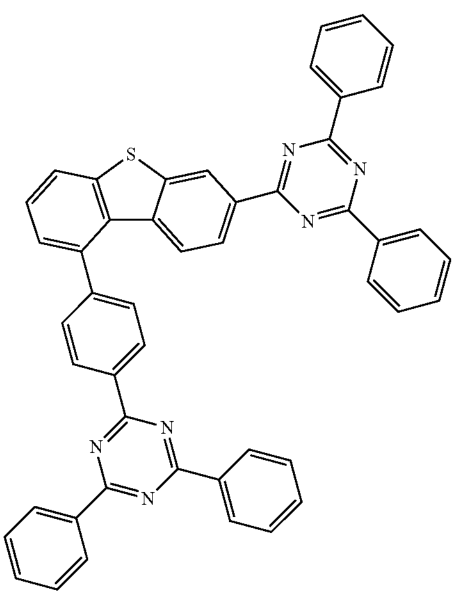
-continued
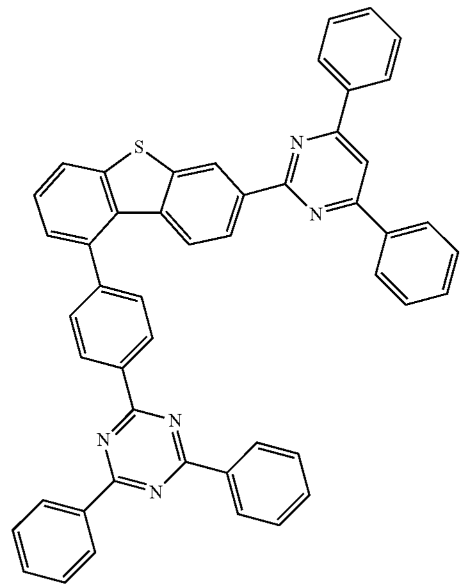
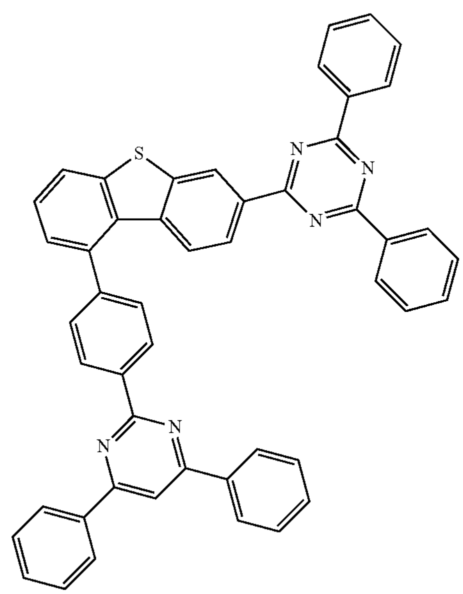

-continued
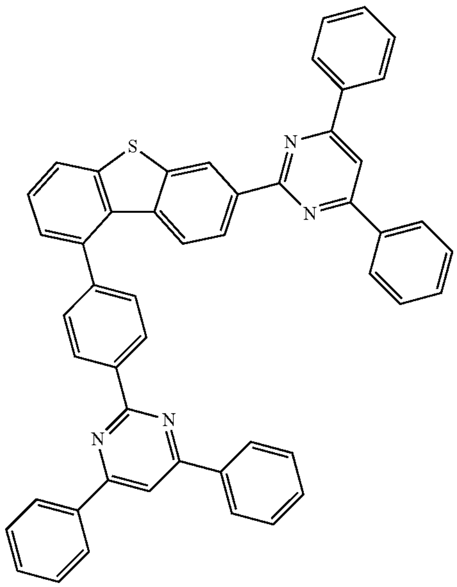
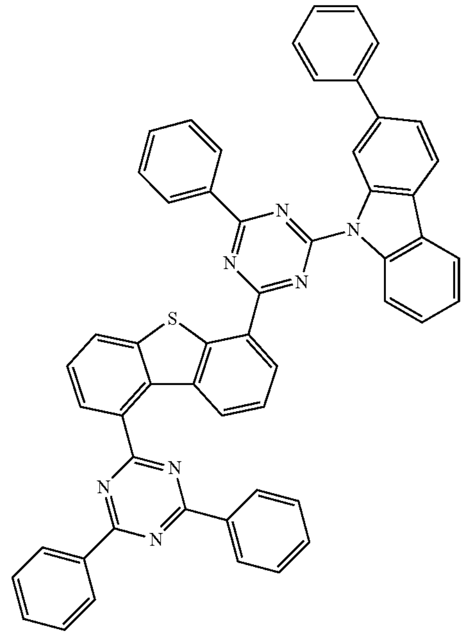
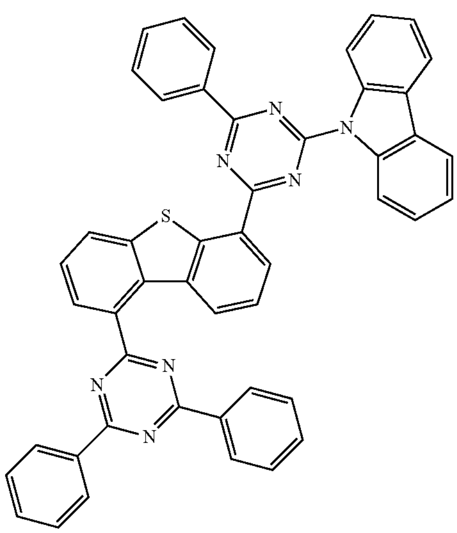
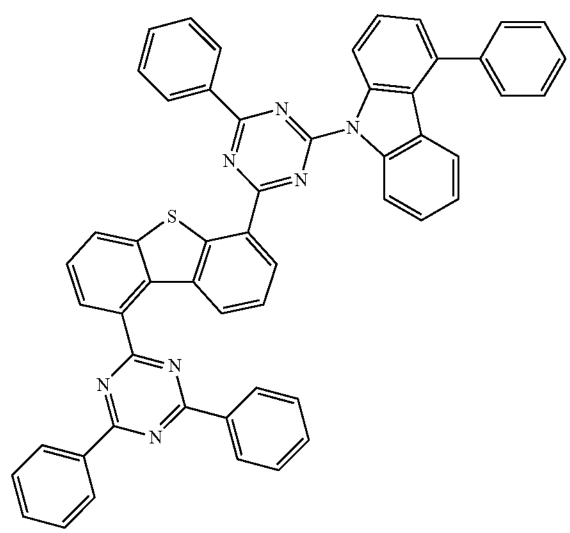

-continued
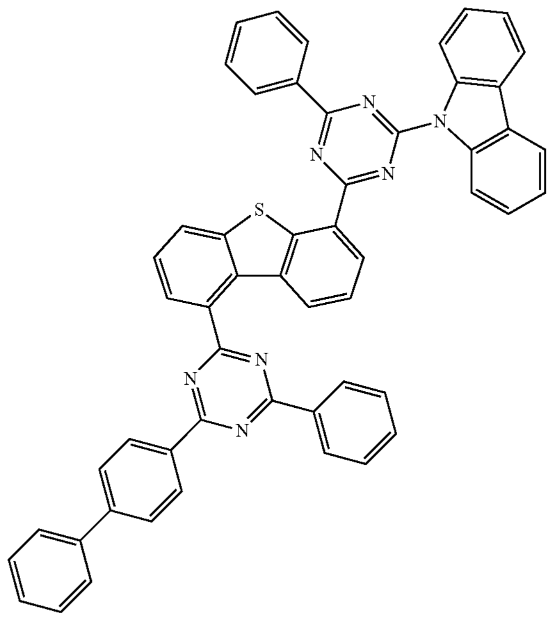
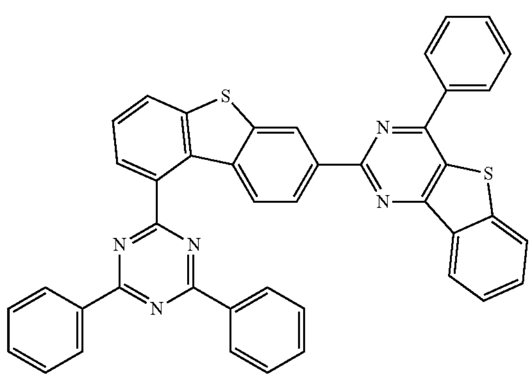
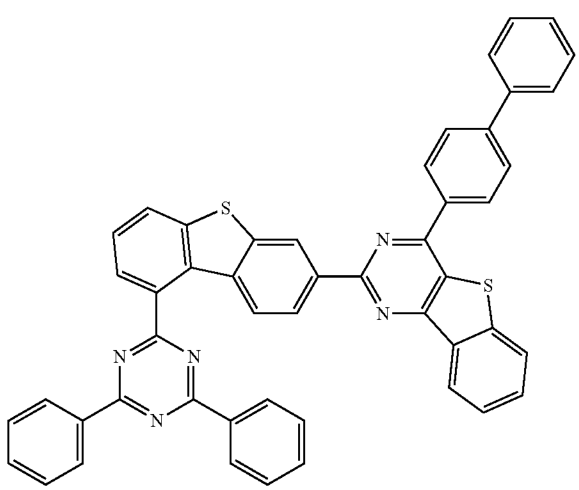
-continued
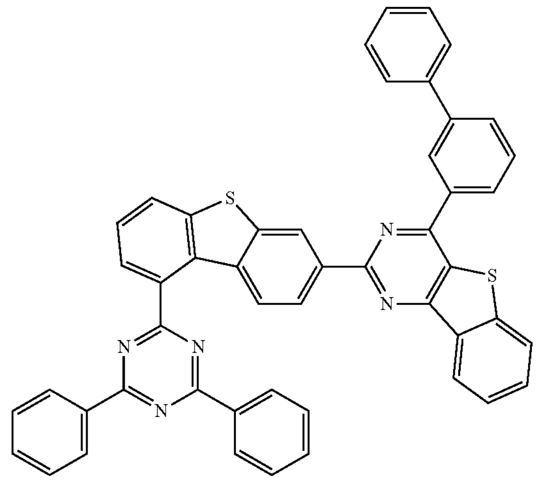
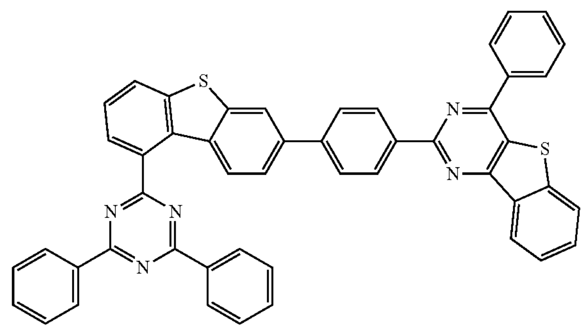
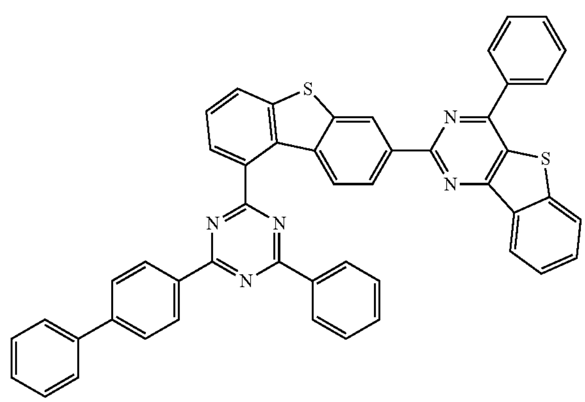
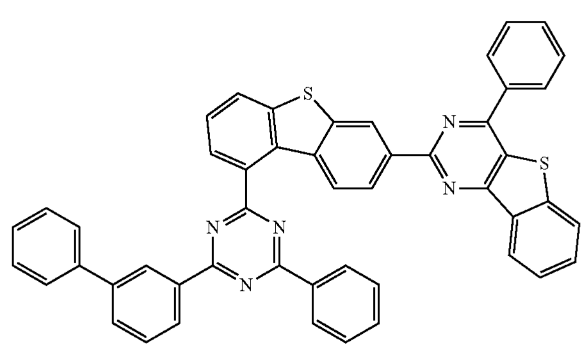

-continued
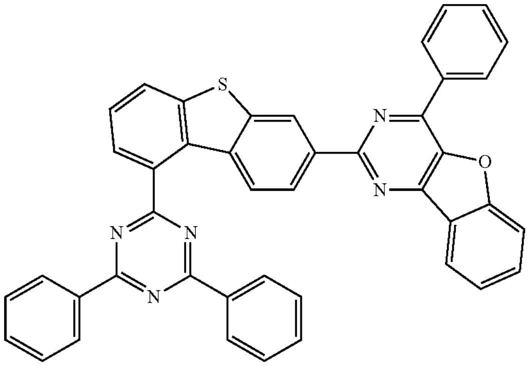
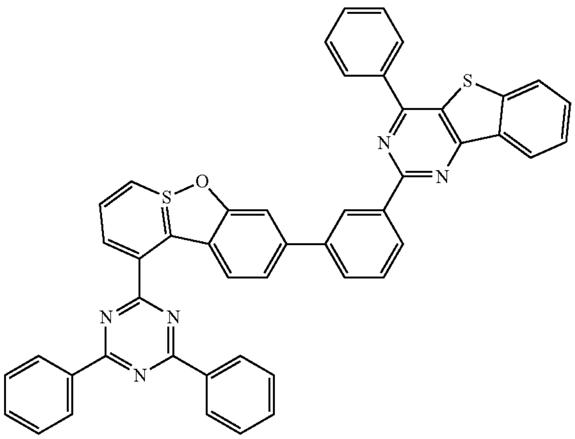
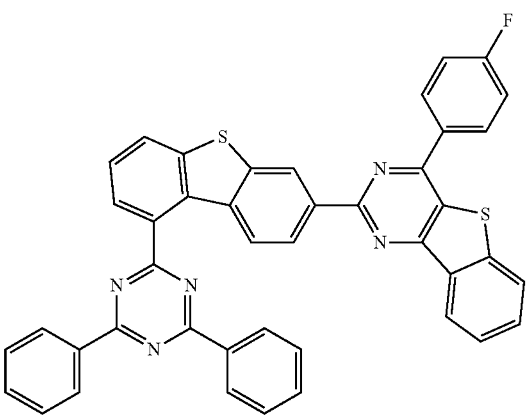
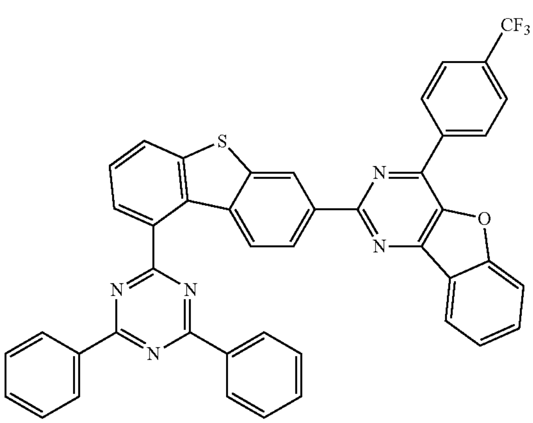
-continued
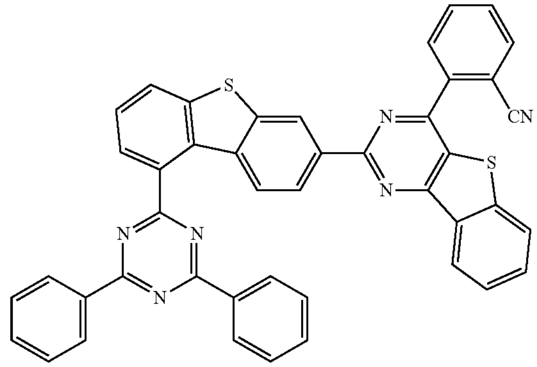
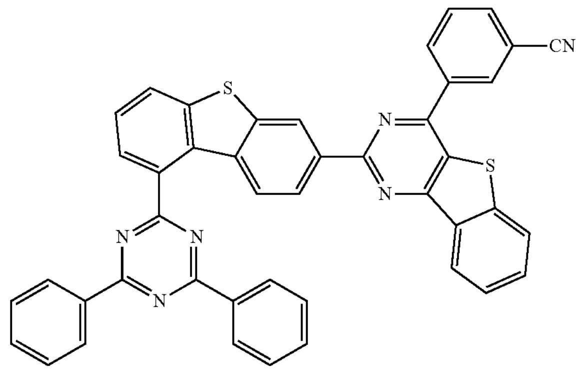
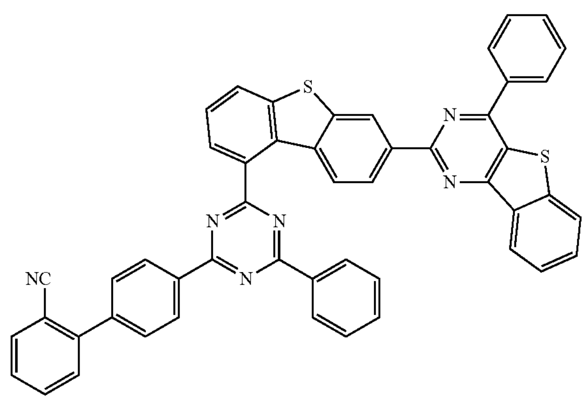
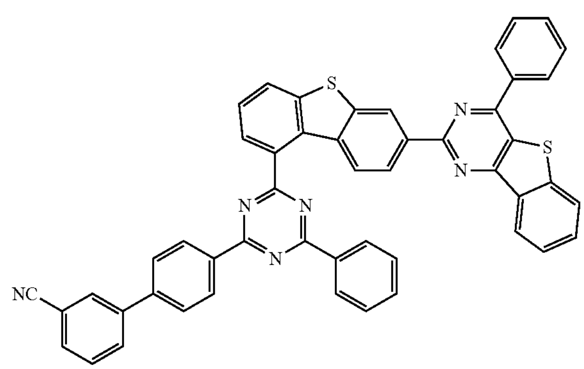

-continued
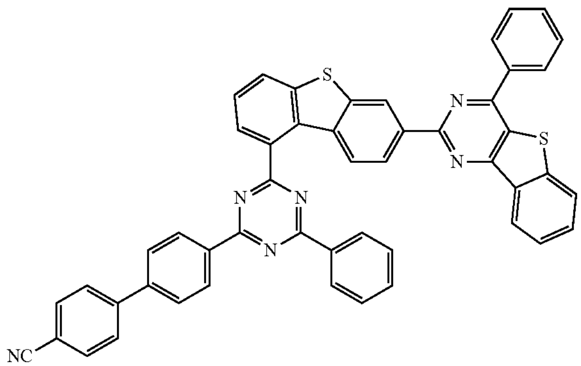
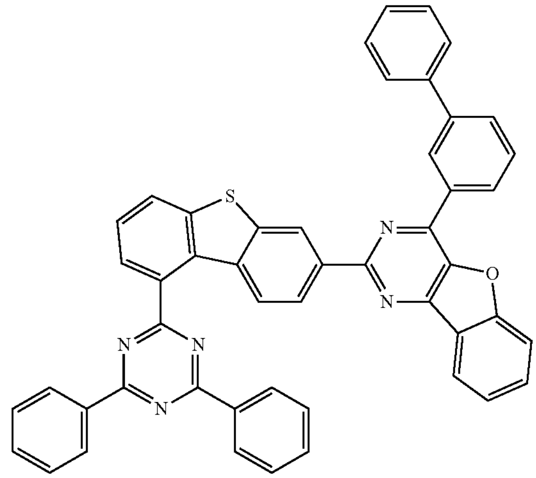
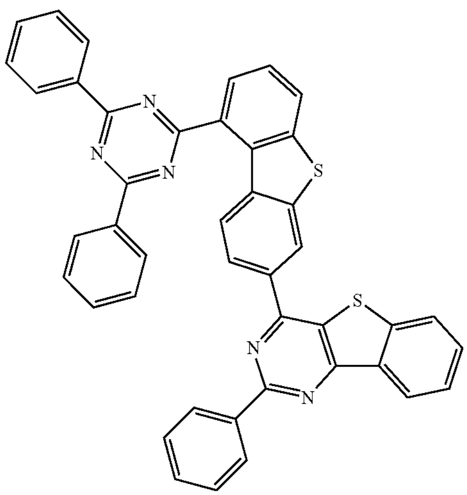
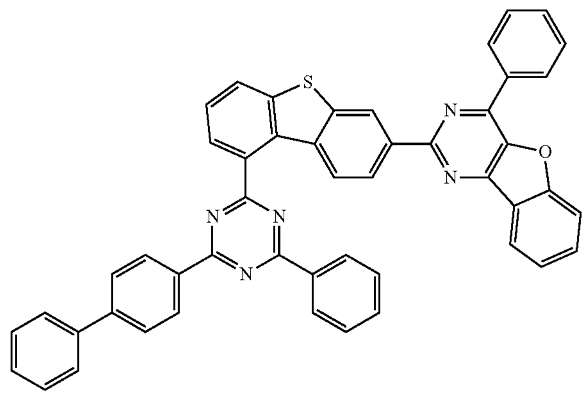
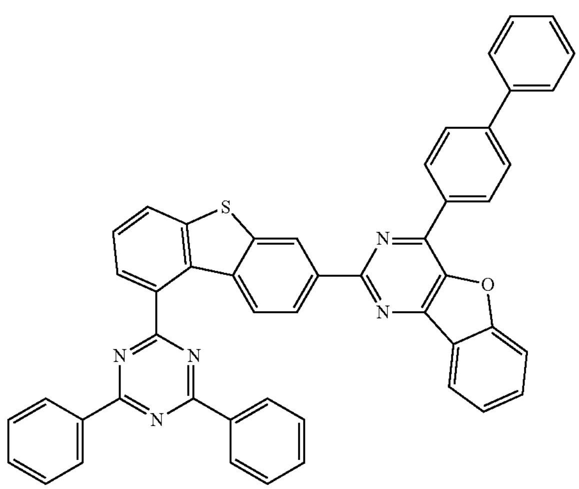
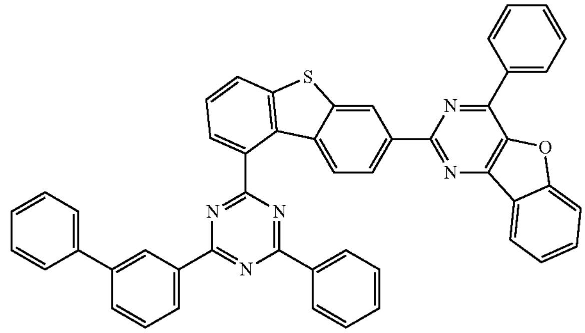

-continued
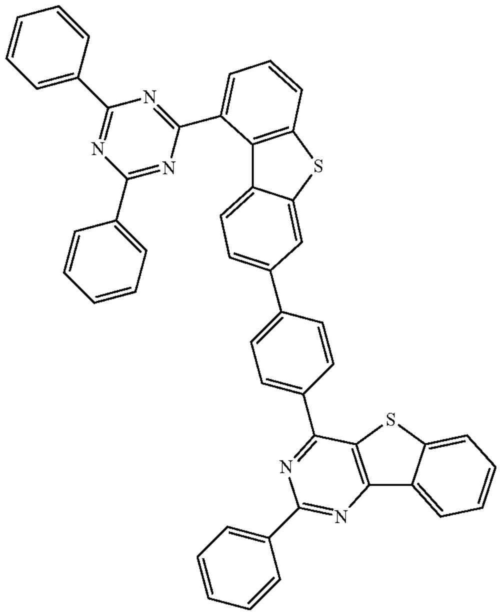
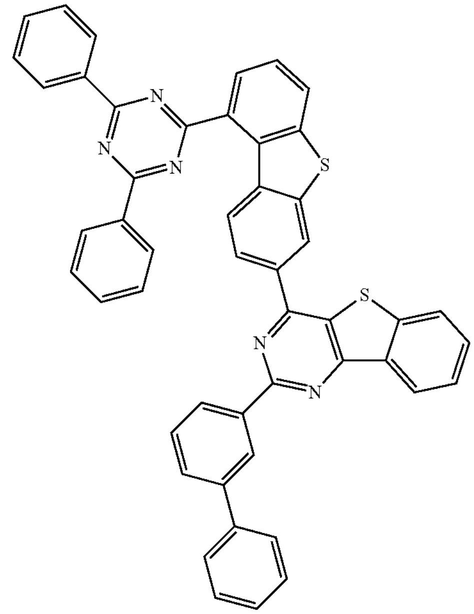
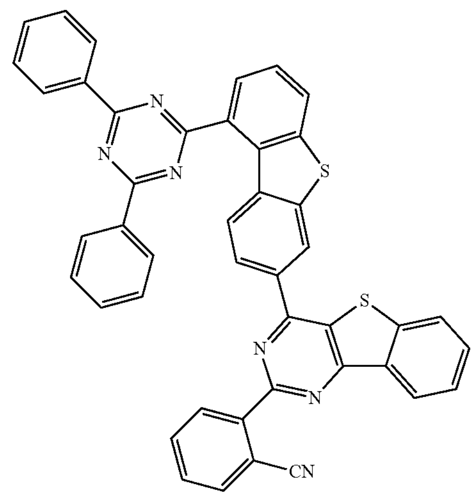
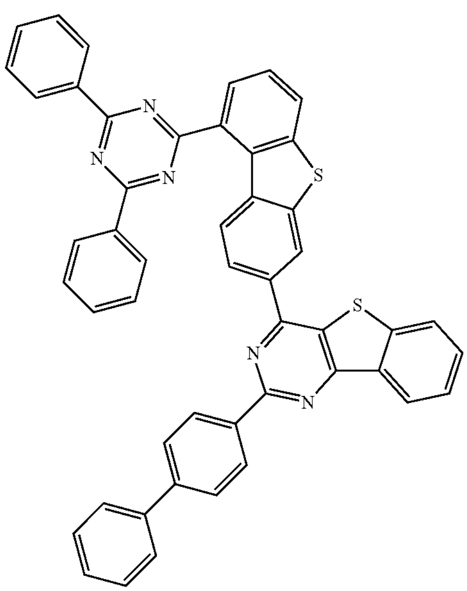
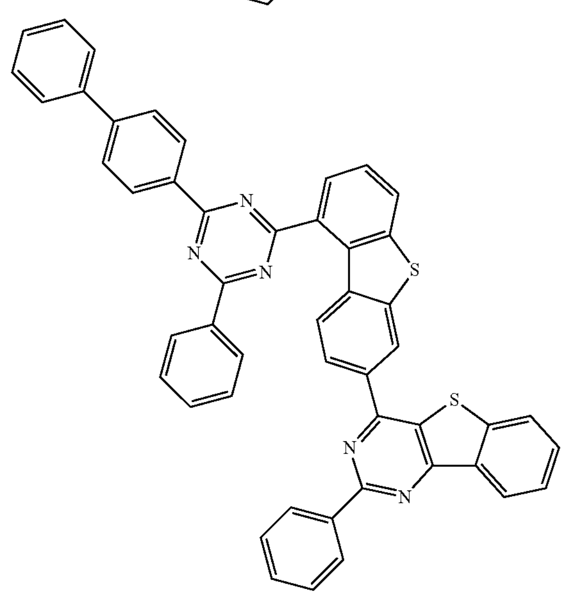

-continued
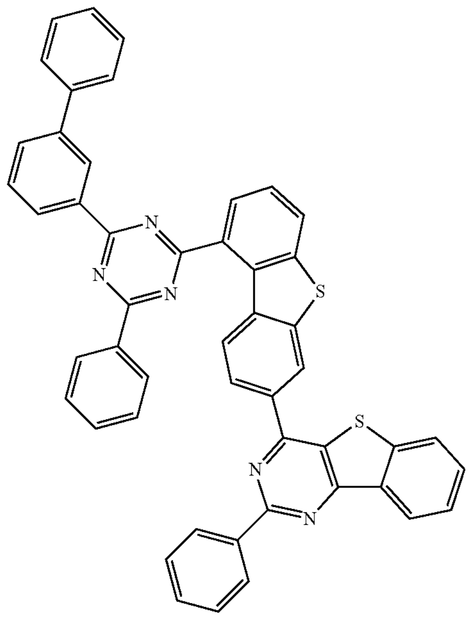
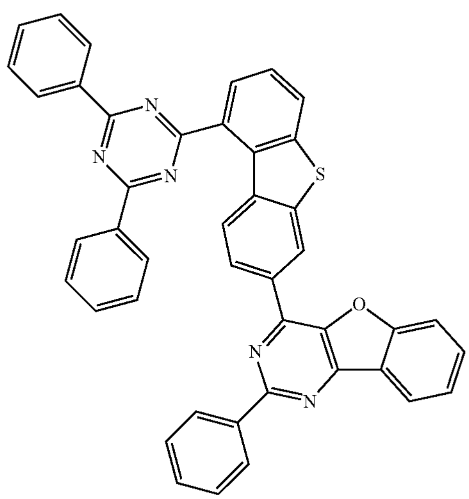
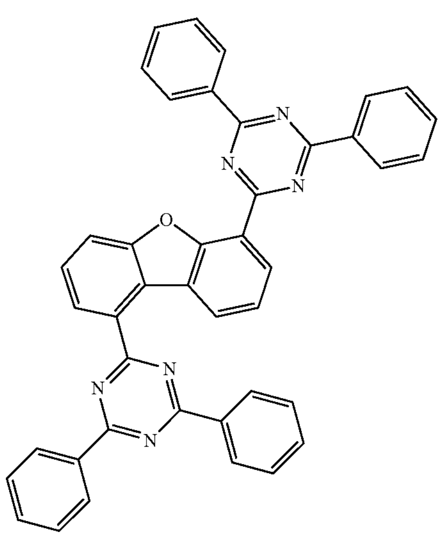
-continued
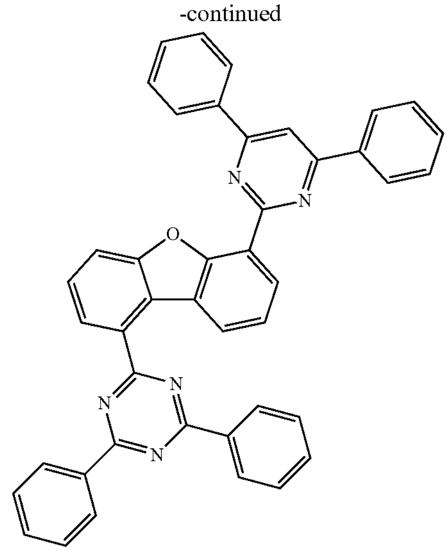
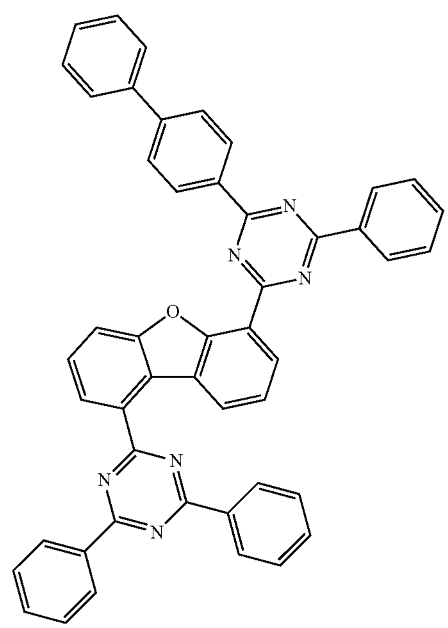

-continued
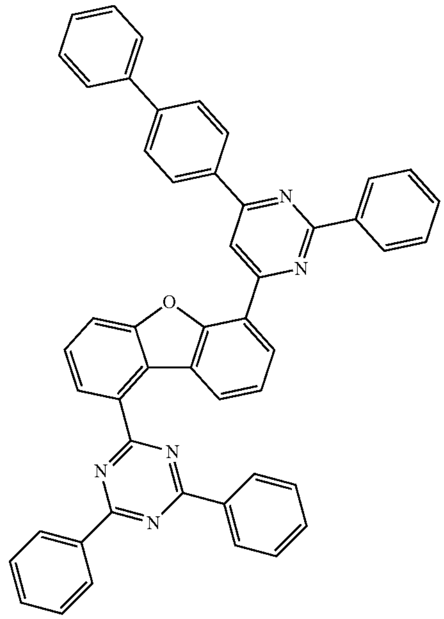
-continued
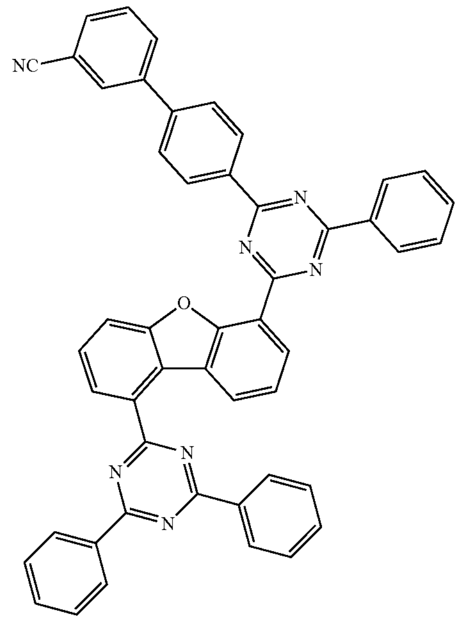
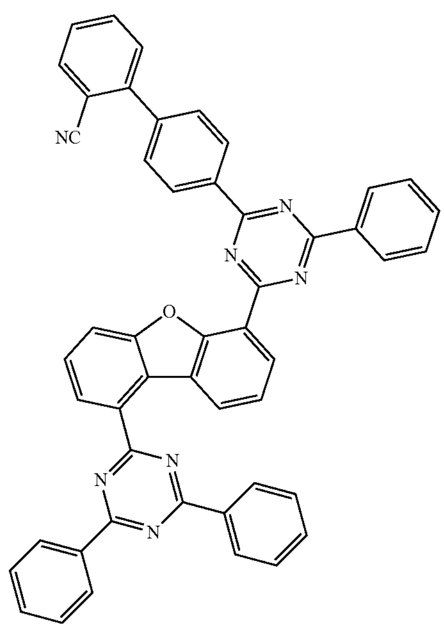
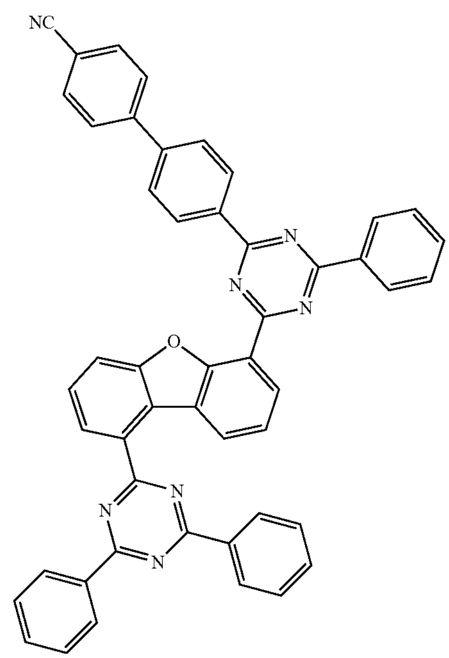

-continued
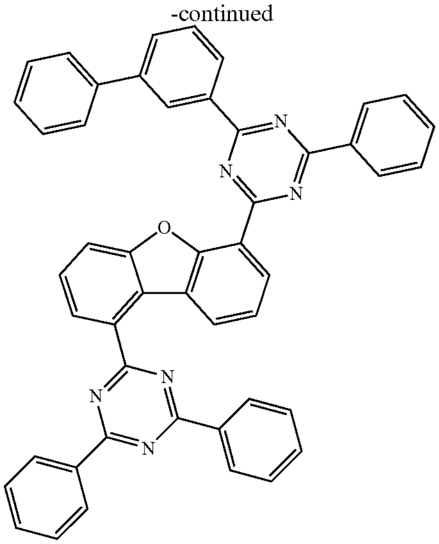
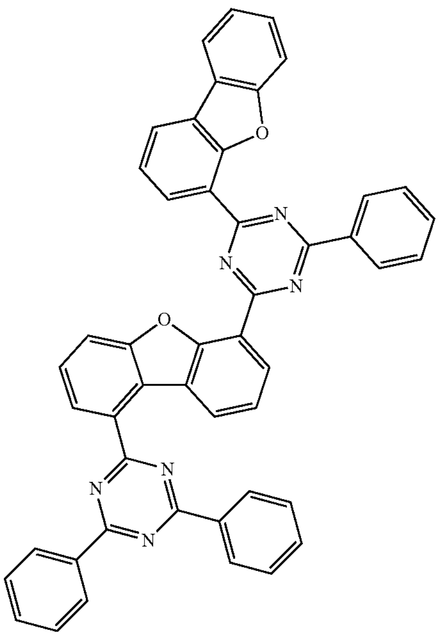
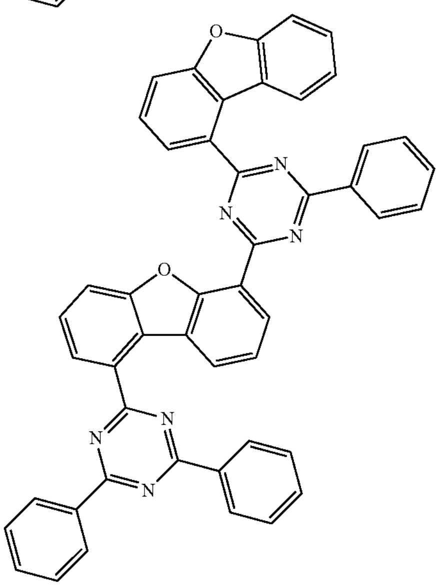
-continued
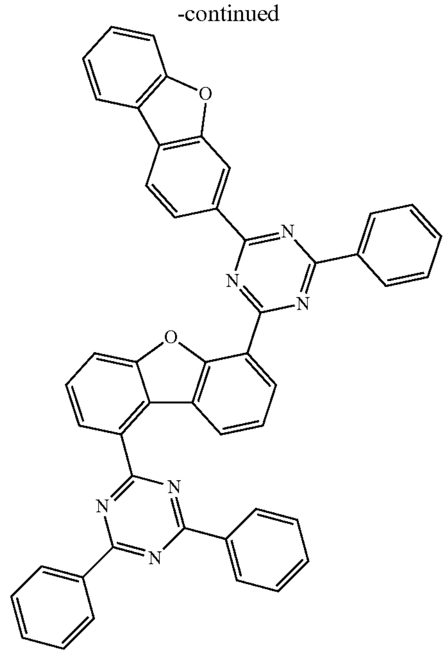
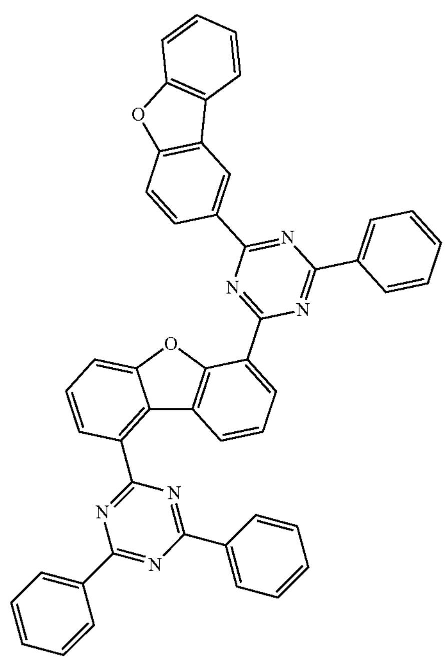

-continued
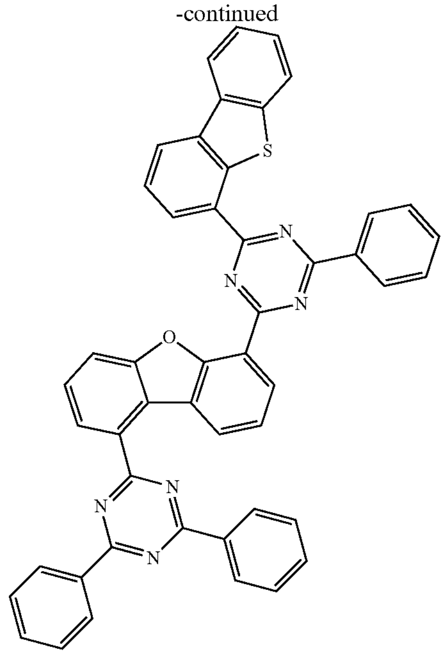
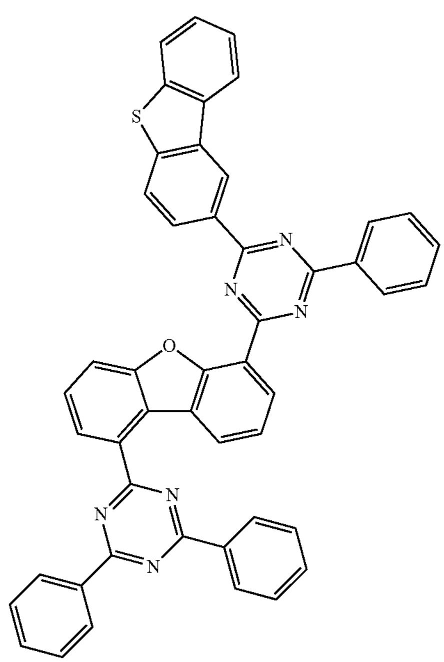
-continued
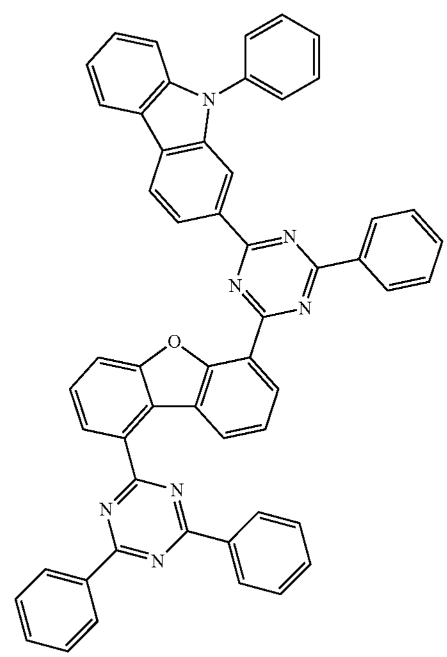
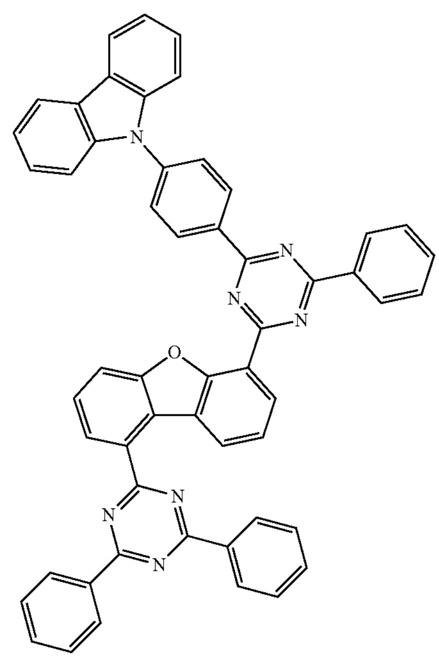

-continued
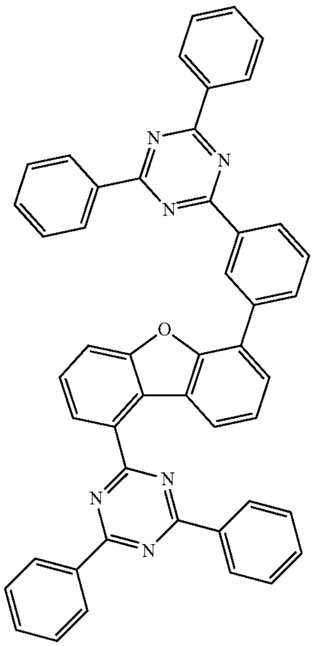
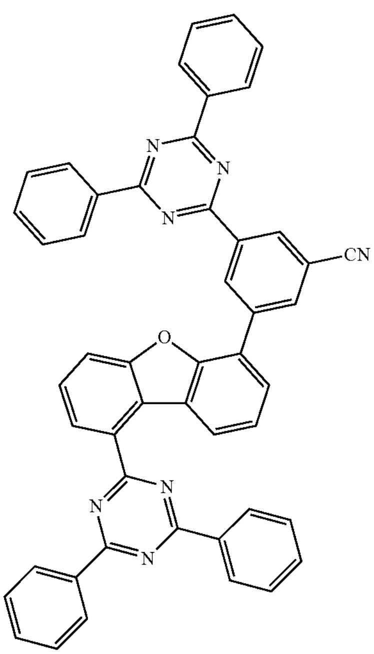
-continued
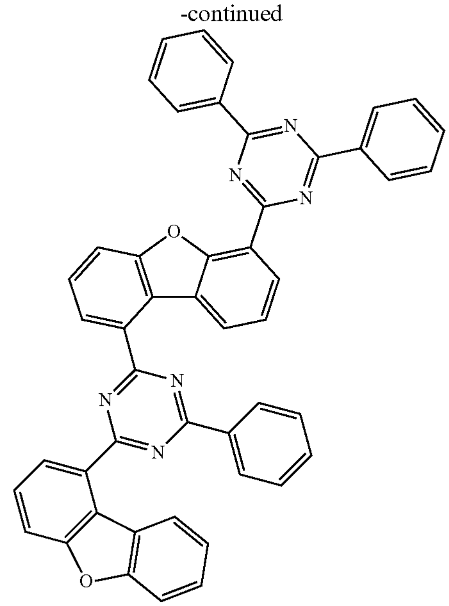
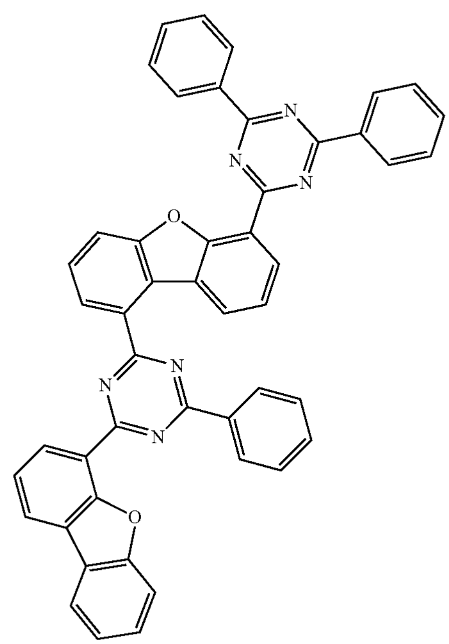

-continued
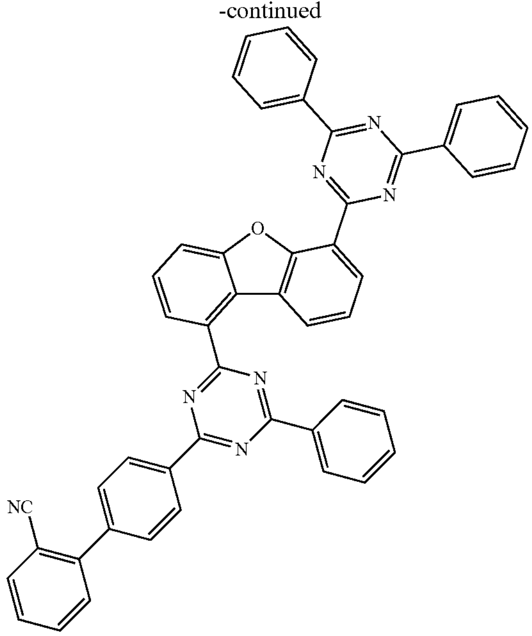
-continued
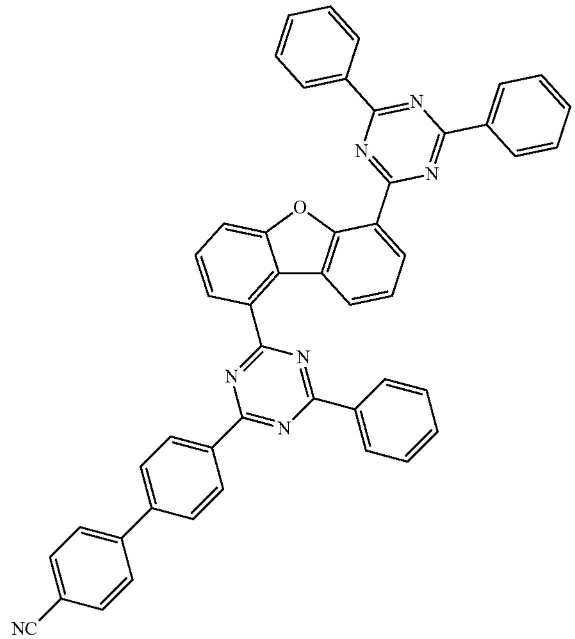
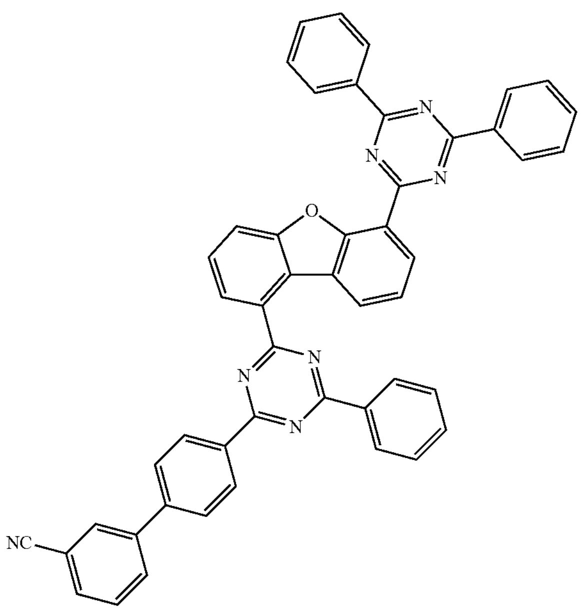
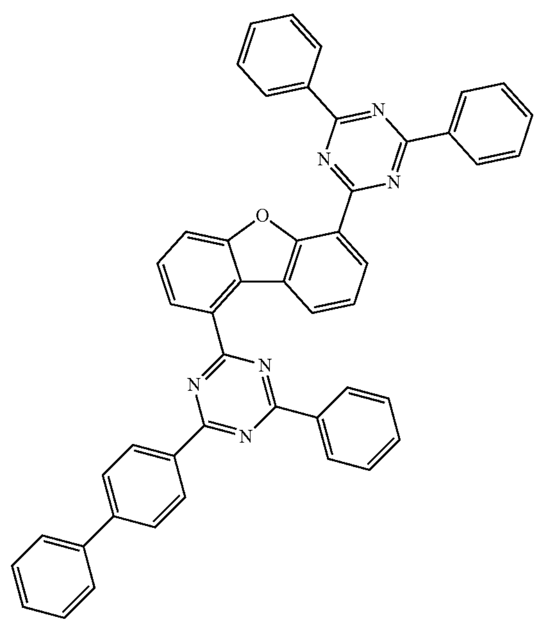

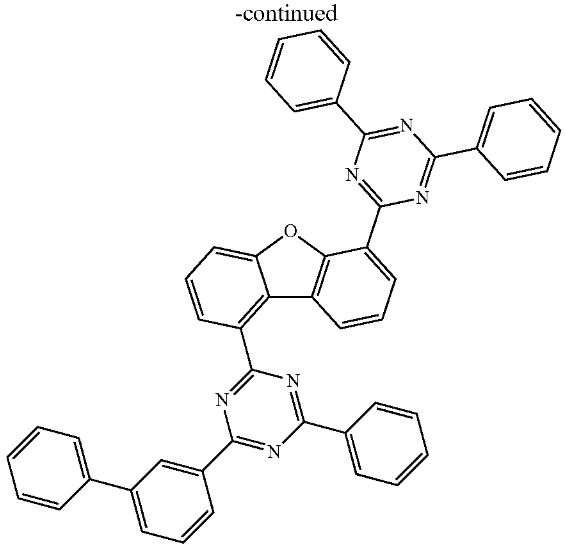
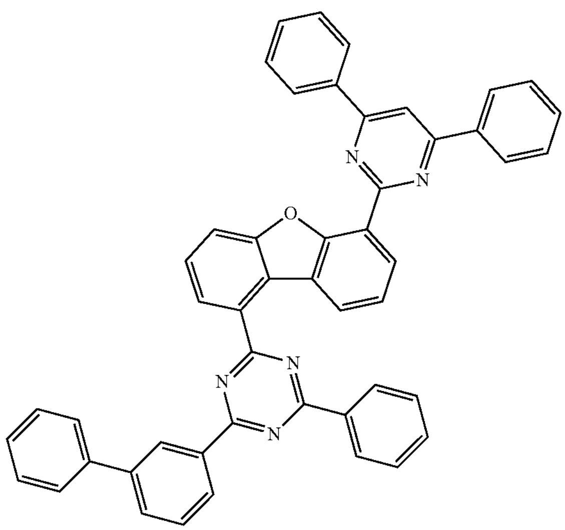
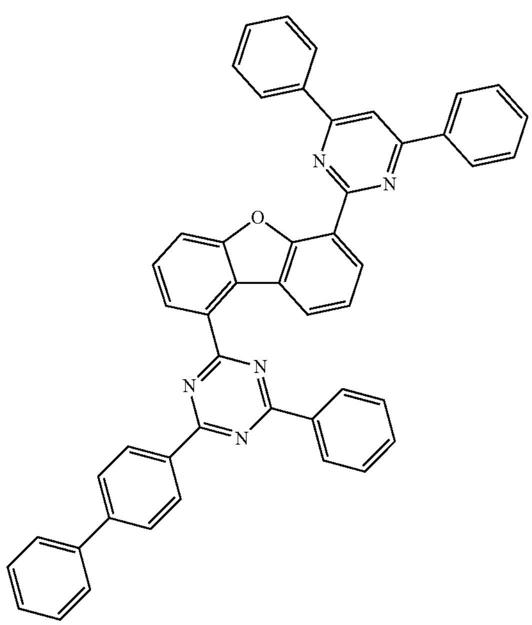
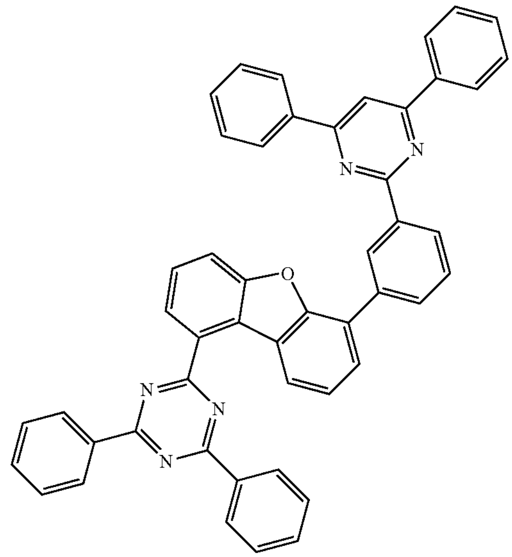
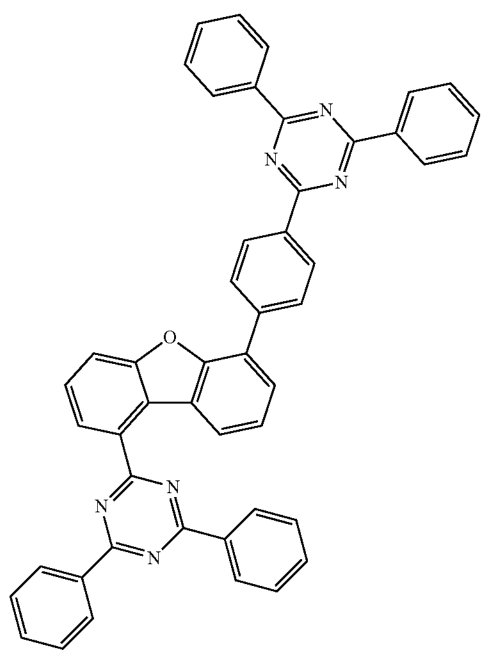

-continued
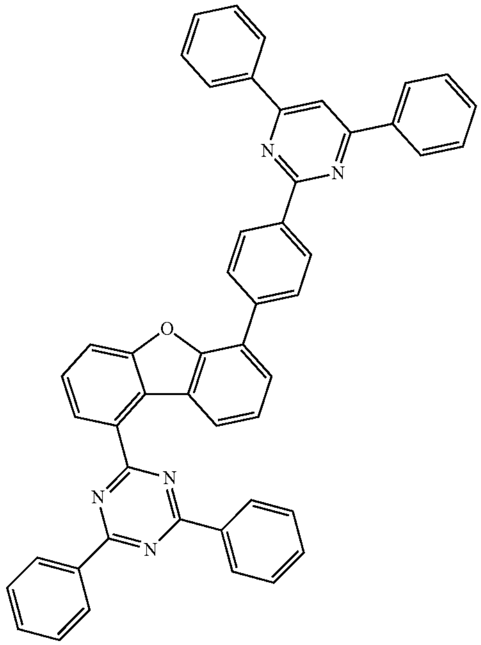
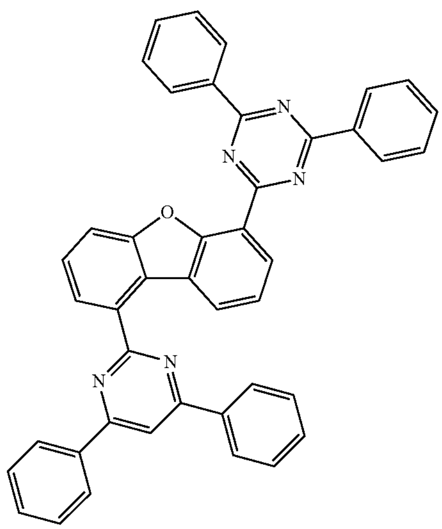
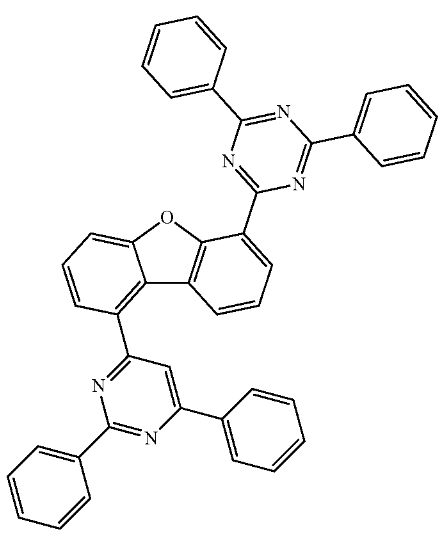
-continued
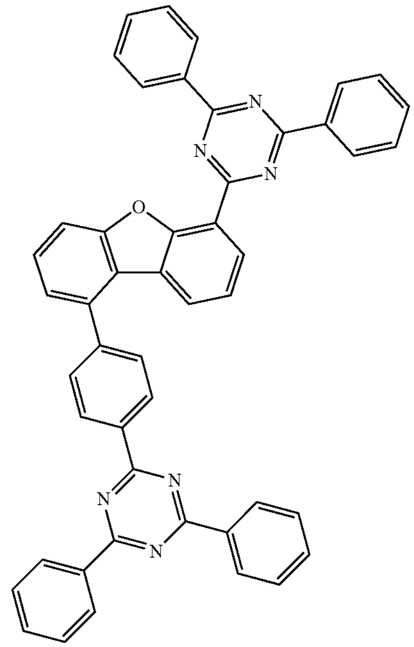
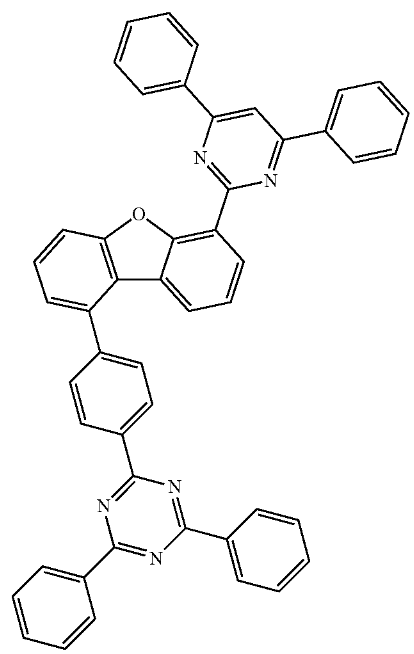

-continued
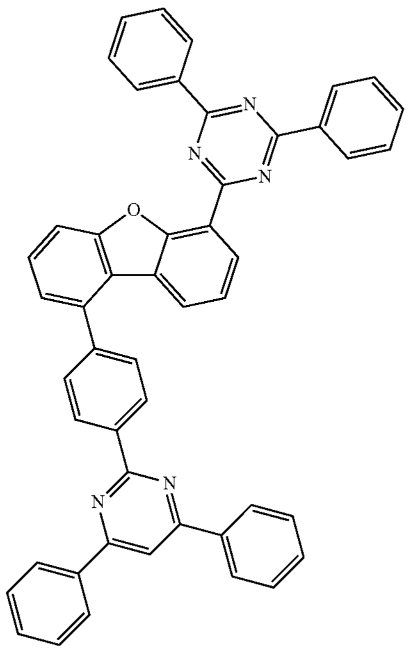
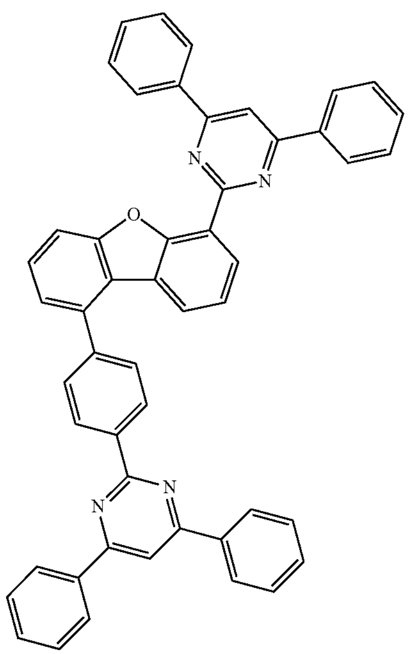
-continued
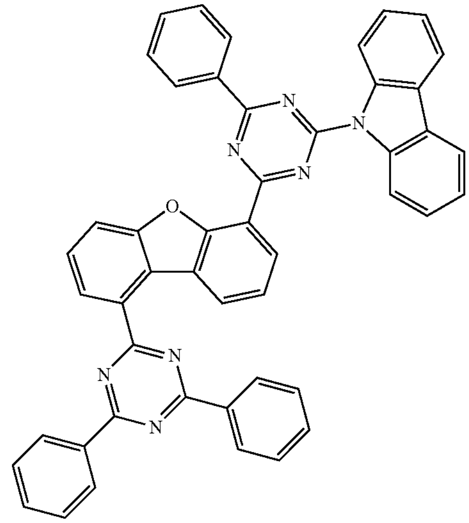
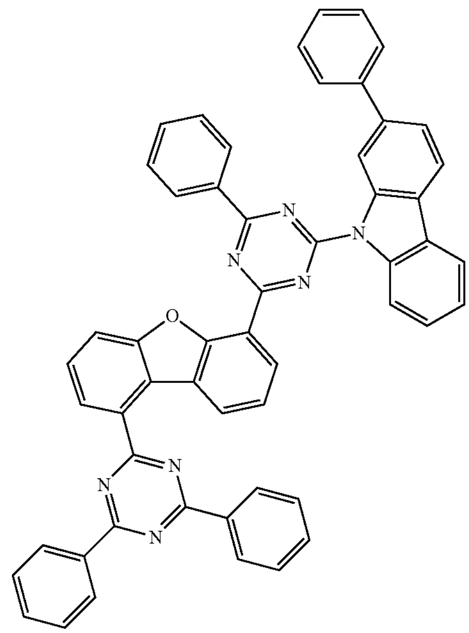
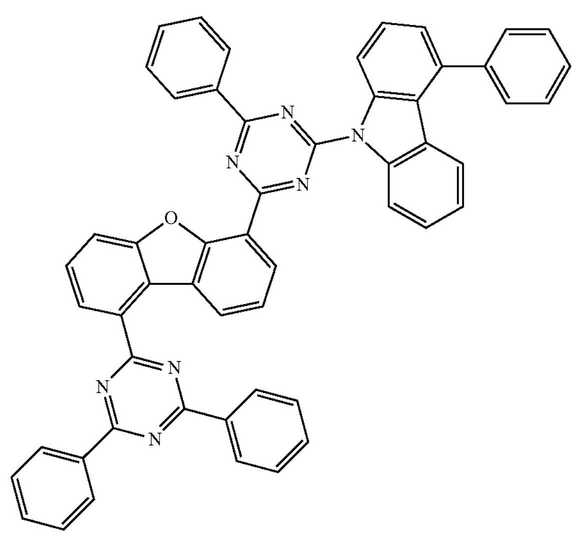

-continued
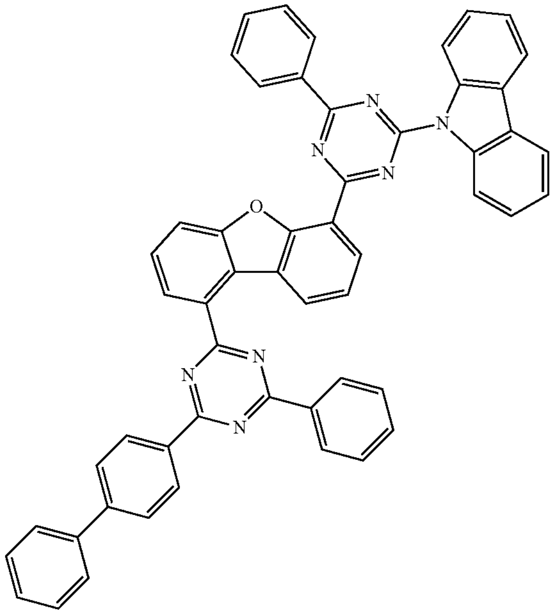
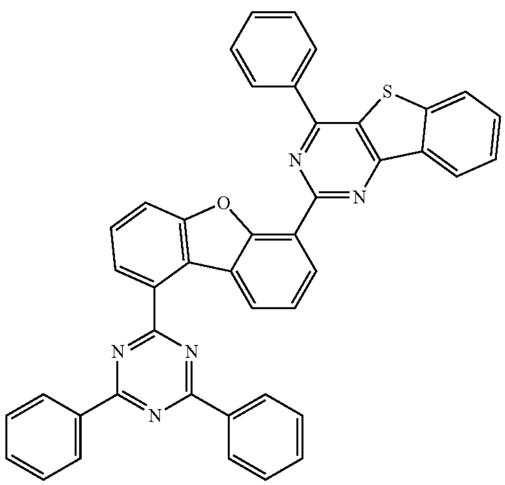
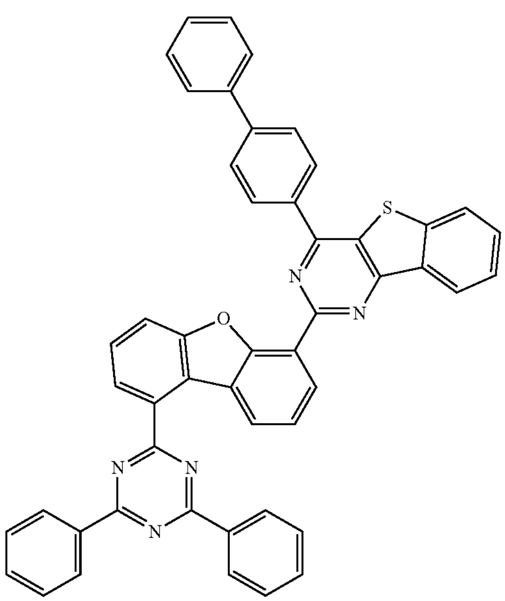
-continued
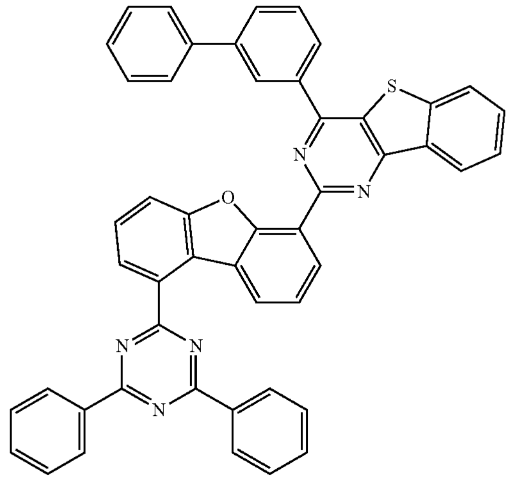
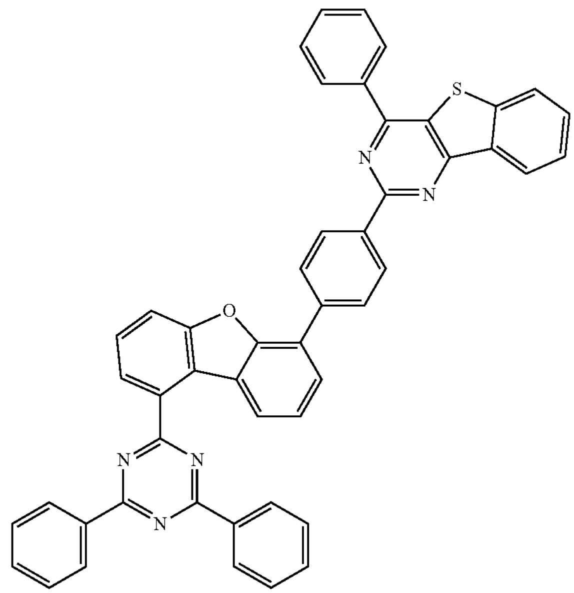
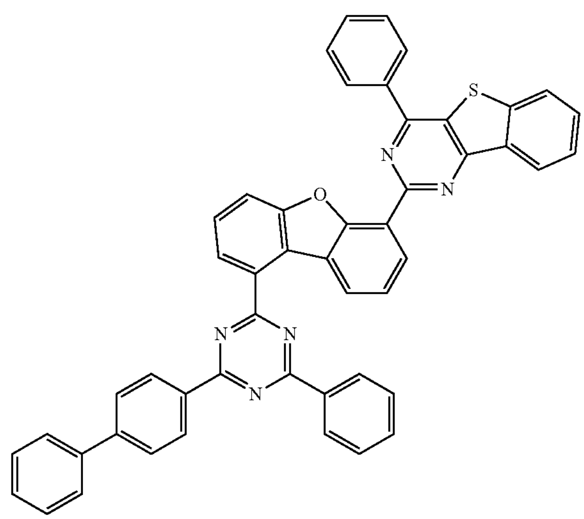

-continued
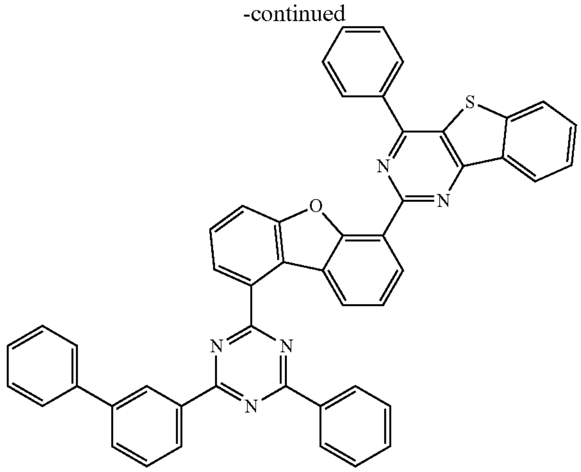
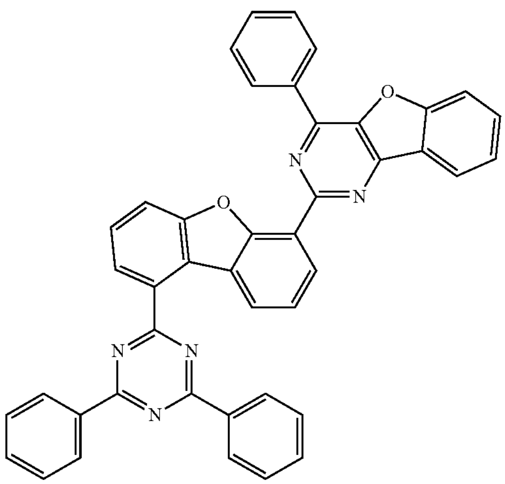
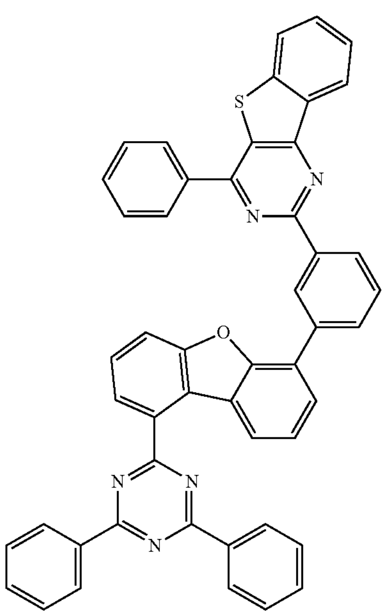
-continued
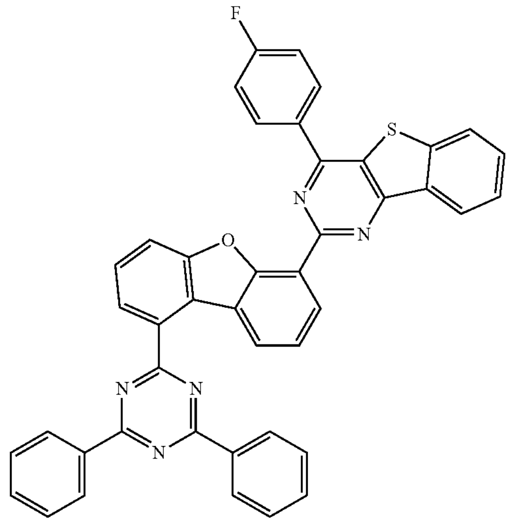
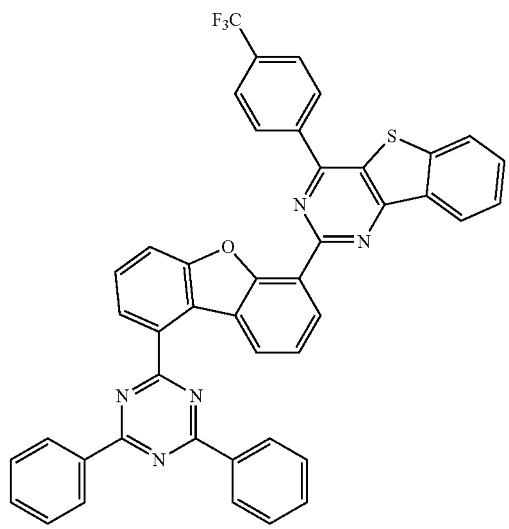
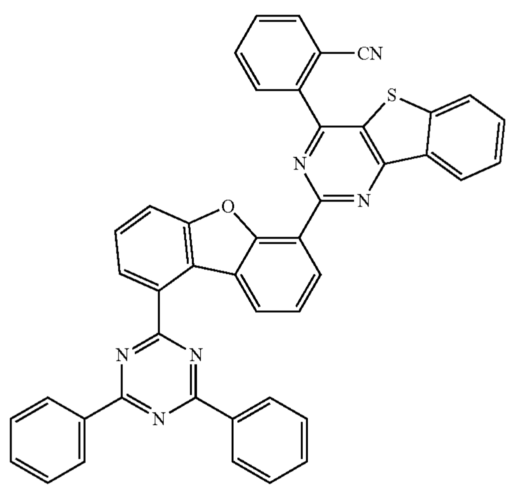

-continued
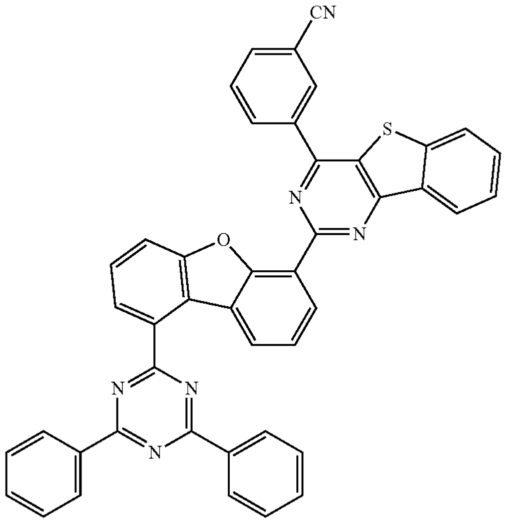
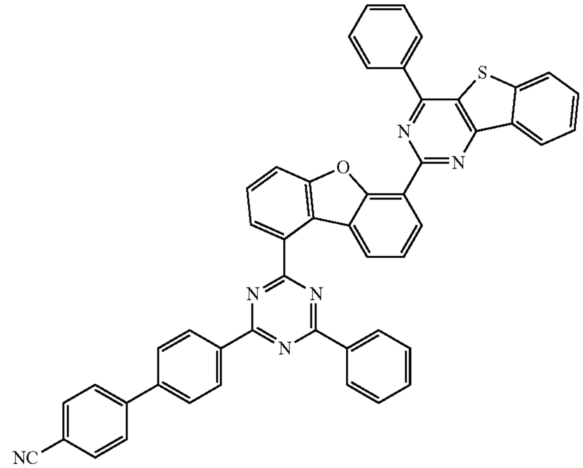
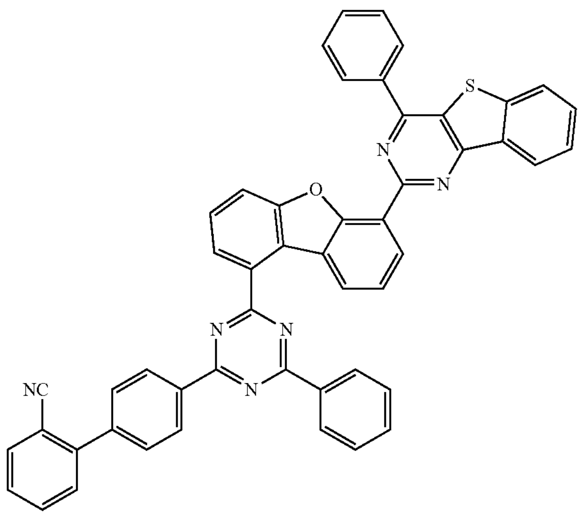
-continued
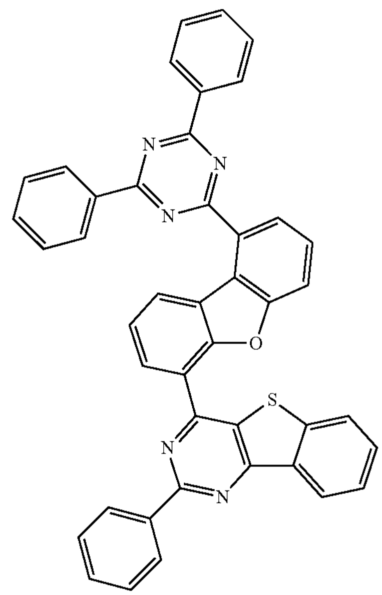
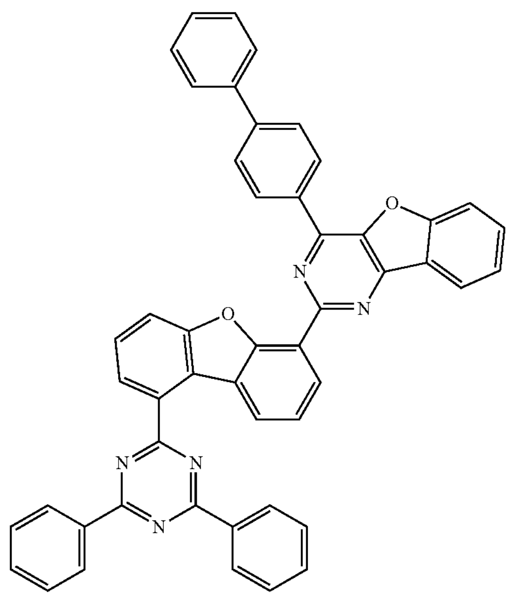
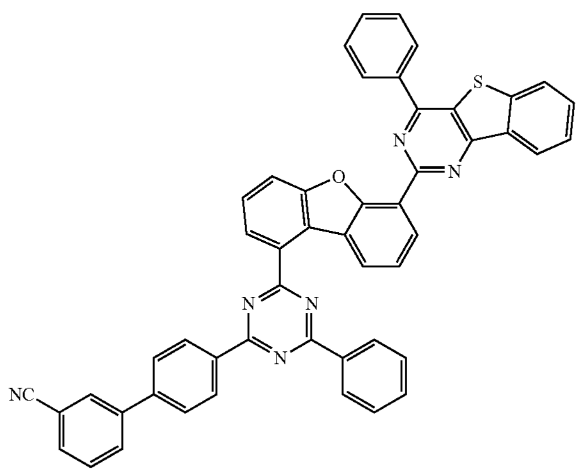

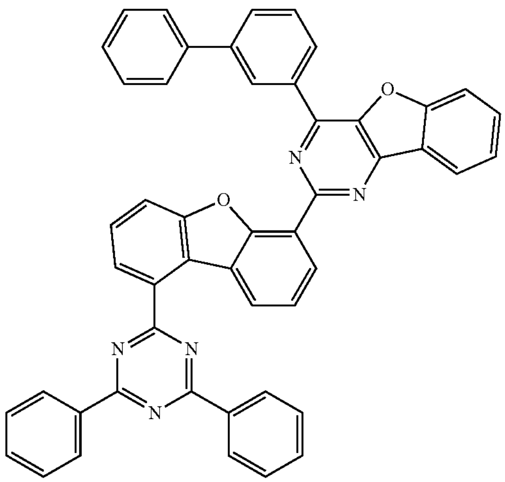
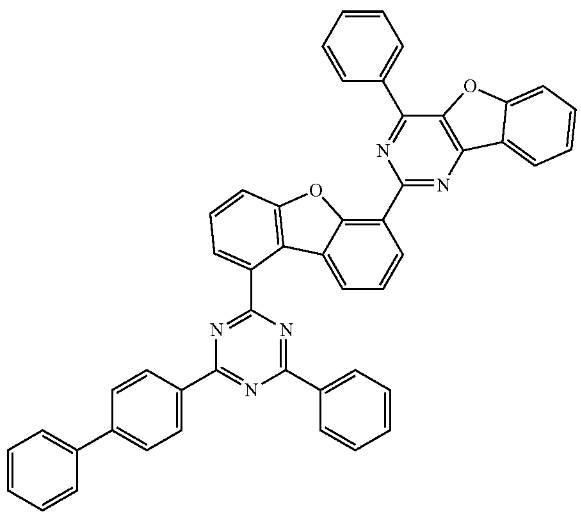
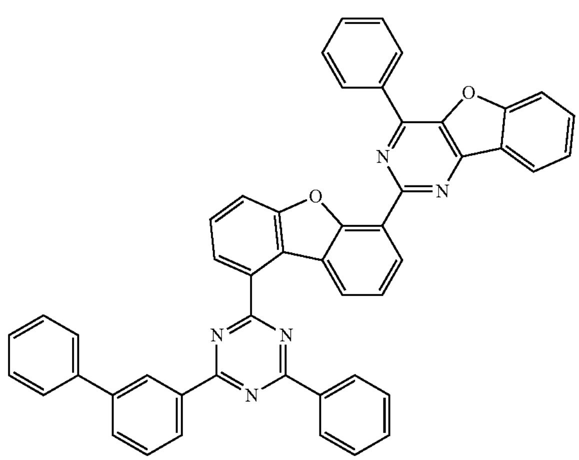
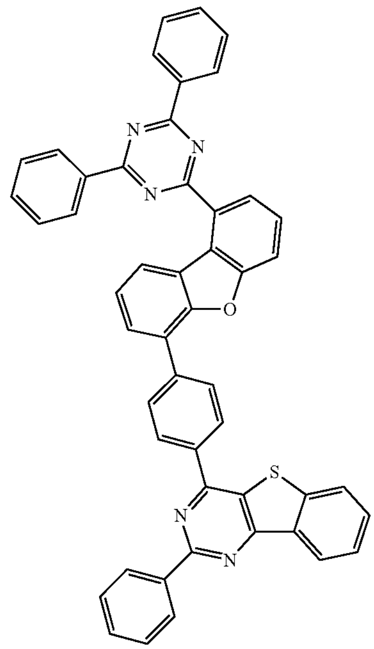
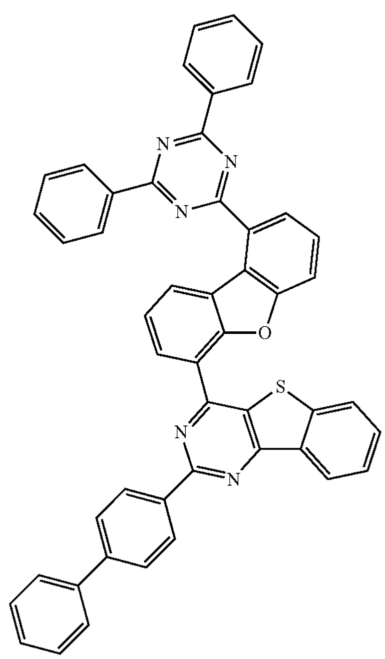
O
N
N
N
N
N
S

-continued
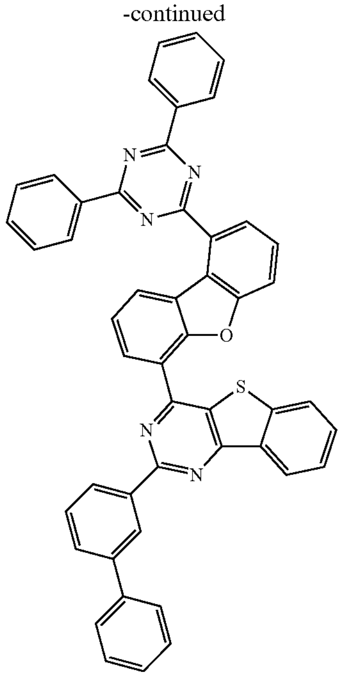
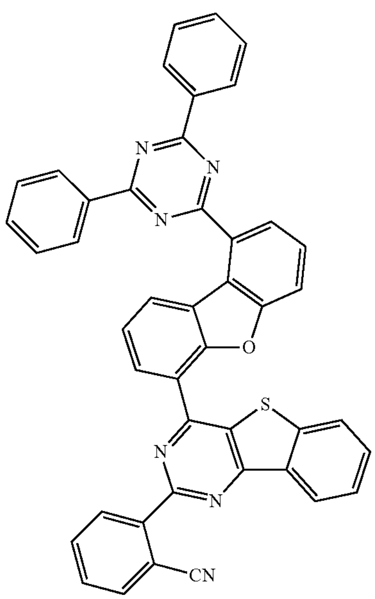
-continued
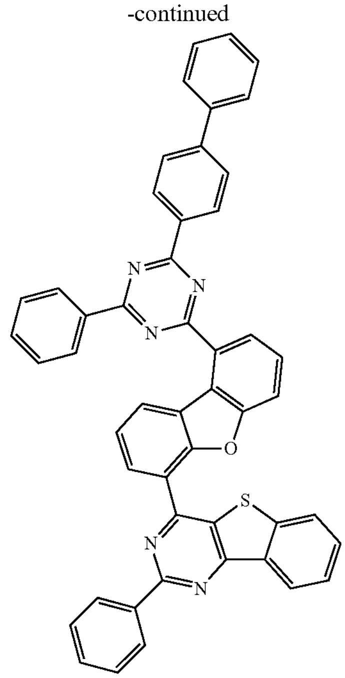
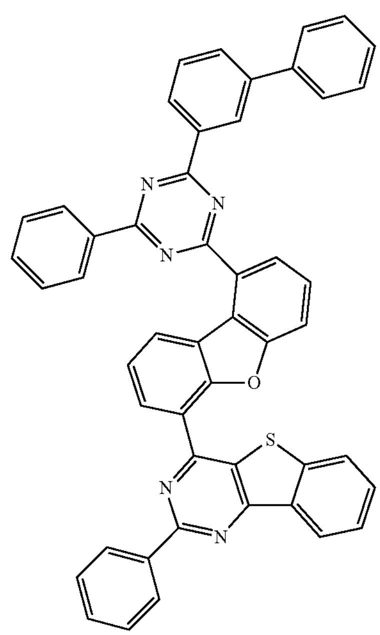

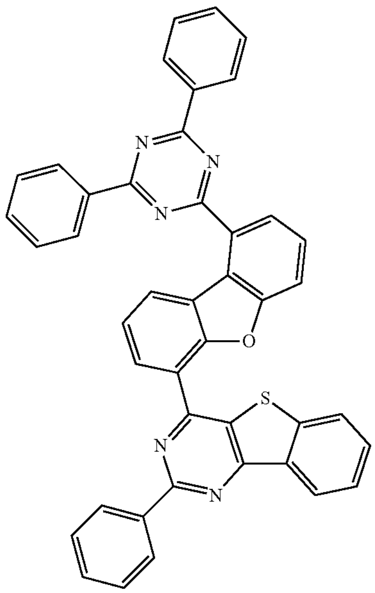
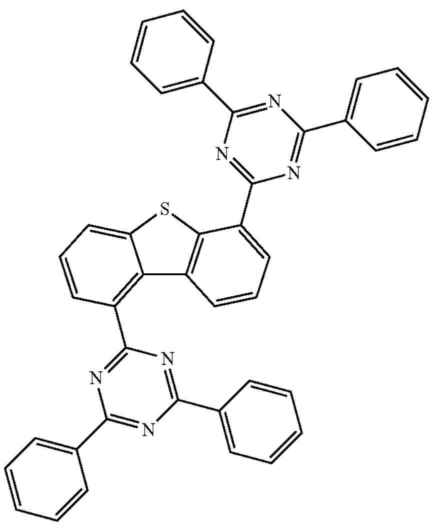
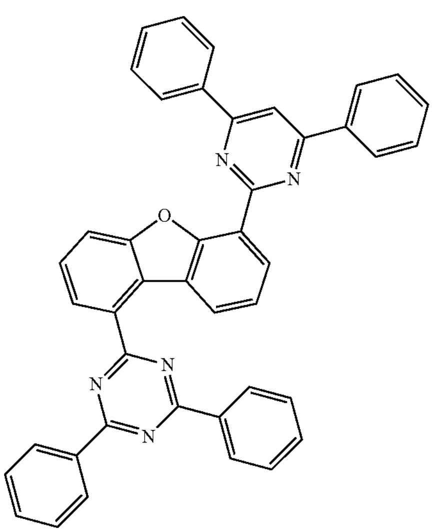
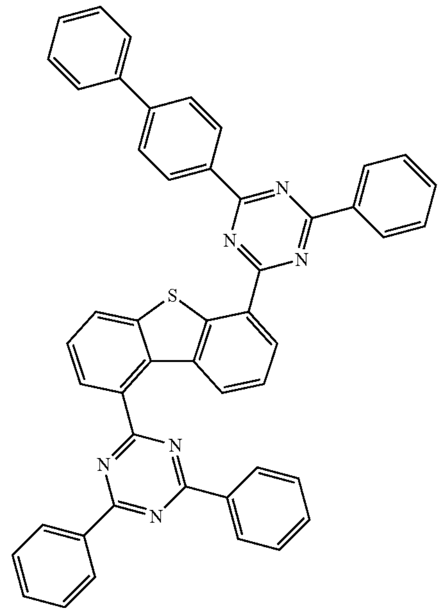
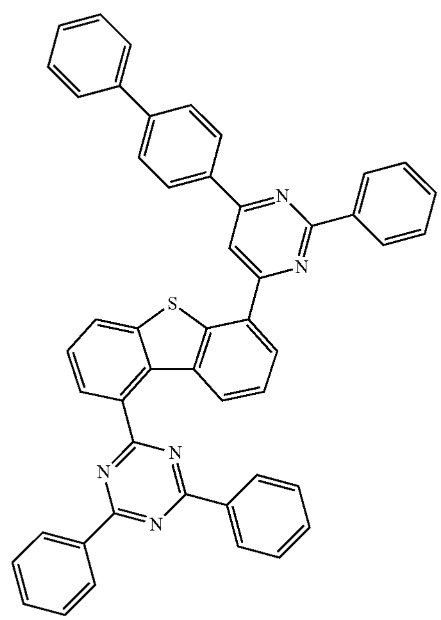

-continued
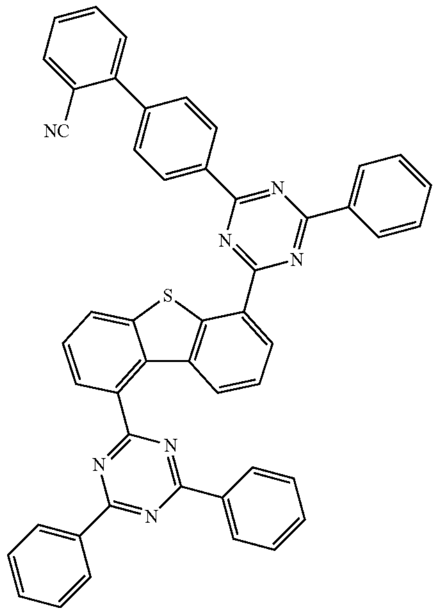
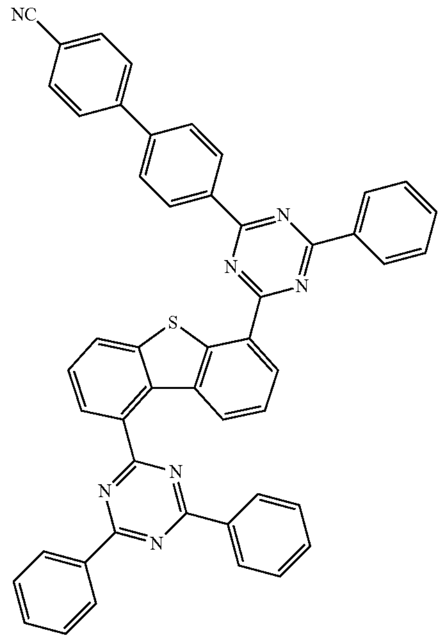
-continued
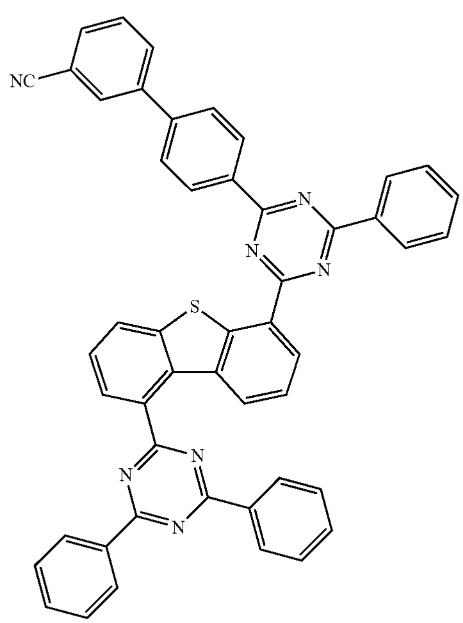
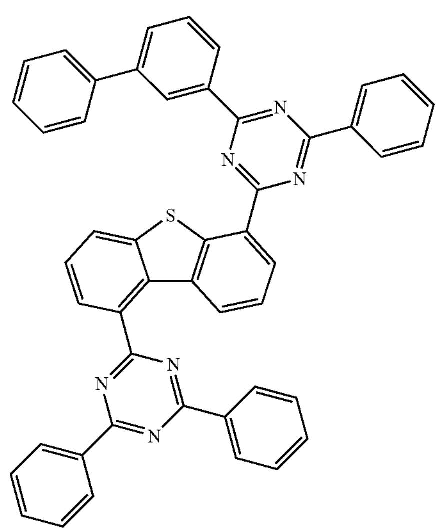

-continued
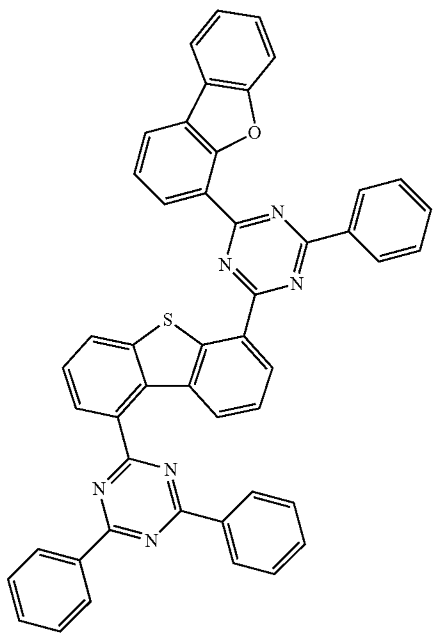
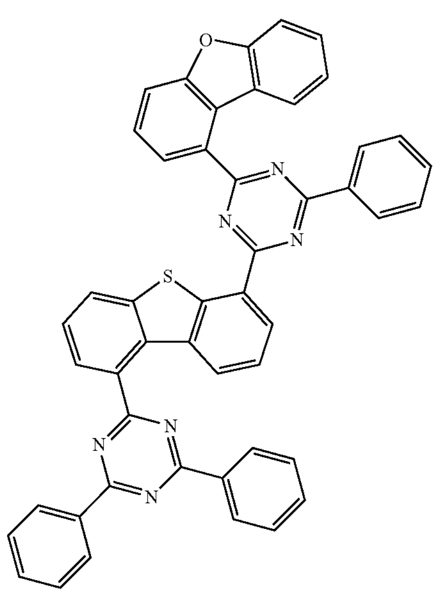
-continued
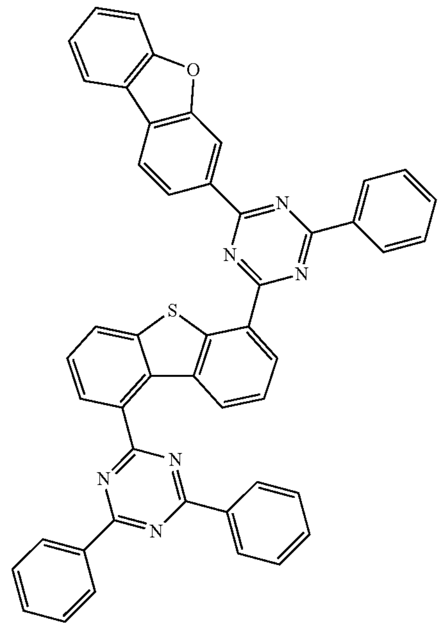
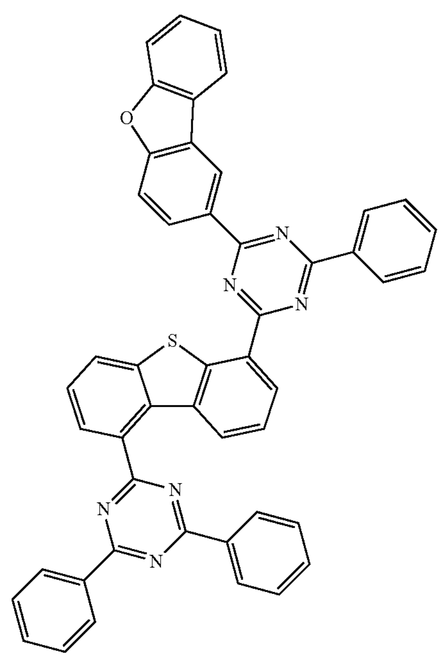

-continued
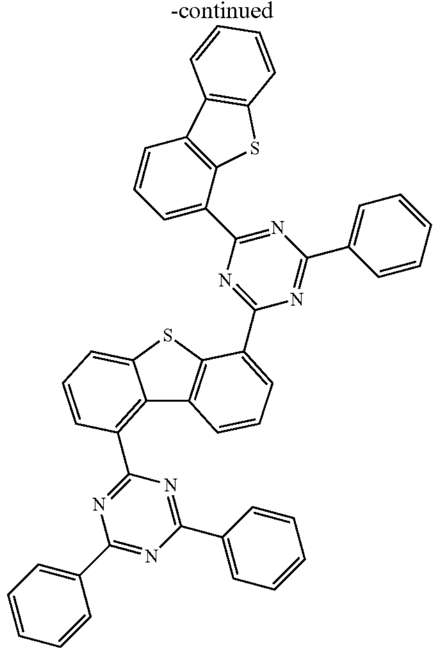
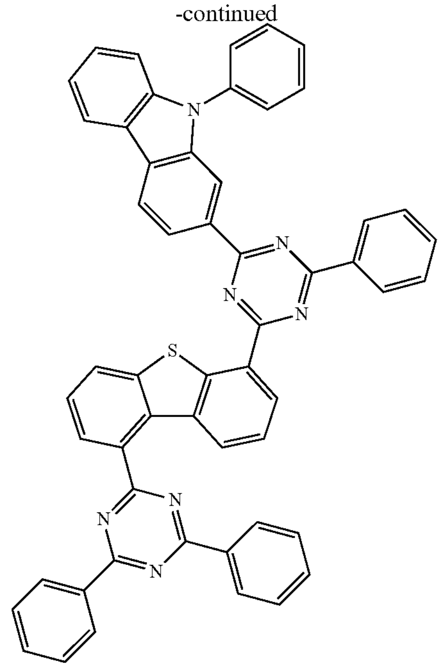
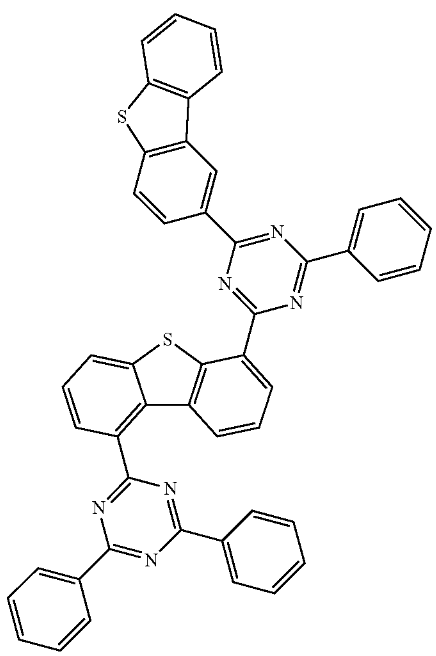
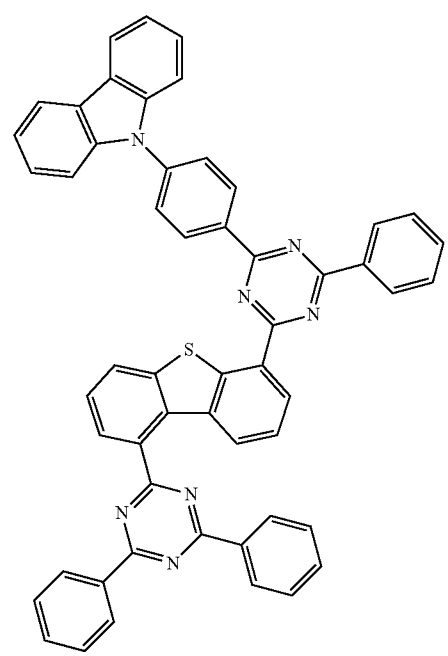
-continued

-continued
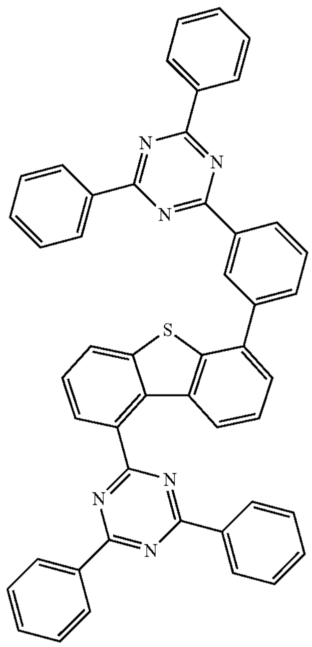
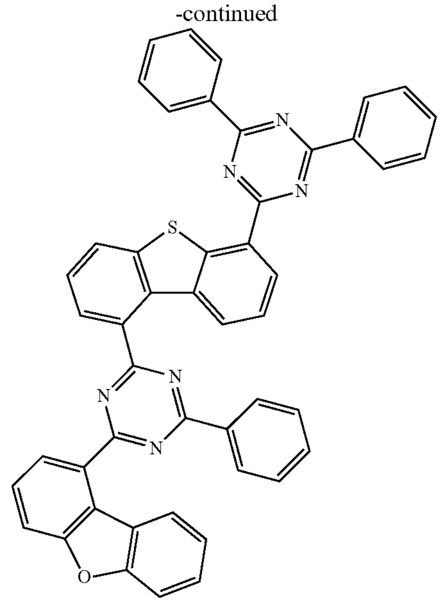
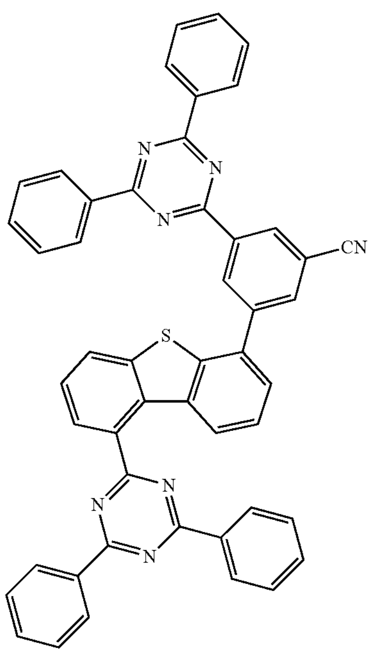
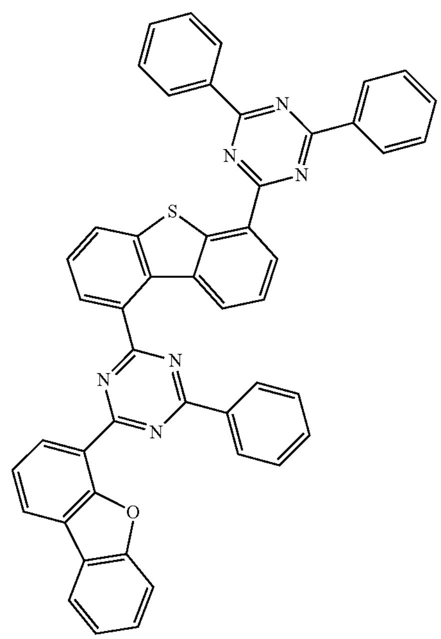

-continued
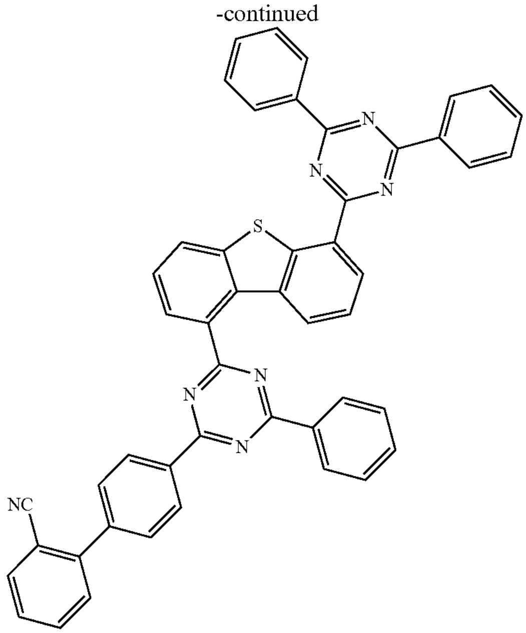
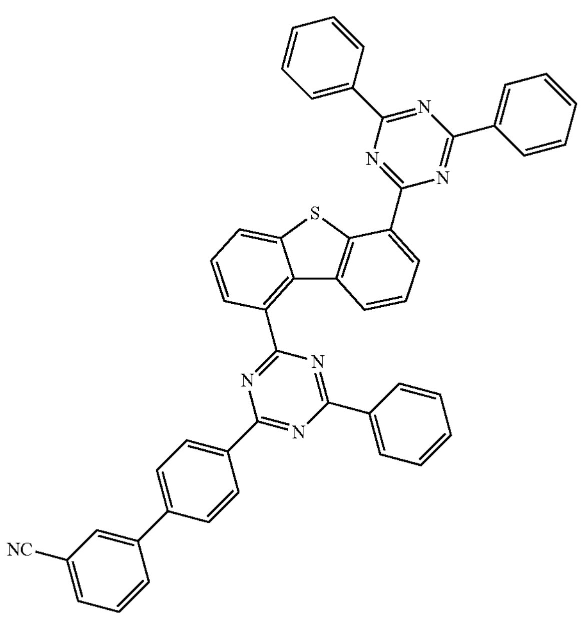
-continued
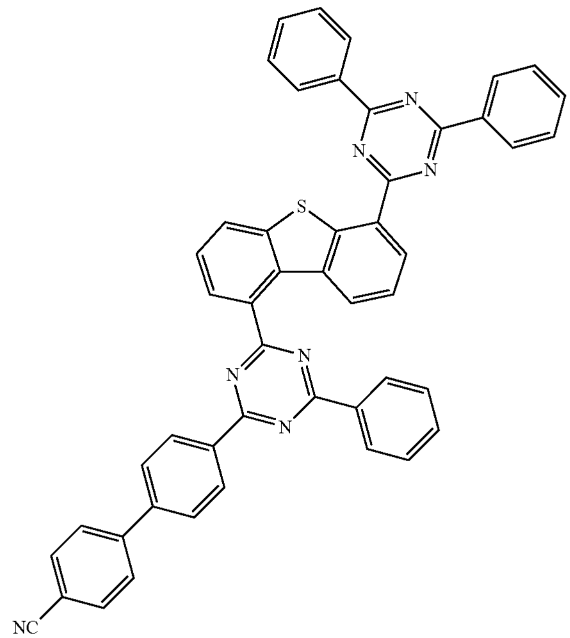
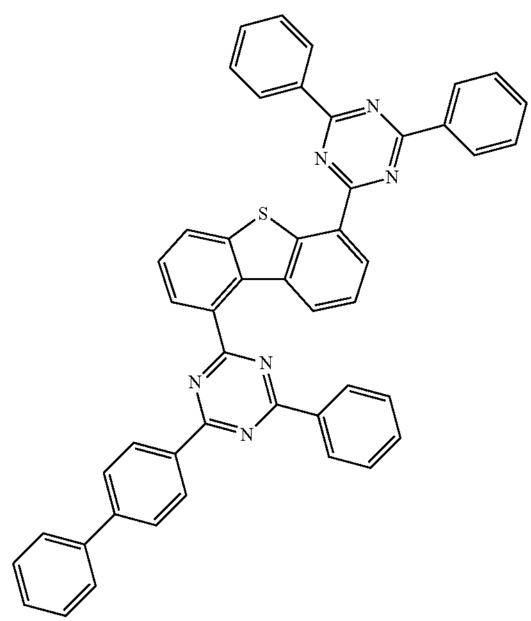

-continued
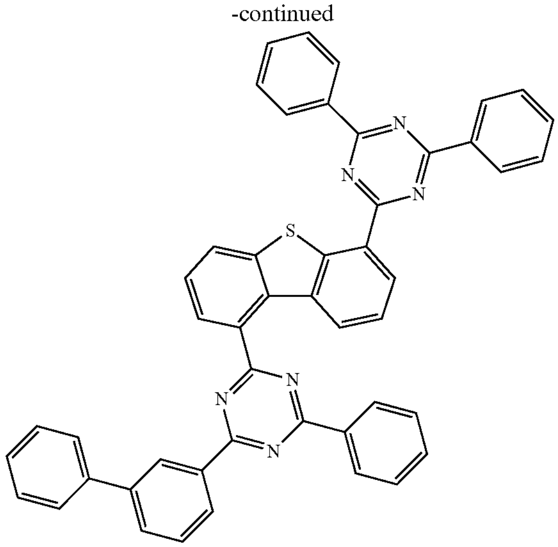
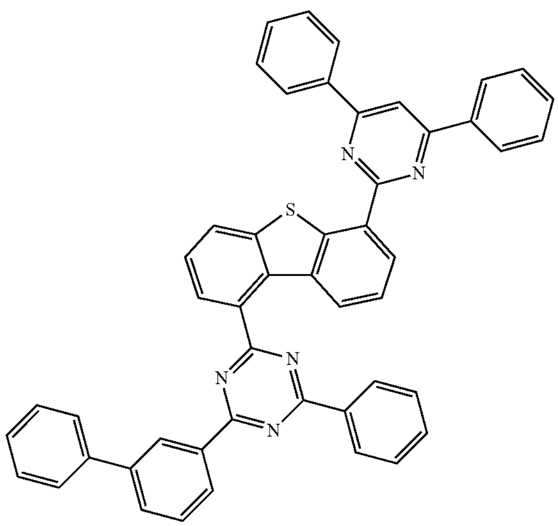
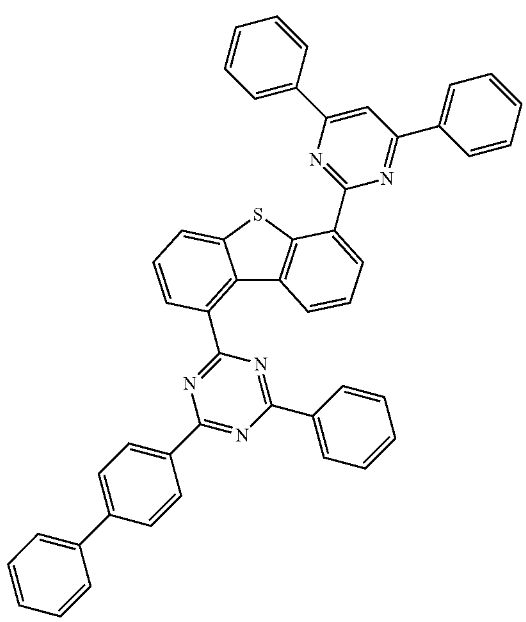
-continued
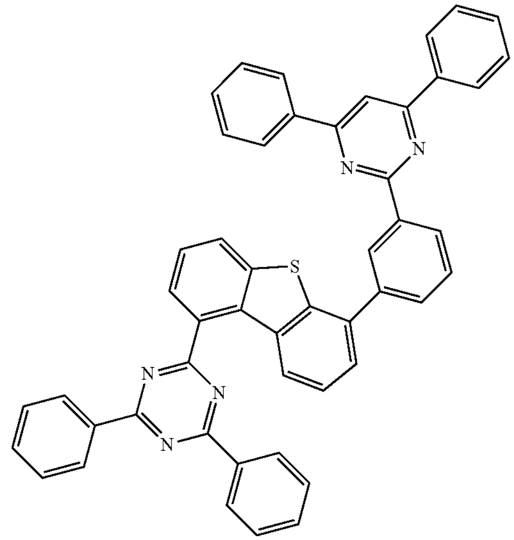
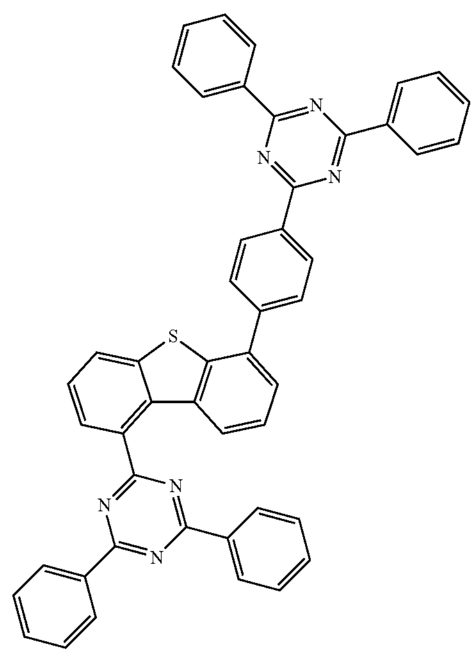

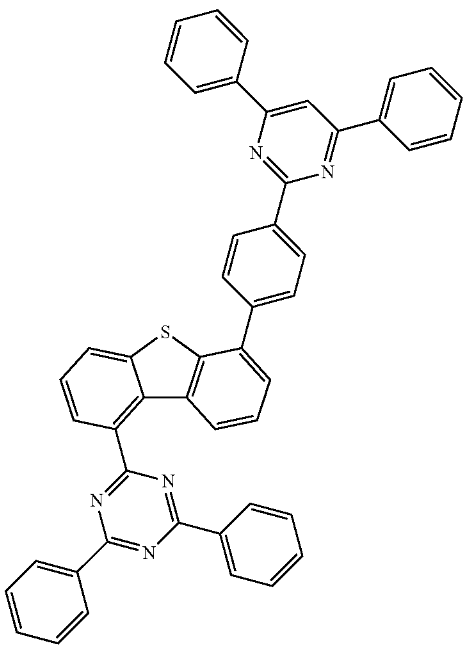
N
N
S
N
N
N
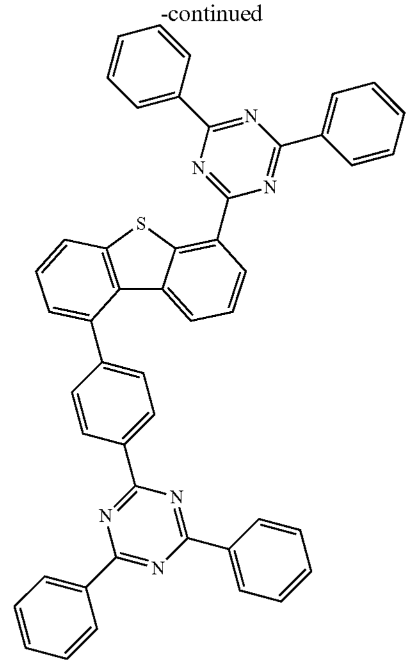
N
N
N
S
N
N
N
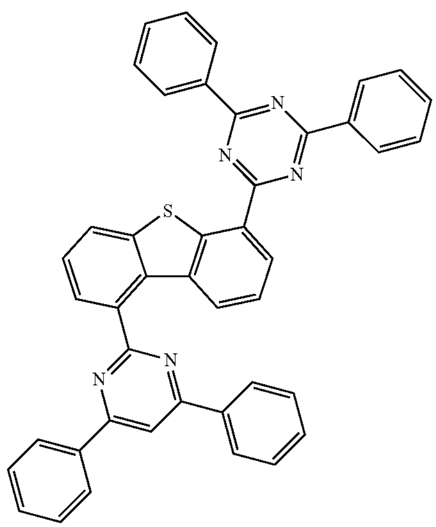
N
N
N
S
N
N
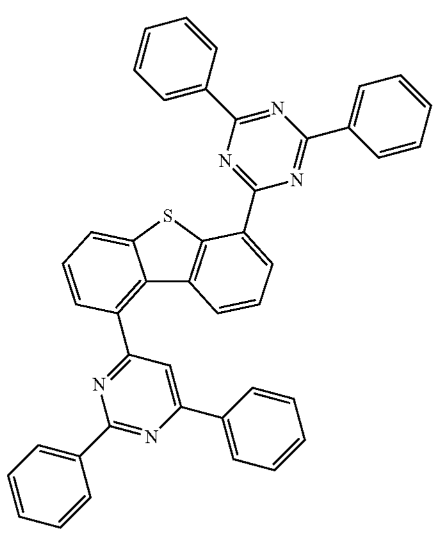
N
N
N
S
N
N
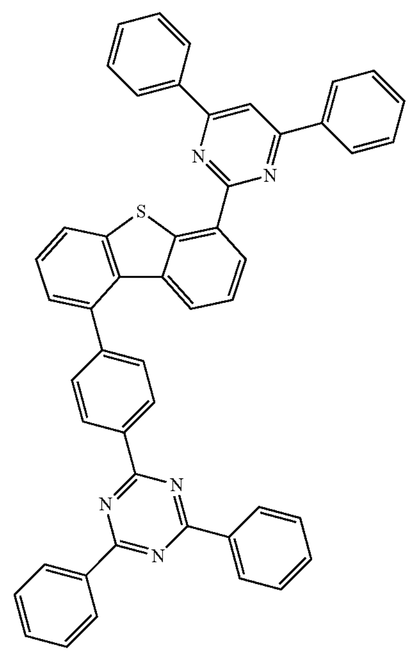
N
N
S
N
N
N -continued
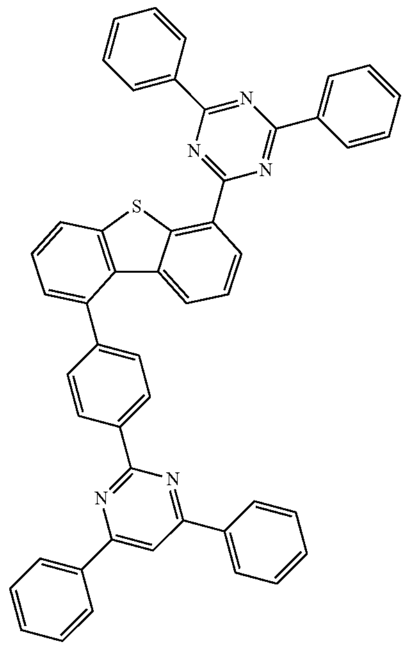
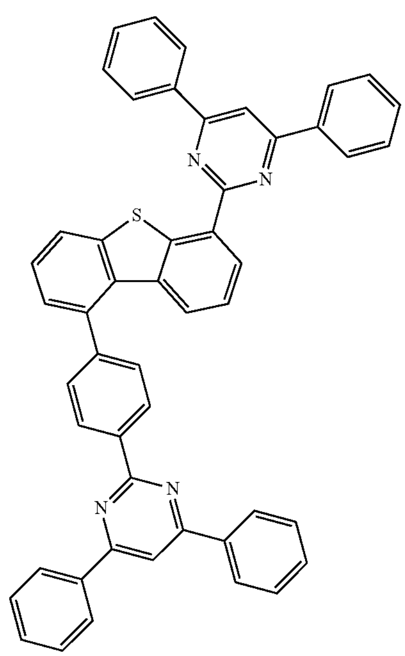
-continued
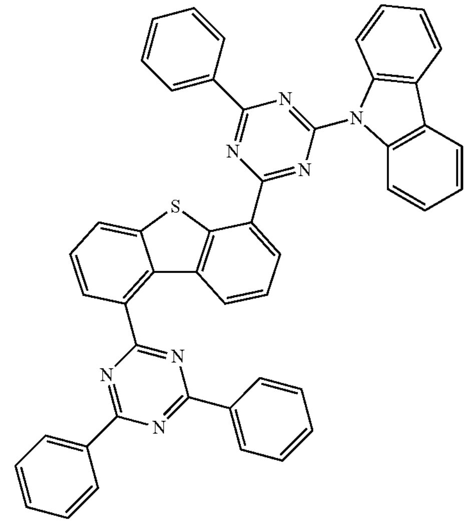
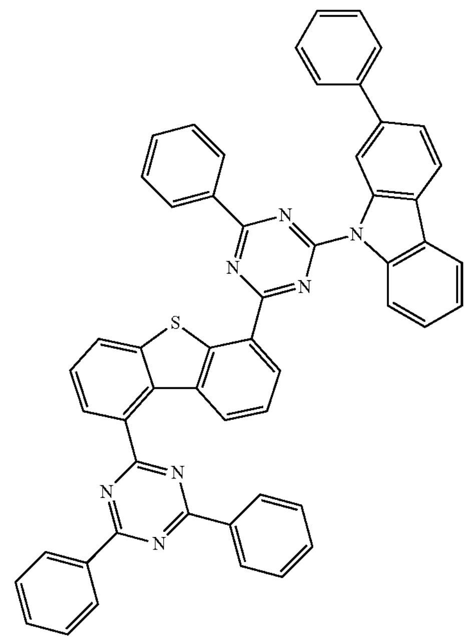
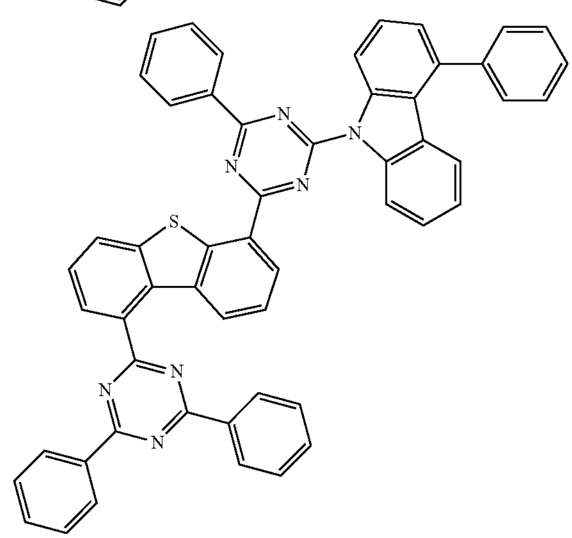

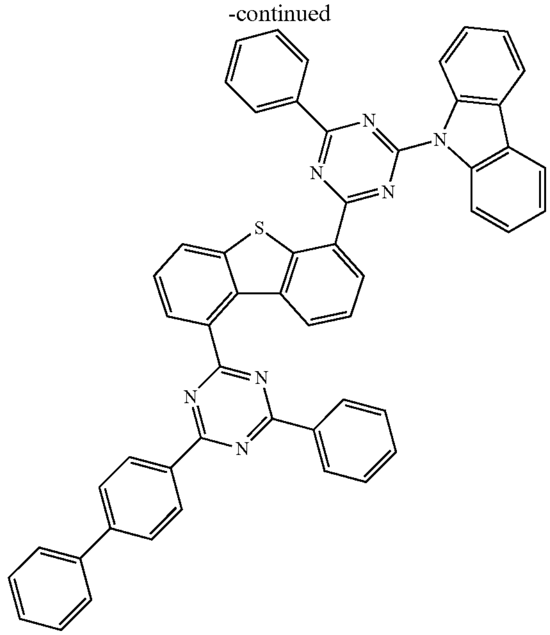
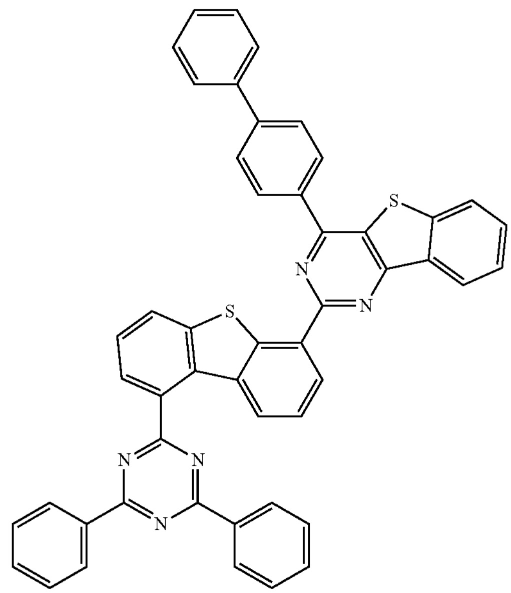
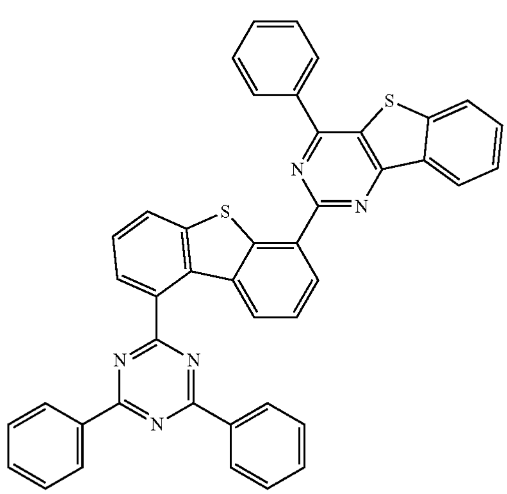
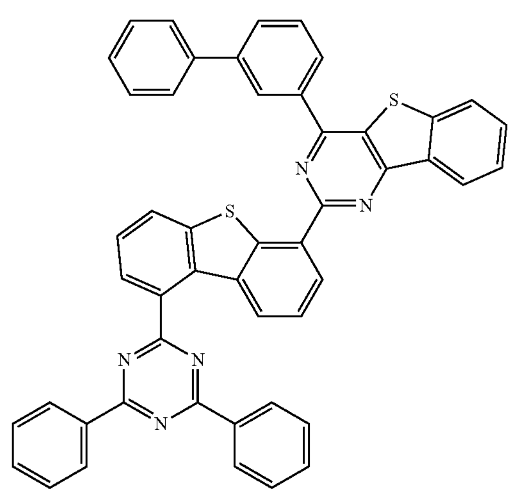

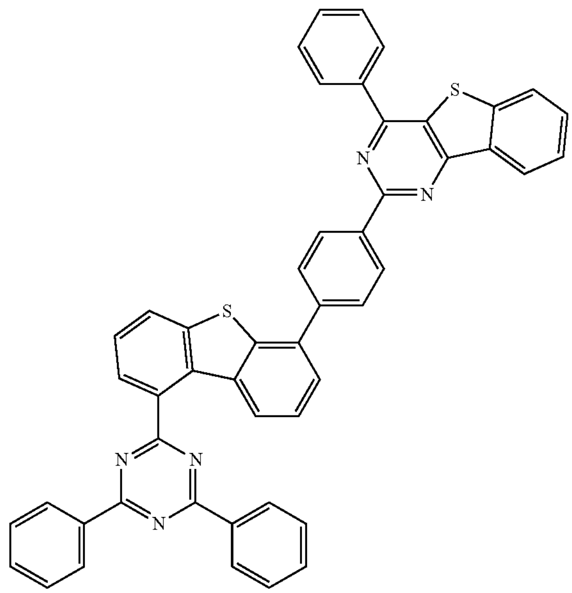
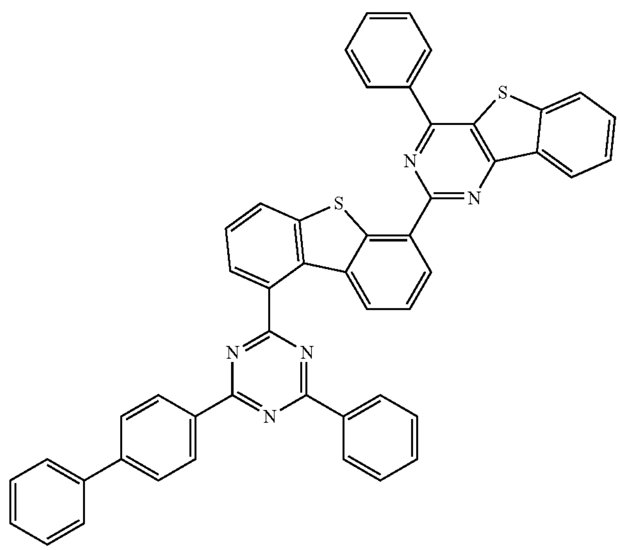
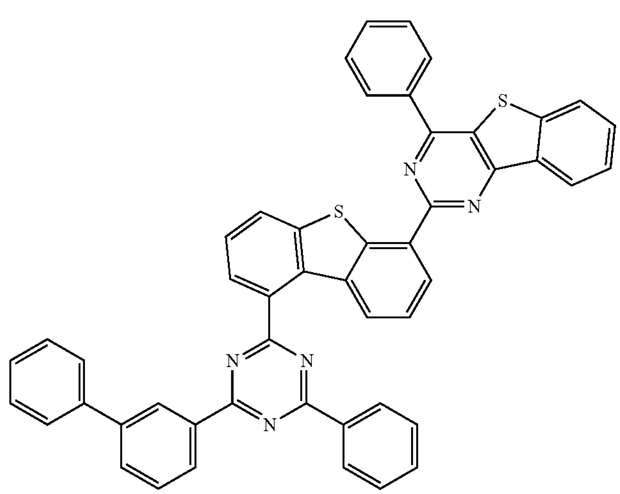

-continued
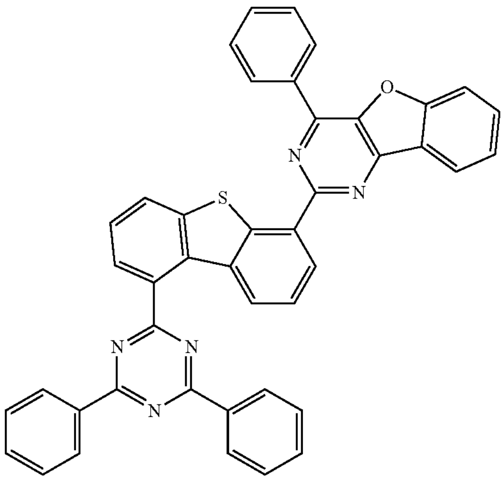
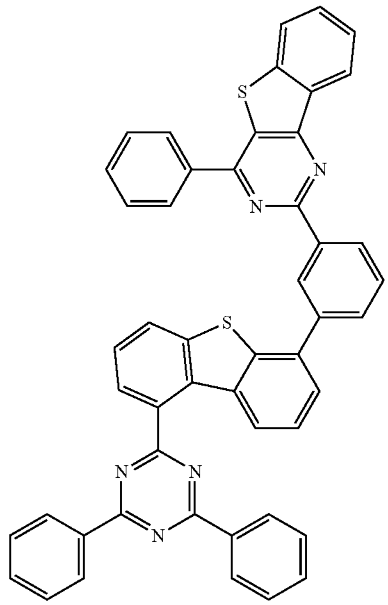
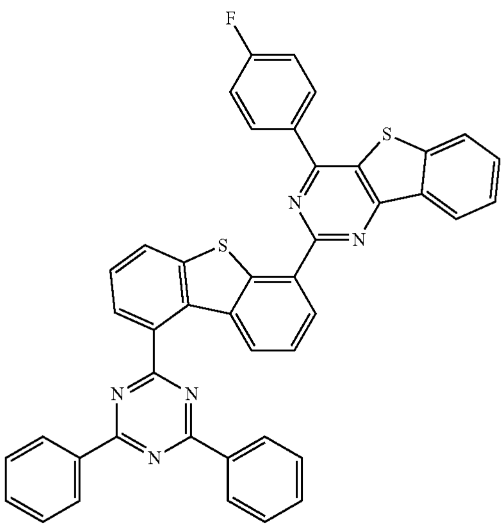
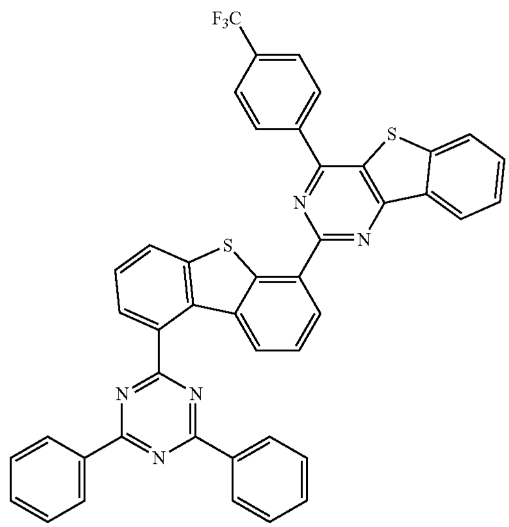
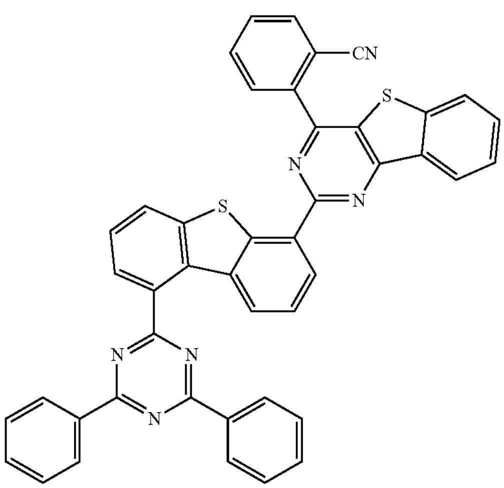
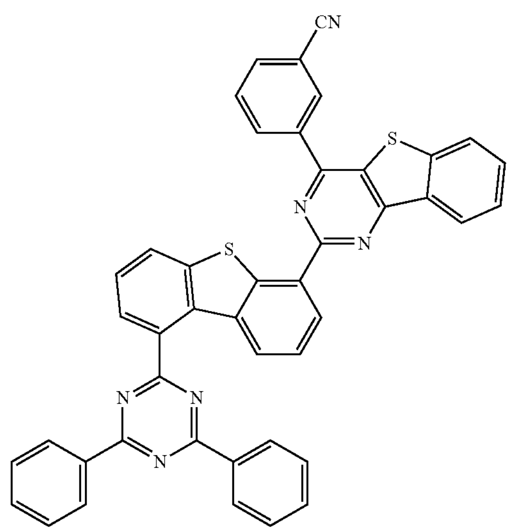

-continued
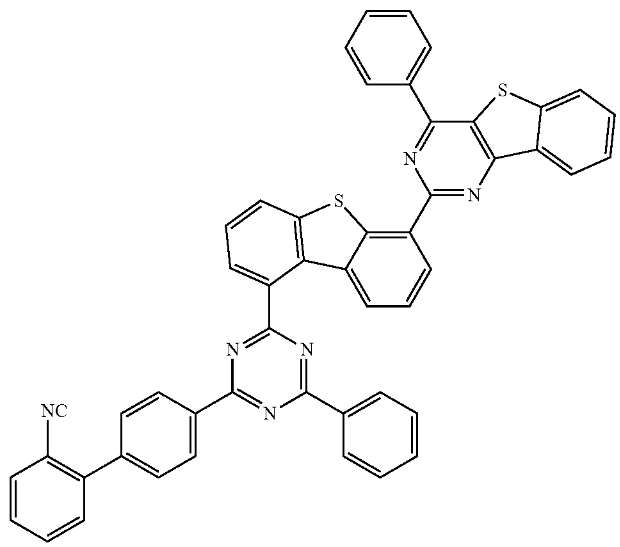
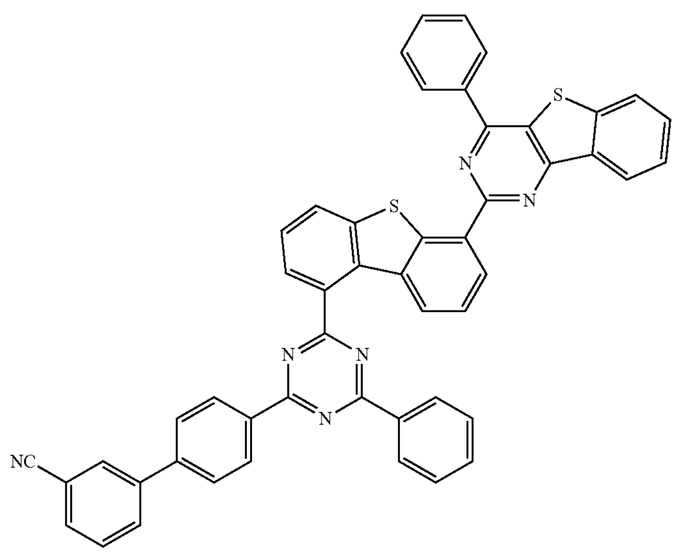
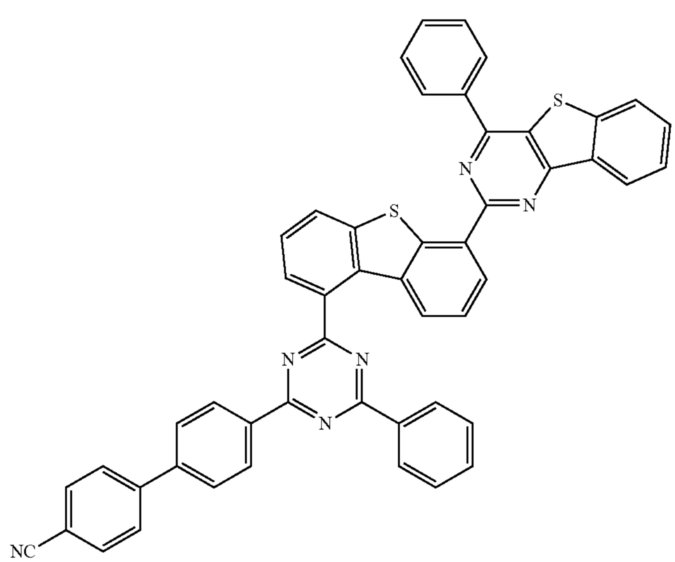

-continued
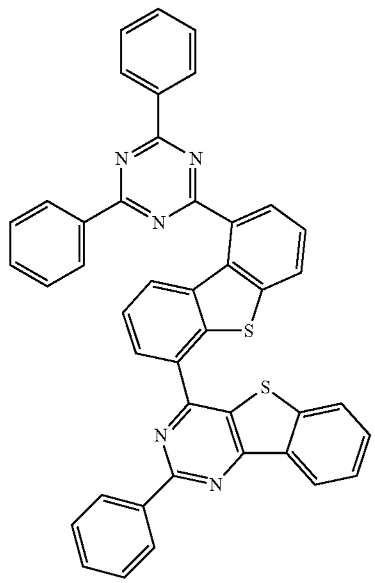
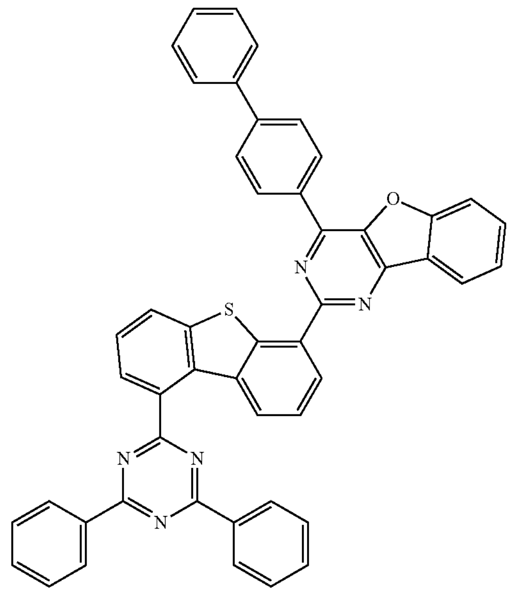
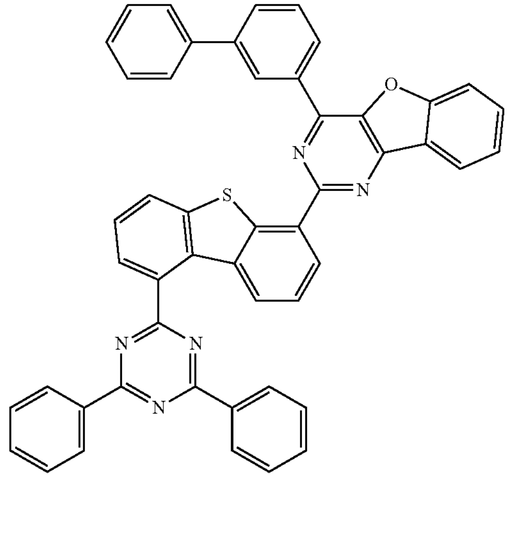
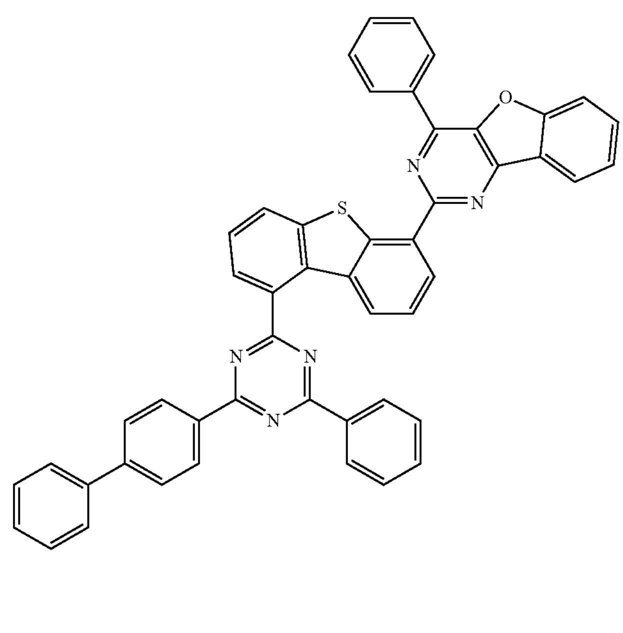

-continued
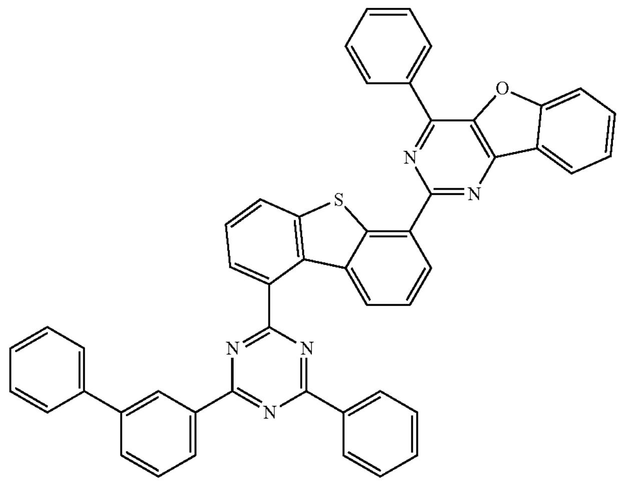
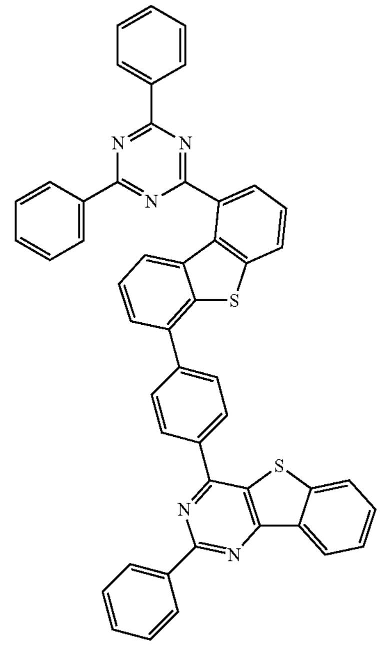
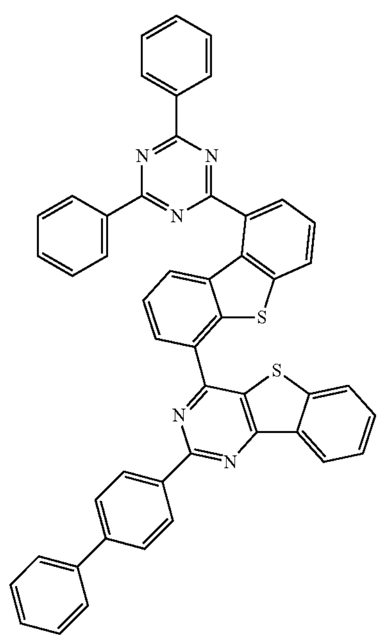
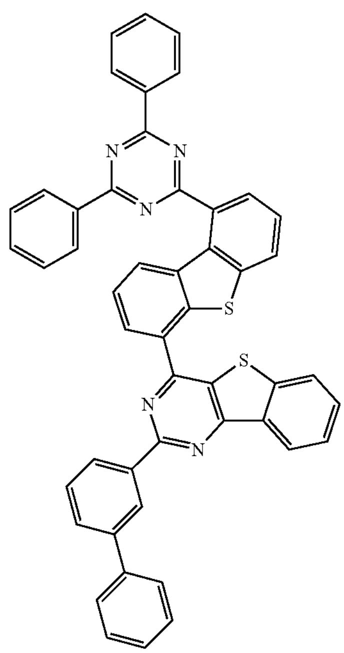
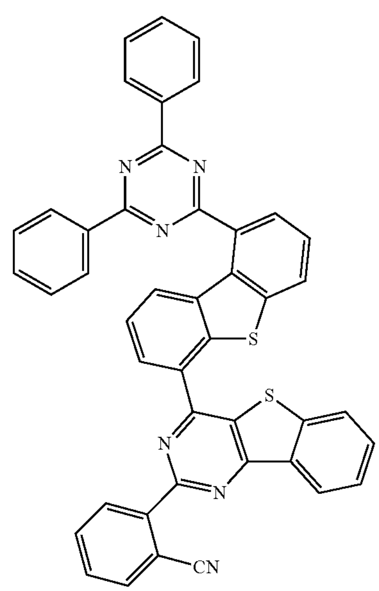

-continued
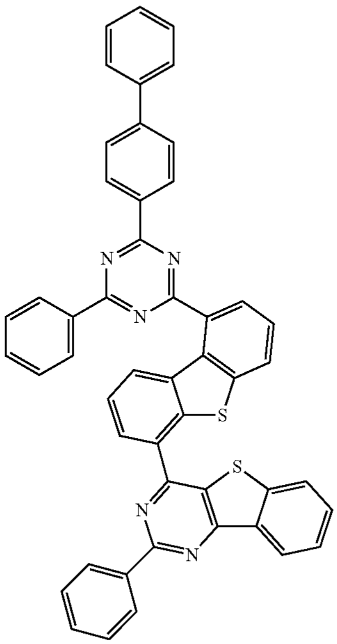
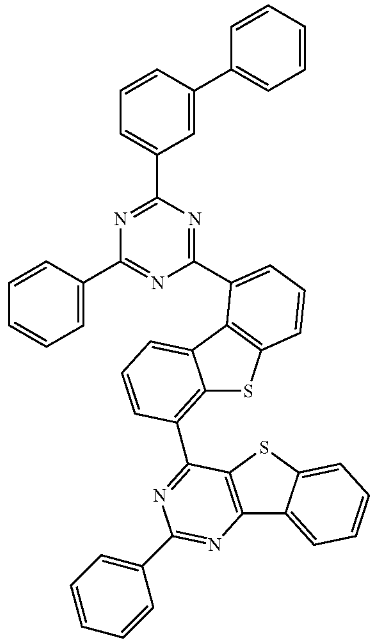
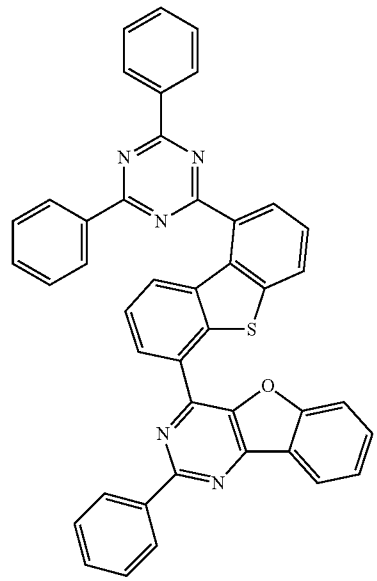
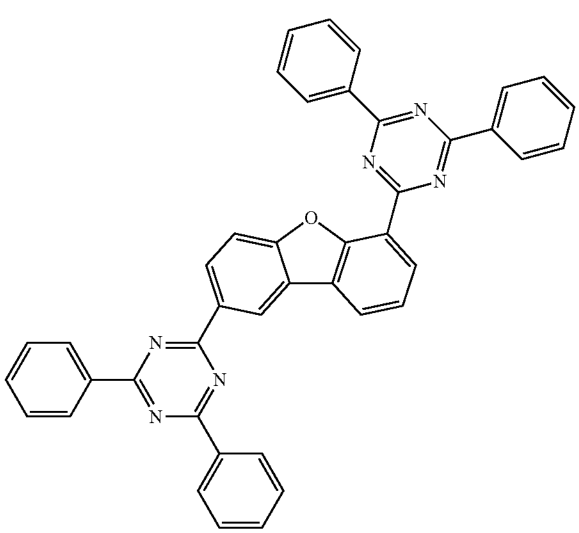
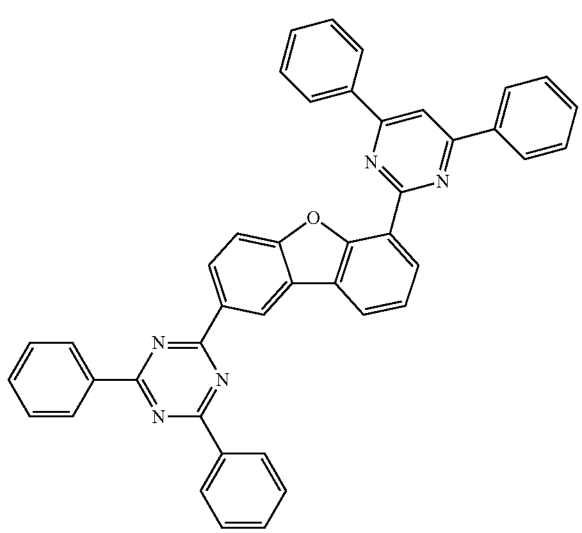

-continued
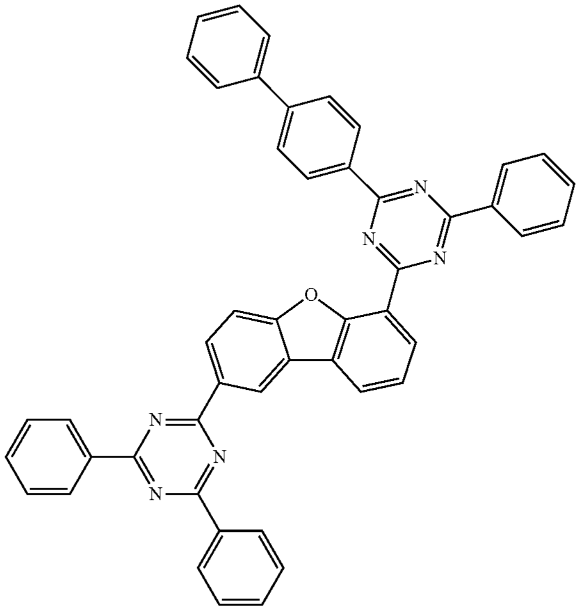
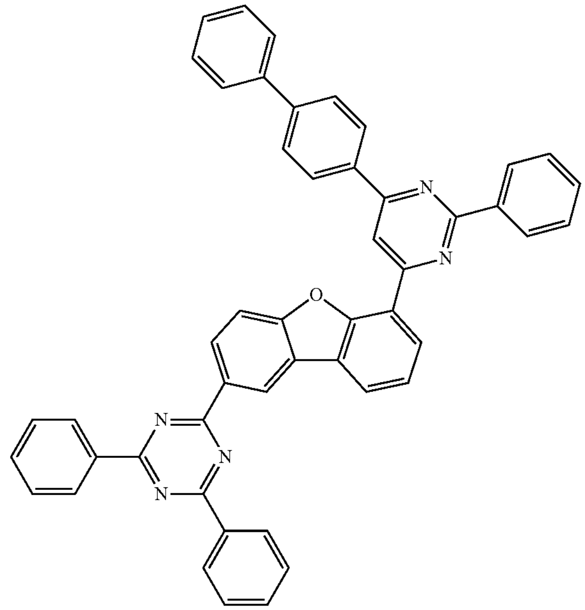
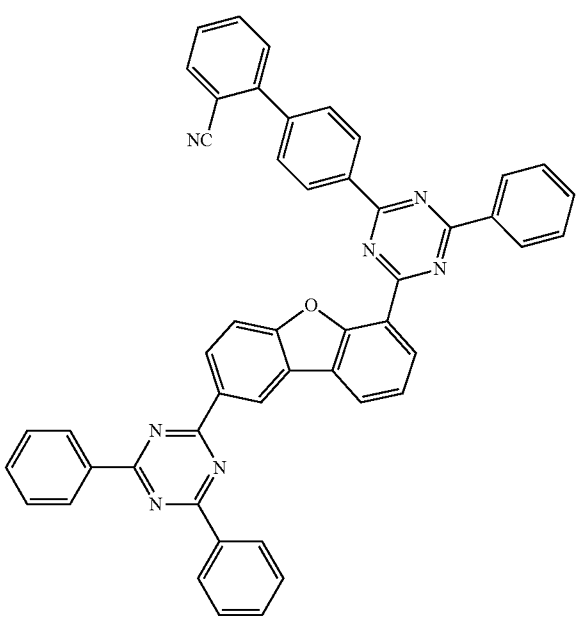
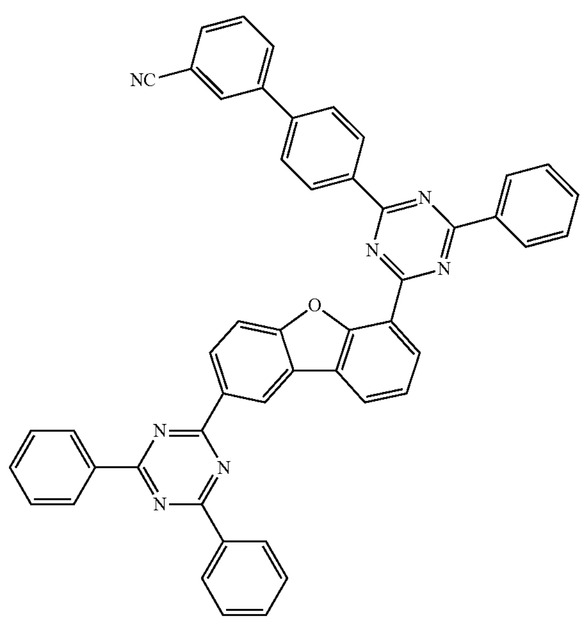

-continued
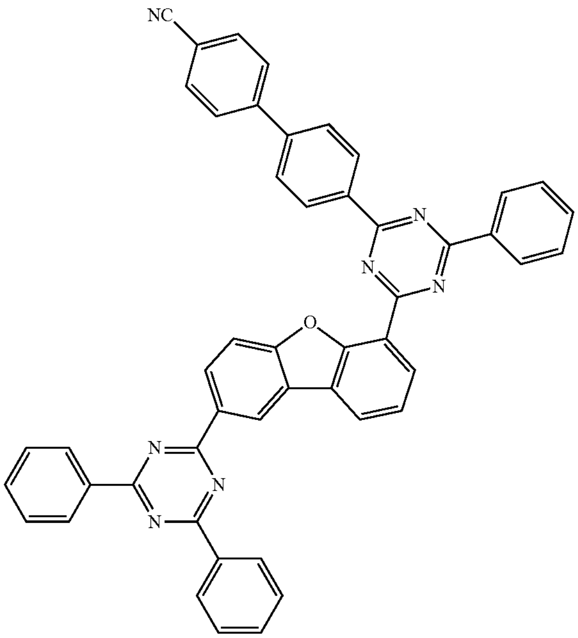
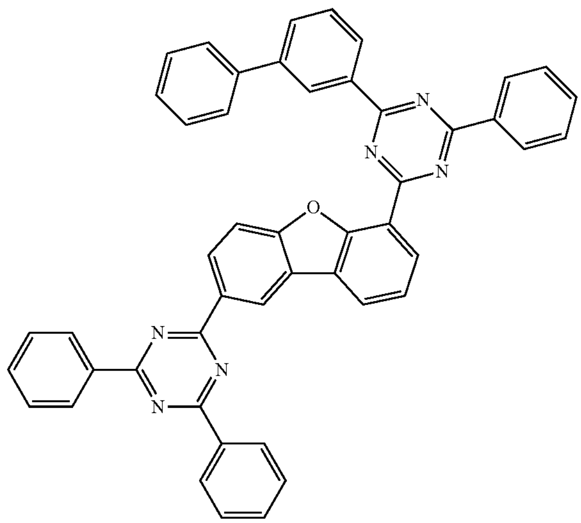
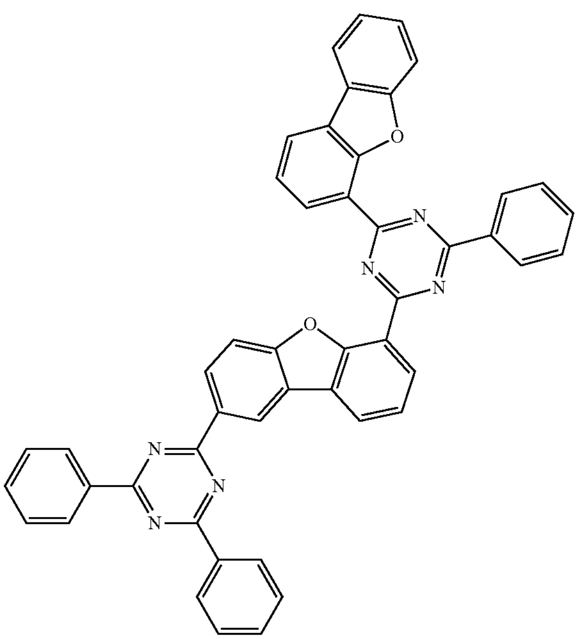
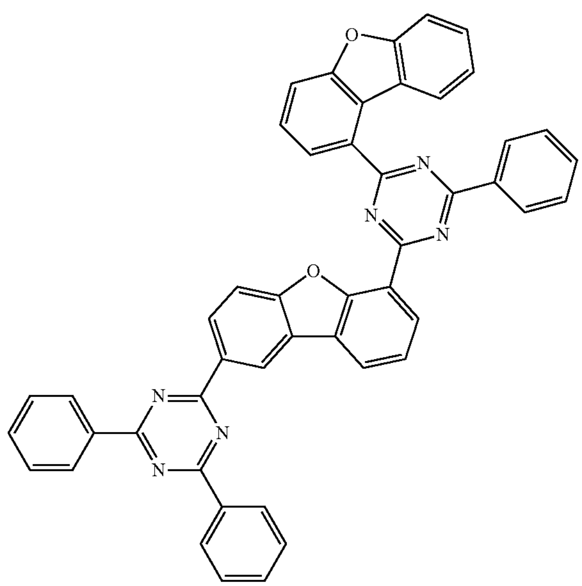

-continued
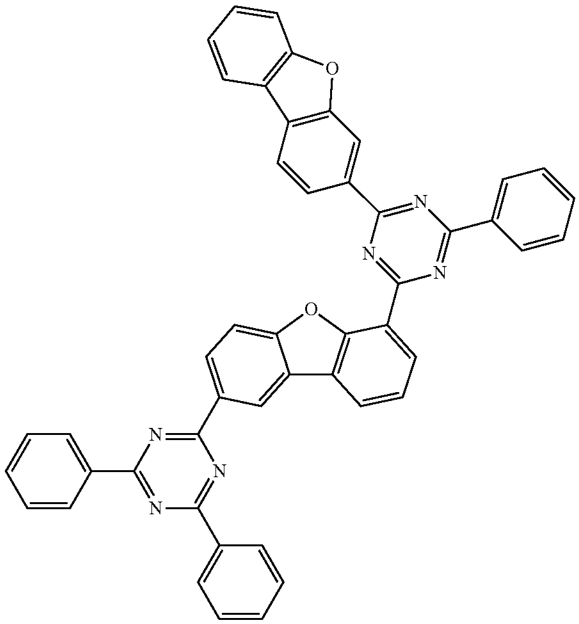
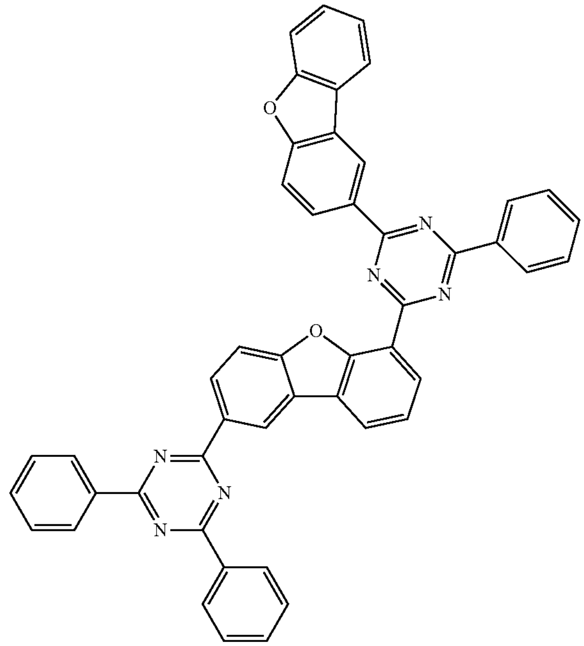
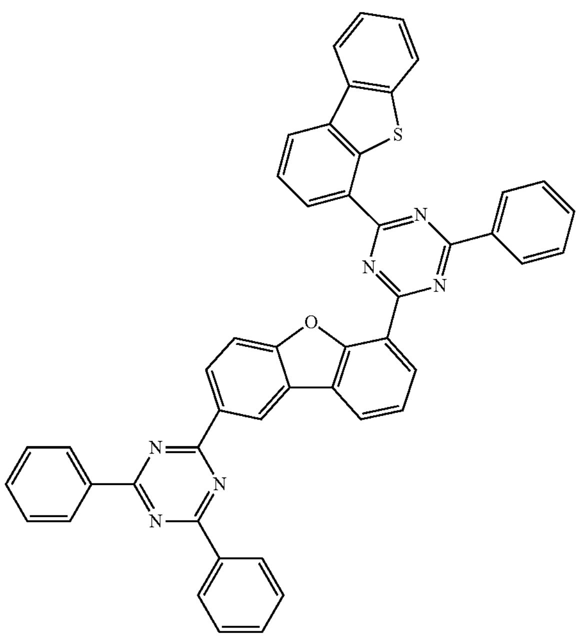
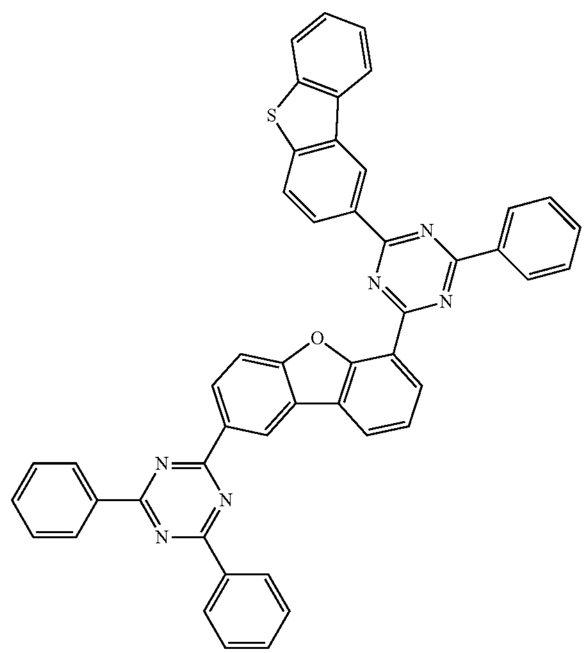

-continued
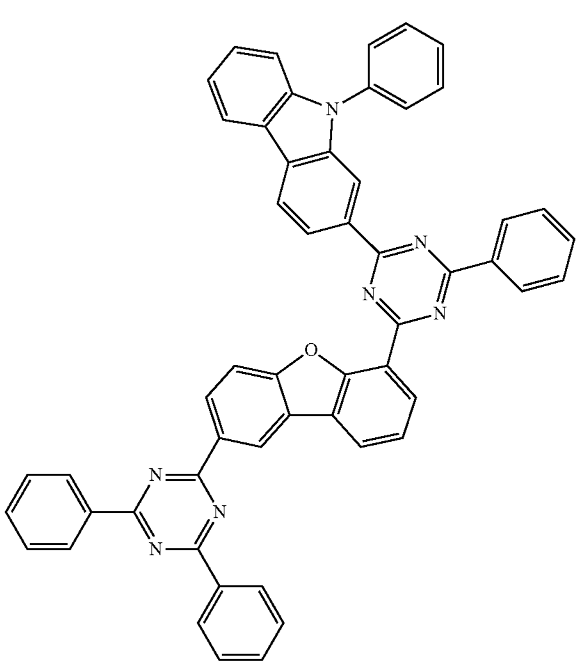
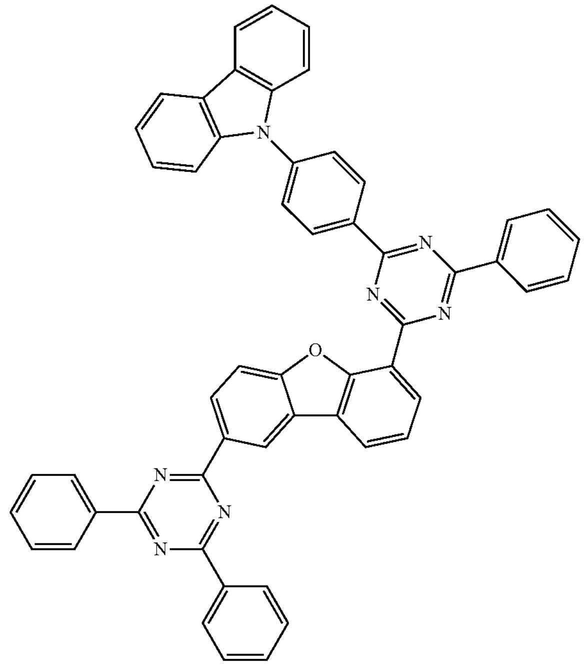
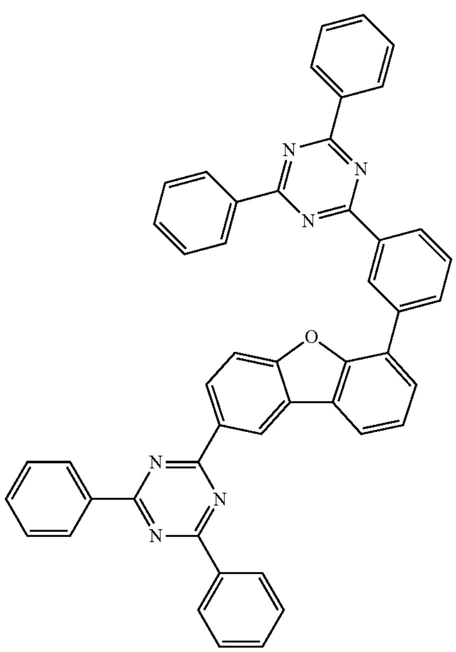
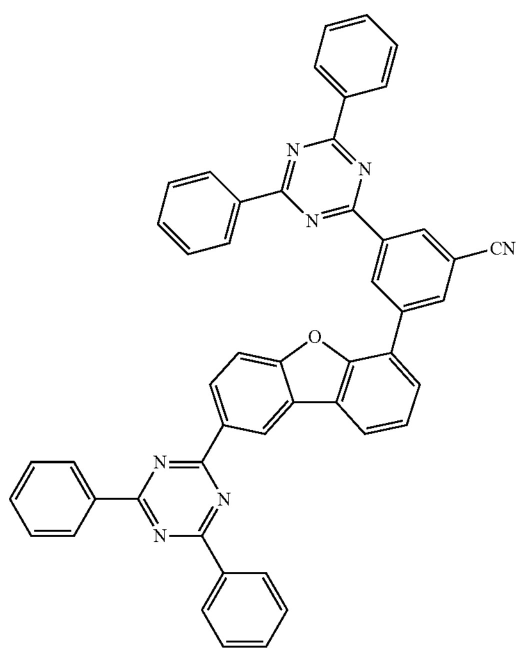

-continued
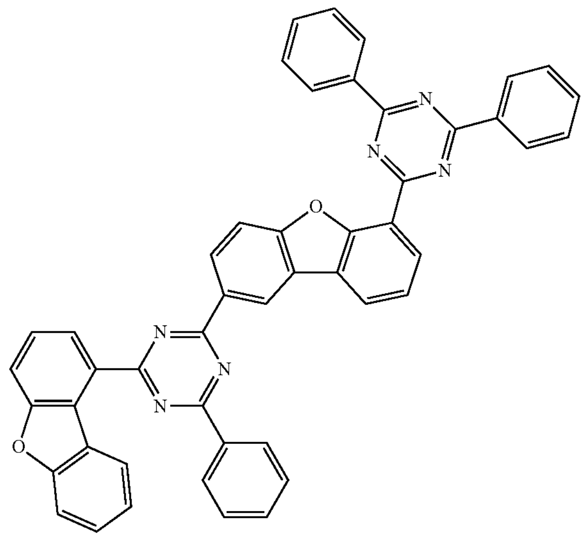
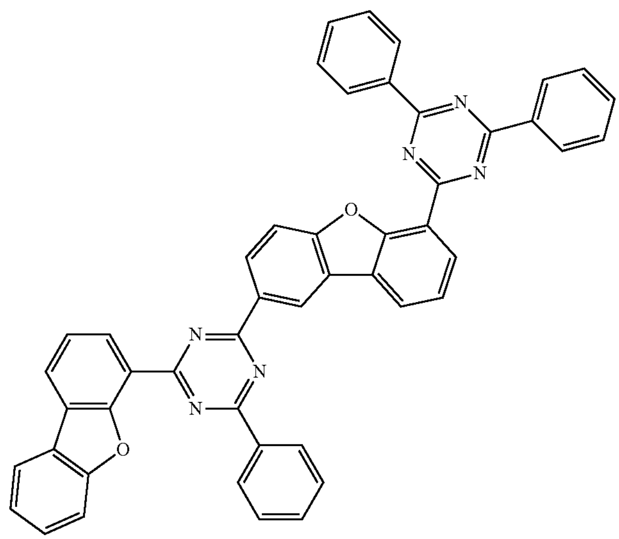
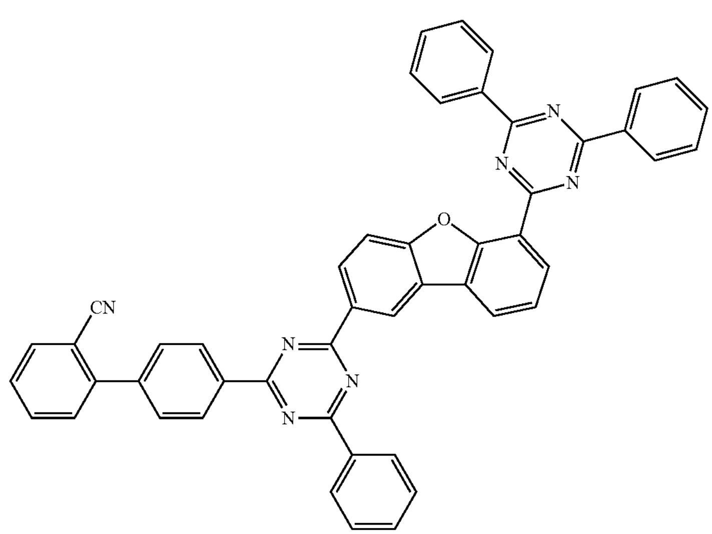

-continued
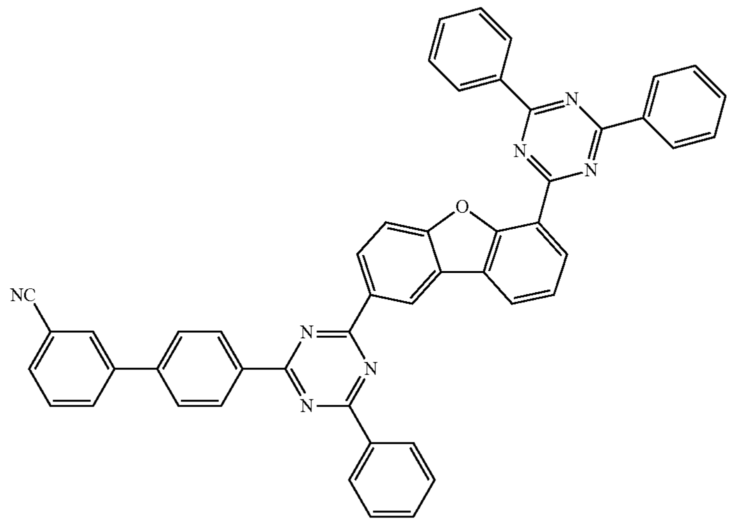
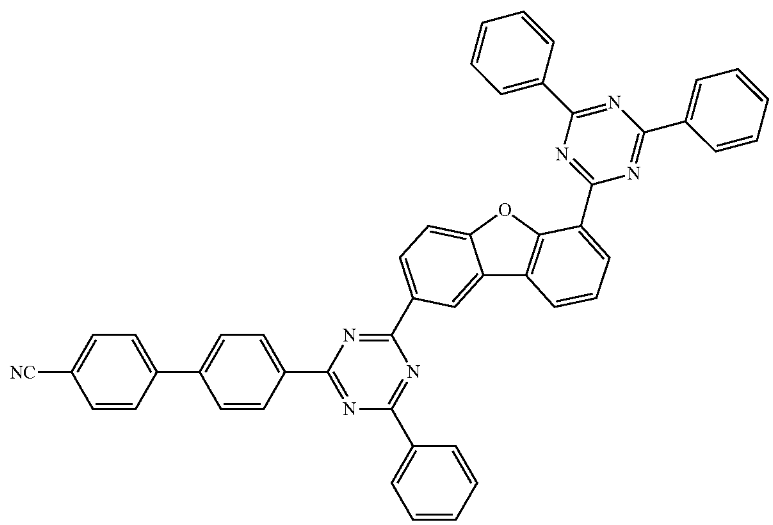
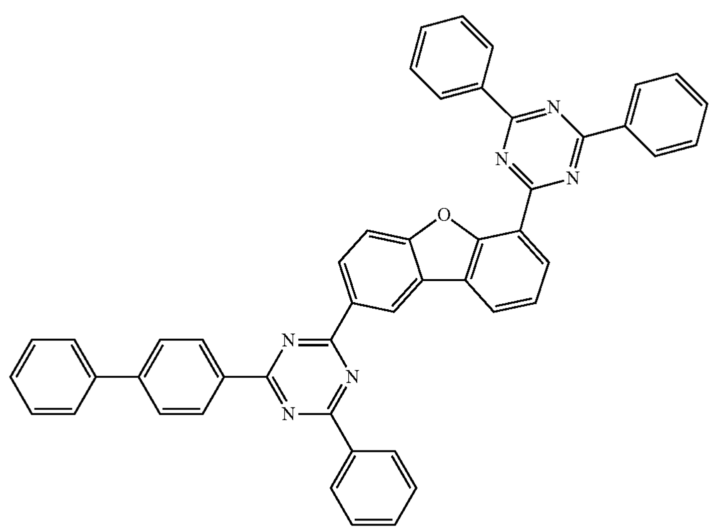

-continued
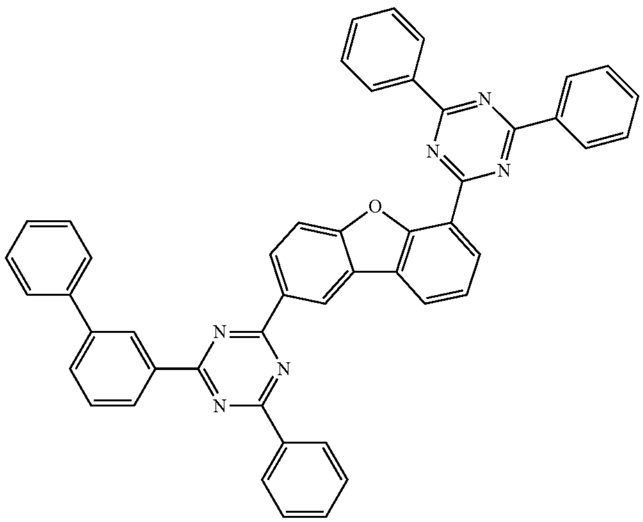
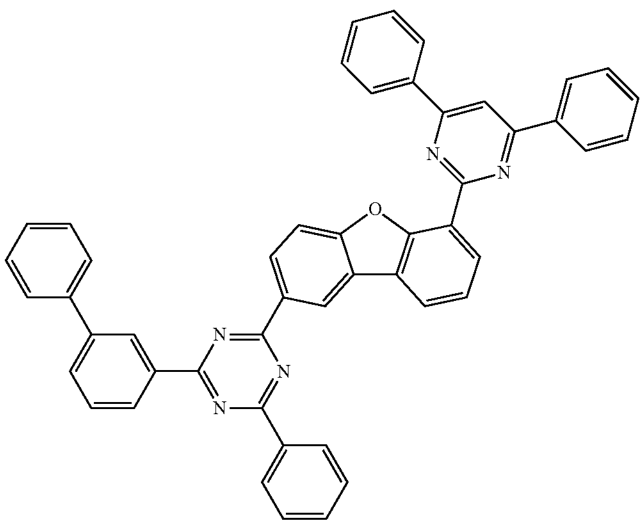
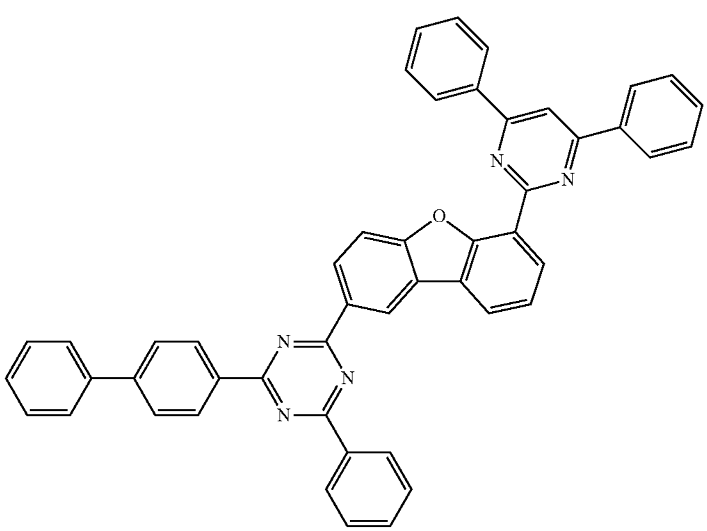

-continued
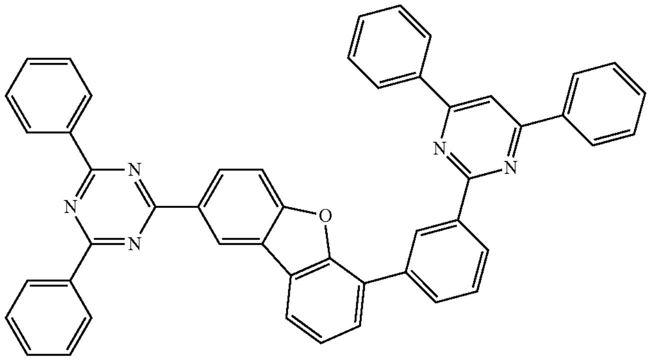
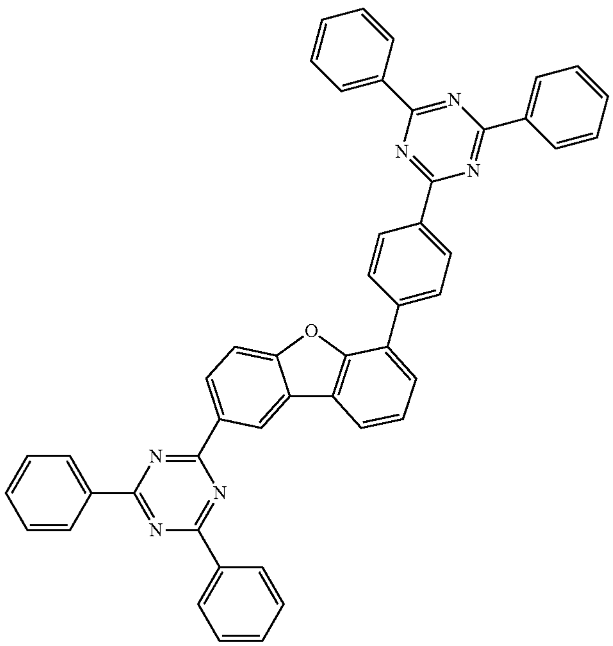
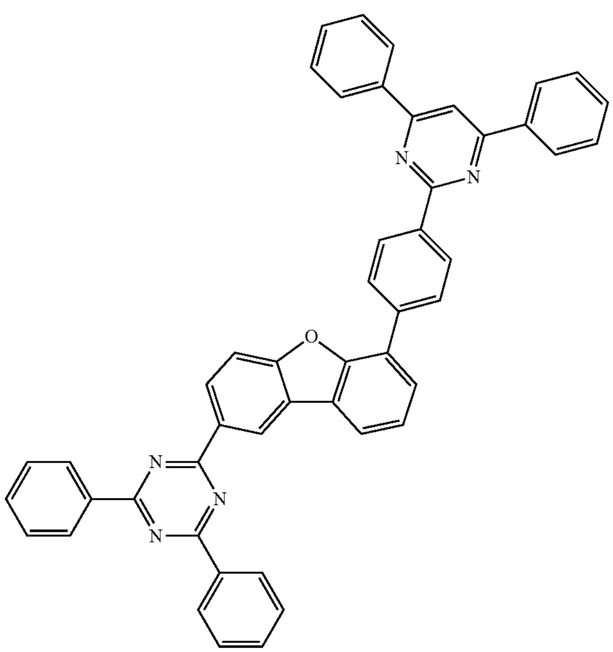
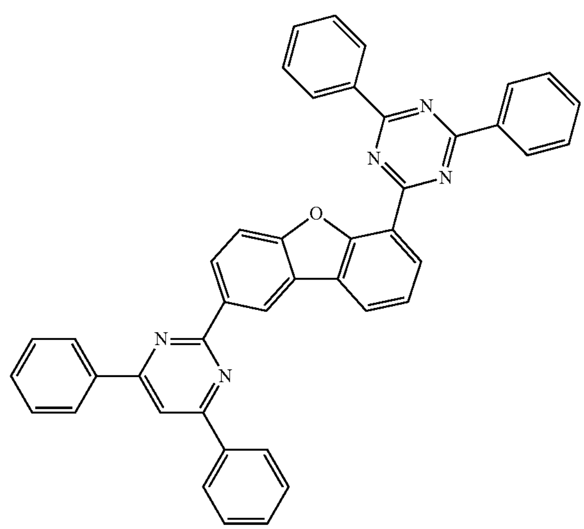

-continued
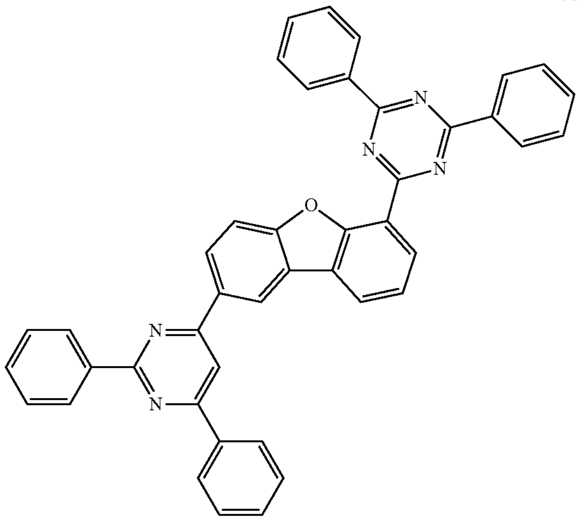
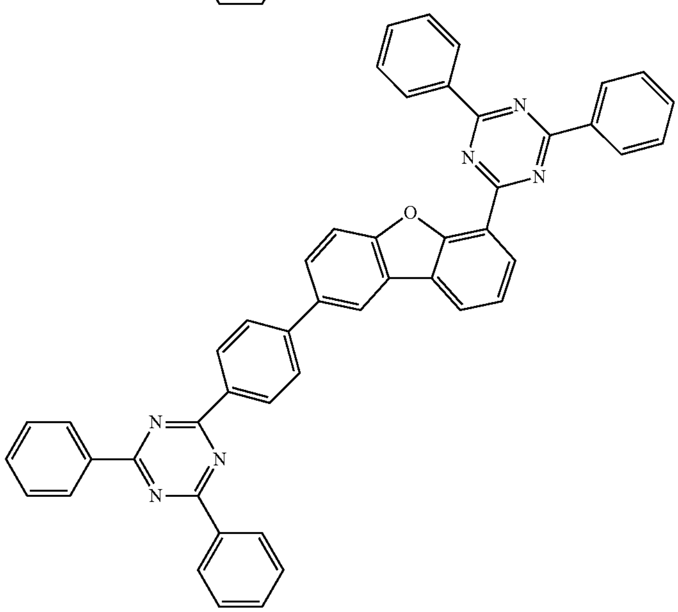
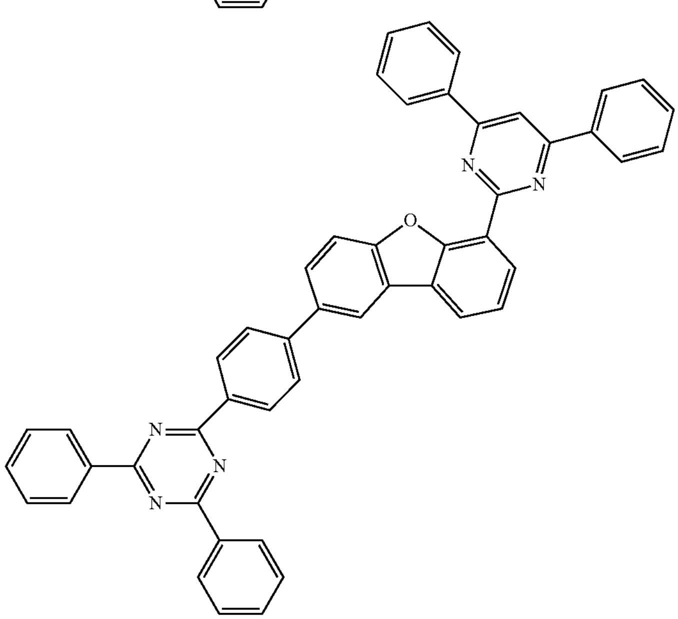

-continued
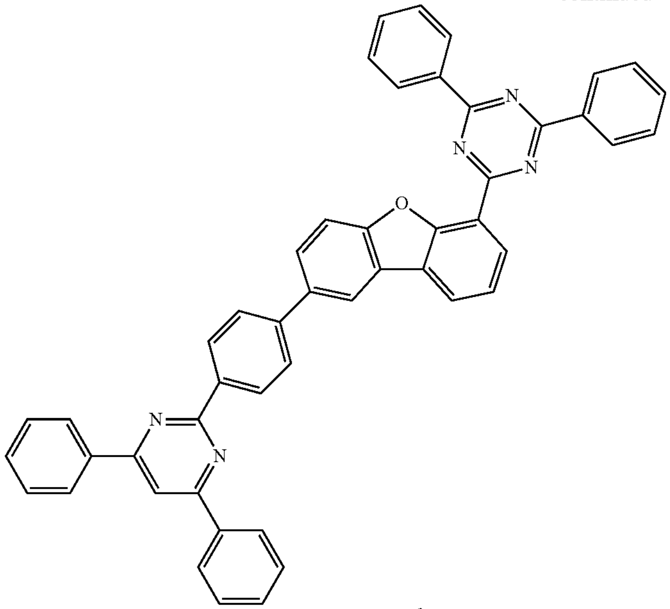
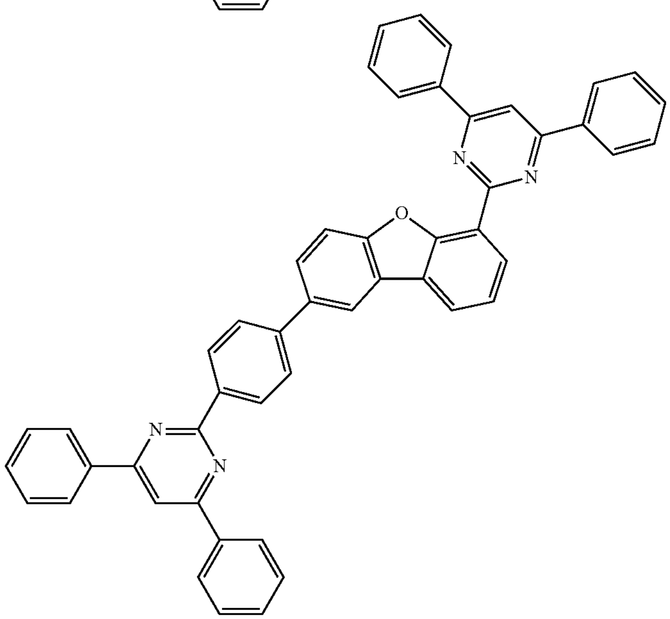
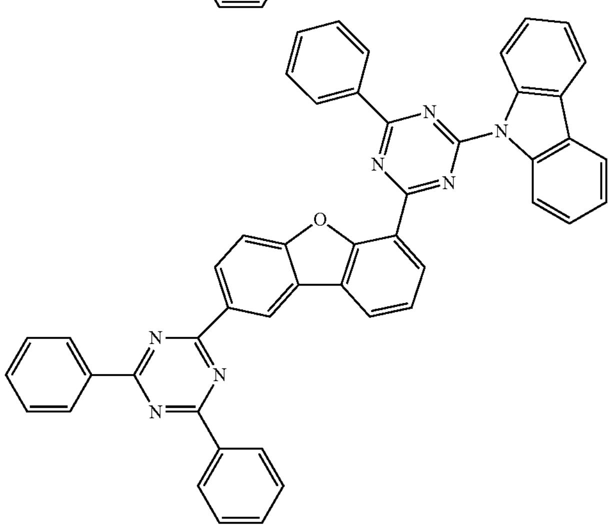

-continued
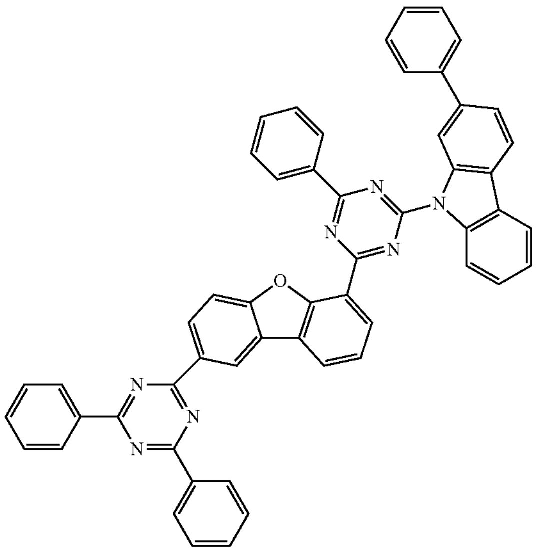
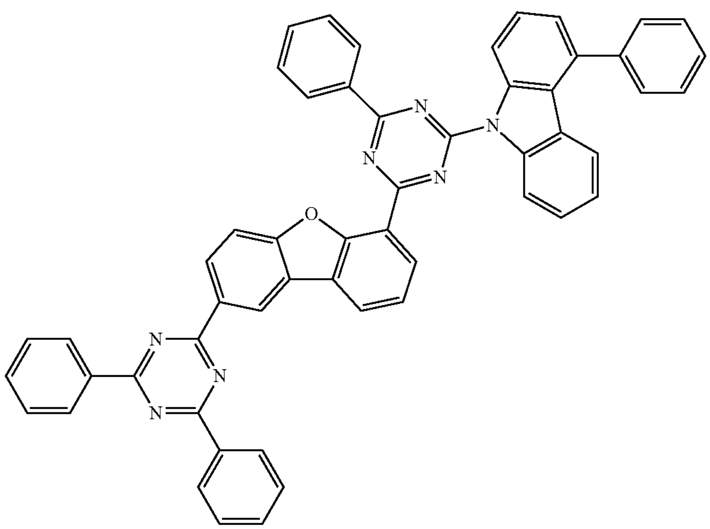
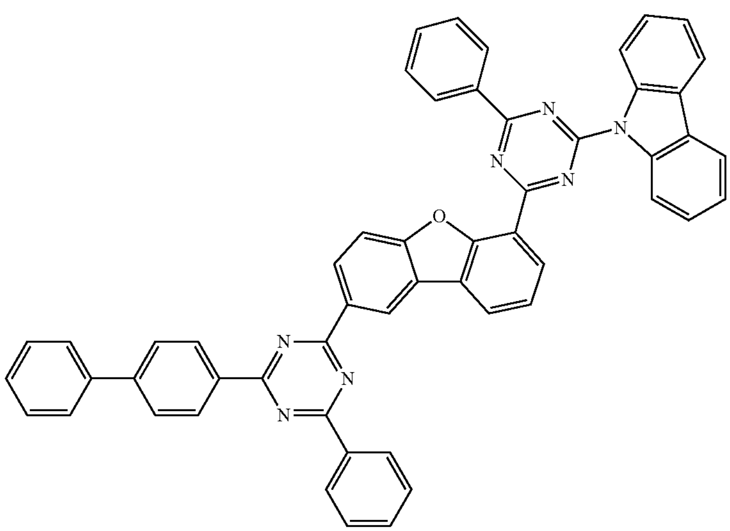

-continued
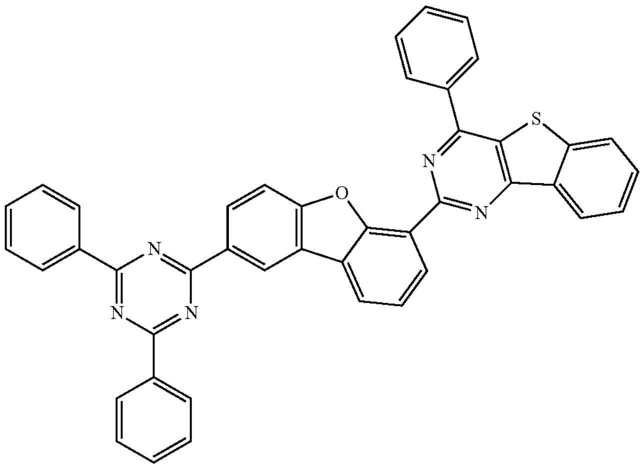
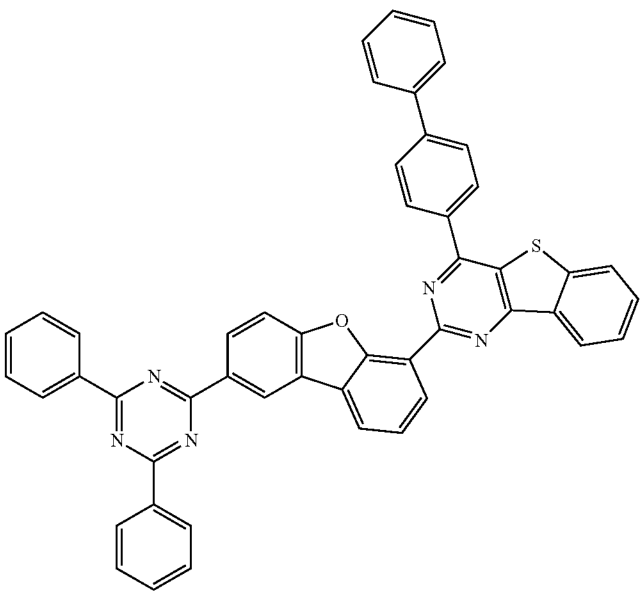
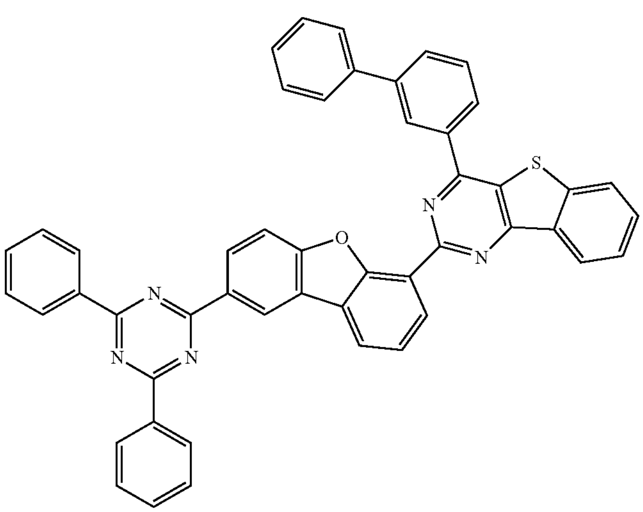

-continued
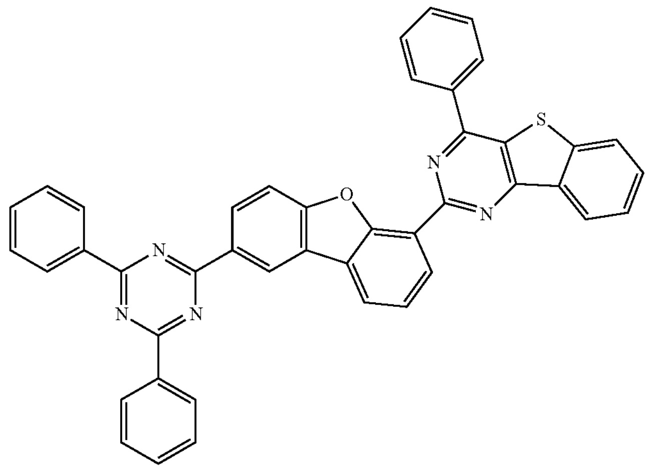
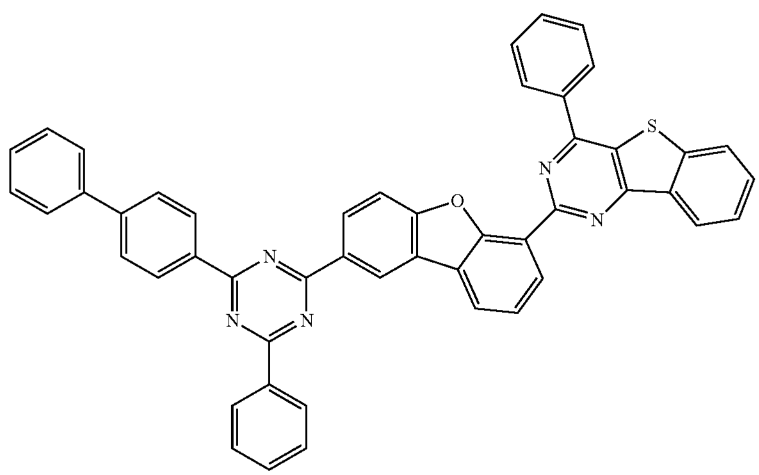
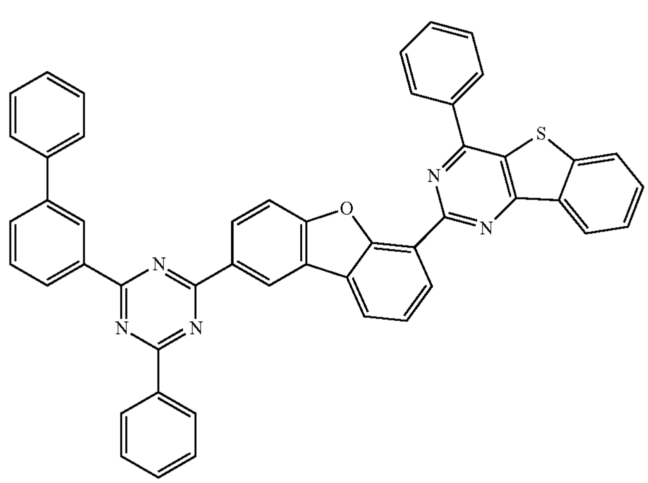

-continued
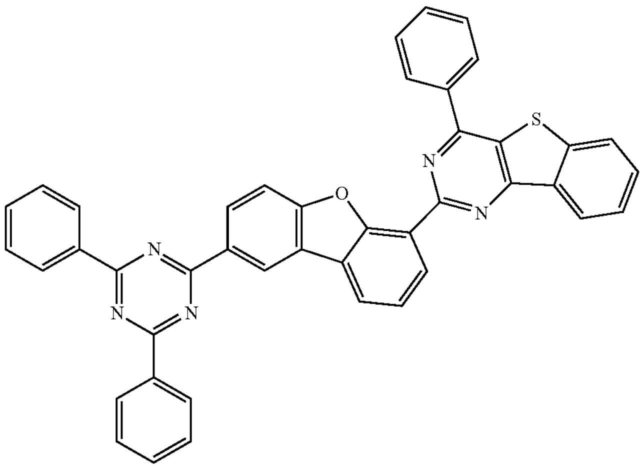
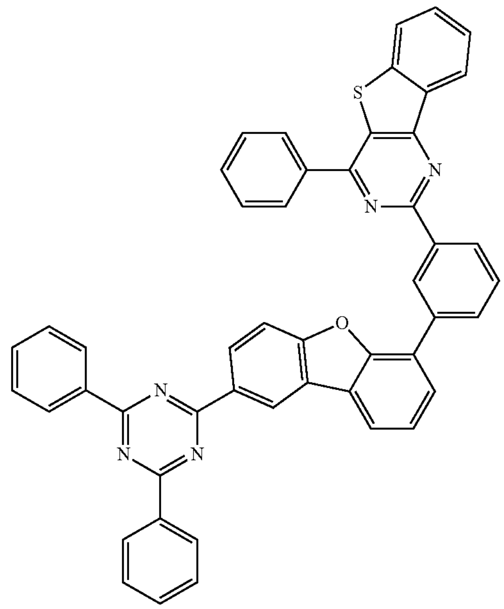
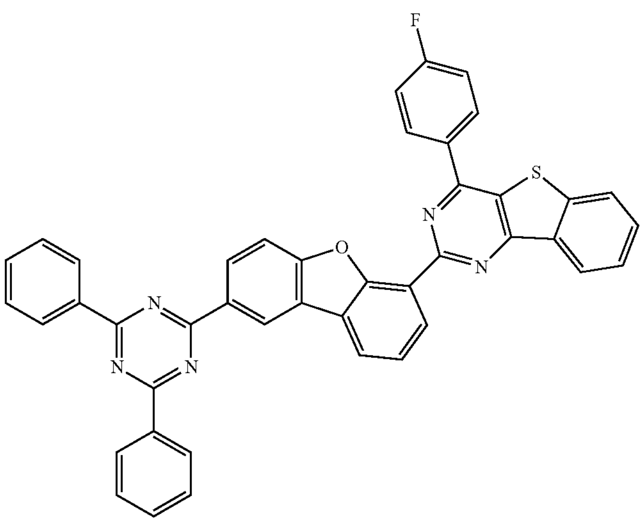
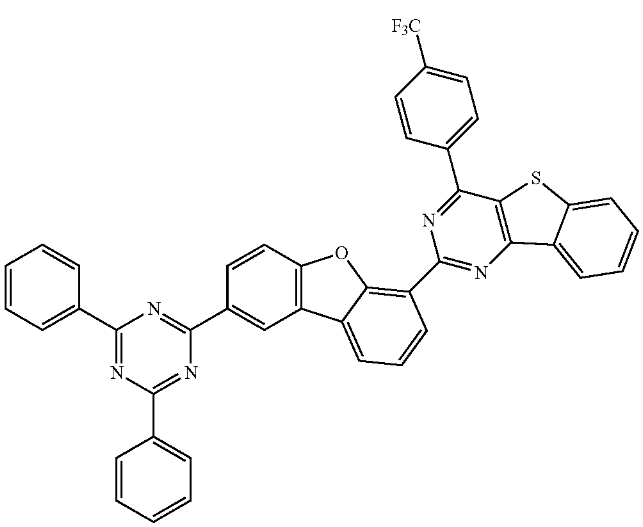

-continued
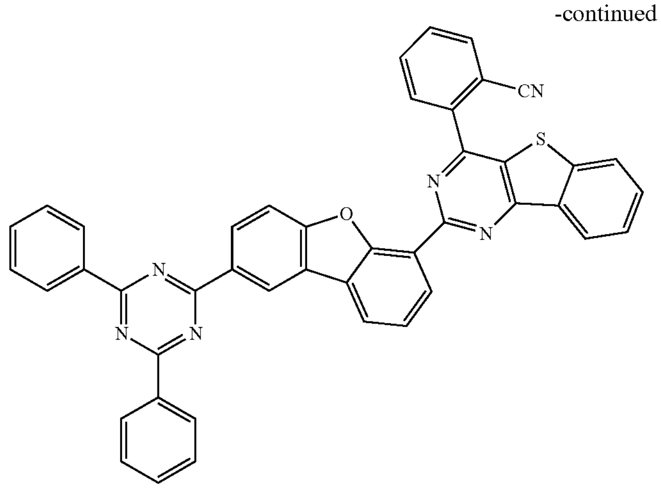
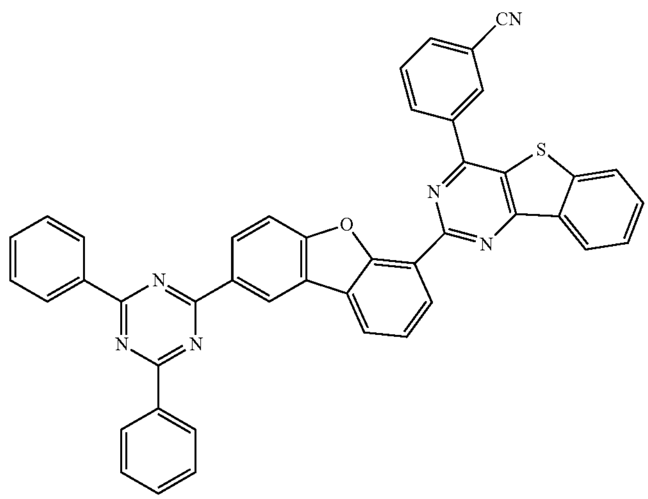
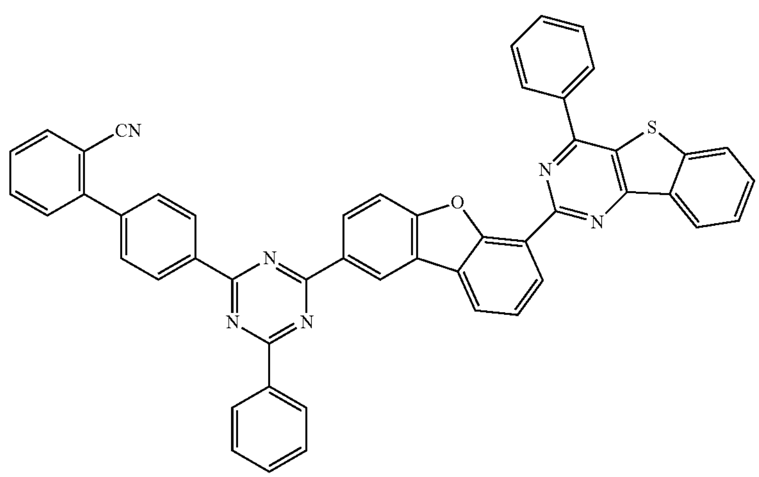

-continued
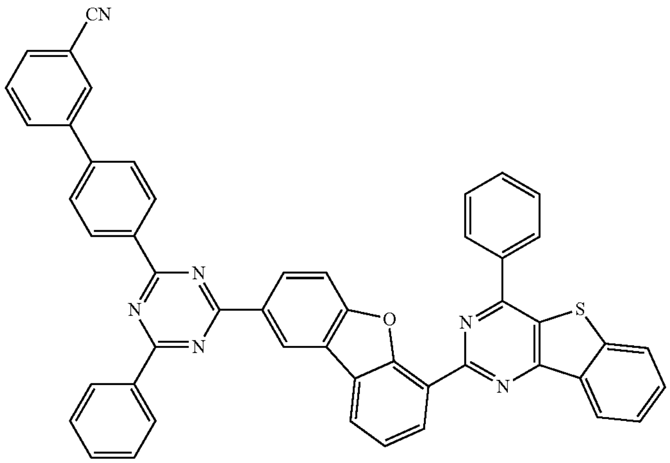
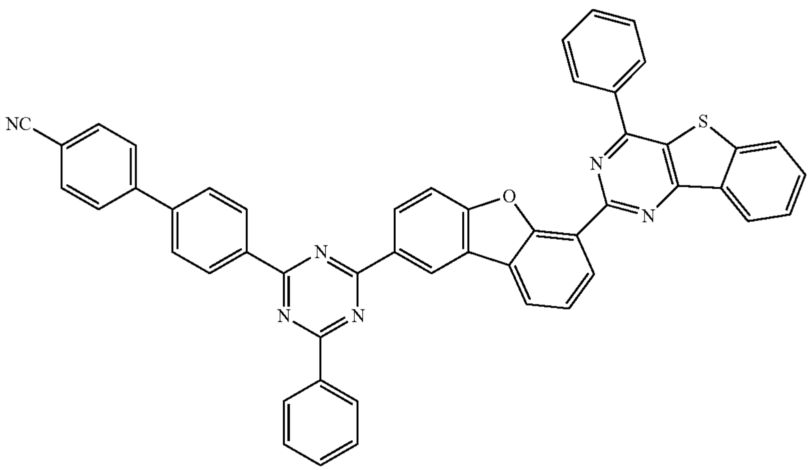
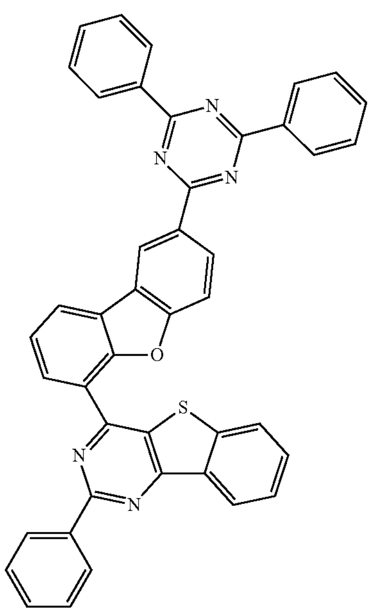
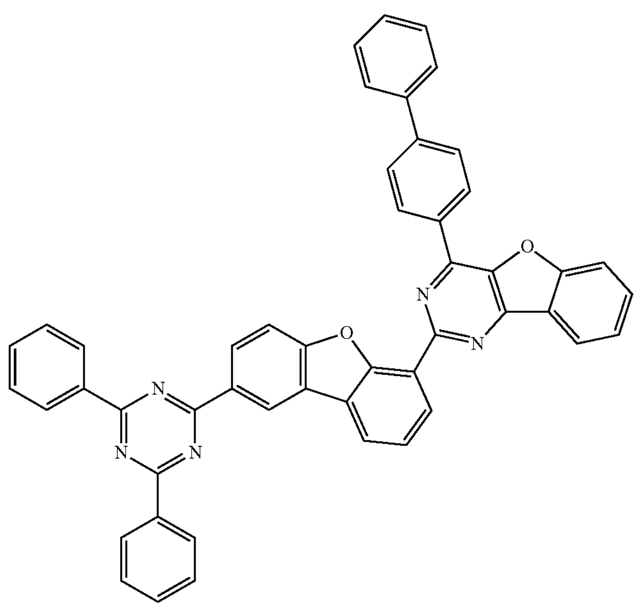

-continued
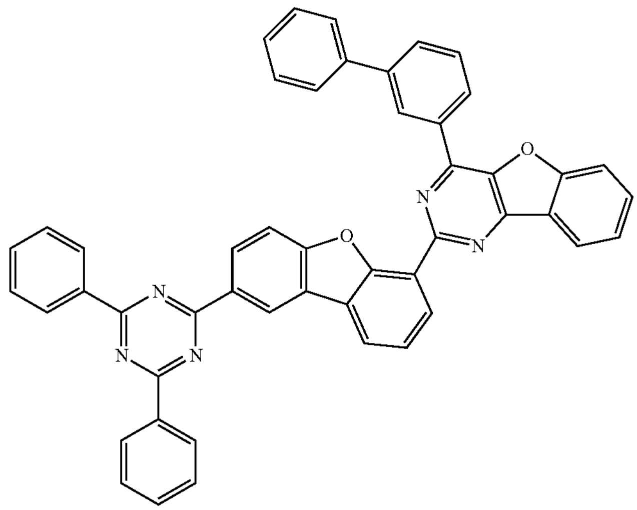
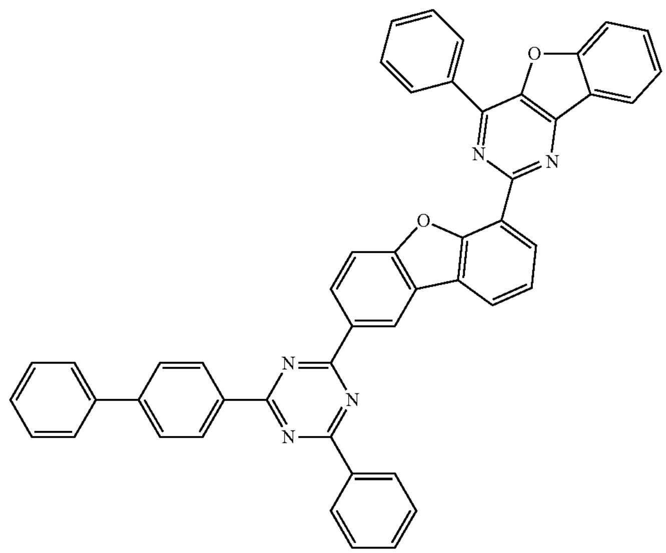
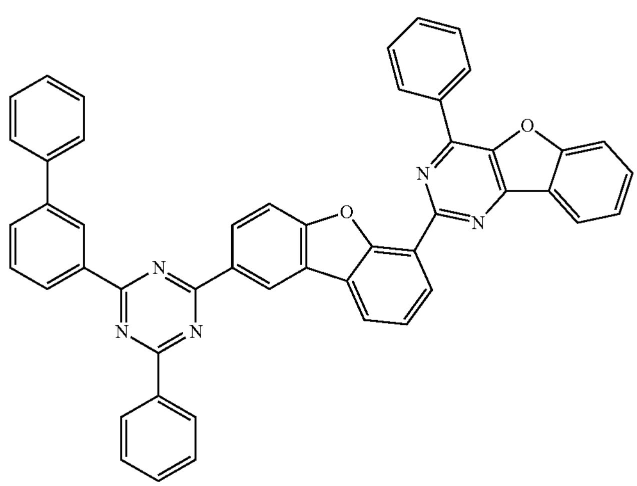
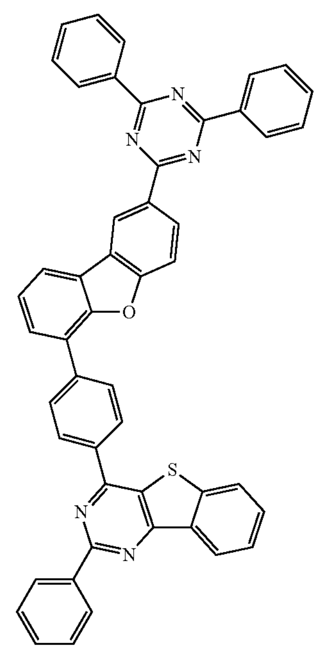

-continued
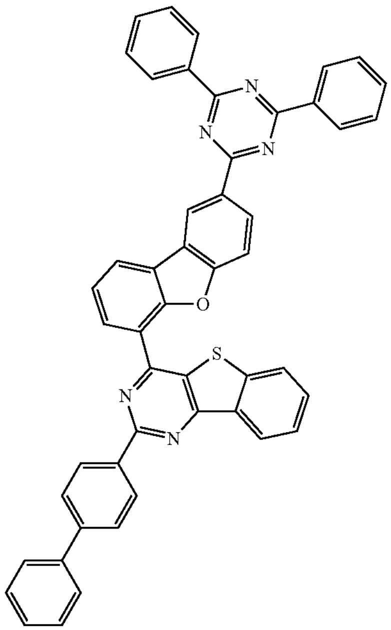
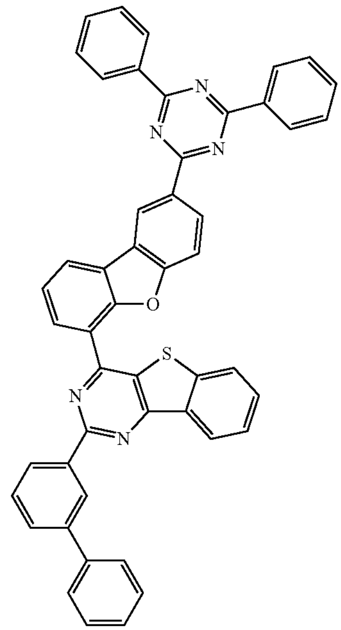
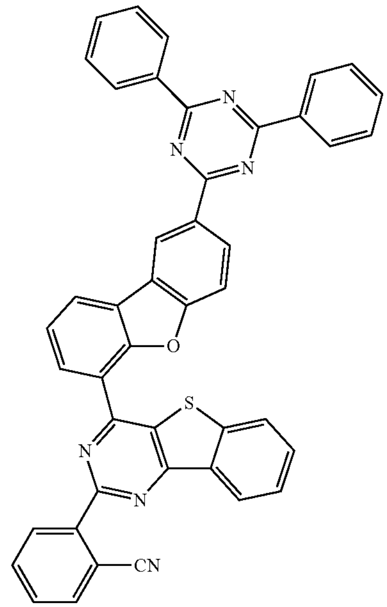
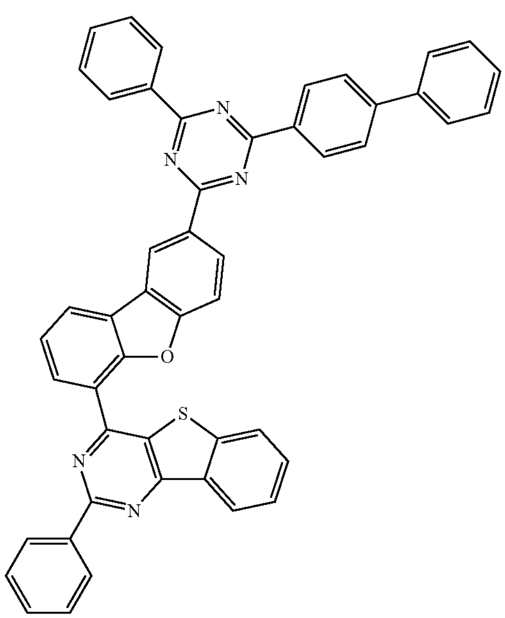
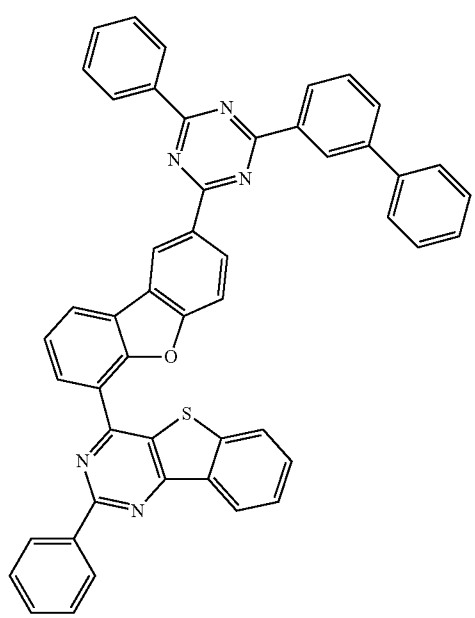

-continued
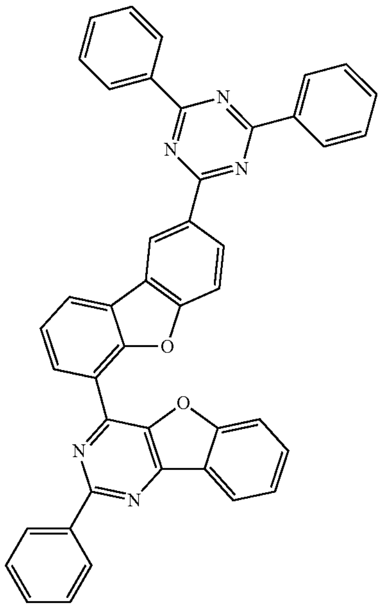
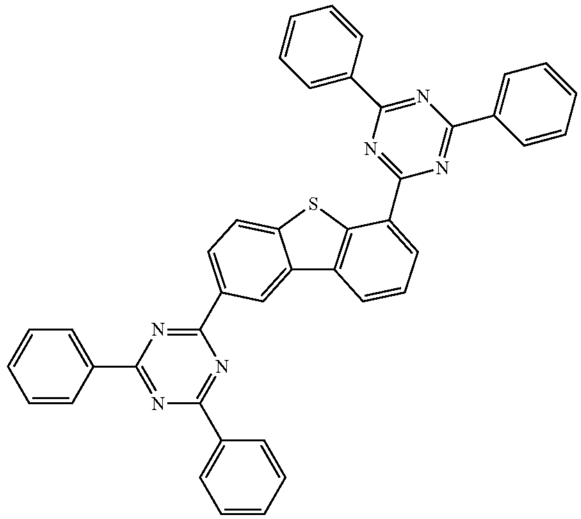
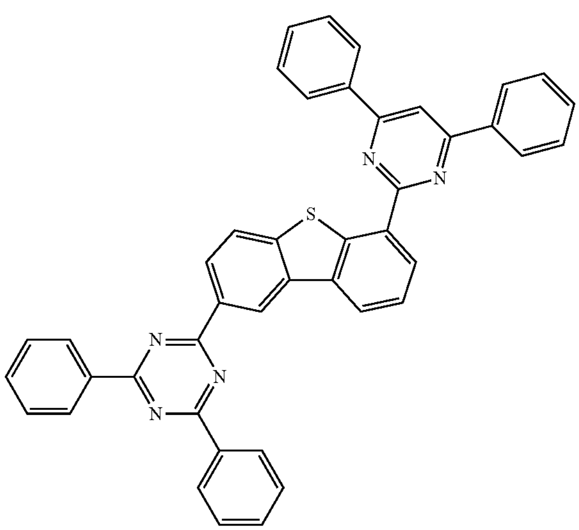
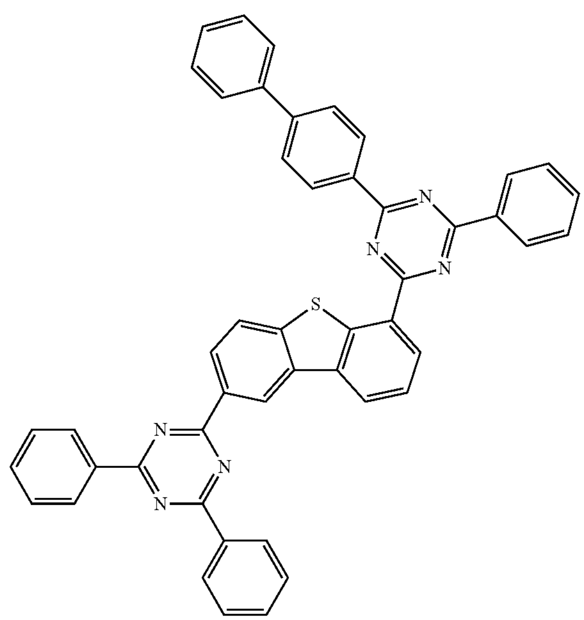

-continued
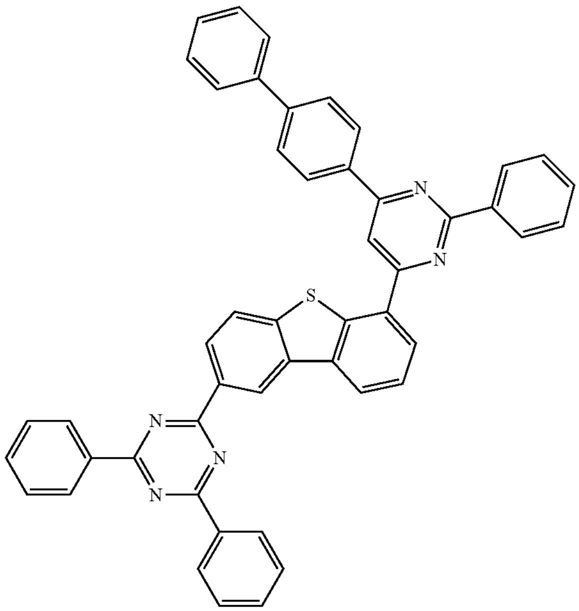
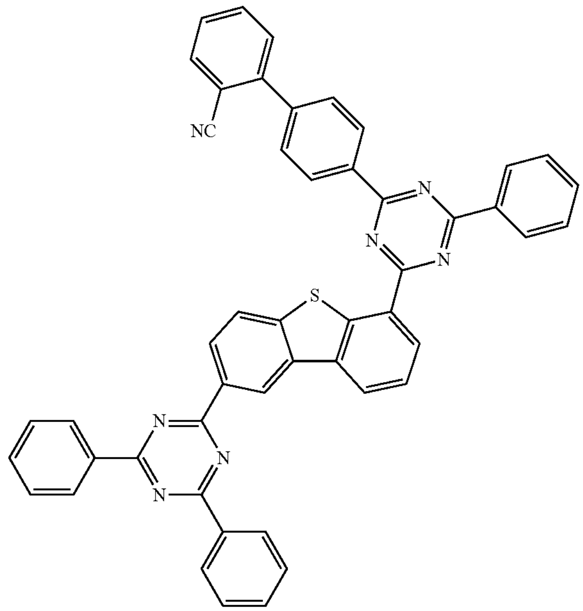
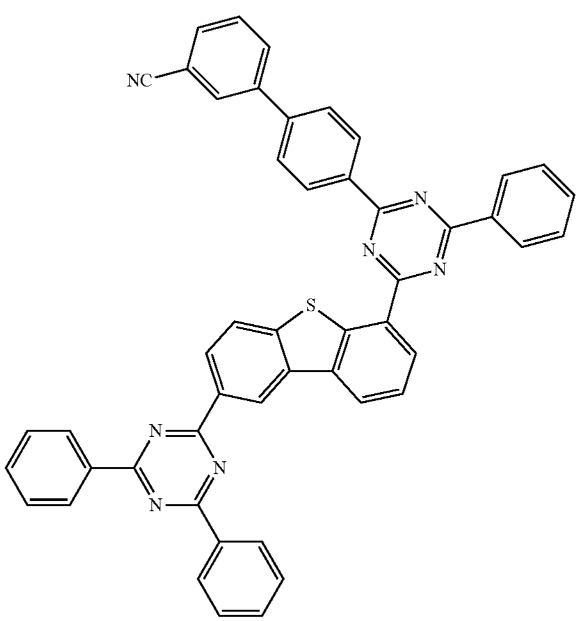
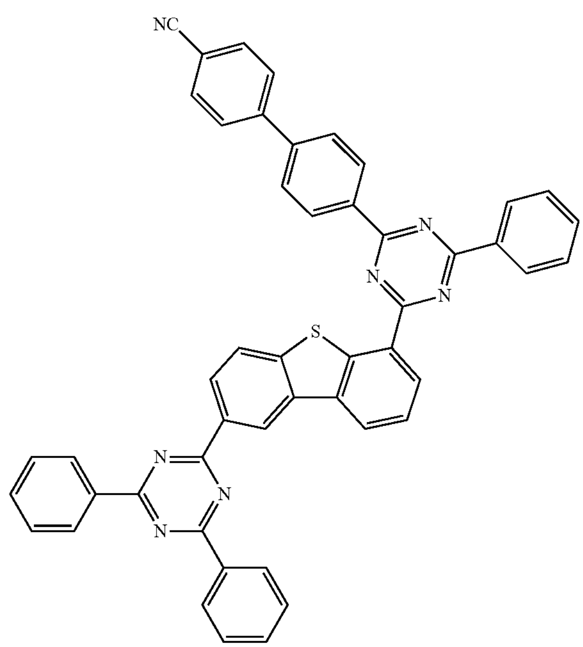

-continued
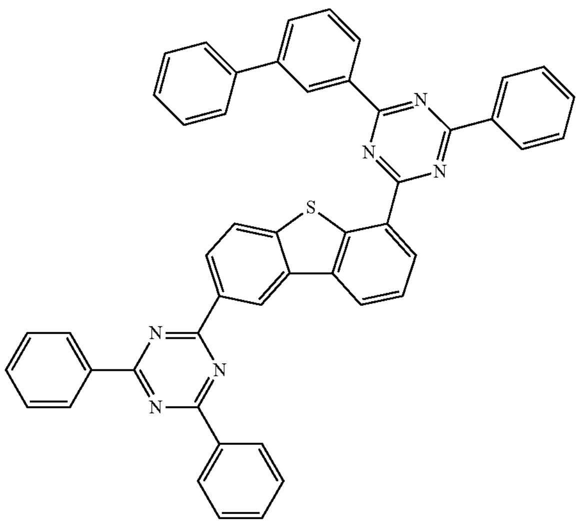
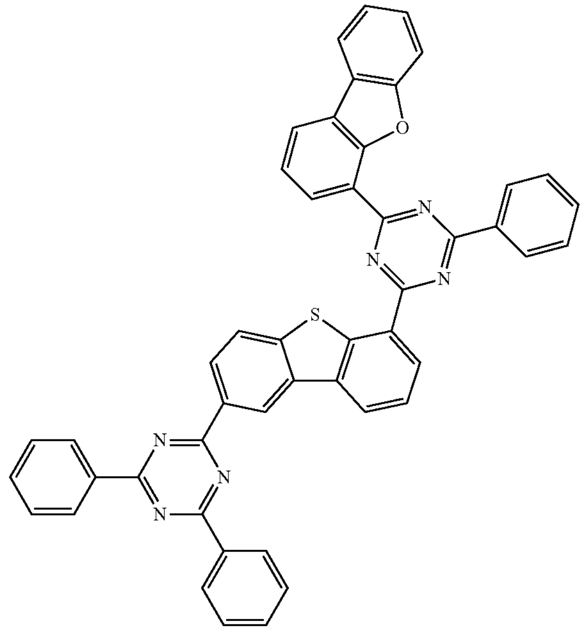
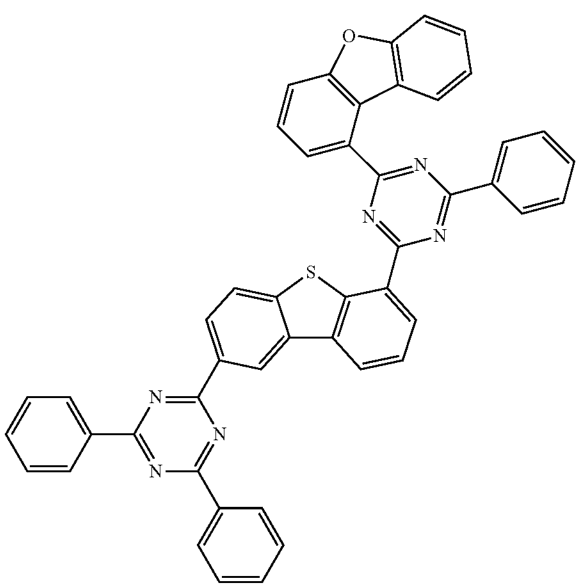
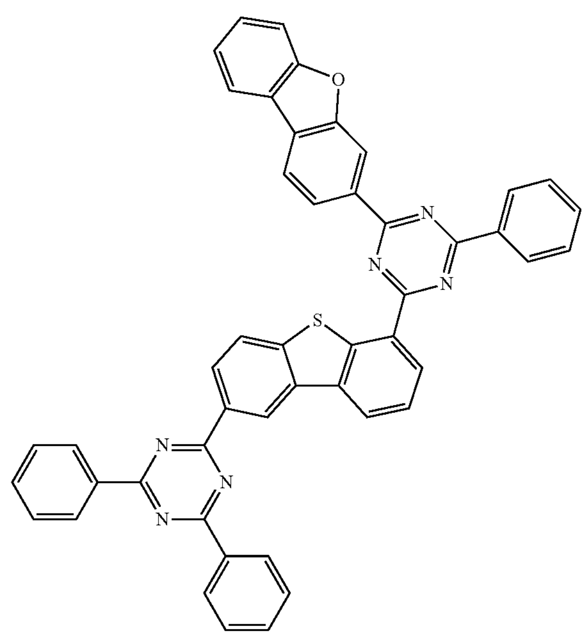

-continued
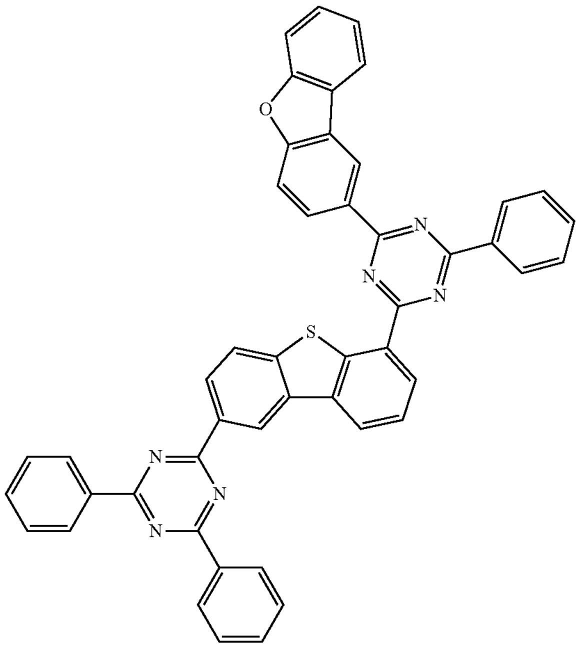
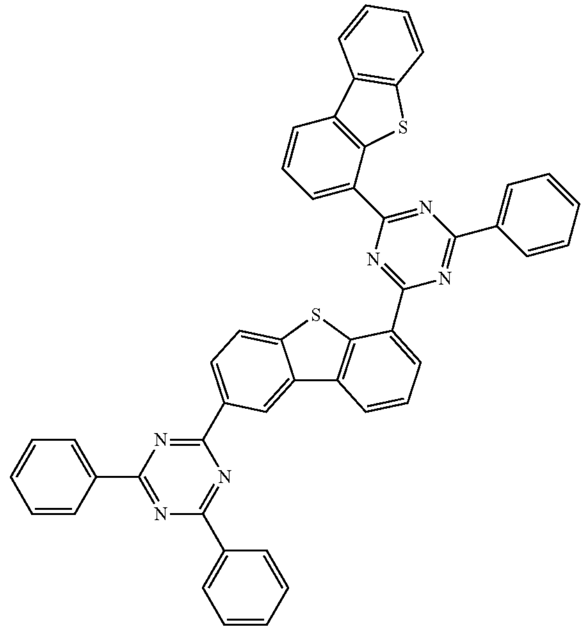
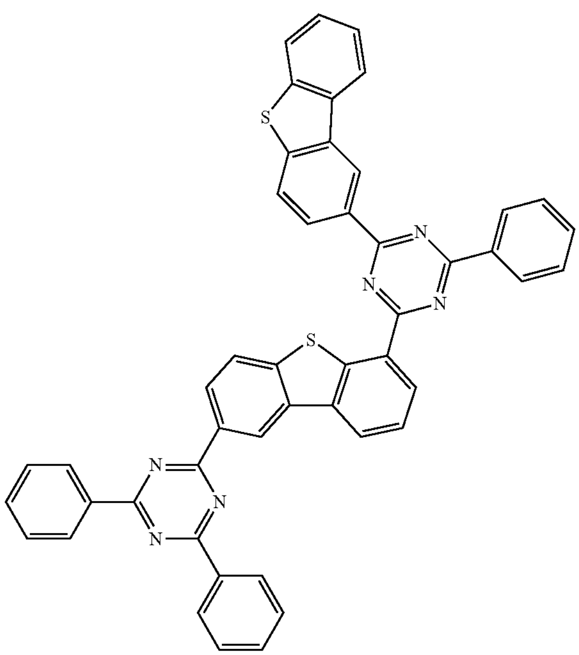
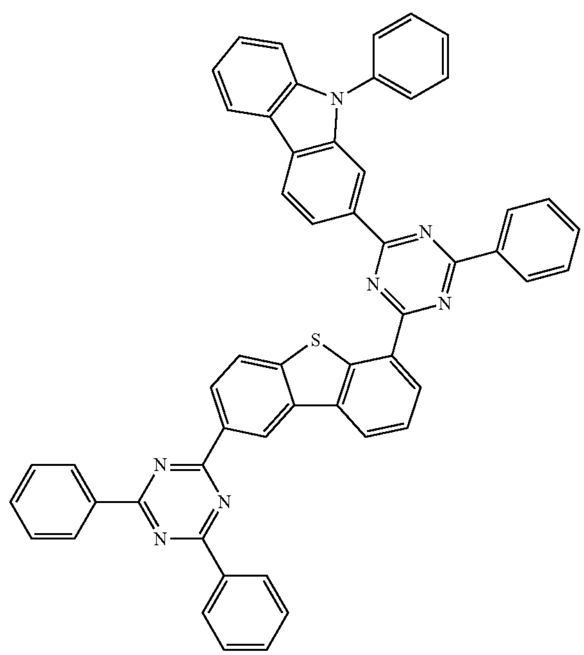

-continued
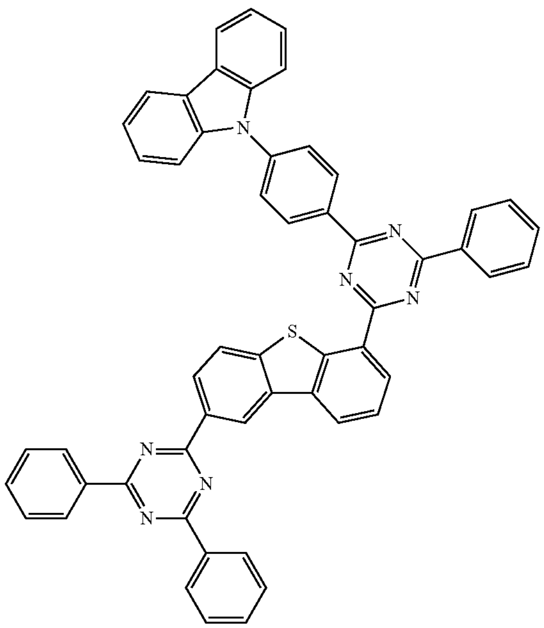
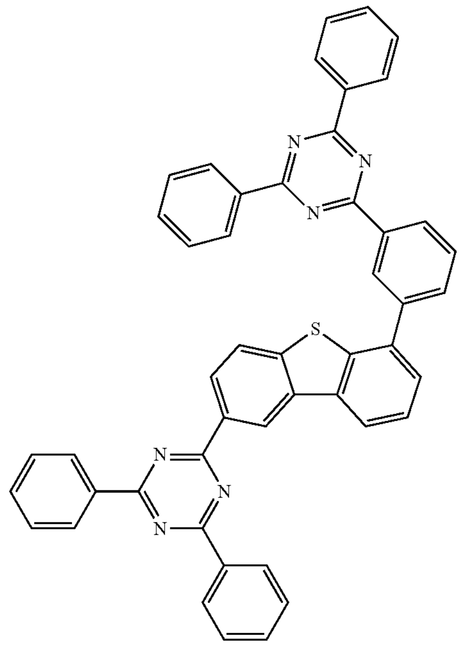
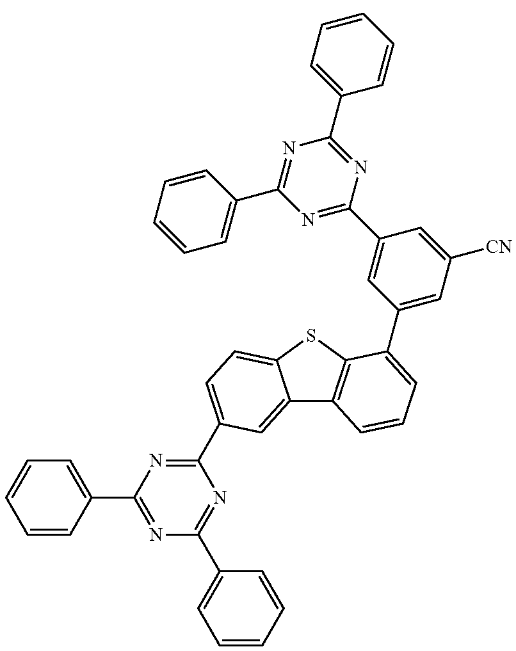
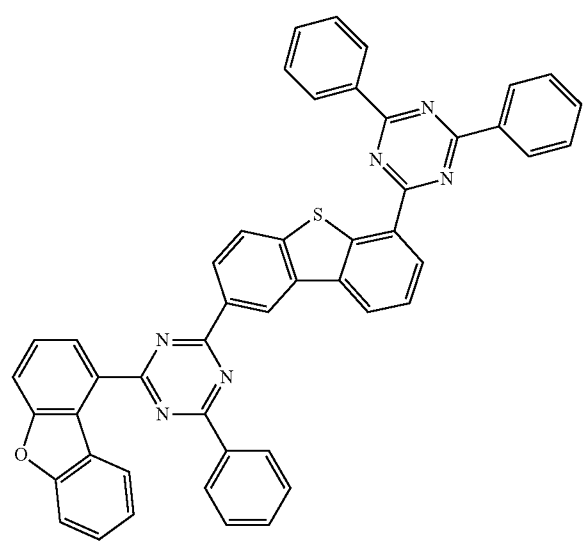

-continued
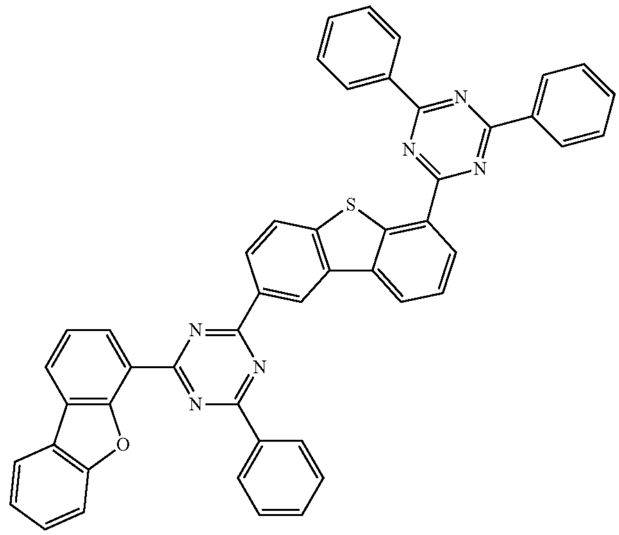
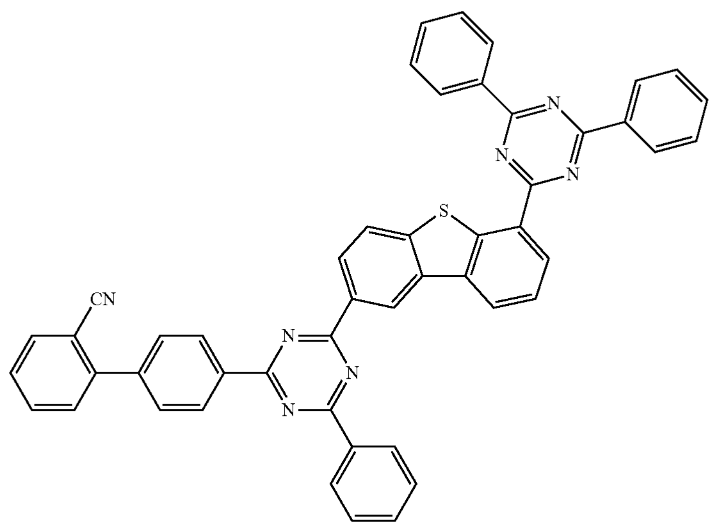
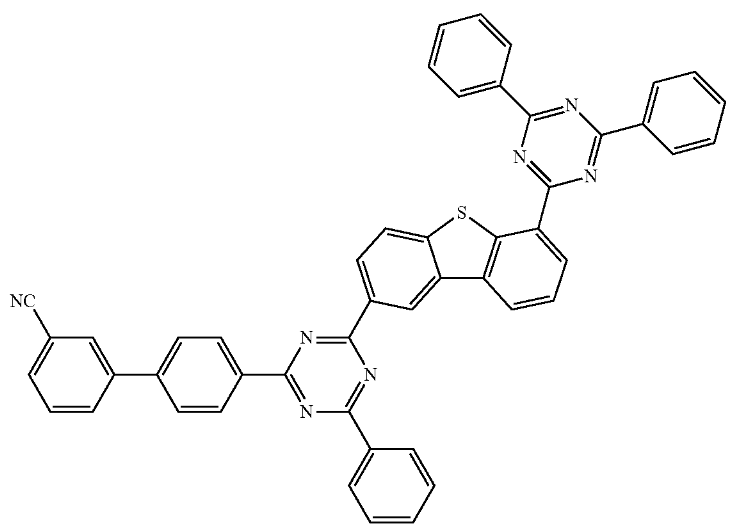

-continued
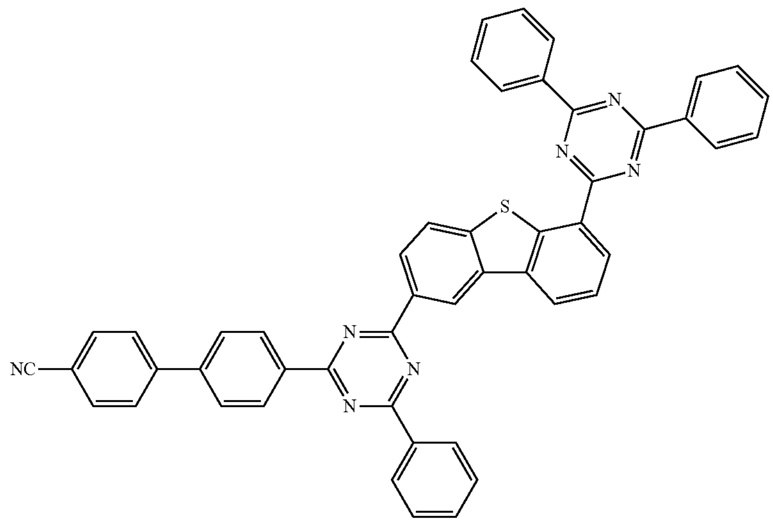
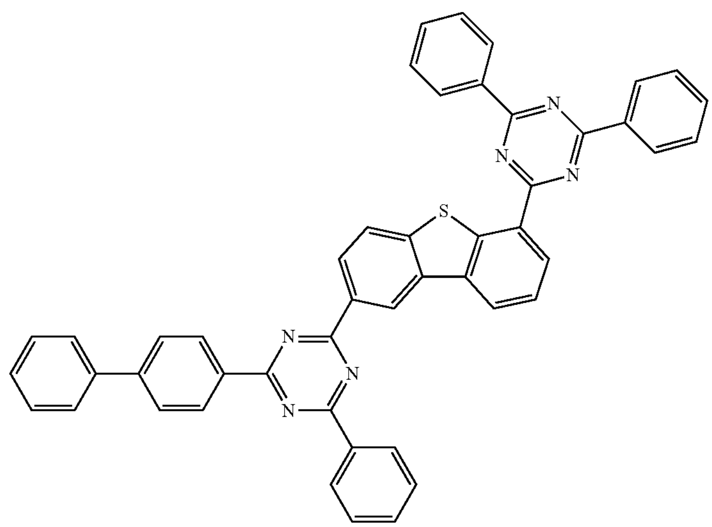
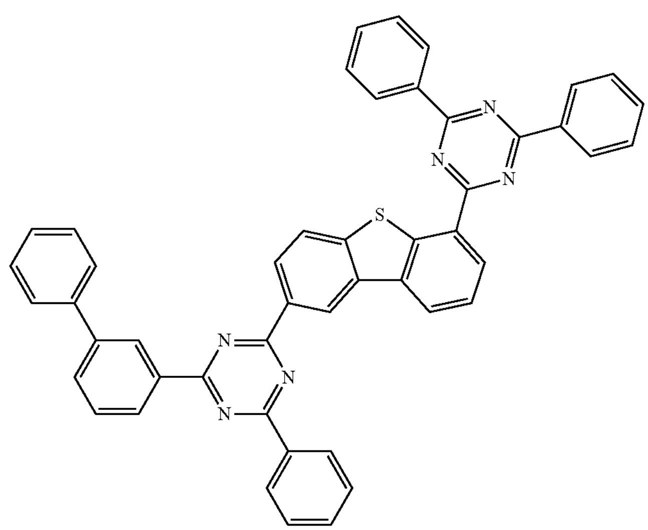

-continued
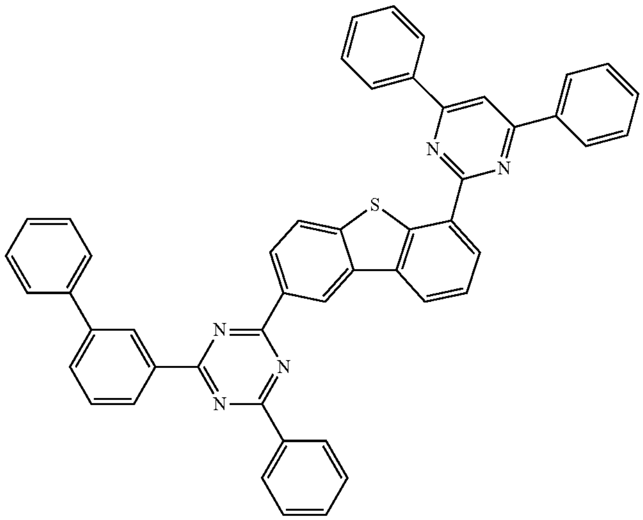
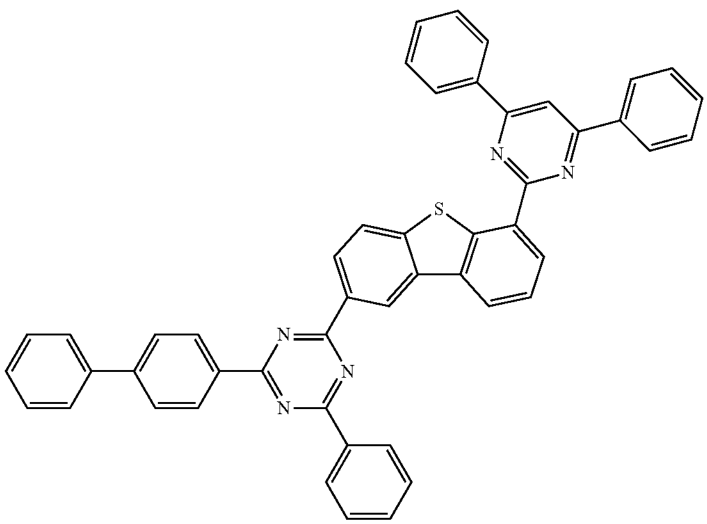
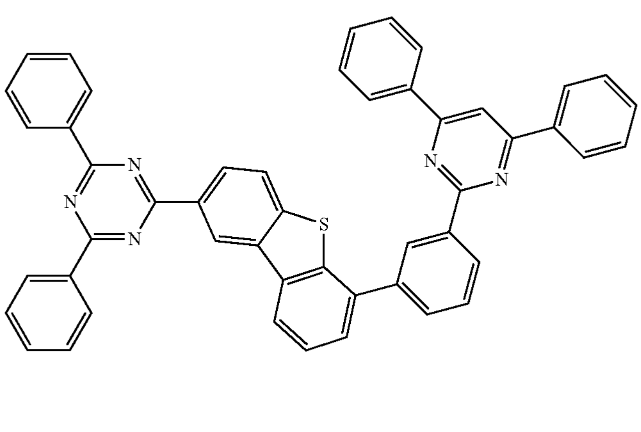

-continued
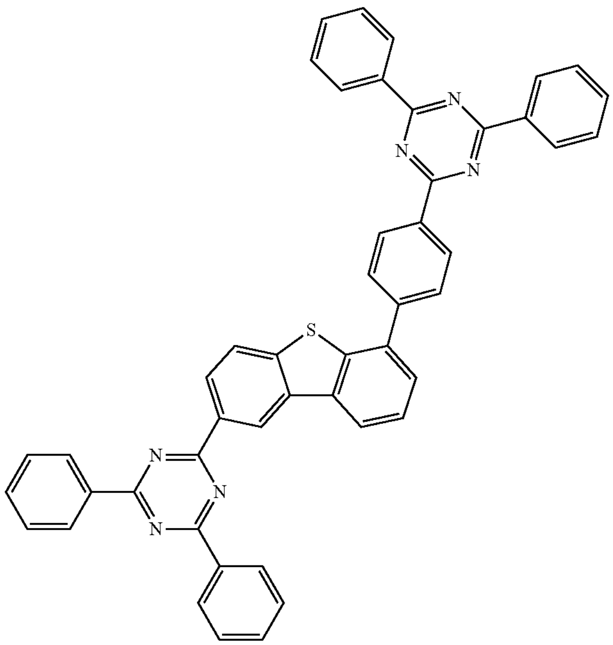
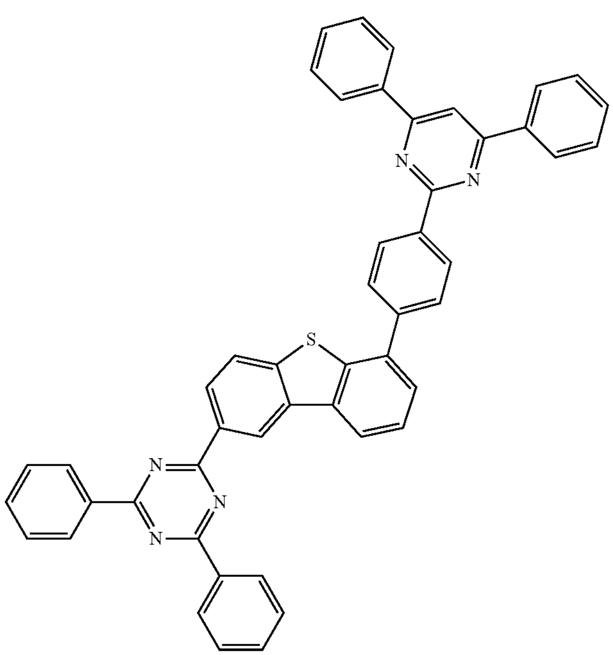

-continued
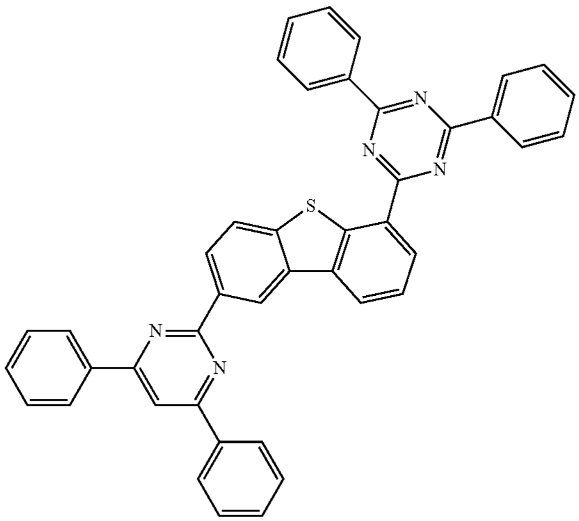
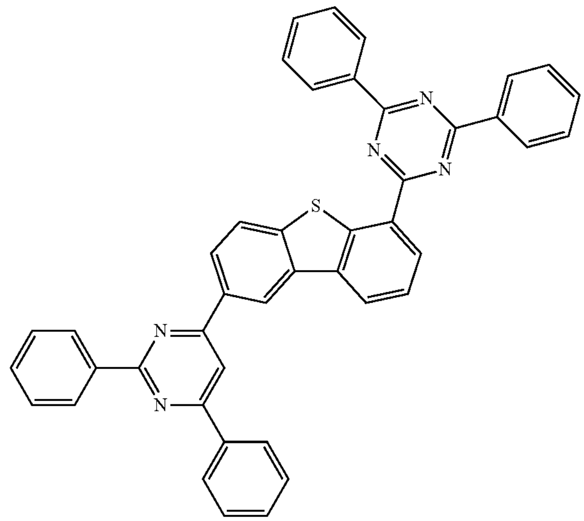
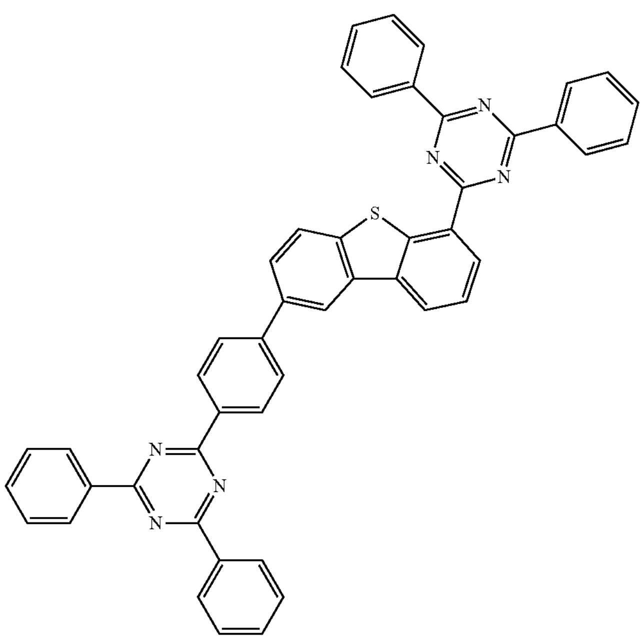

-continued
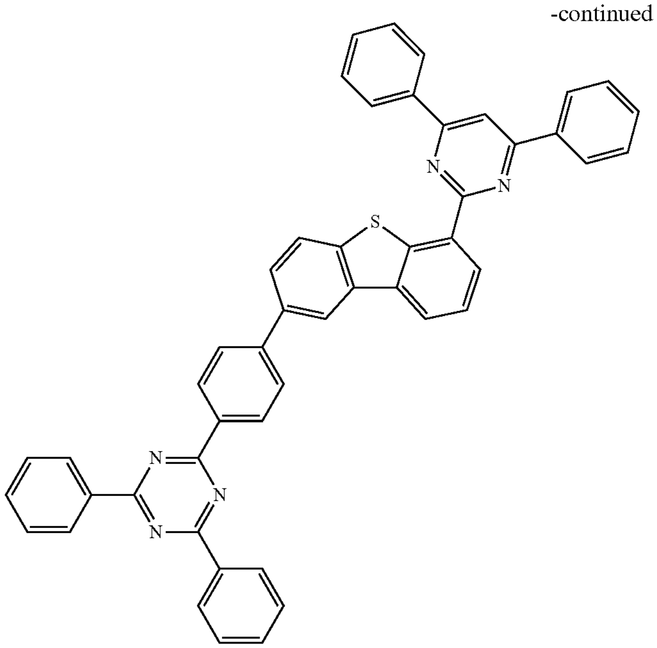
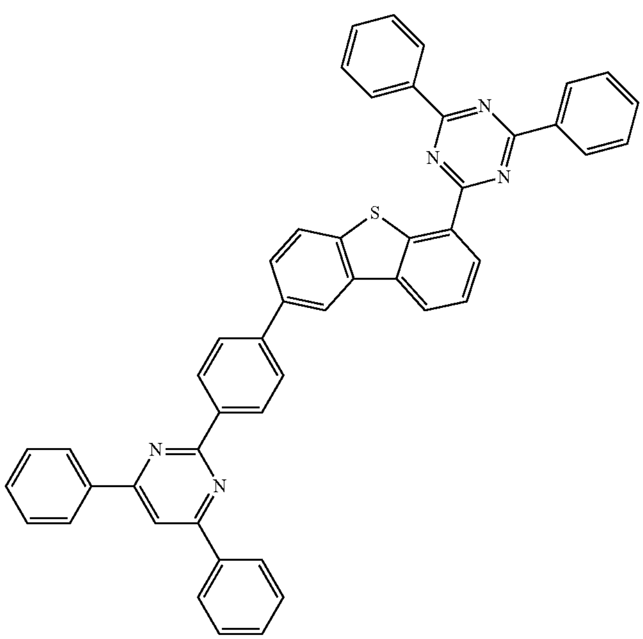

-continued
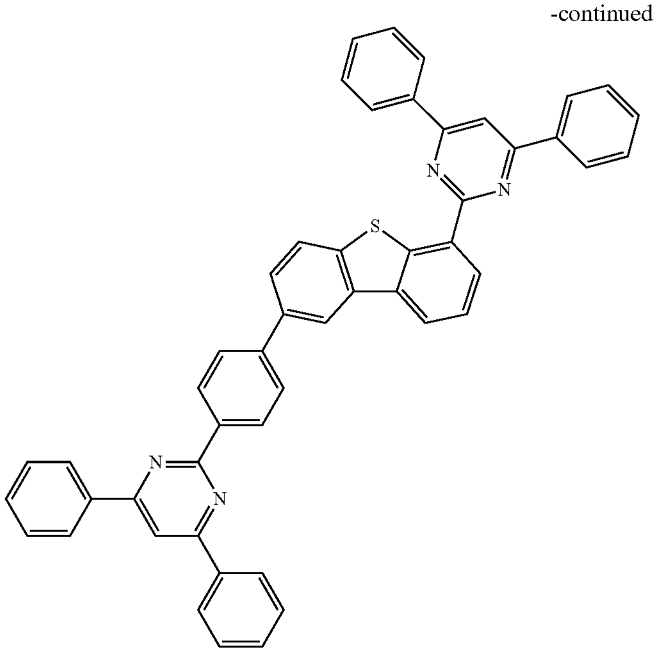
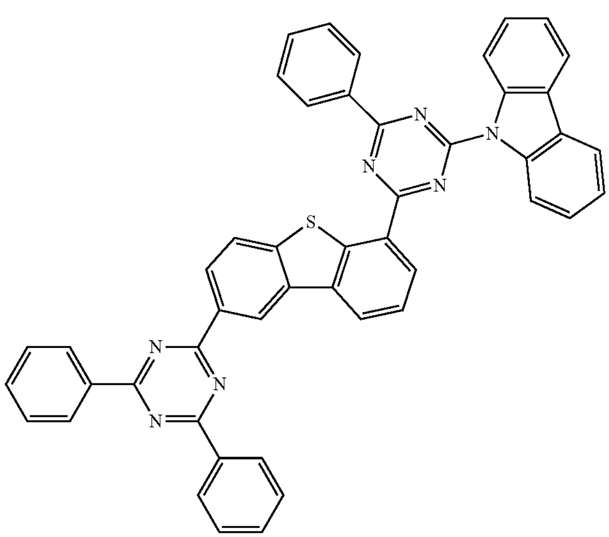

-continued
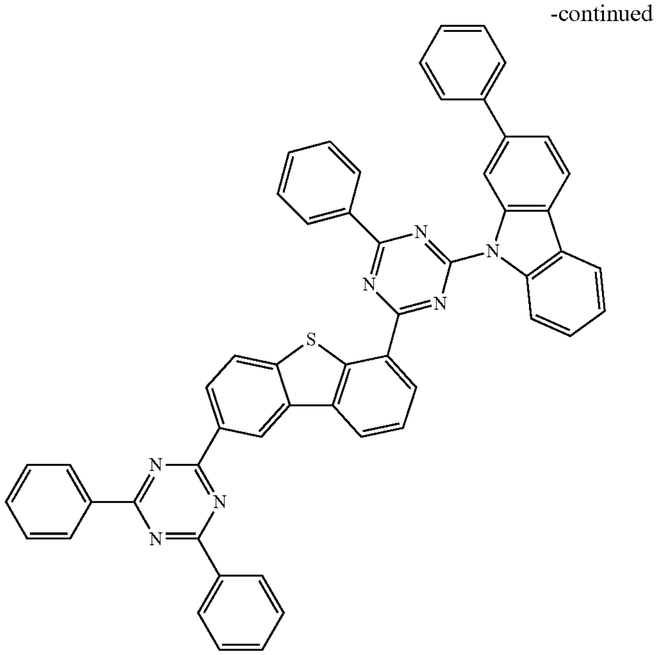
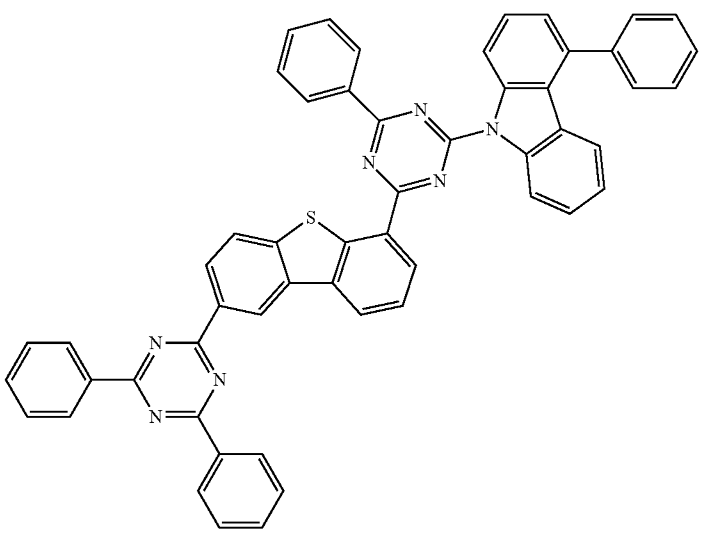
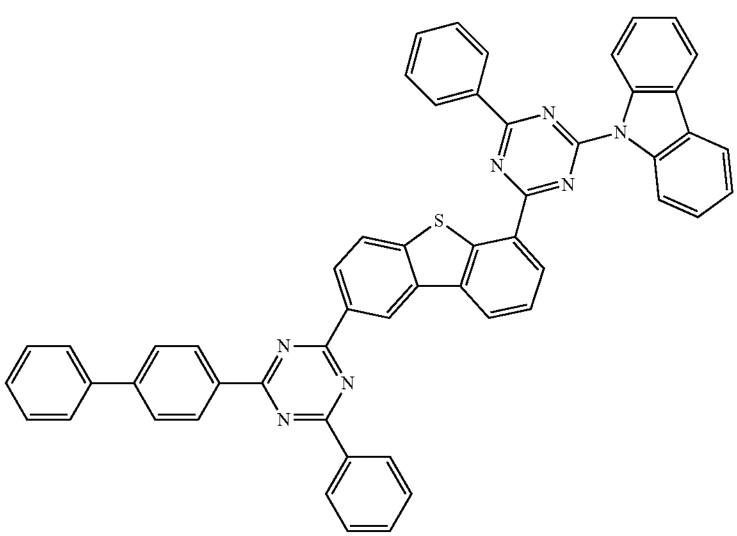

-continued
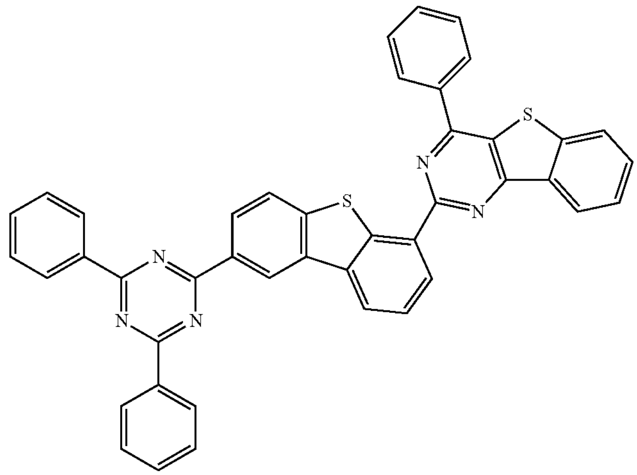
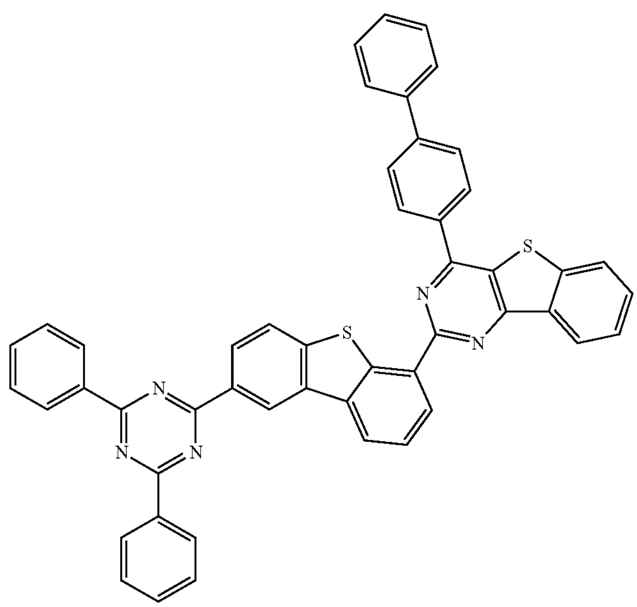
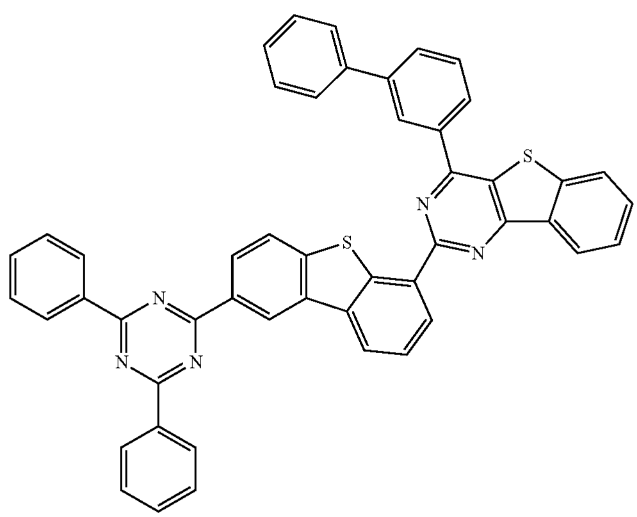

-continued
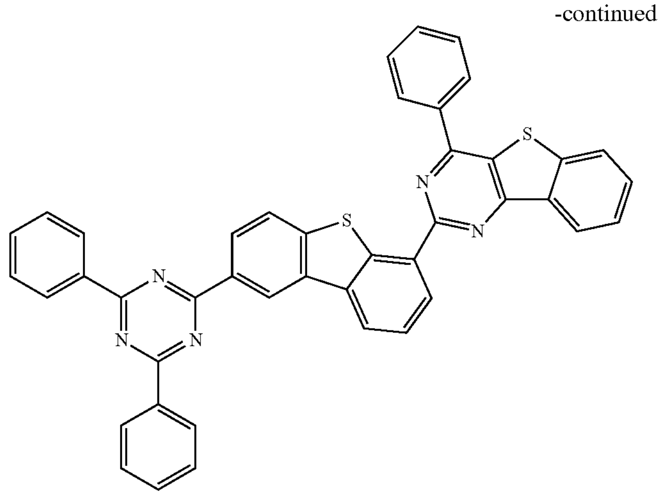
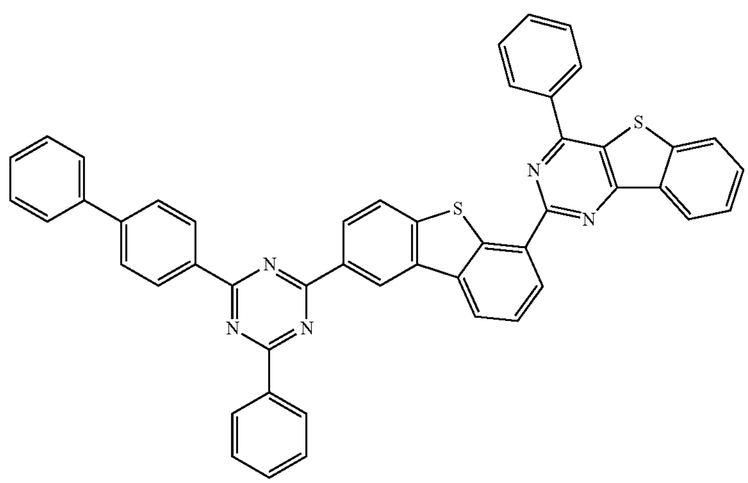
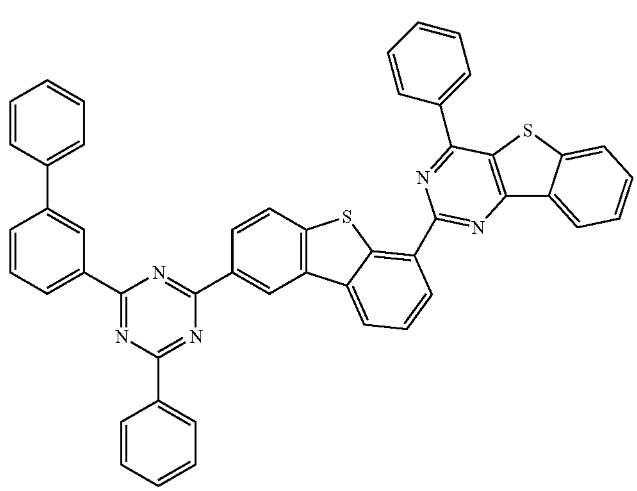

-continued
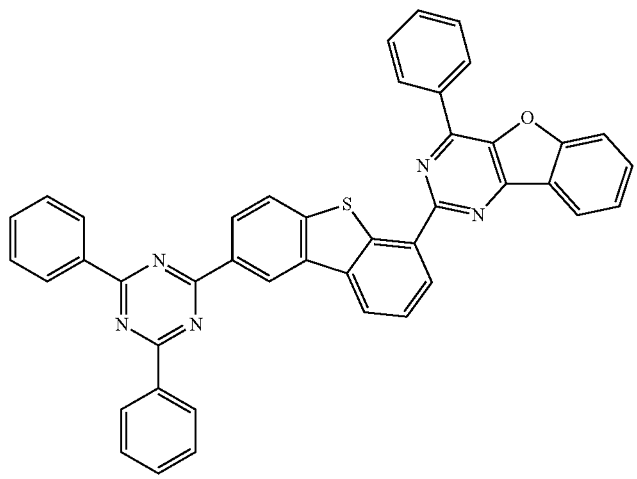
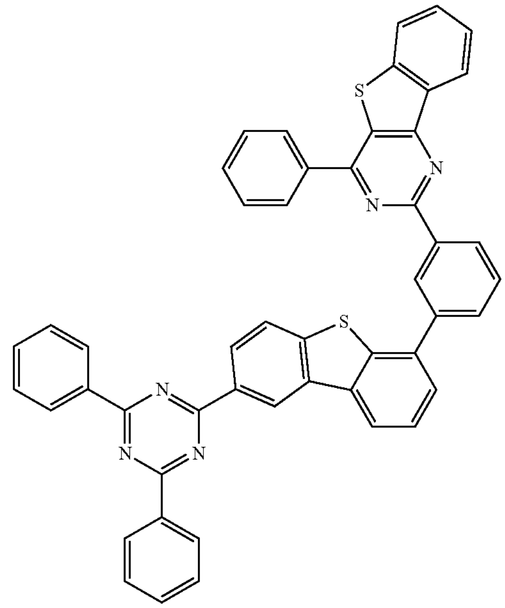
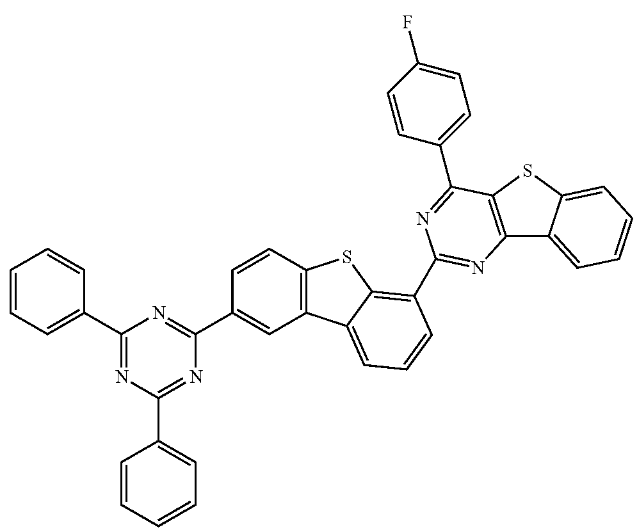
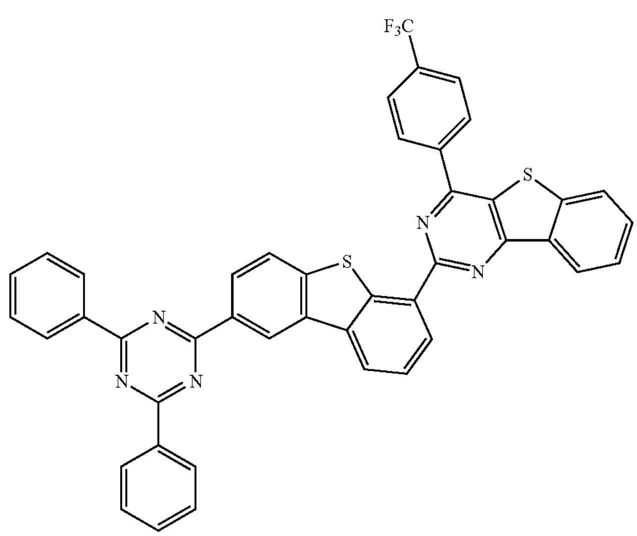

-continued
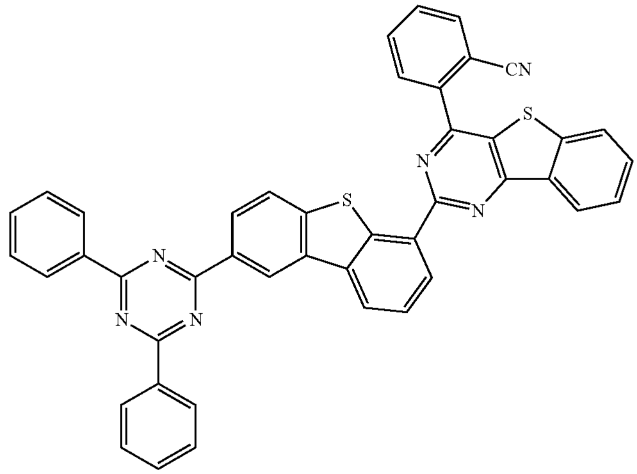
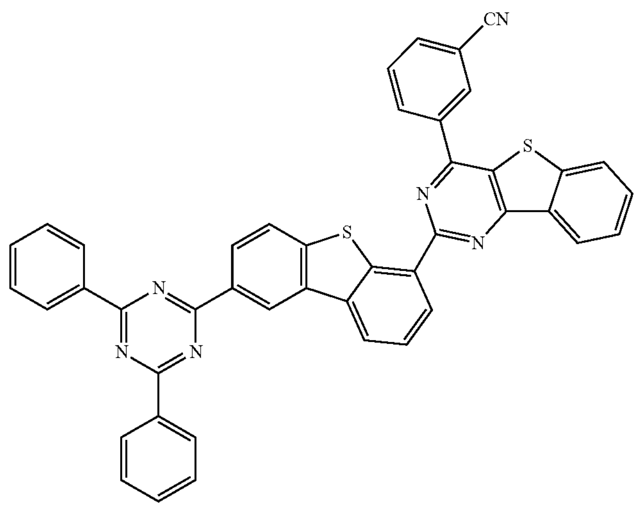
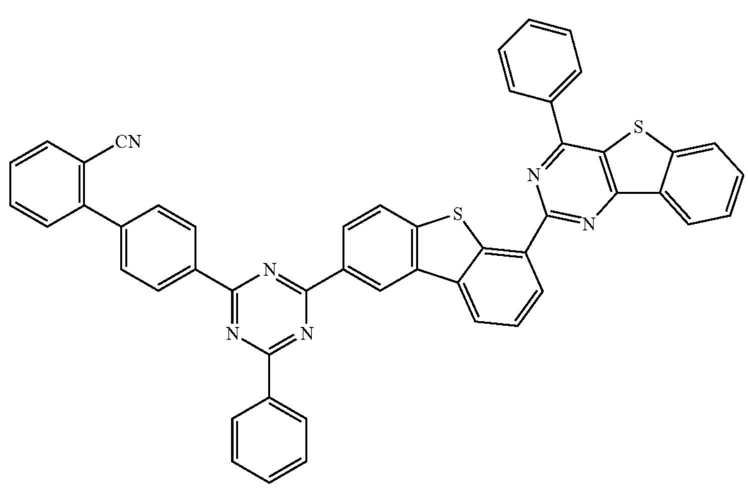

-continued
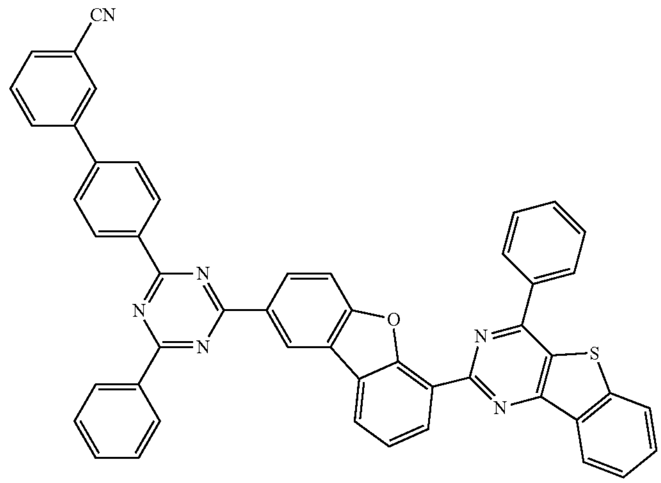
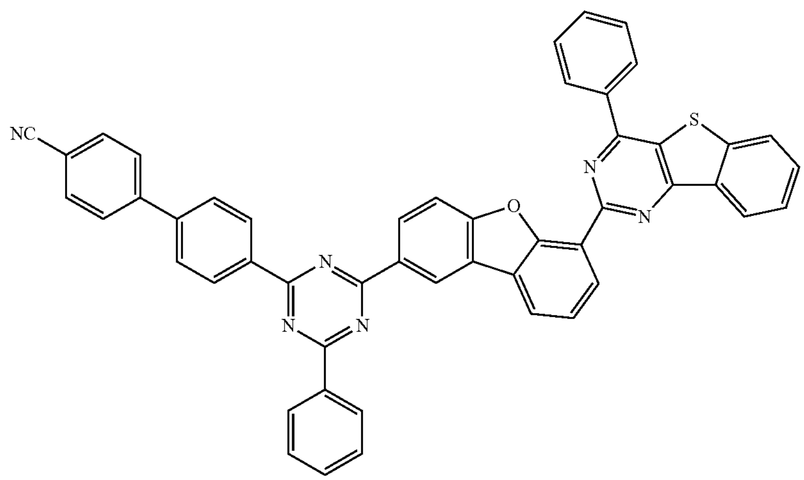
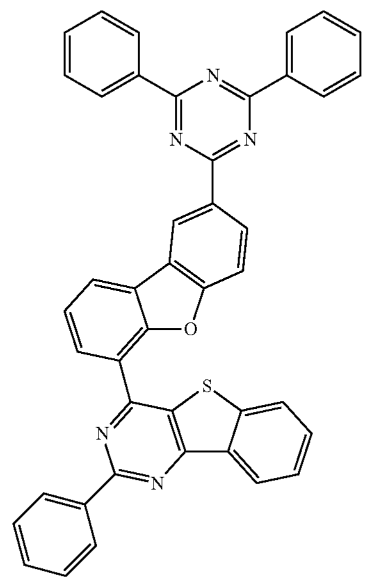
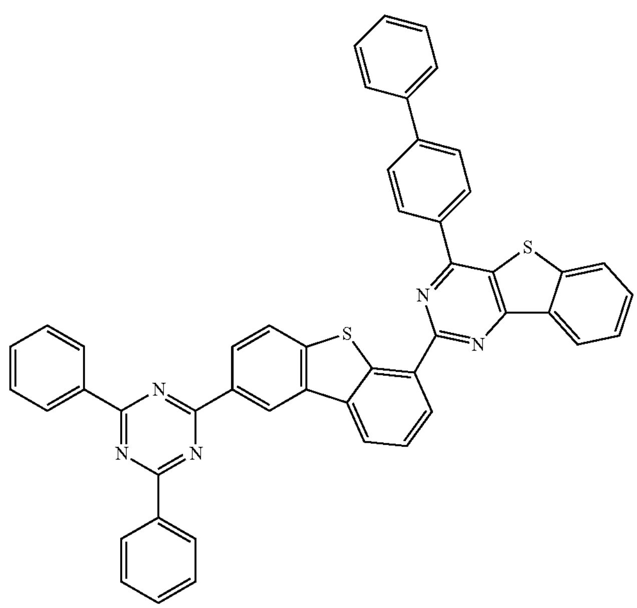

-continued
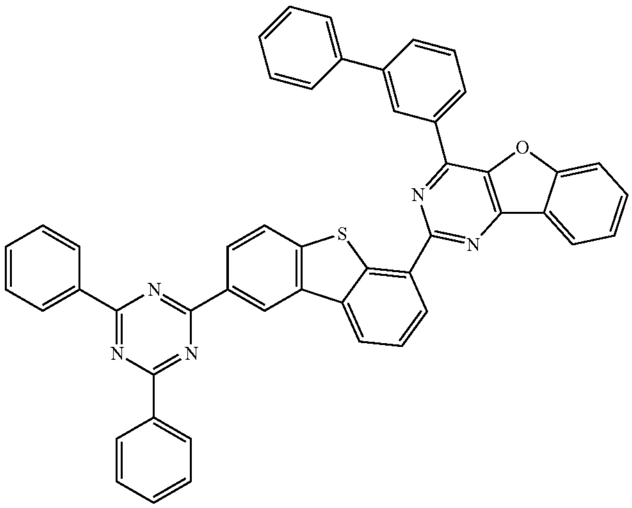
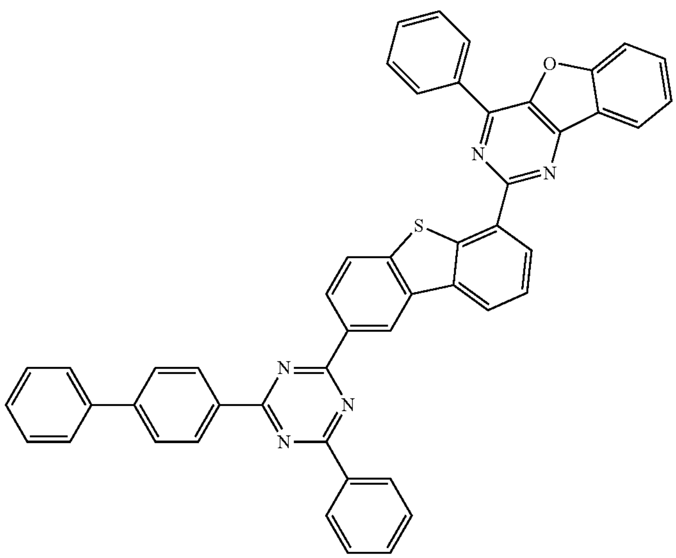
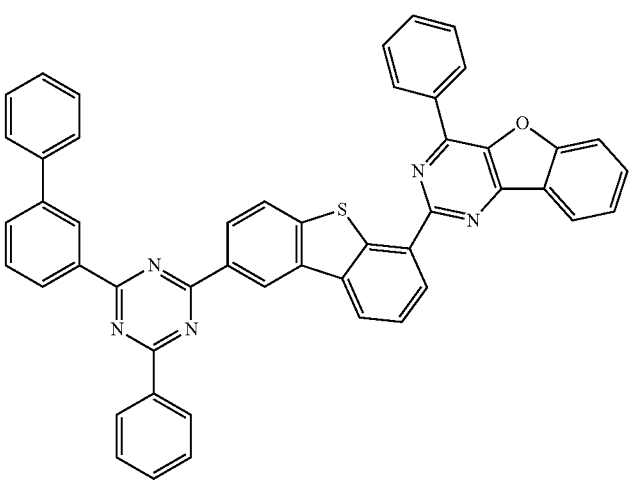
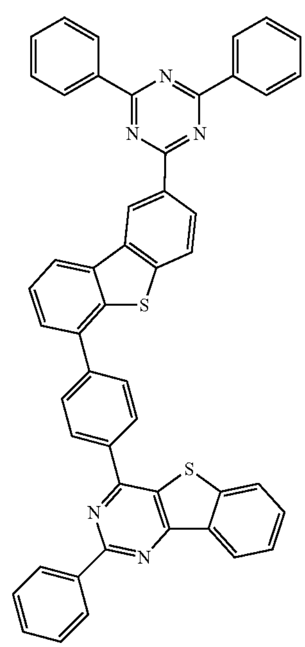

-continued
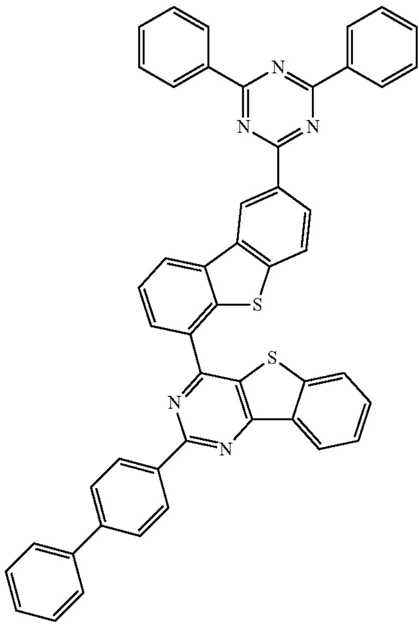
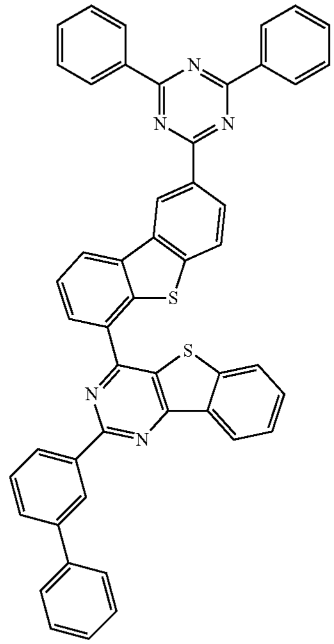
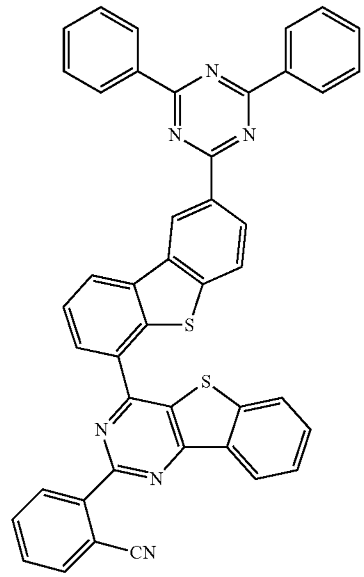
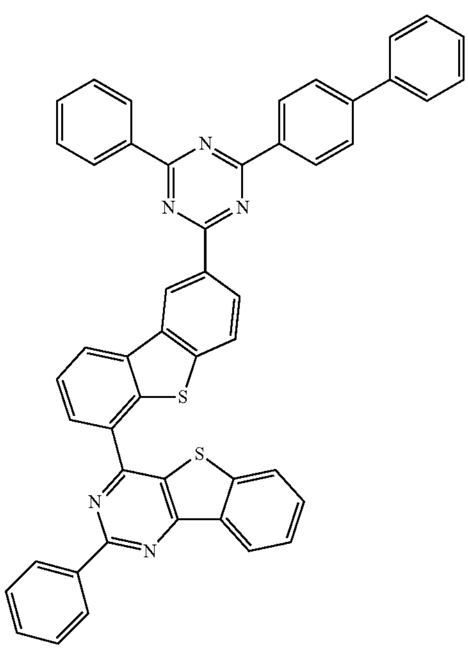
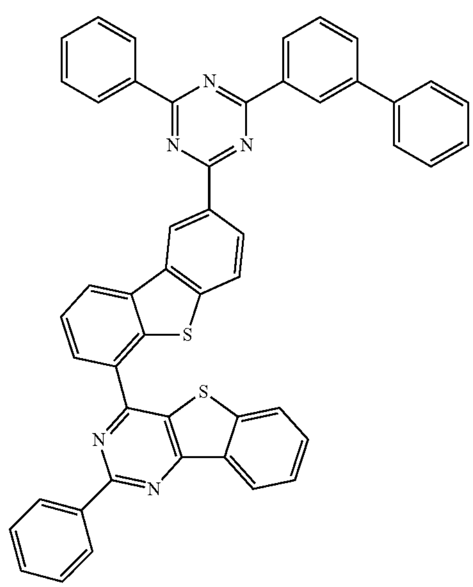

-continued
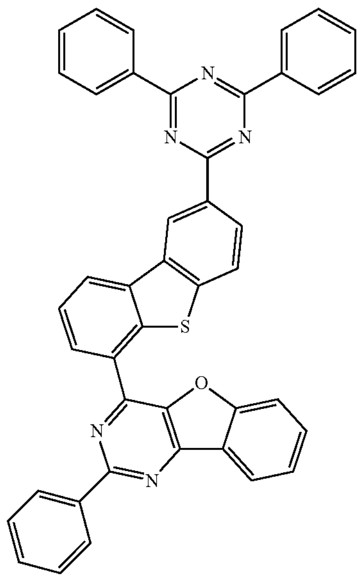
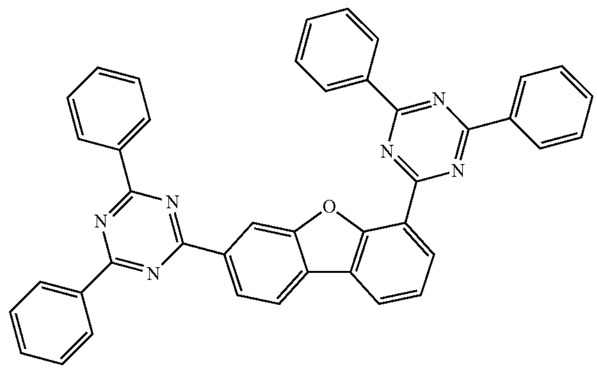
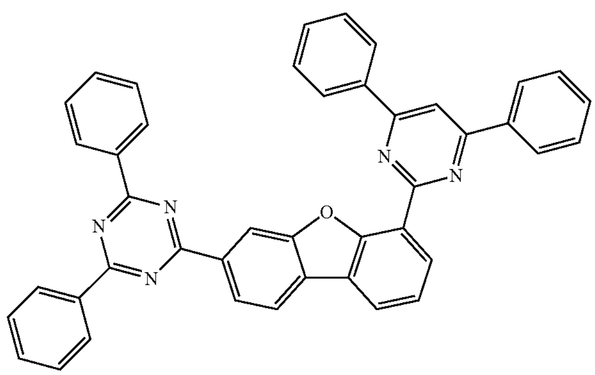
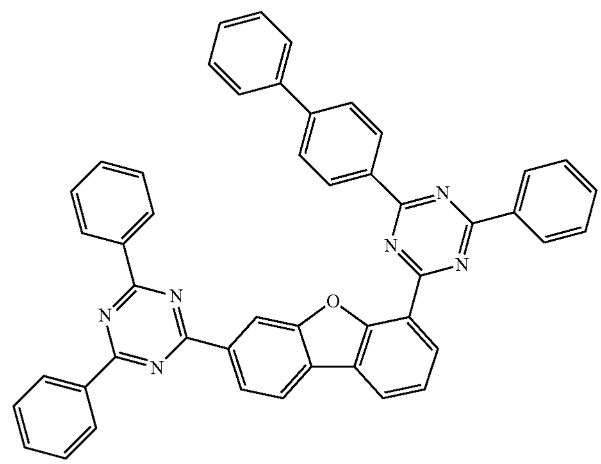
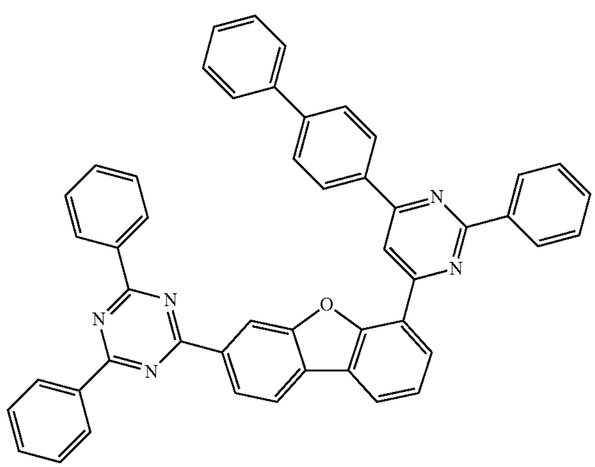
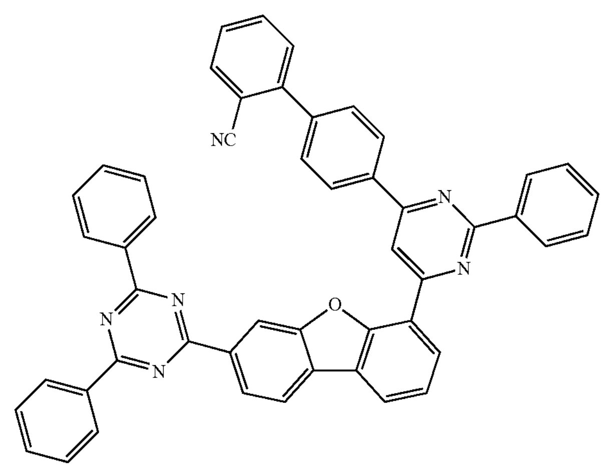

-continued
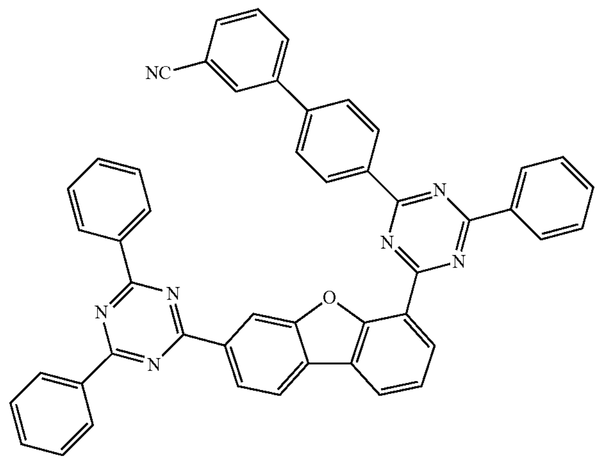
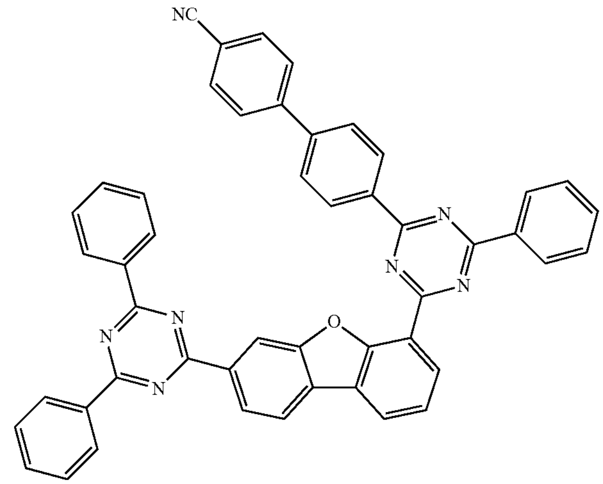
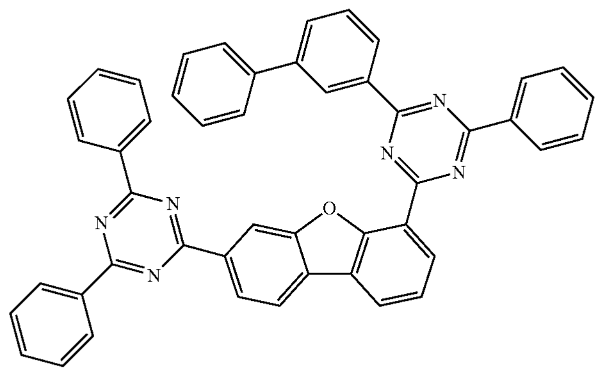
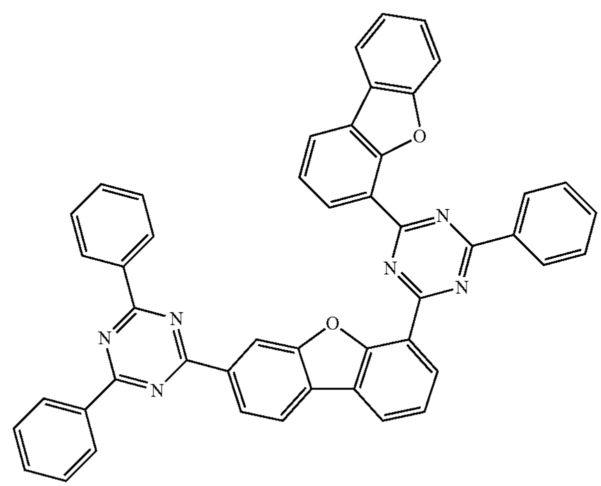
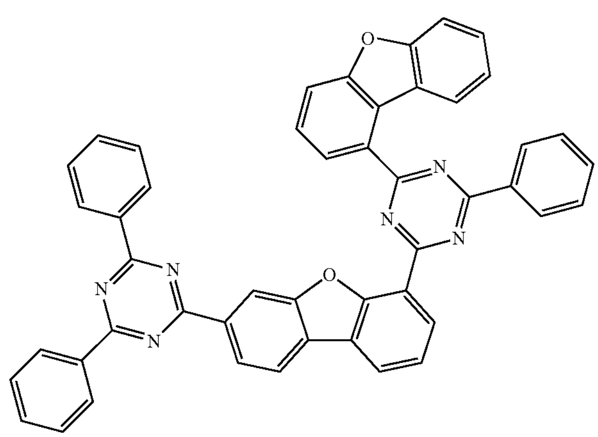
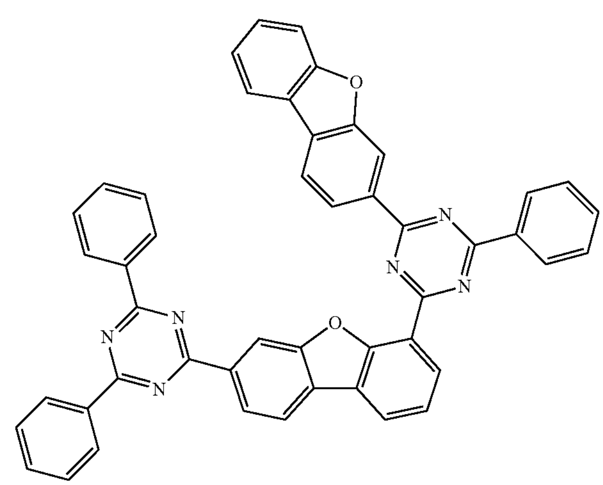

-continued
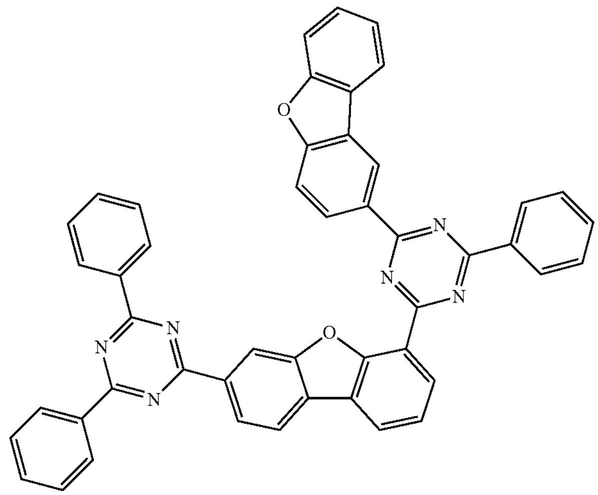
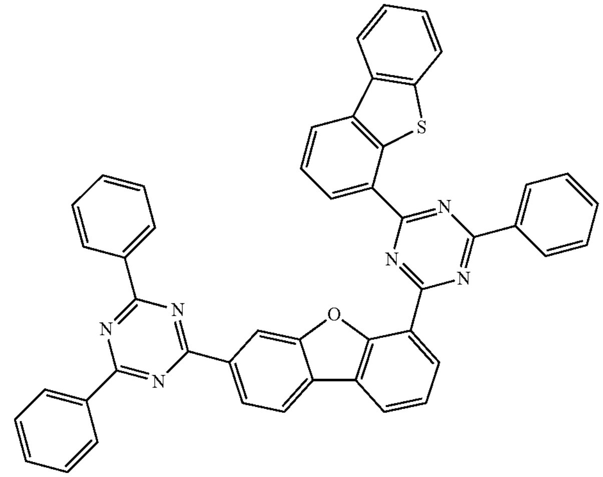
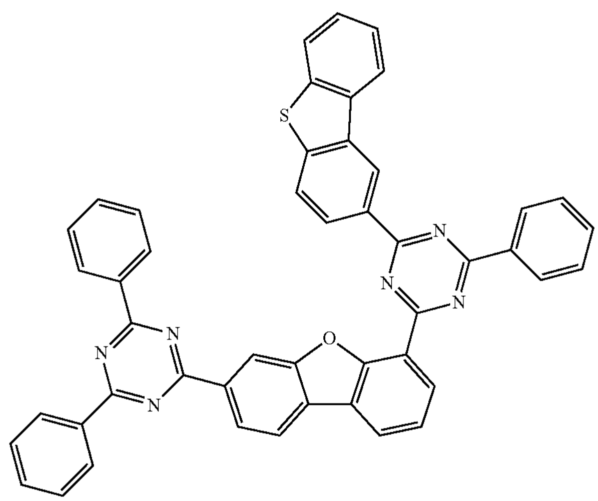
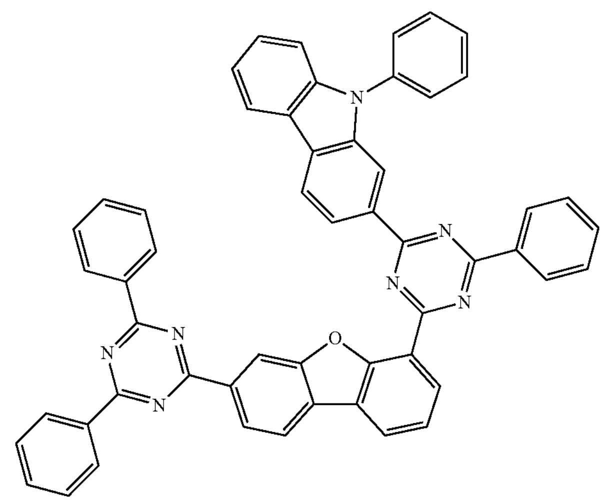
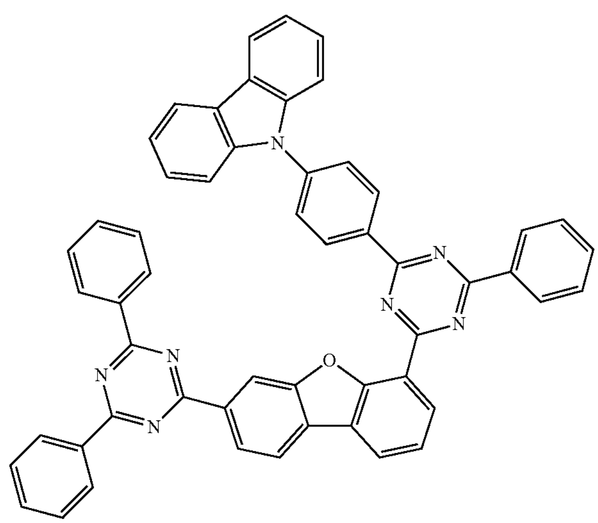
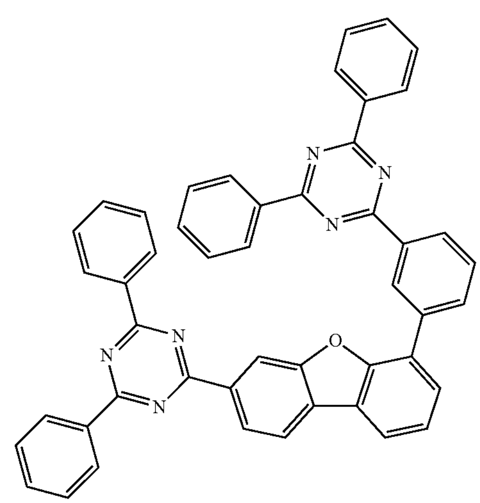

-continued
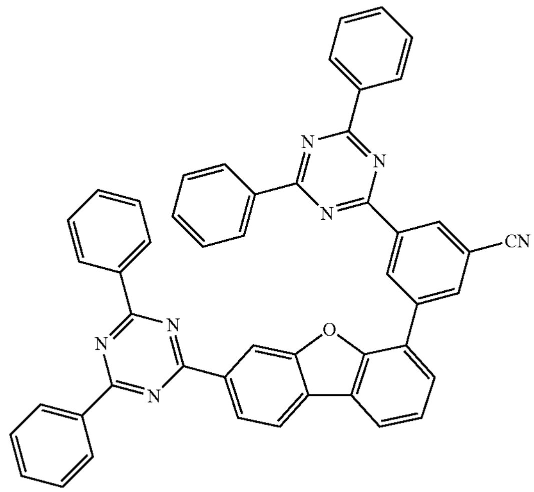
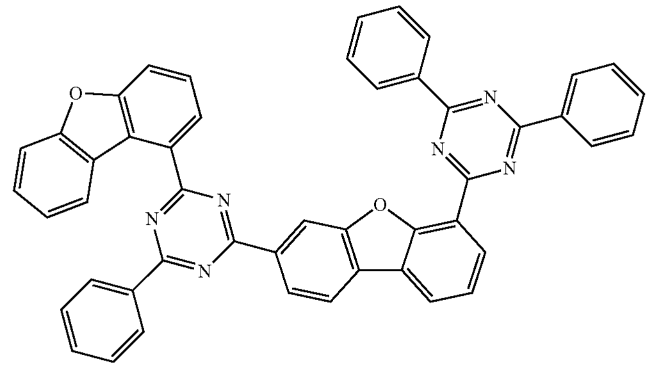
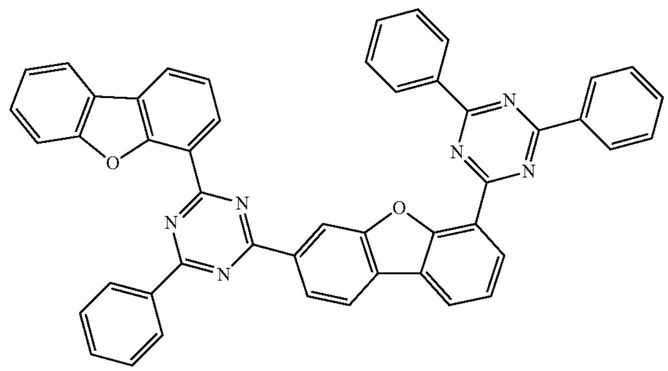
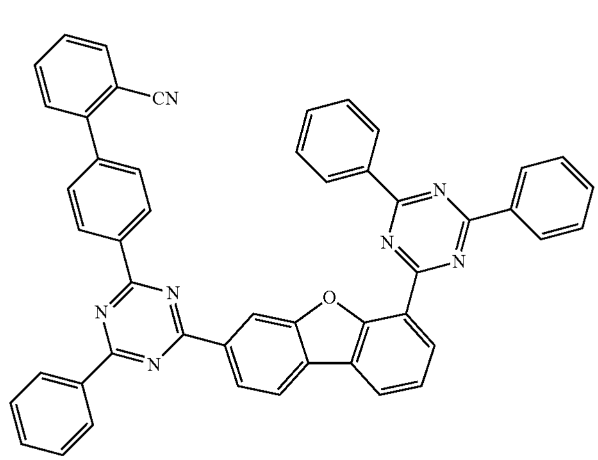
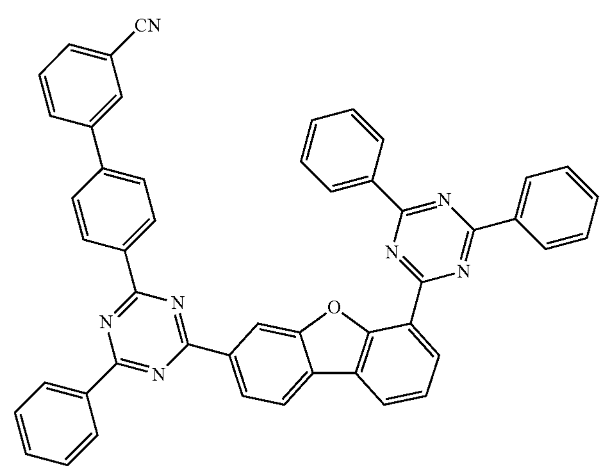

-continued
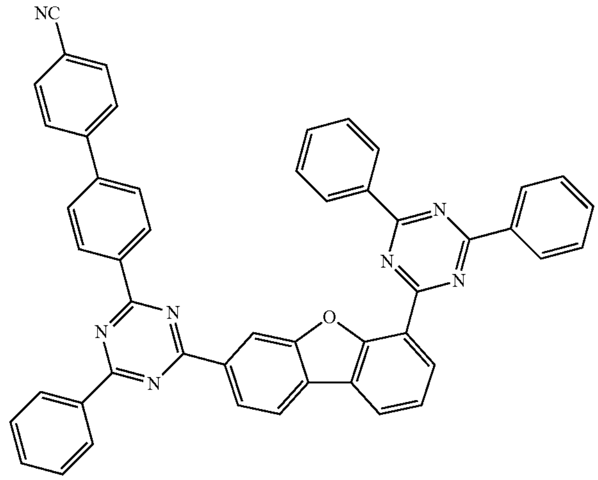
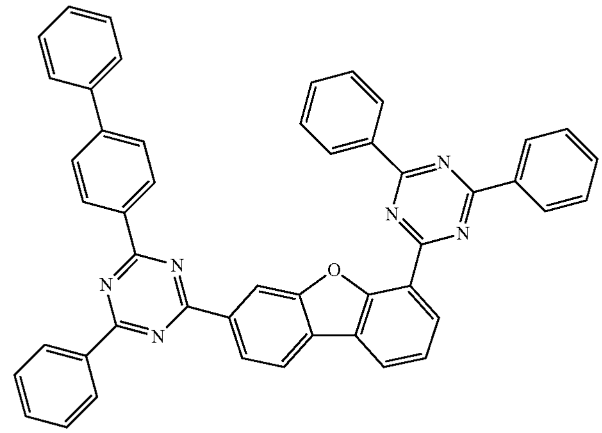
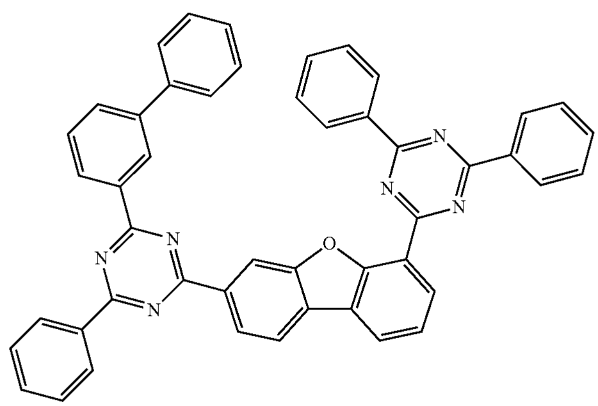
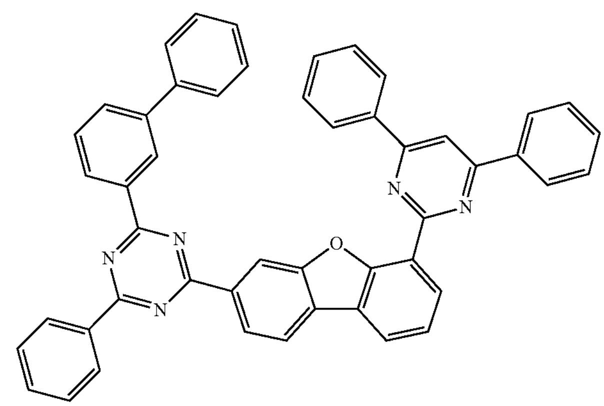
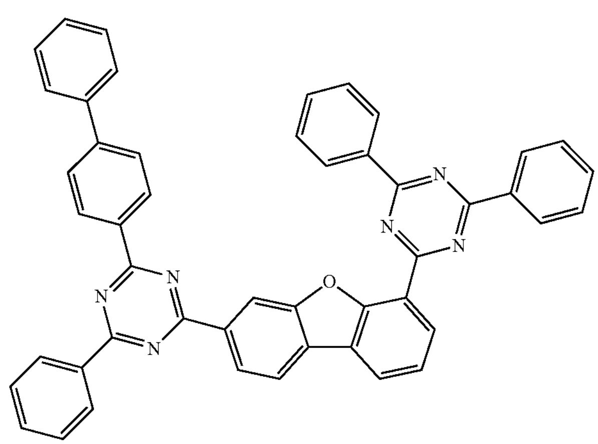
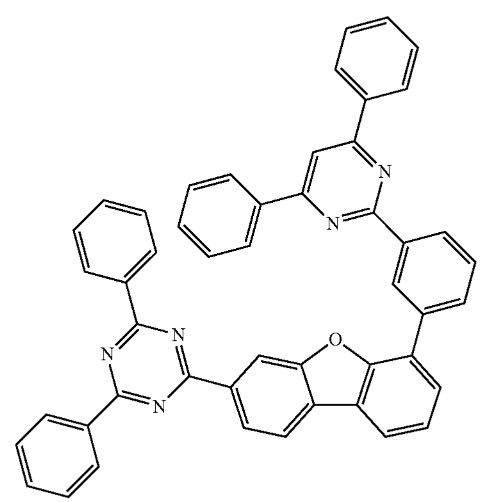

-continued
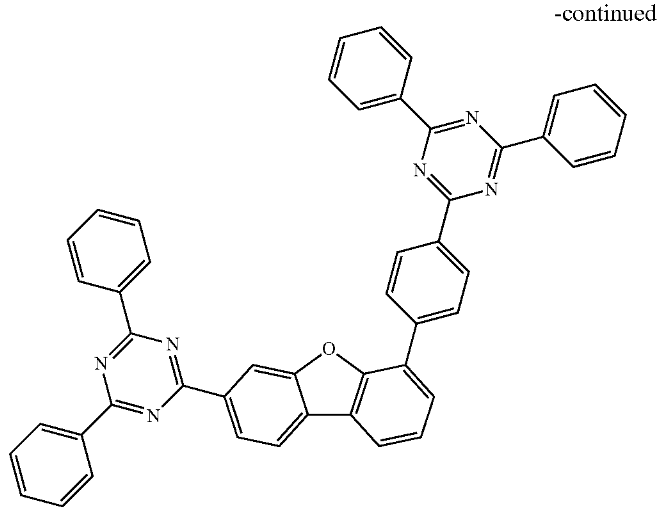
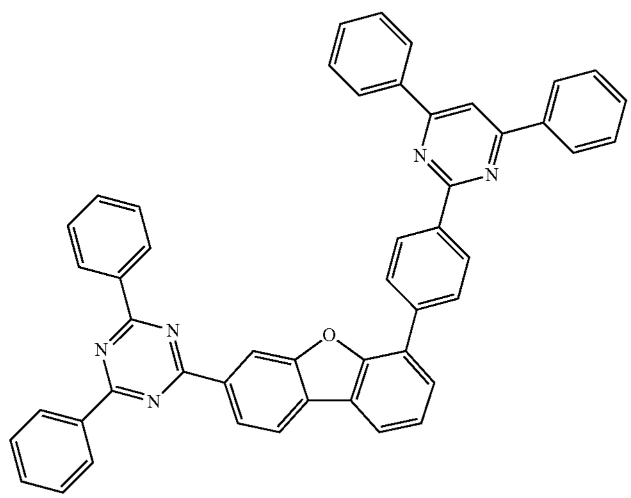
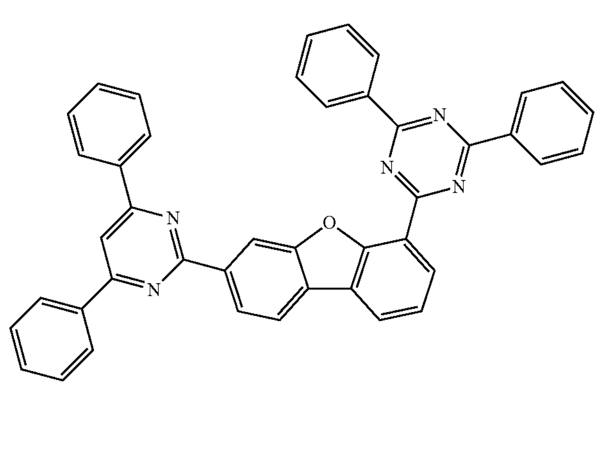
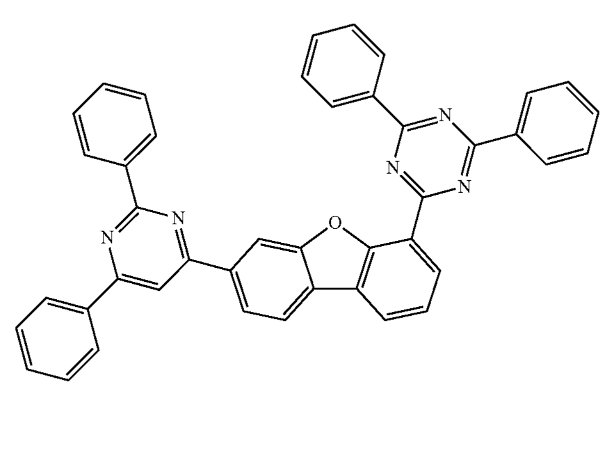

-continued
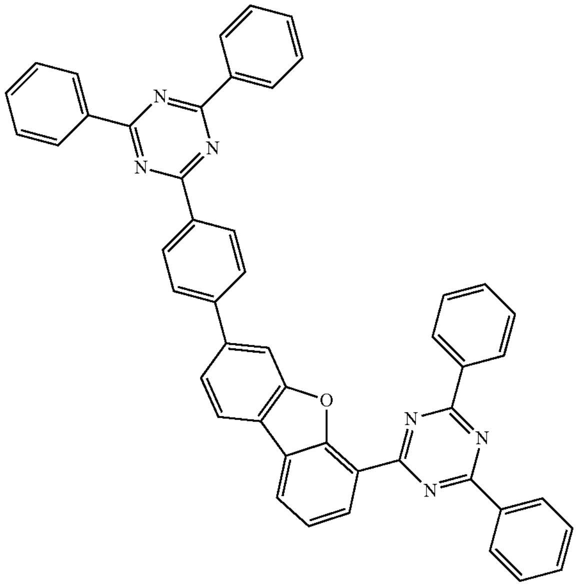
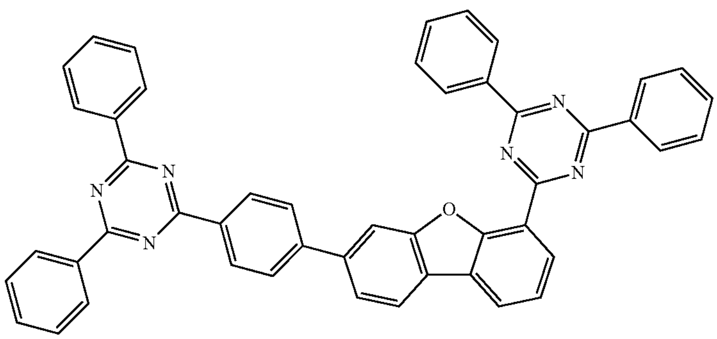
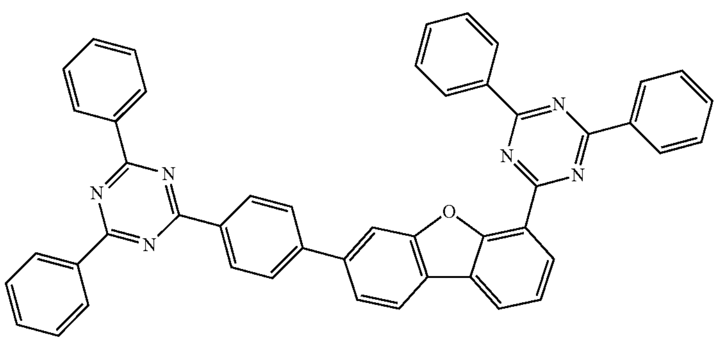
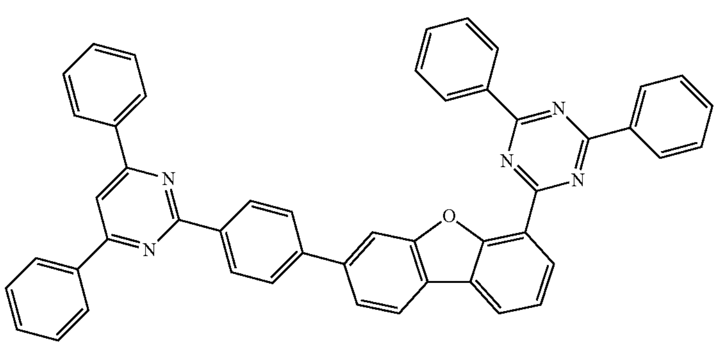

-continued
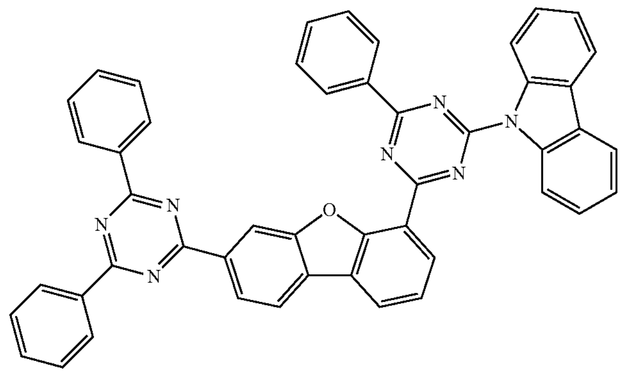
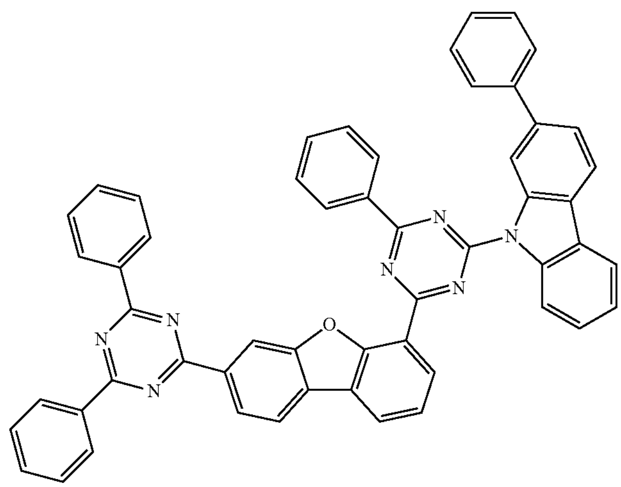
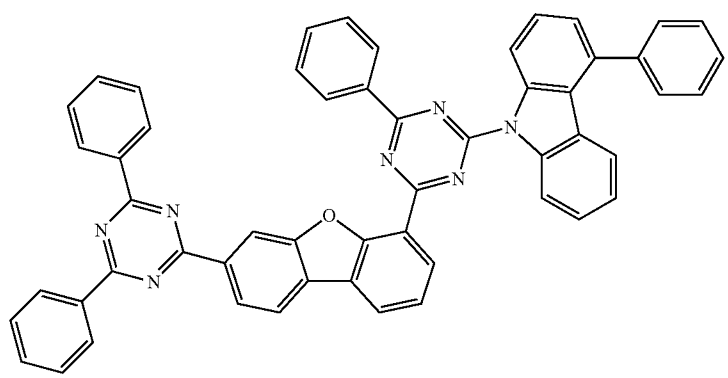
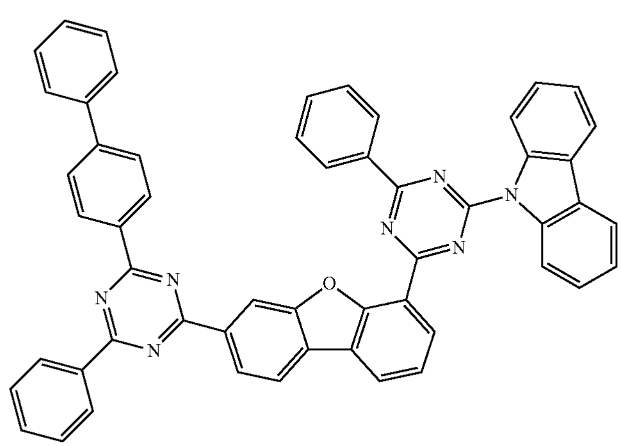
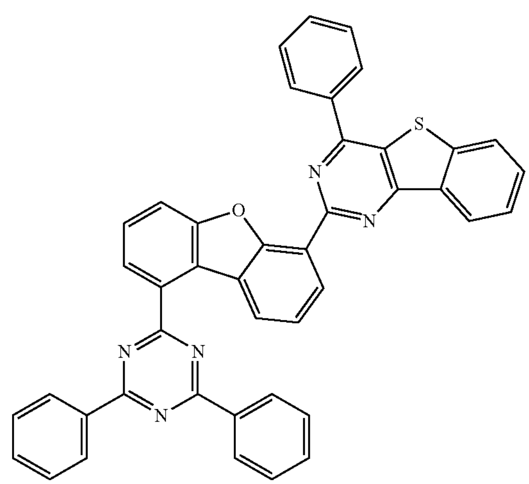

-continued
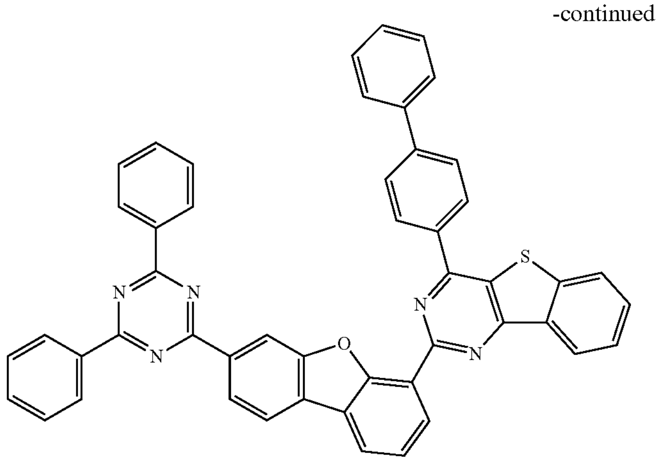
-continued
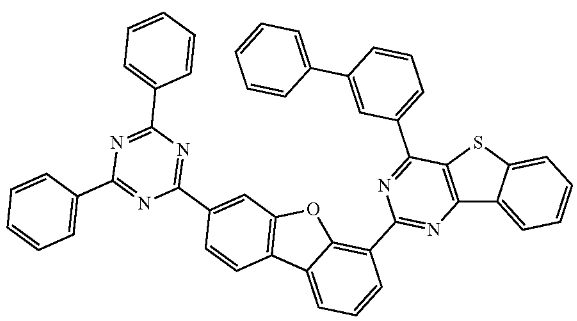
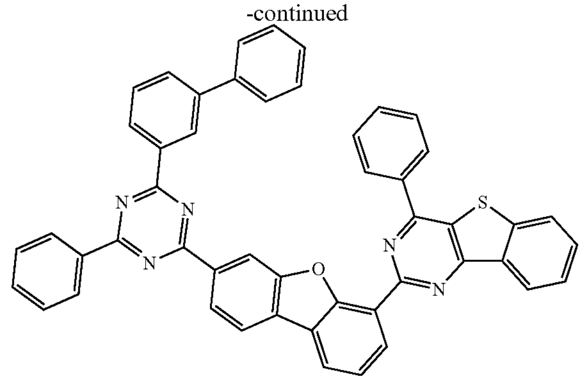
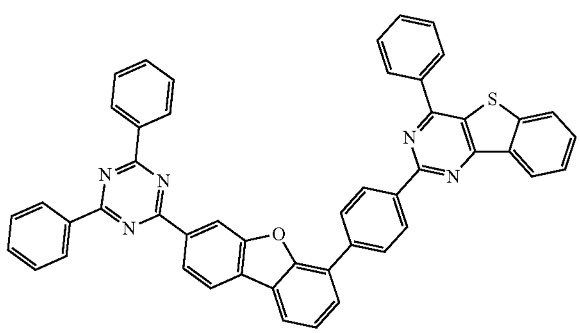
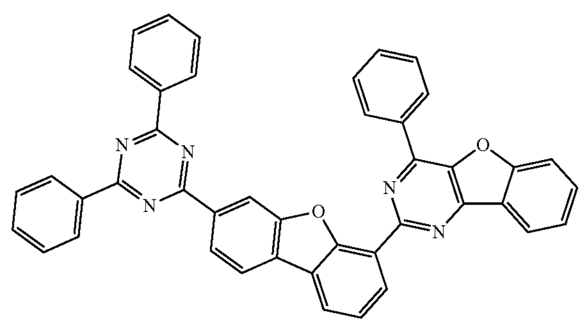
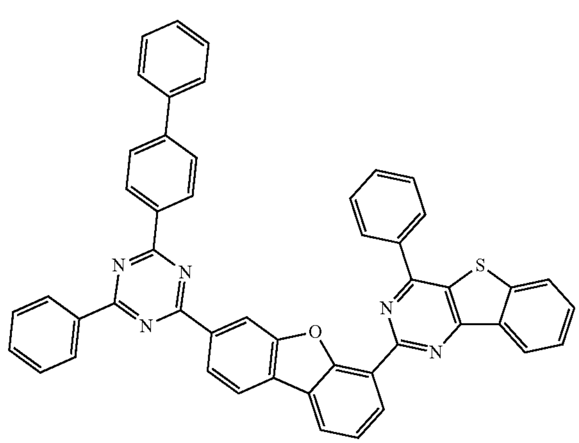
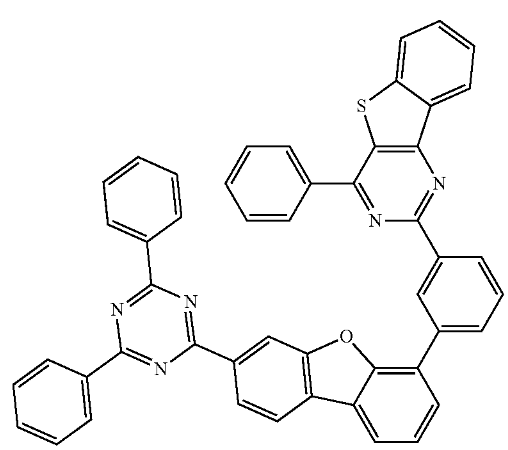

-continued
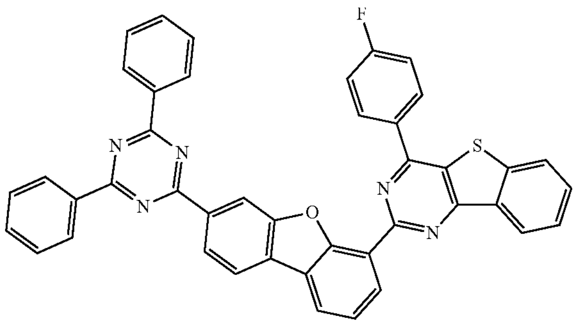
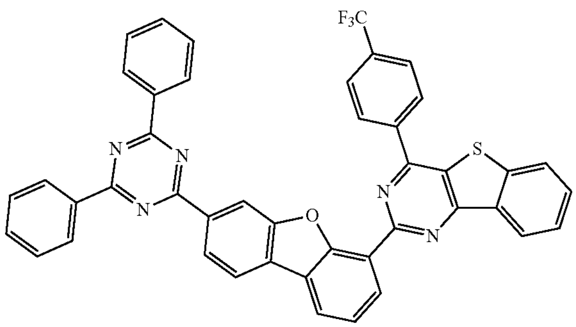
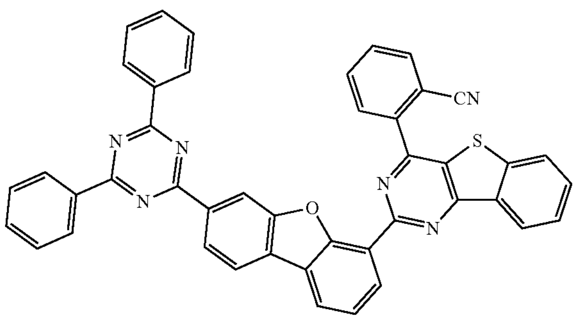
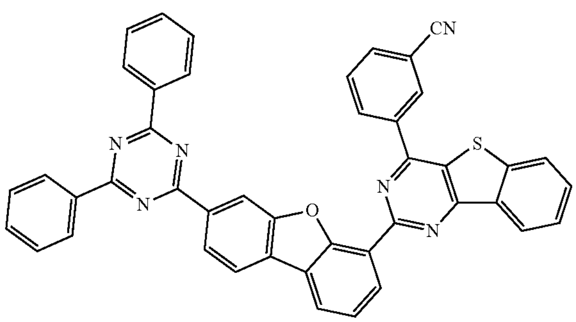
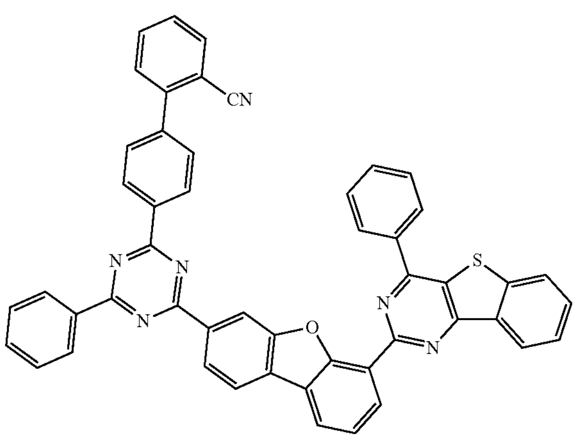
-continued
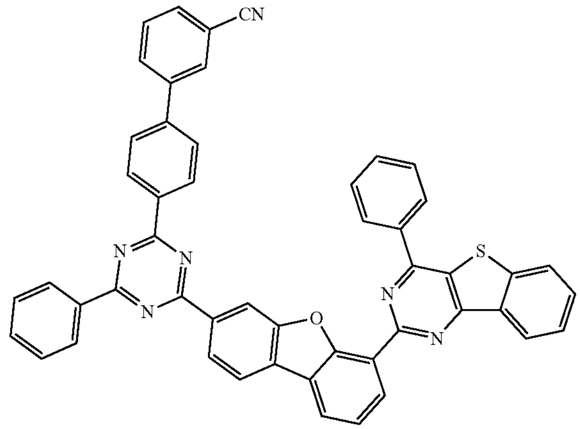
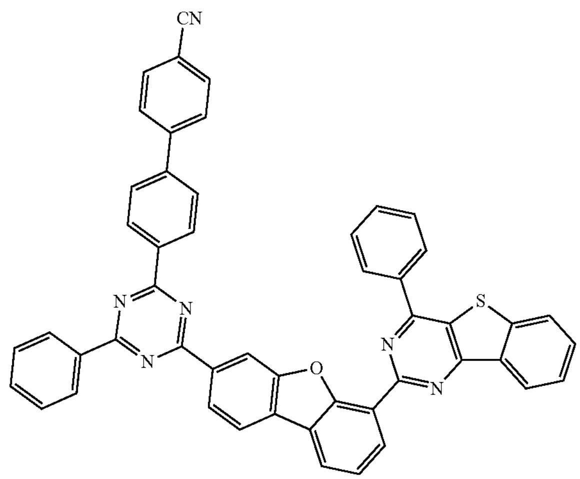
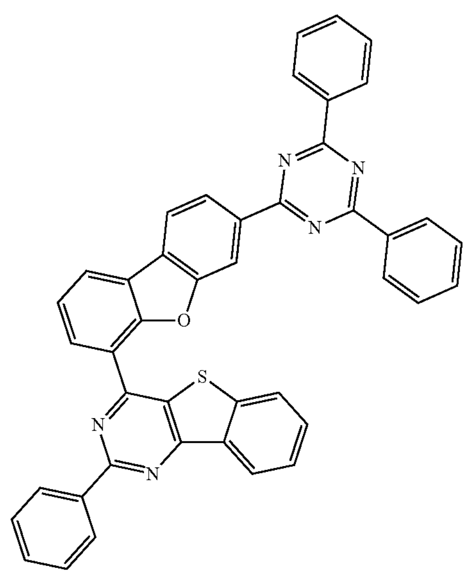

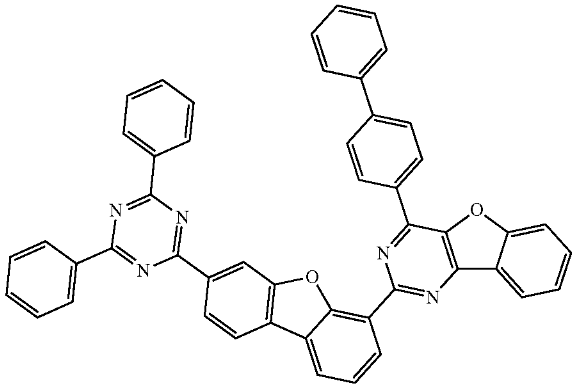
N
N
N
O
O
N
N
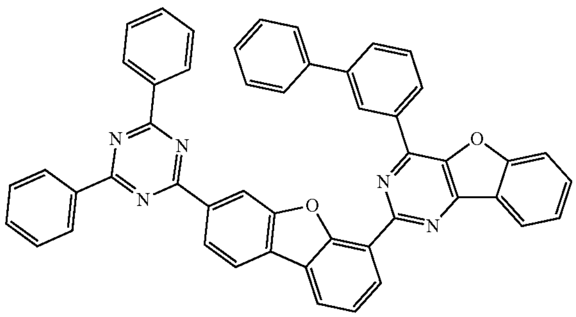
N
N
N
O
O
N
N
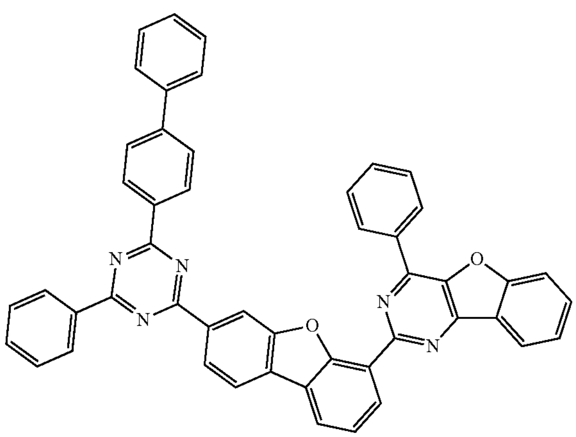
N
N
N
O
O
N
N
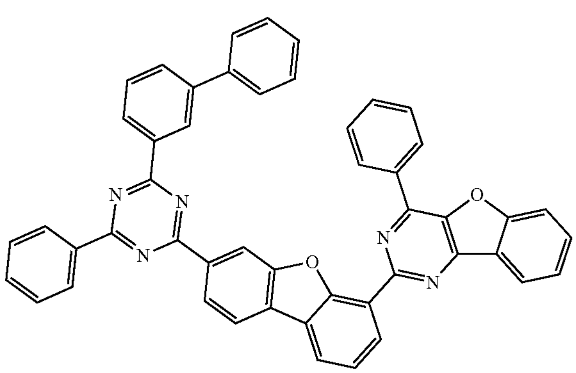
N
N
N
O
O
N
N
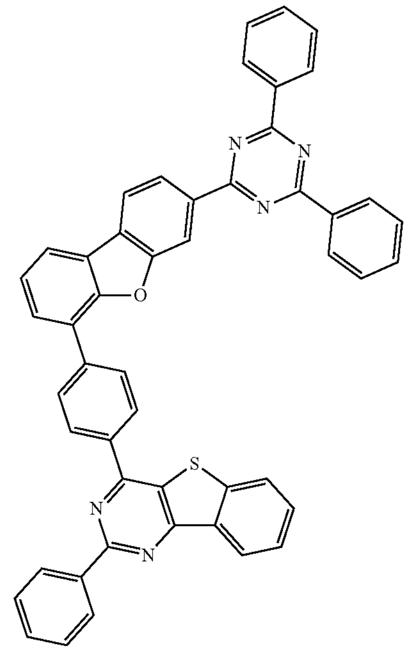
N
N
N
O
S
N
N
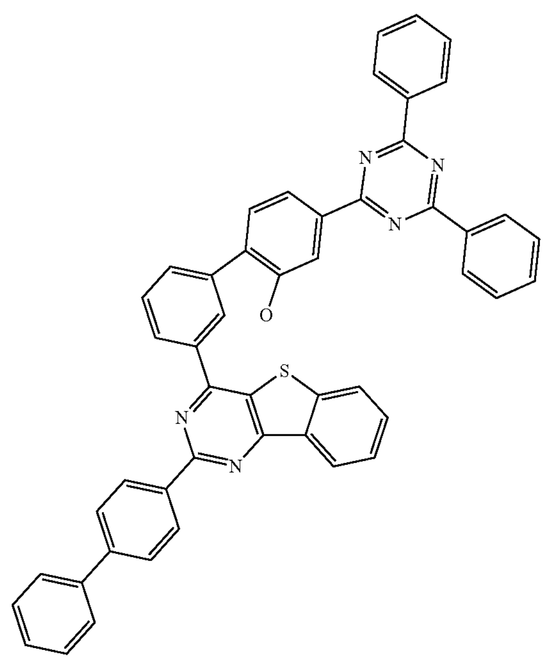
N
N
N
O
S
N
N -continued
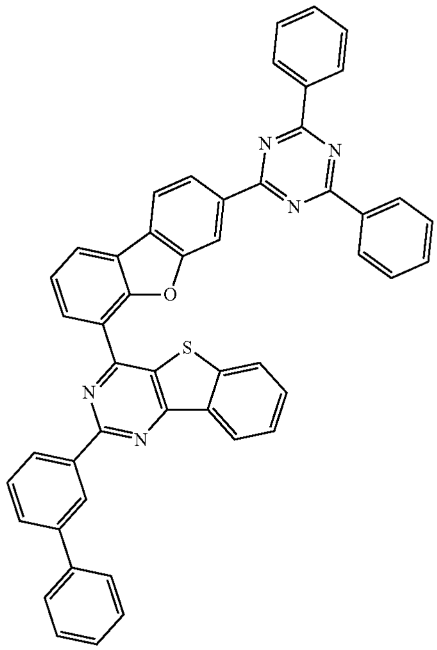
-continued
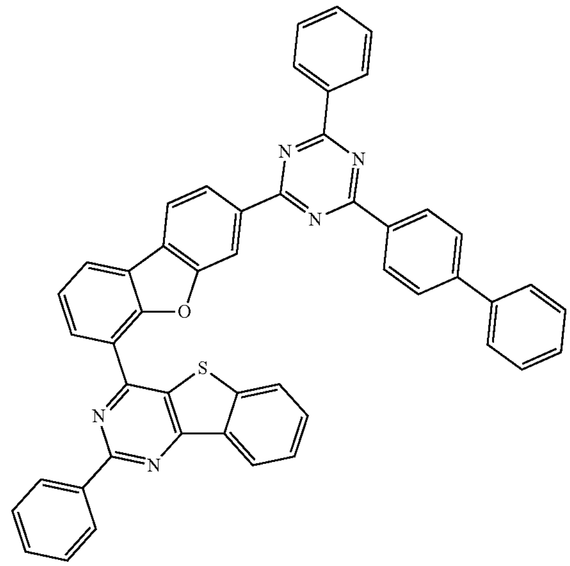
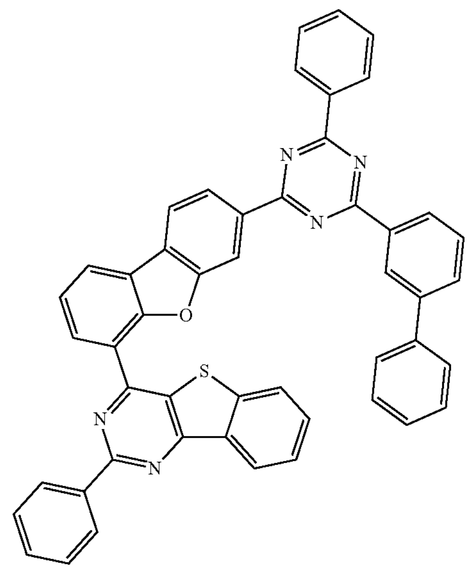
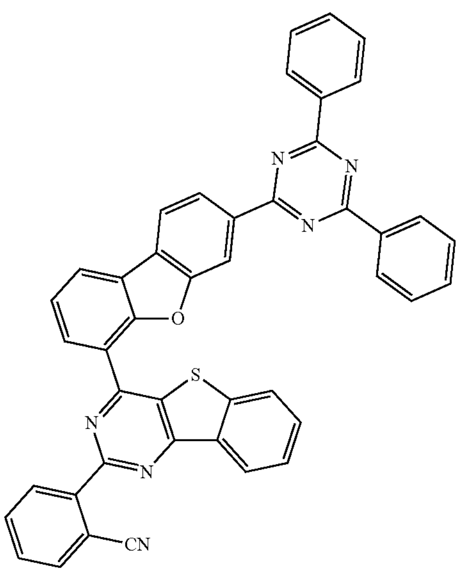
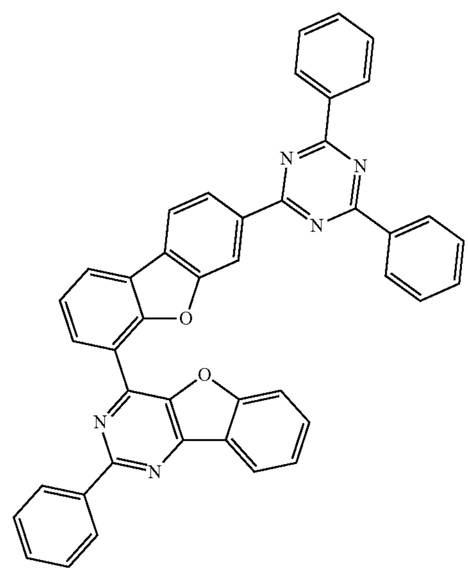

-continued
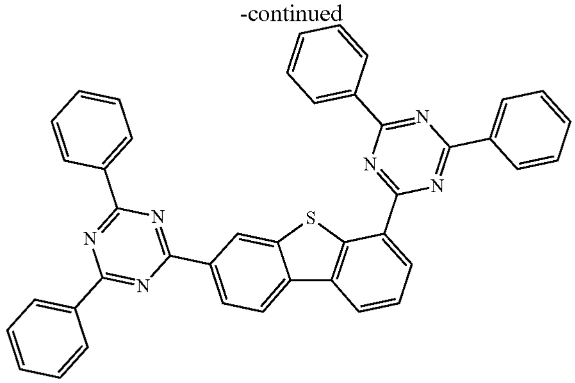
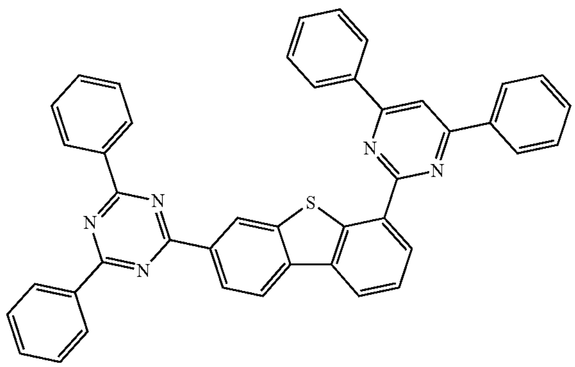
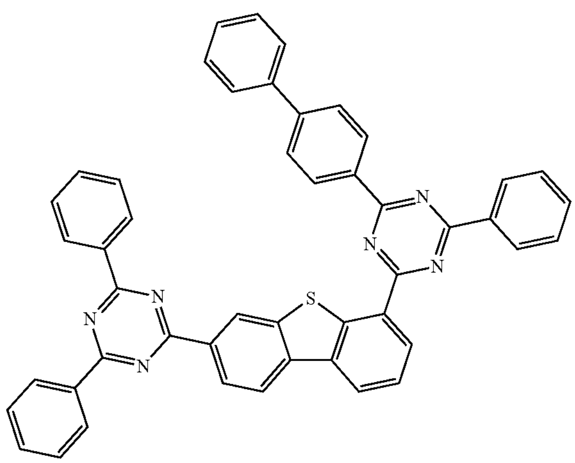
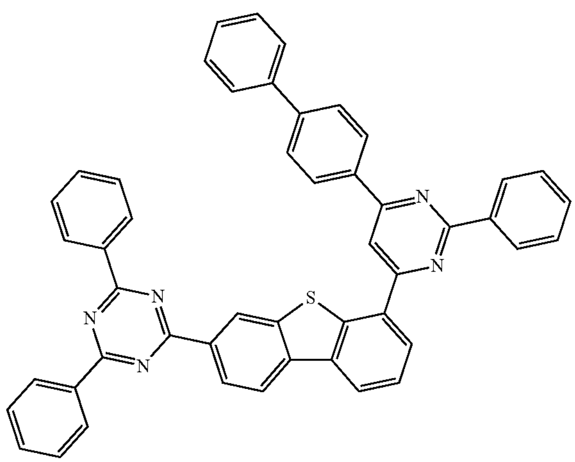
-continued
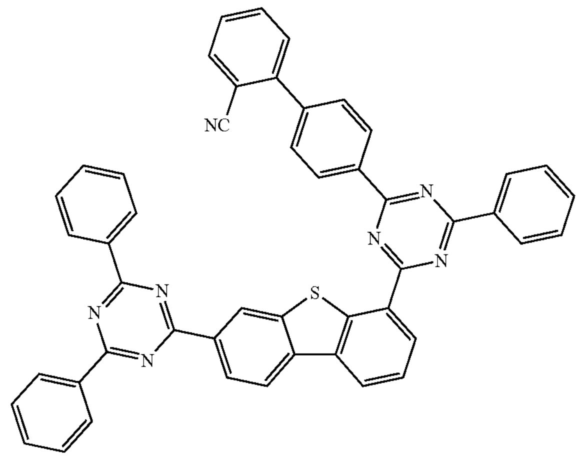
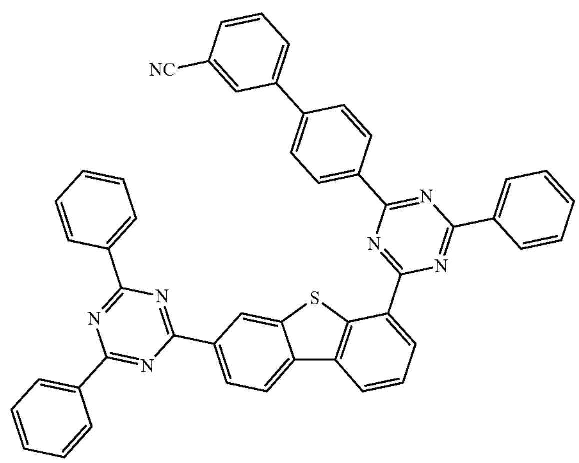
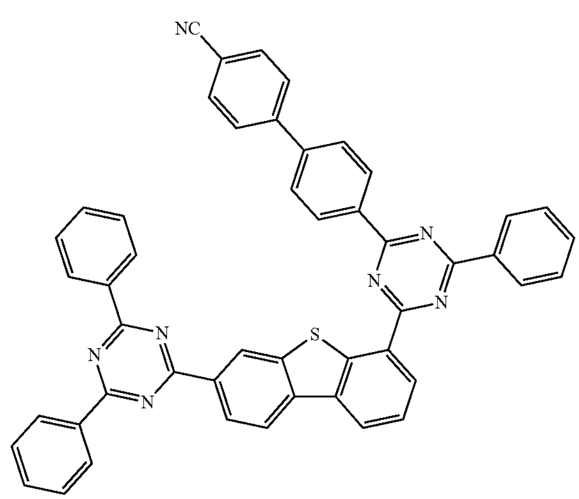

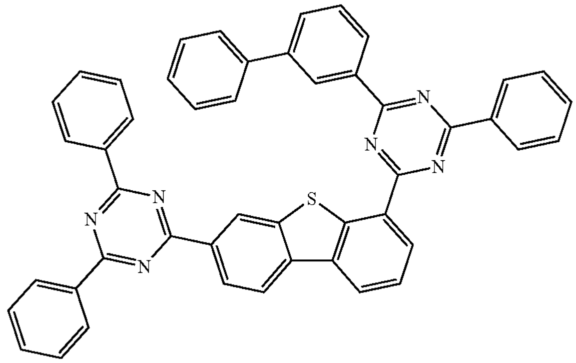
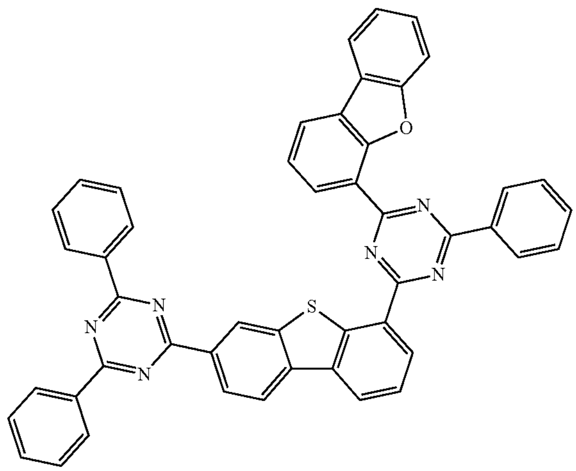
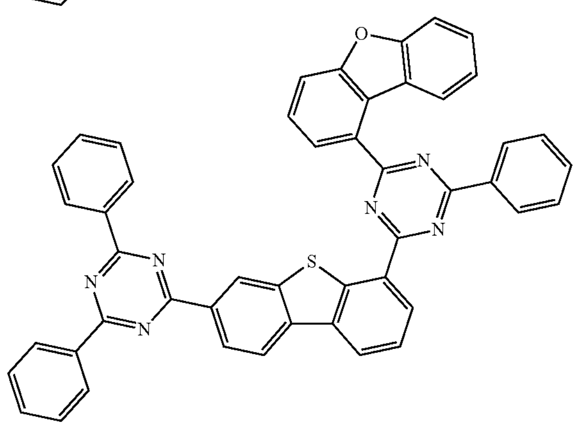
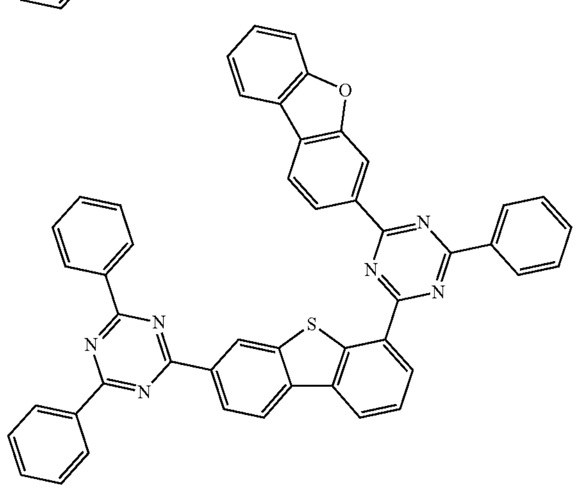
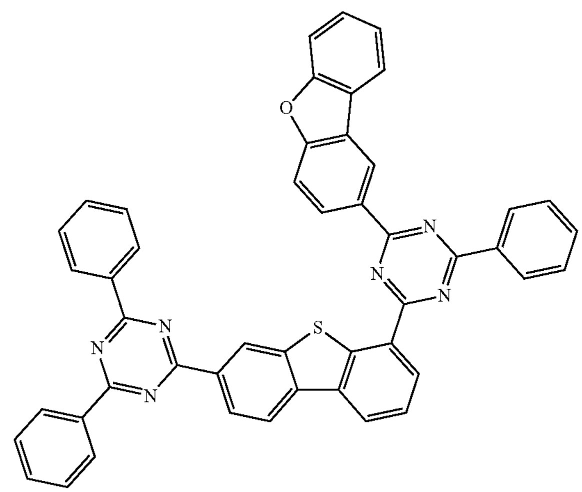
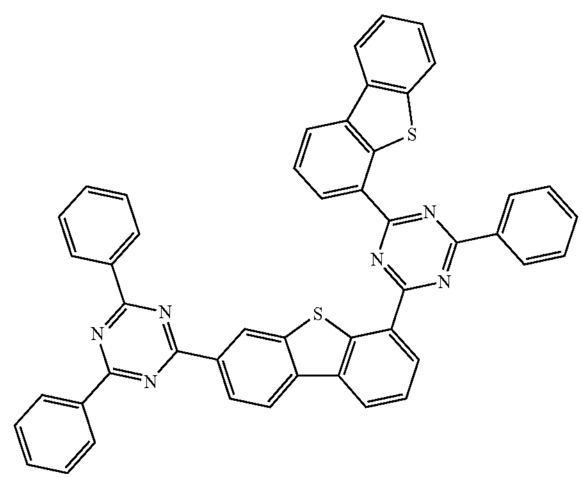
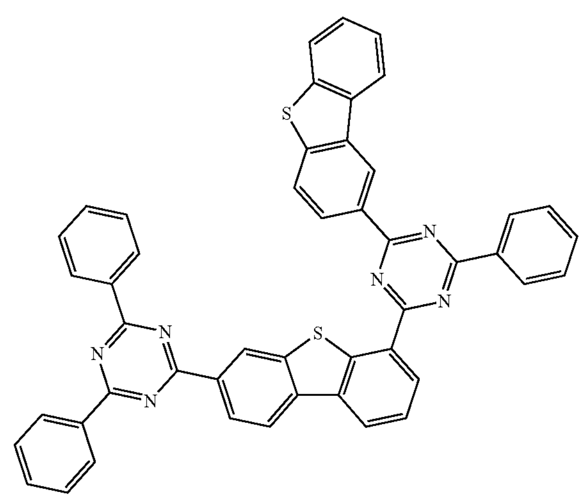

-continued
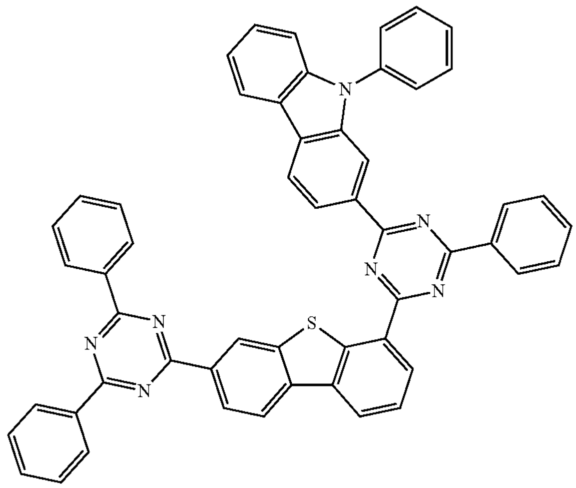
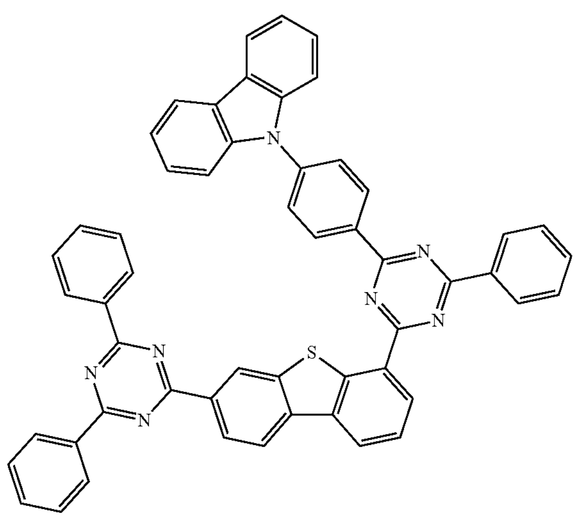
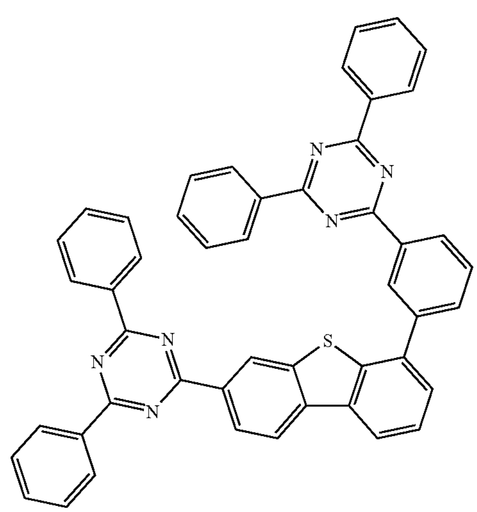
-continued
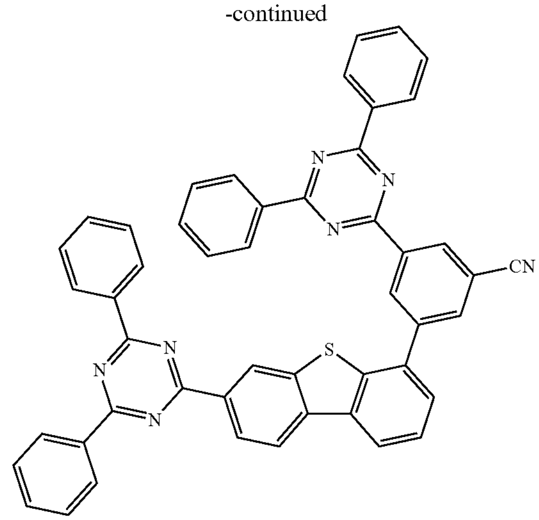
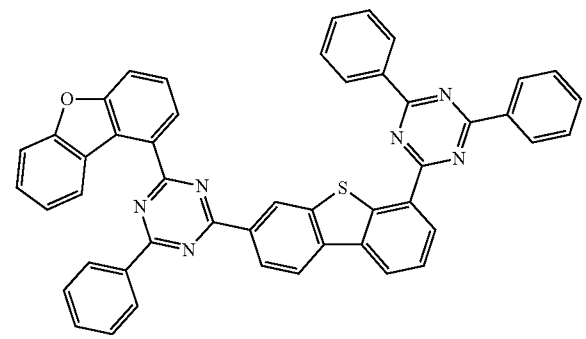
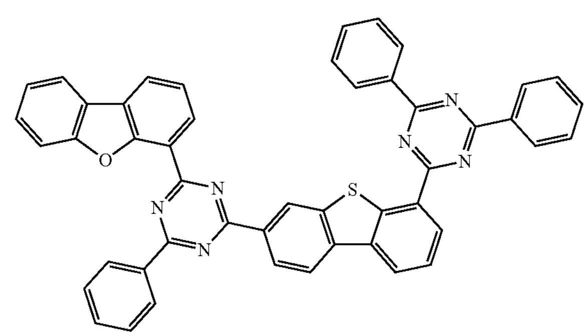
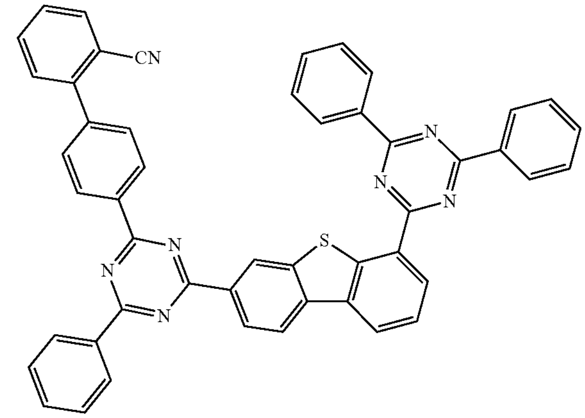

-continued
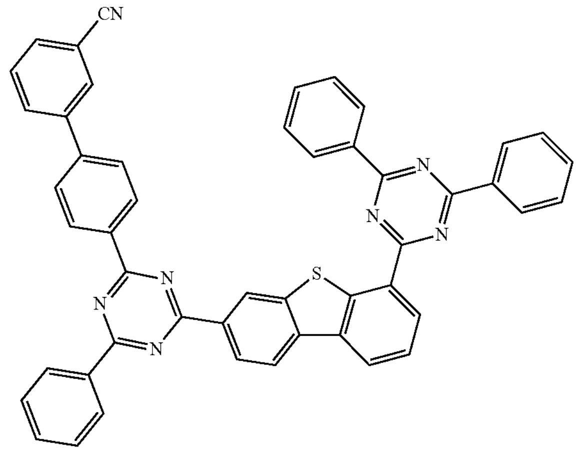
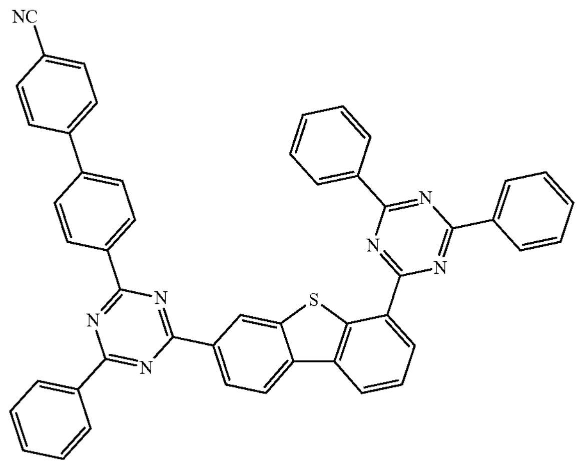
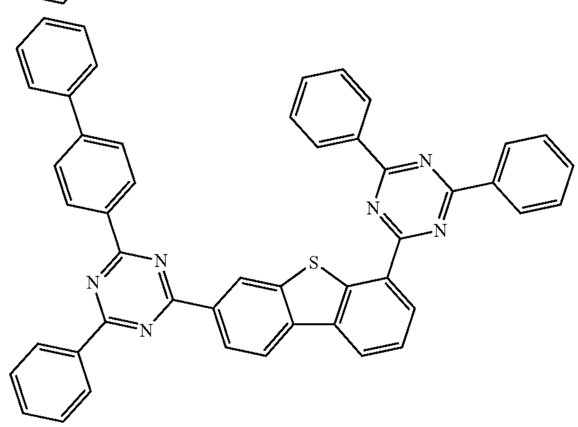
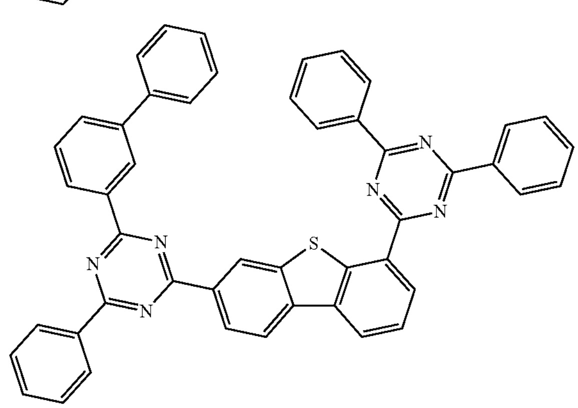
-continued
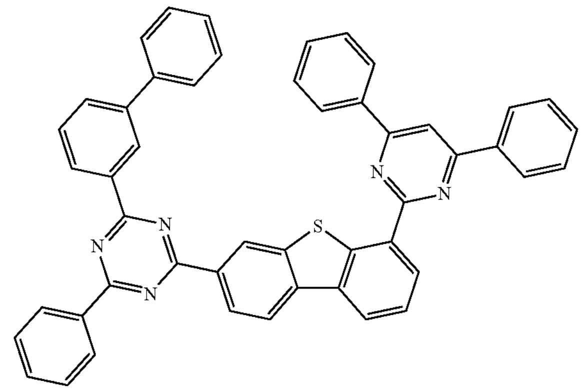
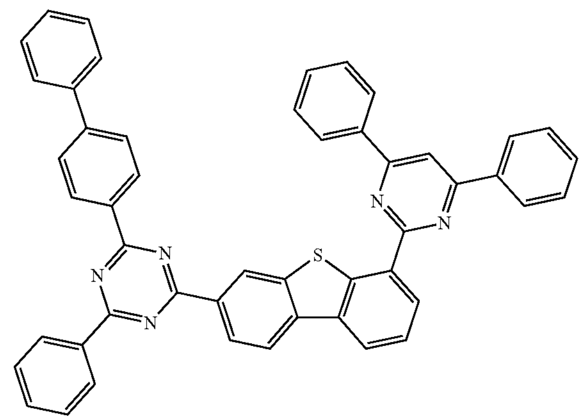
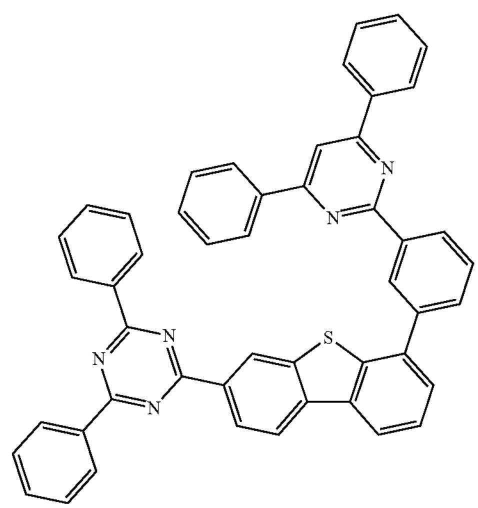

-continued
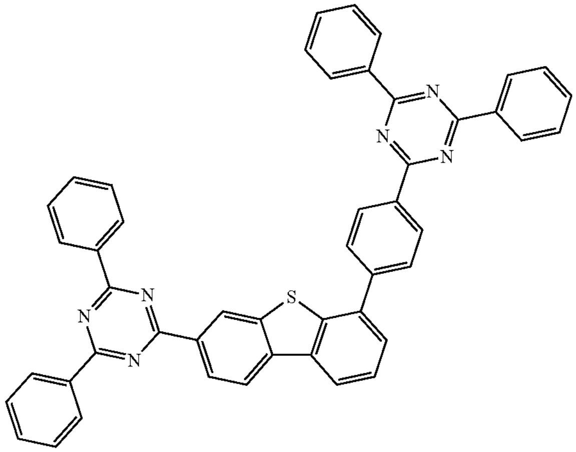
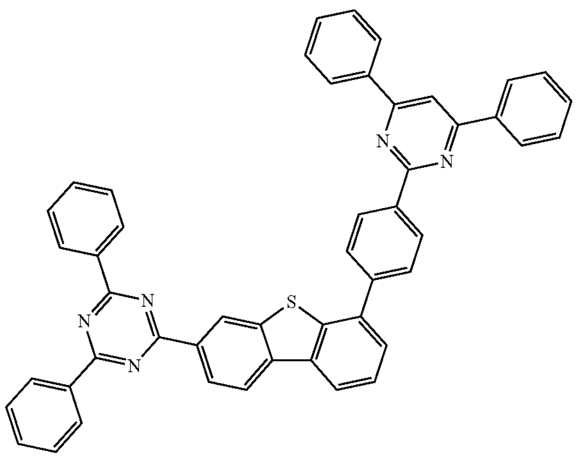
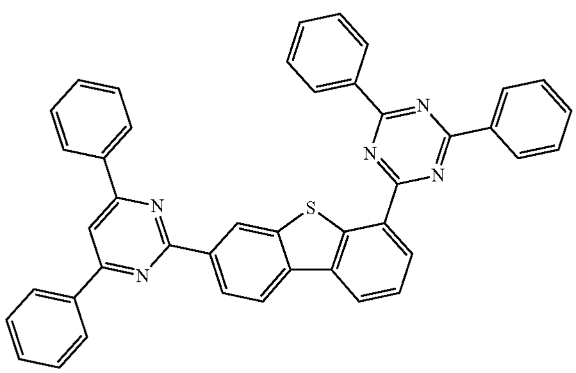
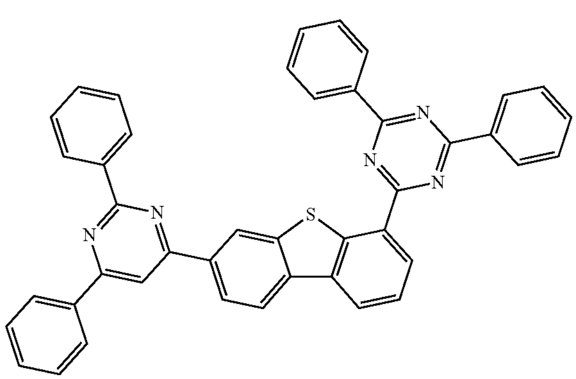
-continued
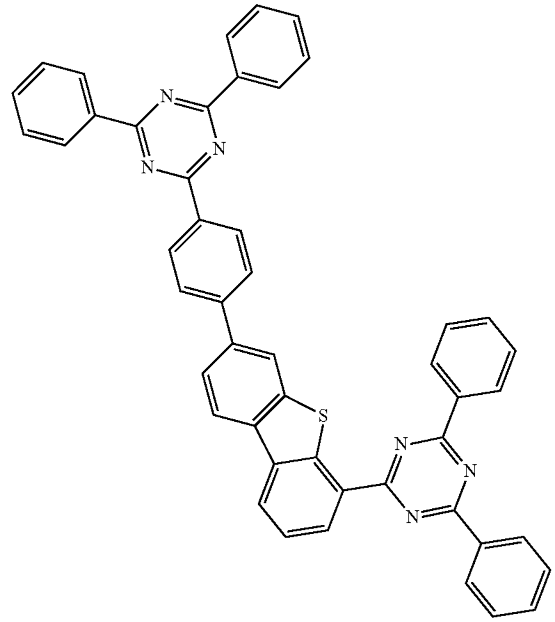
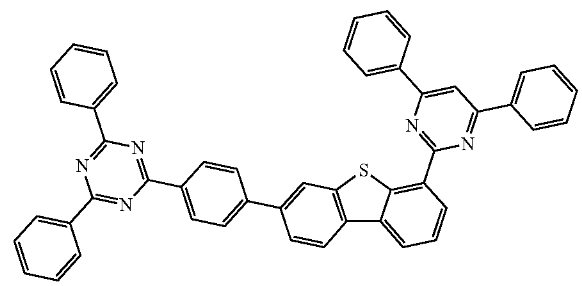
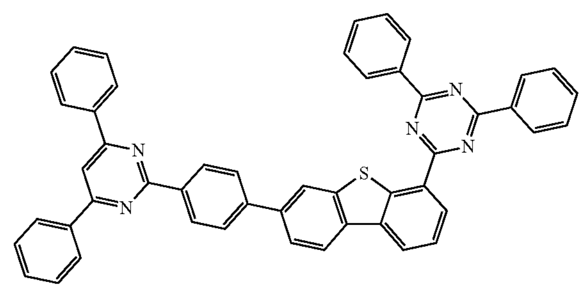
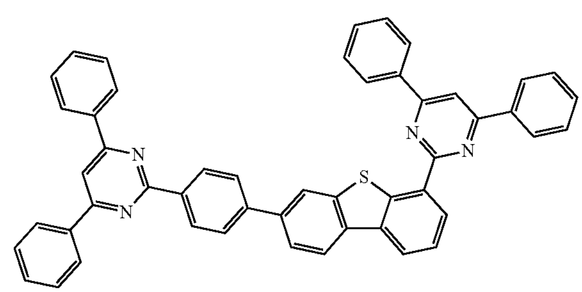

-continued
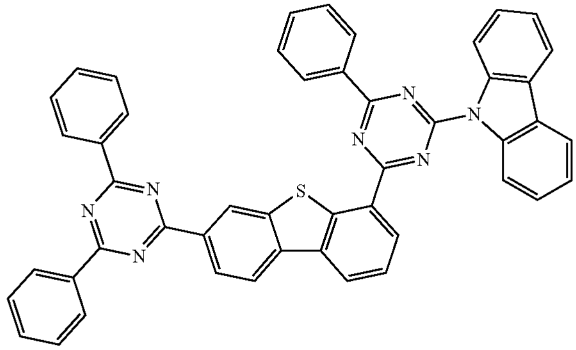
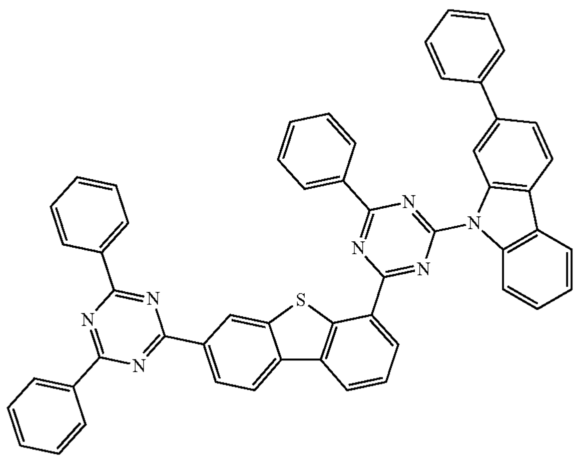
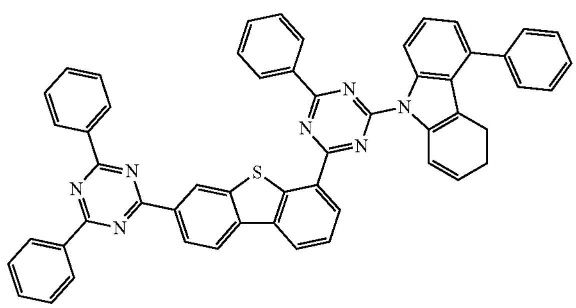
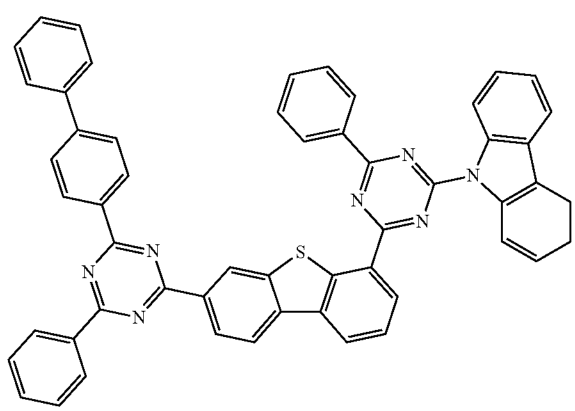
-continued
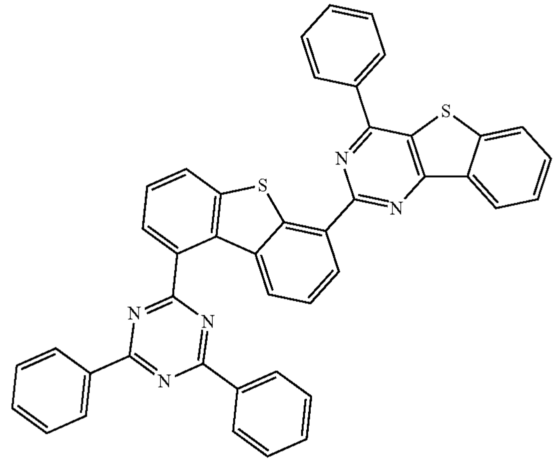
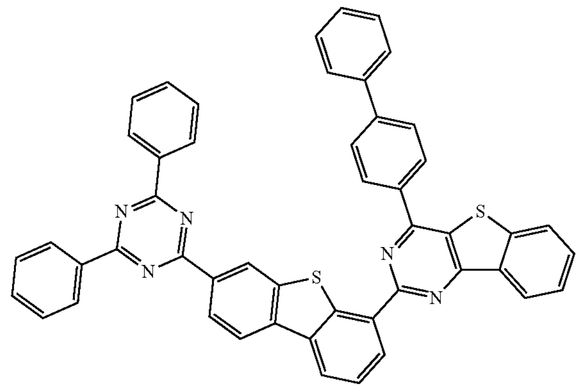
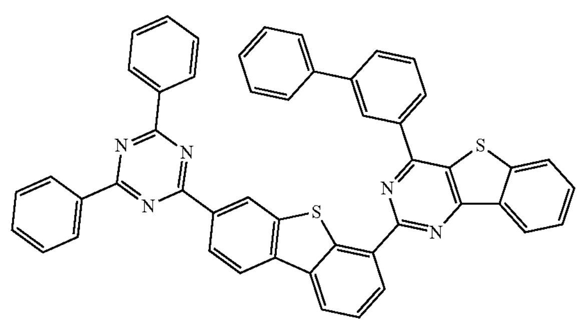
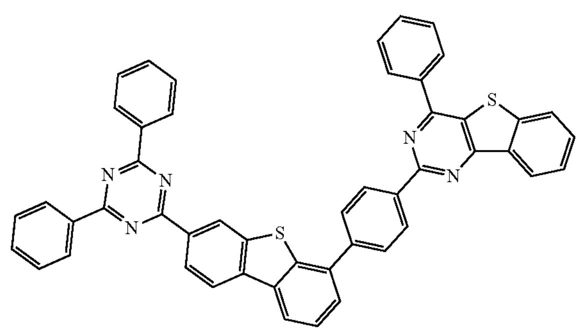

-continued
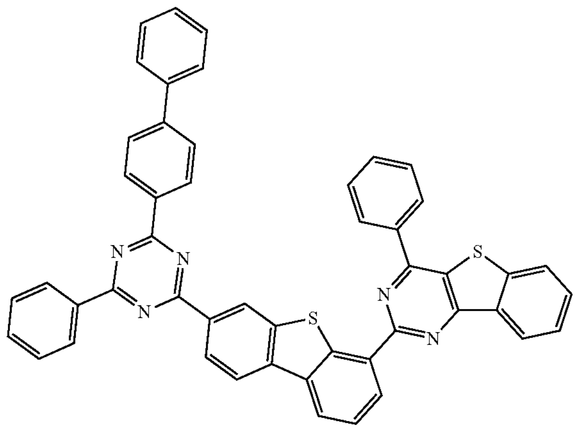
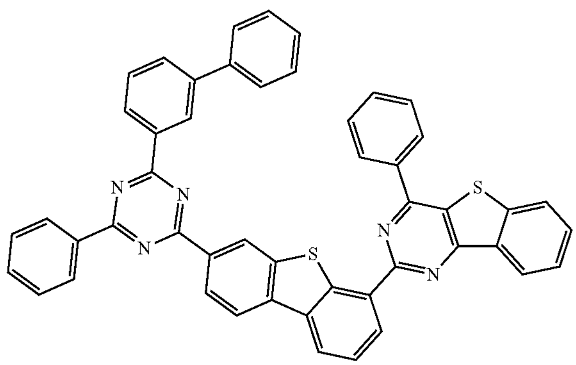
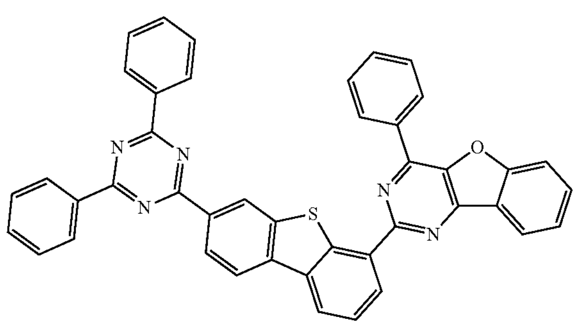
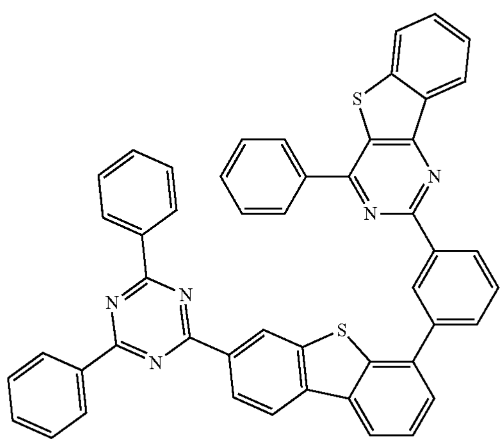
-continued
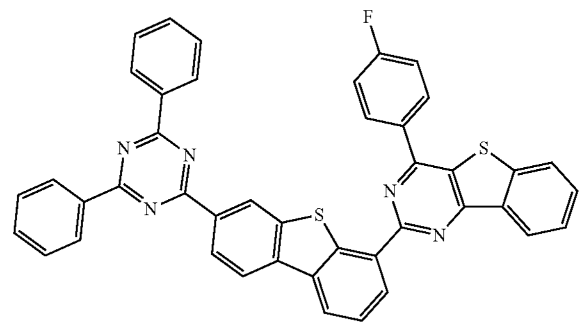
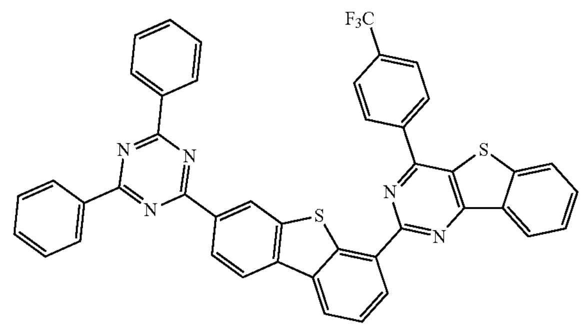
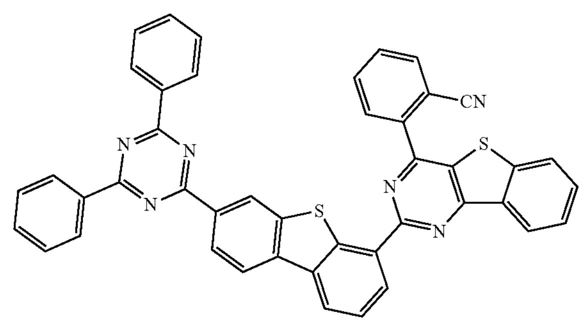
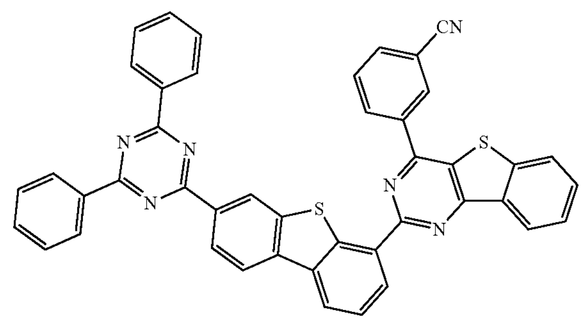
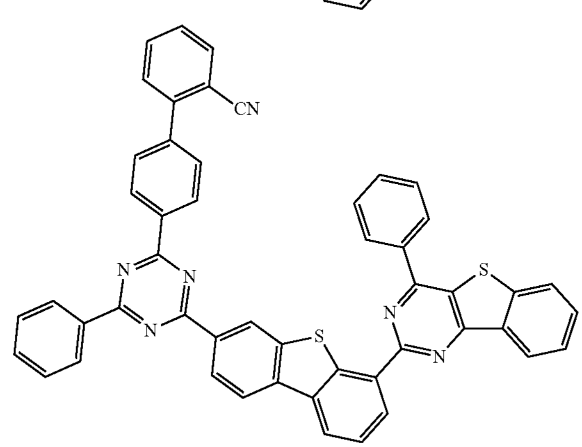

-continued
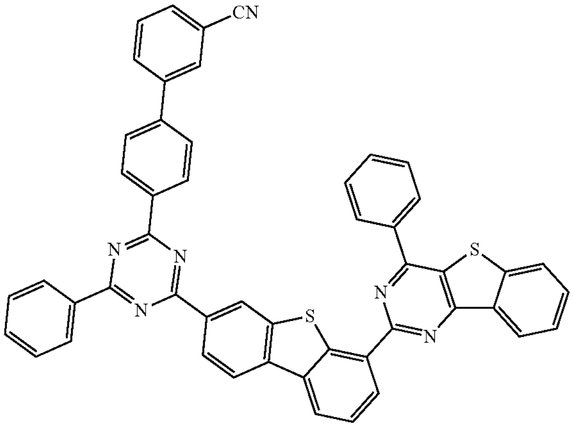
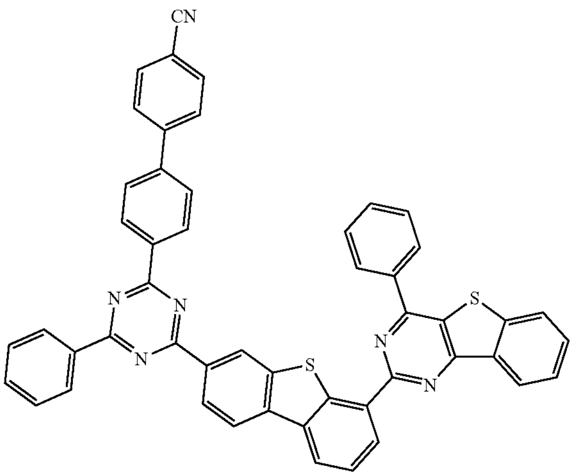
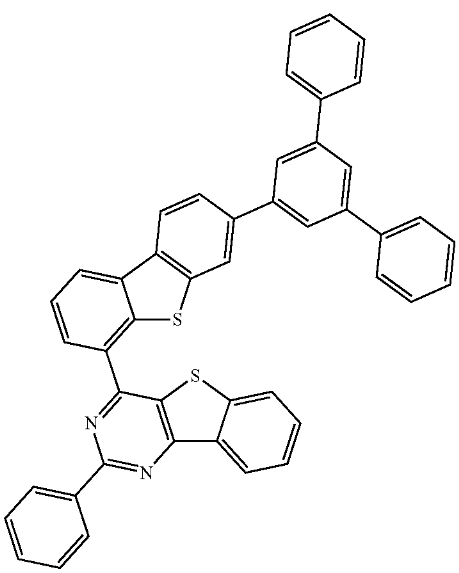
-continued
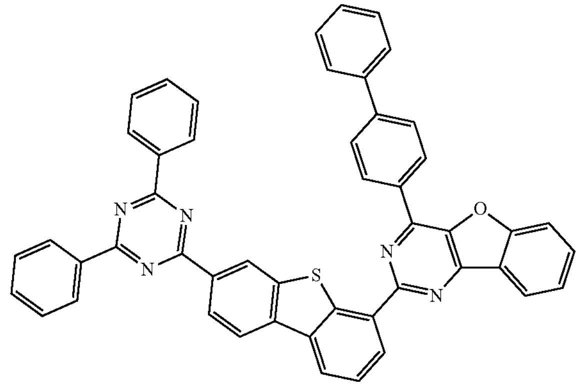
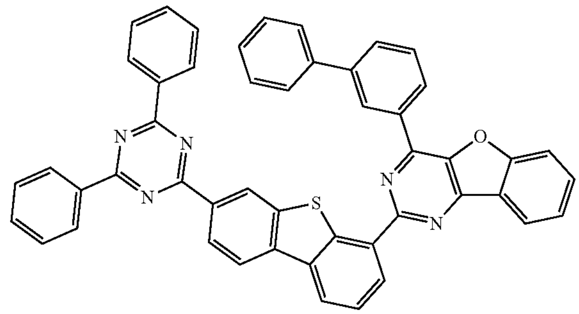
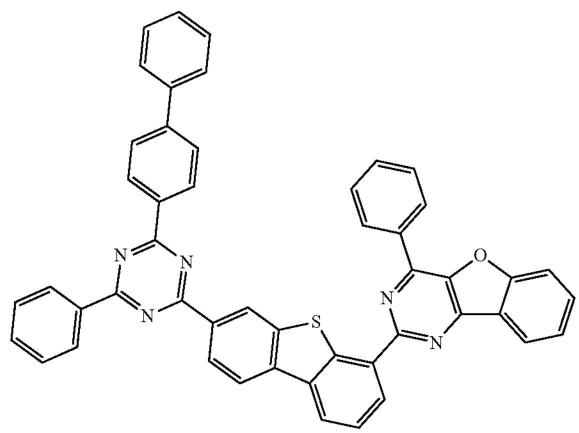
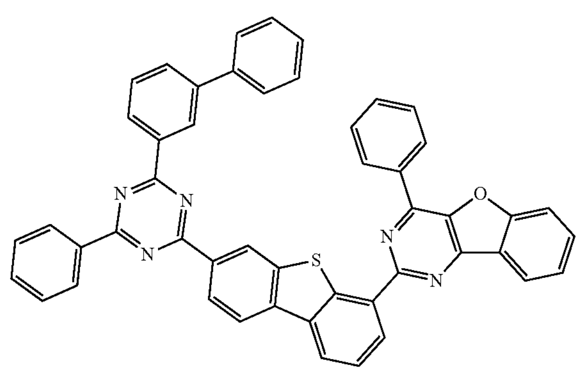

-continued
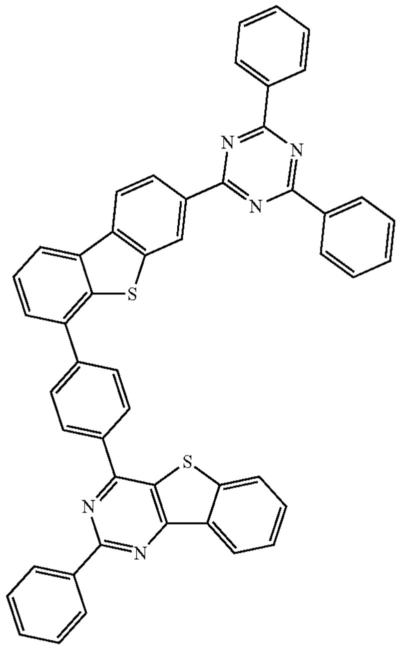
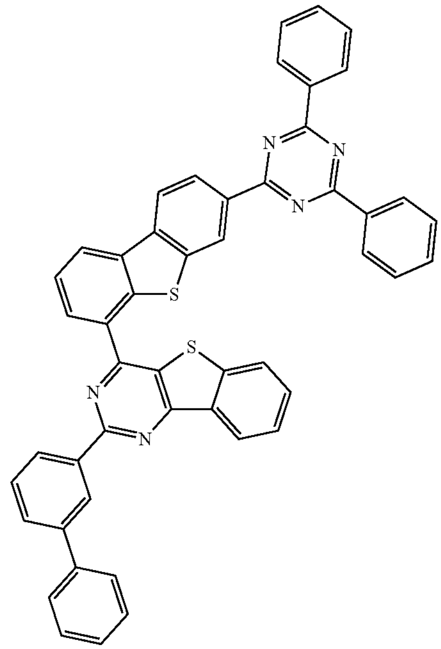
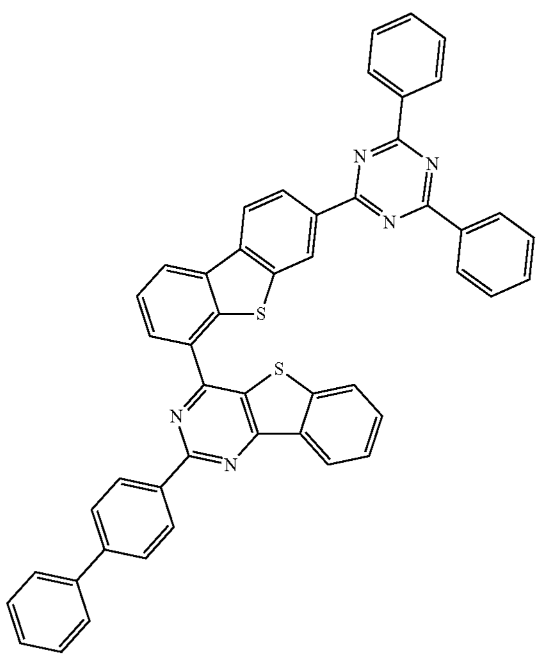
-continued
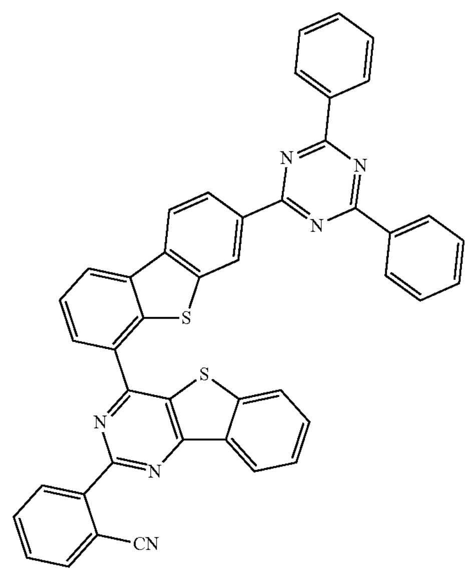

-continued
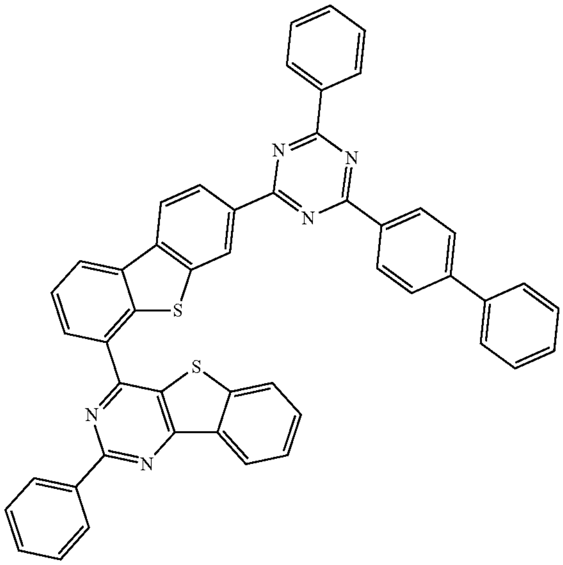
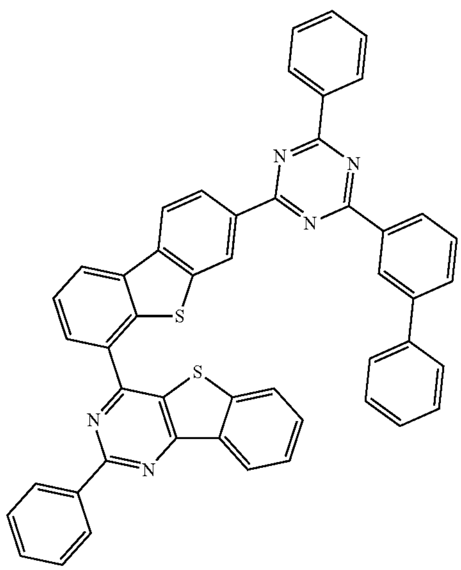
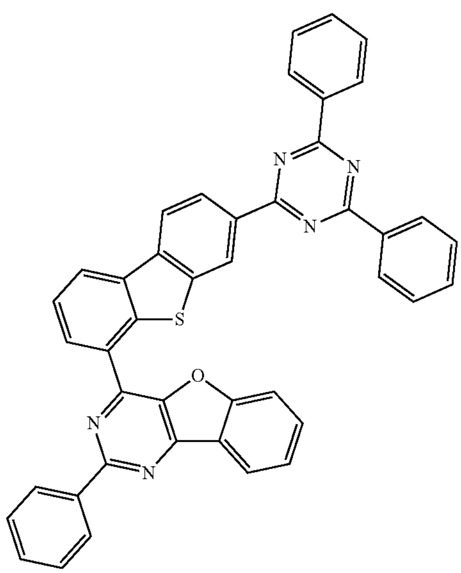
-continued
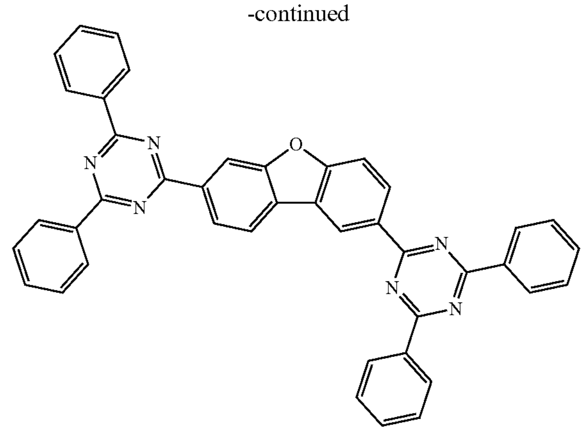
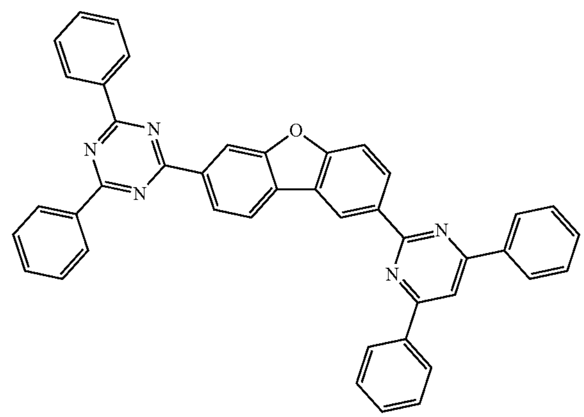
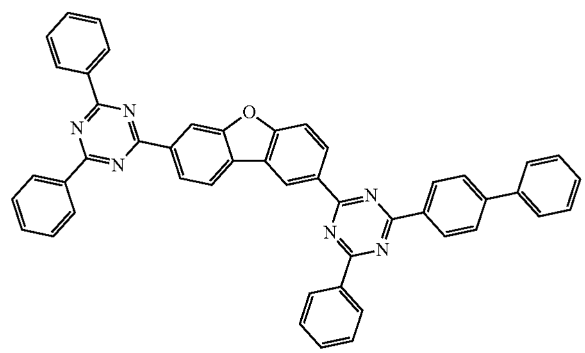
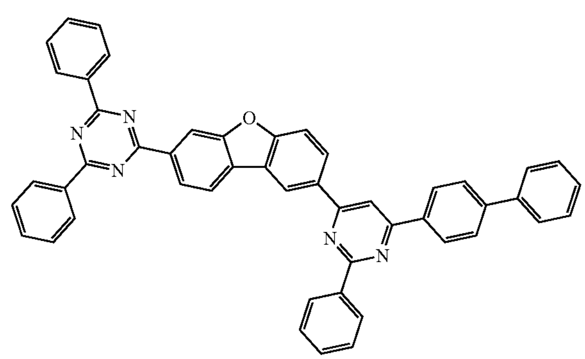

-continued
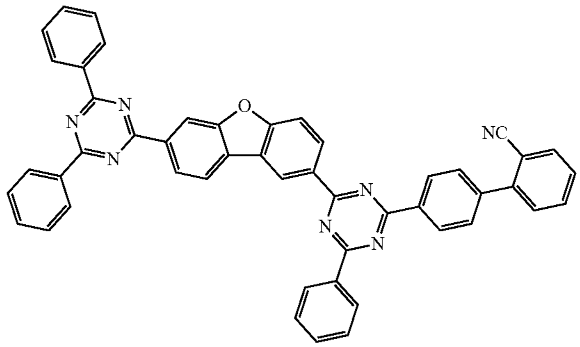
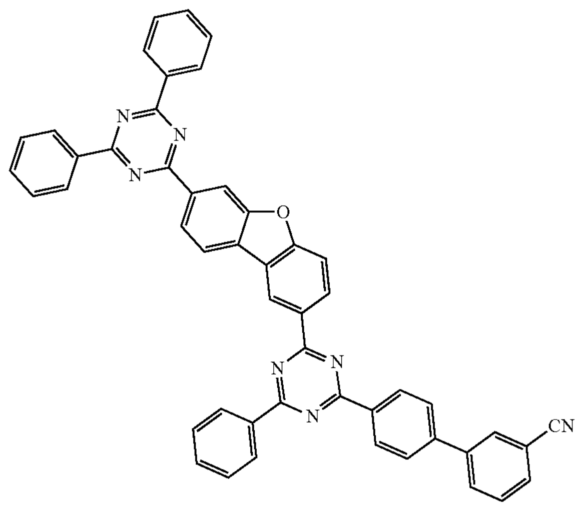
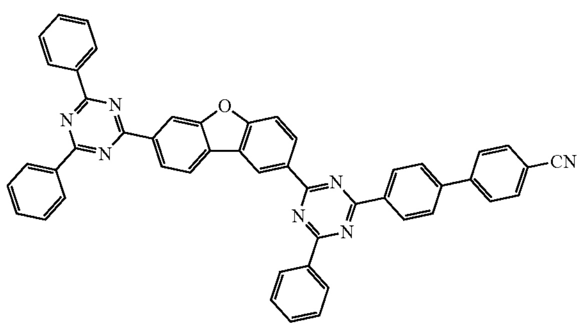
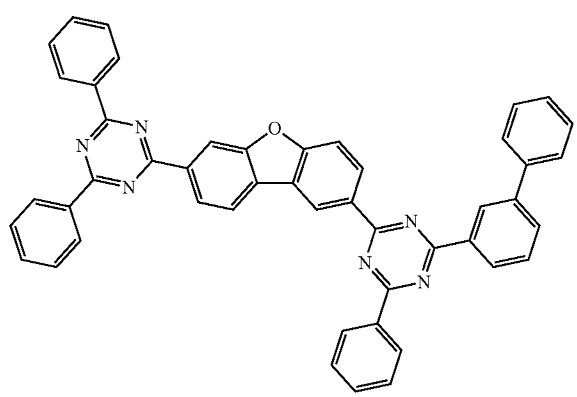
-continued
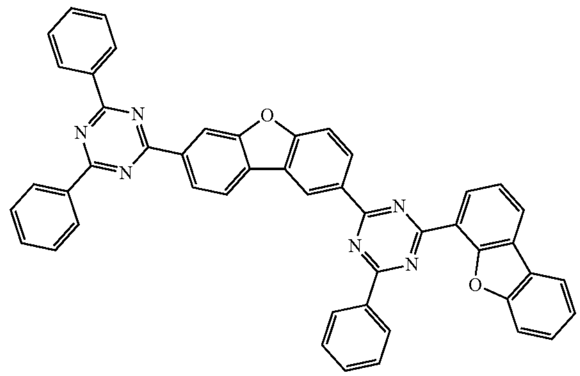
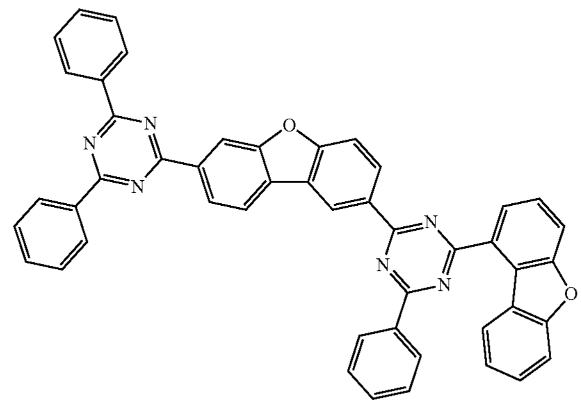
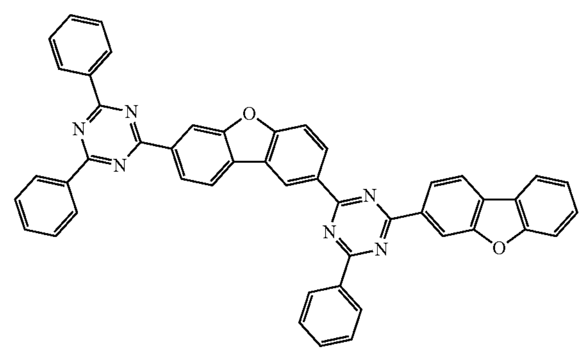
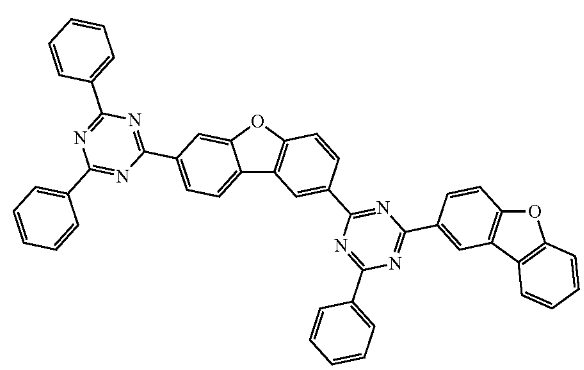

-continued
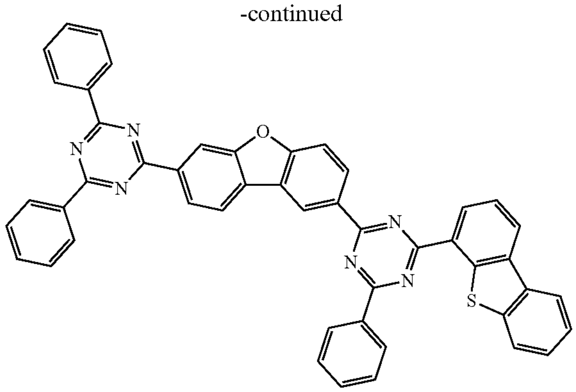
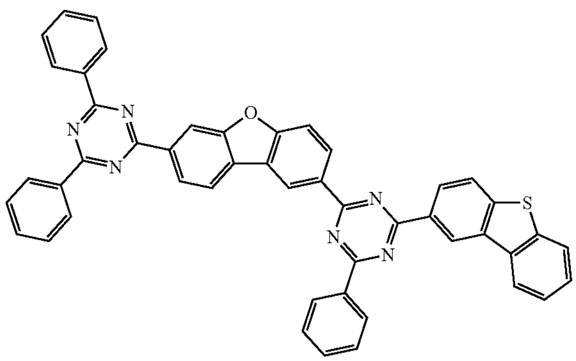
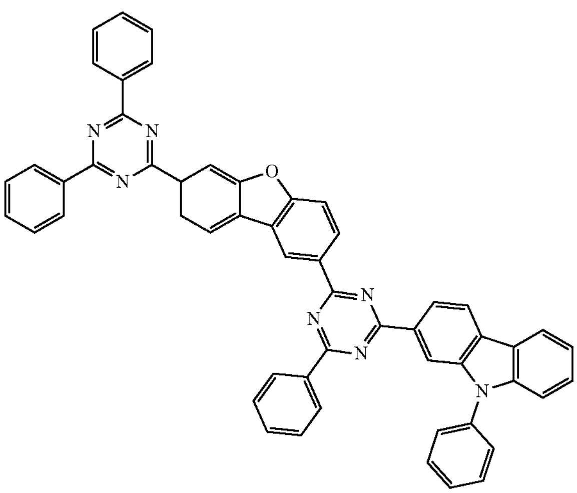
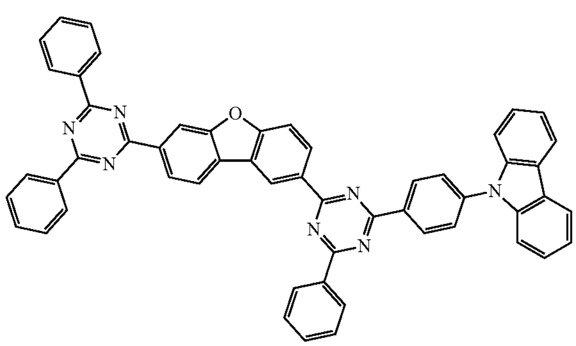
-continued
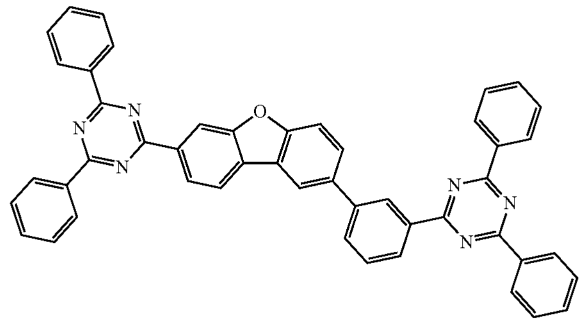
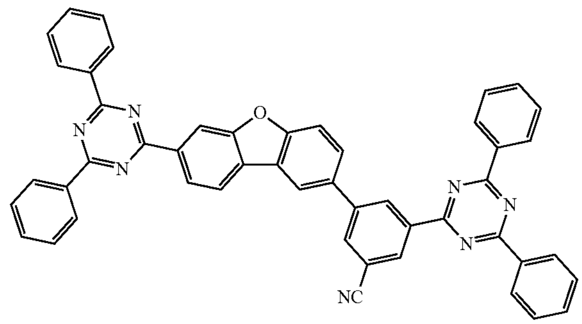
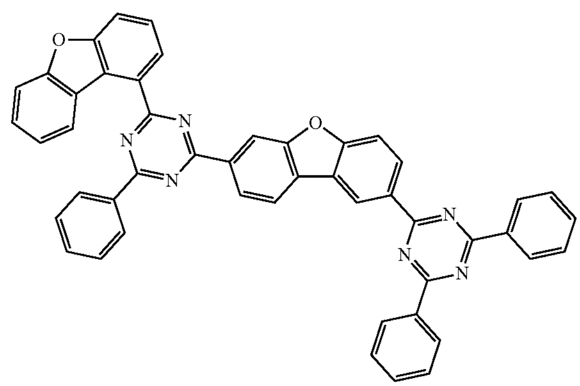
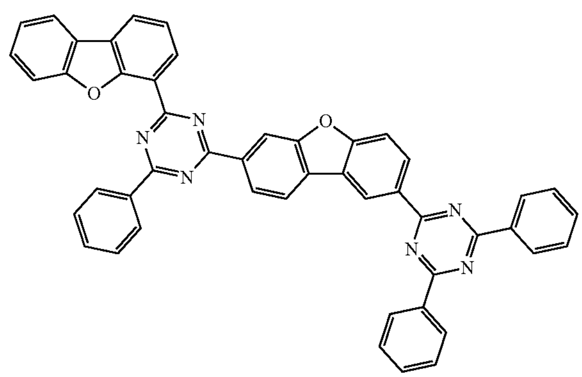

-continued
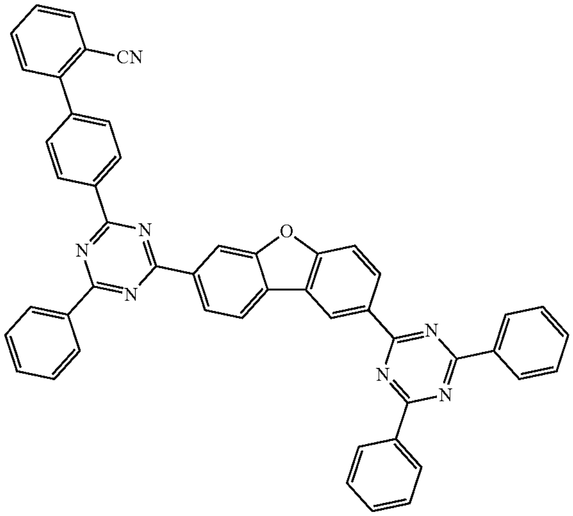
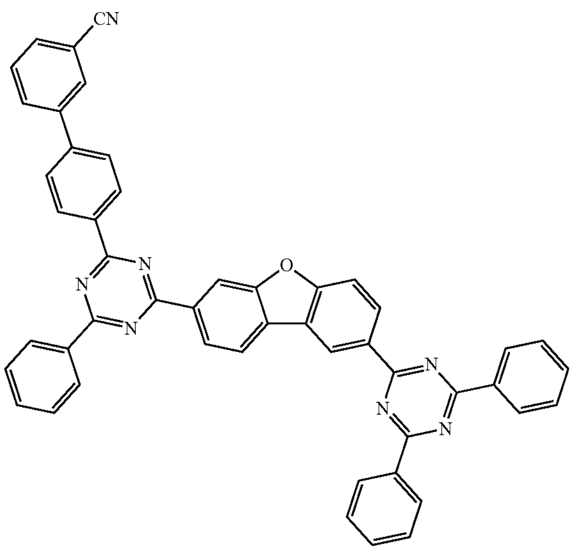
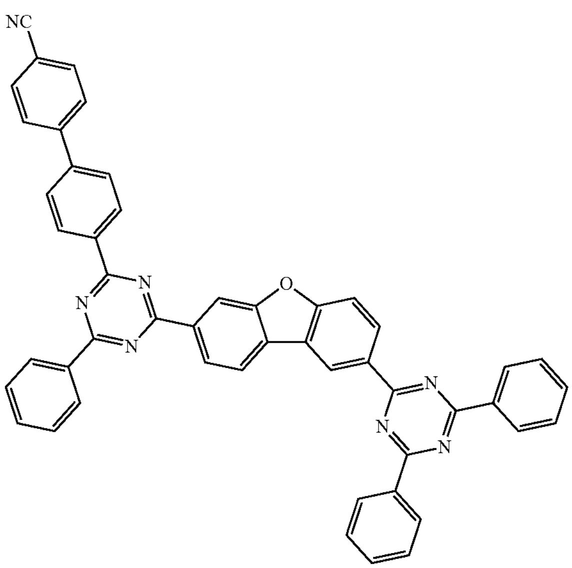
-continued
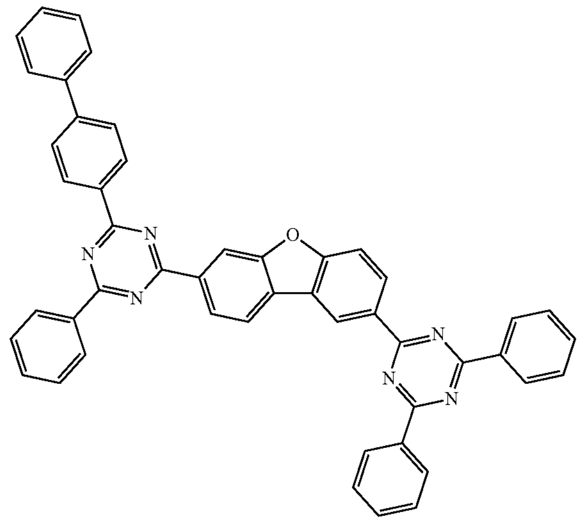
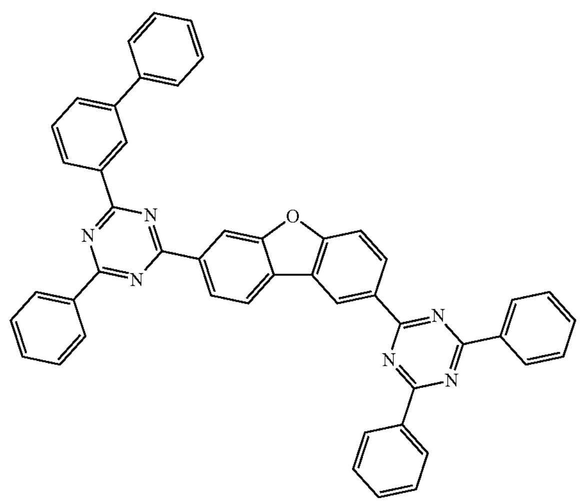
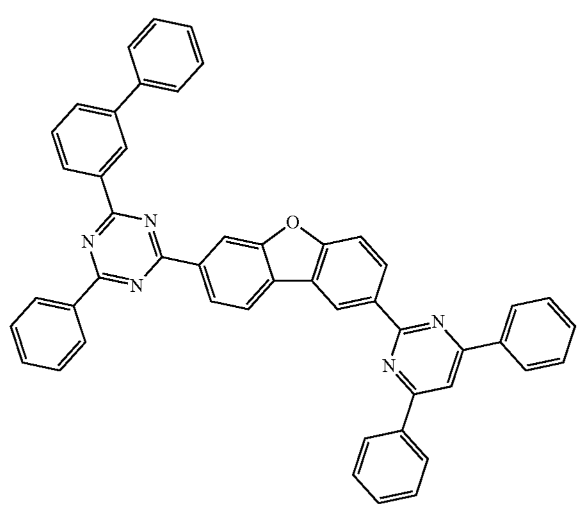

-continued
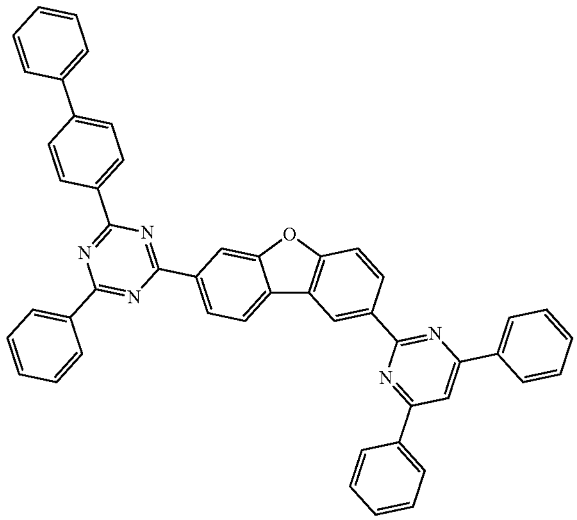
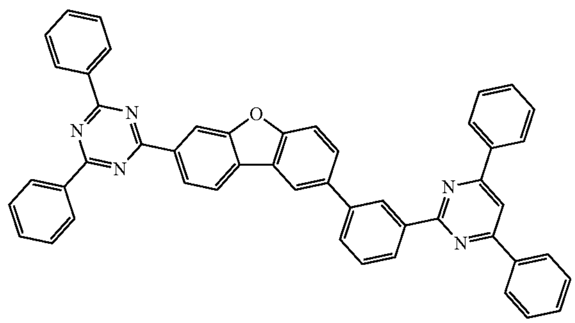
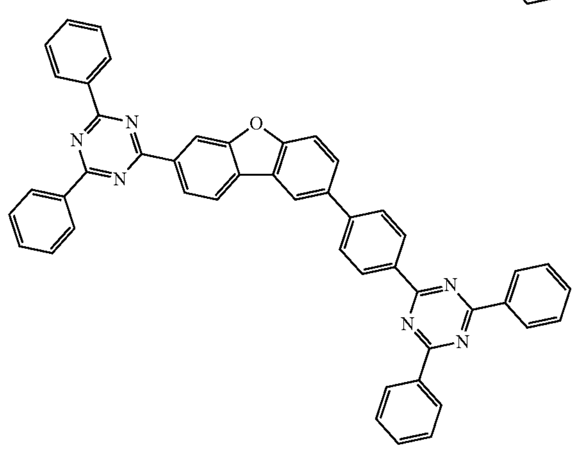
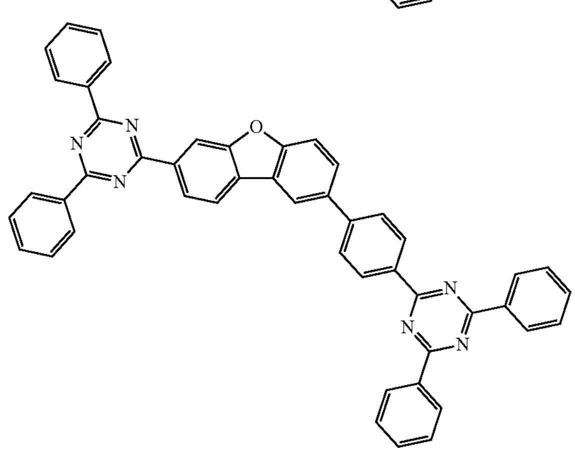
-continued
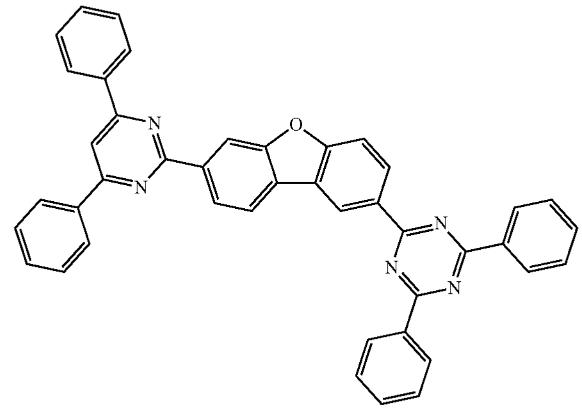
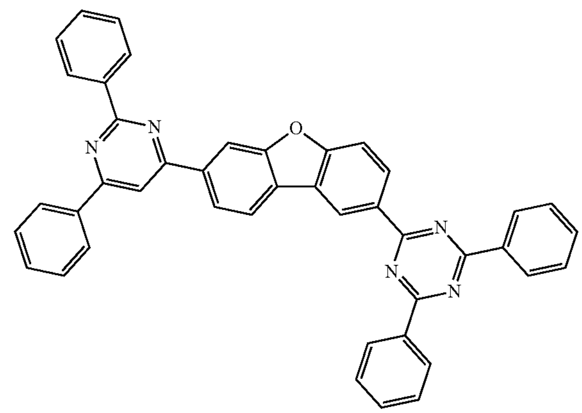
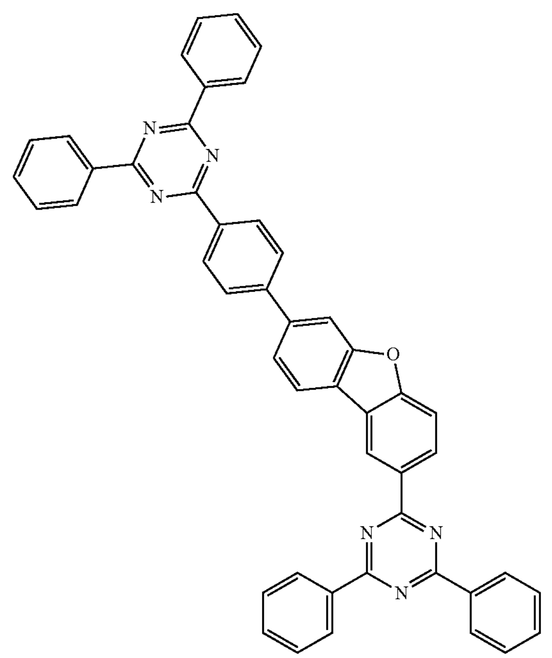

-continued
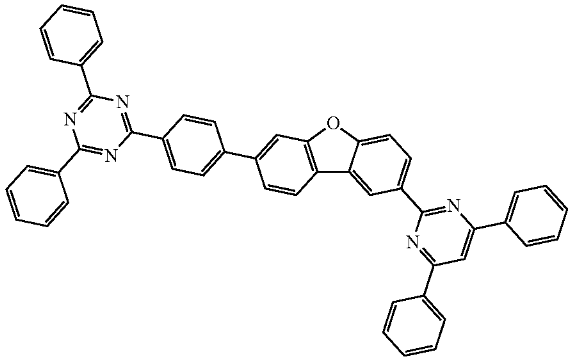
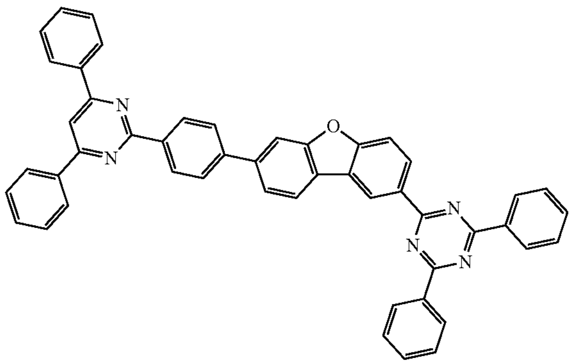
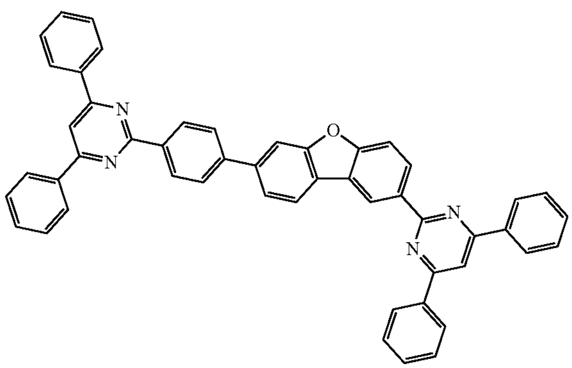
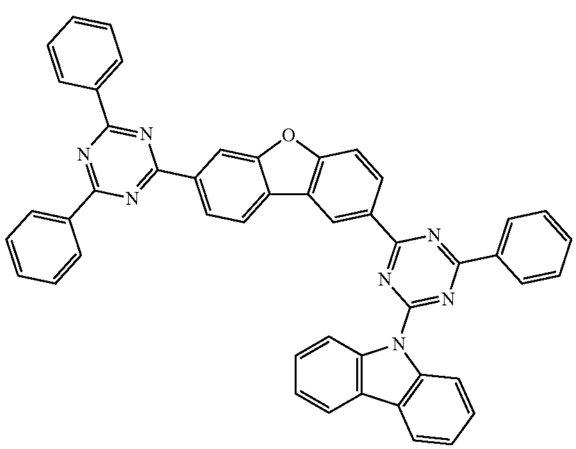
-continued
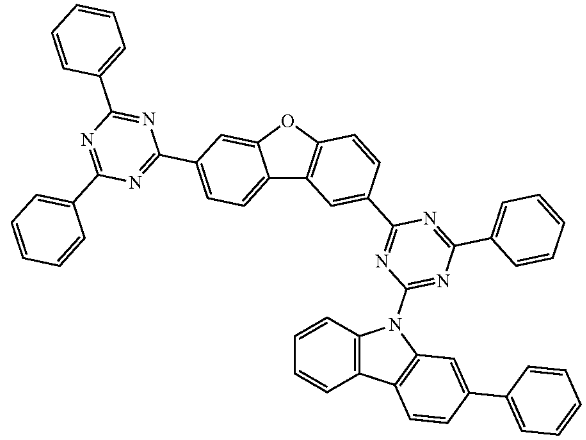
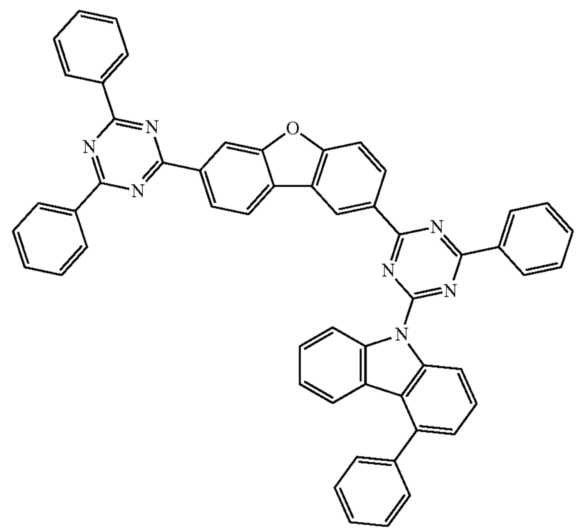
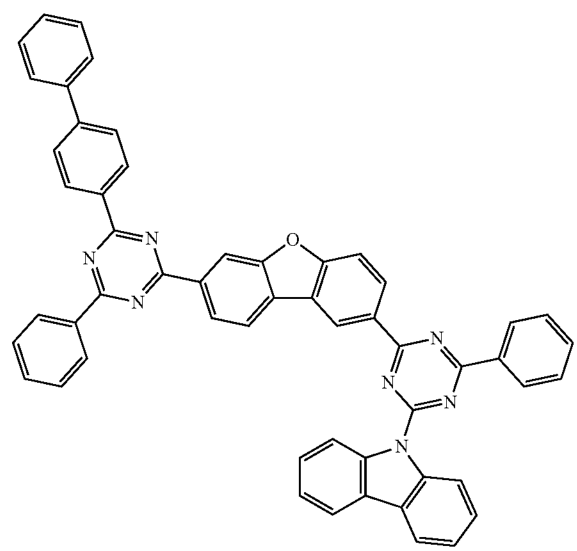

-continued
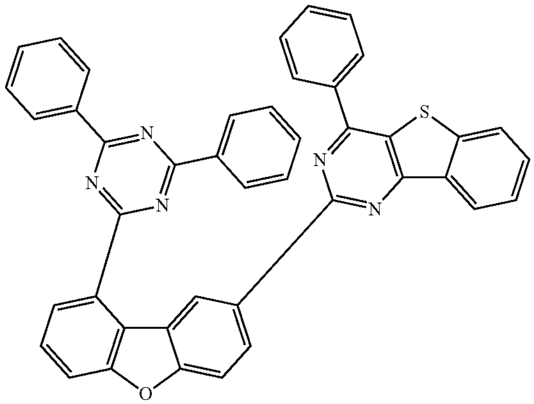
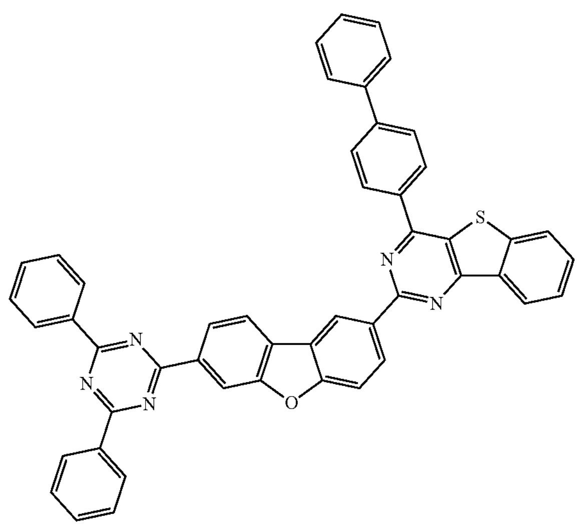
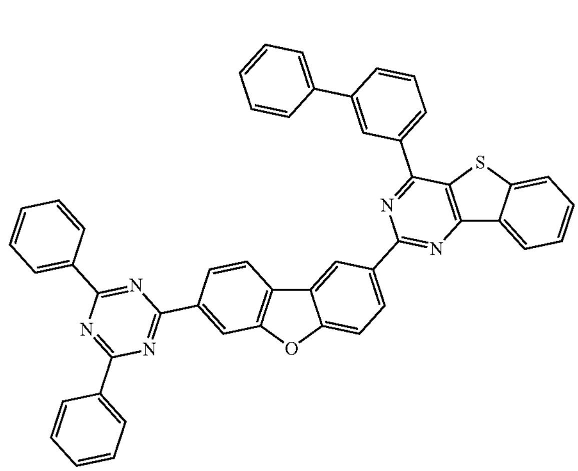
-continued
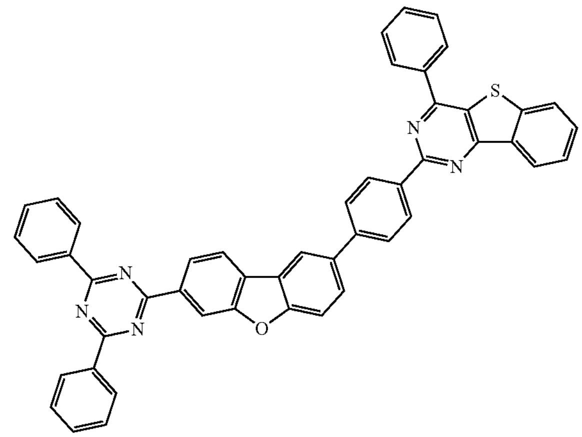
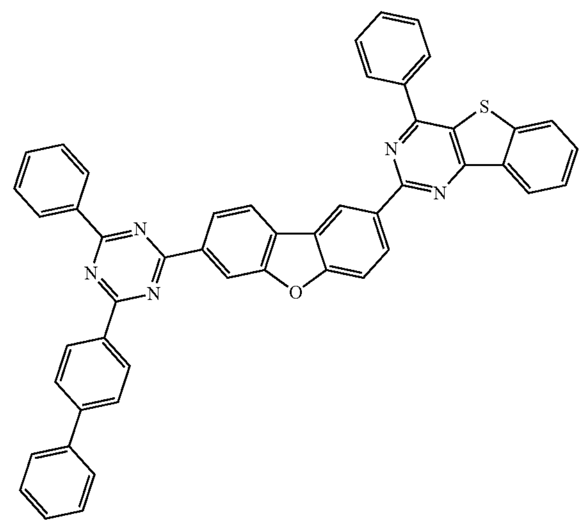
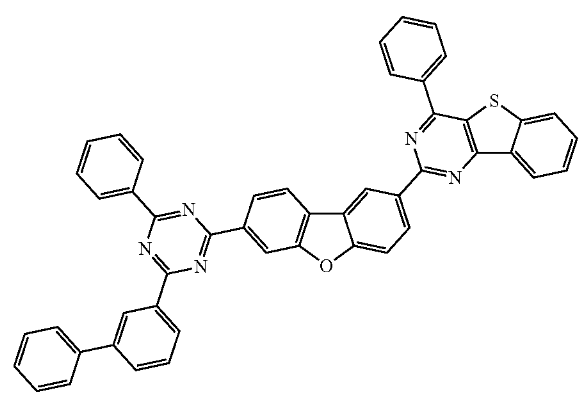

-continued
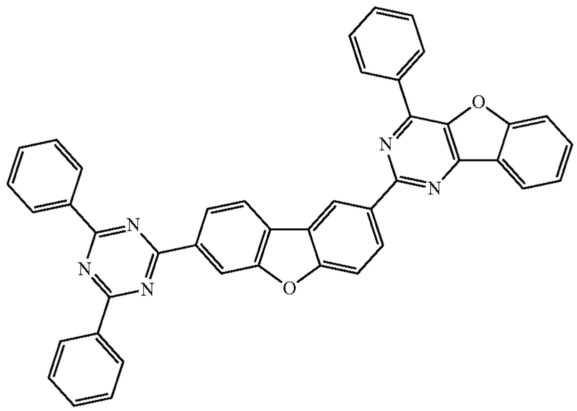
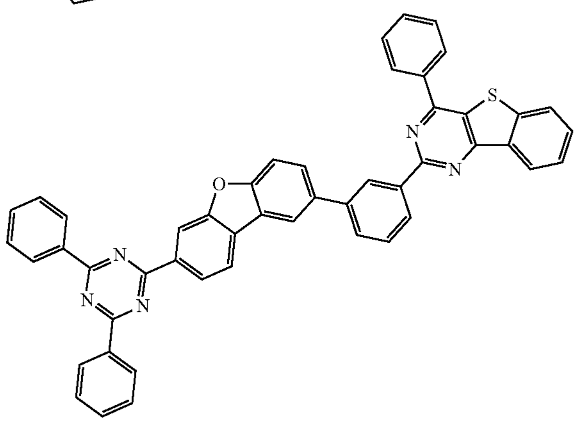
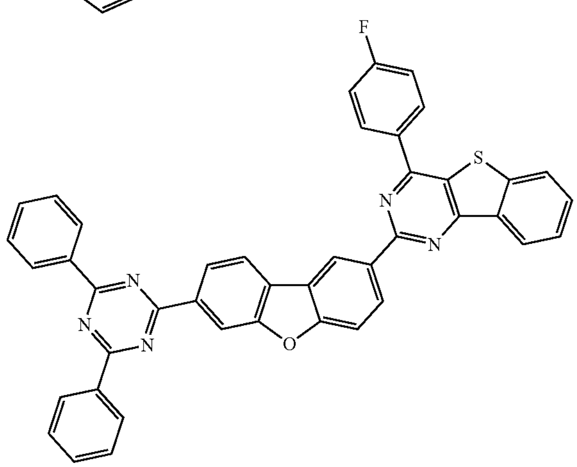
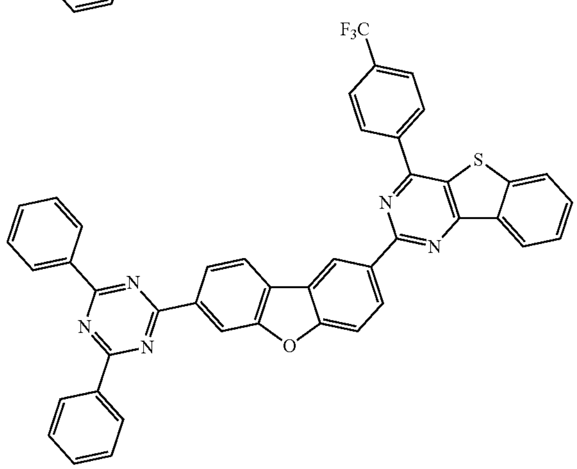
-continued
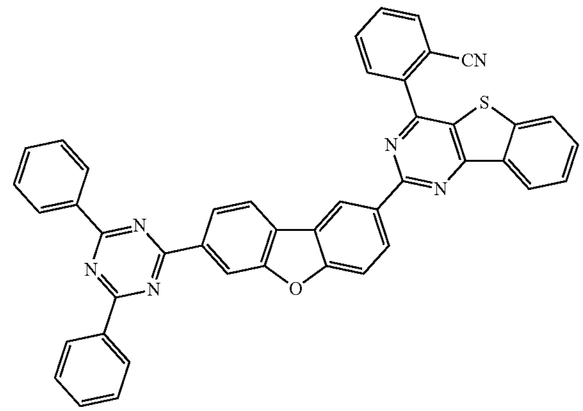
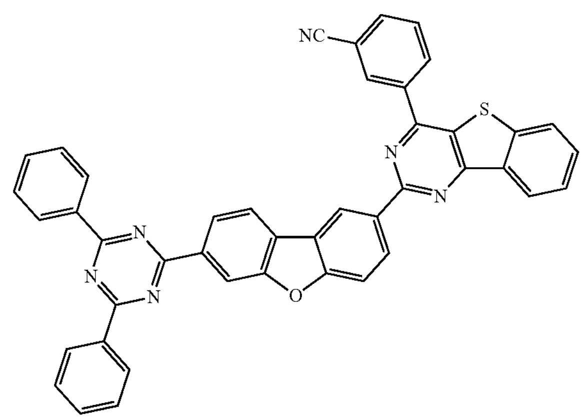
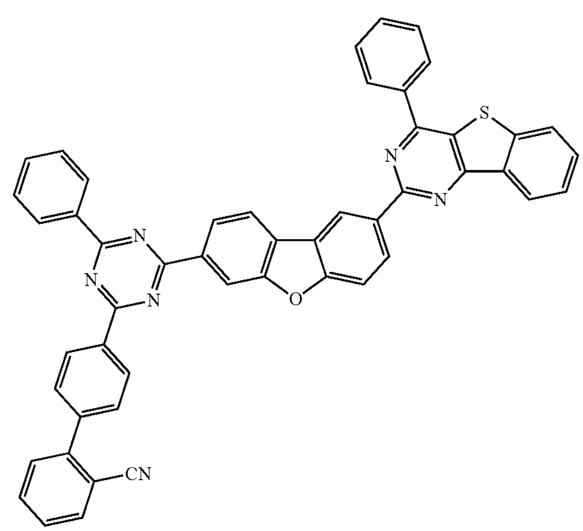

-continued
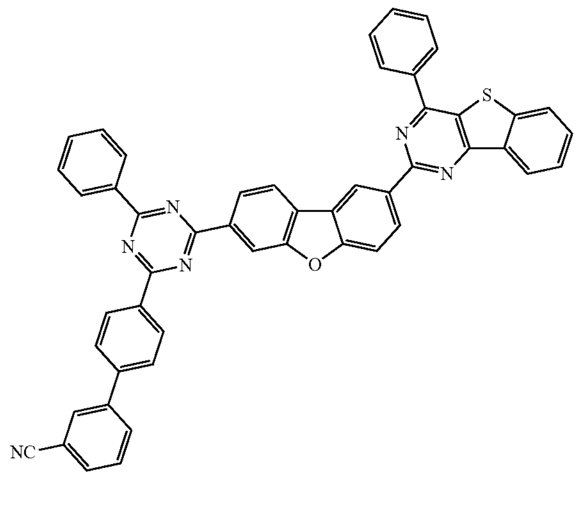
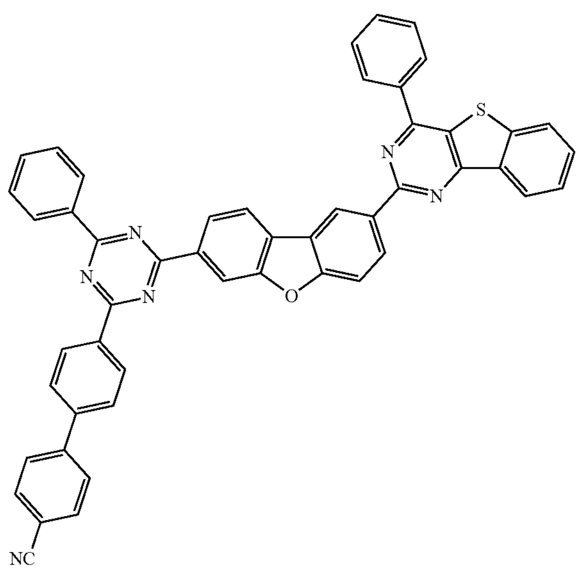
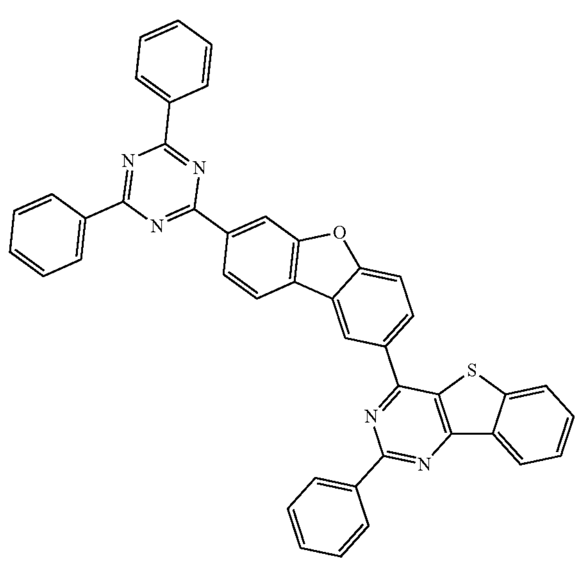
-continued
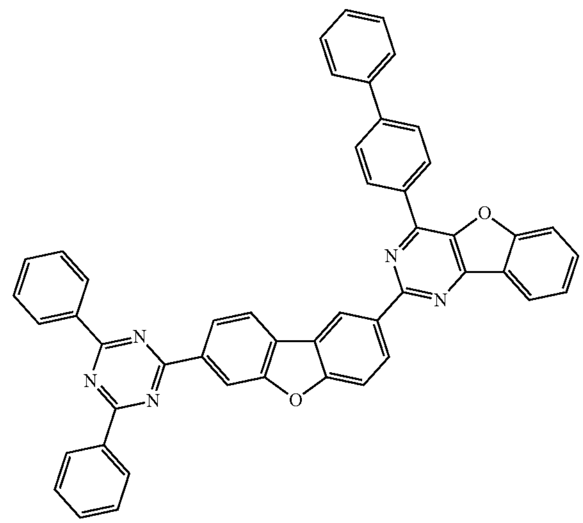
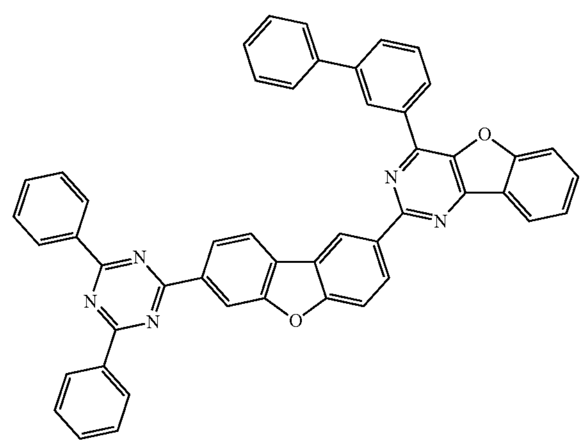
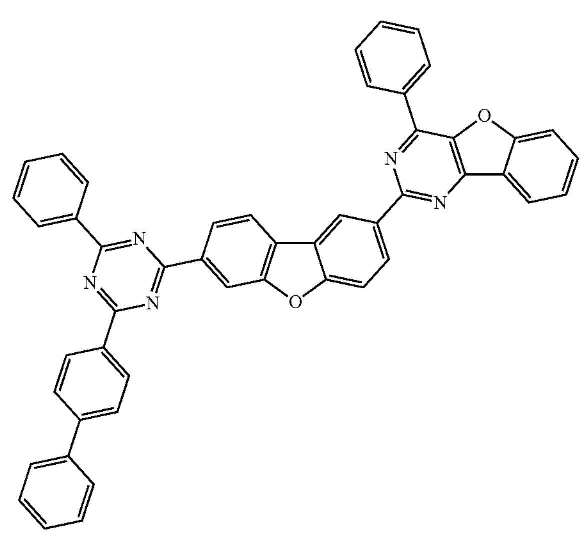

-continued
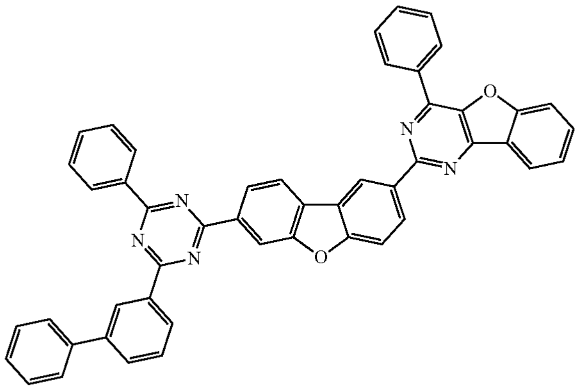
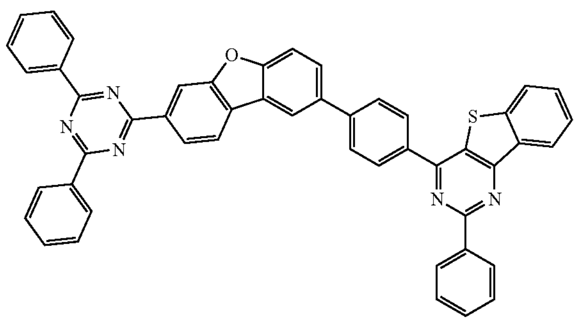
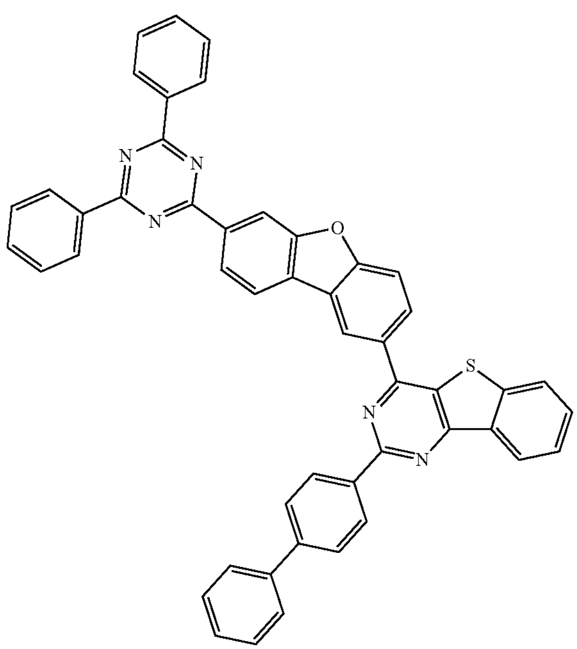
-continued
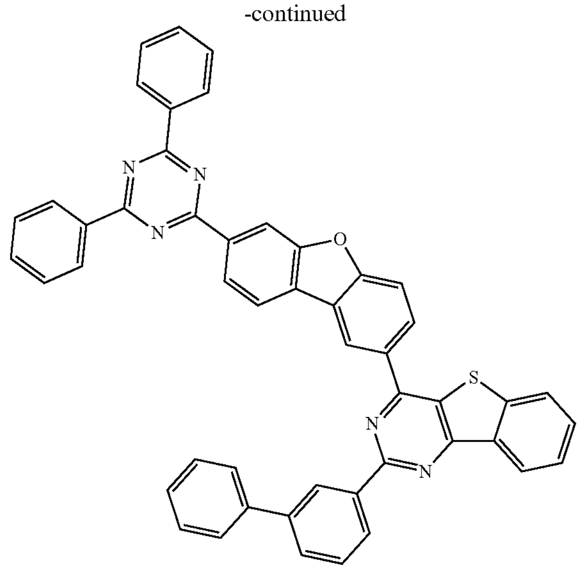
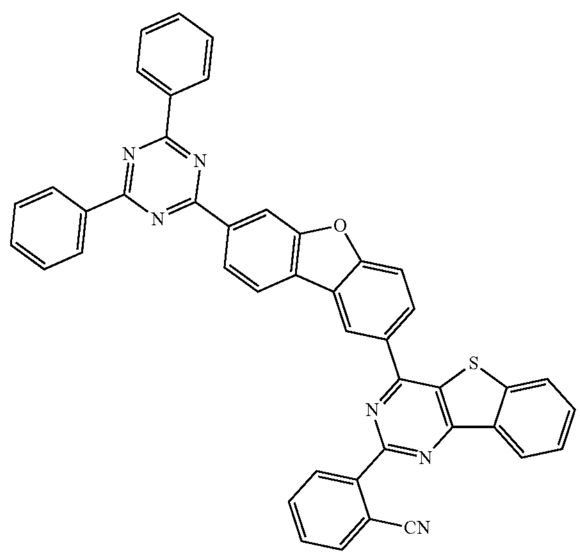
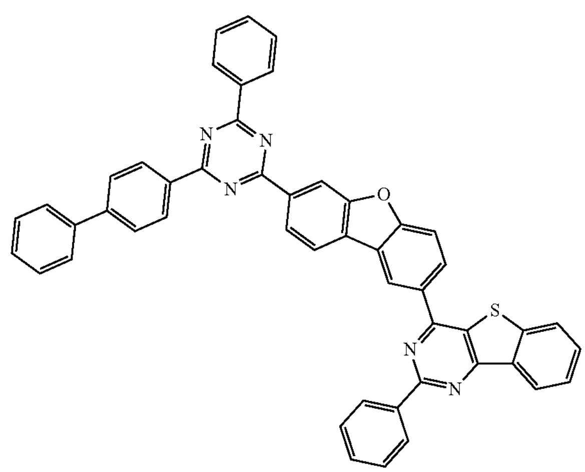

-continued
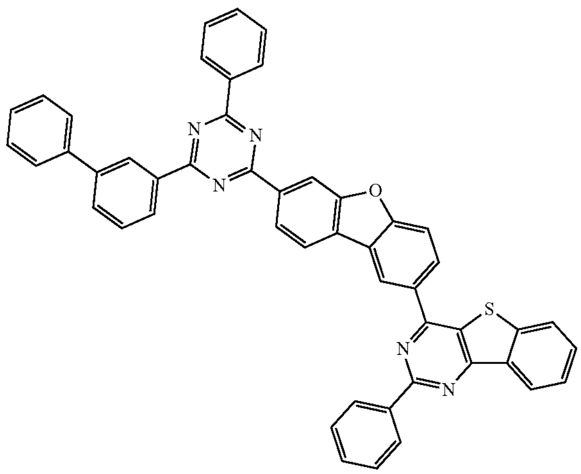
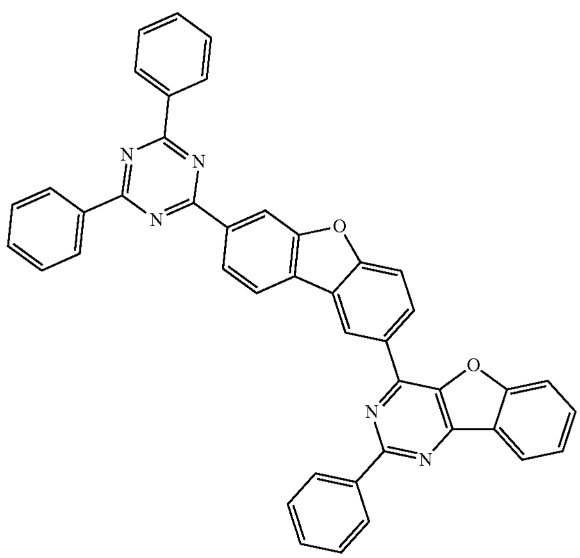
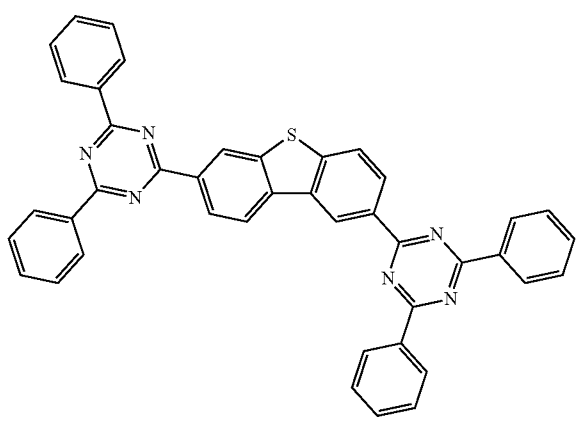
-continued
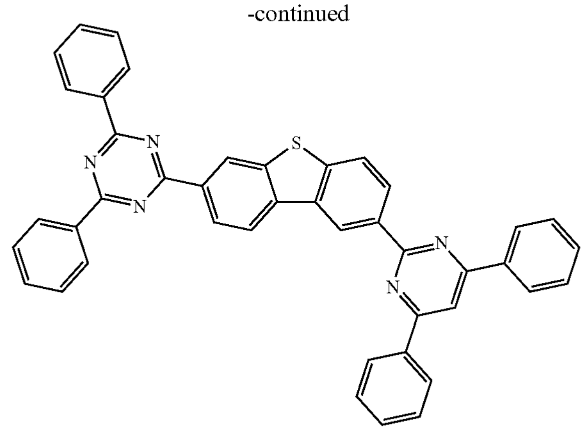
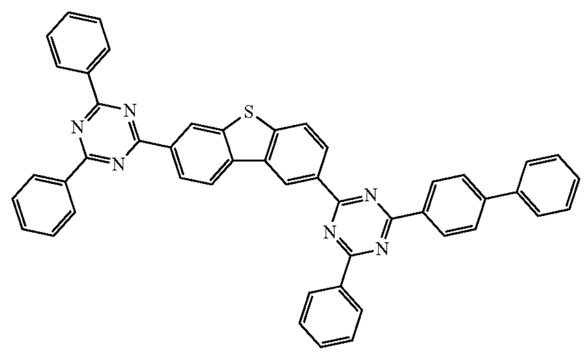
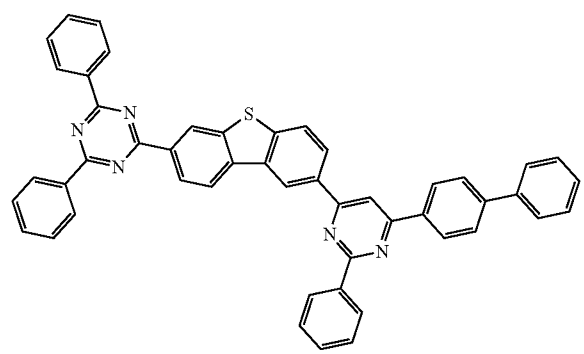
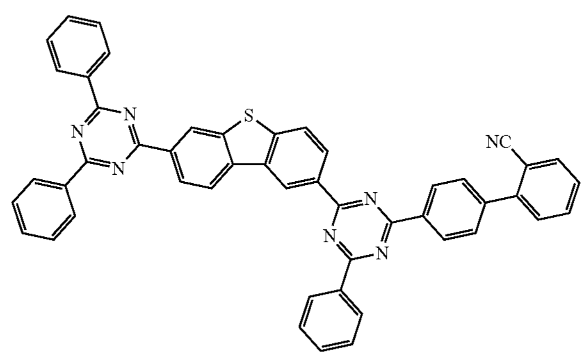

-continued
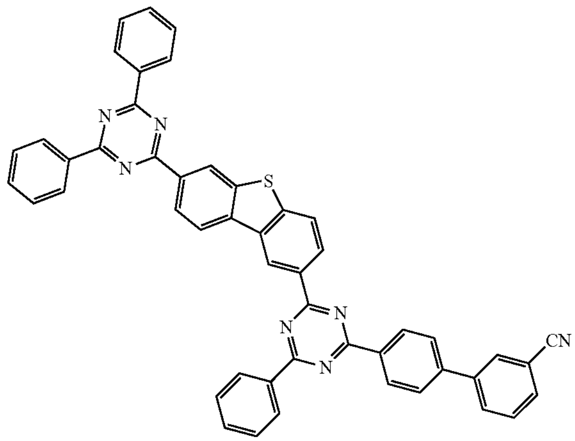
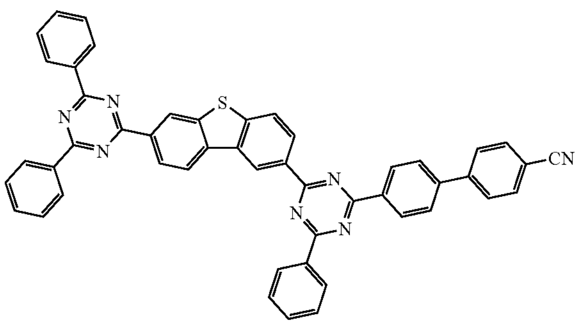
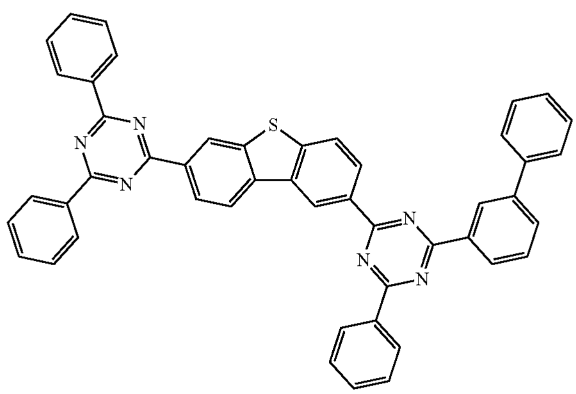
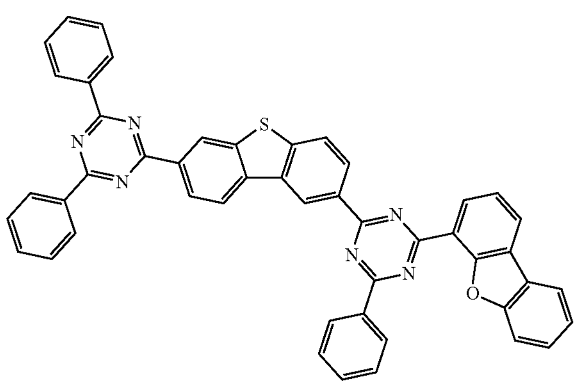
-continued
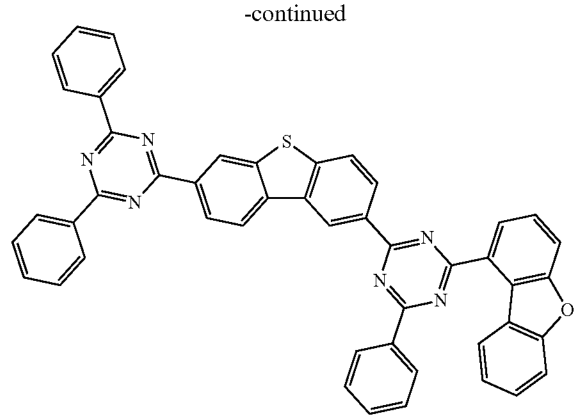
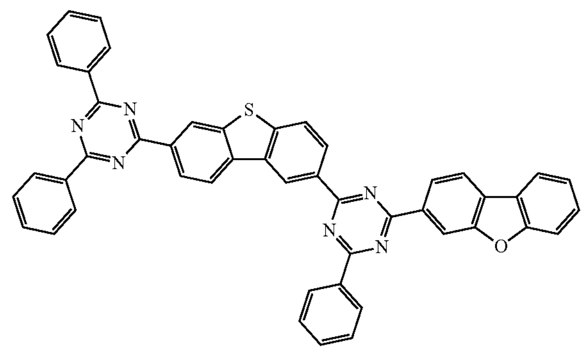
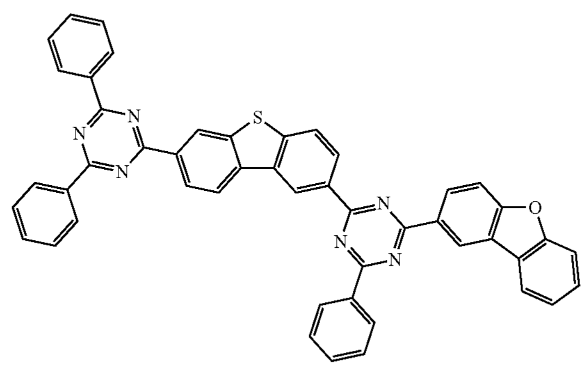
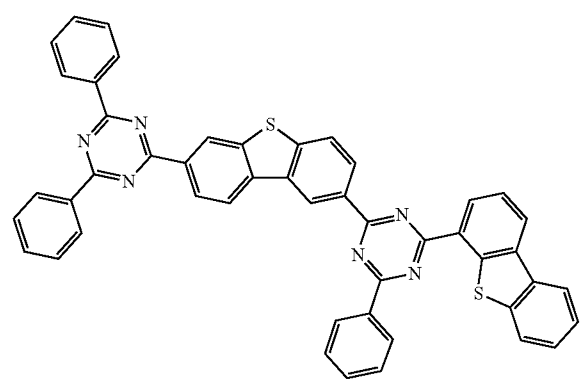

-continued
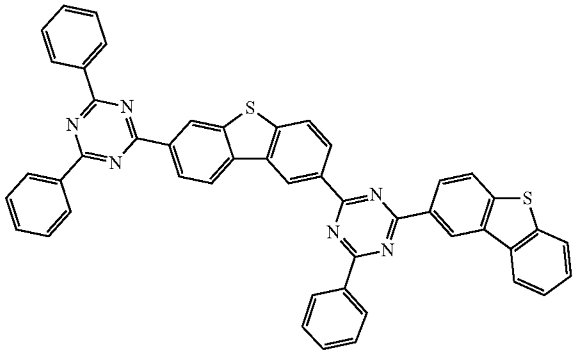
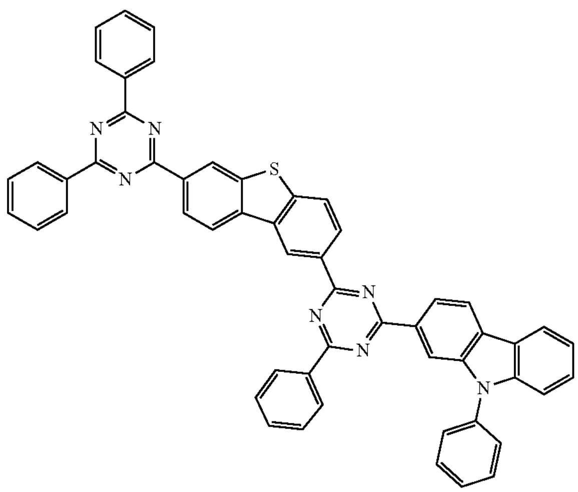
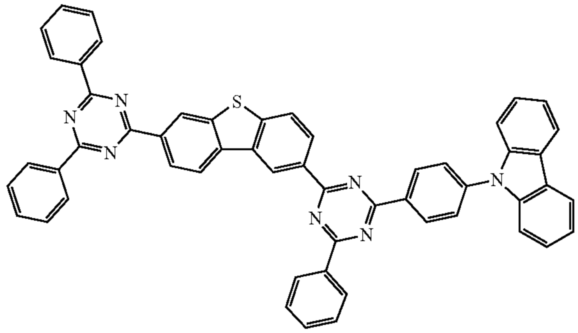
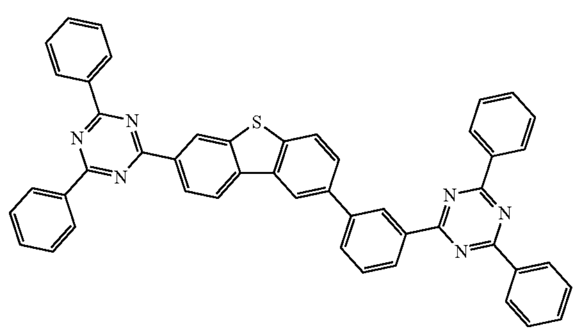
-continued
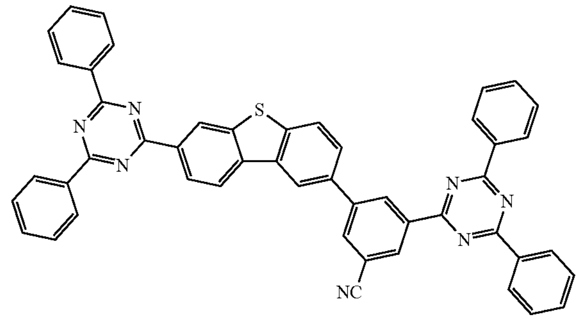
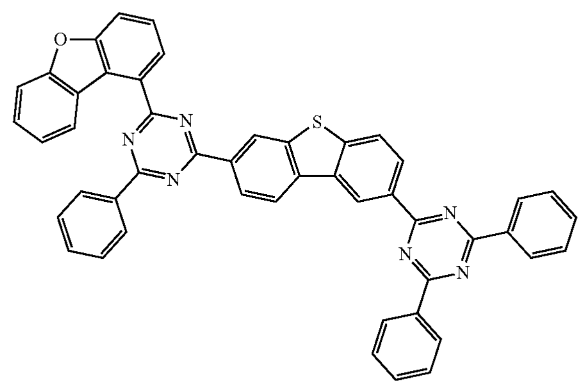
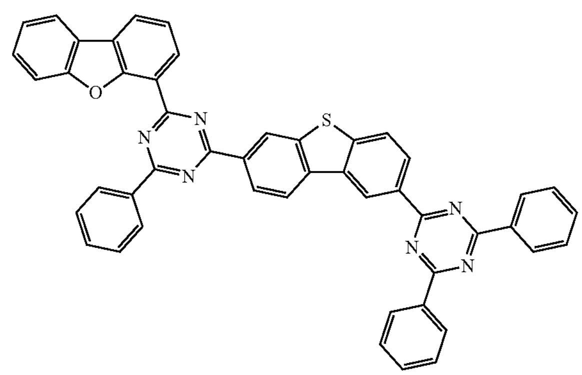
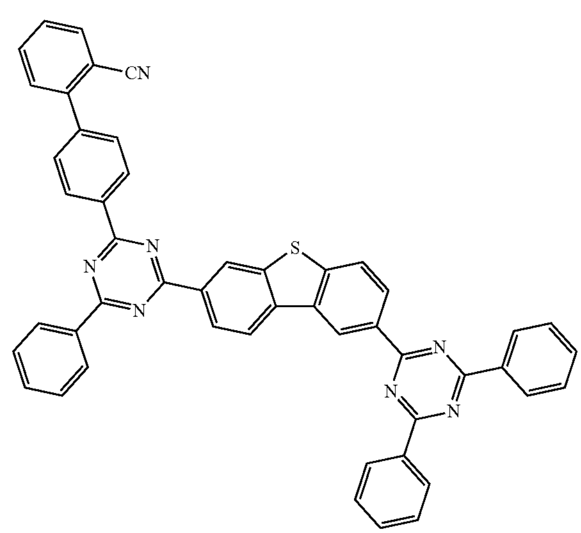

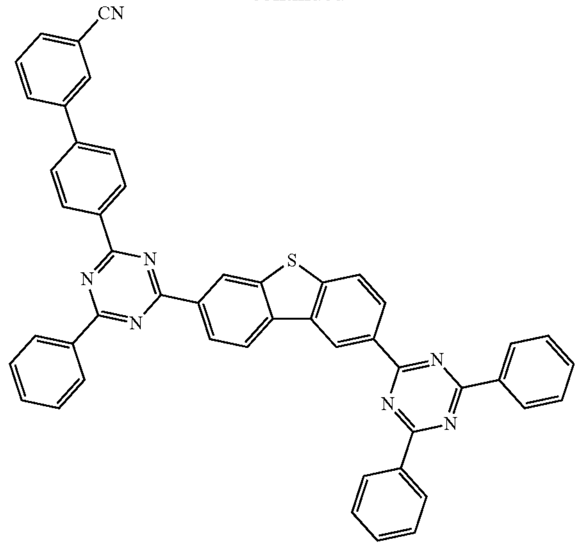
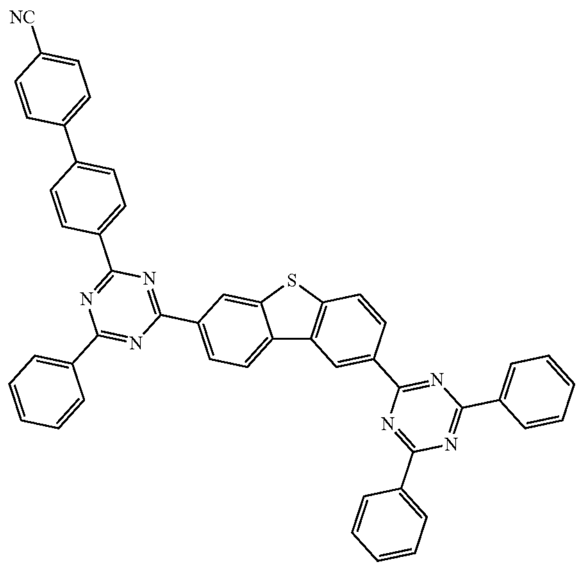
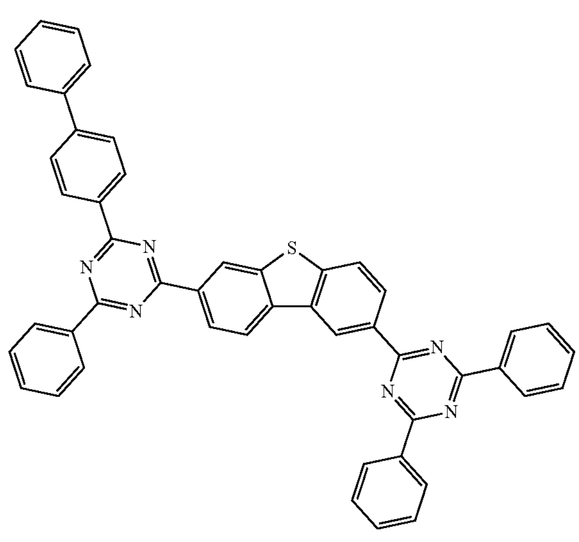
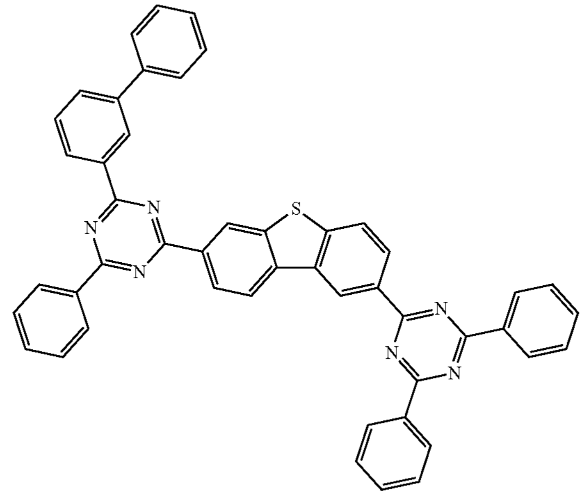
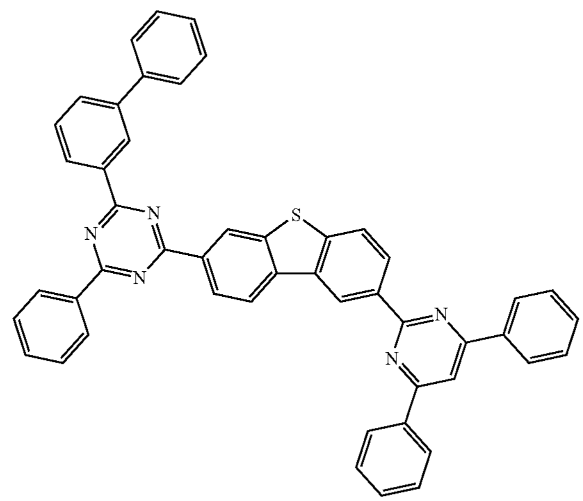
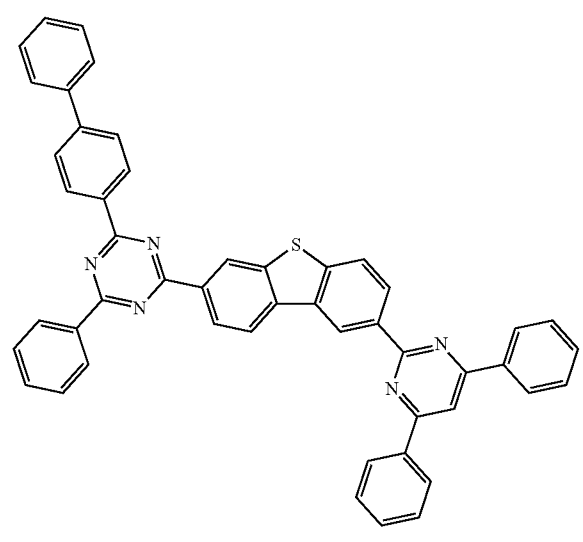

-continued
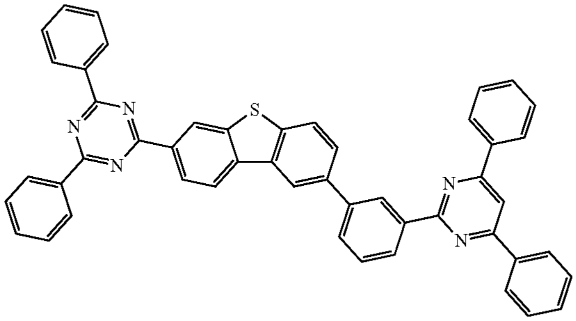
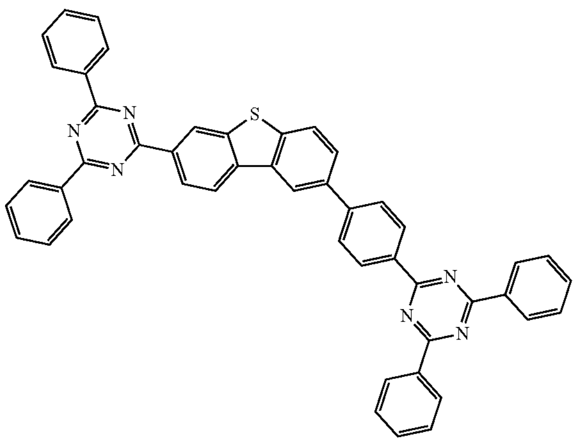
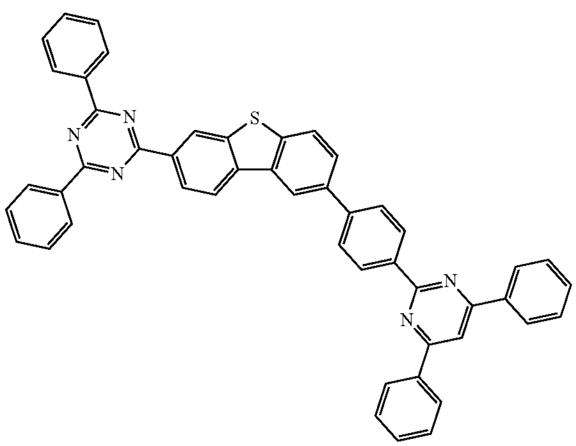
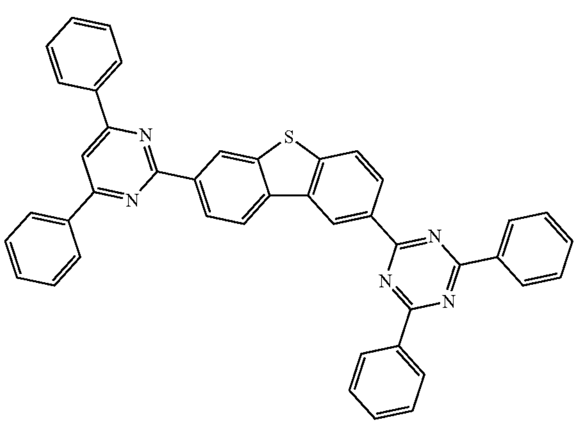
-continued
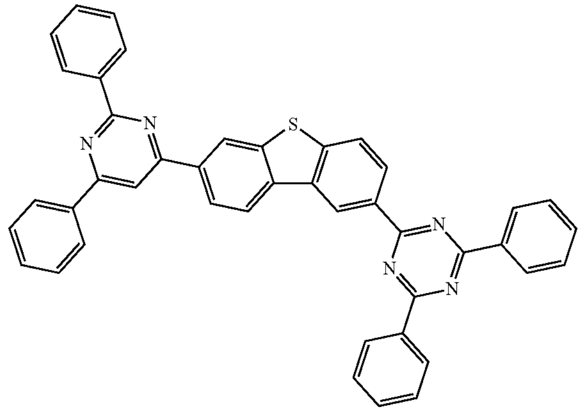
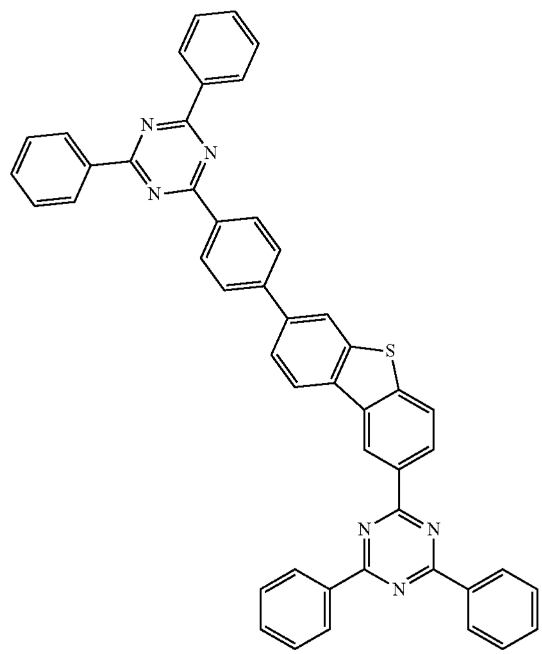
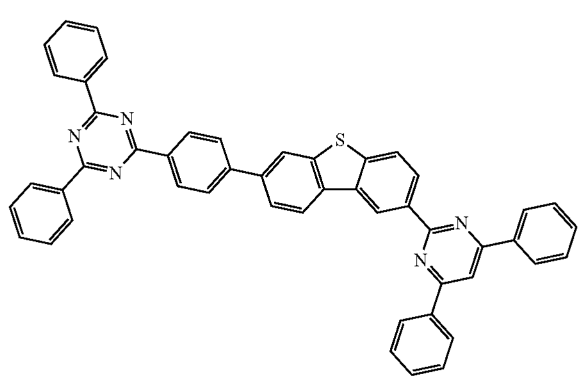

-continued
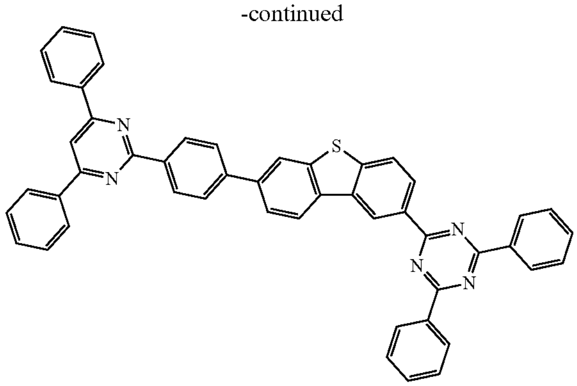
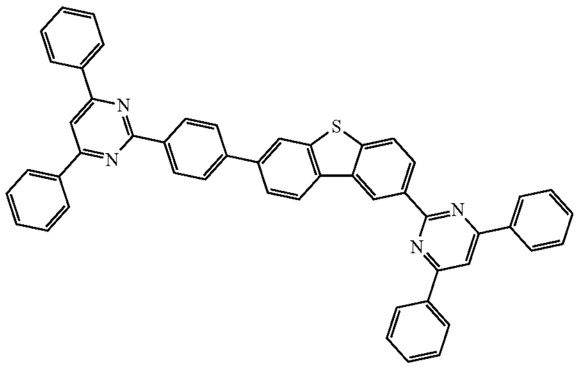
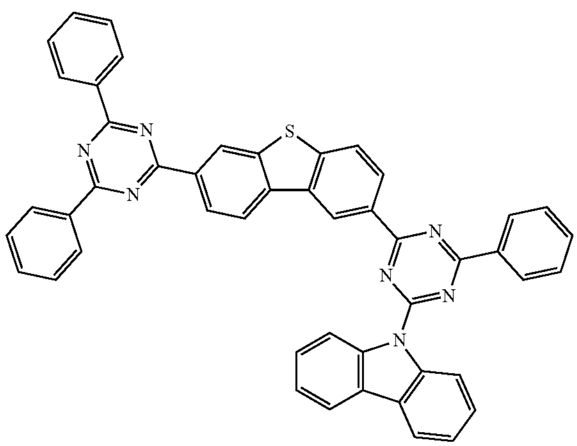
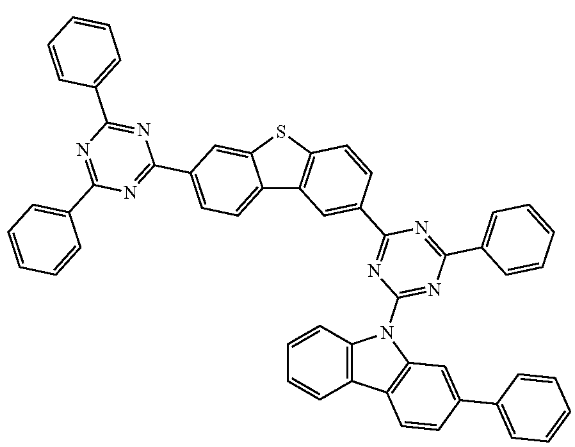
-continued
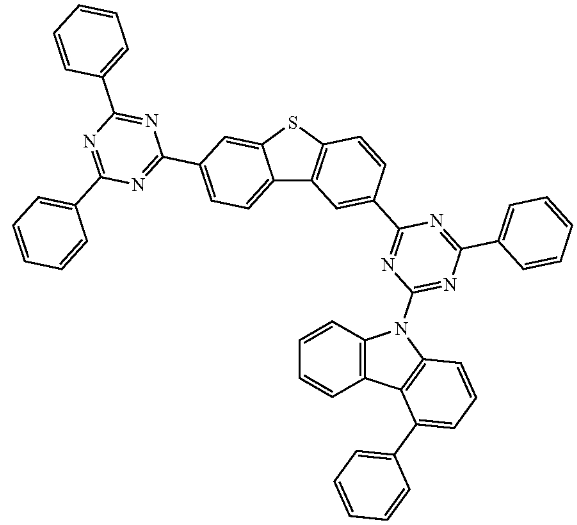
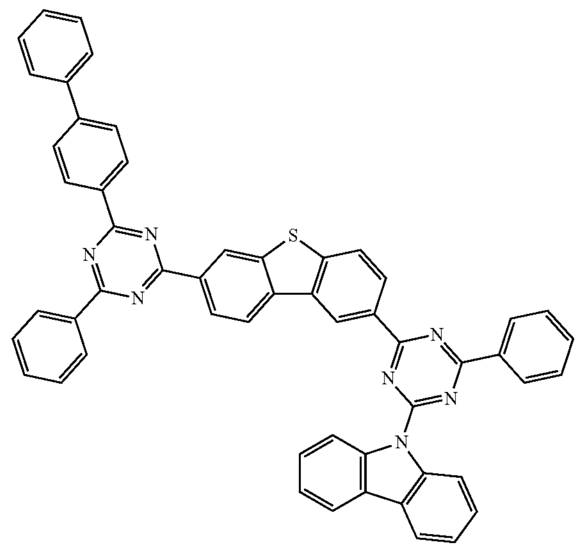
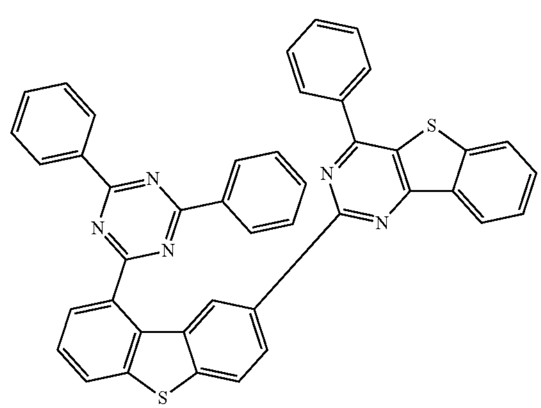

-continued
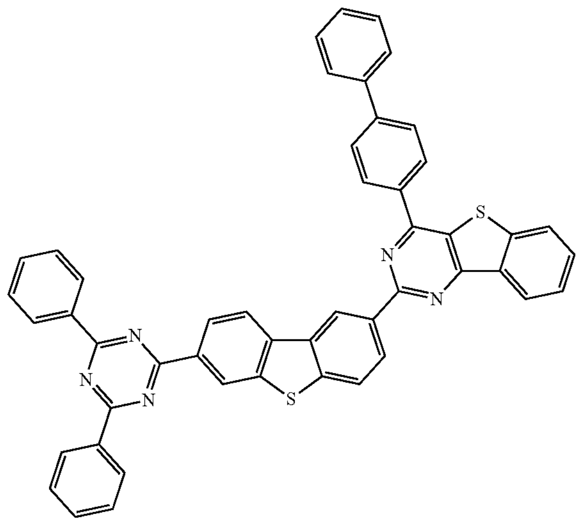
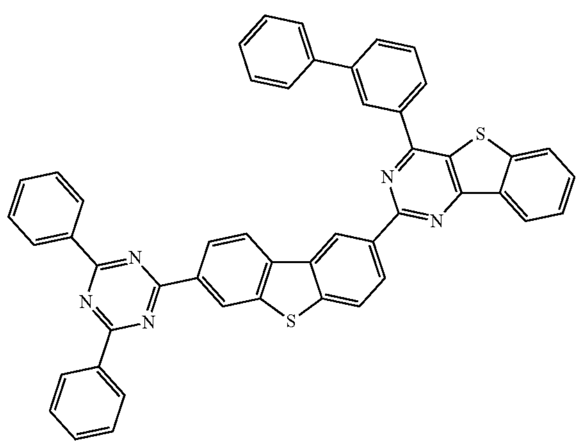
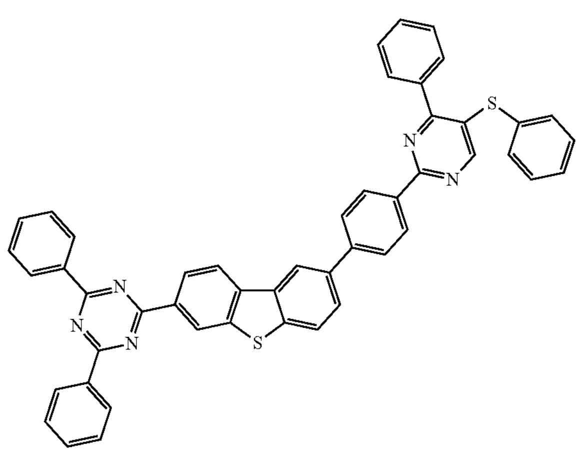
-continued
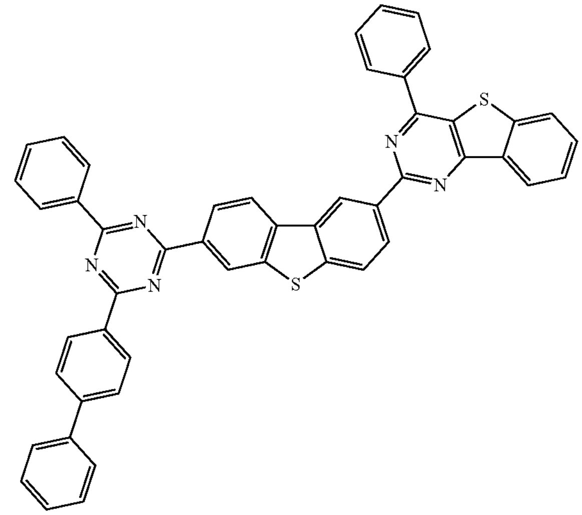
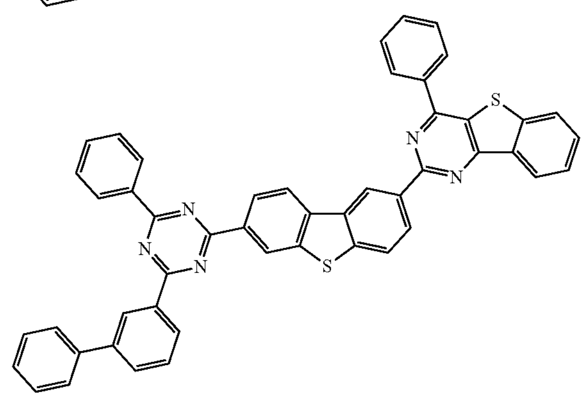
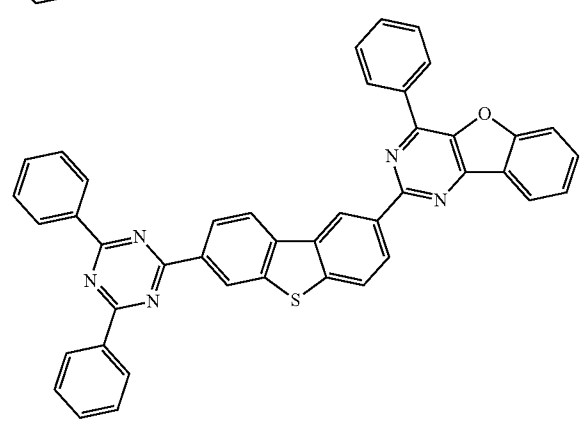
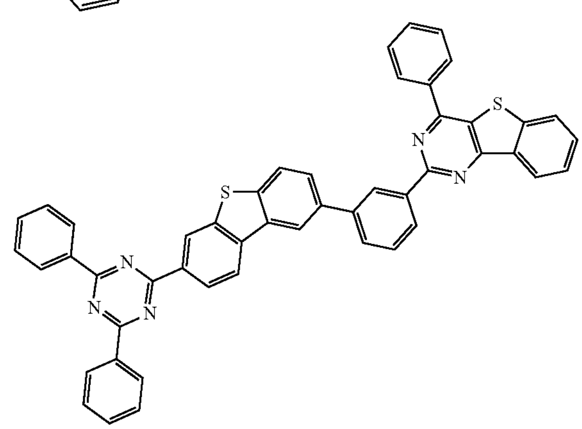

-continued
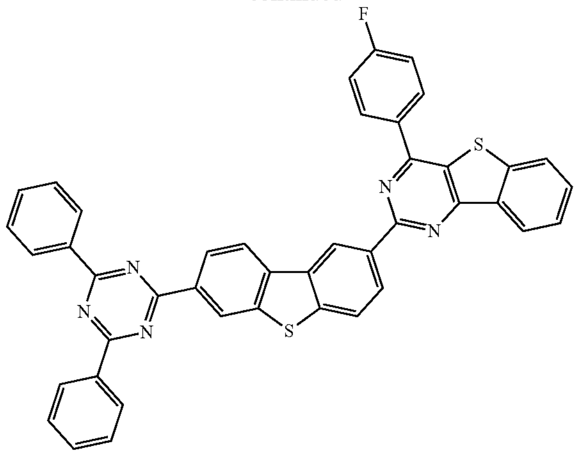
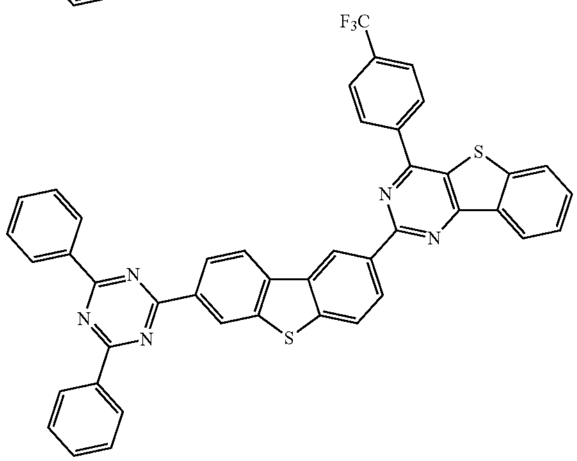
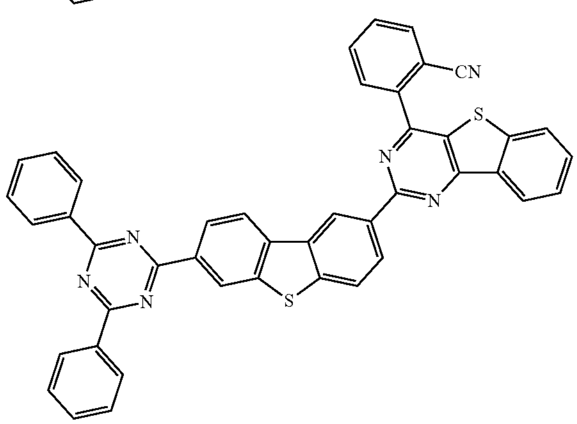
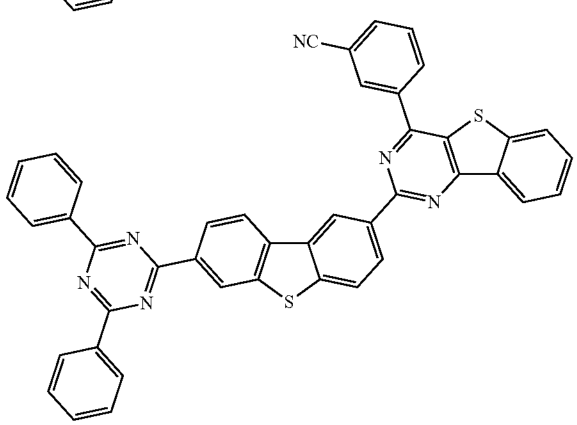
-continued
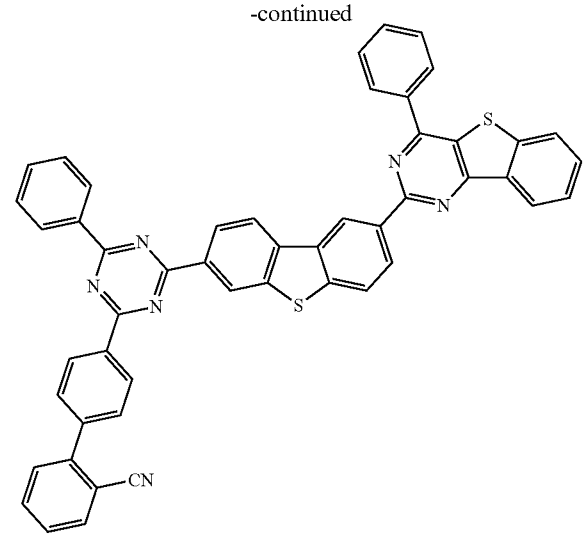
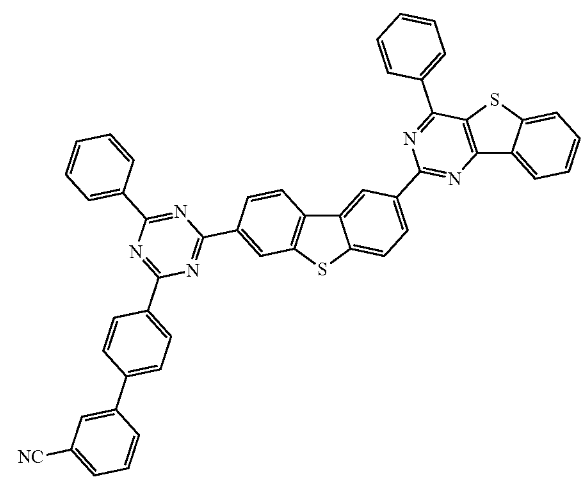
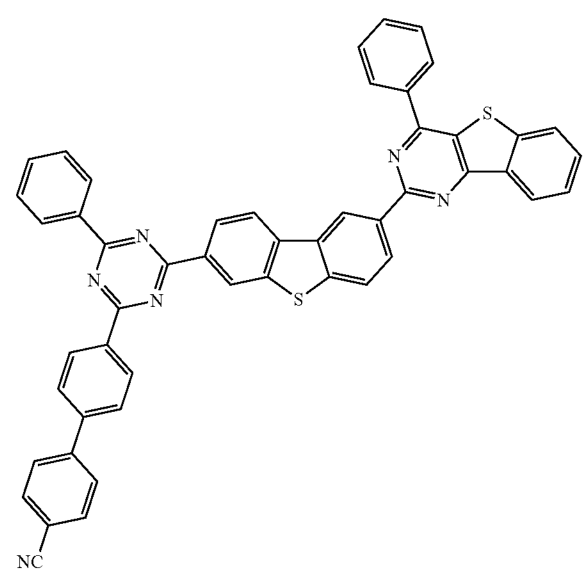

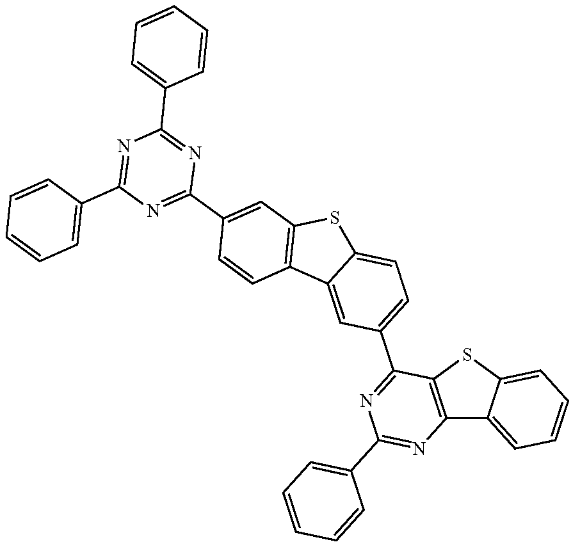
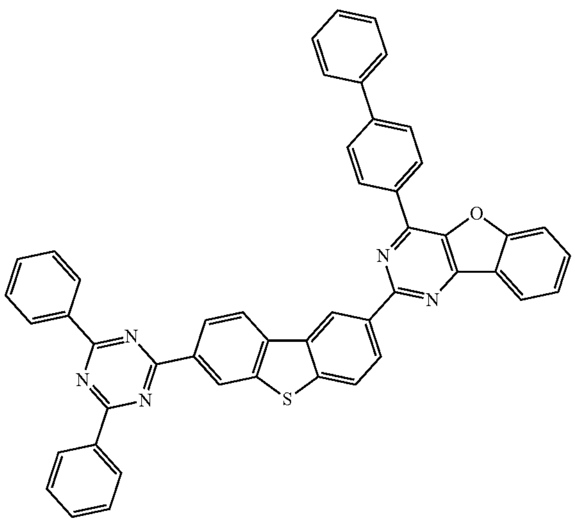
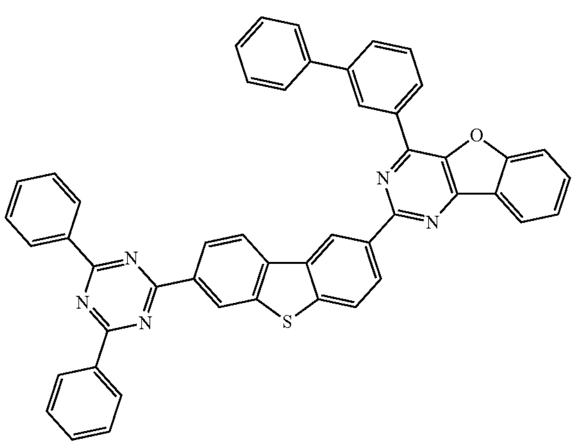
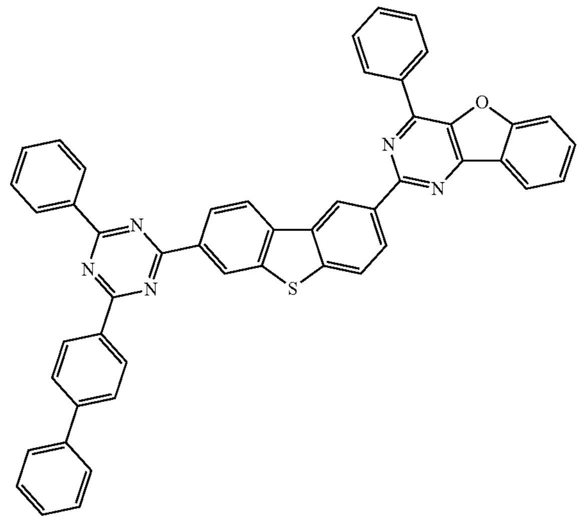
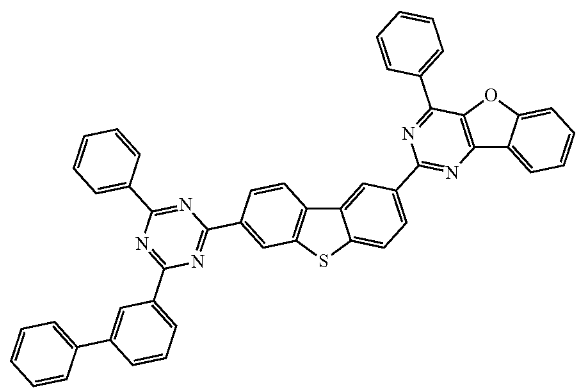
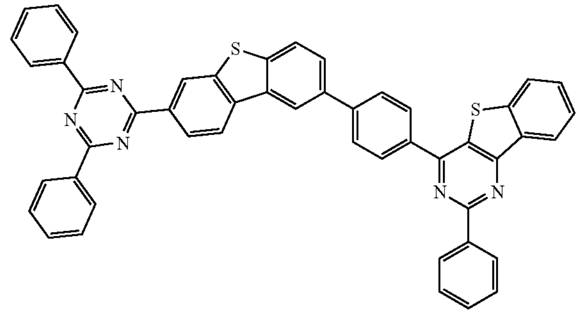

-continued
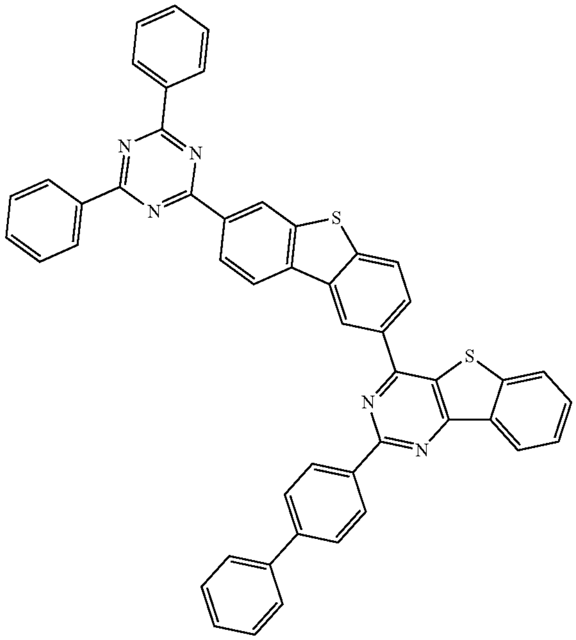
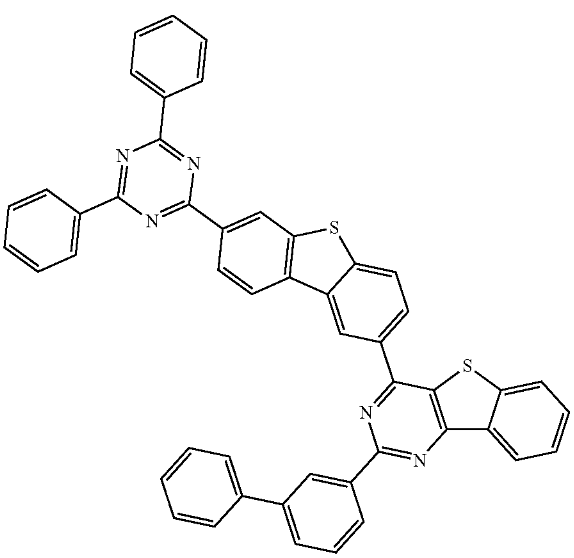
-continued
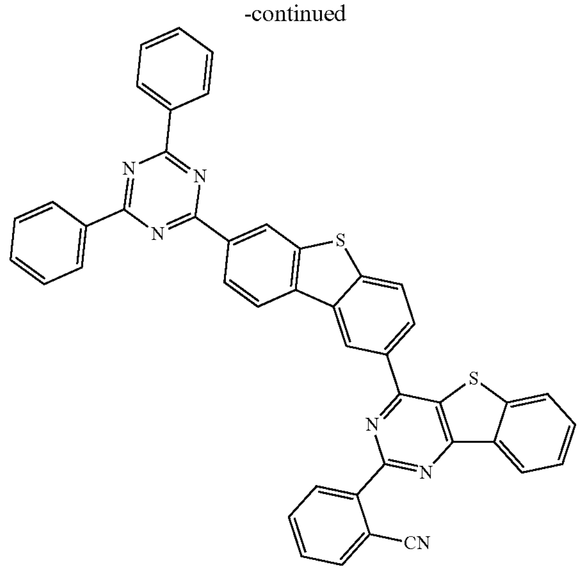
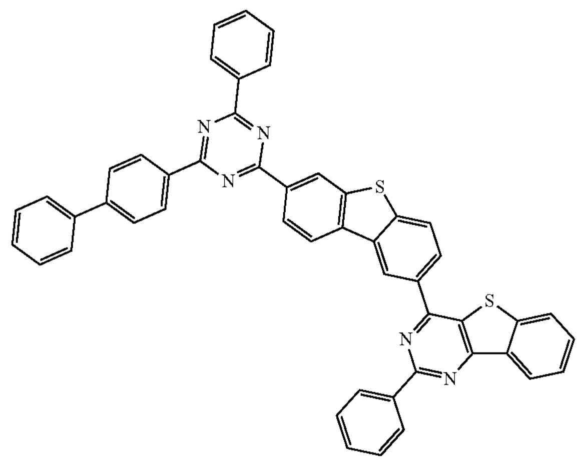
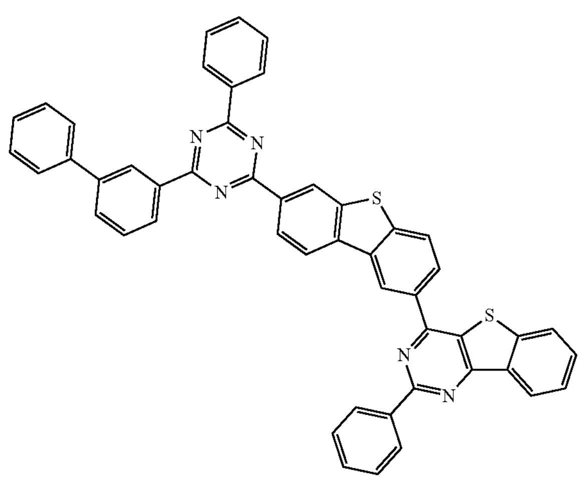

-continued
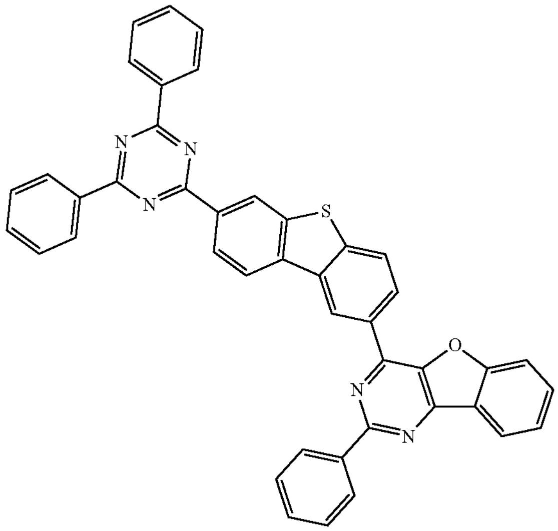
.
* * * * *